US012010908B2

(12) United States Patent
Li et al.

(10) Patent No.: US 12,010,908 B2
(45) Date of Patent: Jun. 11, 2024

(54) METAL-ASSISTED DELAYED FLUORESCENT EMITTERS EMPLOYING BENZO-IMIDAZO-PHENANTHRIDINE AND ANALOGUES

(71) Applicant: Arizona Board of Regents on behalf of Arizona State University, Scottsdale, AZ (US)

(72) Inventors: Jian Li, Tempe, AZ (US); Yunlong Ji, Mesa, AZ (US)

(73) Assignee: Arizona Board of Regents on behalf of Arizona State University, Scottsdale, AZ (US)

(*) Notice: Subject to any disclaimer, the term of this patent is extended or adjusted under 35 U.S.C. 154(b) by 0 days.

(21) Appl. No.: 17/332,100

(22) Filed: May 27, 2021

(65) Prior Publication Data

US 2022/0376190 A1 Nov. 24, 2022

Related U.S. Application Data

(63) Continuation of application No. 16/668,010, filed on Oct. 30, 2019, now Pat. No. 11,063,228, which is a continuation of application No. 15/983,680, filed on May 18, 2018, now Pat. No. 10,516,117.

(60) Provisional application No. 62/508,560, filed on May 19, 2017, provisional application No. 62/508,782, filed on May 19, 2017.

(51) Int. Cl.

| | |
|---|---|
| ***H10K 85/30*** | (2023.01) |
| ***C07F 15/00*** | (2006.01) |
| ***C09K 11/06*** | (2006.01) |
| ***H10K 50/11*** | (2023.01) |
| ***H10K 50/854*** | (2023.01) |
| ***H10K 101/10*** | (2023.01) |

(52) U.S. Cl.

CPC ....... *H10K 85/341* (2023.02); *C07F 15/0033* (2013.01); *C07F 15/006* (2013.01); *C07F 15/0086* (2013.01); *C09K 11/06* (2013.01); *H10K 85/342* (2023.02); *H10K 85/346* (2023.02); *C09K 2211/1044* (2013.01); *C09K 2211/1074* (2013.01); *C09K 2211/185* (2013.01); *H10K 50/11* (2023.02); *H10K 50/854* (2023.02); *H10K 2101/10* (2023.02)

(58) Field of Classification Search

None

See application file for complete search history.

(56) References Cited

U.S. PATENT DOCUMENTS

| | | | |
|---|---|---|---|
| 4,769,292 | A | 9/1988 | Tang |
| 5,451,674 | A | 9/1995 | Silver |
| 5,641,878 | A | 6/1997 | Dandliker |
| 5,707,745 | A | 1/1998 | Forrest |
| 5,844,363 | A | 12/1998 | Gu |
| 6,200,695 | B1 | 3/2001 | Arai |
| 6,303,238 | B1 | 10/2001 | Thompson |
| 6,780,528 | B2 | 8/2004 | Tsuboyama |
| 7,002,013 | B1 | 2/2006 | Chi |
| 7,037,599 | B2 | 5/2006 | Culligan |
| 7,064,228 | B1 | 6/2006 | Yu |
| 7,268,485 | B2 | 9/2007 | Tyan |
| 7,279,704 | B2 | 10/2007 | Walters |
| 7,332,232 | B2 | 2/2008 | Ma |
| 7,442,797 | B2 | 10/2008 | Itoh |
| 7,501,190 | B2 | 3/2009 | Ise |
| 7,635,792 | B1 | 12/2009 | Cella |
| 7,655,322 | B2 | 2/2010 | Forrest |
| 7,854,513 | B2 | 12/2010 | Quach |
| 7,947,383 | B2 | 5/2011 | Ise |
| 8,106,199 | B2 | 1/2012 | Jabbour |
| 8,133,597 | B2 | 3/2012 | Yasukawa |
| 8,389,725 | B2 | 3/2013 | Li |
| 8,617,723 | B2 | 12/2013 | Stoessel |
| 8,669,364 | B2 | 3/2014 | Li |
| 8,778,509 | B2 | 7/2014 | Yasukawa |
| 8,816,080 | B2 | 8/2014 | Li |
| 8,846,940 | B2 | 9/2014 | Li |
| 8,871,361 | B2 | 10/2014 | Xia |
| 8,927,713 | B2 | 1/2015 | Li |
| 8,933,622 | B2 | 1/2015 | Kawami |
| 8,946,417 | B2 | 2/2015 | Jian |
| 8,987,451 | B2 | 3/2015 | Tsai |
| 9,059,412 | B2 | 6/2015 | Zeng |
| 9,076,974 | B2 | 7/2015 | Li |
| 9,082,989 | B2 | 7/2015 | Li |
| 9,203,039 | B2 | 12/2015 | Li |

(Continued)

FOREIGN PATENT DOCUMENTS

| | | | |
|---|---|---|---|
| CN | 1680366 | A | 10/2005 |
| CN | 1777663 | | 5/2006 |

(Continued)

OTHER PUBLICATIONS

Adachi, C. et al., "High-efficiency organic electrophosphorescent devices with tris(2-phenylpyridine)iridium doped into electron-transporting materials", Applied Physics Letters, Aug. 2000, vol. 77, No. 6, pp. 904-906 <DOI:10.1063/1.1306639>.

Ayan Maity et al., "Room-temperature synthesis of cyclometalated iridium(III) complexes; kinetic isomers and reactive functionalities" Chem. Sci., vol. 4, pp. 1175-1181 (2013).

Baldo et al., "Very High-Efficiency Green Organic Light-Emitting Devices Based on Electrophosphorescence", Appl Phys Lett, 75(3):4-6 (1999).

Baldo et al., "Highly Efficient Phosphorescent Emission from Organic Electroluminescent Devices," Nature, vol. 395, Sep. 10, 1998, pp. 151-154.

Baldo et al., "Very high-efficiency green organic light-emitting devices based on electrophosphorescence," Applied Physics Letters, vol. 75, No. 1, Jul. 5, 1999, pp. 4-6.

(Continued)

*Primary Examiner* — Joseph R Kosack

(74) *Attorney, Agent, or Firm* — Riverside Law LLP

(57) ABSTRACT

Metal-assisted delayed fluorescent emitters employing benzo-imidazo-phenanthridine and analogues for full color displays and lighting applications.

9 Claims, 5 Drawing Sheets

(56) References Cited

U.S. PATENT DOCUMENTS 9,221,857 B2 12/2015 Li
9,224,963 B2 12/2015 Li
9,238,668 B2 1/2016 Li
9,312,502 B2 4/2016 Li
9,312,505 B2 4/2016 Brooks
9,318,725 B2 4/2016 Li
9,324,957 B2 4/2016 Li
9,382,273 B2 7/2016 Li
9,385,329 B2 7/2016 Li
9,425,415 B2 8/2016 Li
9,461,254 B2 10/2016 Tsai
9,493,698 B2 11/2016 Beers
9,502,671 B2 11/2016 Jian
9,550,801 B2 1/2017 Li
9,598,449 B2 3/2017 Li
9,617,291 B2 4/2017 Li
9,666,822 B2 5/2017 Forrest
9,673,409 B2 6/2017 Li
9,698,359 B2 7/2017 Li
9,711,739 B2 7/2017 Li
9,711,741 B2 7/2017 Li
9,711,742 B2 7/2017 Li
9,735,397 B2 8/2017 Riegel
9,755,163 B2 9/2017 Li
9,818,959 B2 11/2017 Li
9,865,825 B2 1/2018 Li
9,879,039 B2 1/2018 Li
9,882,150 B2 1/2018 Li
9,899,614 B2 2/2018 Li
9,920,242 B2 3/2018 Li
9,923,155 B2 3/2018 Li
9,941,479 B2 4/2018 Li
9,947,881 B2 4/2018 Li
9,985,224 B2 5/2018 Li
10,020,455 B2 7/2018 Li
10,033,003 B2 7/2018 Li
10,056,564 B2 8/2018 Li
10,056,567 B2 8/2018 Li
10,158,091 B2 12/2018 Li
10,177,323 B2 1/2019 Li
10,211,411 B2 2/2019 Li
10,211,414 B2 2/2019 Li
10,263,197 B2 4/2019 Li
10,294,417 B2 5/2019 Li
10,392,387 B2 8/2019 Li
10,411,202 B2 9/2019 Li
10,414,785 B2 9/2019 Li
10,516,117 B2 12/2019 Li
10,566,553 B2 2/2020 Li
10,566,554 B2 2/2020 Li
10,622,571 B2 4/2020 Li
10,804,475 B2 10/2020 Zeng
10,836,785 B2 11/2020 Li
11,063,228 B2 * 7/2021 Li ...................... C07F 15/0033
11,183,670 B2 11/2021 Li
11,594,688 B2 2/2023 Li
2001/0019782 A1 9/2001 Igarashi
2002/0068190 A1 6/2002 Tsuboyama
2003/0062519 A1 4/2003 Yamazaki
2003/0180574 A1 9/2003 Huang
2003/0186077 A1 10/2003 Chen
2004/0230061 A1 11/2004 Seo
2005/0037232 A1 2/2005 Tyan
2005/0139810 A1 6/2005 Kuehl
2005/0170207 A1 8/2005 Ma
2005/0260446 A1 11/2005 Mackenzie
2006/0024522 A1 2/2006 Thompson
2006/0032528 A1 2/2006 Wang
2006/0066228 A1 3/2006 Antoniadis
2006/0073359 A1 4/2006 Ise
2006/0094875 A1 5/2006 Itoh
2006/0127696 A1 6/2006 Stossel
2006/0182992 A1 8/2006 Nii
2006/0202197 A1 9/2006 Nakayama
2006/0210831 A1 9/2006 Sano
2006/0255721 A1 11/2006 Igarashi
2006/0263635 A1 11/2006 Ise
2006/0286406 A1 12/2006 Igarashi
2007/0057630 A1 3/2007 Nishita
2007/0059551 A1 3/2007 Yamazaki
2007/0082284 A1 4/2007 Stoessel
2007/0103060 A1 5/2007 Itoh
2007/0160905 A1 7/2007 Morishita
2007/0252140 A1 11/2007 Limmert
2008/0001530 A1 1/2008 Ise
2008/0036373 A1 2/2008 Itoh
2008/0054799 A1 3/2008 Satou
2008/0079358 A1 4/2008 Satou
2008/0102310 A1 5/2008 Thompson
2008/0111476 A1 5/2008 Choi
2008/0241518 A1 10/2008 Satou
2008/0241589 A1 10/2008 Fukunaga
2008/0269491 A1 10/2008 Jabbour
2008/0315187 A1 12/2008 Bazan
2009/0026936 A1 1/2009 Satou
2009/0026939 A1 1/2009 Kinoshita
2009/0032989 A1 2/2009 Karim
2009/0039768 A1 2/2009 Igarashi
2009/0079340 A1 3/2009 Kinoshita
2009/0126796 A1 5/2009 Yang
2009/0128008 A1 5/2009 Ise
2009/0136779 A1 5/2009 Cheng
2009/0153045 A1 6/2009 Kinoshita
2009/0167167 A1 7/2009 Aoyama
2009/0205713 A1 8/2009 Mitra
2009/0218561 A1 9/2009 Kitamura
2009/0261721 A1 10/2009 Murakami
2009/0267500 A1 10/2009 Kinoshita
2010/0000606 A1 1/2010 Thompson
2010/0013386 A1 1/2010 Thompson
2010/0043876 A1 2/2010 Tuttle
2010/0093119 A1 4/2010 Shimizu
2010/0127246 A1 5/2010 Nakayama
2010/0141127 A1 6/2010 Xia
2010/0147386 A1 6/2010 Benson-Smith
2010/0171111 A1 7/2010 Takada
2010/0171418 A1 7/2010 Kinoshita
2010/0200051 A1 8/2010 Triani
2010/0204467 A1 8/2010 Lamarque
2010/0270540 A1 10/2010 Chung
2010/0288362 A1 11/2010 Hatwar
2010/0297522 A1 11/2010 Creeth
2010/0301315 A1 12/2010 Masui
2010/0307594 A1 12/2010 Zhu
2011/0028723 A1 2/2011 Li
2011/0049496 A1 3/2011 Fukuzaki
2011/0062858 A1 3/2011 Yersin
2011/0132440 A1 6/2011 Sivarajan
2011/0217544 A1 9/2011 Young
2011/0227058 A1 9/2011 Masui
2011/0301351 A1 12/2011 Li
2012/0024383 A1 2/2012 Kaiho
2012/0025588 A1 2/2012 Humbert
2012/0039323 A1 2/2012 Hirano
2012/0095232 A1 4/2012 Li
2012/0108806 A1 5/2012 Li
2012/0146012 A1 6/2012 Limmert
2012/0181528 A1 7/2012 Takada
2012/0199823 A1 8/2012 Molt
2012/0202997 A1 8/2012 Parham
2012/0204960 A1 8/2012 Kato
2012/0215001 A1 8/2012 Li
2012/0223634 A1 * 9/2012 Xia ........................ H05B 33/14
546/4
2012/0264938 A1 10/2012 Li
2012/0273736 A1 11/2012 James
2012/0302753 A1 11/2012 Li
2013/0048963 A1 2/2013 Beers
2013/0082245 A1 4/2013 Kottas
2013/0137870 A1 5/2013 Li
2013/0168656 A1 7/2013 Tsai
2013/0172561 A1 7/2013 Tsai
2013/0200340 A1 8/2013 Otsu
2013/0203996 A1 8/2013 Li

(56) References Cited

U.S. PATENT DOCUMENTS

| | | | |
|---|---|---|---|
| 2013/0237706 | A1 | 9/2013 | Li |
| 2013/0341600 | A1 | 12/2013 | Lin |
| 2014/0014922 | A1 | 1/2014 | Lin |
| 2014/0014931 | A1 | 1/2014 | Riegel |
| 2014/0027733 | A1 | 1/2014 | Zeng |
| 2014/0042475 | A1 | 2/2014 | Park |
| 2014/0066628 | A1 | 3/2014 | Li |
| 2014/0073798 | A1 | 3/2014 | Li |
| 2014/0084261 | A1 | 3/2014 | Brooks |
| 2014/0114072 | A1 | 4/2014 | Li |
| 2014/0147996 | A1 | 5/2014 | Vogt |
| 2014/0148594 | A1 | 5/2014 | Li |
| 2014/0191206 | A1 | 7/2014 | Cho |
| 2014/0203248 | A1 | 7/2014 | Zhou |
| 2014/0249310 | A1 | 9/2014 | Li |
| 2014/0326960 | A1 | 11/2014 | Kim |
| 2014/0330019 | A1 | 11/2014 | Li |
| 2014/0364605 | A1 | 12/2014 | Li |
| 2014/0374728 | A1 | 12/2014 | Adamovich |
| 2015/0008419 | A1 | 1/2015 | Li |
| 2015/0018558 | A1 | 1/2015 | Li |
| 2015/0028323 | A1 | 1/2015 | Xia |
| 2015/0060804 | A1 | 3/2015 | Kanitz |
| 2015/0069334 | A1 | 3/2015 | Xia |
| 2015/0105556 | A1 | 4/2015 | Li |
| 2015/0123047 | A1 | 5/2015 | Maltenberger |
| 2015/0162552 | A1 | 6/2015 | Li |
| 2015/0194616 | A1 | 7/2015 | Li |
| 2015/0207086 | A1 | 7/2015 | Li |
| 2015/0228914 | A1 | 8/2015 | Li |
| 2015/0274762 | A1 | 10/2015 | Li |
| 2015/0287938 | A1 | 10/2015 | Li |
| 2015/0311456 | A1 | 10/2015 | Li |
| 2015/0318500 | A1 | 11/2015 | Li |
| 2015/0349279 | A1 | 12/2015 | Li |
| 2015/0380666 | A1 | 12/2015 | Szigethy |
| 2016/0028028 | A1 | 1/2016 | Li |
| 2016/0028029 | A1 | 1/2016 | Li |
| 2016/0043331 | A1 | 2/2016 | Li |
| 2016/0072082 | A1 | 3/2016 | Brooks |
| 2016/0133861 | A1 | 5/2016 | Li |
| 2016/0133862 | A1 | 5/2016 | Li |
| 2016/0181529 | A1 | 6/2016 | Tsai |
| 2016/0194344 | A1 | 7/2016 | Li |
| 2016/0197285 | A1 | 7/2016 | Zeng |
| 2016/0197291 | A1 | 7/2016 | Li |
| 2016/0204358 | A1 | 7/2016 | Stoessel |
| 2016/0285015 | A1 | 9/2016 | Li |
| 2016/0359120 | A1 | 12/2016 | Li |
| 2016/0359125 | A1 | 12/2016 | Li |
| 2017/0005278 | A1 | 1/2017 | Li |
| 2017/0012224 | A1 | 1/2017 | Li |
| 2017/0040555 | A1 | 2/2017 | Li |
| 2017/0047533 | A1 | 2/2017 | Li |
| 2017/0066792 | A1 | 3/2017 | Li |
| 2017/0069855 | A1 | 3/2017 | Li |
| 2017/0077420 | A1 | 3/2017 | Li |
| 2017/0125708 | A1 | 5/2017 | Li |
| 2017/0267923 | A1 | 9/2017 | Li |
| 2017/0271611 | A1 | 9/2017 | Li |
| 2017/0301871 | A1 | 10/2017 | Li |
| 2017/0305881 | A1 | 10/2017 | Li |
| 2017/0309943 | A1 | 10/2017 | Angell |
| 2017/0331056 | A1 | 11/2017 | Li |
| 2017/0342098 | A1 | 11/2017 | Li |
| 2017/0373260 | A1 | 12/2017 | Li |
| 2018/0006246 | A1 | 1/2018 | Li |
| 2018/0013096 | A1 | 1/2018 | Hamada |
| 2018/0037812 | A1 | 2/2018 | Pegington |
| 2018/0052366 | A1 | 2/2018 | Hao |
| 2018/0053904 | A1 | 2/2018 | Li |
| 2018/0062084 | A1 | 3/2018 | Watabe |
| 2018/0130960 | A1 | 5/2018 | Li |
| 2018/0138428 | A1 | 5/2018 | Li |
| 2018/0148464 | A1 | 5/2018 | Li |
| 2018/0159051 | A1 | 6/2018 | Li |
| 2018/0166655 | A1 | 6/2018 | Li |
| 2018/0175329 | A1 | 6/2018 | Li |
| 2018/0194790 | A1 | 7/2018 | Li |
| 2018/0198081 | A1 | 7/2018 | Zeng |
| 2018/0219161 | A1 | 8/2018 | Li |
| 2018/0226592 | A1 | 8/2018 | Li |
| 2018/0226593 | A1 | 8/2018 | Li |
| 2018/0230173 | A1 | 8/2018 | Ji |
| 2018/0277777 | A1 | 9/2018 | Li |
| 2018/0301641 | A1 | 10/2018 | Li |
| 2018/0312750 | A1 | 11/2018 | Li |
| 2018/0331307 | A1 | 11/2018 | Li |
| 2018/0334459 | A1 | 11/2018 | Li |
| 2018/0337345 | A1 | 11/2018 | Li |
| 2018/0337349 | A1 | 11/2018 | Li |
| 2018/0337350 | A1 | 11/2018 | Li |
| 2018/0353771 | A1 | 12/2018 | Kim |
| 2019/0013485 | A1 | 1/2019 | Li |
| 2019/0058137 | A1 | 2/2019 | Ko |
| 2019/0067602 | A1 | 2/2019 | Li |
| 2019/0109288 | A1 | 4/2019 | Li |
| 2019/0119312 | A1 | 4/2019 | Chen |
| 2019/0157352 | A1 | 5/2019 | Li |
| 2019/0194536 | A1 | 6/2019 | Li |
| 2019/0221757 | A1 | 7/2019 | Tarran |
| 2019/0259963 | A1 | 8/2019 | Li |
| 2019/0276485 | A1 | 9/2019 | Li |
| 2019/0312217 | A1 | 10/2019 | Li |
| 2019/0367546 | A1 | 12/2019 | Li |
| 2019/0389893 | A1 | 12/2019 | Li |
| 2020/0006678 | A1 | 1/2020 | Li |
| 2020/0055885 | A1 | 2/2020 | Tarran |
| 2020/0071330 | A1 | 3/2020 | Li |
| 2020/0075868 | A1 | 3/2020 | Li |
| 2020/0119288 | A1 | 4/2020 | Li |
| 2020/0119289 | A1 | 4/2020 | Lin |
| 2020/0140471 | A1 | 5/2020 | Chen |
| 2020/0152891 | A1 | 5/2020 | Li |
| 2020/0227656 | A1 | 7/2020 | Li |
| 2020/0227660 | A1 | 7/2020 | Li |
| 2020/0239505 | A1 | 7/2020 | Li |
| 2020/0243776 | A1 | 7/2020 | Li |
| 2020/0287153 | A1 | 9/2020 | Li |
| 2020/0332185 | A1 | 10/2020 | Li |
| 2020/0365819 | A1 | 11/2020 | Seo |
| 2020/0373505 | A1 | 11/2020 | Li |
| 2020/0403167 | A1 | 12/2020 | Li |
| 2021/0024526 | A1 | 1/2021 | Li |
| 2021/0024559 | A1 | 1/2021 | Li |
| 2021/0047296 | A1 | 2/2021 | Li |
| 2021/0091316 | A1 | 3/2021 | Li |
| 2021/0095195 | A1 | 4/2021 | Ma |
| 2021/0292351 | A1 | 9/2021 | Macinnis |
| 2021/0376260 | A1 | 12/2021 | Li |
| 2022/0059786 | A1 | 2/2022 | Seo |

FOREIGN PATENT DOCUMENTS

| | | | |
|---|---|---|---|
| CN | 1894267 | | 1/2007 |
| CN | 1894269 | A | 1/2007 |
| CN | 101142223 | A | 3/2008 |
| CN | 101667626 | | 3/2010 |
| CN | 102449108 | A | 5/2012 |
| CN | 102892860 | A | 1/2013 |
| CN | 102971396 | A | 3/2013 |
| CN | 103102372 | | 5/2013 |
| CN | 104232076 | A | 12/2014 |
| CN | 104377231 | | 2/2015 |
| CN | 104576934 | | 4/2015 |
| CN | 104693243 | A | 6/2015 |
| CN | 105367605 | A | 3/2016 |
| CN | 105418591 | A | 3/2016 |
| CN | 106783922 | | 5/2017 |
| EP | 1617493 | | 1/2006 |
| EP | 1808052 | A1 | 7/2007 |
| EP | 1874893 | A1 | 1/2008 |
| EP | 1874894 | A1 | 1/2008 |
| EP | 1919928 | A1 | 5/2008 |

(56) References Cited

FOREIGN PATENT DOCUMENTS

| | | | |
|---|---|---|---|
| EP | 1968131 | | 9/2008 |
| EP | 2020694 | | 2/2009 |
| EP | 2036907 | A1 | 3/2009 |
| EP | 2096690 | | 9/2009 |
| EP | 2112213 | A2 | 10/2009 |
| EP | 2417217 | A2 | 2/2012 |
| EP | 2684932 | | 1/2014 |
| EP | 2711999 | A2 | 3/2014 |
| EP | 3032293 | | 6/2016 |
| JP | 2002010505 | | 1/2002 |
| JP | 2002105055 | | 4/2002 |
| JP | 2003342284 | | 12/2003 |
| JP | 2005031073 | | 2/2005 |
| JP | 2005267557 | | 9/2005 |
| JP | 2005310733 | A | 11/2005 |
| JP | 2006047240 | A | 2/2006 |
| JP | 2006232784 | A | 9/2006 |
| JP | 2006242080 | | 9/2006 |
| JP | 2006242081 | A | 9/2006 |
| JP | 2006256999 | A | 9/2006 |
| JP | 2006257238 | A | 9/2006 |
| JP | 2006261623 | A | 9/2006 |
| JP | 2006290988 | A | 10/2006 |
| JP | 2006313796 | A | 11/2006 |
| JP | 2006332622 | A | 12/2006 |
| JP | 2006351638 | A | 12/2006 |
| JP | 2007019462 | A | 1/2007 |
| JP | 2007031678 | | 2/2007 |
| JP | 2007042875 | A | 2/2007 |
| JP | 2007051243 | A | 3/2007 |
| JP | 2007053132 | A | 3/2007 |
| JP | 2007066581 | | 3/2007 |
| JP | 2007073620 | A | 3/2007 |
| JP | 2007073845 | A | 3/2007 |
| JP | 2007073900 | A | 3/2007 |
| JP | 2007080593 | | 3/2007 |
| JP | 2007080677 | A | 3/2007 |
| JP | 2007088105 | | 4/2007 |
| JP | 2007088164 | A | 4/2007 |
| JP | 2007096259 | A | 4/2007 |
| JP | 2007099765 | A | 4/2007 |
| JP | 2007110067 | | 4/2007 |
| JP | 2007110102 | A | 4/2007 |
| JP | 2007519614 | | 7/2007 |
| JP | 2007258550 | A | 10/2007 |
| JP | 2007324309 | A | 12/2007 |
| JP | 2008010353 | A | 1/2008 |
| JP | 2008091860 | A | 4/2008 |
| JP | 2008103535 | A | 5/2008 |
| JP | 2008108617 | A | 5/2008 |
| JP | 2008109085 | | 5/2008 |
| JP | 2008109103 | A | 5/2008 |
| JP | 2008116343 | A | 5/2008 |
| JP | 2008117545 | A | 5/2008 |
| JP | 2008160087 | A | 7/2008 |
| JP | 2008198801 | A | 8/2008 |
| JP | 2008270729 | A | 11/2008 |
| JP | 2008270736 | | 11/2008 |
| JP | 2008310220 | A | 12/2008 |
| JP | 2009016184 | A | 1/2009 |
| JP | 2009016579 | | 1/2009 |
| JP | 2009032977 | A | 2/2009 |
| JP | 2009032988 | A | 2/2009 |
| JP | 2009059997 | | 3/2009 |
| JP | 2009076509 | | 4/2009 |
| JP | 2009161524 | A | 7/2009 |
| JP | 2009247171 | | 10/2009 |
| JP | 2009266943 | A | 11/2009 |
| JP | 2009267171 | A | 11/2009 |
| JP | 2009267244 | A | 11/2009 |
| JP | 2009272339 | A | 11/2009 |
| JP | 2009283891 | A | 12/2009 |
| JP | 4460952 | | 5/2010 |
| JP | 2010135689 | A | 6/2010 |
| JP | 2010171205 | A | 8/2010 |
| JP | 2011071452 | A | 4/2011 |
| JP | 2012074444 | A | 4/2012 |
| JP | 2012079895 | A | 4/2012 |
| JP | 2012079898 | A | 4/2012 |
| JP | 5604505 | | 9/2012 |
| JP | 2012522843 | | 9/2012 |
| JP | 2012207231 | A | 10/2012 |
| JP | 2012222255 | A | 11/2012 |
| JP | 2012231135 | A | 11/2012 |
| JP | 2013023500 | A | 2/2013 |
| JP | 2013048256 | A | 3/2013 |
| JP | 2013053149 | A | 3/2013 |
| JP | 2013525436 | | 6/2013 |
| JP | 2014019701 | A | 2/2014 |
| JP | 2014058504 | A | 4/2014 |
| JP | 2014520096 | | 8/2014 |
| JP | 2012709899 | | 11/2014 |
| JP | 2014221807 | A | 11/2014 |
| JP | 2014239225 | A | 12/2014 |
| JP | 2015081257 | A | 4/2015 |
| KR | 20060011537 | | 2/2006 |
| KR | 20060015371 | | 2/2006 |
| KR | 20060115371 | | 11/2006 |
| KR | 20070061830 | | 6/2007 |
| KR | 20070112465 | | 11/2007 |
| KR | 20130043460 | | 4/2013 |
| KR | 101338250 | | 12/2013 |
| KR | 20140052501 | | 5/2014 |
| TW | 200701835 | | 1/2007 |
| TW | 201249851 | | 12/2012 |
| TW | 201307365 | A | 2/2013 |
| TW | 201710277 | | 3/2017 |
| WO | 0070655 | A2 | 11/2000 |
| WO | 2000070655 | | 11/2000 |
| WO | 2004003108 | | 1/2004 |
| WO | 2004070655 | | 8/2004 |
| WO | 2004085450 | | 10/2004 |
| WO | 2004108857 | | 12/2004 |
| WO | 2005042444 | A2 | 5/2005 |
| WO | 2005042550 | A1 | 5/2005 |
| WO | 2005113704 | | 12/2005 |
| WO | 2006033440 | A1 | 3/2006 |
| WO | 2006067074 | | 6/2006 |
| WO | 2006081780 | | 8/2006 |
| WO | 2006098505 | A1 | 9/2006 |
| WO | 2006113106 | | 10/2006 |
| WO | 2006115299 | A1 | 11/2006 |
| WO | 2006115301 | | 11/2006 |
| WO | 2007034985 | A1 | 3/2007 |
| WO | 2007069498 | A1 | 6/2007 |
| WO | 2008054578 | | 5/2008 |
| WO | 2008066192 | A1 | 6/2008 |
| WO | 2008066195 | A1 | 6/2008 |
| WO | 2008066196 | A1 | 6/2008 |
| WO | 2008101842 | A1 | 8/2008 |
| WO | 2008117889 | | 10/2008 |
| WO | 2008123540 | | 10/2008 |
| WO | 2008131932 | A1 | 11/2008 |
| WO | 2009003455 | | 1/2009 |
| WO | 2009008277 | | 1/2009 |
| WO | 2009011327 | | 1/2009 |
| WO | 2009017211 | A1 | 2/2009 |
| WO | 2009023667 | | 2/2009 |
| WO | 2009086209 | | 7/2009 |
| WO | 2009111299 | | 9/2009 |
| WO | 2010007098 | A1 | 1/2010 |
| WO | 2010056669 | | 5/2010 |
| WO | 2010093176 | | 8/2010 |
| WO | 2010105141 | | 9/2010 |
| WO | 2010118026 | A2 | 10/2010 |
| WO | 2011064335 | A1 | 6/2011 |
| WO | 2011070989 | A1 | 6/2011 |
| WO | 2011089163 | | 7/2011 |
| WO | 2011137429 | A2 | 11/2011 |
| WO | 2011137431 | A2 | 11/2011 |
| WO | 2012074909 | | 6/2012 |
| WO | 2012112853 | A1 | 8/2012 |
| WO | 2012116231 | | 8/2012 |
| WO | 2012142387 | | 10/2012 |

(56) References Cited

FOREIGN PATENT DOCUMENTS

| | | |
|---|---|---|
| WO | 2012162488 A1 | 11/2012 |
| WO | 2012163471 A1 | 12/2012 |
| WO | 2013130483 A1 | 9/2013 |
| WO | 2014009310 | 1/2014 |
| WO | 2014016611 | 1/2014 |
| WO | 2014031977 | 2/2014 |
| WO | 2014047616 A1 | 3/2014 |
| WO | 2014109814 | 7/2014 |
| WO | 2014208271 | 12/2014 |
| WO | 2015027060 A1 | 2/2015 |
| WO | 2015131158 | 9/2015 |
| WO | 2016025921 | 2/2016 |
| WO | 2016029137 | 2/2016 |
| WO | 2016029186 | 2/2016 |
| WO | 2016088354 A1 | 6/2016 |
| WO | 2016197019 | 12/2016 |
| WO | 2017117935 | 7/2017 |
| WO | 2018071697 | 4/2018 |
| WO | 2018140765 | 8/2018 |
| WO | 2019079505 | 4/2019 |
| WO | 2019079508 | 4/2019 |
| WO | 2019079509 | 4/2019 |
| WO | 2019236541 | 12/2019 |
| WO | 2020018476 | 1/2020 |

OTHER PUBLICATIONS

Baldo, M. et al., "Excitonic singlet-triplet ratio in a semiconducting organic thin film", Physical Review B, Nov. 1999, vol. 60, No. 20, pp. 14422-14428 <DOI: 10.1103/PhysRevB.60.14422>.

Baldo, M. et al., "High-efficiency fluorescent organic light-emitting devices using a phosphorescent sensitizer", Nature, Feb. 2000, vol. 403, pp. 750-753.

Barry O'Brien et al.: White organic light emitting diodes using Pt-based red, green and blue phosphorescent dopants. Proc. SPIE, vol. 8829, pp. 1-6, Aug. 25, 2013.

Barry O'Brien et al., "High efficiency white organic light emitting diodes employing blue and red platinum emitters," Journal of Photonics for Energy, vol. 4, 2014, pp. 043597-1-8.

Berson et al. (2007). "Poly(3-hexylthiophene) fibers for photovoltaic applications," Adv. Funct. Mat., 17, 1377-84.

Bouman et al. (1994). "Chiroptical properties of regioregular chiral polythiophenes," Mol. Cryst. Liq. Cryst., 256, 439-48.

Brian W. D'Andrade et al., "Controlling Exciton Diffusion in Multilayer White Phosphorescent Organic Light Emitting Devices", Adv. Mater., vol. 14, No. 2, Jan. 16, 2002, pp. 147-151.

Bronner; "Dipyrrin based luminescent cyclometallated palladium and platinum complexes", Dalton Trans., 2010, 39, 180-184. DOI: 10.1039/b908424j (Year: 2010) (5 pages).

Brooks, J. et al., "Synthesis and Characterization of Phosphorescent Cyclometalated Platinum Complexes", Inorganic Chemistry, May 2002, vol. 41, No. 12, pp. 3055-3066 <DOI:10.1021/ic0255508>.

Brown, A. et al., "Optical spectroscopy of triplet excitons and charged excitations in poly(p-phenylenevinylene) light-emitting diodes", Chemical Physics Letters, Jul. 1993, vol. 210, No. 1-3, pp. 61-66 <DOI:10.1016/0009-2614(93)89100-V>.

Burroughes, J. et al., "Light-emitting diodes based on conjugated polymers", Nature, Oct. 1990, vol. 347, pp. 539-541.

Campbell et al. (2008). "Low-temperature control of nanoscale morphology for high performance polymer photovoltaics," Nano Lett., 8, 3942-47.

Chen, F. et al., "High-performance polymer light-emitting diodes doped with a red phosphorescent iridium complex", Applied Physics Letters, Apr. 2002 [available online Mar. 2002], vol. 80, No. 13, pp. 2308-2310 <10.1063/1.1462862>.

Chen, X., et al., "Fluorescent Chemosensors Based on Spiroring-Opening of Xanthenes and Related Derivatives", Chemical Reviews, 2012 [available online Oct. 2011], vol. 112, No. 3, pp. 1910-1956 <DOI:10.1021/cr200201z>.

Chew, S. et al: Photoluminescence and electroluminescence of a new blue-emitting homoleptic iridium complex. Applied Phys. Letters; vol. 88, pp. 093510-1-093510-3, 2006.

Chi et al.; Transition-metal phosphors with cyclometalating ligands: fundamentals and applications, Chemical Society Reviews, vol. 39, No. 2, Feb. 2010, pp. 638-655.

Chi-Ming Che et al. "Photophysical Properties and OLEO Applications of Phosphorescent Platinum(II) Schiff Base Complexes," Chem. Eur. J., vol. 16, 2010, pp. 233-247.

Chow; "Strongly Phosphorescent Palladium (II) Complexes of Tetradentate Ligands with Mixed Oxygen, Carbon, and Nitrogen Donor Atoms: Photophysics, Photochemistry, and Applications", Angew. Chem. Int. Ed. 2013, 52, 11775 -11779. DOI: 10.1002/anie.201305590 (Year: 2013) (5 pages).

Christoph Ulbricht et al., "Synthesis and Characterization of Oxetane-Functionalized Phosphorescent Ir(III)-Complexes", Macromol. Chem. Phys. 2009, 210, pp. 531-541.

Coakley et al. (2004). "Conjugated polymer photovoltaic cells," Chem. Mater., 16, 4533-4542.

Colombo, M. et al., "Synthesis and high-resolution optical spectroscopy of bis[2-(2-thienyl)pyridinato-C3, N'](2,2'-bipyridine)iridium(III)", Inorganic Chemistry, Jul. 1993, vol. 32, No. 14, pp. 3081-3087 <DOI:10.1021/ic00066a019>.

D.F. O'Brien et al., "Improved energy transfer in electrophosphorescent devices," Appl. Phys. Lett., vol. 74, No. 3, Jan. 18, 1999, pp. 442-444.

D'Andrade, B. et al., "Operational stability of electrophosphorescent devices containing p and n doped transport layers ", Applied Physics Letters, Nov. 2003, vol. 83, No. 19, pp. 3858-3860 <DOI:10.1063/1.1624473>.

Dan Wang et al., "Carbazole and arylamine functionalized iridium complexes for efficient electro-phosphorescent light-emitting diodes", Inorganica Chimica Acta 370 (2011) pp. 340-345.

Dileep A. K. Vezzu et al., "Highly Luminescent Tetradentate Bis-Cyclometalated Platinum Complexes: Design, Synthesis, Structure, Photophysics, and Electroluminescence Application," Inorg. Chem., vol. 49, 2010, pp. 5107-5119.

Dorwald, Side Reactions in Organic Synthesis 2005, Wiley:VCH Weinheim Preface, pp. 1-15 & Chapter 1, pp. 279-308.

Dorwald; "Side Reactions in Organic Synthesis: A Guide to Successful Synthesis Design," Chapter 1, 2005 Wiley-VCH Verlag Gmbh & Co. KGaA, Wienheim, 32 pages.

Dsouza, R., et al., "Fluorescent Dyes and Their Supramolecular Host/Guest Complexes with Macrocycles in Aqueous Solution", Oct. 2011, vol. 111, No. 12, pp. 7941-7980 <DOI:10.1021/cr200213s>.

Eric Turner et al., "Cyclometalated Platinum Complexes with Luminescent Quantum Yields Approaching 100%," Inorg. Chem., 2013, vol. 52, pp. 7344-7351.

Evan L. Williams et al., "Excimer-Based White Phosphorescent Organic Light Emitting Diodes with Nearly 100% Internal Quantum Efficiency," Adv. Mater., vol. 19, 2007, pp. 197-202.

Finikova,M.A. et al., New Selective Synthesis of Substituted Tetrabenzoporphyris, Doklady Chemistry, 2003, vol. 391, No. 4-6, pp. 222-224.

Fuchs, C. et al., "Enhanced light emission from top-emitting organic light-emitting diodes by optimizing surface plasmon polariton losses", arXiv, submitted Mar. 2015, 11 pages, arXiv:1503.01309.

Fuchs, C. et al., "Enhanced light emission from top-emitting organic light-emitting diodes by optimizing surface plasmon polariton losses", Physical Review B, Dec. 2015, vol. 92, No. 24, pp. 245306-1-245306-10 <DOI:10.1103/PhysRevB.92.245306>.

Galanin et al. Synthesis and Properties of meso-Phenyl-Substituted Tetrabenzoazaporphines Magnesium Complexes. Russian Journal of Organic Chemistry (Translation of Zhurnal Organicheskoi Khimii) (2002), 38(8), 1200-1203.

Galanin et al., meso-Phenyltetrabenzoazaporphyrins and their zinc complexes. Synthesis and spectral properties, Russian Journal of General Chemistry (2005), 75(4), 651-655.

Gather, M. et al., "Recent advances in light outcoupling from white organic light-emitting diodes," Journal of Photonics for Energy, May 2015, vol. 5, No. 1, 057607-1-057607-20 <DOI:10.1117/1.JPE.5.057607>.

(56) References Cited

OTHER PUBLICATIONS

Glauco Ponterini et al., "Comparison of Radiationless Decay Processes in Osmium and Platinum Porphyrins," J. Am. Chem. Soc., vol. 105, No. 14, 1983, pp. 4639-4645.
Gong et al., Highly Selective Complexation of Metal lons by the Self-Tuning Tetraazacalixpyridine macrocycles, Tetrahedron, 65(1): 87-92 (2009).
Gottumukkala, V. et al., Synthesis, cellular uptake and animal toxicity of a tetra carboranylphenyl N-tetrabenzoporphyr in, Bioorganic & Medicinal Chemistry, 2006, vol. 14, pp. 1871-1879.
Graf, A. et al., "Correlating the transition dipole moment orientation of phosphorescent emitter molecules in OLEDs with basic material properties", Journal of Materials Chemistry C, Oct. 2014, vol. 2, No. 48, pp. 10298-10304 <DOI:10.1039/c4tc00997e>.
Guijie Li et al., "Efficient and stable red organic light emitting devices from a tetradentate cyclometalated platinum complex," Organic Electronics, 2014, vol. 15 pp. 1862-1867.
Guijie Li et al., "Modifying Emission Spectral Bandwidth of Phosphorescent Platinum(II) Complexes Through Synthetic Control," Inorg. Chem. 2017, 56, 8244-8256.
Guijie Li et al., Efficient and Stable White Organic Light-Emitting Diodes Employing a Single Emitter, Adv. Mater., 2014, vol. 26, pp. 2931-2936.
Hansen (1969). "The universality of the solubility parameter," I & EC Product Research and Development, 8, 2-11.
Hatakeyama, T. et al., "Ultrapure Blue Thermally Activated Delayed Fluorescence Molecules: Efficient HOMO-LUMO Separation by the Multiple Resonance Effect", Advanced Materials, Apr. 2016, vol. 28, No. 14, pp. 2777-2781, <DOI:10.1002/adma.201505491>.
Hirohiko Fukagawa et al., "Highly Efficient and Stable Red Phosphorescent Organic Light-Emitting Diodes Using Platinum Complexes," Adv. Mater., 2012, vol. 24, pp. 5099-5103.
Hoe-Joo Seo et al., "Blue phosphorescent iridium(III) complexes containing carbazole-functionalized phenyl pyridine for organic light-emitting diodes: energy transfer from carbazolyl moieties to iridium(III) cores", RSC Advances, 2011, 1, pp. 755-757.
Holmes, R. et al., "Efficient, deep-blue organic electrophosphorescence by guest charge trapping", Applied Physics Letters, Nov. 2003 [available online Oct. 2003], vol. 83, No. 18, pp. 3818-3820 <DOI:10.1063/1.1624639>.
Huaijun Tang et al., "Novel yellow phosphorescent iridium complexes containing a carbazoleeoxadiazole unit used in polymeric light-emitting diodes", Dyes and Pigments 91 (2011) pp. 413-421.
Imre et al (1996). "Liquid-liquid demixing ffrom solutions of polystyrene. 1. A review. 2. Improved correlation with solvent properties," J. Phys. Chem. Ref. Data, 25, 637-61.
Ivaylo Ivanov et al., "Comparison of the INDO band structures of polyacetylene, polythiophene, polyfuran, and polypyrrole," Synthetic Metals, vol. 116, Issues 1-3, Jan. 1, 2001, pp. 111-114.
Jack W. Levell et al., "Carbazole/iridium dendrimer side-chain phosphorescent copolymers for efficient light emitting devices", New J. Chem., 2012, vol. 36, pp. 407-413.
Jan Kalinowski et al., "Light-emitting devices based on organometallic platinum complexes as emitters," Coordination Chemistry Reviews, vol. 255, 2011, pp. 2401-2425.
Jeong et al. (2010). "Improved efficiency of bulk heterojunction poly (3-hexylthiophene): [6,6]-phenyl-C61-butyric acid methyl ester photovoltaic devices using discotic liquid crystal additives," Appl. Phys. Lett.. 96, 183305. (3 pages).
Jeonghun Kwak et al., "Bright and Efficient Full-Color Colloidal Quantum Dot Light-Emitting Diodes Using an Inverted Device Structure," Nano Letters 12, Apr. 2, 2012, pp. 2362-2366.
Ji Hyun Seo et al., "Efficient blue-green organic light-emitting diodes based on heteroleptic tris-cyclometalated iridium (III) complexes". Thin Solid Films, vol. 517, pp. 1807-1810 (2009).
JP2009267244, English Translation from EPO, Nov. 2009, 80 pages.
JP2010135689, English translation from EPO, dated Jun. 2010, 95 pages.
Kai Li et al., "Light-emitting platinum(II) complexes supported by tetradentate dianionic bis(N-heterocyclic carbene) ligands: towards robust blue electrophosphors," Chem. Sci., 2013, vol. 4, pp. 2630-2644.
Ke Feng et al., "Norbornene-Based Copolymers Containing Platinum Complexes and Bis(carbazolyl)benzene Groups in Their Side-Chains," Macromolecules, vol. 42, 2009, pp. 6855-6864.
Kim et al (2009). "Altering the thermodynamics of phase separation in inverted bulk-heterojunction organic solar cells," Adv. Mater., 21, 3110-15.
Kim et al. (2005). "Device annealing effect in organic solar cells with blends of regioregular poly (3-hexylthiophene) and soluble fullerene," Appl. Phys. Lett. 86, 063502. (3 pages).
Kim, Hy et al., "Crystal Organic Light-Emitting Diodes with Perfectly Oriented Non-Doped Pt-Based Emitting Layer", Advanced Functional Materials, Feb. 2016, vol. 28, No. 13, pp. 2526-2532 <DOI:10.1002/adma.201504451>.
Kim, JJ., "Setting up the new efficiency limit of OLEDs; Abstract" [online], Electrical Engineering-Princeton University, Aug. 2014 [retrieved on Aug. 24, 2016], retrieved from the internet: <URL:http://ee.princeton.edu/events/setting-new-efficiency-limit-oled> 2 pages.
Kim, SY. et al., "Organic Light-Emitting Diodes with 30% External Quantum Efficiency Based on a Horizontally Oriented Emitter", Advanced Functional Materials, Mar. 2013, vol. 23, No. 31, pp. 3896-3900 <DOI:10.1002/adfm.201300104 >.
Kroon et al. (2008). "Small bandgap olymers for organic solar cells," Polymer Reviews, 48, 531-82.
Kwon-Hyeon Kim et al., "Controlling Emitting Dipole Orientation with Methyl Substituents on Main Ligand of Iridium Complexes for Highly Efficient Phosphorescent Organic Light-Emitting Diodes", Adv. Optical Mater. 2015, 3, pp. 1191-1196.
Kwon-Hyeon Kim et al., "Crystal Organic Light-Emitting Diodes with Perfectly Oriented Non-Doped Pt-Based Emitting Layer", Adv. Mater. 2016, 28, pp. 2526-2532.
Kwong, R. et al., "High operational stability of electrophosphorescent devices", Applied Physics Letters, Jul. 2002 [available online Jun. 2002], vol. 81, No. 1, pp. 162-164 <DOI:10.1063/1.1489503>.
Lamansky, S. et al., "Cyclometalated Ir complexes in polymer organic light-emitting devices", Journal of Applied Physics, Aug. 2002 [available online Jul. 2002], vol. 92, No. 3, pp. 1570-1575 <10.1063/1.1491587>.
Lamansky, S. et al., "Synthesis and Characterization of Phosphorescent Cyclometalated Iridium Complexes", Inorganic Chemistry, Mar. 2001, vol. 40, No. 7, pp. 1704-1711 <DOI:10.1021/ic0008969>.
Lampe, T. et al., "Dependence of Phosphorescent Emitter Orientation on Deposition Technique in Doped Organic Films", Chemistry of Materials, Jan. 2016, vol. 28, pp. 712-715 <DOI:10.1021/acs.chemmater.5b04607>.
Lee et al. (2008). "Processing additives for inproved efficiency from bulk heterojunction solar cells," J. Am. Chem. Soc, 130, 3619-23.
Li et al. (2005). "Investigation of annealing effects and film thickness dependence of polymer solar cells based on poly (3-hexylthiophene)," J. Appl. Phys., 98, 043704. (5 pages).
Li et al. (2007). "Solvent annealing effect in polymer solar cells based on poly(3-hexylthiophene) and methanofullerenes," Adv. Funct. Mater, 17, 1636-44.
Li, J .et al., "Synthesis and characterization of cyclometalated Ir(III) complexes with pyrazolyl ancillary ligands", Polyhedron, Jan. 2004, vol. 23, No. 2-3, pp. 419-428 <DOI:10.1016/j.poly.2003.11.028>.
Li, J., "Efficient and Stable OLEDs Employing Square Planar Metal Complexes and Inorganic Nanoparticles", in DOE SSL R&D Workshop (Raleigh, North Carolina, 2016), Feb. 2016, 15 pages.
Li, J., et al., "Synthetic Control of Excited-State Properties in Cyclometalated Ir(III) Complexes Using Ancillary Ligands", Inorganic Chemistry, Feb. 2005, vol. 44, No. 6, pp. 1713-1727 <DOI:10.1021/ic048599h>.
Liang, et al. (2010). "For the bright future-bulk heterojunction polymer solar cells with power conversion efficiency of 7.4%," Adv. Mater. 22, E135-38.
Lin, TA et al., "Sky-Blue Organic Light Emitting Diode with 37% External Quantum Efficiency Using Thermally Activated Delayed

(56) References Cited

OTHER PUBLICATIONS

Fluorescence from Spiroacridine-Triazine Hybrid", Advanced Materials, Aug. 2016, vol. 28, No. 32, pp. 6876-6983 <DOI:10.1002/adma.201601675>.
Maestri et al., "Absorption Spectra and Luminescence Properties of Isomeric Platinum (II) and Palladium (II) Complexes Containing 1,1'-Biphenyldiyl, 2-Phenylpyridine, and 2,2'-Bipyridine as Ligands," Helvetica Chimica Acta, vol. 71, Issue 5, Aug. 10, 1988, pp. 1053-1059.
Marc Lepeltier et al., "Efficient blue green organic light-emitting devices based on a monofluorinated heteroleptic iridium(III) complex," Synthetic Metals, vol. 199, 2015, pp. 139-146.
Markham, J. et al., "High-efficiency green phosphorescence from spin-coated single-layer dendrimer light-emitting diodes", Applied Physics Lettersm Apr. 2002, vol. 80, vol. 15, pp. 2645-2647 <DOI:10.1063/1.1469218>.
Matthew J. Jurow et al., "Understanding and predicting the orientation of heteroleptic phosphors in organic light-emitting materials", Nature Materials, vol. 15, Jan. 2016, pp. 85-93.
Michl, J., "Relationship of bonding to electronic spectra", Accounts of Chemical Research, May 1990, vol. 23, No. 5, pp. 127-128 <DOI:10.1021/ar00173a001>.
Miller, R. et al., "Polysilane high polymers", Chemical Reviews, Sep. 1989, vol. 89, No. 6, pp. 1359-1410 <DOI:10.1021/cr00096a006>.
Morana et al. (2007). "Organic field-effect devices as tool to characterize the bipolar transport in polymer-fullerene blends: the case of P3HT-PCBM," Adv. Funct. Mat., 17, 3274-83.
Moule et al. (2008). "Controlling morphology in Polymer-Fullerene mixtures," Adv. Mater., 20, 240-45.
Murakami; JP 2007324309, English machine translation from EPO, dated Dec. 13, 2007, 89 pages.
Nazeeruddin, M. et al., "Highly Phosphorescence Iridium Complexes and Their Application in Organic Light-Emitting Devices", Journal of the American Chemical Society, Jun. 2003, vol. 125, No. 29, pp. 8790-8797 <DOI:10.1021/ja021413y>.
Nicholas R. Evans et al., "Triplet Energy Back Transfer in Conjugated Polymers with Pendant Phosphorescent Iridium Complexes," J. Am. Chem. Soc., vol. 128, 2006, pp. 6647-6656.
Nillson et al. (2007). "Morphology and phase segregation of spin-casted films of polyfluorene/PCBM Blends," Macromolecules, 40, 8291-8301.
Olynick et al. (2009). "The link between nanoscale feature development in a negative resist and the Hansen solubility sphere," Journal of Polymer Science: Part B: Polymer Physics, 47, 2091-2105.
Peet et al. (2007). "Efficiency enhancement in low-bandgap polymer solar cells by processing with alkane dithiols," Nature Materials, 6, 497-500.
Pivrikas et al. (2008). "Substituting the postproduction treatment for bulk-heterojunction solar cells using chemical additives," Organic Electronics, 9, 775-82.
Pui Keong Chow et al., "Strongly Phosphorescent Palladium(II) Complexes of Tetradentate Ligands with Mixed Oxygen, Carbon, and Nitrogen Donor Atoms: Photophysics, Photochemistry, and Applications," Angew. Chem. Int. Ed. 2013, 52, 11775-11779.
Pui-Keong Chow et al., "Highly luminescent palladium(II) complexes with sub-millisecond blue to green phosphorescent excited states. Photocatalysis and highly efficient PSF-OLEDs," Chem. Sci., 2016, 7, 6083-6098.
Results from SciFinder Compound Search on Dec. 8, 2016. (17 pages).
Rui Zhu et al., "Color tuning based on a six-membered chelated iridium (III) complex with aza-aromatic ligand," Chemistry Letters, vol. 34, No. 12, 2005, pp. 1668-1669.
Russell J. Holmes et al., "Blue and Near-UV Phosphorescence from Iridium Complexes with Cyclometalated Pyrazolyl or N-Heterocyclic Carbene Ligands," Inorganic Chemistry, 2005, vol. 44, No. 22, pp. 7995-8003.
Sajoto, T. et al., "Temperature Dependence of Blue Phosphorescent Cyclometalated Ir(III) Complexes", Journal of the American Chemical Society, Jun. 2009, vol. 131, No. 28, pp. 9813-9822 <DOI:10.1021/ja903317w>.
Sakai, Y. et al., "Simple model-free estimation of orientation order parameters of vacuum-deposited and spin-coated amorphous films used in organic light-emitting diodes", Applied Physics Express, Aug. 2015, vol. 8, No. 9, pp. 096601-1-096601-4 <DOI:10.7567/APEX.8.096601>.
Saricifci et al. (1993). "Semiconducting polymerbuckminsterfullerene heterojunctions: diodes photodiodes, and photovoltaic cells," Appl. Phys. Lett., 62, 585-87.
Satake et al., "Interconvertible Cationic and Neutral Pyridinylimidazole n3-Allylpalladium Complexes. Structural Assignment by 1H, 13C, and 15N NMR and X-ray Diffraction", Organometallics, vol. 18, No. 24, 1999, pp. 5108-5111.
Saunders et al. (2008). "Nanoparticle-polymer photovoltaic cells," Advances in Colloid and Interface Science, 138, 1-23.
Senes, A. et al., "Transition dipole moment orientation in films of solution processed fluorescent oligomers: investigating the influence of molecular anisotropy", Journal of Materials Chemistry C, Jun. 2016, vol. 4, No. 26, pp. 6302-6308 <DOI: 10.1039/c5tc03481g>.
Shih-Chun Lo et al. "High-Triplet-Energy Dendrons: Enhancing the Luminescence of Deep Blue Phosphorescent Indium(III) Complexes" J. Am. Chem. Soc., vol. 131, 2009, pp. 16681-16688.
Shin et al. (2010). "Abrupt morphology change upon thermal annealing in Poly(3-hexathiophene)/soluble fullerene blend films for polymer solar cells," Adv. Funct. Mater., 20, 748-54.
Shiro Koseki et al., "Spin-orbit coupling analyses of the geometrical effects on phosphorescence in Ir(ppy)3 and its derivatives", J. Phys. Chem. C, vol. 117, pp. 5314-5327 (2013).
Shizuo Tokito et al. "Confinement of triplet energy on phosphorescent molecules for highly-efficient organic blue-light-emitting devices" Applied Physics Letters, vol. 83, No. 3, Jul. 21, 2003, pp. 569-571.
Stefan Bernhard, "The First Six Years: A Report," Department of Chemistry, Princeton University, May 2008, 11 pages.
Stephen R. Forrest, "The path to ubiquitous and low-cost organic electronic appliances on plastic," Nature, vol. 428, Apr. 29, 2004, pp. 911-918.
Steven C. F. Kui et al., "Robust phosphorescent platinum(II) complexes with tetradentate ONCN ligands: high efficiency OLEDs with excellent efficiency stability," Chem. Commun., 2013, vol. 49, pp. 1497-1499.
Steven C. F. Kui et al., "Robust Phosphorescent Platinum(II) Complexes Containing Tetradentate ONCN Ligands: Excimeric Excited State and Application in Organic White-Light-Emitting Diodes," Chem. Eur. J., 2013, vol. 19, pp. 69-73.
Strouse, G. et al., "Optical Spectroscopy of Single Crystal [Re(bpy)(CO)4](PF6): Mixing between Charge Transfer and Ligand Centered Excited States", Inorganic Chemistry, Oct. 1995, vol. 34, No. 22, pp. 5578-5587 <DOI:10.1021/ic00126a031>.
Supporting Information: Xiao-Chun Hang et al., "Highly Efficient Blue-Emitting Cyclometalated Platinum(II) Complexes by Judicious Molecular Design," Wiley-VCH 2013, 7 pages.
Sylvia Bettington et al. "Tris-Cyclometalated Iridium(III) Complexes of Carbazole(fluorenyl)pyridine Ligands: Synthesis, Redox and Photophysical Properties, and Electrophosphorescent Light-Emitting Diodes" Chemistry: A European Journal, 2007, vol. 13, pp. 1423-1431.
Tang, C. et al., "Organic electroluminescent diodes", Applied Physics Letters, Jul. 1987, vol. 51, No. 12, pp. 913-915 <DOI:10.1063/1.98799>.
Tsuoboyama, A. et al., "Homoleptic Cyclometalated Iridium Complexes with Highly Efficient Red Phosphorescence and Application to Organic Light-Emitting Diode", Journal of the American Chemical Society, Sep. 2003, vol. 125, No. 42, pp. 12971-12979 <DOI:10.1021/ja034732d>.
Turro, N., "Modern Molecular Photochemistry" (Sausalito, California, University Science Books, 1991), p. 48. (3 pages).

(56) References Cited

OTHER PUBLICATIONS

Tyler Fleetham et al., "Efficient "pure" blue OLEDs employing tetradentate Pt complexes with a narrow spectral bandwidth," Advanced Materials (Weinheim, Germany), Vo. 26, No. 41, 2014, pp. 7116-7121.
Tyler Fleetham et al., "Efficient Red-Emitting Platinum Complex with Long Operational Stability," ACS Appl. Mater. Interfaces 2015, 7, 16240-16246.
V. Adamovich et al., "High efficiency single dopant white electrophosphorescent light emitting diodes", New J. Chem, vol. 26, pp. 1171-1178. 2002.
V. Thamilarasan et al., "Green-emitting phosphorescent iridium(III) complex: Structural, photophysical and electrochemical properties," Inorganica Chimica Acta, vol. 408, 2013, pp. 240-245.
Vanessa Wood et al., "Colloidal quantum dot light-emitting devices," Nano Reviews 1, Jul. 2010, pp. 5202. (7 pages).
Vezzu, D. et al.: Highly luminescent tridentate platinum complexes featured in fused five-six-membered metallocycle and diminishing quenching. Inorganic Chem., vol. 50 (17), pp. 8261-8273, 2011.
Wang et al. (2010). "The development of nanoscale morphology in polymer: fullerene photovoltaic blends during solvent casting," Soft Matter, 6, 4128-4134.
Wang et al., C(aryl)-C(alkyl) bond formation from Cu(Cl04)2-mediated oxidative cross coupling reaction between arenes and alkyllithium reagents through structurally well-defined Ar—Cu(III) intermediates, Chem Commun, 48: 9418-9420 (2012).
Williams, E. et al., "Excimer Based White Phosphorescent Organic Light□Emitting Diodes with Nearly 100 % Internal Quantum Efficiency", Advanced Materials, Jan. 2007, vol. 19, No. 2, pp. 197-202 <DOI:10.1002/adma.200602174>.
Williams, E. et al., "Organic light-emitting diodes having exclusive near-infrared electrophosphorescence", Applied Physics Letters, Aug. 2006, vol. 89, No. 8, pp. 083506-1-083506-3 <DOI:10.1063/1.2335275>.
Wong. Challenges in organometallic research—Great opportunity for solar cells and OLEDs. Journal of Organometallic Chemistry 2009, vol. 694, pp. 2644-2647.
Xiao-Chu Hang et al., "Highly Efficient Blue-Emitting Cyclometalated Platinum(II) Complexes by Judicious Molecular Design," Angewandte Chemie, International Edition, vol. 52, Issue 26, Jun. 24, 2013, pp. 6753-6756.
Xiaofan Ren et al., "Ultrahigh Energy Gap Hosts in Deep Blue Organic Electrophosphorescent Devices," Chem. Mater., vol. 16, 2004, pp. 4743-4747.
Xin Li et al., "Density functional theory study of photophysical properties of iridium (III) complexes with phenylisoquinoline and phenylpyridine ligands", The Journal of Physical Chemistry C, 2011, vol. 115, No. 42, pp. 20722-20731.
Yakubov, L.A. et al., Synthesis and Properties of Zinc Complexes of mesoHexadecyloxy-Substituted Tetrabenzoporphyrin and Tetrabenzoazaporphyrins, Russian Journal of Organic Chemistry, 2008, vol. 44, No. 5, pp. 755-760.
Yang et al. (2005). "Nanoscale morphology of high-performance polymer solar cells," Nano Lett., 5, 579-83.
Yang, X. et al., "Efficient Blue□and White□Emitting Electrophosphorescent Devices Based on Platinum(II) [1,3□Difluoro□4,6□di(2□pyridinyl)benzene] Chloride", Advanced Materials, Jun. 2008, vol. 20, No. 12, pp. 2405-2409 <DOI:10.1002/adma.200702940>.
Yao et al. (2008). "Effect of solvent mixture on nanoscale phase separation in polymer solar cells," Adv. Funct. Mater., 18, 1783-89.
Yao et al., Cu(Cl04)2-Mediated Arene C—H Bond Halogenations of Azacalixaromatics Using Alkali Metal Halides as Halogen Sources, The Journal of Organic Chemistry, 77(7): 3336-3340 (2012).
Ying Yang et al., "Induction of Circularly Polarized Electroluminescence from an Achiral Light-Emitting Polymer via a Chiral Small-Molecule Dopant," Advanced Materials, vol. 25, Issue 18, May 14, 2013, pp. 2624-2628.
Yu et al. (1995). "Polymer Photovoltaic Cells: Enhanced efficiencies via a network of internal donor-acceptor heterojunctions," Science, 270, 1789-91.
Z Liu et al., "Green and blue-green phosphorescent heteroleptic iridium complexes containing carbazole-functionalized beta-diketonate for non-doped organic light-emitting diodes", Organic Electronics 9 (2008) pp. 171-182.
Z Xu et al., "Synthesis and properties of iridium complexes based 1,3,4-oxadiazoles derivatives", Tetrahedron 64 (2008) pp. 1860-1867.
Zhi-Qiang Zhu et al., "Efficient Cyclometalated Platinum(II) Complex with Superior Operational Stability," Adv. Mater. 29 (2017) 1605002, pp. 1-5.
Zhi-Qiang Zhu et.al., "Harvesting All Electrogenerated Excitons through Metal Assisted Delayed Fluorescent Materials," Adv. Mater. 27 (2015) 2533-2537.
Zhu, W. et al., "Highly efficient electrophosphorescent devices based on conjugated polymers doped with iridium complexes", Applied Physics Letters, Mar. 2002, vol. 80, No. 12, pp. 2045-2047 <DOI:10.1063/1.1461418>.
Tyler Fleetham, "Phosphorescent Pt(II) and Pd(II) Complexes for Efficient, High-Color-Quality, and Stable OLEDs", 52 pages, Material Science and Engineering, Arizona State University (Year: 2016).
The claim set of the U.S. Appl. No. 62/444,973, filed Jan. 11, 2017, Lichang Zeng, 36 pages. (Year: 2017).
Korean Office Action (with English translation) for App. No. KR10-2015-0104260, dated Jan. 12, 2022, 12 pages.
Machine-translated English version of JP 2012/074444 A, Sekine Noboru, Apr. 12, 2012 (Year: 2012) 75 pages.
JP4460952 machine translation downloaded from Google patents Dec. 30, 2022.
J. Park et al., 26 Semicond. Sci. Technol., 1-9 (2011) (Year: 2011).
S. Kunic et al., 54th International Symposium ELMAR-2012, 31-35 (2012) (Year: 2012).
T. Fleetham et al., 25 Advanced Materials, 2573-2576 (2013) (Year: 2013).
Y. Karzazi, 5 J. Mater. Environ. Sci., 1-12 (2014) (Year: 2014).

* cited by examiner

METAL-ASSISTED DELAYED FLUORESCENT EMITTERS EMPLOYING BENZO-IMIDAZO-PHENANTHRIDINE AND ANALOGUES

CROSS-REFERENCE TO RELATED APPLICATIONS

The present application is a continuation of, and claims priority to, U.S. patent application Ser. No. 16/668,010, filed Oct. 30, 2019, now allowed, which in turn is a continuation of U.S. patent application Ser. No. 15/983,680, filed May 18, 2018, now issued as U.S. Pat. No. 10,516,117, and which claims priority under 35 U.S.C. § 119(e) to U.S. Provisional Application Ser. No. 62/508,560, filed May 19, 2017 and U.S. Provisional Application Ser. No. 62/508,782, filed May 19, 2017, all of which are incorporated herein by reference in their entireties.

STATEMENT OF GOVERNMENT INTEREST

This invention was made with government support under DE-EE0007090 awarded by the Department of Energy. The government has certain rights in the invention.

TECHNICAL FIELD

This invention relates to metal-assisted delayed fluorescent (MADF) emitters employing benzo-imidazo-phenanthridine and analogues for full color displays and lighting applications.

BACKGROUND

Compounds capable of absorbing or emitting light can be used in a variety of optical and electro-optical devices, including photo-absorbing devices (e.g., solar- and photo-sensitive devices), photo-emitting devices, organic light-emitting diodes (OLEDs), and devices capable of photo-absorption and photo-emission. Much research has been devoted to the discovery and optimization of organic and organometallic materials for use in optical and electro-optical devices. Metal complexes can be used for many applications, such as emitters for OLEDs. Despite advances in research devoted to optical and electro-optical materials, many currently available materials exhibit a number of disadvantages, including poor processing ability, inefficient emission or absorption, and insufficient stability.

SUMMARY

General Formulas I-III represent MADF emitters based on cyclic platinum (II) and palladium (II) complexes employing benzo-imidazo-phenanthridine and analogues.

General Formula I

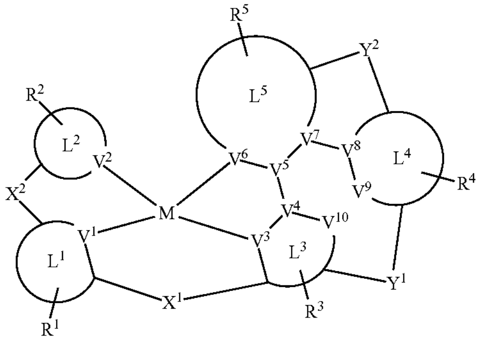

-continued

General Formula II

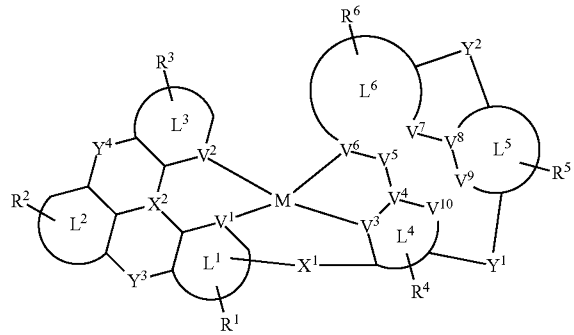

General Formula III

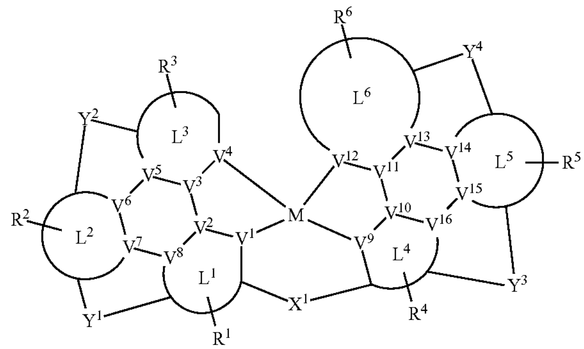

In General Formulas I-III:

M is Pt (II) or Pd (II), each of $V^1$-$V^{16}$, if present, is independently C, N, Si, O, S, Ge, P, As, Se, B, Al, or Bi, each of $X^1$, $X^2$, $Y^1$, $Y^2$, $Y^3$, and $Y^4$ is independently present or absent, and each $X^1$, $X^2$, $Y^1$, $Y^2$, $Y^3$, and $Y^4$ present independently represents C, N, Si, O, S, Ge, P, As, Se, B, Al, or Bi, or if valency permits, each independently represents $CR^7$, $SiR^7$, $GeR^7$, $NR^7$, P═O, As═O, B, $BR^7$, $AlR^7$, Bi═O, $CR^7R^8$, C═O, $SiR^7R^8$, $GeR^7R^8$, $NR^7$, $PR^7$, $PR^7R^8$, $R^7P$═O, $AsR^7$, $R^7As$═O, S═O, $SO_2$, Se═O, $SeO_2$, $BR^7$, $BR^7R^8$, $AlR^7$, $AlR^7R^8$, $R^7Bi$═O, or $BiR^7$, each of $L^1$, $L^2$, $L^3$, and $L^4$ is independently present or absent, and each $L^1$, $L^2$, $L^3$, and $L^4$ present independently represents a substituted or unsubstituted aryl, heteroaryl, or N-heterocyclic carbene, and each of R, $R^1$, $R^2$, $R^3$, $R^4$, $R^5$, $R^6$, $R^7$, and $R^8$ is independently absent or present as a single substituent or multiple substituents, valency permitting, and each R, $R^1$, $R^2$, $R^3$, $R^4$, $R^5$, $R^6$, $R^7$, and $R^8$ present independently represents deuterium, halogen, hydroxyl, thiol, nitro, cyanide, isocyanide, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof.

General Formula IV represents MADF emitters based on cyclic platinum (II) and palladium (II) complexes employing benzo-imidazo-phenanthridine and analogues.

General Formula IV
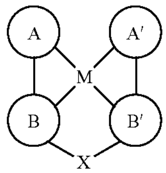
In General Formula IV:
M is Pt (II) or Pd (II)
X represents a single bond or $CR^7R^8$, C═O, $SiR^7R^8$, $GeR^7R^8$, $NR^7$, $PR^7$, $PR^7R^8$, $R^7P$═O, $AsR^7$, $R^7As$═O, O, S, S═O, $SO_2$, Se, Se═O, $SeO_2$, $BR^7$, $BR^7R^8$, $AlR^7$, $AlR^7R^8$, $R^7Bi$═O, or $BiR^7$,
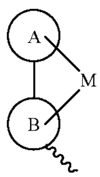
and
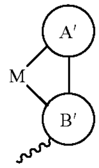
each independently represents one of the following chemical moieties:
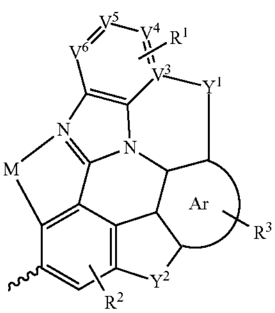
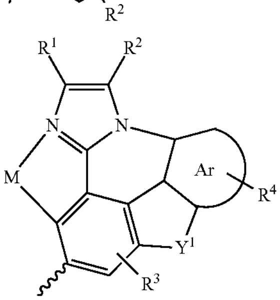
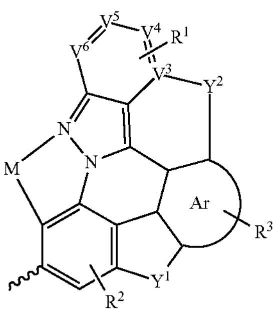
-continued
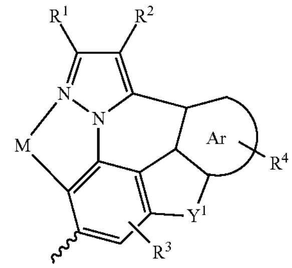
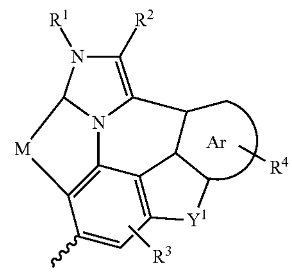
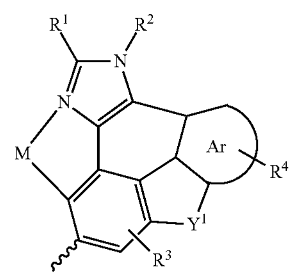
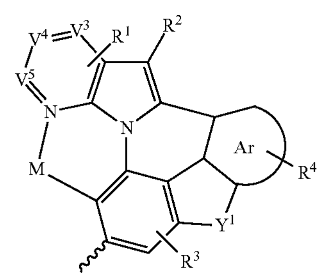
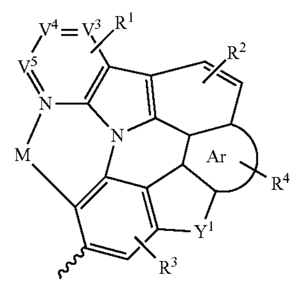
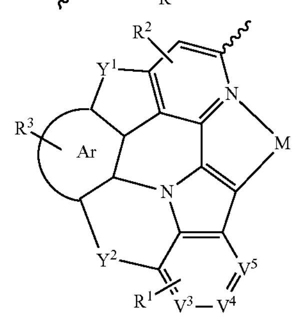

-continued
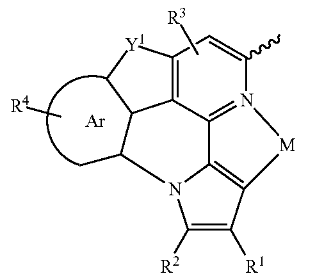
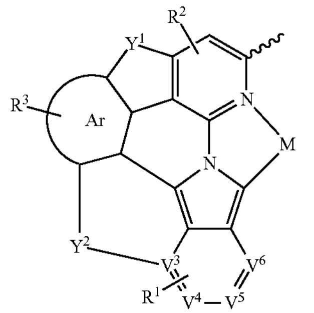
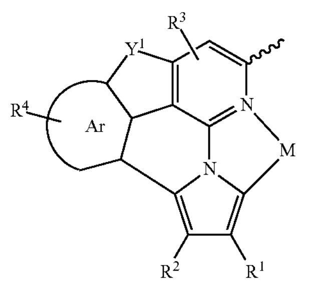
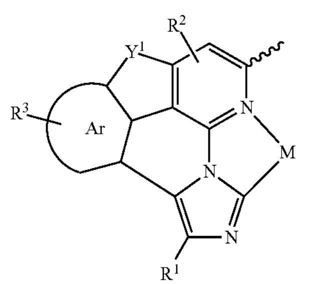
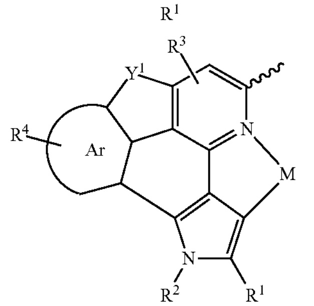
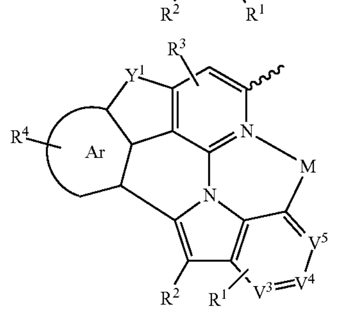
-continued
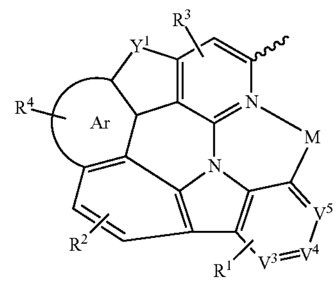
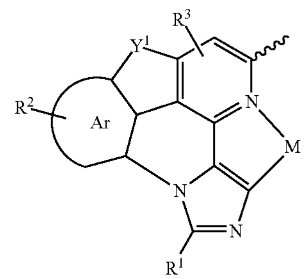
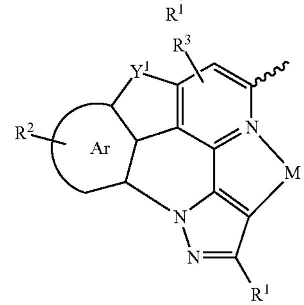
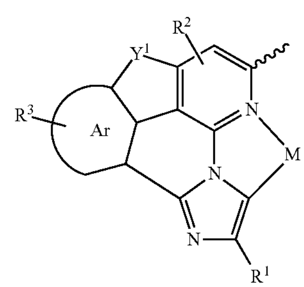
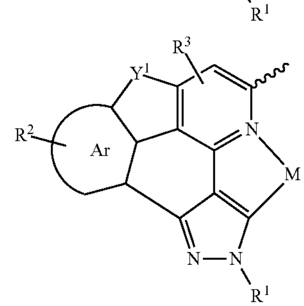
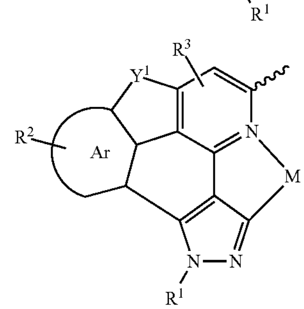

-continued
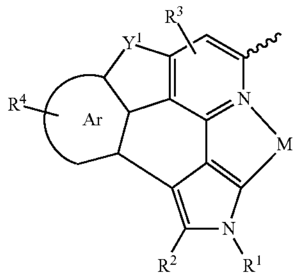
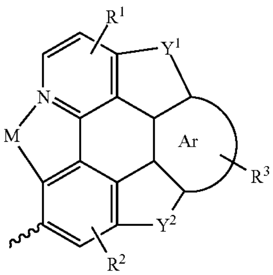
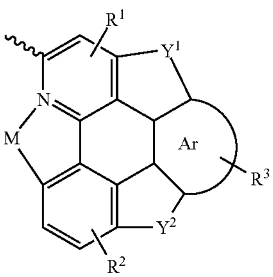
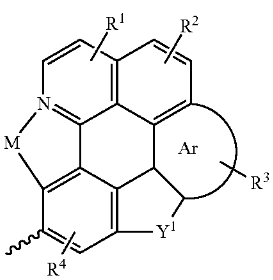
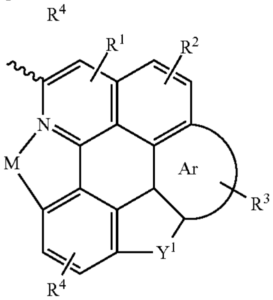
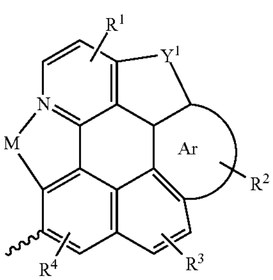
-continued
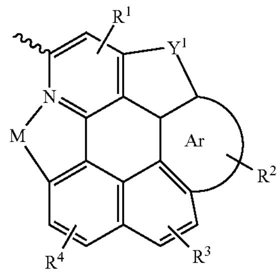
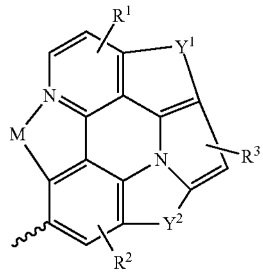
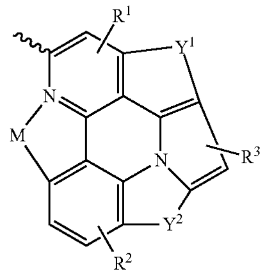
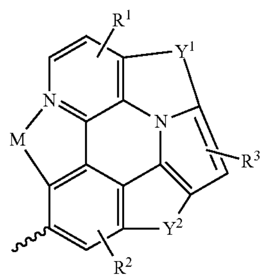
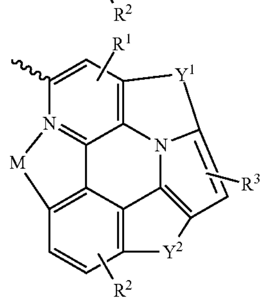
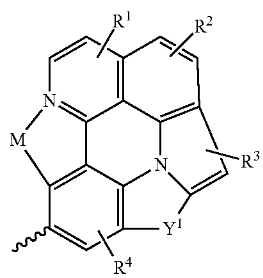

-continued
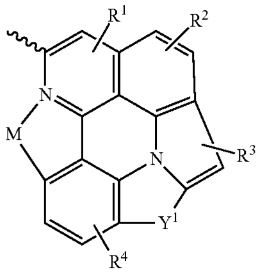
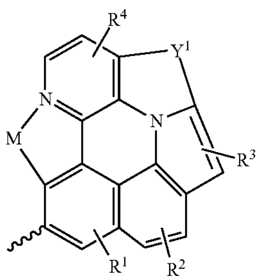
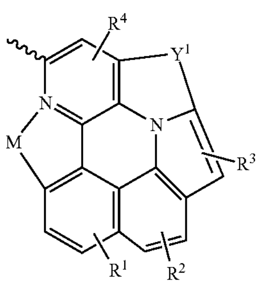
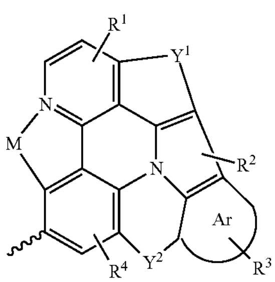
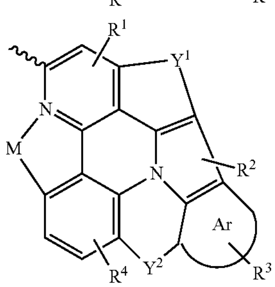
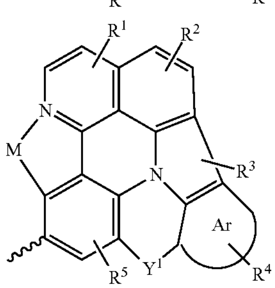
-continued
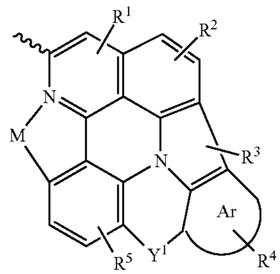
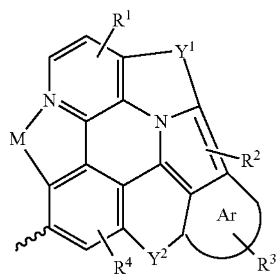
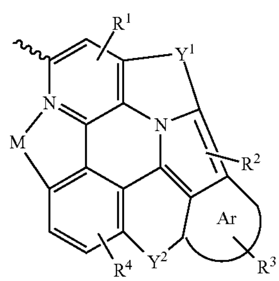
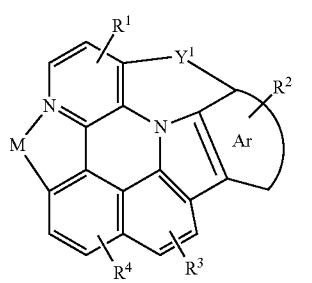
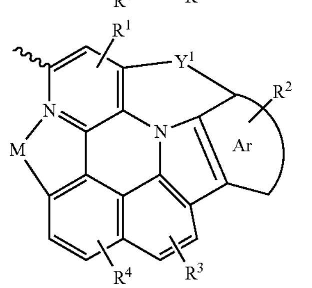
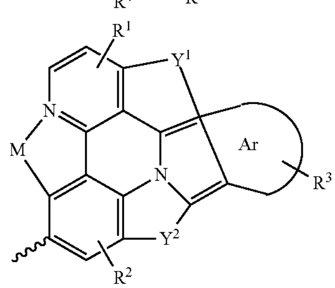

-continued
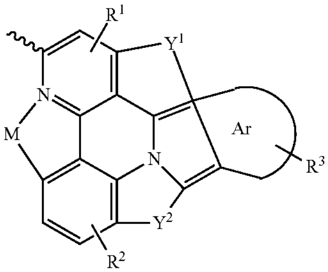
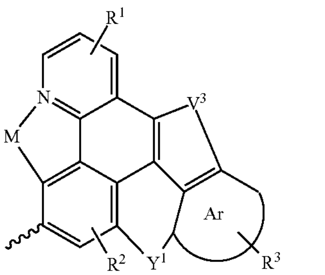
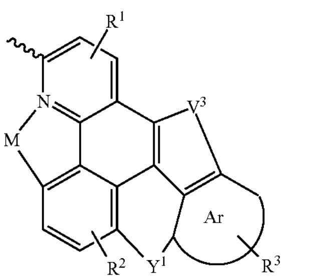
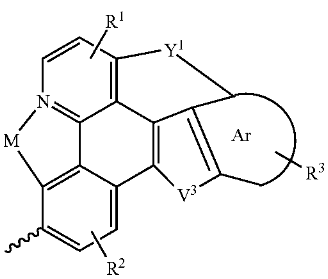
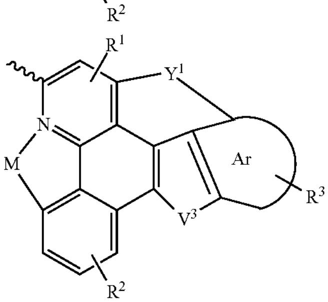
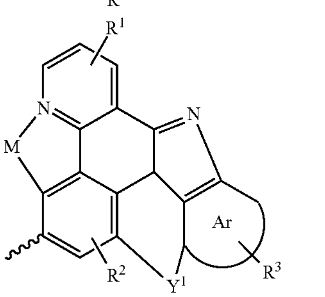
-continued
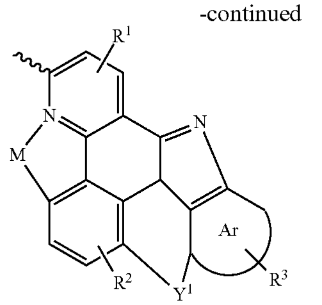
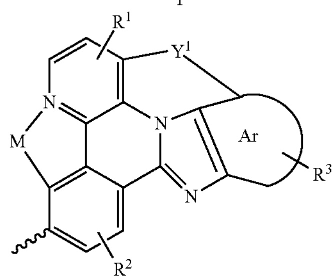
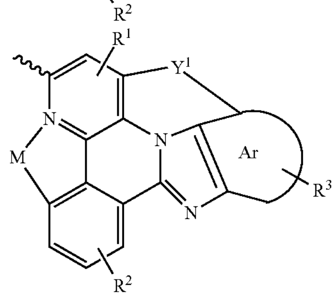
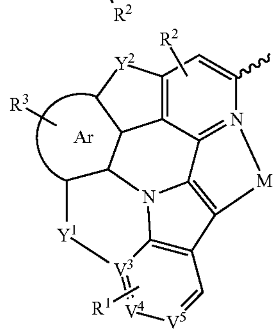
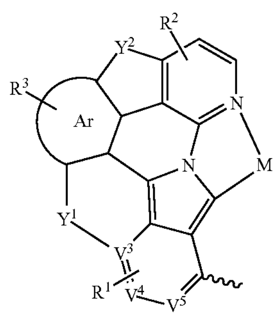
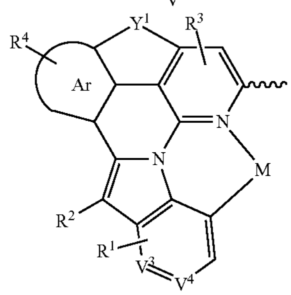

-continued

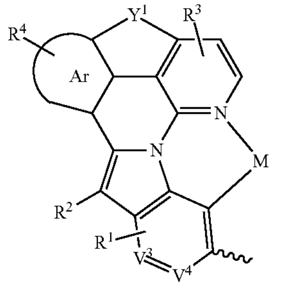

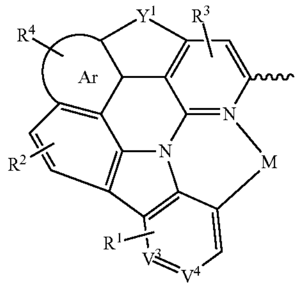

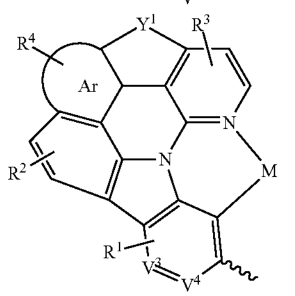

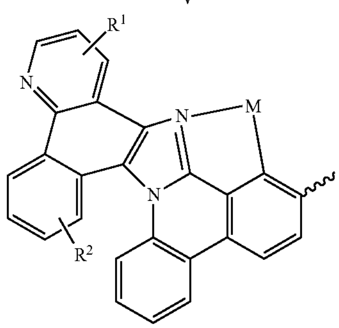

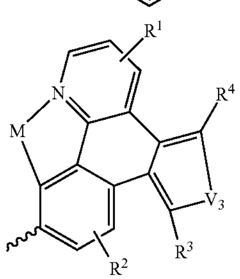

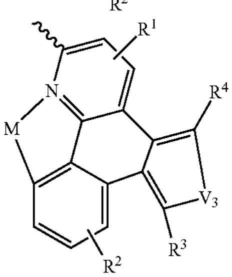

where:

N is nitrogen, each of $V^1$, $V^2$, $V^3$, $V^4$, $V^5$, and $V^6$, if present, is independently C, N, Si, O, S, Ge, P, As, Se, B, Al, or Bi, each of $X^1$, $X^2$, $Y^1$, $Y^2$, $Y^3$, and $Y^4$ is independently present or absent, and each $X^1$, $X^2$, $Y^1$, $Y^2$, $Y^3$, and $Y^4$ present independently represents C, N, Si, O, S, Ge, P, As, Se, B, Al, or Bi, or valency permitting, $CR^7$, $SiR^7$, $GeR^7$, $NR^7$, P═O, As═O, B, $BR^7$, $AlR^7$, Bi═O, $CR^7R^8$, C═O, $SiR^7R^8$, $GeR^7R^8$, $NR^7$, $PR^7$, $PR^7R^8$, $R^7$P═O, $AsR^7$, $R^7$As═O, S═O, $SO_2$, Se═O, $SeO_2$, $BR^7$, $BR^7R^8$, $AlR^7$, $AlR^7R^8$, $R^7$Bi═O, or $BiR^7$, each of $L^1$, $L^2$, $L^3$, and $L^4$ is independently present or absent, and each $L^1$, $L^2$, $L^3$, and $L^4$ present independently represents a substituted or unsubstituted aryl, heteroaryl, or N-heterocyclic carbene, each of R, $R^1$, $R^2$, $R^3$, $R^4$, $R^5$, $R^6$, $R^7$, and $R^8$ is independently absent or present as a single substituent or multiple substituents, valency permitting, and each R, $R^1$, $R^2$, $R^3$, $R^4$, $R^5$, $R^6$, $R^7$, and $R^8$ present independently represents deuterium, halogen, hydroxyl, thiol, nitro, cyanide, isocyanide, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof, and each of

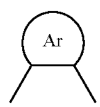

is independently present or absent, and each Ar present independently represents a substituted or unsubstituted aryl, heteroaryl, or N-heterocyclic carbene.

General Formulas V-XIII represent MADF emitters based on cyclic platinum (II) and palladium (II) complexes employing benzo-imidazo-phenanthridine and analogues.

General Formula V

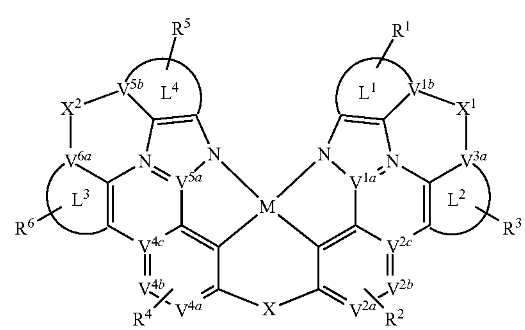

-continued

General Formula VI

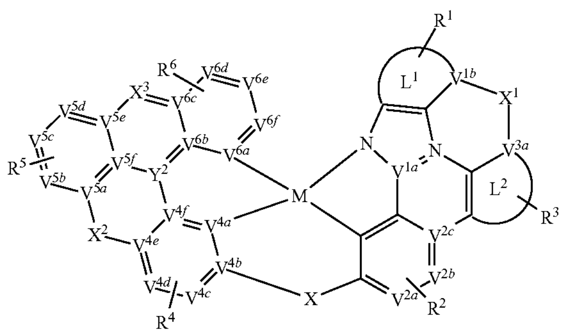

General Formula VII

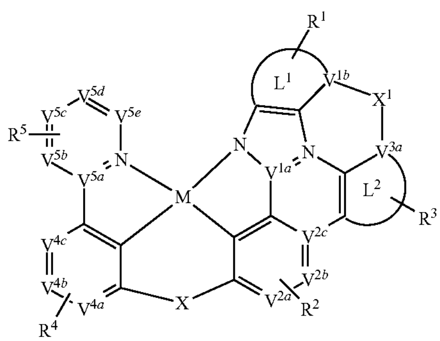

General Formula VIII

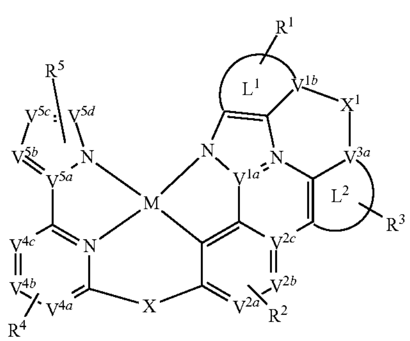

General Formula IX

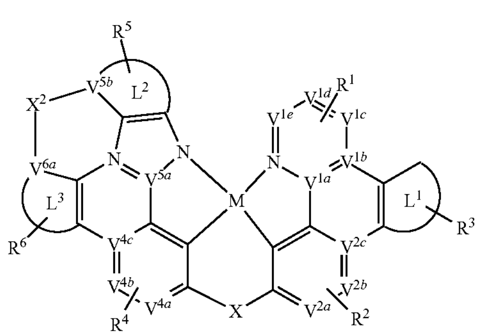

-continued

General Formula X

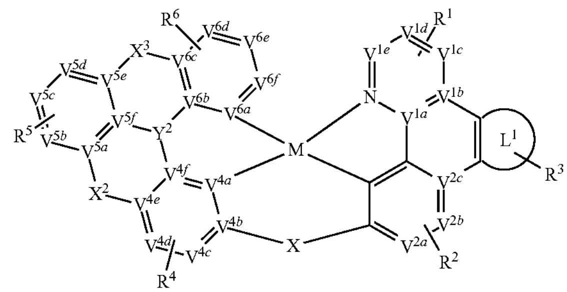

General Formula XI

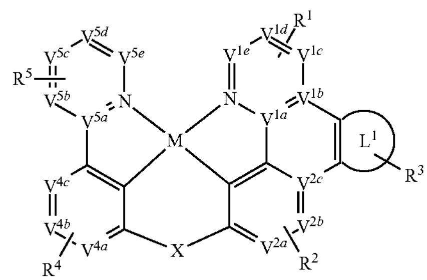

General Formula XII

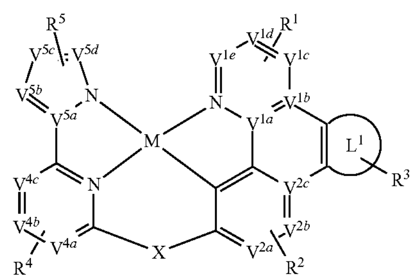

General Formula XIII

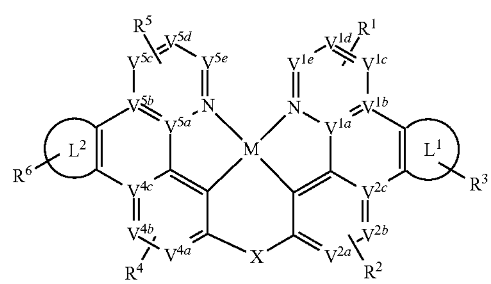

In General Formulas V-XIII,

M is Pt (II) or Pd (II),

N is nitrogen, each of $V^{1a}$-$V^{1f}$, $V^{2a}$-$V^{2f}$, $V^{3a}$-$V^{3f}$, $V^{4a}$-$V^{4f}$, $V^{5a}$-$V^{5f}$, and $V^{6a}$-$V^{6f}$, if present, is independently N, C, P, O, S, or Si, each of X, $X^1$, $X^2$, $X^3$, and $X^4$ is independently present or absent, and each X, $X^1$, $X^2$, $X^3$, and $X^4$ present independently represents a single bond, $CR^7R^8$, C═O, $SiR^7R^8$, $GeR^7R^8$, $NR^7$, $PR^7$, $PR^7R^8$, $R^7P$═O, $AsR^7$, $R^7As$═O, O, S, S═O, $SO_2$, Se, Se═O, $SeO_2$, $BR^7$, $BR^7R^8$, $AlR^7$, $AlR^7R^8$, $R^7Bi$═O, or $BiR^7$, each of $Y^1$ and $Y^2$ is independently CR, SiR, GeR, N, NR, P, P═O, As, As═O, B, BR, Al, AlR, Bi═O, or Bi, each of $L^1$, $L^2$, $L^3$, and $L^4$ is independently present or absent, and each $L^1$, $L^2$, $L^3$, and $L^4$ present independently represents a substituted or unsubstituted aryl, heteroaryl, or N-heterocyclic carbene, each of R, $R^1$, $R^2$, $R^3$, $R^4$, $R^5$, $R^6$, $R^7$, and $R^8$ is independently absent or present as a single substituent or multiple substituents, valency permitting, and each R, $R^1$, $R^2$, $R^3$, $R^4$, $R^5$, $R^6$, $R^7$, and $R^8$ present independently represents deuterium, halogen, hydroxyl, thiol, nitro, cyanide, isocyanide, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof.

Octahedral iridium (III) metal-assisted delayed fluorescent (MADF) emitters employing benzo-imidazo-phenanthridine are represented by General Formulas XIV-XVII.

General Formula XIV

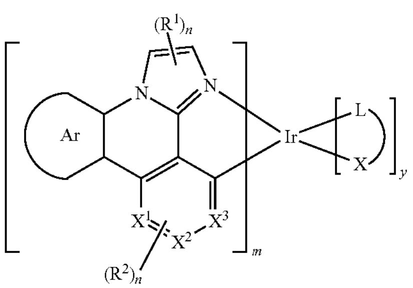

General Formula XV

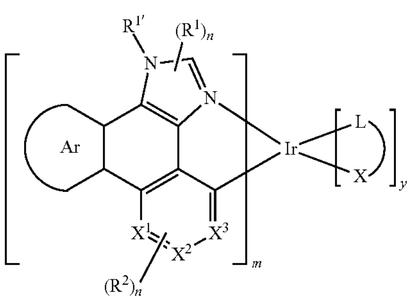

General Formula XVI

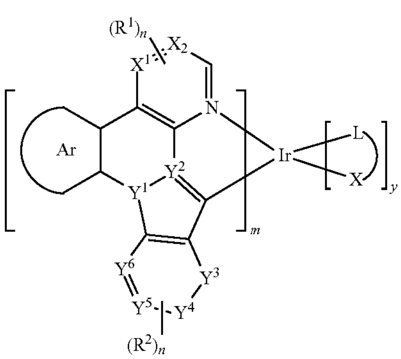

-continued

General Formula XVII

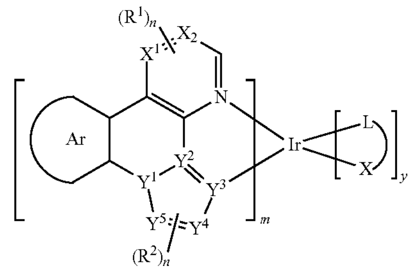

In General Formulas XIV-XVII, y=0, 1, or 2, and m+y=3. For m=3, the moieties can be the same or different. That is, when m=3, the three moieties can be the same, two of the moieties can be the same, or all three of the moieties can be different.

Implementations include a light emitting diode including a complex of General Formulas I-XVII, and a lighting device including such light emitting diode.

These general and specific aspects may be implemented using a device, system or method, or any combination of devices, systems, or methods. The details of one or more embodiments are set forth in the accompanying drawings and the description below. Other features, objects, and advantages will be apparent from the description and drawings, and from the claims.

DETAILED DESCRIPTION

Figure 1:
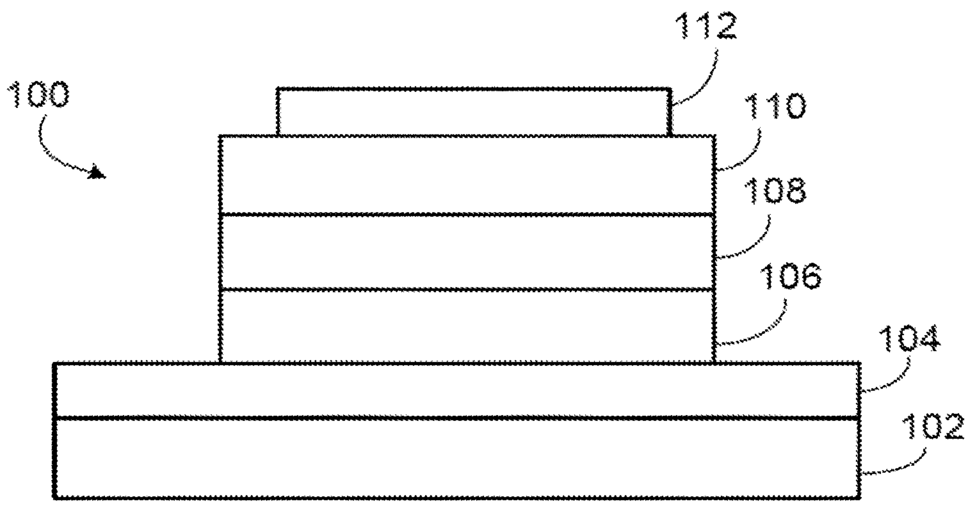
FIG. 1 depicts a cross-sectional view of an organic light-emitting device.

Cyclometalated Pt (II) and Pd (II) complexes have found wide applications as emitters for OLEDs in recent decades. Metal-assisted delayed fluorescent (MADF) emitters based on Pt (II) and Pd (II) complexes can exhibit both singlet and triplet excitons, resulting in a unity internal quantum efficiency and short lifetimes. Through the judicious design of cyclometalating ligands, MADF emitters can display singlet-triplet energy splitting.

MADF emitters based on cyclic platinum (II) and palladium (II) complexes employing benzo-imidazo-phenanthridine and analogues are disclosed. The triplet state consists mostly of the lower energy C^N portion of the molecules which is localized on the benzo-imidazo-phenanthridine (or analogues). The singlet energy can be reduced by extending the conjugation of benzo-imidazo-phenanthridine (or analogues) with no or little energy change of triplet energy. The small energy gap between singlet and triplet allows excitons to be thermally promoted to the singlet state and efficiently emitted via thermally assisted delayed fluorescence (TADF) while the remaining triplet excitons can emit via the available efficient phosphorescent pathway. This class of emitters is suitable for full color displays and lighting applications.

MADF emitters employing benzo-imidazo-phenanthridine and analogues include compounds of General Formulas I-III shown below.

General Formula I

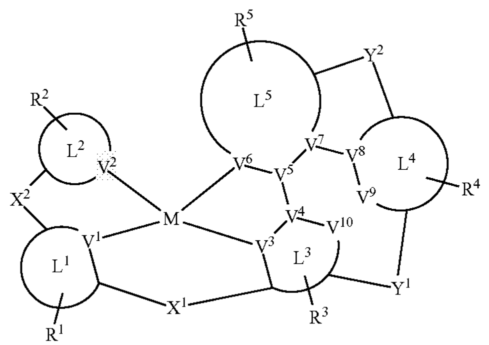

General Formula II

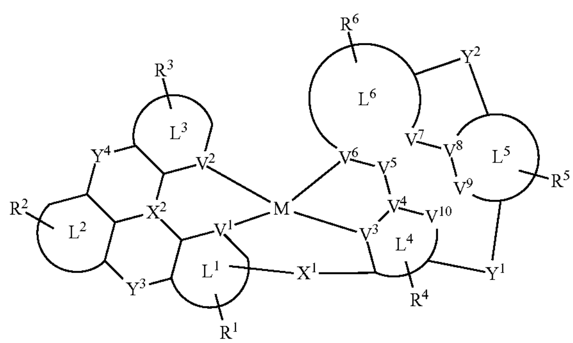

General Formula III

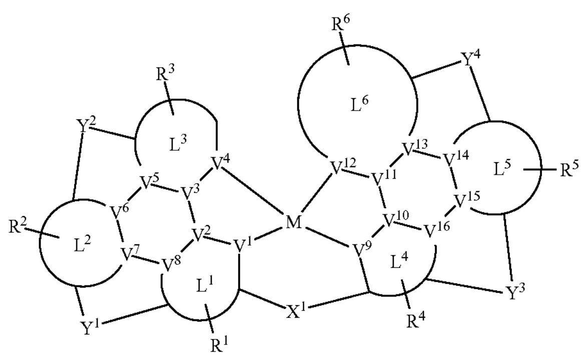

In General Formulas I-III:

M is Pt (II) or Pd (II), each of $V^1$-$V^{16}$, if present, is independently C, N, Si, O, S, Ge, P, As, Se, B, Al, or Bi, each of $X^1$, $X^2$, $Y^1$, $Y^2$, $Y^3$, and $Y^4$ is independently present or absent, and each $X^1$, $X^2$, $Y^1$, $Y^2$, $Y^3$, and $Y^4$ present independently represents C, N, Si, O, S, Ge, P, As, Se, B, Al, or Bi, or if valency permits, each independently represents $CR^7$, $SiR^7$, $GeR^7$, $NR^7$, P=O, As=O, B, $BR^7$, $AlR^7$, Bi=O, $CR^7R^8$, C=O, $SiR^7R^8$, $GeR^7R^8$, $NR^7$, $PR^7$, $PR^7R^8$, $R^7P$=O, $AsR^7$, $R^7As$=O, S=O, $SO_2$, Se=O, $SeO_2$, $BR^7$, $BR^7R^8$, $AlR^7$, $AlR^7R^8$, $R^7Bi$=O, or $BiR^7$, each of $L^1$, $L^2$, $L^3$, $L^4$, $L^5$, and $L^6$ is independently present or absent, and each $L^1$, $L^2$, $L^3$, $L^4$, $L^5$, and $L^6$ present independently represents a substituted or unsubstituted aryl, heteroaryl, or N-heterocyclic carbene, and each of R, $R^1$, $R^2$, $R^3$, $R^4$, $R^5$, $R^6$, $R^7$, and $R^8$ is independently absent or present as a single substituent or multiple substituents, valency permitting, and each R, $R^1$, $R^2$, $R^3$, $R^4$, $R^5$, $R^6$, $R^7$, and $R^8$ present independently represents deuterium, halogen, hydroxyl, thiol, nitro, cyanide, isocyanide, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof.

Examples of suitable substituents $R^1$-$R^8$ include:

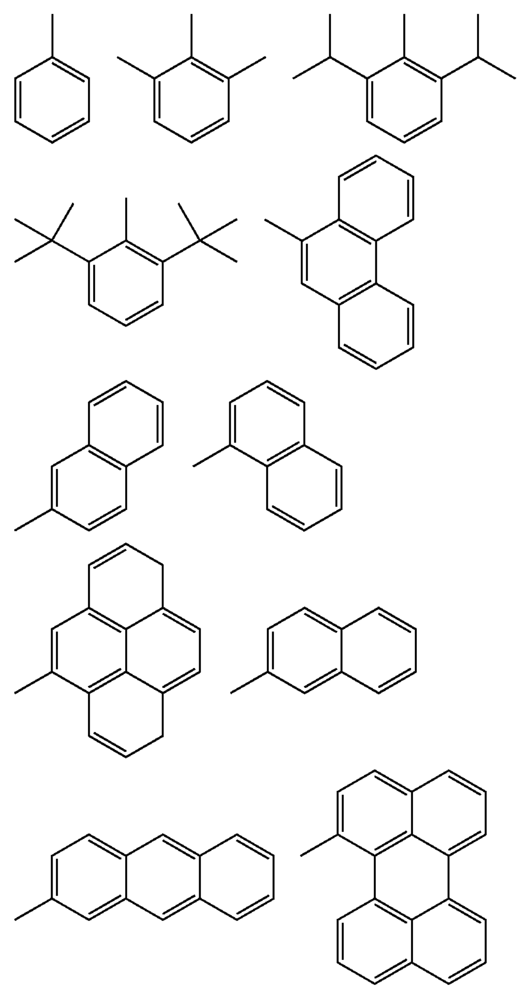

-continued
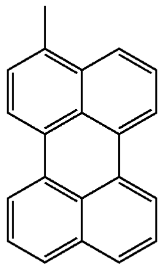
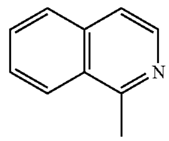
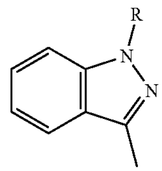
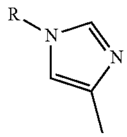
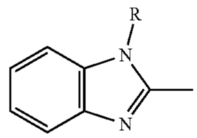
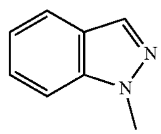
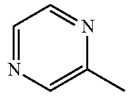
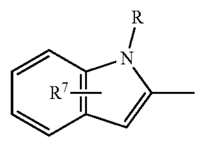
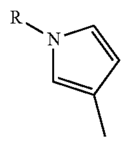
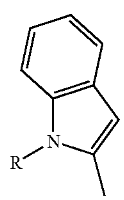
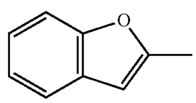
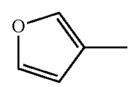
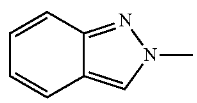
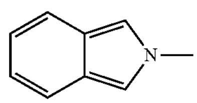
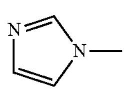
.
Examples of General Formulas I-III are shown below.
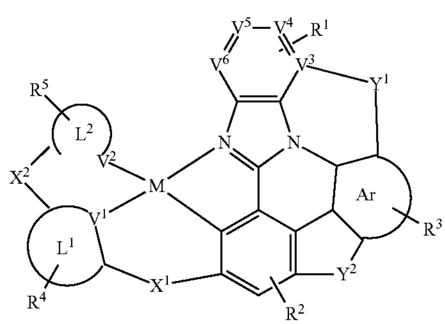
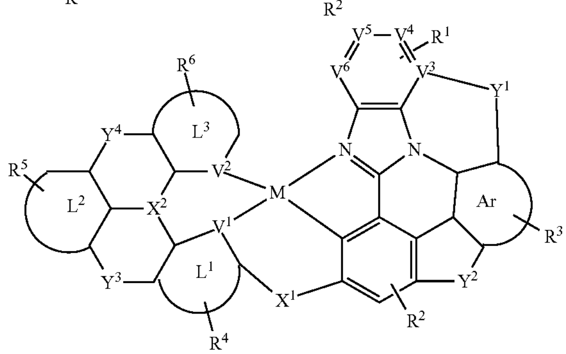
-continued
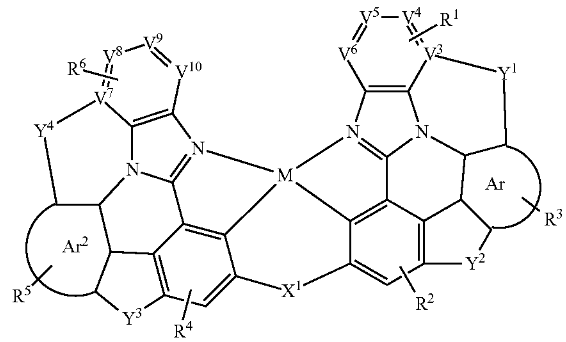
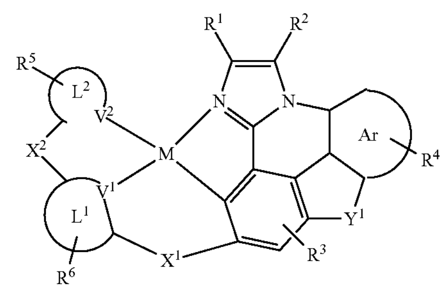
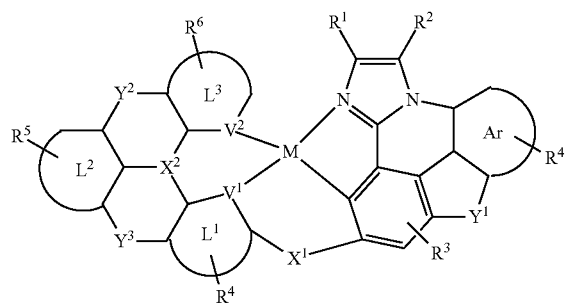
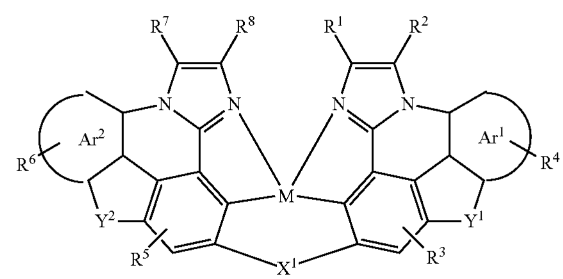
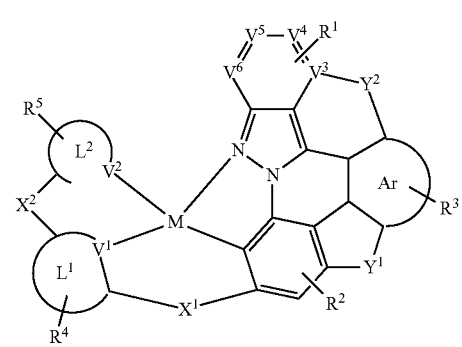

-continued
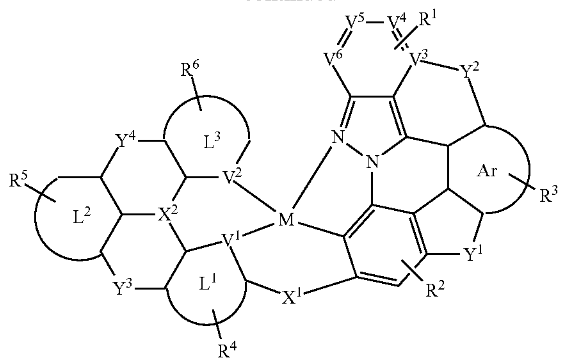
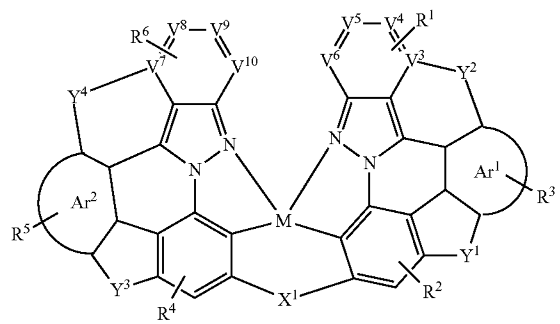
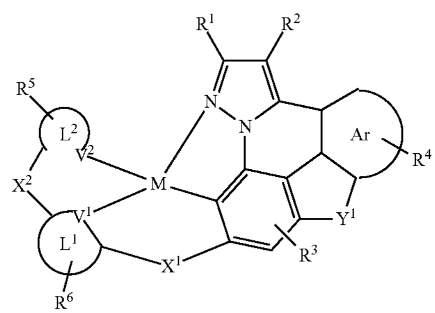
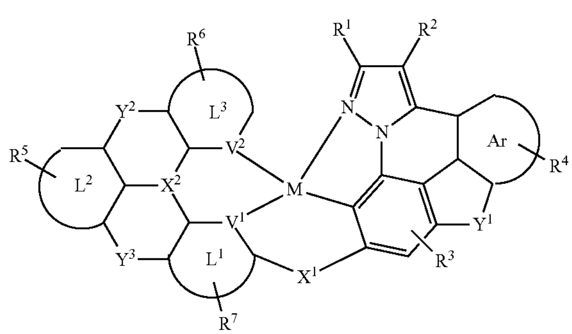
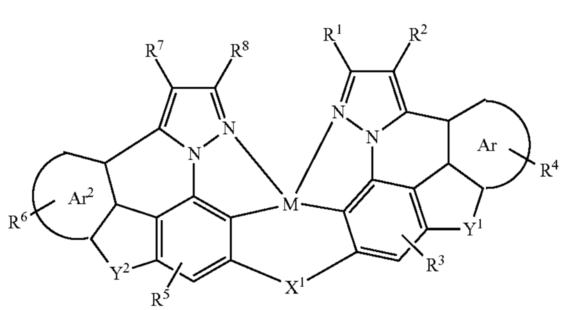
-continued
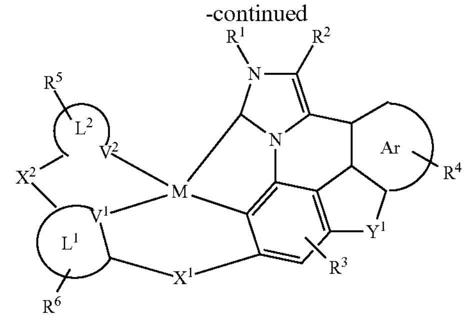
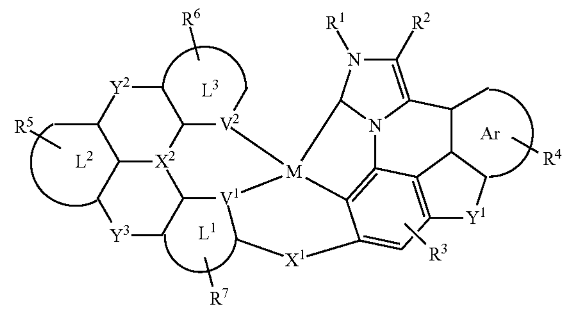
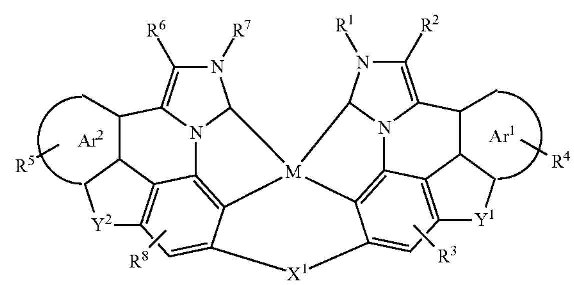
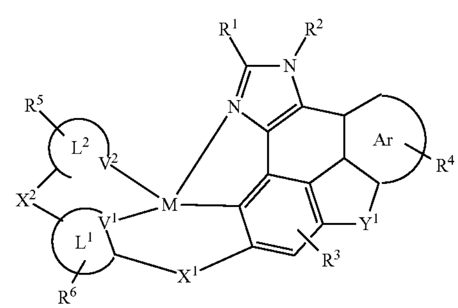
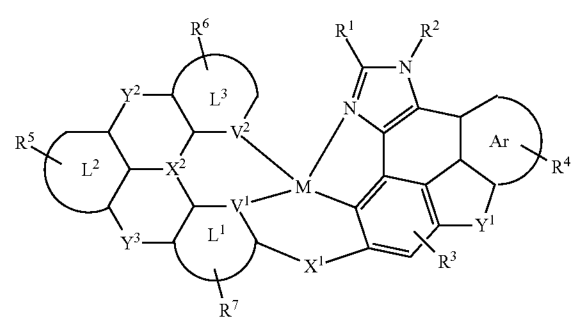

-continued
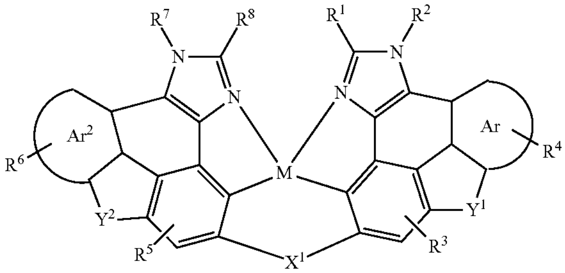
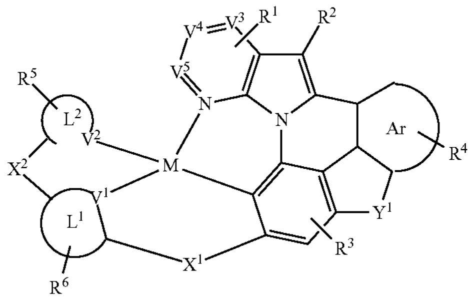
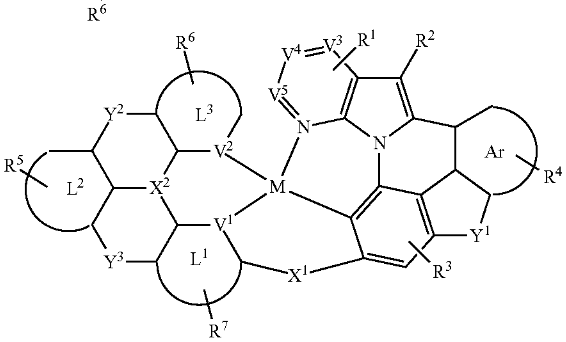
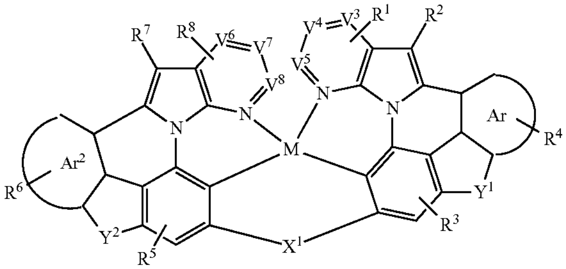
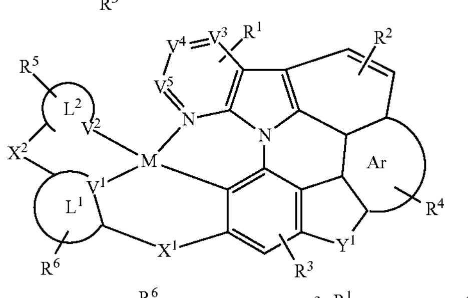
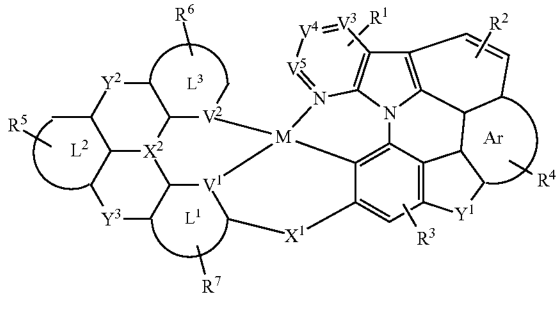
-continued
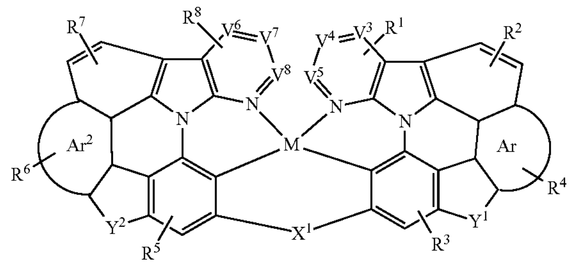
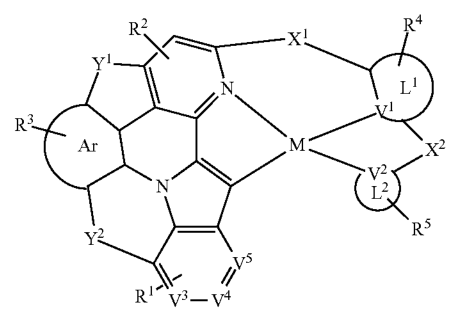
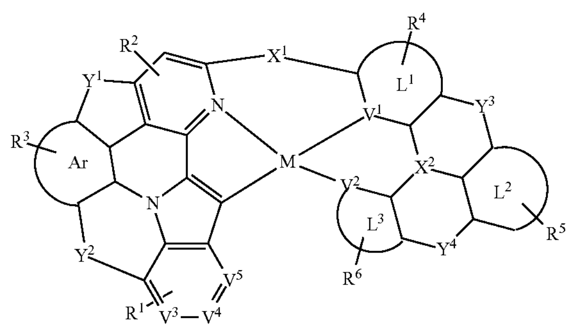
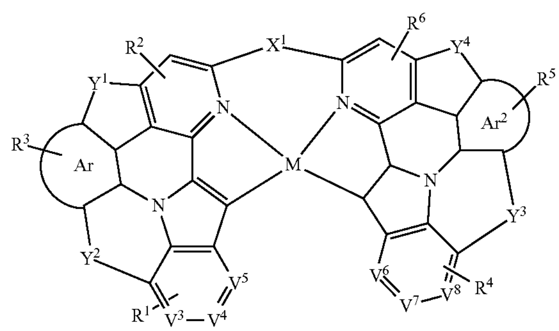
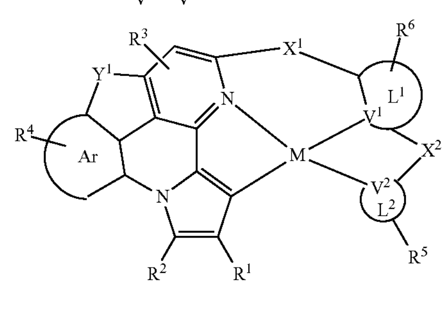

-continued
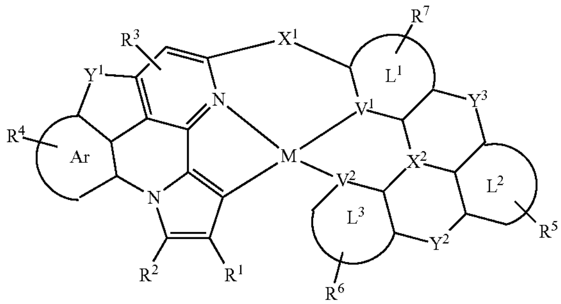
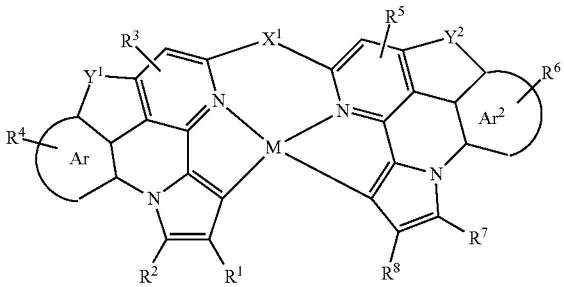
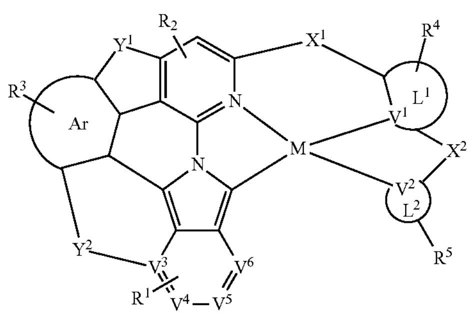
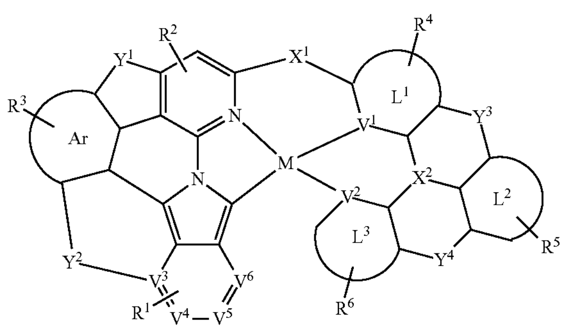
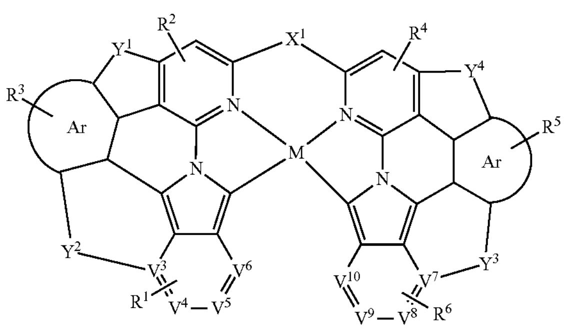
-continued
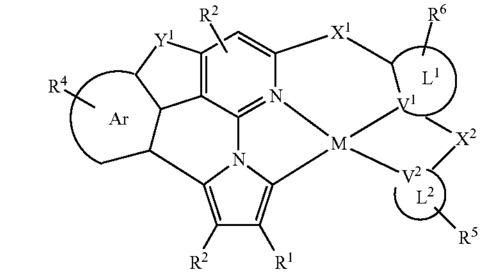
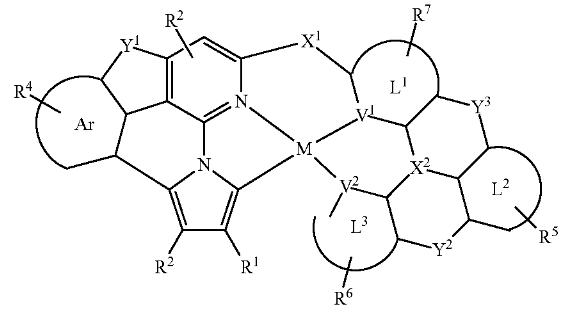
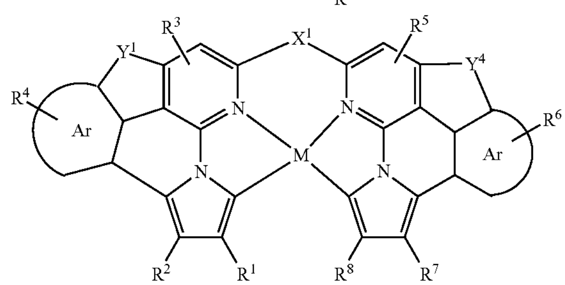
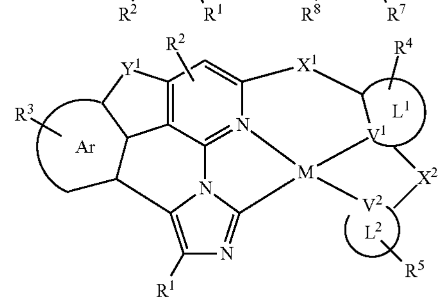
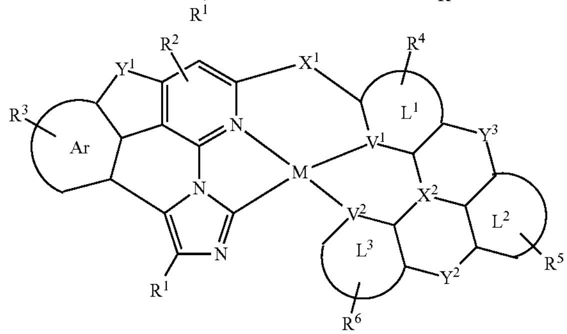
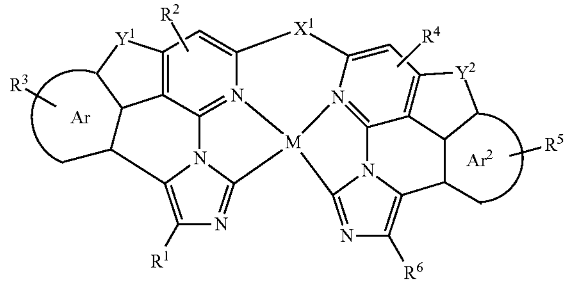

-continued
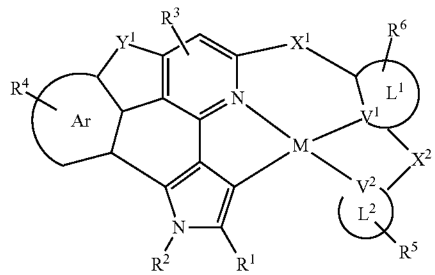
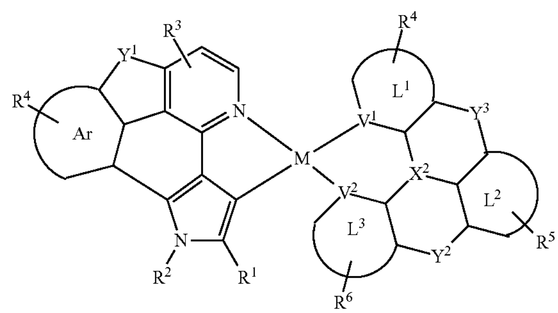
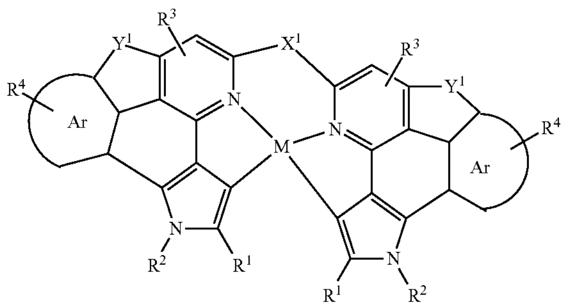
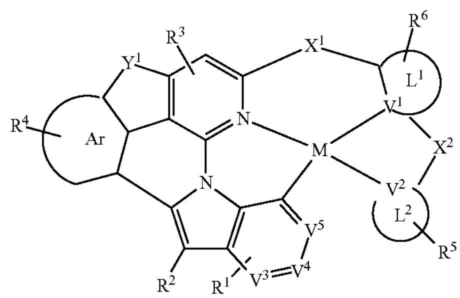
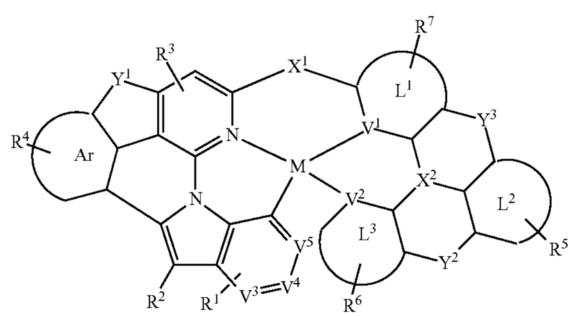
-continued
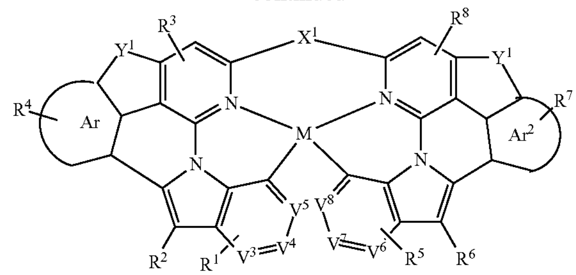
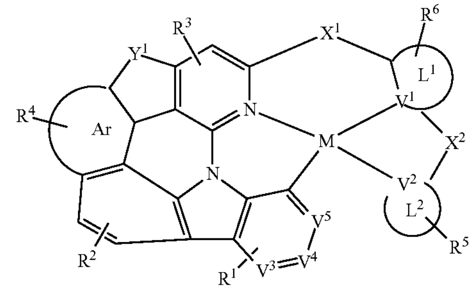
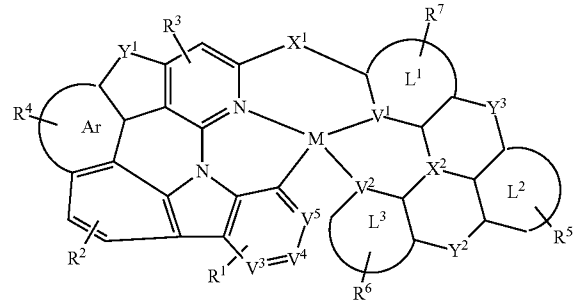
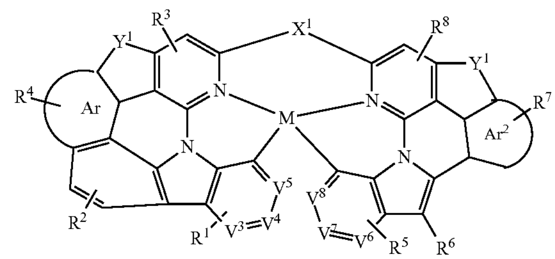
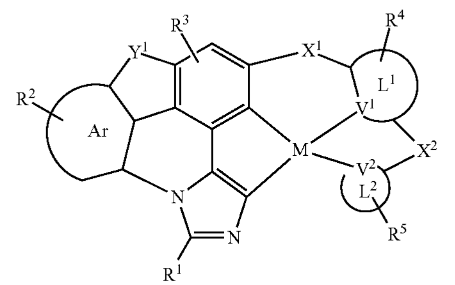
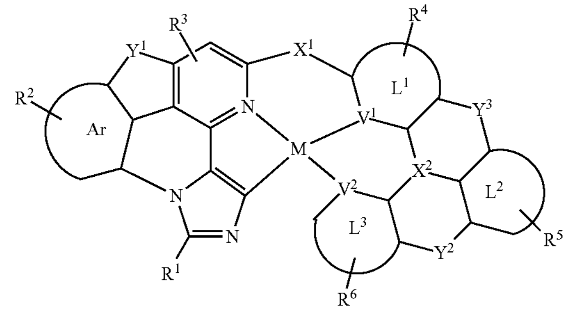

-continued
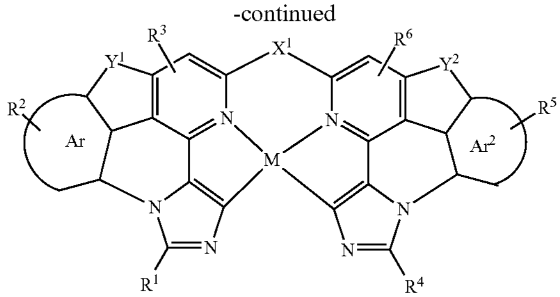
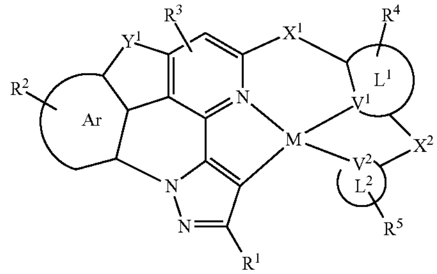
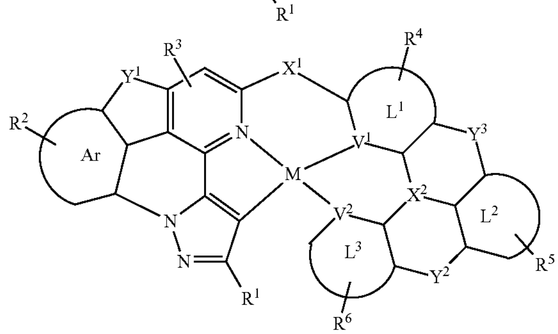
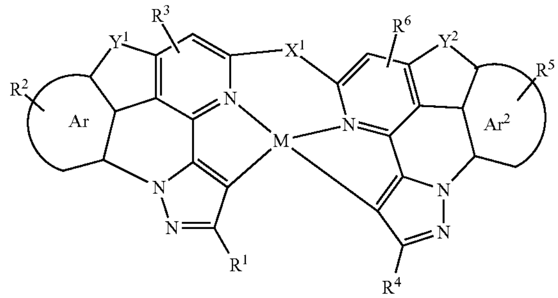
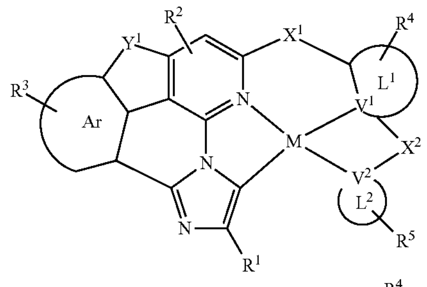
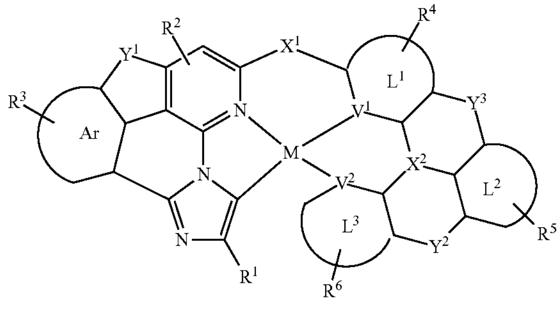
-continued
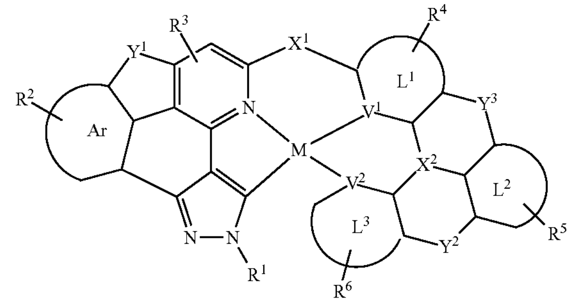
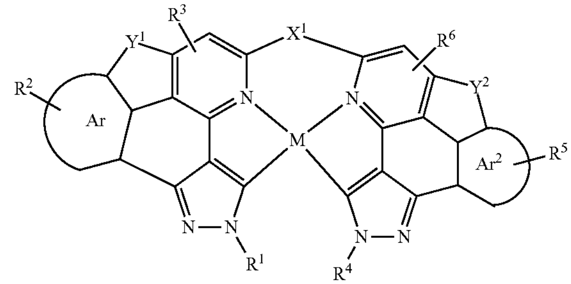
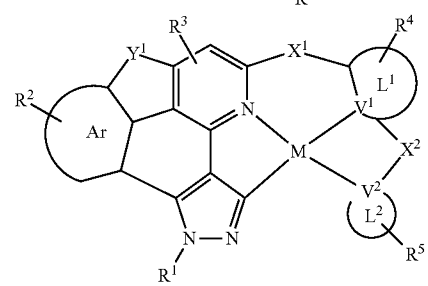
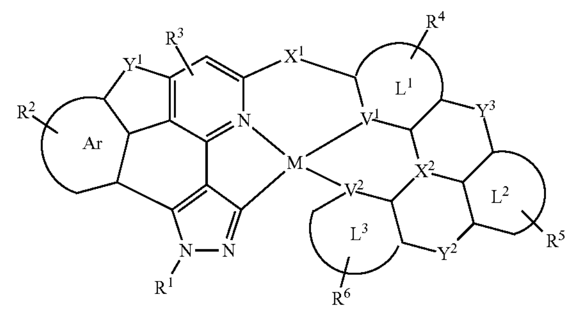
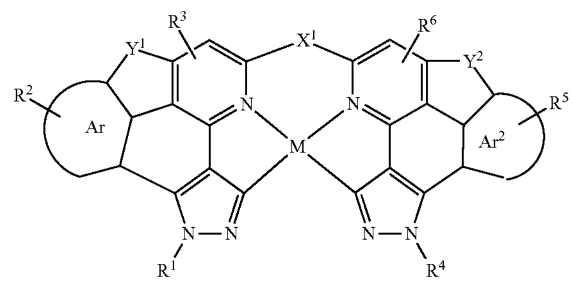
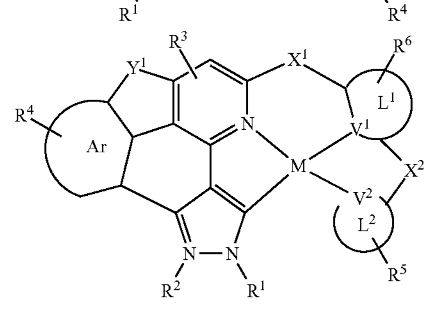

-continued
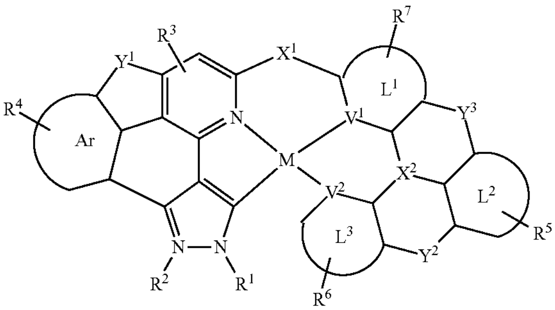
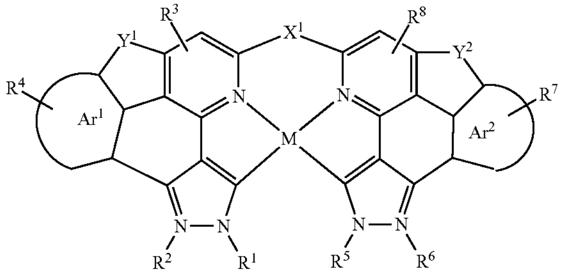
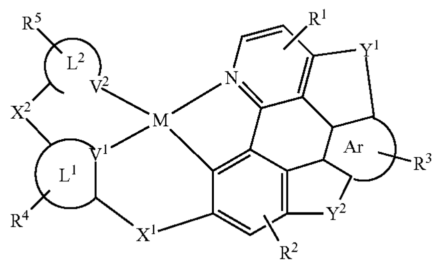
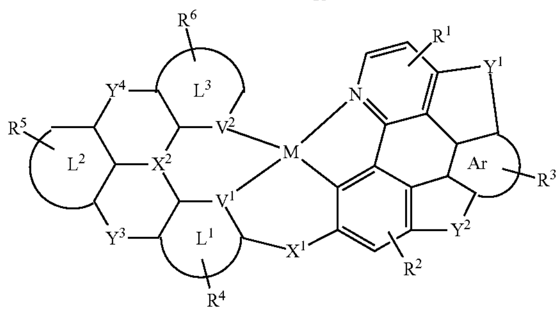
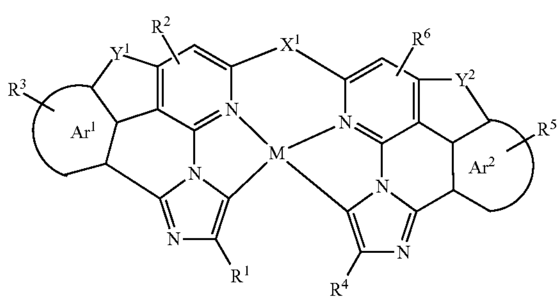
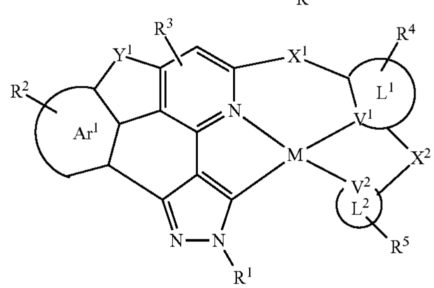
-continued
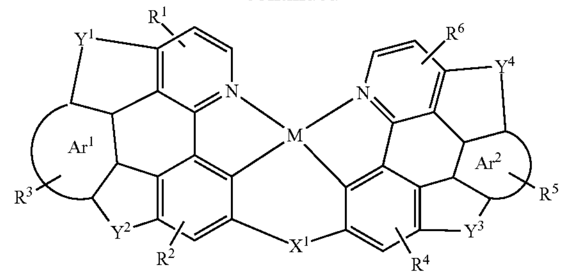
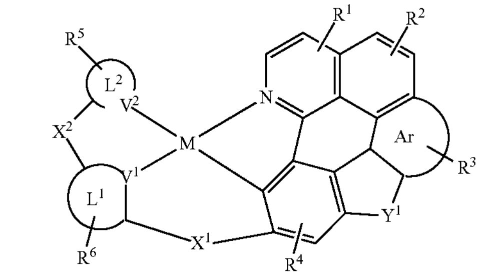
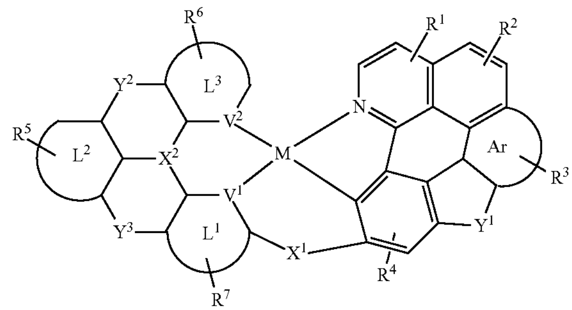
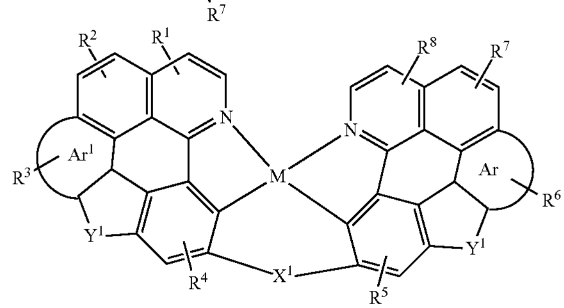
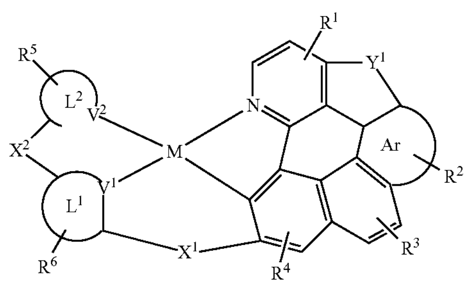
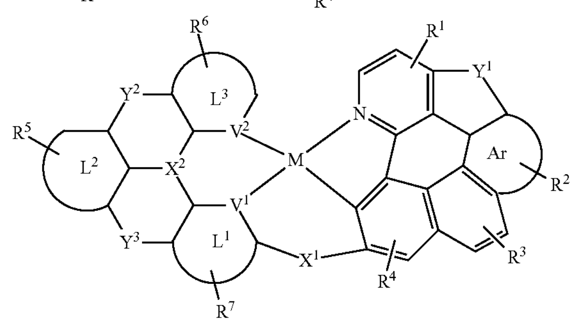

-continued
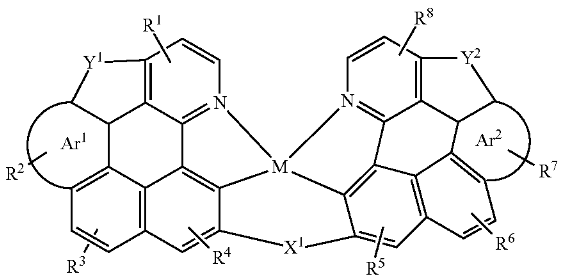
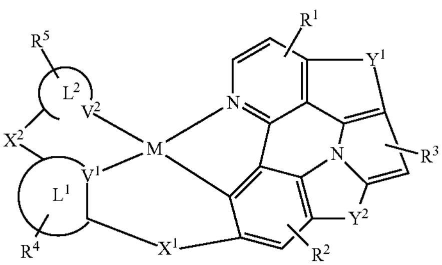
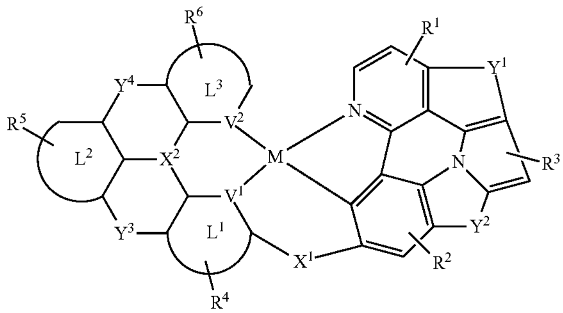
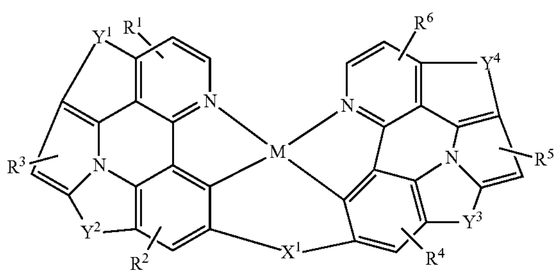
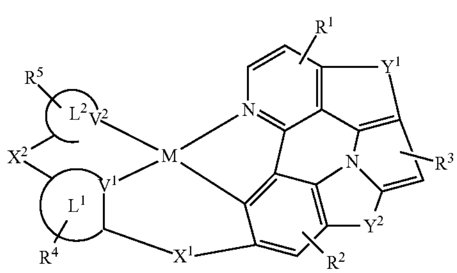
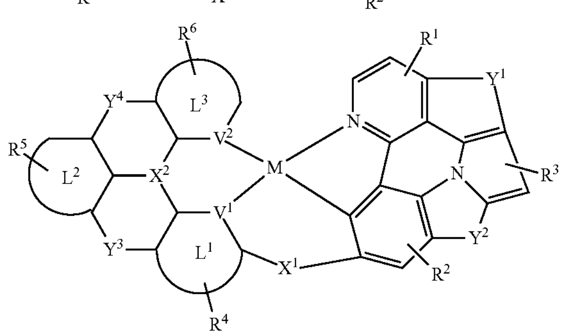
-continued
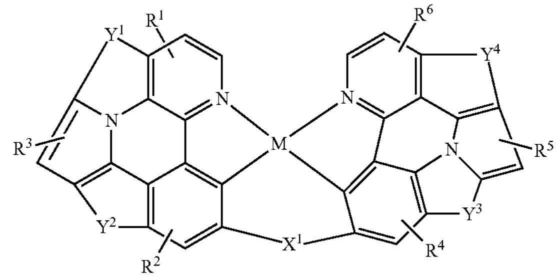
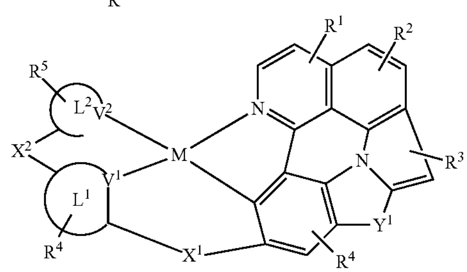
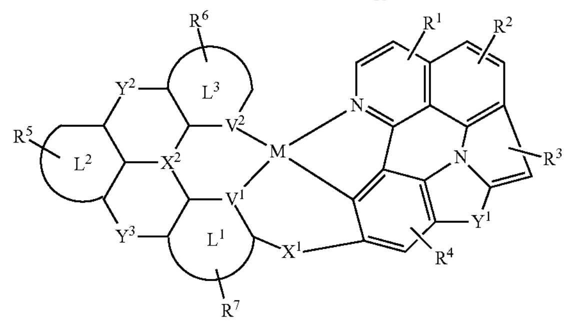
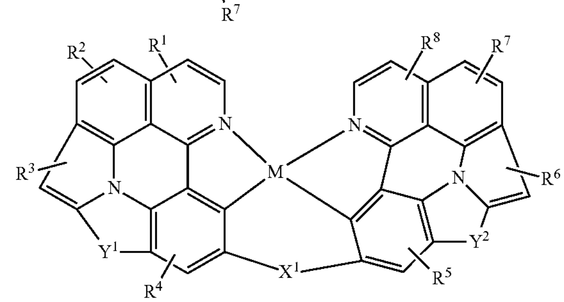
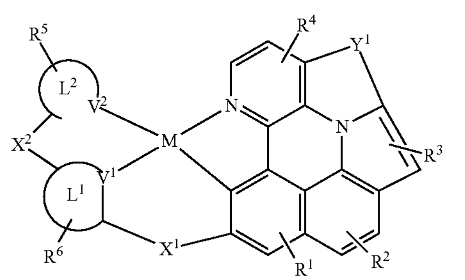
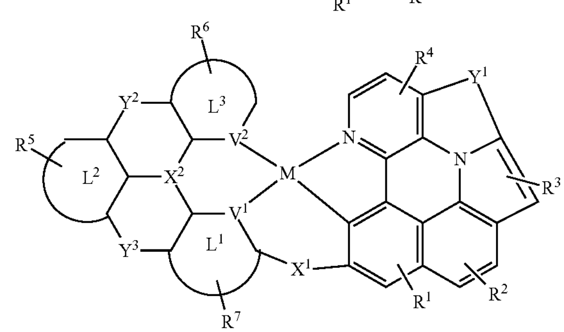

-continued
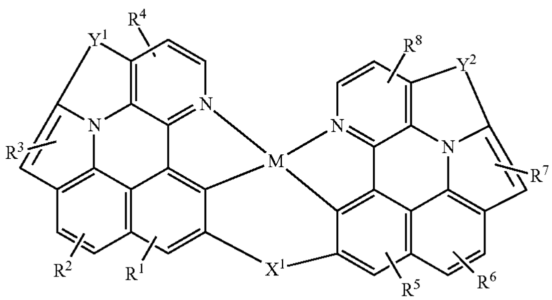
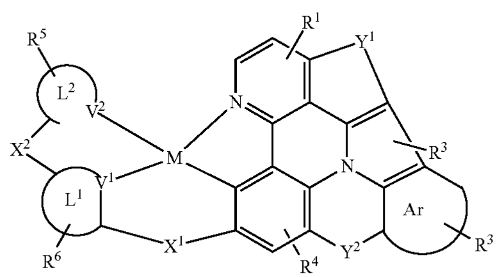
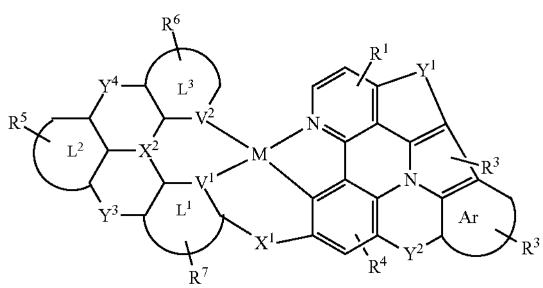
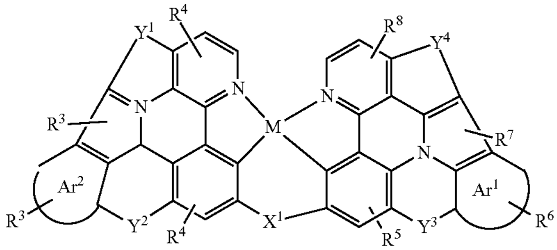
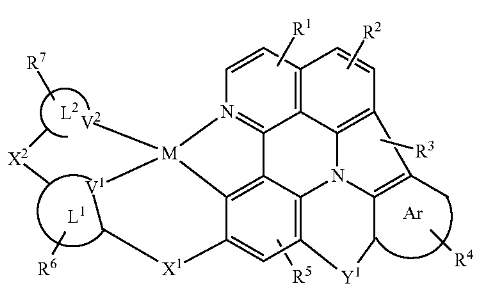
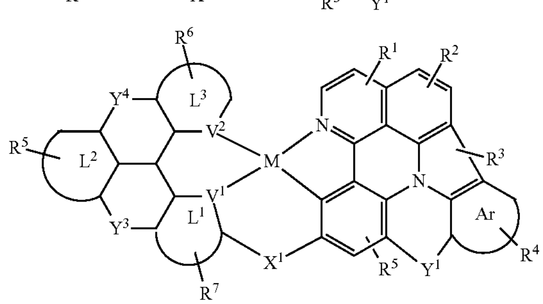
-continued
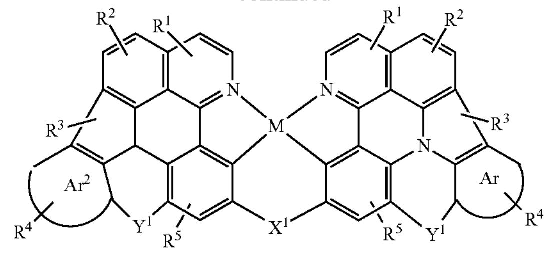
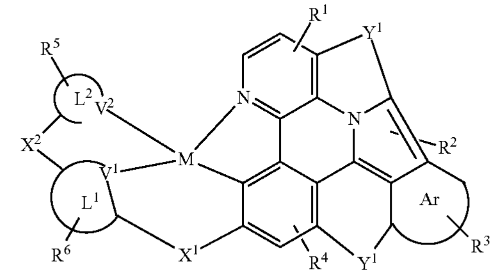
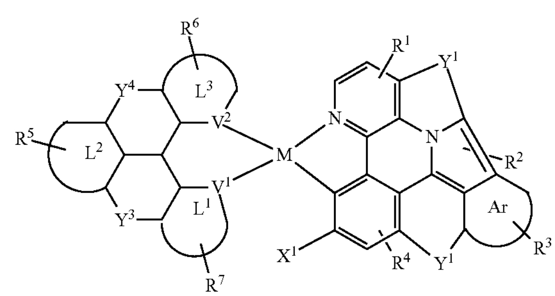
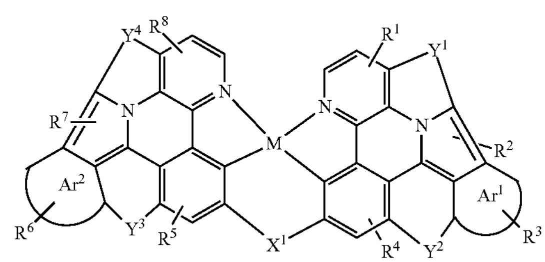
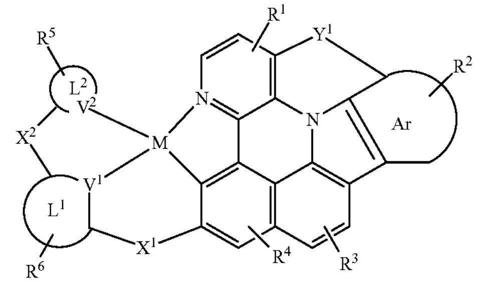
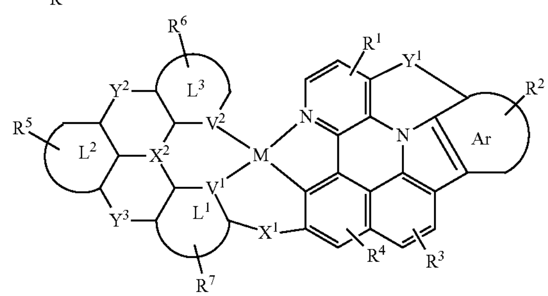

-continued
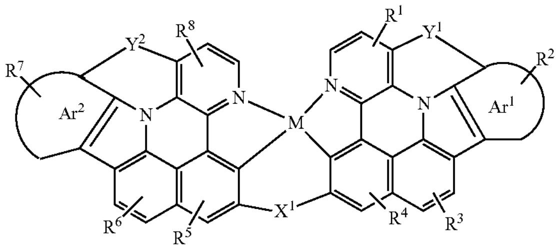
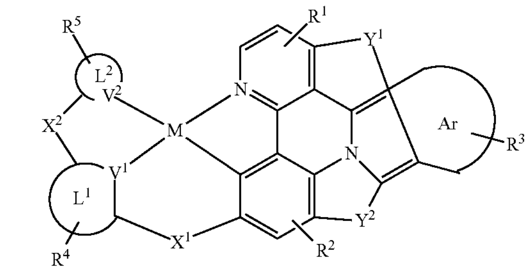
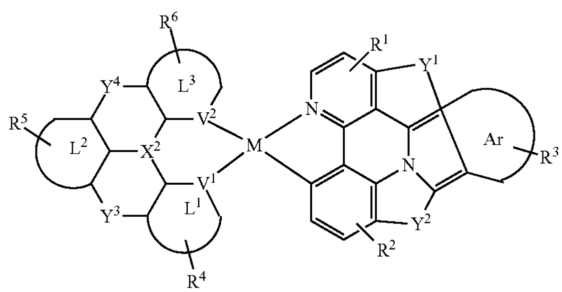
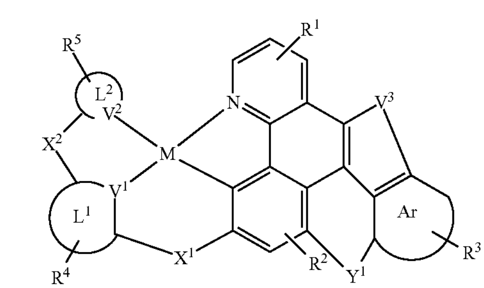
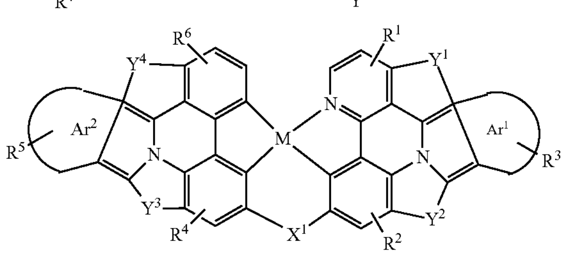
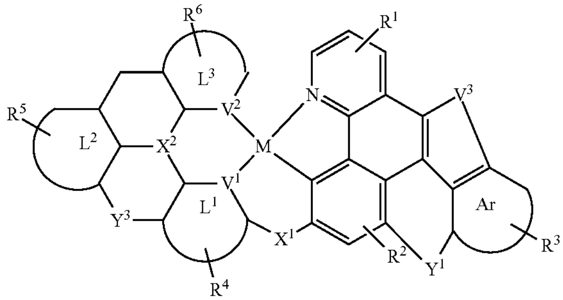
-continued
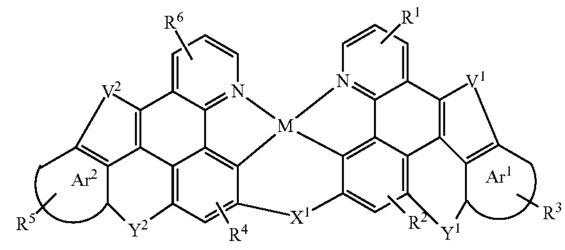
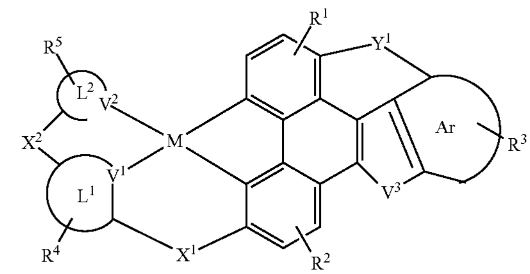
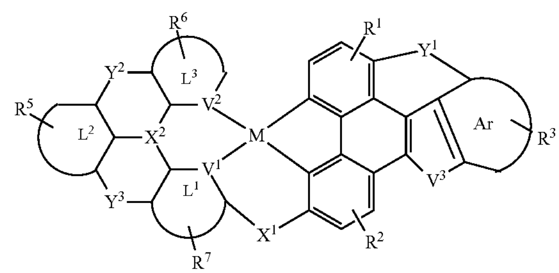
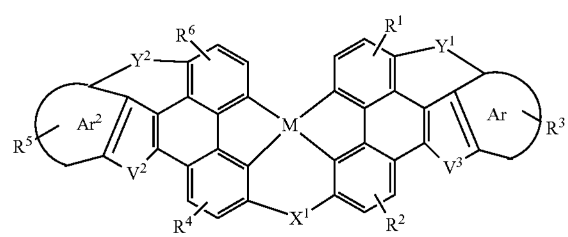
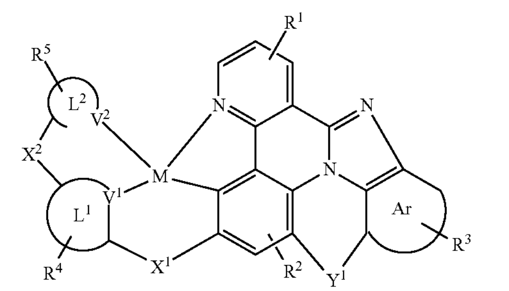
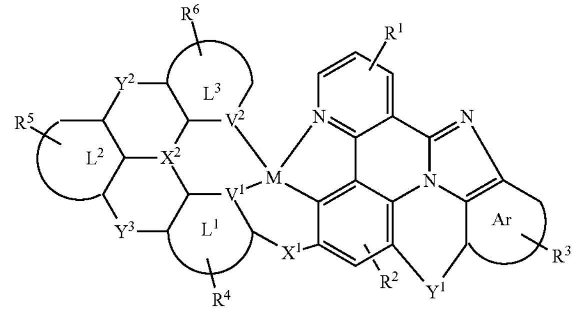

-continued
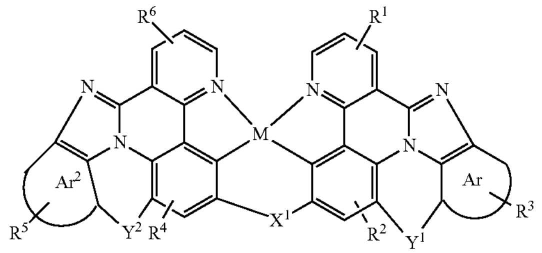
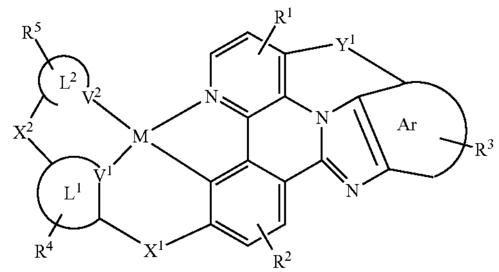
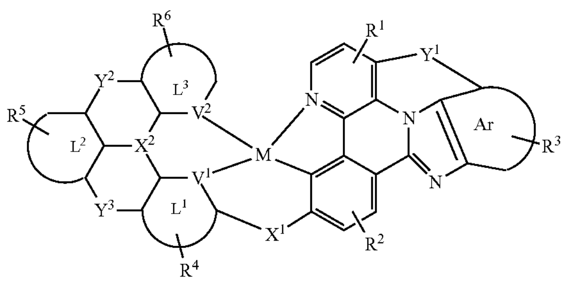
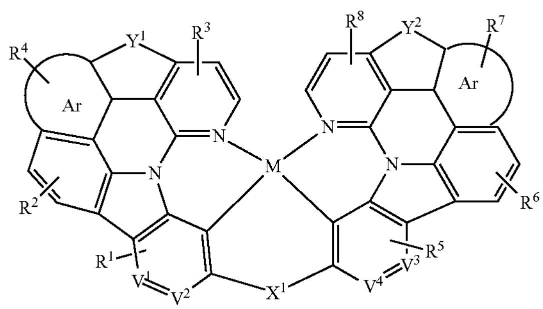
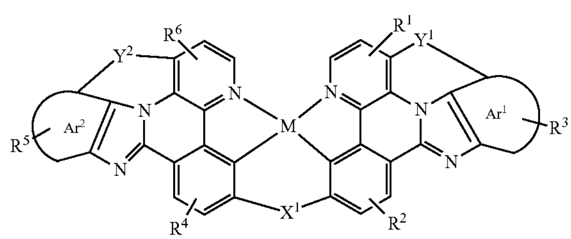
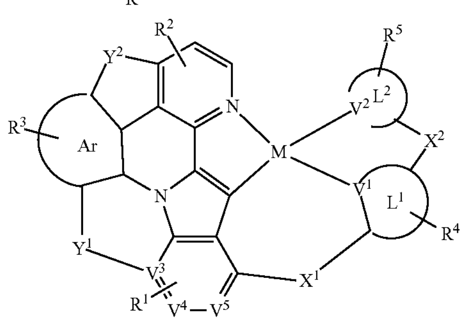
-continued
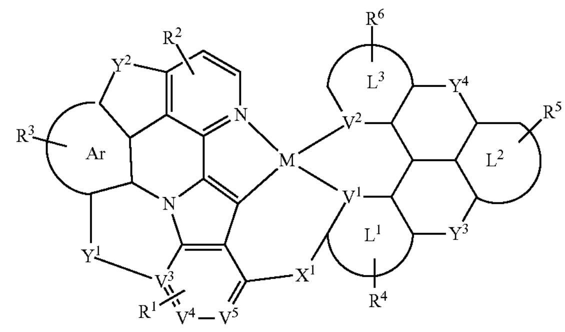
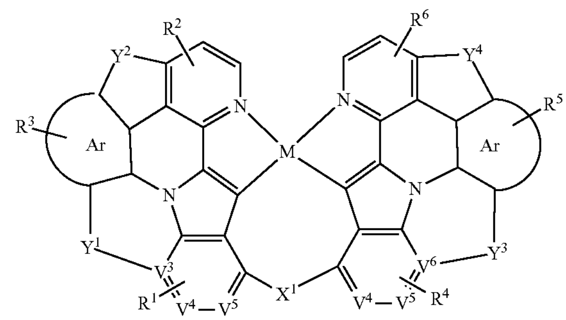
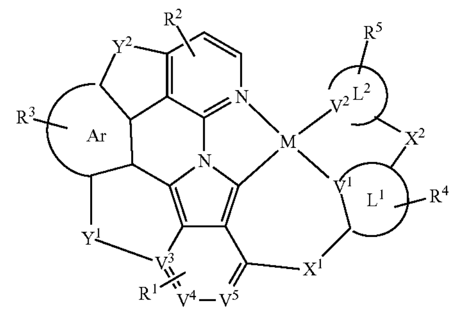
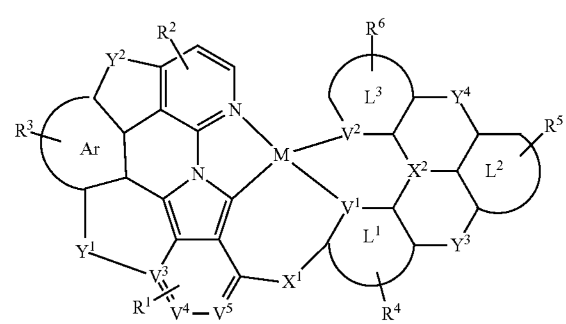
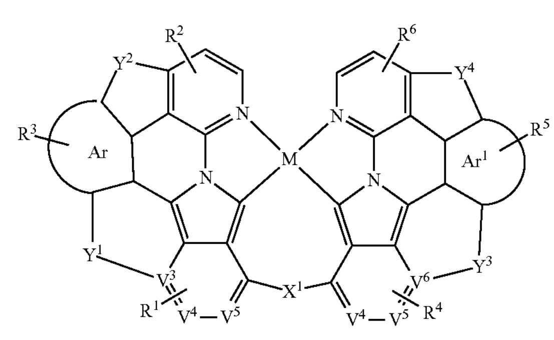

-continued
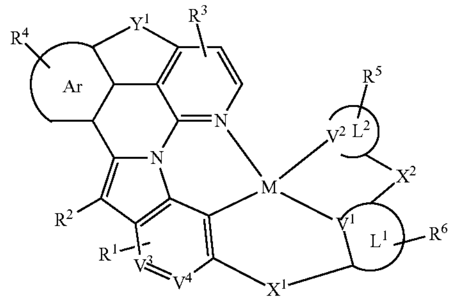
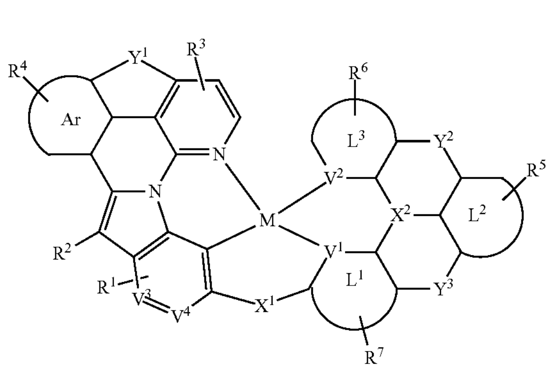
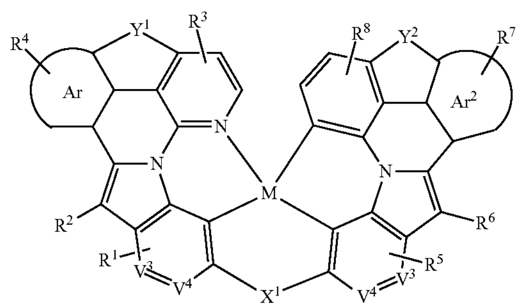
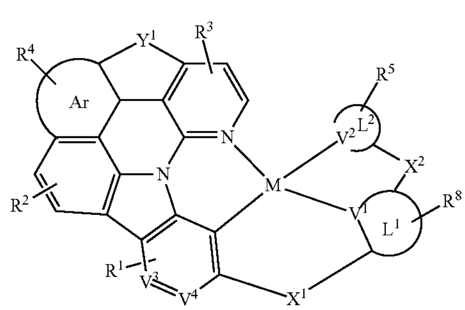
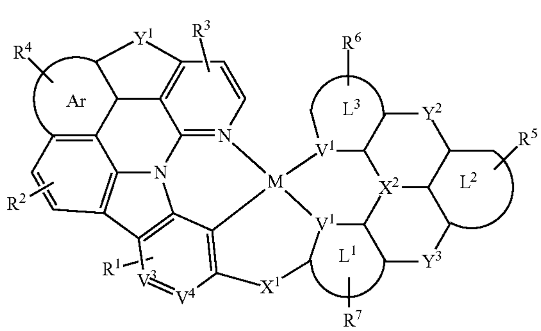
-continued
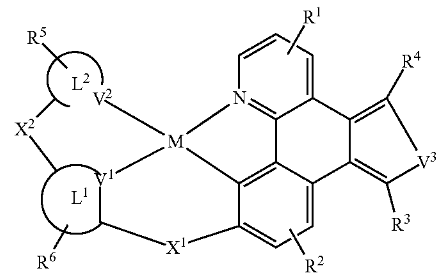
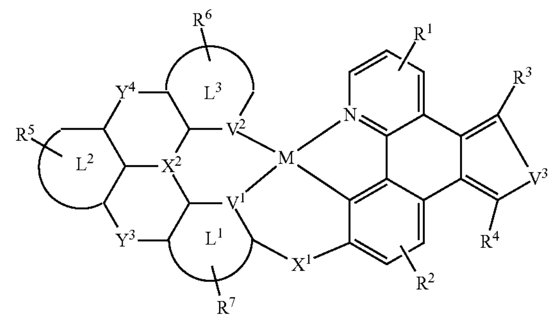
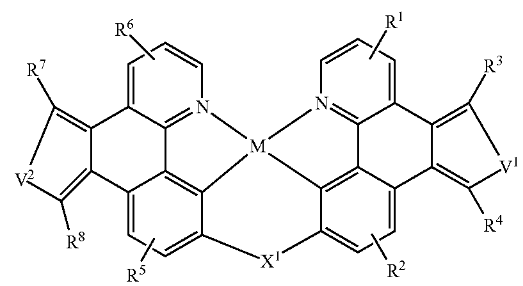
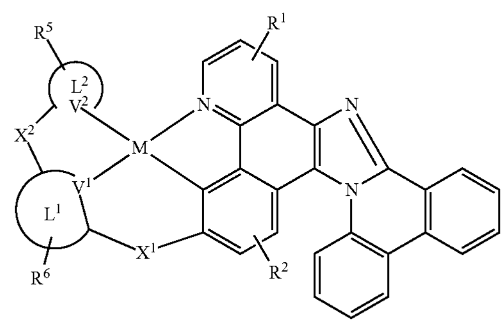
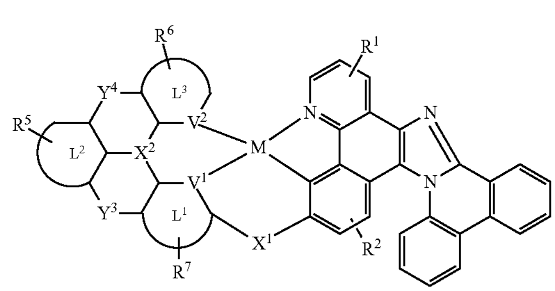

-continued

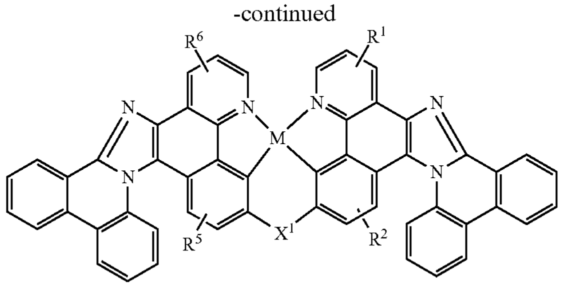

In these implementations of General Formulas I-III:

M is Pt (II) or Pd (II),

N is nitrogen, each of $V^1$-$V^6$, if present, is independently C, N, Si, O, S, Ge, P, As, Se, B, Al, or Bi, each of $X^1$, $X^2$, $Y^1$, $Y^2$, $Y^3$, and $Y^4$ is independently present or absent, and if present, each $X^1$, $X^2$, $Y^1$, $Y^2$, $Y^3$, and $Y^4$ independently represents C, N, Si, O, S, Ge, P, As, Se, B, Al, or Bi, or valency permitting, each independently represents $CR^7$, $SiR^7$, $GeR^7$, $NR^7$, P═O, As═O, B, $BR^7$, $AlR^7$, Bi═O, $CR^7R^8$, C═O, $SiR^7R^8$, $GeR^7R^8$, $NR^7$, $PR^7$, $PR^7R^8$, $R^7P$═O, $AsR^7$, $R^7As$═O, S═O, $SO_2$, Se═O, $SeO_2$, $BR^7$, $BR^7R^8$, $AlR^7$, $AlR^7R^8$, $R^7Bi$═O, or $BiR^7$, each of $L^1$, $L^2$, $L^3$, and $L^4$ is independently present or absent, and each $L^1$, $L^2$, $L^3$, and $L^4$ present independently represents a substituted or unsubstituted aryl, heteroaryl, or N-heterocyclic carbene, each of R, $R^1$, $R^2$, $R^3$, $R^4$, $R^5$, $R^6$, $R^7$, and $R^8$ is independently absent or present as a single substituent or multiple substituents, valency permitting, and each R, $R^1$, $R^2$, $R^3$, $R^4$, $R^5$, $R^6$, $R^7$, and $R^8$ present independently represents deuterium, halogen, hydroxyl, thiol, nitro, cyanide, isocyanide, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof.

Examples of suitable substituents $R^1$-$R^8$ include:

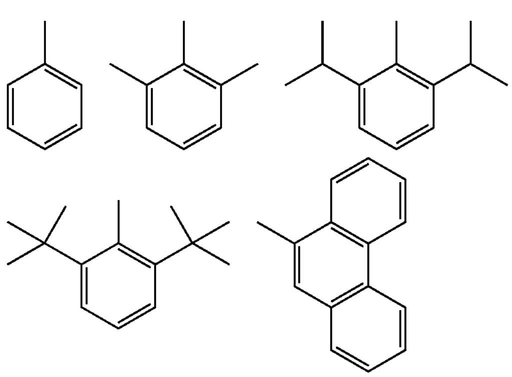

-continued

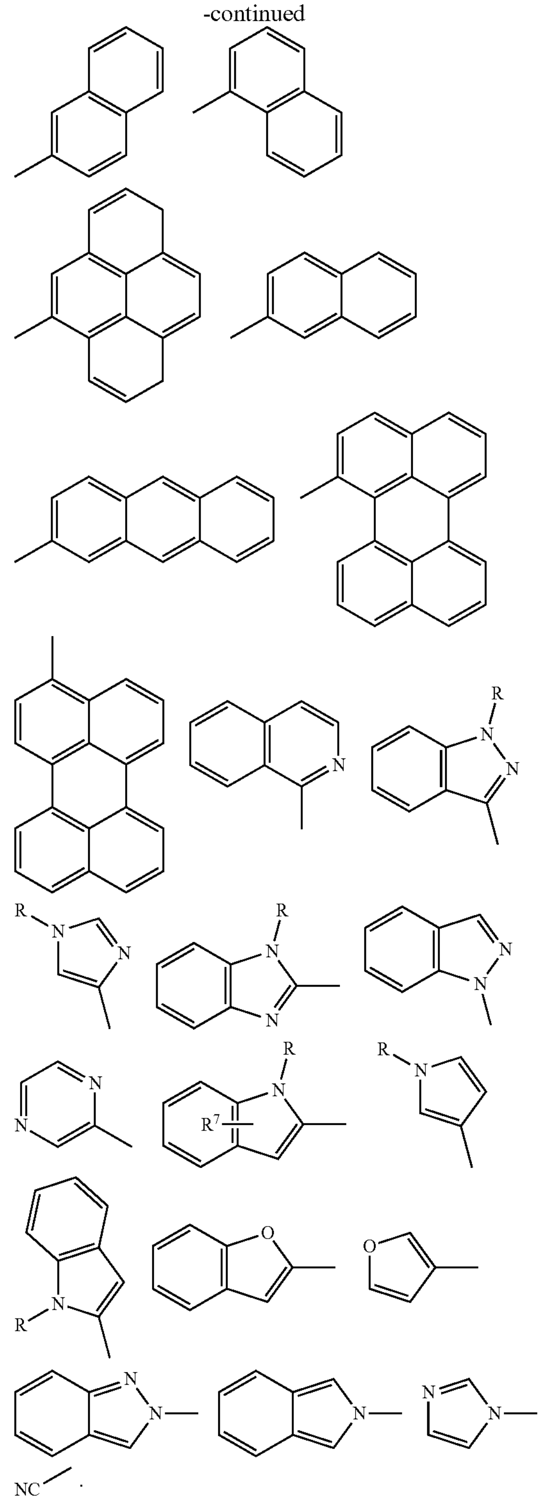

In the implementations of General Formulas I-III, each of

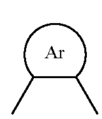

is independently present or absent, and each Ar present independently represents a substituted or unsubstituted aryl, heteroaryl, or N-heterocyclic carbene, including the following moieties:
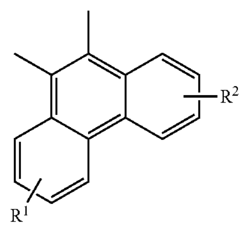
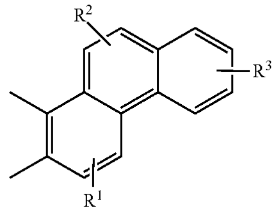
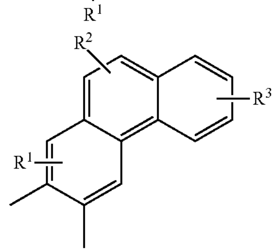
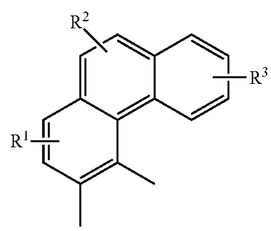
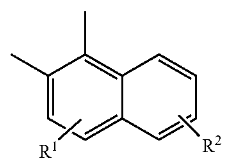
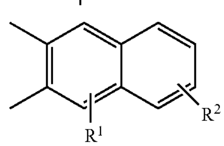
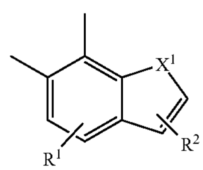
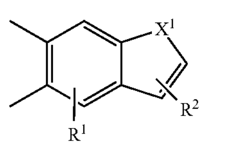
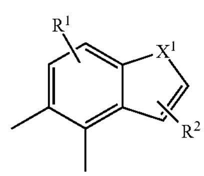
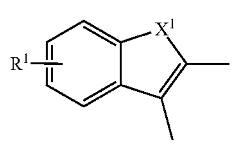
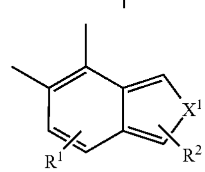
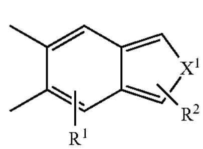
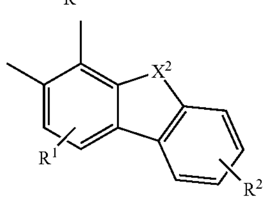
-continued
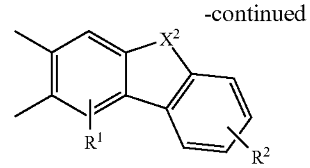
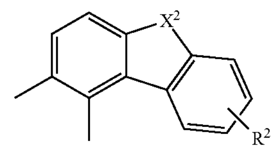
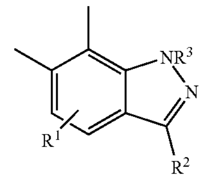
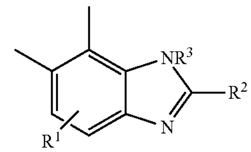
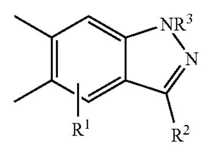
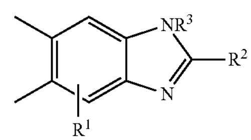
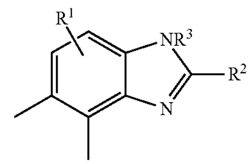
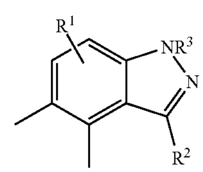
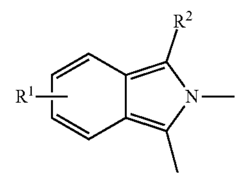
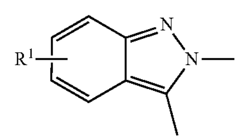
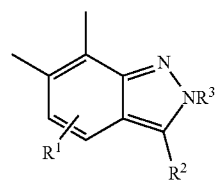
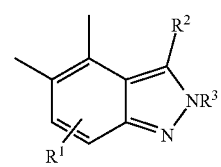
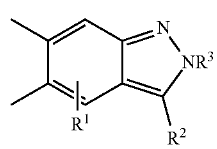
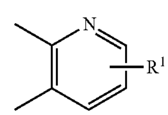
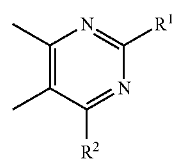
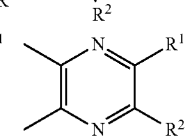
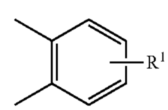
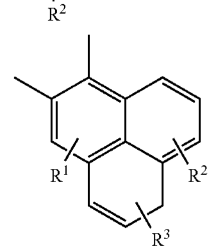

-continued
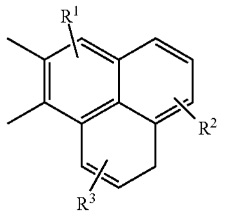
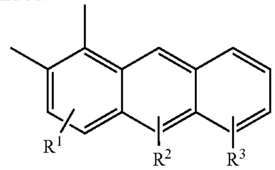
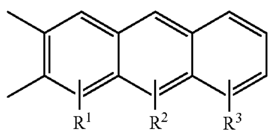
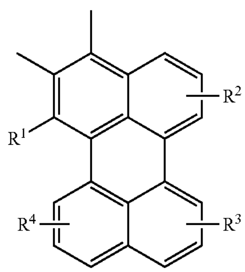
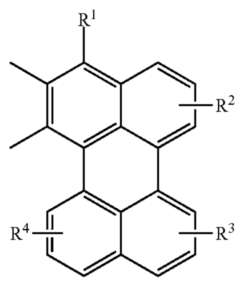
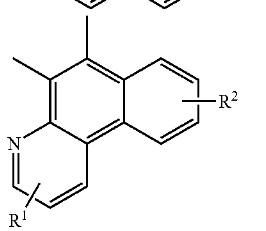
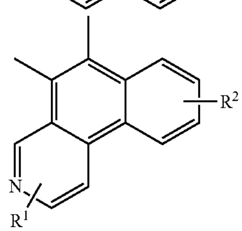
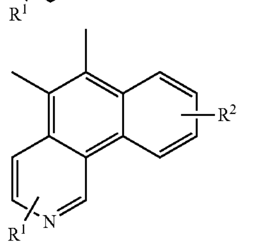
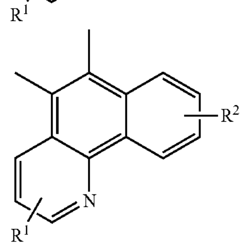
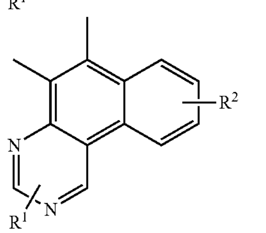
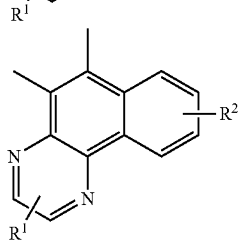
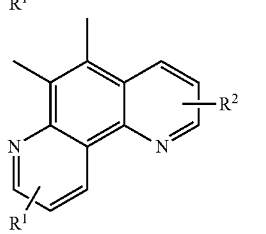
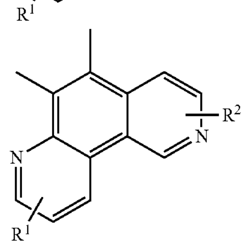
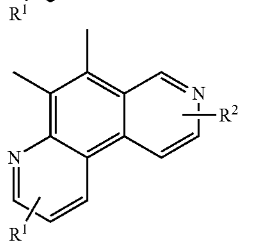
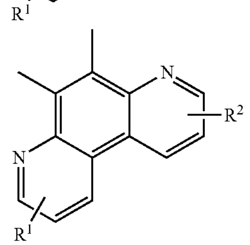
-continued
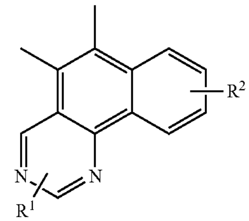
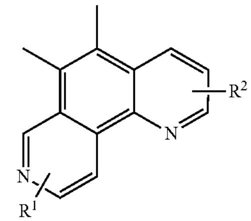
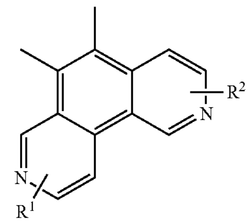
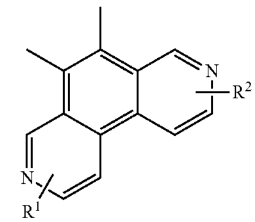
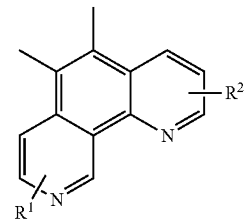
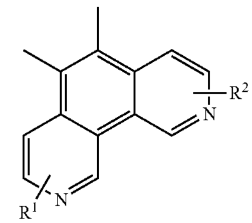
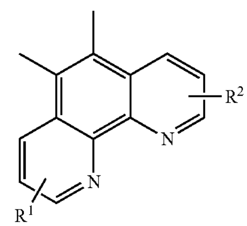
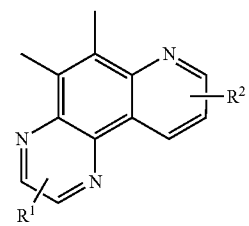
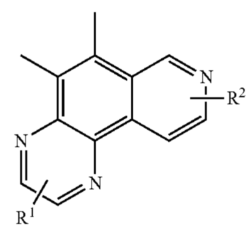
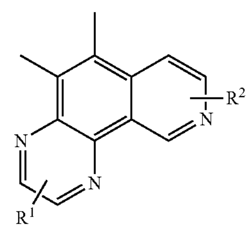
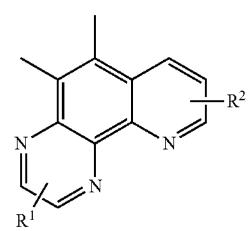
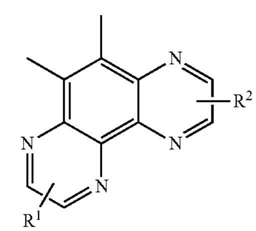
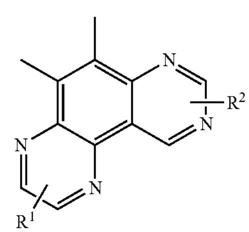
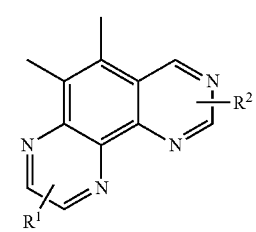

-continued
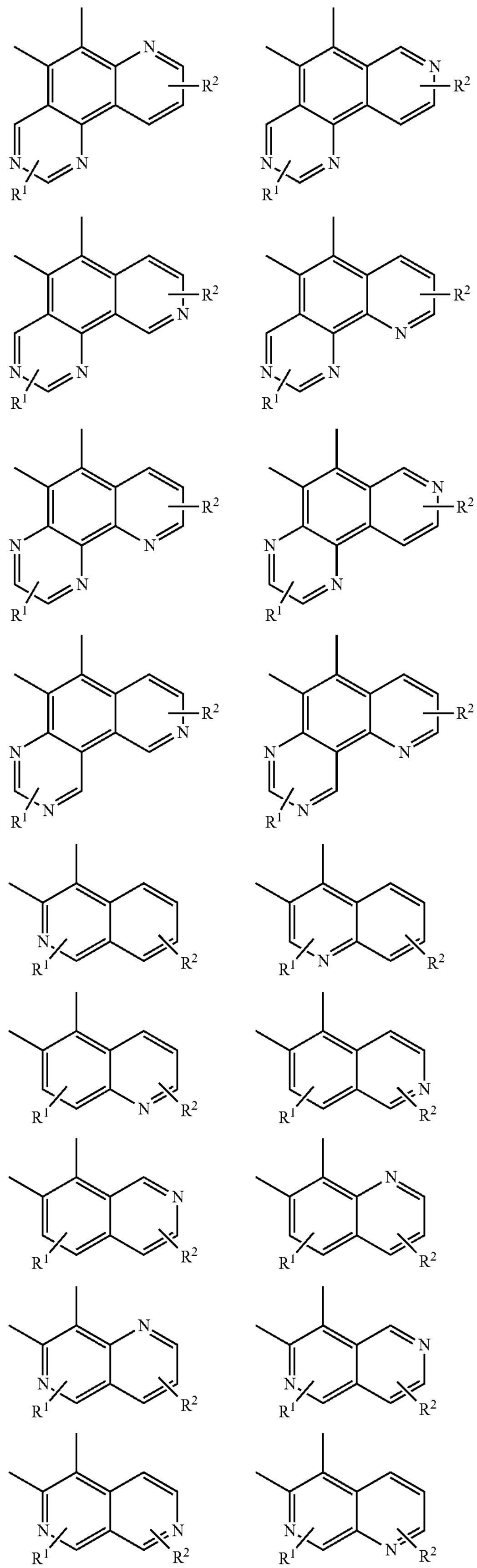
-continued
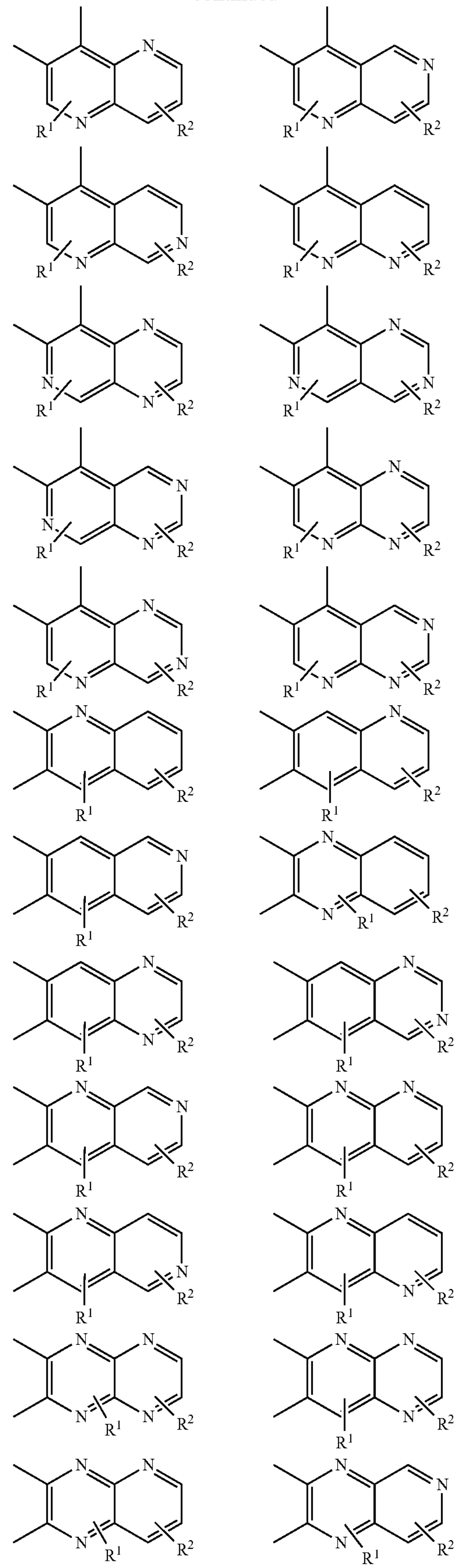

-continued
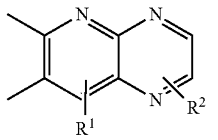
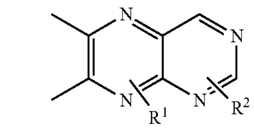
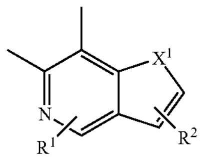
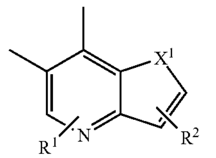
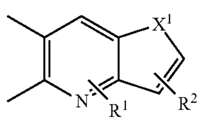
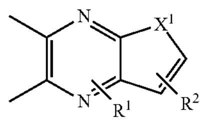
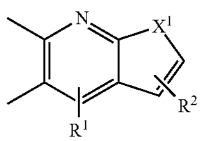
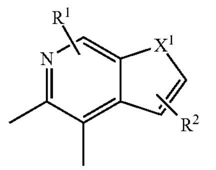
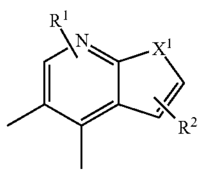
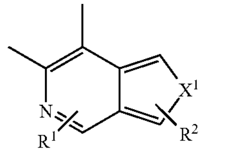
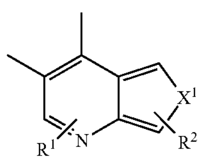
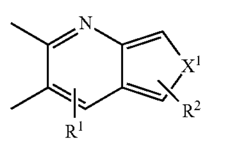
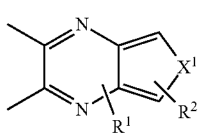
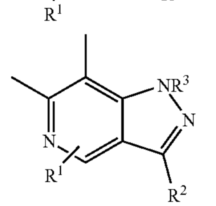
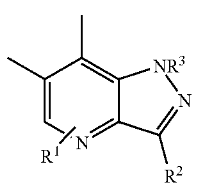
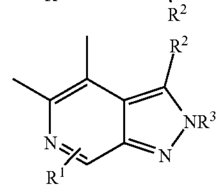
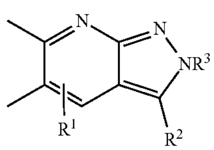
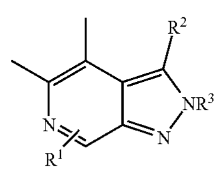
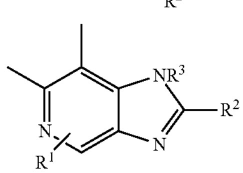
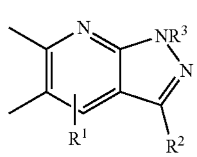
-continued
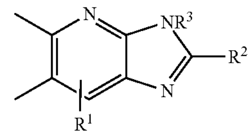
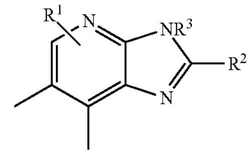
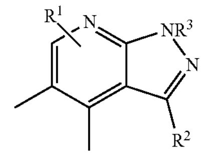
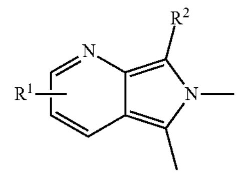
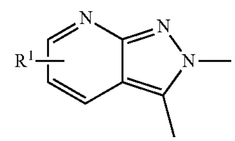
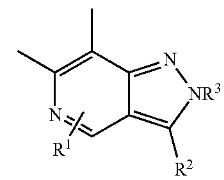
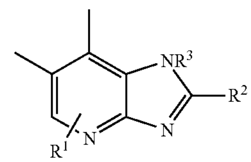
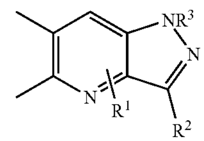
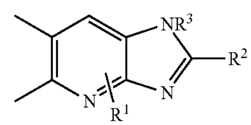
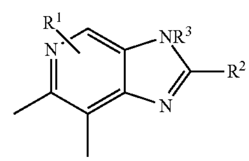
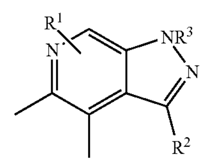
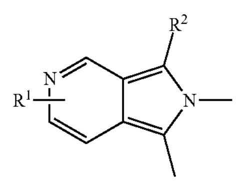
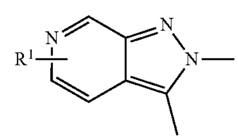
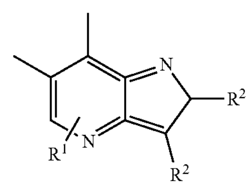
in which $R^1$, $R^2$, $R^3$, $R^4$, $X^1$, and $X^2$ are as defined herein.
Compounds of General Formulas I-III are shown below.
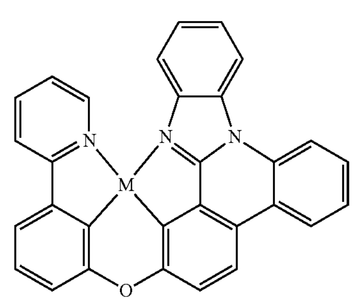

-continued
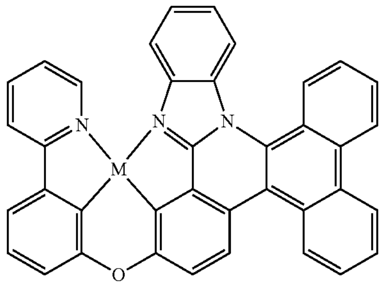
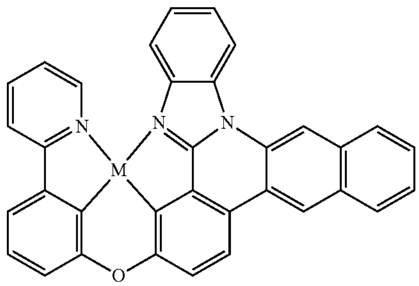
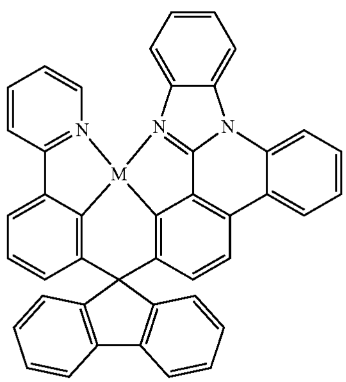
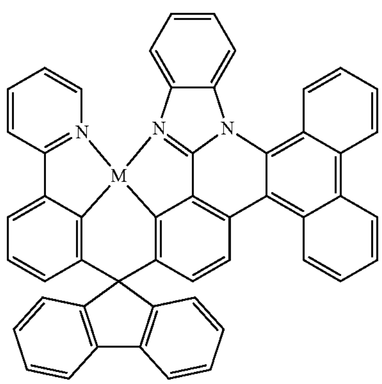
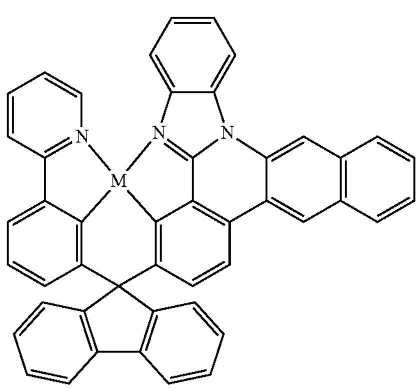
-continued
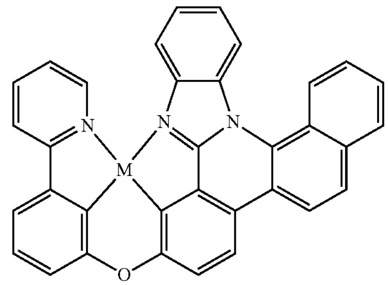
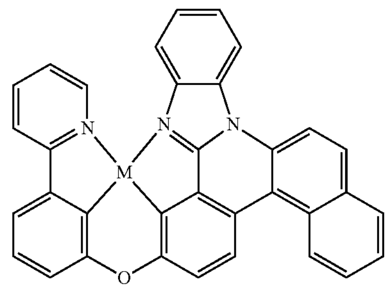
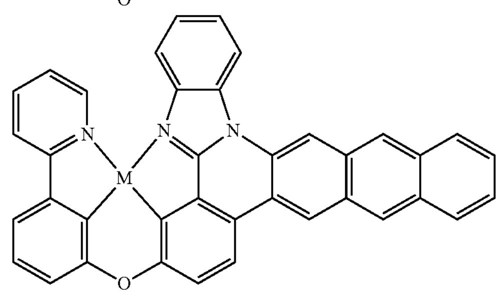
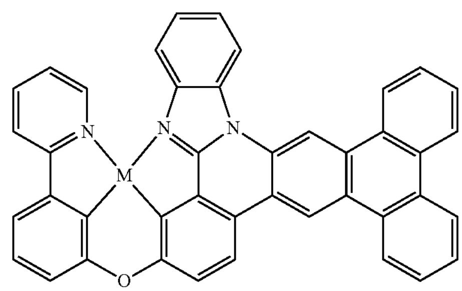
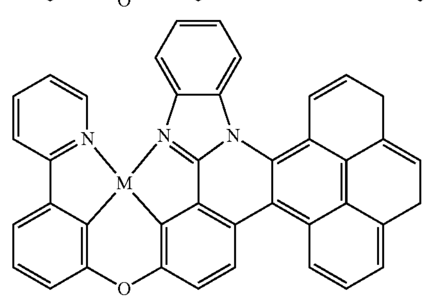
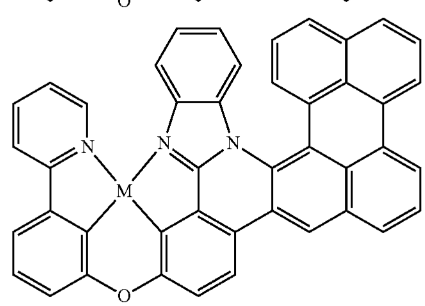

-continued
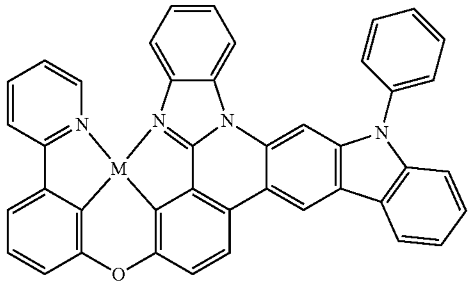
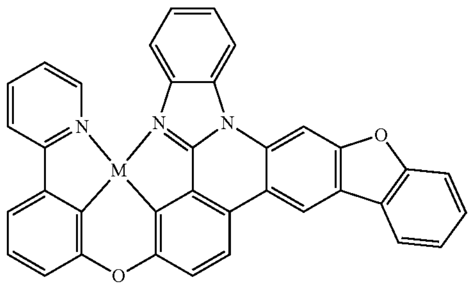
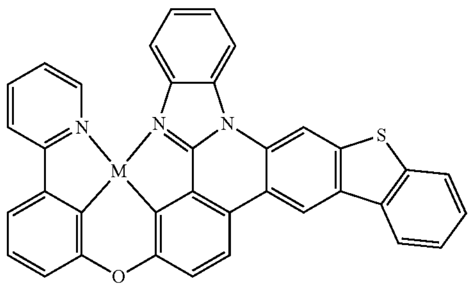
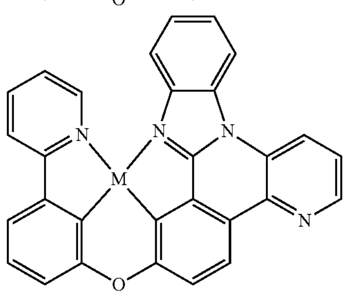
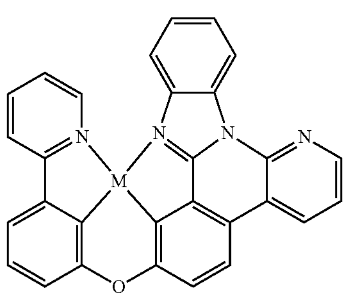
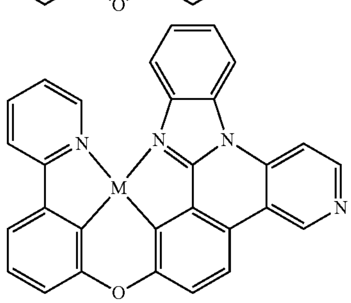
-continued
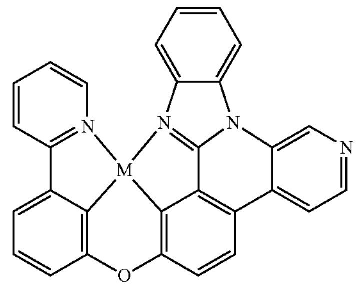
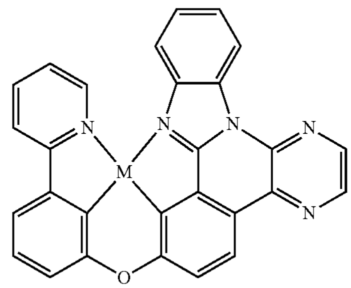
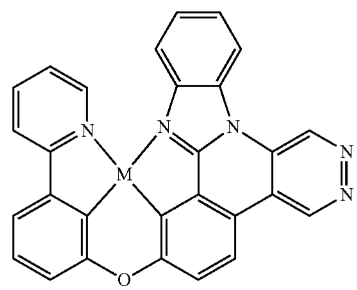
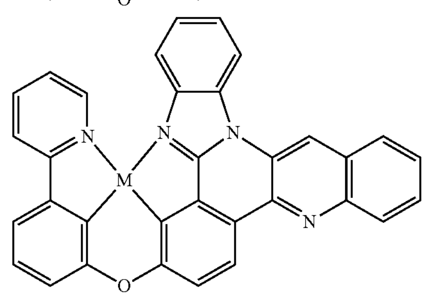
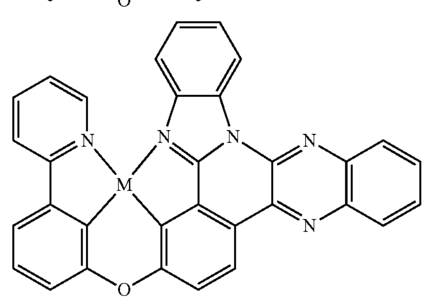
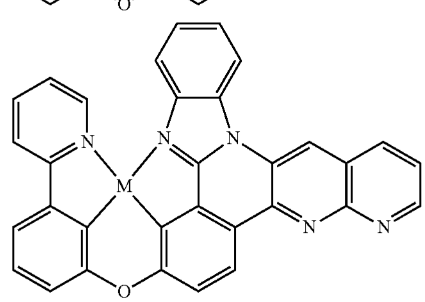

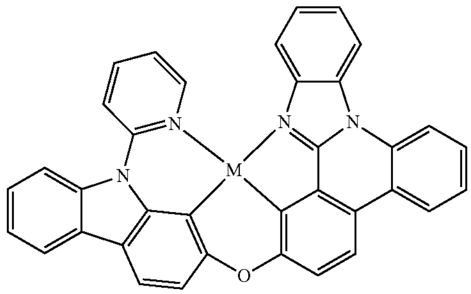
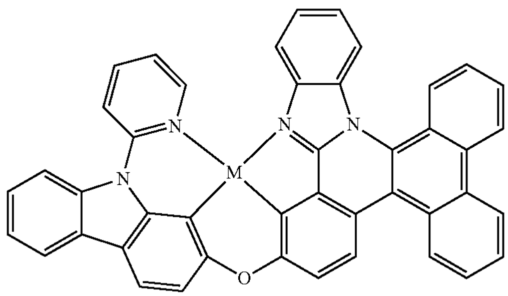
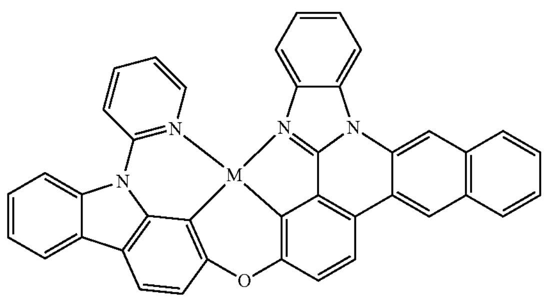
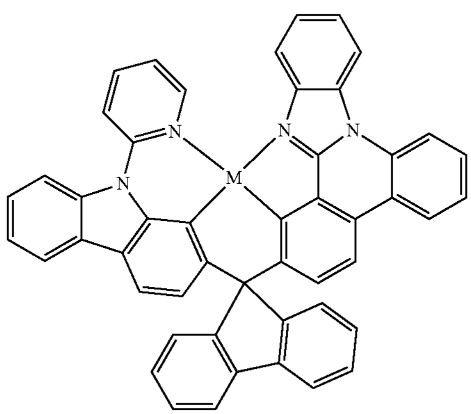
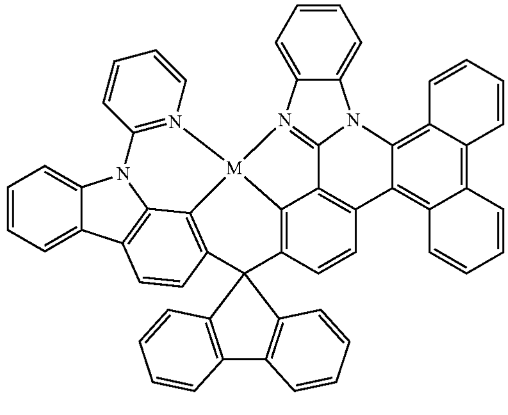
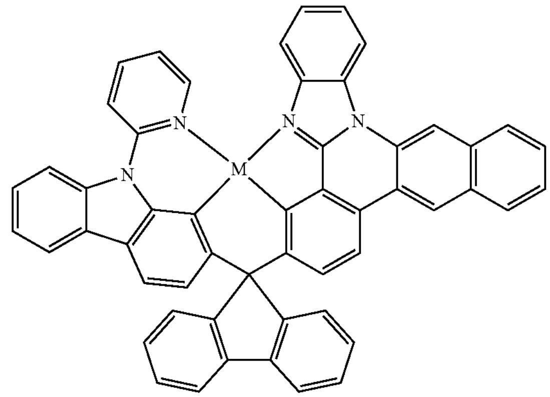
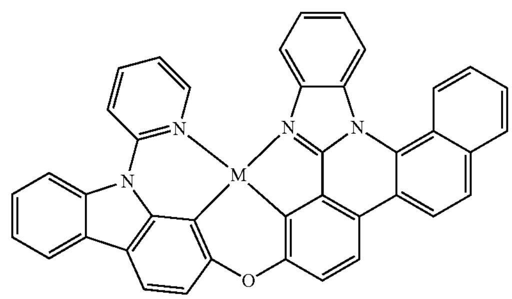
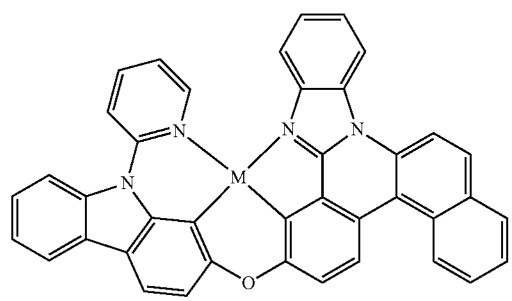
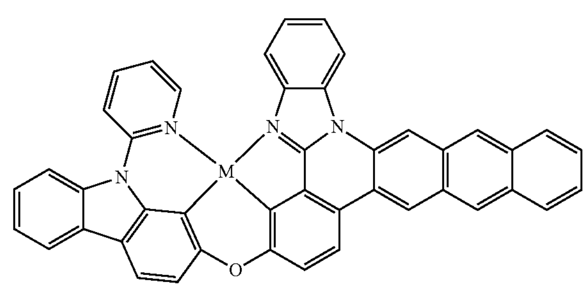
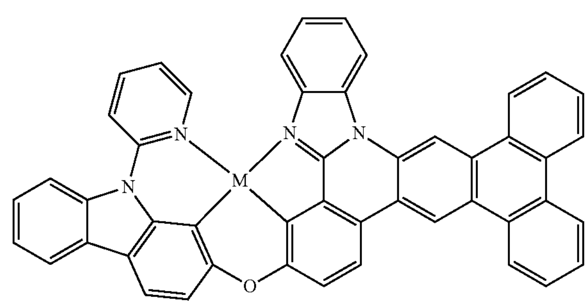

-continued
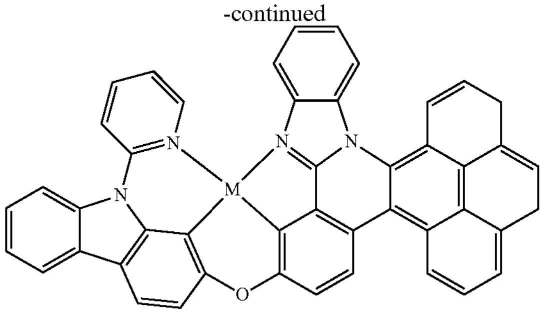
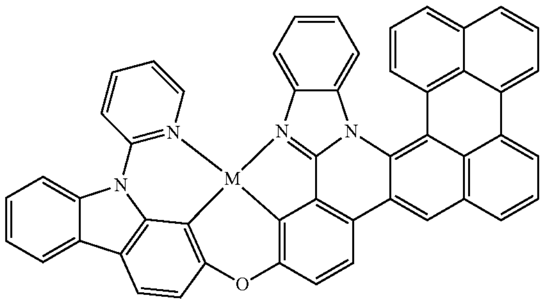
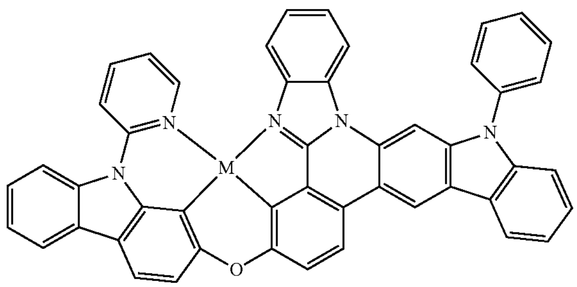
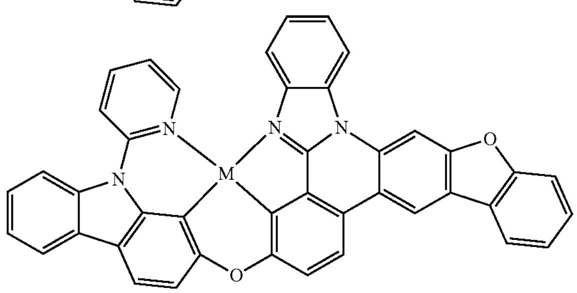
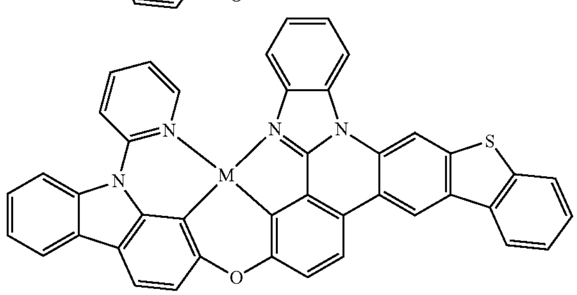
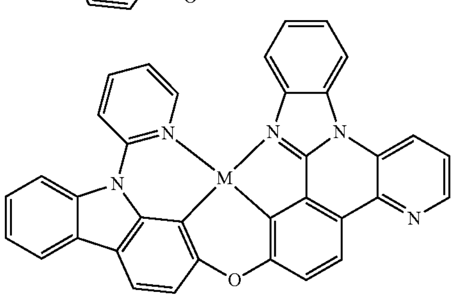
-continued
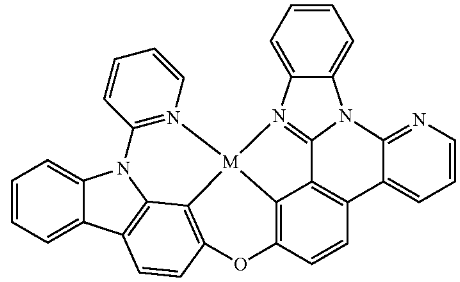
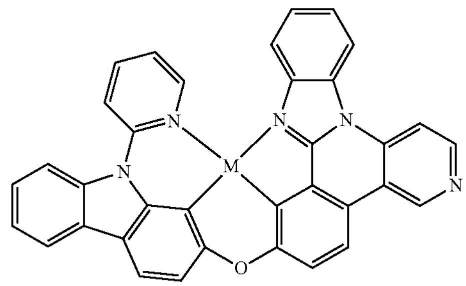
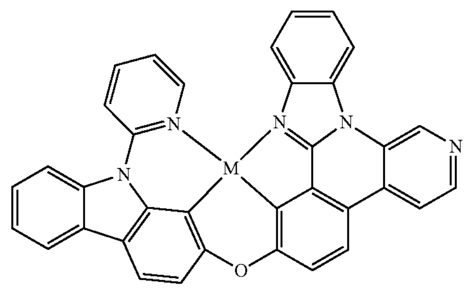
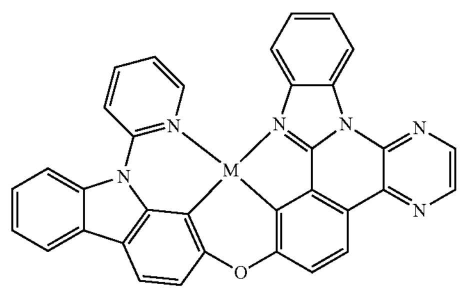
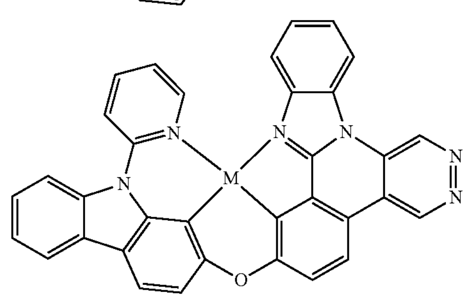
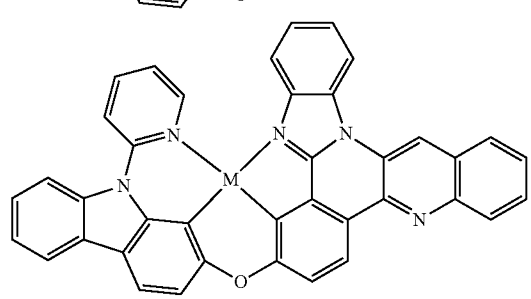

-continued
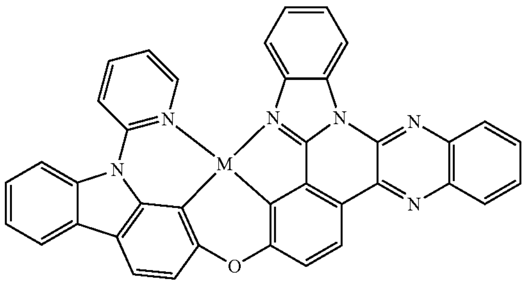
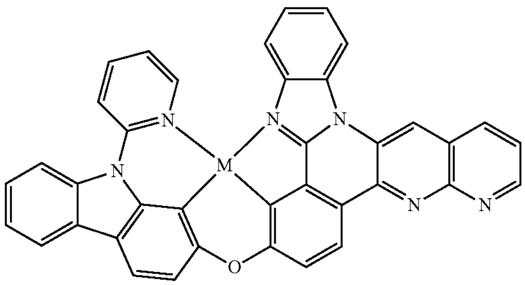
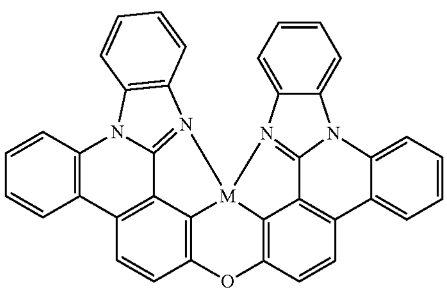
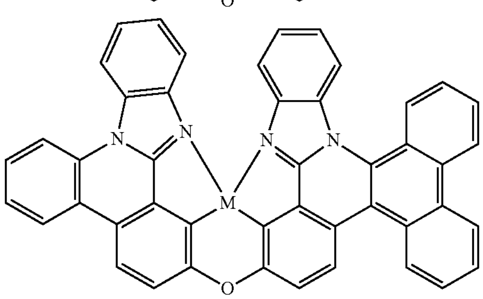
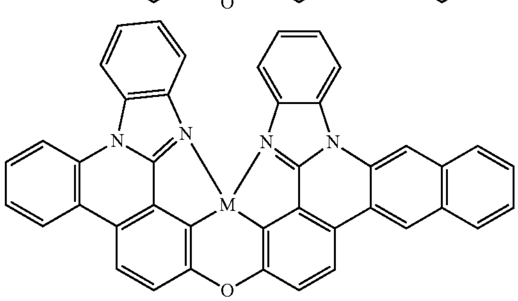
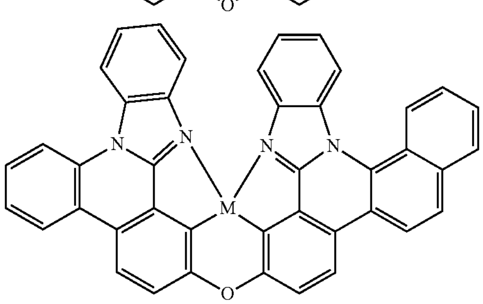
-continued
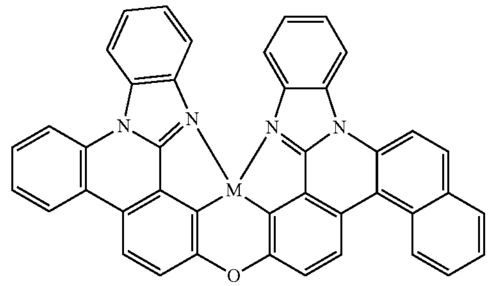
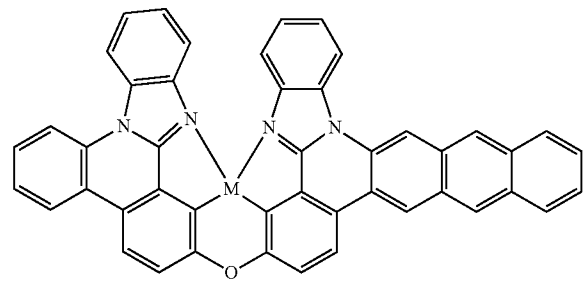
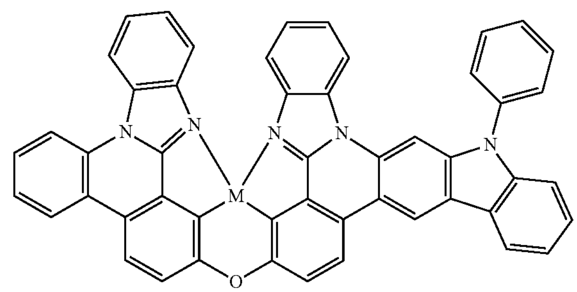
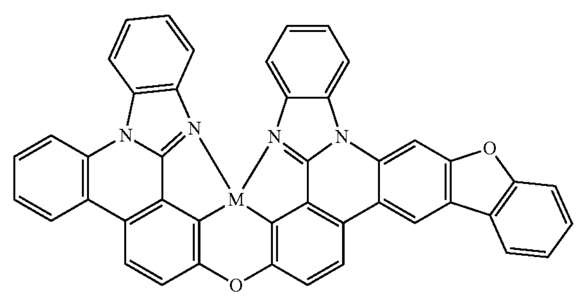
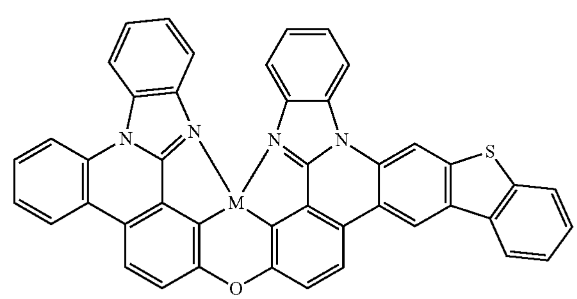

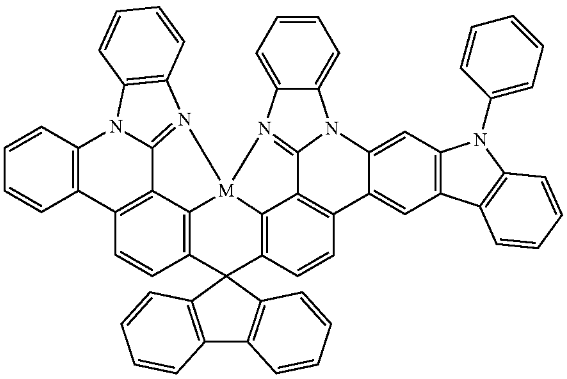
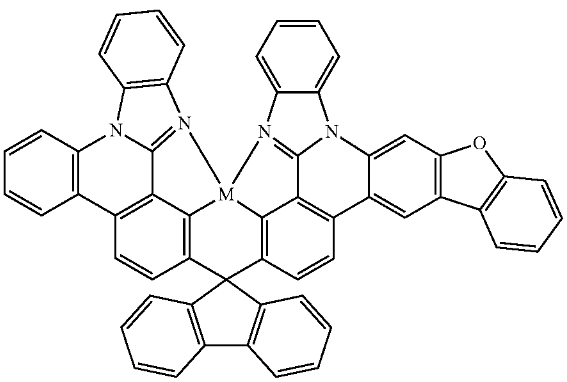
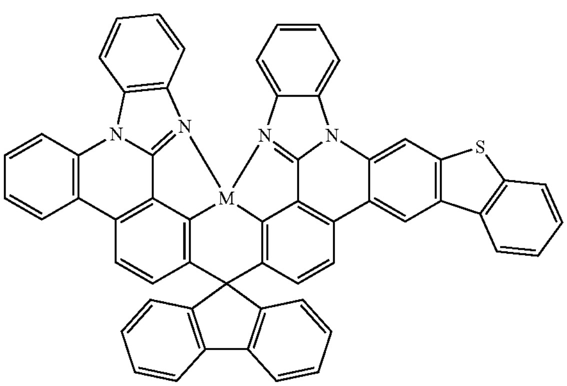
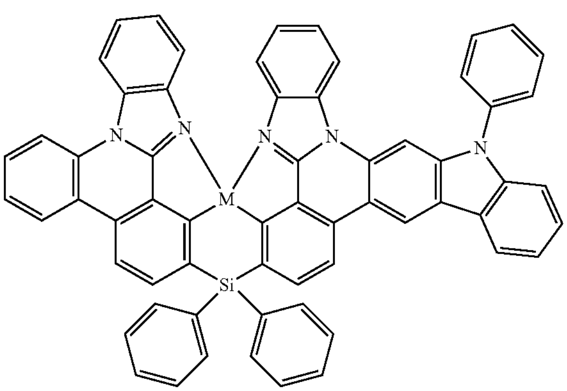
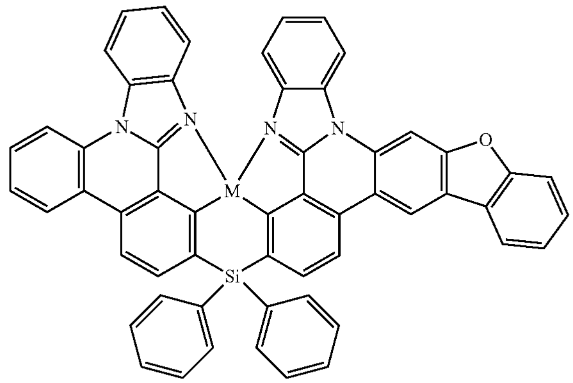
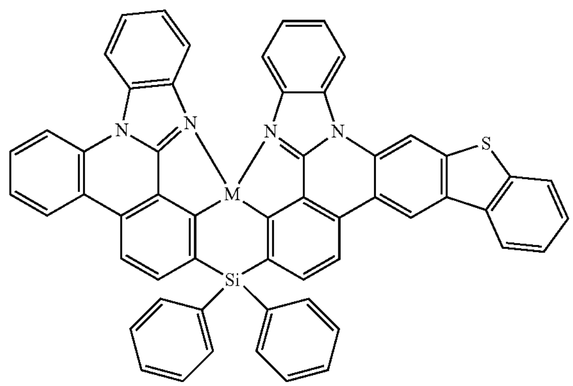
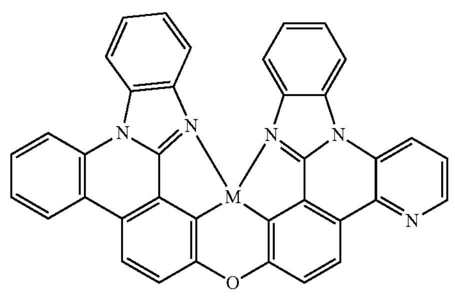
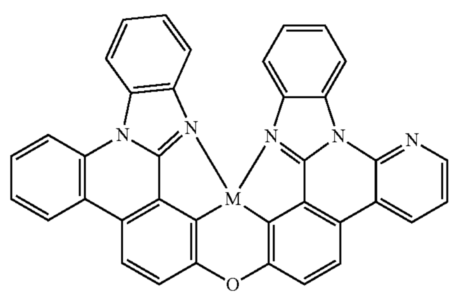
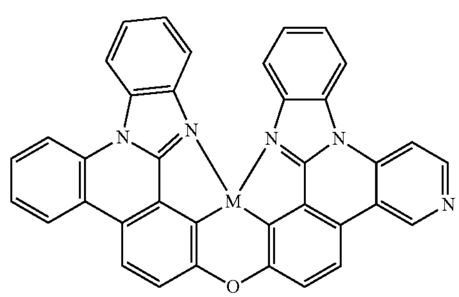

-continued
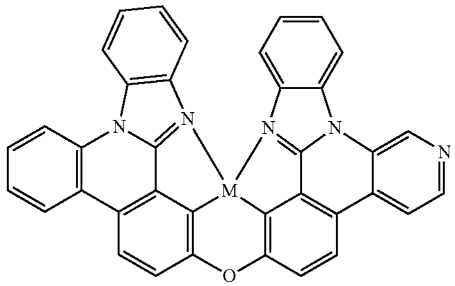
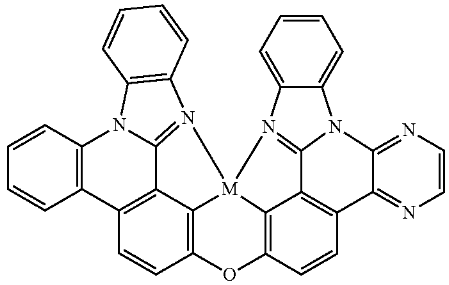
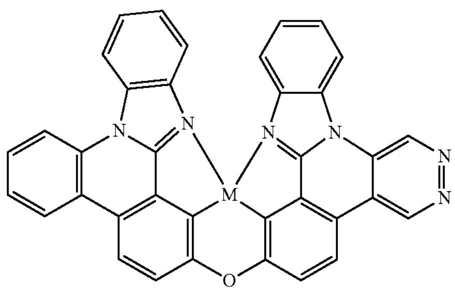
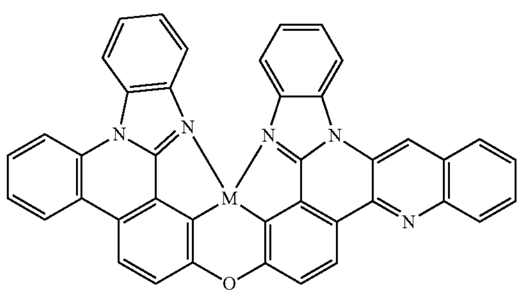
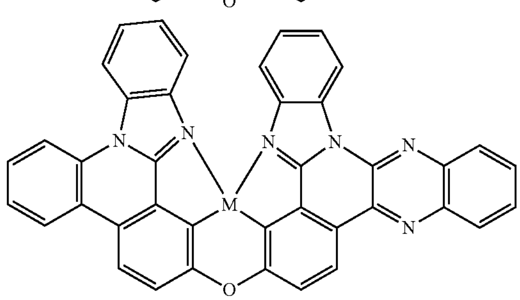
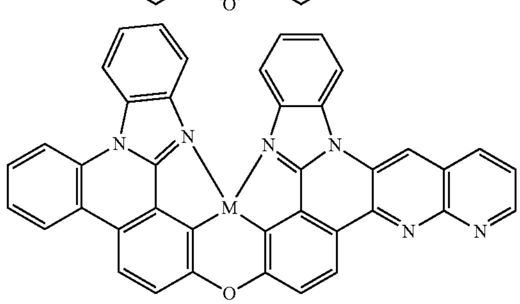
-continued
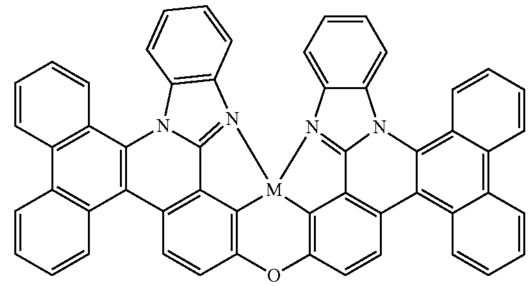
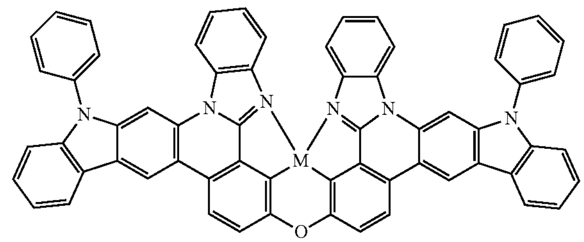
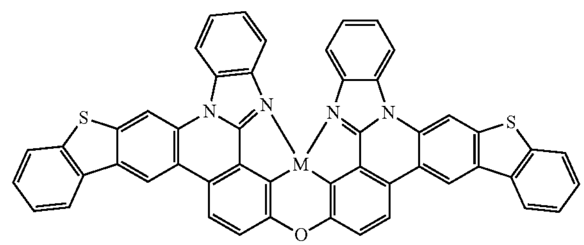
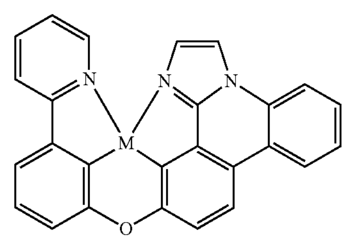
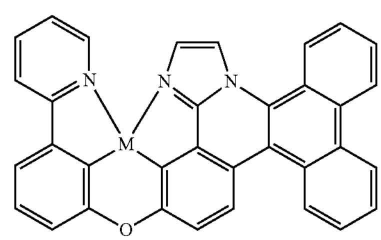
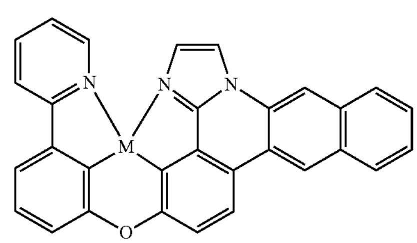

-continued
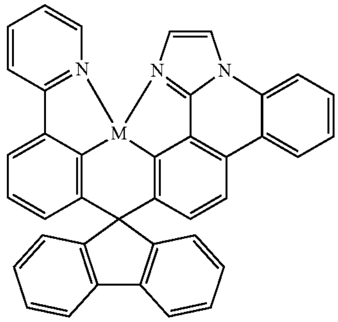
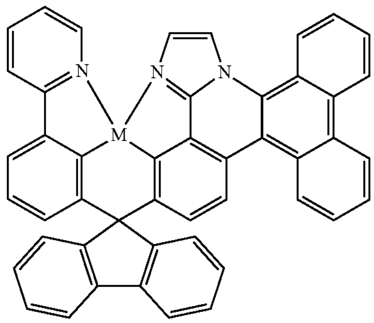
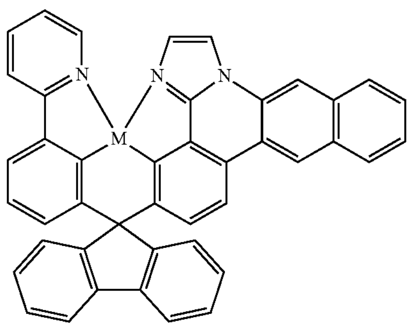
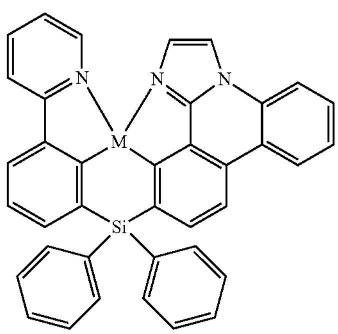
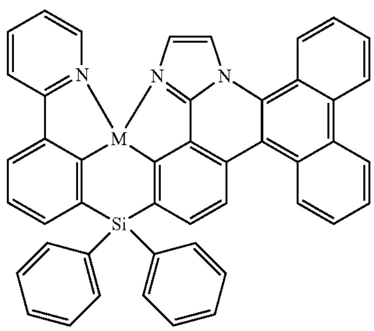
-continued
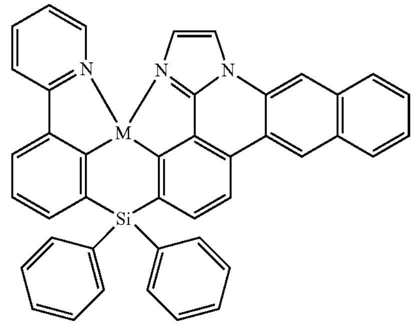
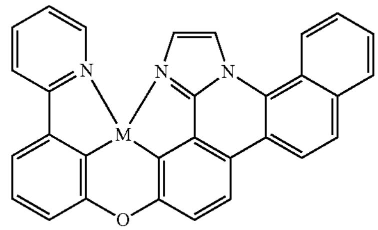
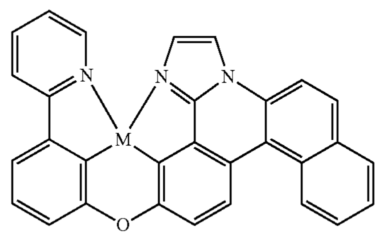
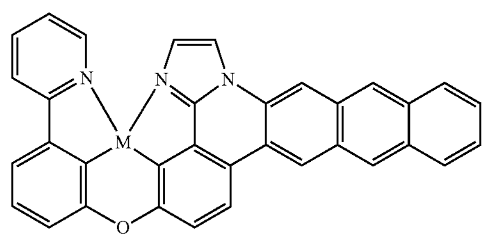
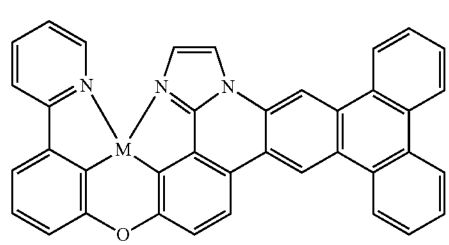
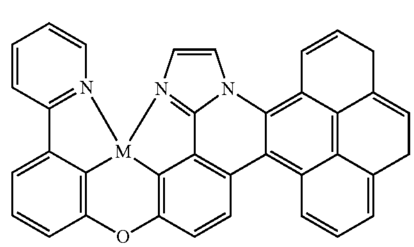

-continued
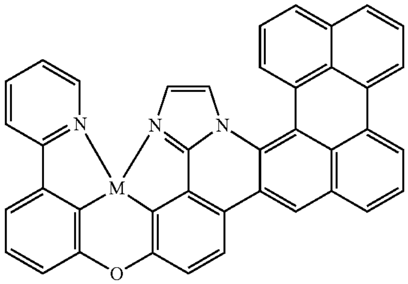
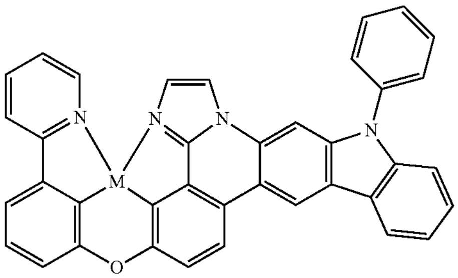
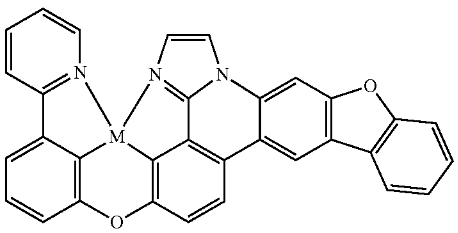
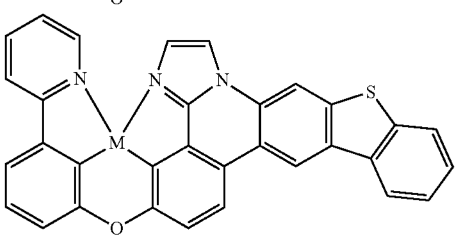
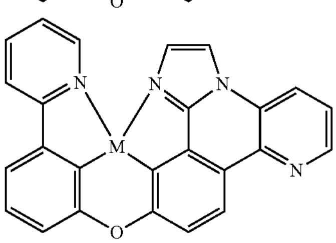
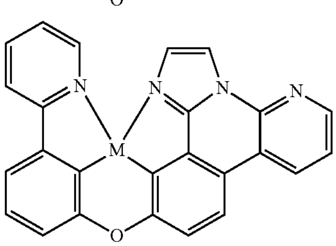
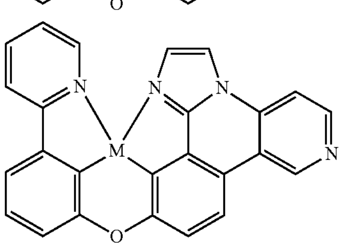
-continued
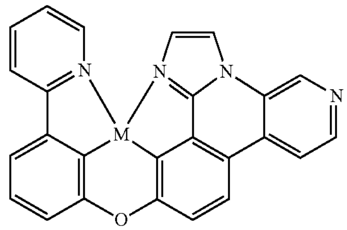
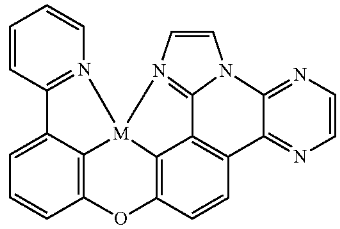
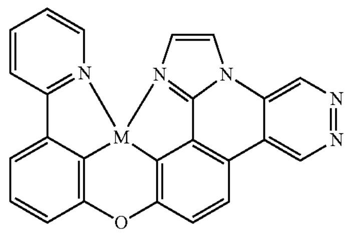
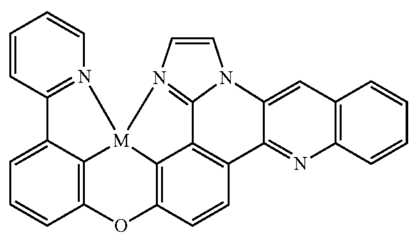
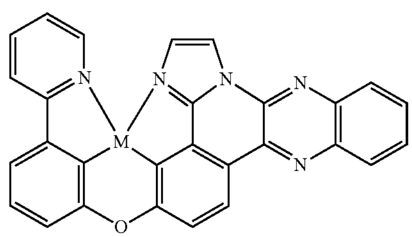
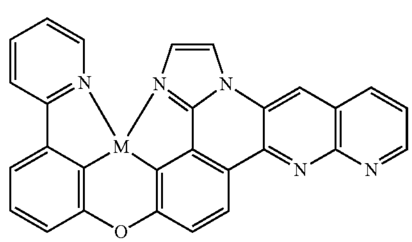
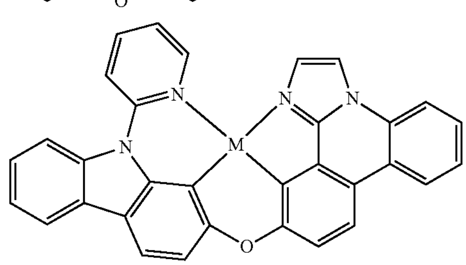

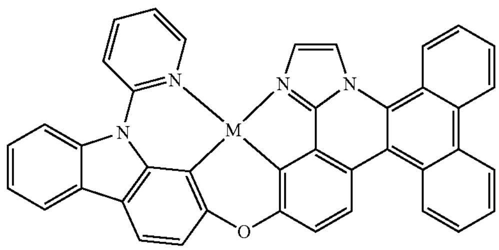
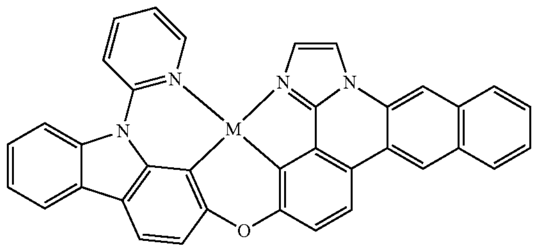
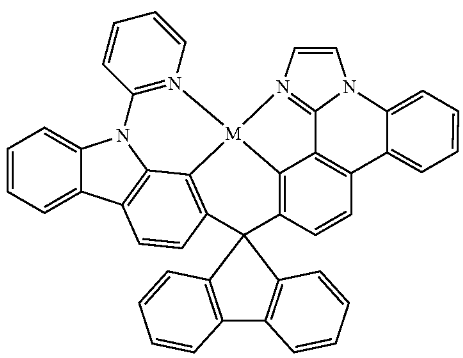
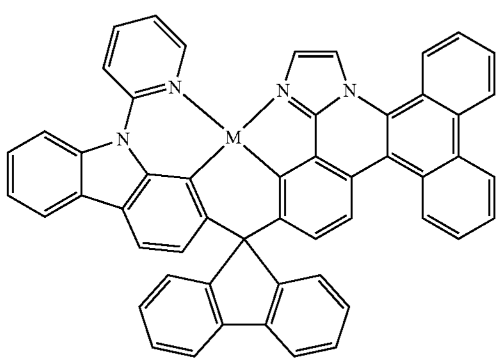
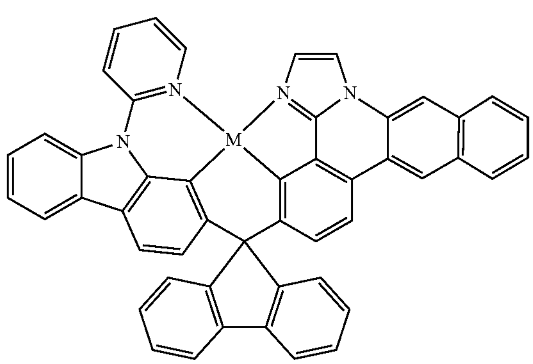
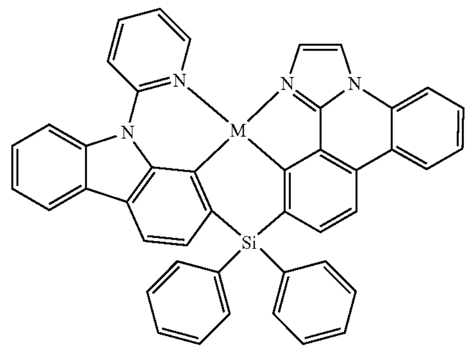
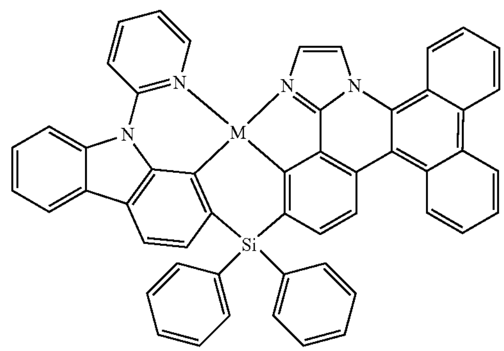
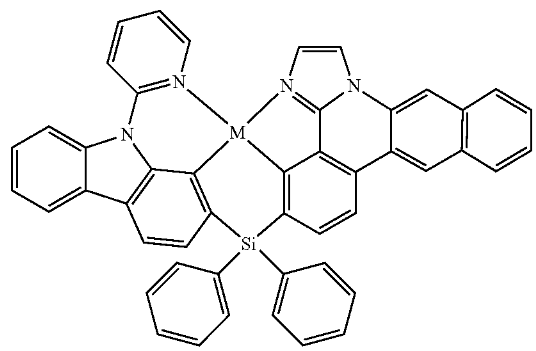
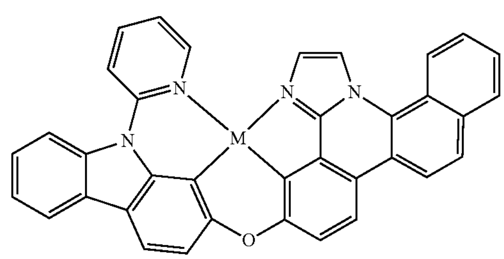
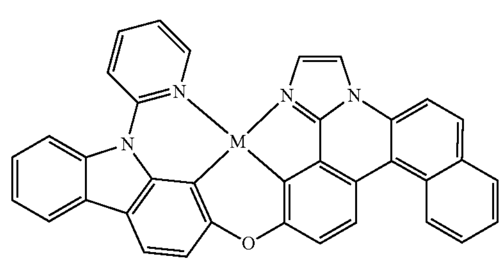

-continued
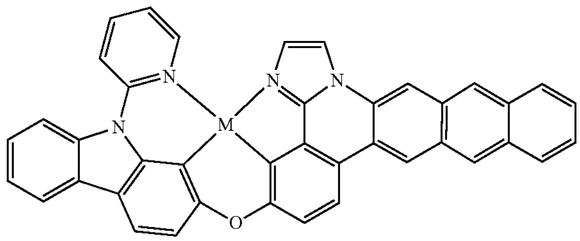
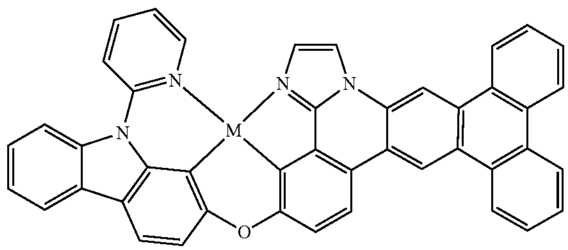
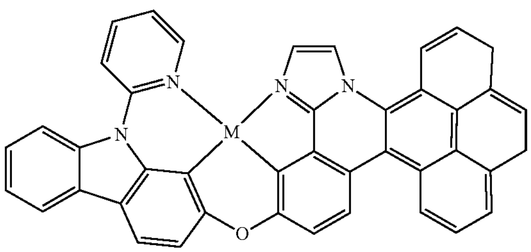
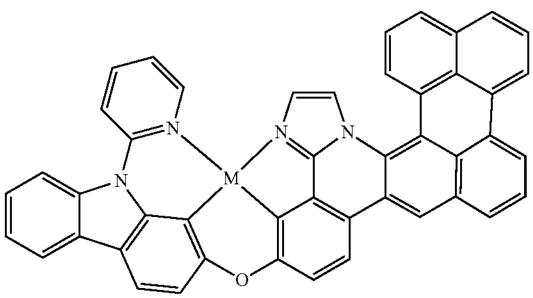
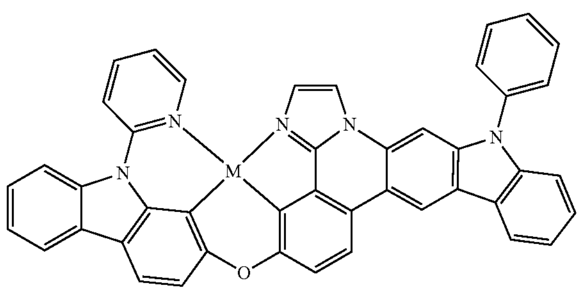
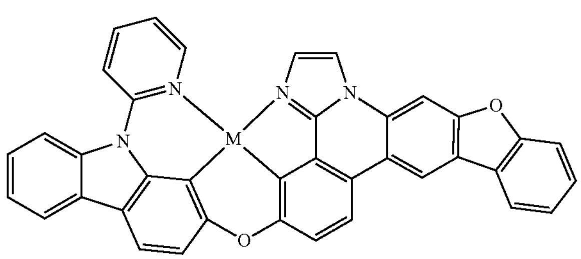
-continued
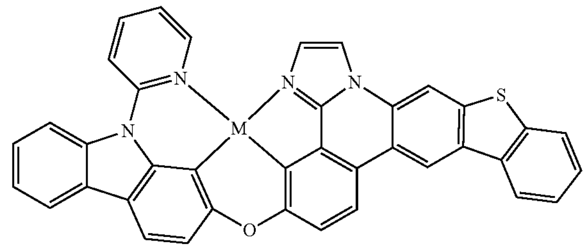
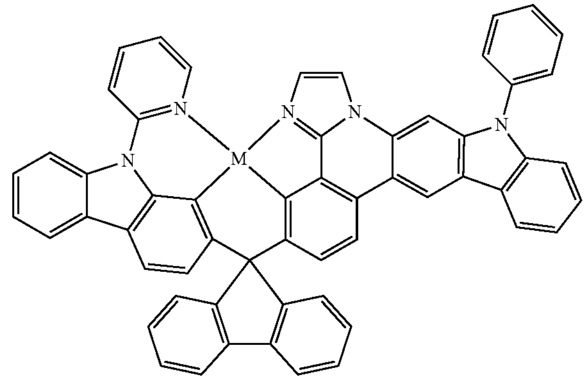
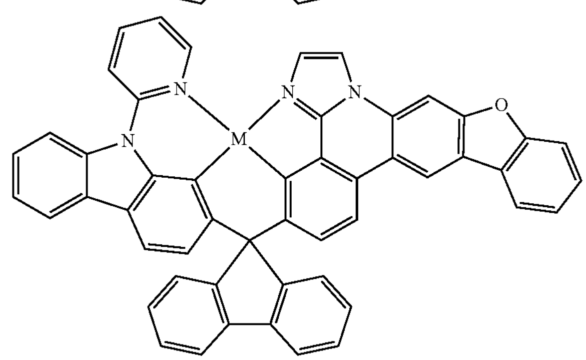
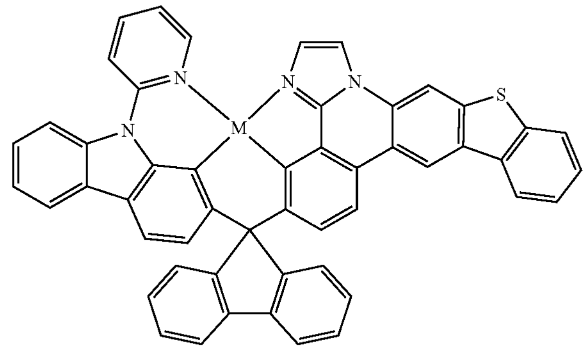
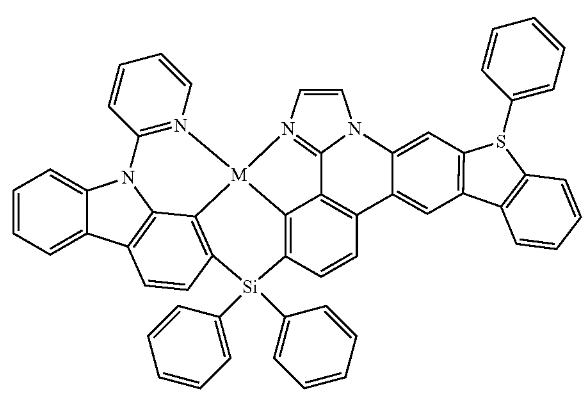

-continued
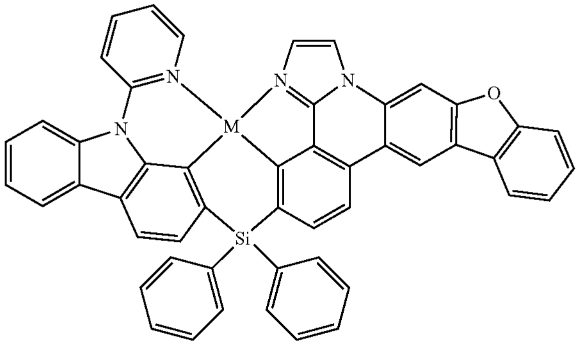
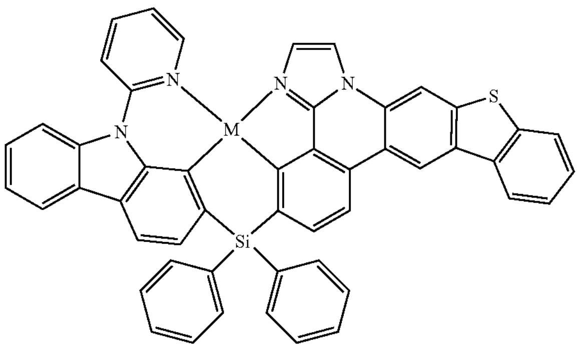
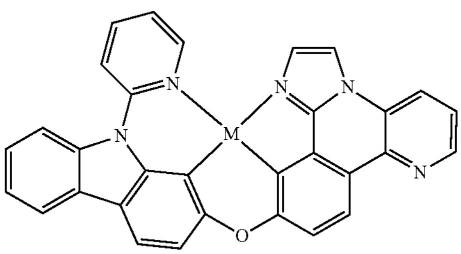
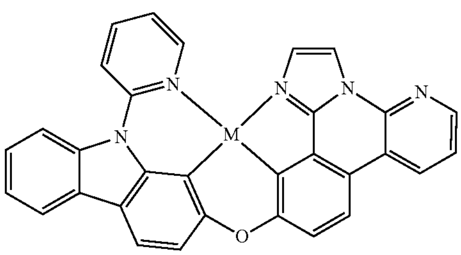
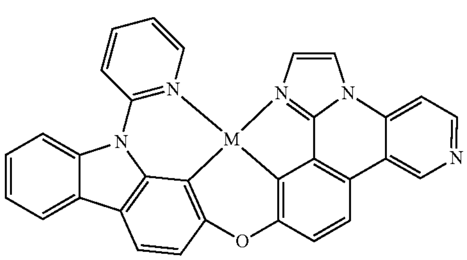
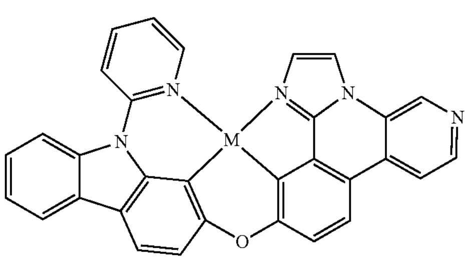
-continued
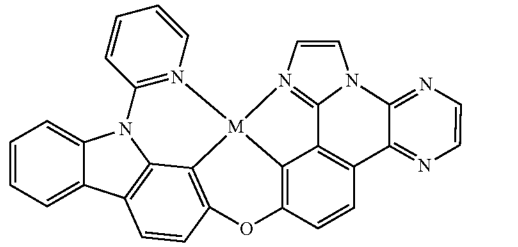
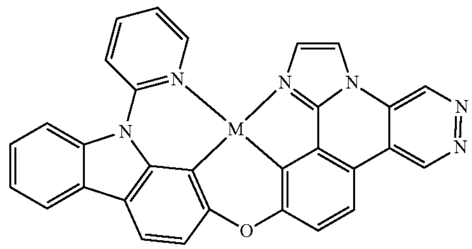
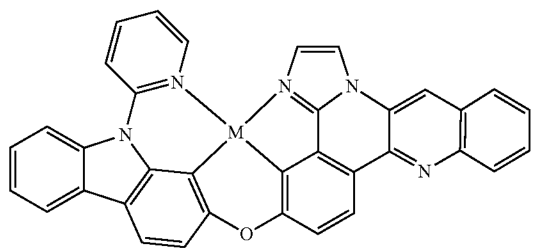
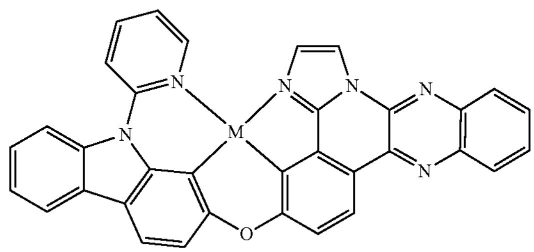
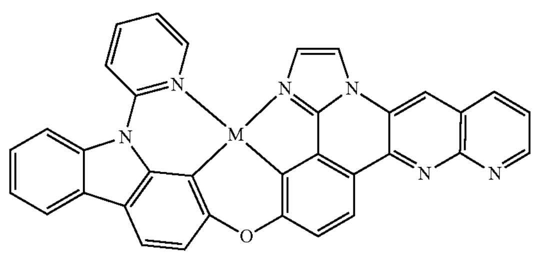
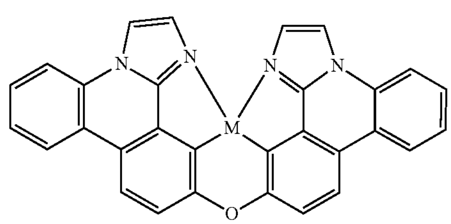
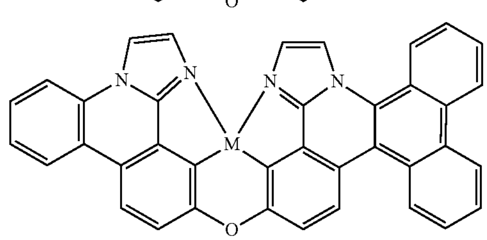

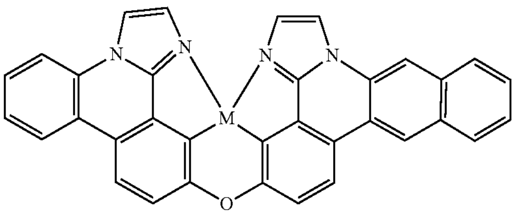
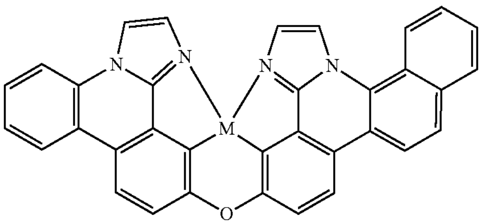
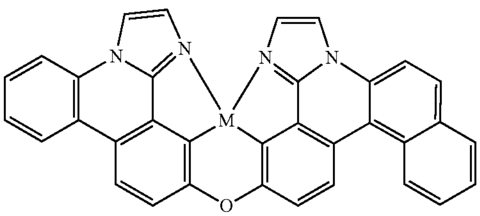
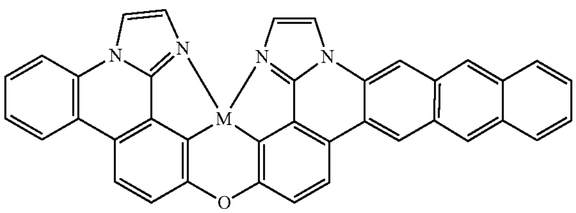
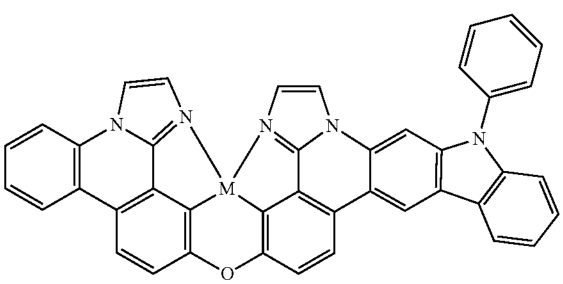
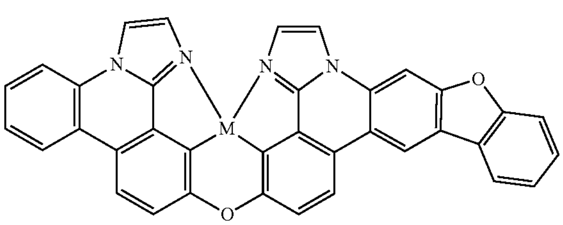
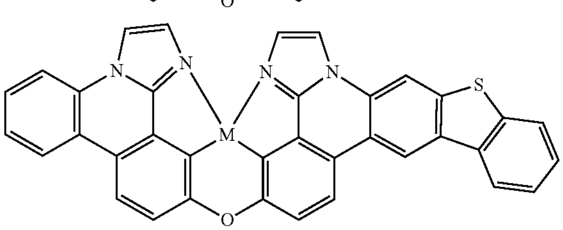
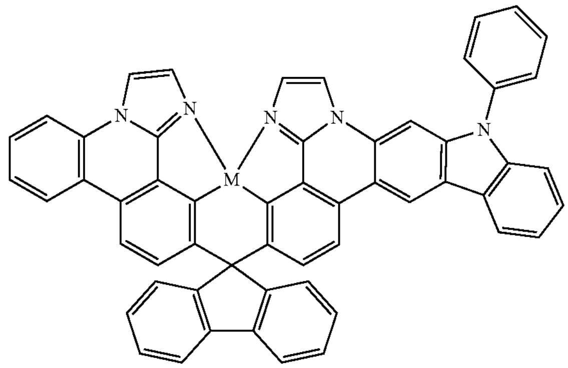
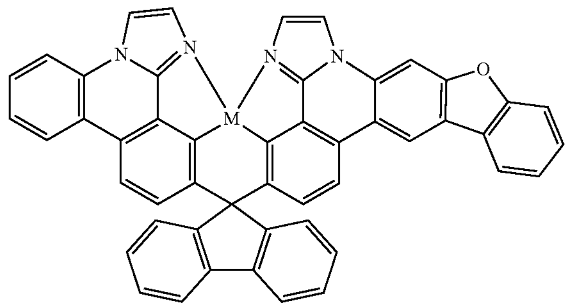
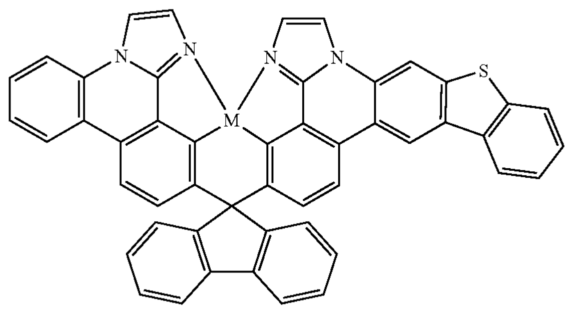
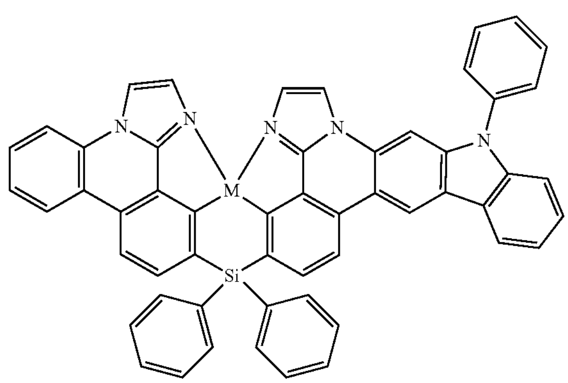
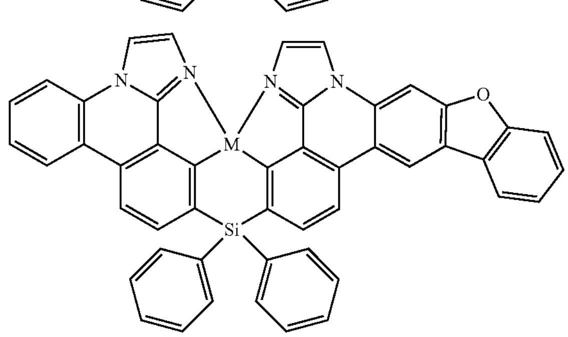

-continued
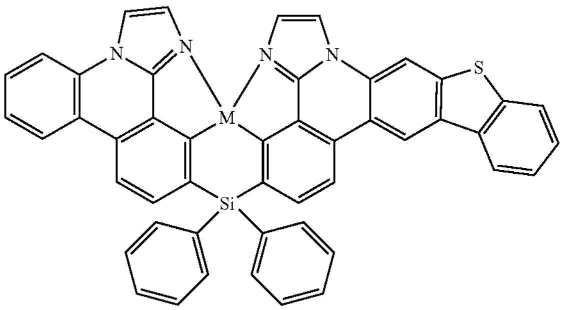
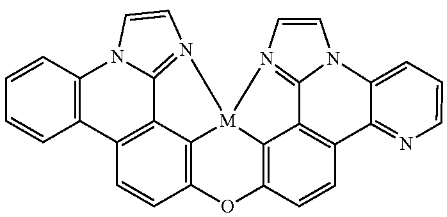
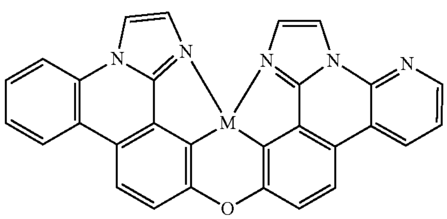
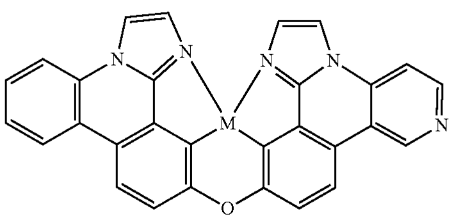
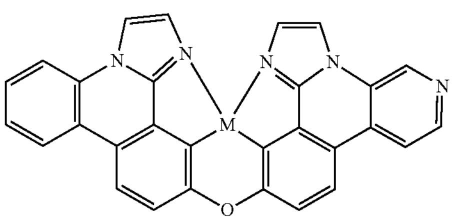
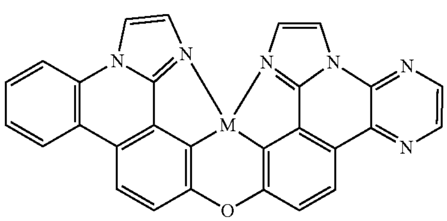
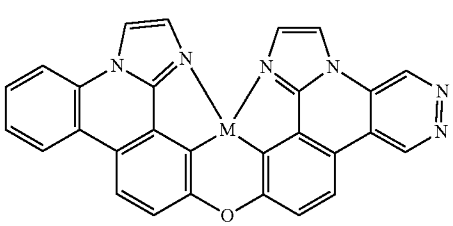
-continued
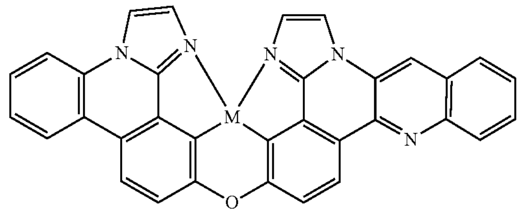
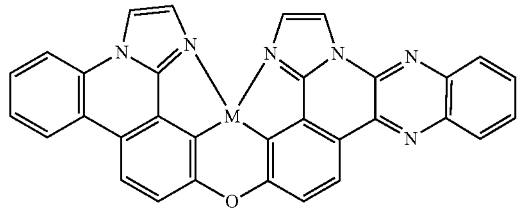
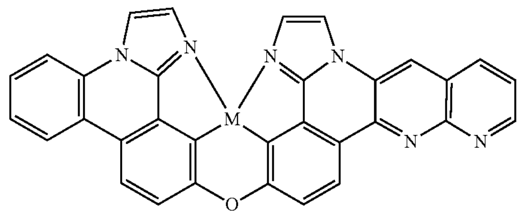
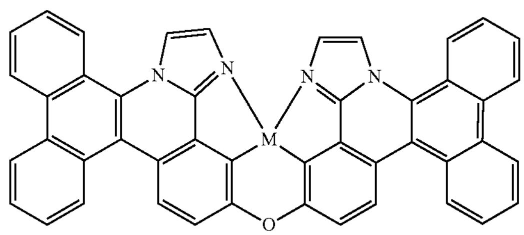
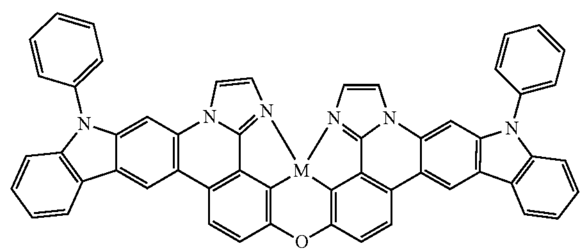
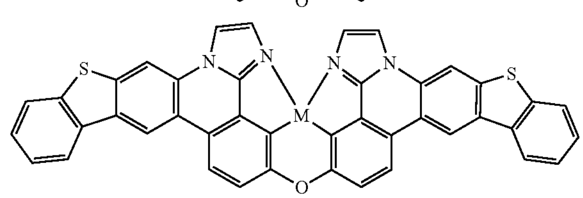
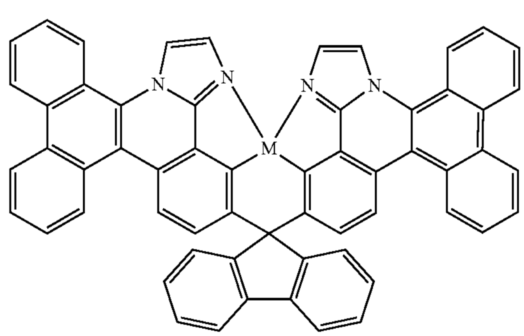

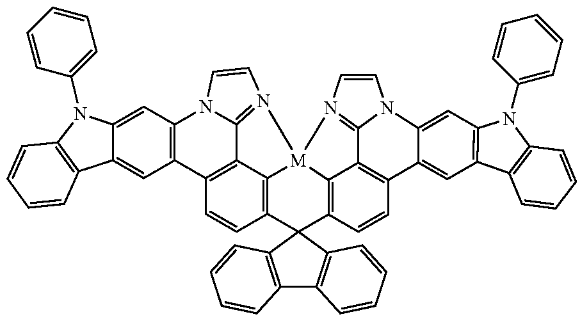
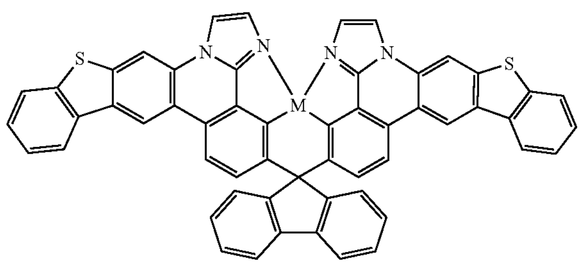
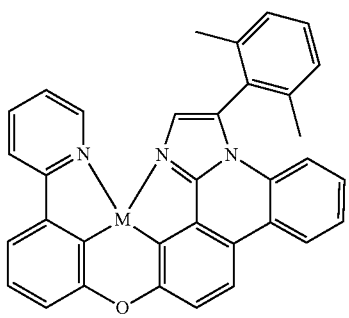
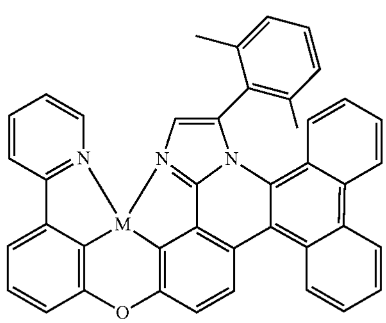
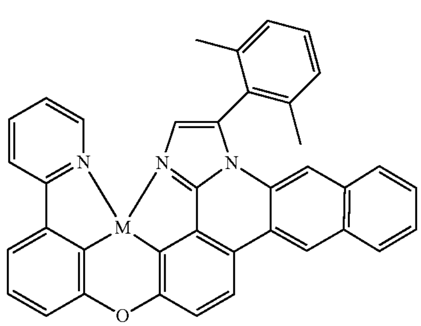
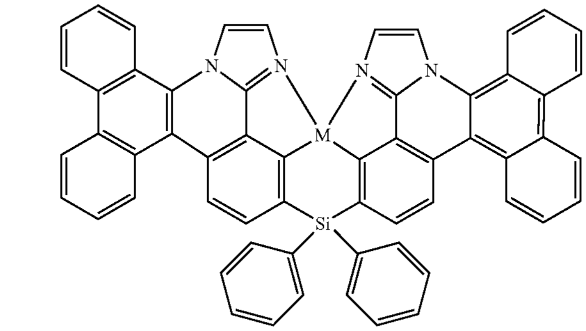
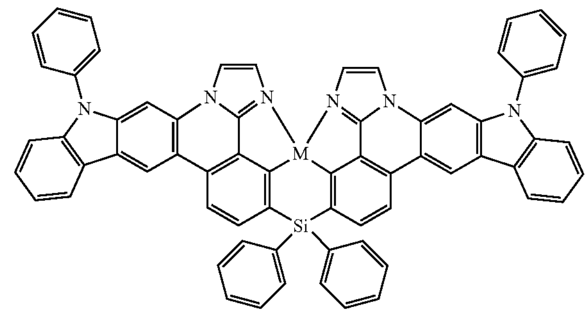
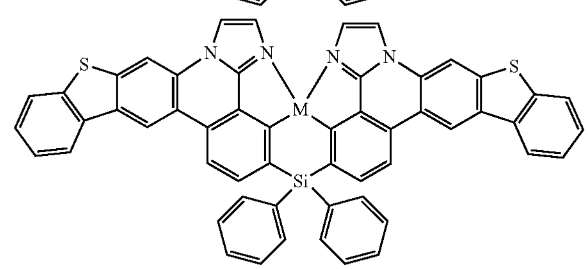
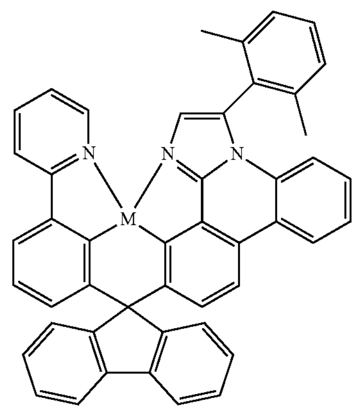
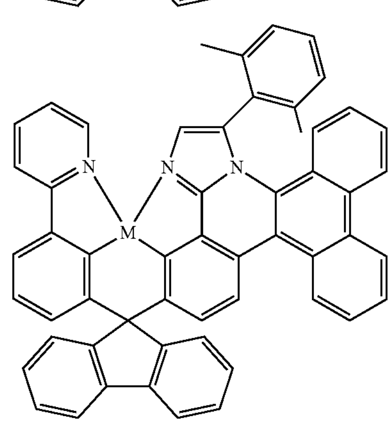

-continued
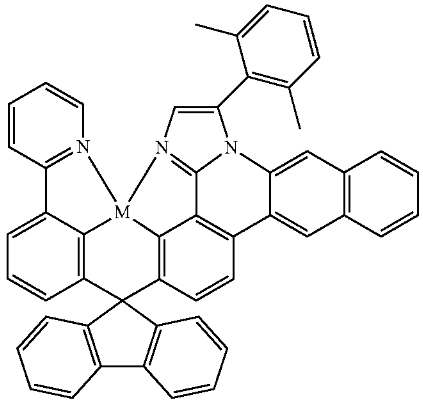
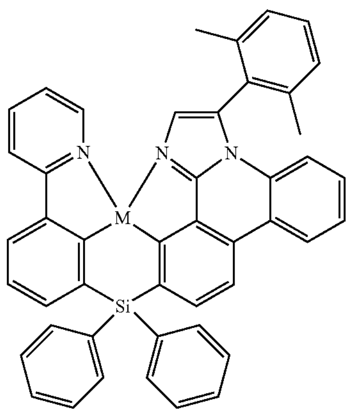
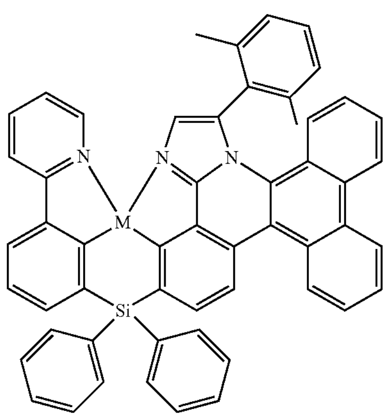
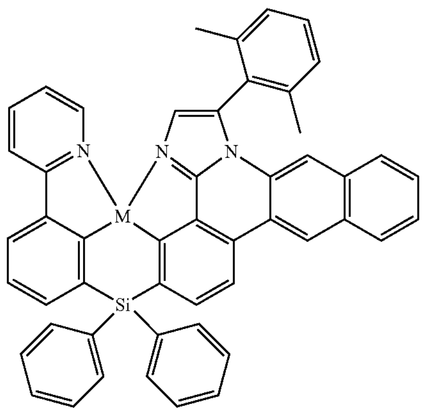
-continued
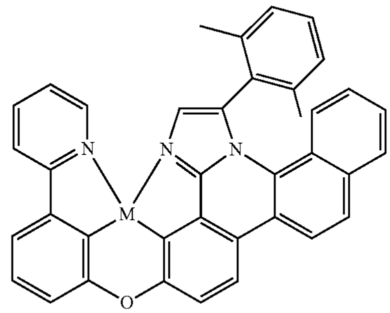
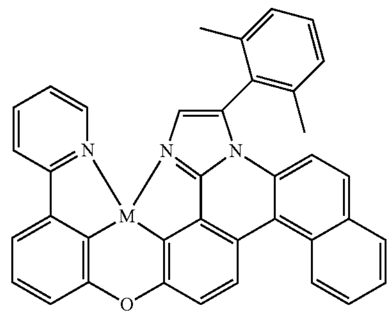
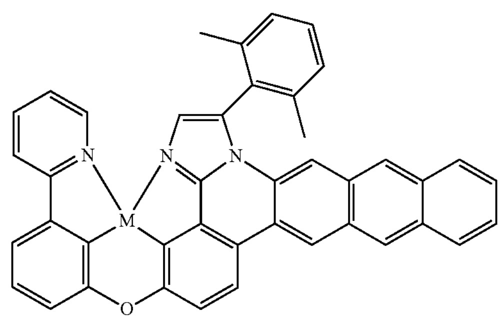
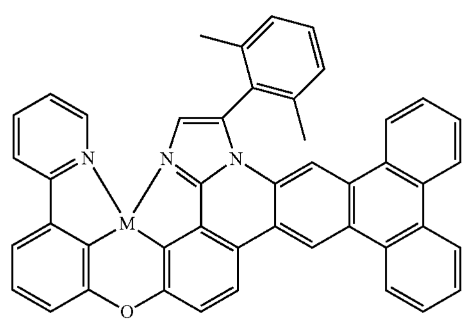
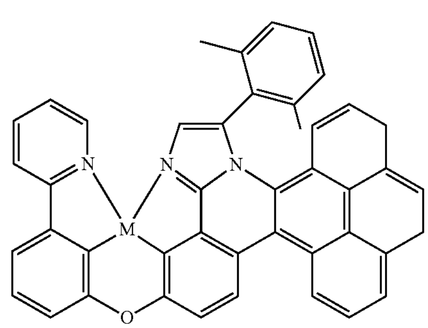

-continued
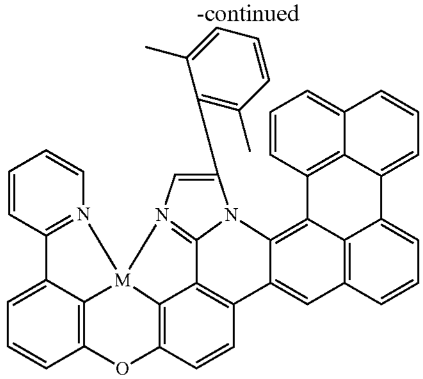
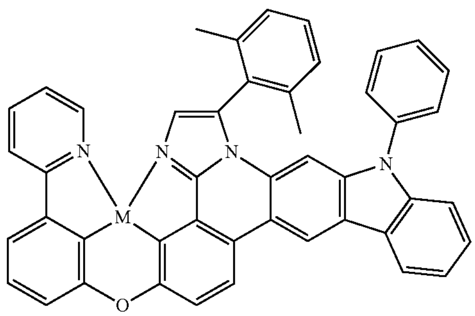
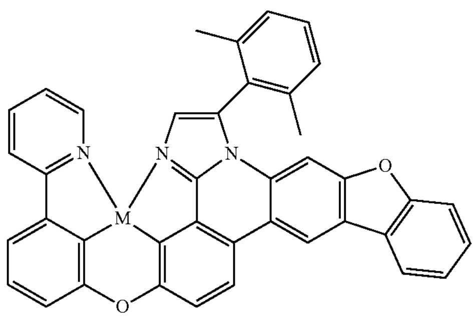
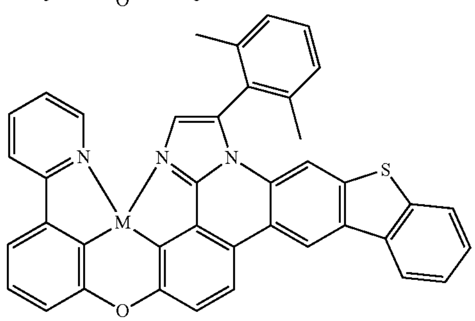
-continued
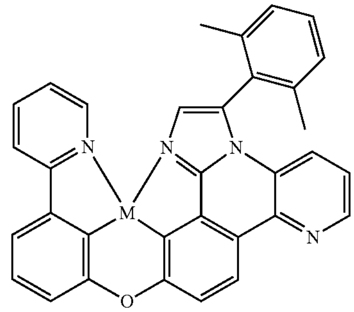
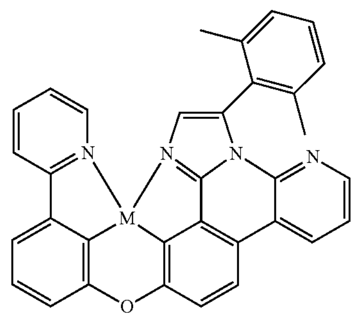
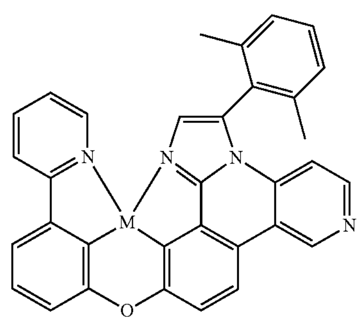
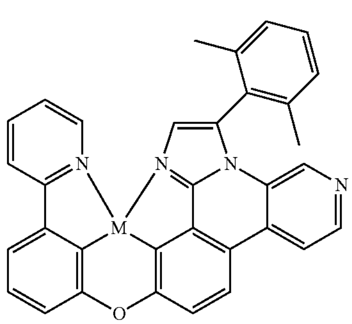
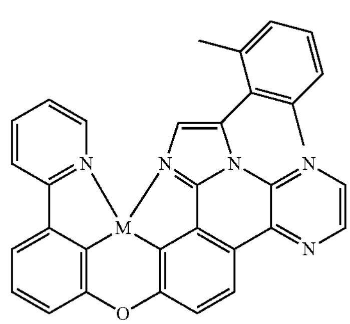
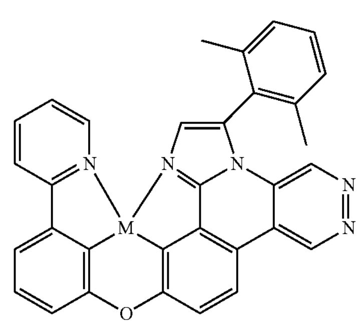

-continued
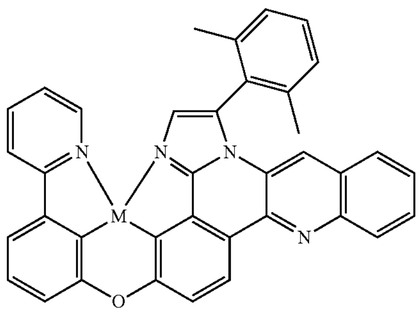
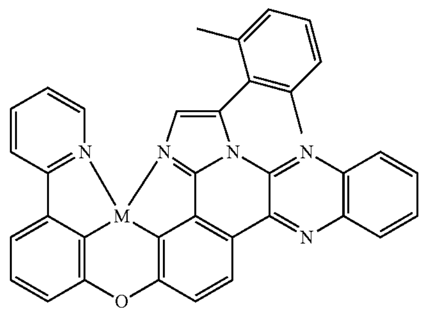
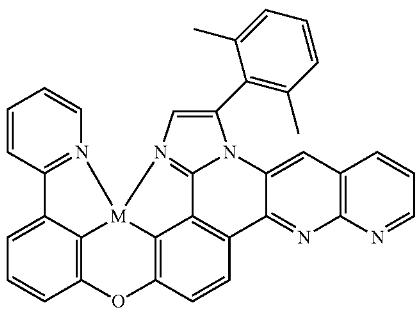
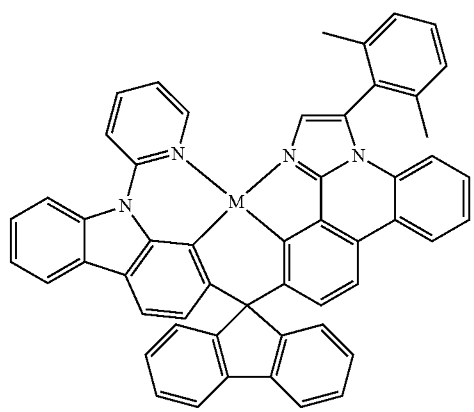
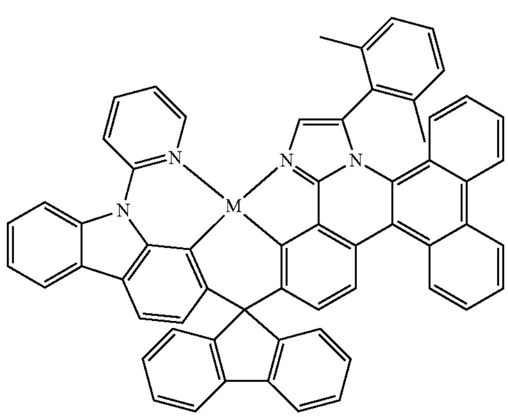
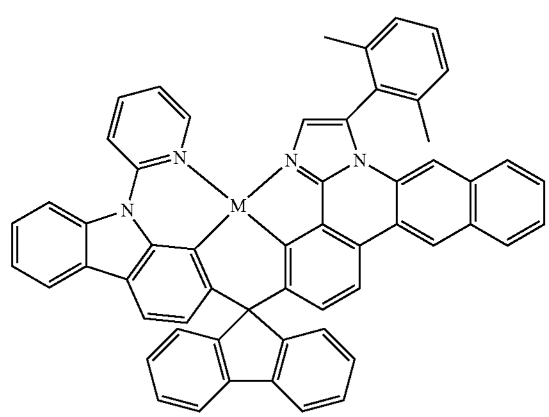
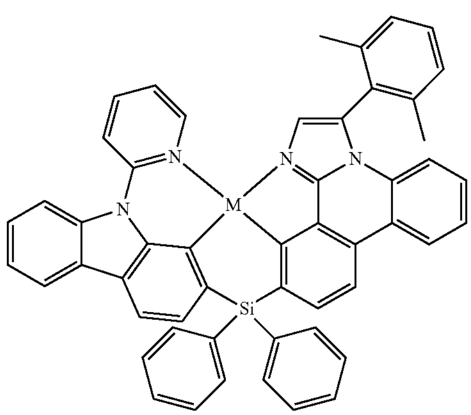
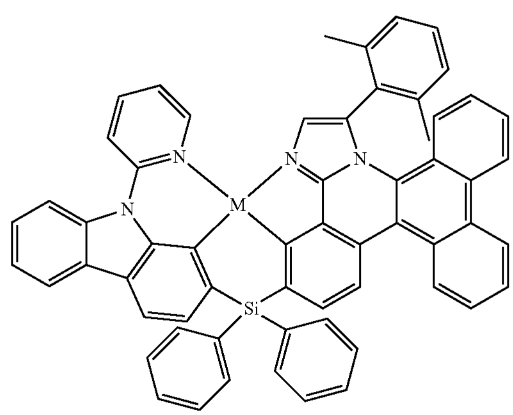

-continued
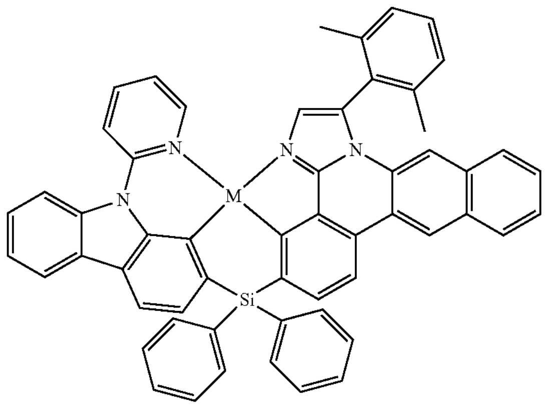
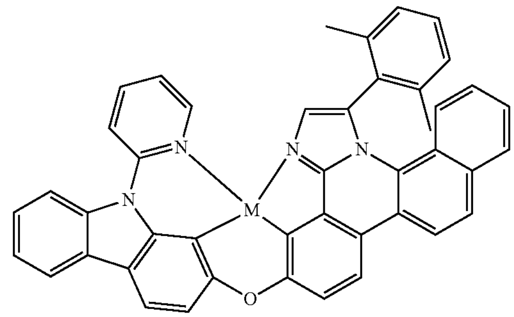
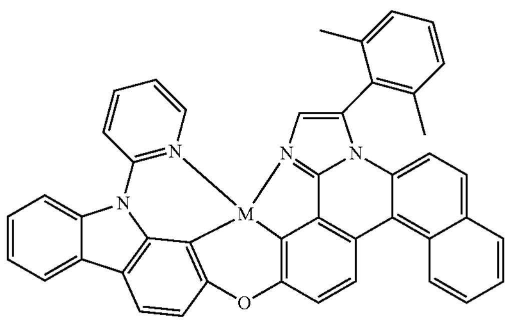
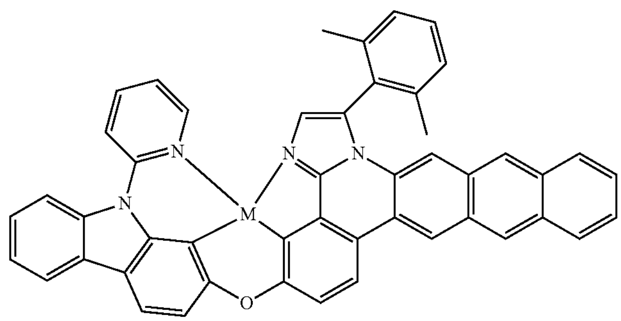
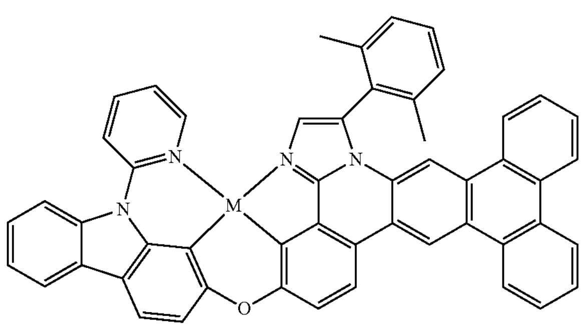
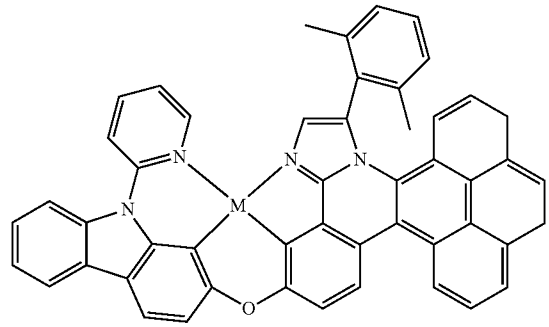
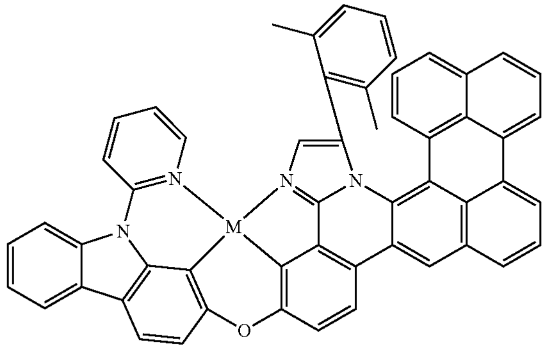
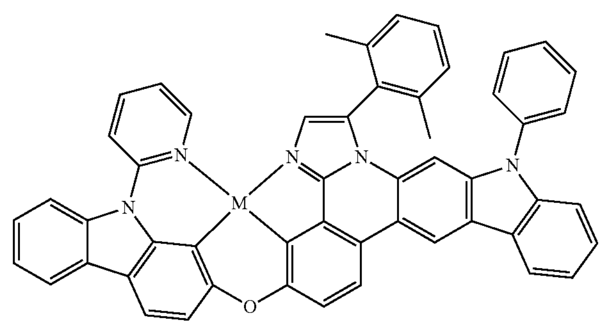
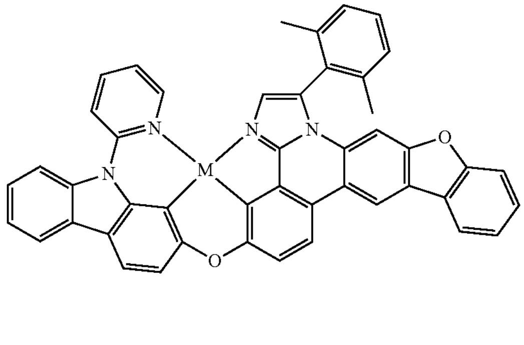
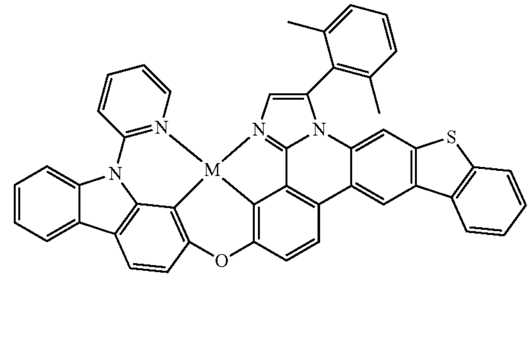

-continued
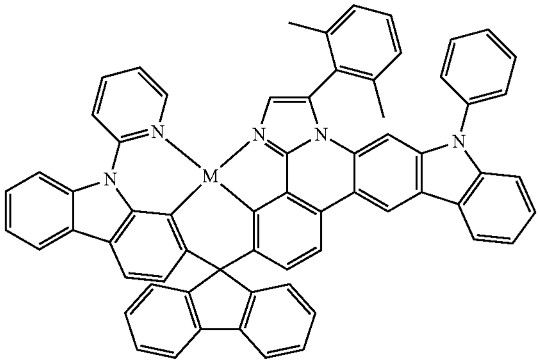
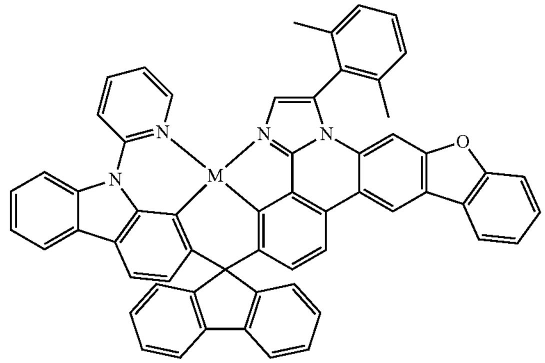
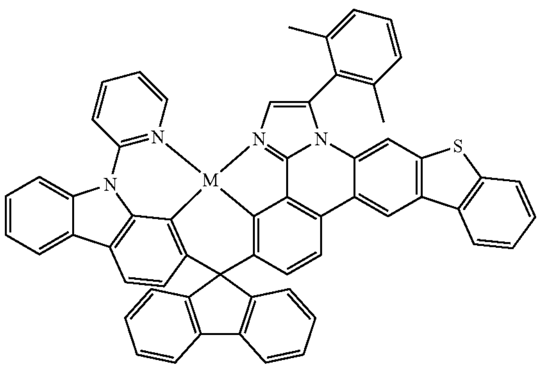
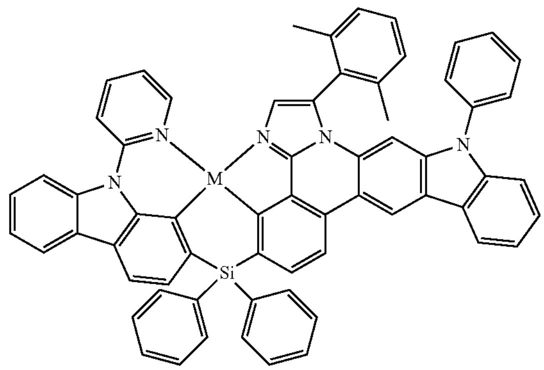
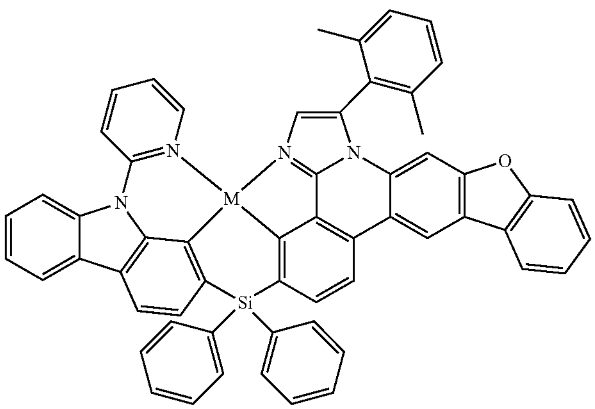
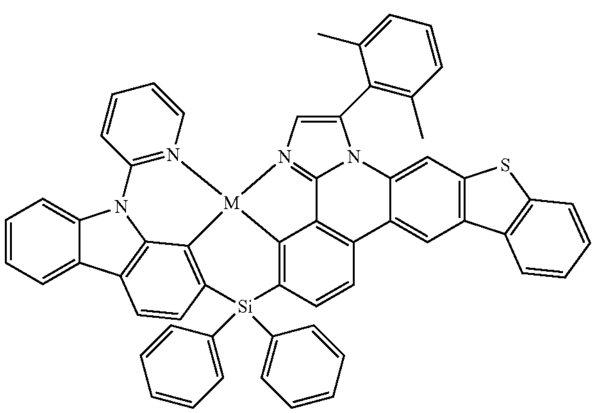
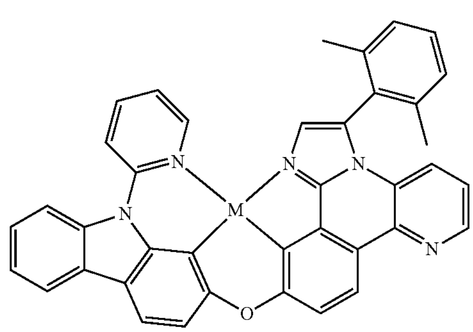

-continued
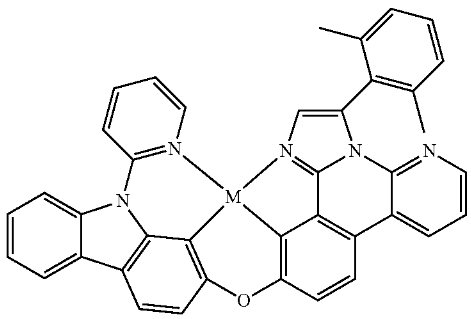
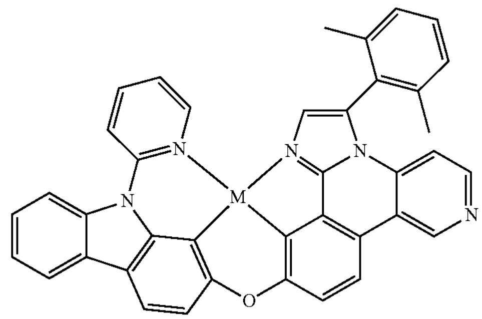
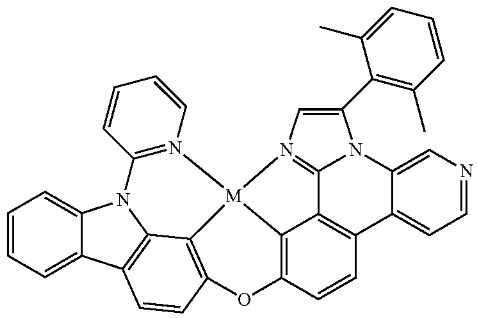
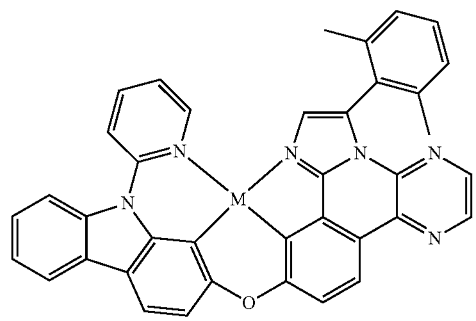
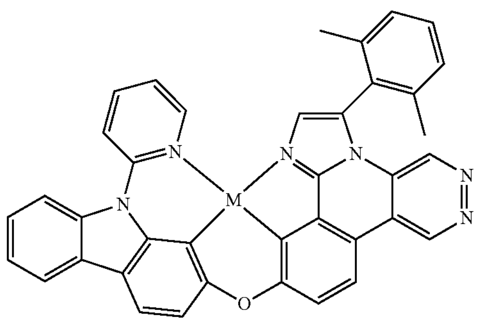
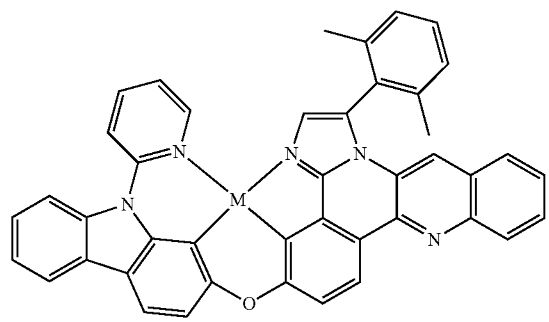
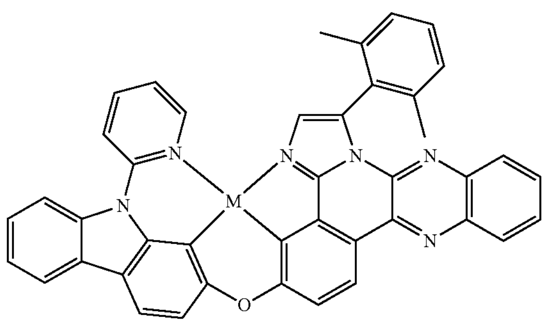
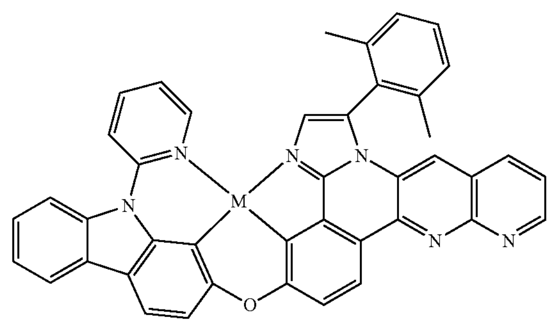
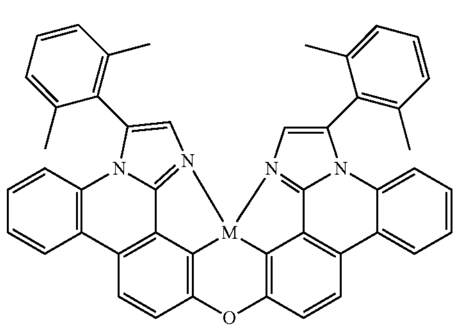
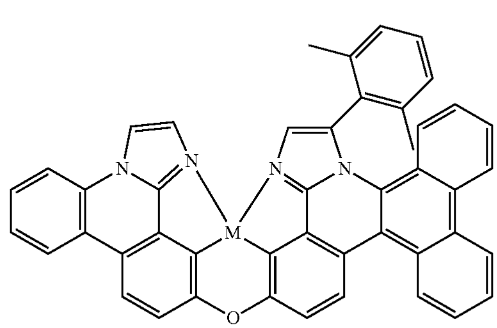

-continued
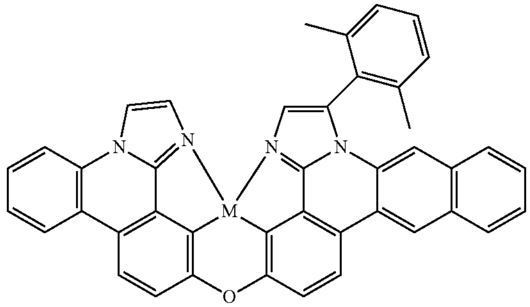
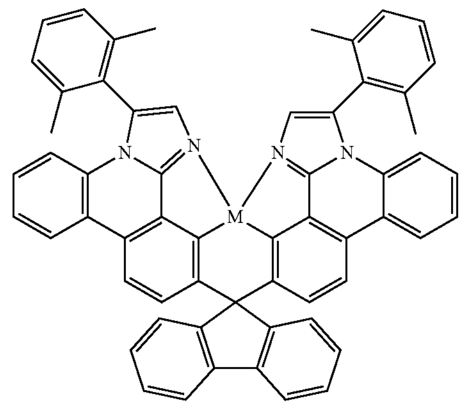
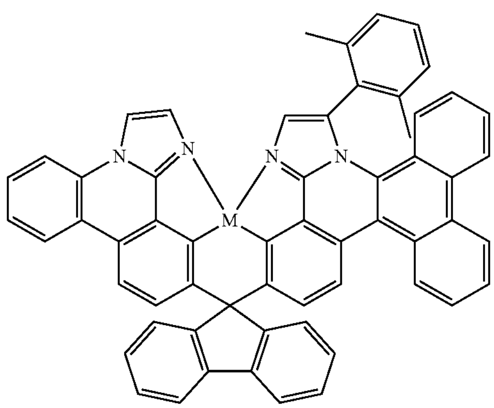
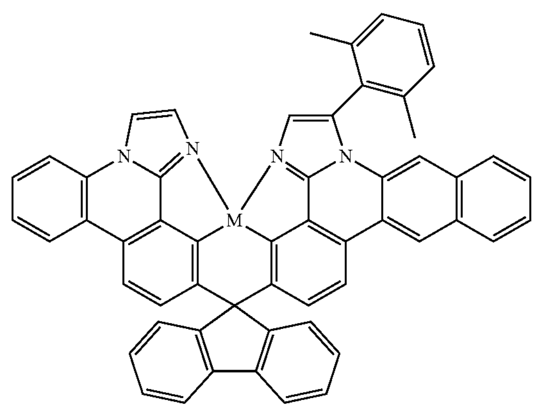
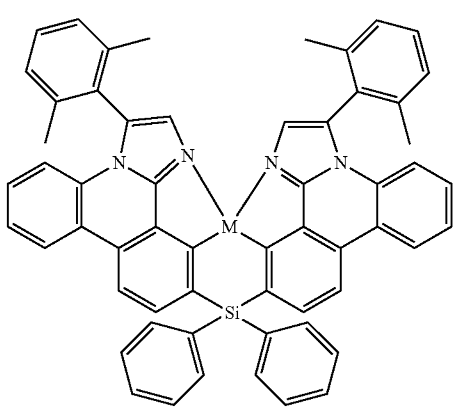
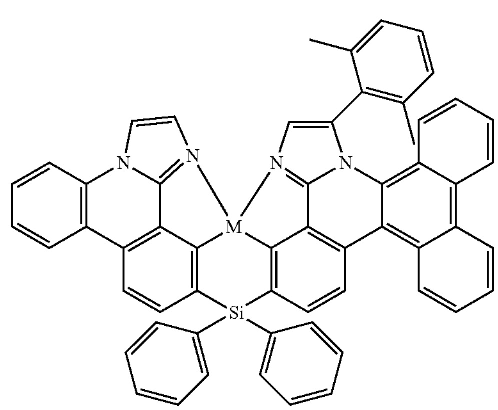
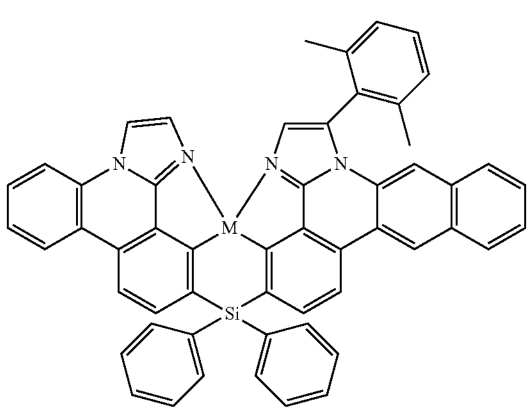
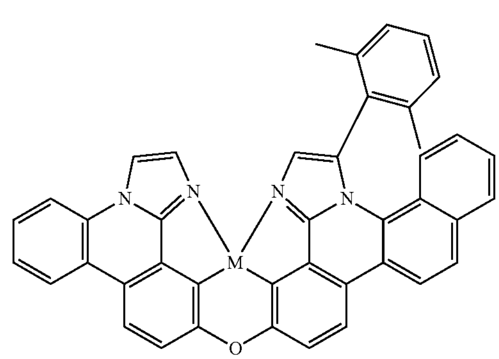

-continued
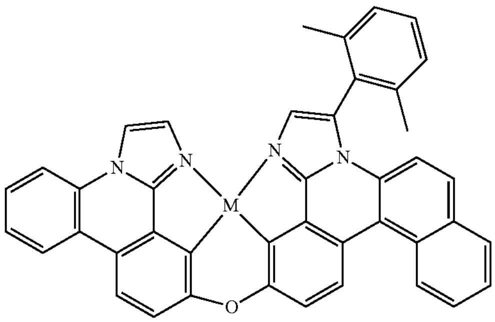
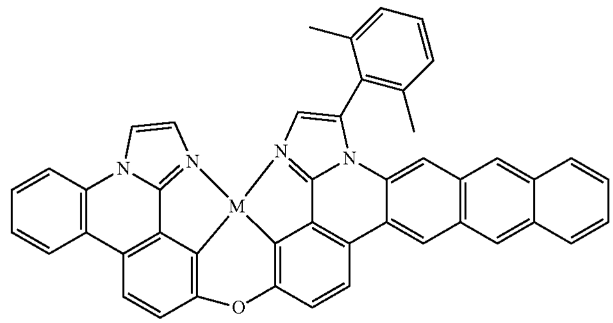
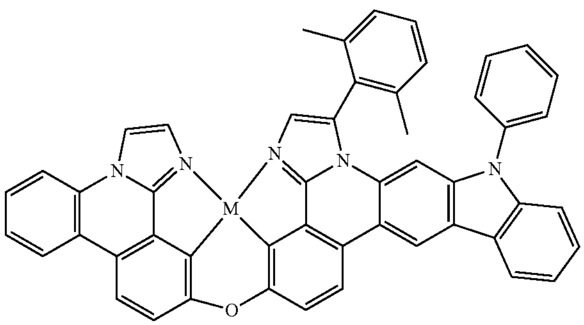
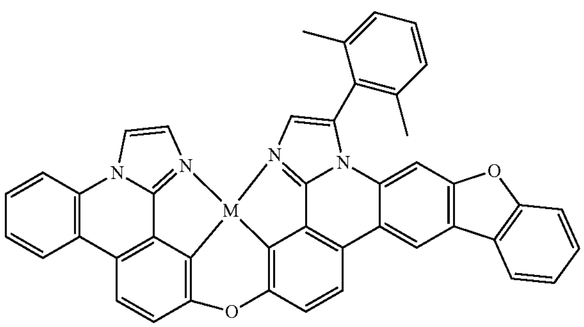
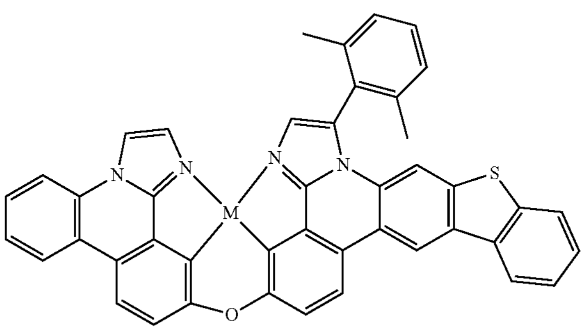
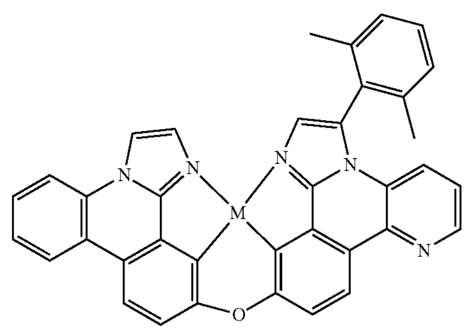
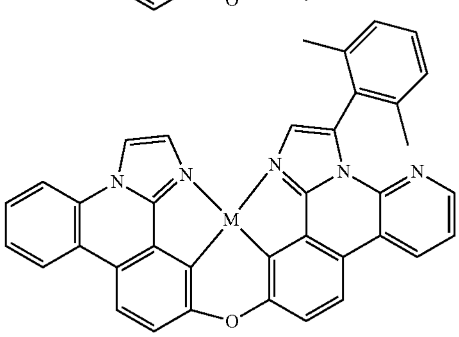
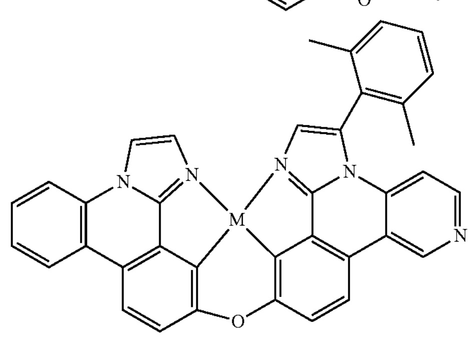

-continued
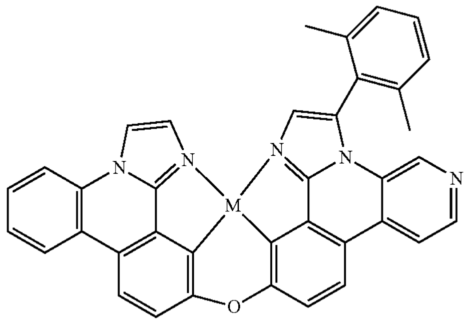
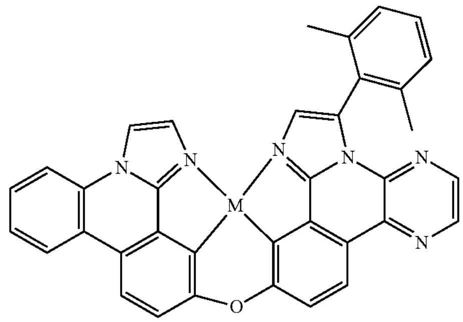
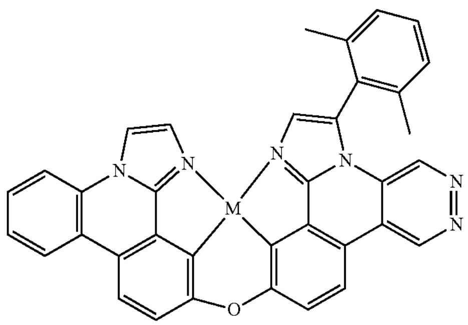
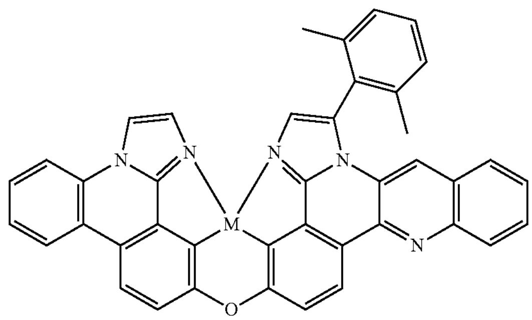
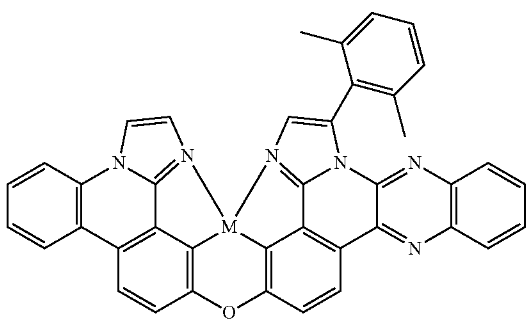
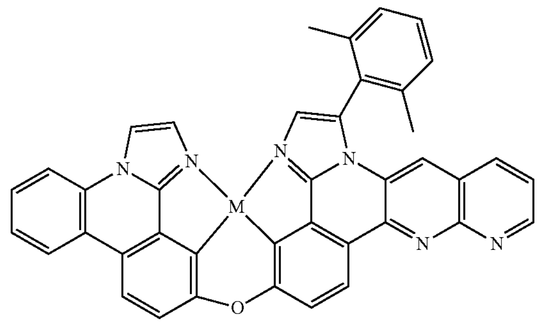
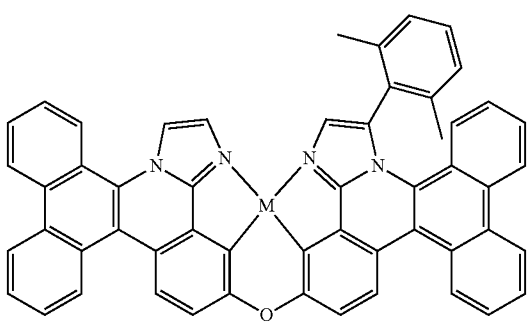
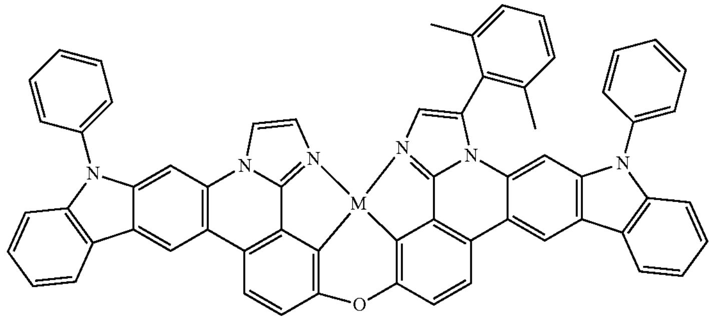

-continued
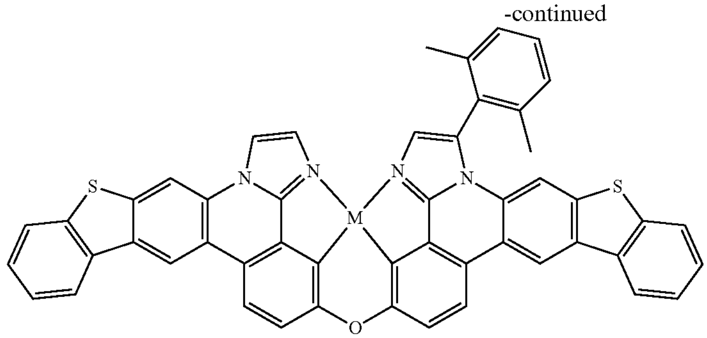
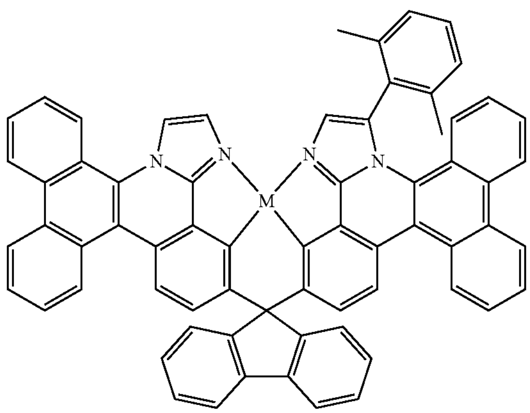
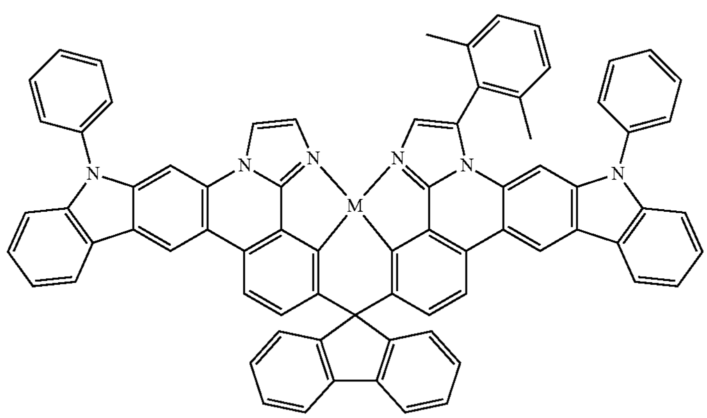
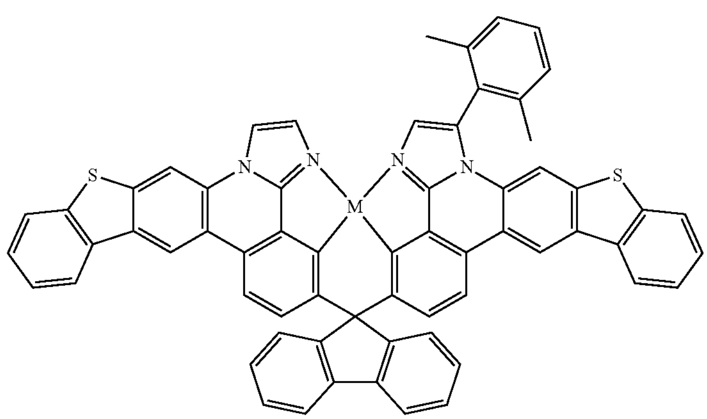

-continued
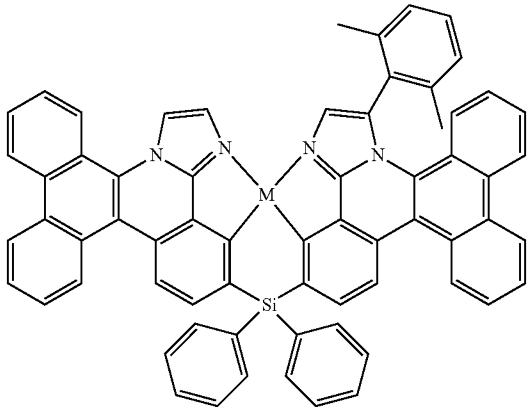
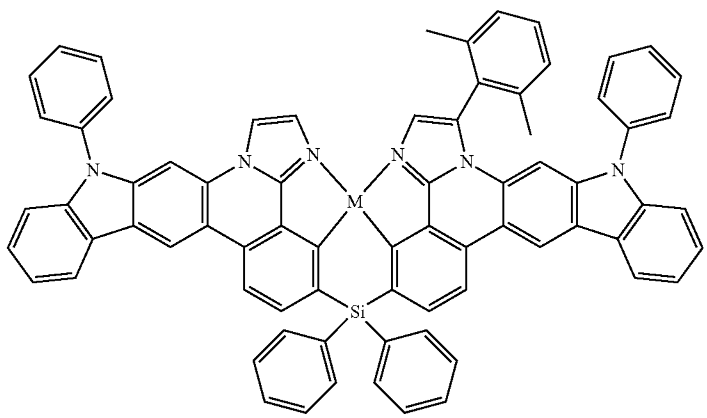
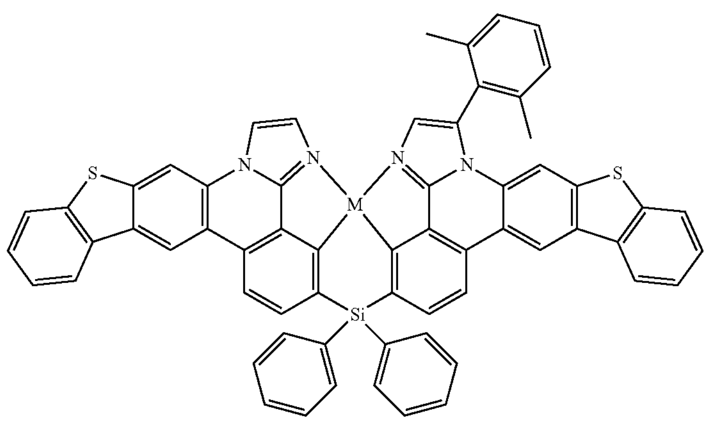
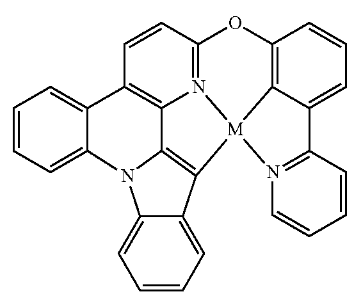
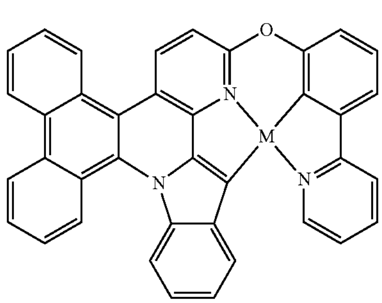
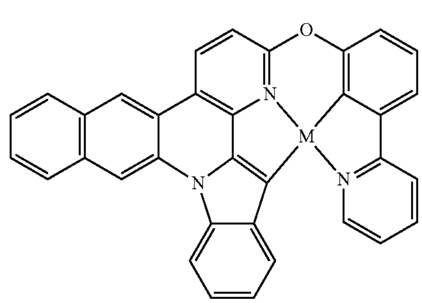
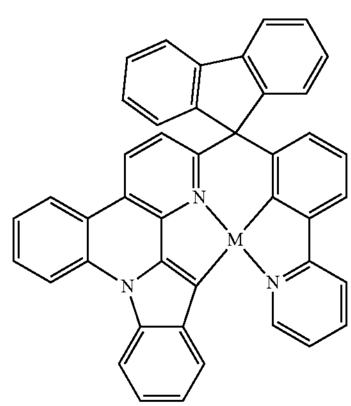

-continued
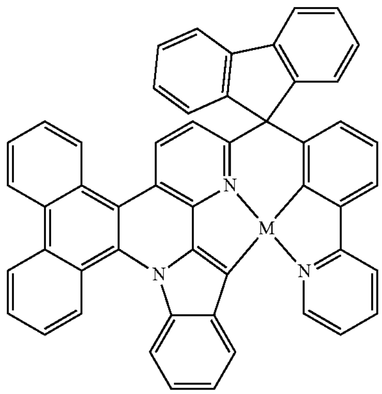
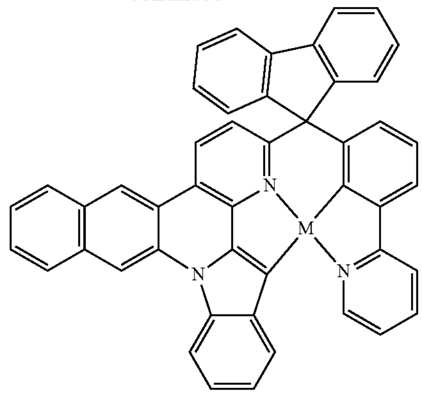
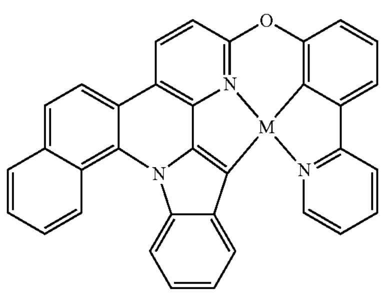
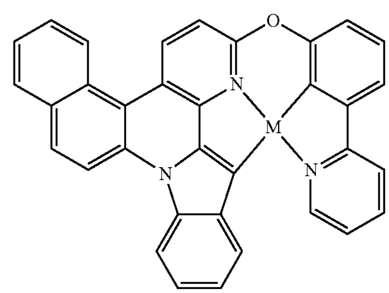
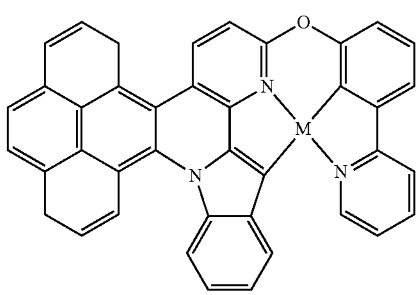
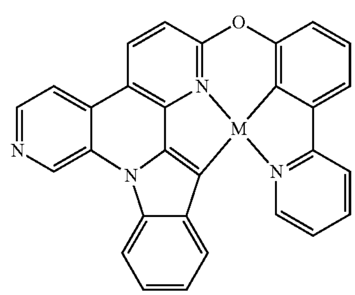
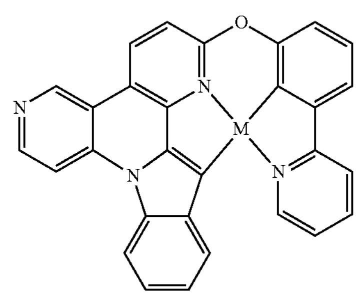
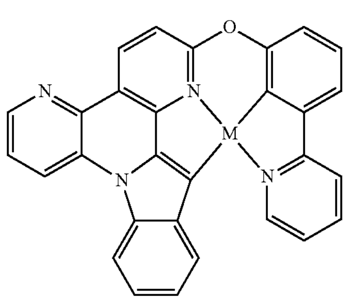
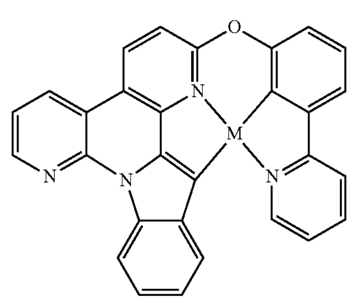
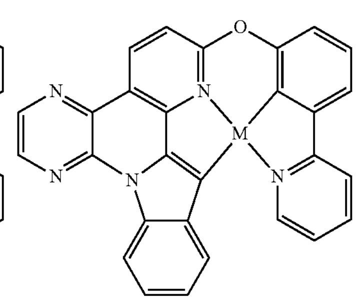
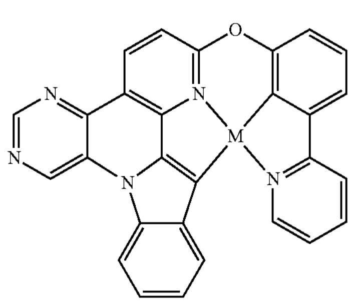
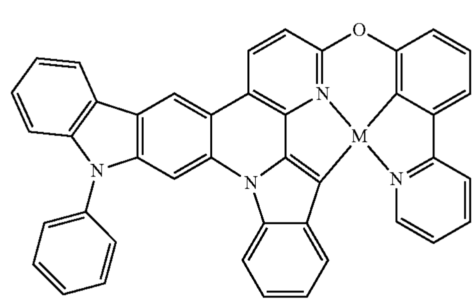

-continued
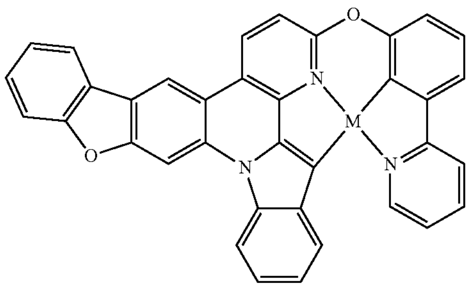
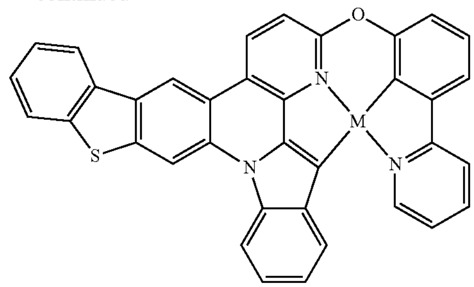
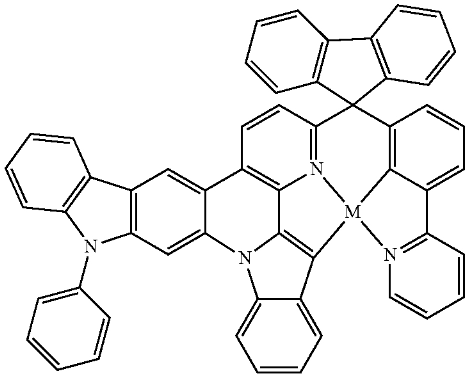
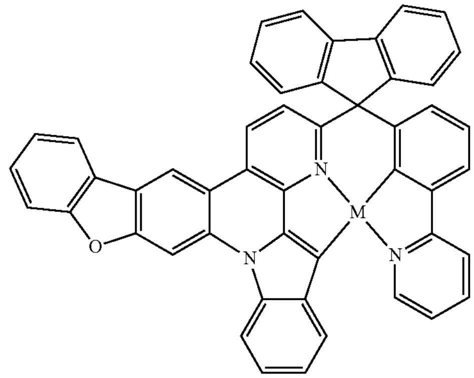
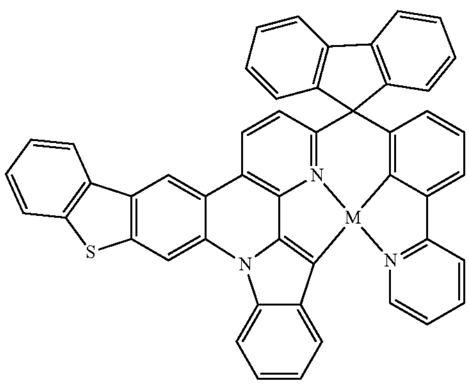
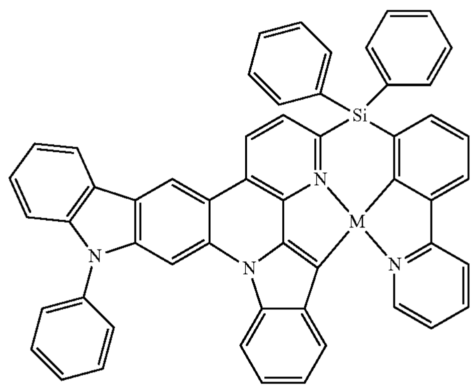
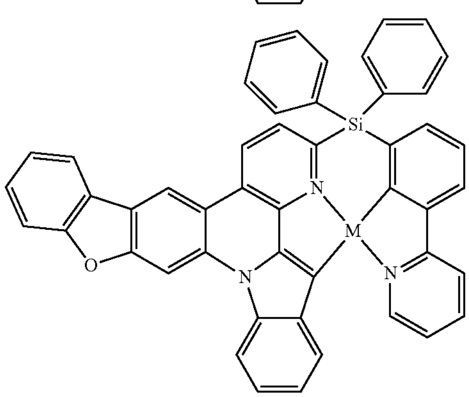
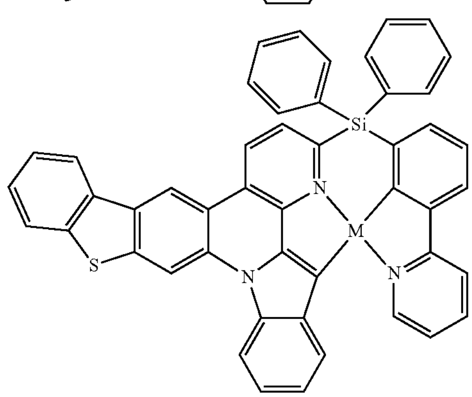
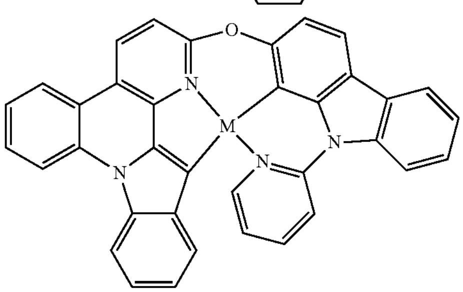
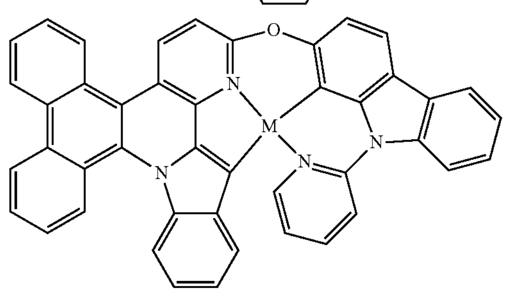

-continued
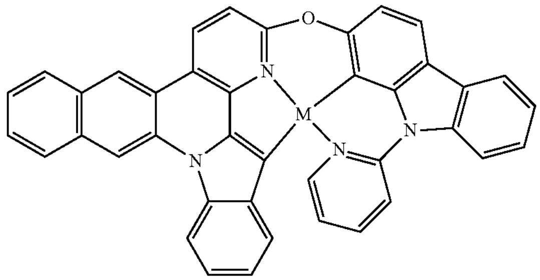
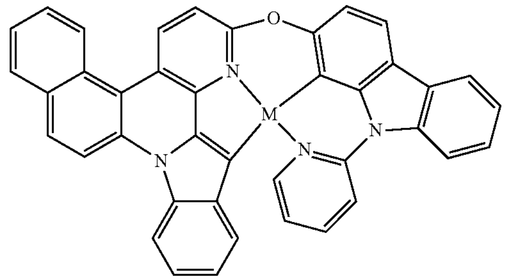
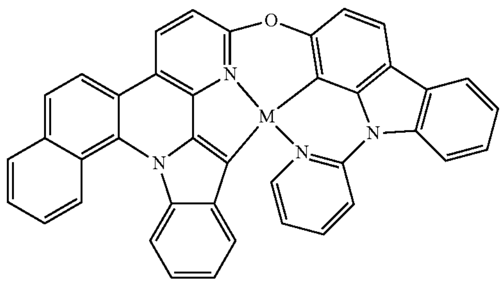
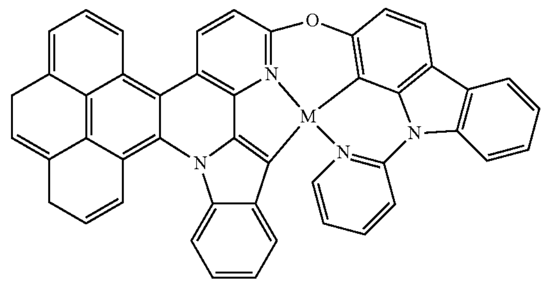
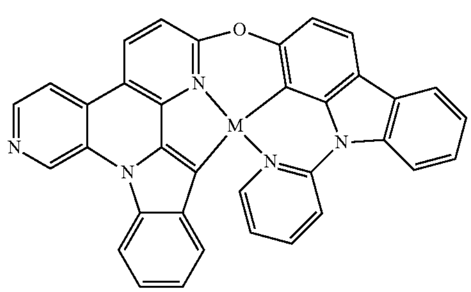
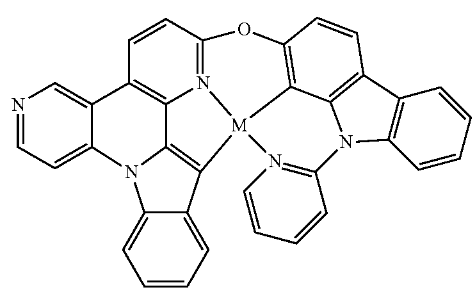
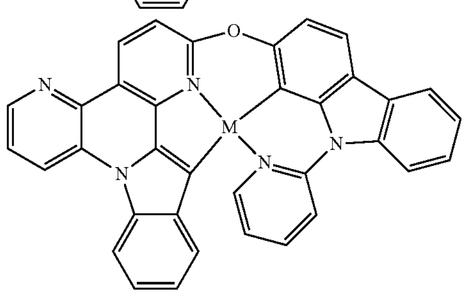
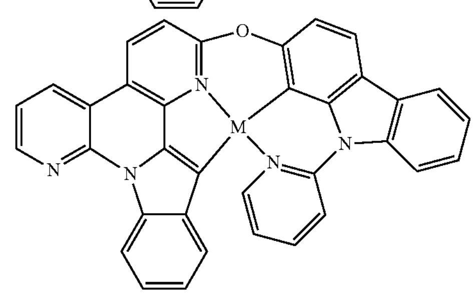
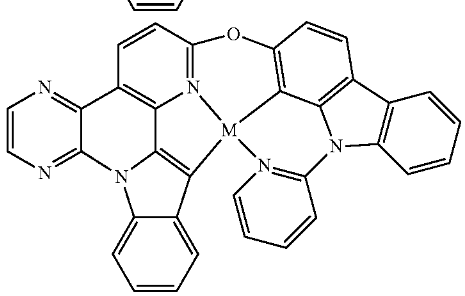
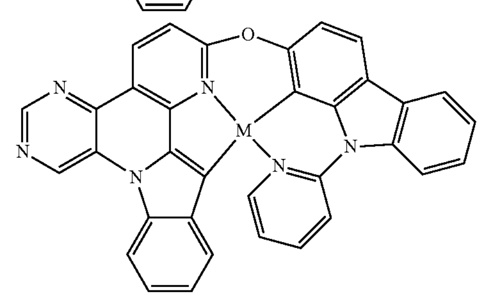
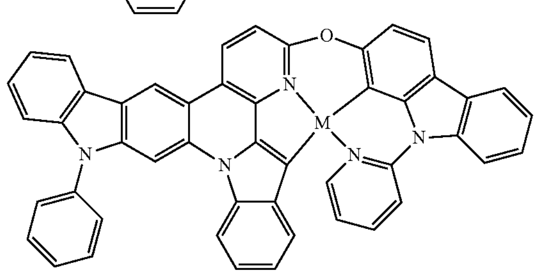
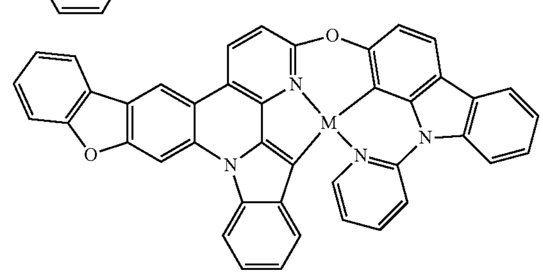

-continued
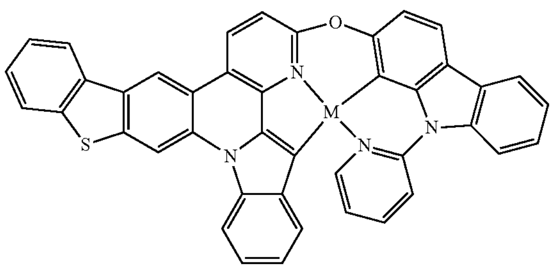
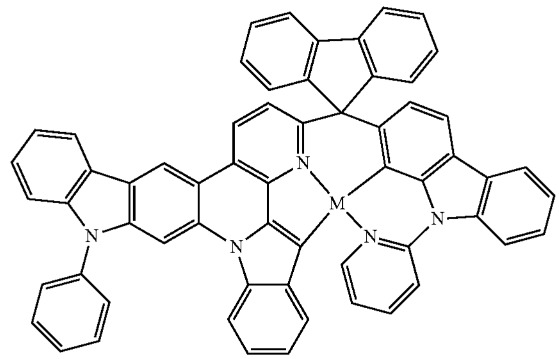
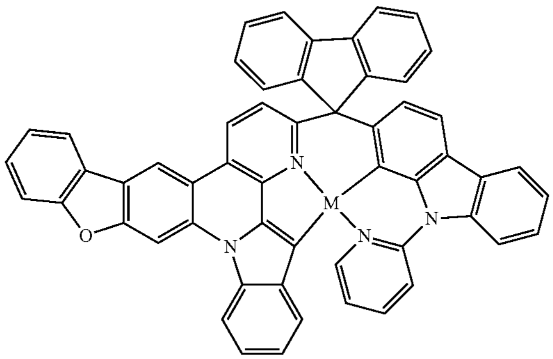
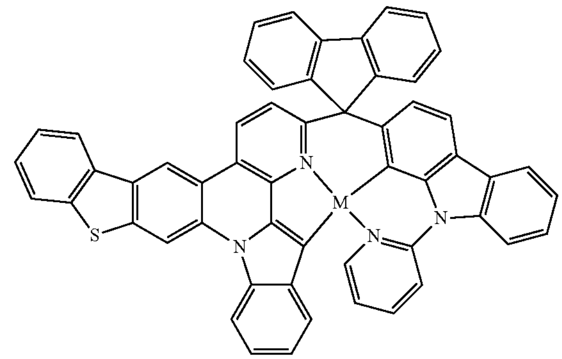
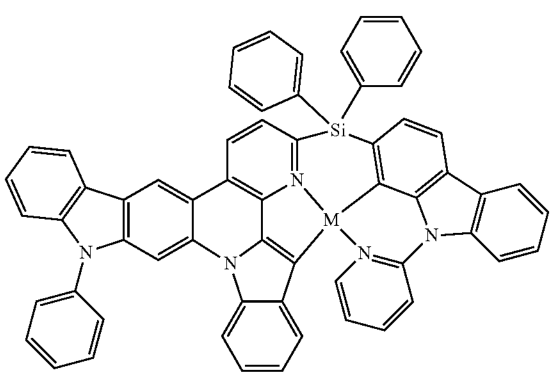
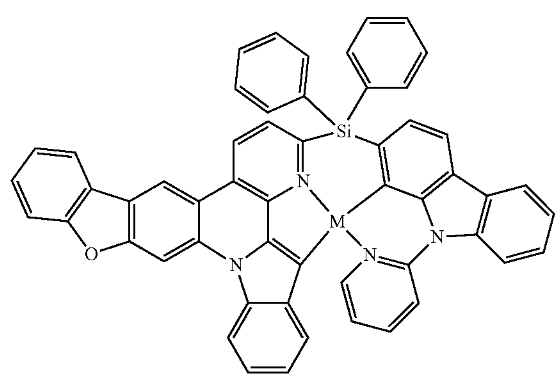
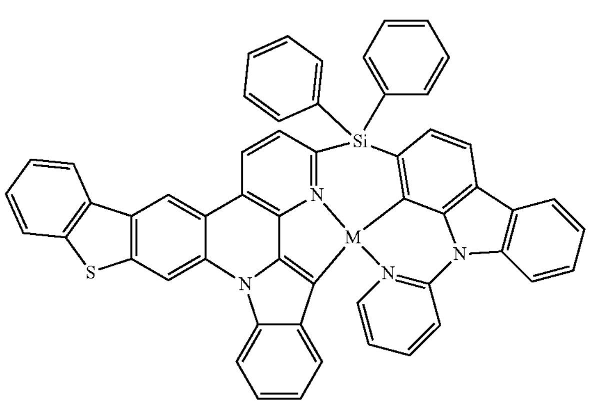
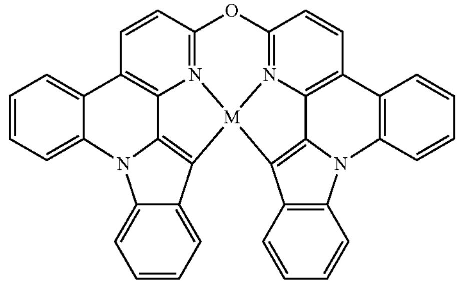

-continued
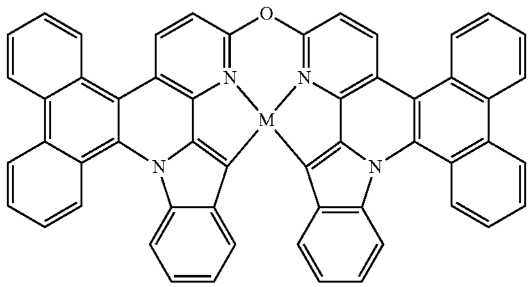
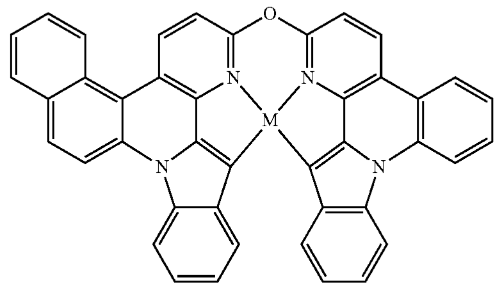
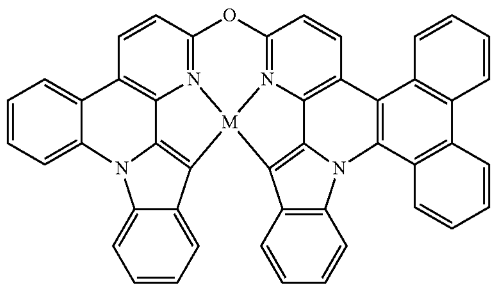
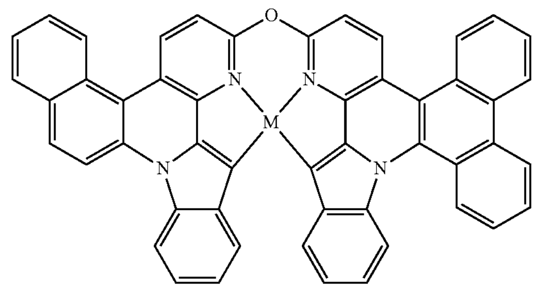
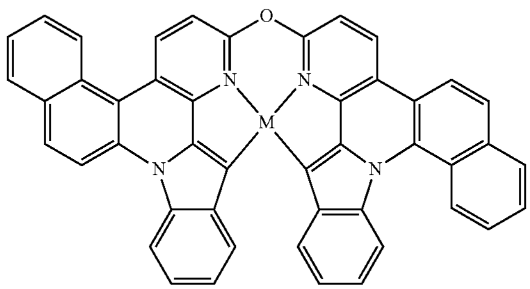
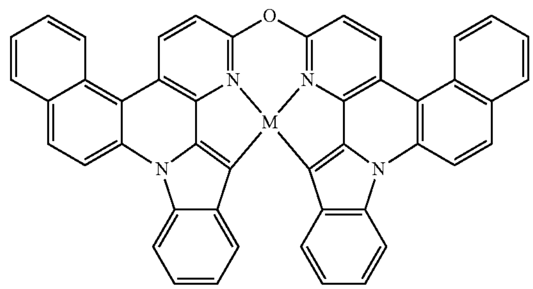
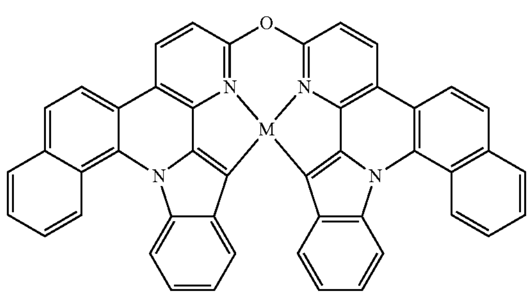
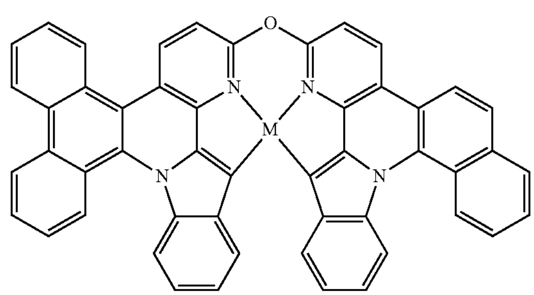
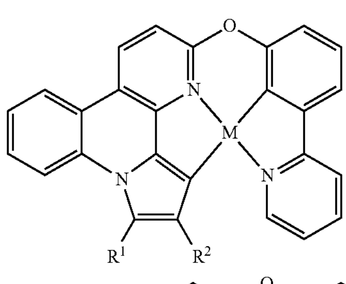
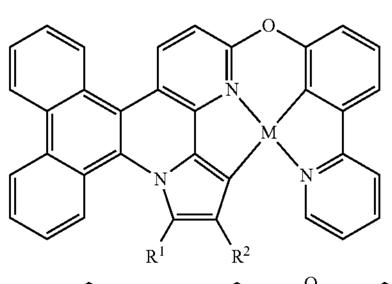
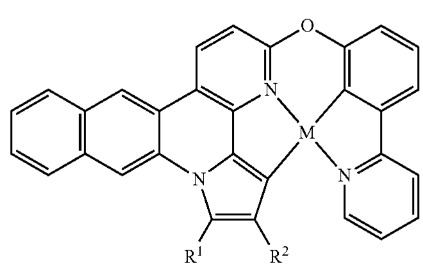
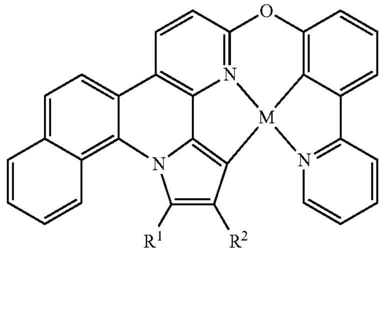
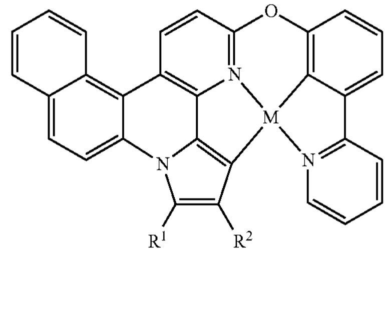

-continued
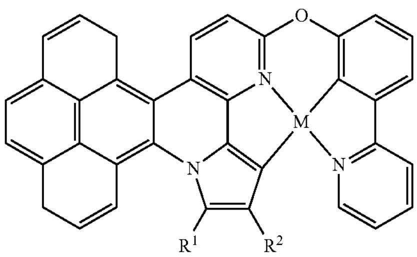
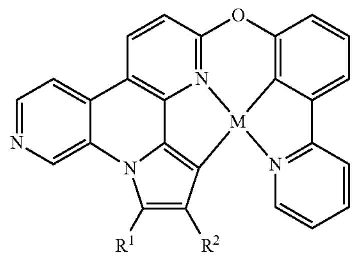
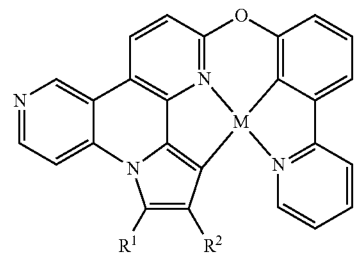
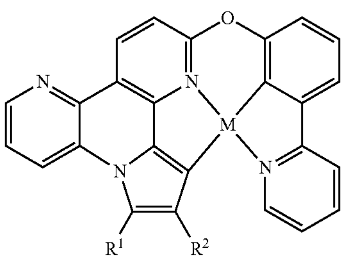
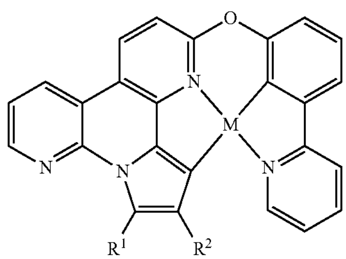
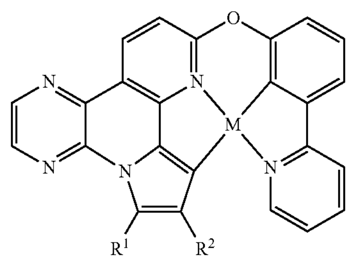
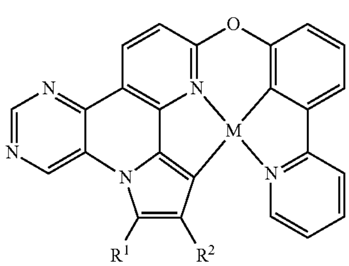
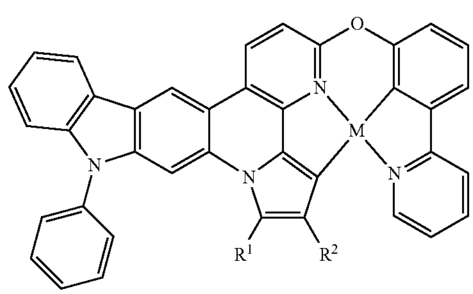
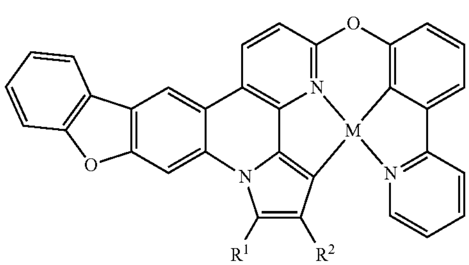
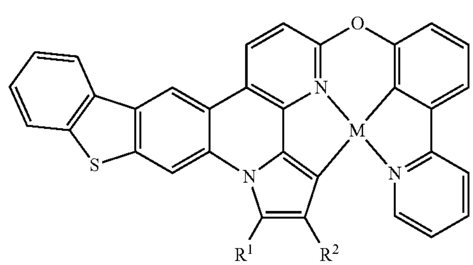
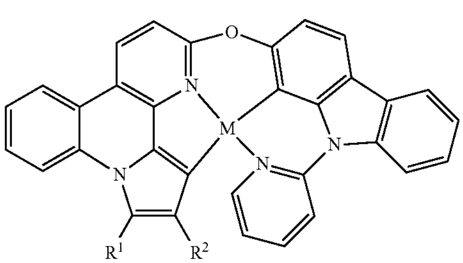
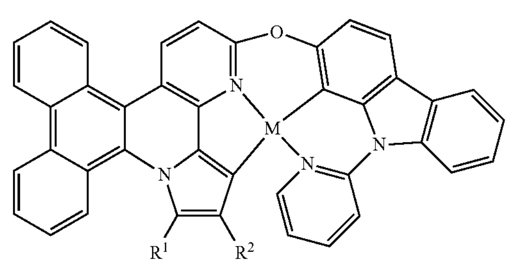
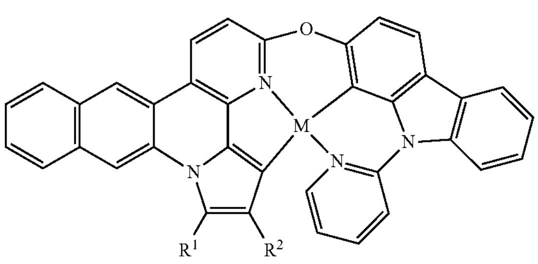
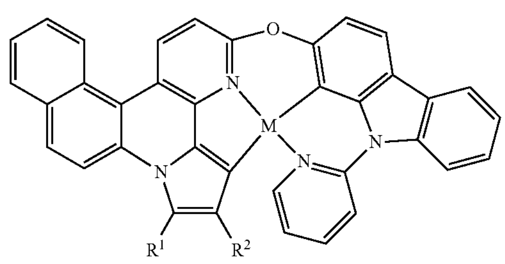

-continued
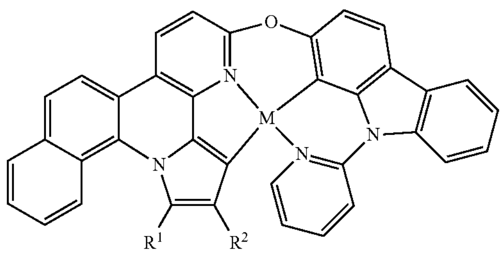
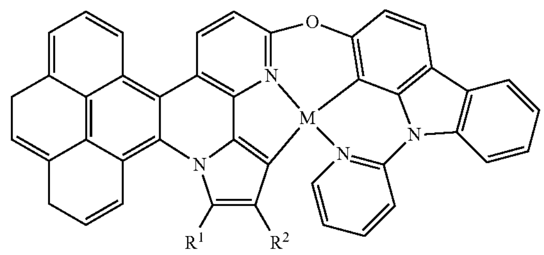
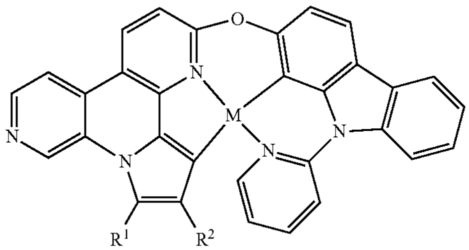
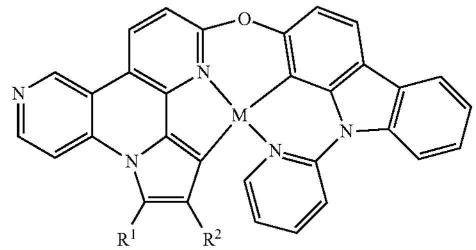
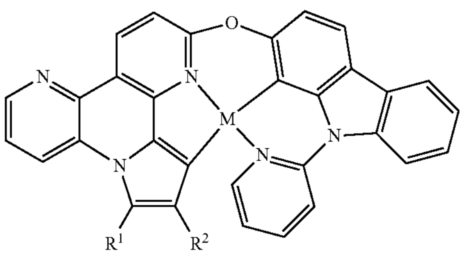
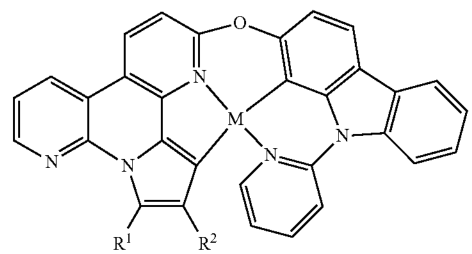
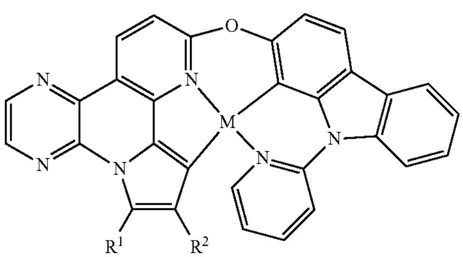
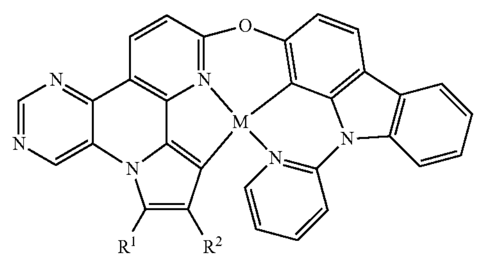
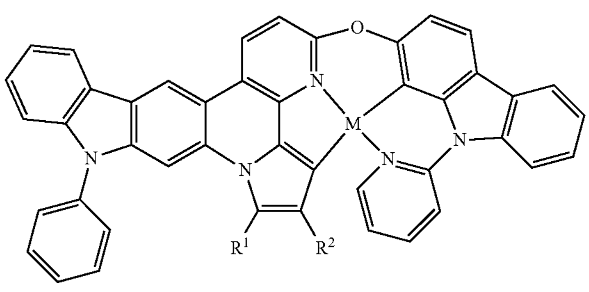
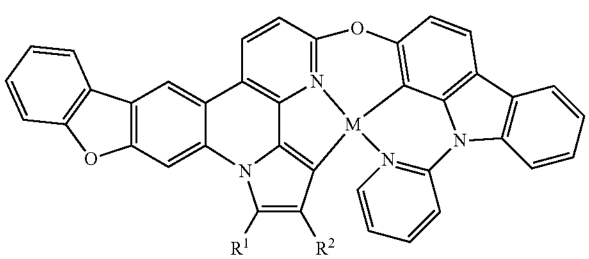

-continued
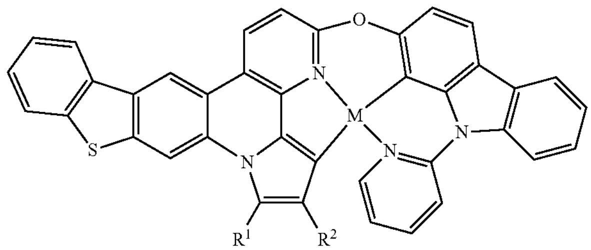
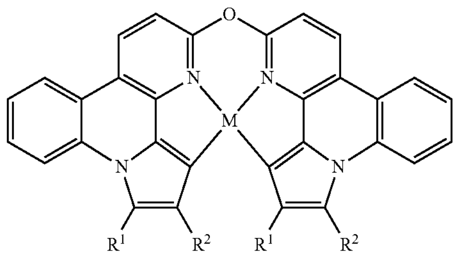
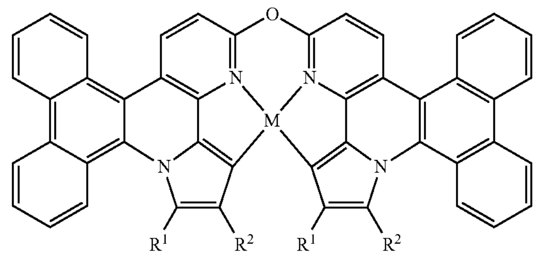
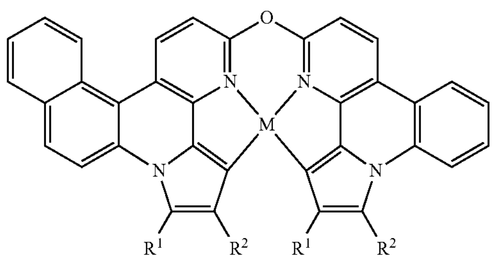
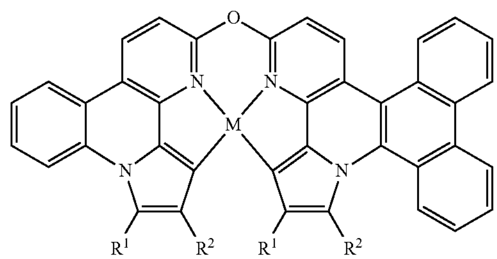
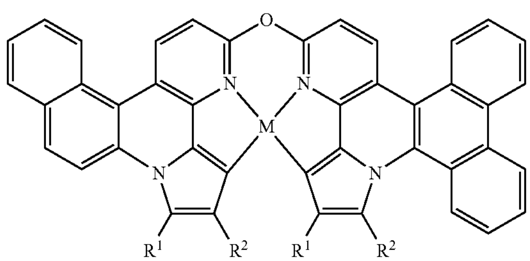
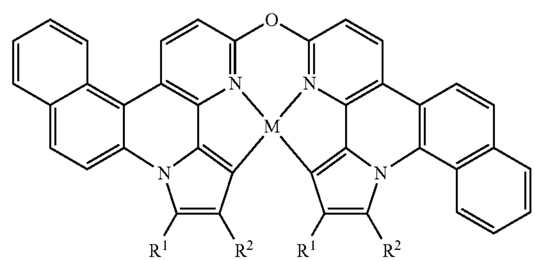
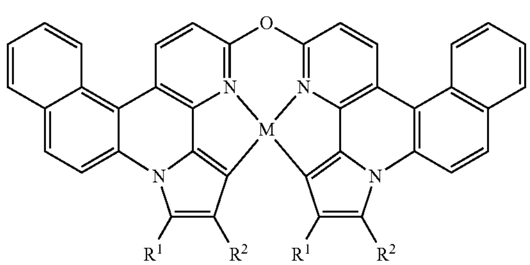
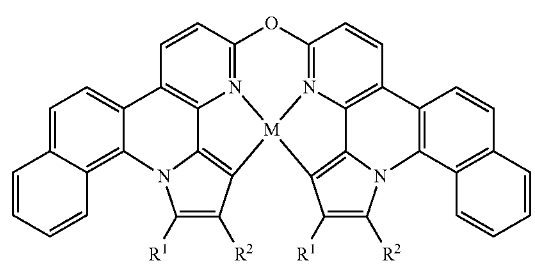
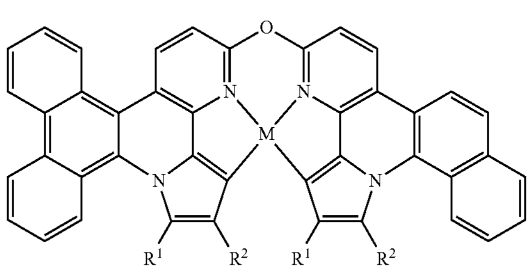

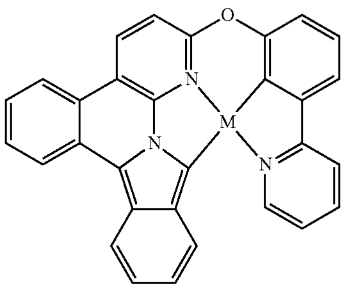
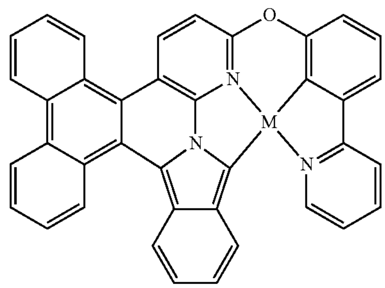
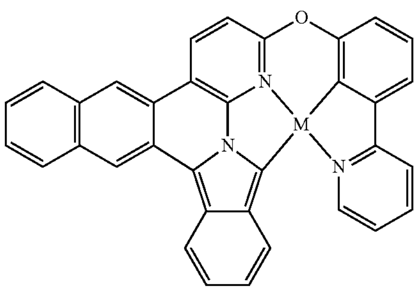
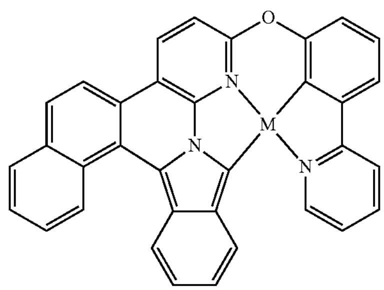
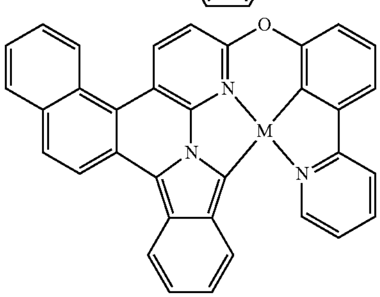
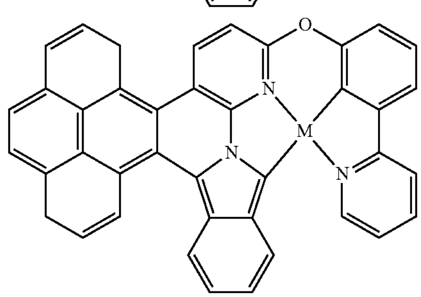
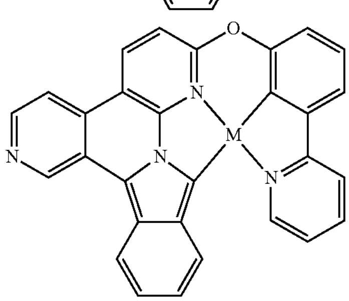
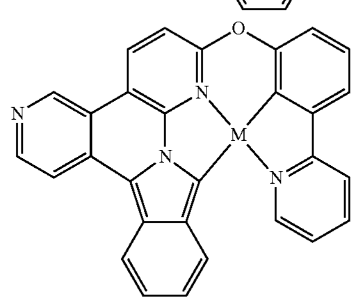
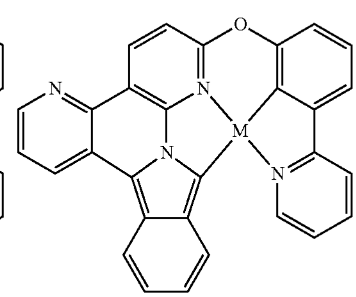
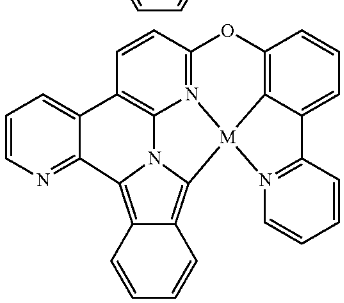
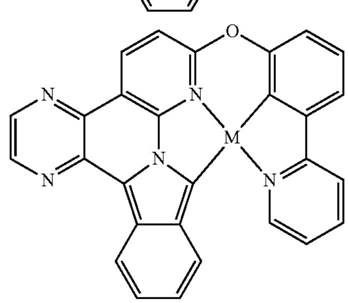
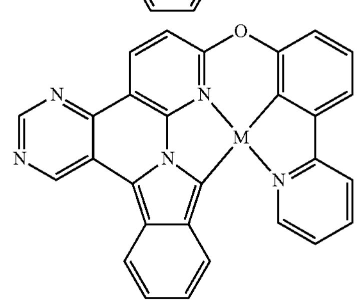
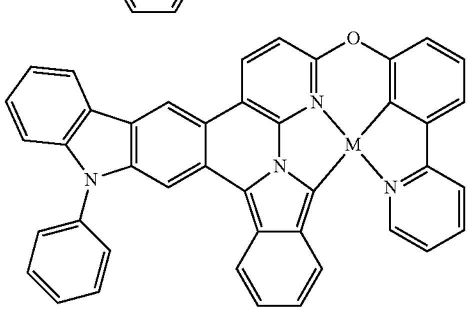
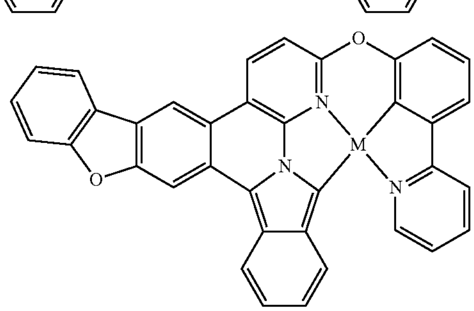

-continued
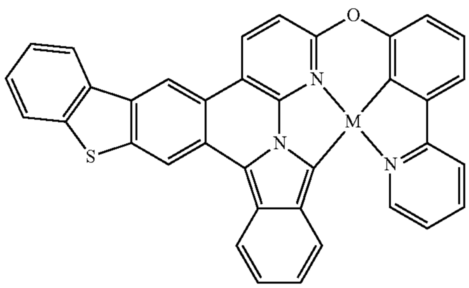
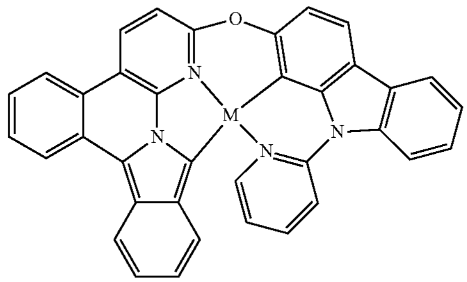
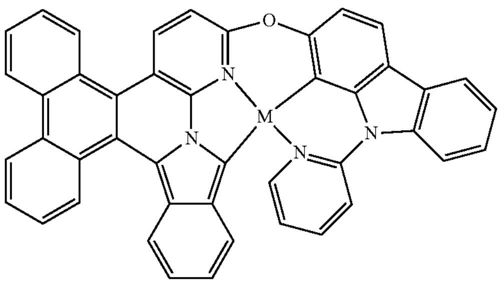
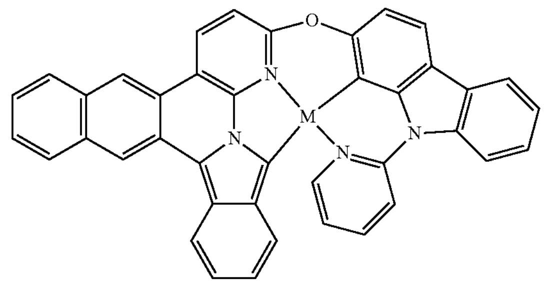
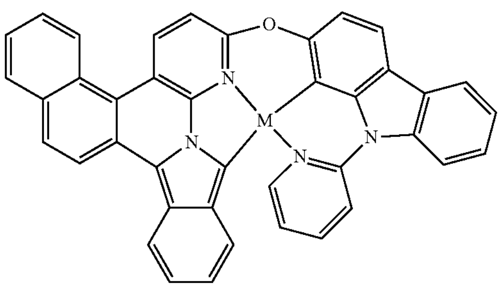
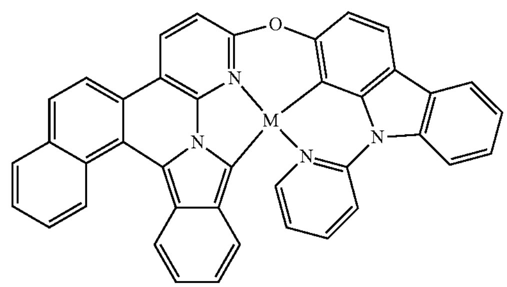
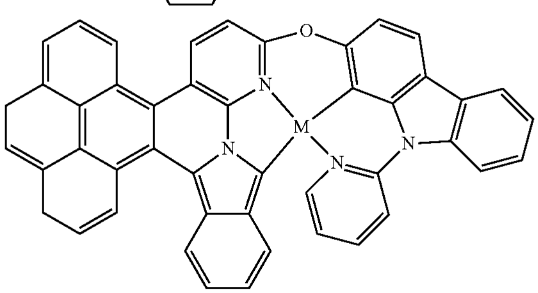
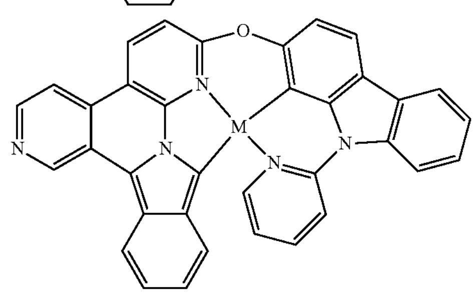
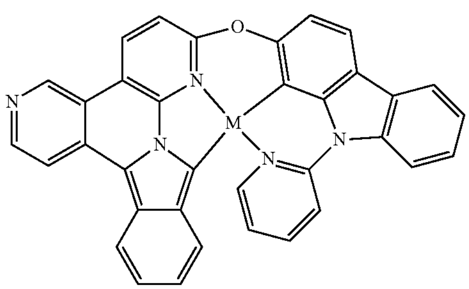
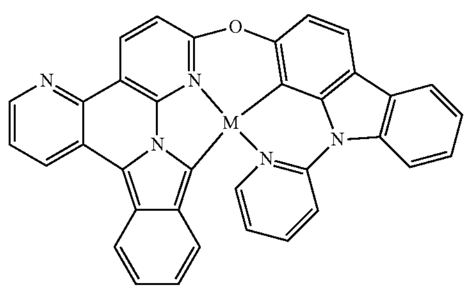
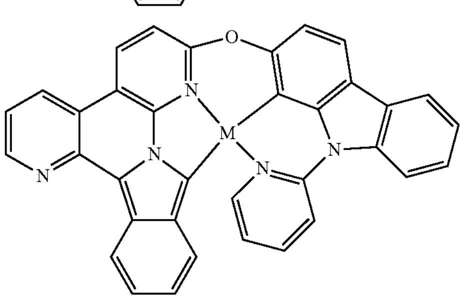
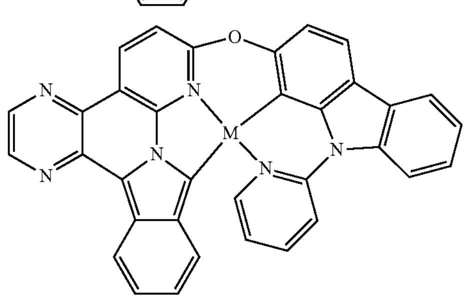

-continued
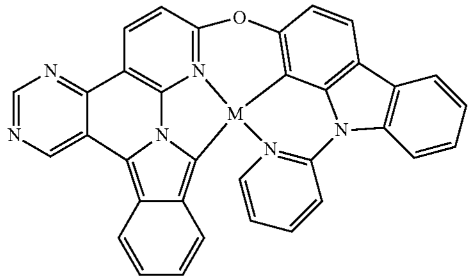
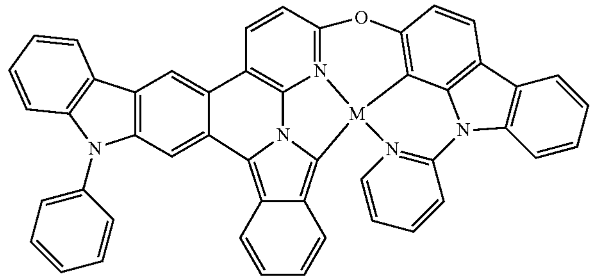
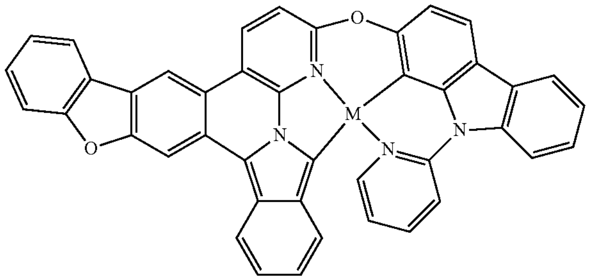
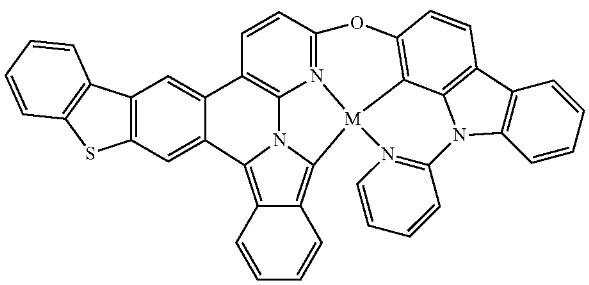
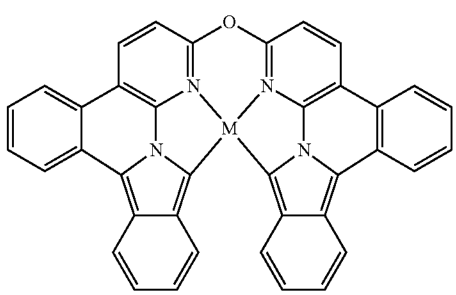
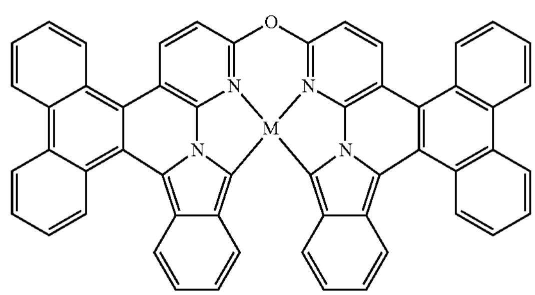
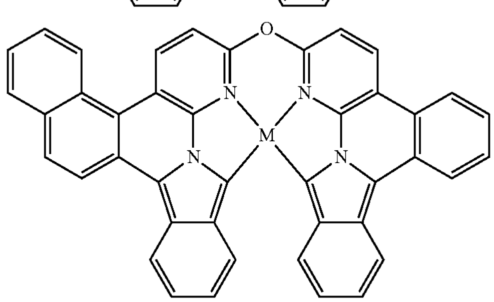
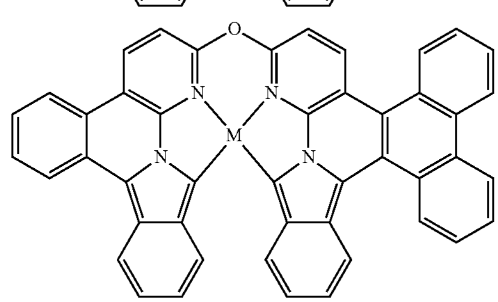
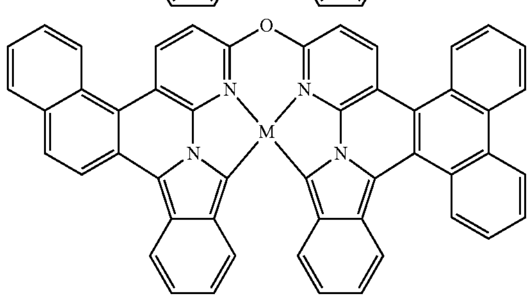
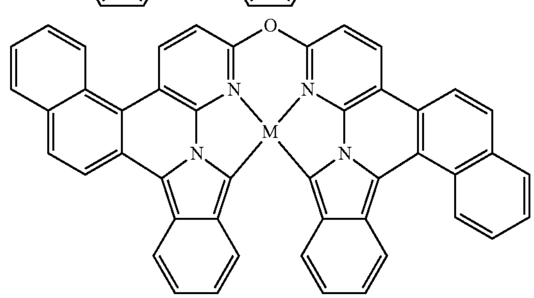

-continued
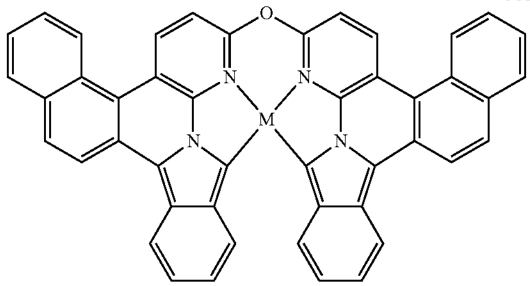
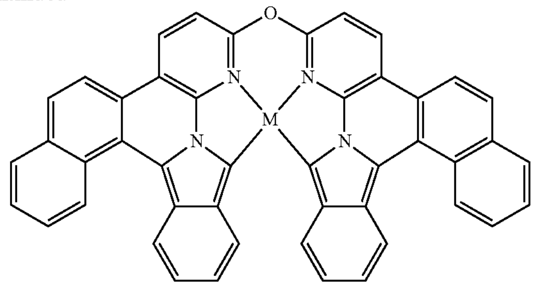
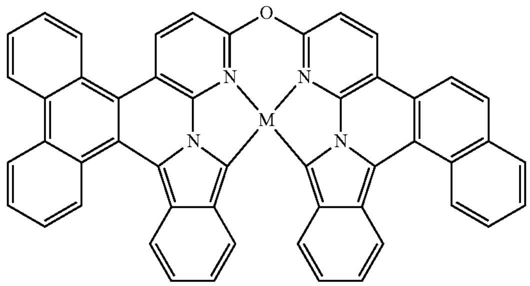
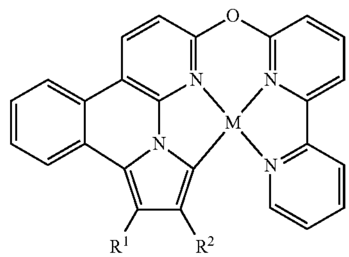
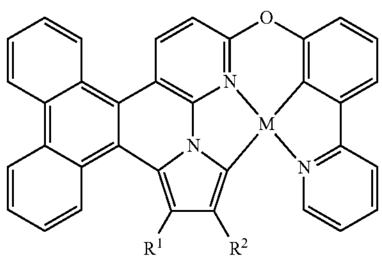
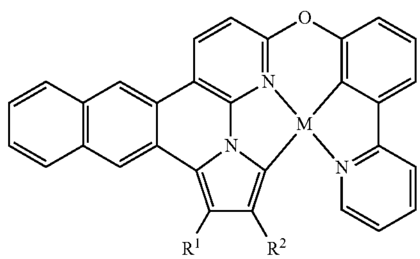
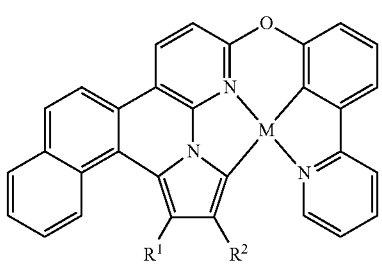
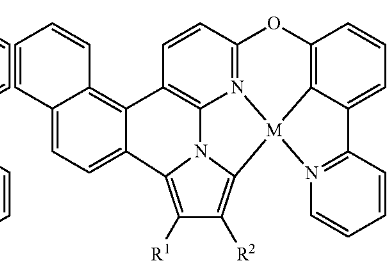
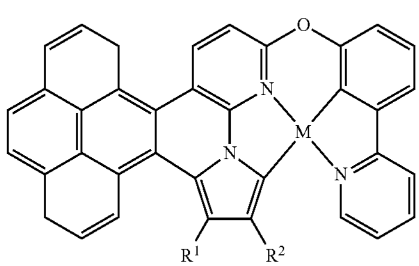
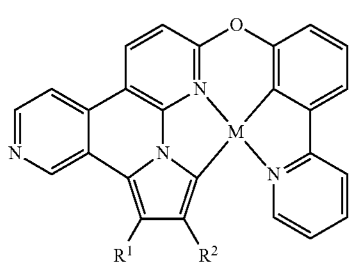
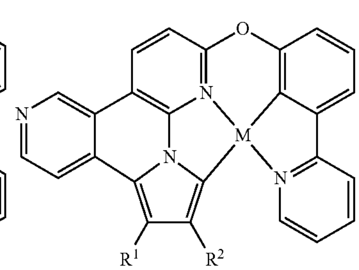
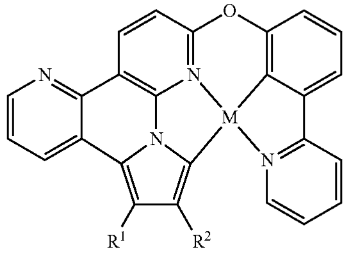
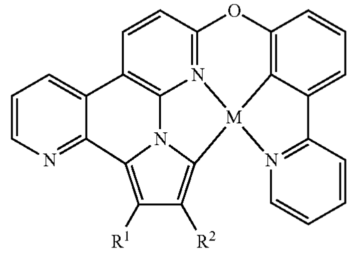
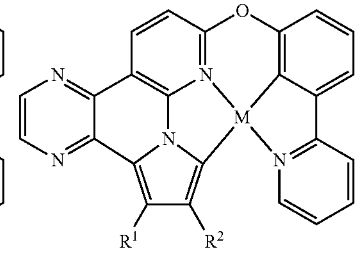

-continued
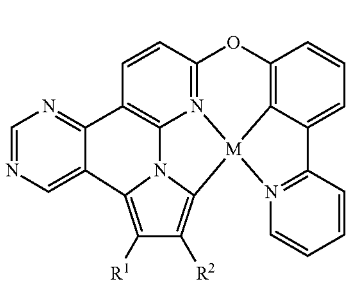
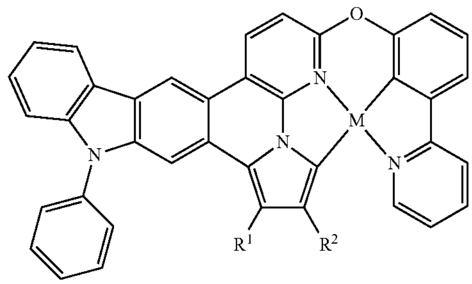
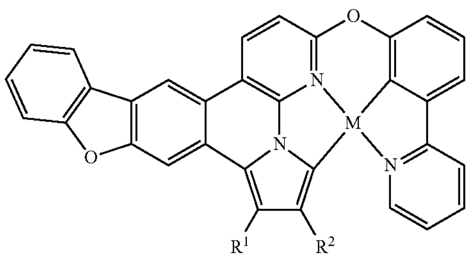
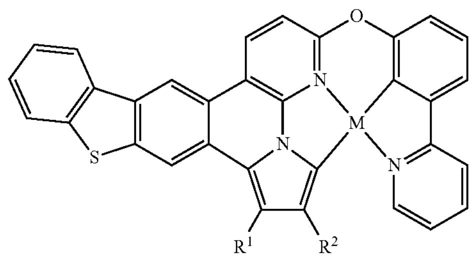
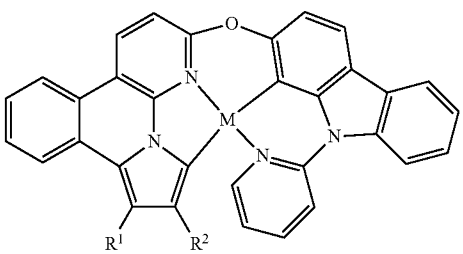
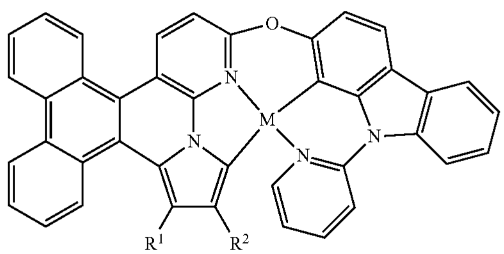
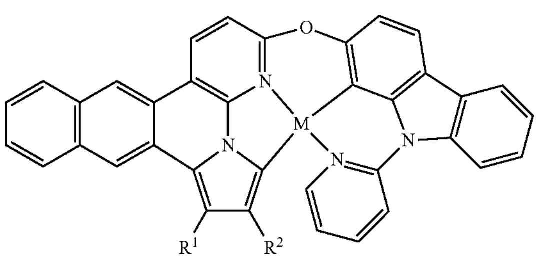
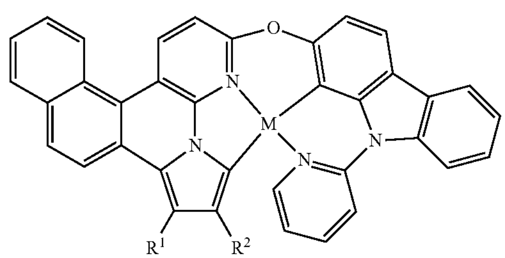
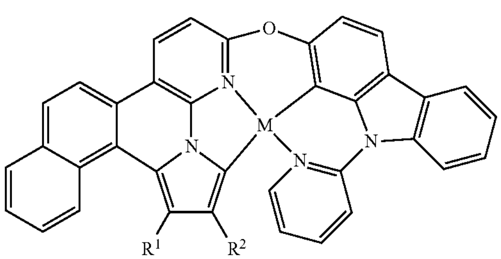
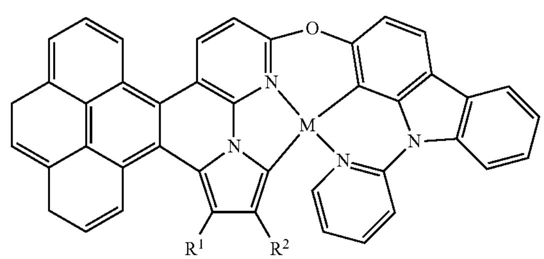
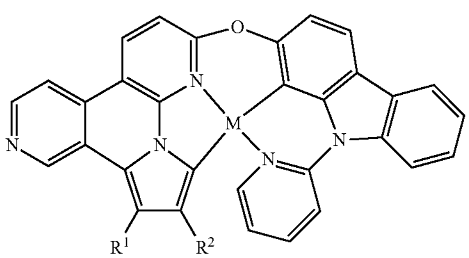
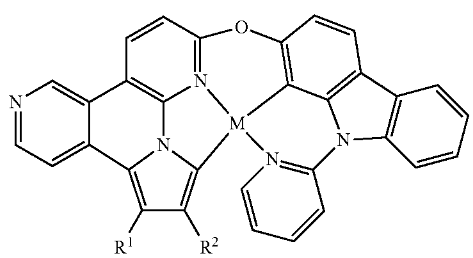

-continued
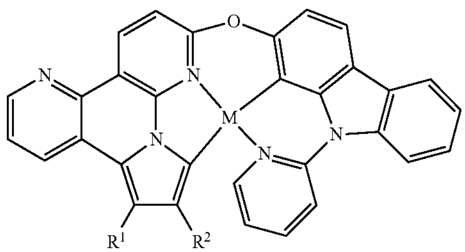
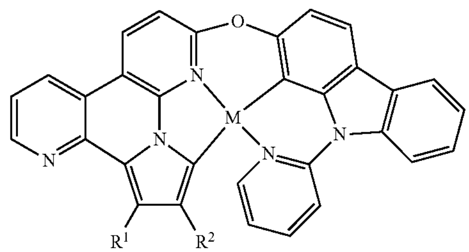
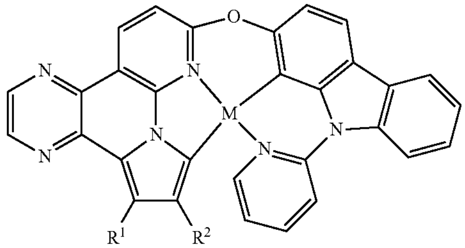
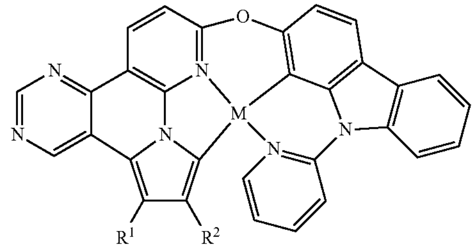
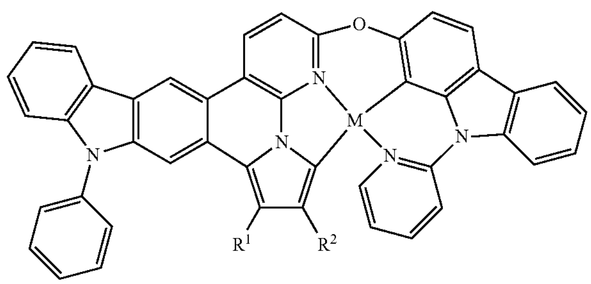
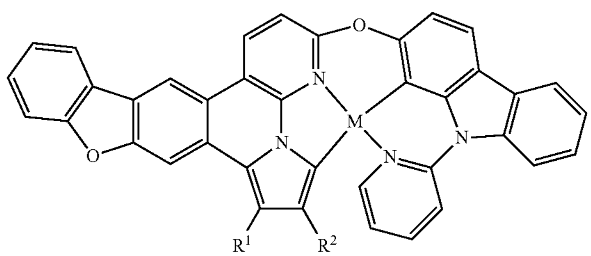
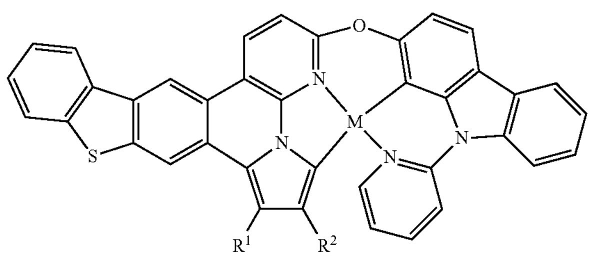
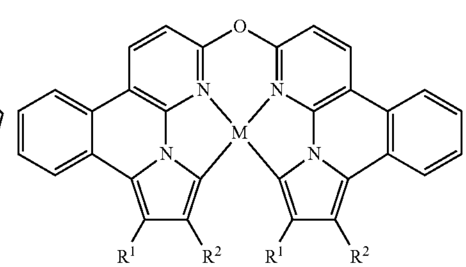
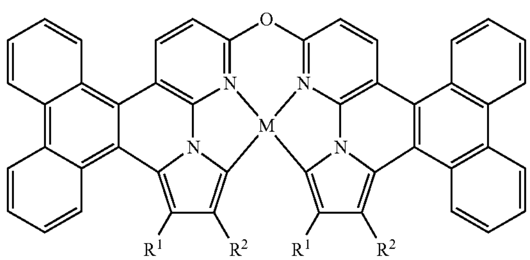
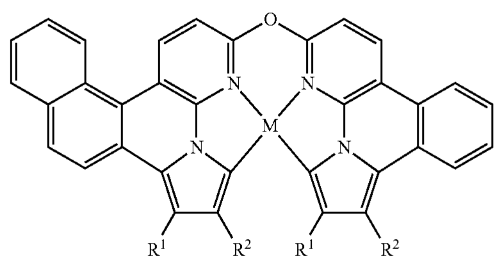

-continued
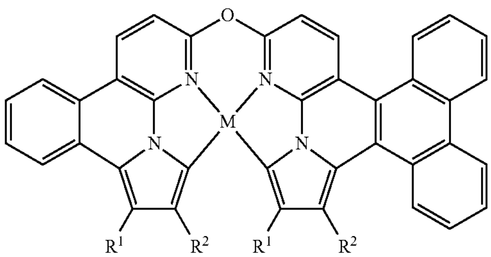
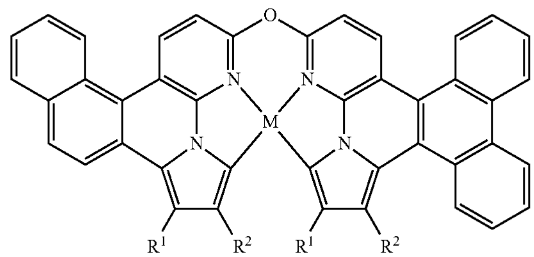
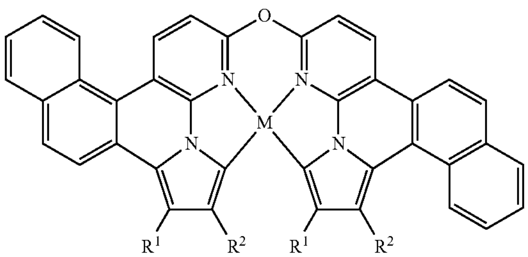
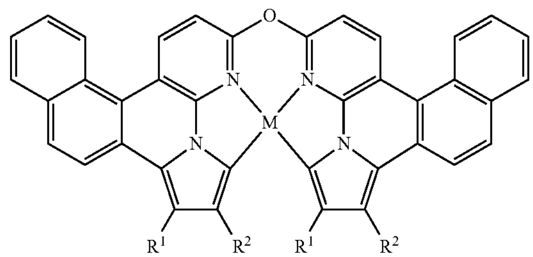
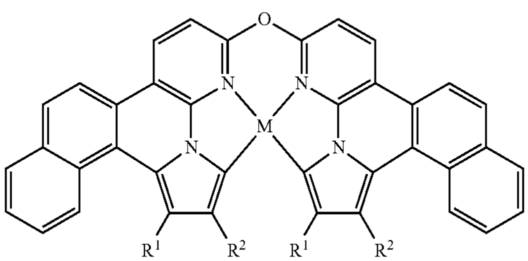
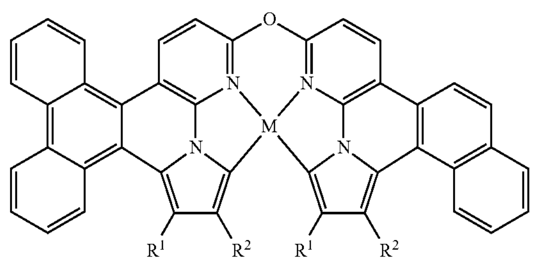
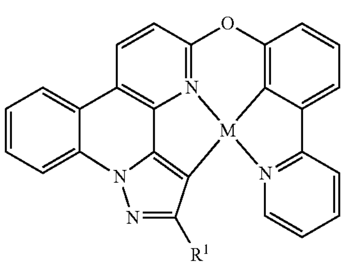
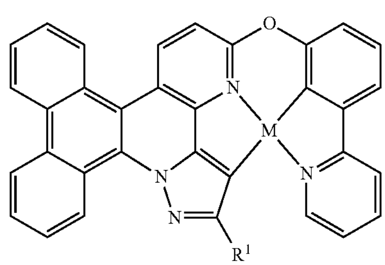
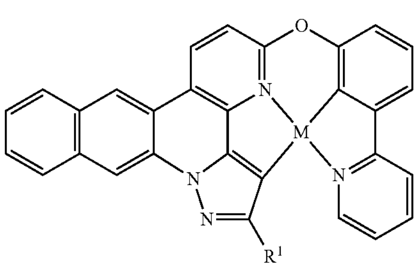
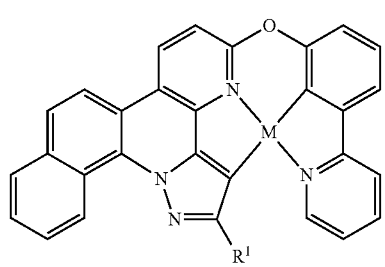
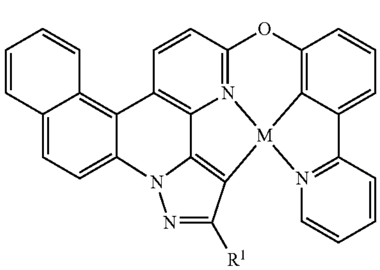
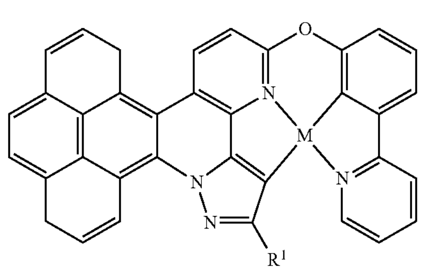

-continued
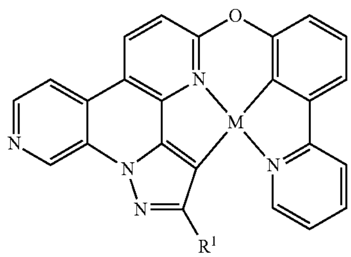
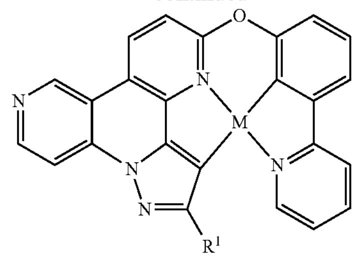
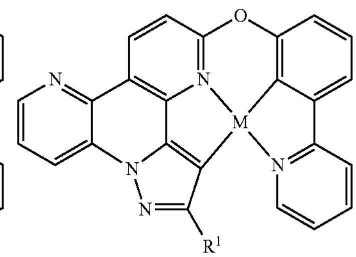
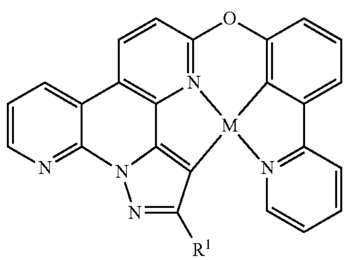
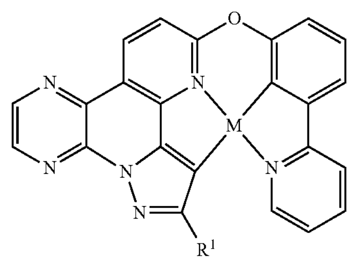
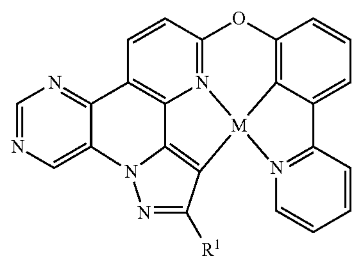
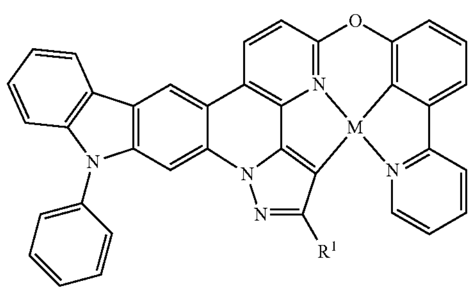
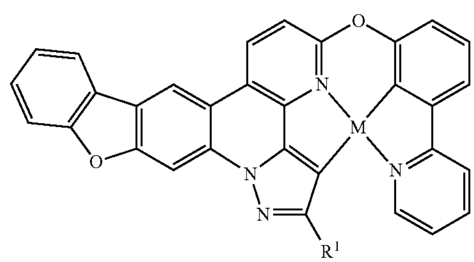
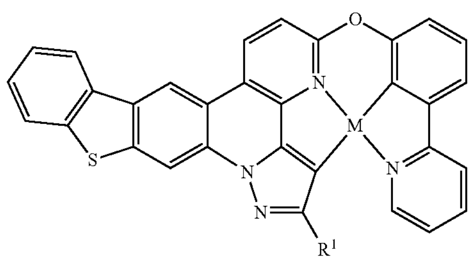
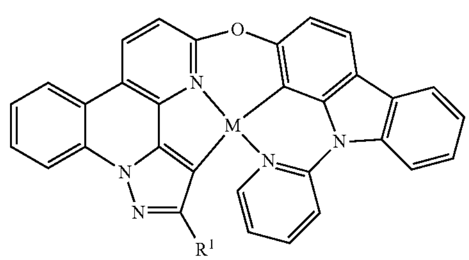
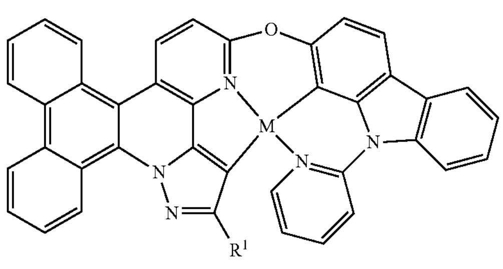
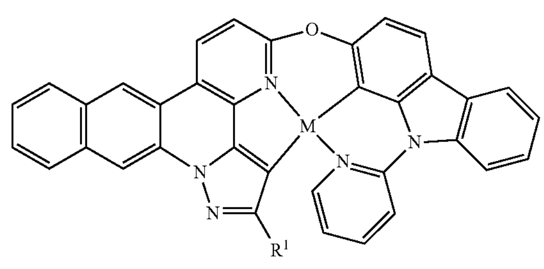
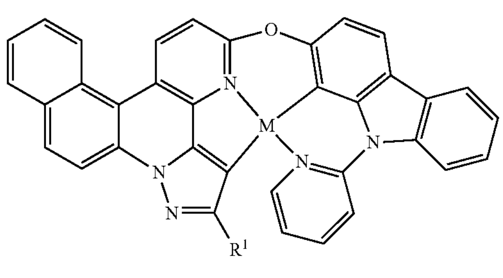
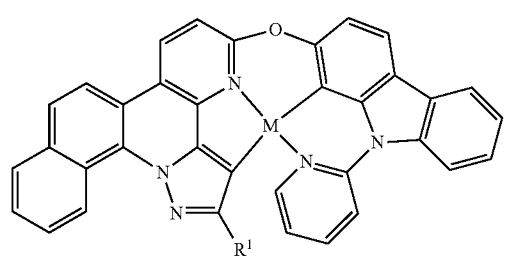

-continued
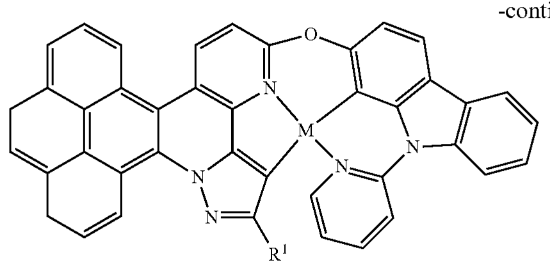
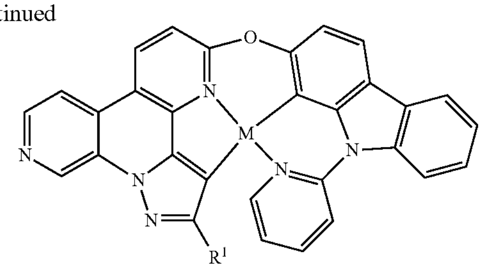
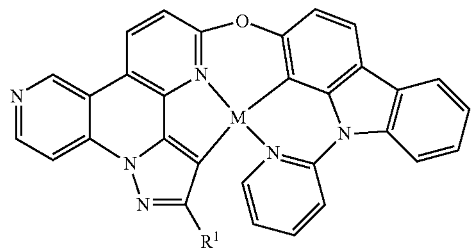
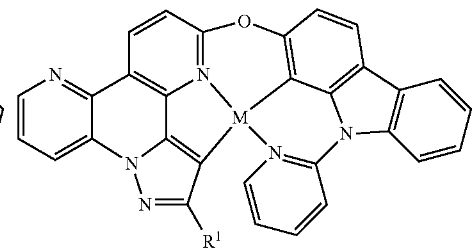
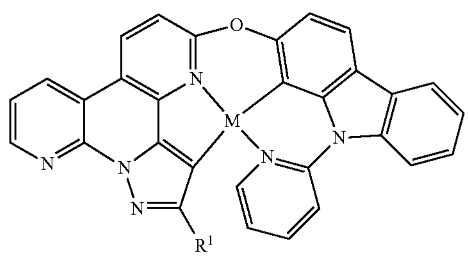
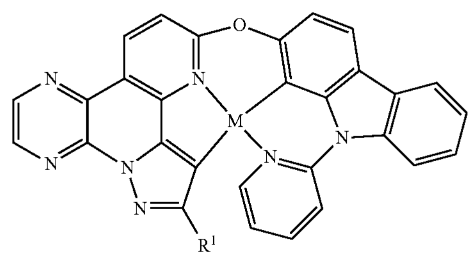
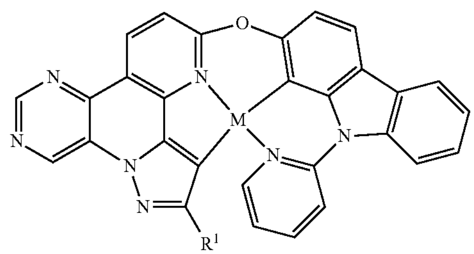
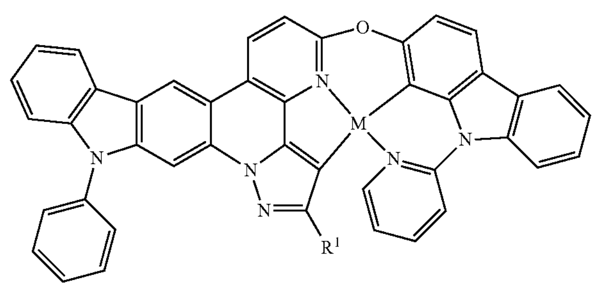
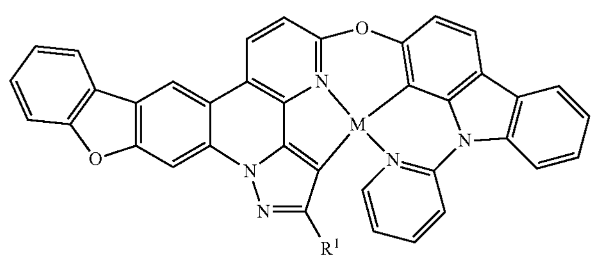
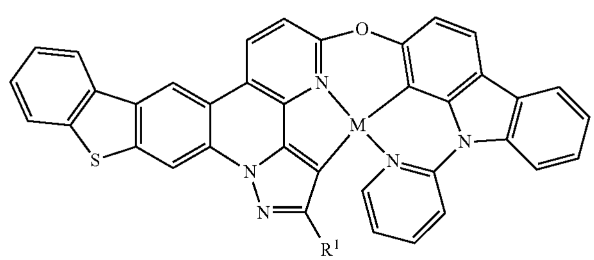
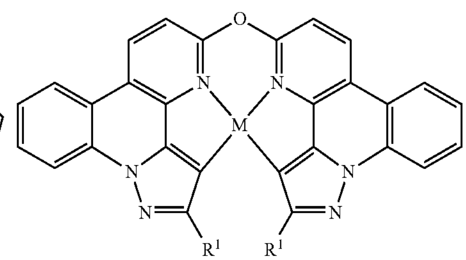

-continued
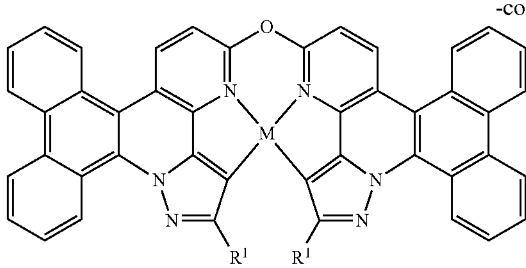
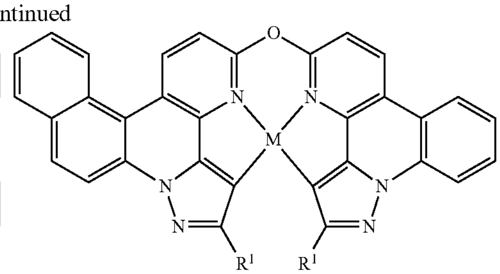
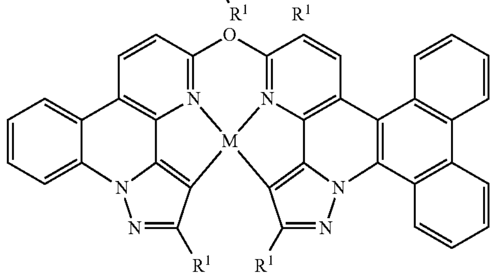
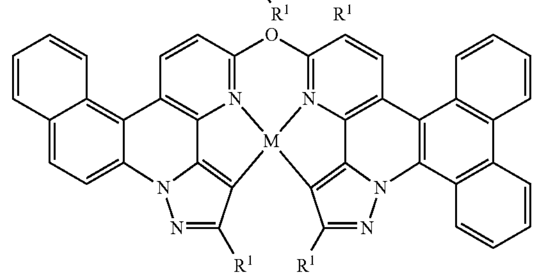
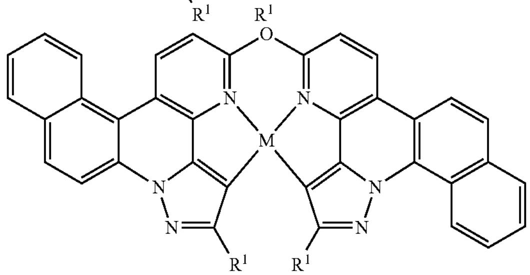
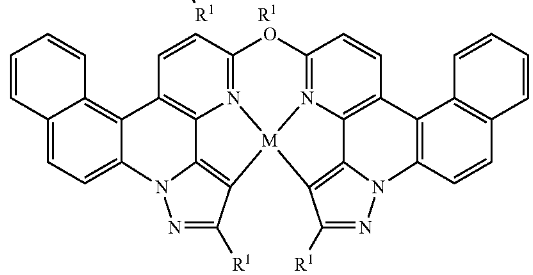
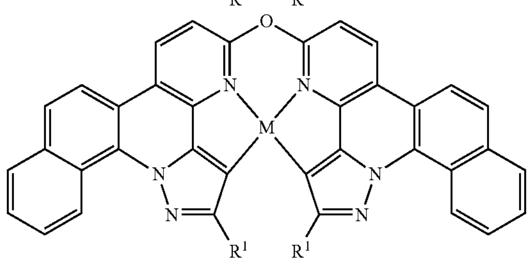
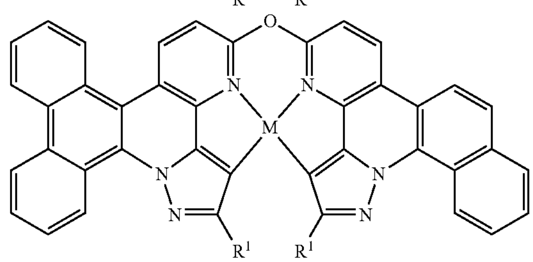
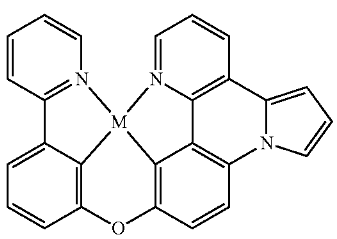
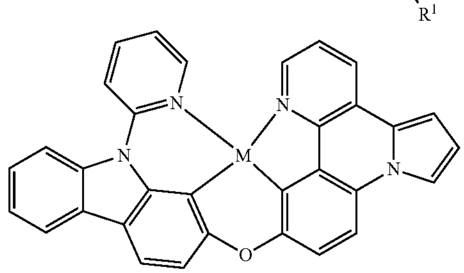
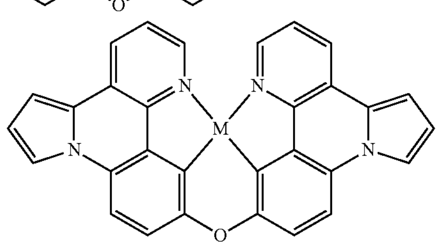
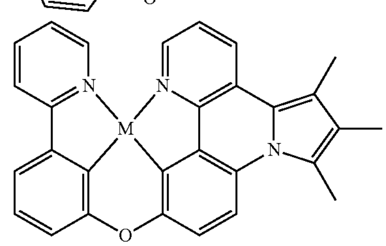
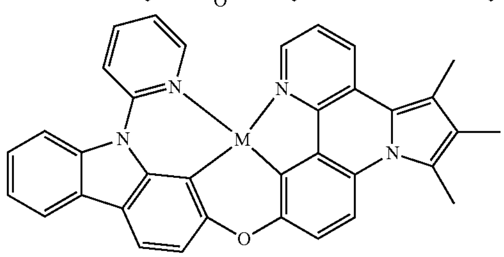
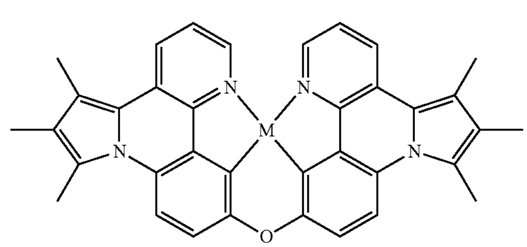

-continued
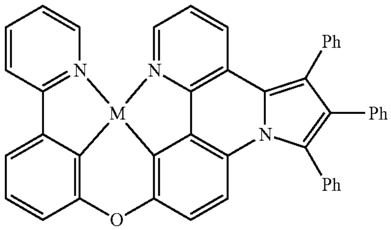
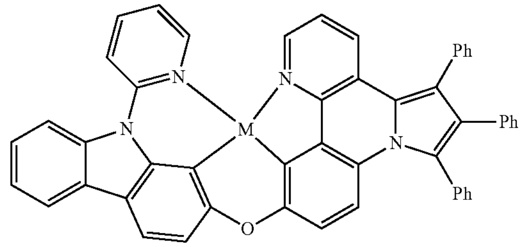
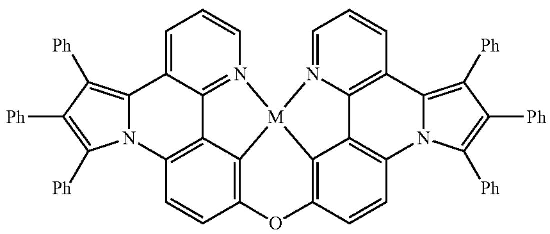
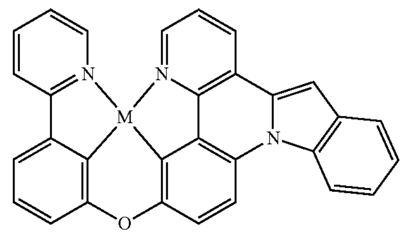
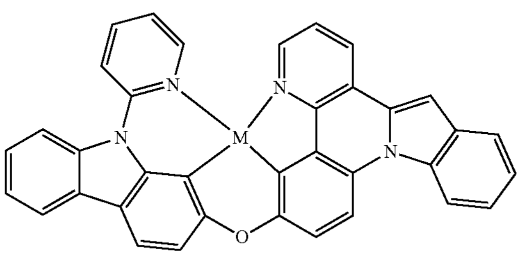
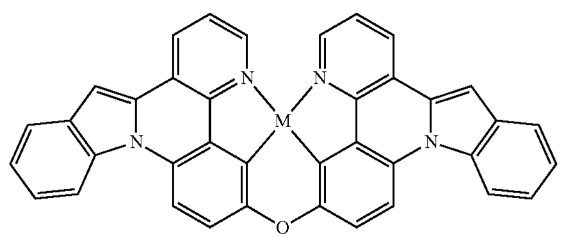
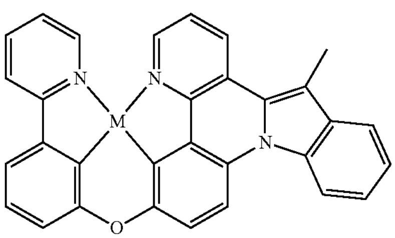
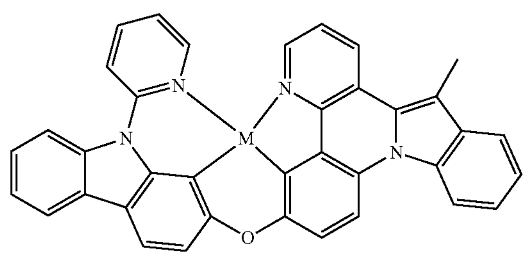
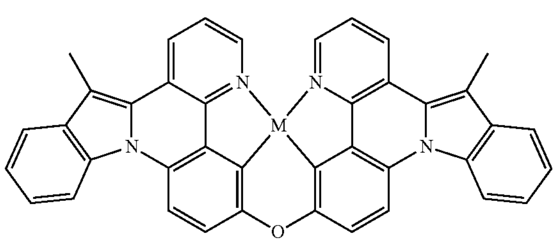
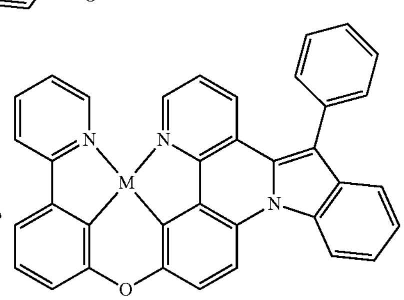
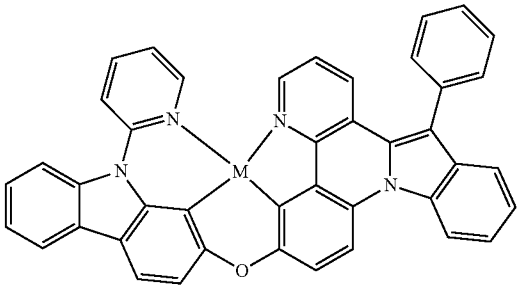
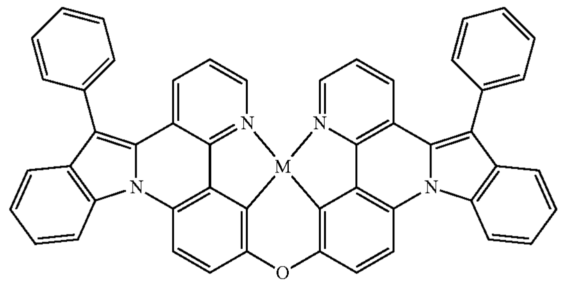

-continued
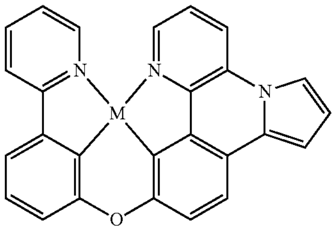
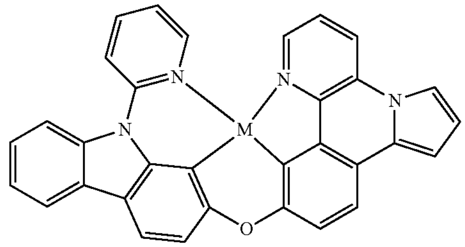
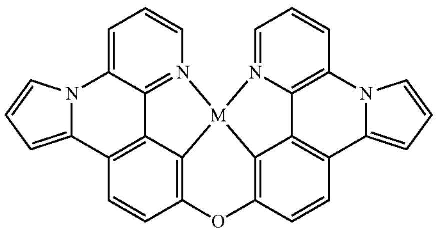
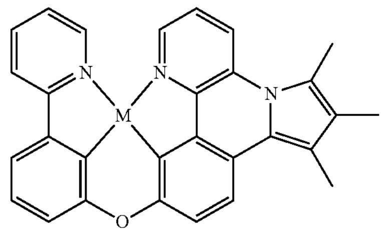
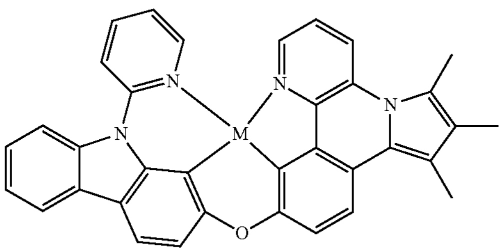
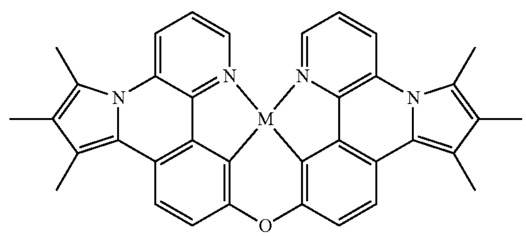
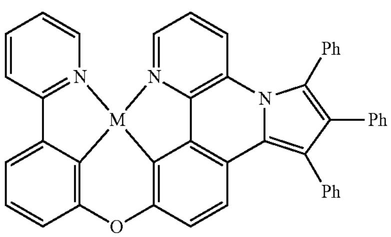
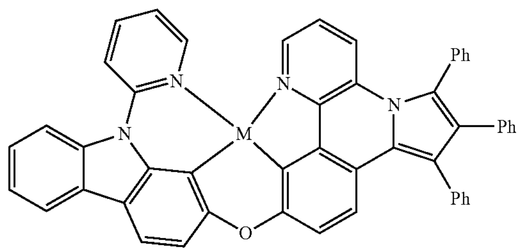
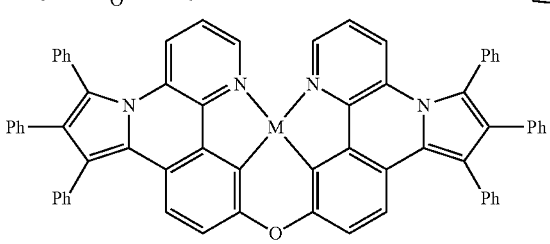
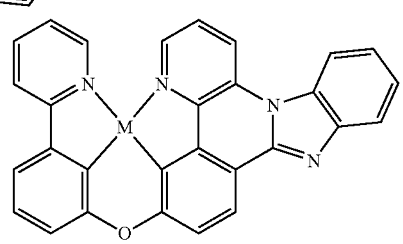
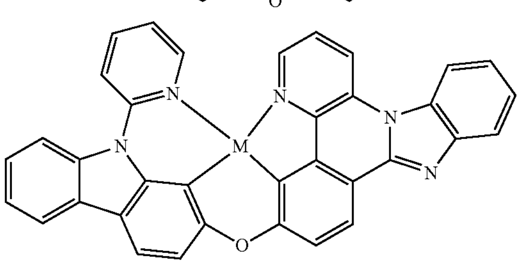
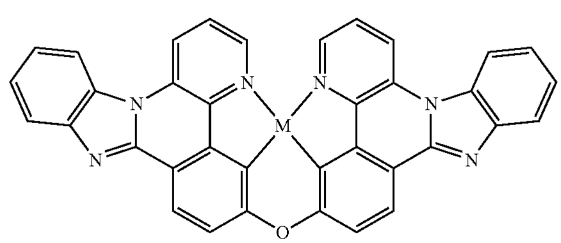
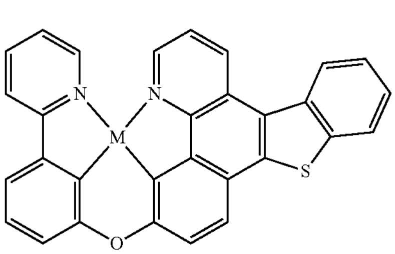
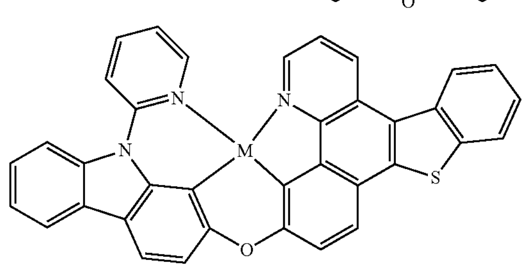

-continued
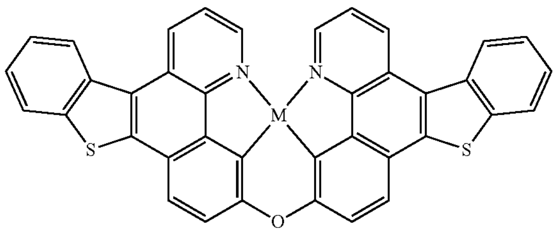
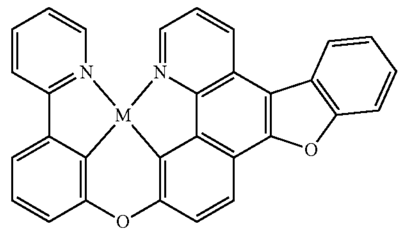
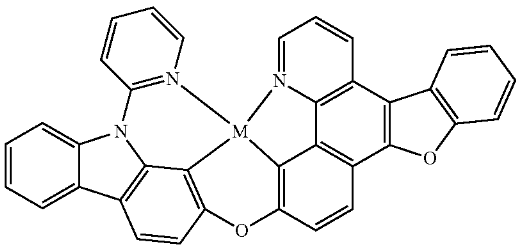
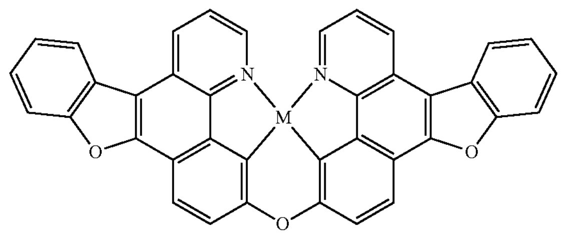
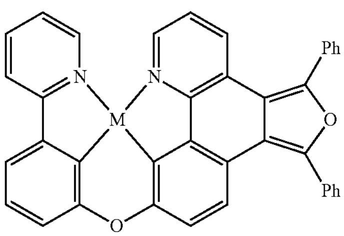
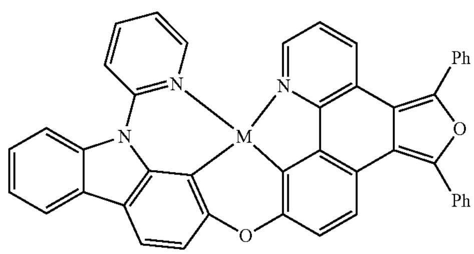
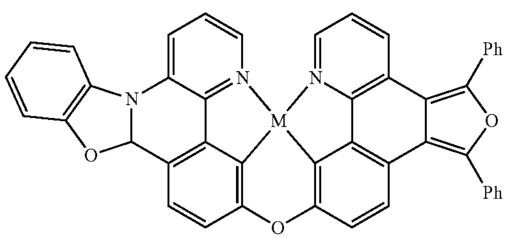
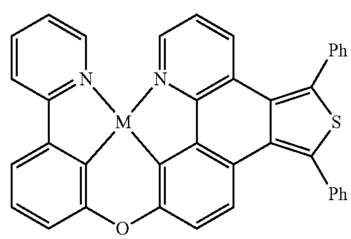
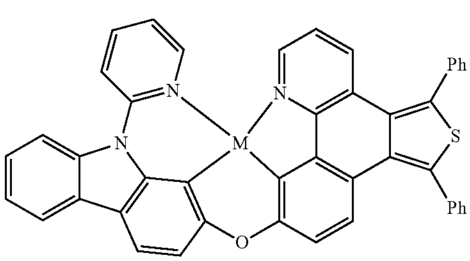
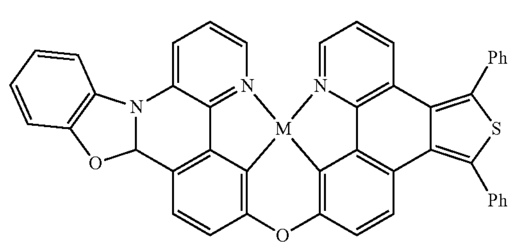
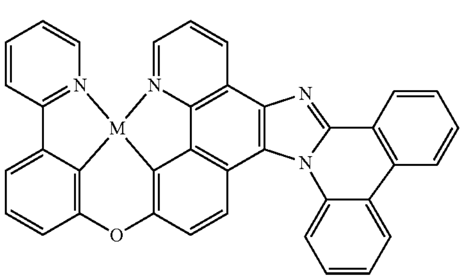
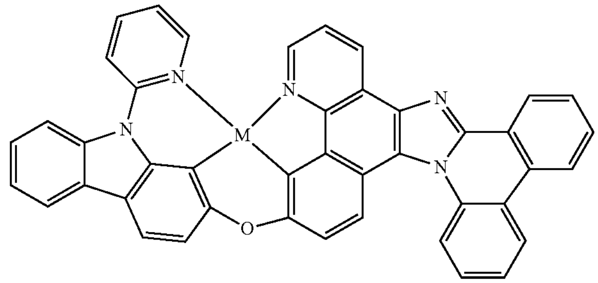

-continued
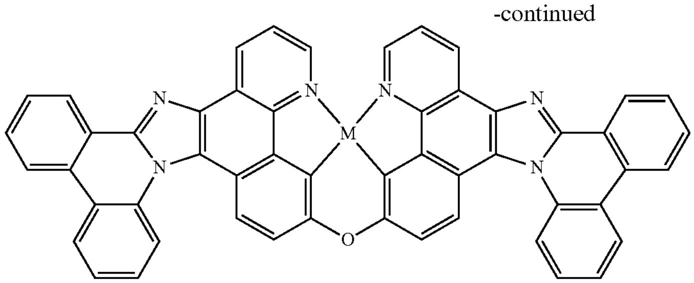
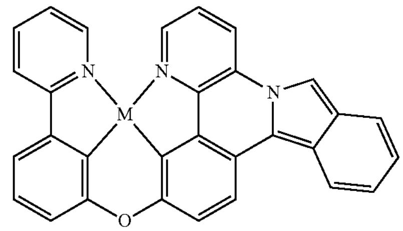
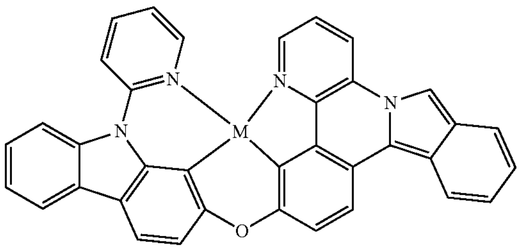
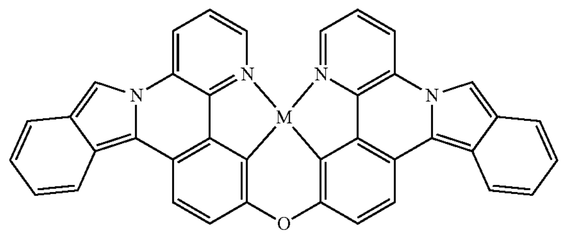
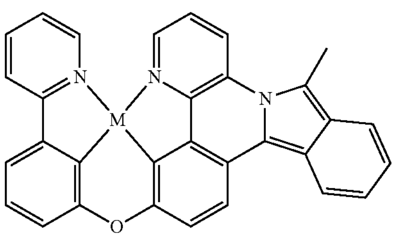
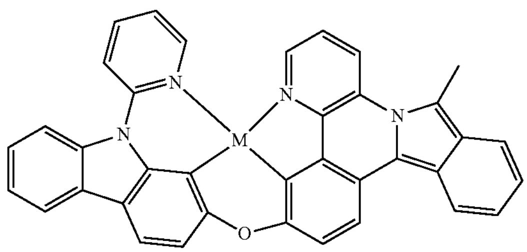
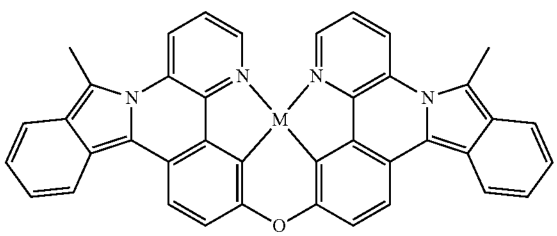
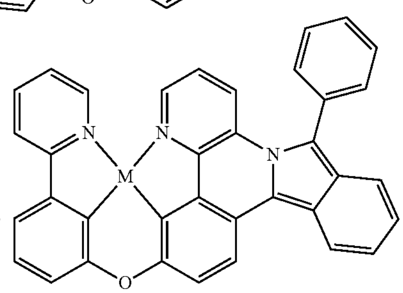
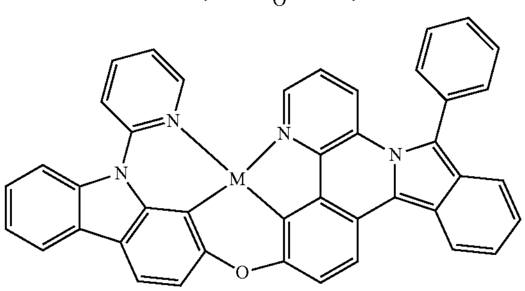
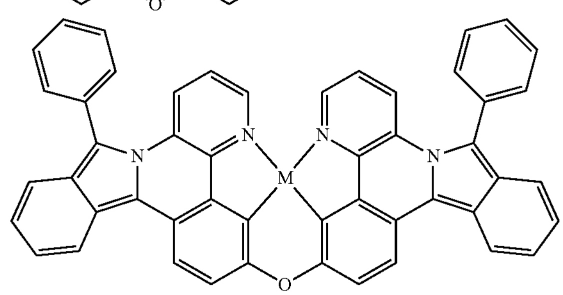
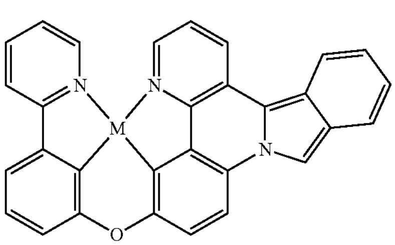
-continued
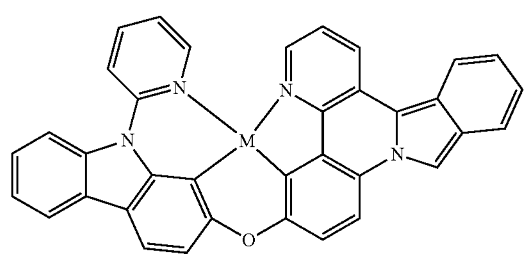

-continued
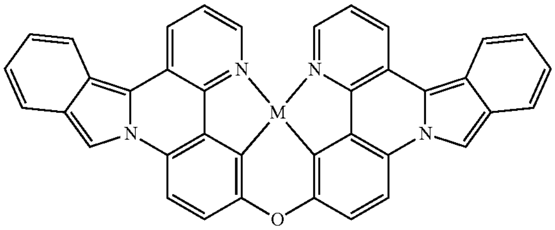
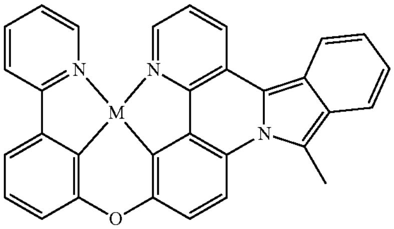
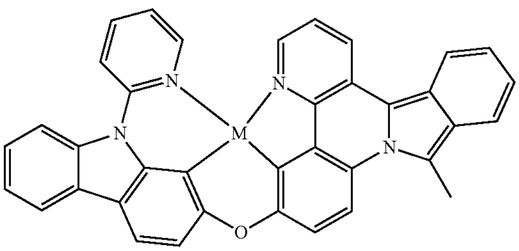
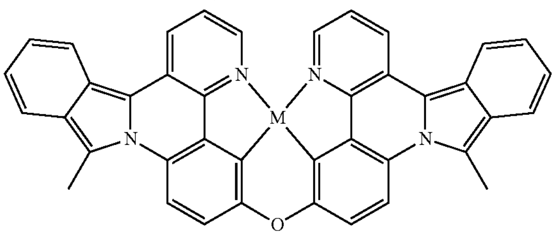
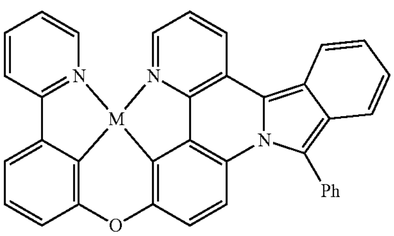
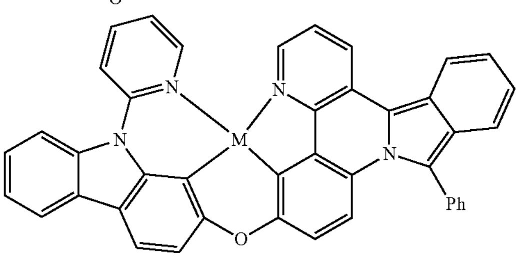
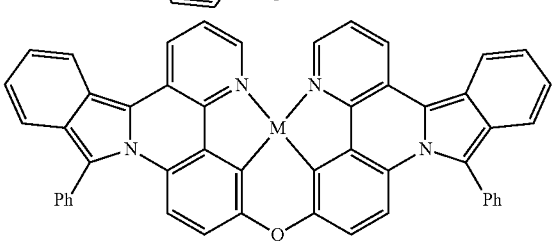
-continued
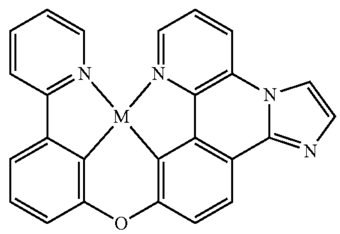
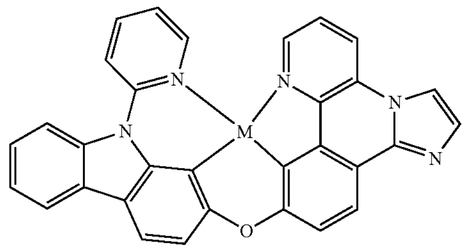
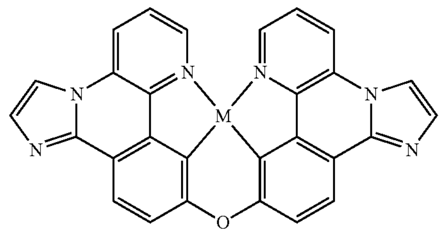
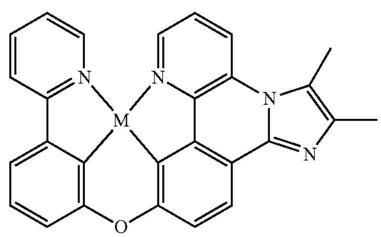
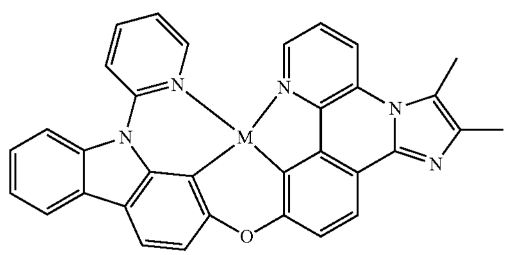
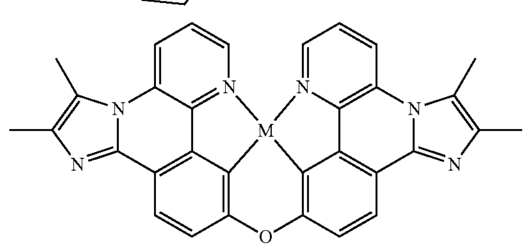
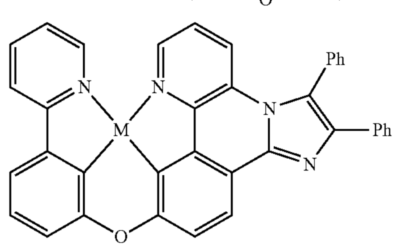

-continued
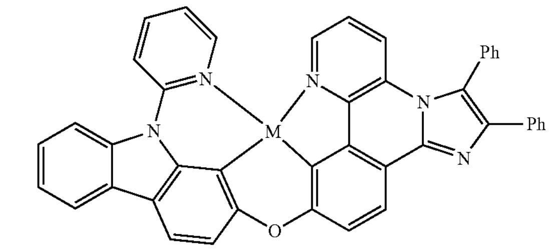
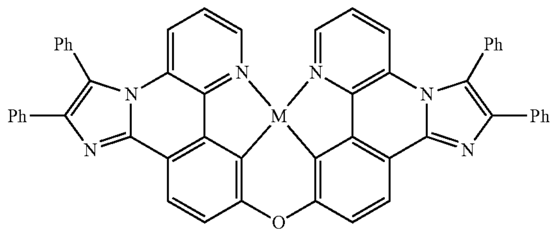
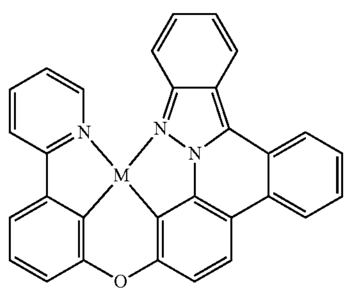
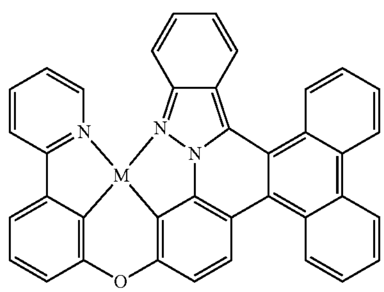
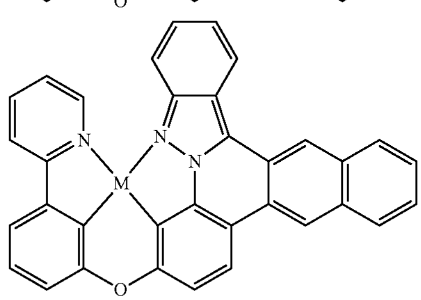
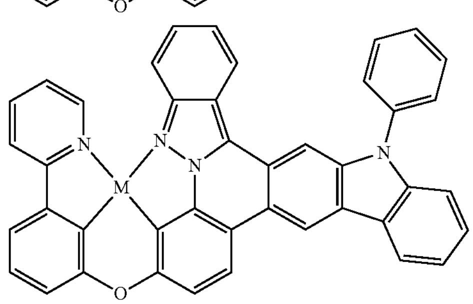
-continued
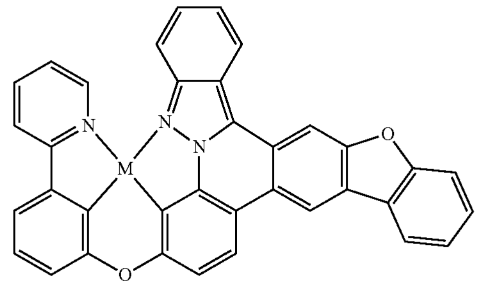
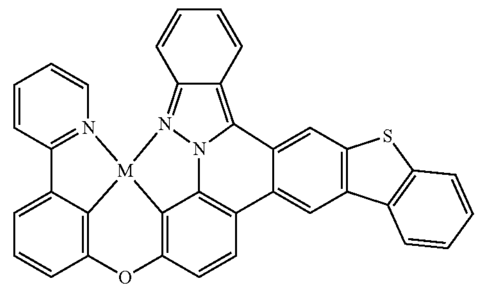
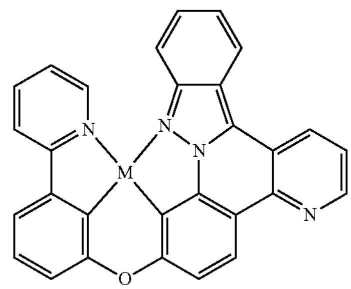
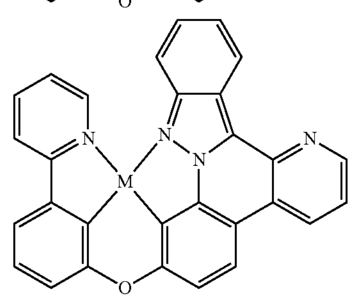
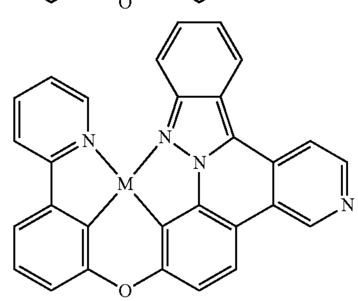
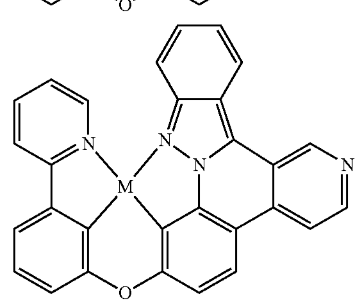

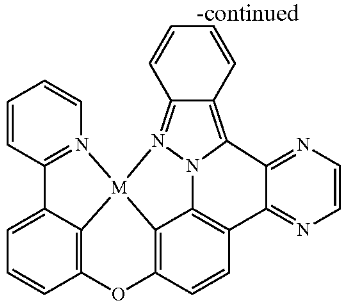
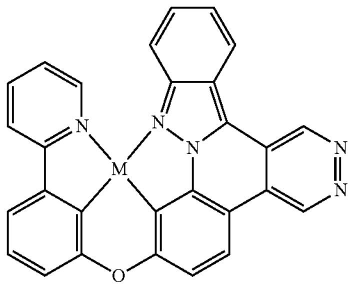
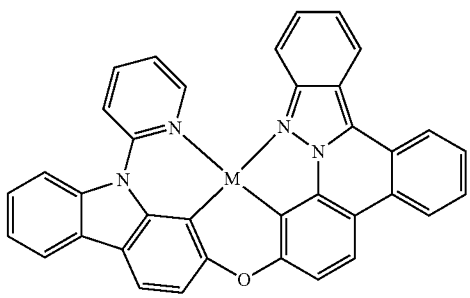
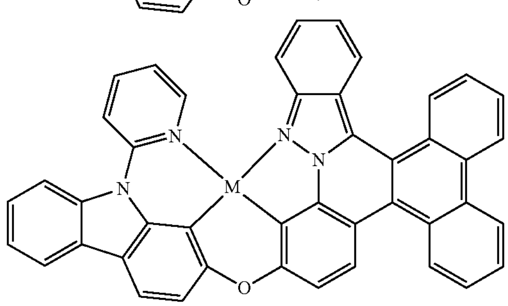
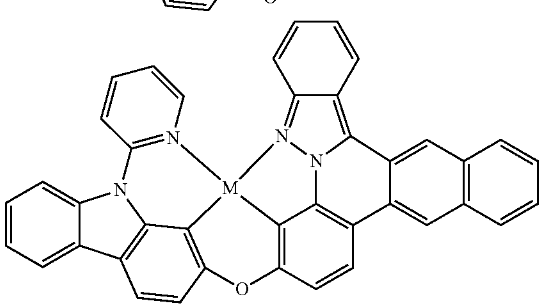
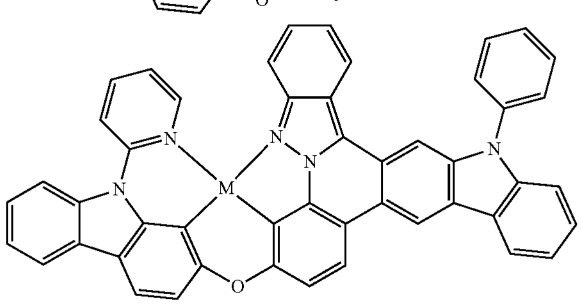
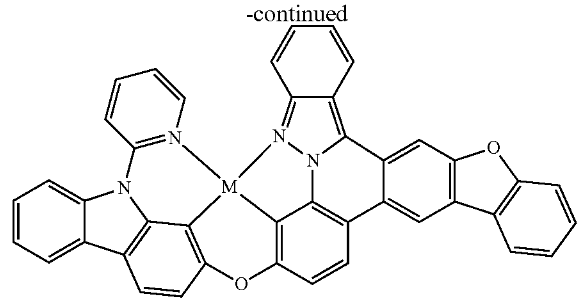
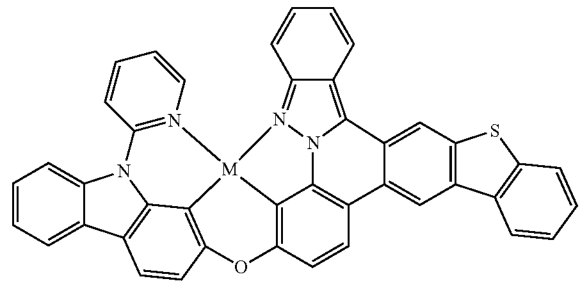
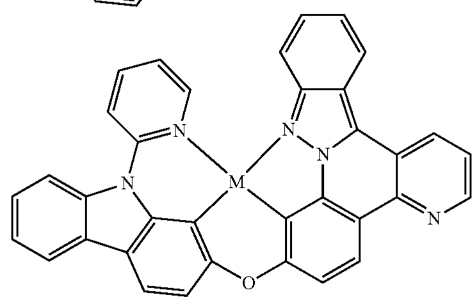
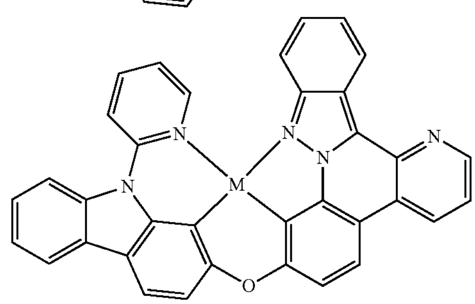
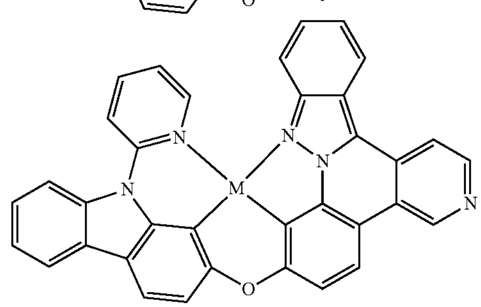
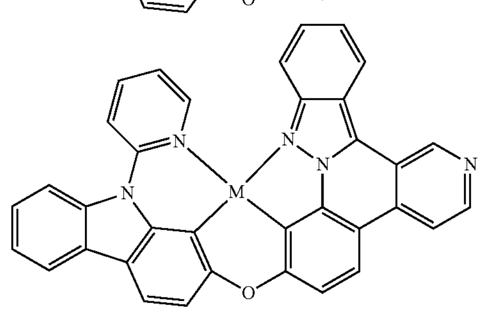

-continued
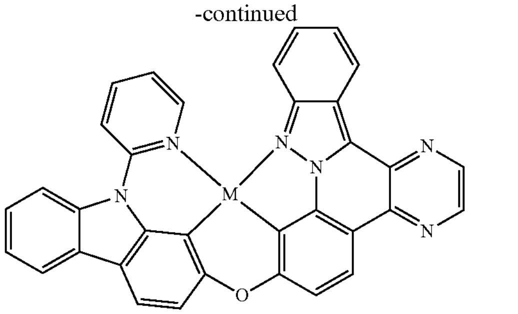
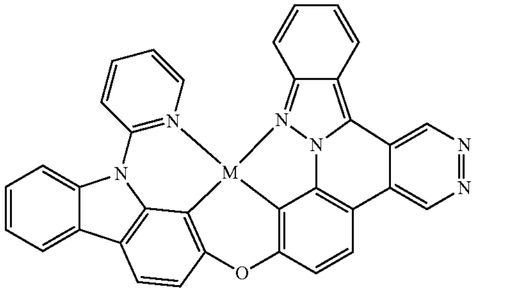
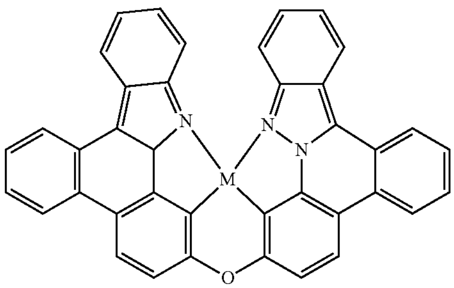
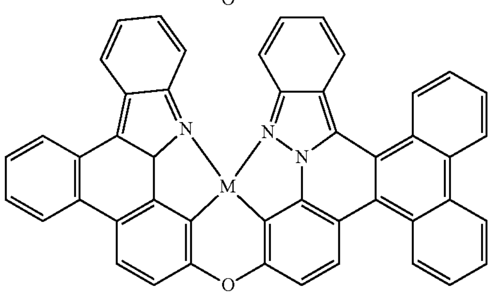
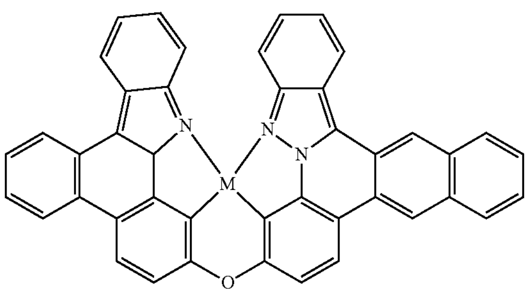
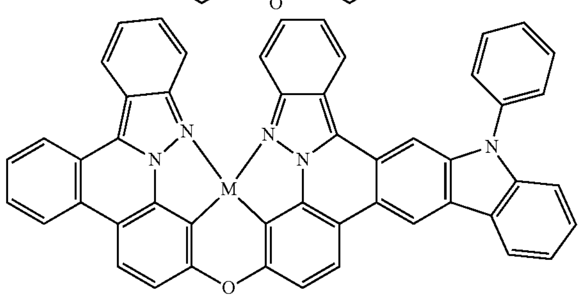
-continued
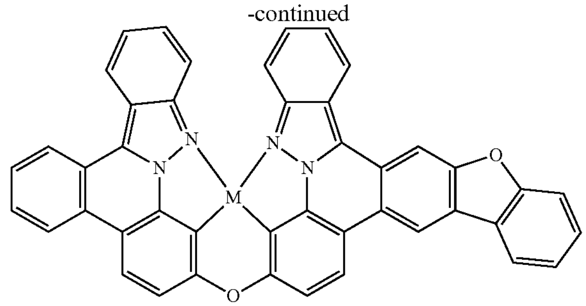
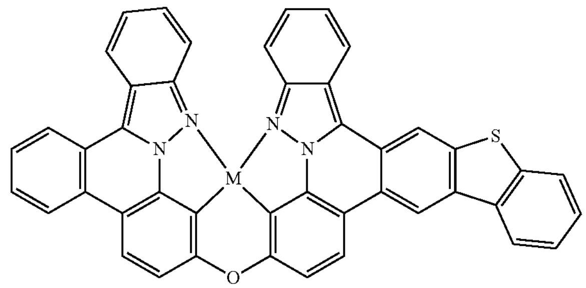
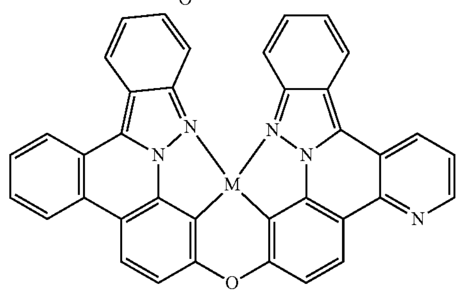
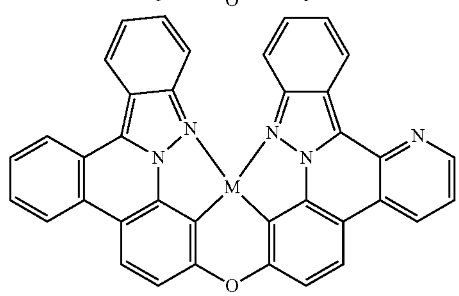
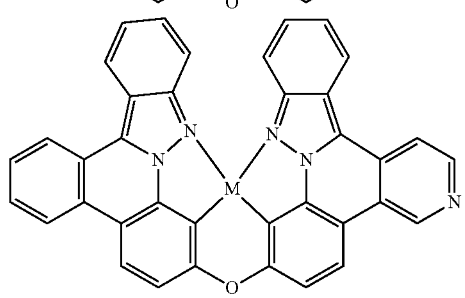
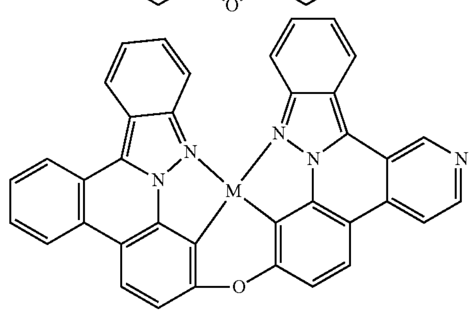

-continued
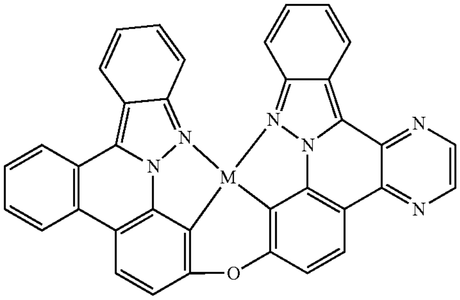
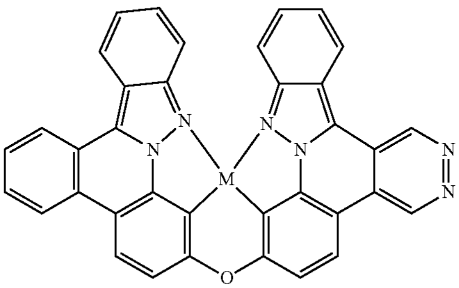
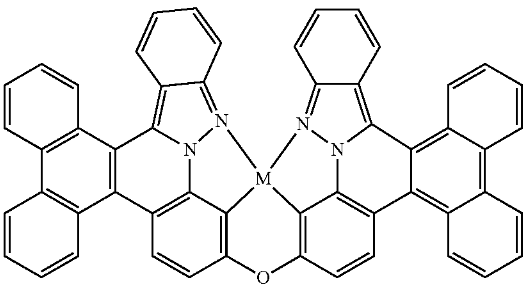
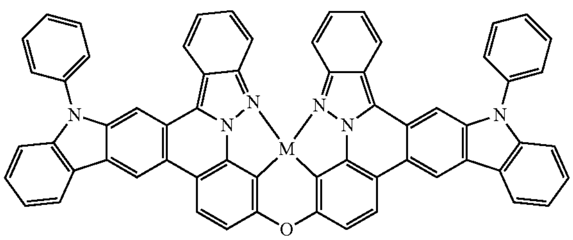
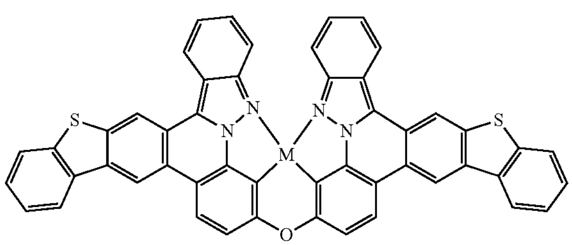
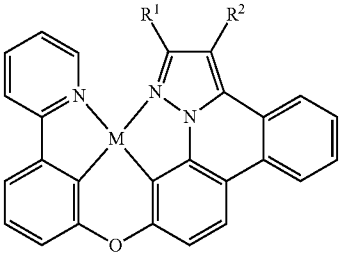
-continued
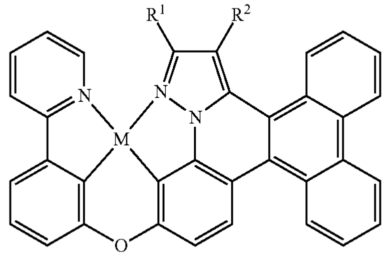
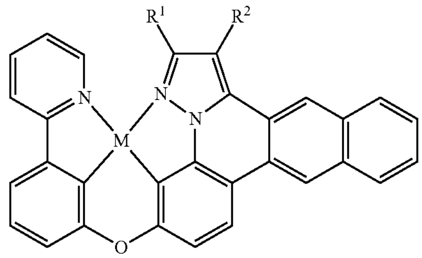
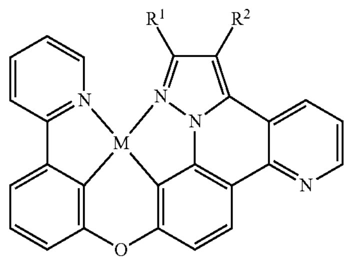
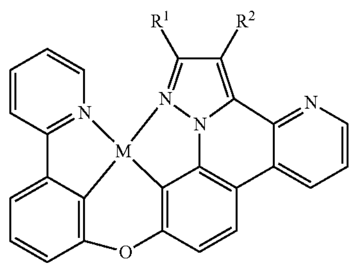
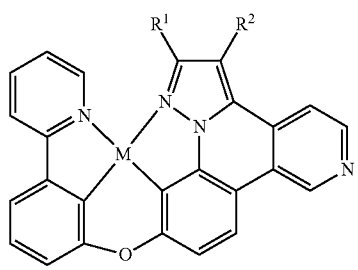
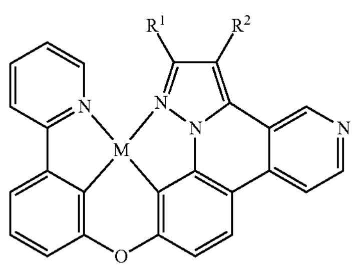

-continued
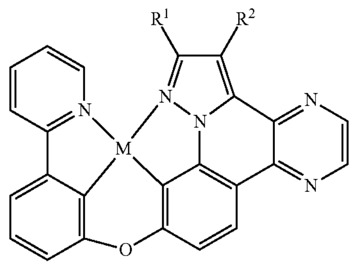
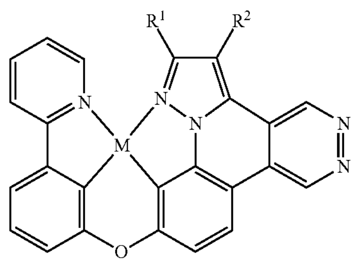
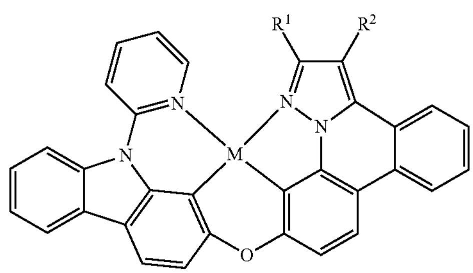
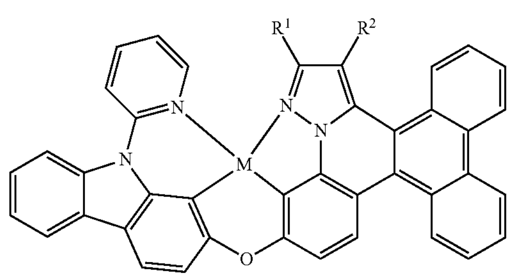
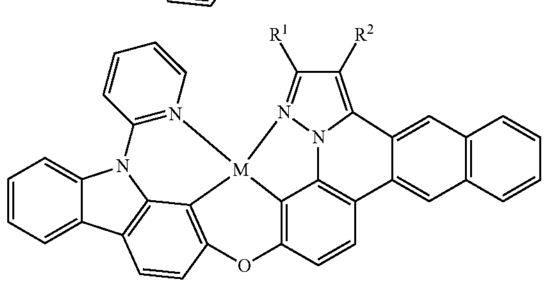
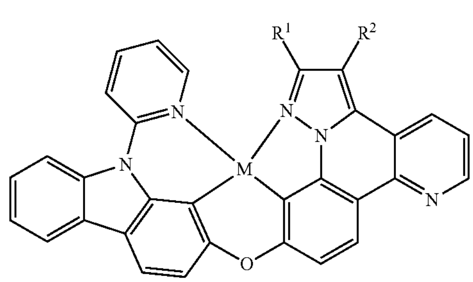
-continued
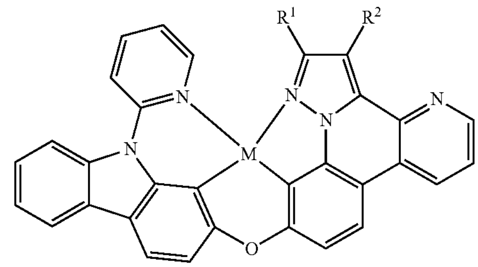
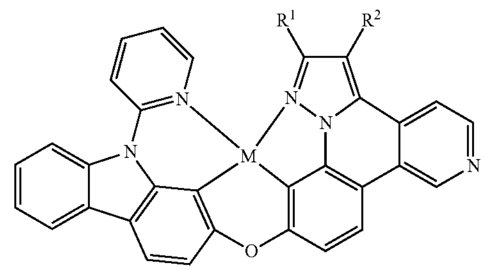
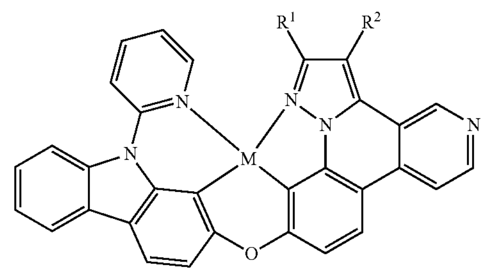
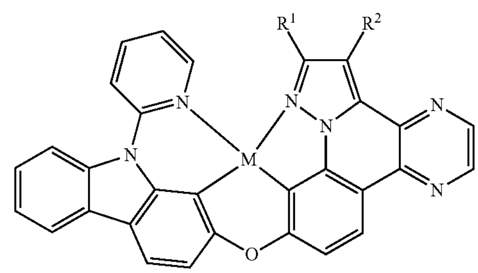
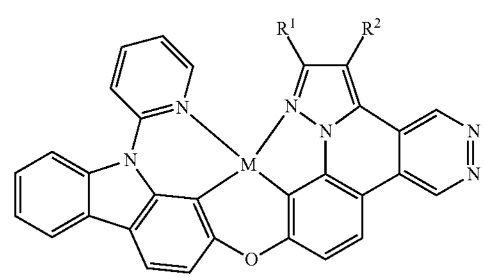
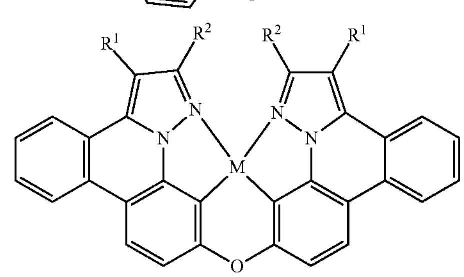

-continued
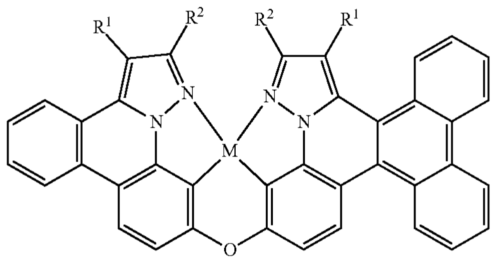
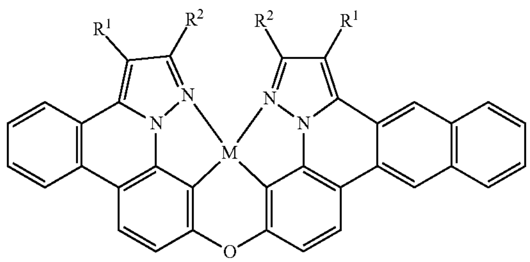
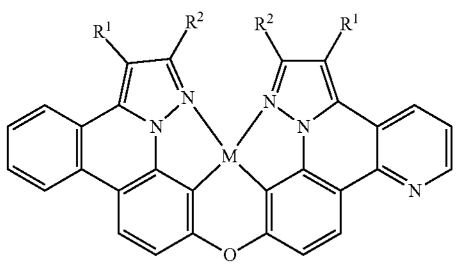
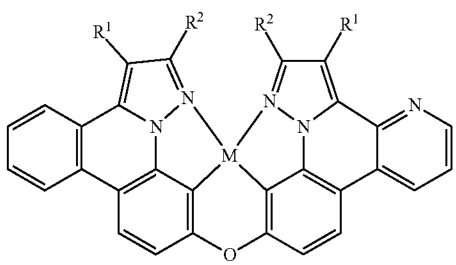
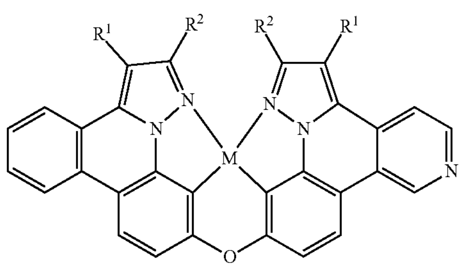
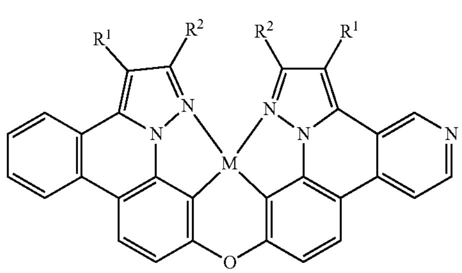
-continued
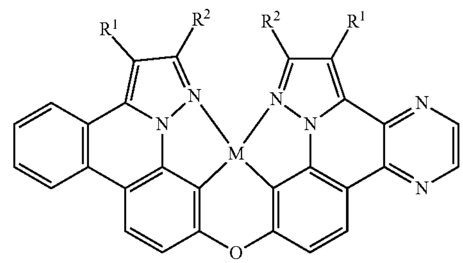
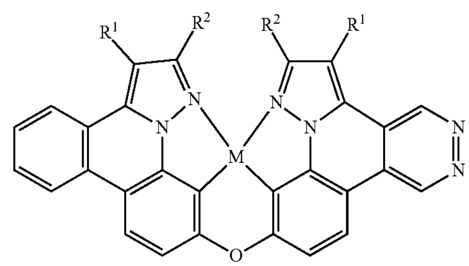
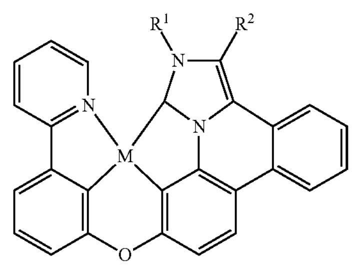
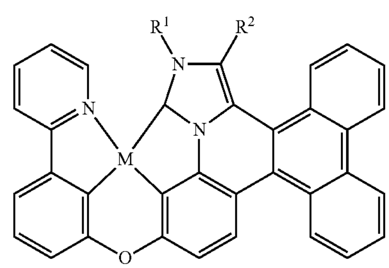
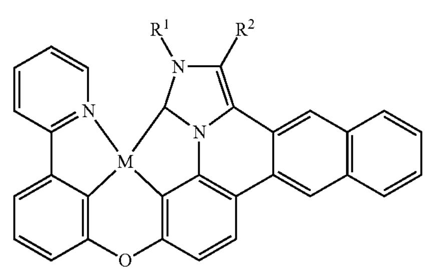
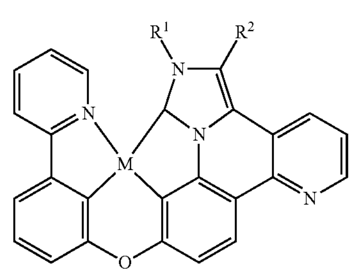

-continued
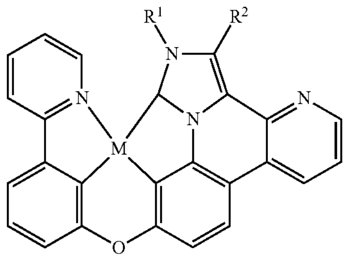
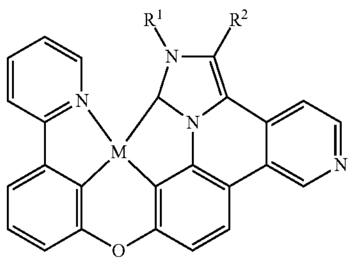
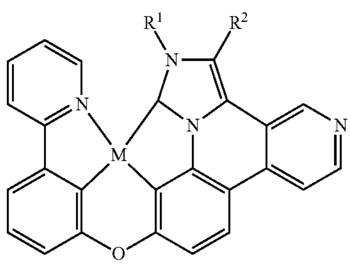
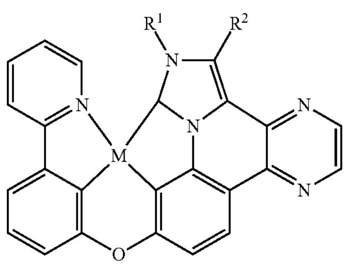
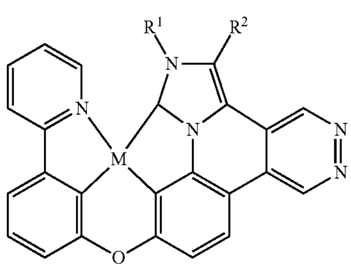
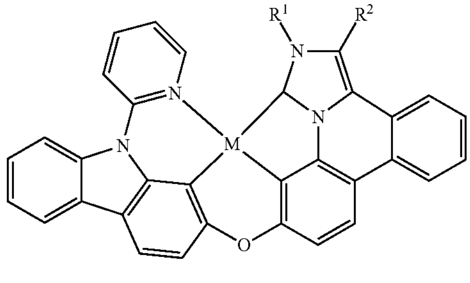
-continued
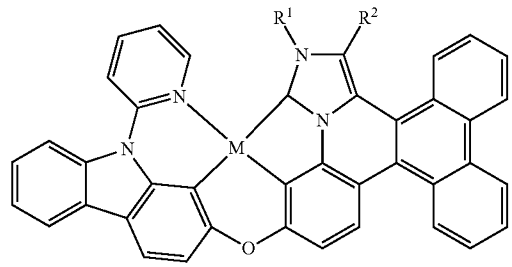
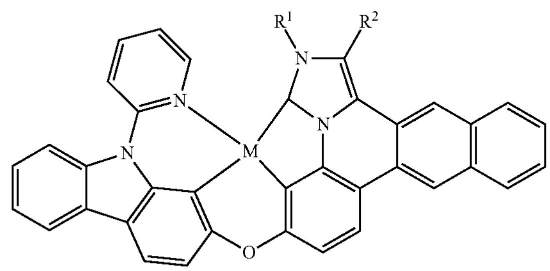
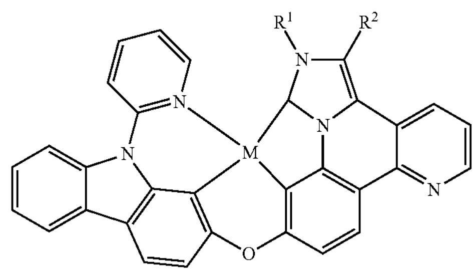
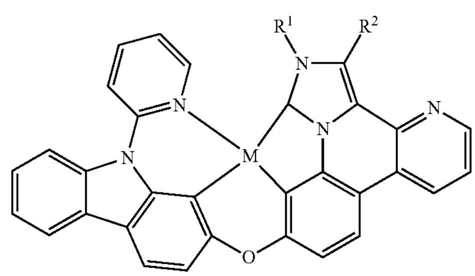
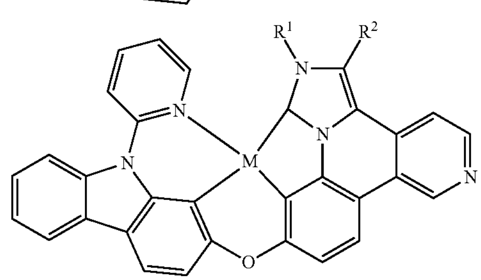
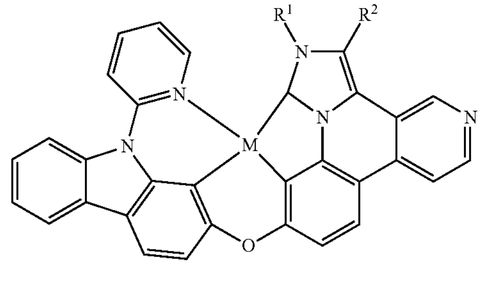

-continued
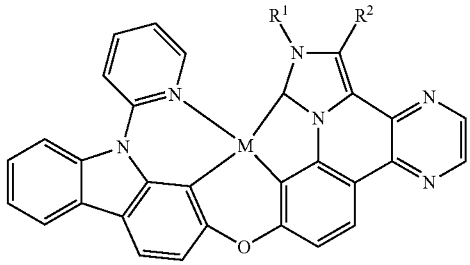
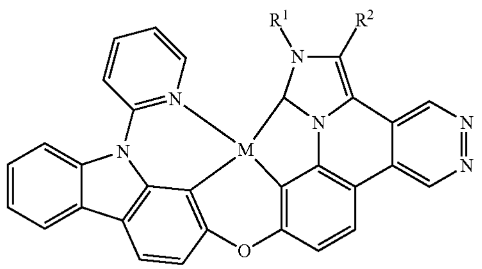
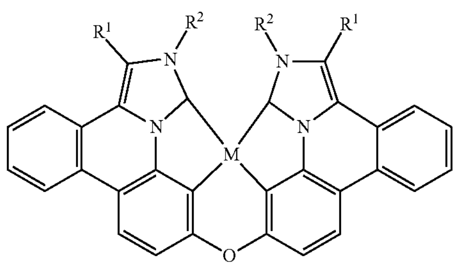
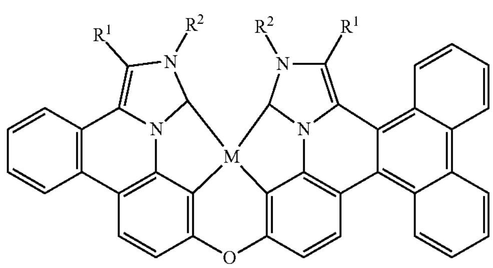
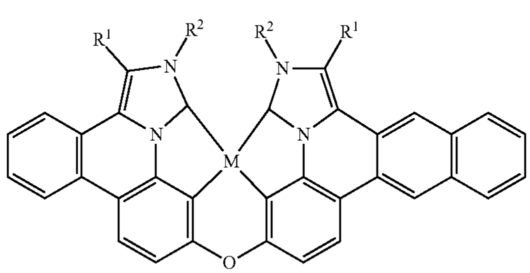
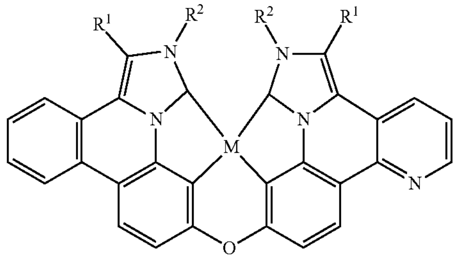
-continued
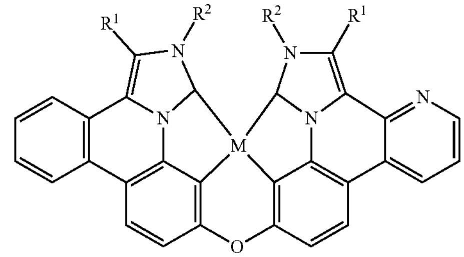
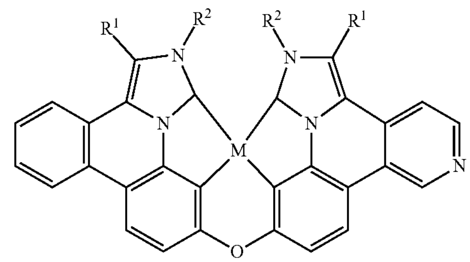
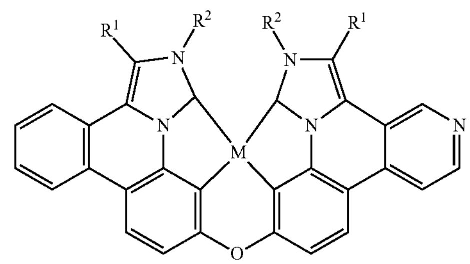
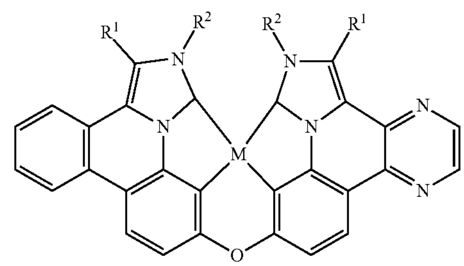
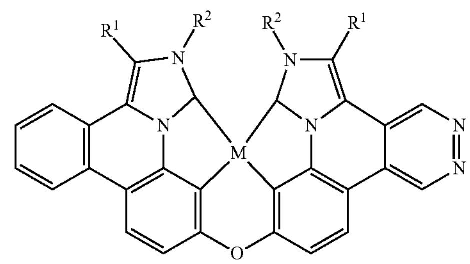
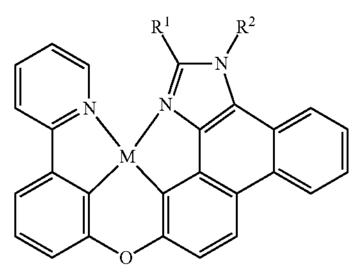

-continued
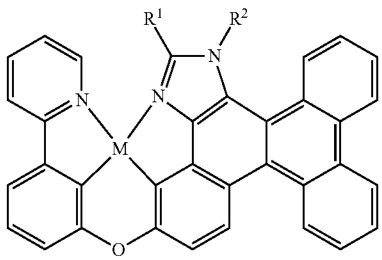
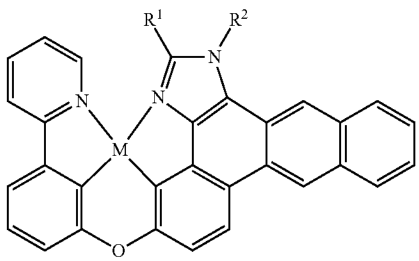
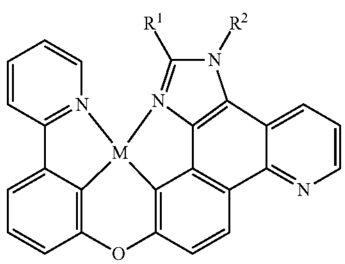
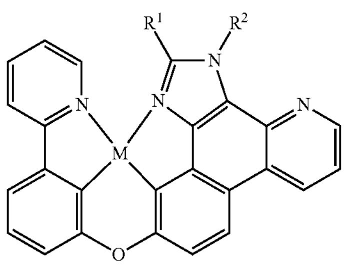
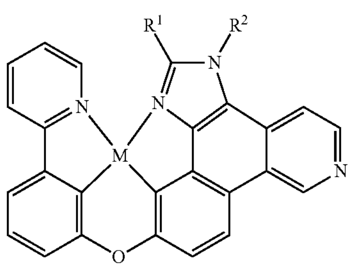
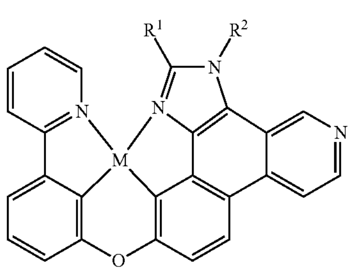
-continued
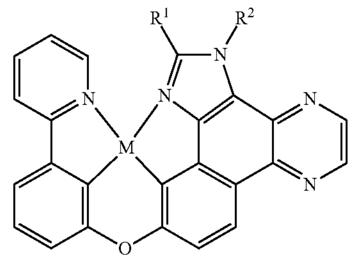
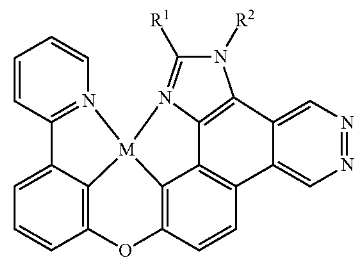
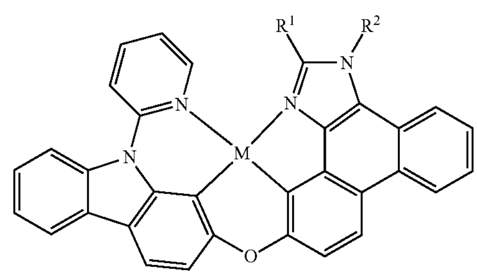
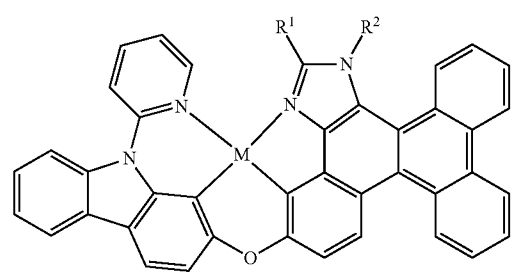
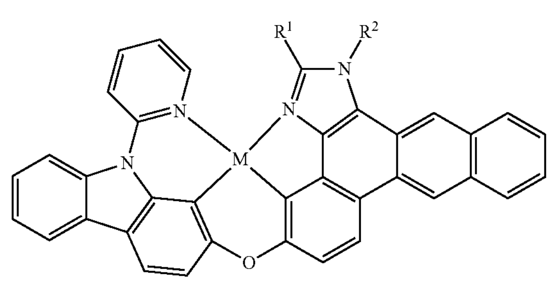
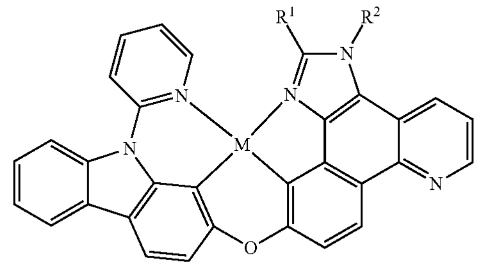

-continued
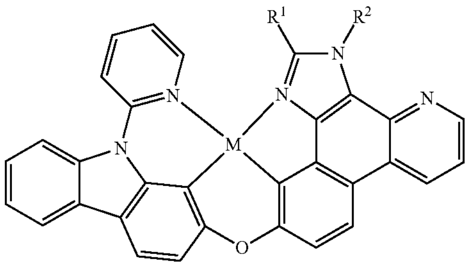
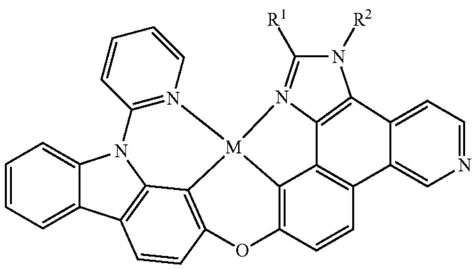
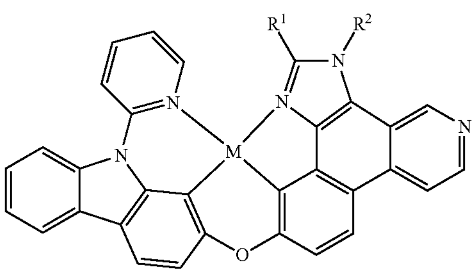
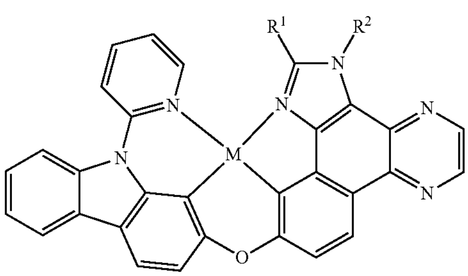
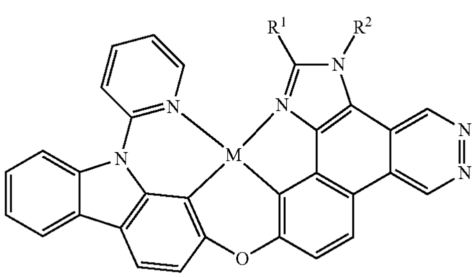
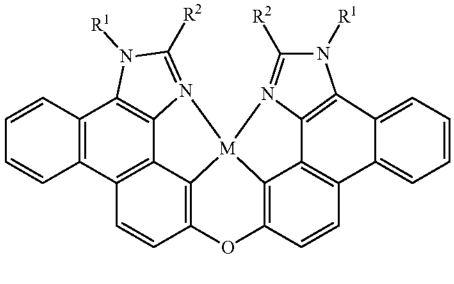
-continued
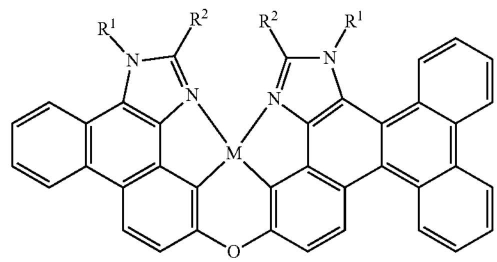
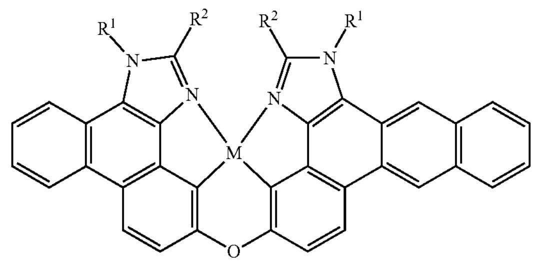
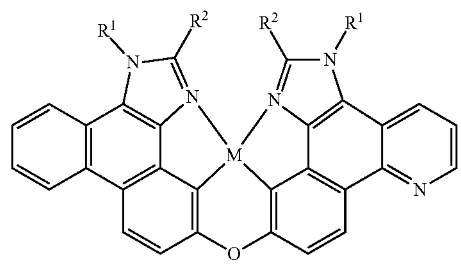
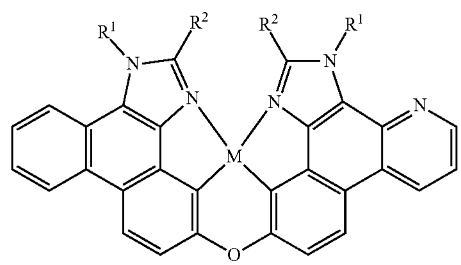
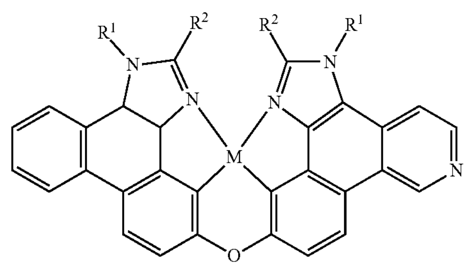
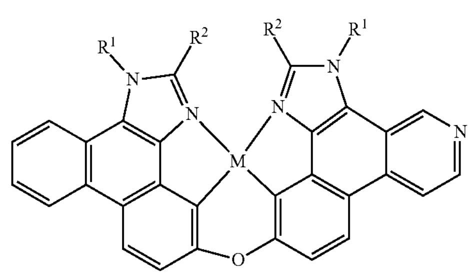

-continued
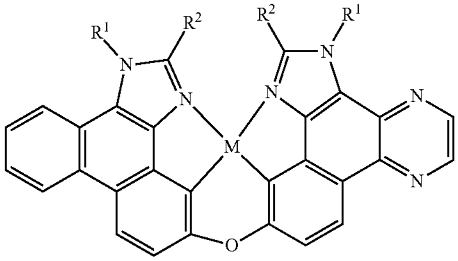
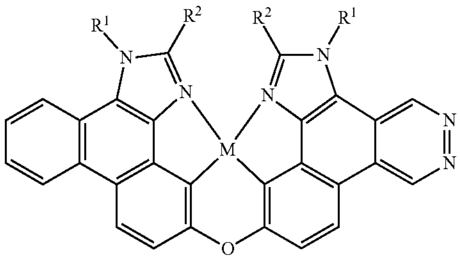
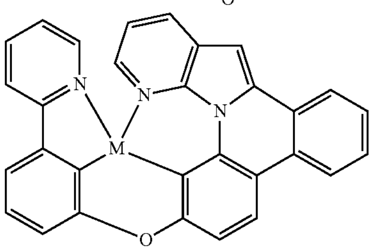
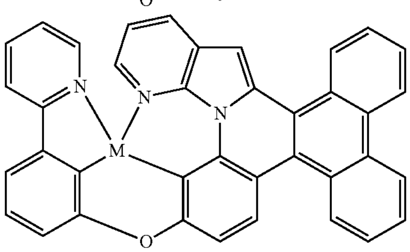
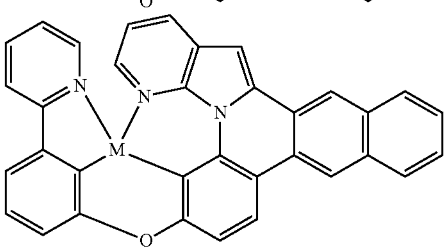
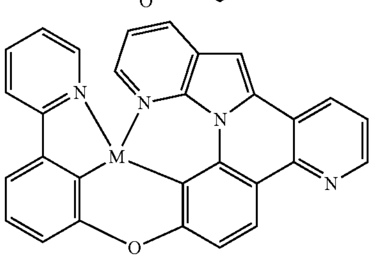
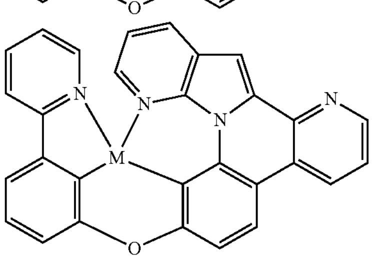
-continued
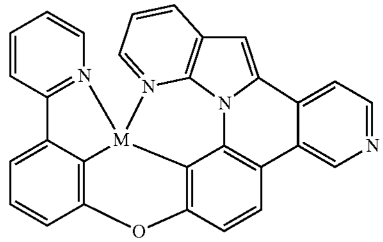
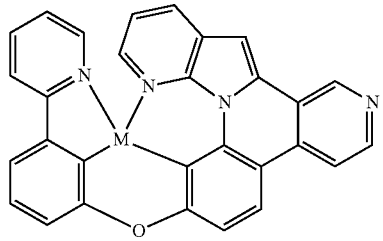
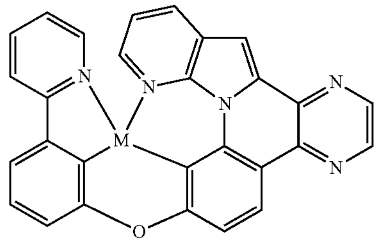
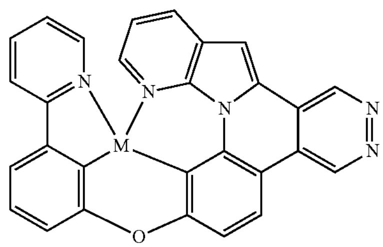
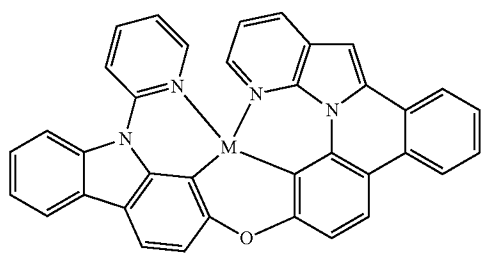
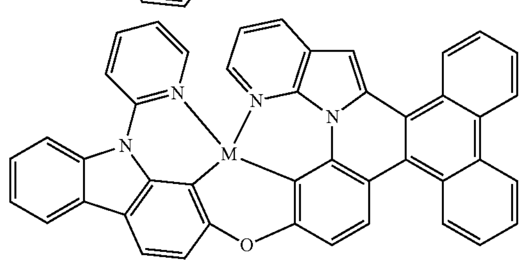
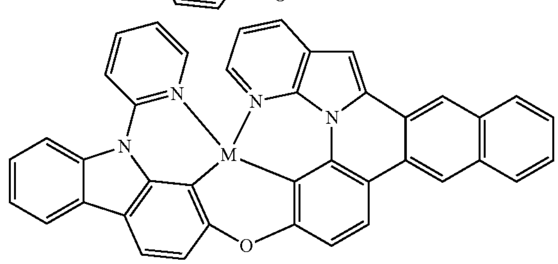

-continued
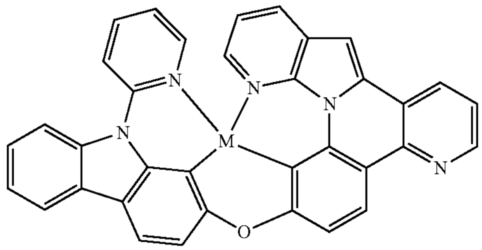
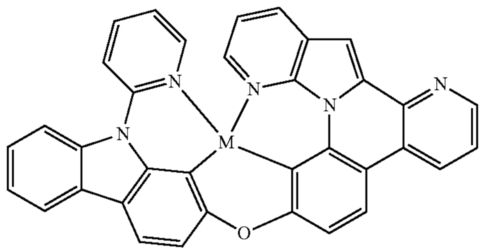
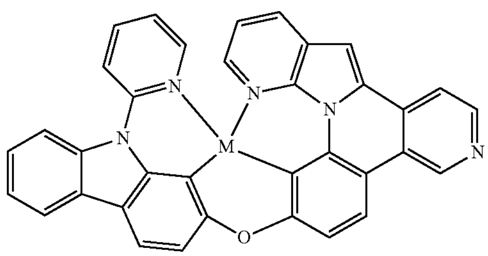
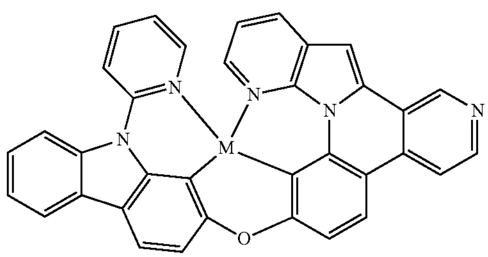
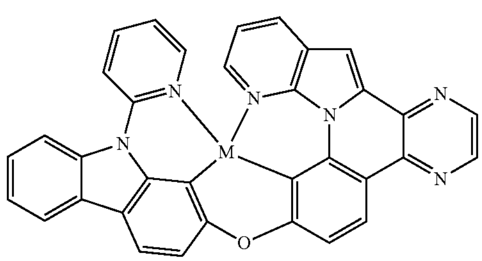
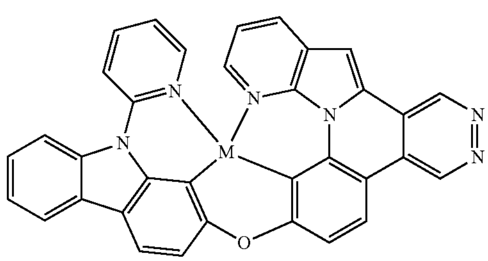
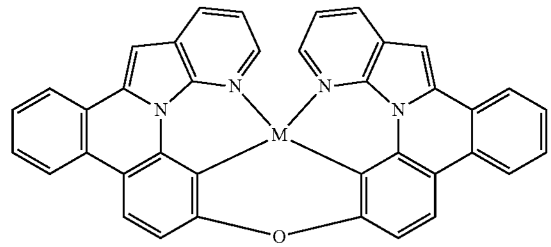
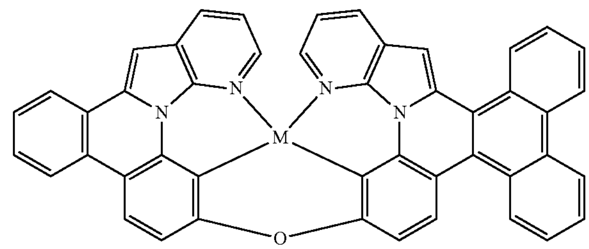
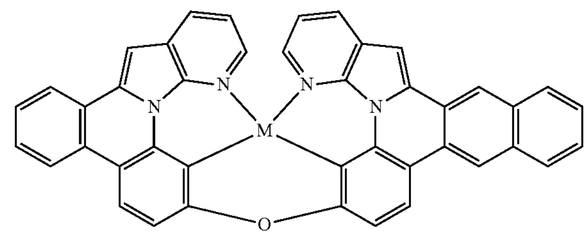
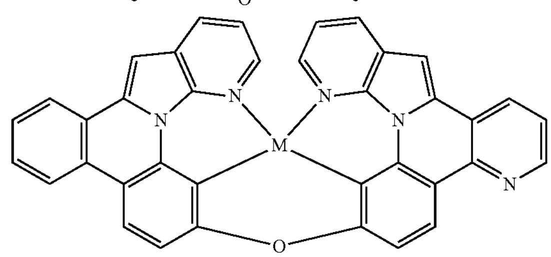
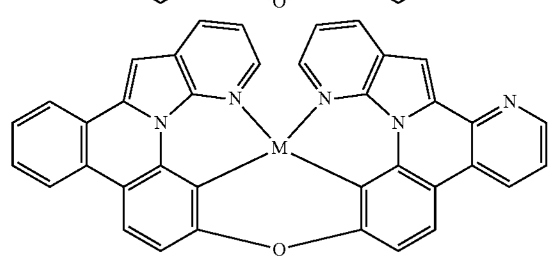
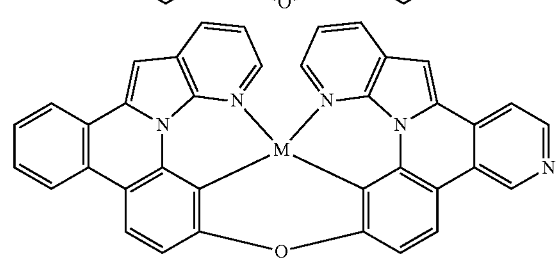
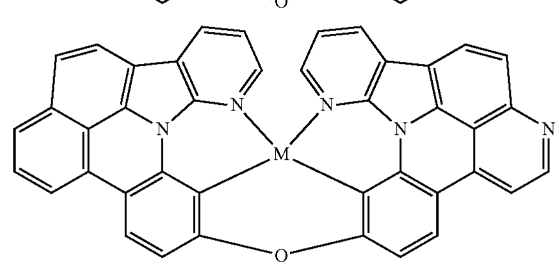

-continued
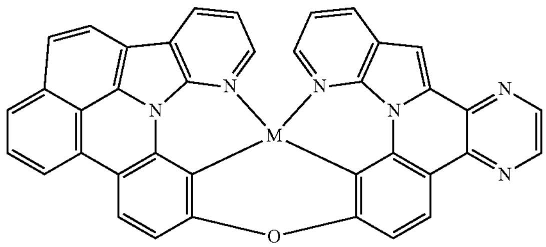
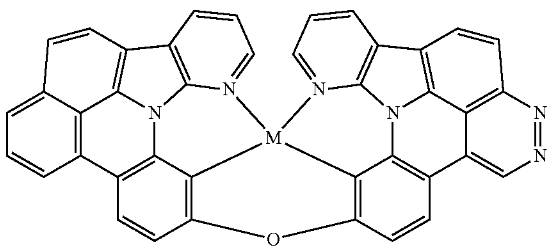
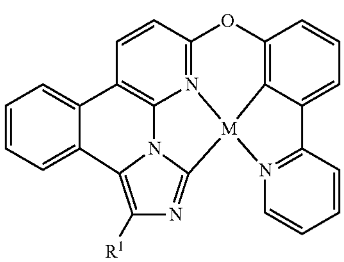
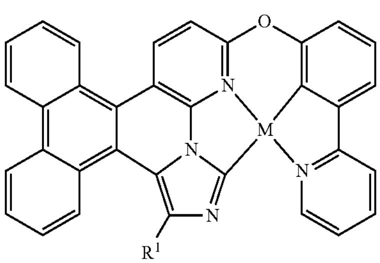
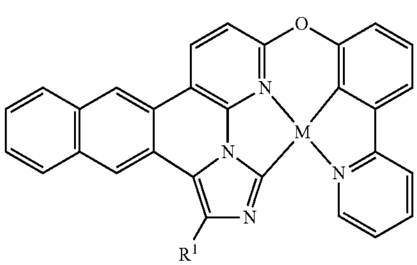
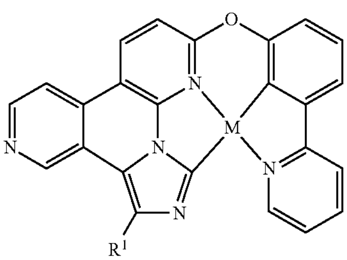
-continued
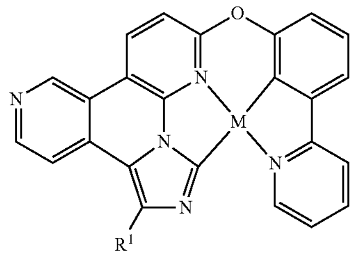
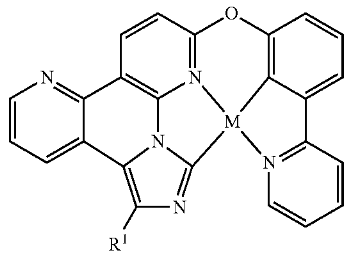
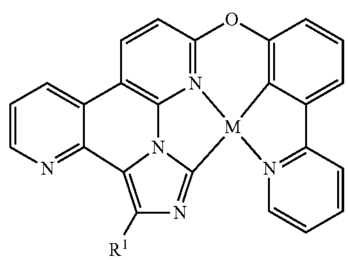
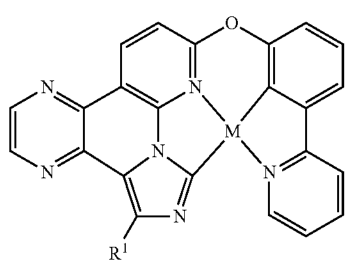
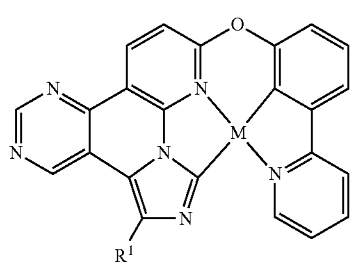
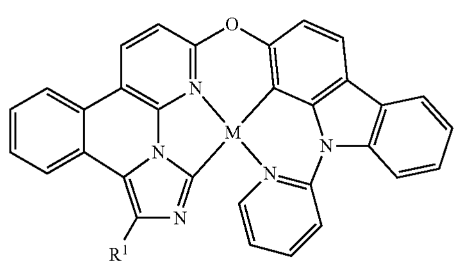

-continued
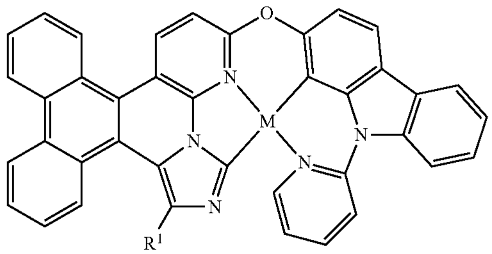
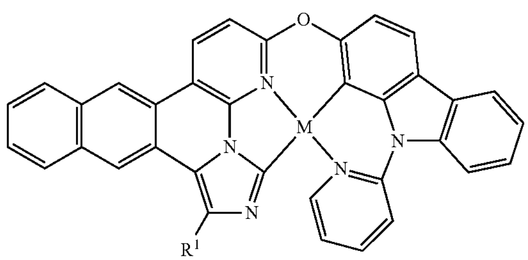
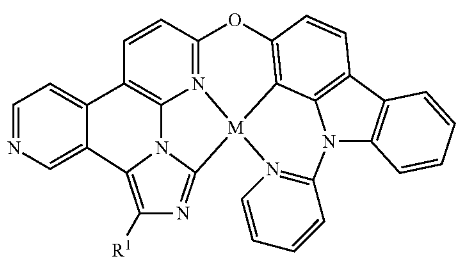
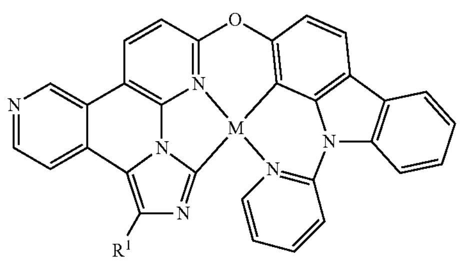
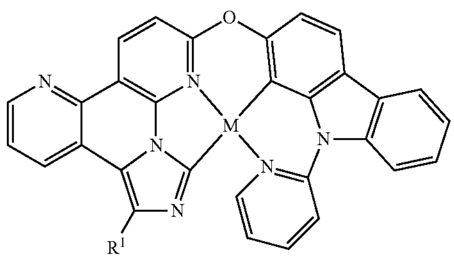
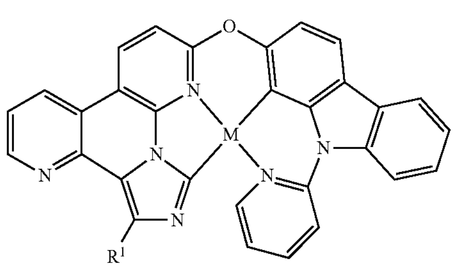
-continued
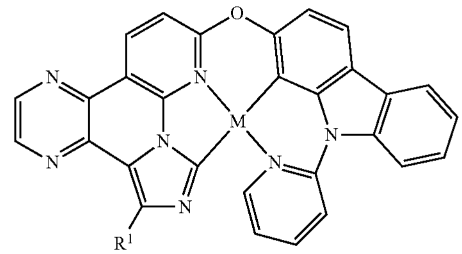
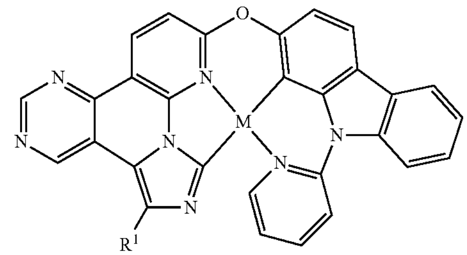
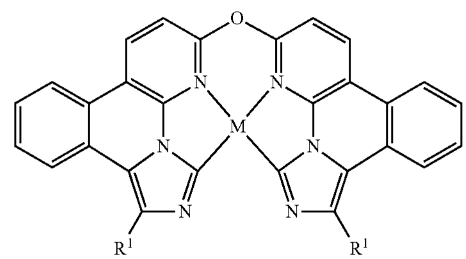
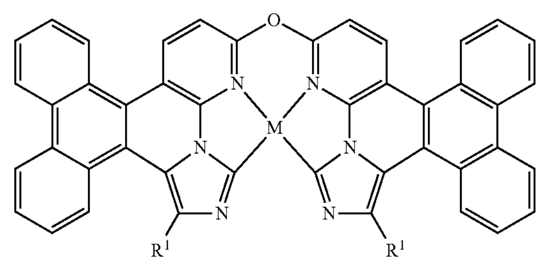
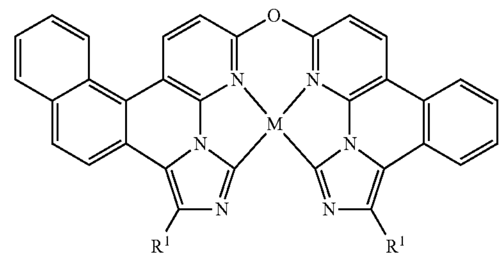
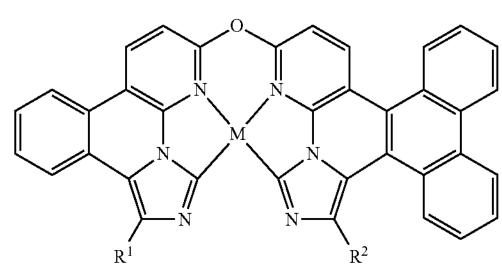

-continued
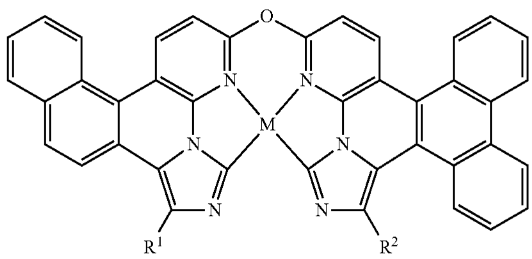
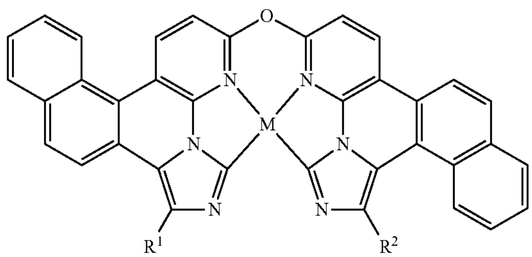
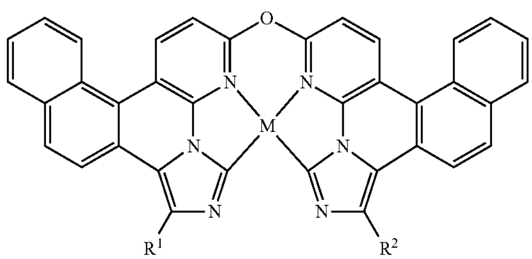
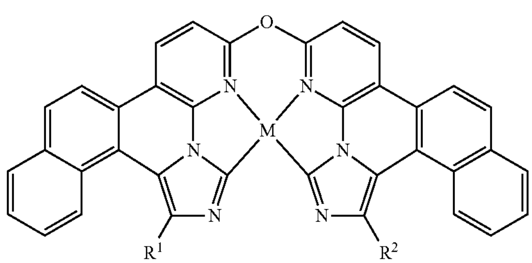
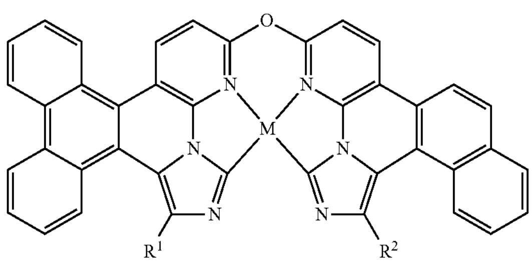
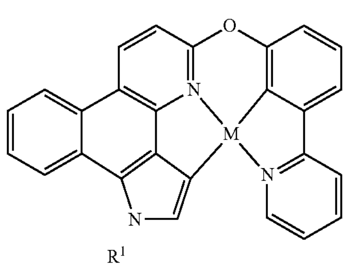
-continued
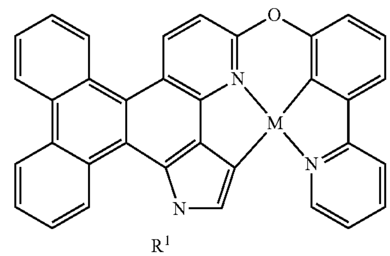
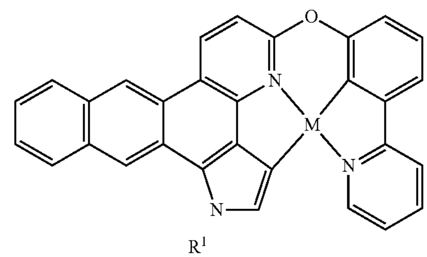
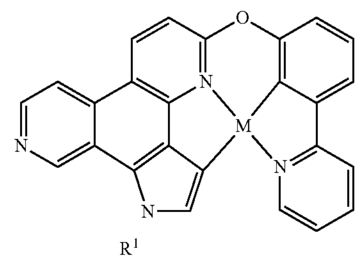
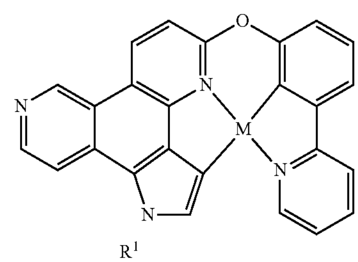
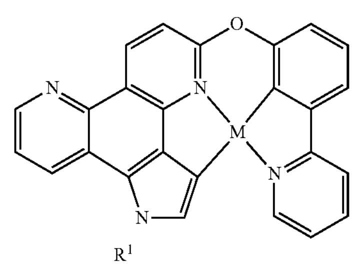
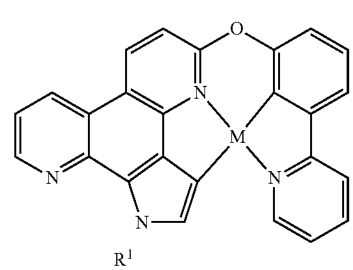

-continued
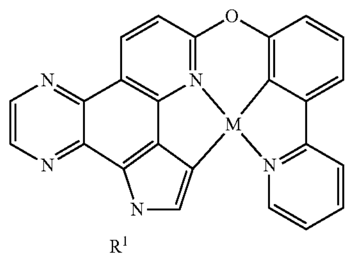
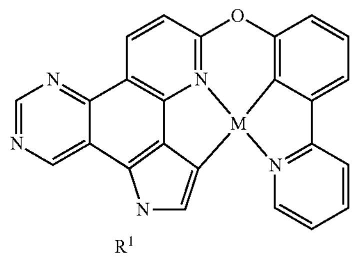
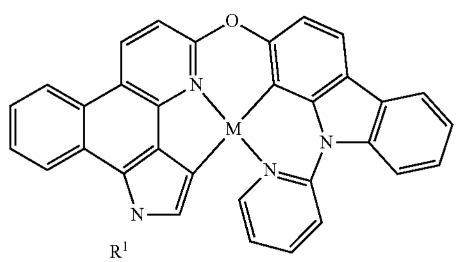
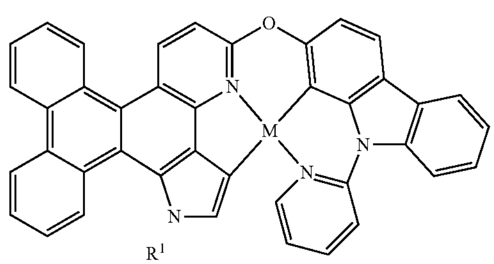
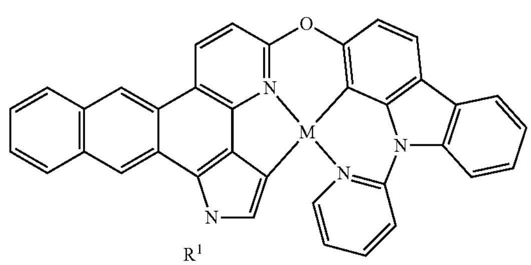
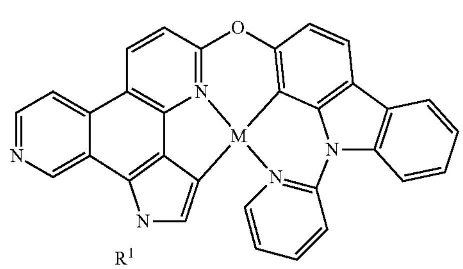
-continued
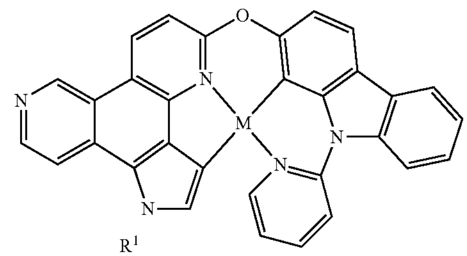
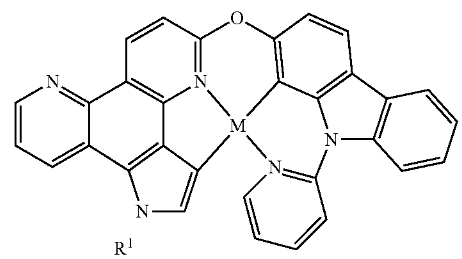
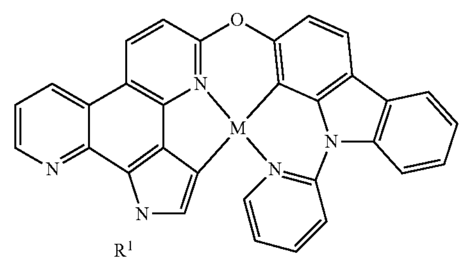
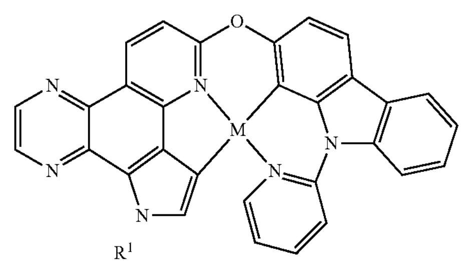
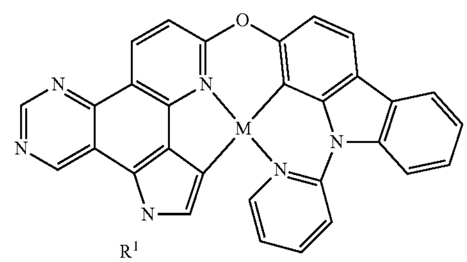
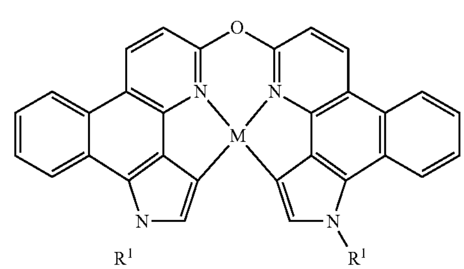

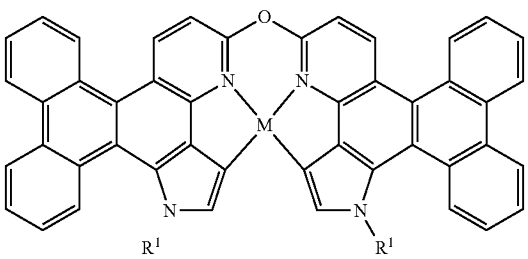
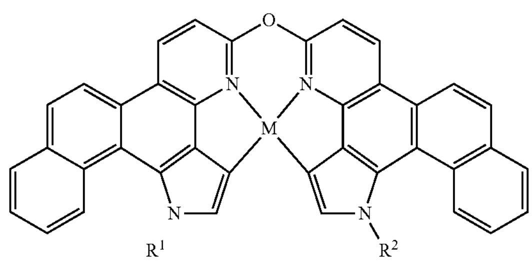
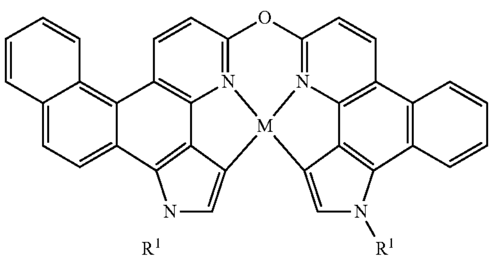
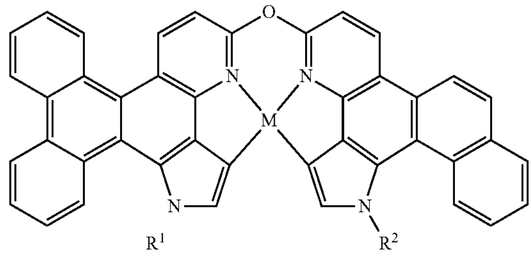
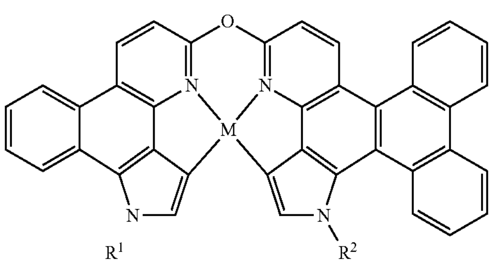
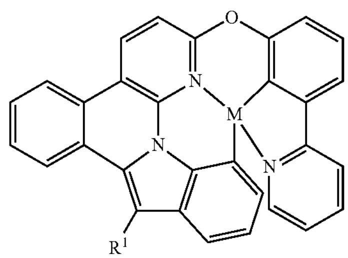
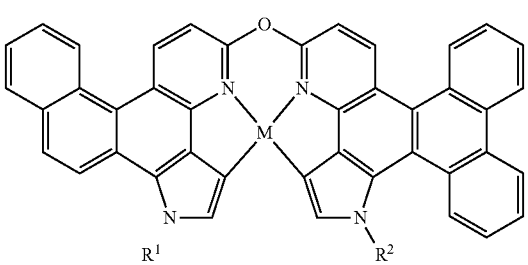
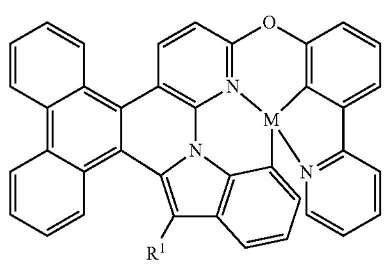
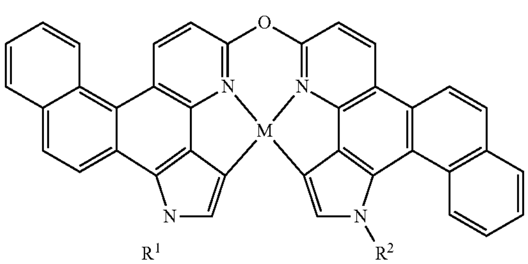
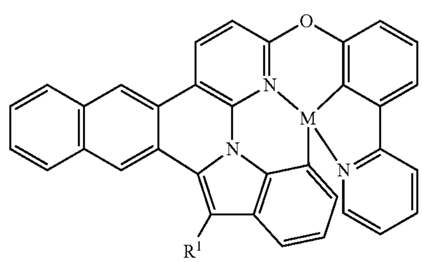
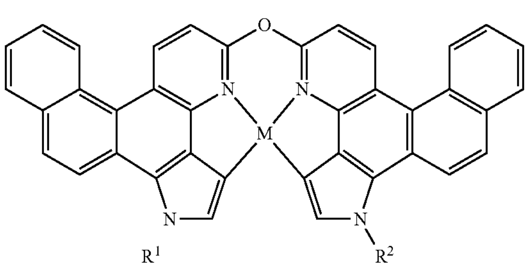
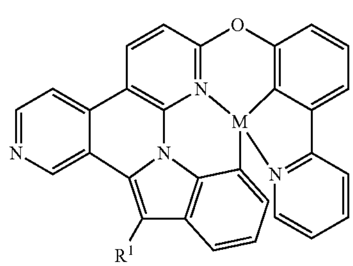

-continued
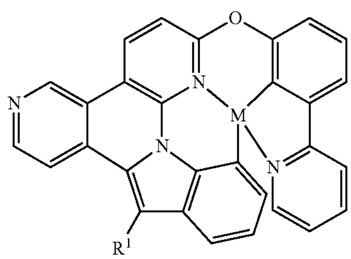
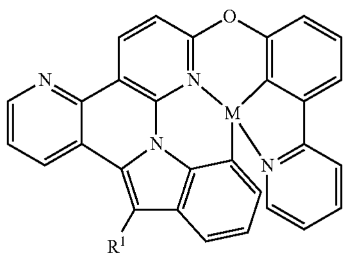
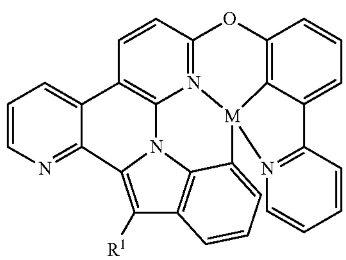
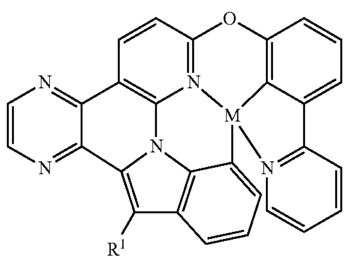
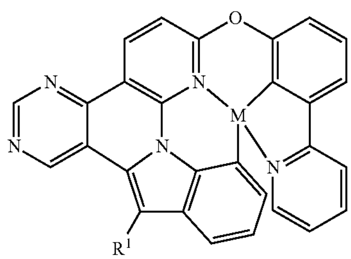
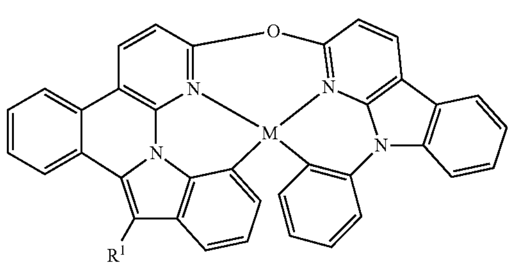
-continued
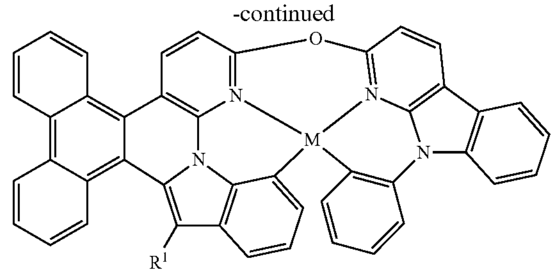
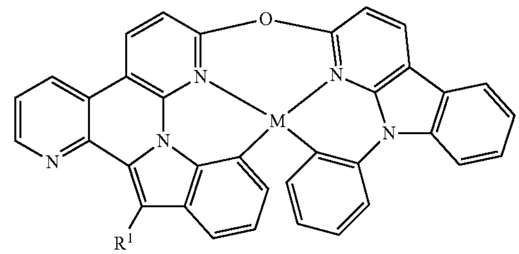
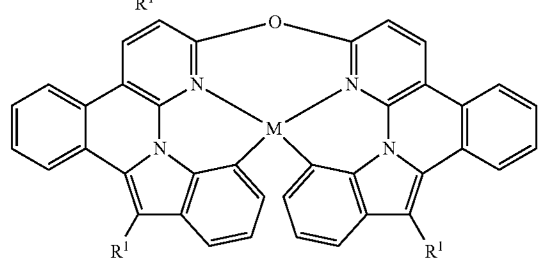
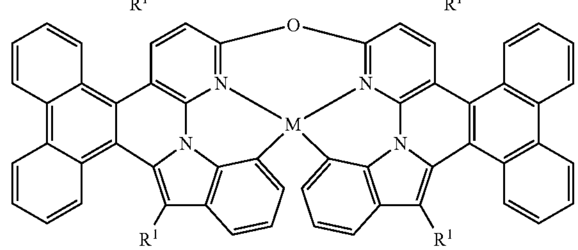
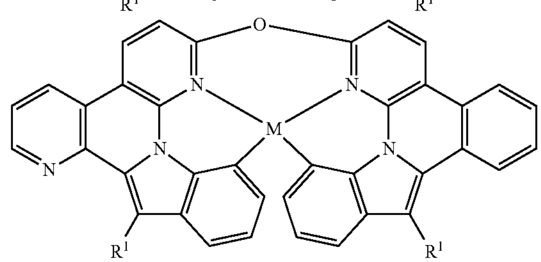
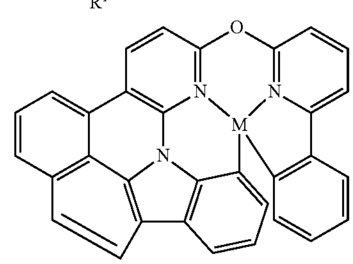
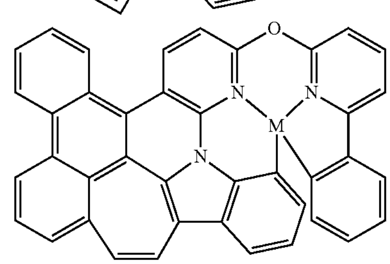

-continued
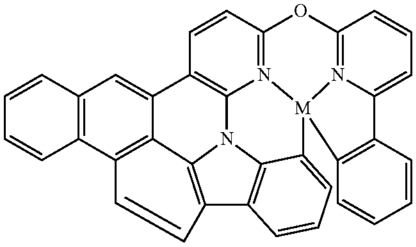
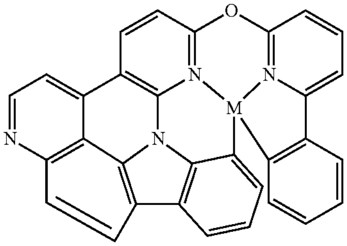
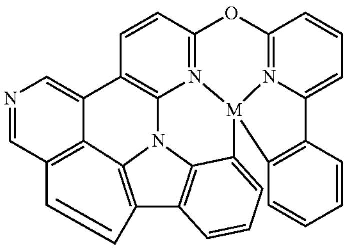
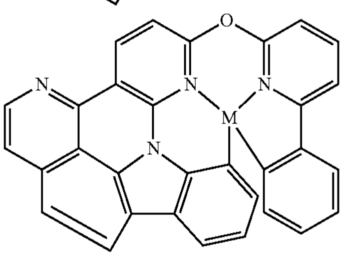
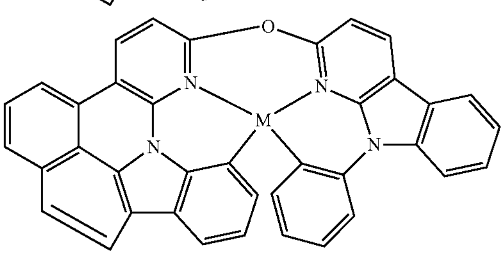
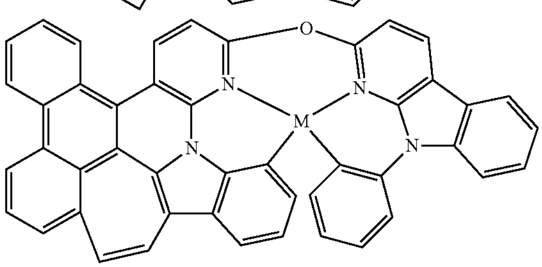
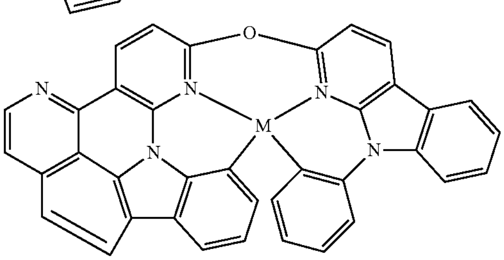
-continued
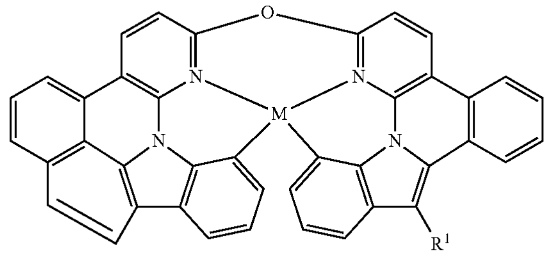
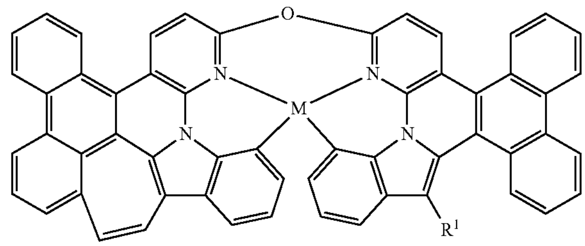
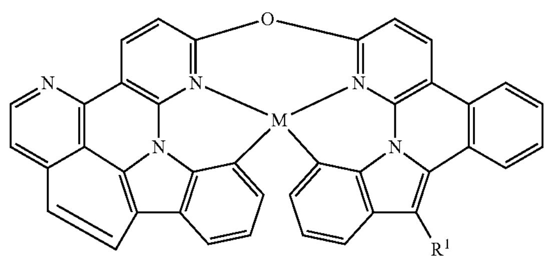
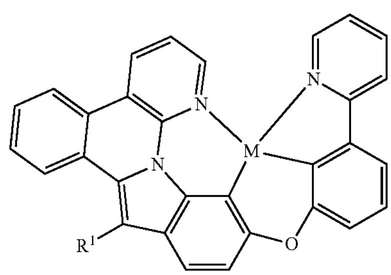
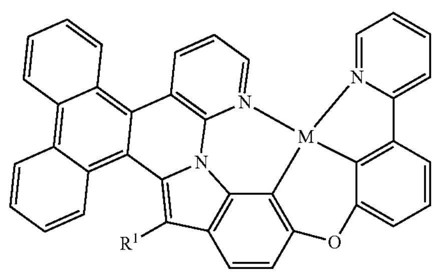
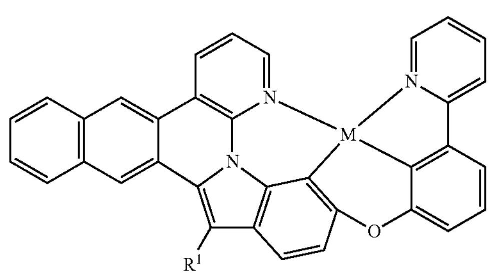

-continued
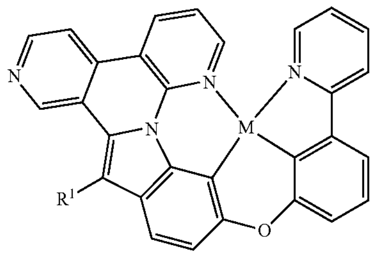
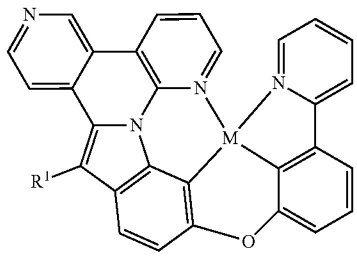
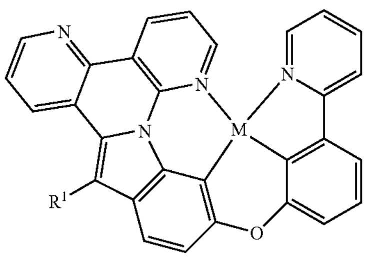
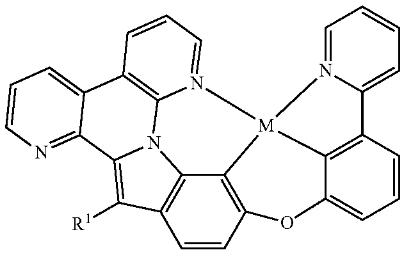
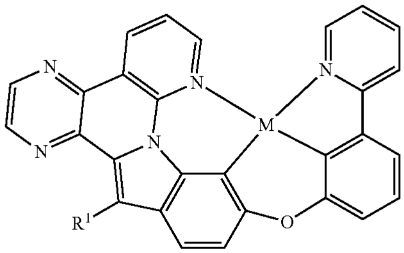
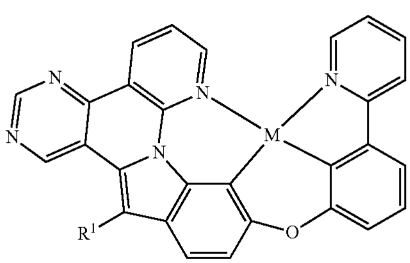
-continued
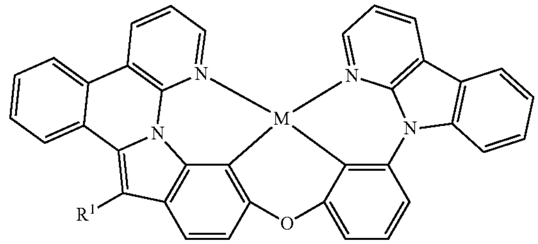
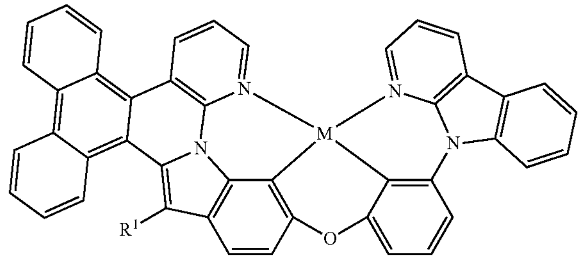
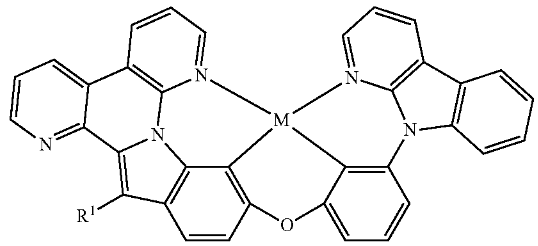
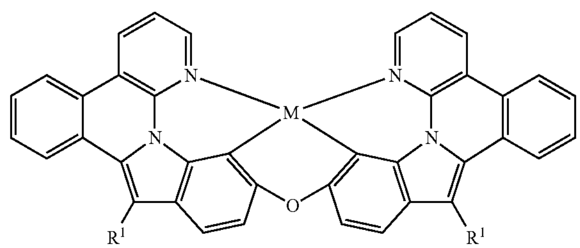
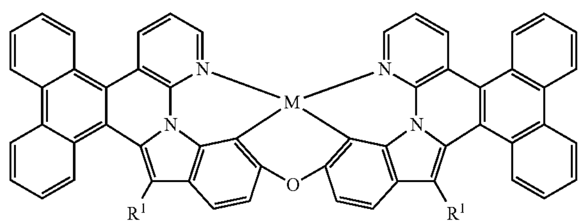
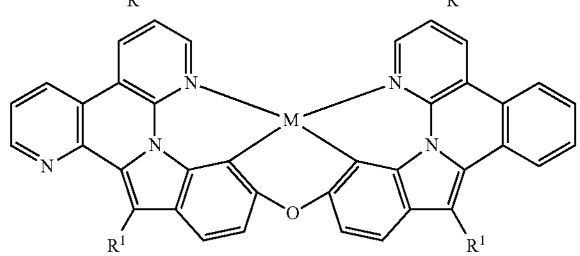
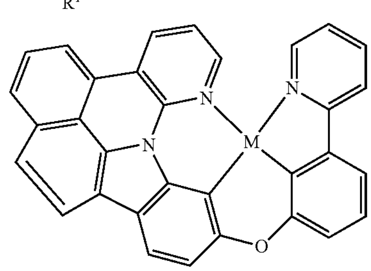

-continued
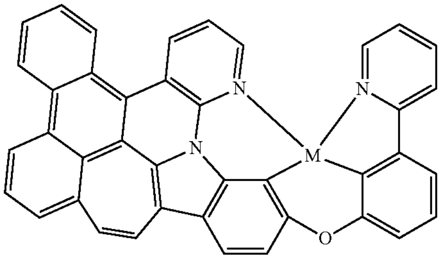
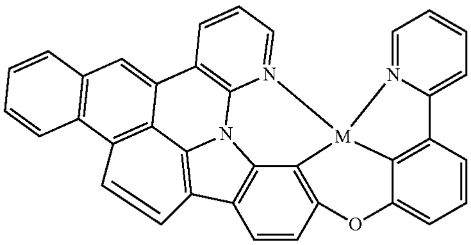
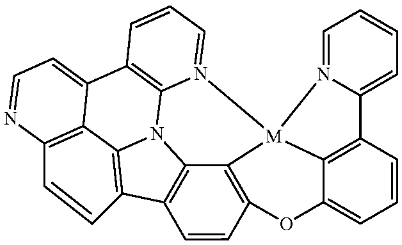
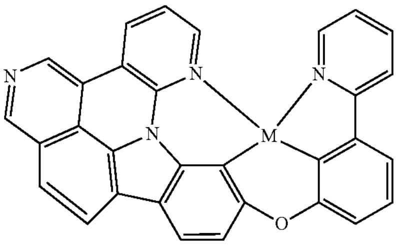
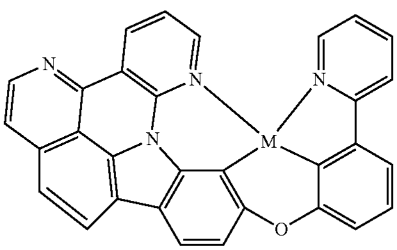
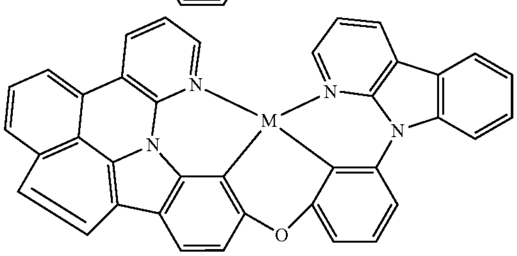
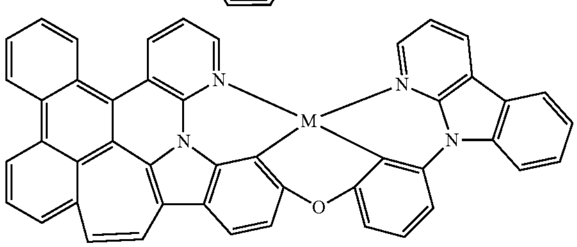
-continued
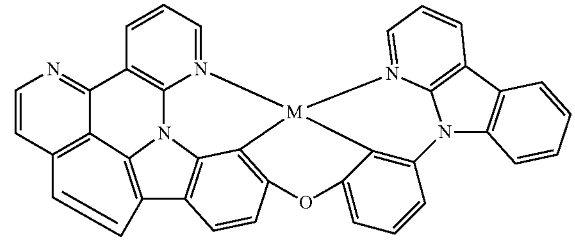
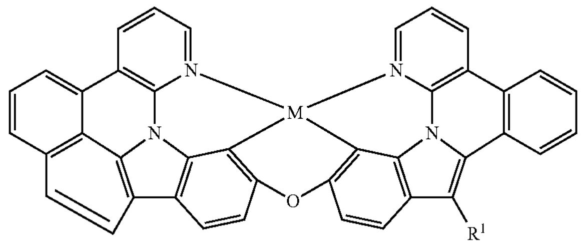
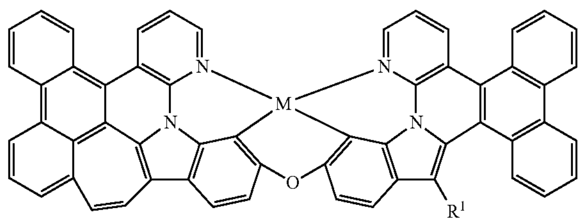
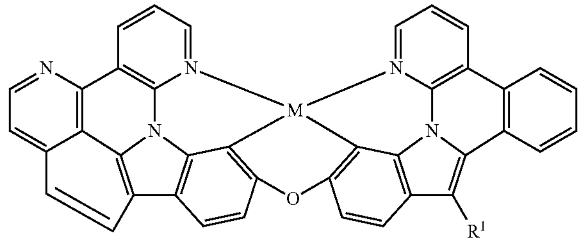
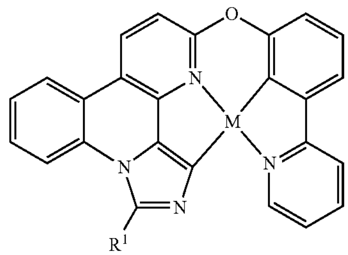
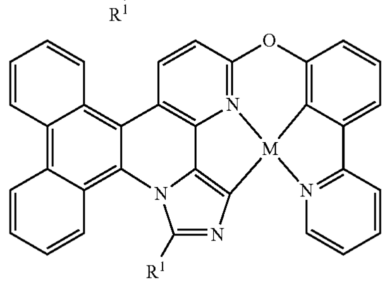
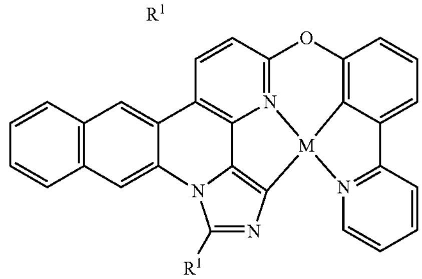

-continued
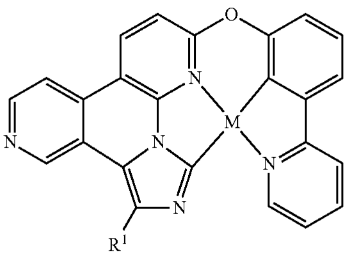
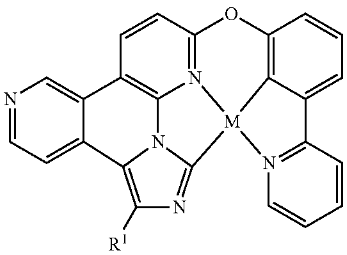
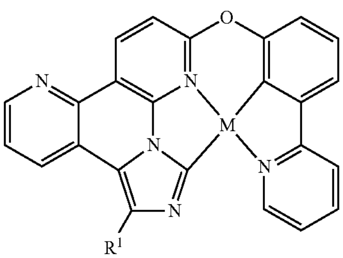
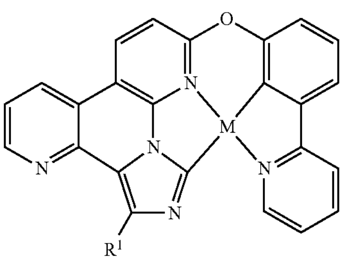
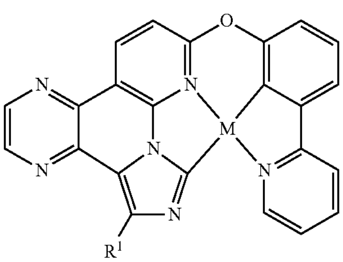
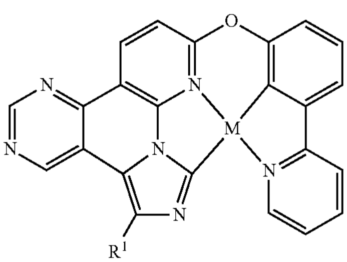
-continued
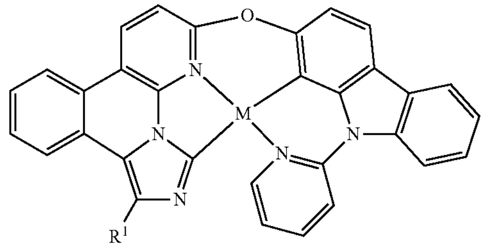
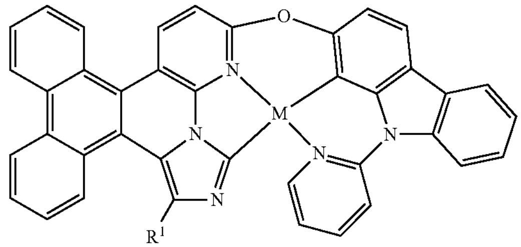
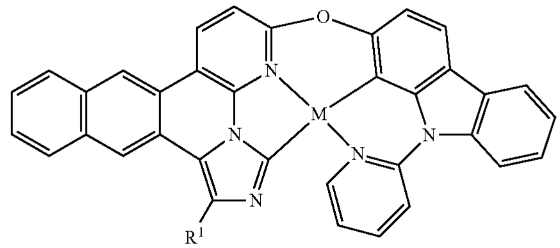
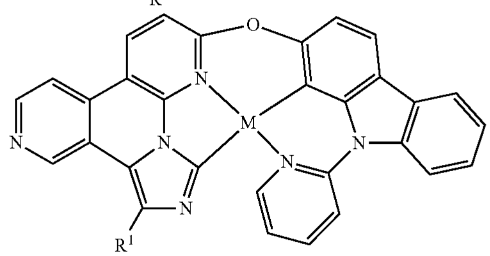
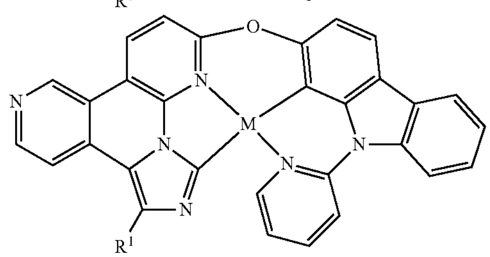
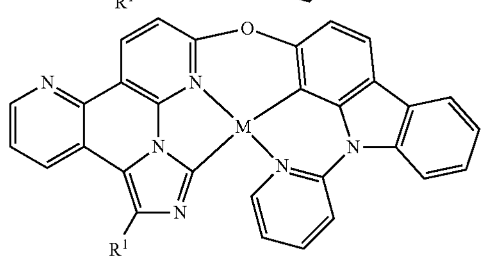
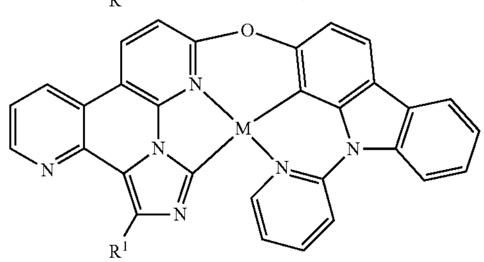

-continued
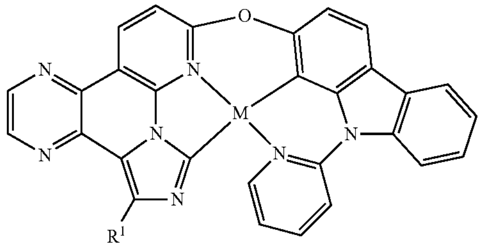
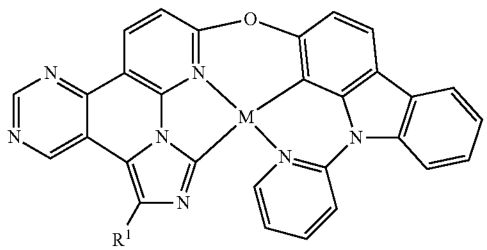
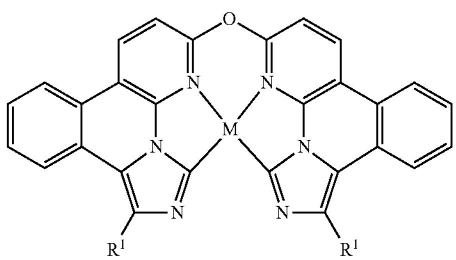
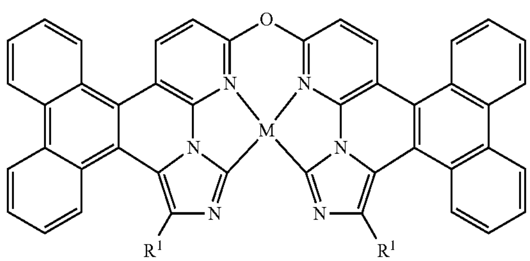
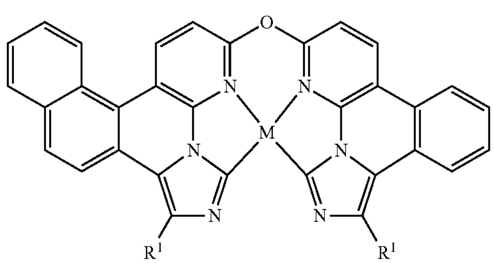
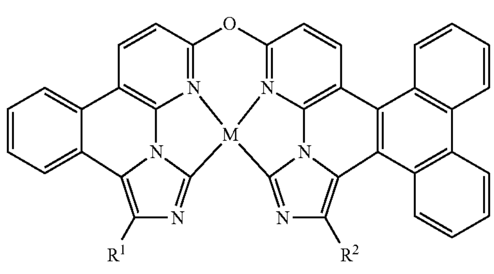
-continued
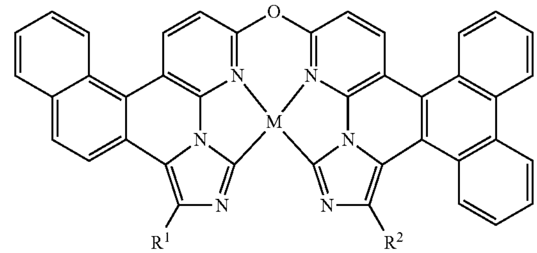
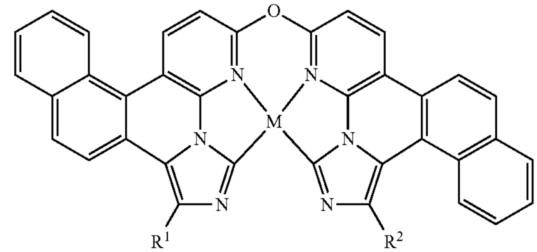
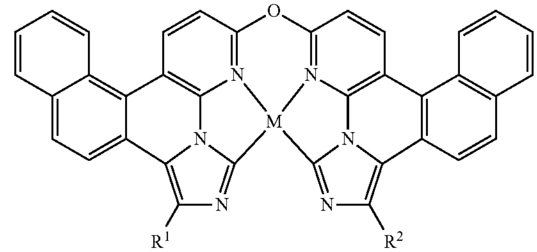
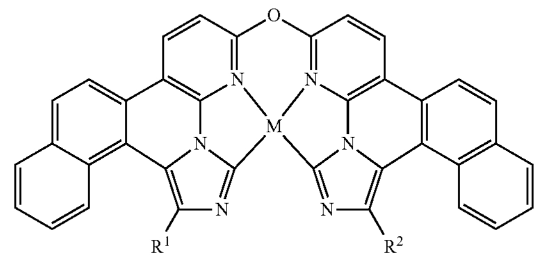
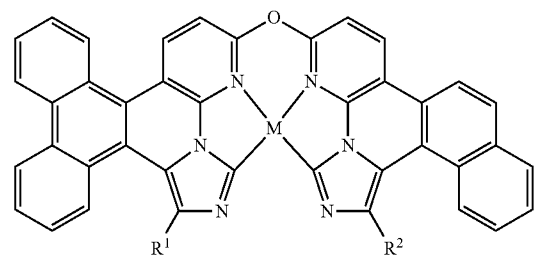
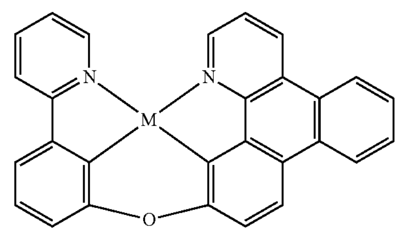
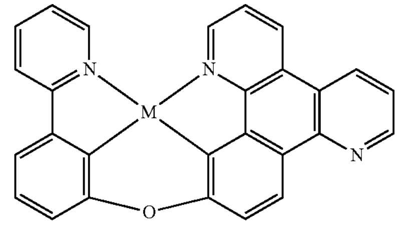

-continued
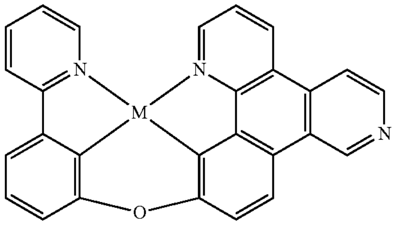
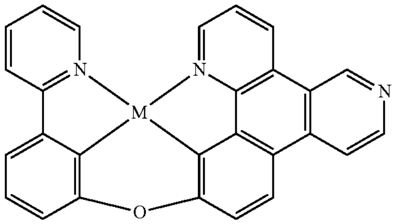
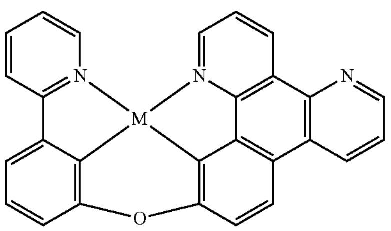
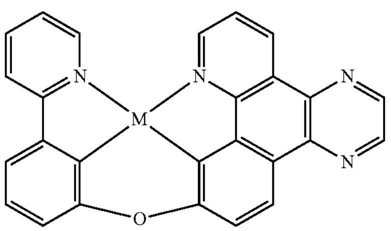
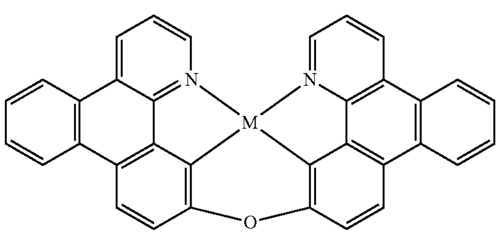
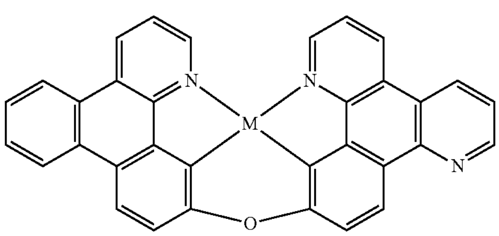
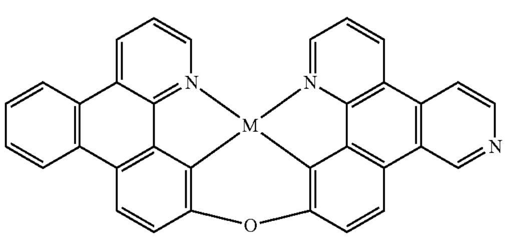
-continued
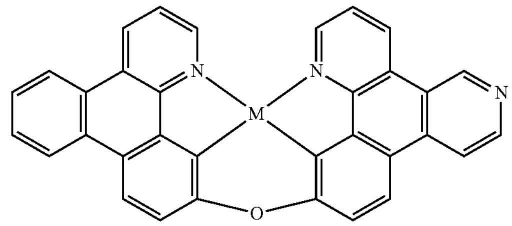
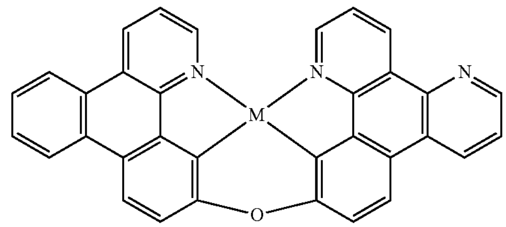
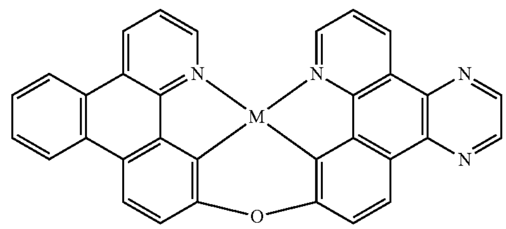
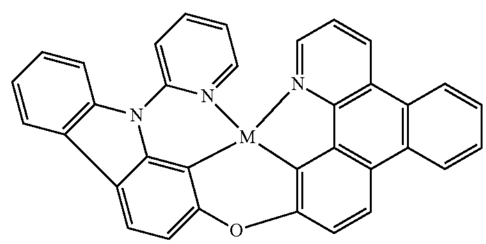
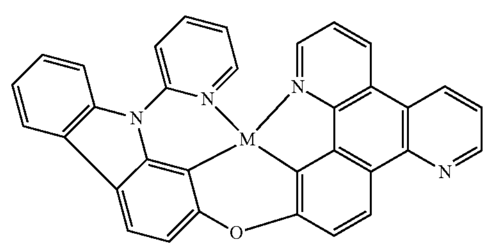
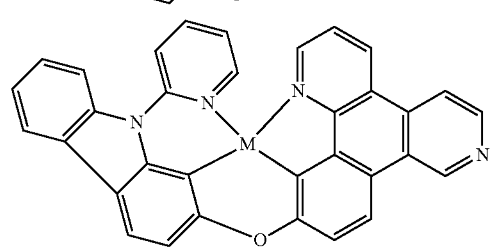
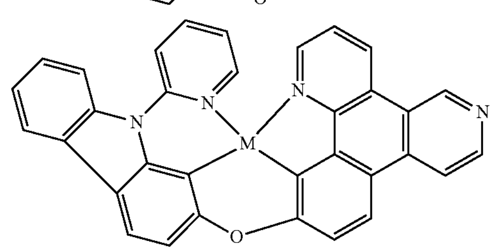

-continued
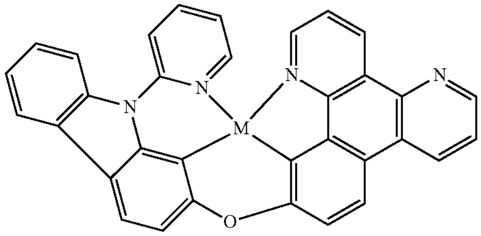
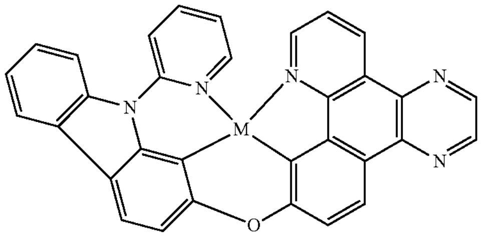
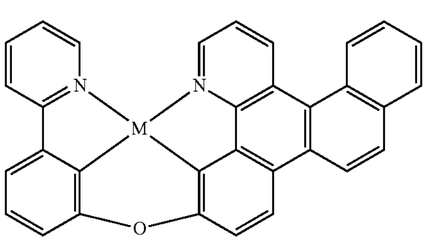
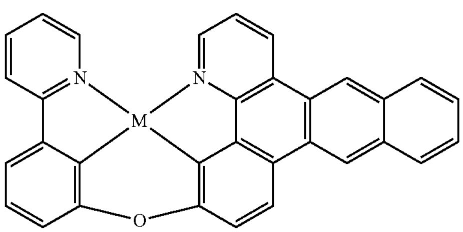
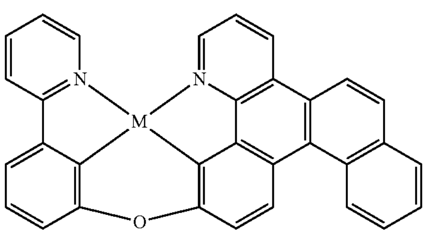
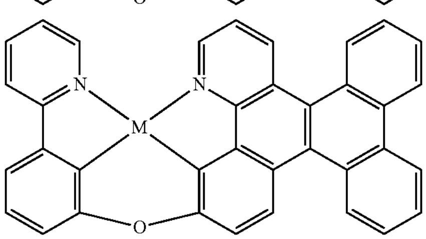
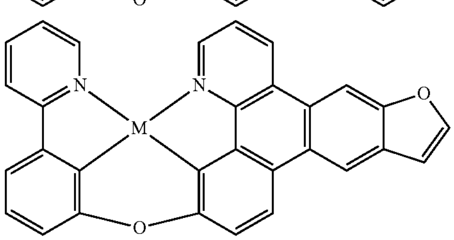
-continued
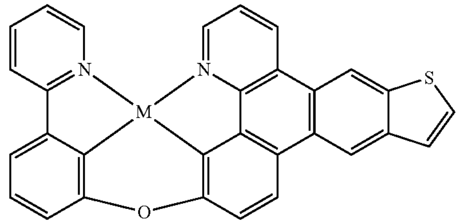
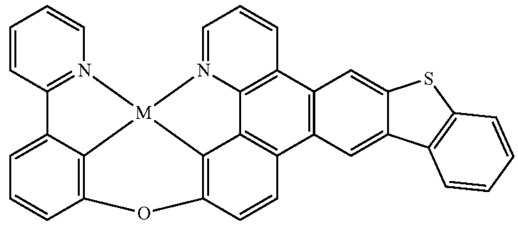
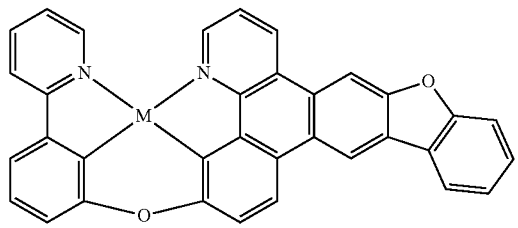
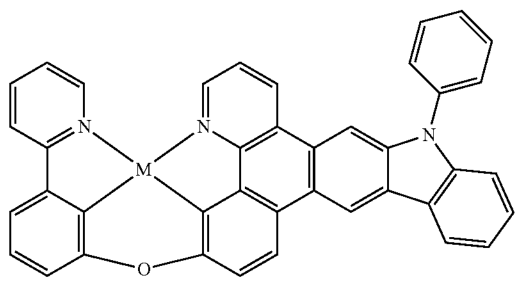
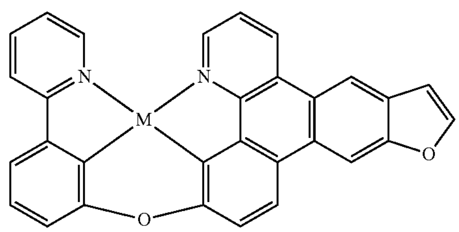
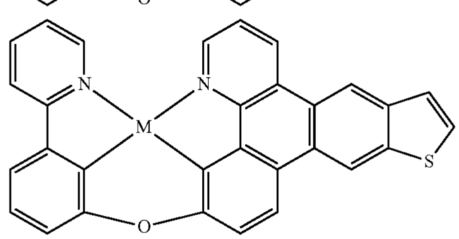
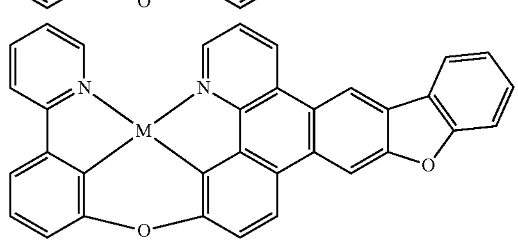

-continued

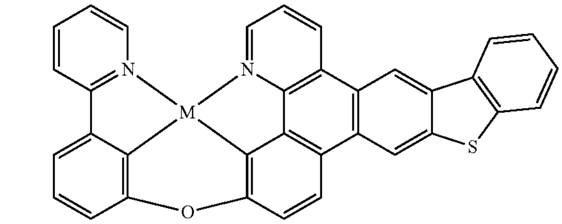

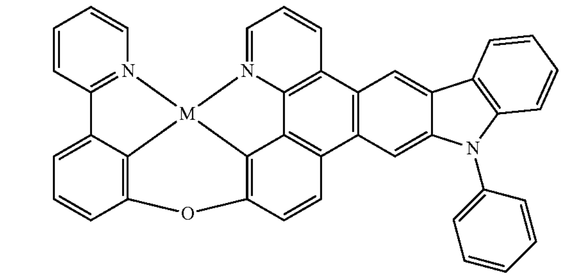

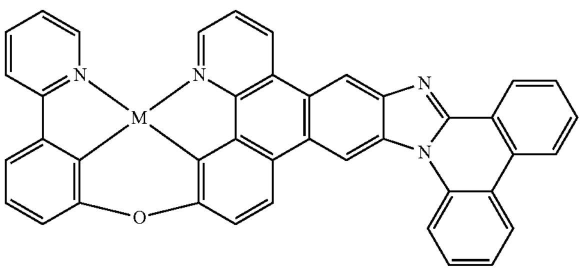

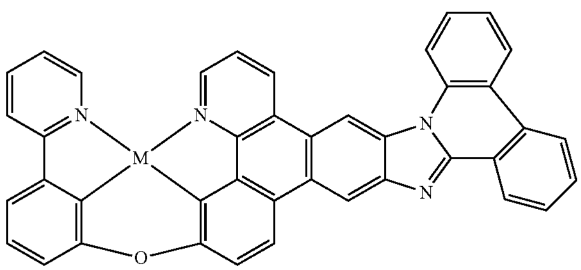

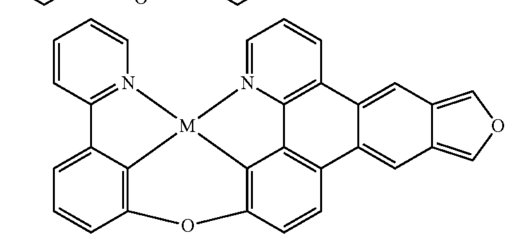

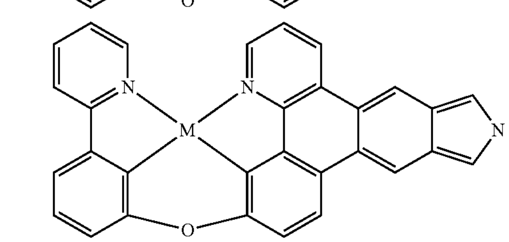

MADF emitters based on cyclic platinum (II) and palladium (II) complexes employing benzo-imidazo-phenanthridine and analogues include compounds of General Formula IV shown below.

General Formula IV

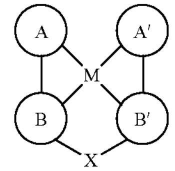

In General Formula IV:

M is Pt (II) or Pd (II)

X represents a single bond or $CR^7R^8$, C═O, $SiR^7R^8$, $GeR^7R^8$, $NR^7$, $PR^7$, $PR^7R^8$, $R^7P$═O, $AsR^7$, $R^7As$═O, O, S, S═O, $SO_2$, Se, Se═O, $SeO_2$, $BR^7$, $BR^7R^8$, $AlR^7$, $AlR^7R^8$, $R^7Bi$═O, or $BiR^7$,

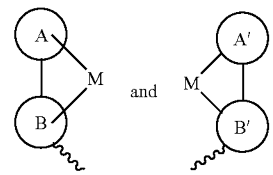

each independently represents one of the following chemical moieties:

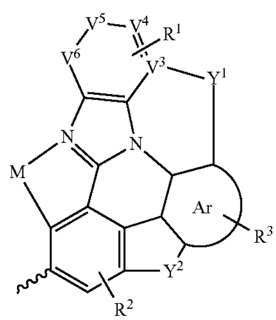

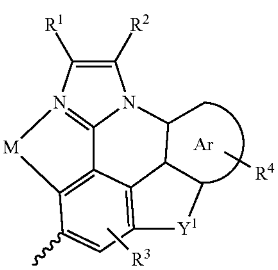

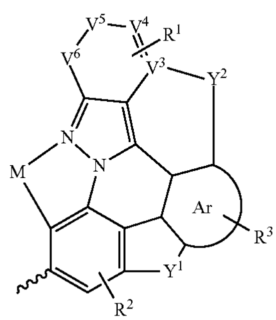

-continued
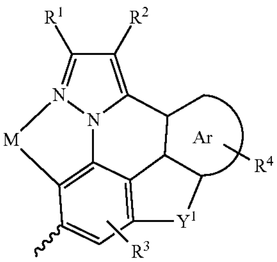
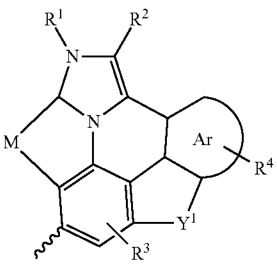
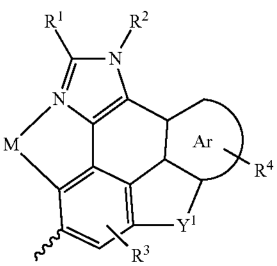
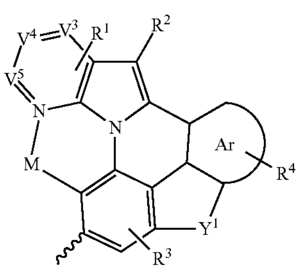
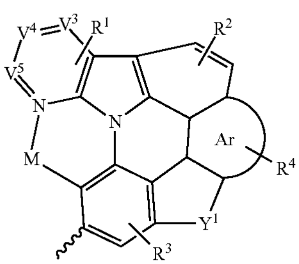
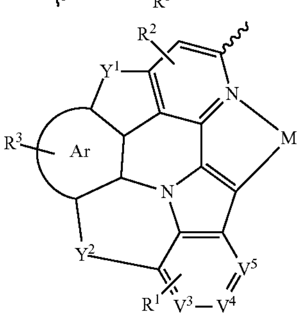
-continued
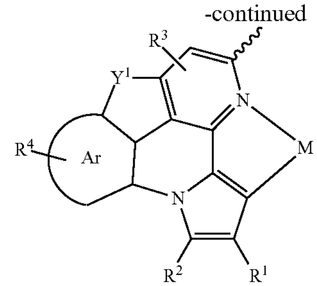
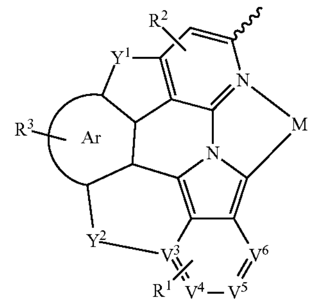
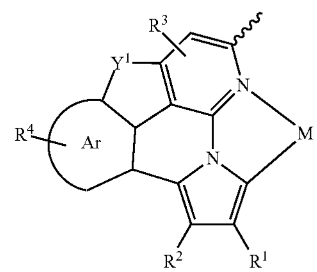
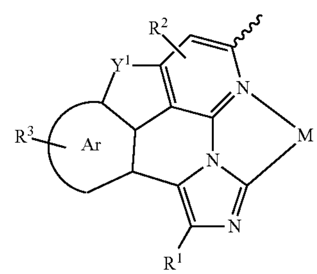
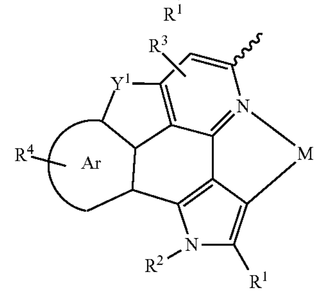
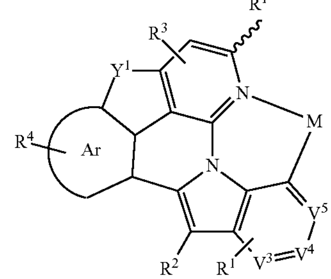

-continued
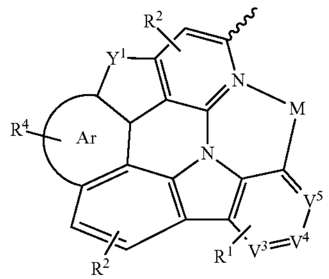
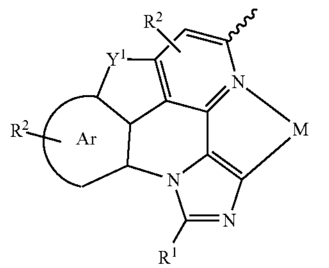
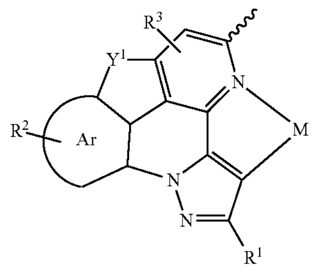
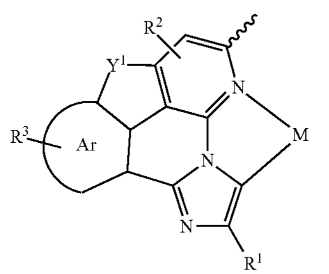
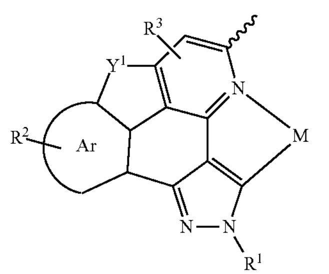
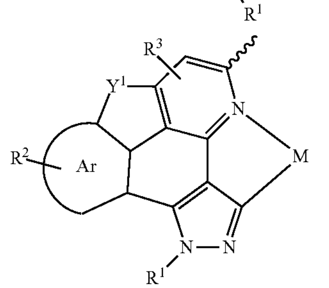
-continued
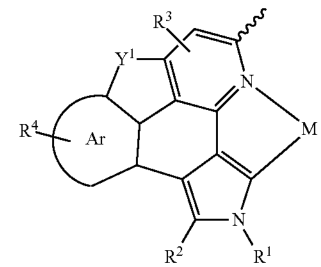
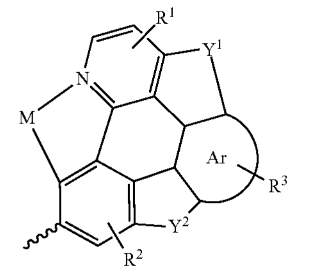
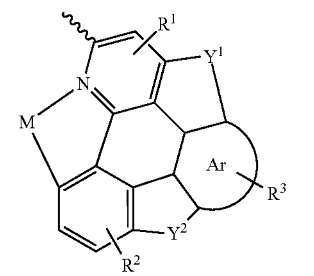
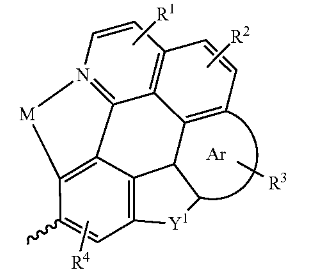
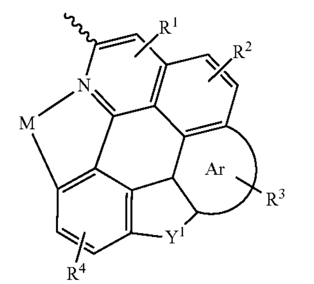
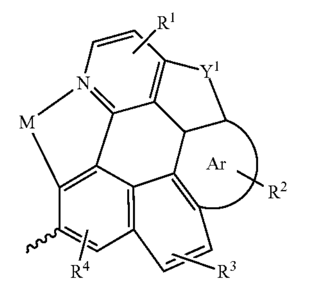

-continued
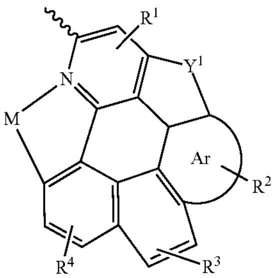
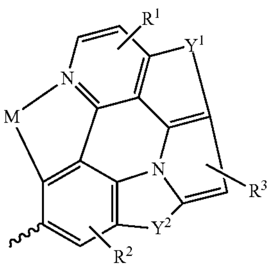
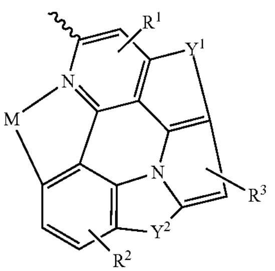
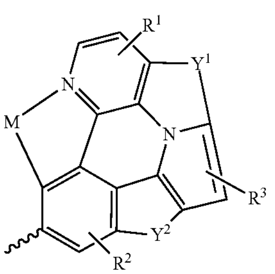
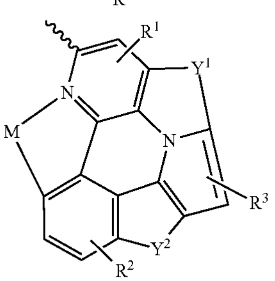
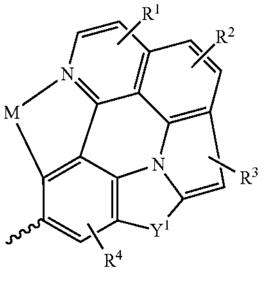
-continued
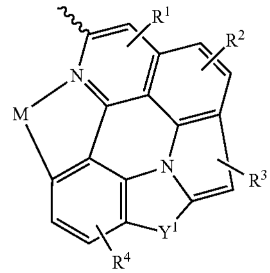
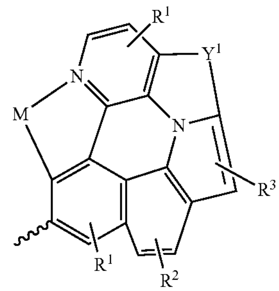
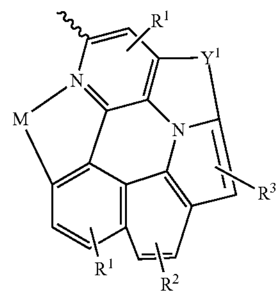
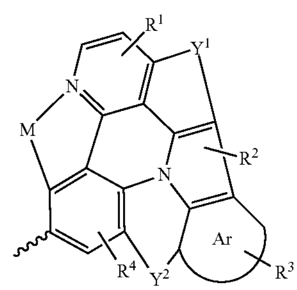
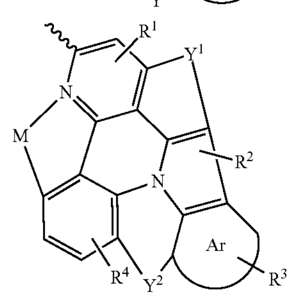
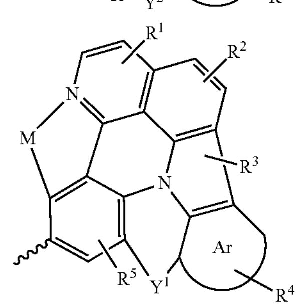

-continued
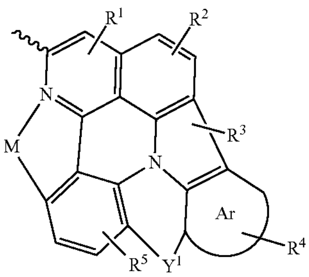
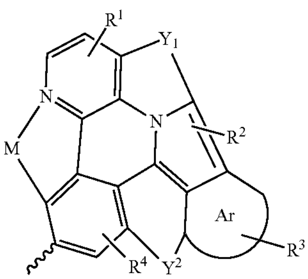
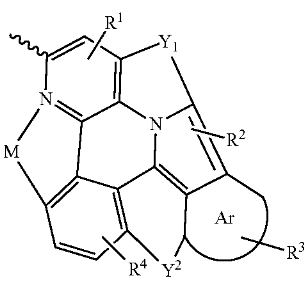
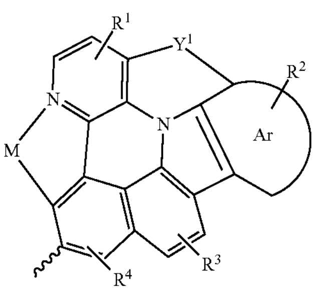
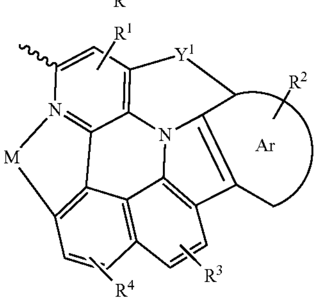
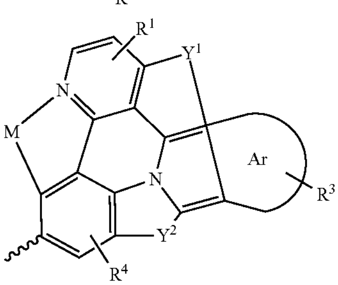
-continued
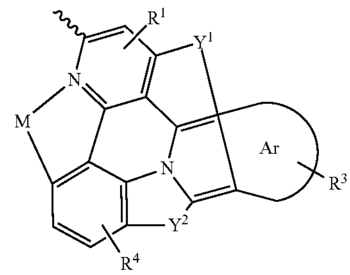
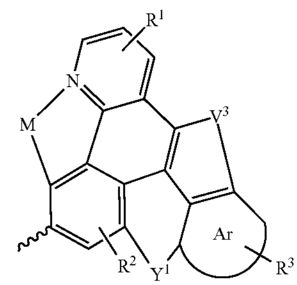
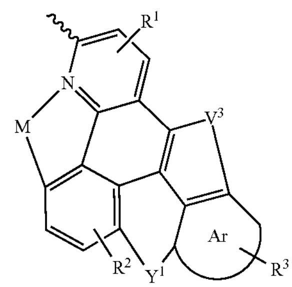
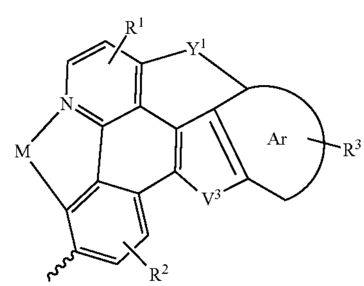
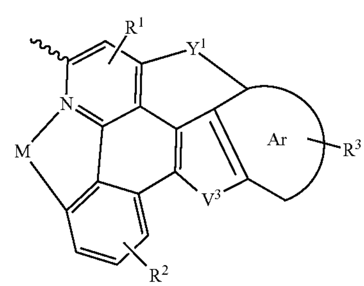
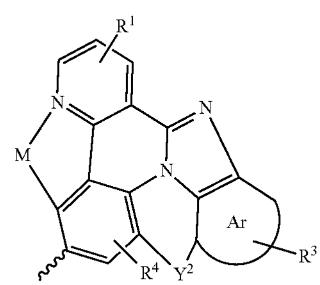

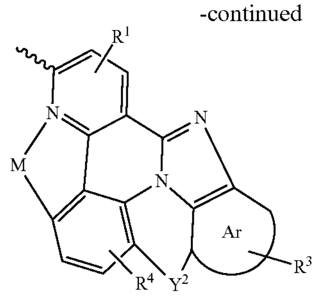
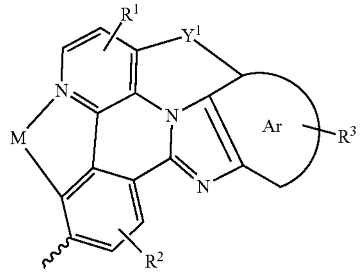
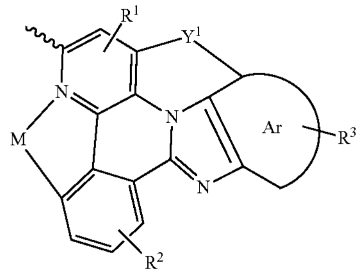
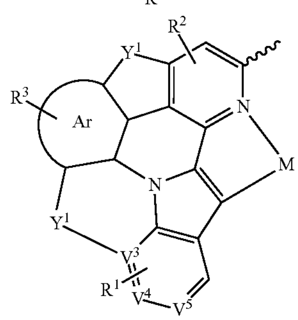
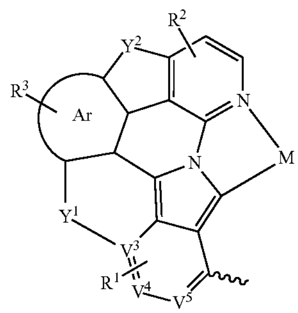
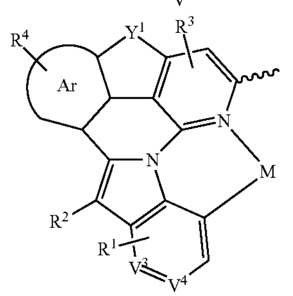
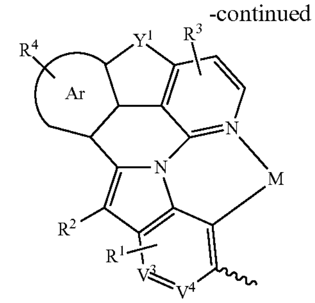
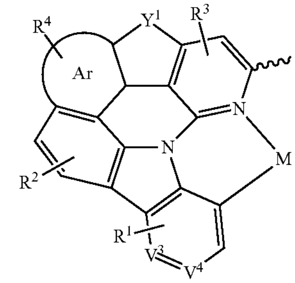
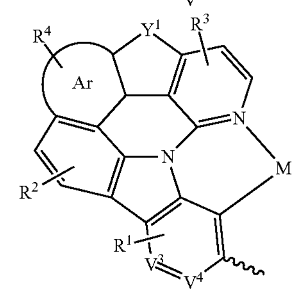
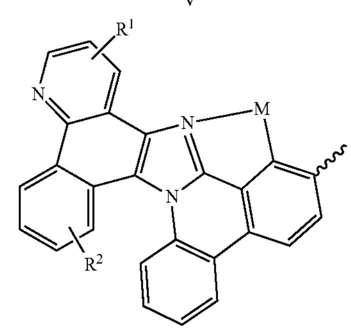
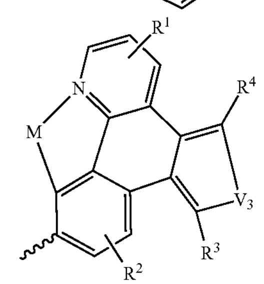
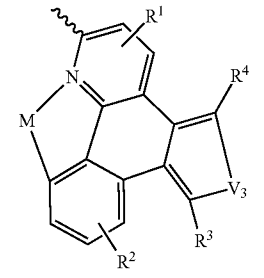

where:

N is nitrogen, each of $V^1$, $V^2$, $V^3$, $V^4$, $V^5$, and $V^6$, if present, is independently C, N, Si, O, S, Ge, P, As, Se, B, Al, or Bi, each of $X^1$, $X^2$, $Y^1$, $Y^2$, $Y^3$, and $Y^4$ is independently present or absent, and each $X^1$, $X^2$, $Y^1$, $Y^2$, $Y^3$, and $Y^4$ present independently represents C, N, Si, O, S, Ge, P, As, Se, B, Al, or Bi, or valency permitting, $CR^7$, $SiR^7$, $GeR^7$, $NR^7$, P═O, As═O, B, $BR^7$, $AlR^7$, Bi═O, $CR^7R^8$, C═O, $SiR^7R^8$, $GeR^7R^8$, $NR^7$, $PR^7$, $PR^7R^8$, $R^7P$═O, $AsR^7$, $R^7As$═O, S═O, $SO_2$, Se═O, $SeO_2$, $BR^7$, $BR^7R^8$, $AlR^7$, $AlR^7R^8$, $R^7Bi$═O, or $BiR^7$, each of $L^1$, $L^2$, $L^3$, and $L^4$ is independently present or absent, and each $L^1$, $L^2$, $L^3$, and $L^4$ present independently represents a substituted or unsubstituted aryl, heteroaryl, or N-heterocyclic carbene, each of R, $R^1$, $R^2$, $R^3$, $R^4$, $R^5$, $R^6$, $R^7$, and $R^8$ is independently absent or present as a single substituent or multiple substituents, valency permitting, and each R, $R^1$, $R^2$, $R^3$, $R^4$, $R^5$, $R^6$, $R^7$, and $R^8$ present independently represents deuterium, halogen, hydroxyl, thiol, nitro, cyanide, isocyanide, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof, and each of

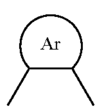

is independently present or absent, and each Ar present independently represents a substituted or unsubstituted aryl, heteroaryl, or N-heterocyclic carbene, where suitable examples of substituents include the following:

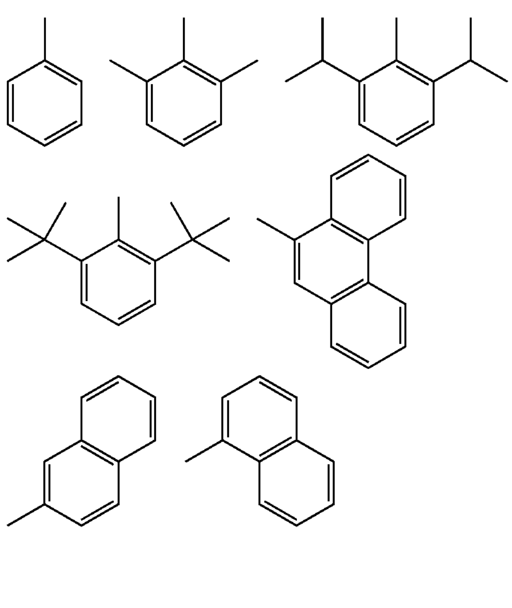

-continued

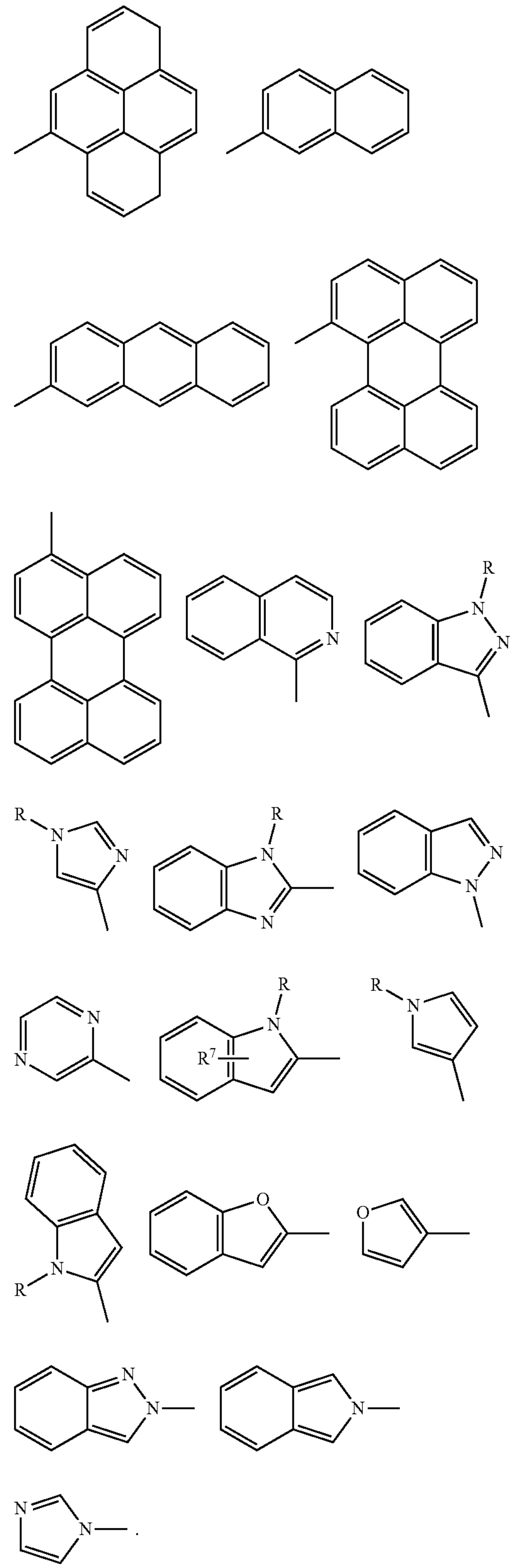

In A-B and A'-B', Ar is independently present or absent, and each Ar present independently represents a substituted or unsubstituted aryl, heteroaryl, or N-heterocyclic carbene. Suitable examples of Ar include the following:

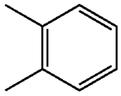
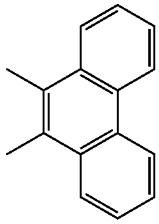
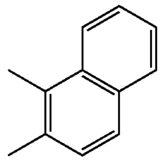
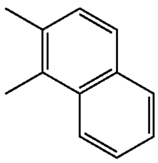
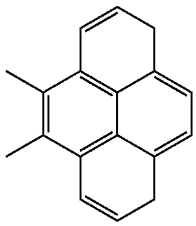
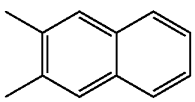
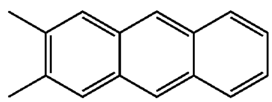
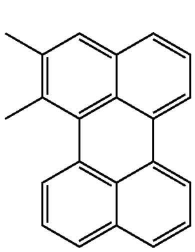
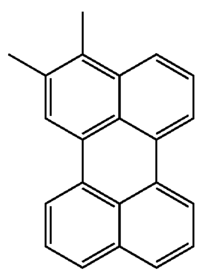
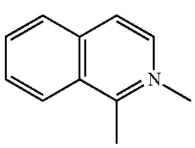
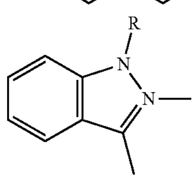
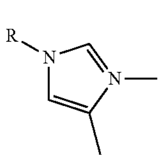
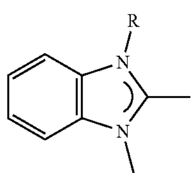
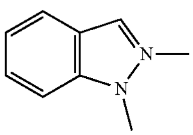
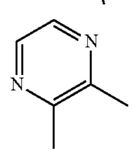
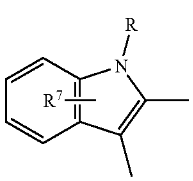
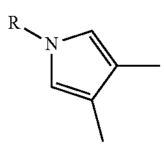
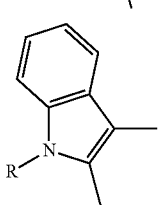
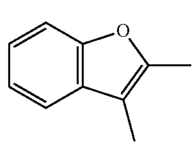
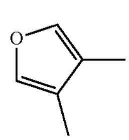
-continued
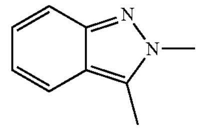
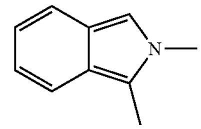
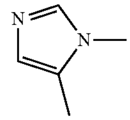
,
in which R and $R^7$ are as defined herein.
Compounds of General Formula IV are shown below.
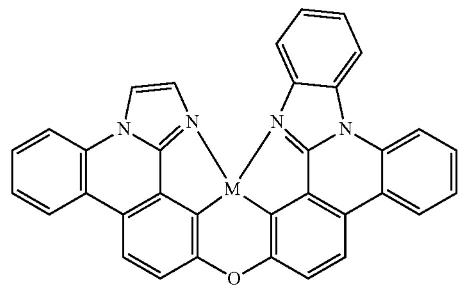
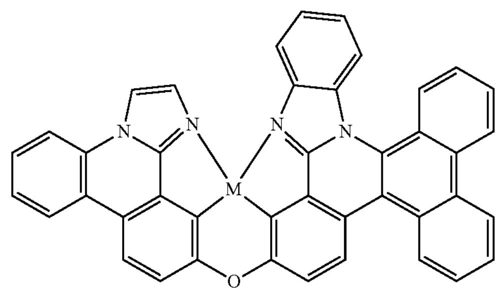
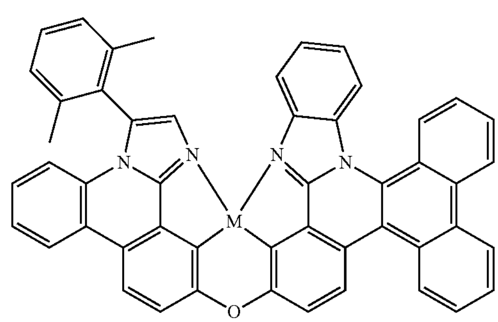
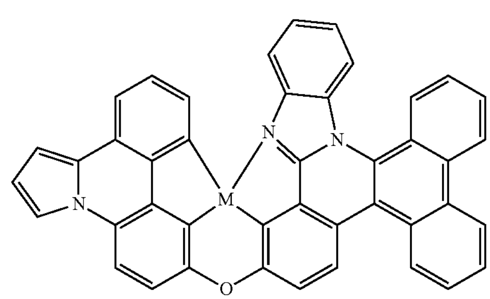

-continued
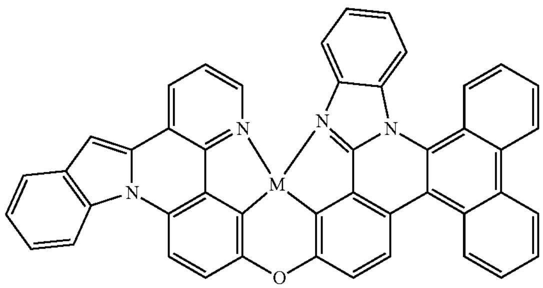
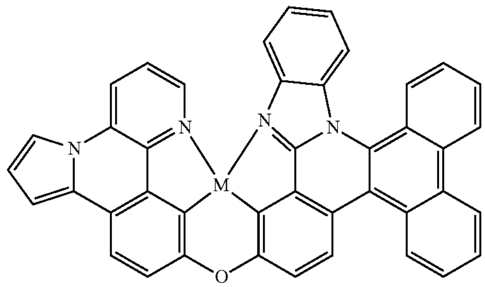
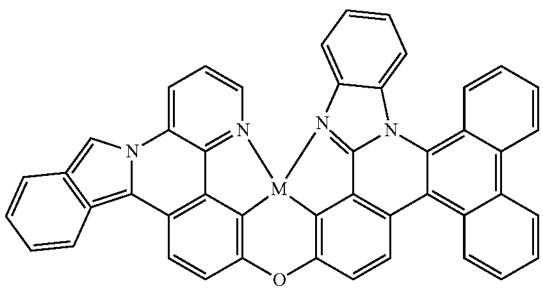
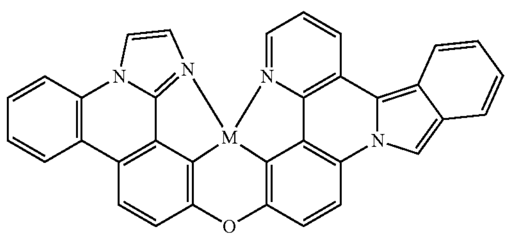
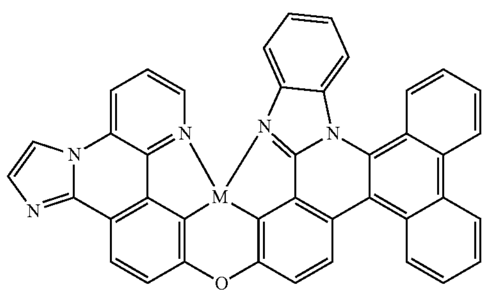
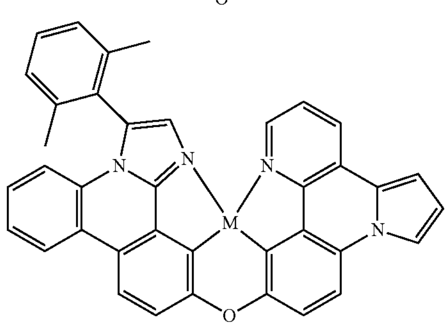
-continued
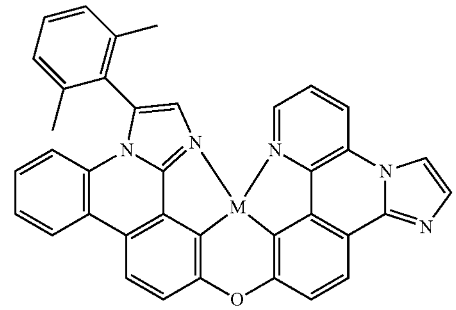
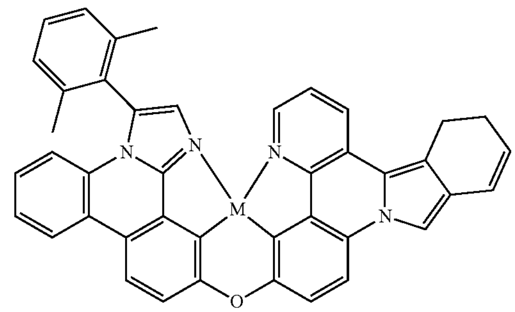
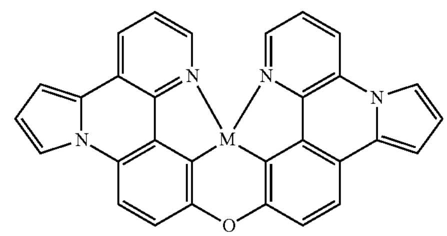
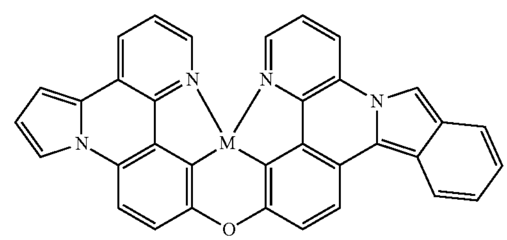
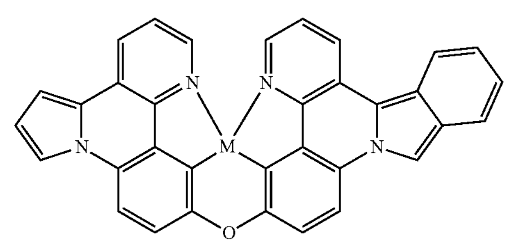
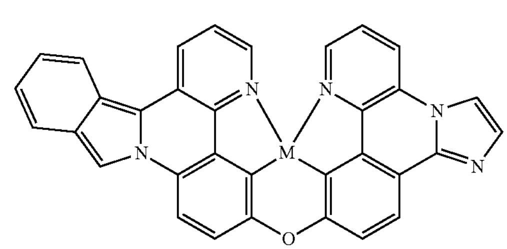

-continued
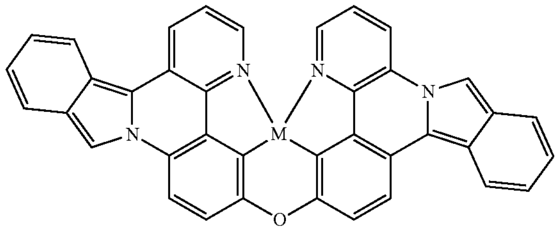
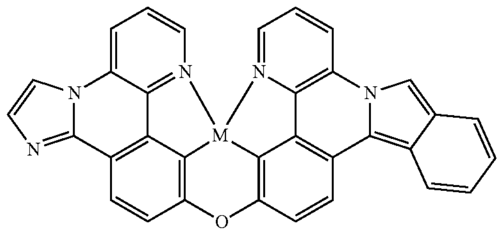
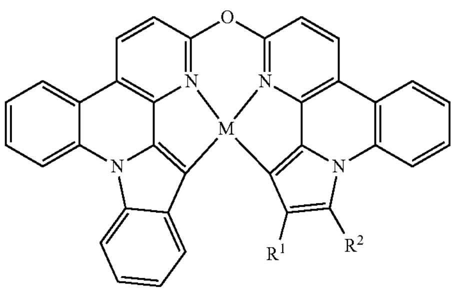
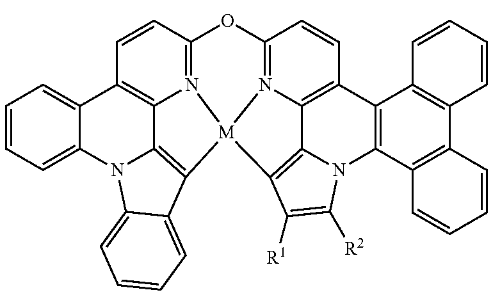
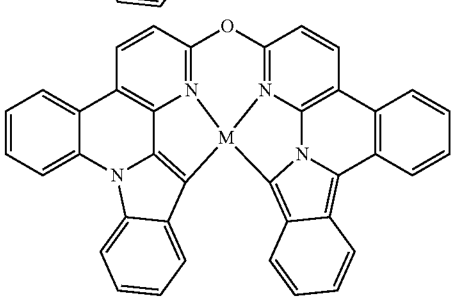
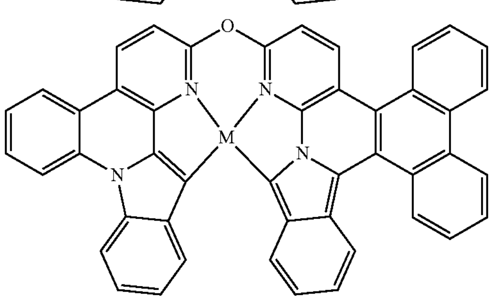
-continued
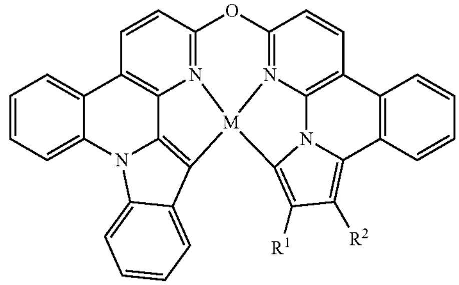
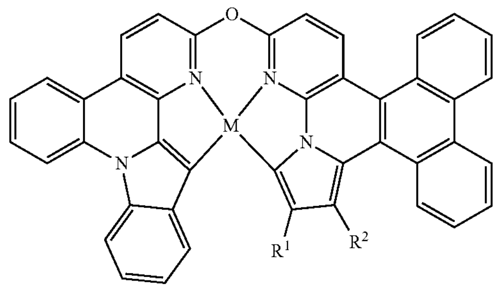
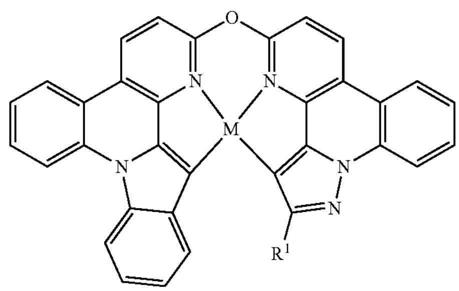
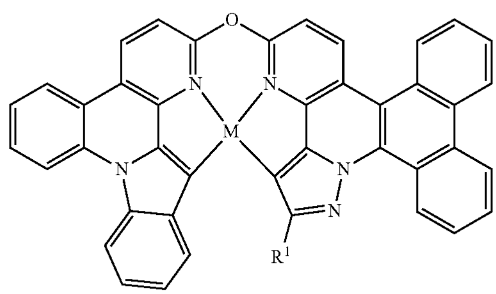
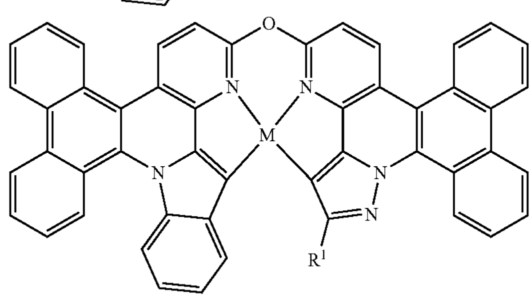
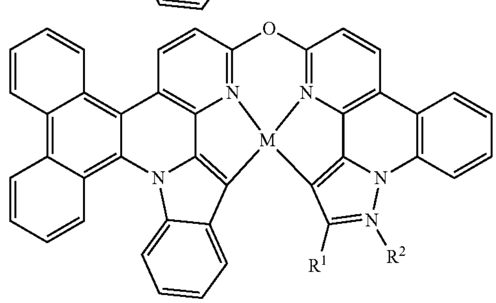

-continued
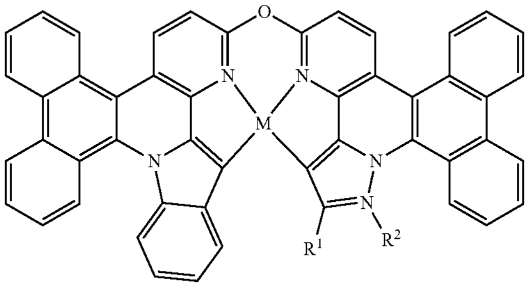
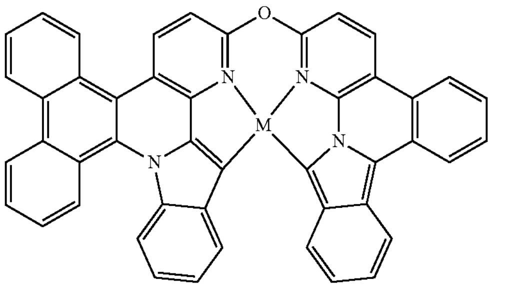
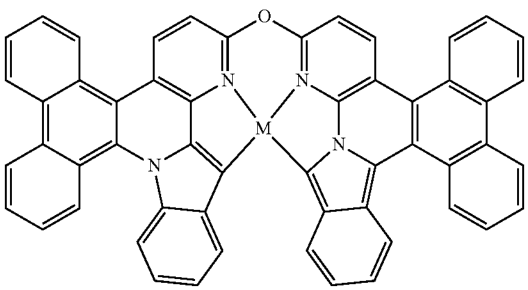
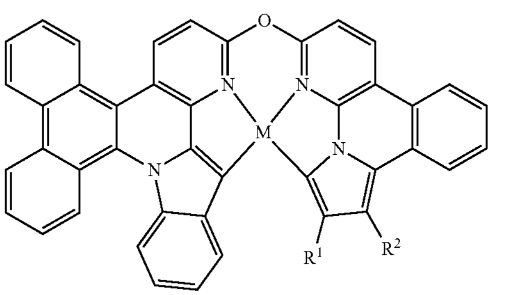
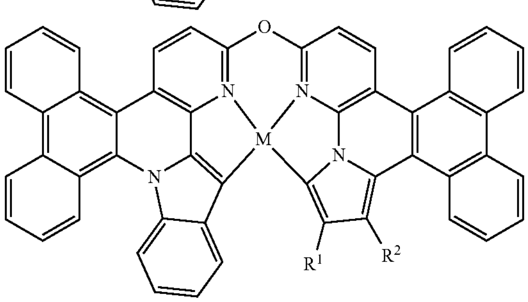
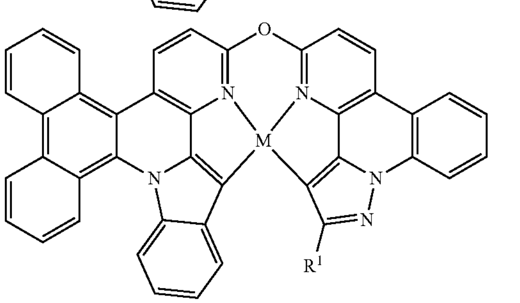
-continued
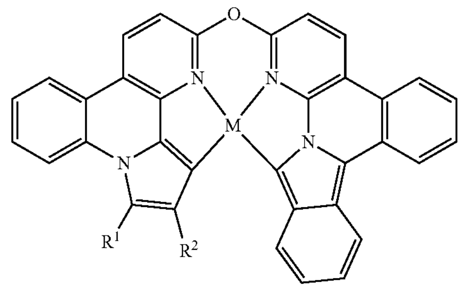
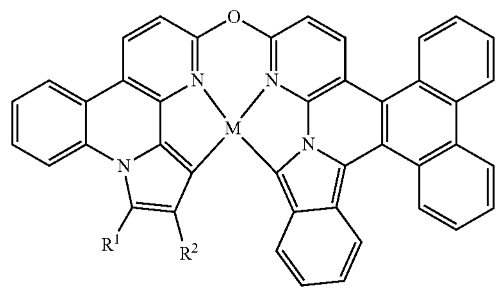
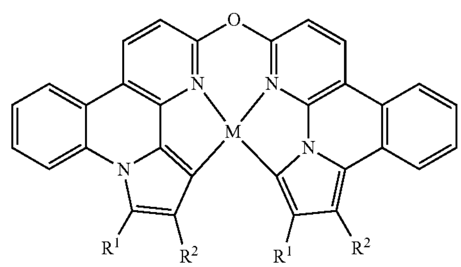
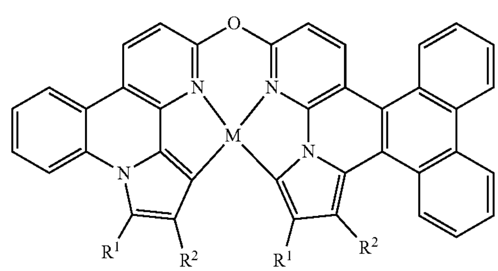
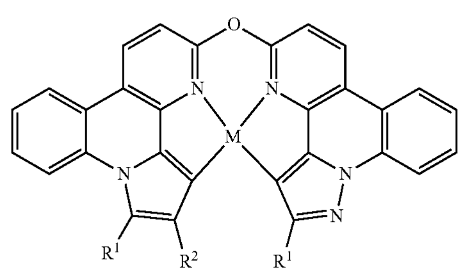
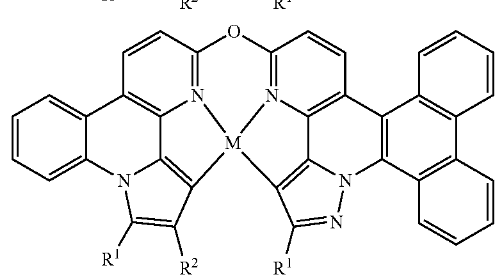

-continued
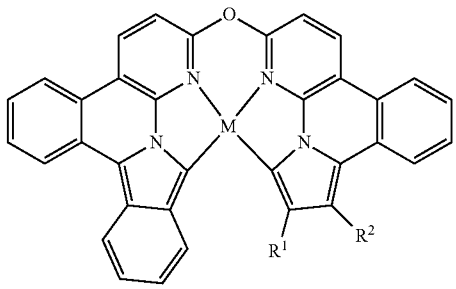
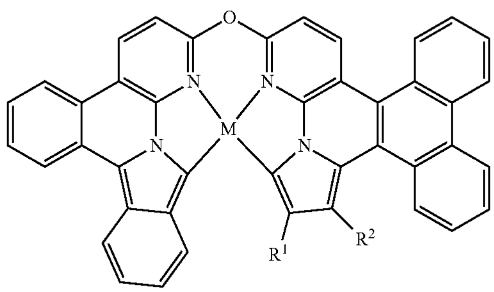
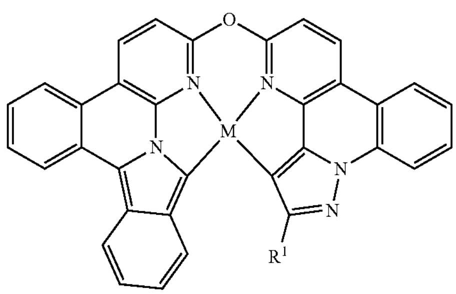
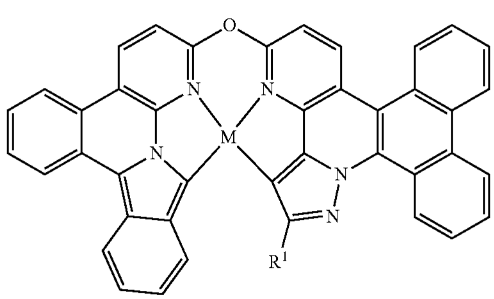
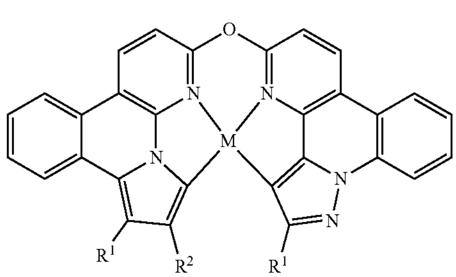
MADF emitters based on cyclic platinum (II) and palladium (II) complexes employing benzo-imidazo-phenanthridine and analogues include General Formulas V-XIII.
General Formula V
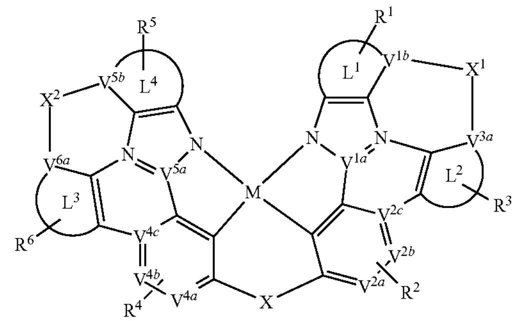
General Formula VI
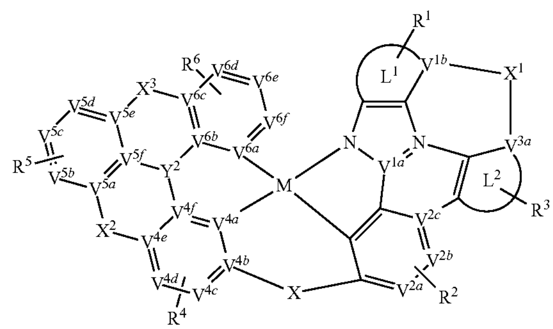
General Formula VII
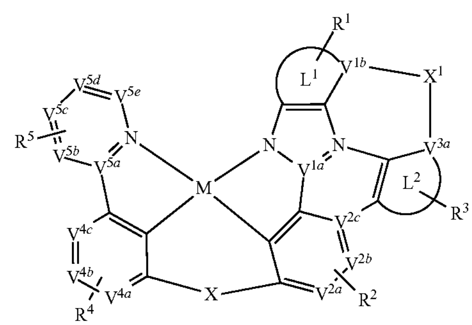
General Formula VIII
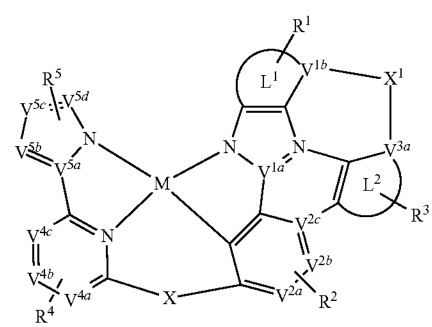

-continued

General Formula IX

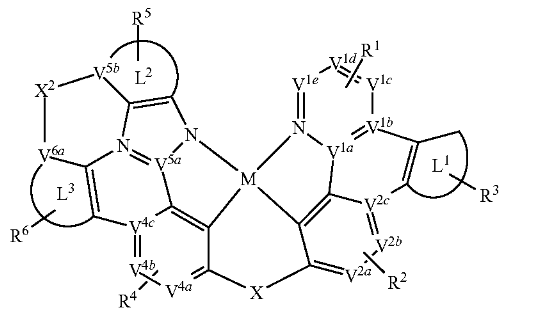

General Formula X

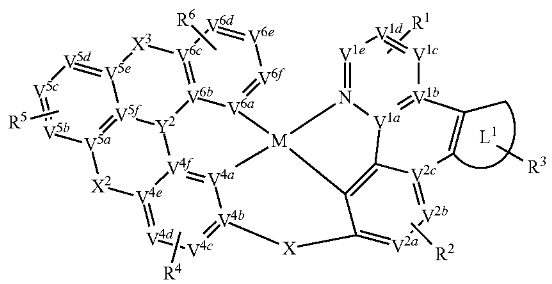

General Formula XI

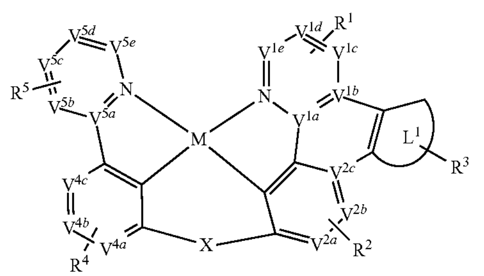

General Formula XII

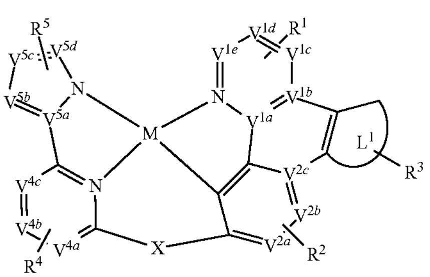

General Formula XIII

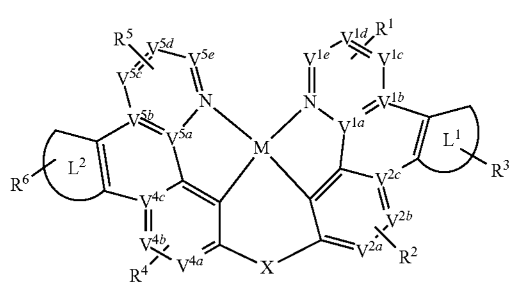

In General Formulas V-XIII:

M is Pt (II) or Pd (II),

N is nitrogen, each of $V^{1a}$-$V^{1f}$, $V^{2a}$-$V^{2f}$, $V^{3a}$-$V^{3f}$, $V^{4a}$-$V^{4f}$, $V^{5a}$-$V^{5f}$, and $V^{6a}$-$V^{6f}$, if present, is independently N, C, P, O, S, or Si, each of X, $X^1$, $X^2$, $X^3$, and $X^4$ is independently present or absent, and each X, $X^1$, $X^2$, $X^3$, and $X^4$ present independently represents a single bond, $CR^7R^8$, C═O, $SiR^7R^8$, $GeR^7R^8$, $NR^7$, $PR^7$, $PR^7R^8$, $R^7P$═O, $AsR^7$, $R^7As$═O, O, S, S═O, $SO_2$, Se, Se═O, $SeO_2$, $BR^7$, $BR^7R^8$, $AlR^7$, $AlR^7R^8$, $R^7Bi$═O, or $BiR^7$, each of $Y^1$ and $Y^2$ is independently CR, SiR, GeR, N, NR, P, P═O, As, As═O, B, BR, Al, AlR, Bi═O, or Bi, each of $L^1$, $L^2$, $L^3$, and $L^4$ is independently present or absent, and each $L^1$, $L^2$, $L^3$, and $L^4$ present independently represents a substituted or unsubstituted aryl, heteroaryl, or N-heterocyclic carbene, each of R, $R^1$, $R^2$, $R^3$, $R^4$, $R^5$, $R^6$, $R^7$, and $R^8$ is independently absent or present as a single substituent or multiple substituents, valency permitting, and each R, $R^1$, $R^2$, $R^3$, $R^4$, $R^5$, $R^6$, $R^7$, and $R^8$ present independently represents deuterium, halogen, hydroxyl, thiol, nitro, cyanide, isocyanide, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof.

Compounds of General Formulas V-XIII include the following.

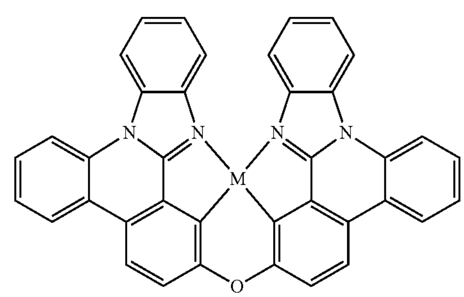

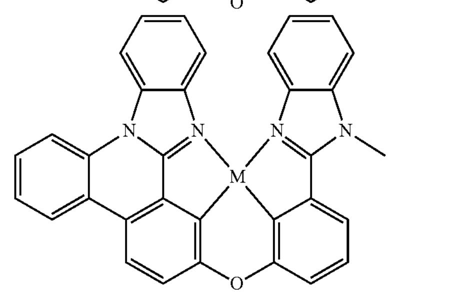

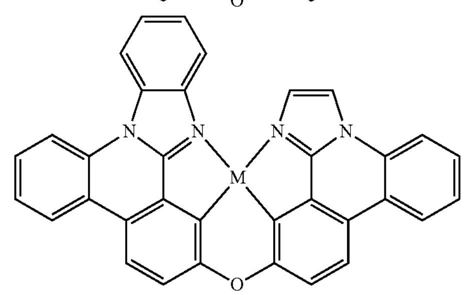

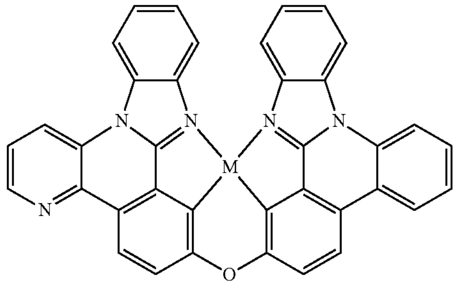
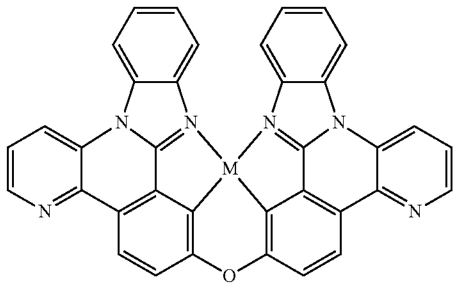
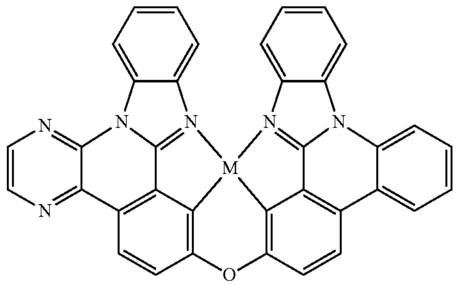
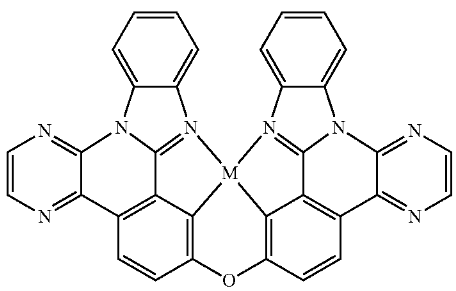
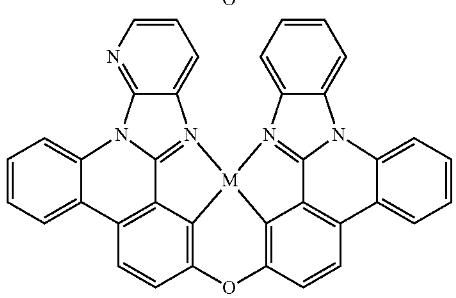
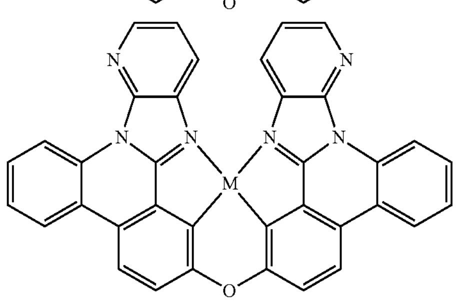
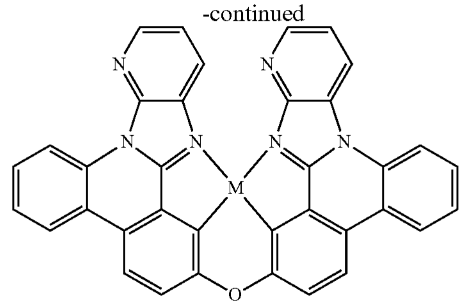
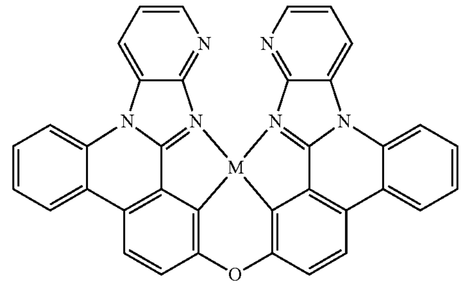
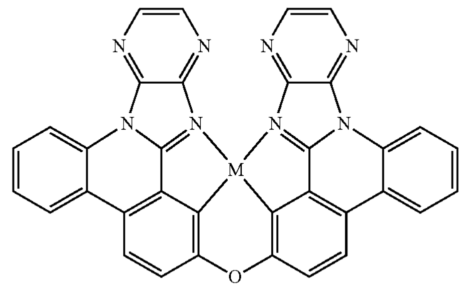
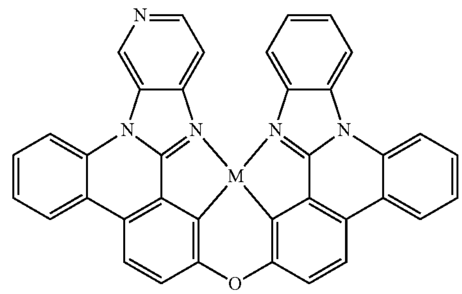
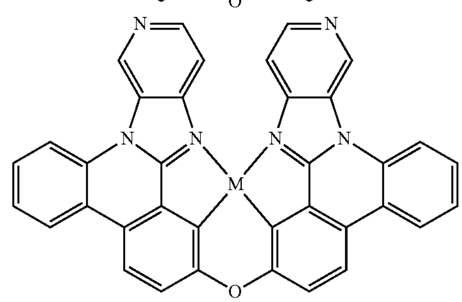
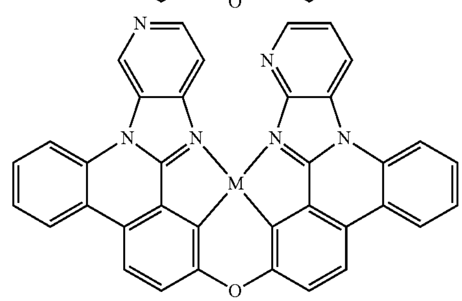

-continued
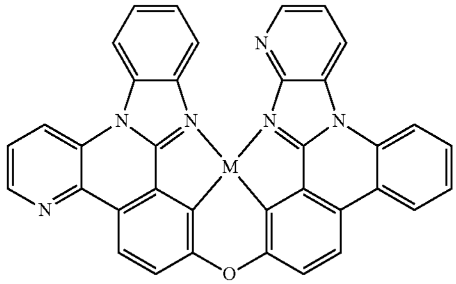
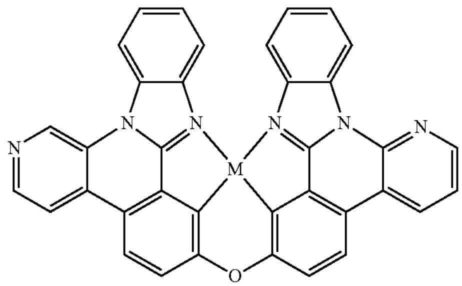
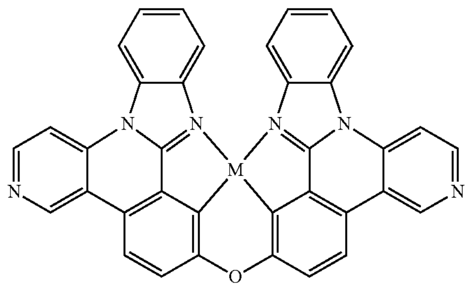
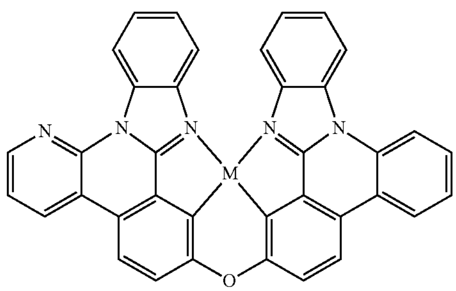
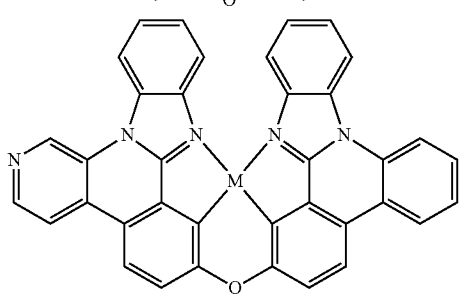
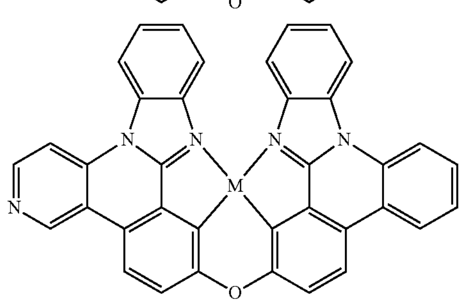
-continued
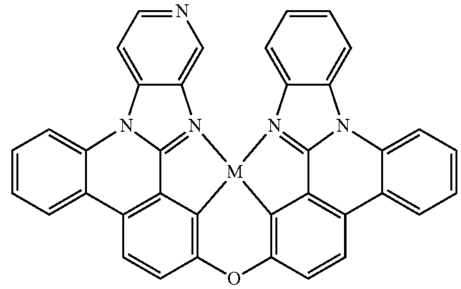
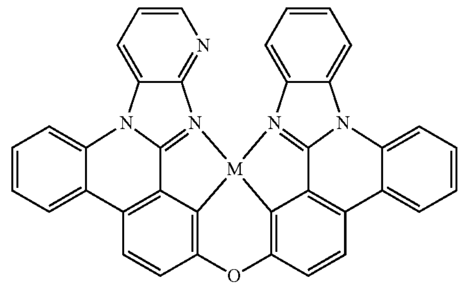
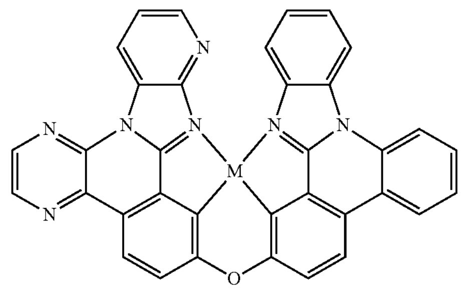
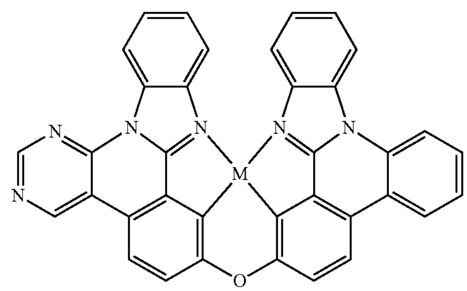
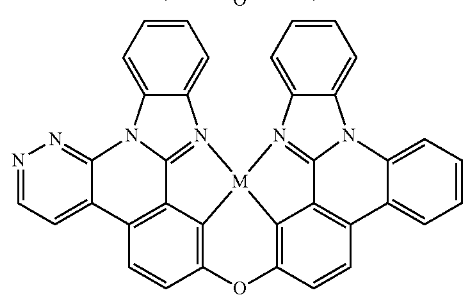
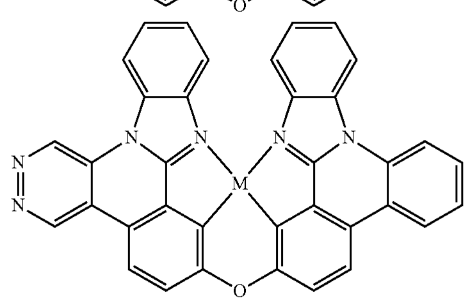

-continued
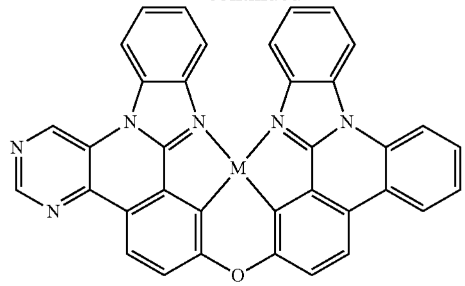
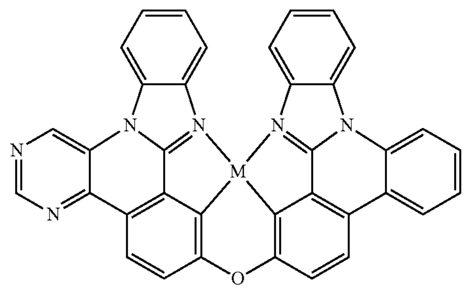
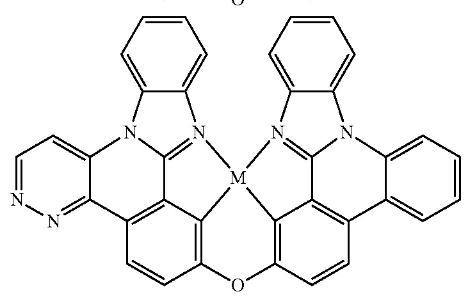
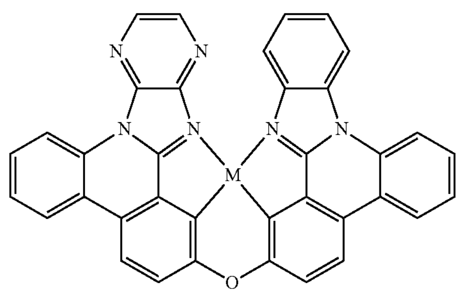
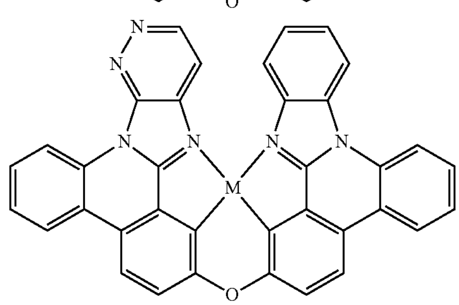
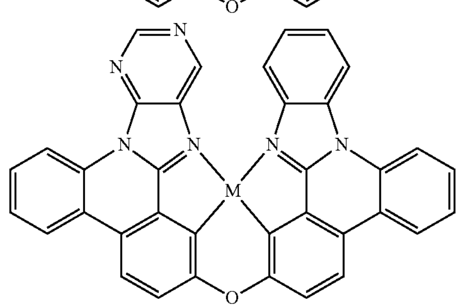
-continued
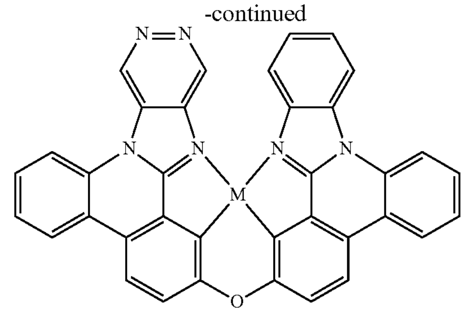
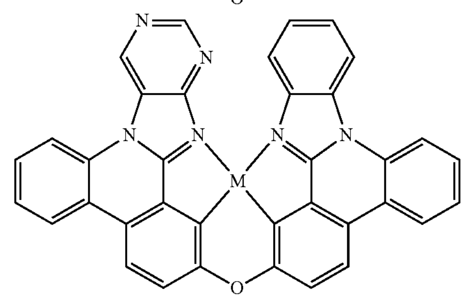
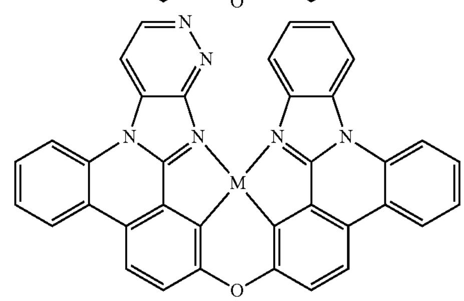
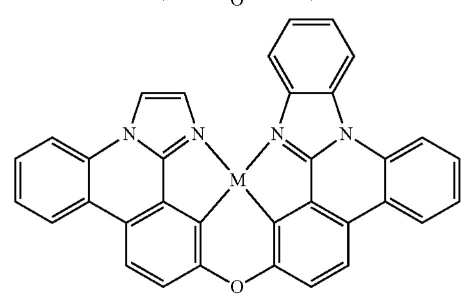
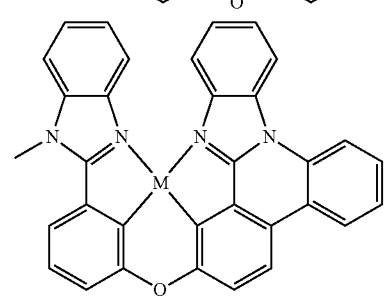
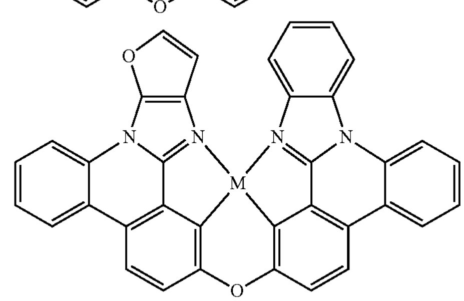

-continued
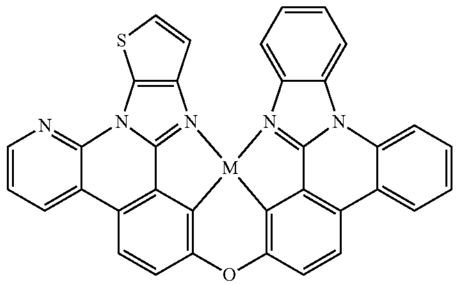
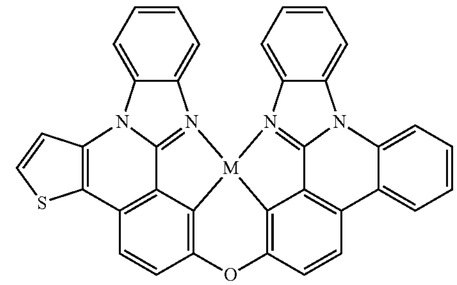
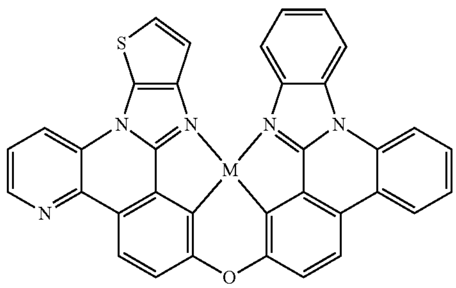
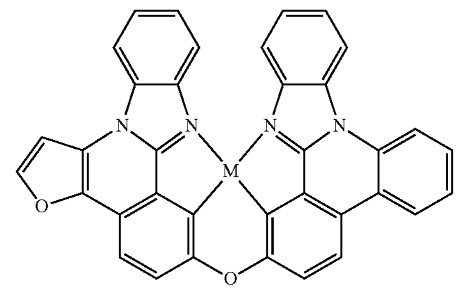
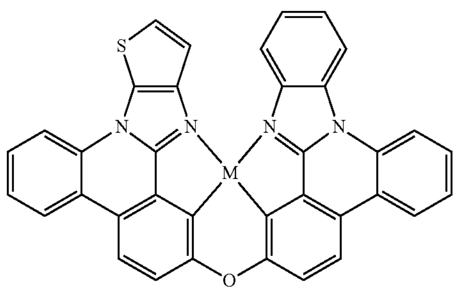
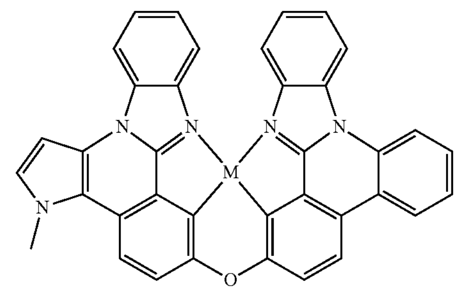
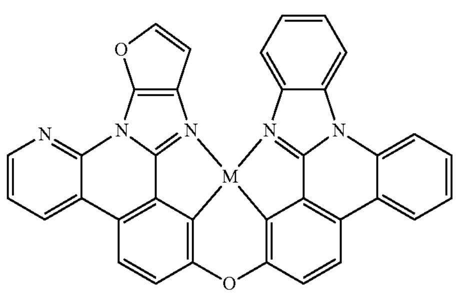
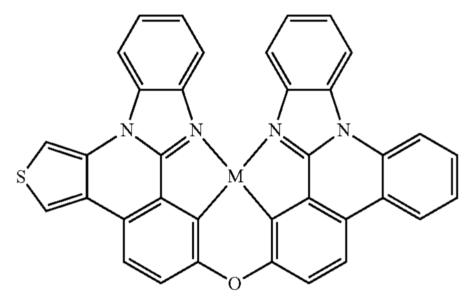
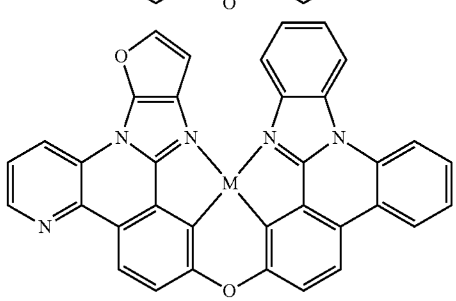
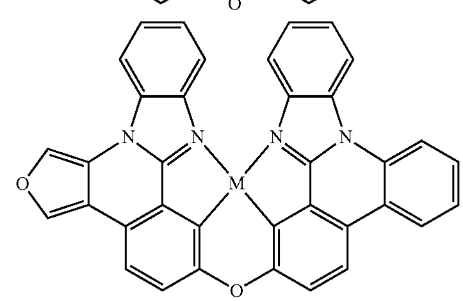
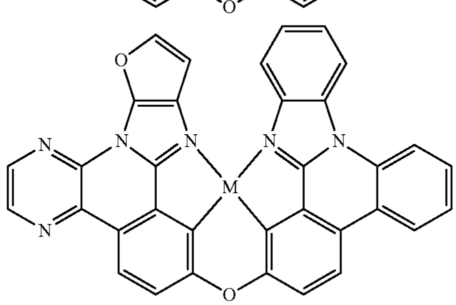
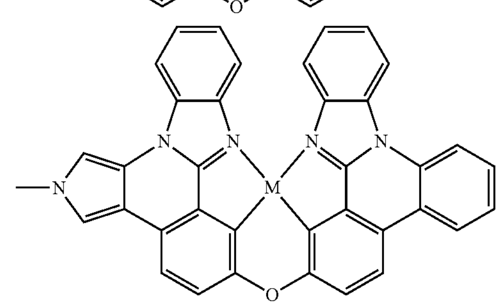
-continued -continued
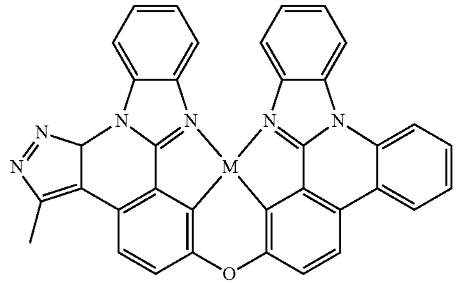
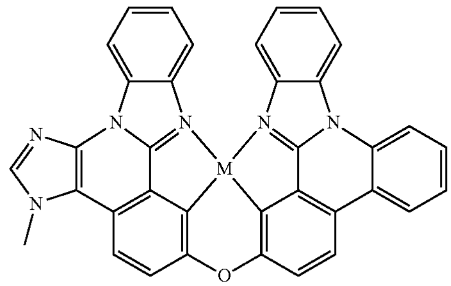
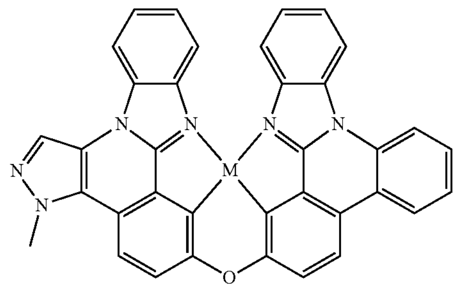
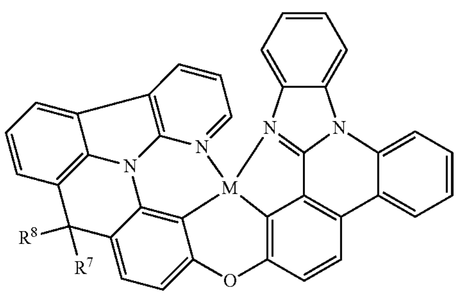
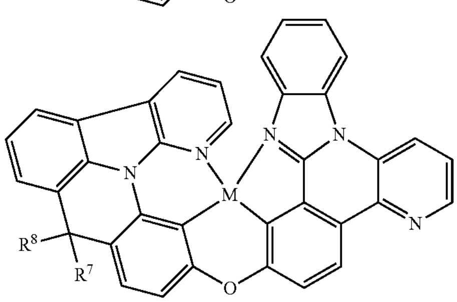
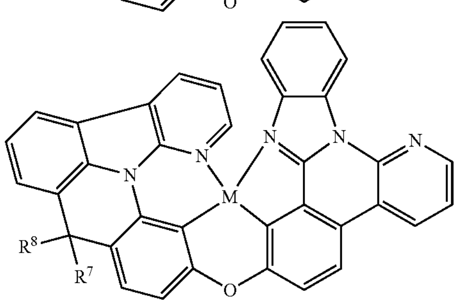
-continued
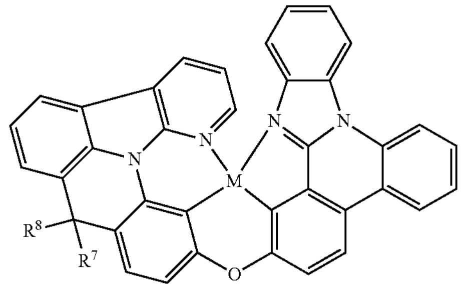
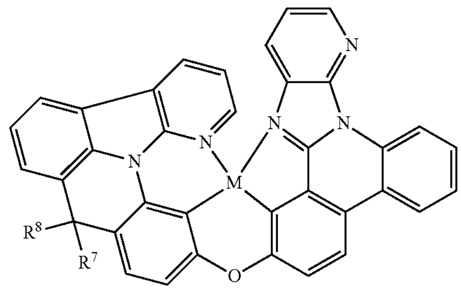
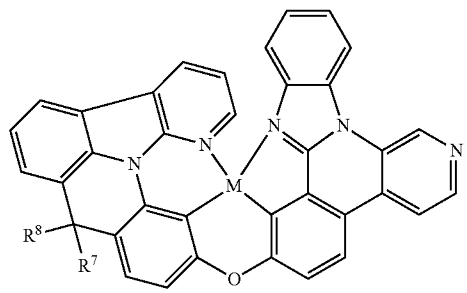
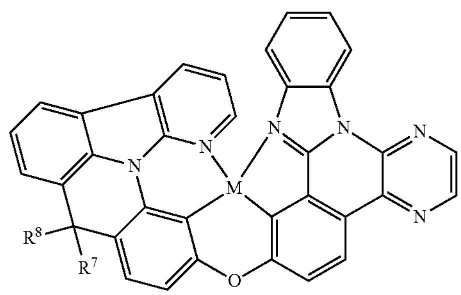
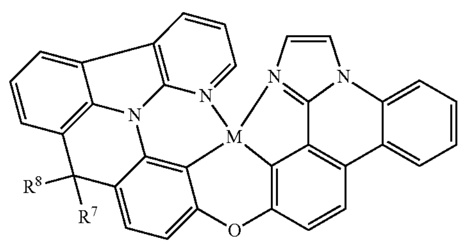
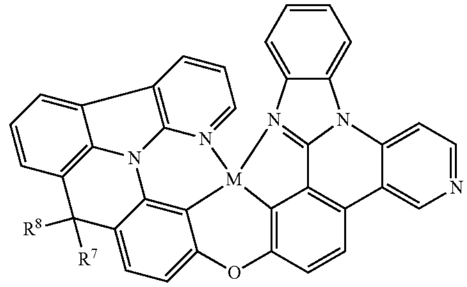

-continued
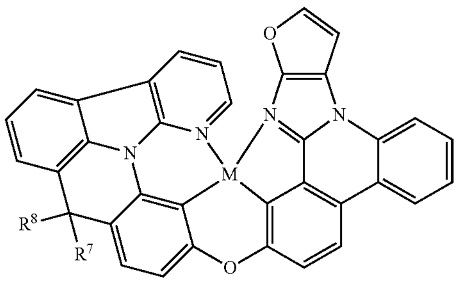
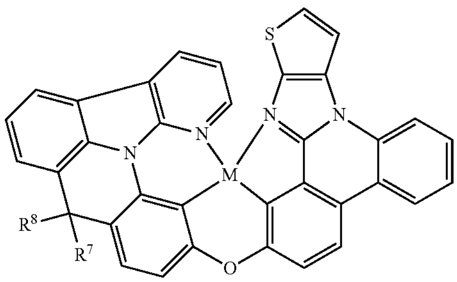
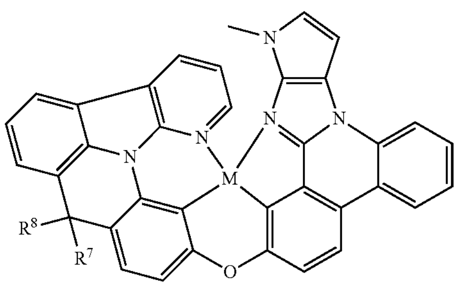
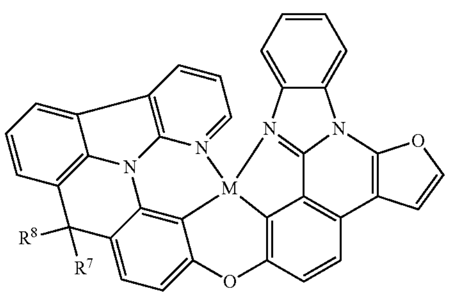
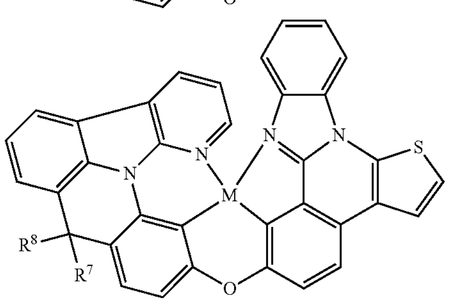
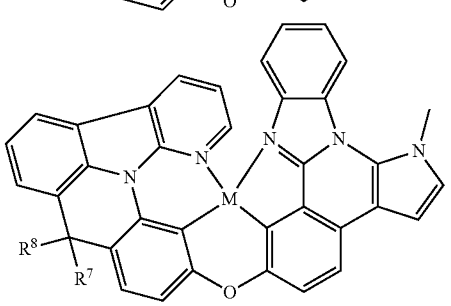
-continued
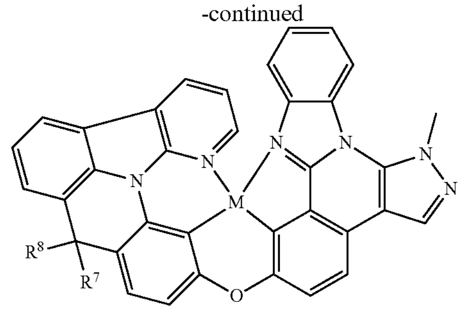
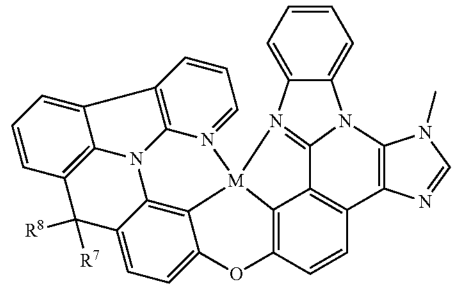
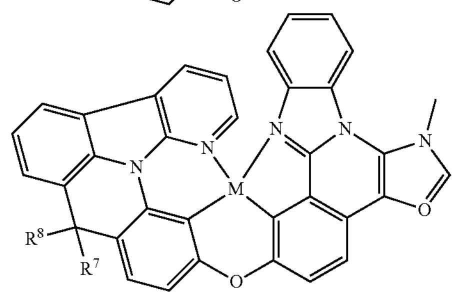
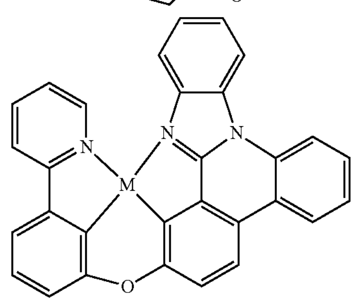
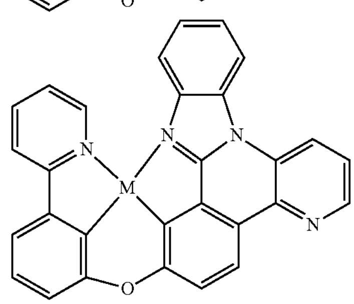
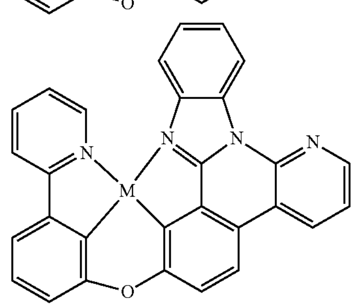

-continued
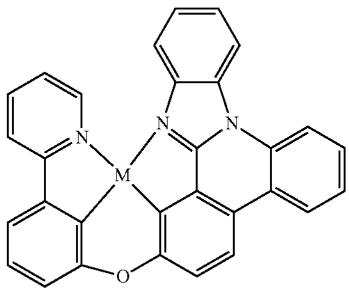
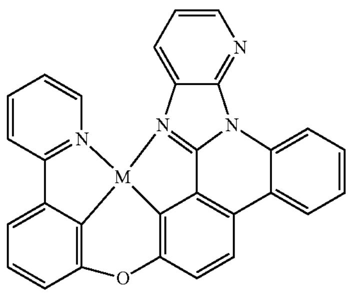
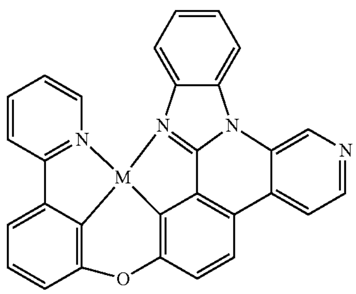
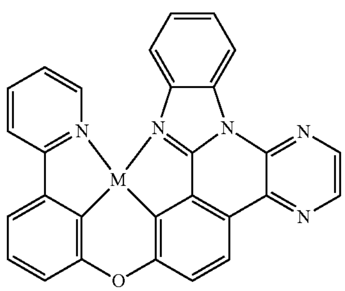
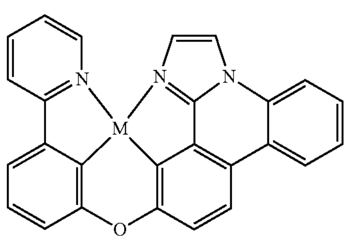
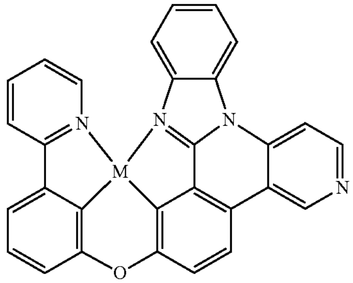
-continued
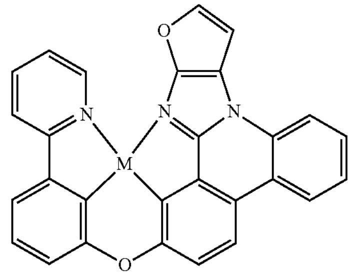
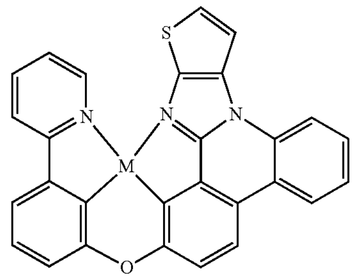
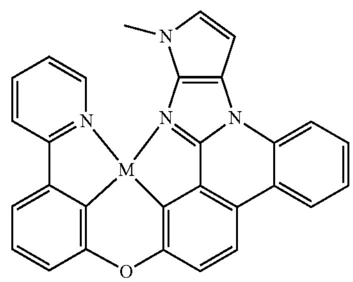
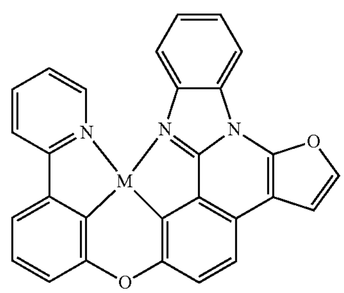
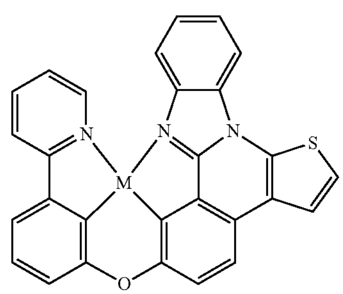
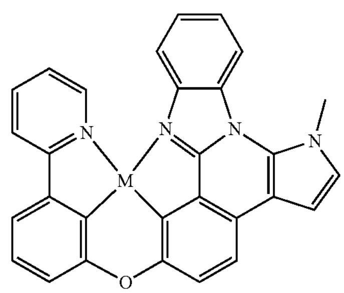

-continued
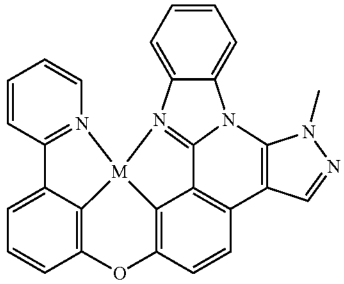
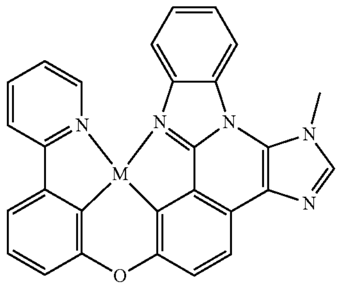
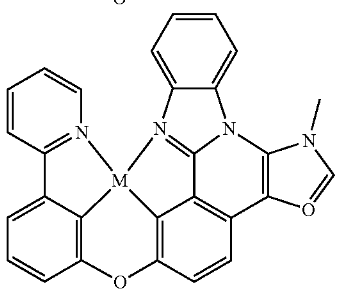
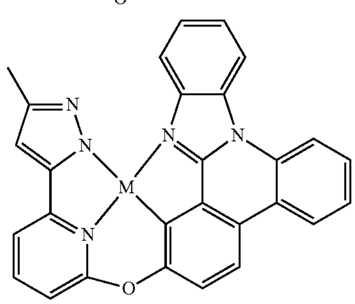
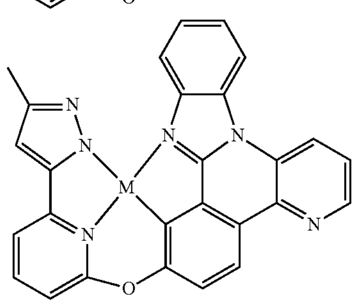
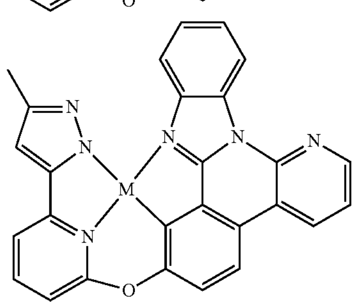
-continued
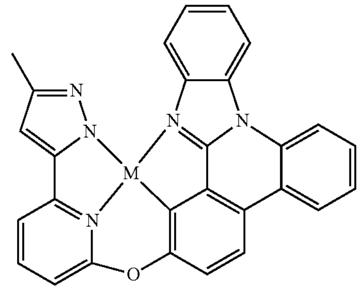
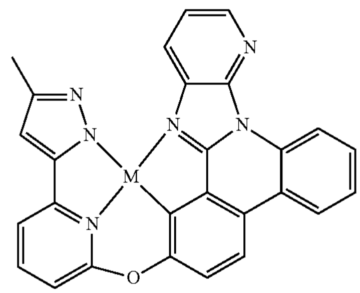
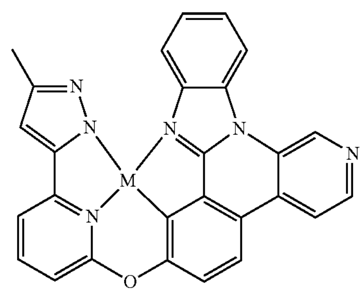
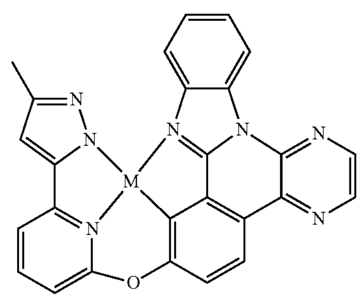
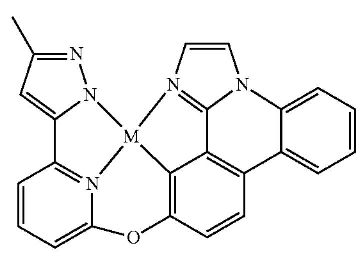
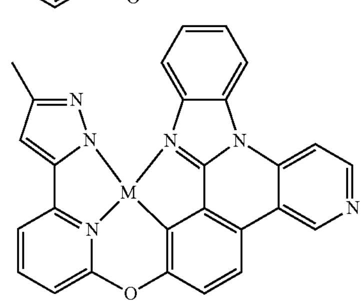

-continued
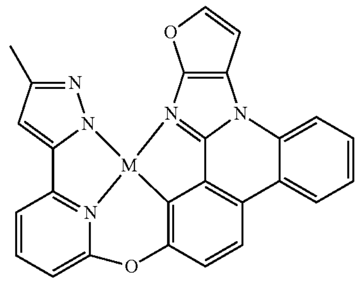
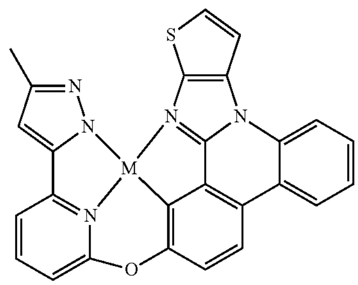
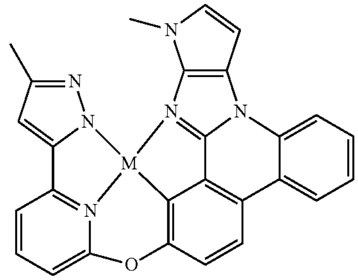
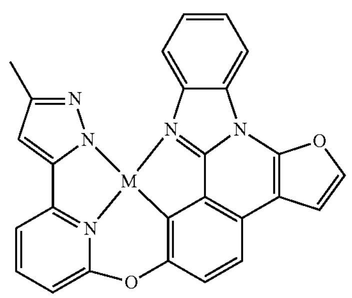
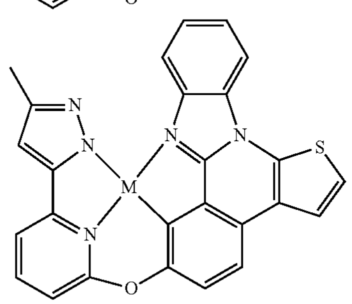
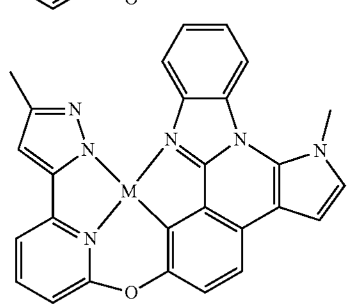
-continued
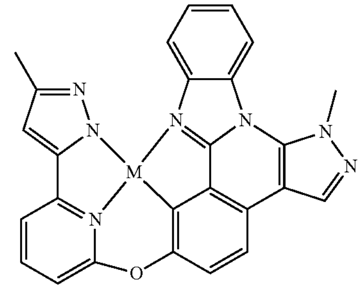
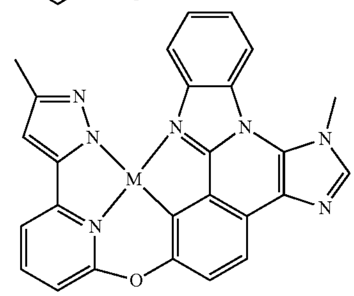
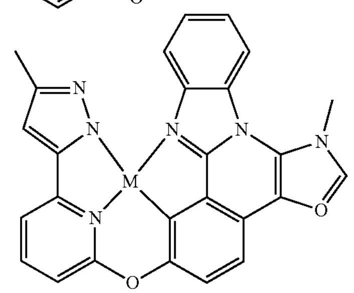
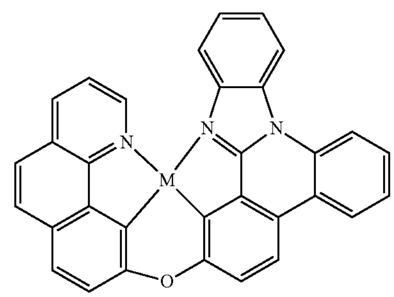
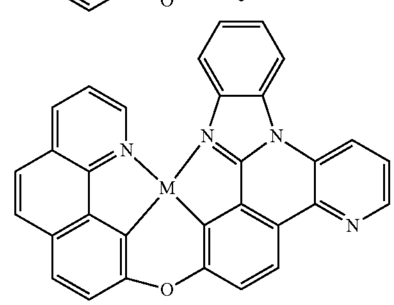
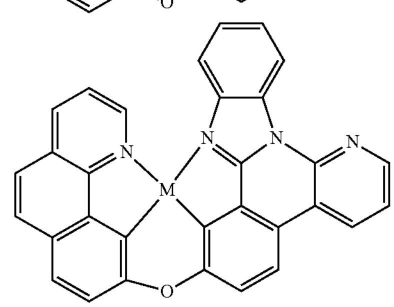

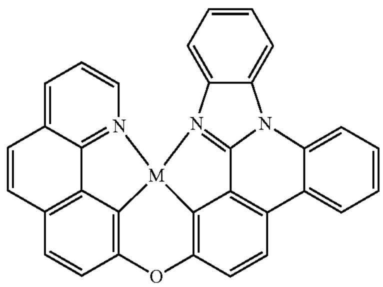
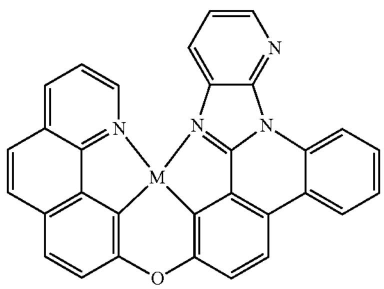
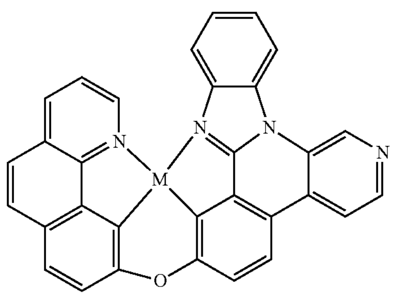
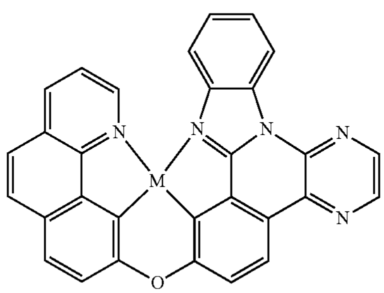
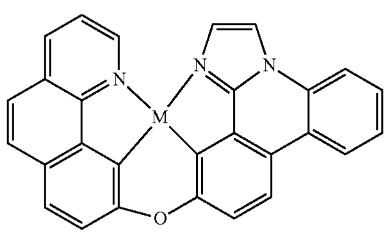
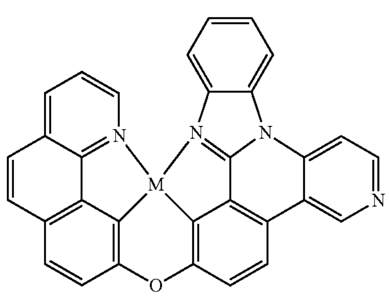
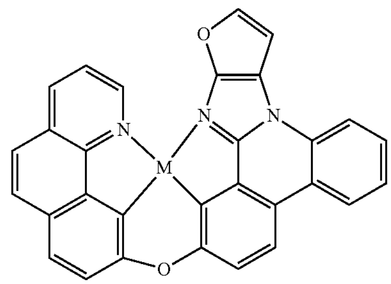
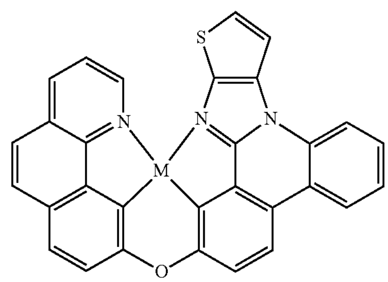
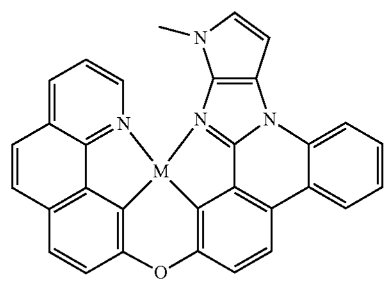
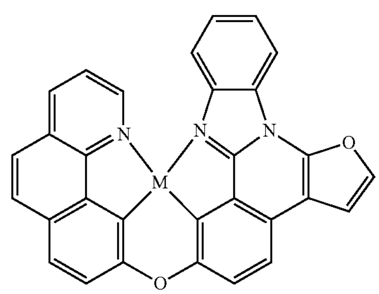
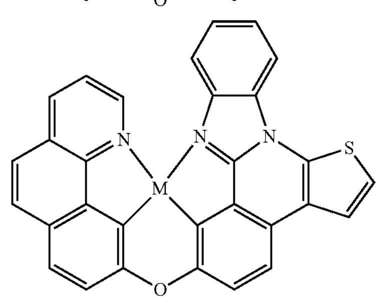
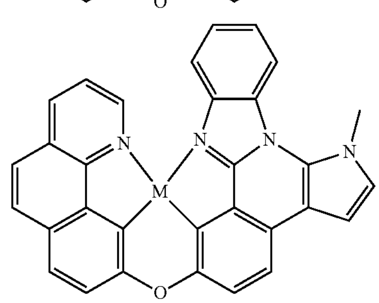

-continued
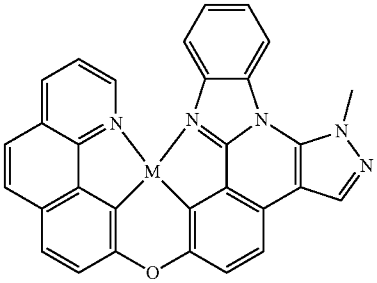
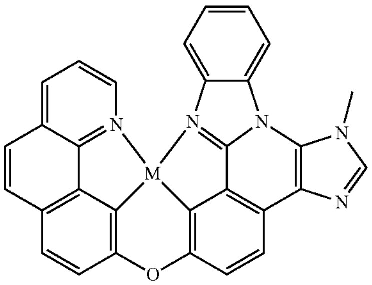
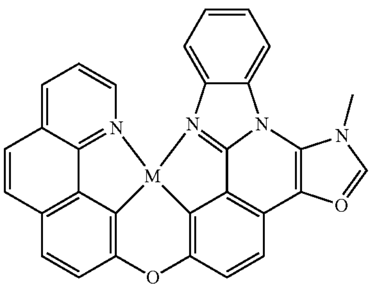
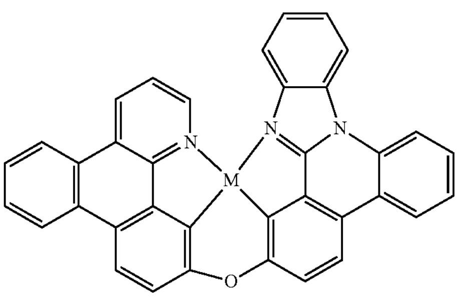
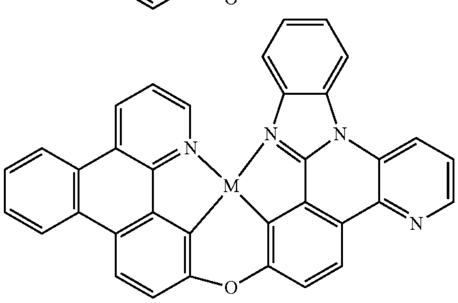
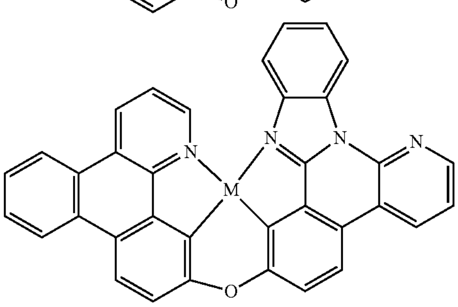
-continued
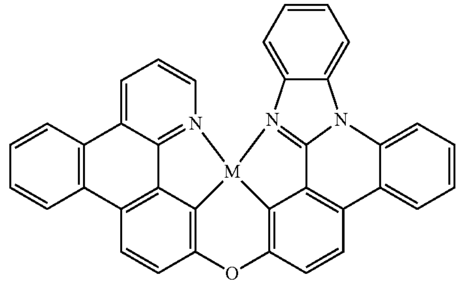
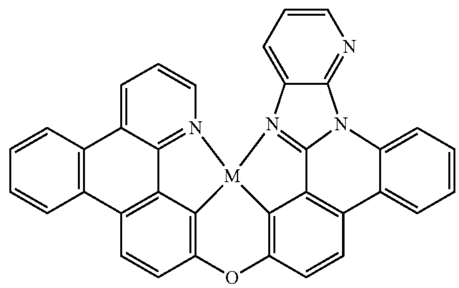
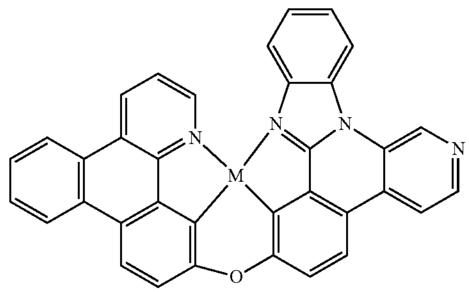
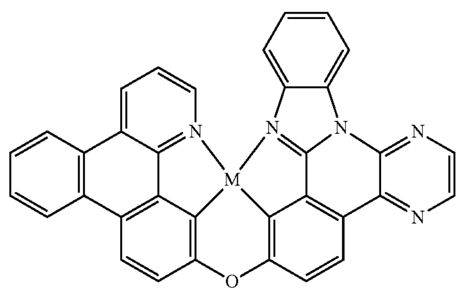
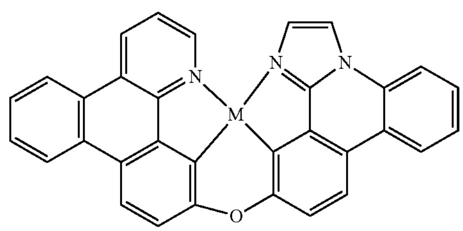
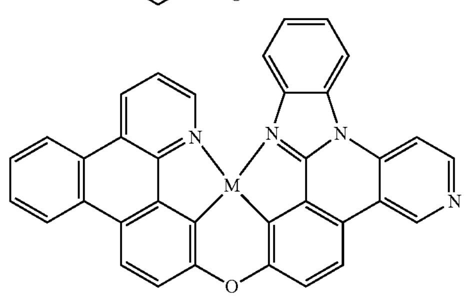

-continued
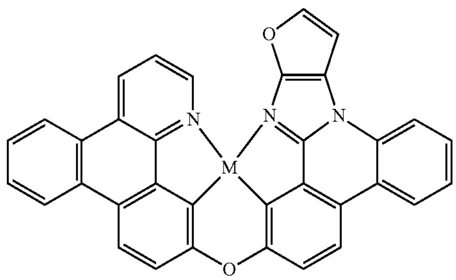
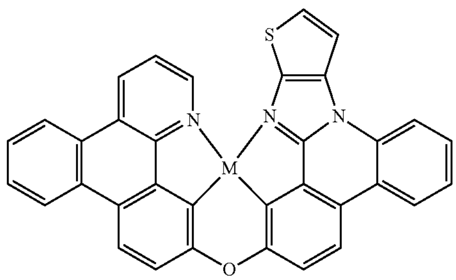
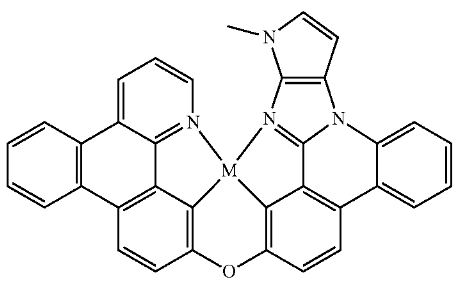
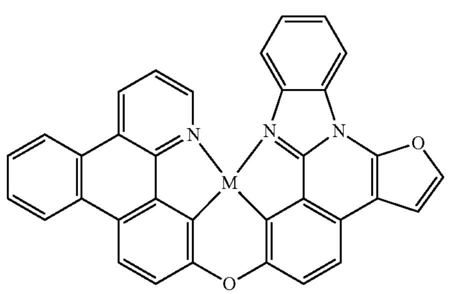
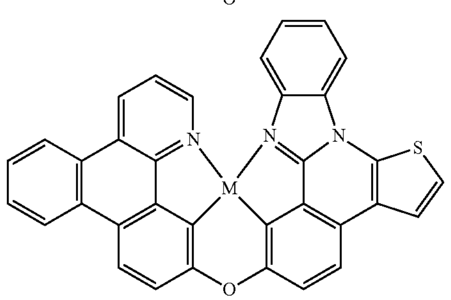
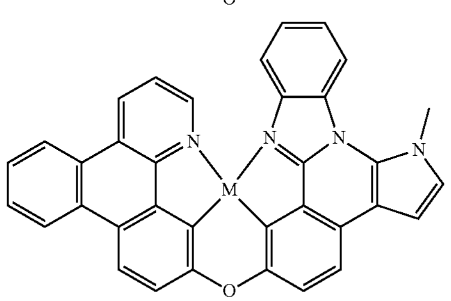
-continued
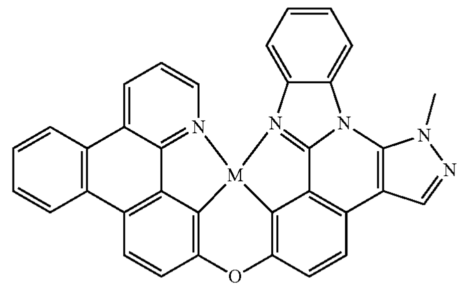
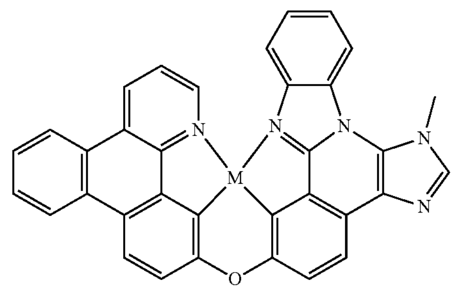
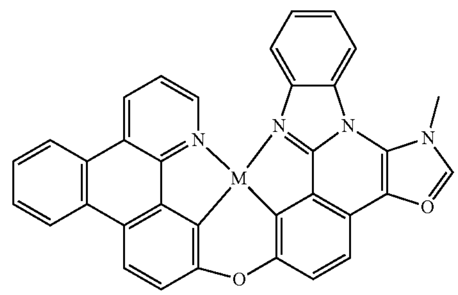
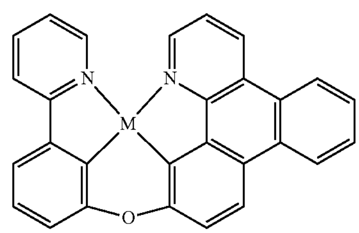
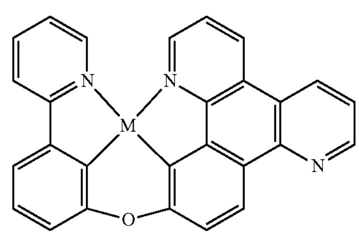
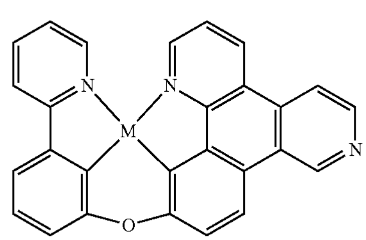

-continued
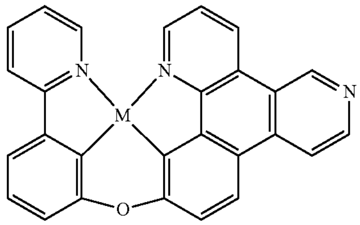
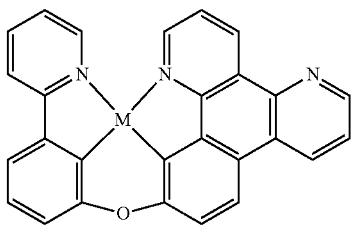
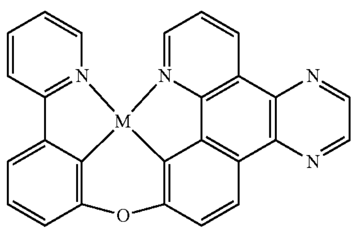
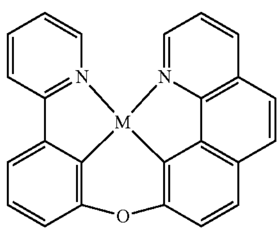
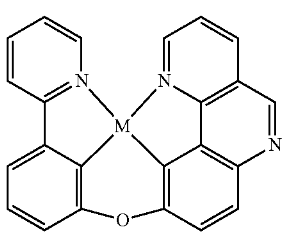
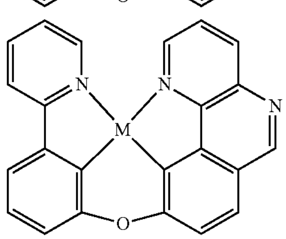
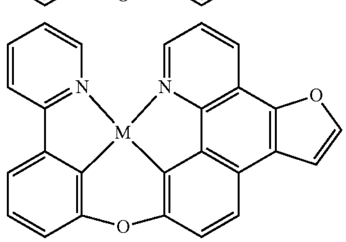
-continued
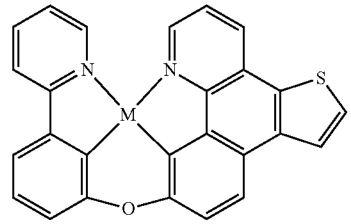
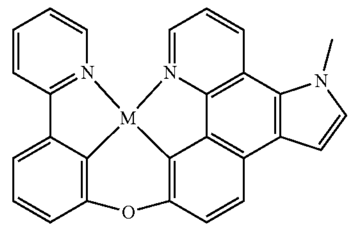
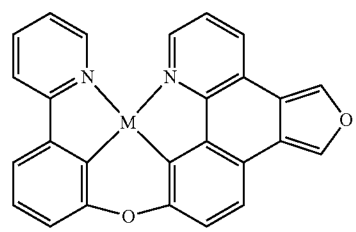
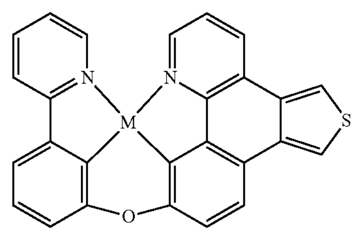
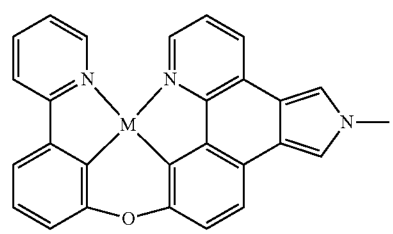
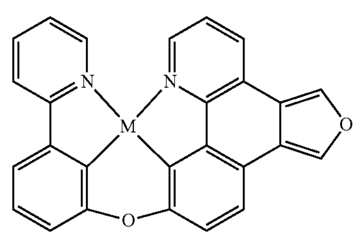
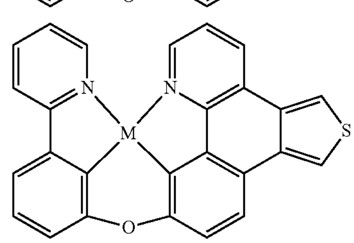

-continued
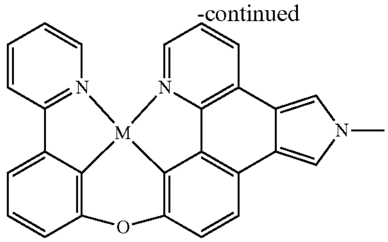
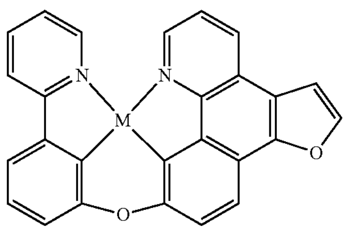
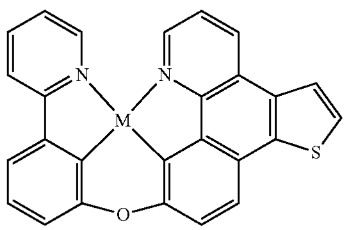
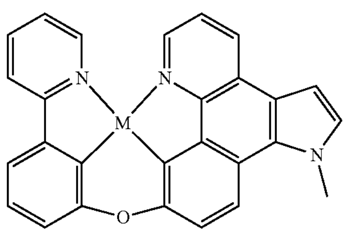
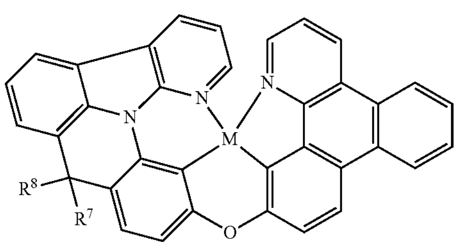
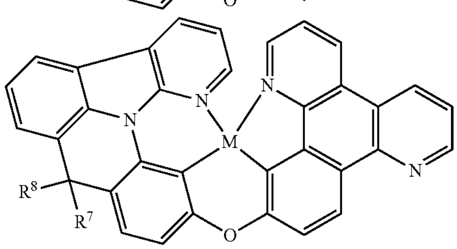
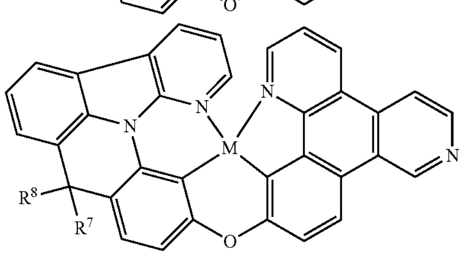
-continued
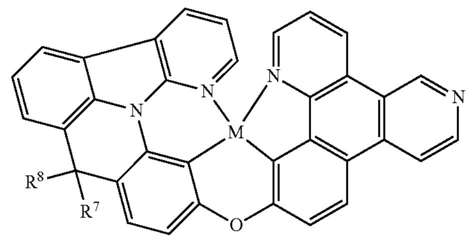
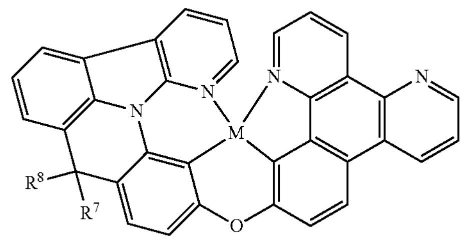
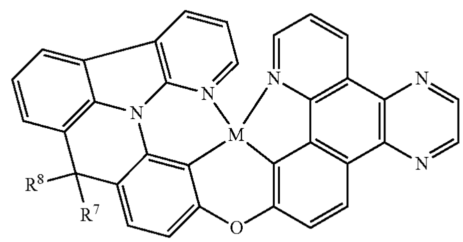
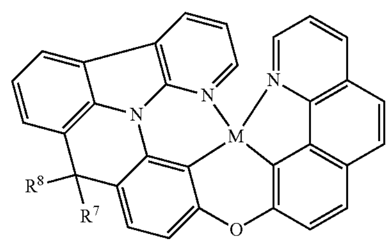
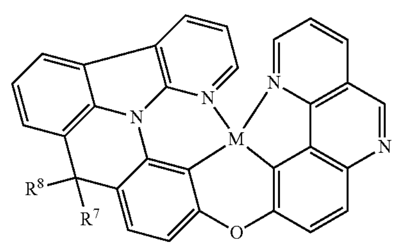
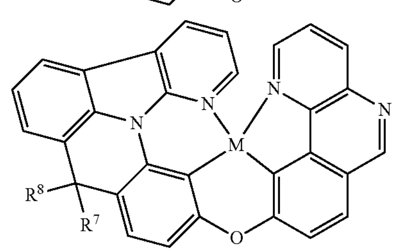
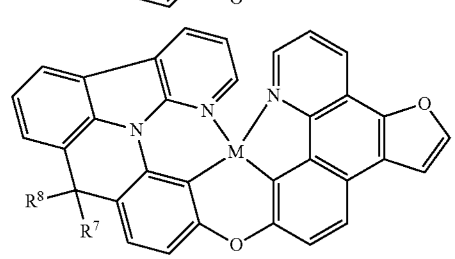

-continued
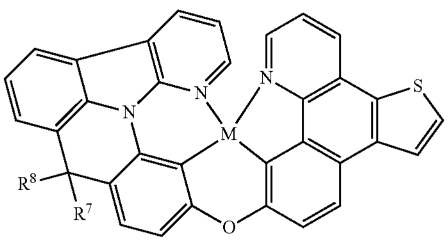
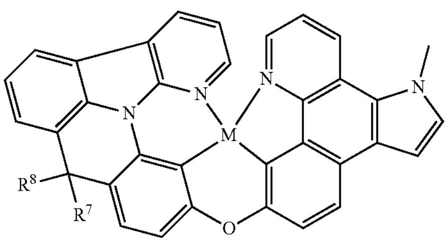
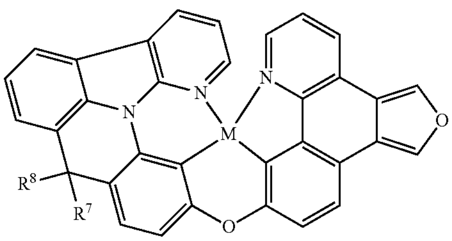
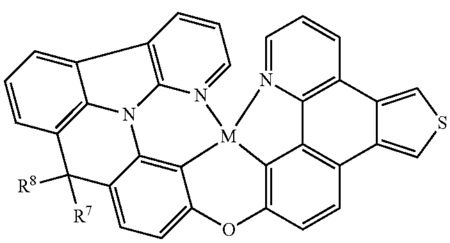
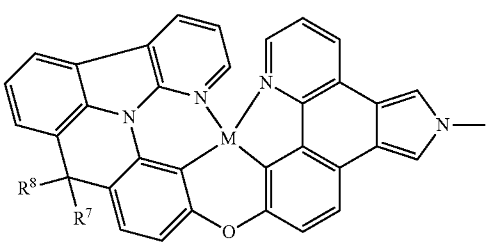
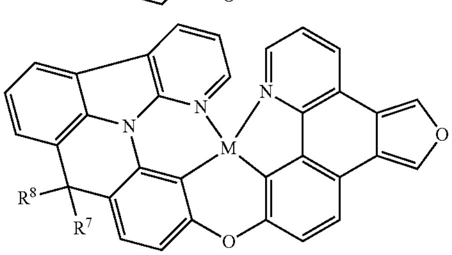
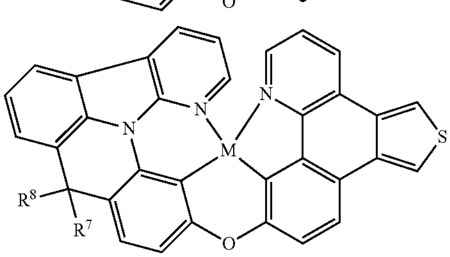
-continued
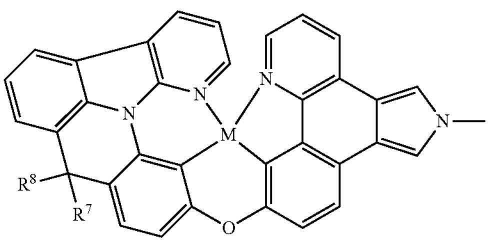
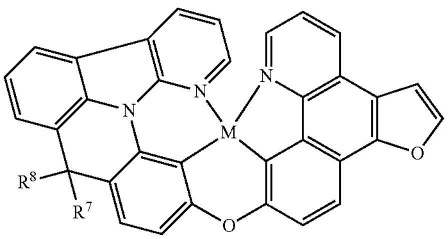
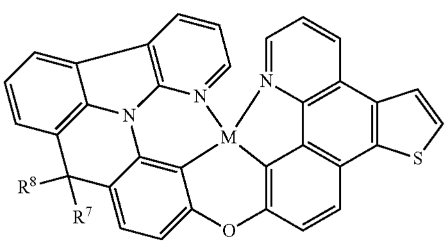
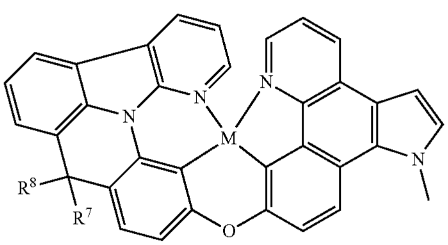
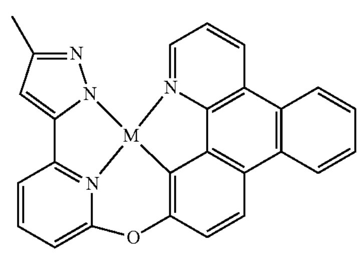
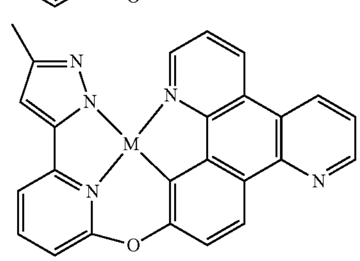
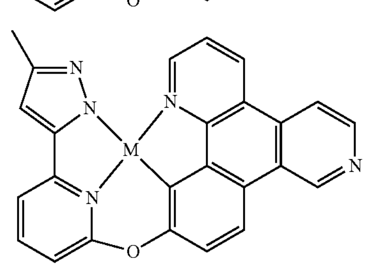

-continued
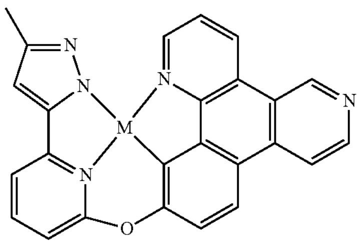
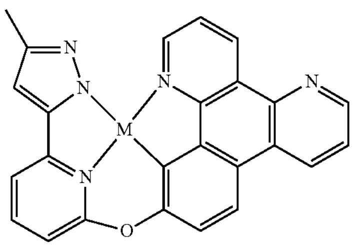
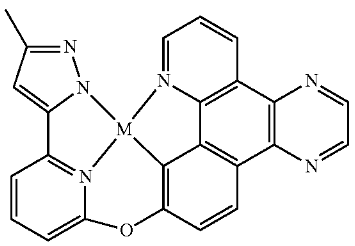
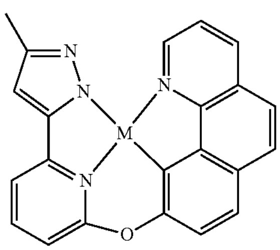
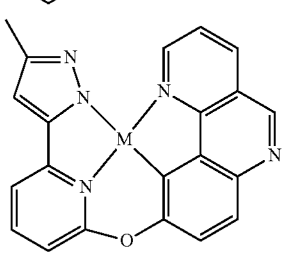
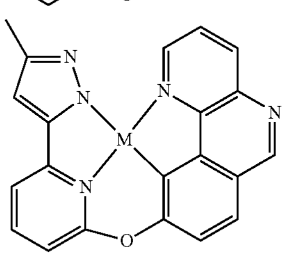
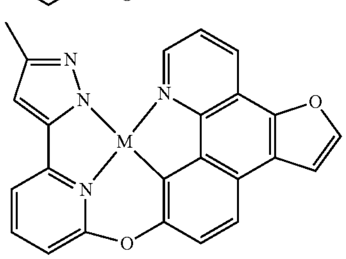
-continued
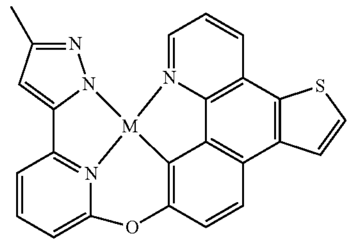
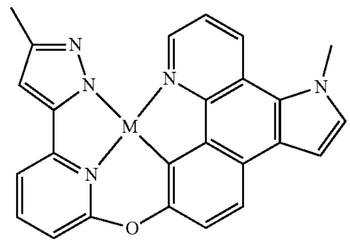
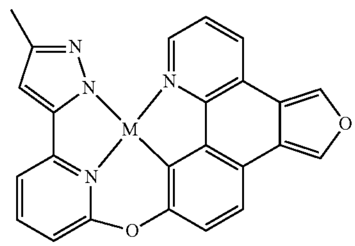
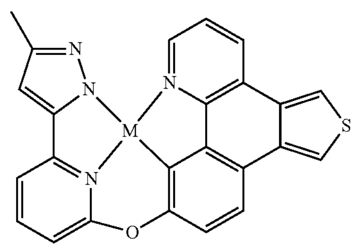
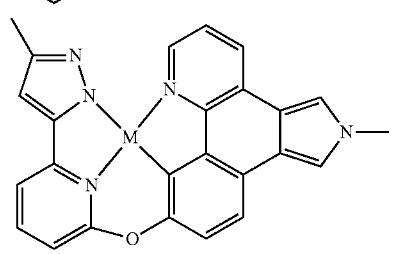
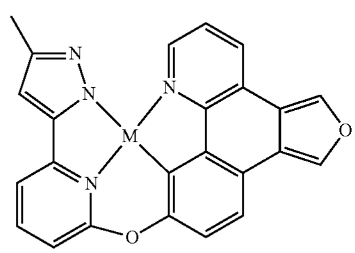
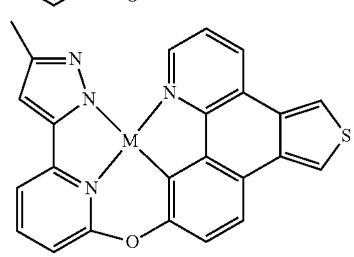

-continued
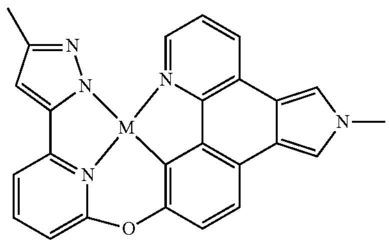
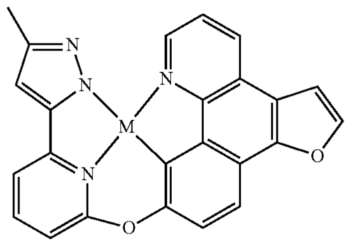
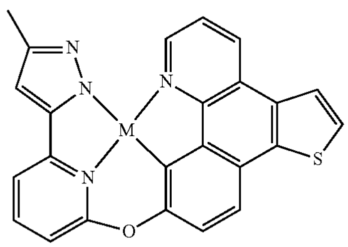
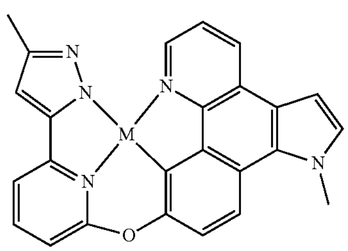
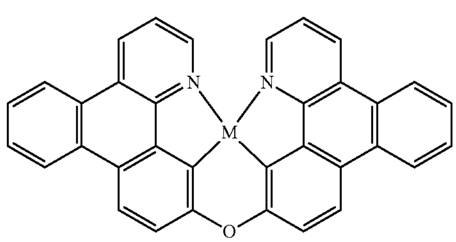
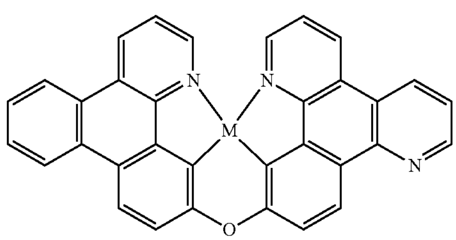
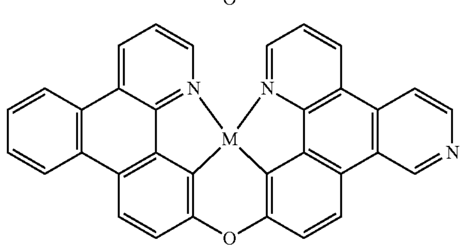
-continued
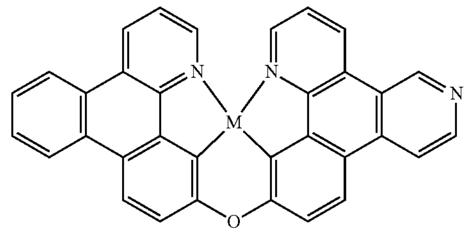
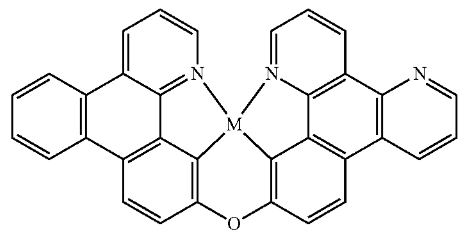
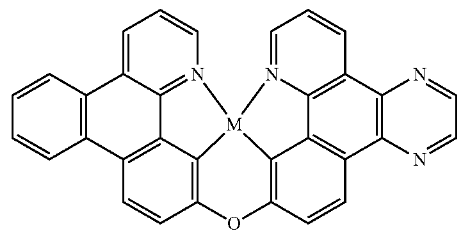
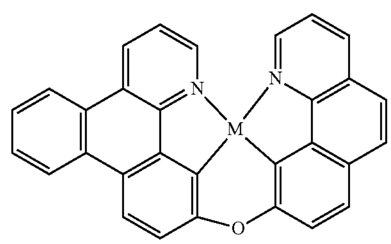
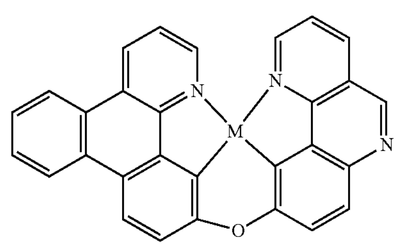
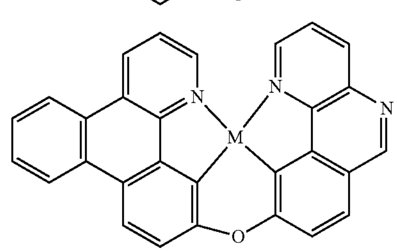
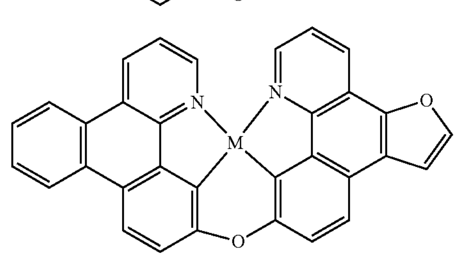

-continued
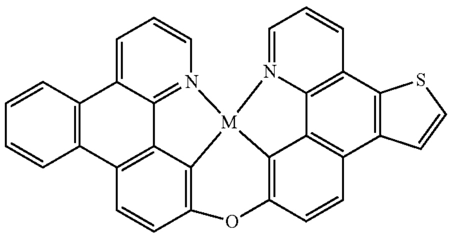
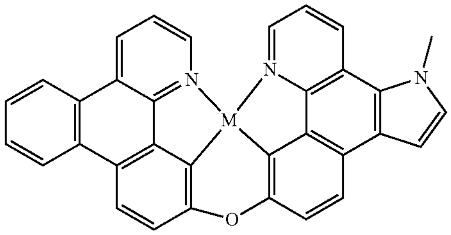
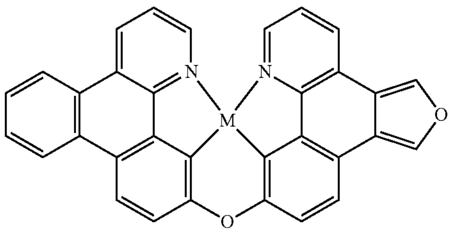
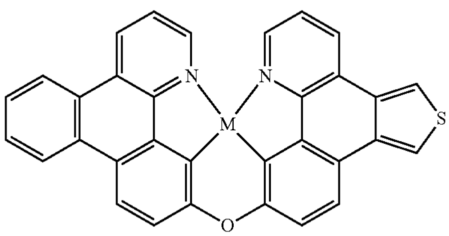
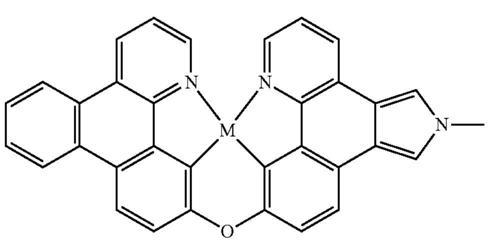
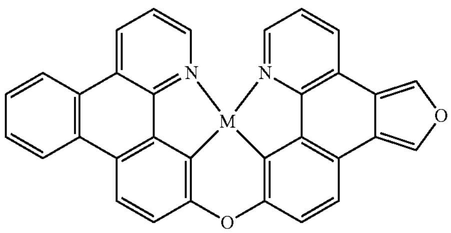
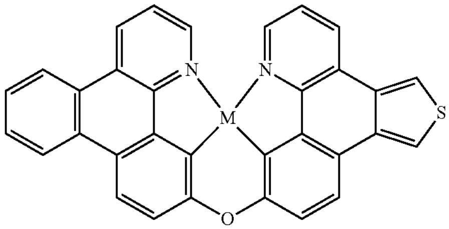
-continued
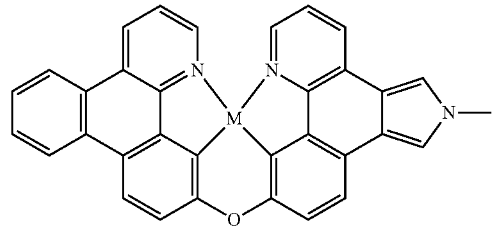
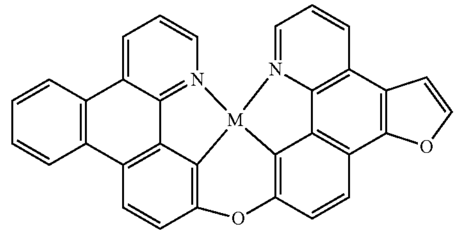
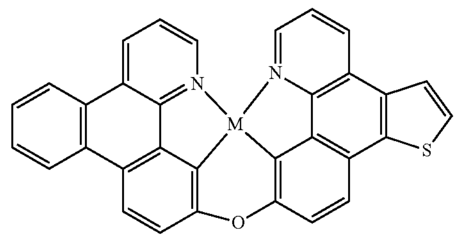
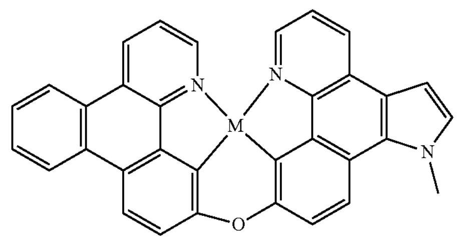
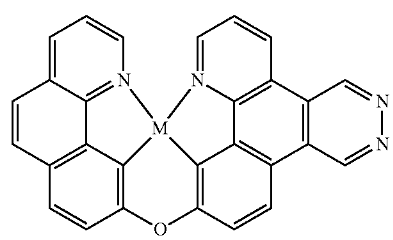
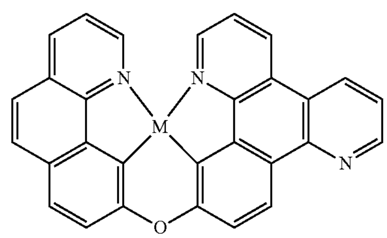
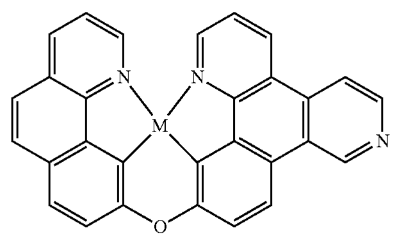

-continued
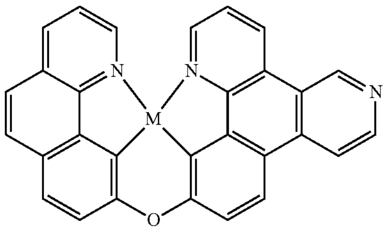
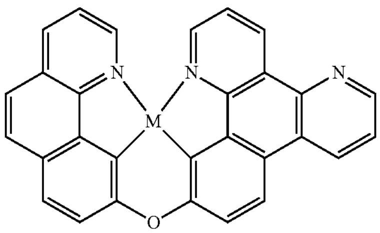
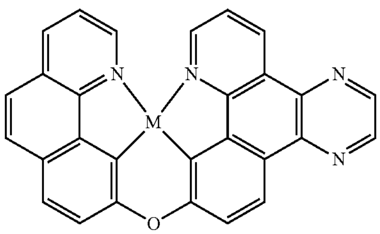
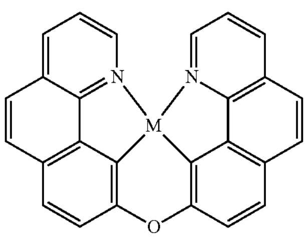
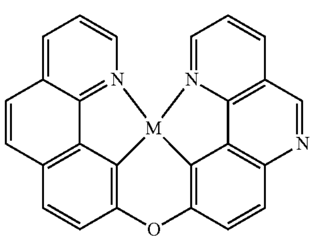
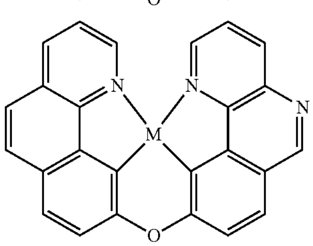
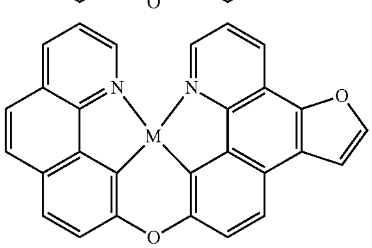
-continued
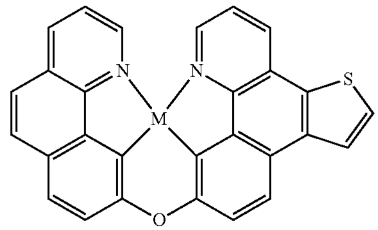
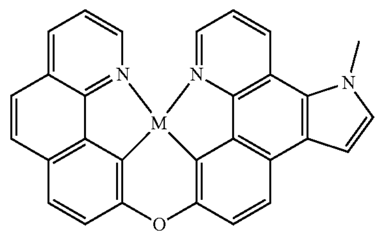
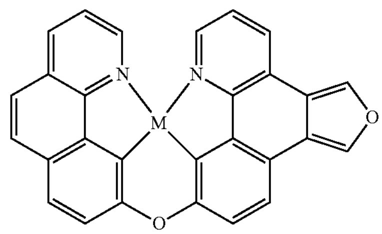
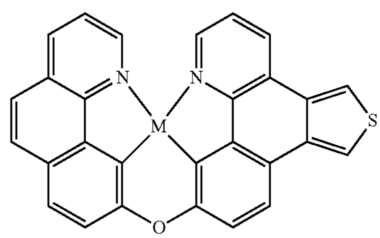
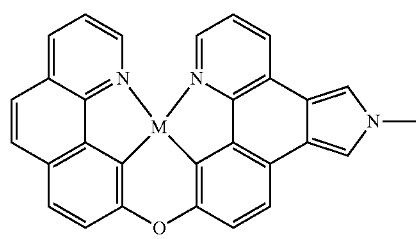
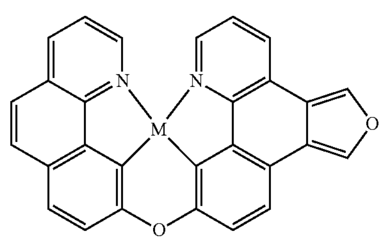
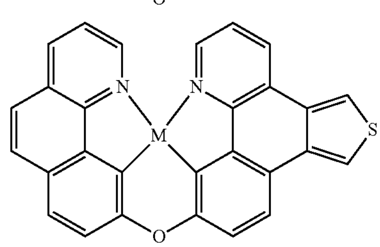

-continued

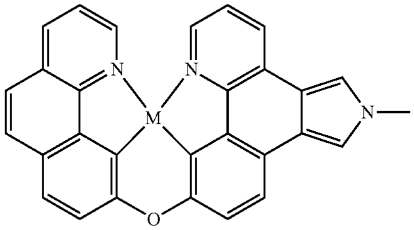

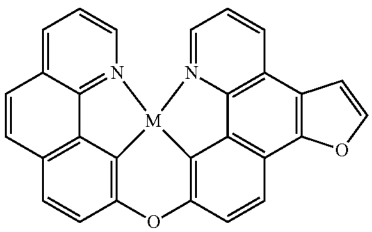

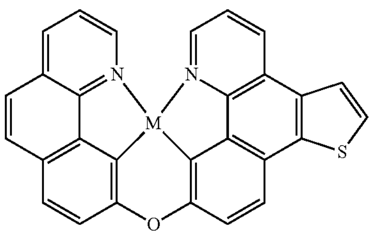

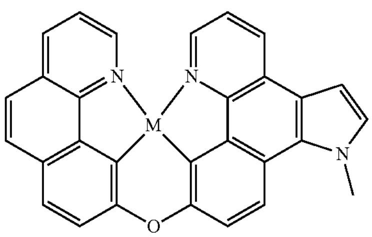

The substituents in these compounds are as defined herein.

Octahedral iridium (III) metal-assisted delayed fluorescent (MADF) emitters employing benzo-imidazo-phenanthridine are represented by General Formulas XIV-XVII:

General Formula XIV

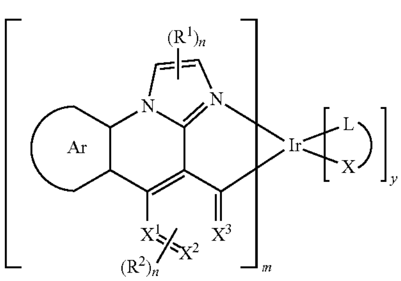

-continued

General Formula XV

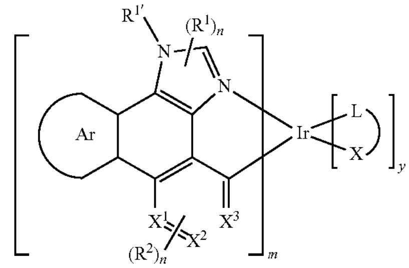

General Formula XVI

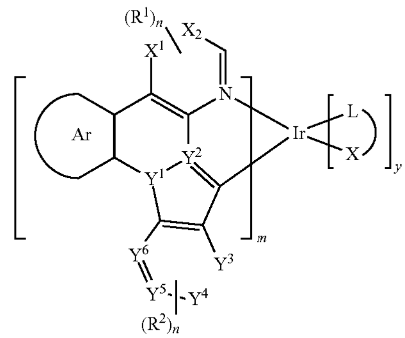

General Formula XVII

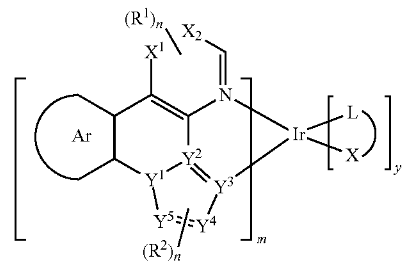

In General Formulas XIV-XVII,

N is nitrogen,

Ir is iridium, m+y=3, and when m=3, y=0, when m=2, y=1, when m=1, y=2, each n is independently an integer, valency permitting, each

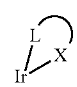

represents one of the following chemical moieties:

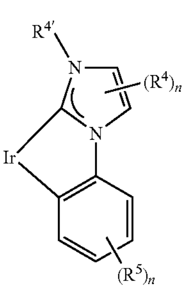

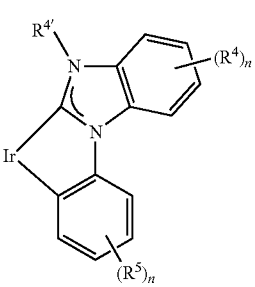

-continued

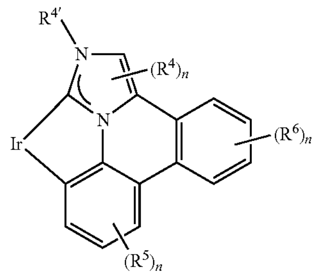
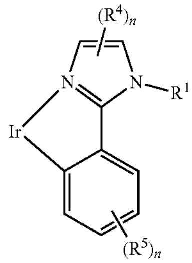
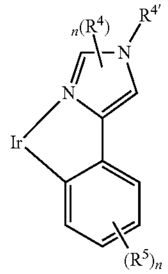
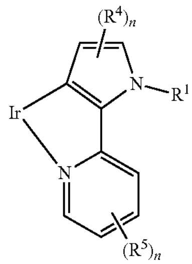
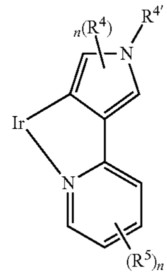
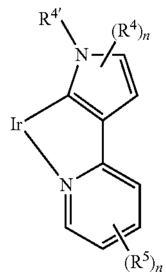
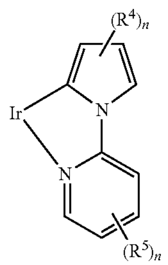
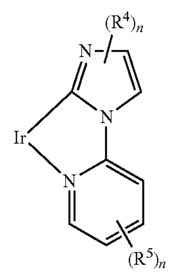
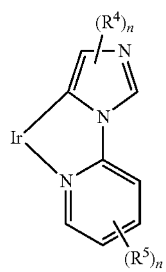
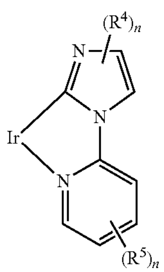
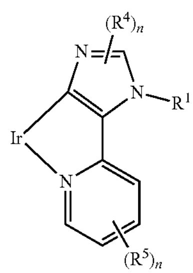
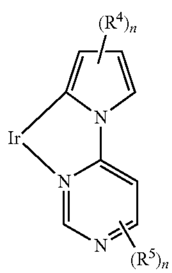
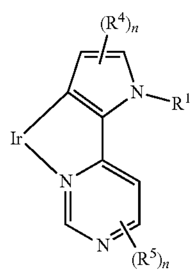
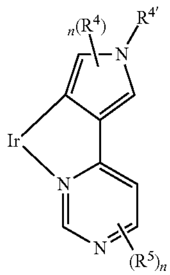

-continued

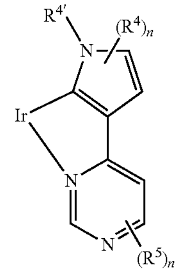
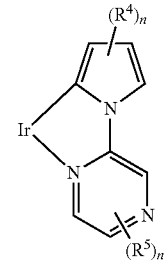
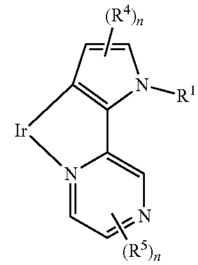
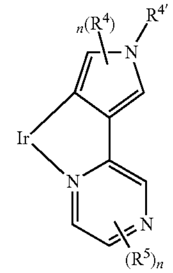
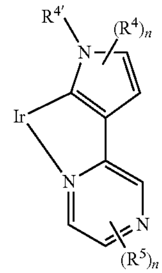
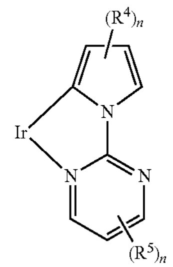
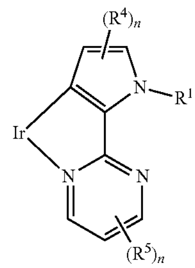
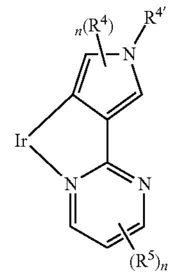
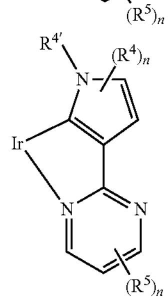

each of R, $R^1$, $R^2$, $R^3$, $R^4$, $R^5$, $R^6$, $R^{1'}$, and $R^{4'}$ is independently absent or present as a single substituent or multiple substituents, valency permitting, and each R, $R^1$, $R^2$, $R^3$, $R^4$, $R^5$, $R^6$, $R^{1'}$, and $R^{4'}$ present independently represents deuterium, halogen, hydroxyl, thiol, nitro, cyanide, isocyanide, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof, where the following are examples:

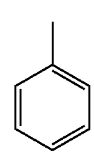
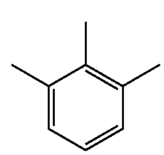
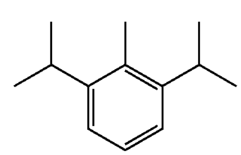

-continued

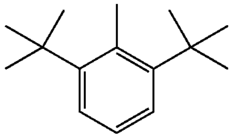
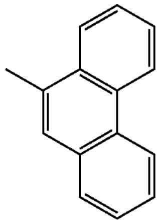
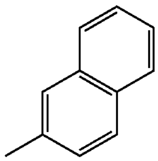
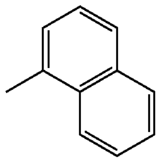
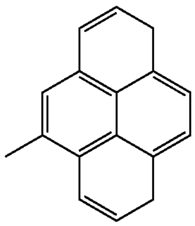
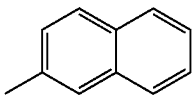
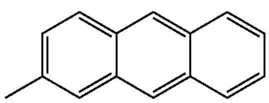
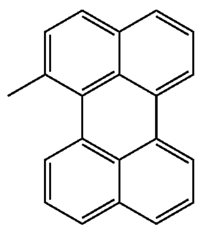
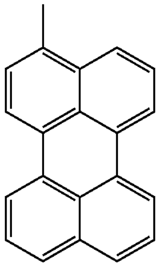
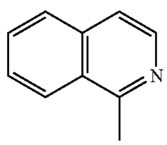
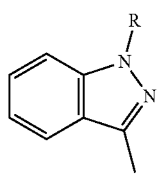
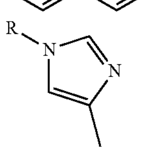
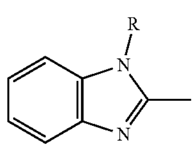
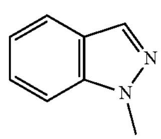
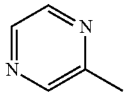
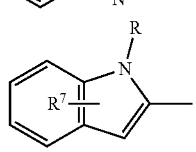
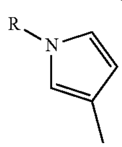
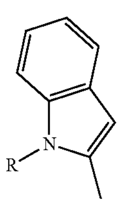
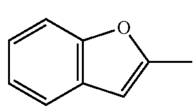
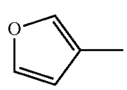
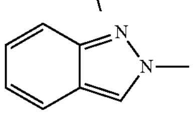
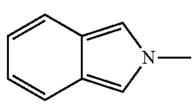
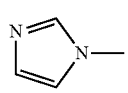
, each of $X^1$, $X^2$, $X^3$, $X^4$, $Y^1$, $Y^2$, $Y^3$, $Y^4$, $Y^5$, $Y^6$, and $Y^7$ is independently present or absent, and each $X^1$, $X^2$, $X^3$, $X^4$, $Y^1$, $Y^2$, $Y^3$, $Y^4$, $Y^5$, $Y^6$, and $Y^7$ present independently represents C, N, Si, O, S, Ge, P, As, Se, B, Al, or Bi, or, valency permitting, $CR^7$, $SiR^7$, $GeR^7$, $NR^7$, P═O, As═O, B, $BR^7$, $AlR^7$, Bi═O, $CR^7R^8$, C═O, $SiR^7R^8$, $GeR^7R^8$, $NR^7$, $PR^7$, $PR^7R^8$, $R^7P$═O, $AsR^7$, $R^7As$═O, S═O, $SO_2$, Se═O, $SeO_2$, $BR^7$, $BR^7R^8$, $AlR^7$, $AlR^7R^8$, $R^7Bi$═O, or $BiR^7$, each

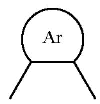

is independently present or absent, and each Ar present independently represents a substituted or unsubstituted aryl, heteroaryl, or N-heterocyclic carbene, and the following chemical moieties:

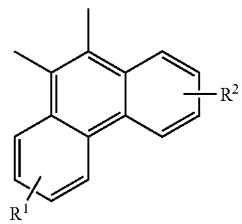
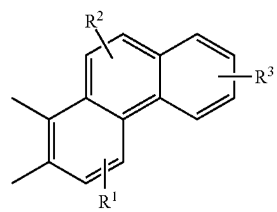
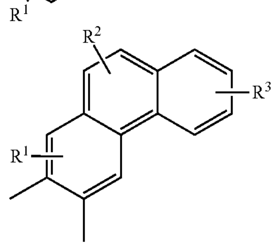
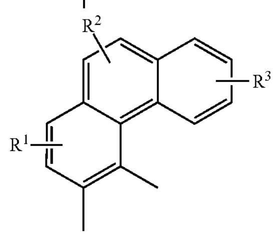
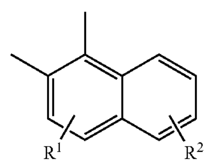
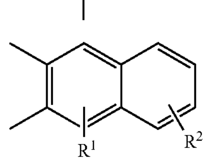
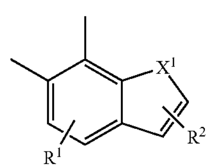
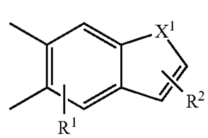
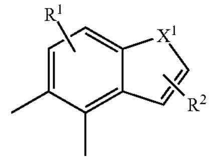
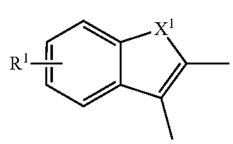
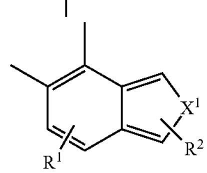

-continued
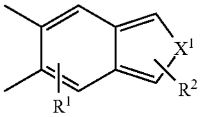
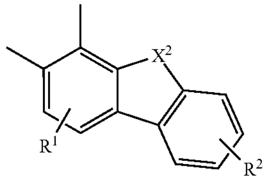
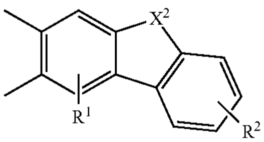
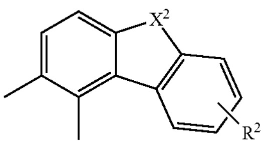
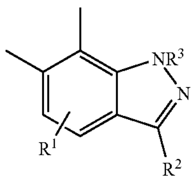
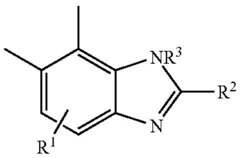
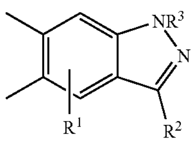
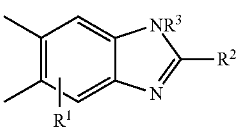
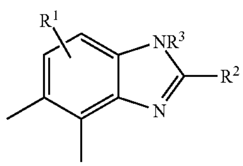
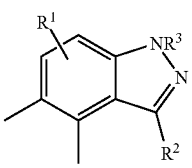
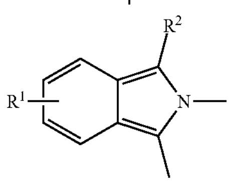
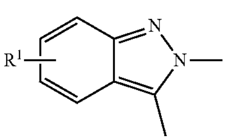
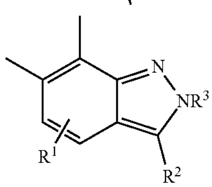
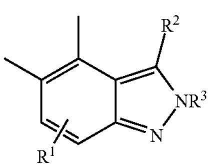
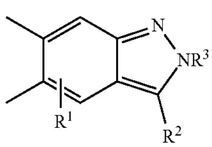
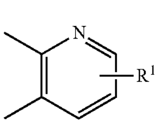
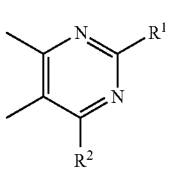
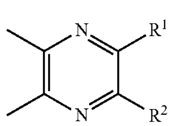
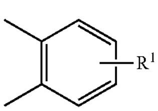
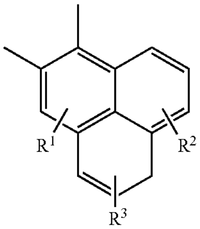
-continued
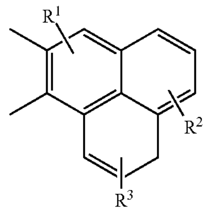
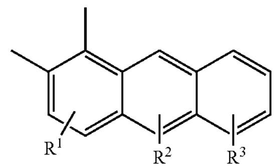
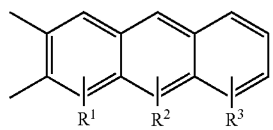
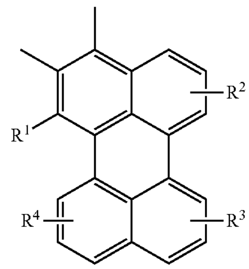
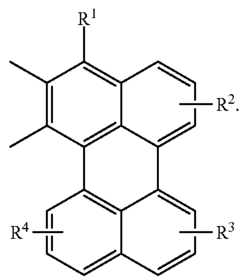
In General Formulas XIV-XVII, for m=3, the moieties can be the same or different. That is, when m=3, the three moieties can be the same, two of the moieties can be the same, or all three of the moieties can be different.
Implementations of General Formulas XIV-XVII include the following:
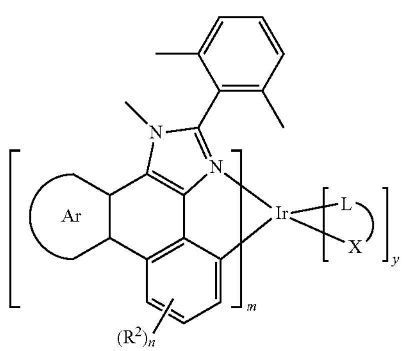
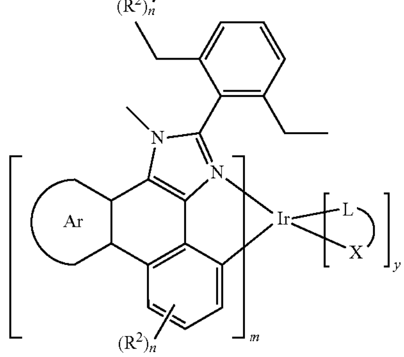

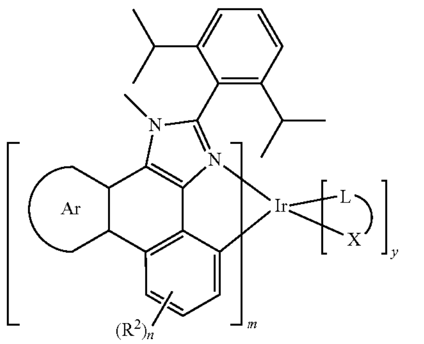
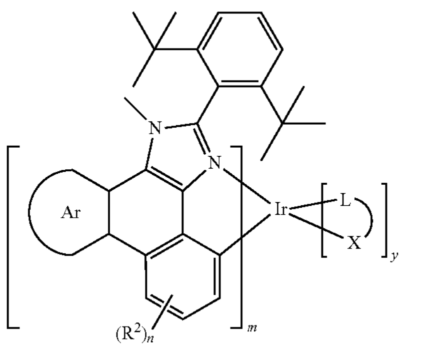
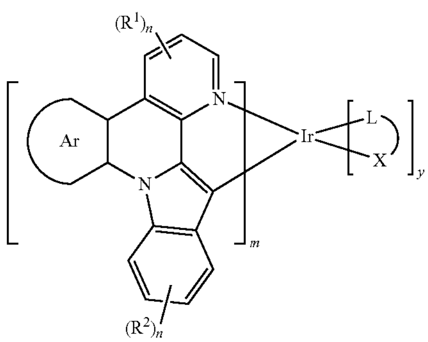
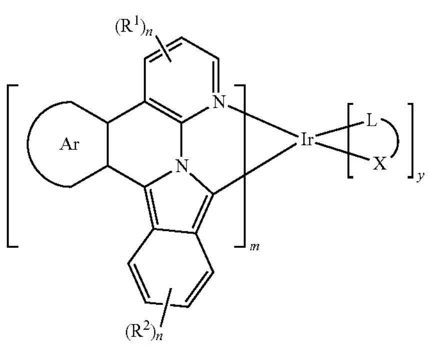
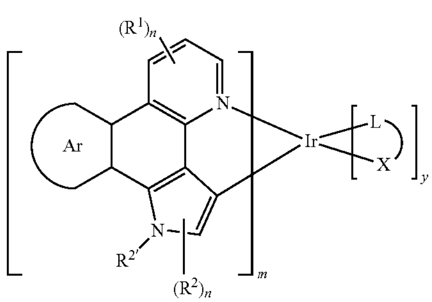
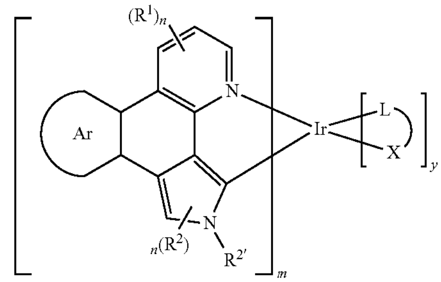
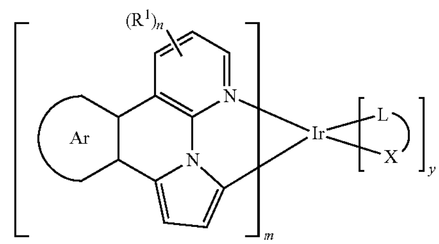
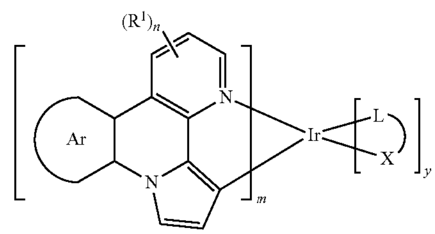
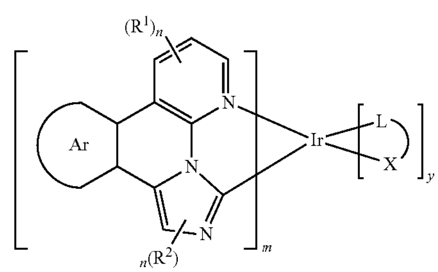
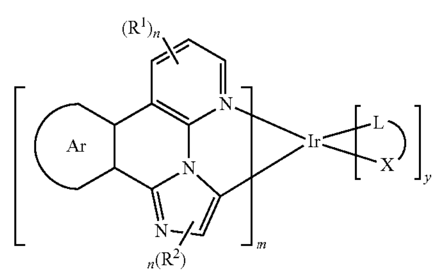
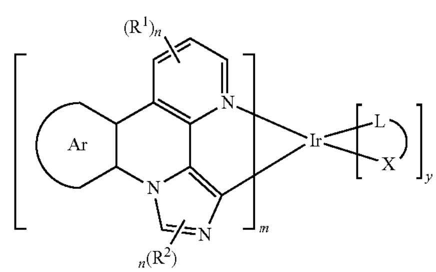

-continued
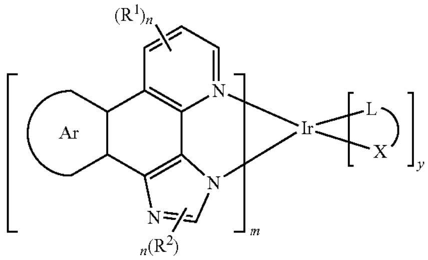
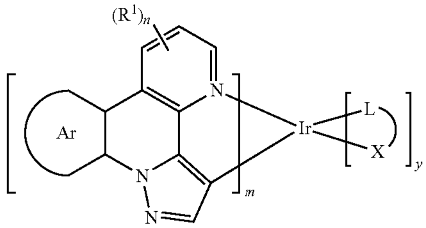
?
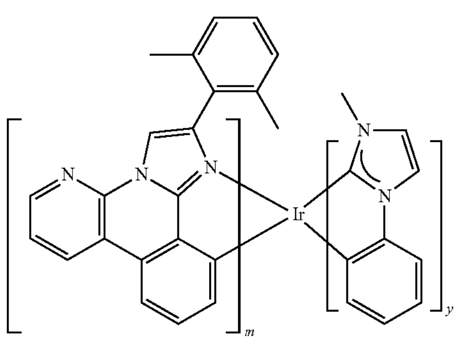
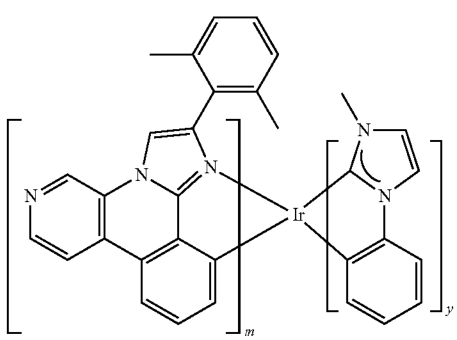
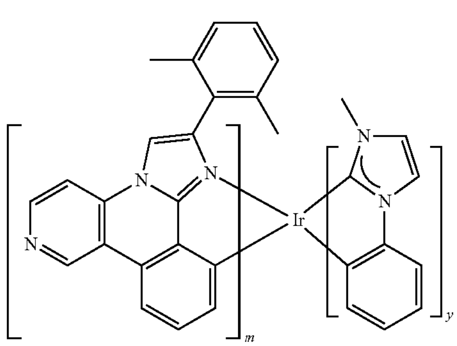
-continued
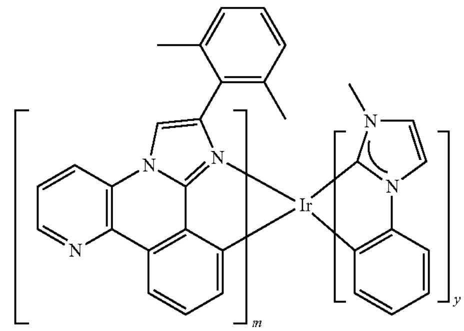
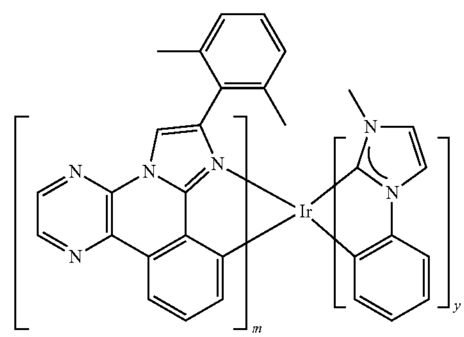
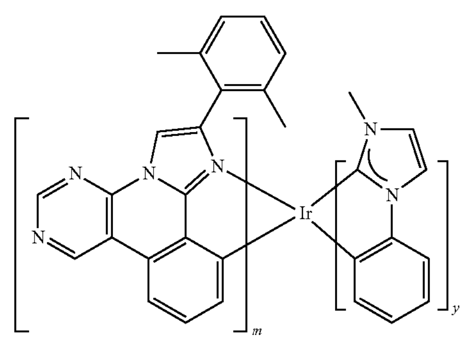
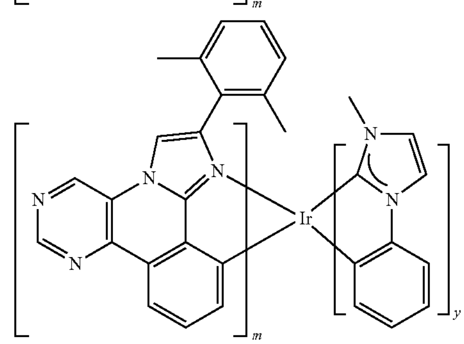
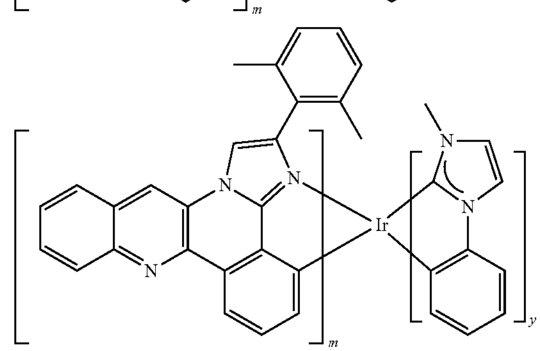

-continued
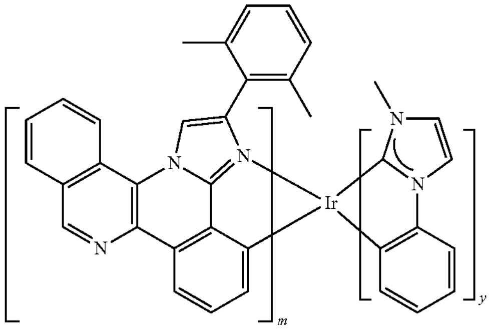
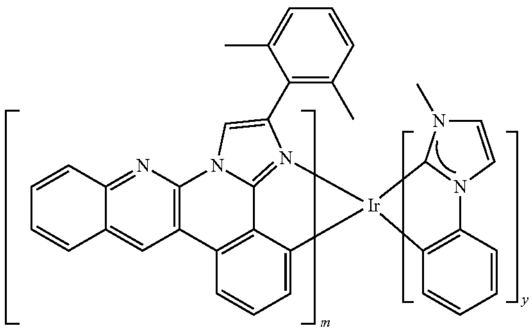
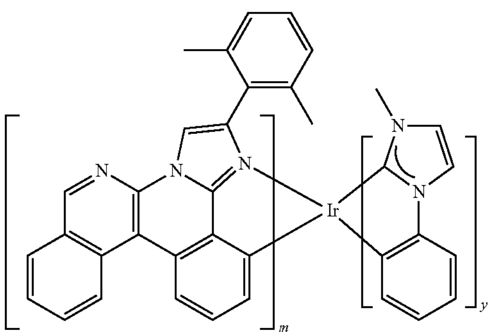
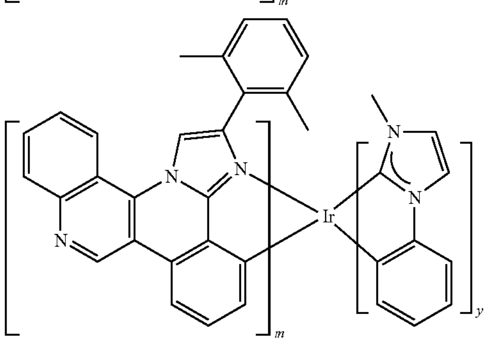
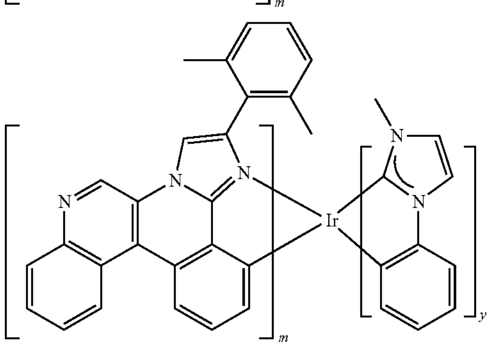
-continued
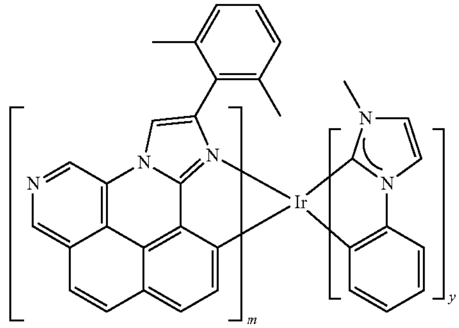
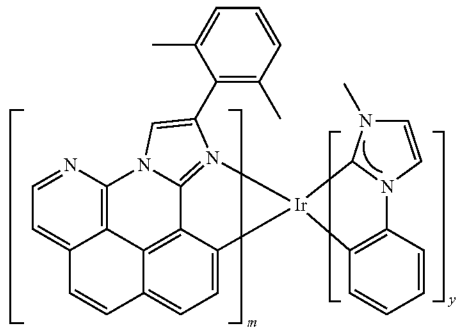
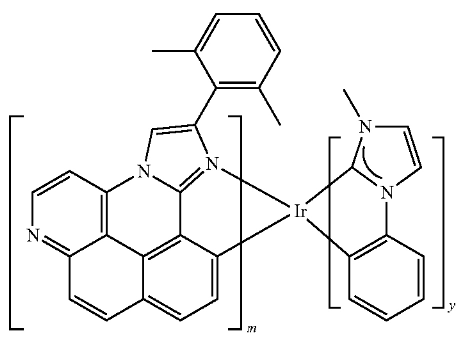
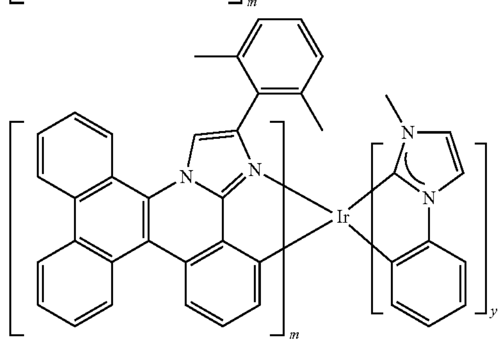
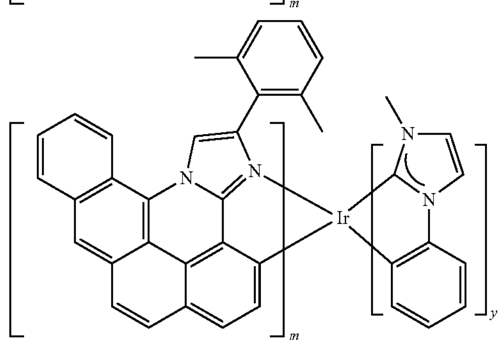

-continued
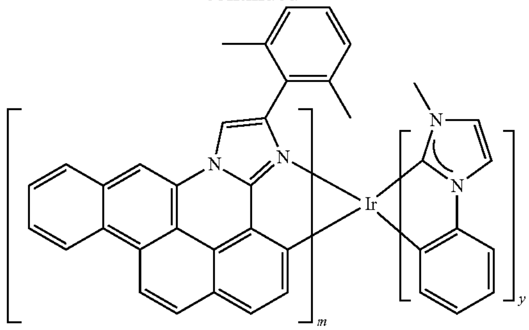
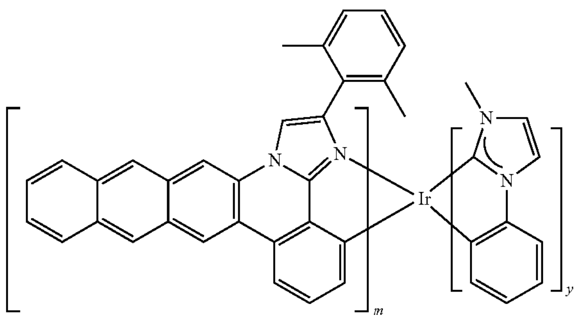
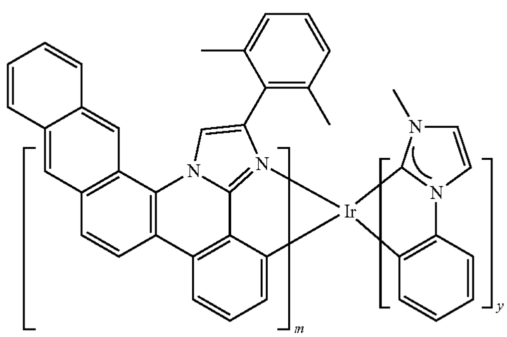
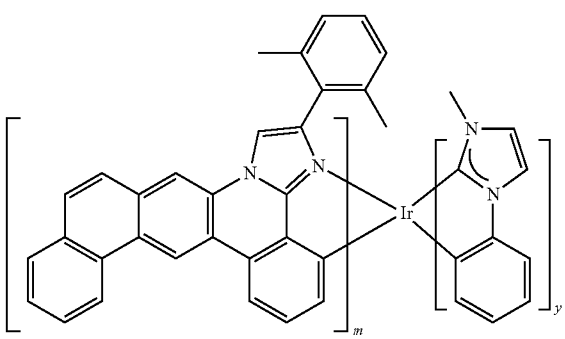
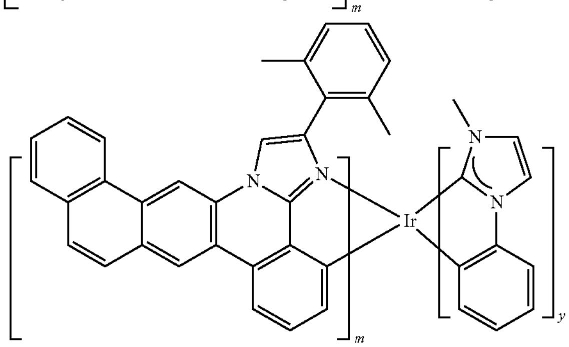
-continued
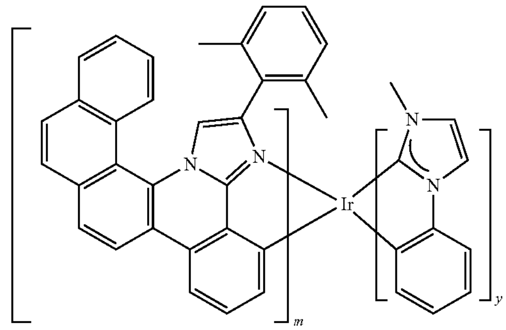
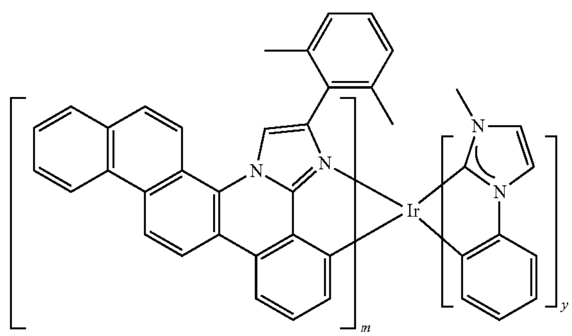
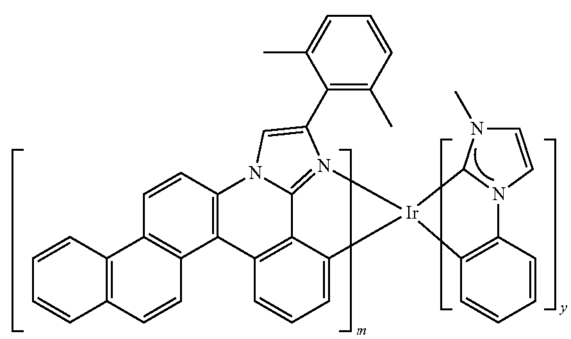
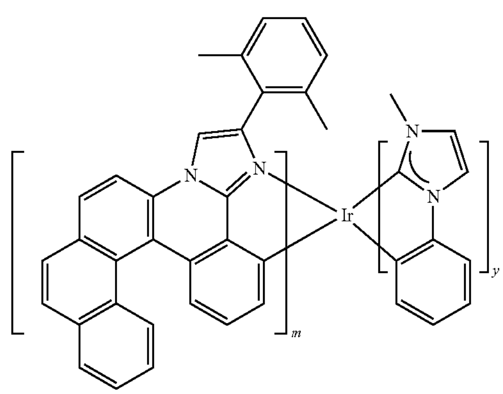

-continued
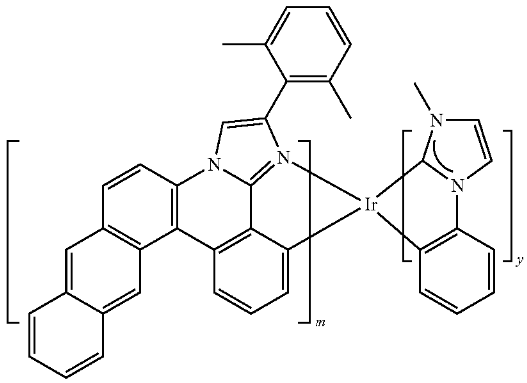
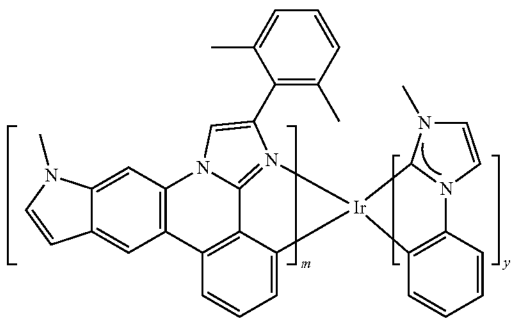
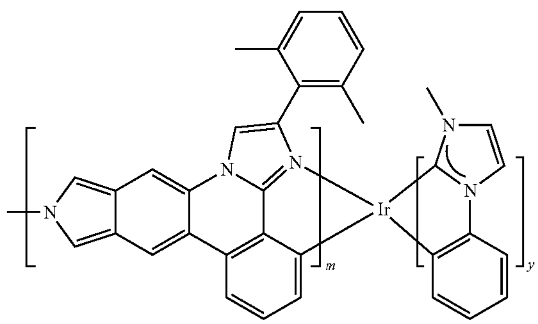
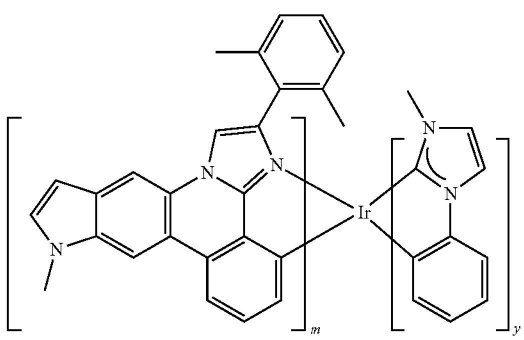
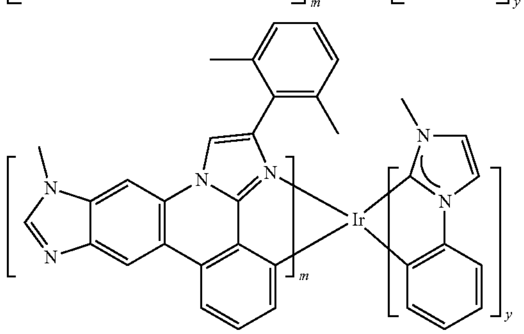
-continued
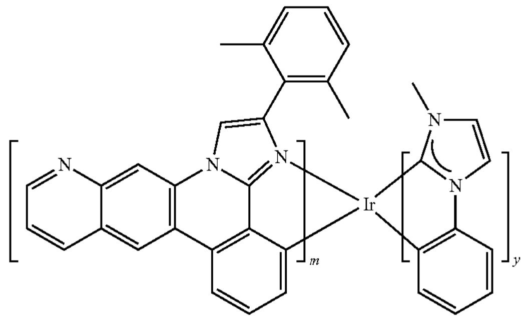
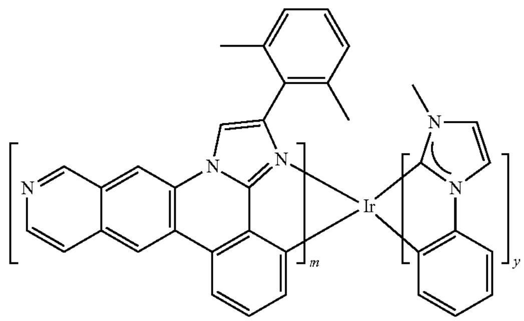
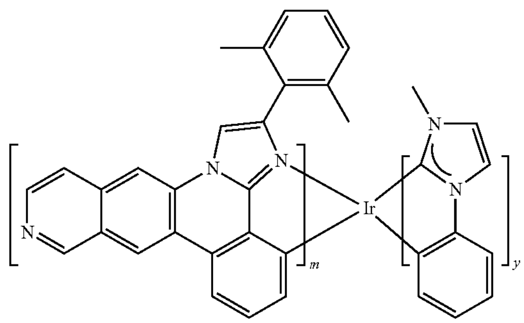
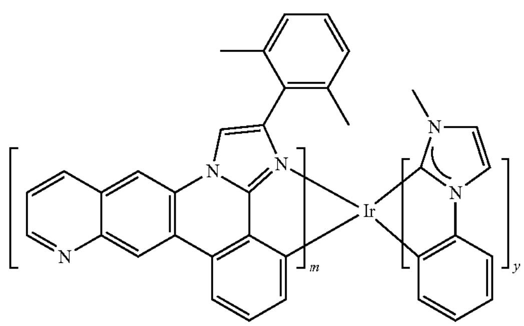
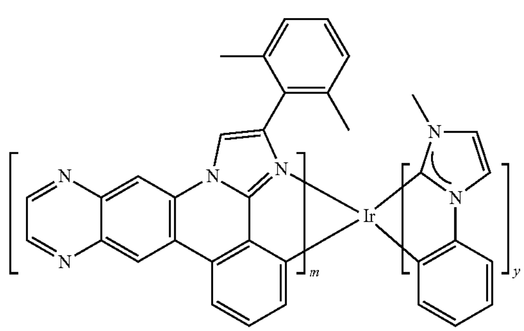

-continued
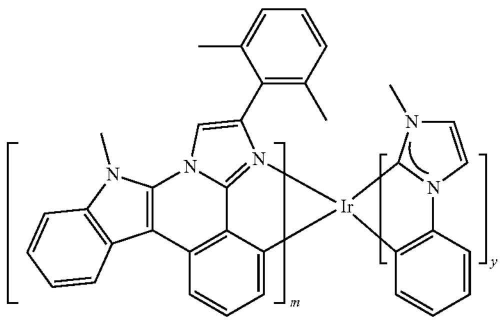
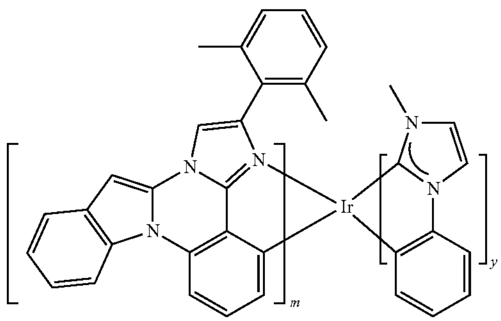
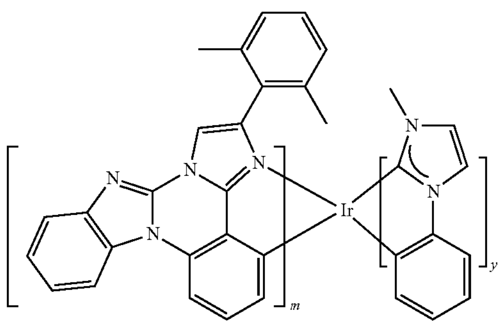
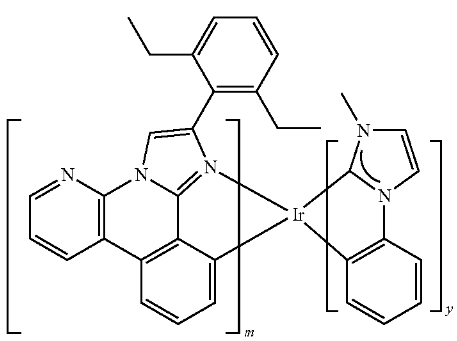
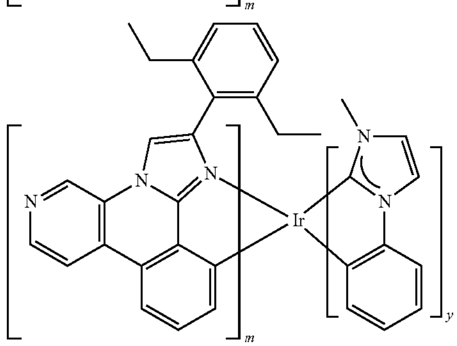
-continued
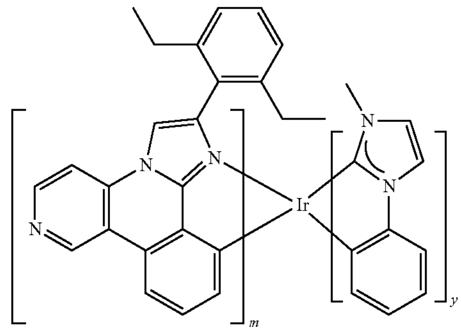
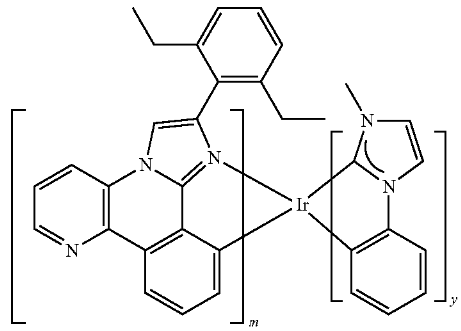
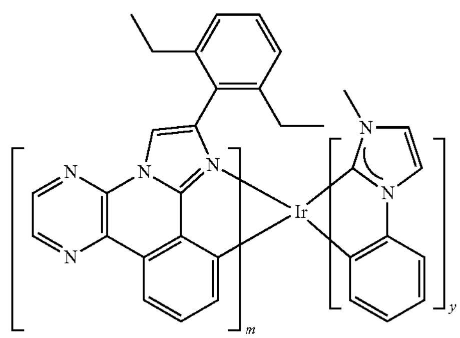
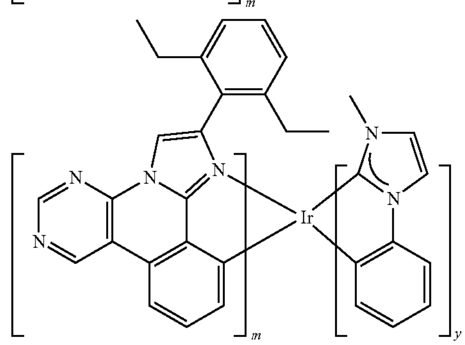
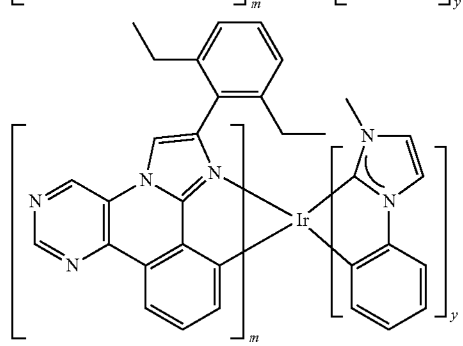

-continued
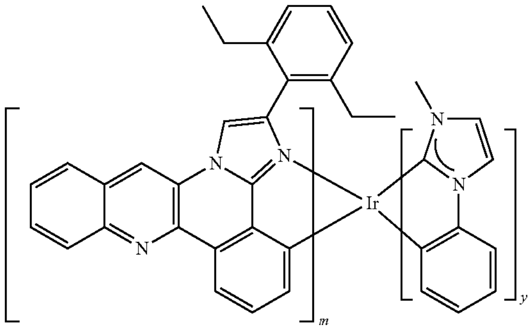
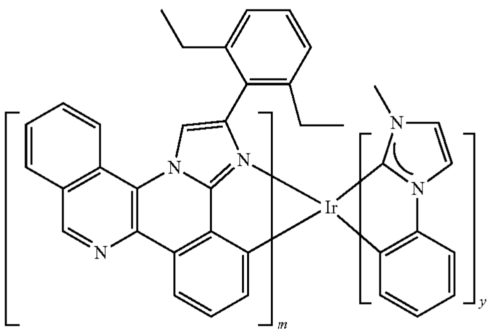
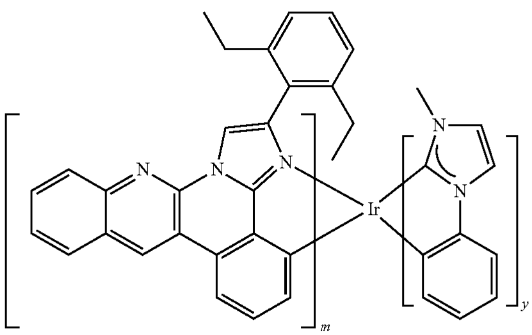
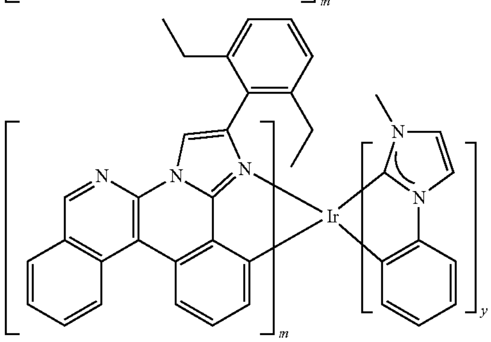
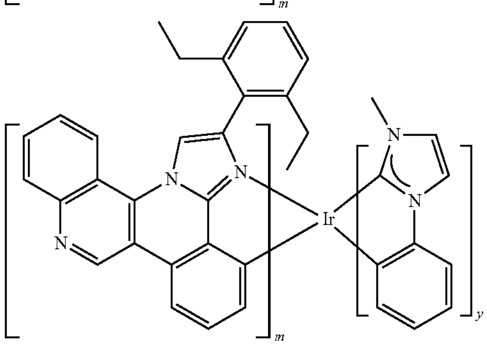
-continued
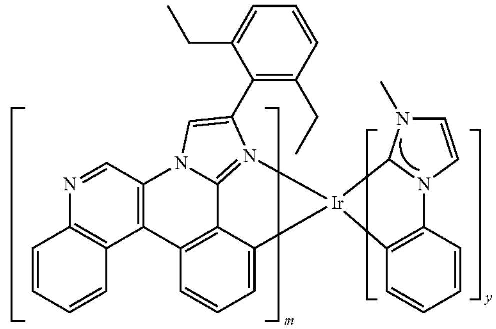
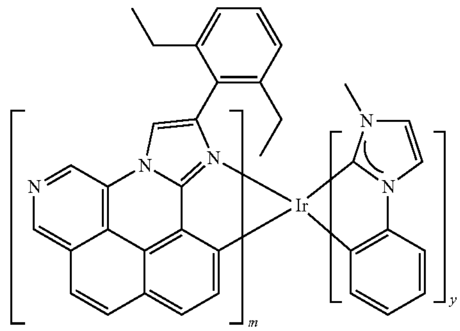
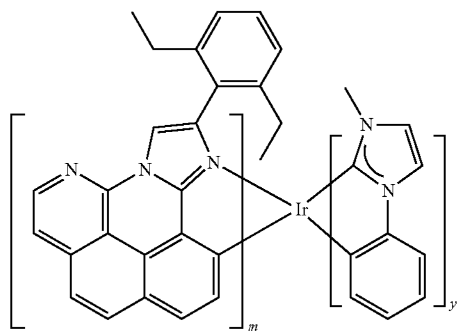
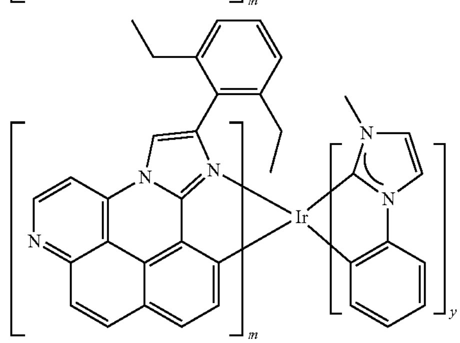
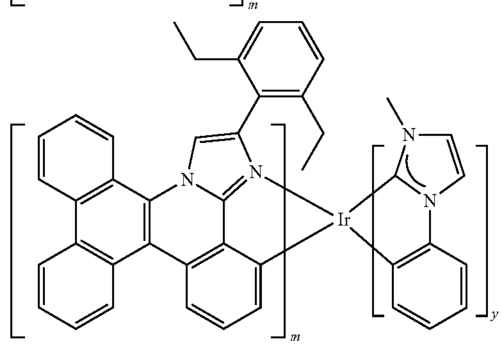

-continued
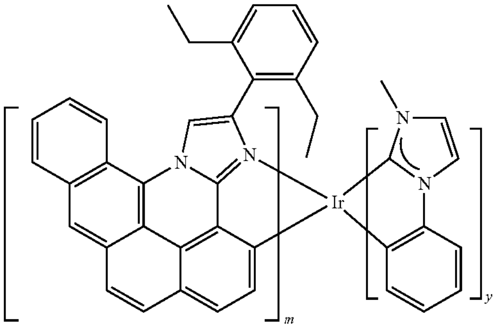
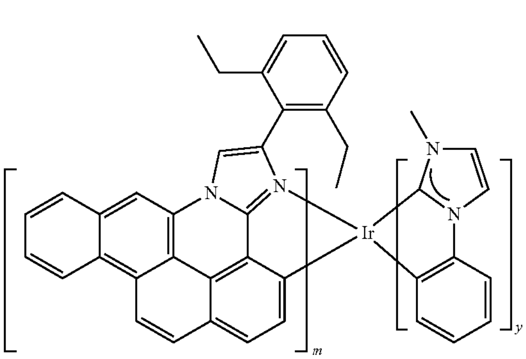
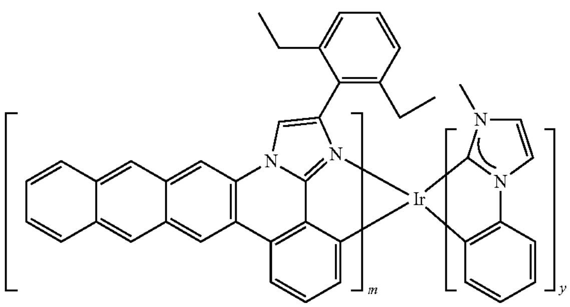
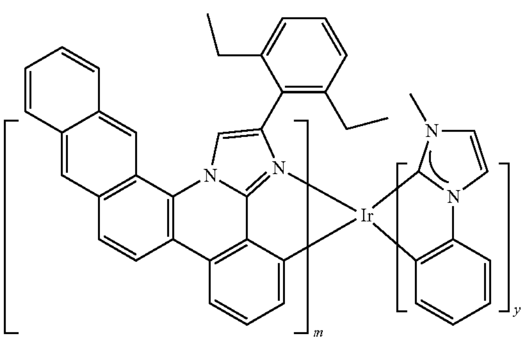
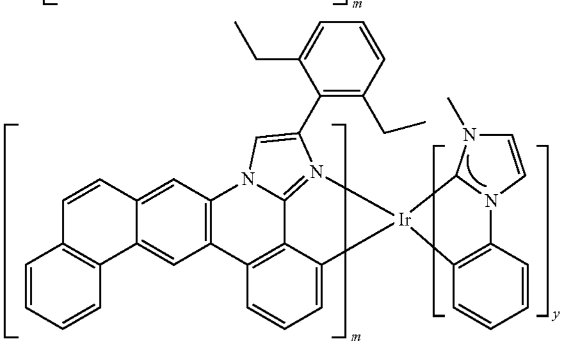
-continued
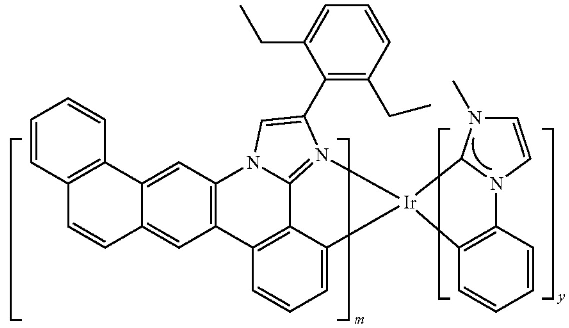
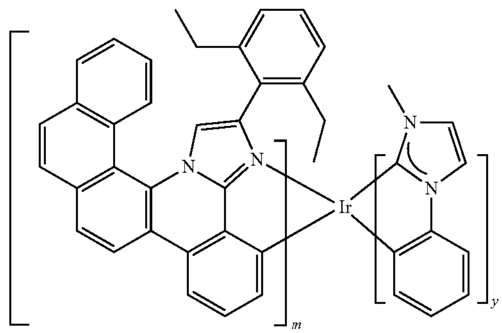
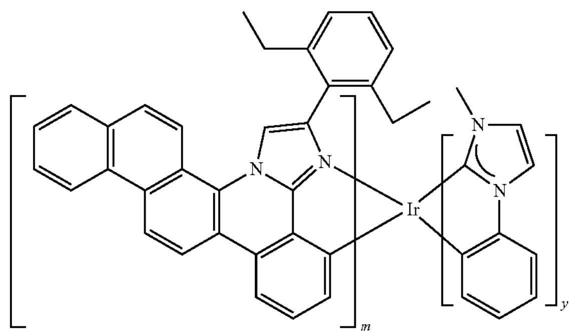
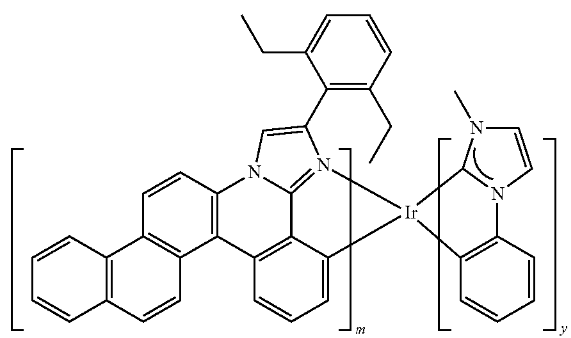
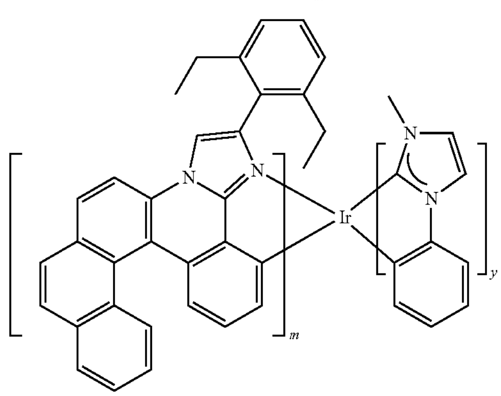

-continued
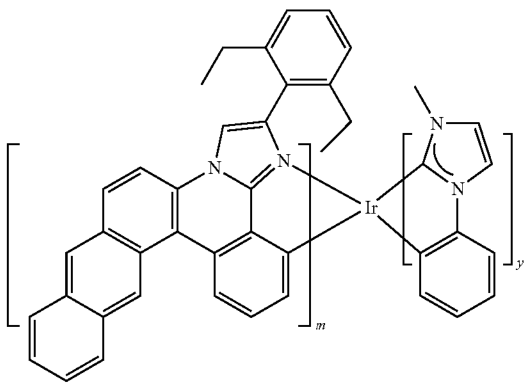
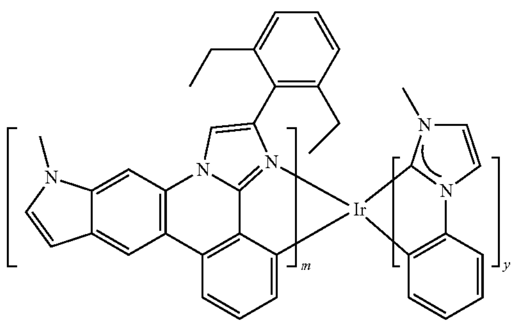
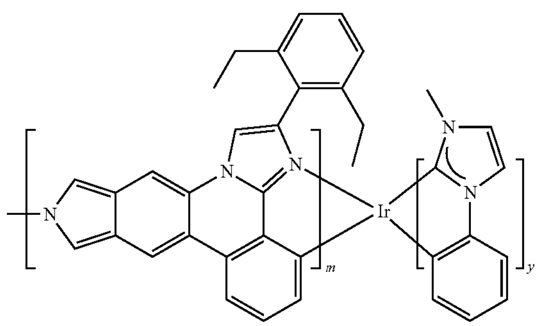
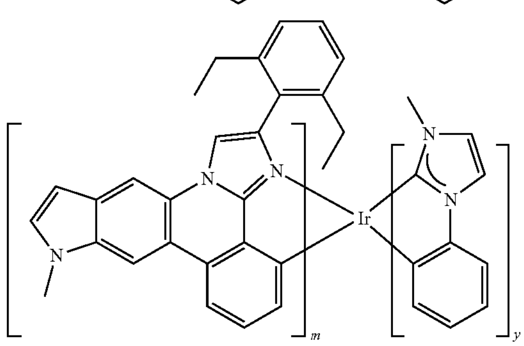
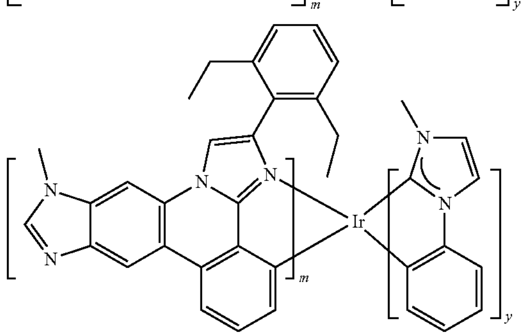
-continued
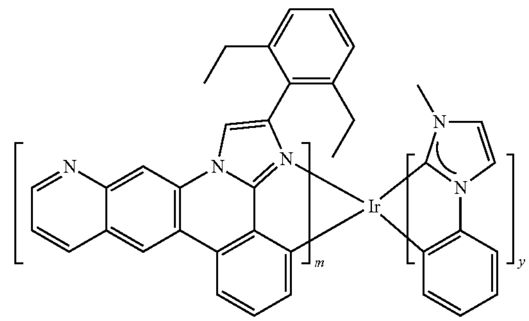
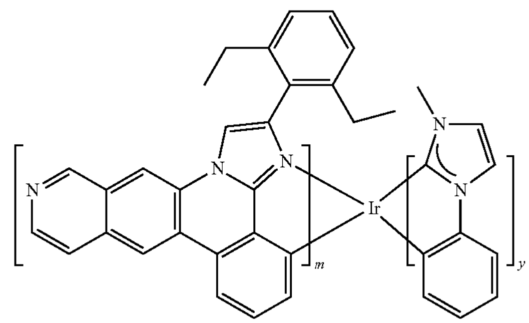
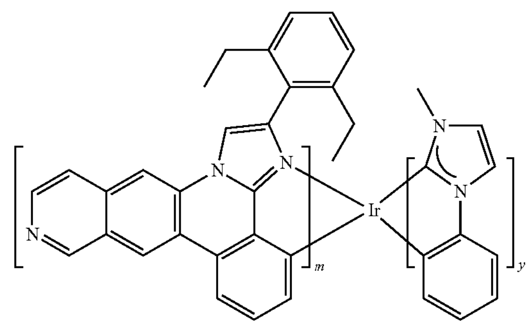
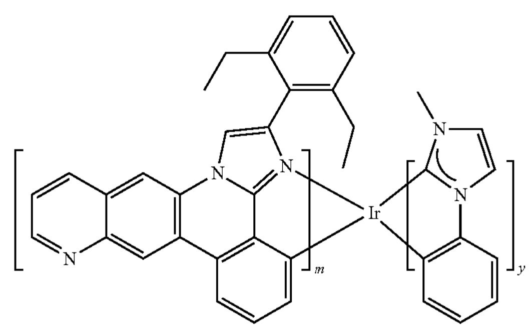
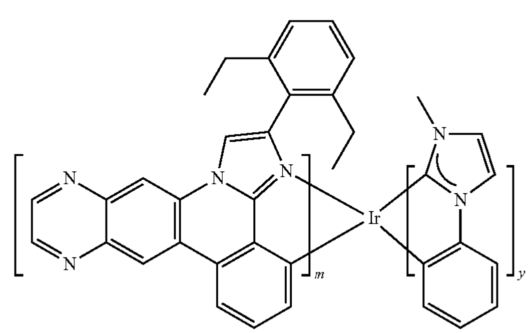

-continued
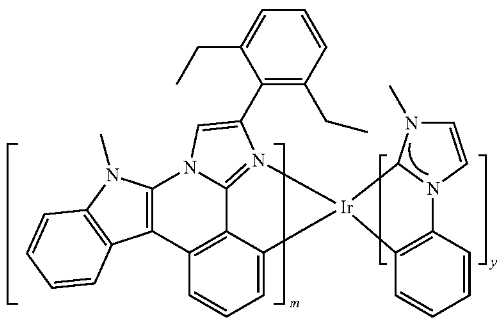
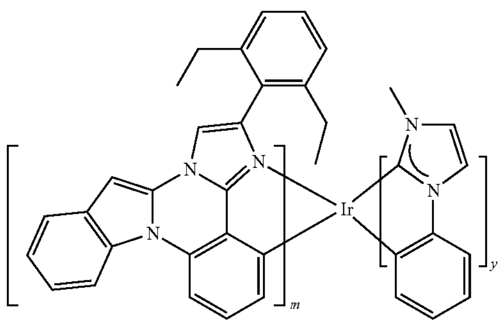
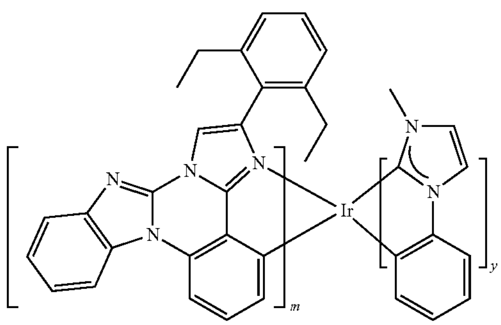
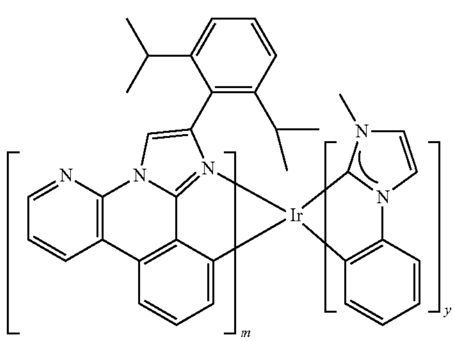
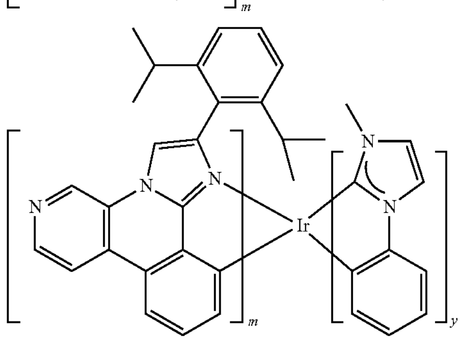
-continued
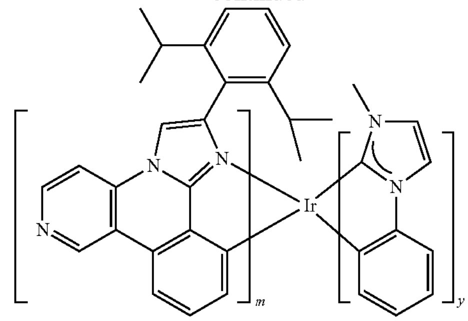
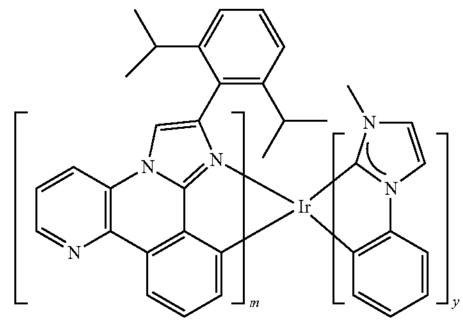
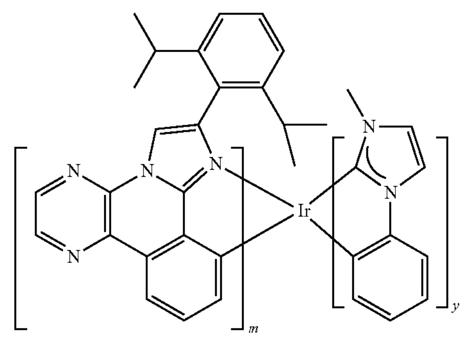
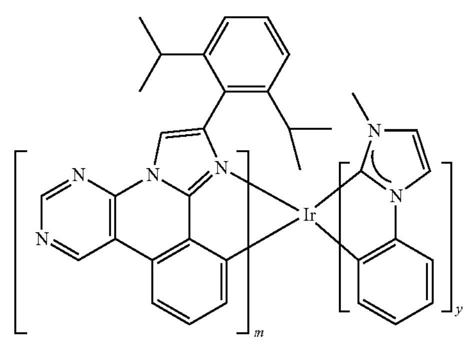
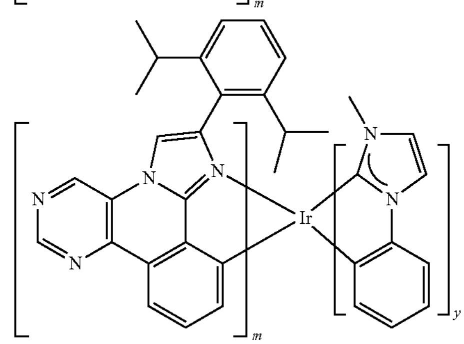

-continued
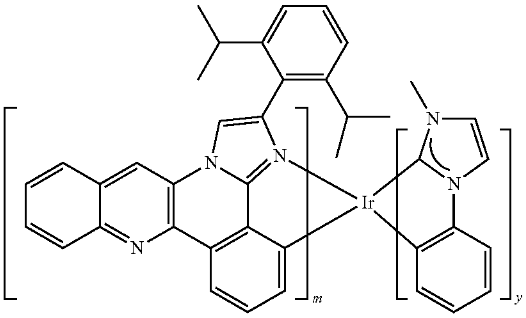
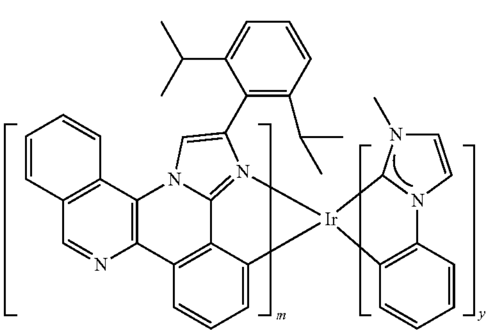
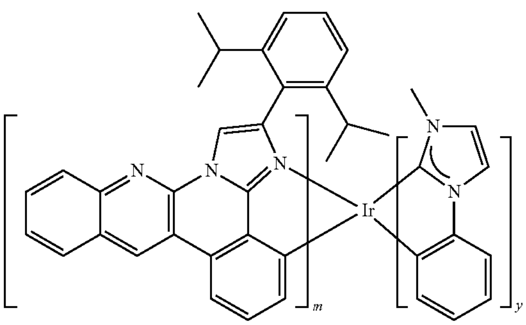
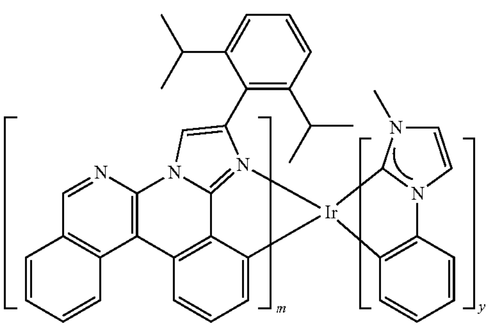
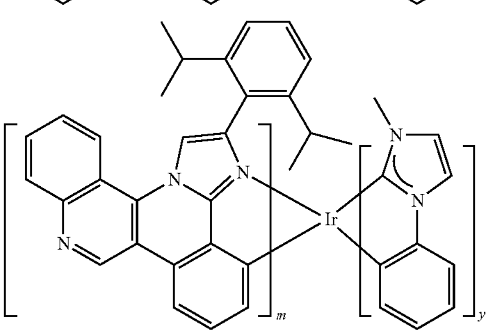
-continued
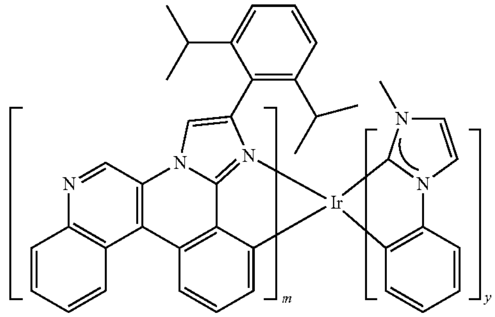
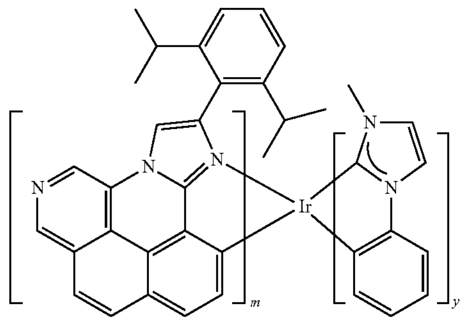
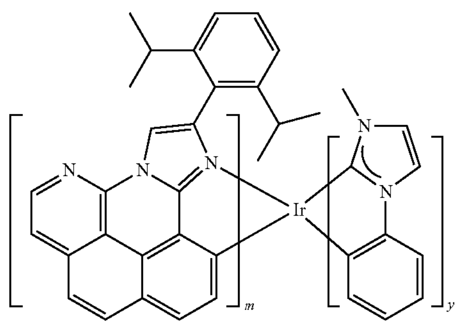
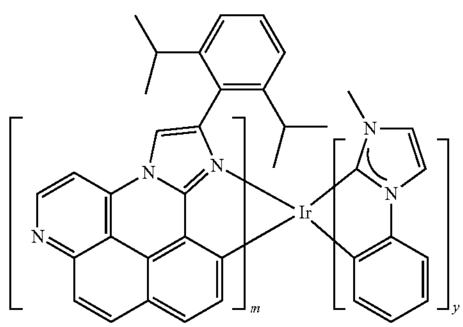
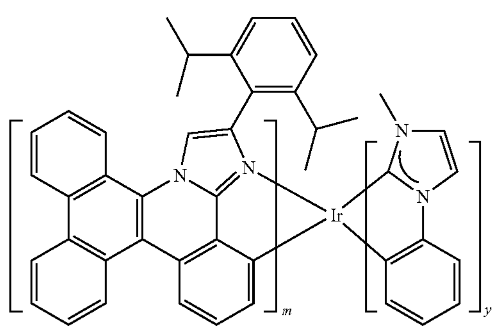

-continued
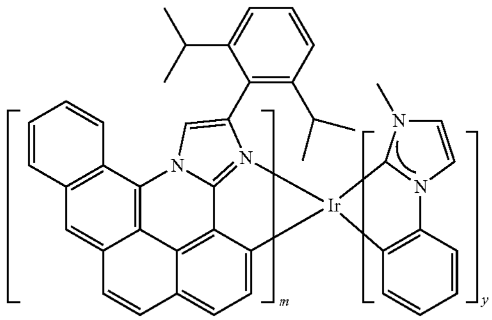
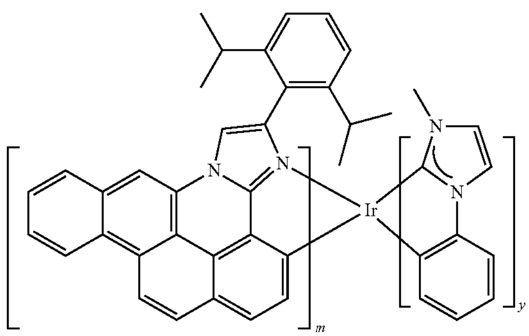
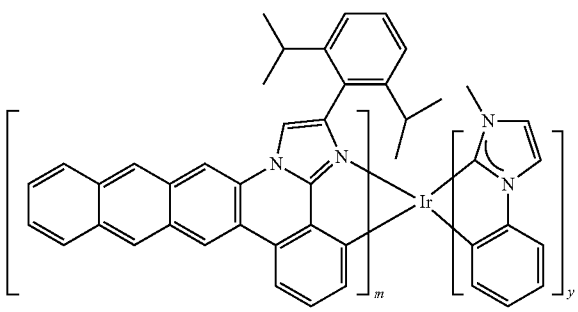
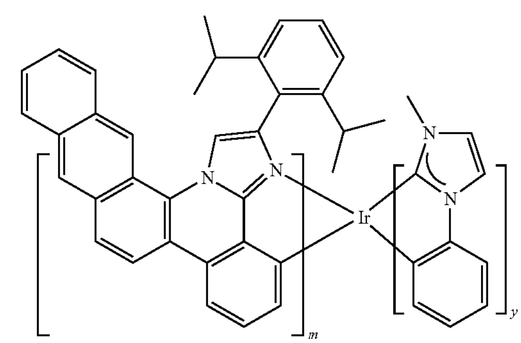
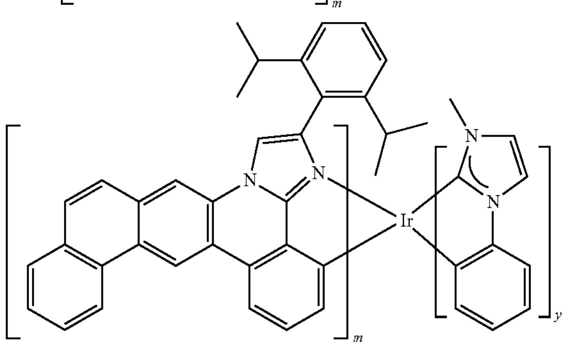
-continued
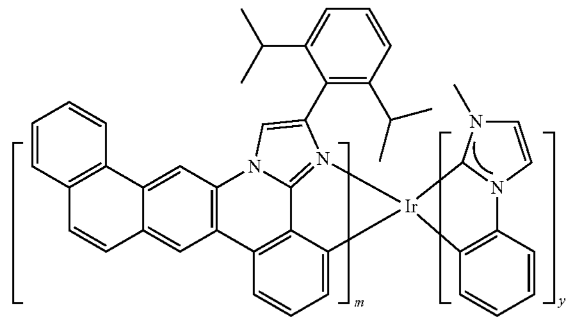
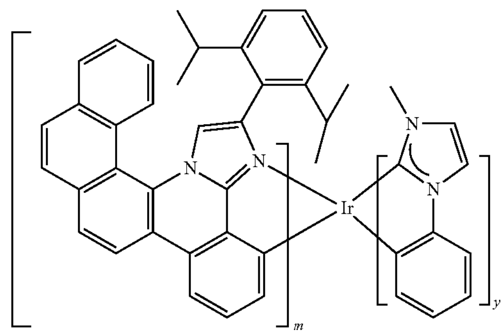
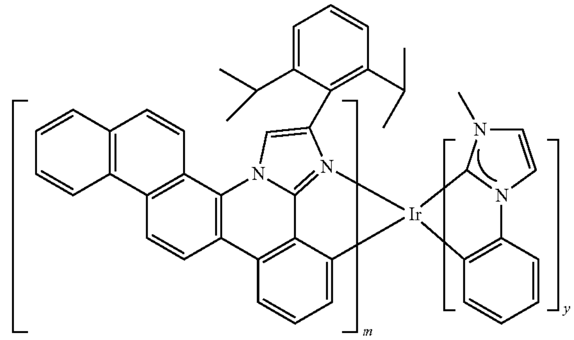
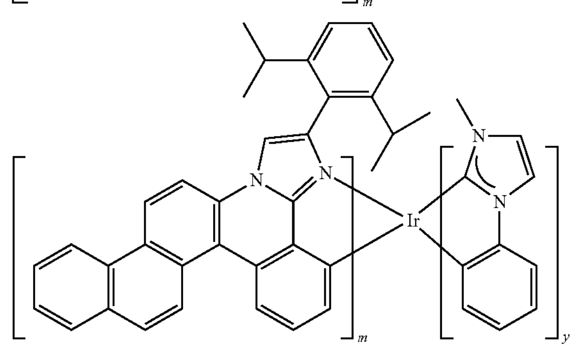
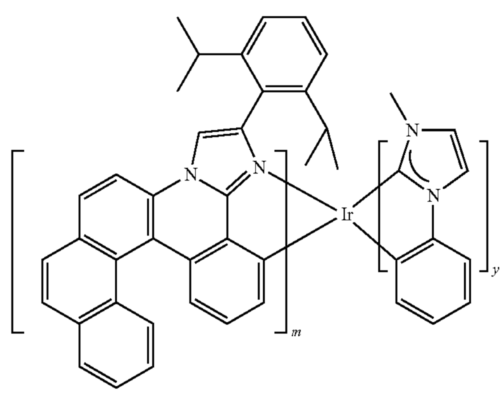

-continued
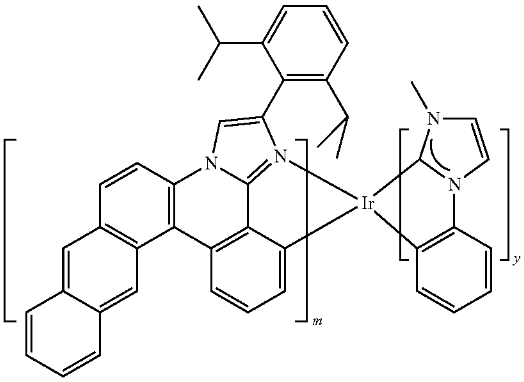
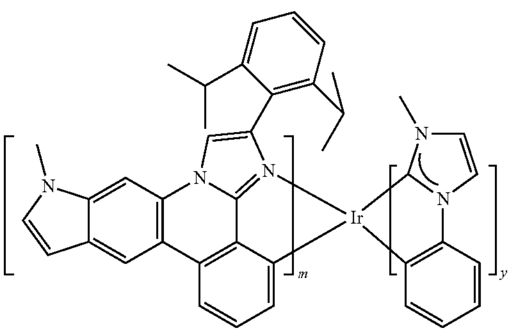
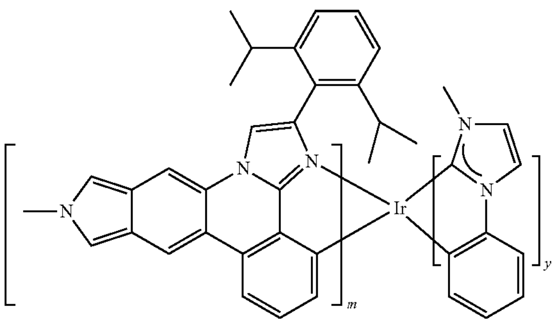
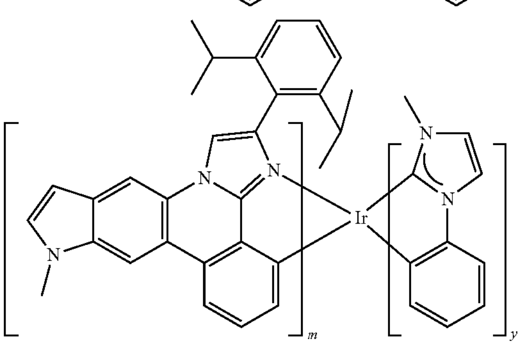
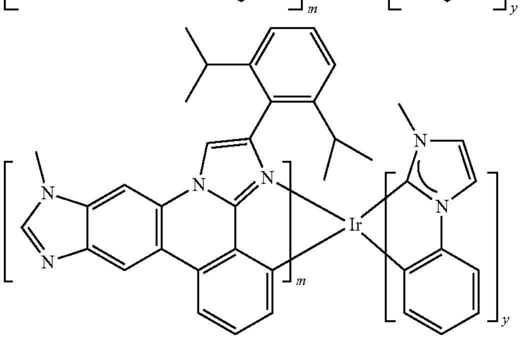
-continued
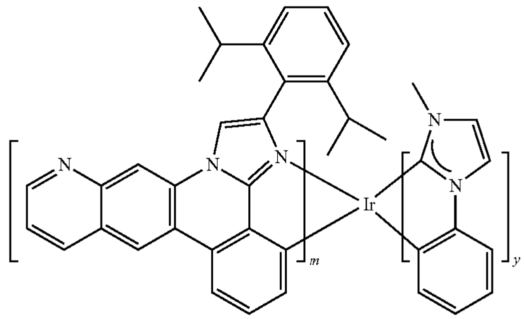
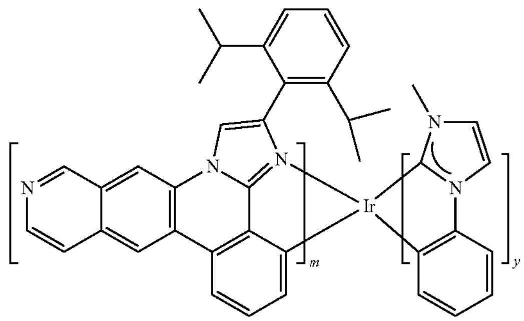
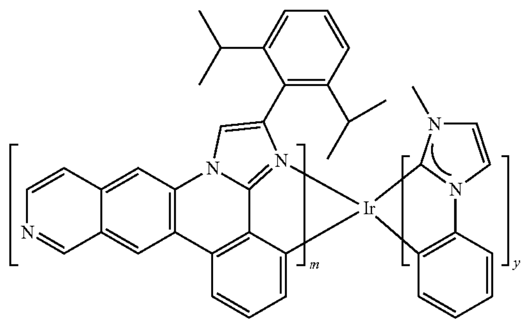
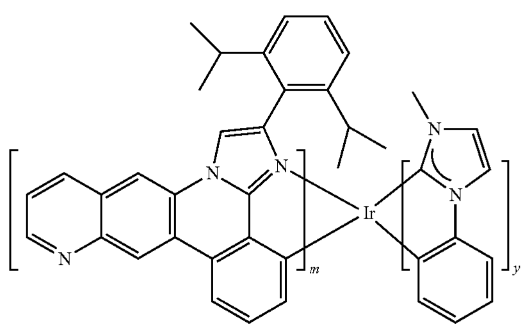
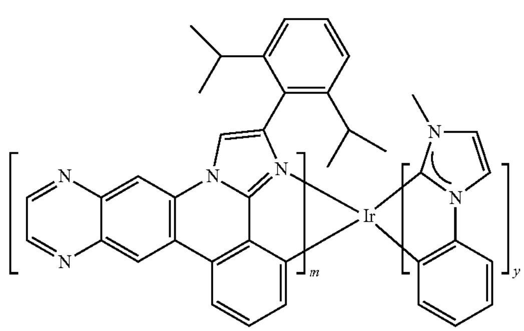

-continued
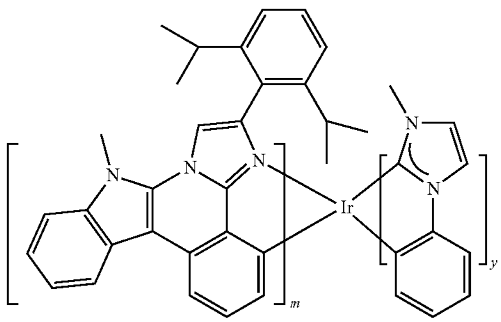
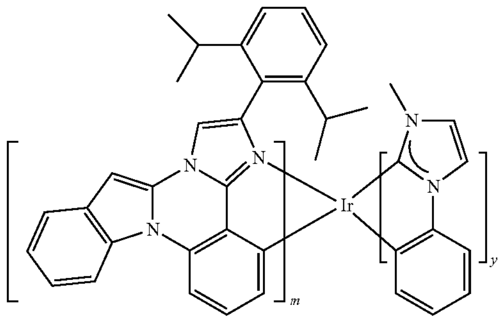
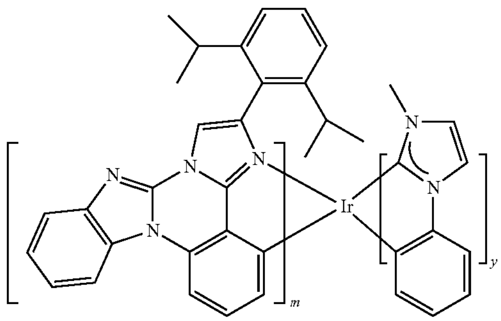
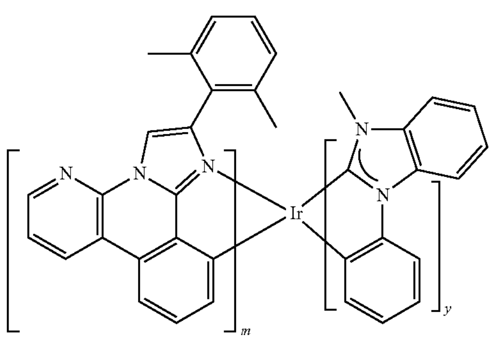
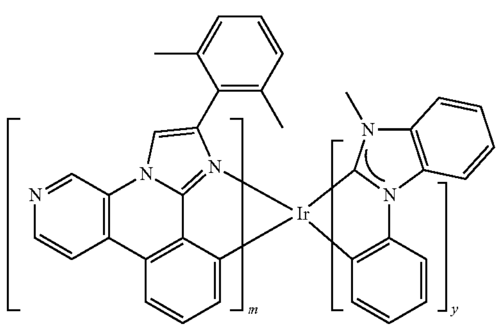
-continued
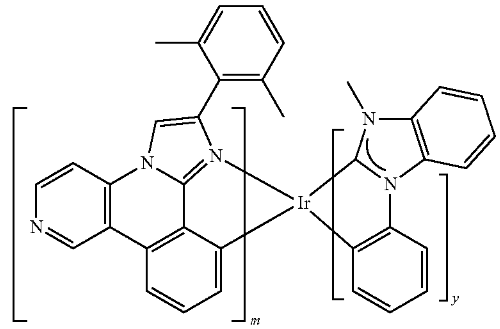
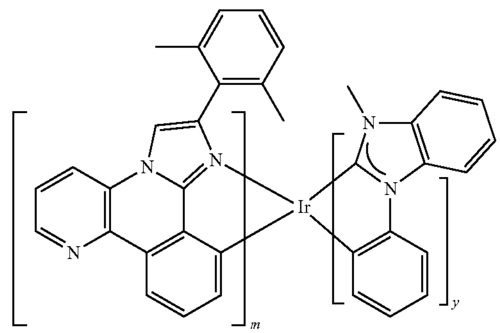
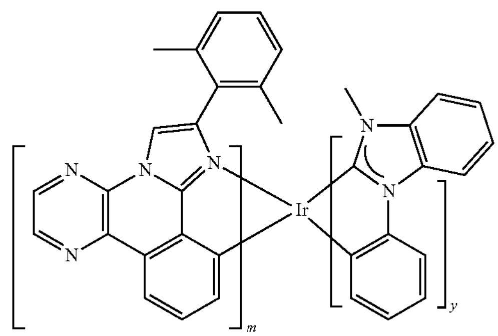
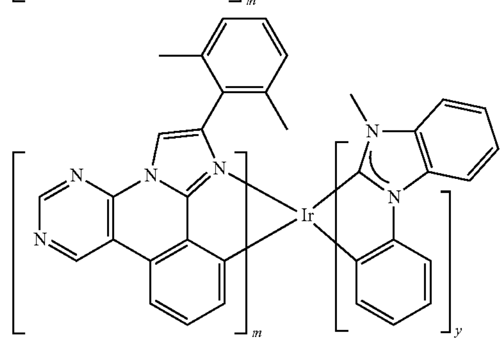
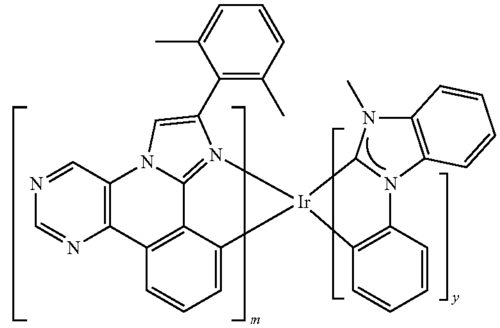

-continued
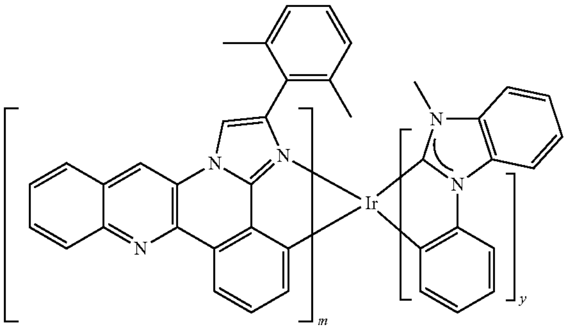
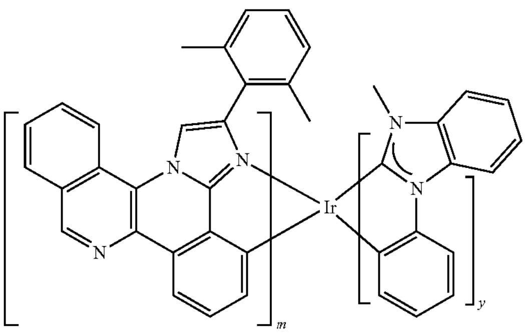
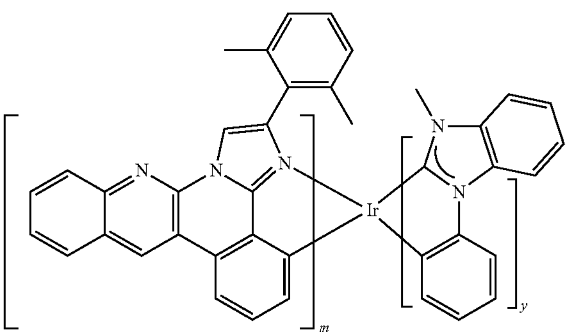
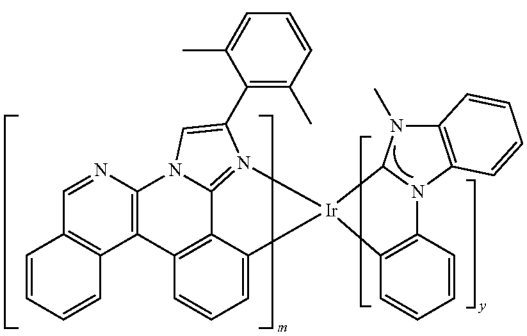
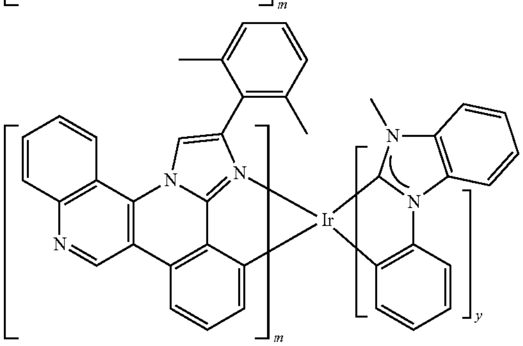
-continued
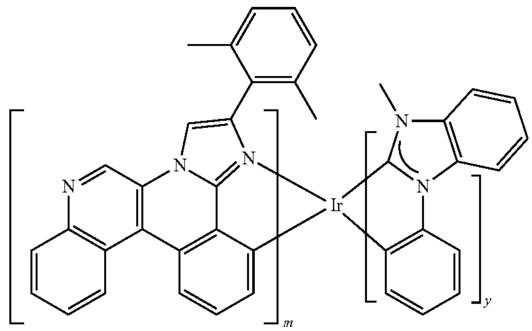
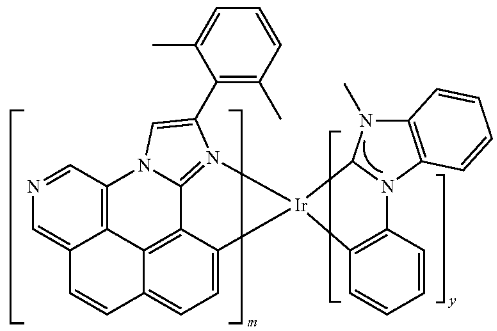
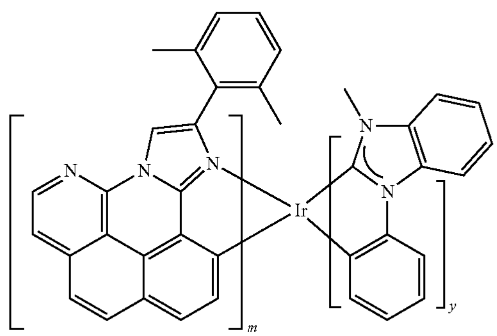
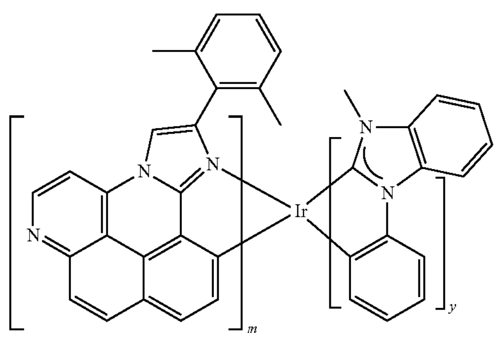
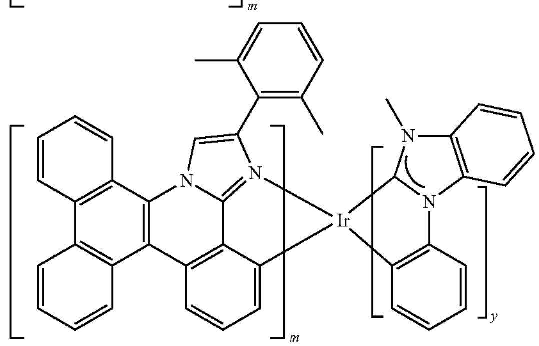

-continued
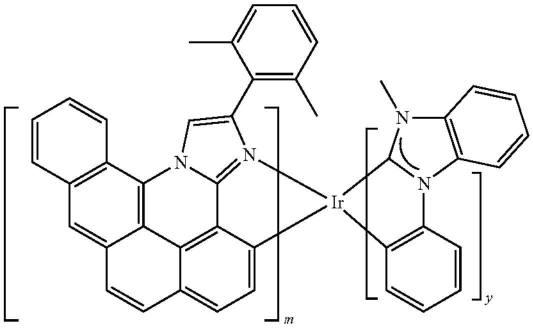
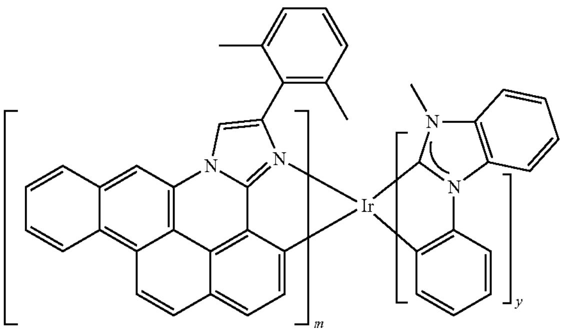
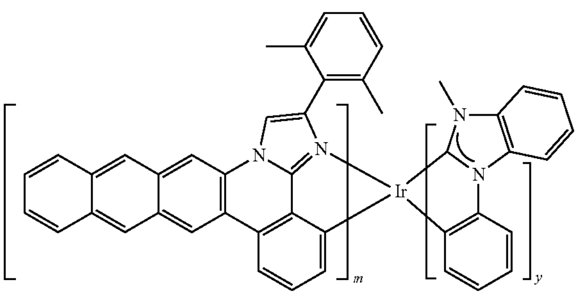
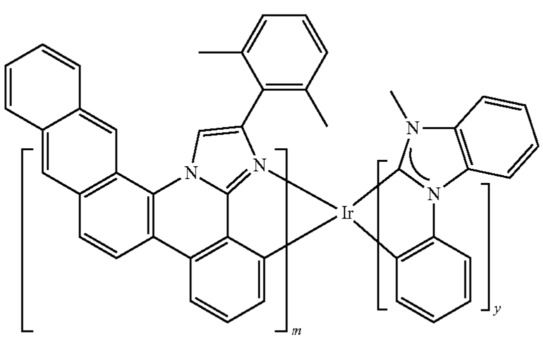
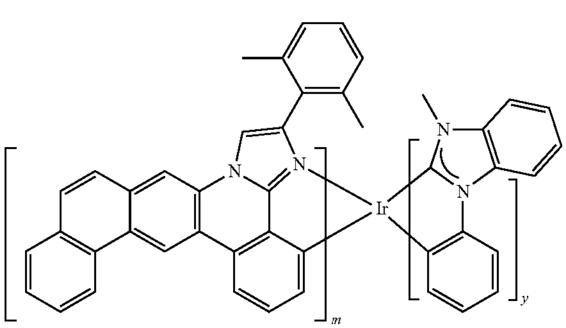
-continued
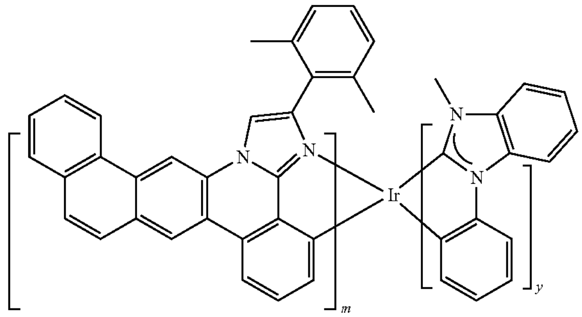
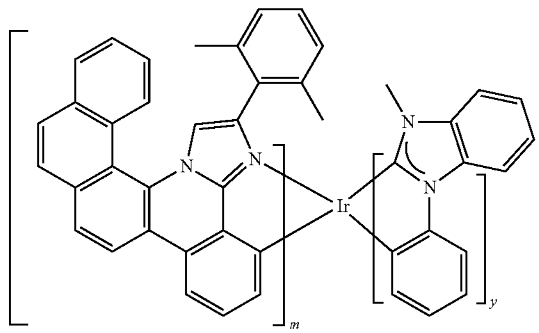
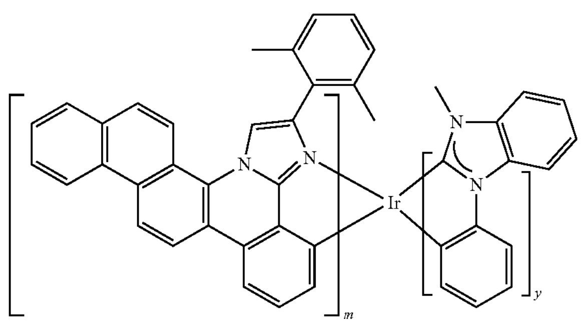
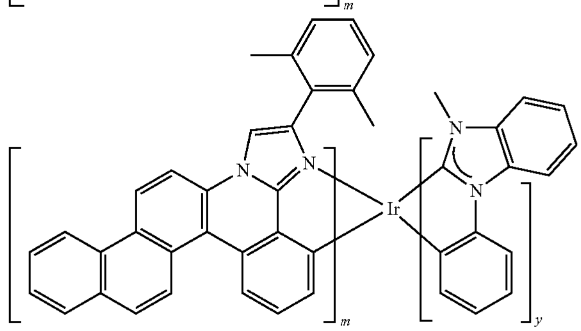
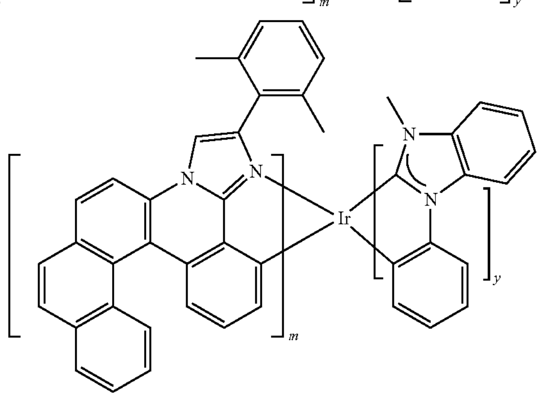

-continued
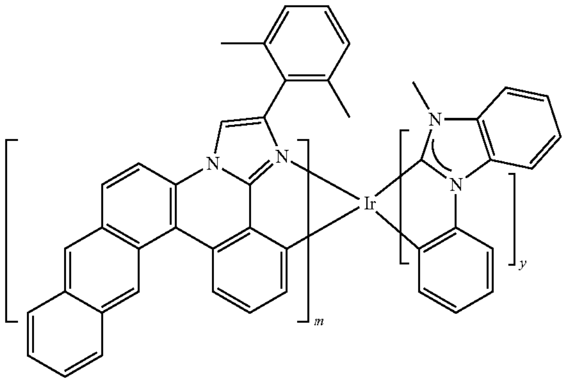
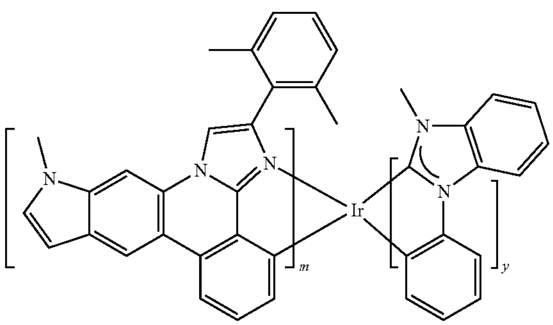
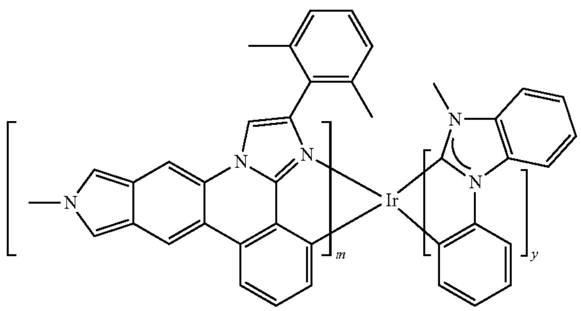
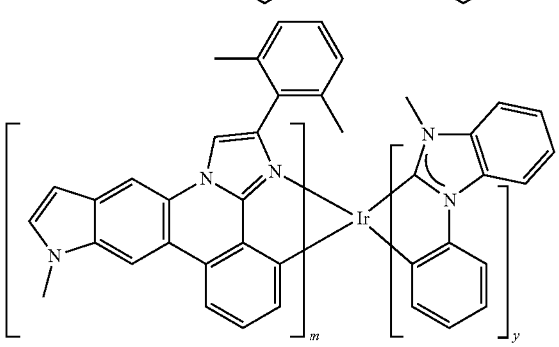
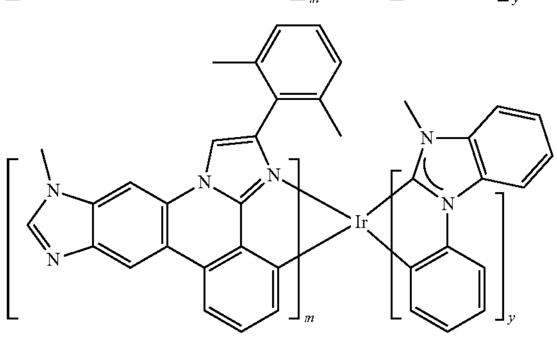
-continued
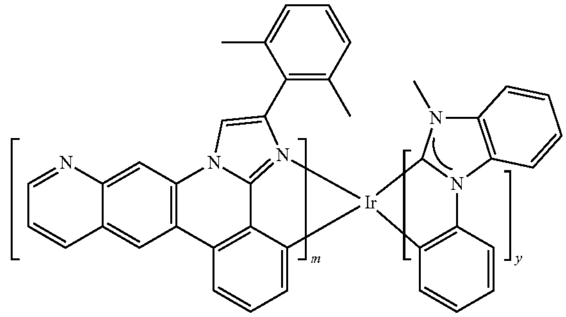
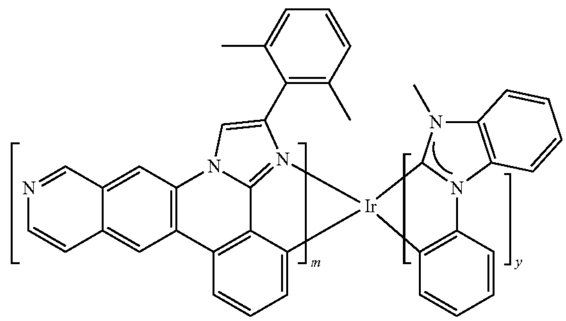
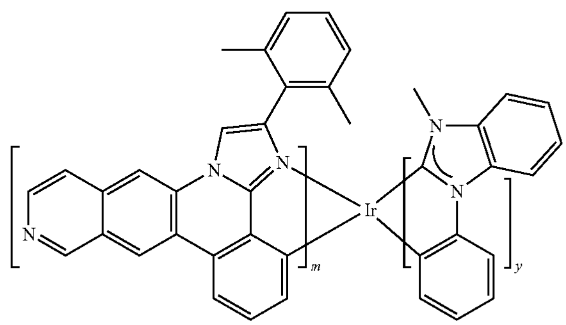
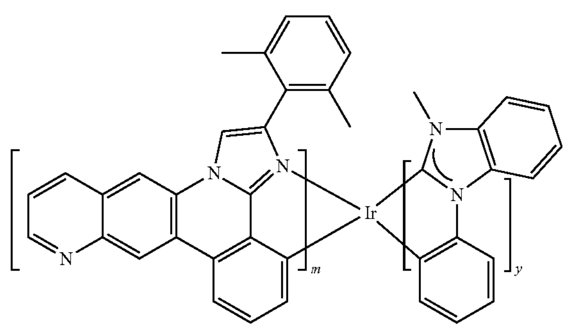
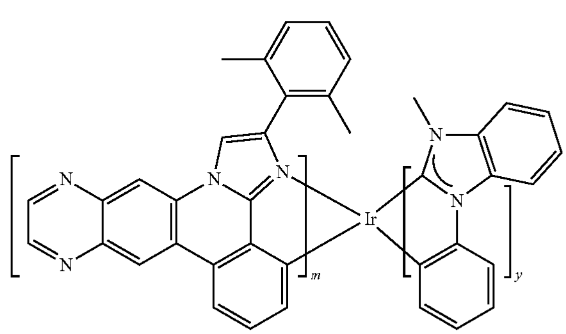

-continued
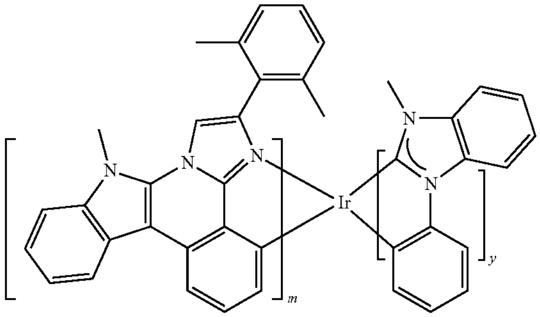
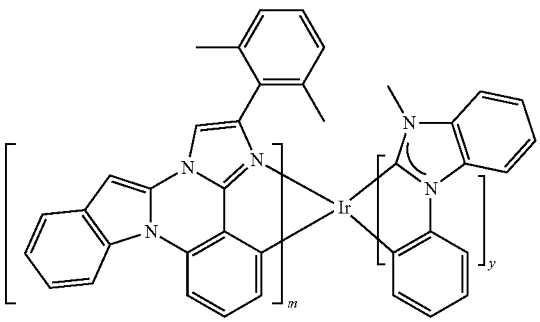
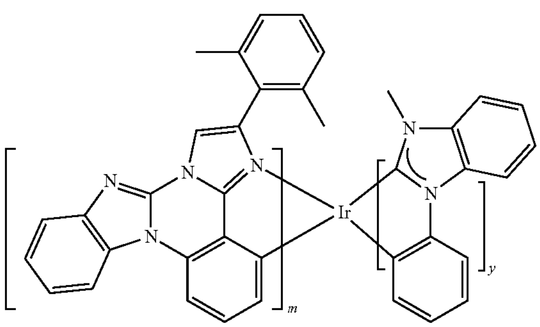
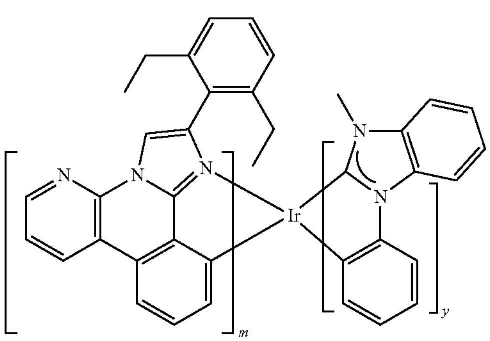
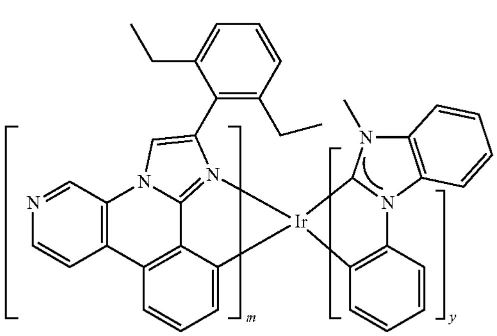
-continued
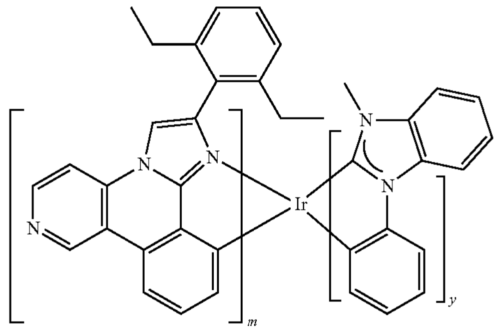
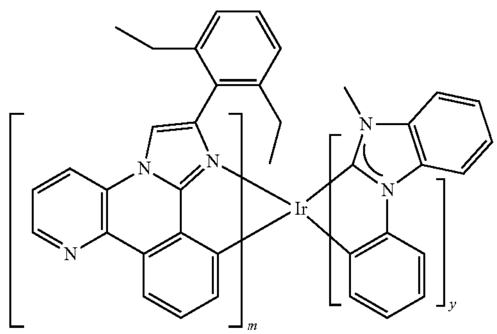
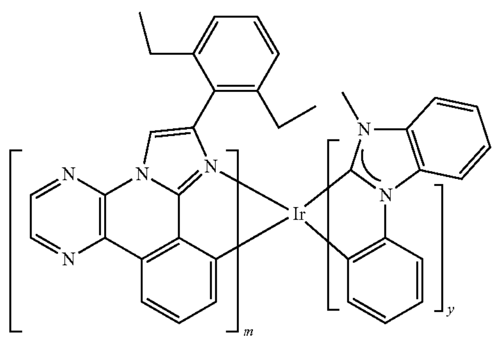
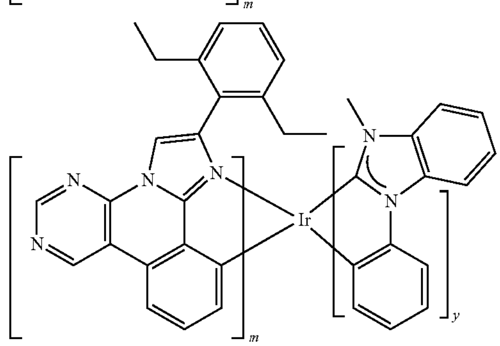
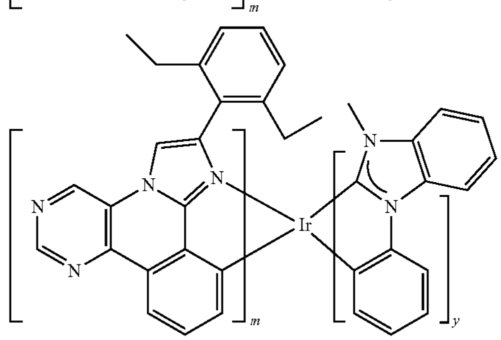

-continued
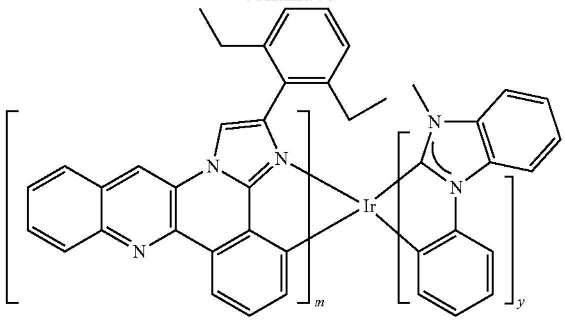
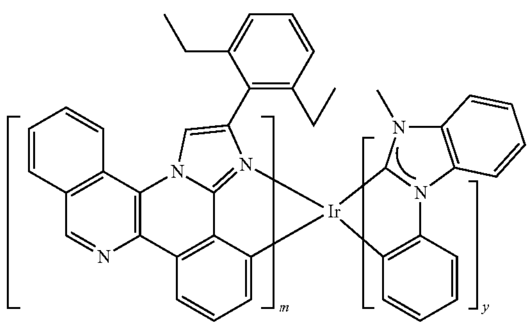
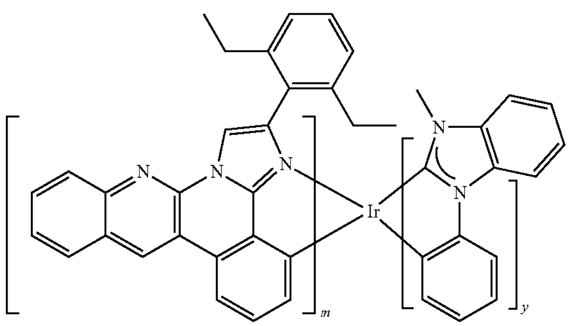
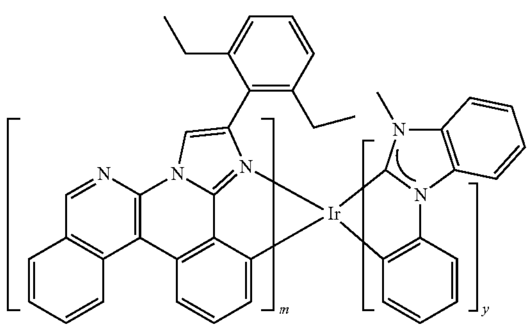
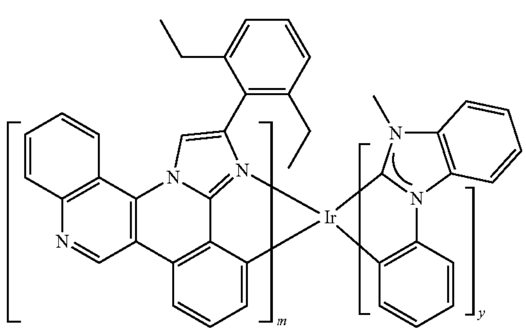
-continued
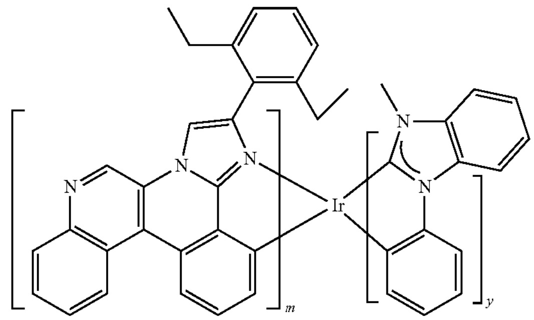
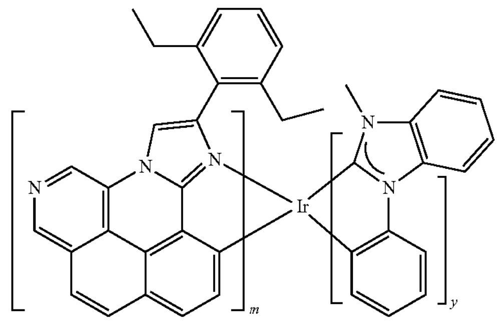
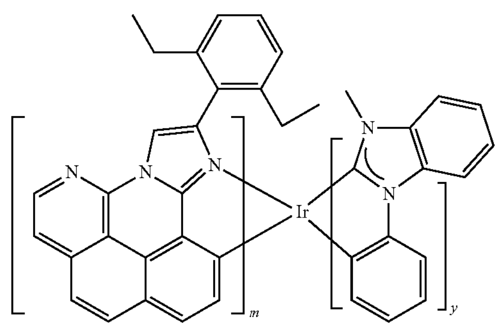
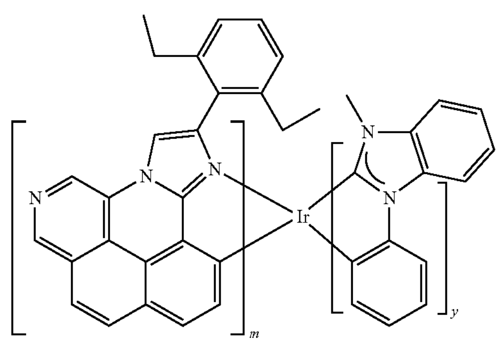
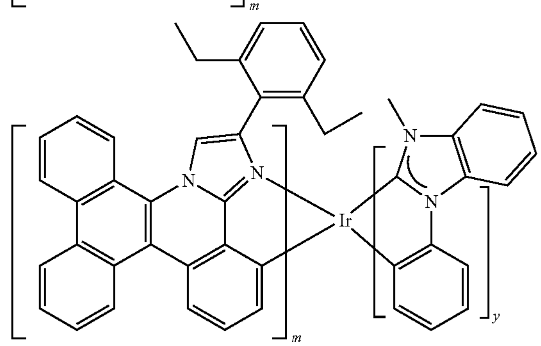

-continued
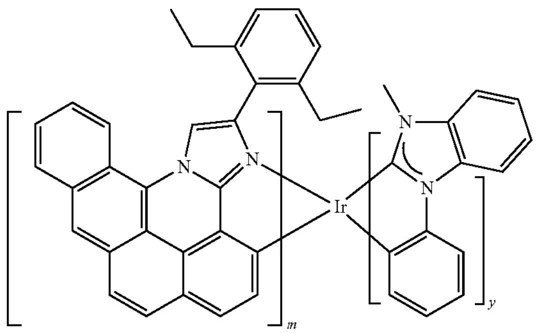
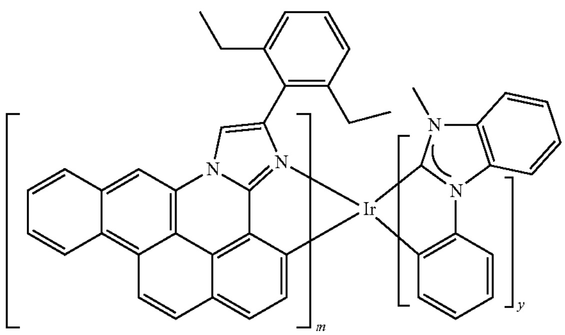
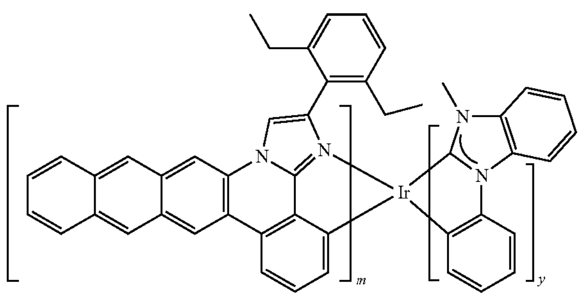
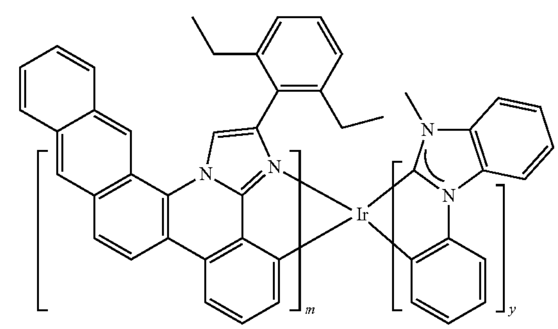
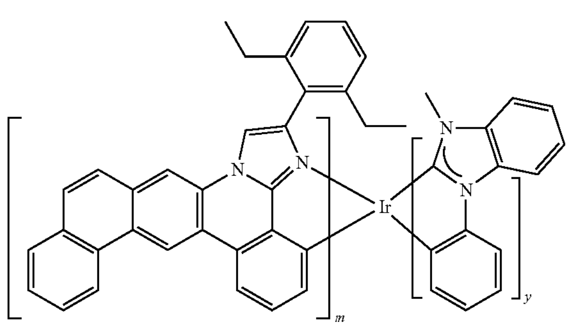
-continued
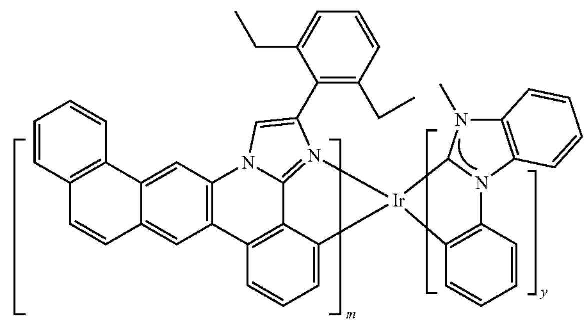
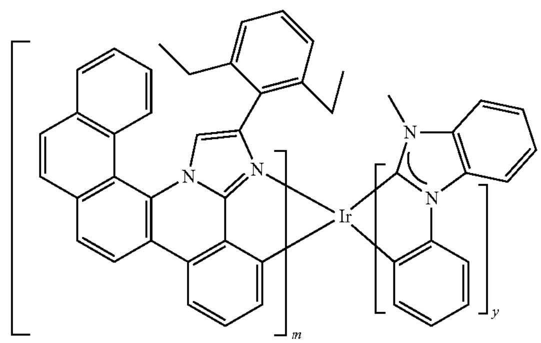
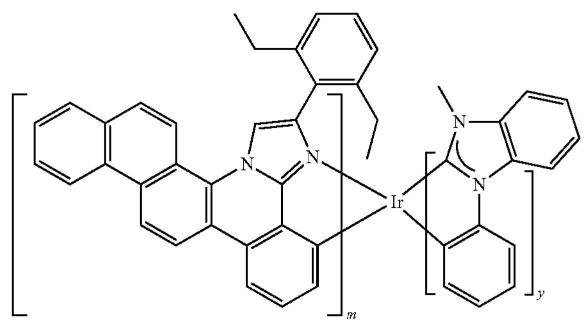
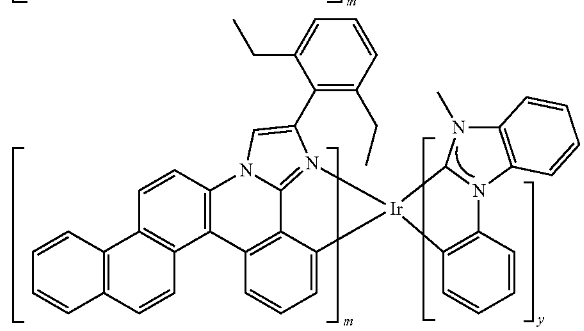
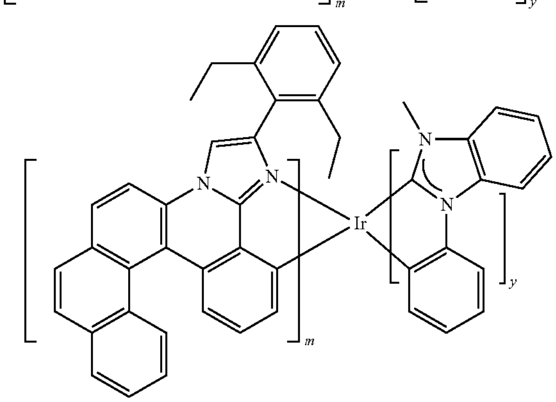

-continued
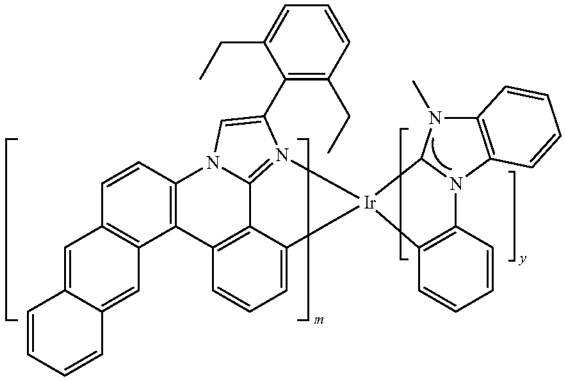
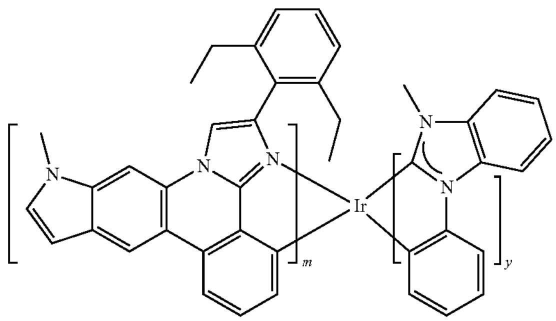
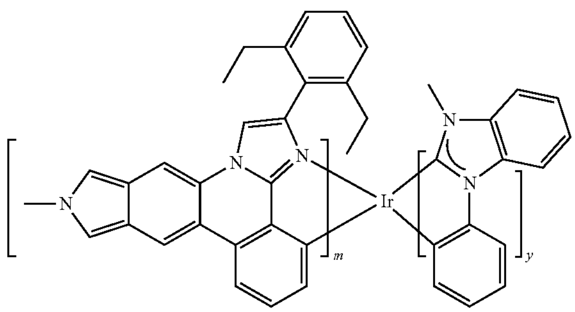
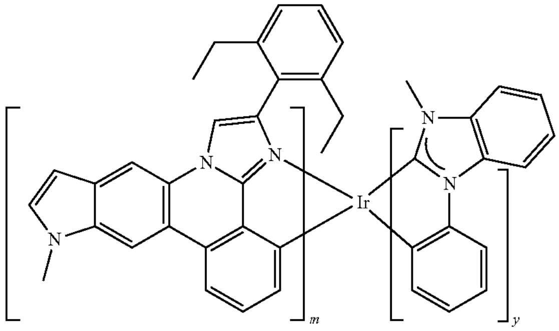
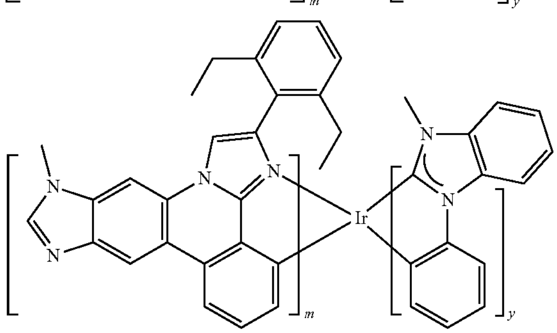
-continued
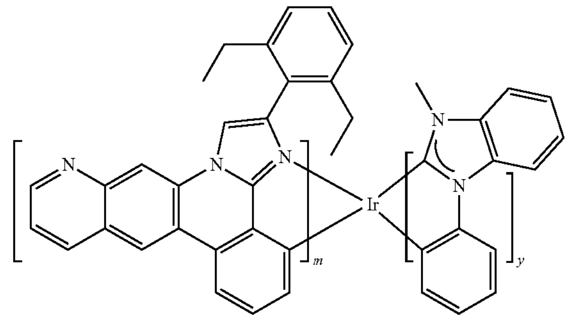
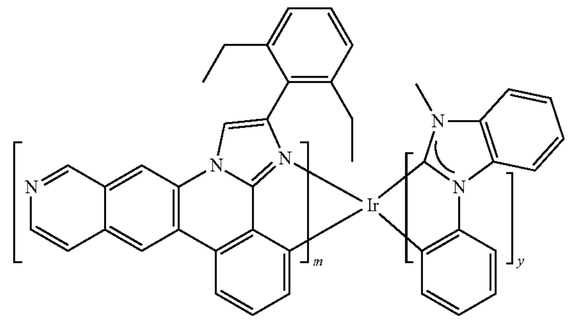
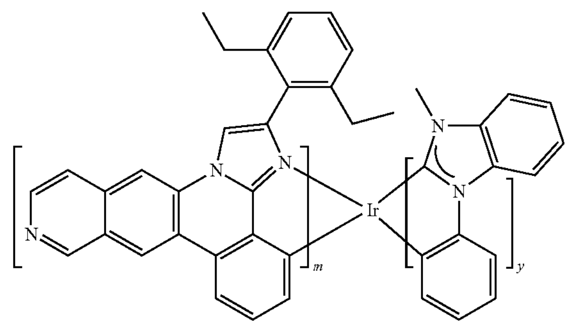
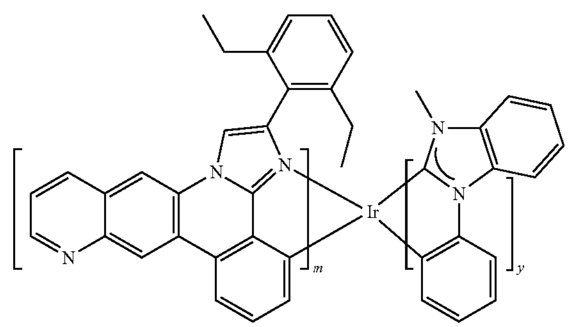
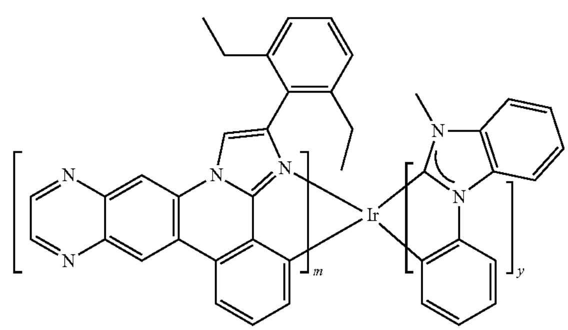

-continued
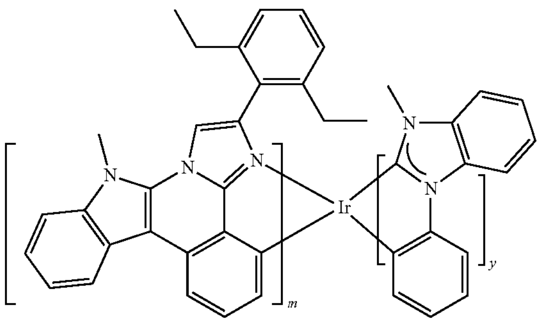
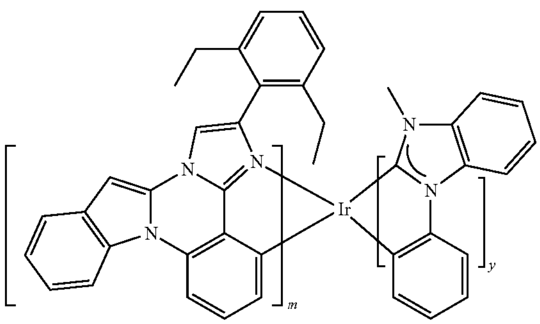
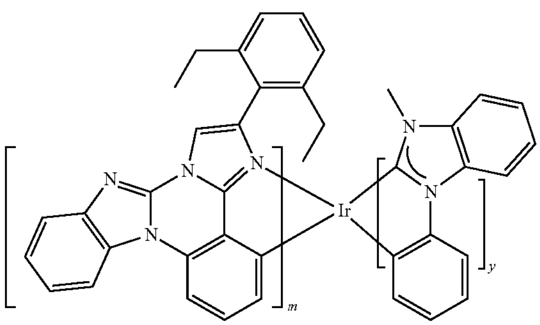
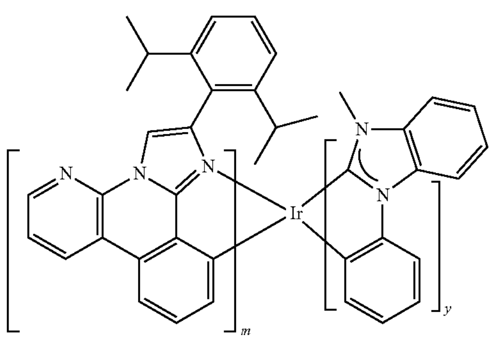
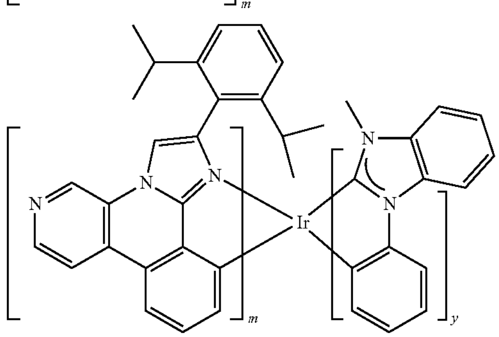
-continued
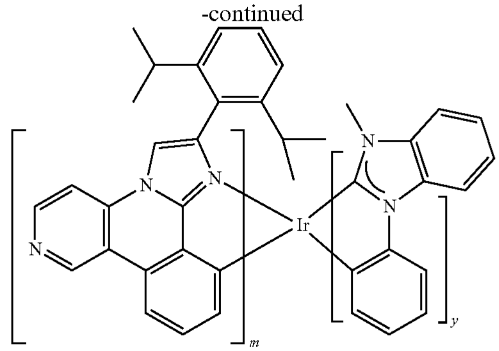
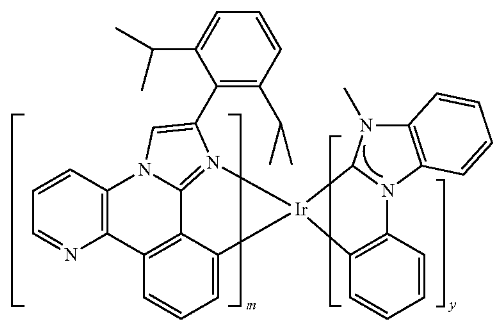
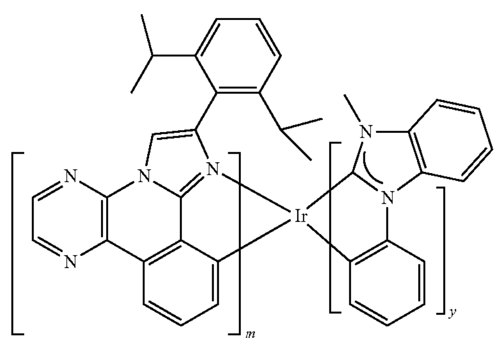
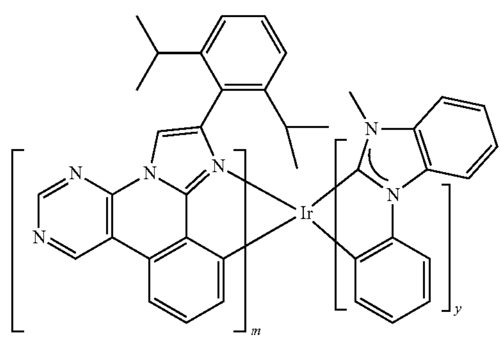
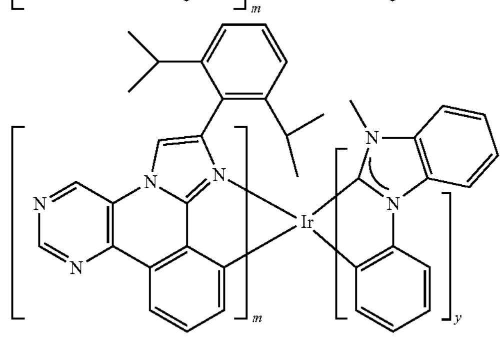

-continued
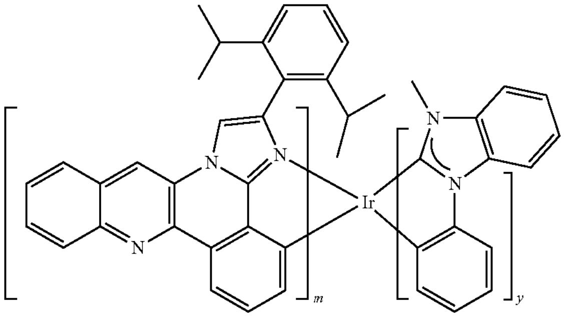
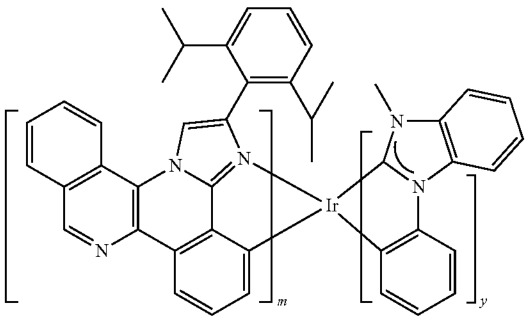
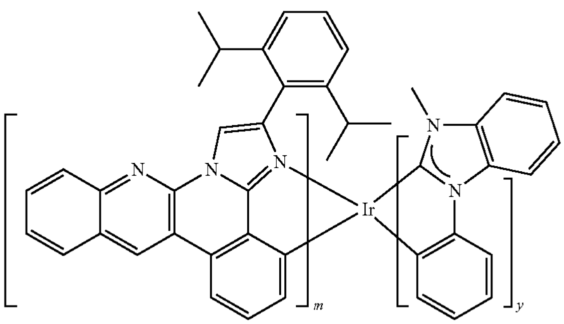
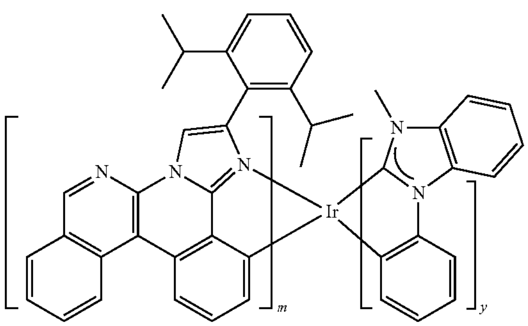
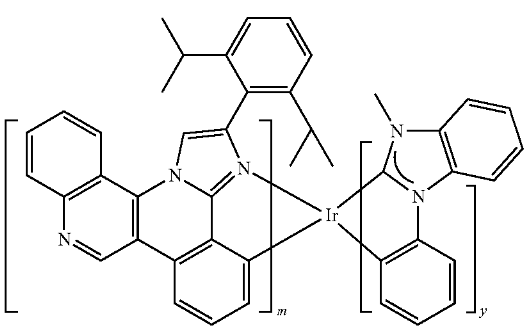
-continued
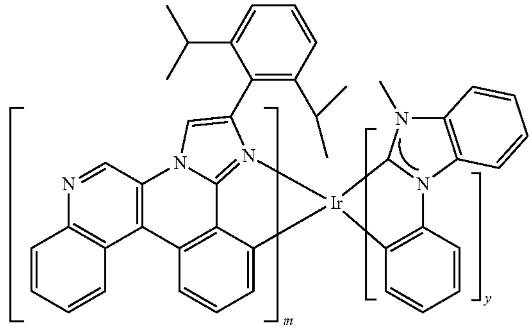
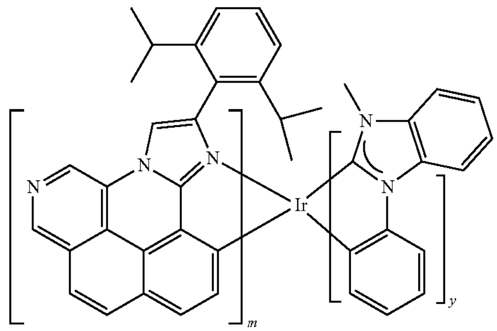
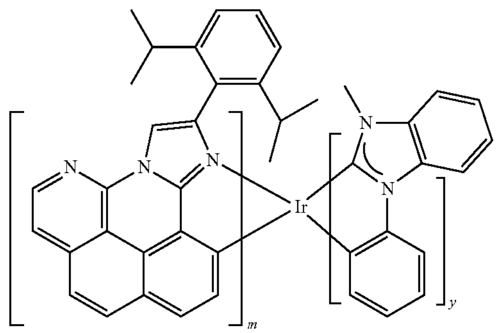
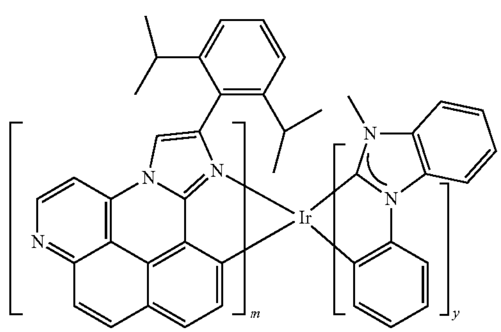
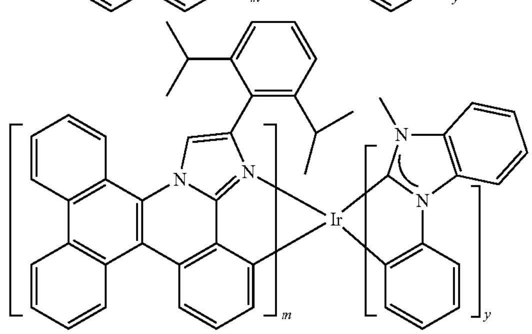

-continued
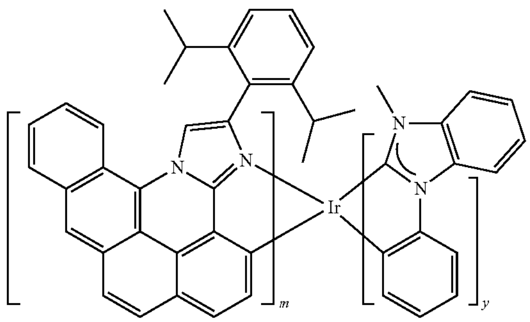
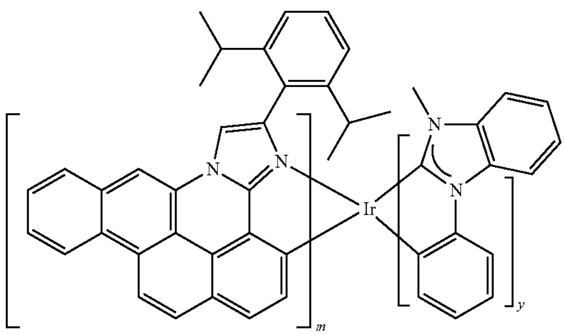
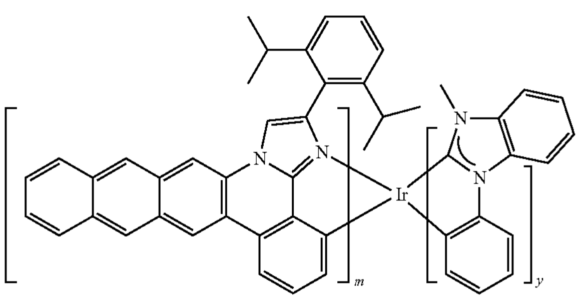
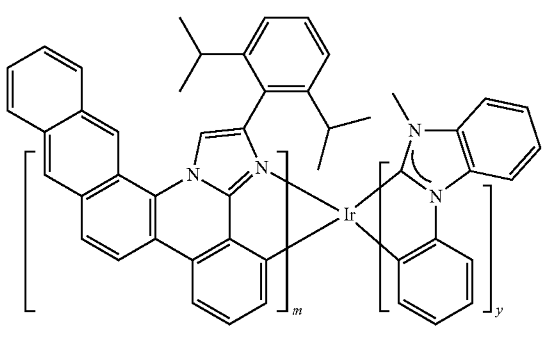
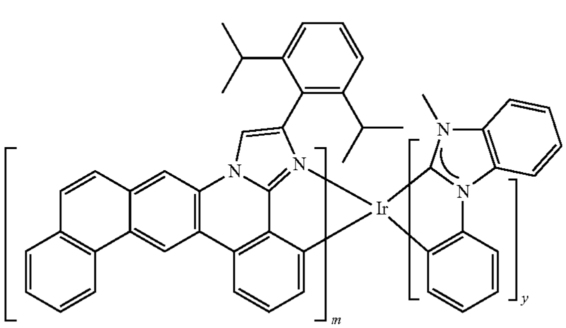
-continued
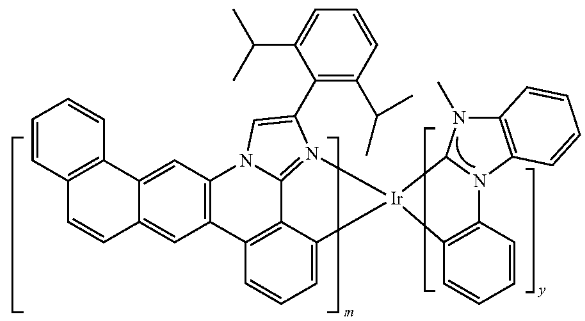
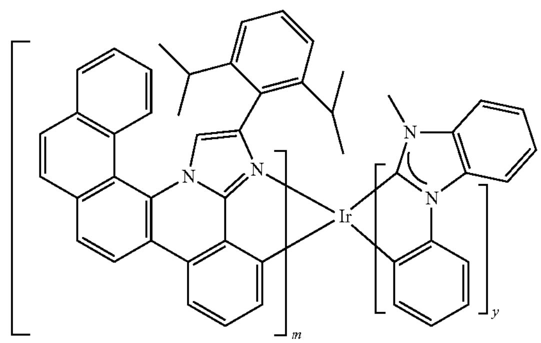
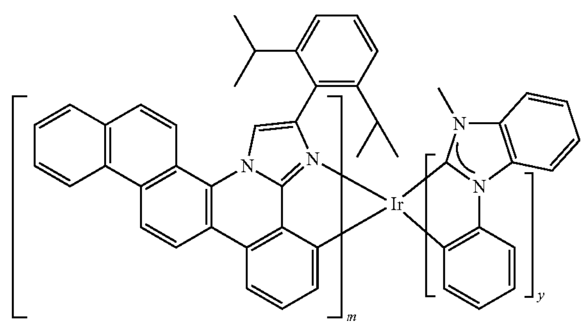
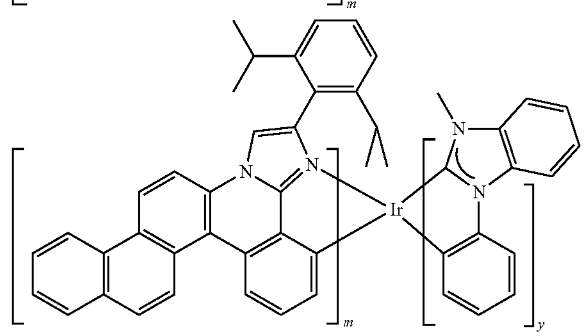
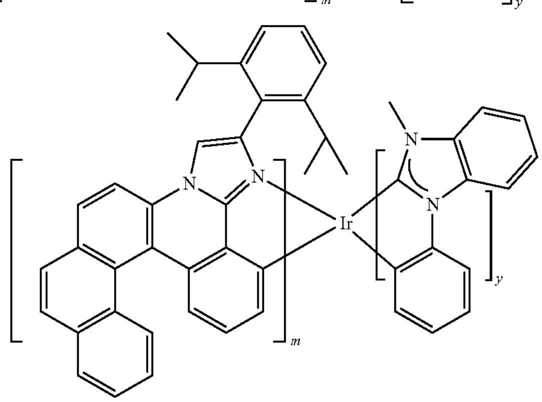

-continued
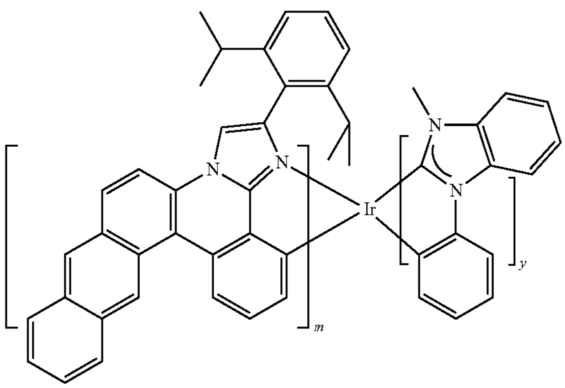
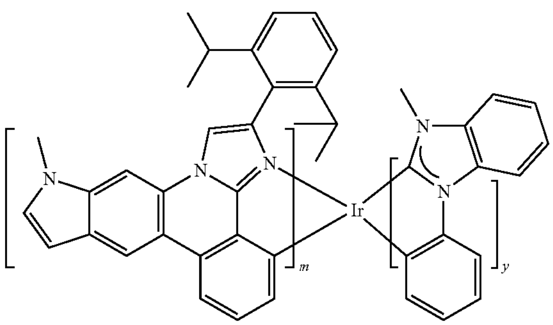
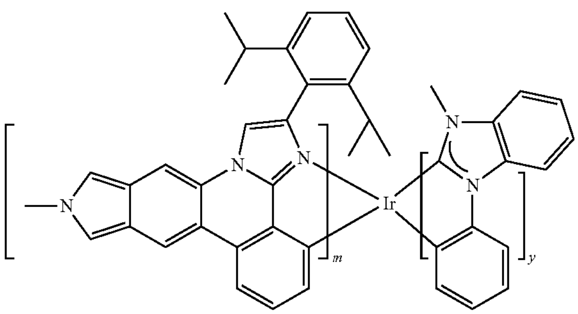
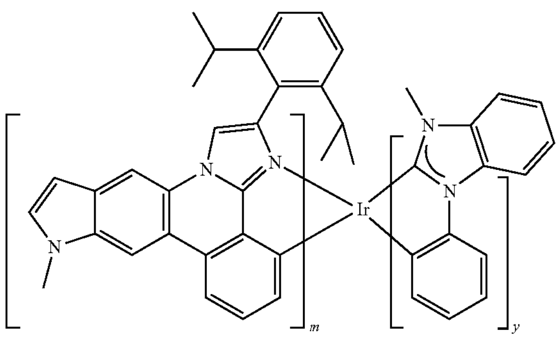
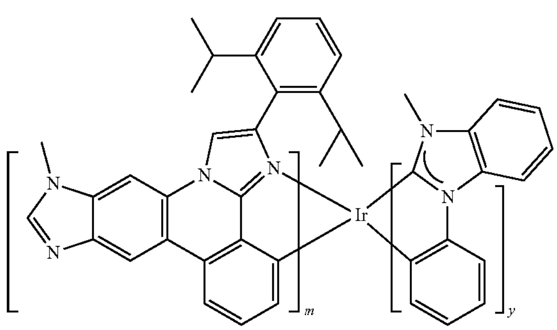
-continued
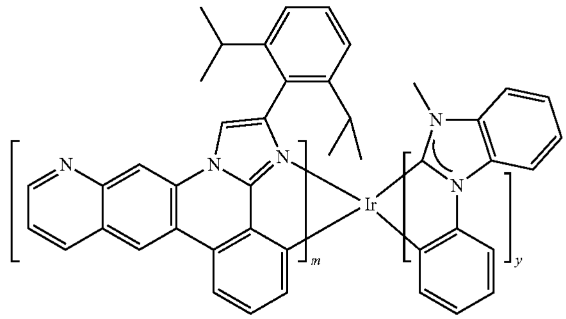
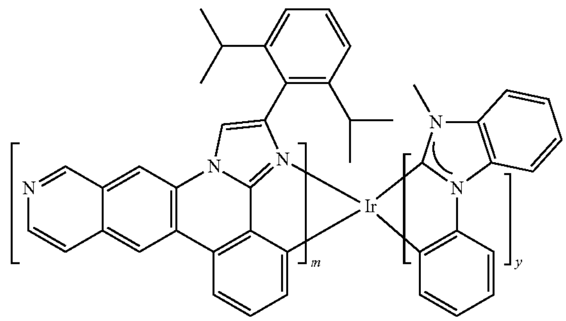
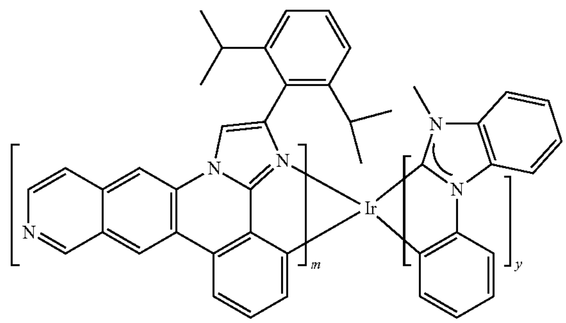
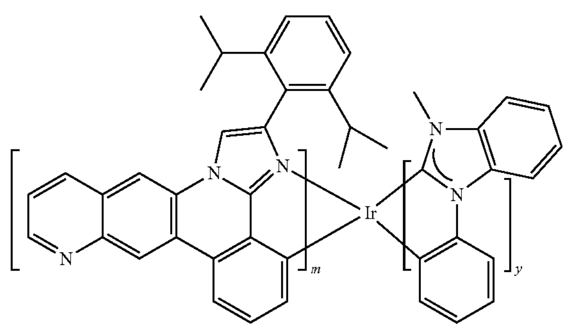
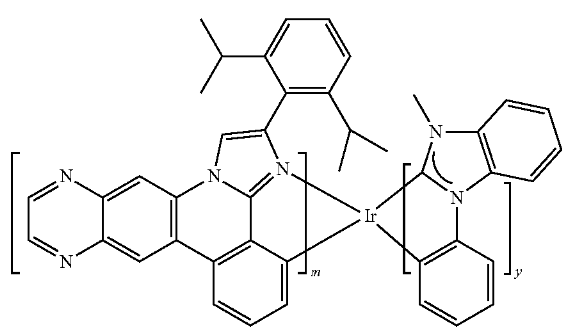

-continued
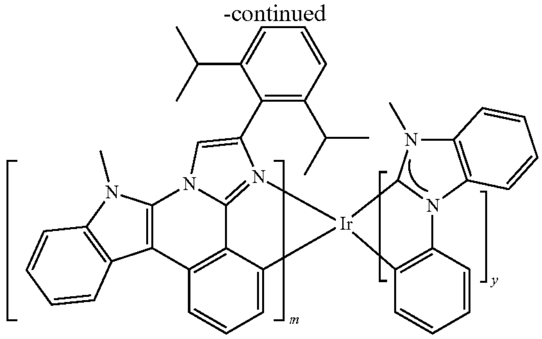
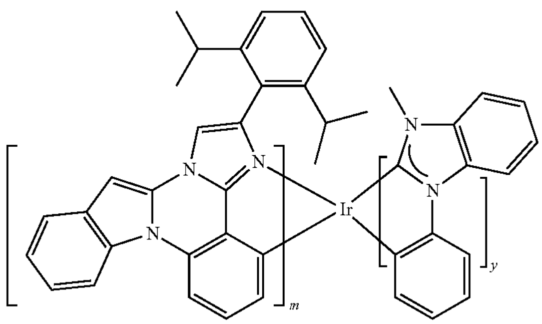
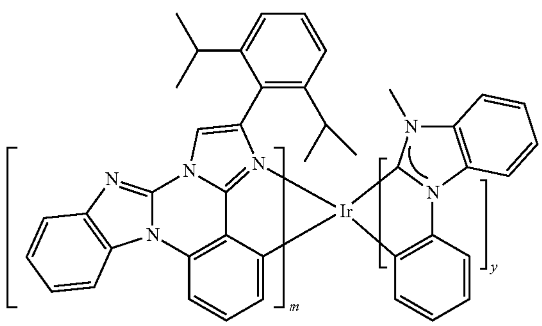
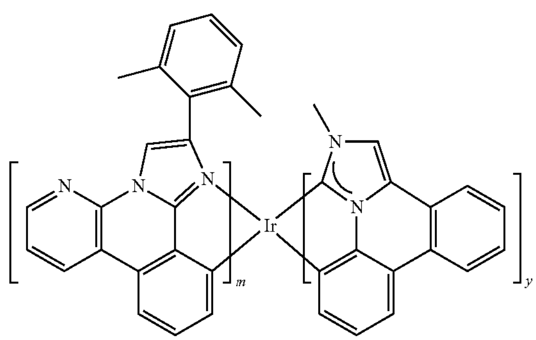
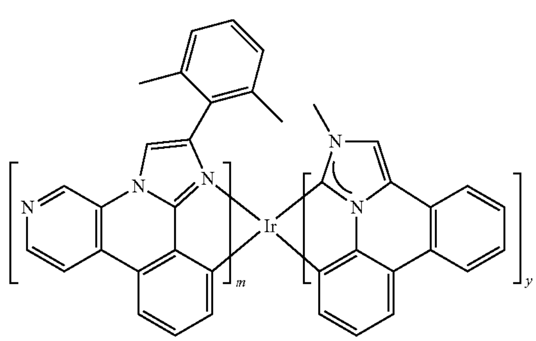
-continued
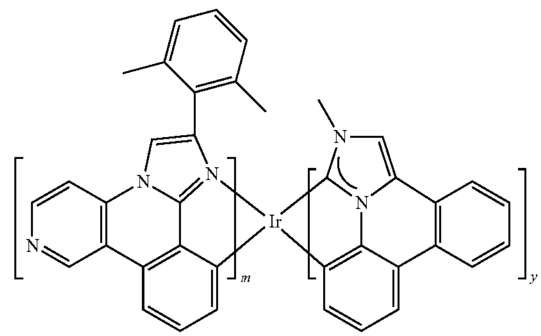
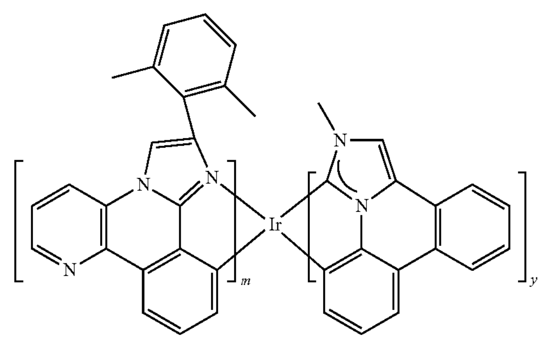
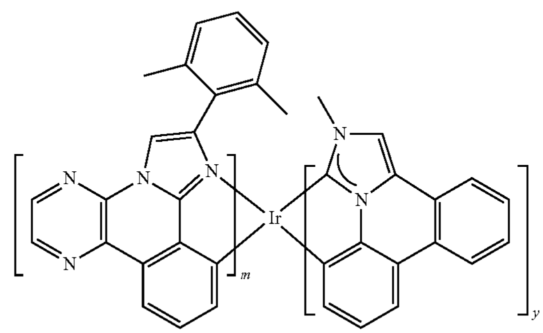
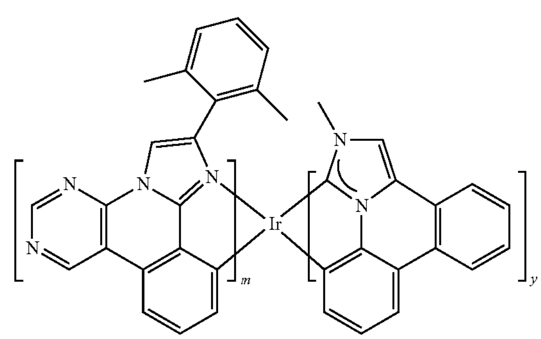
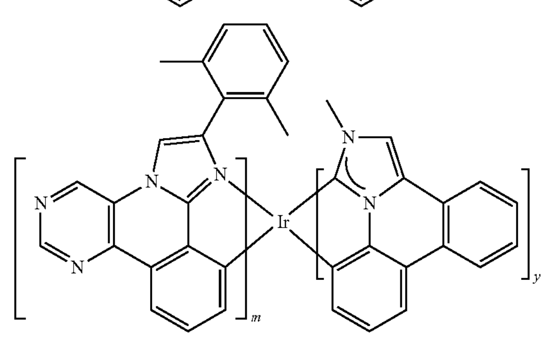

-continued
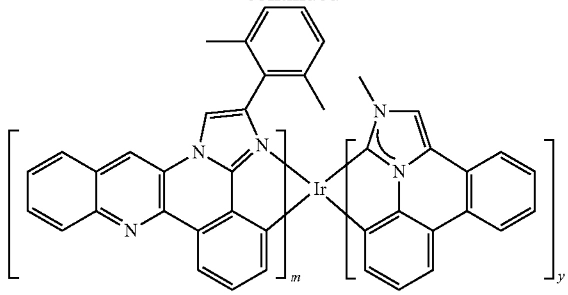
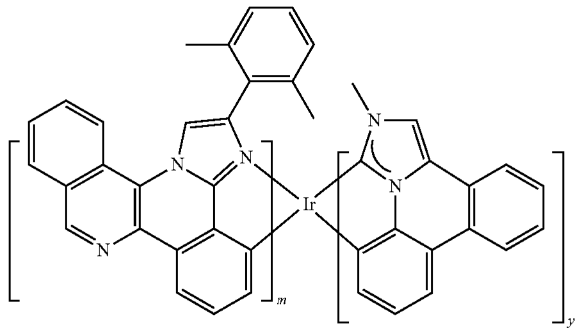
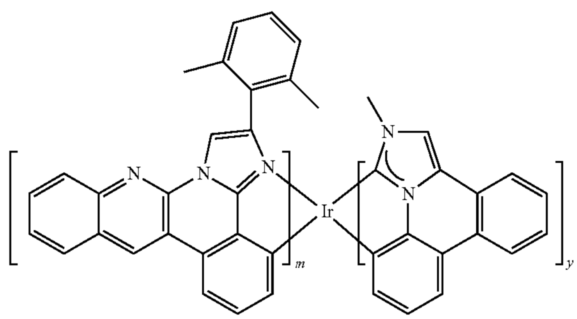
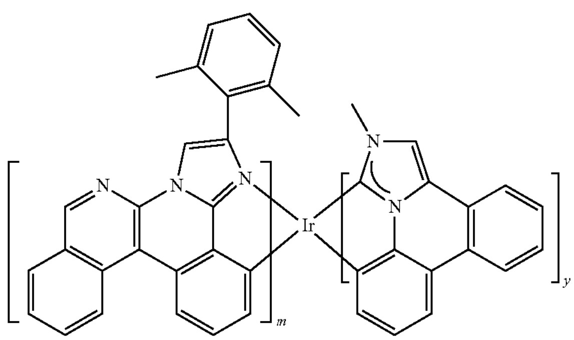
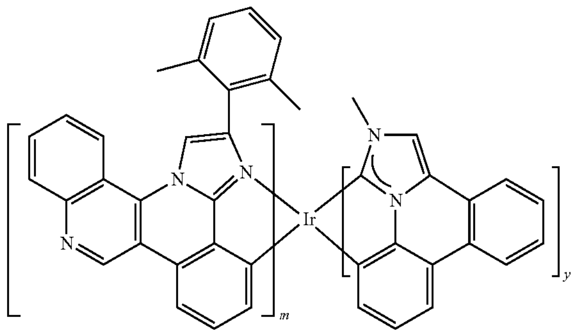
-continued
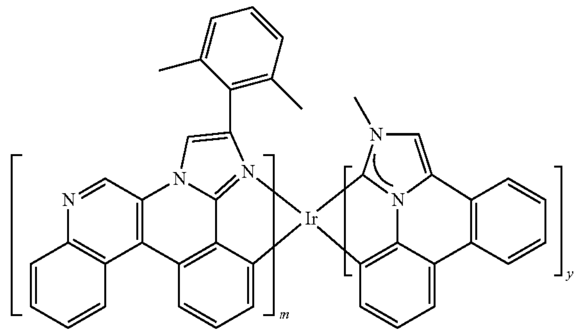
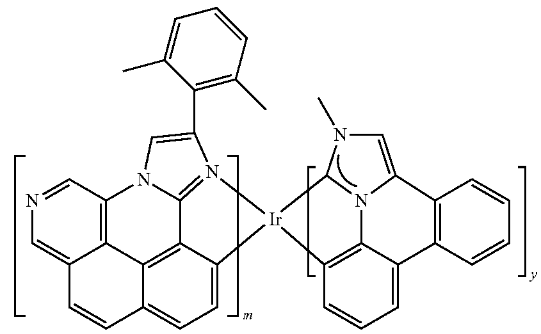
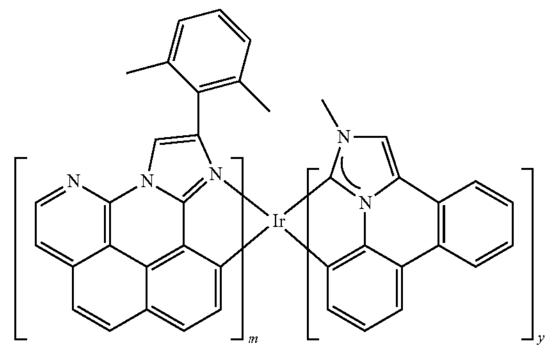
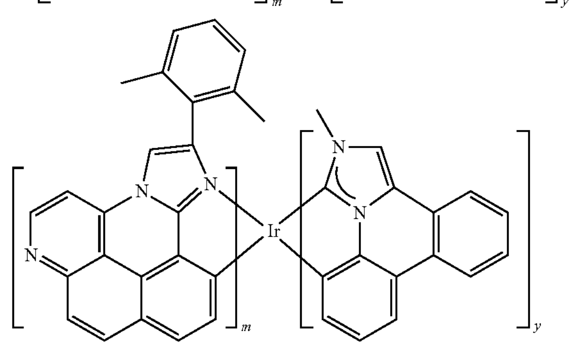
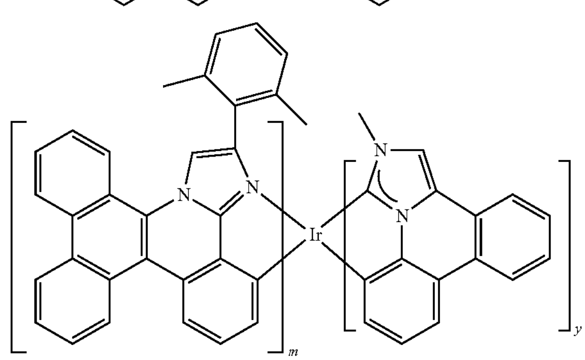

-continued
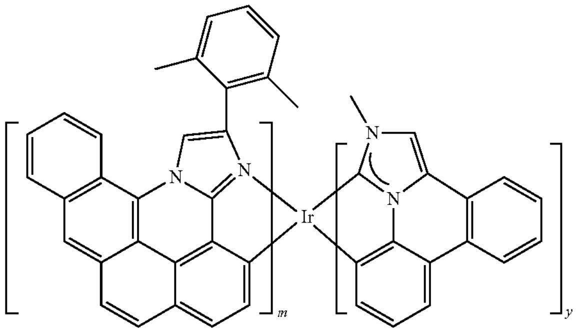
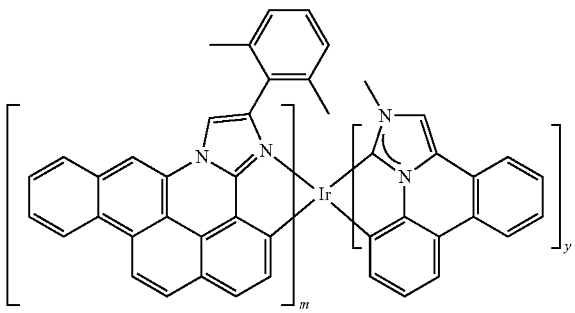
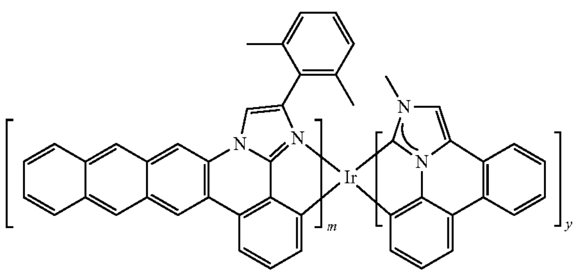
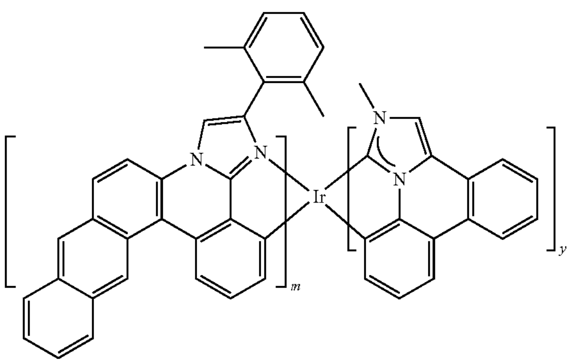
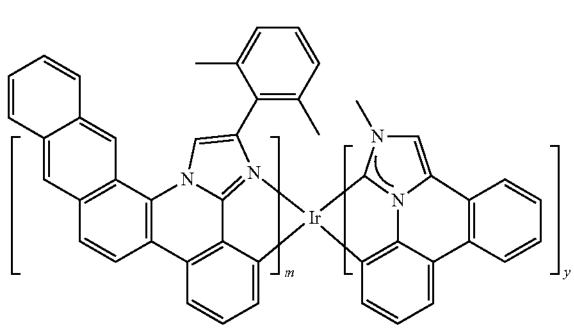
-continued
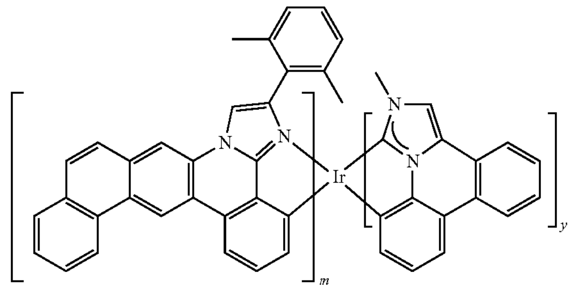
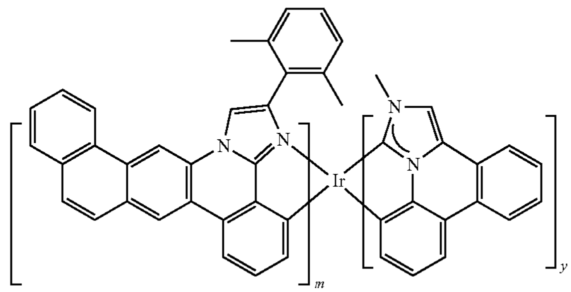
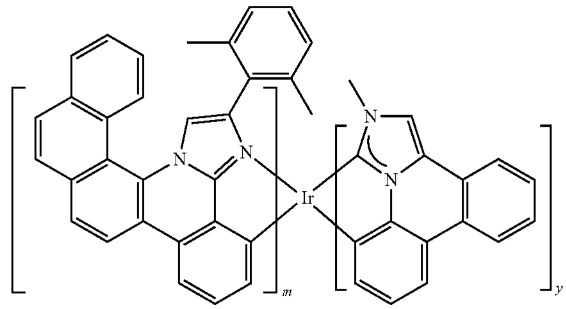
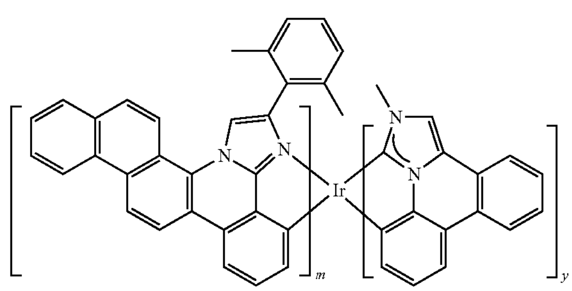
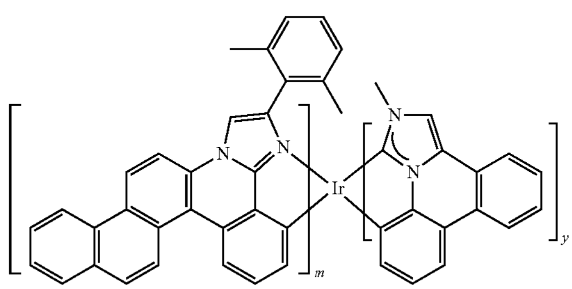

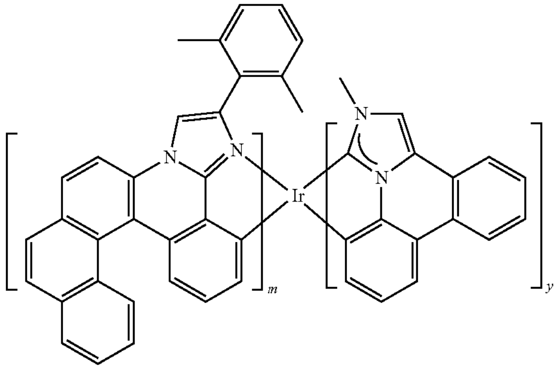
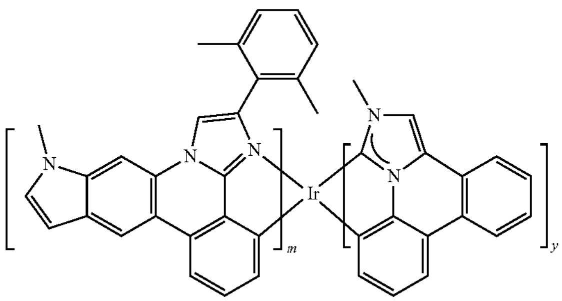
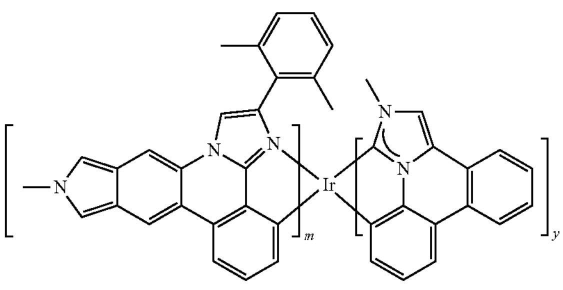
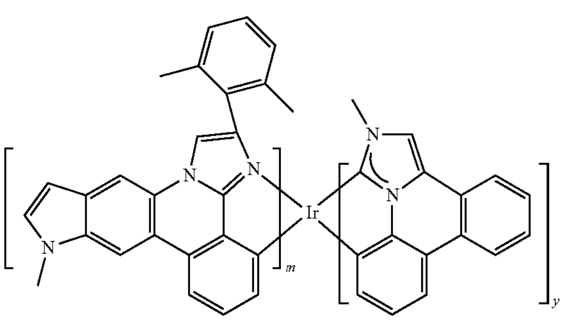
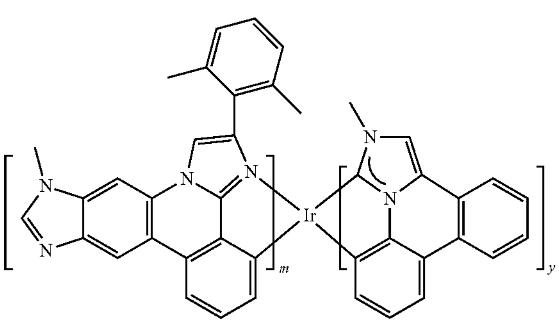
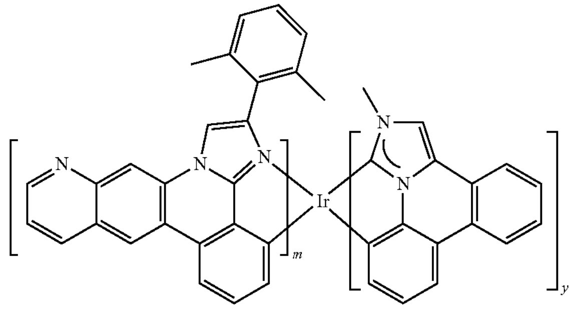
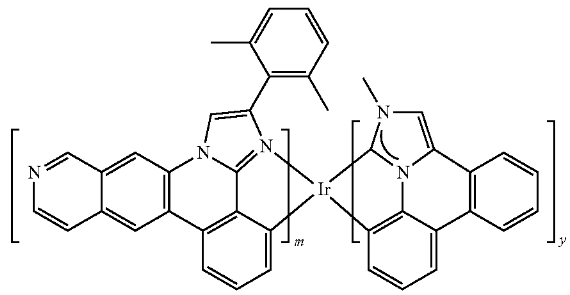
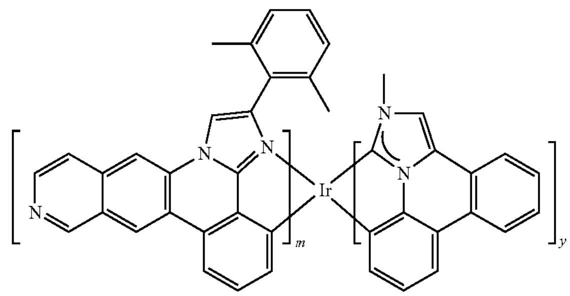
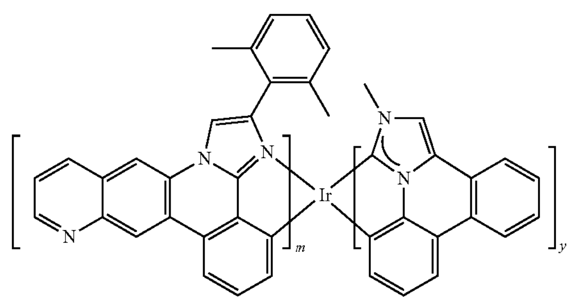
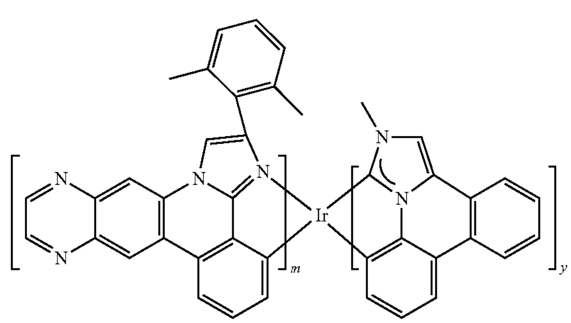

-continued
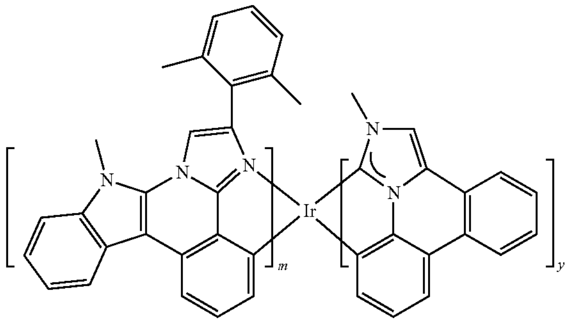
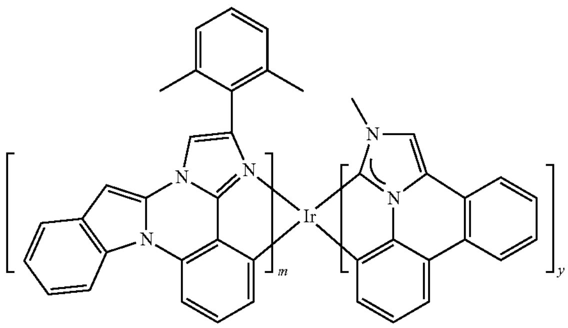
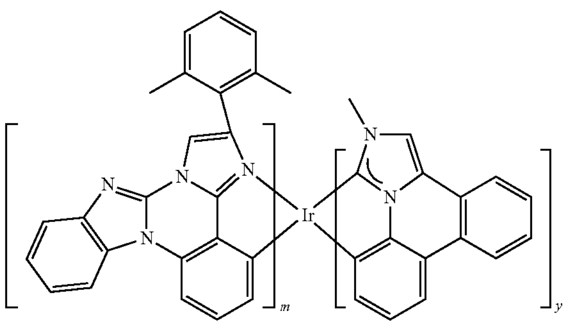
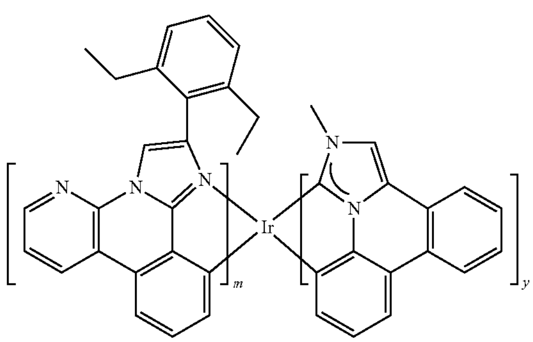
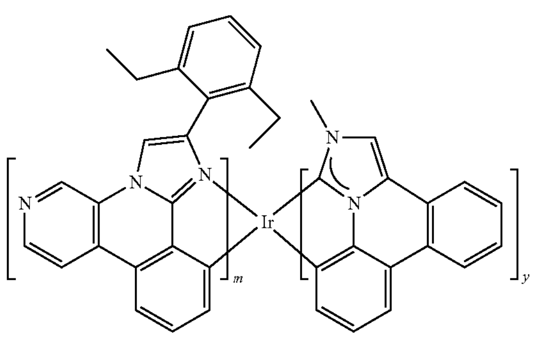
-continued
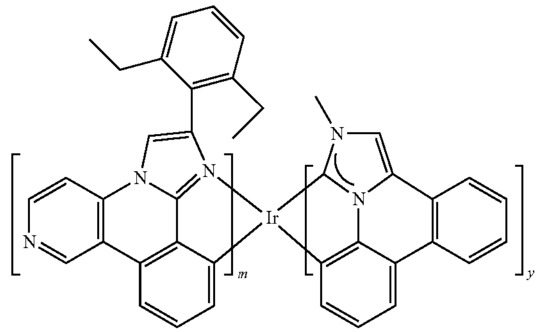
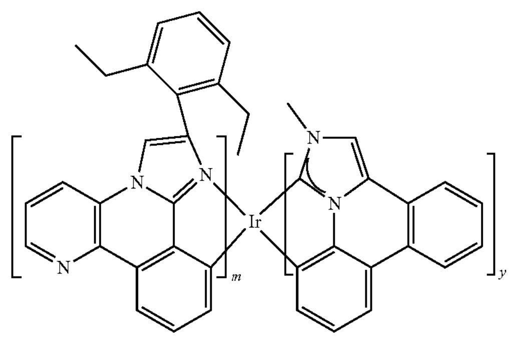
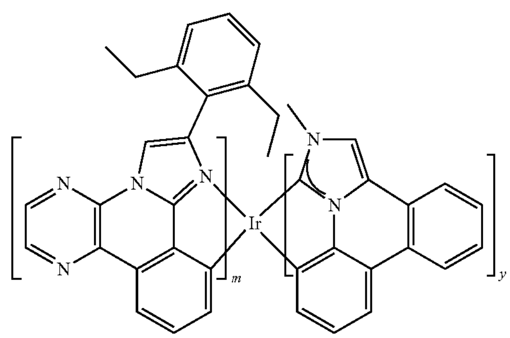
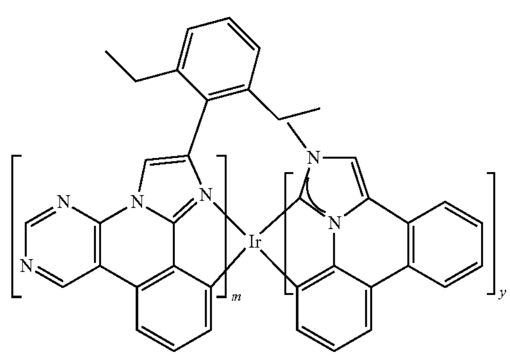

-continued
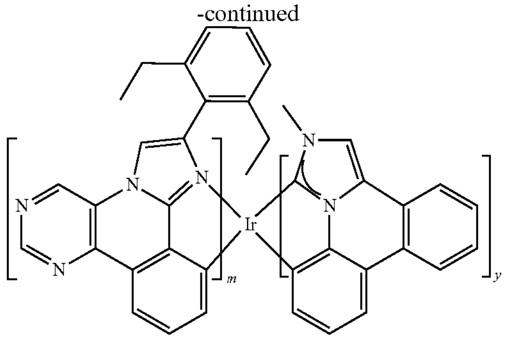
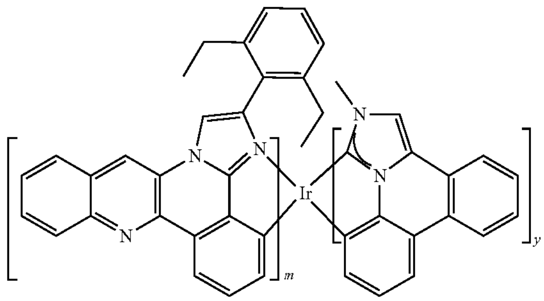
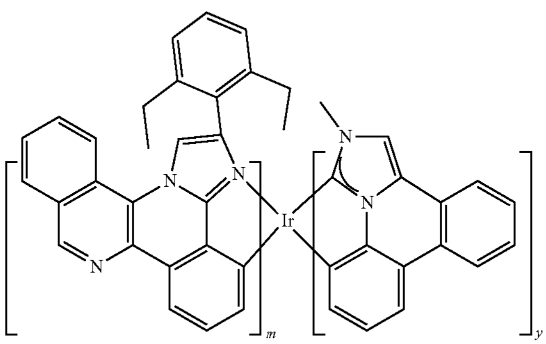
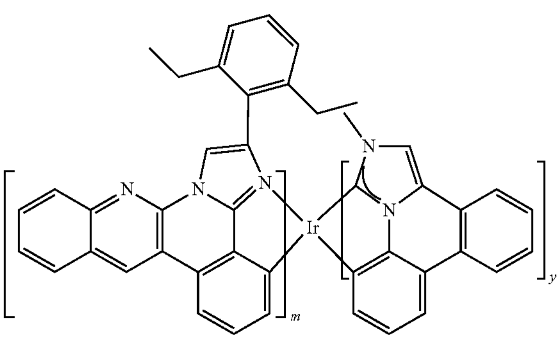
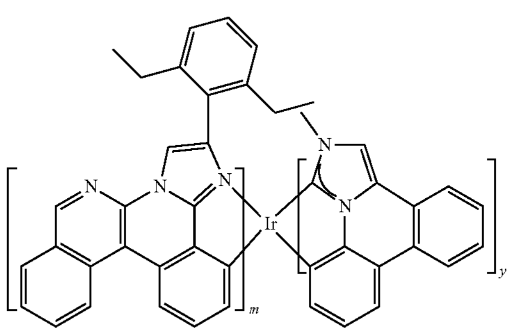
-continued
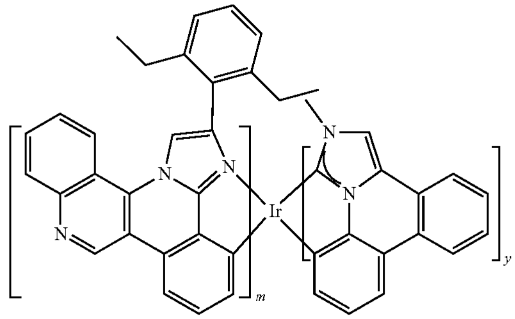
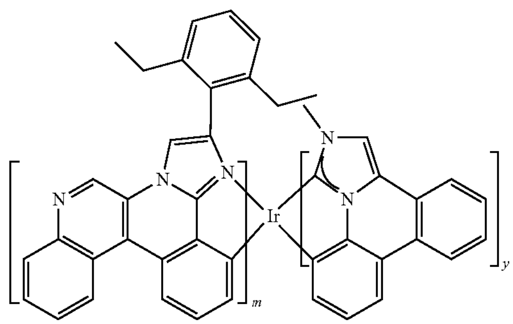
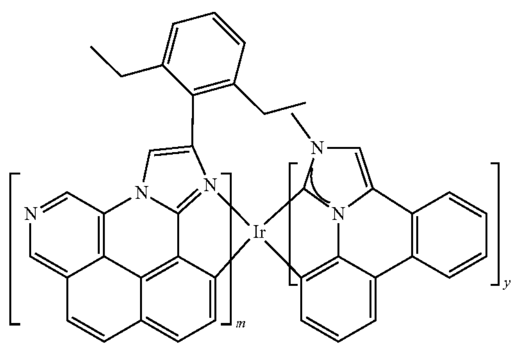
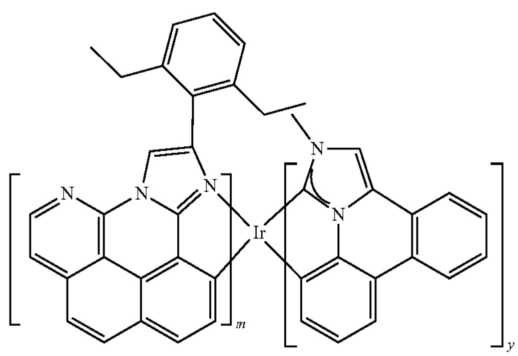
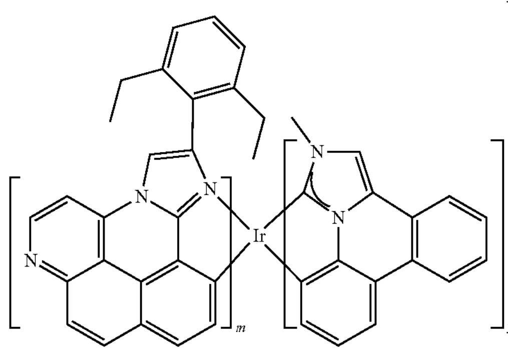

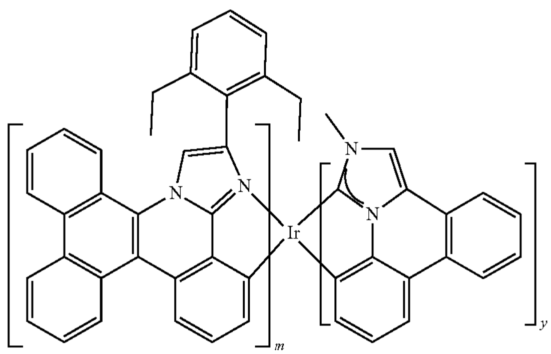
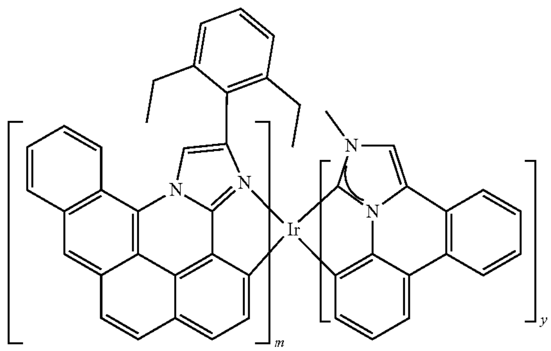
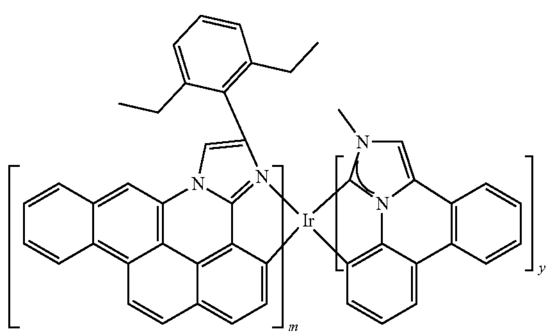
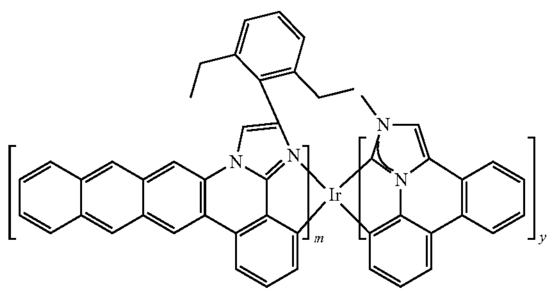
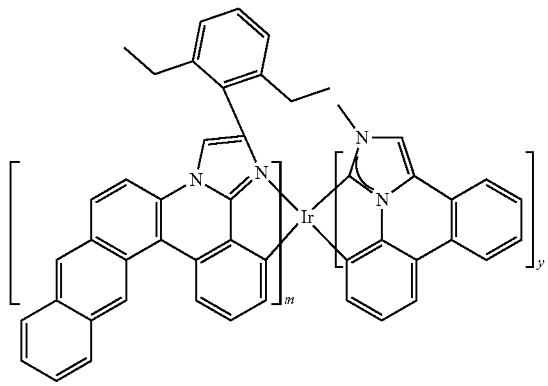
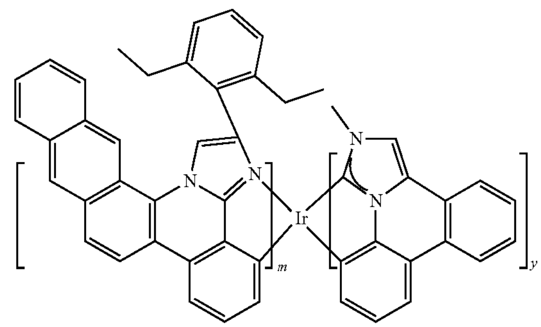
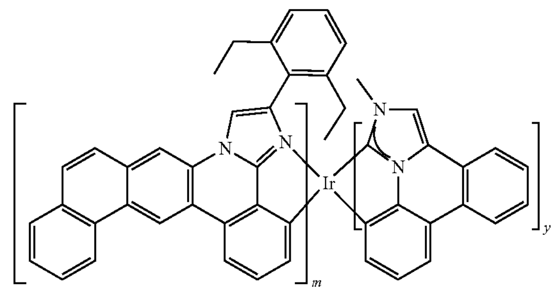
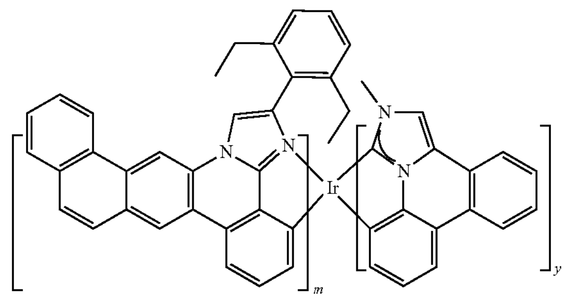
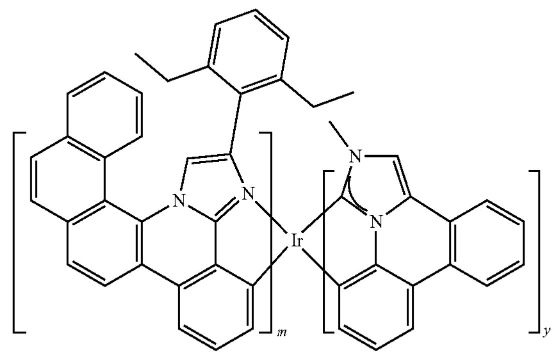
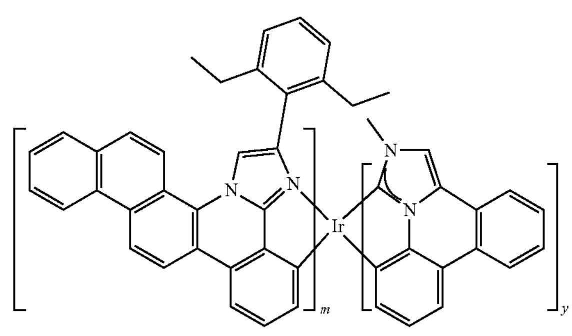

-continued
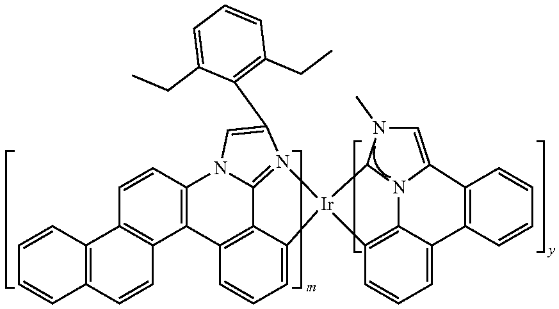
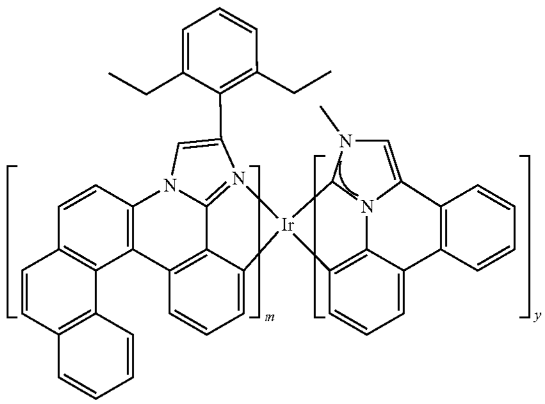
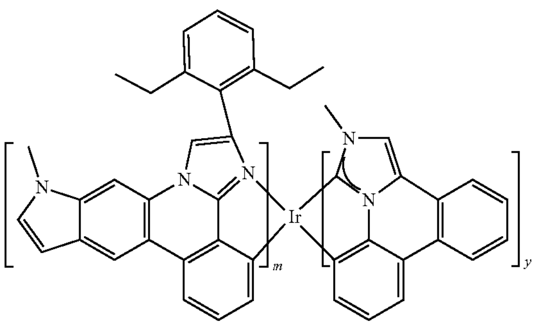
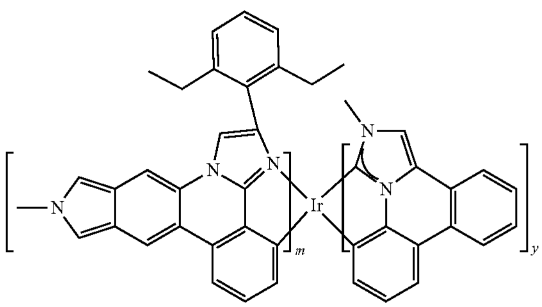
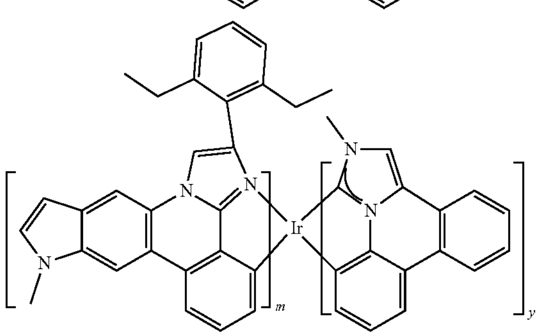
-continued
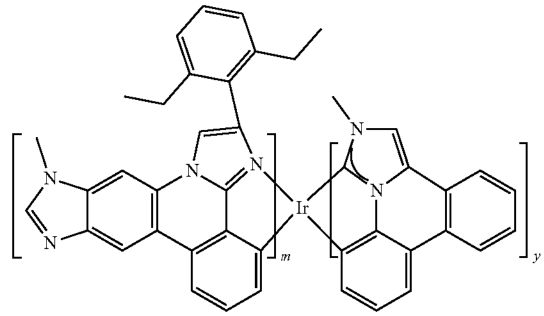
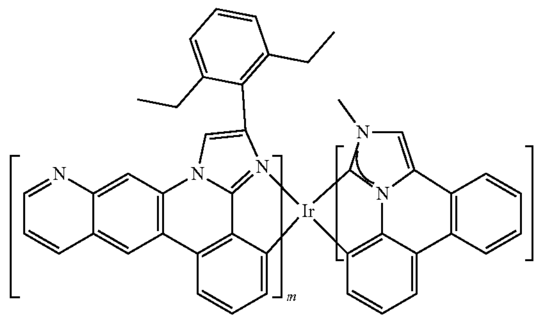
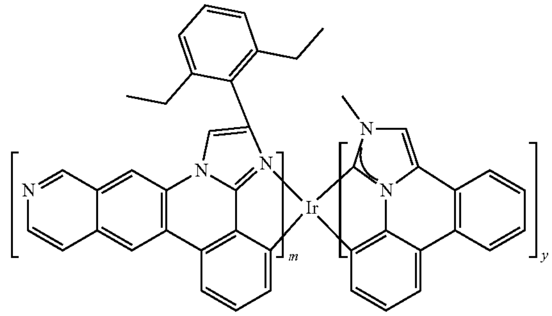
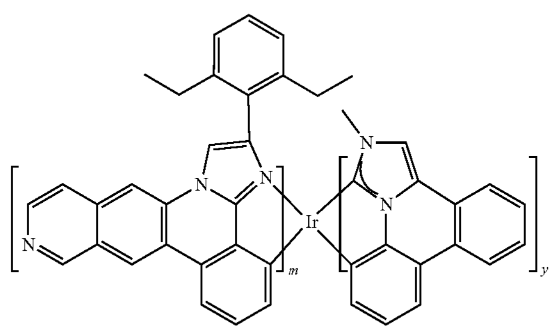
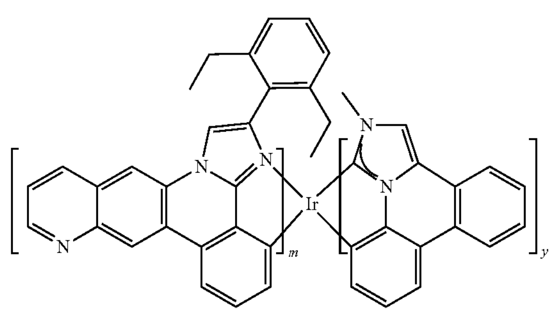

-continued
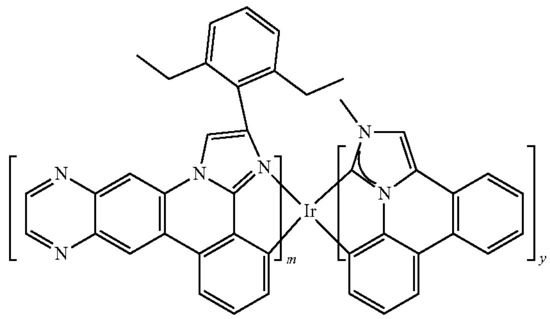
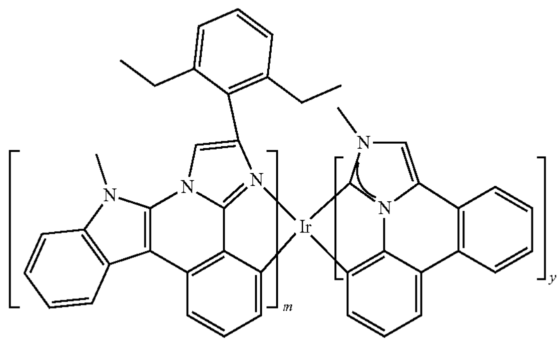
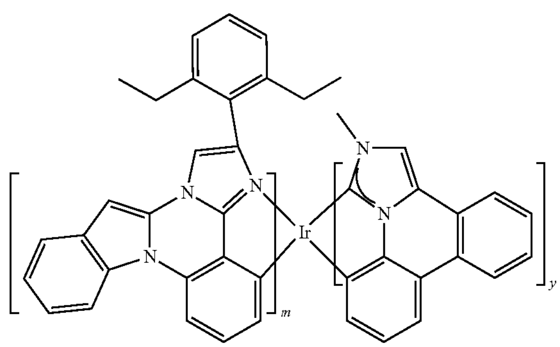
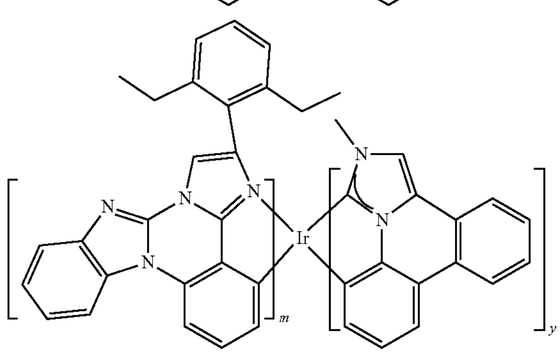
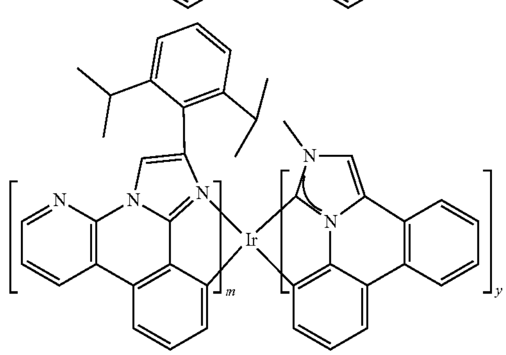
-continued
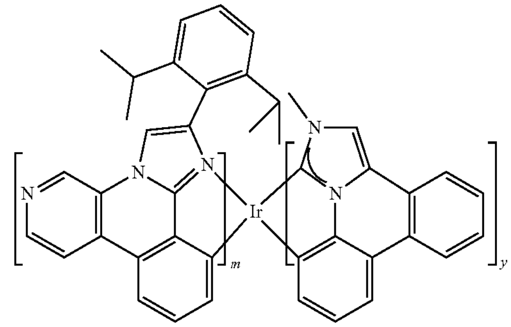
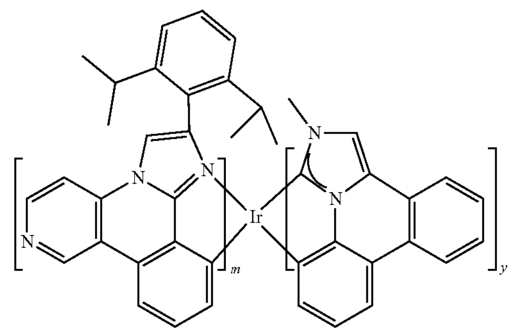
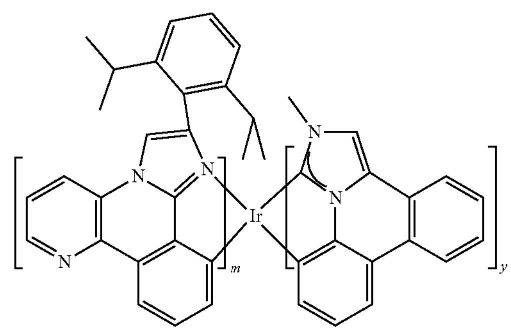
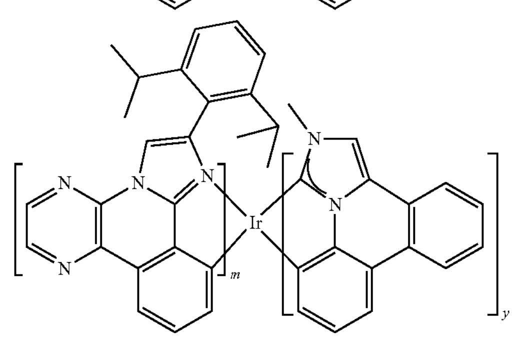
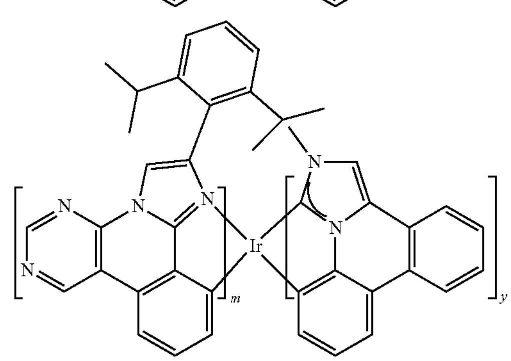

-continued
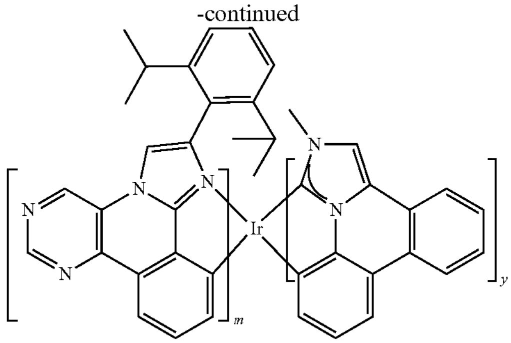
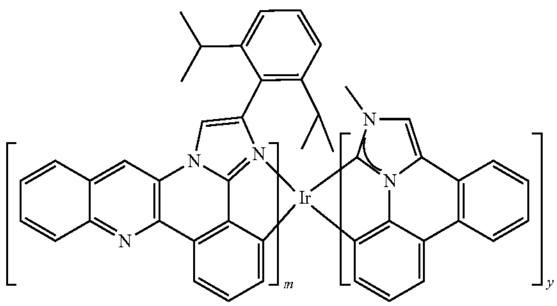
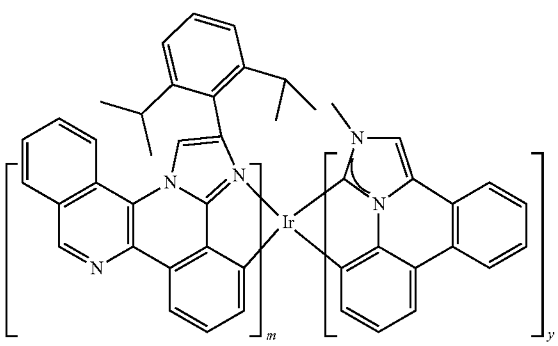
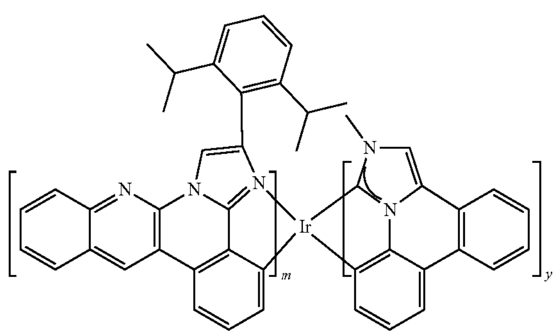
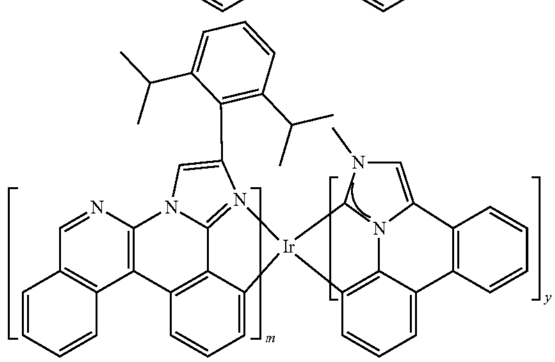
-continued
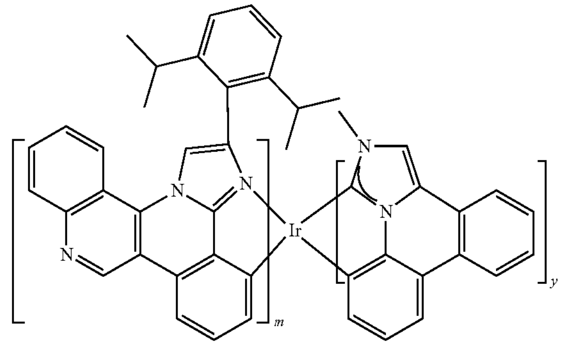
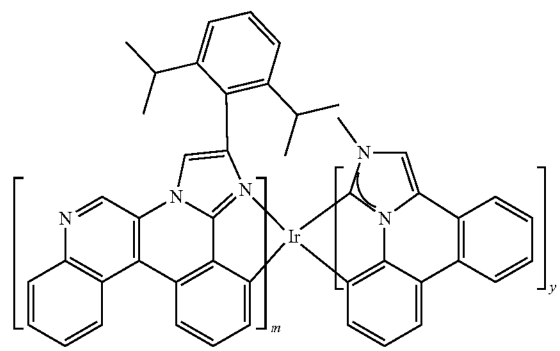
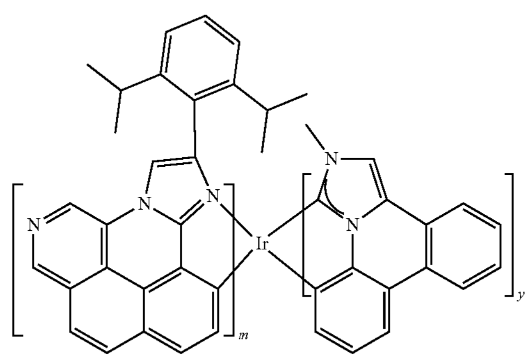
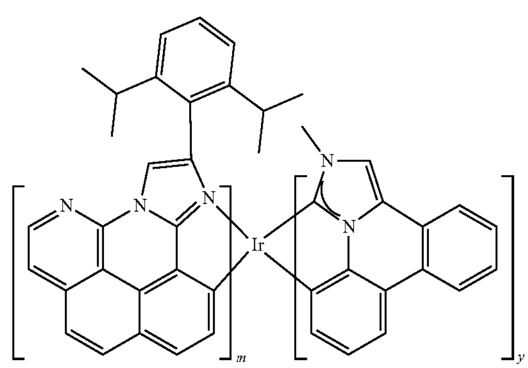

-continued
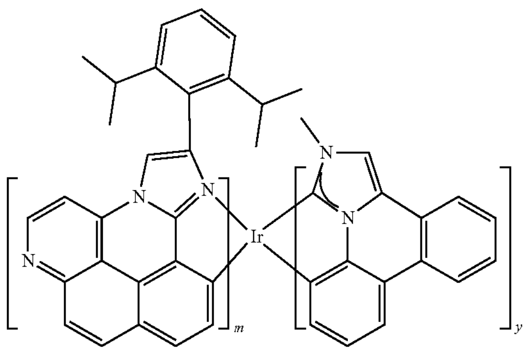
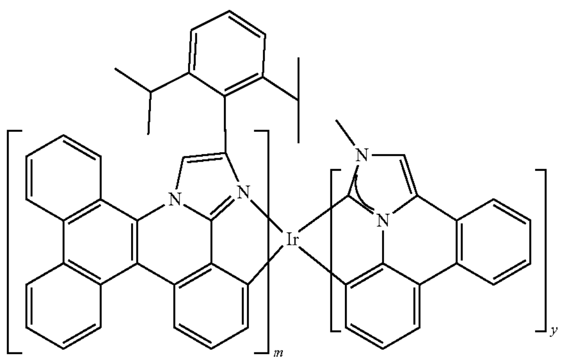
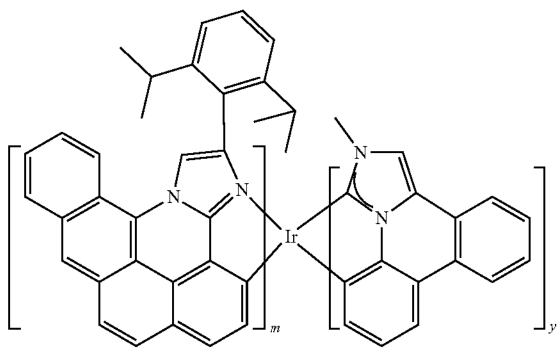
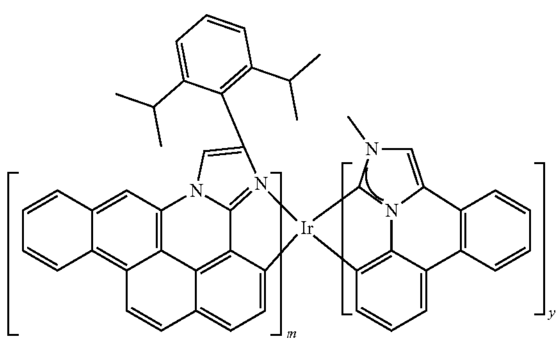
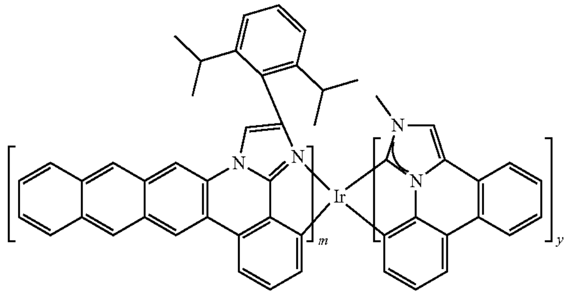
-continued
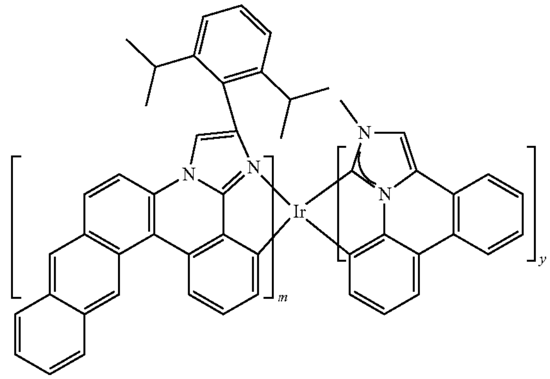
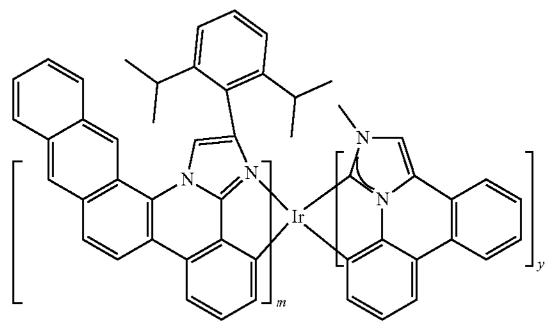
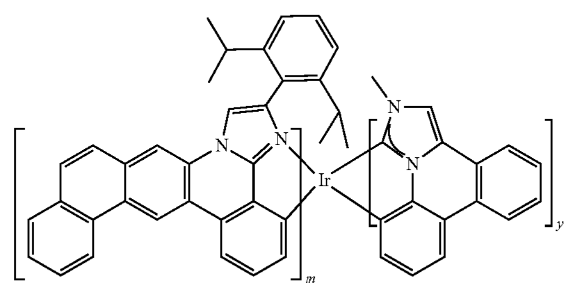
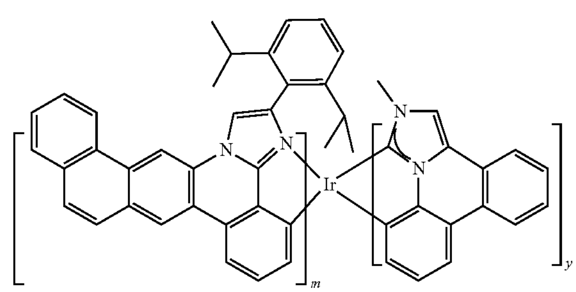
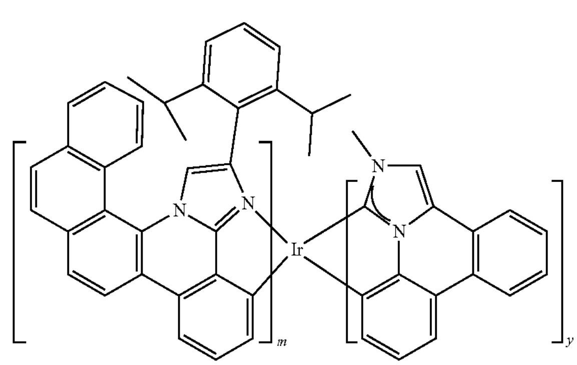

-continued
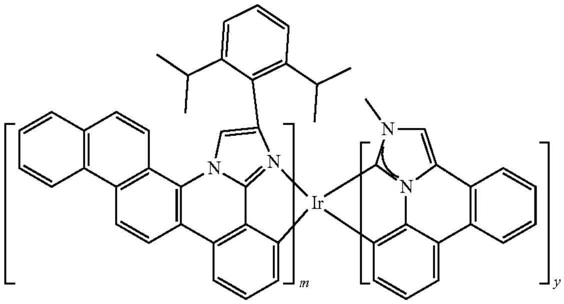
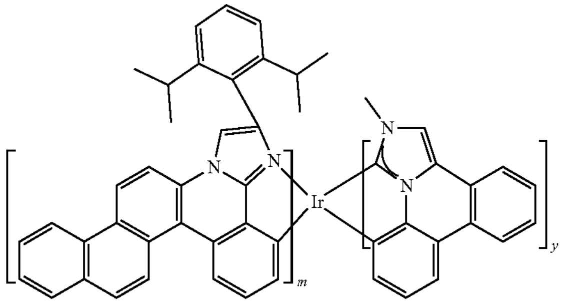
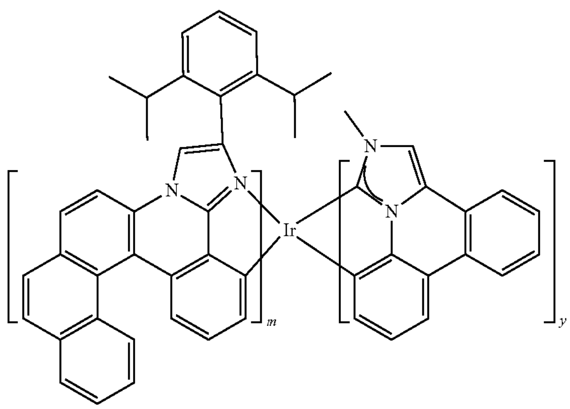
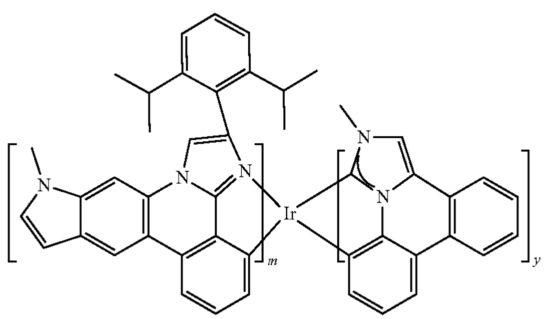
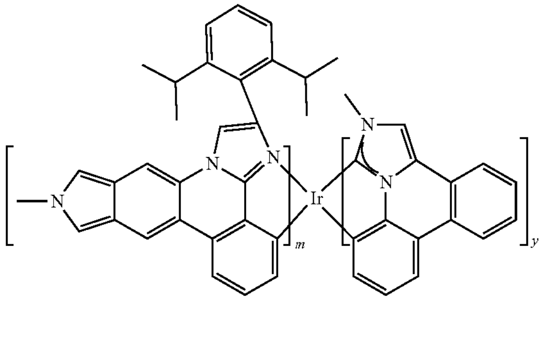
-continued
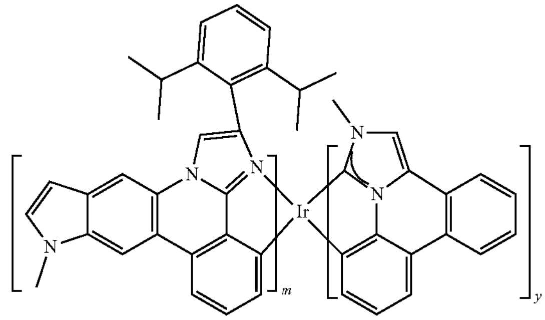
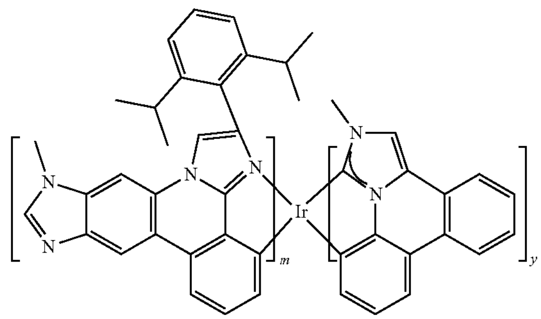
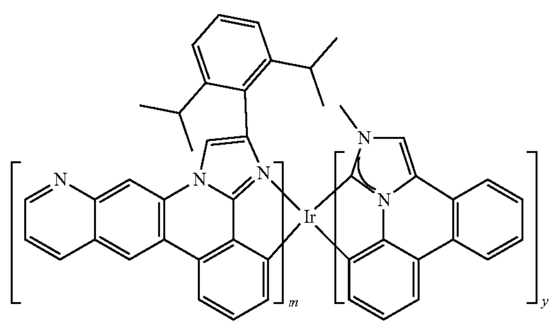
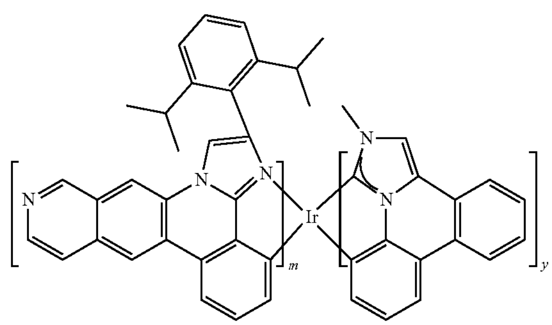
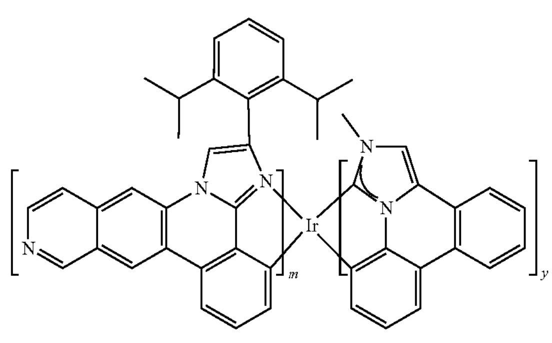

-continued
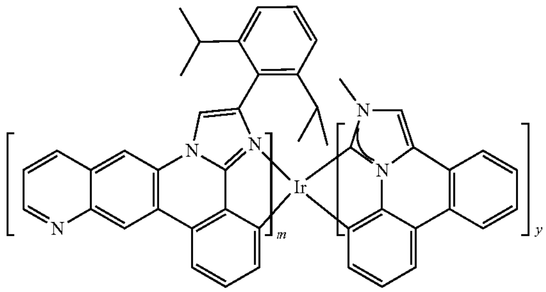
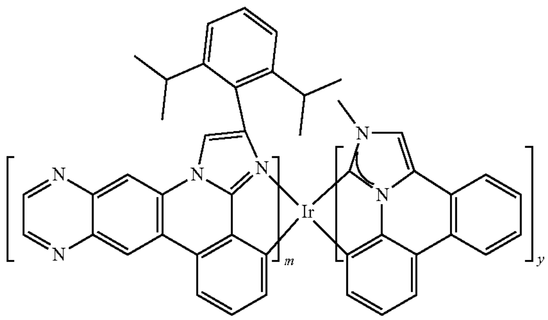
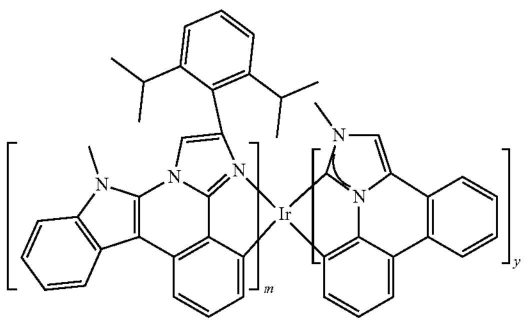
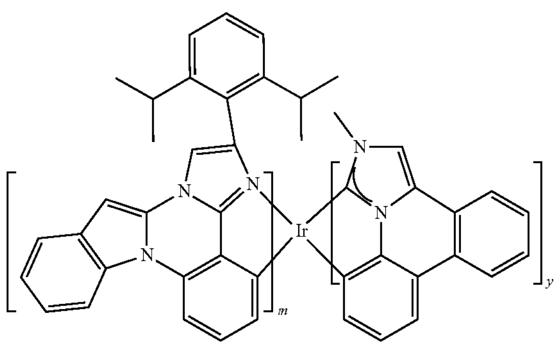
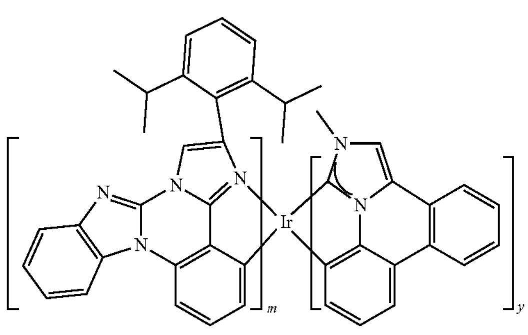
-continued
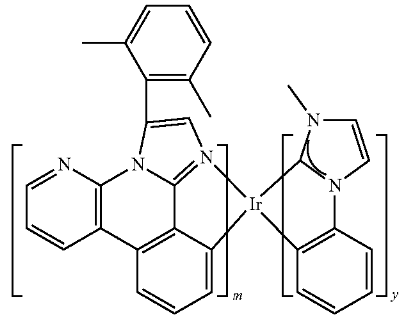
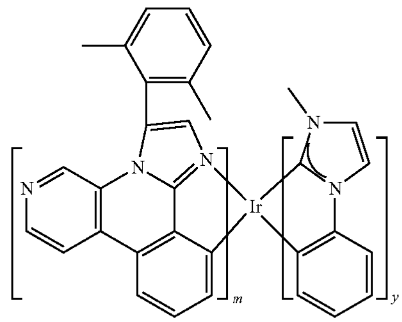
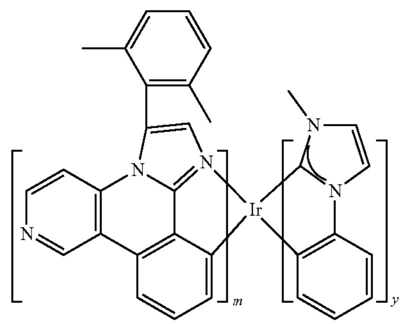
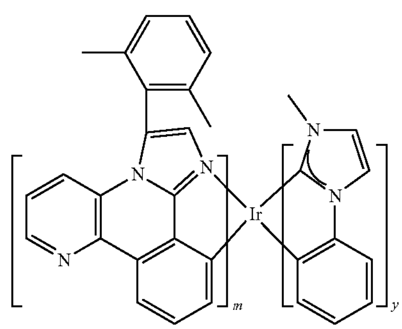
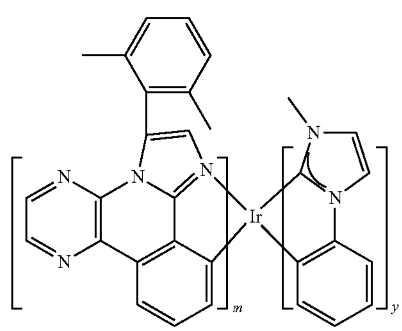

-continued
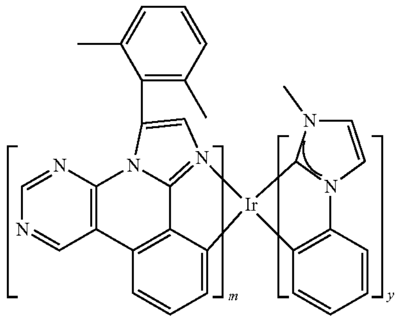
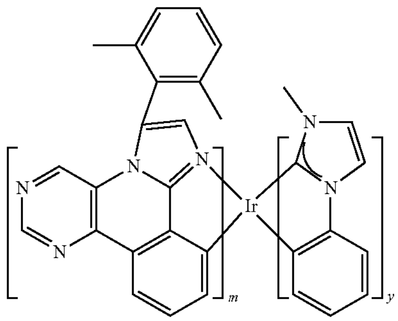
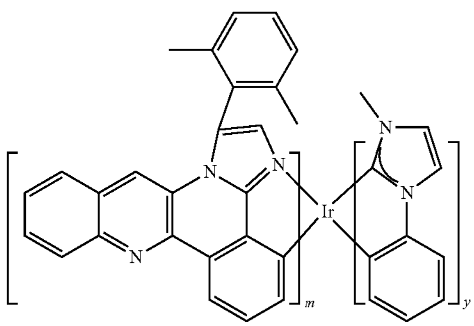
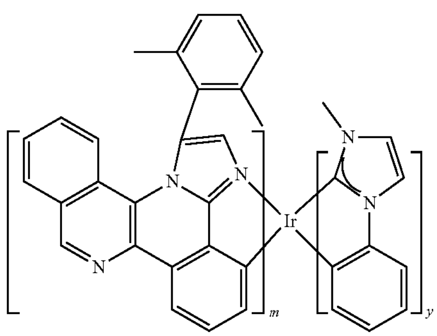
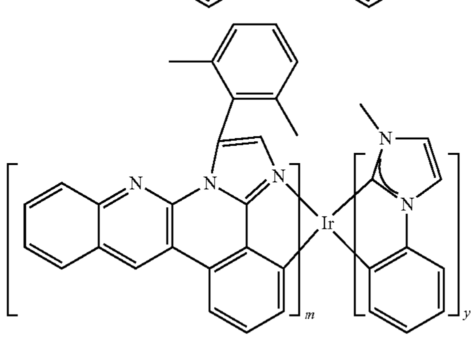
-continued
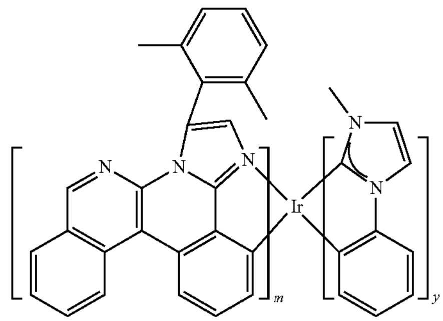
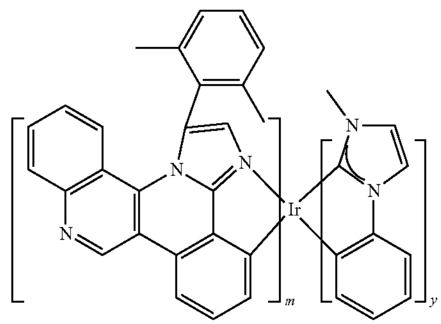
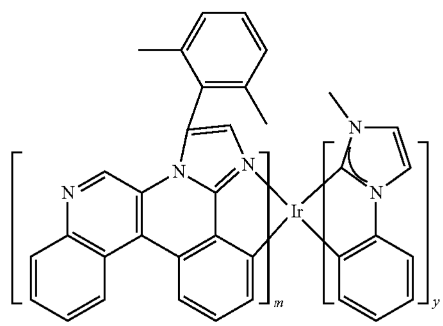
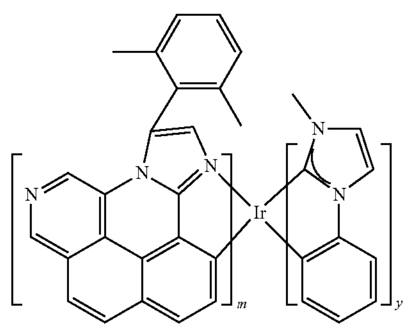
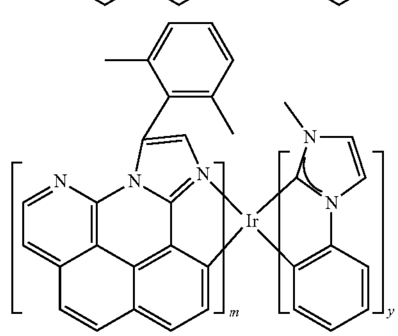

-continued
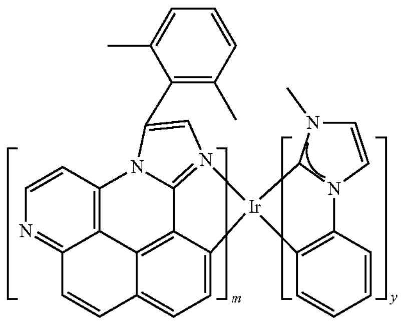
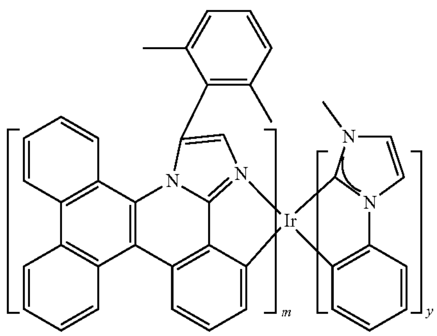
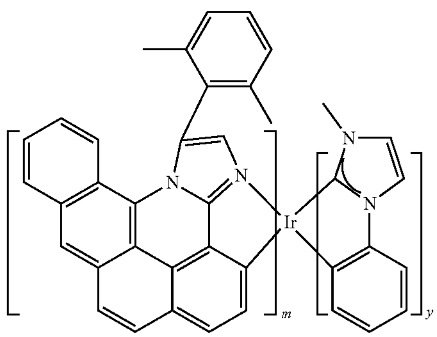
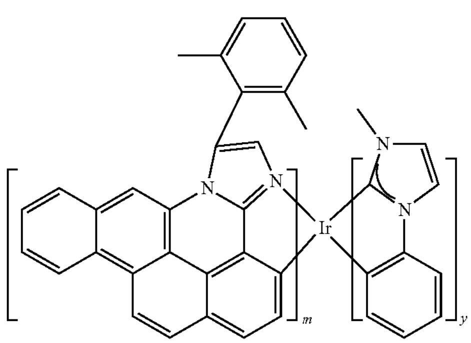
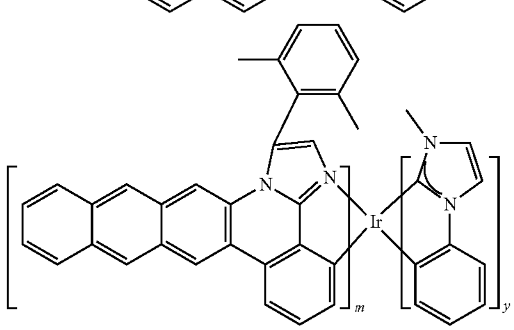
-continued
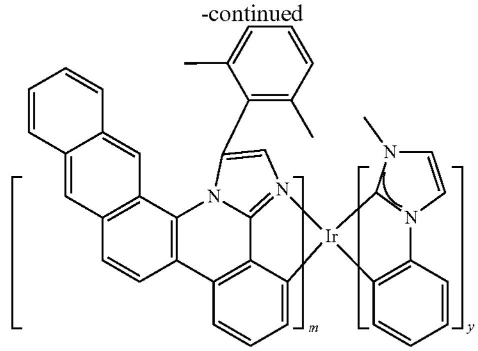
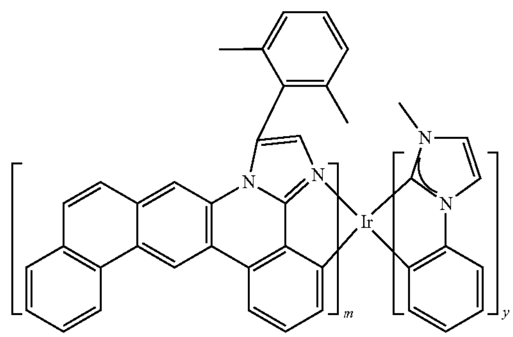
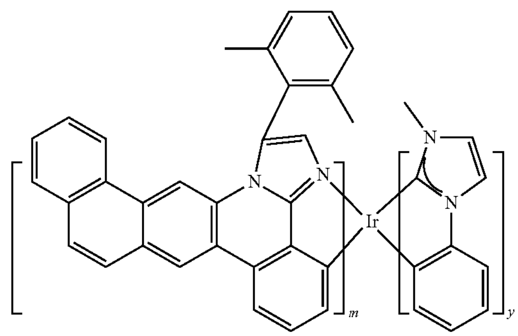
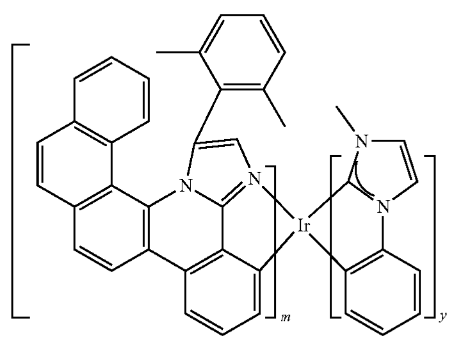
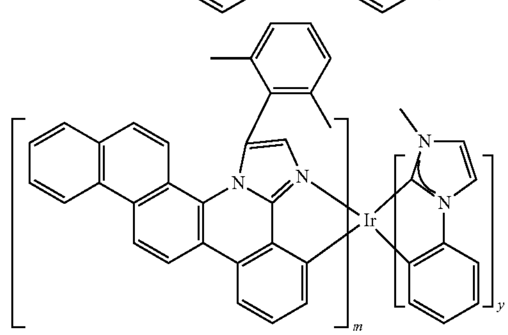

-continued
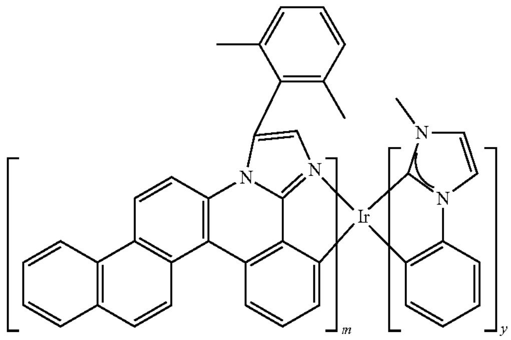
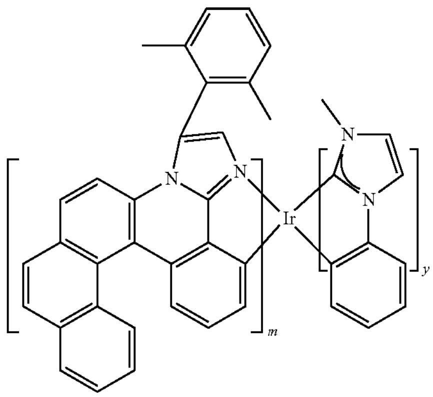
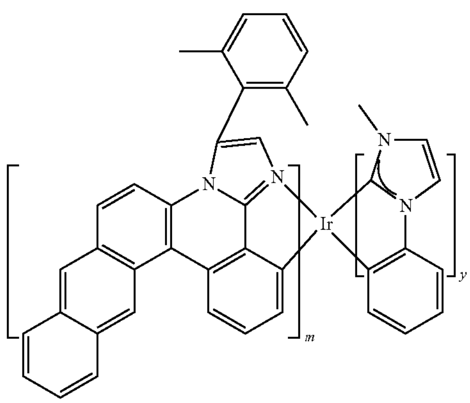
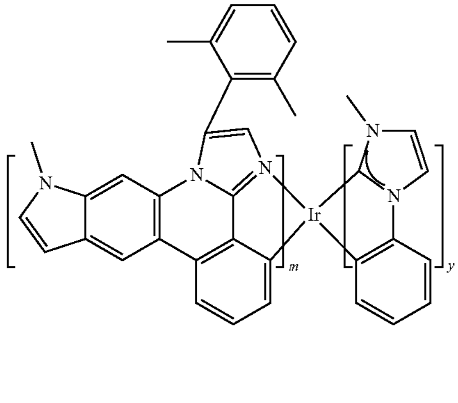
-continued
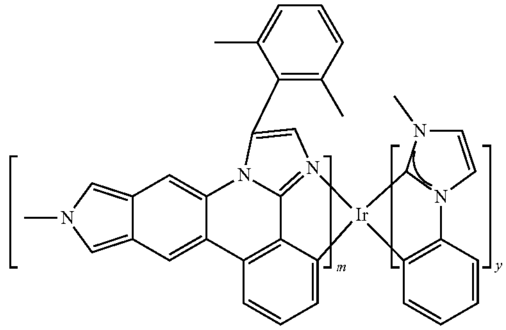
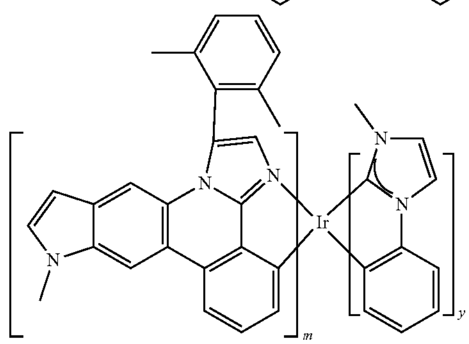
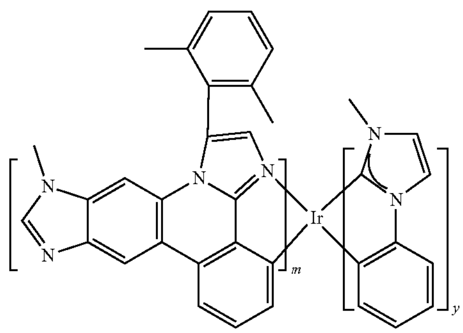
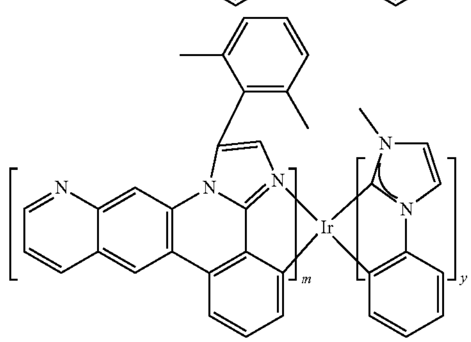
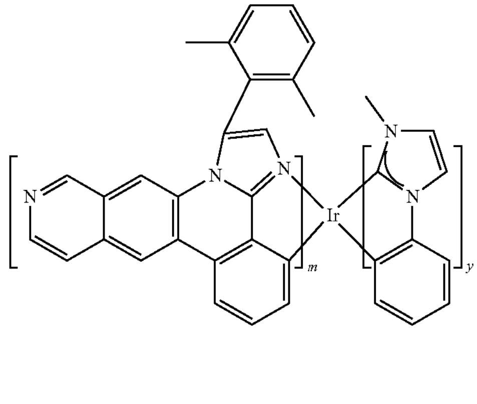

-continued
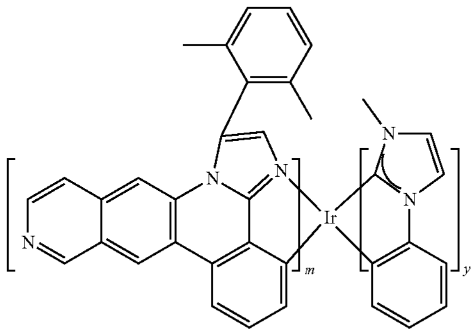
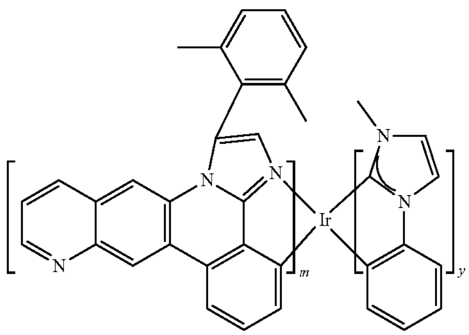
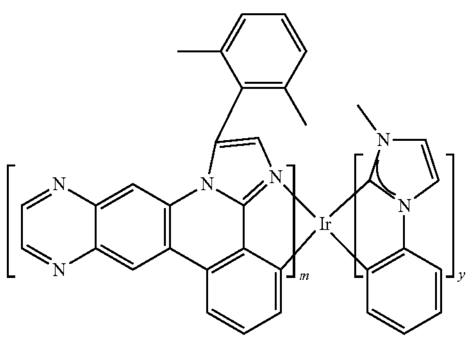
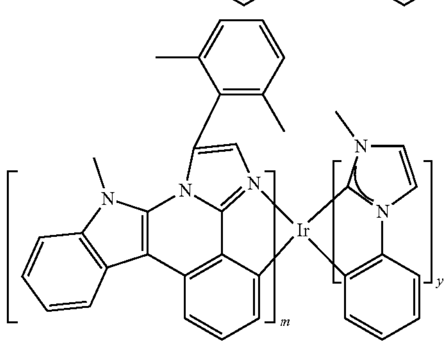
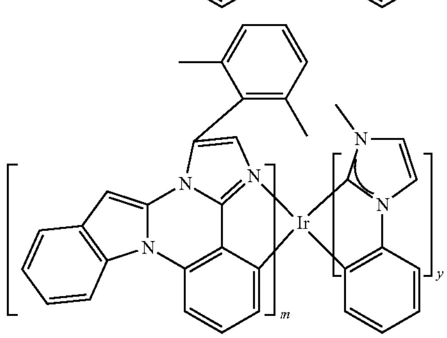
-continued
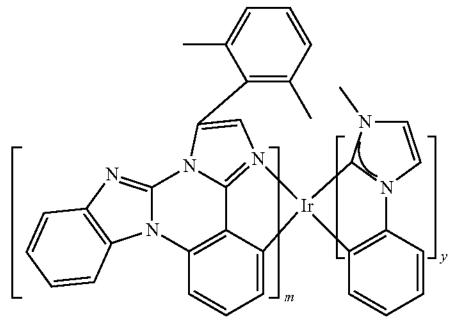
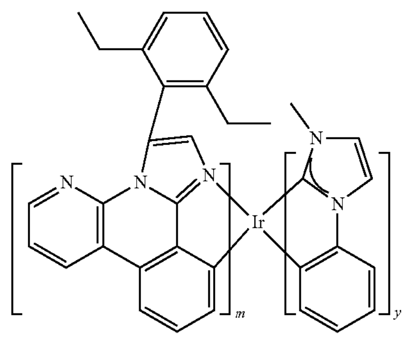
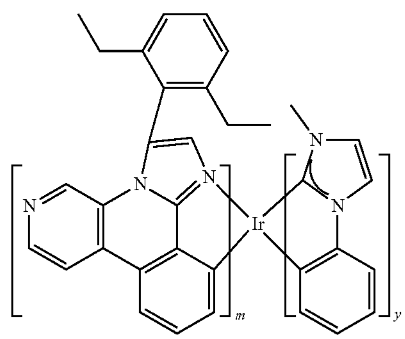
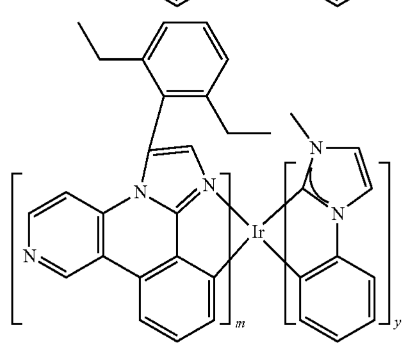
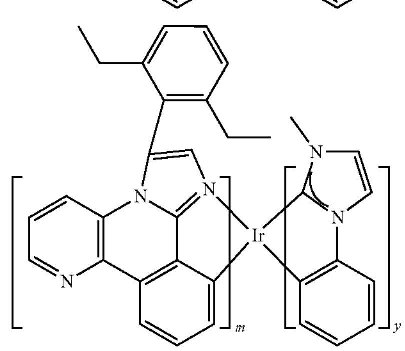

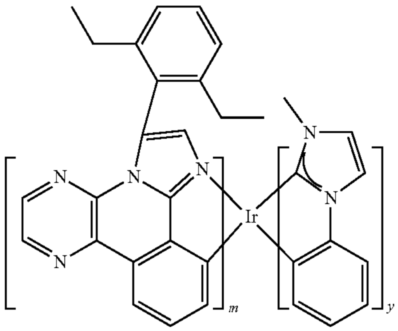
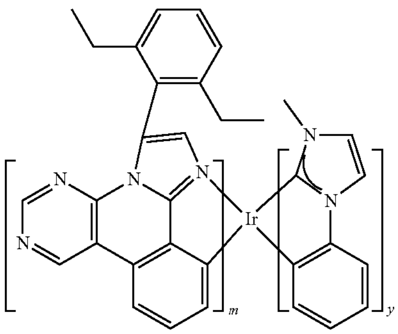
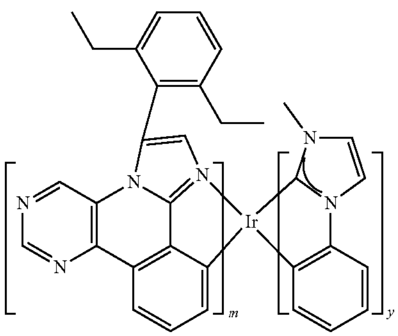
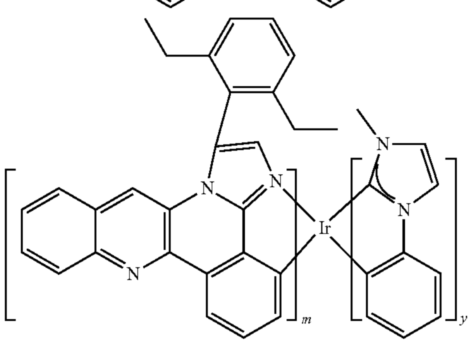
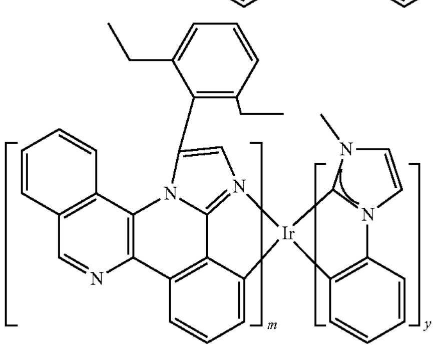
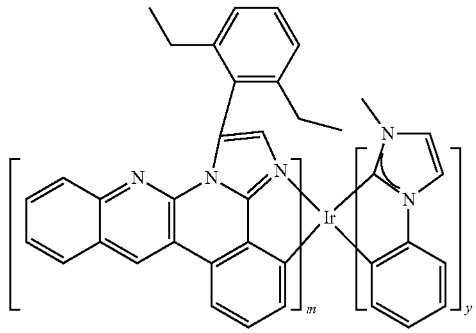
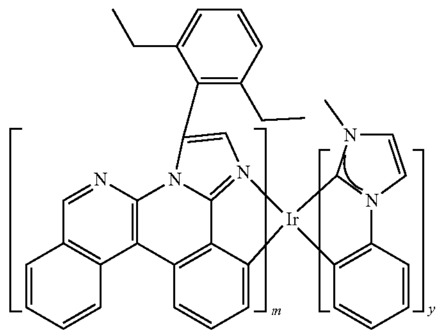
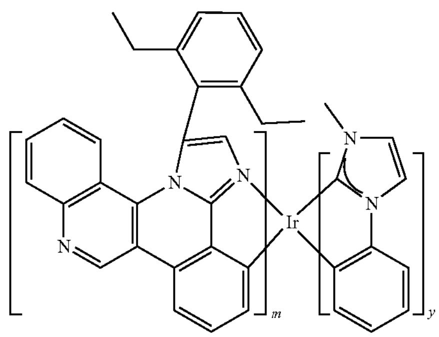
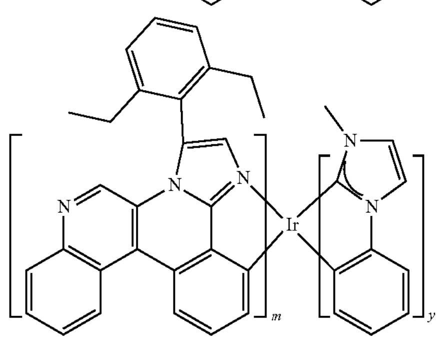
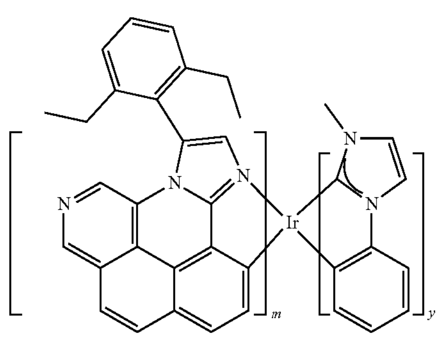

-continued
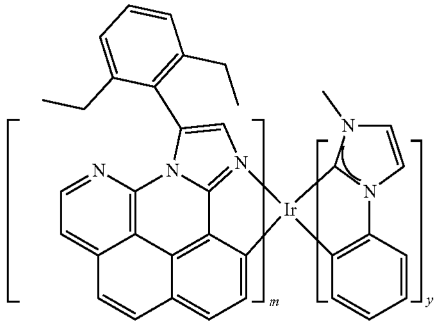
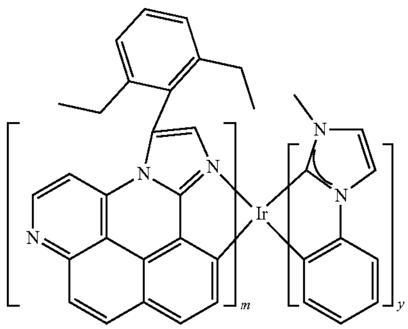
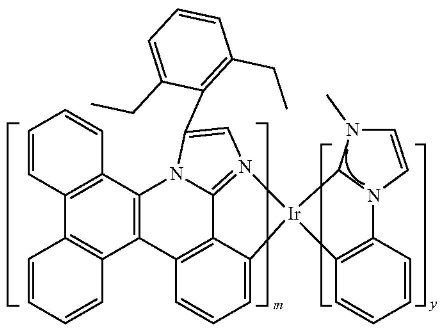
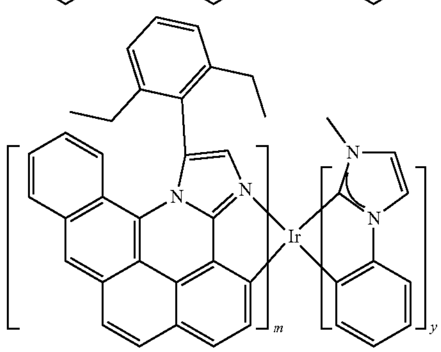
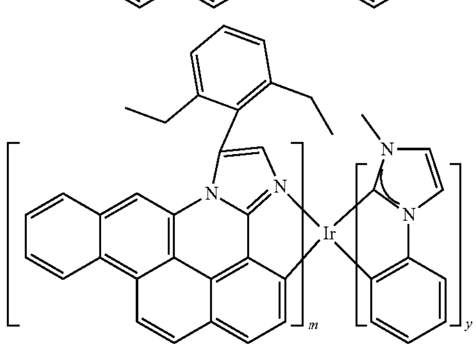
-continued
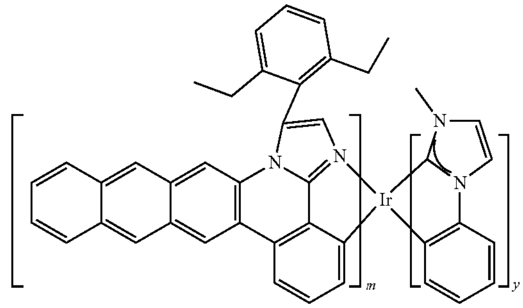
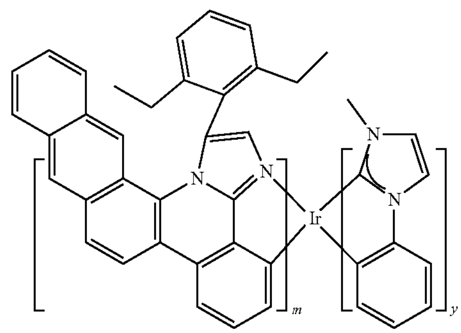
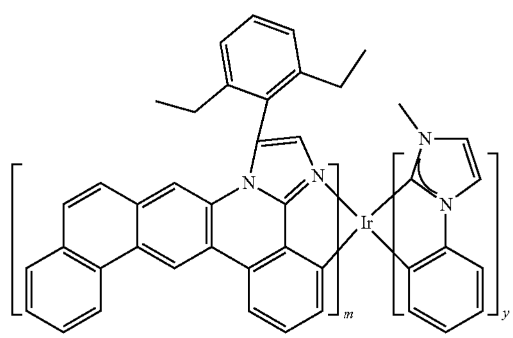
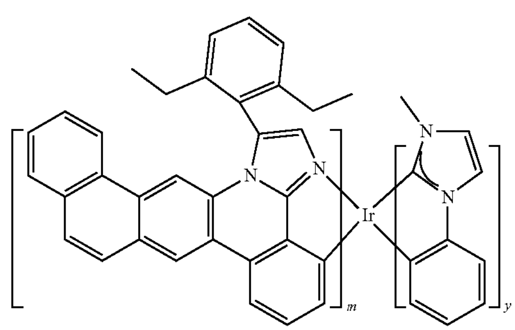
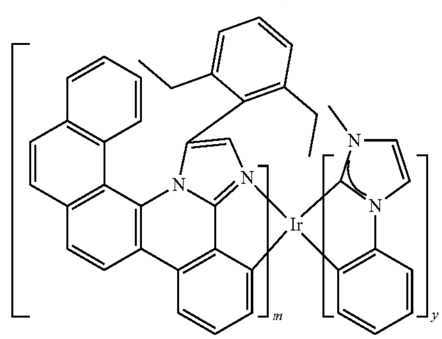

-continued
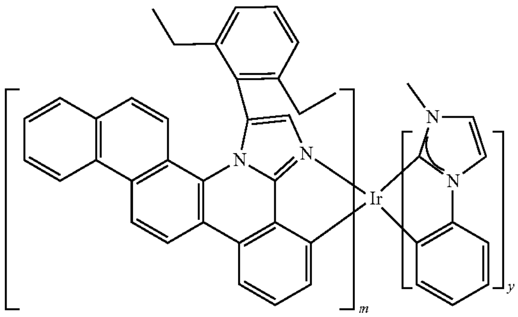
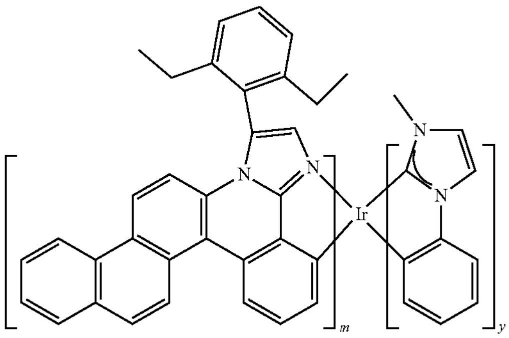
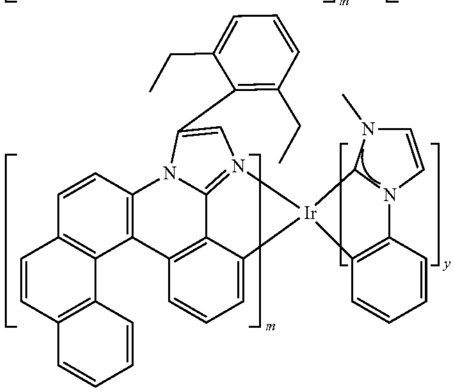
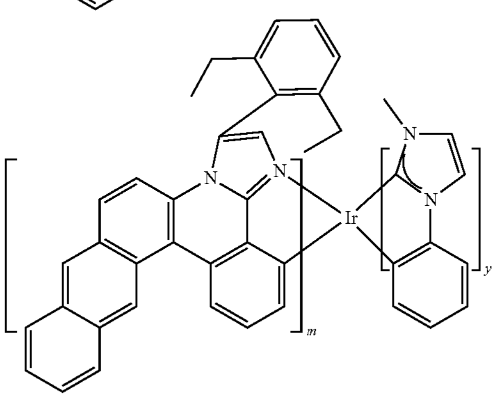
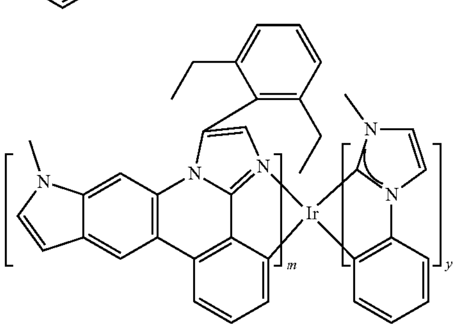
-continued
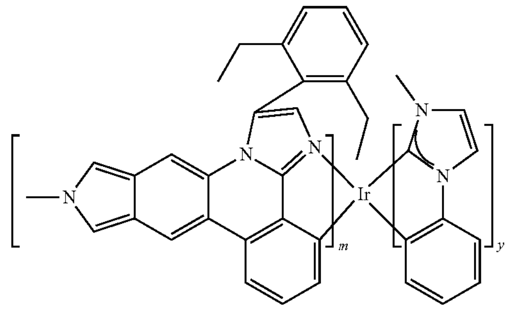
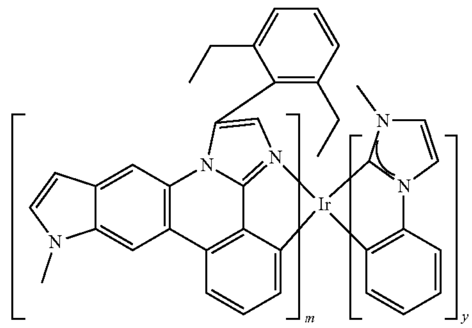
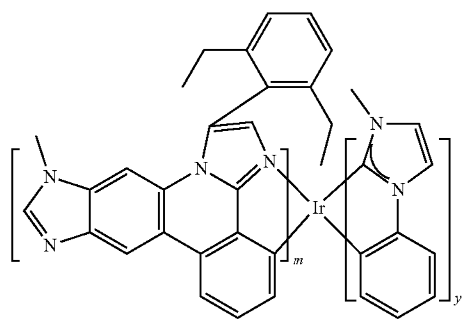
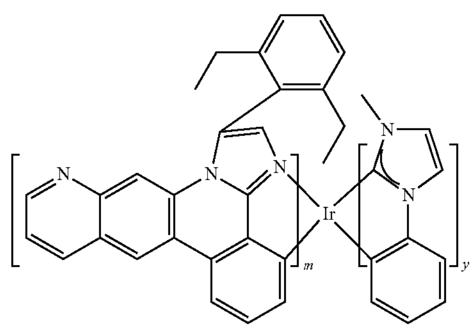
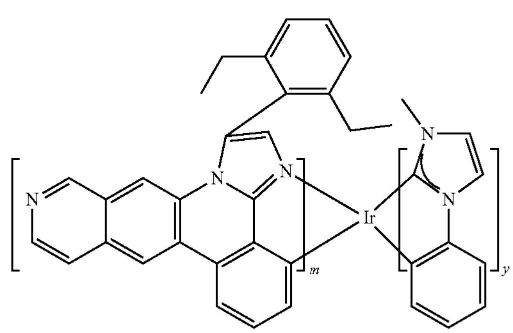

-continued
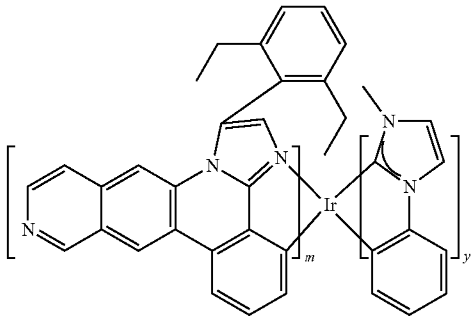
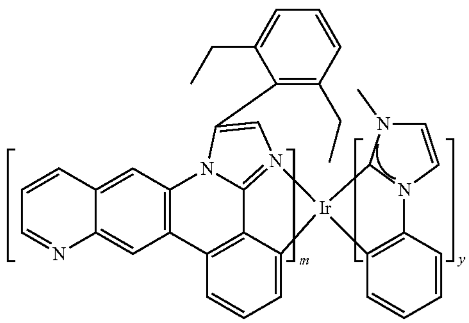
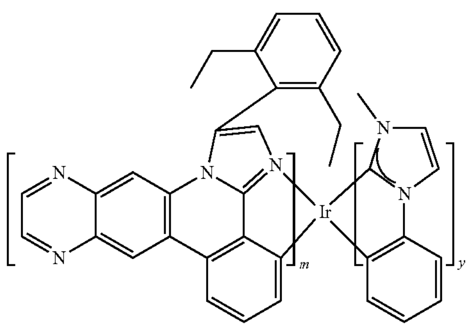
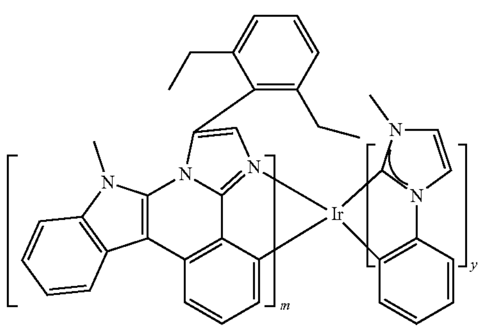
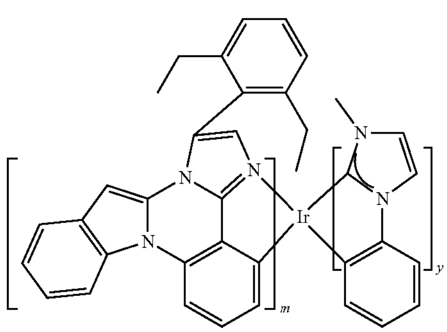
-continued
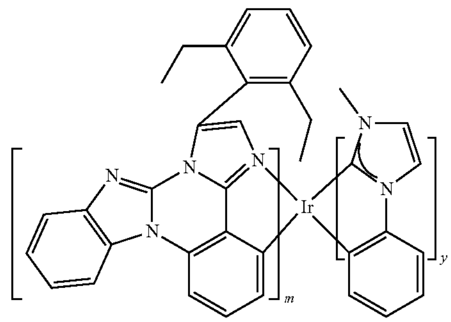
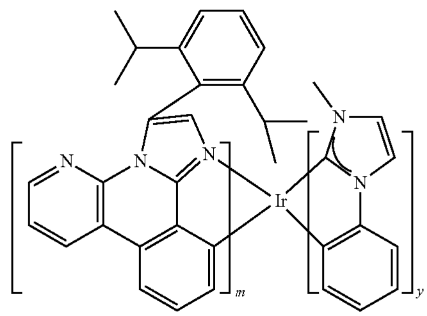
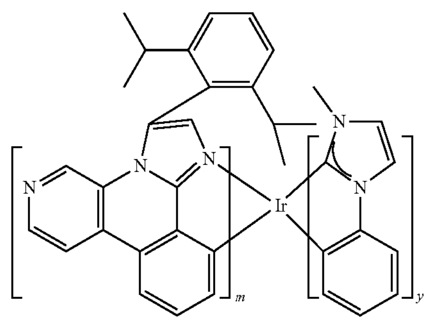
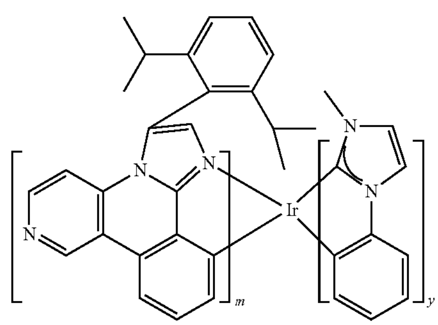
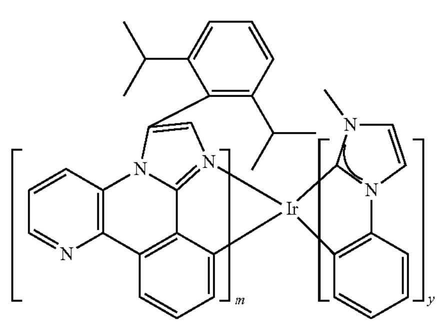

-continued
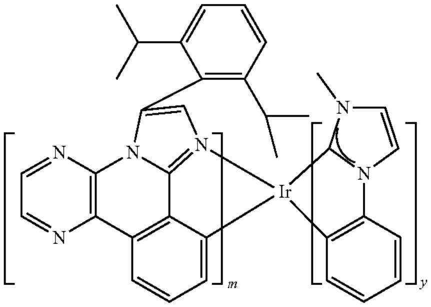
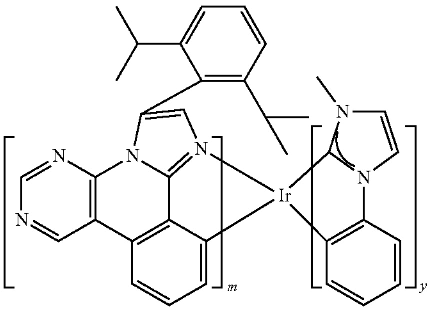
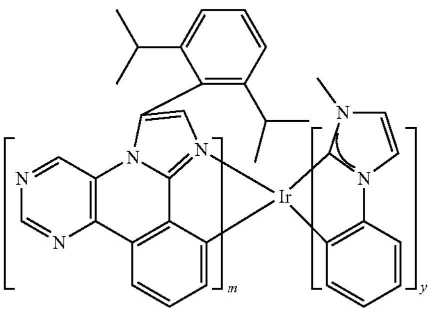
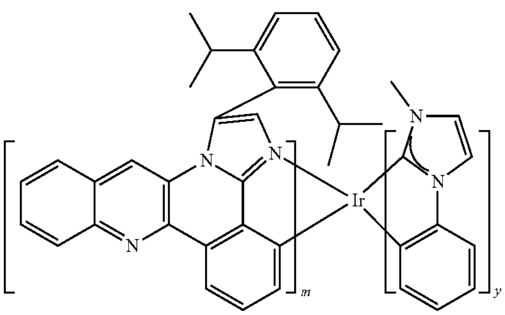
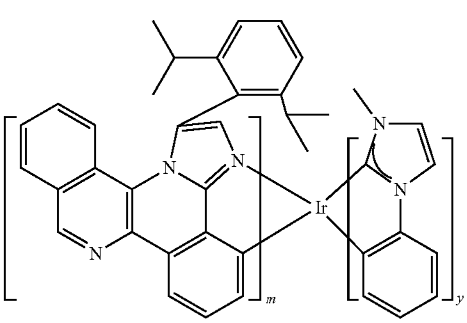
-continued
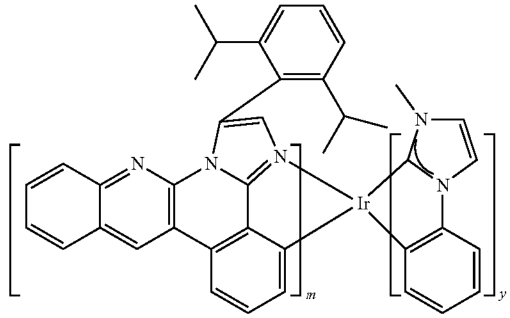
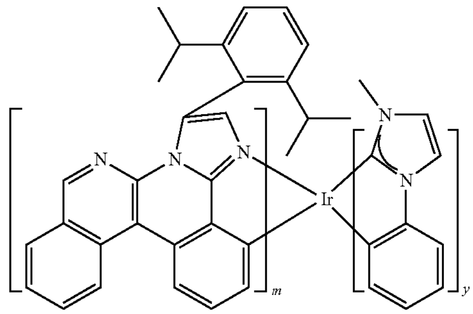
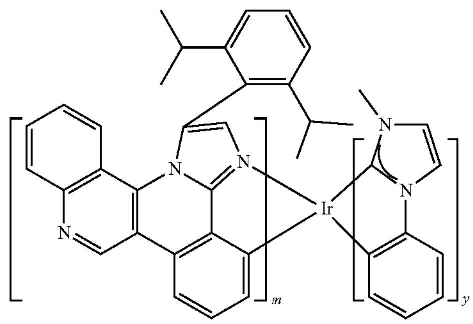
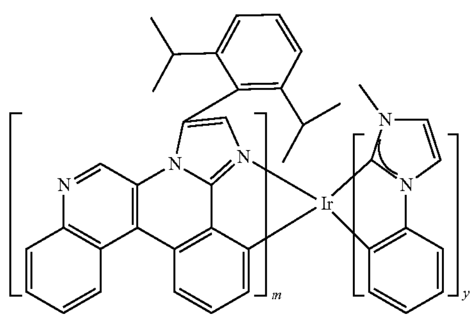
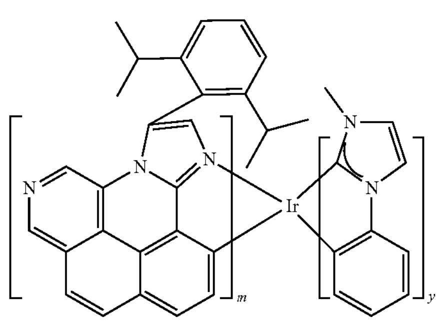

-continued
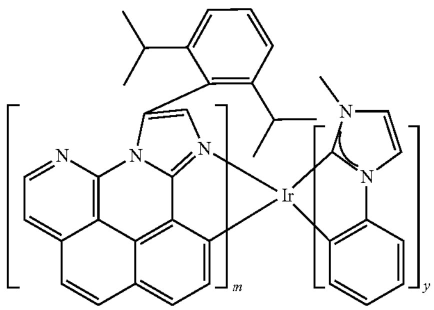
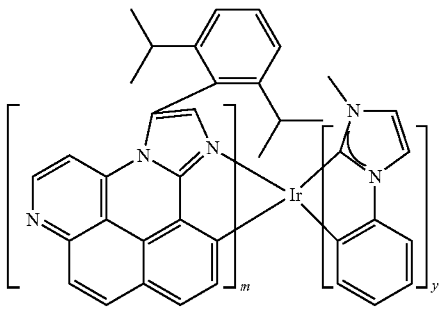
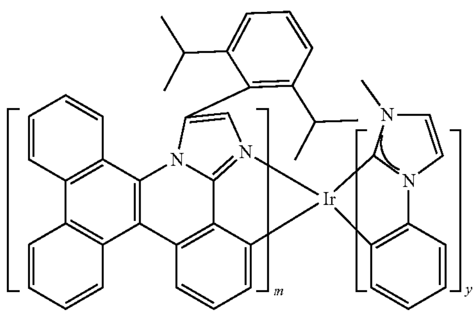
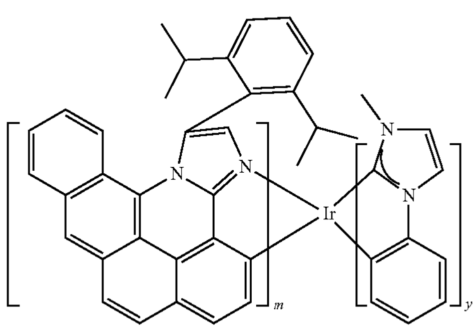
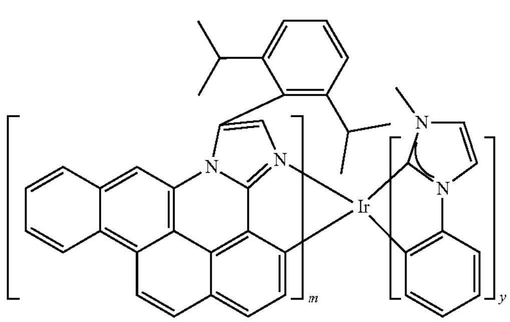
-continued
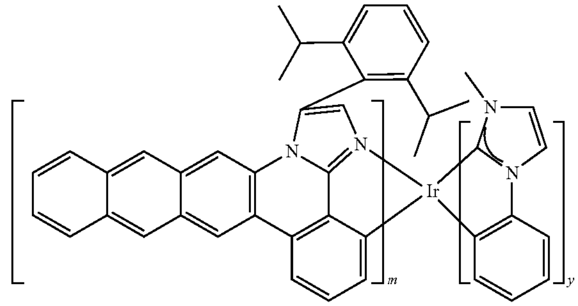
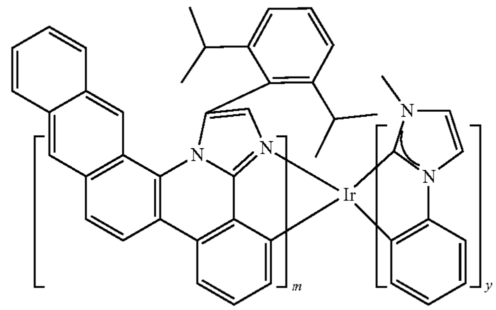
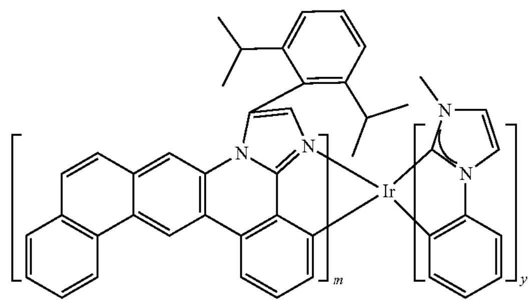
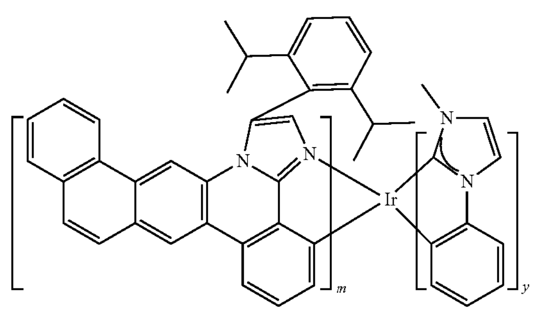
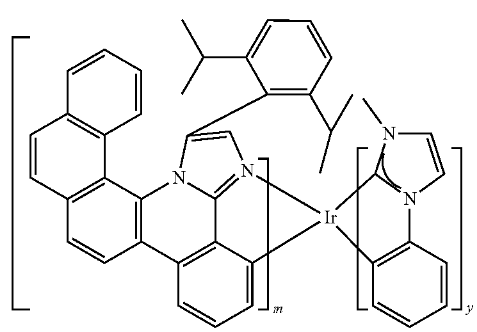

-continued
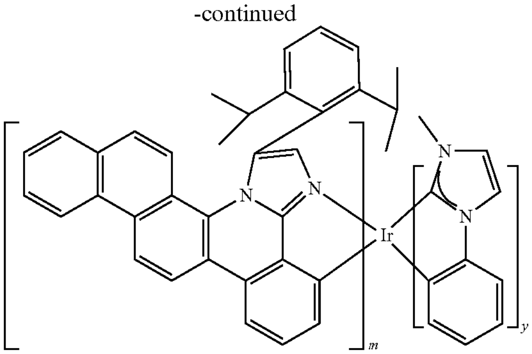
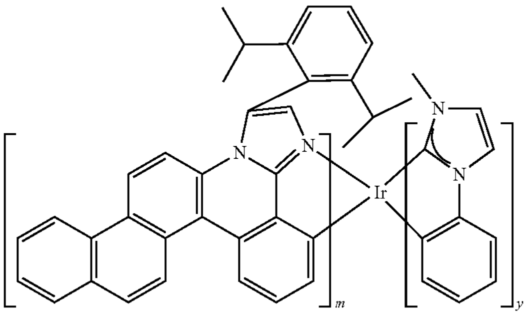
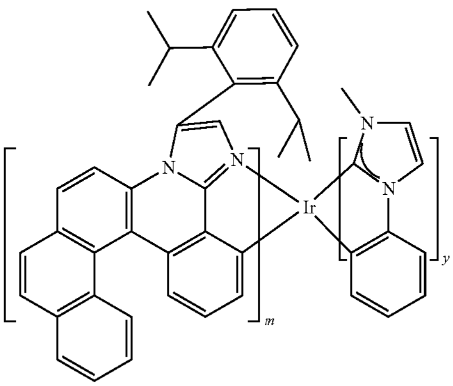
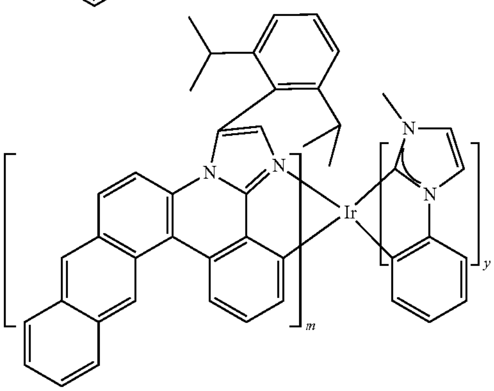
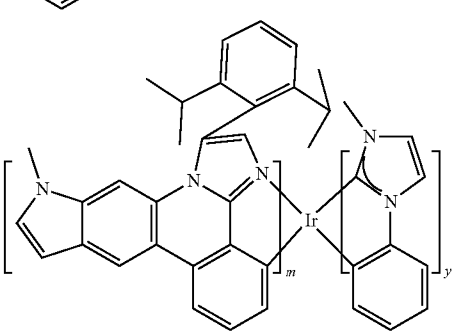
-continued
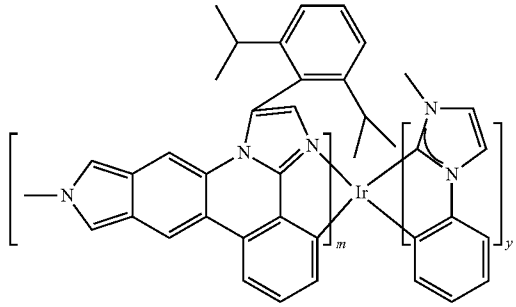
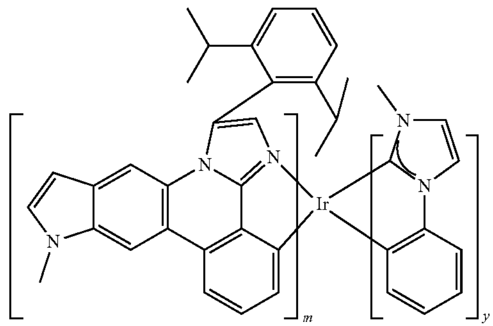
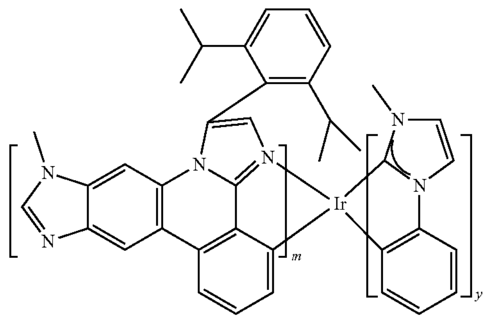
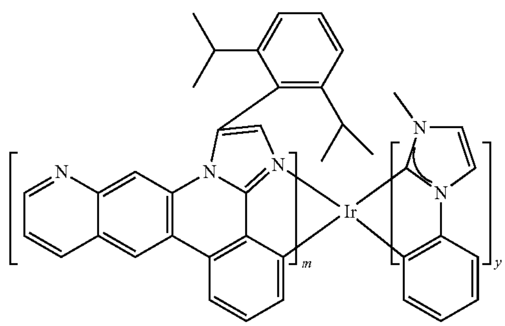
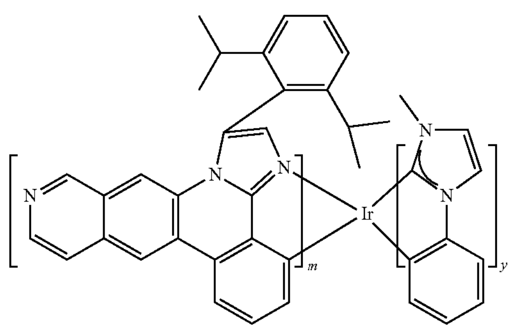

-continued
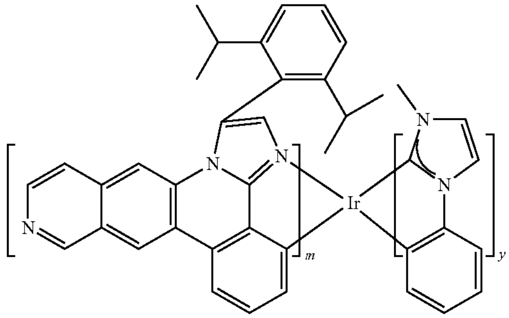
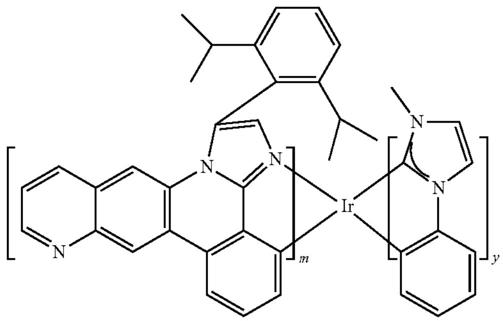
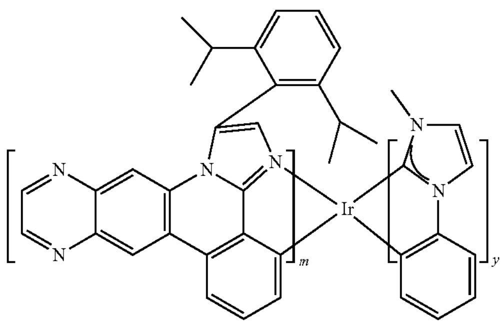
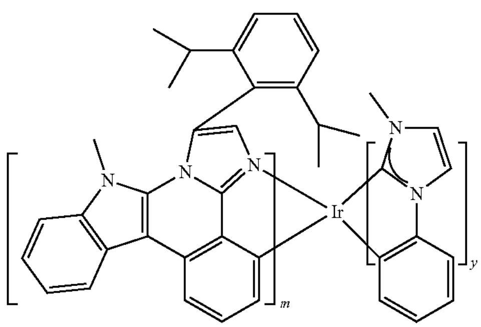
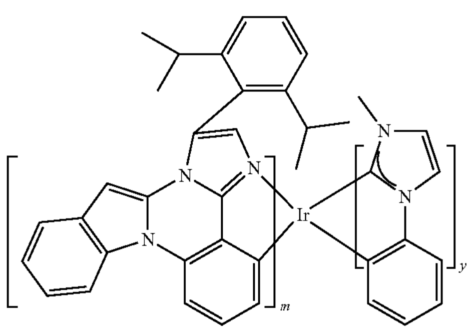
-continued
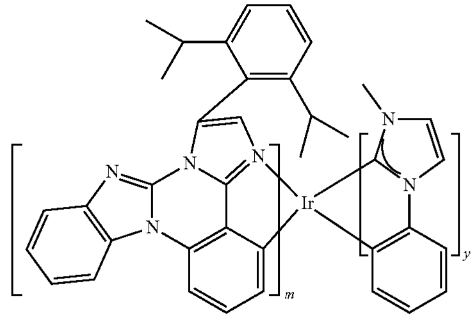
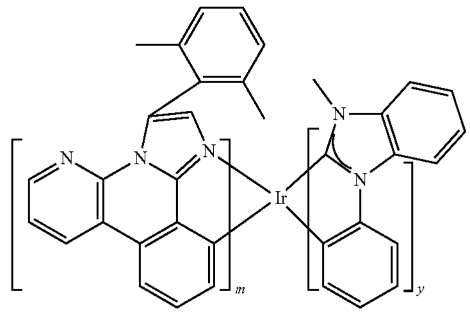
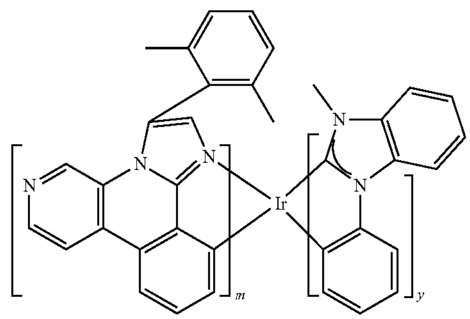
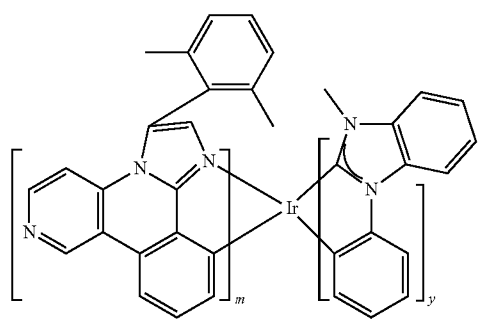
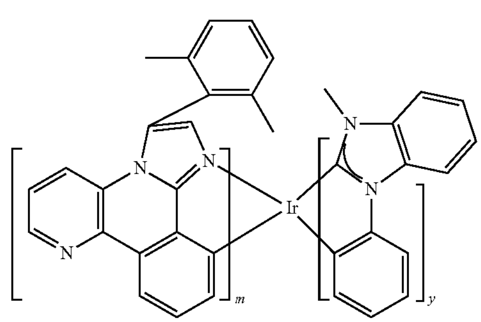

-continued
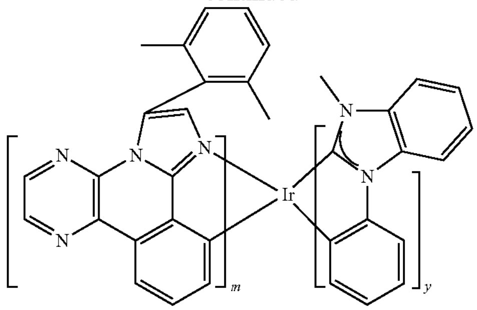
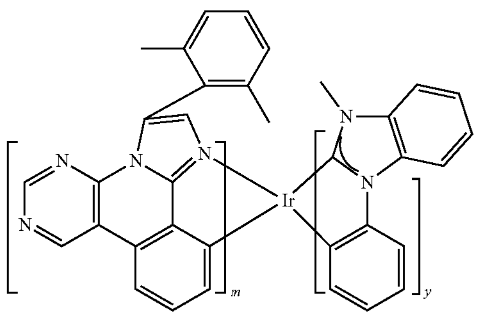
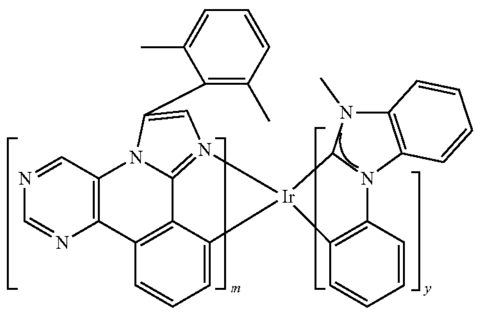
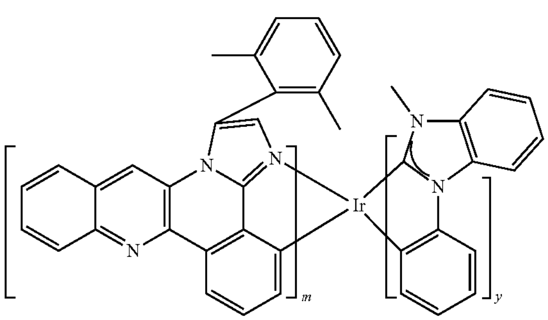
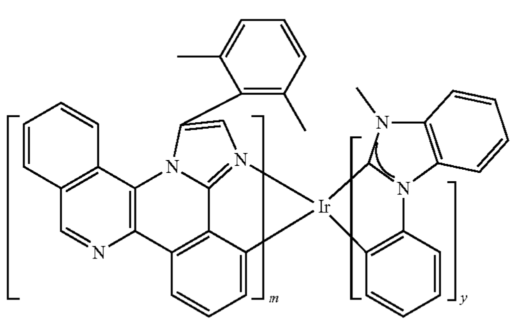
-continued
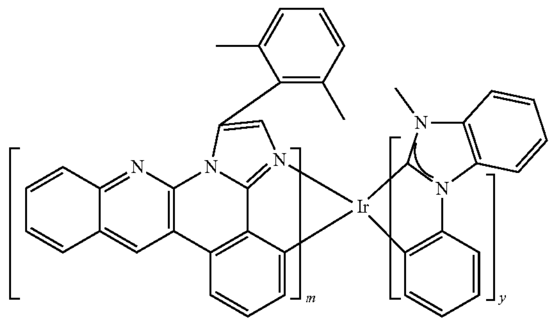
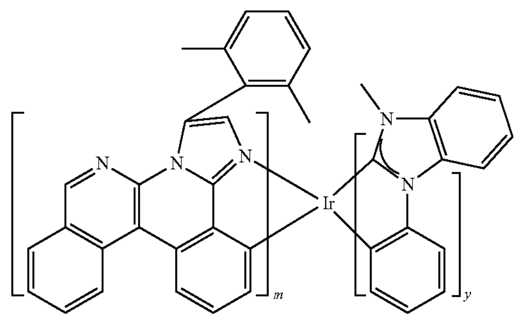
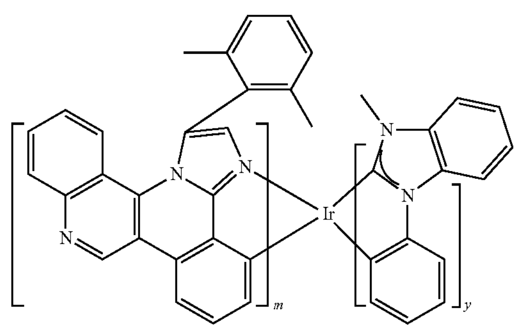
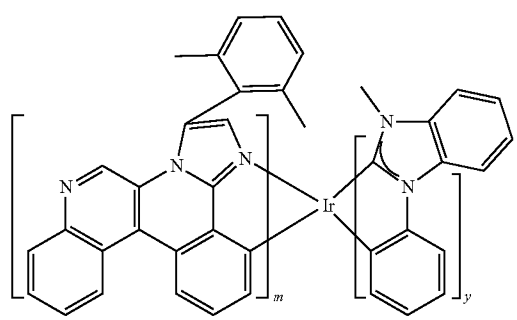
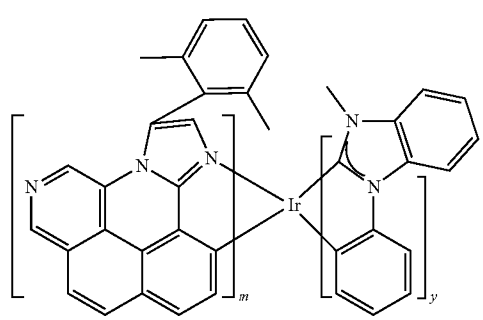

-continued
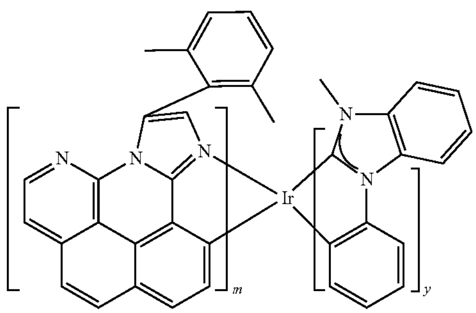
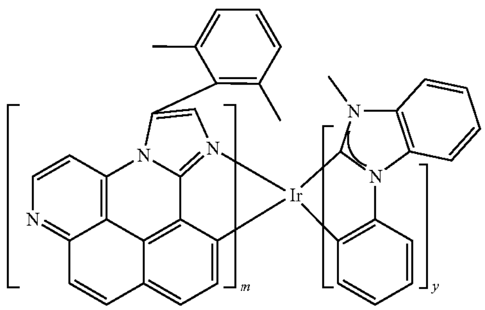
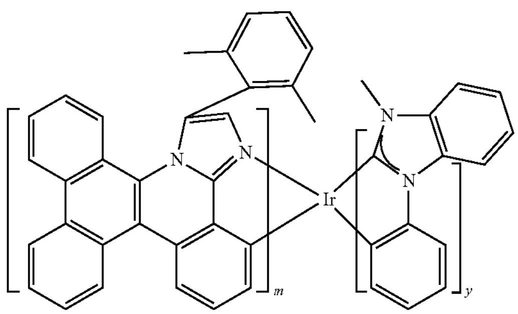
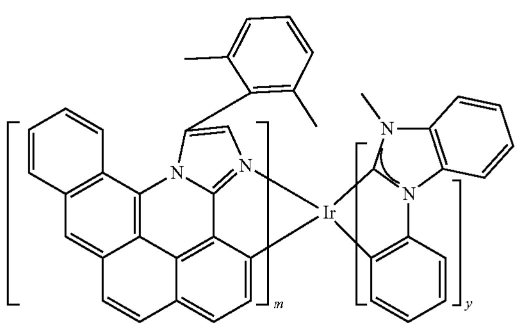
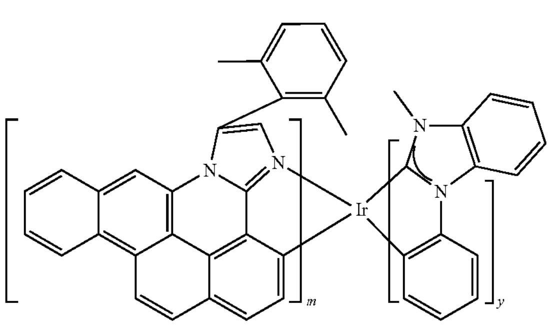
-continued
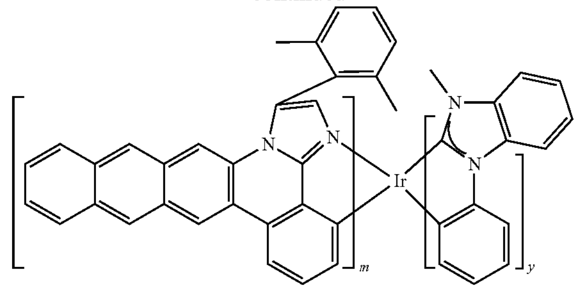
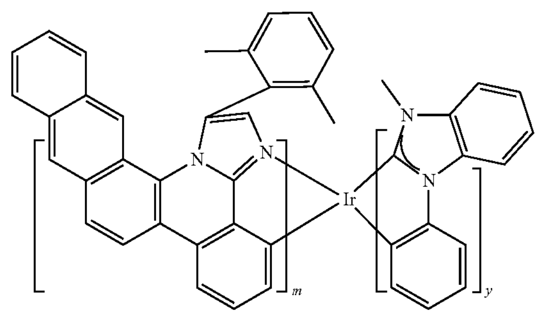
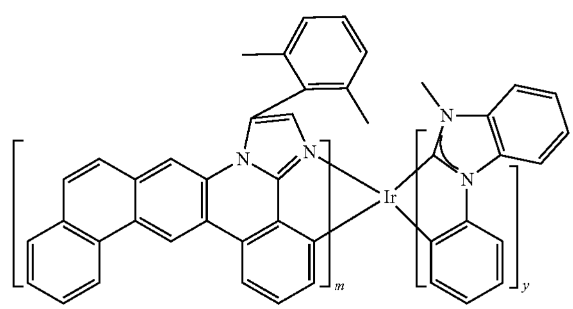
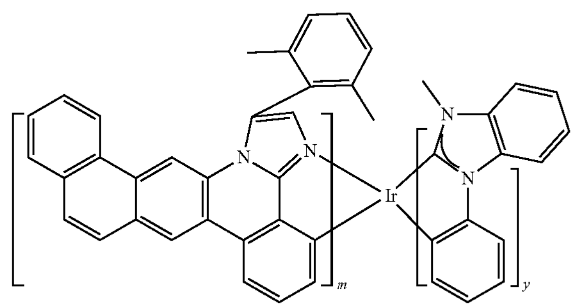
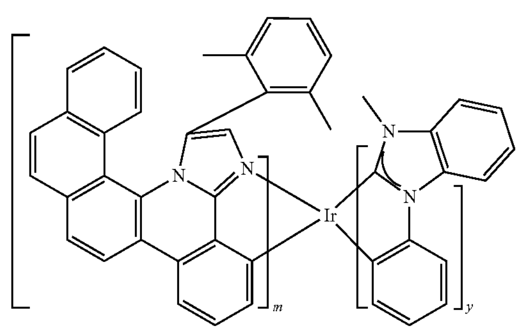

-continued
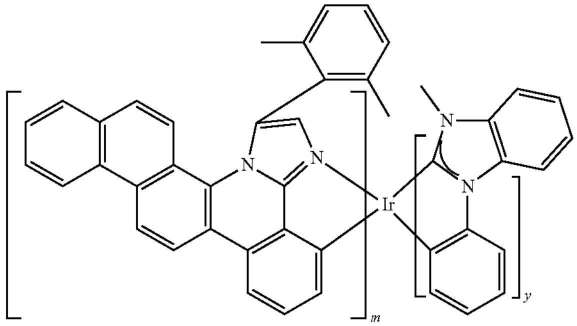
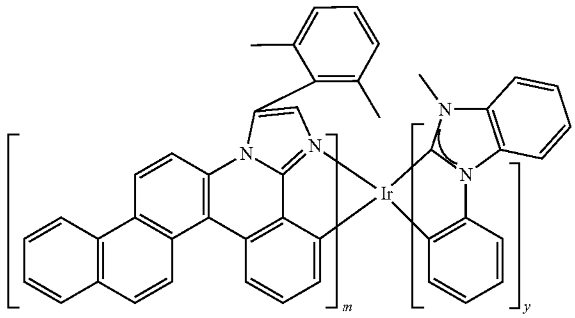
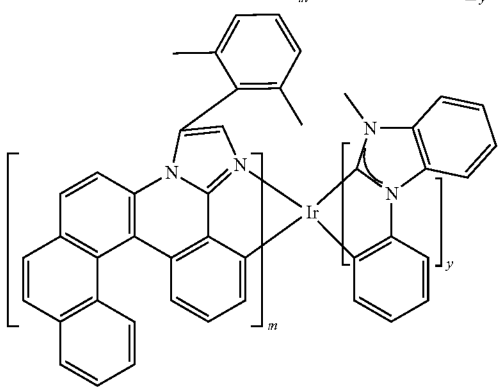
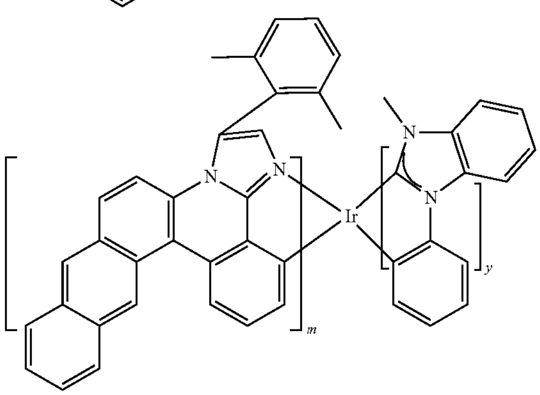
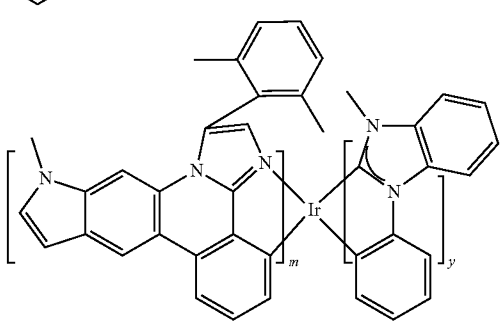
-continued
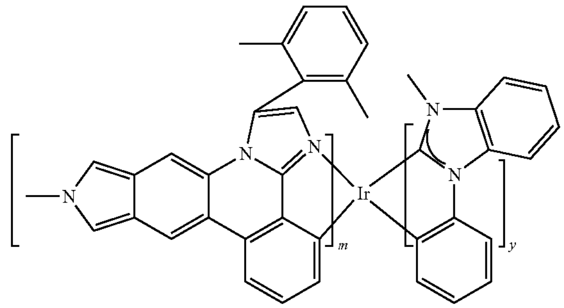
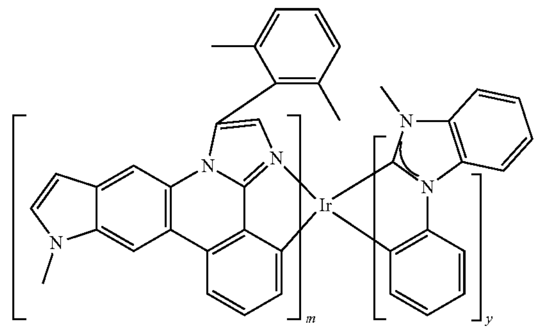
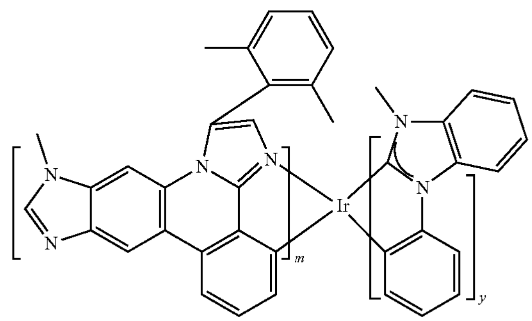
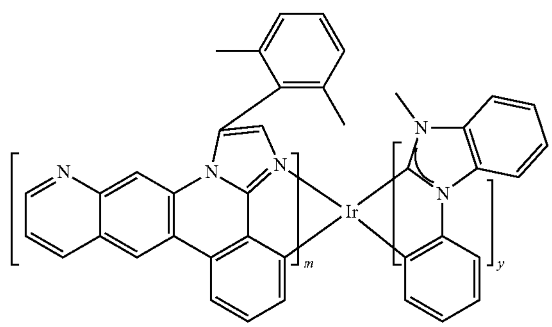
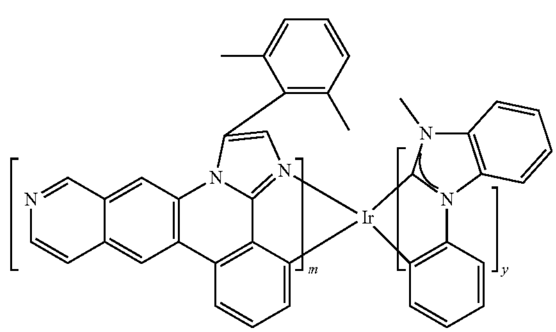

-continued
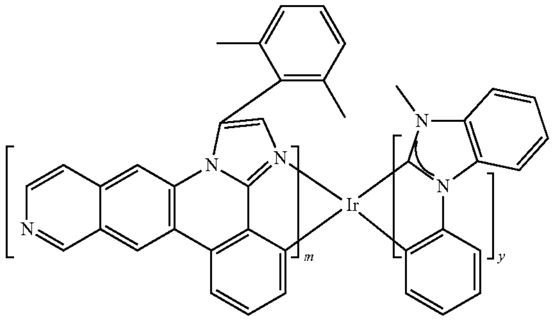
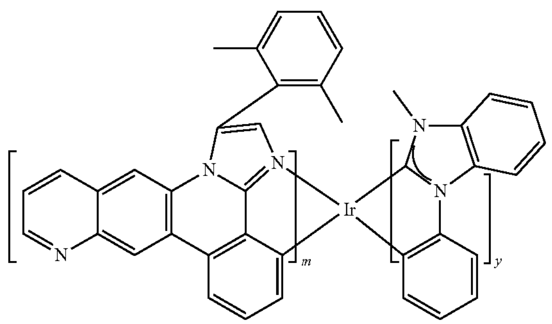
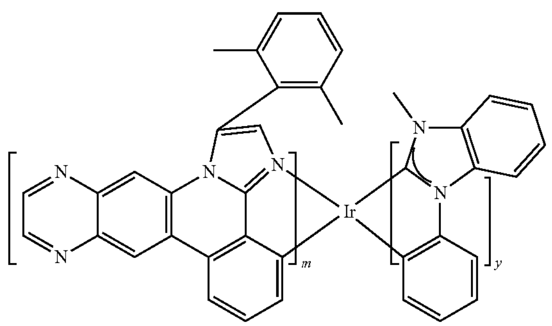
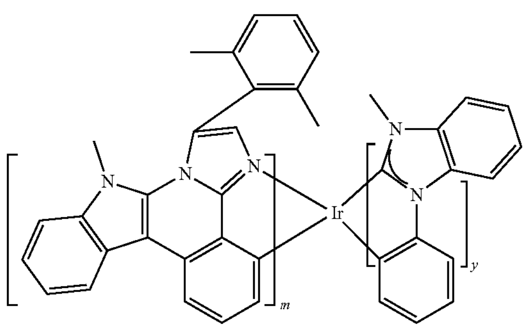
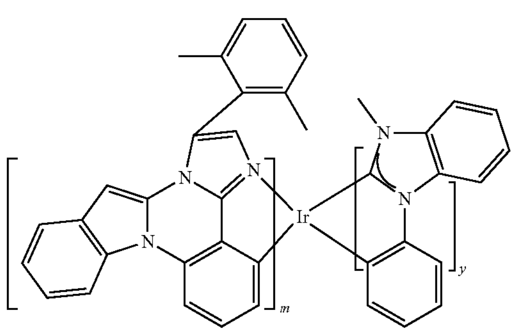
-continued
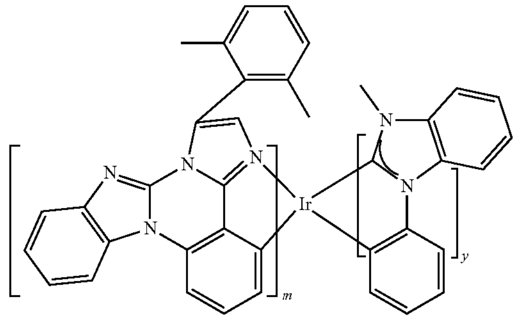
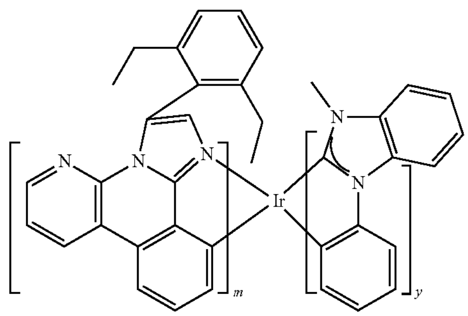
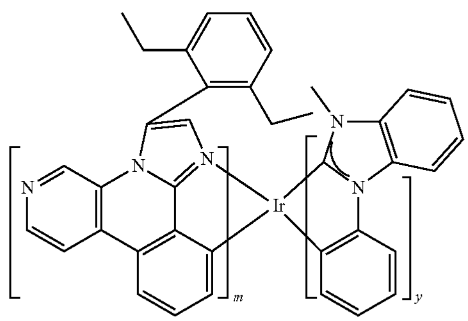
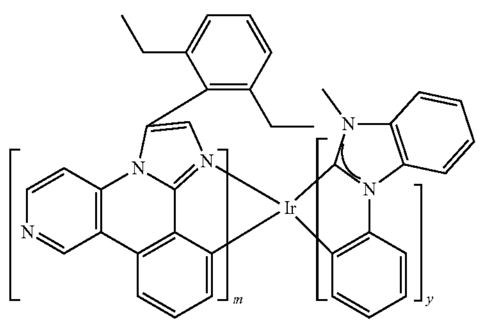
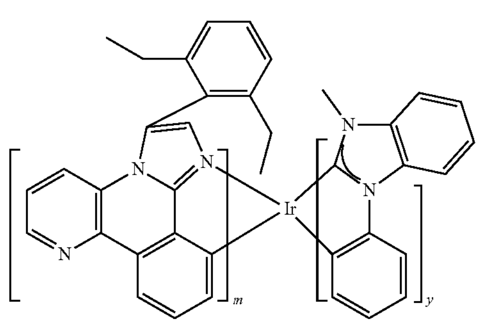

-continued
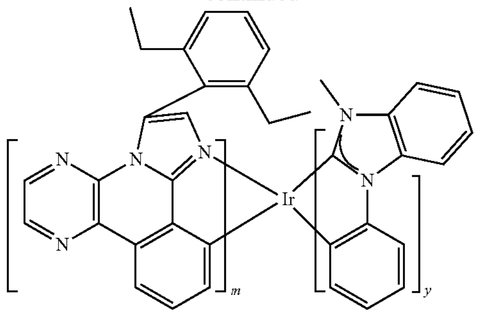
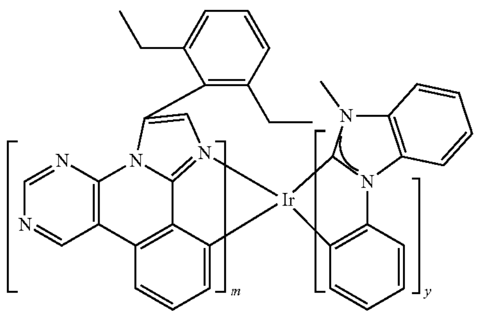
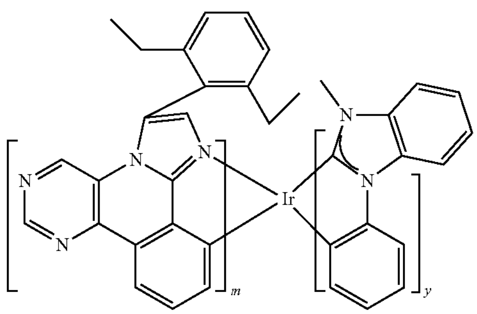
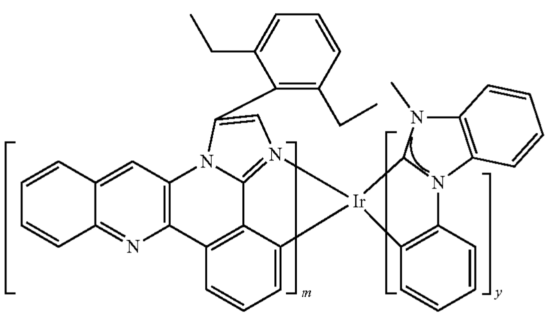
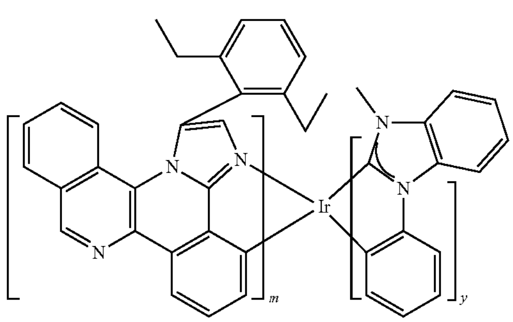
-continued
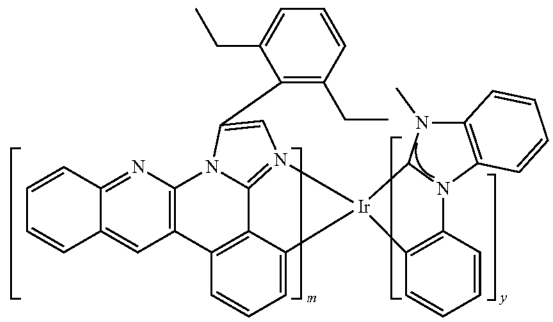
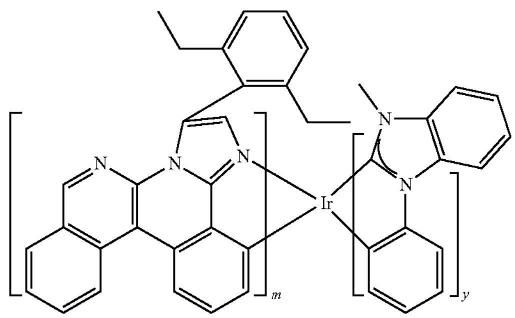
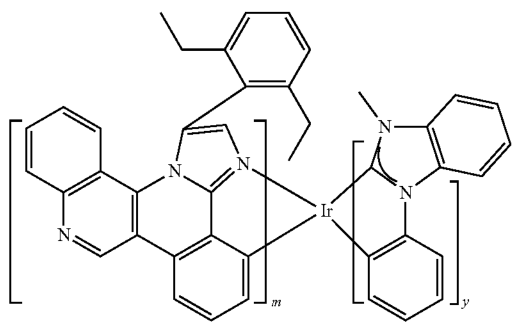
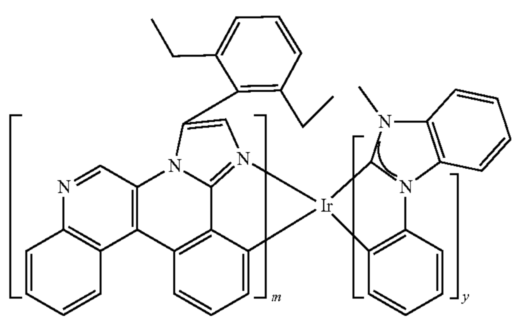
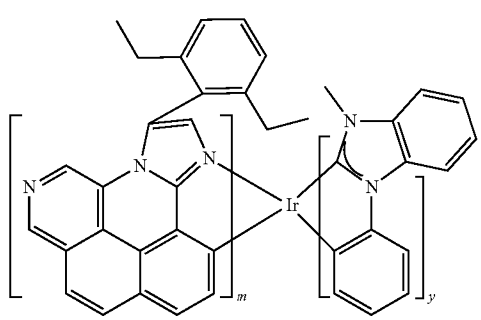

-continued
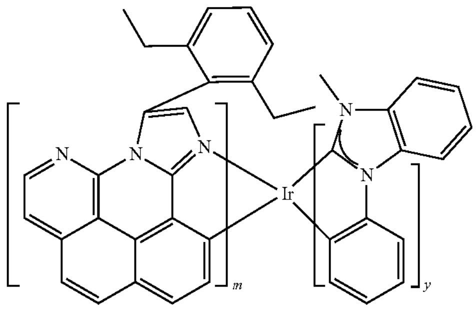
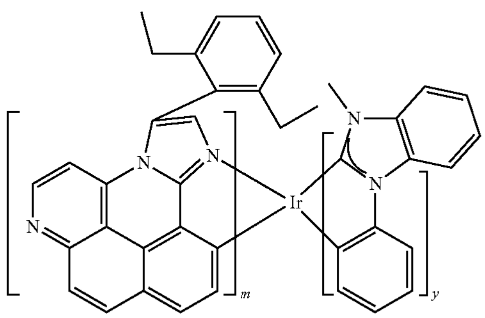
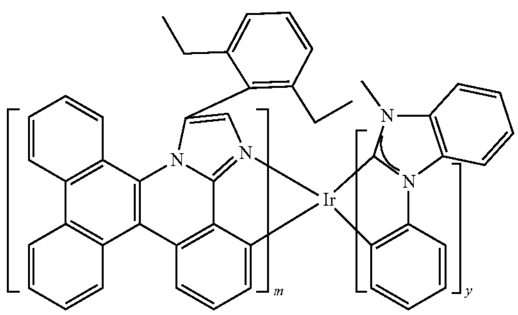
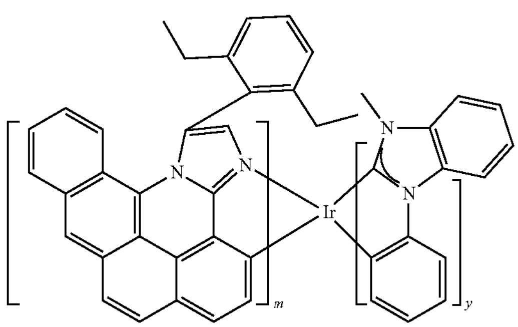
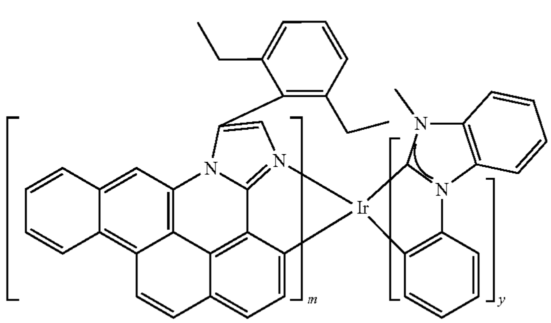
-continued
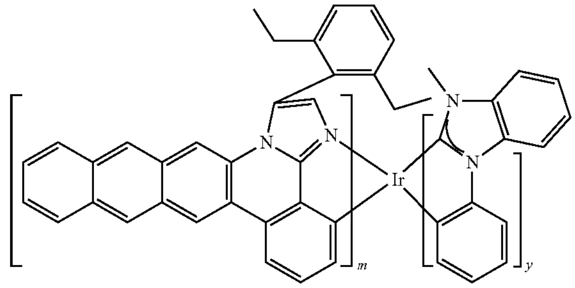
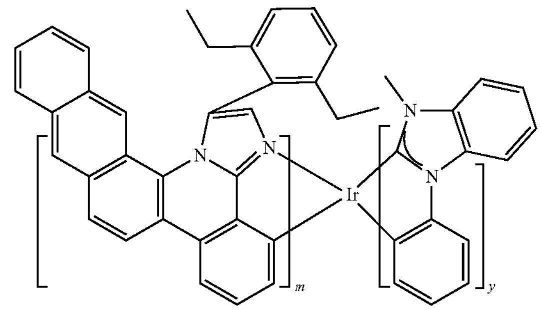
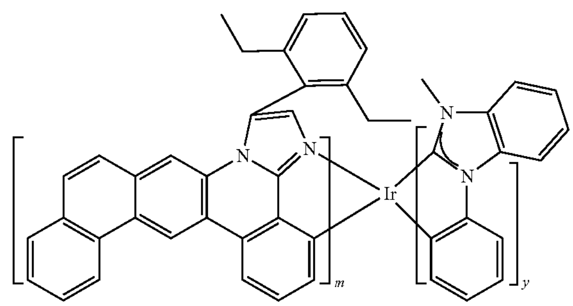
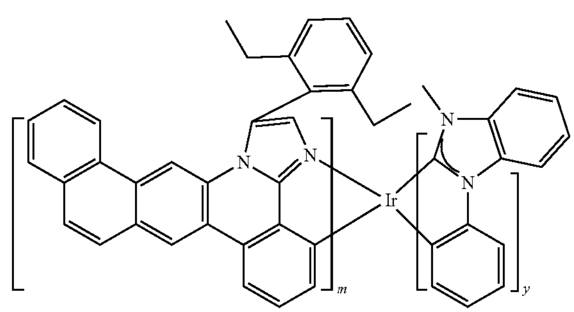
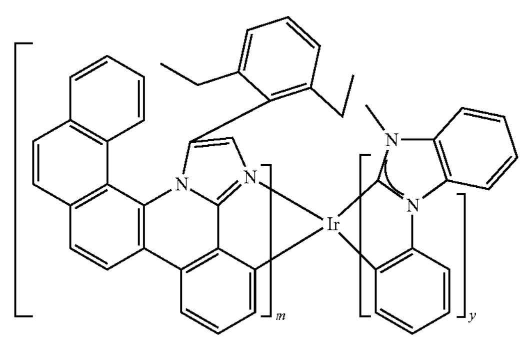

-continued
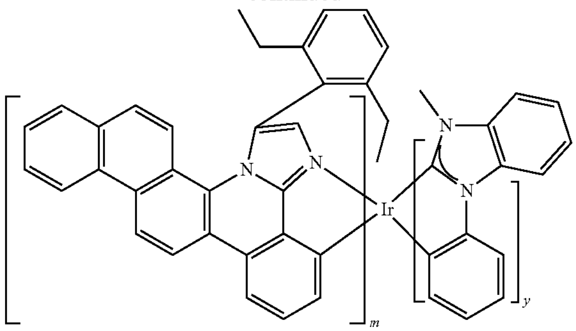
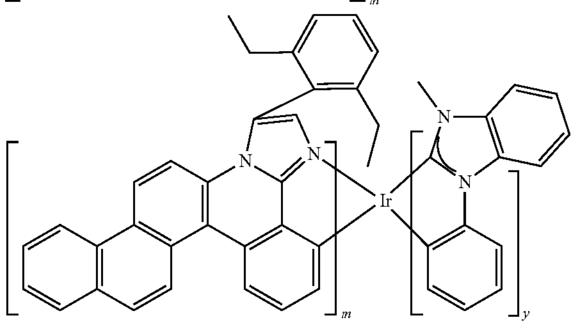
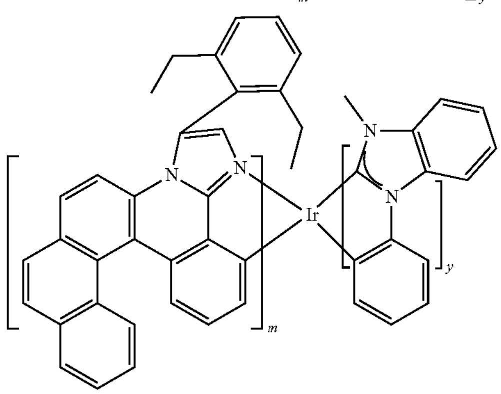
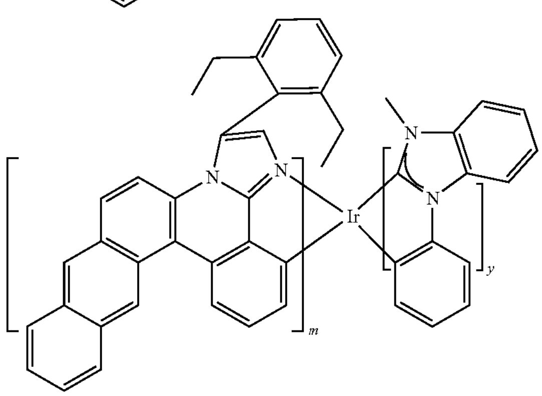
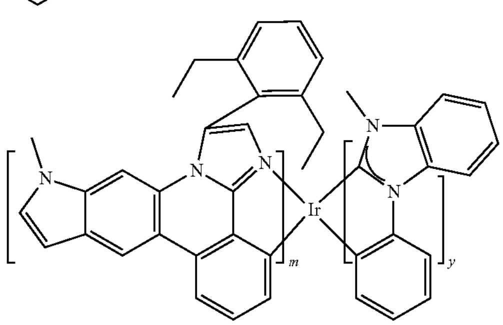
-continued
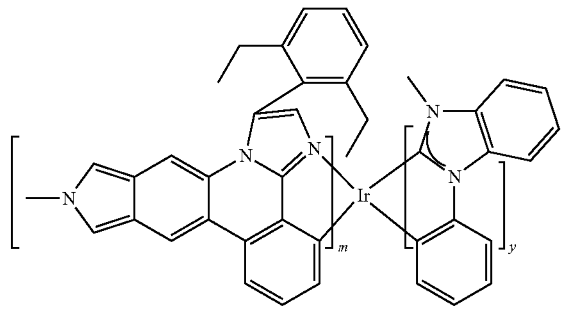
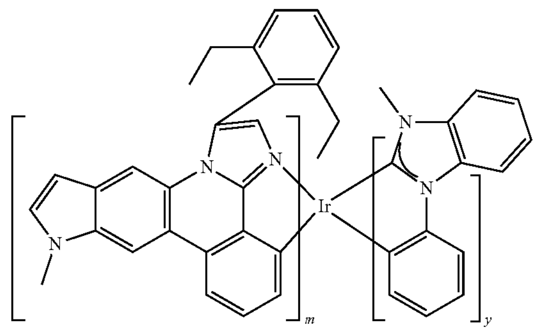
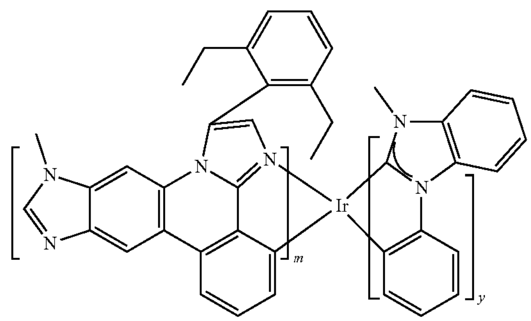
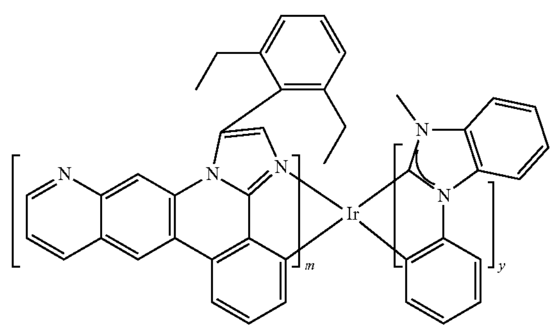
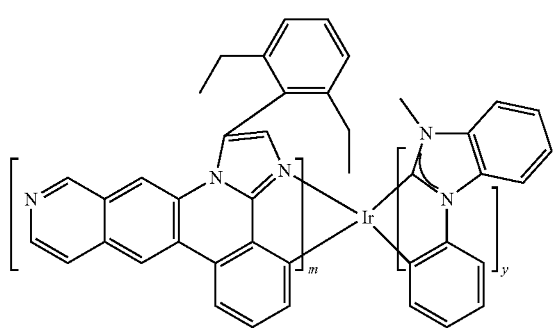

-continued
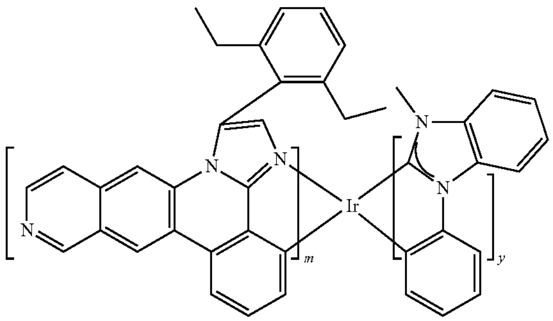
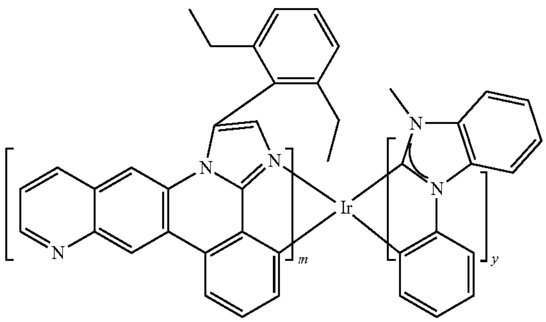
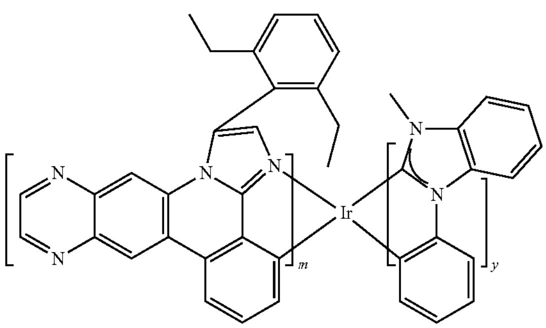
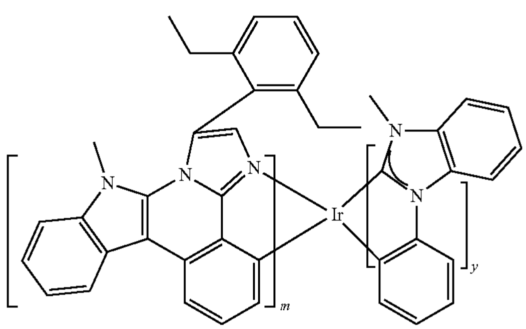
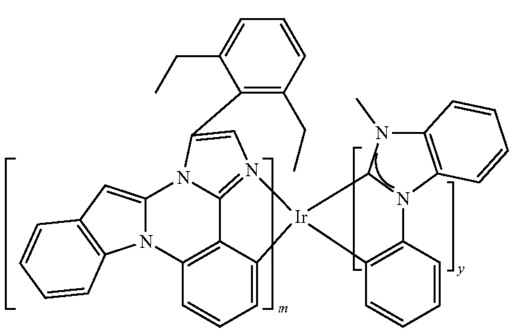
-continued
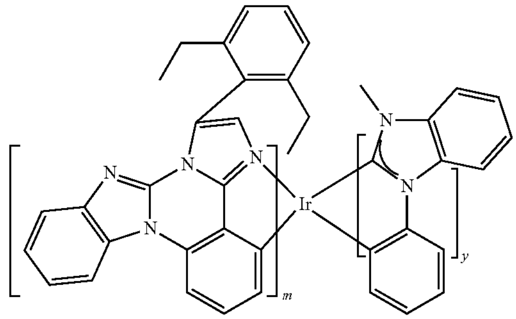
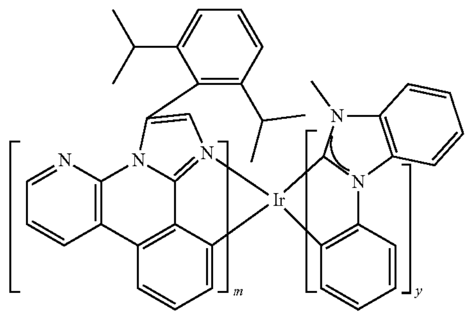
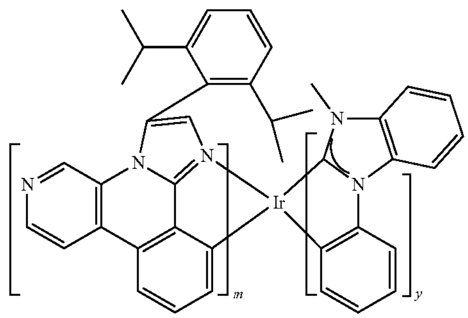
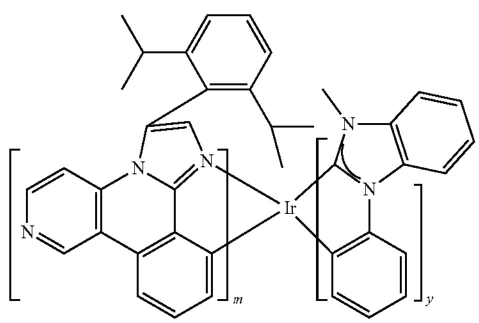
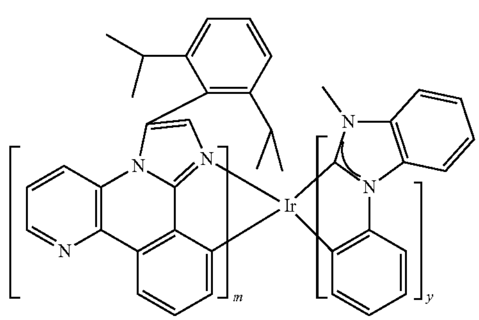

-continued
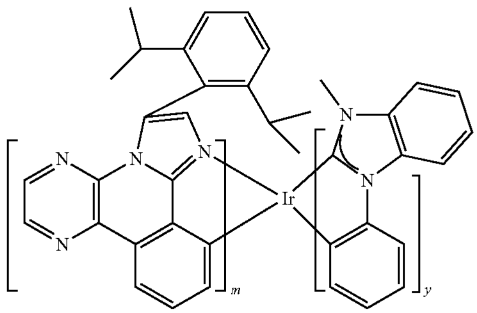
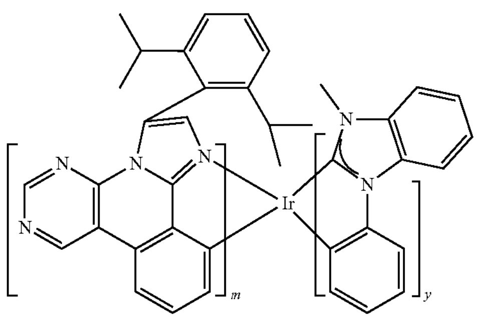
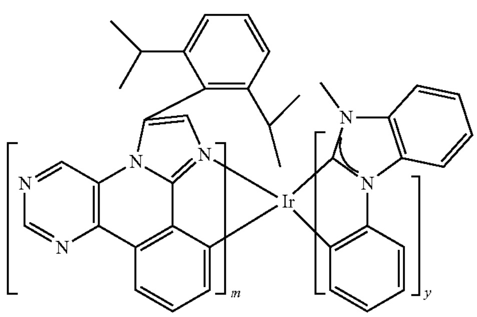
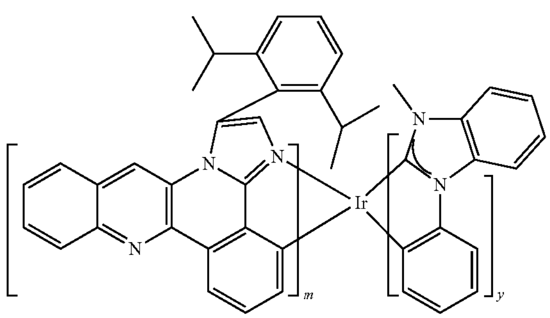
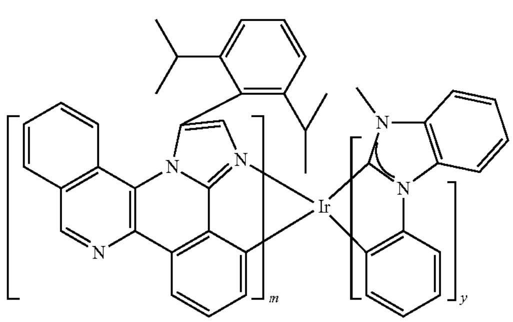
-continued
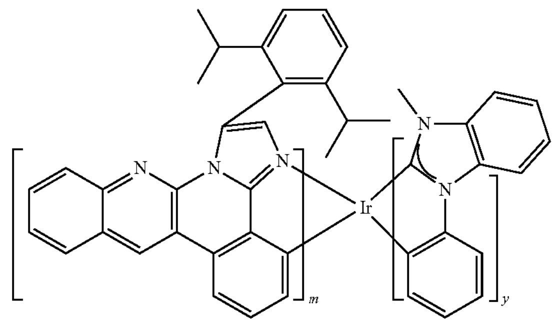
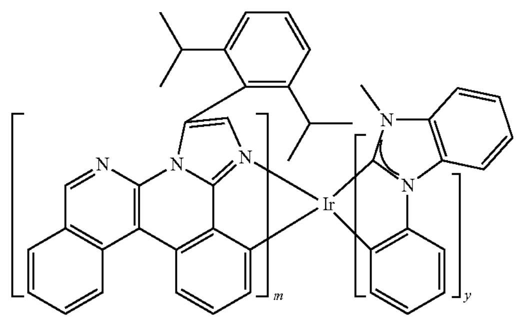
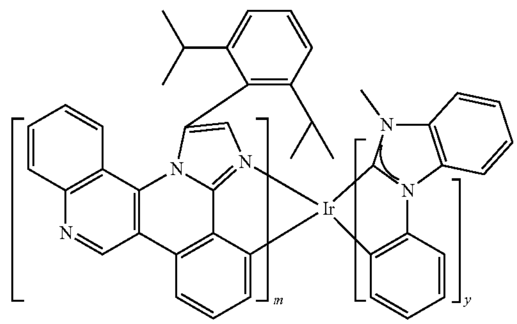
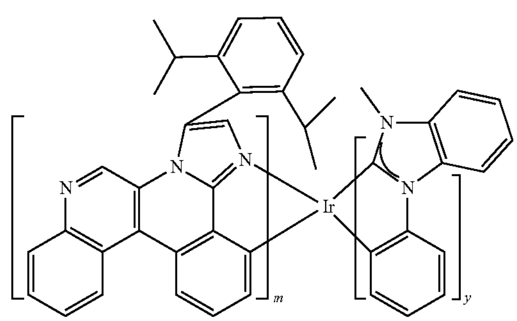
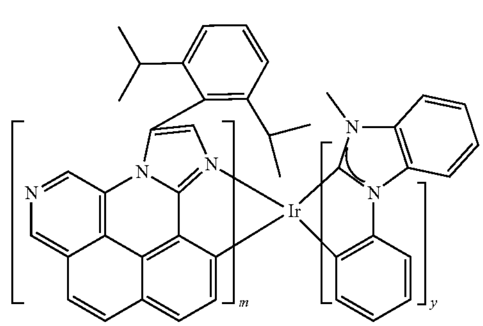

-continued
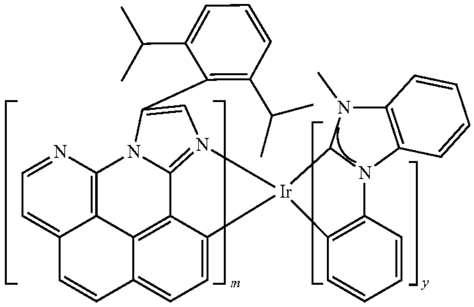
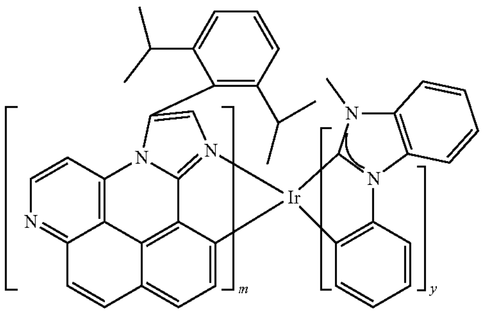
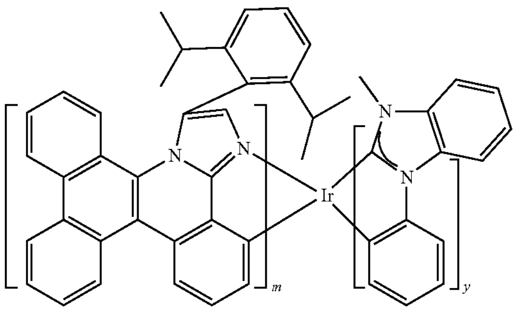
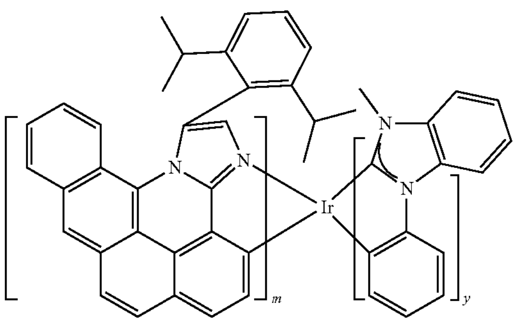
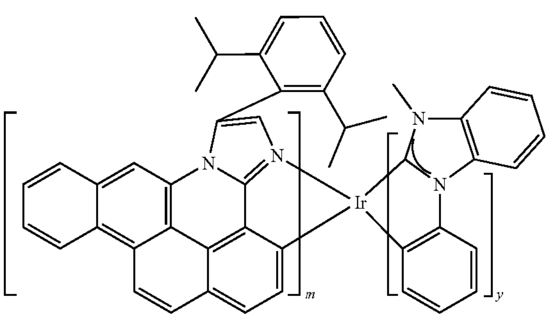
-continued
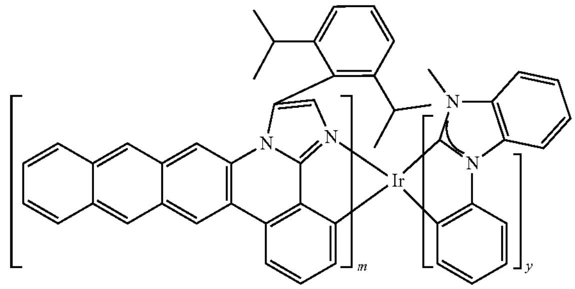
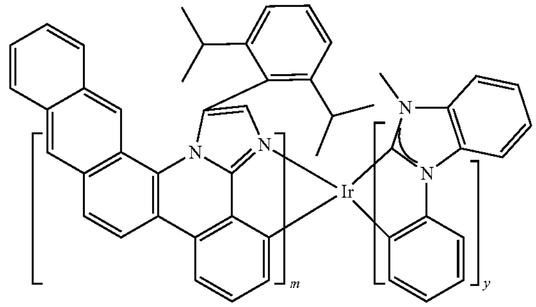
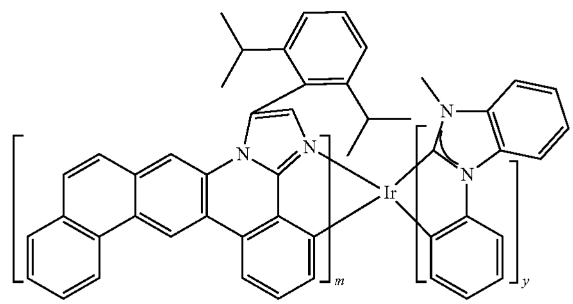
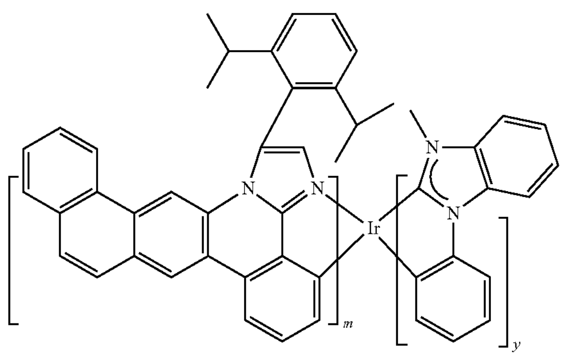
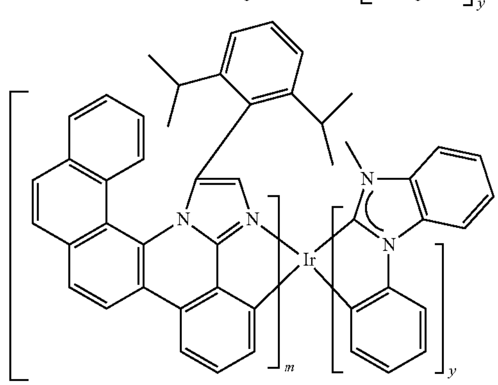

-continued
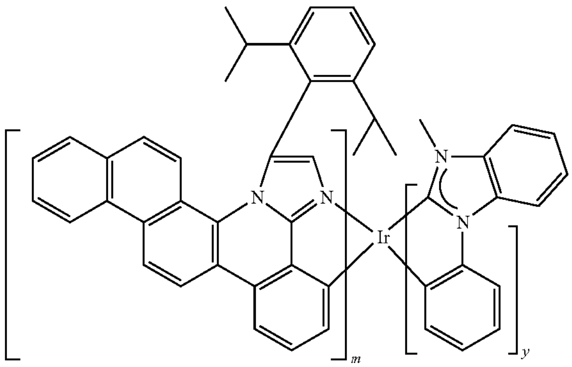
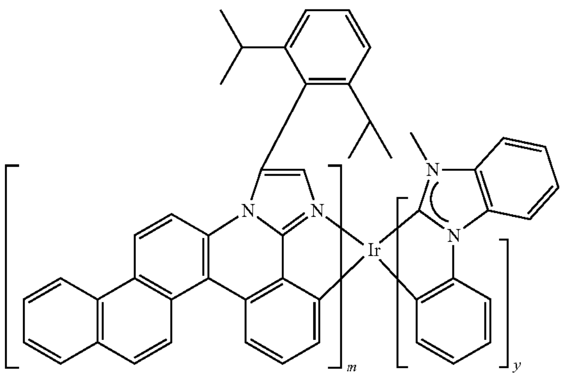
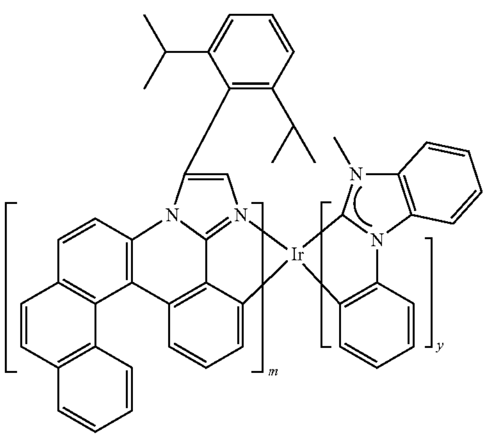
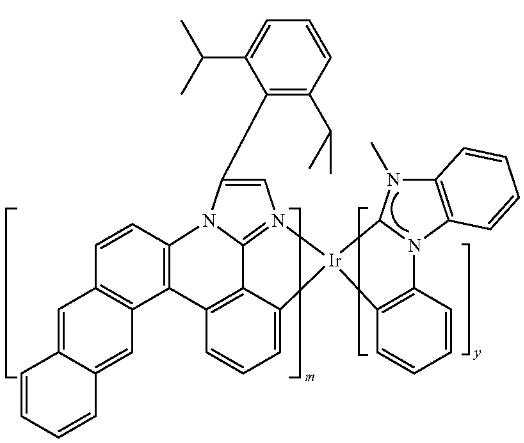
-continued
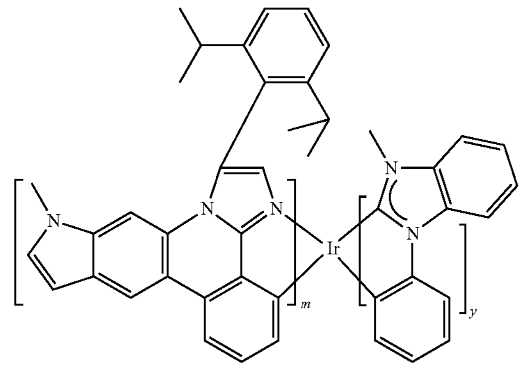
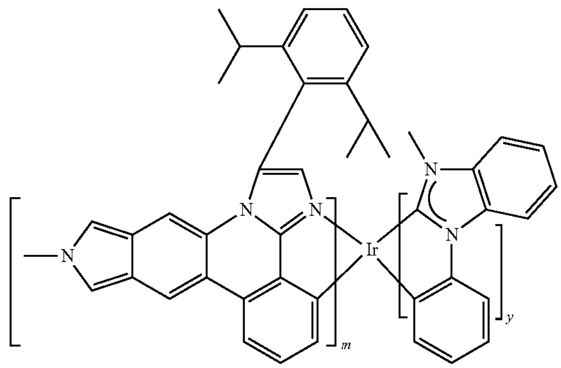
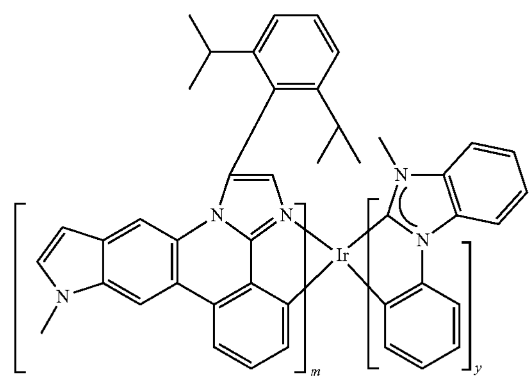
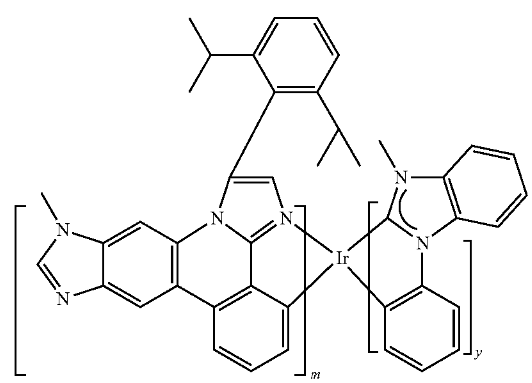

-continued
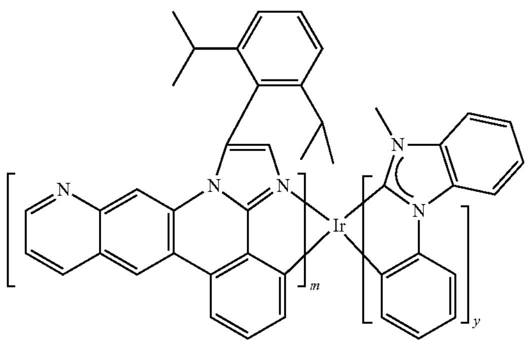
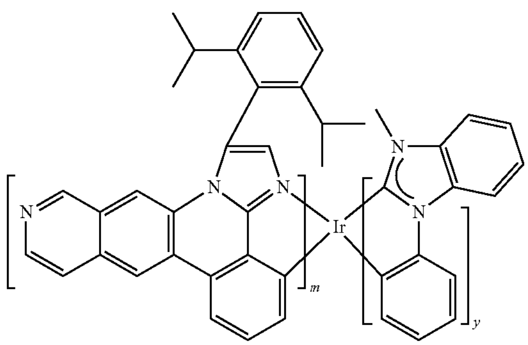
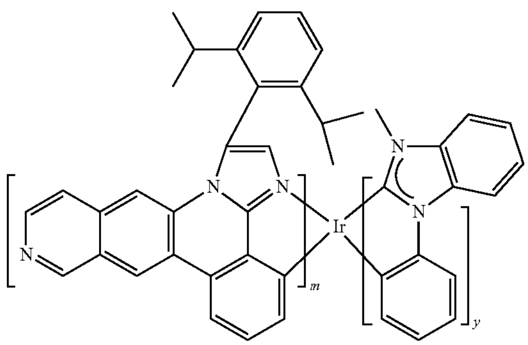
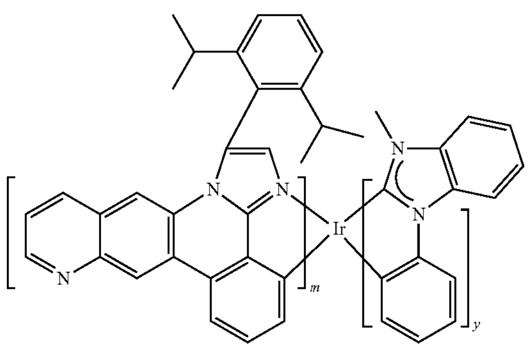
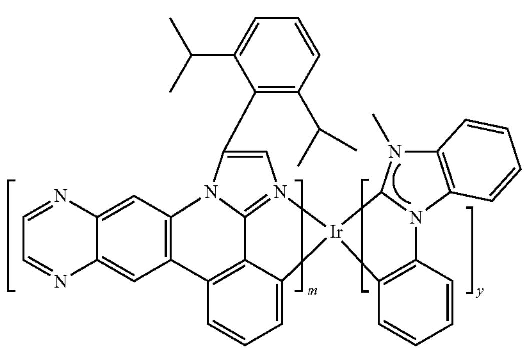
-continued
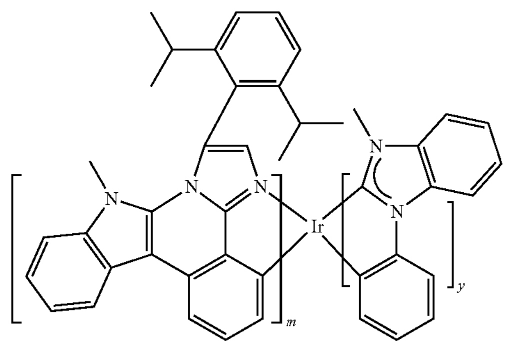
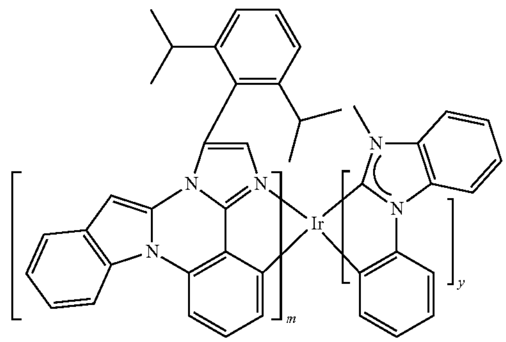
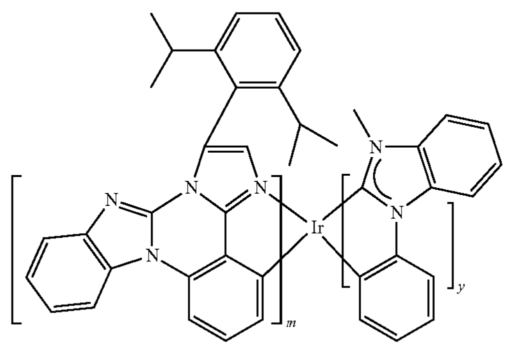
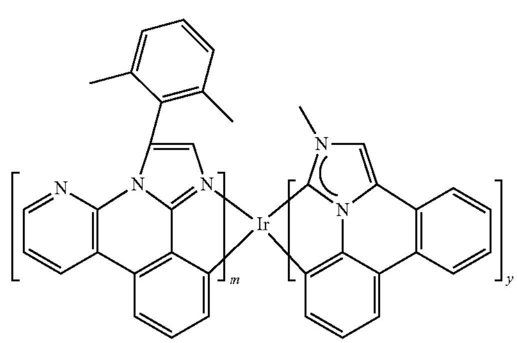
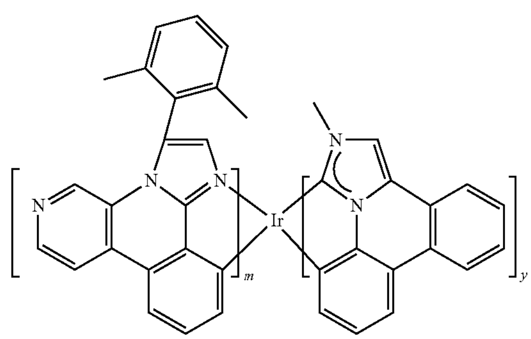

-continued
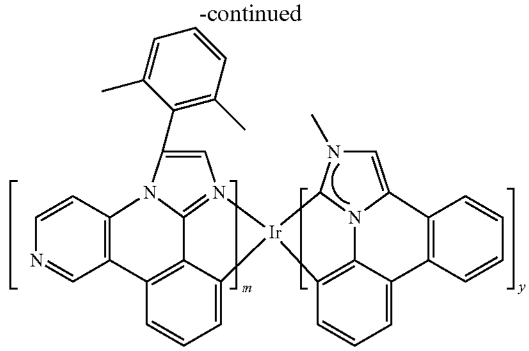
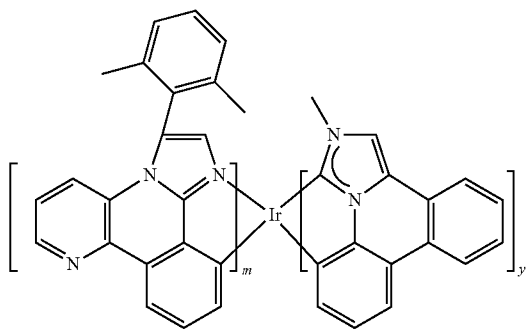
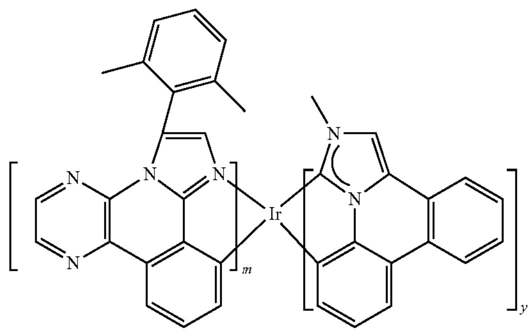
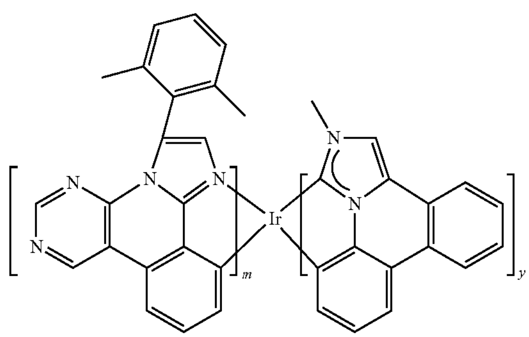
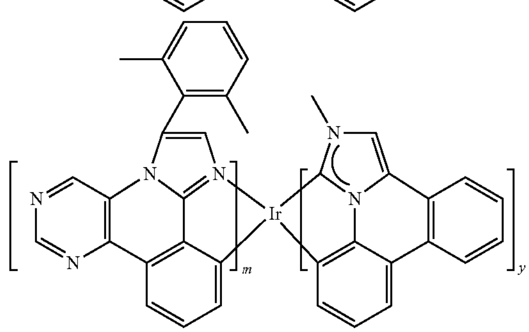
-continued
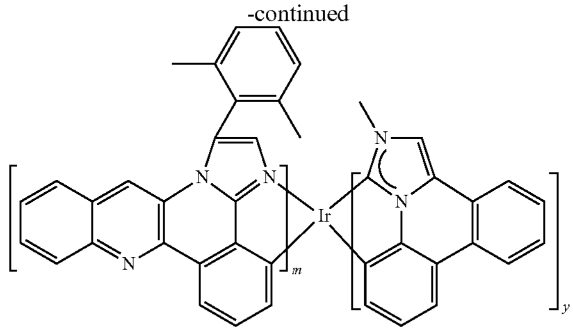
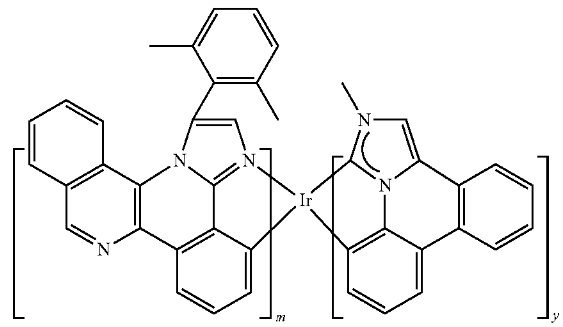
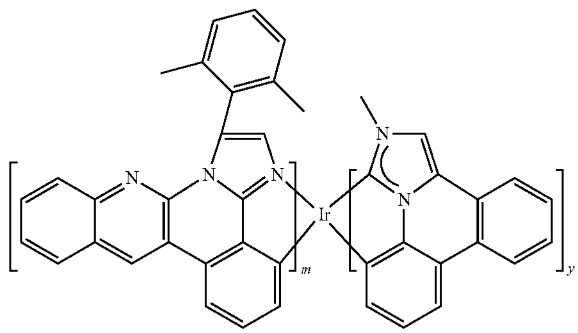
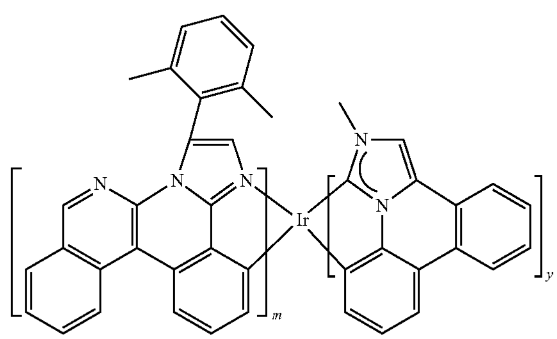
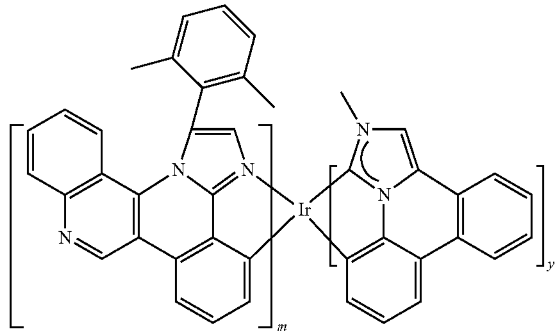

-continued
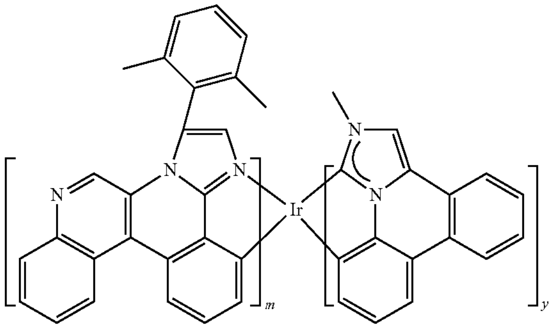
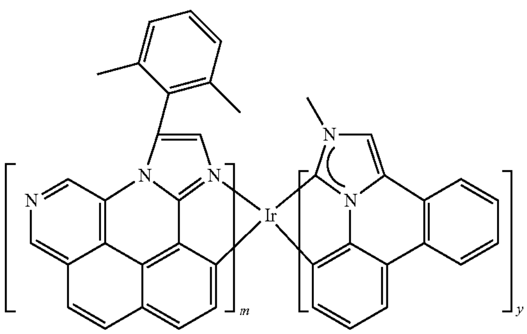
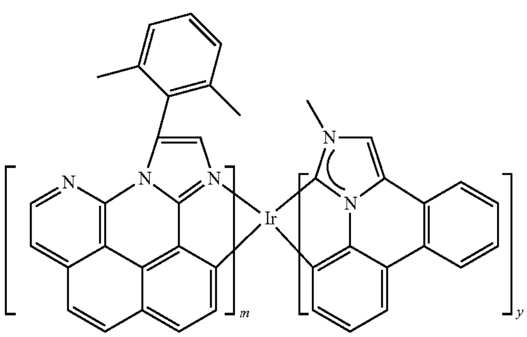
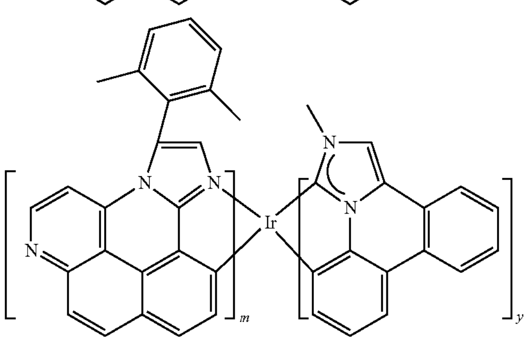
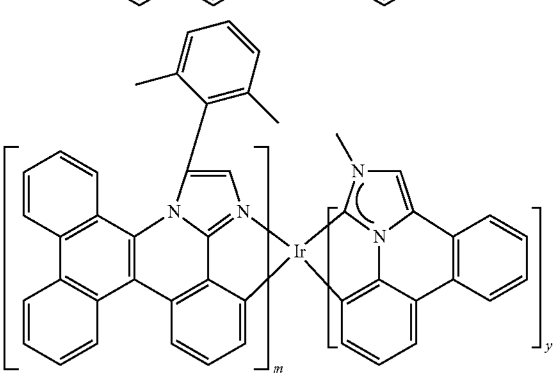
-continued
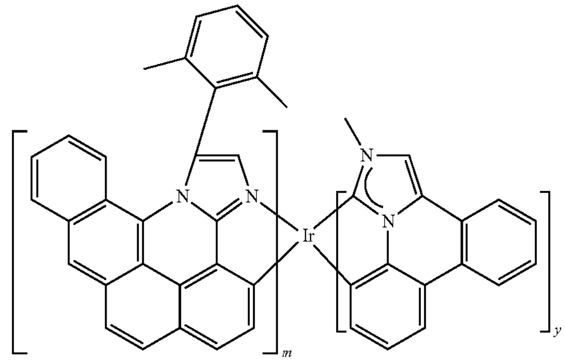
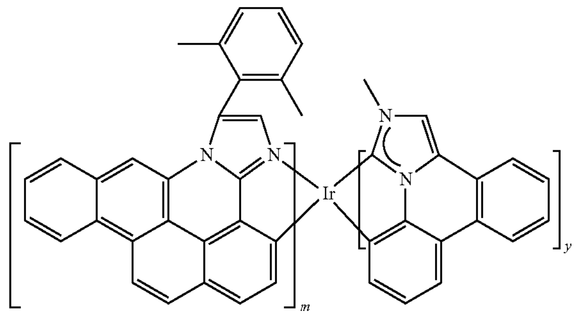
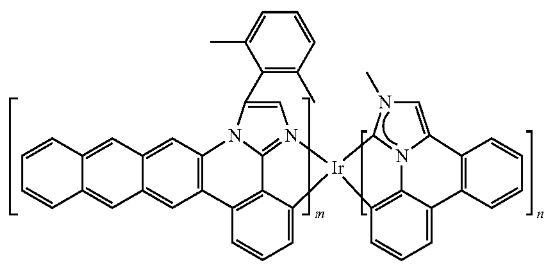
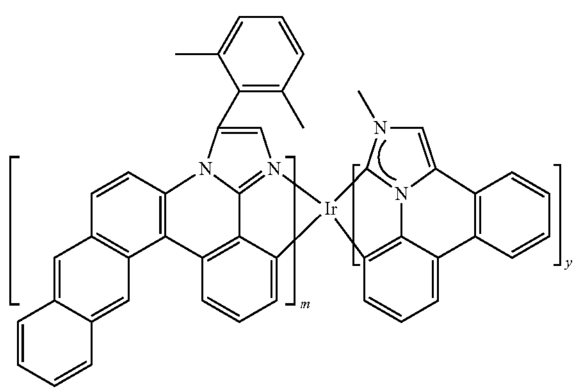
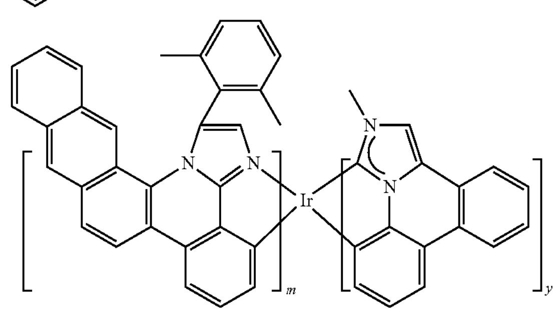

-continued
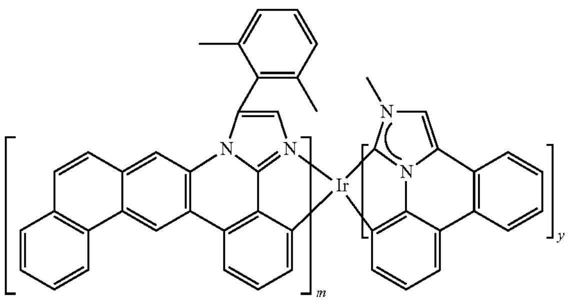
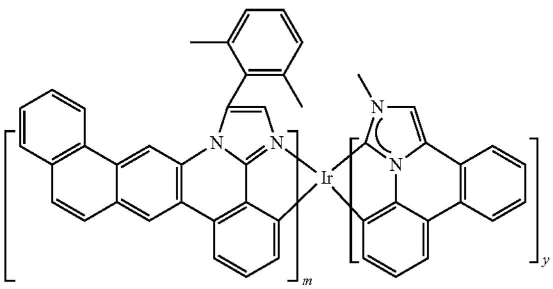
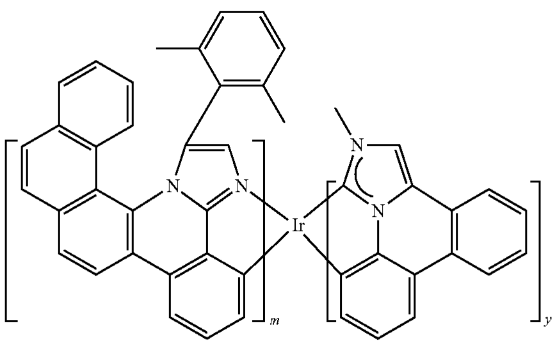
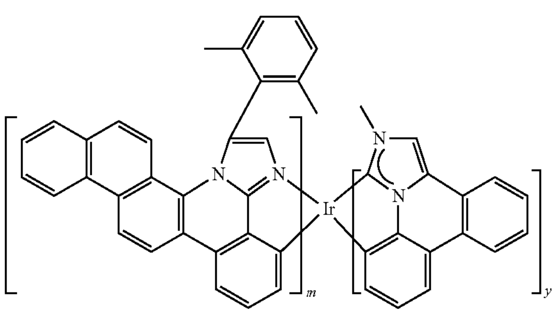
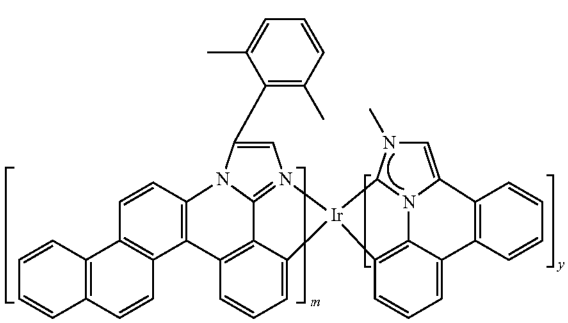
-continued
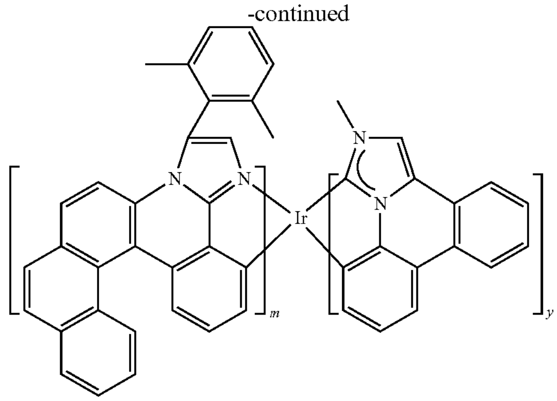
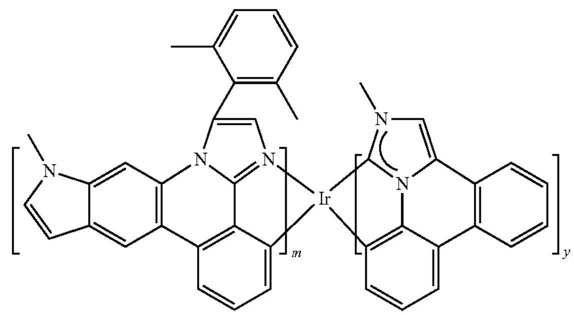
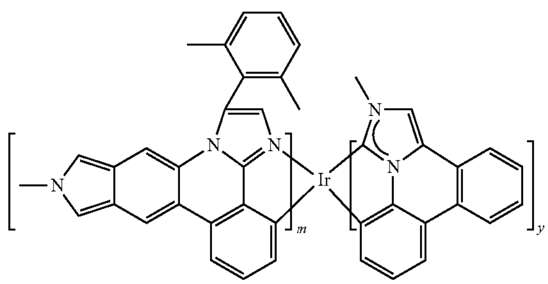
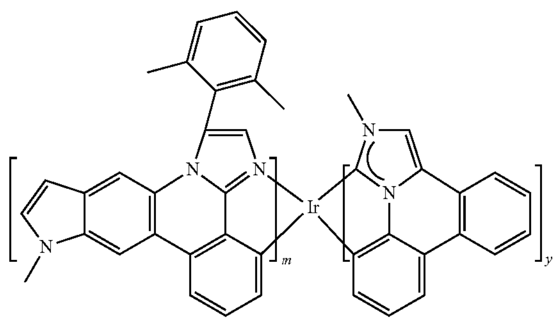
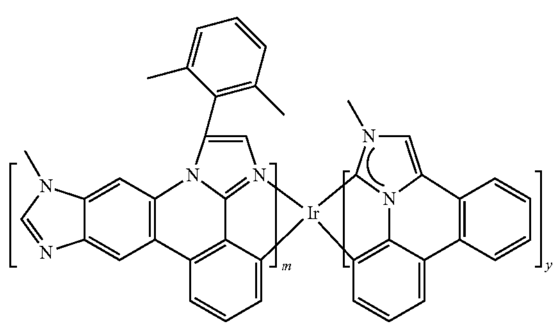

-continued
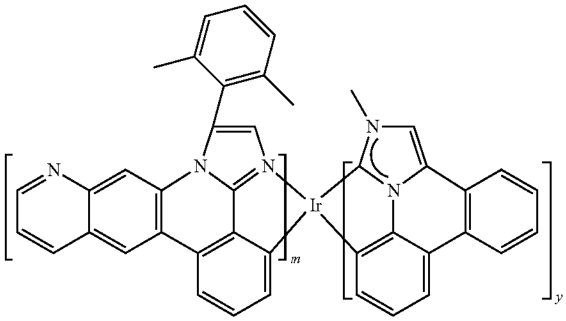
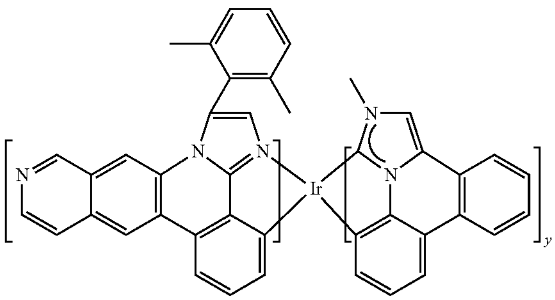
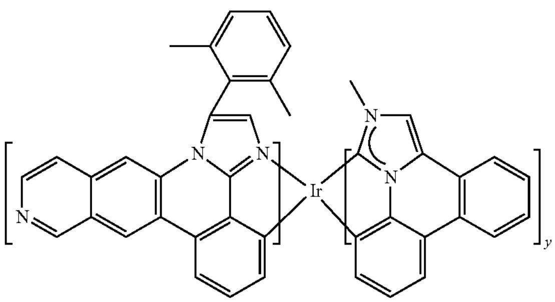
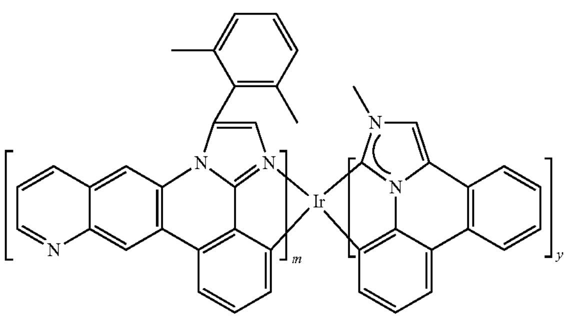
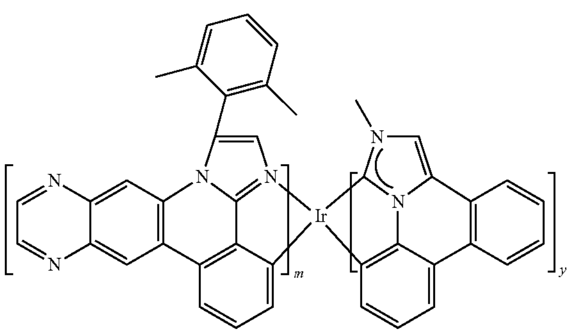
-continued
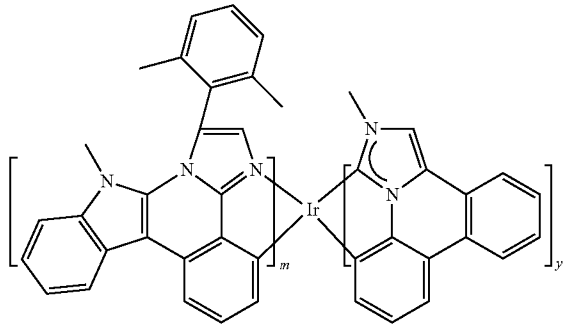
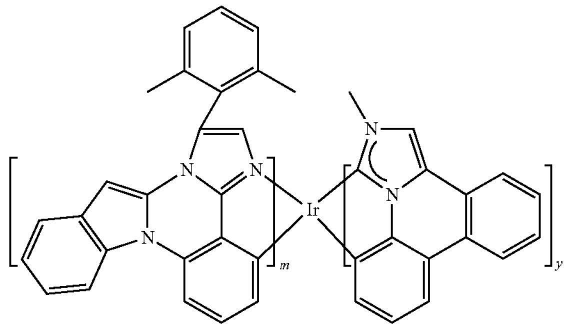
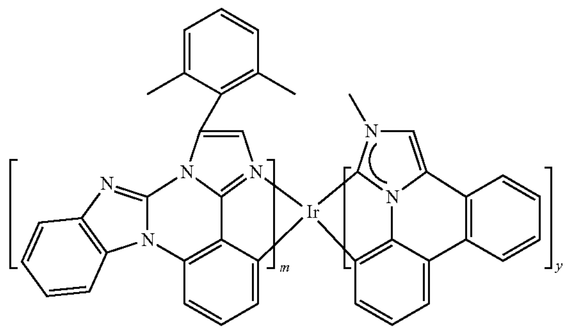
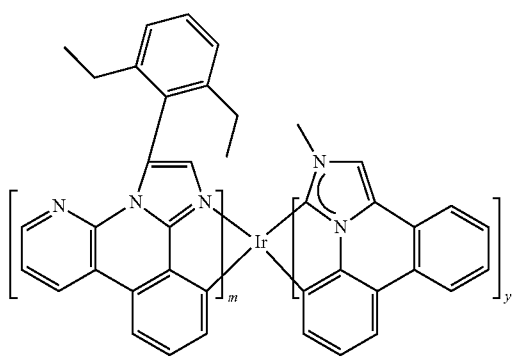
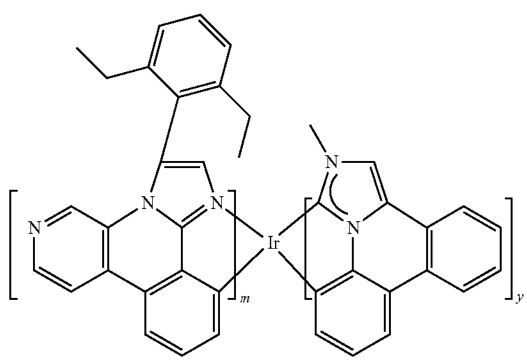

-continued
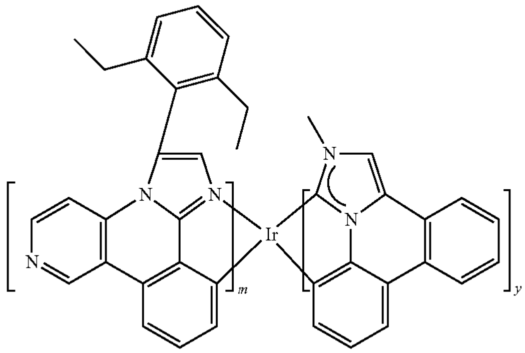
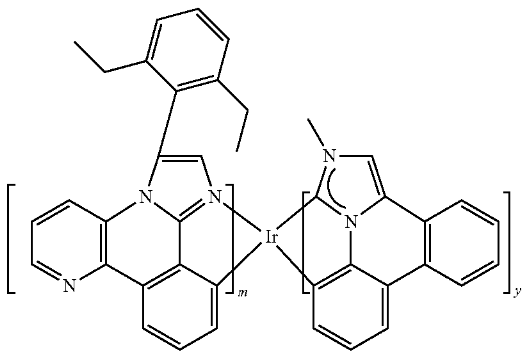
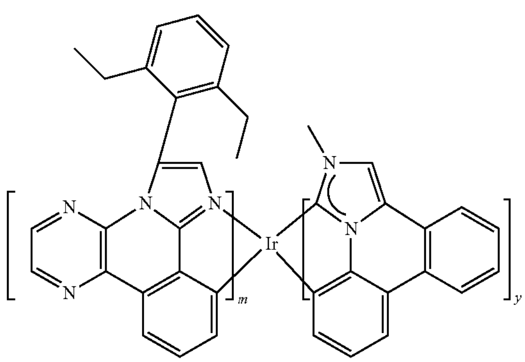
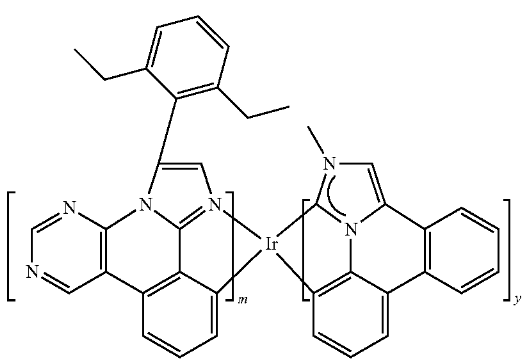
-continued
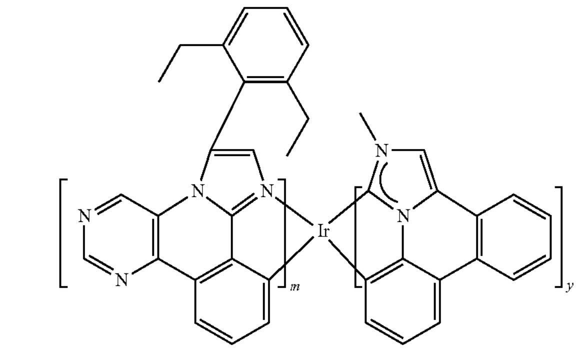
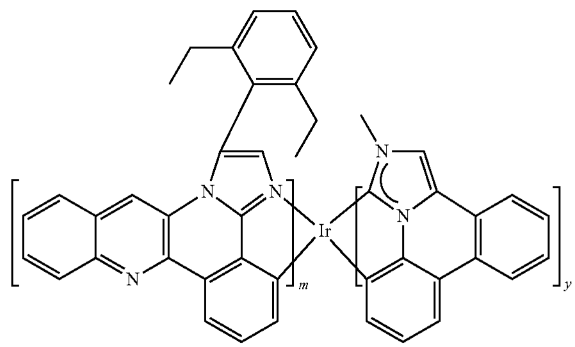
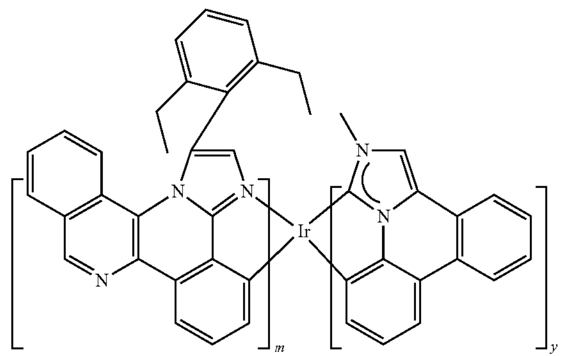
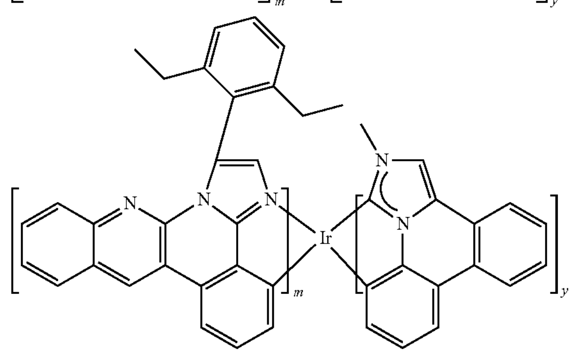
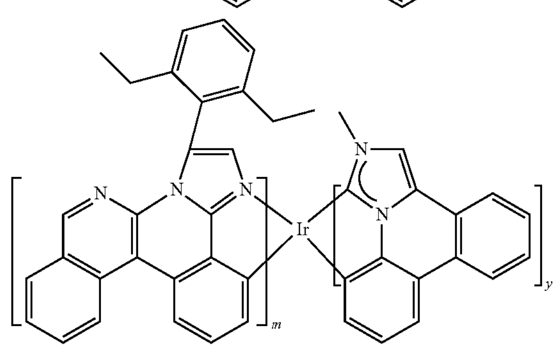

-continued
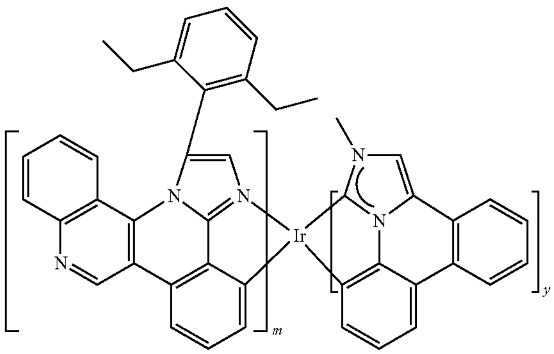
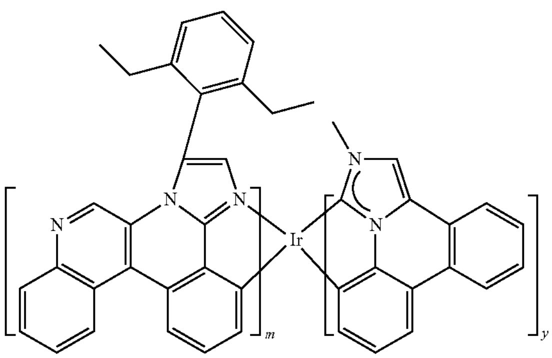
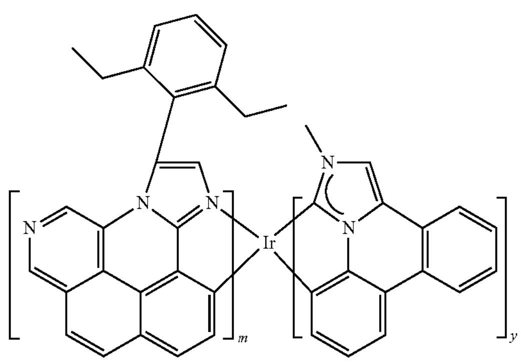
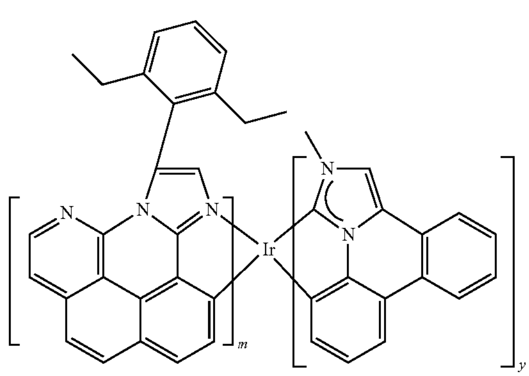
-continued
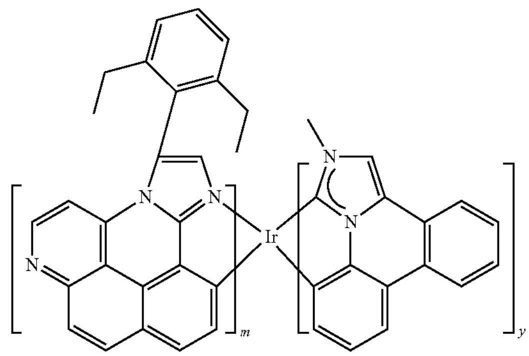
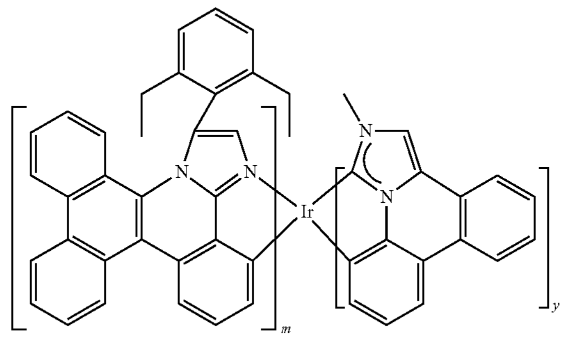
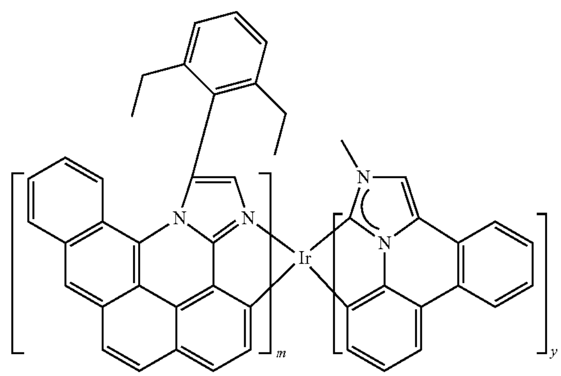
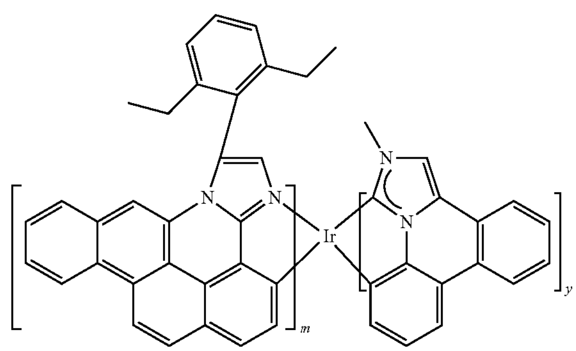
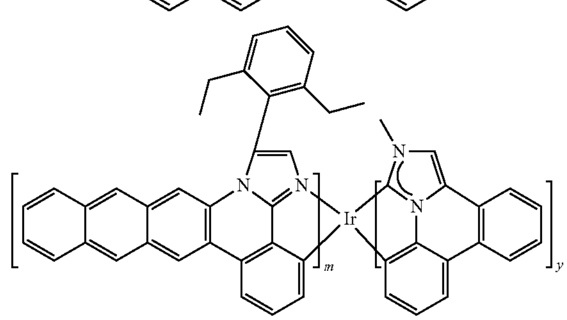

-continued
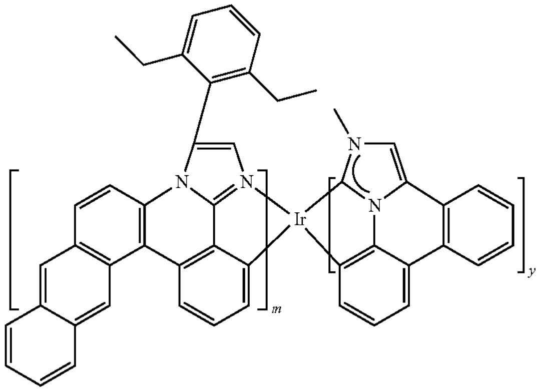
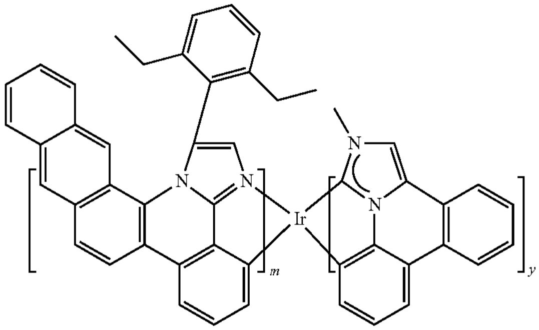
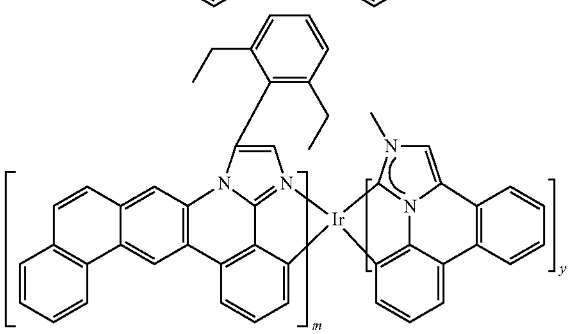
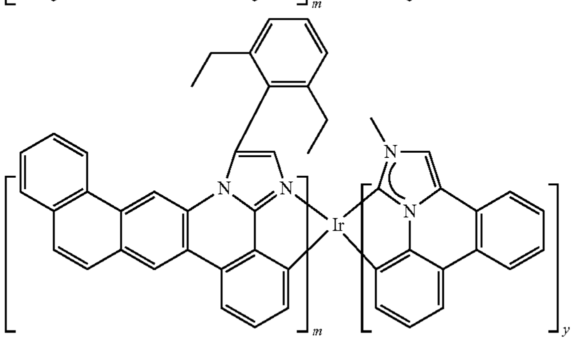
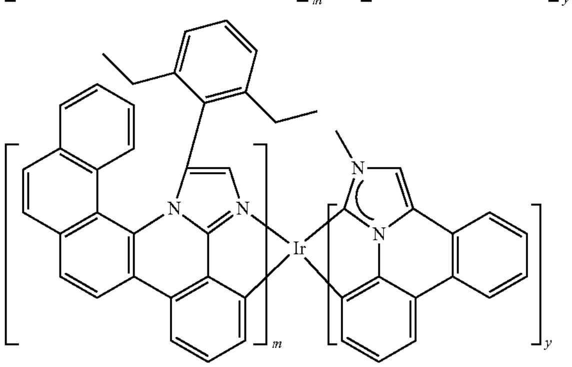
-continued
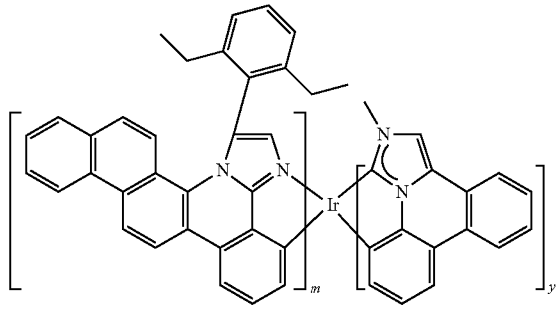
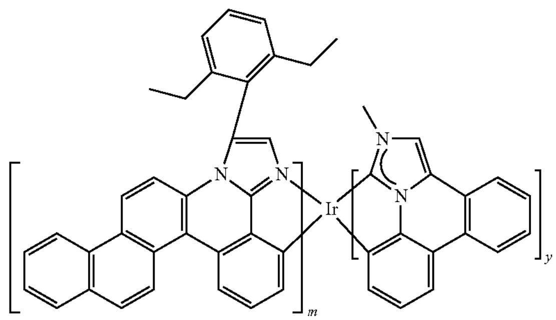
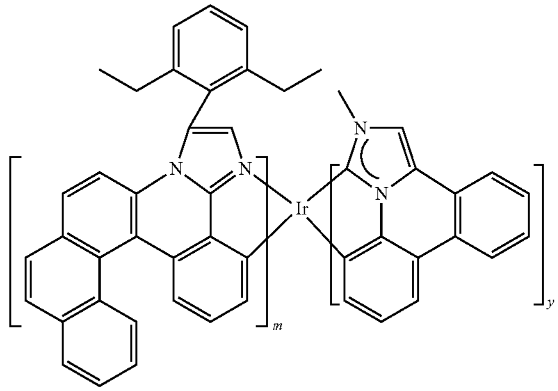
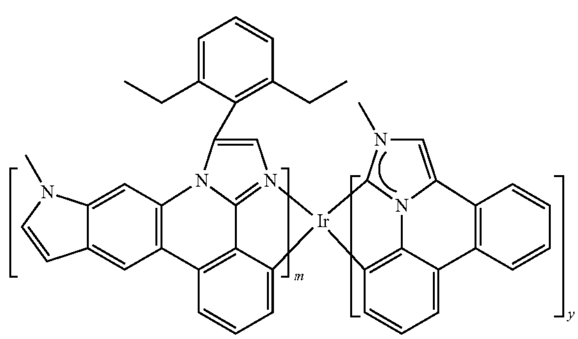
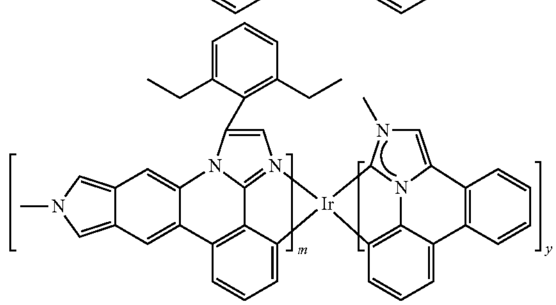

-continued
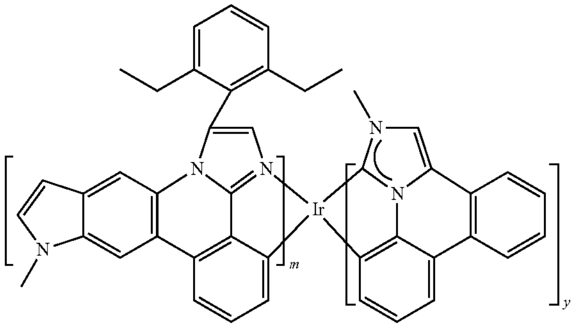
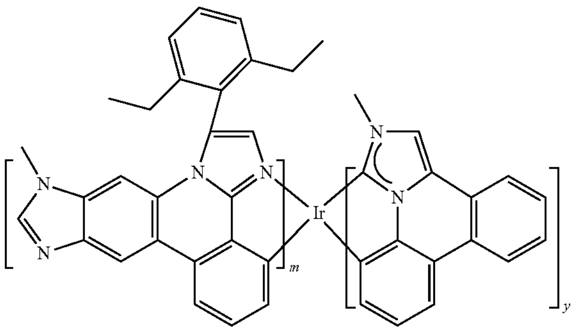
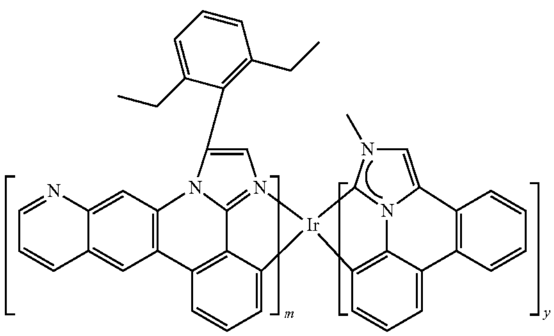
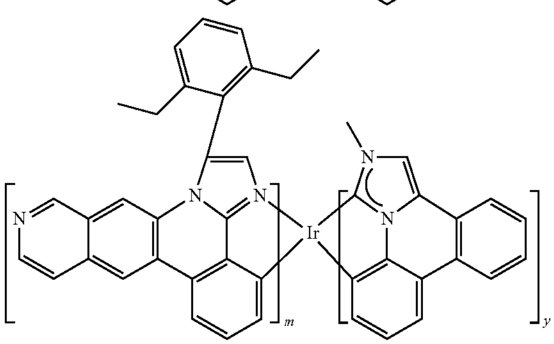
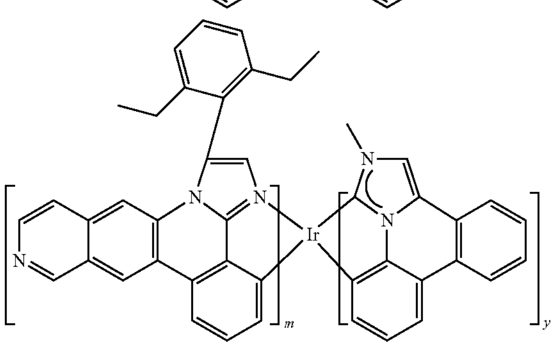
-continued
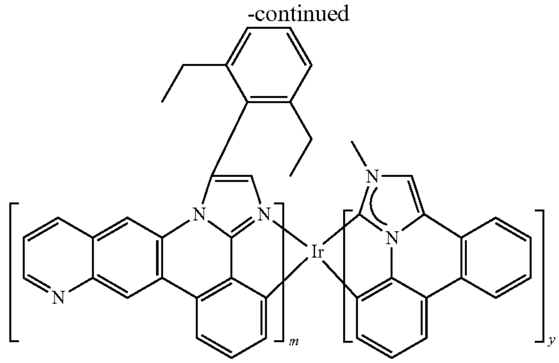
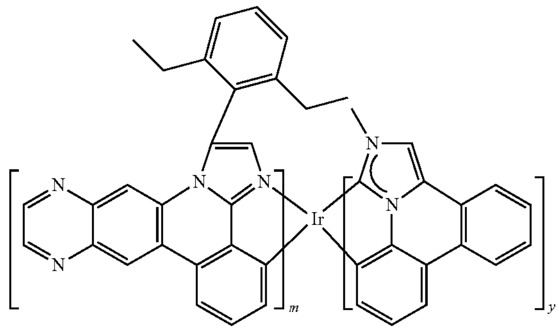
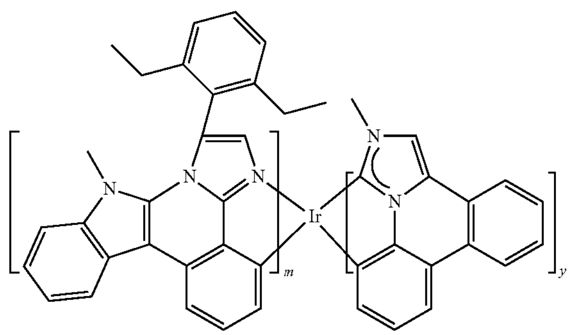
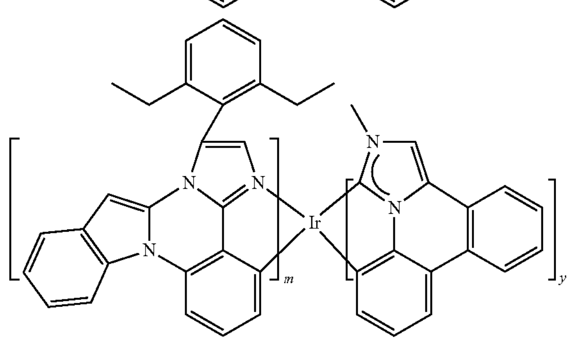
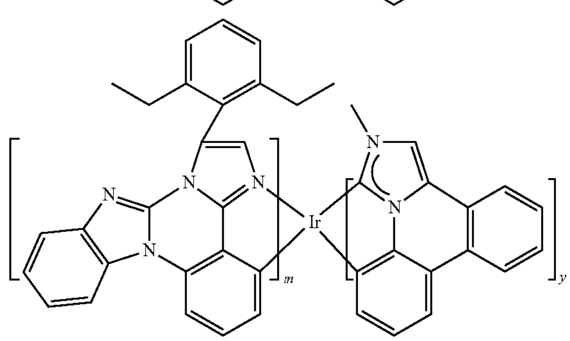

-continued
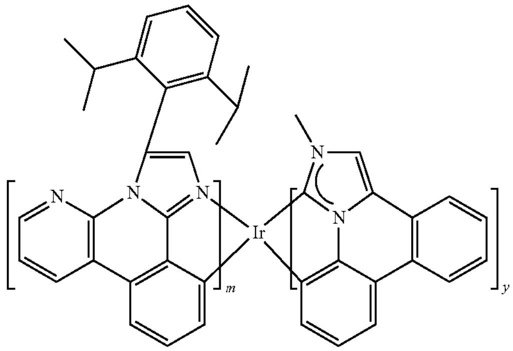
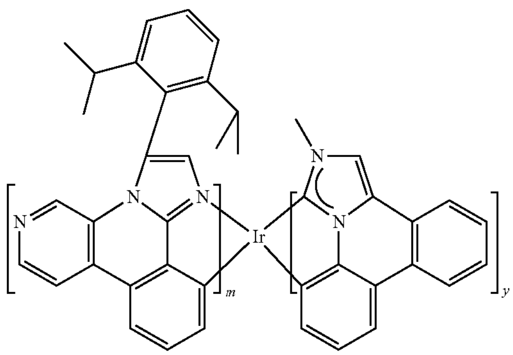
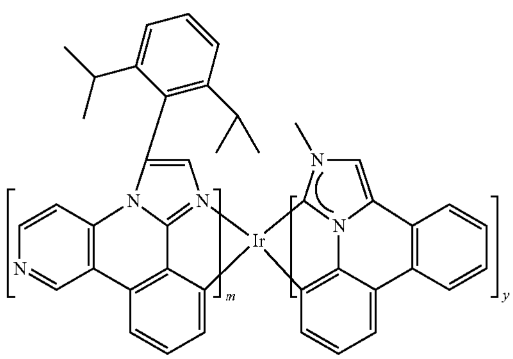
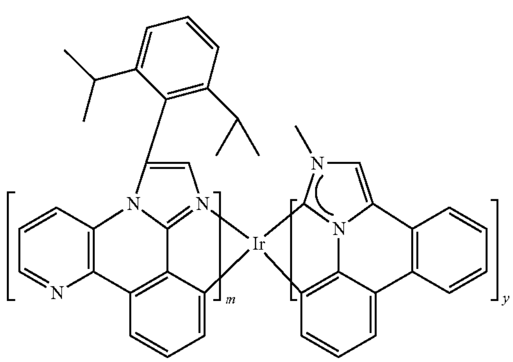
-continued
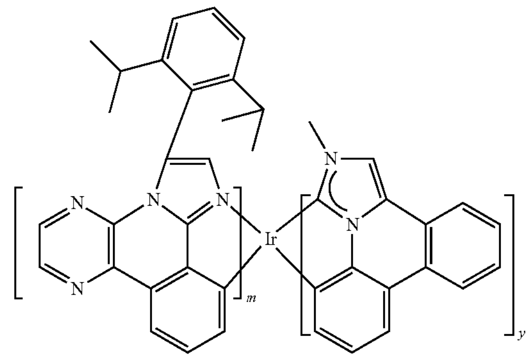
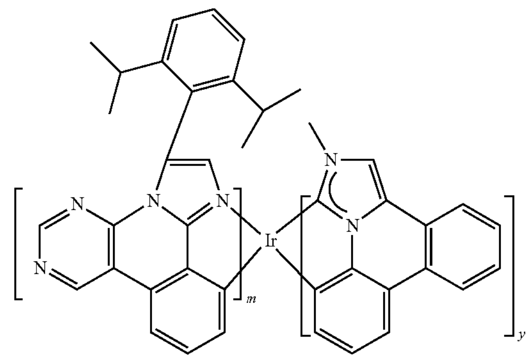
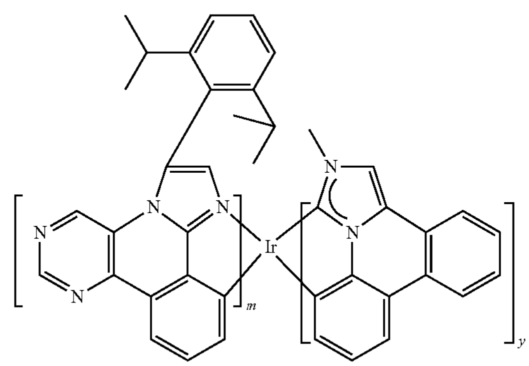
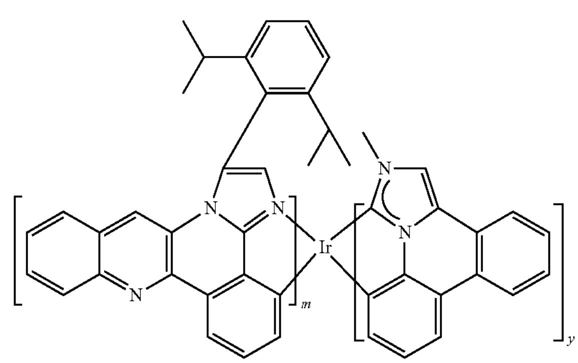

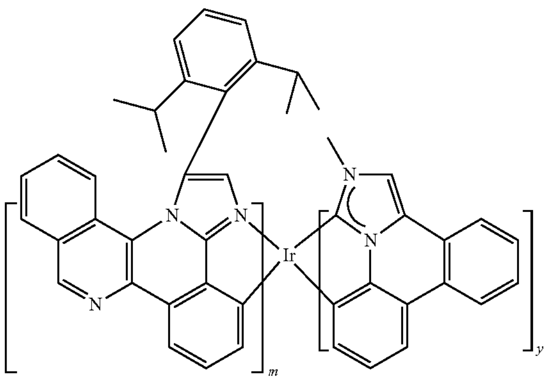
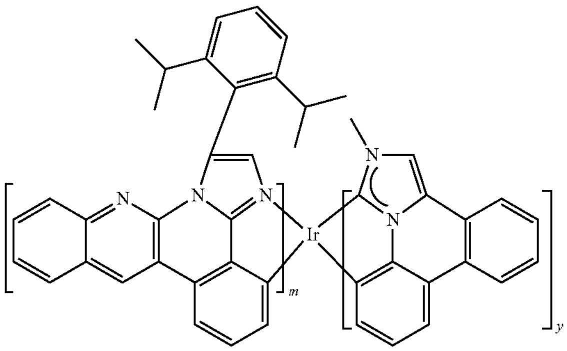
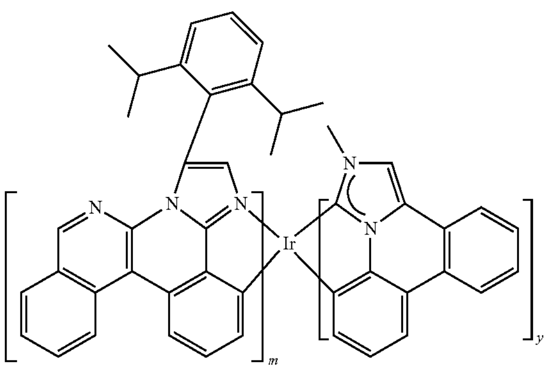
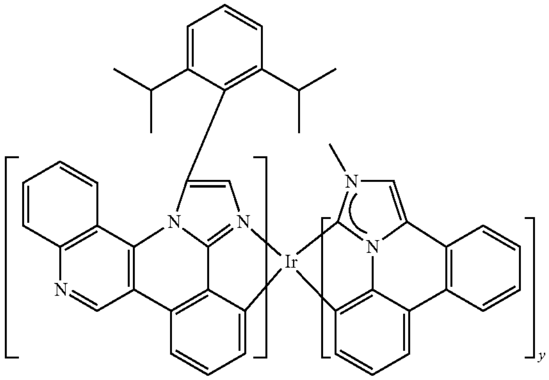
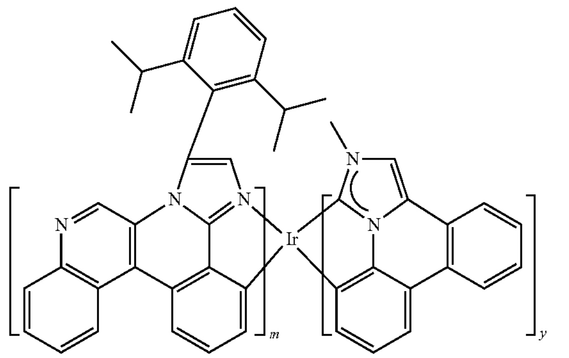
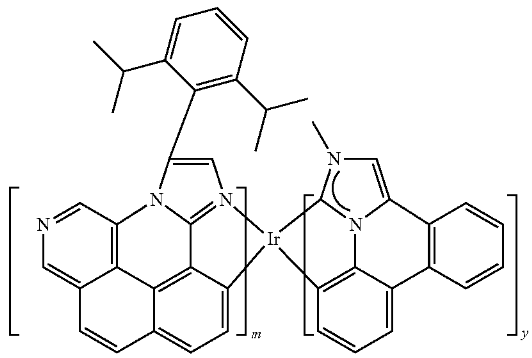
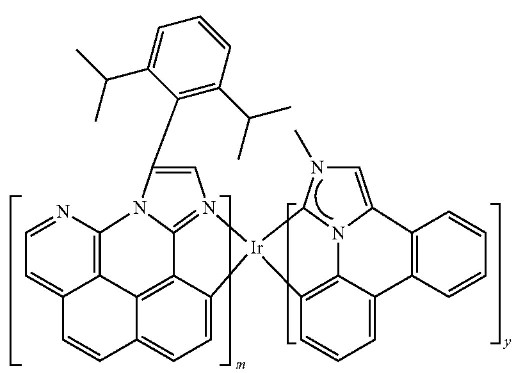
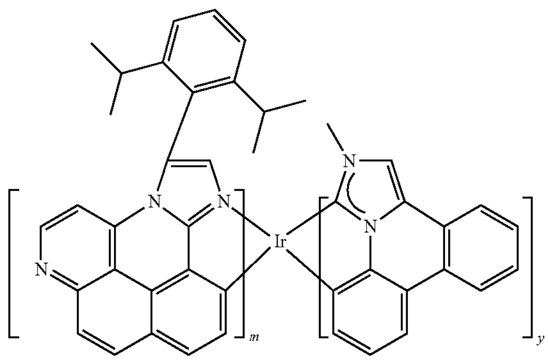

-continued
-continued
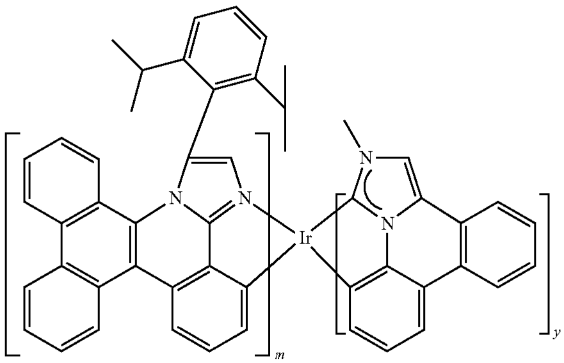
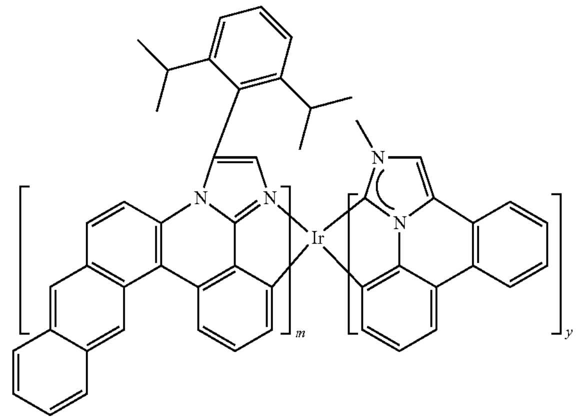
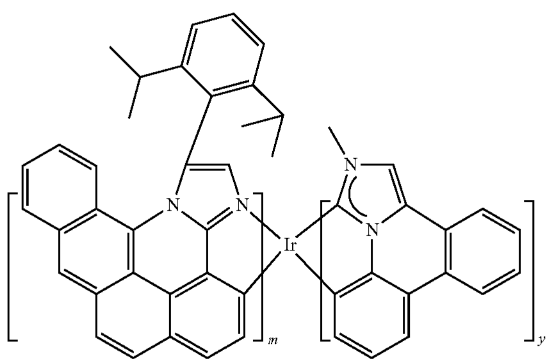
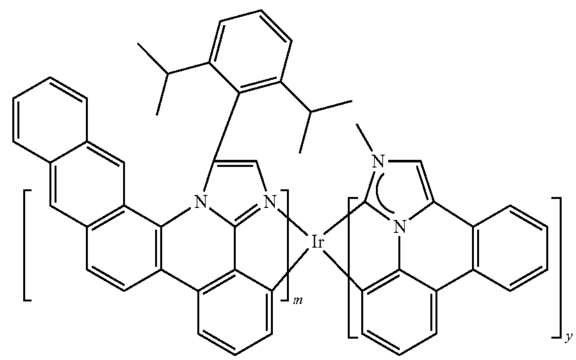
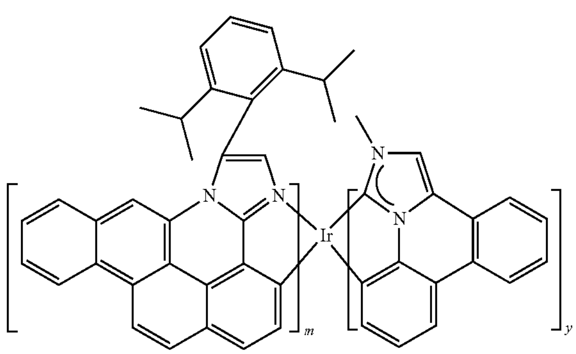
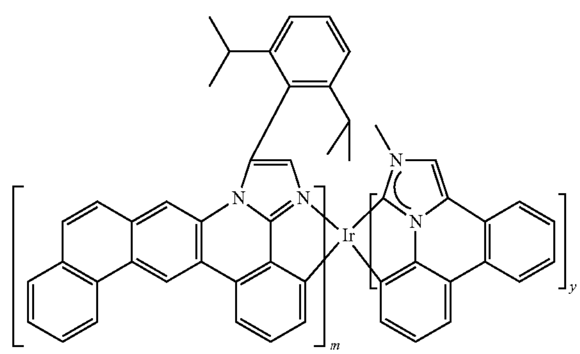
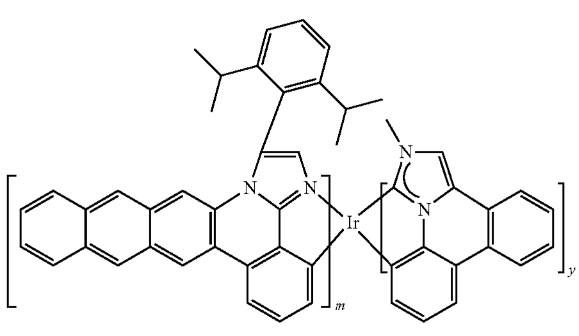
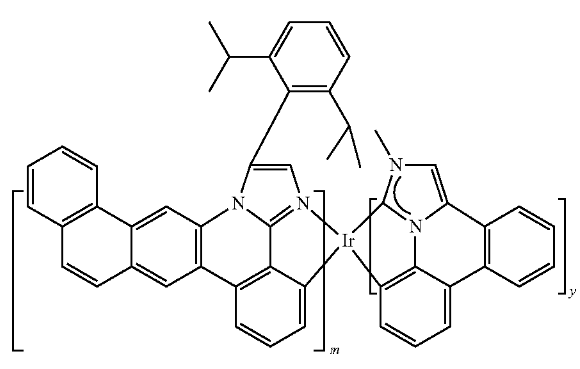

-continued
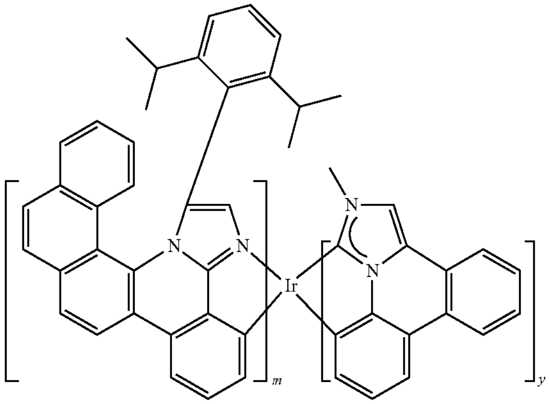
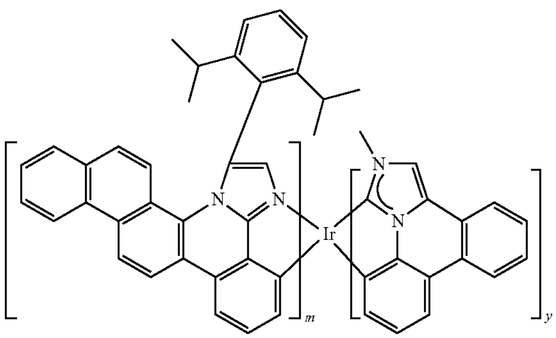
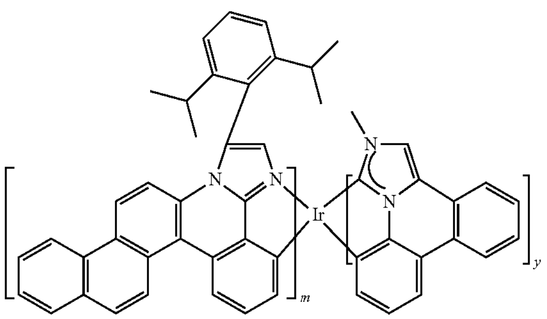
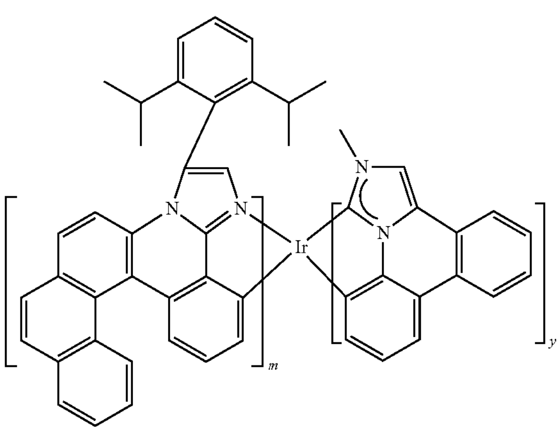
-continued
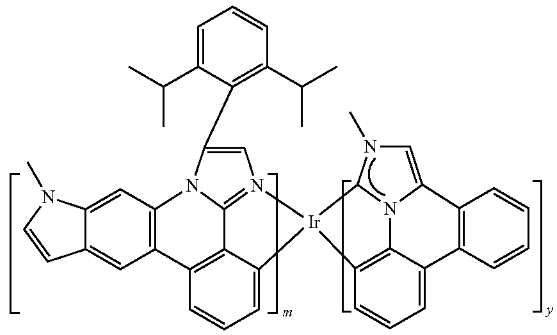
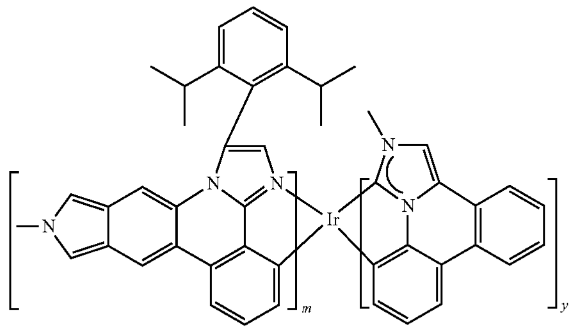
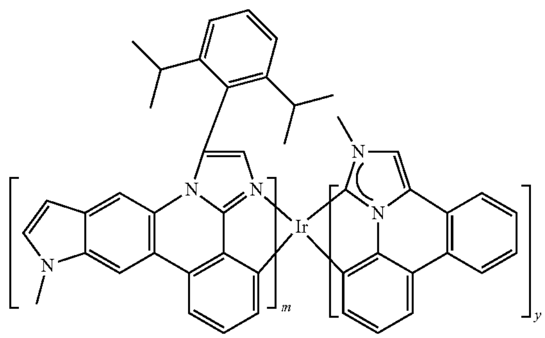
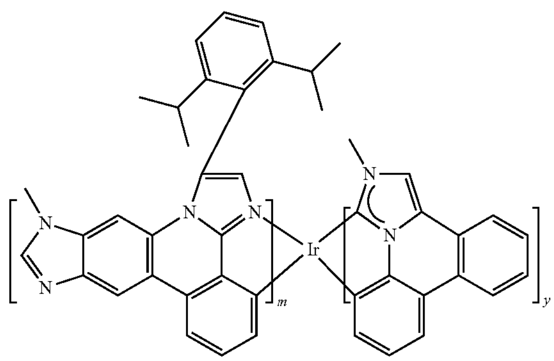
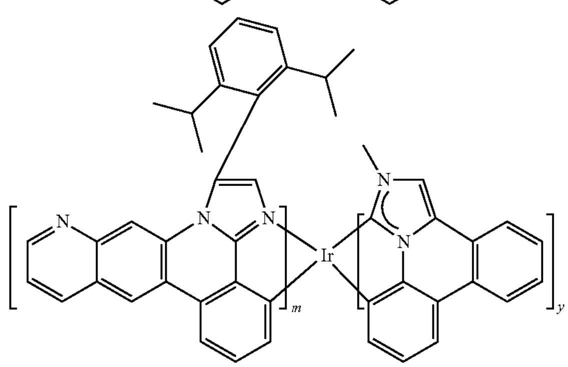

-continued
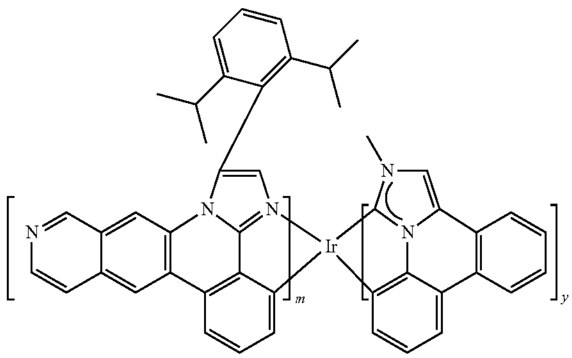
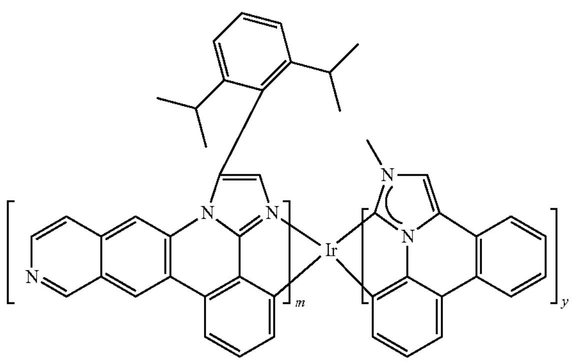
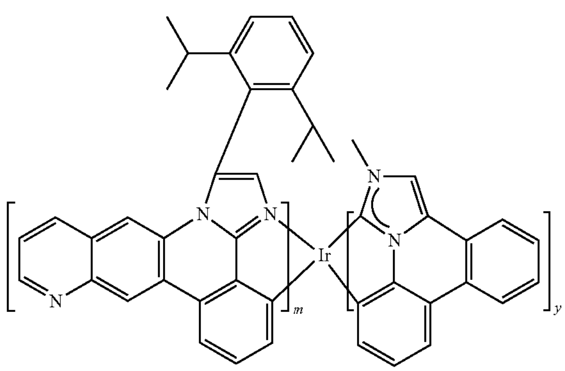
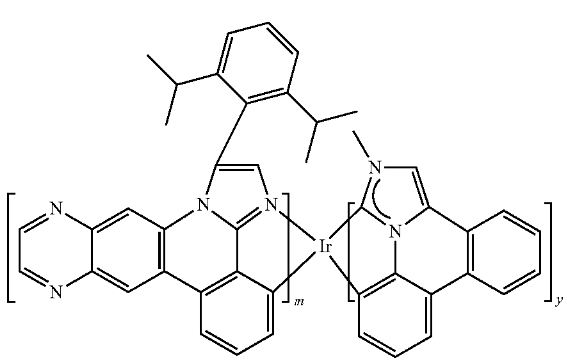
-continued
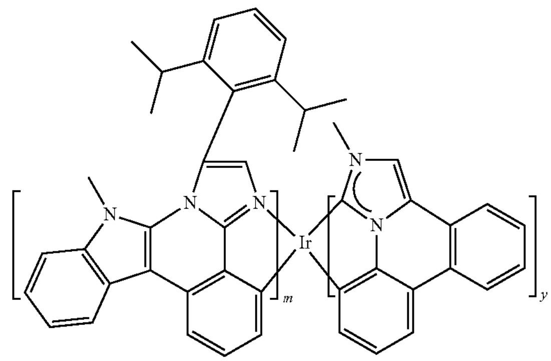
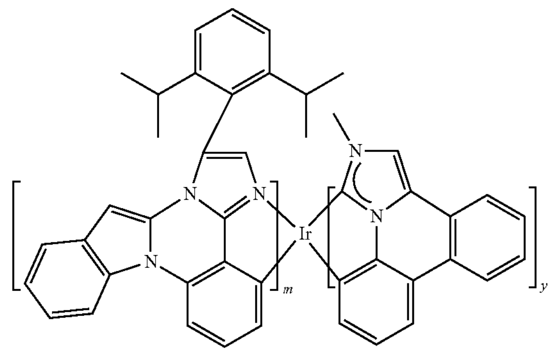
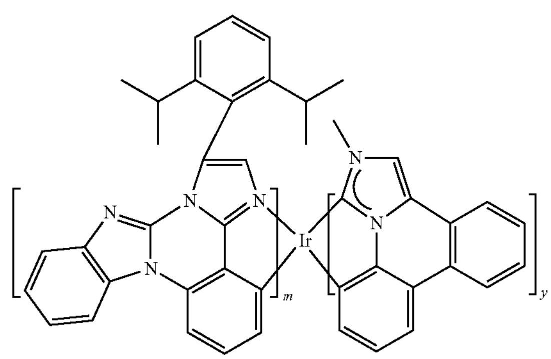
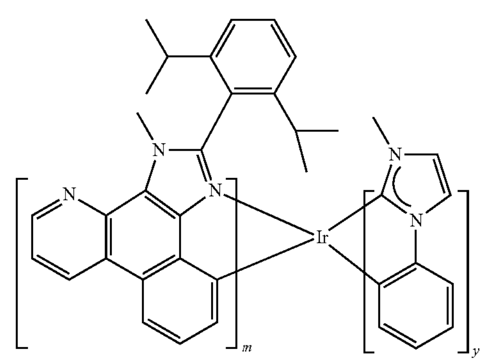

-continued
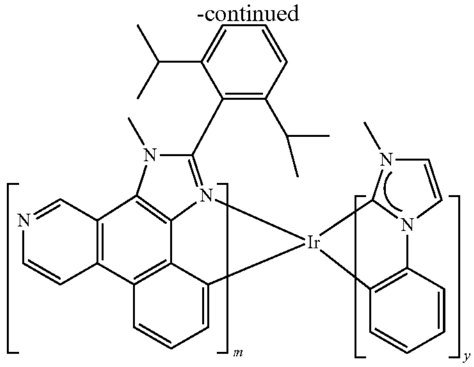
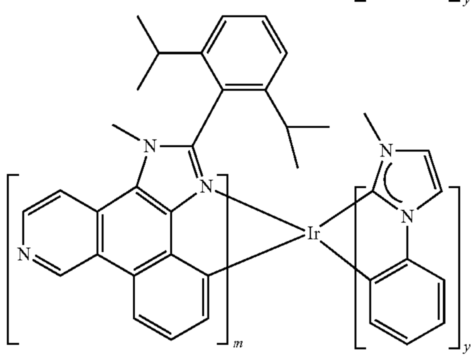
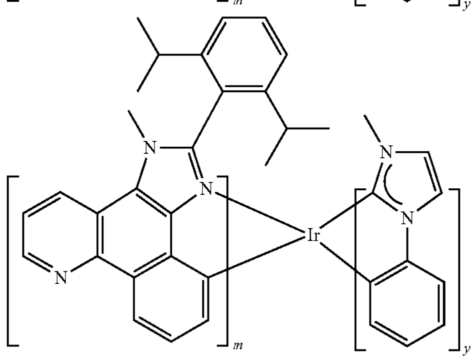
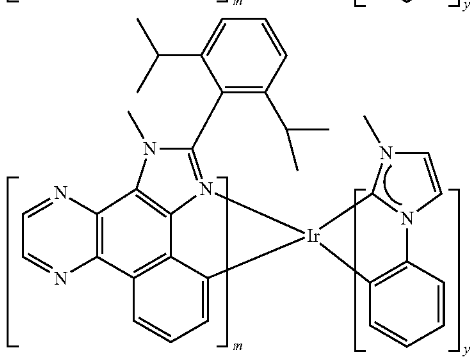
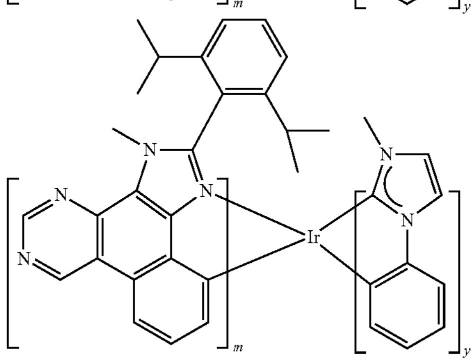
-continued
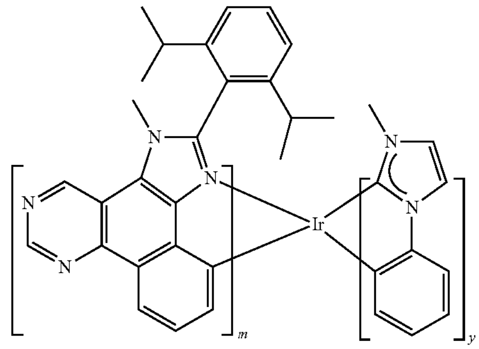
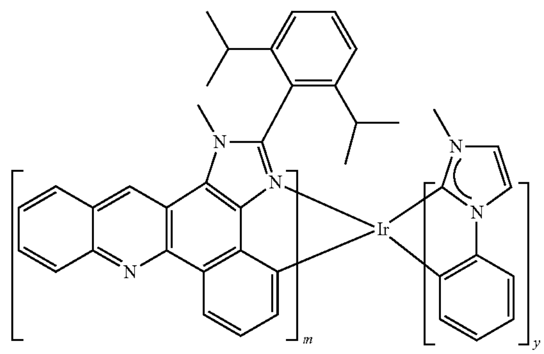
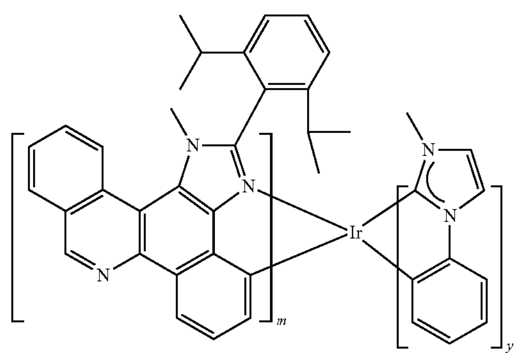
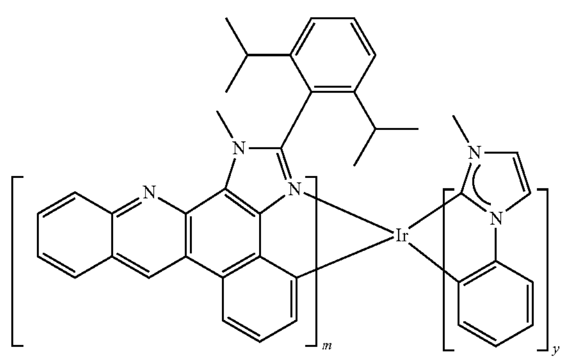

-continued
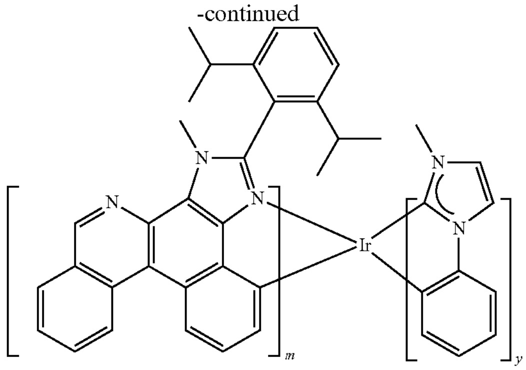
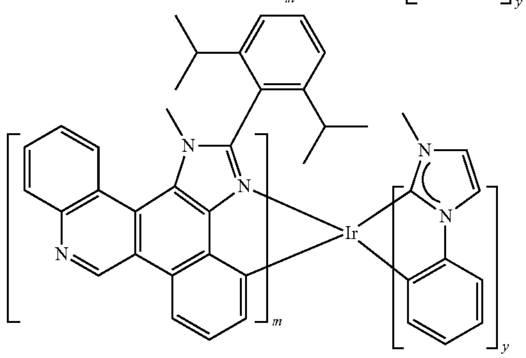
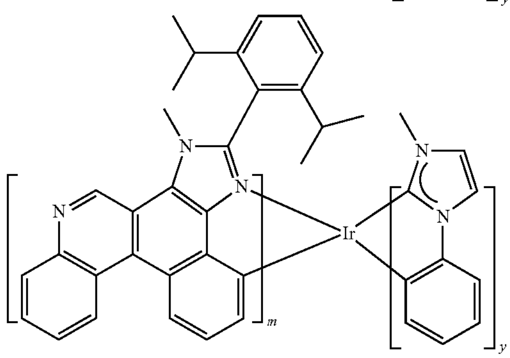
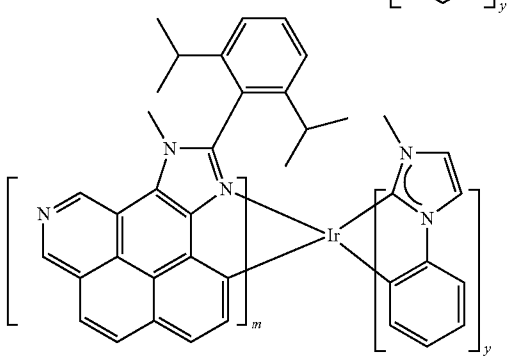
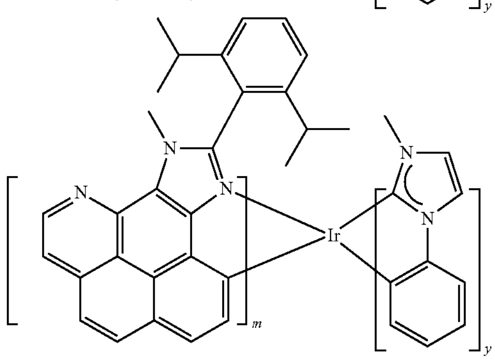
-continued
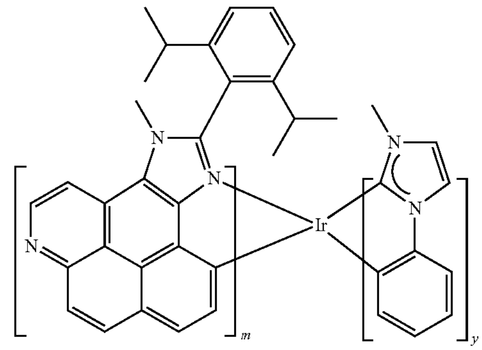
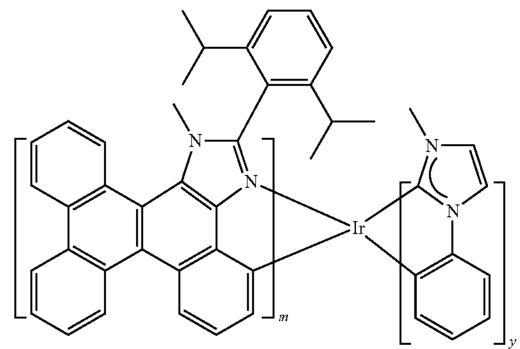
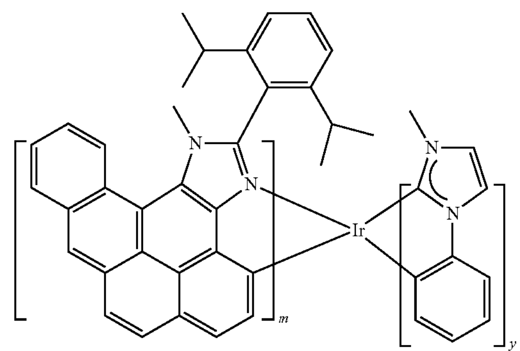
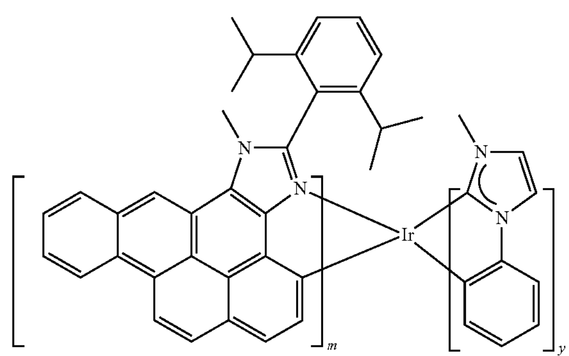
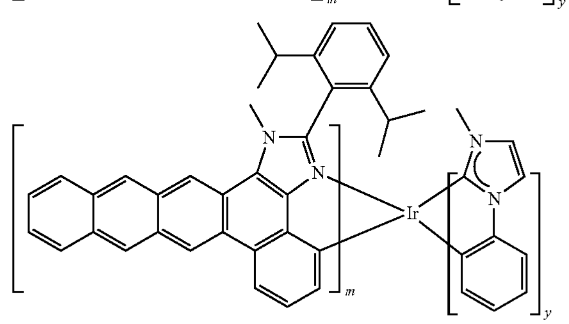

-continued
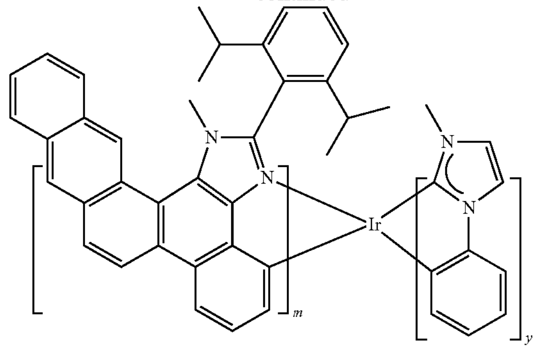
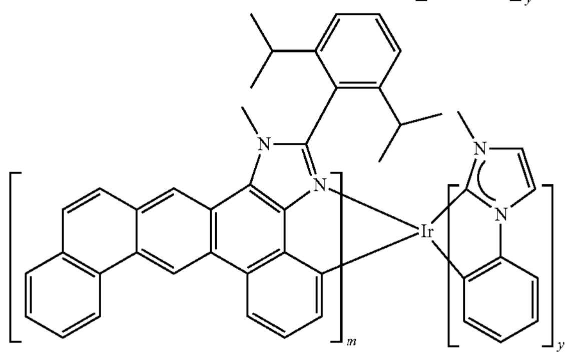
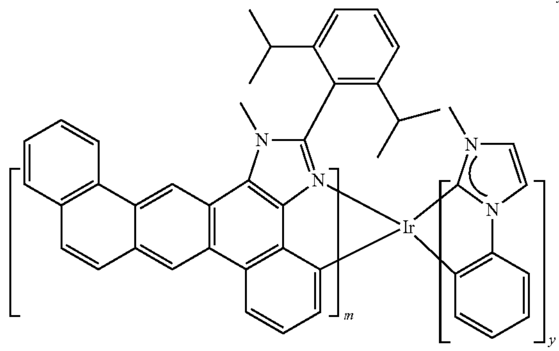
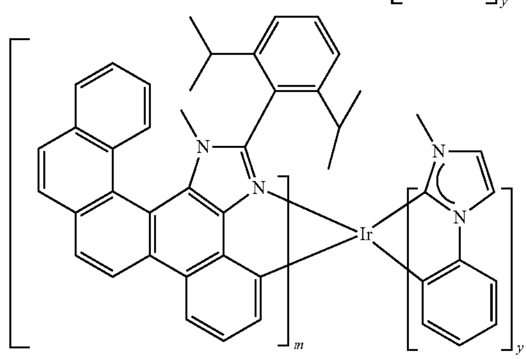
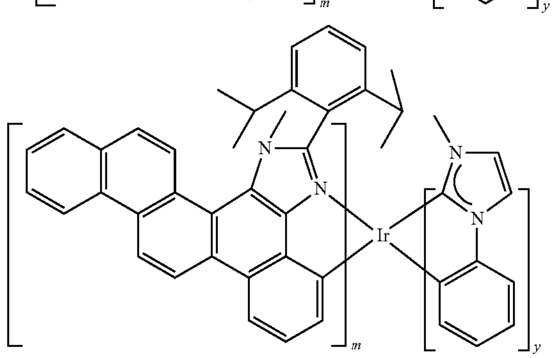
-continued
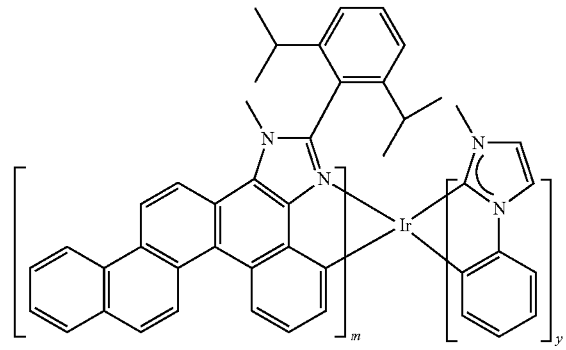
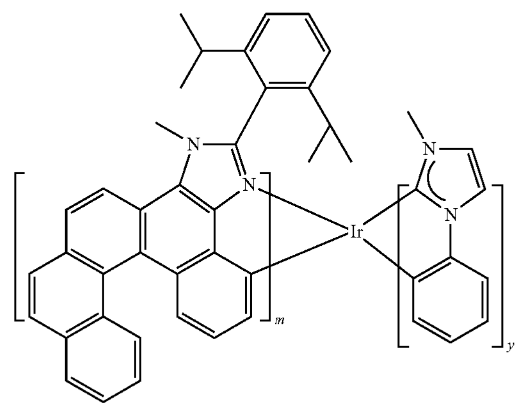
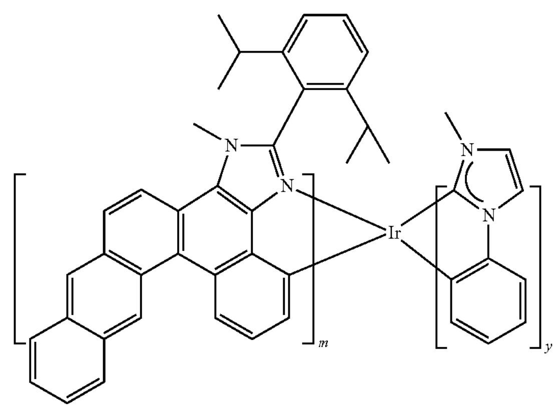
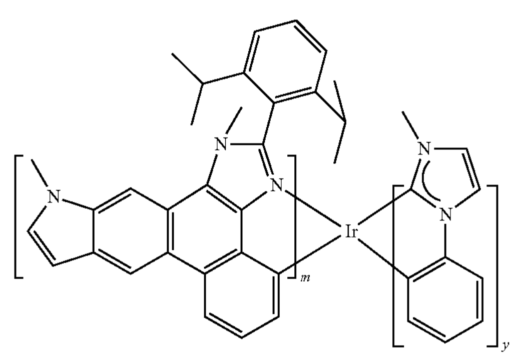

-continued
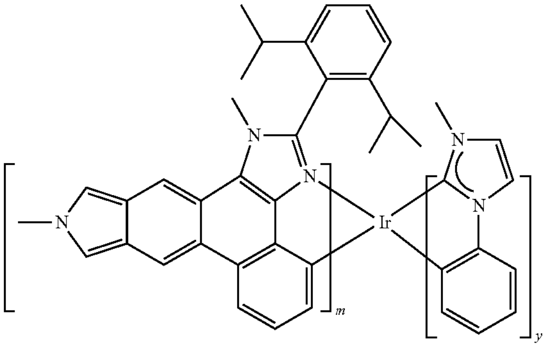
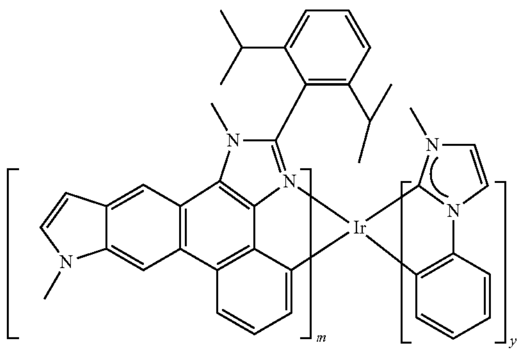
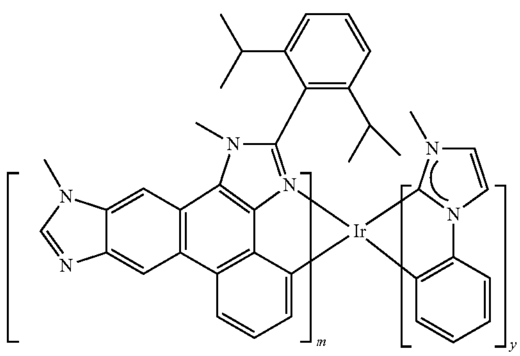
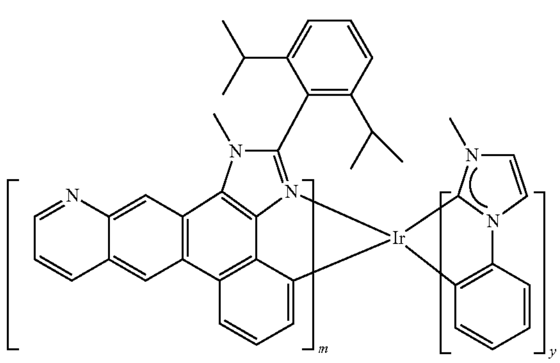
-continued
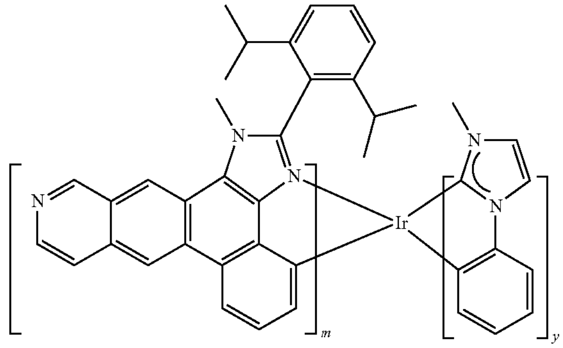
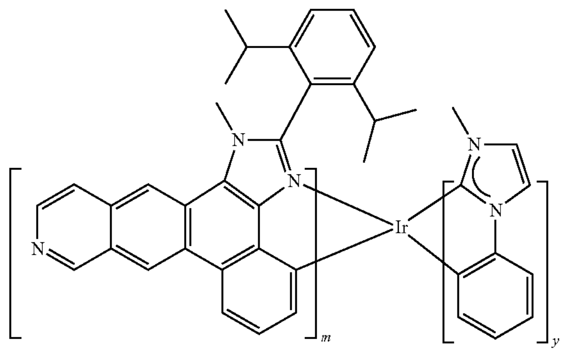
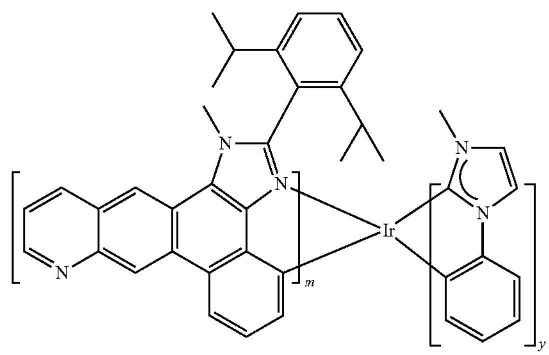
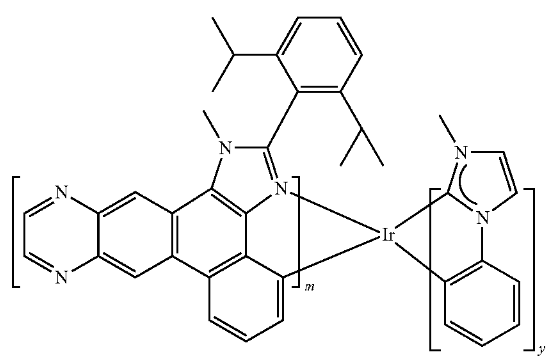

-continued
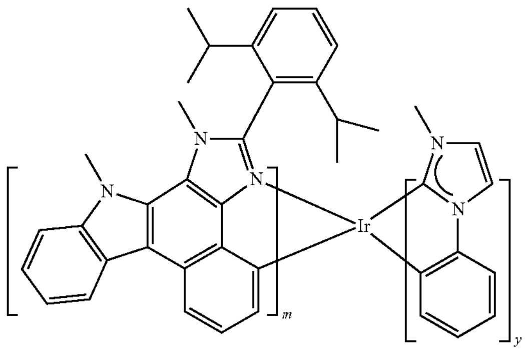
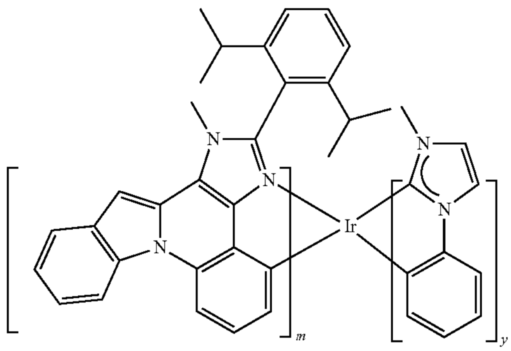
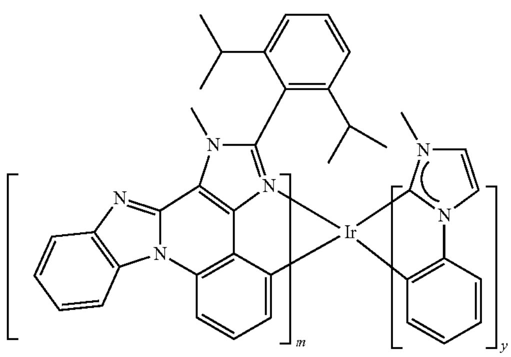
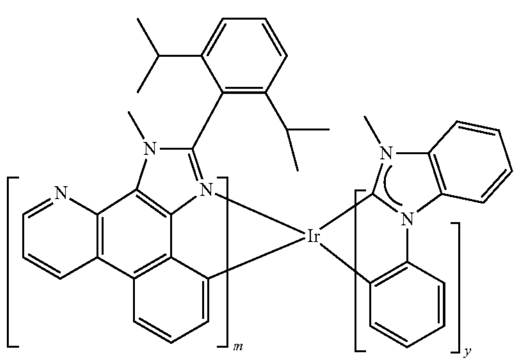
-continued
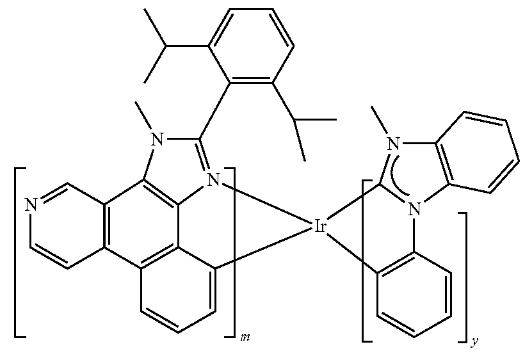
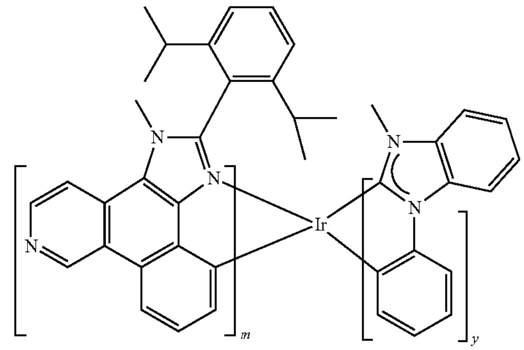
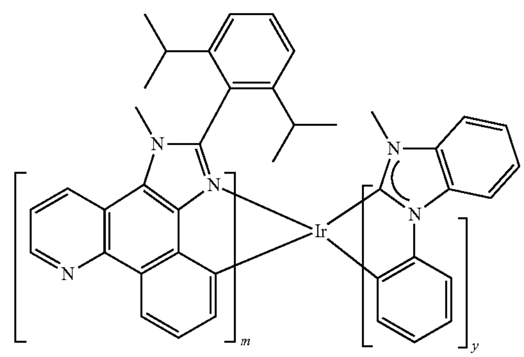
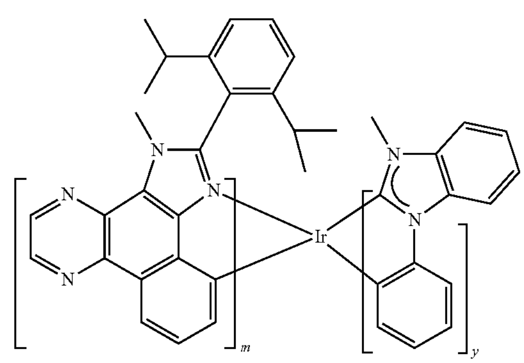

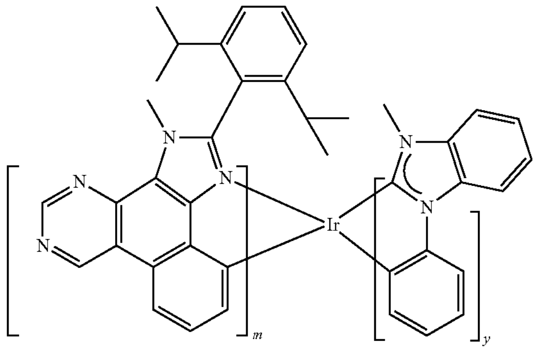
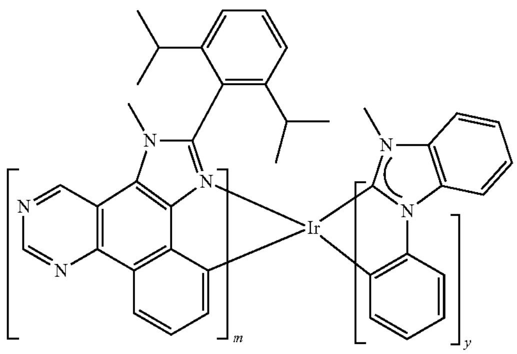
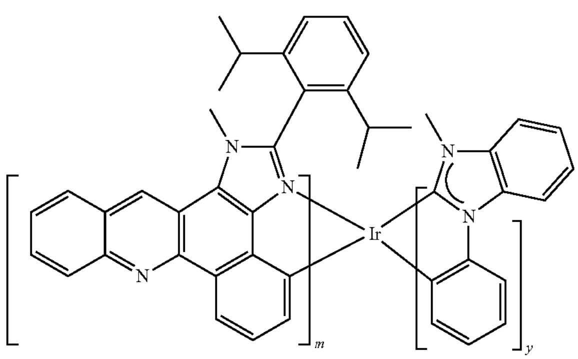
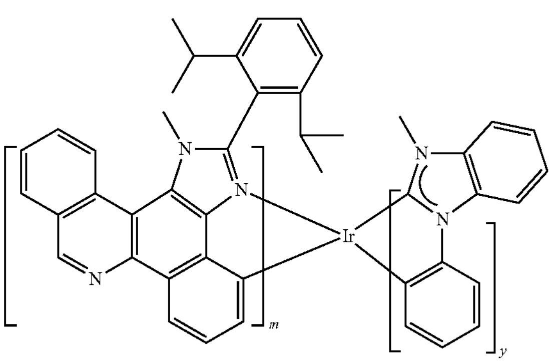
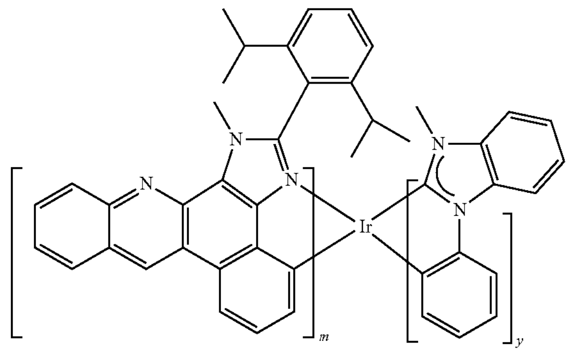
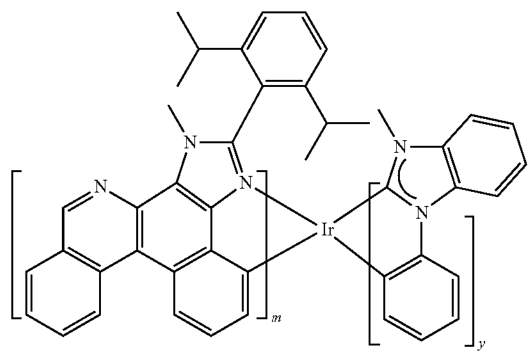
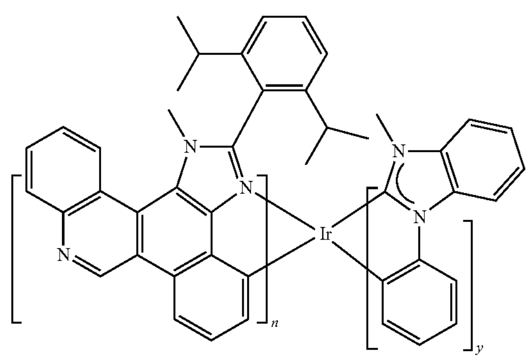
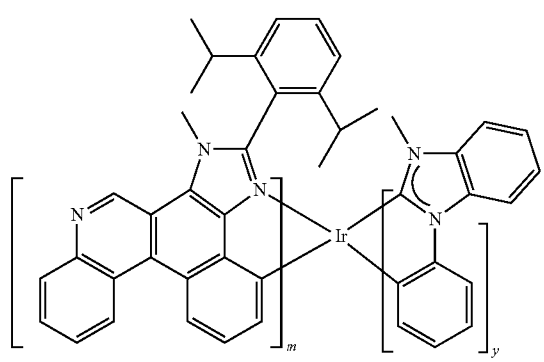

-continued
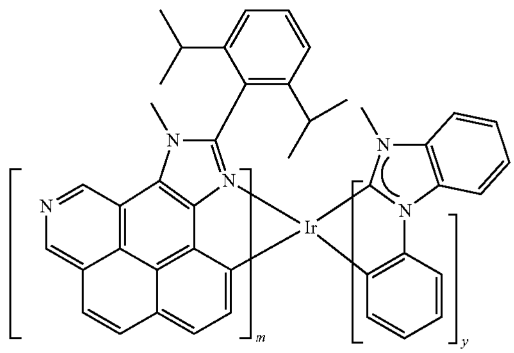
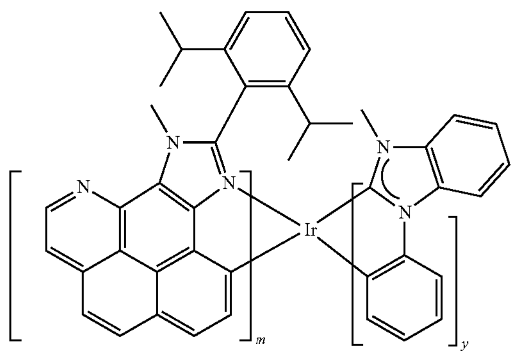
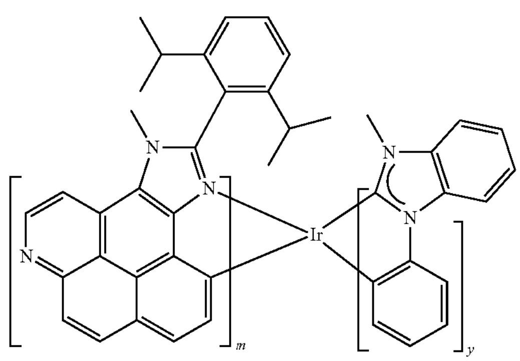
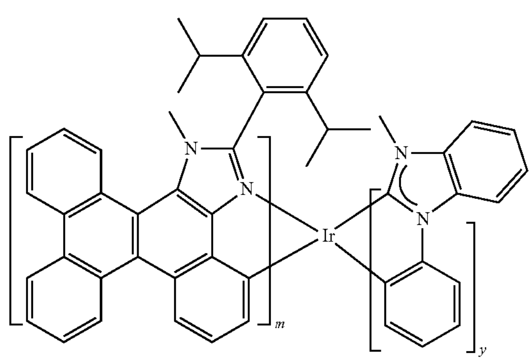
-continued
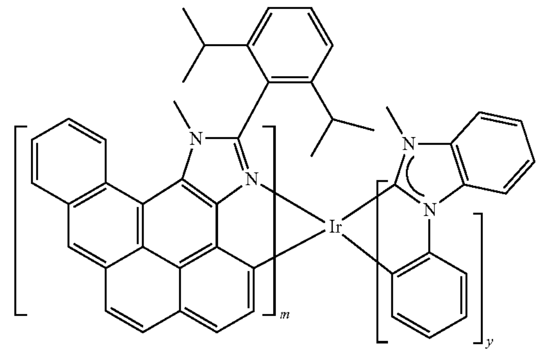
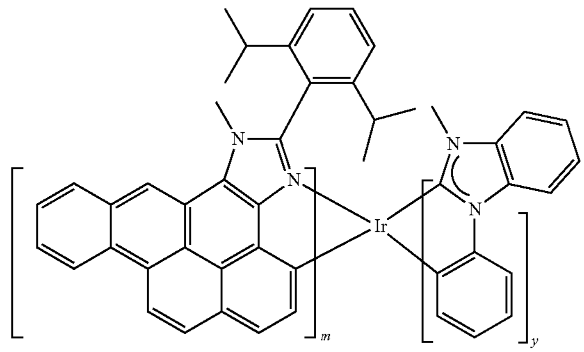
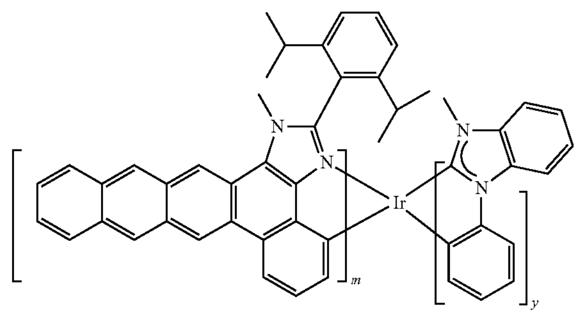
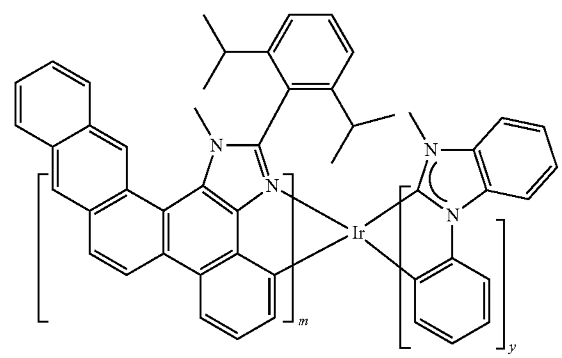
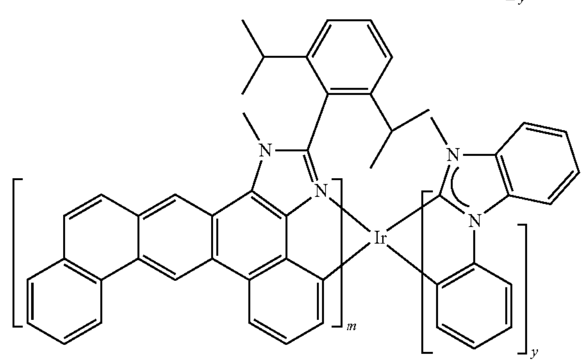

-continued
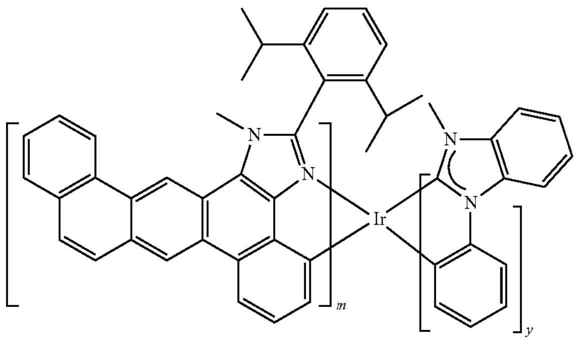
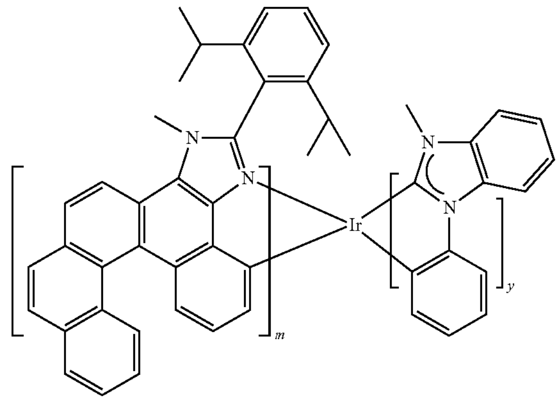
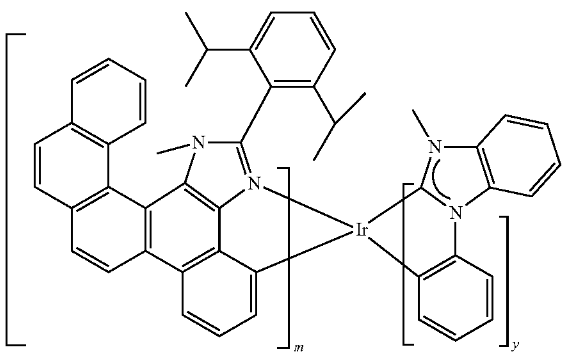
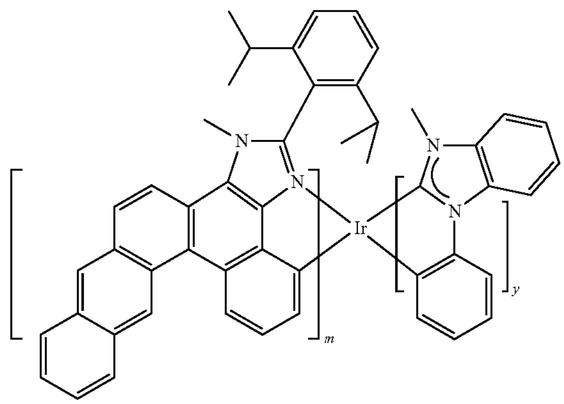
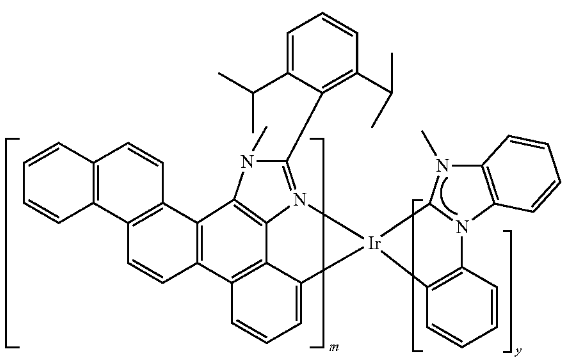
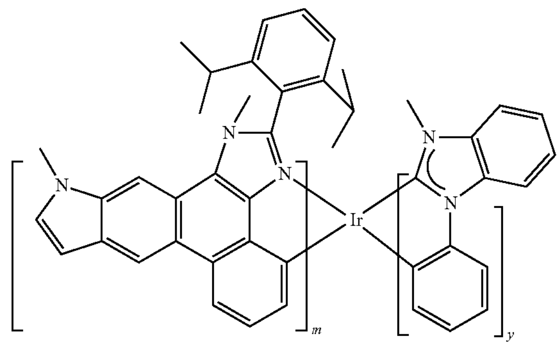
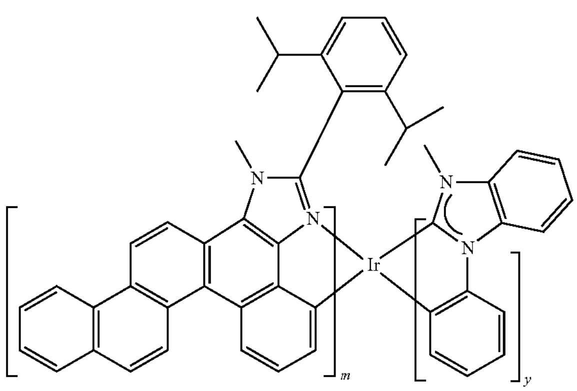
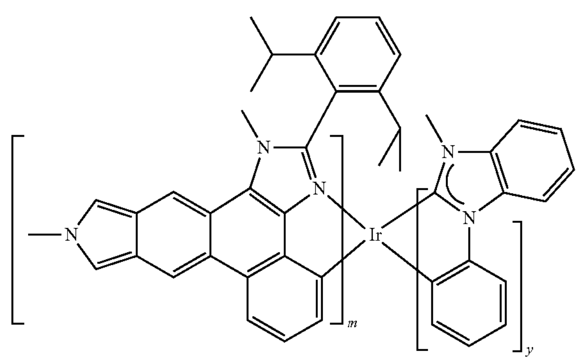
-continued -continued
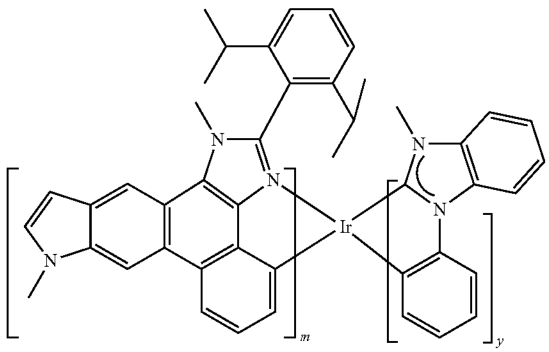
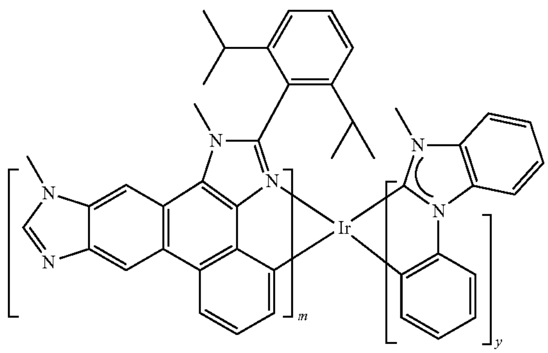
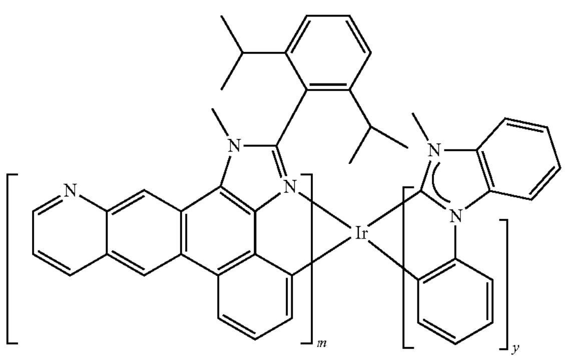
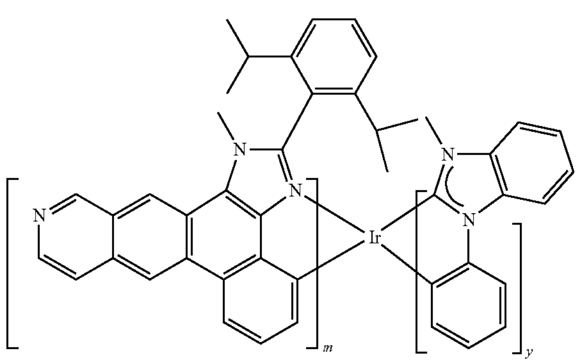
-continued
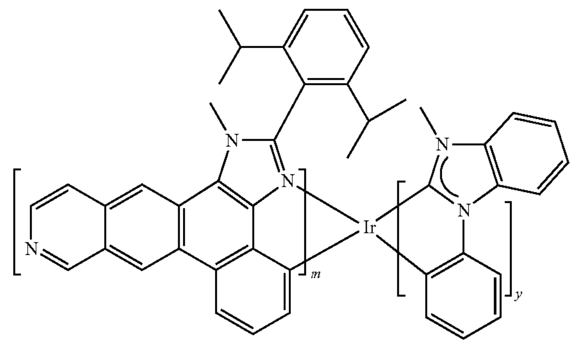
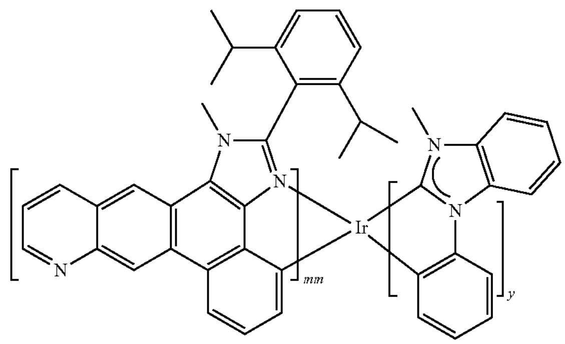
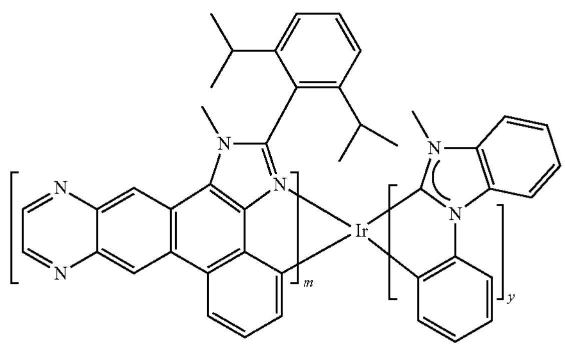
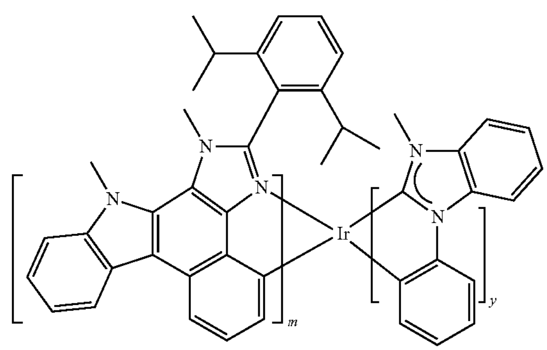
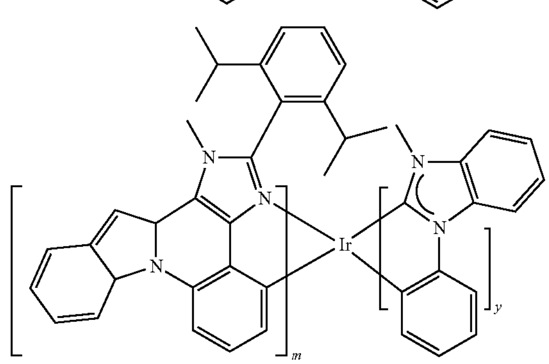

-continued
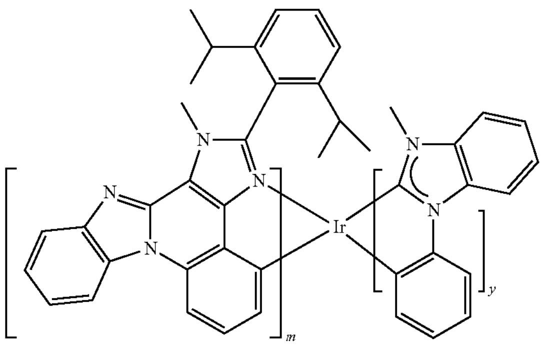
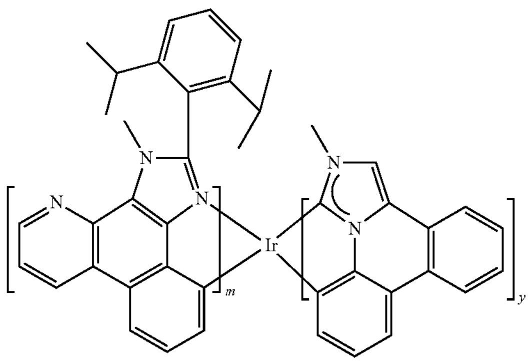
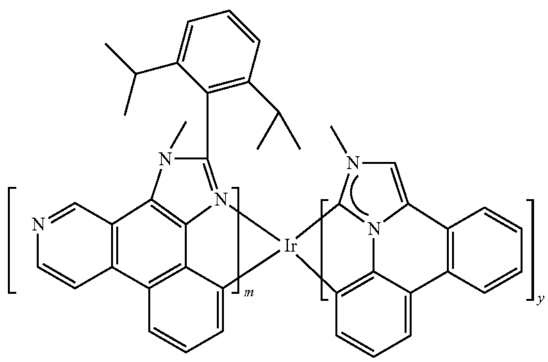
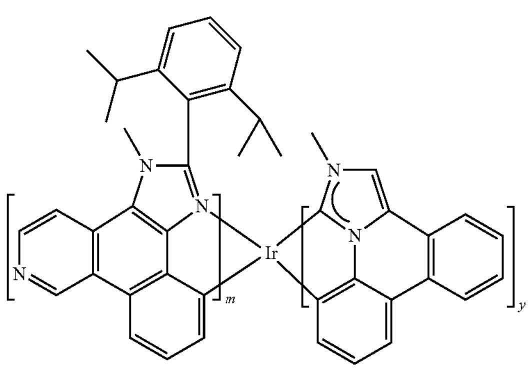
-continued
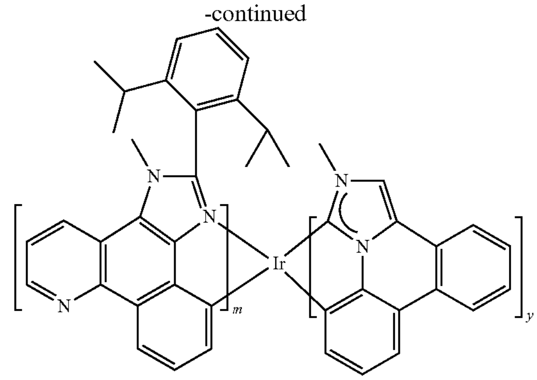
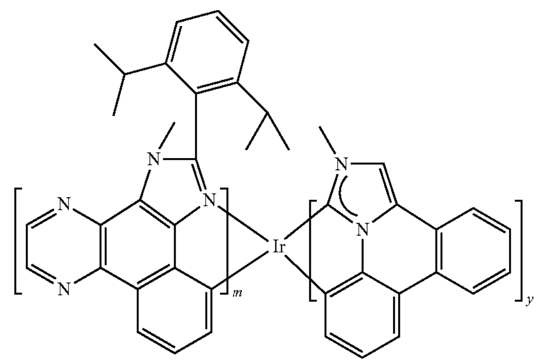
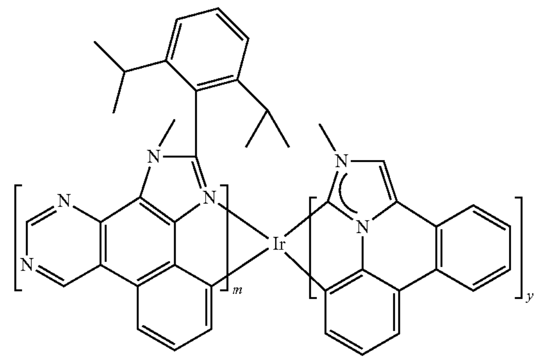
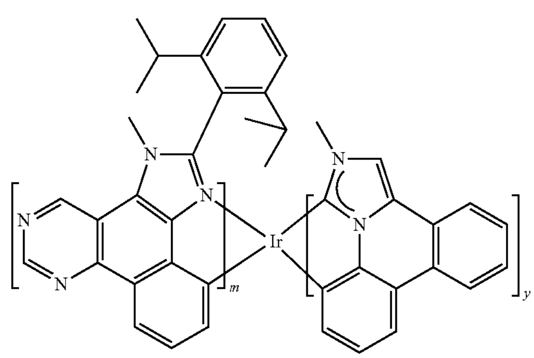

-continued
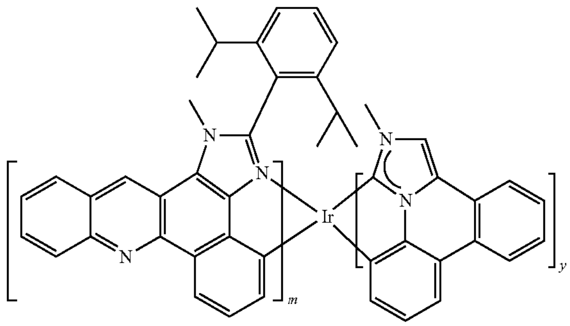
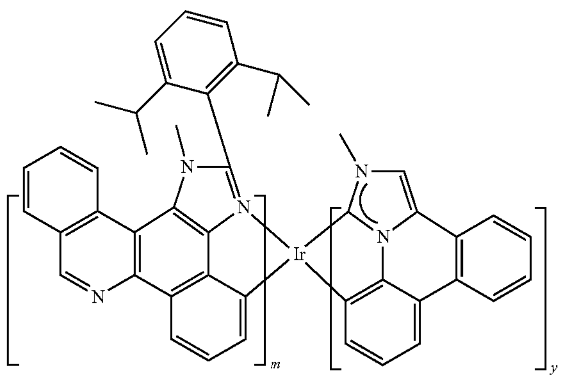
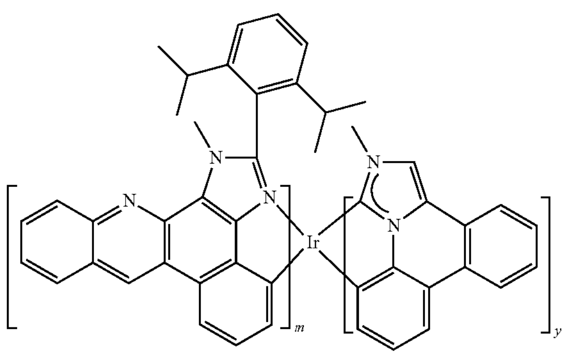
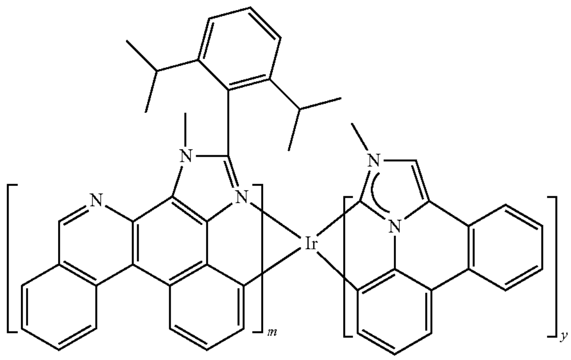
-continued
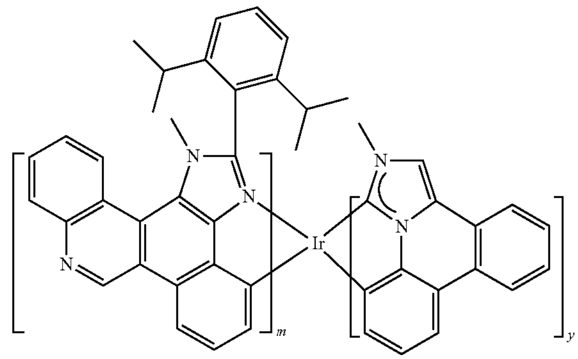
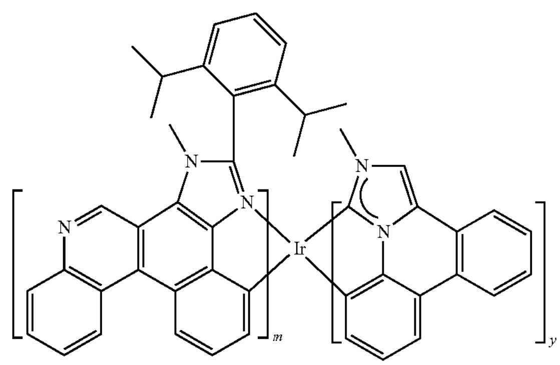
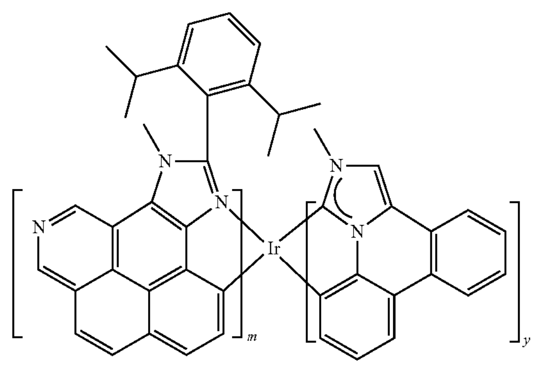
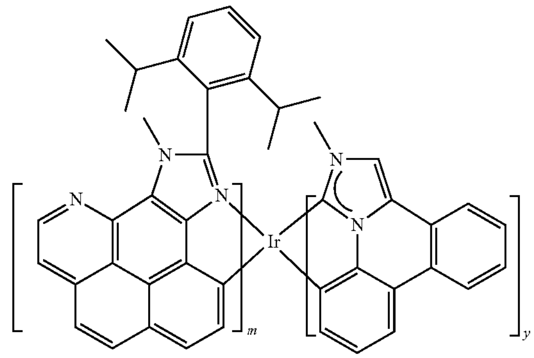

-continued
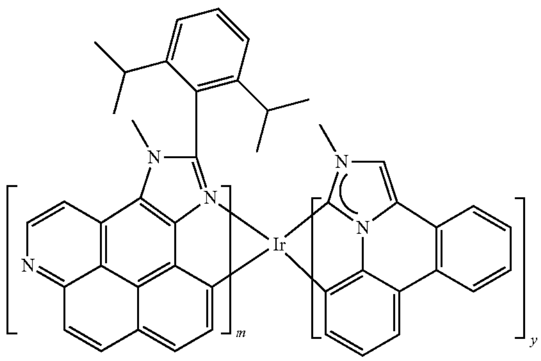
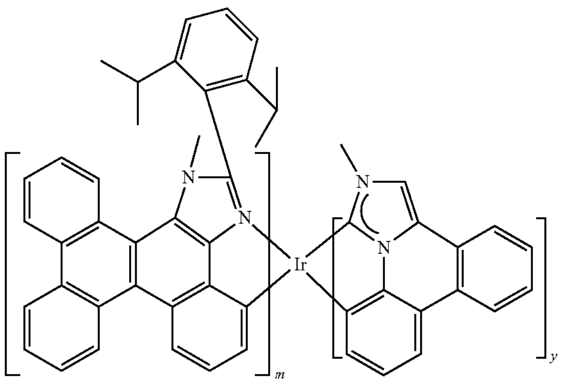
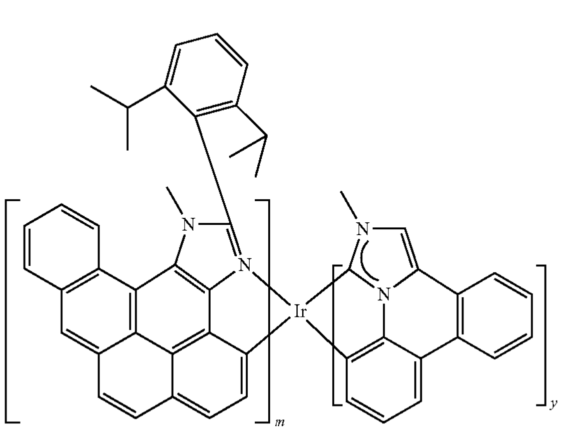
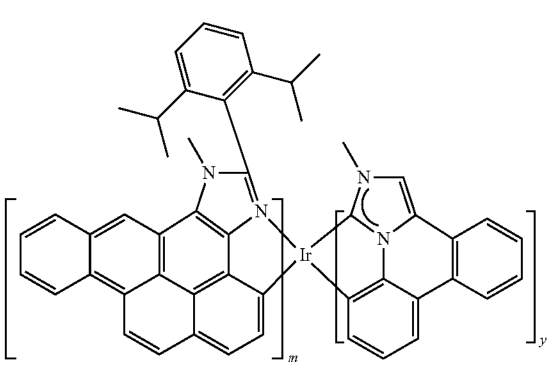
-continued
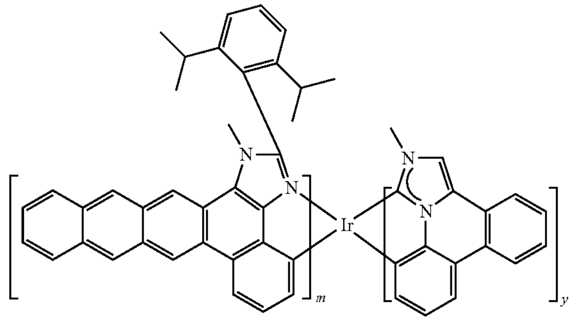
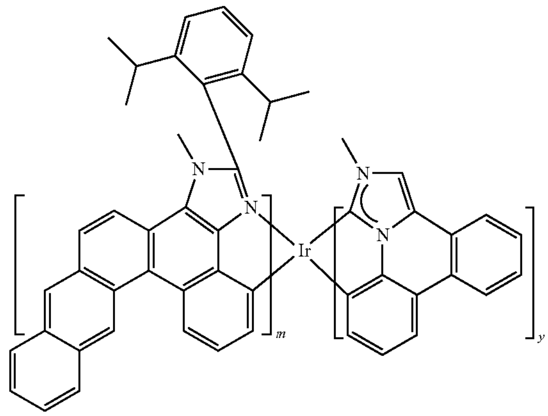
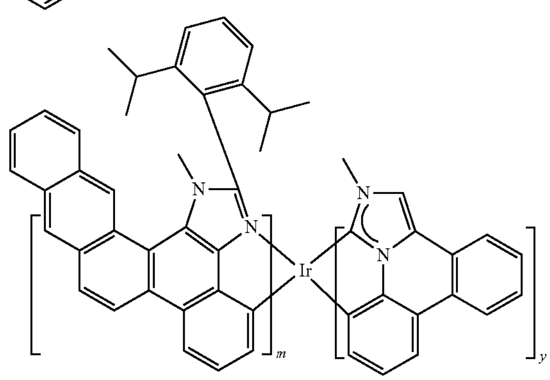
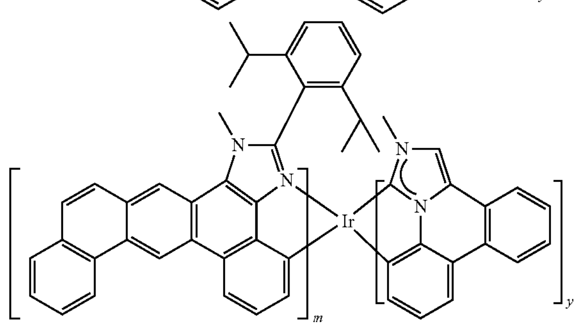
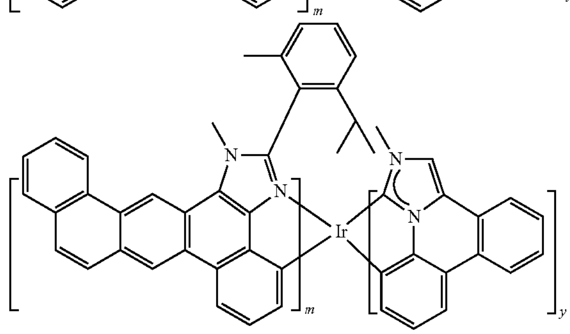

-continued
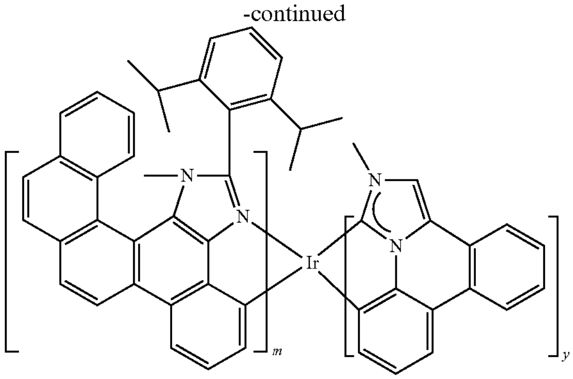
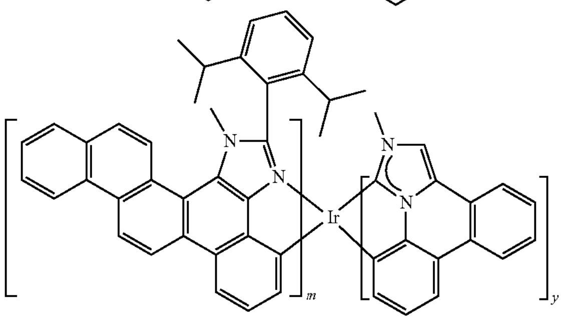
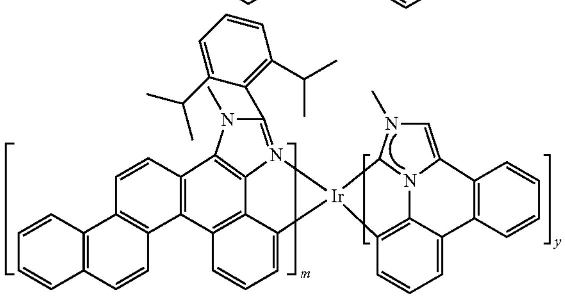
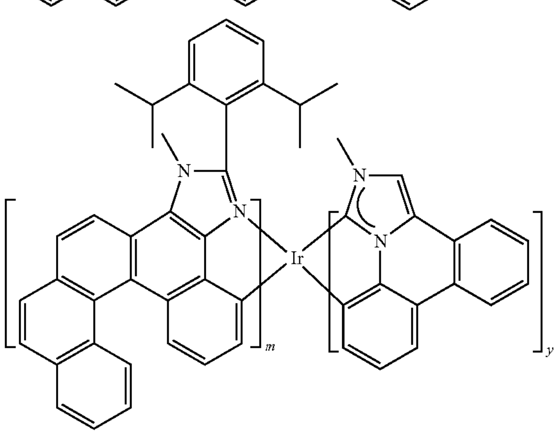
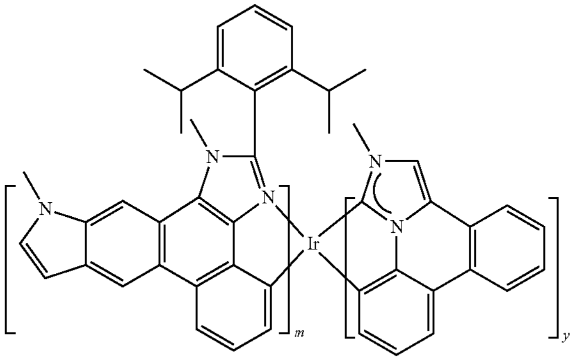
-continued
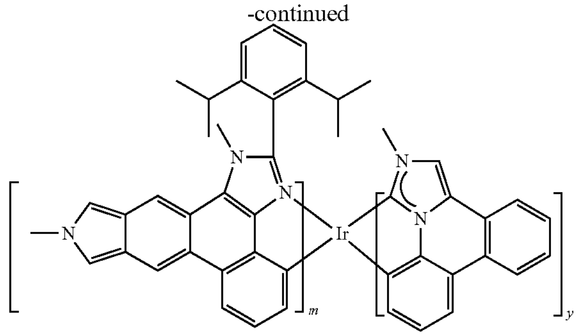
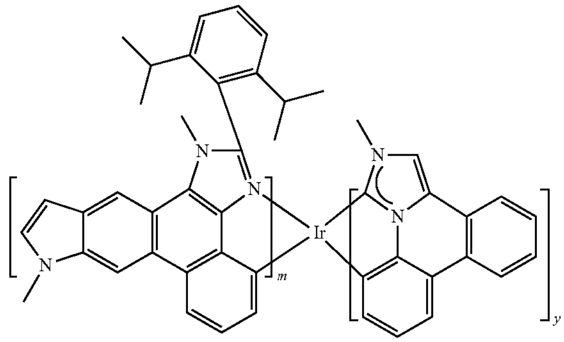
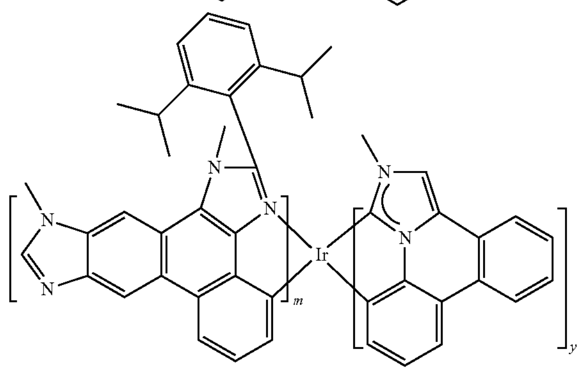
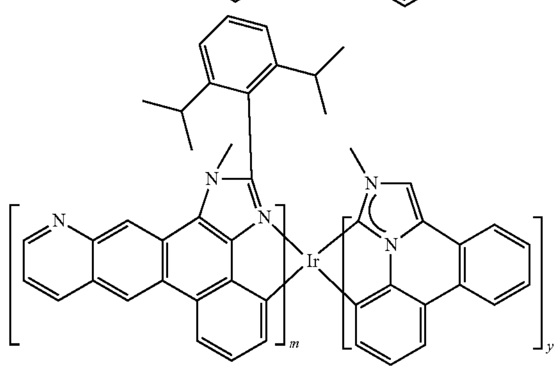
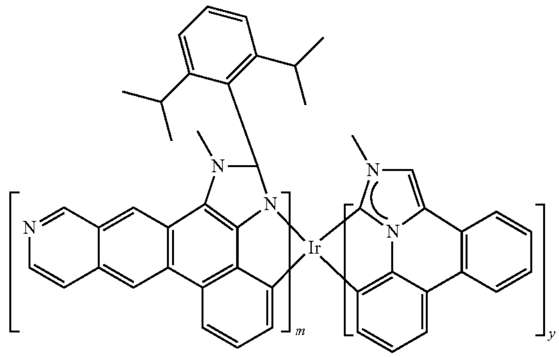

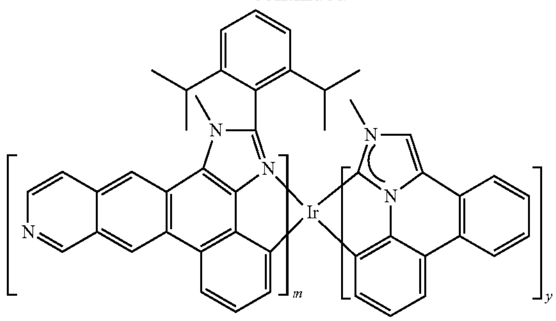
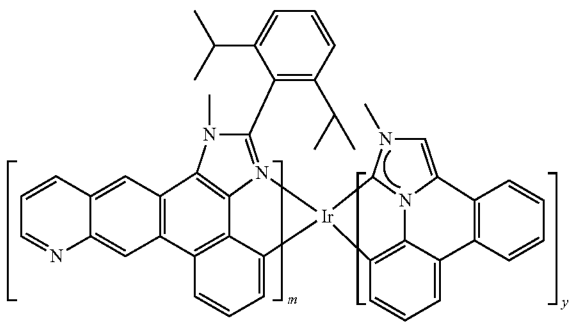
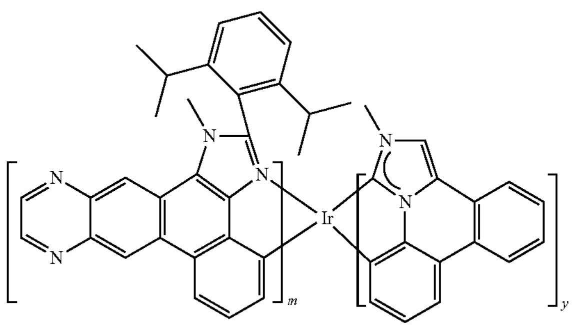
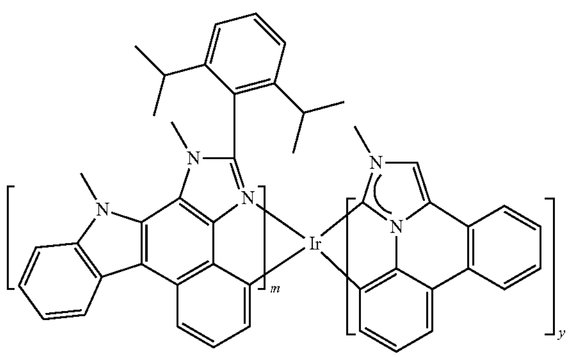
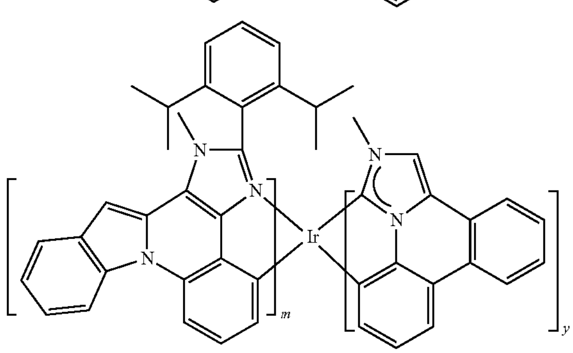
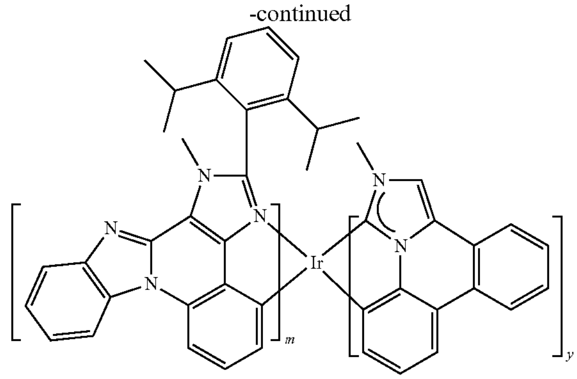
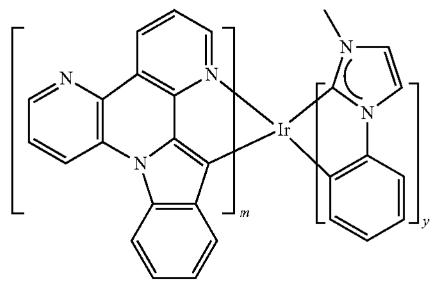
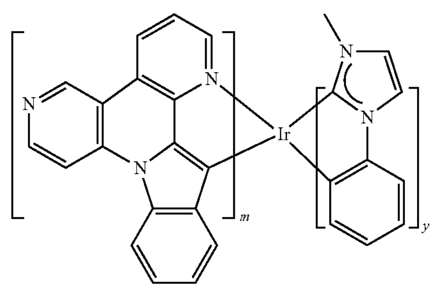
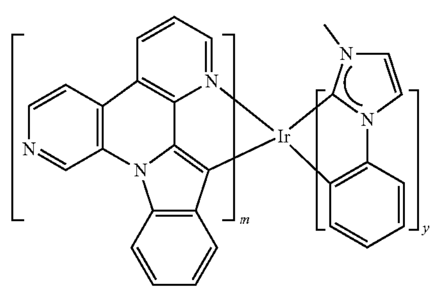
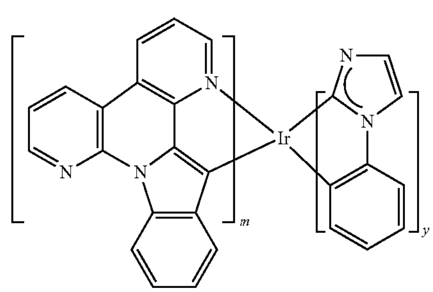

-continued
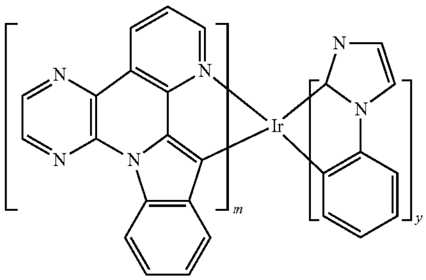
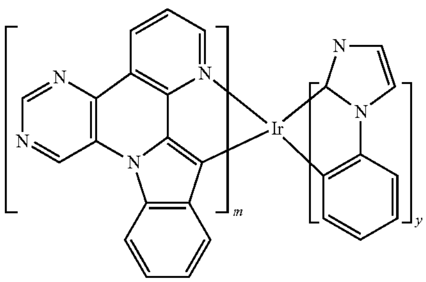
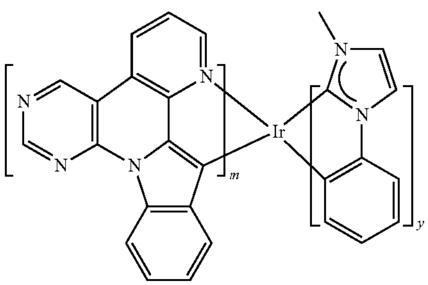
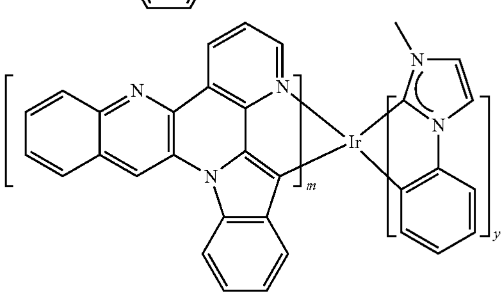
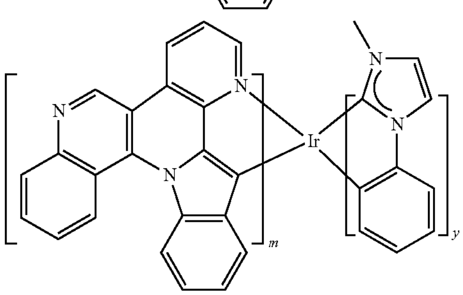
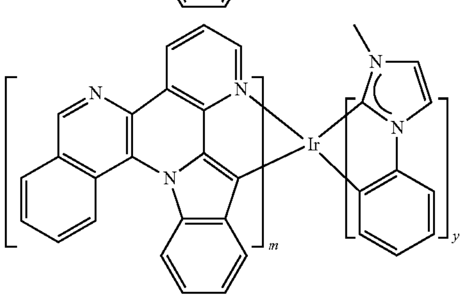
-continued
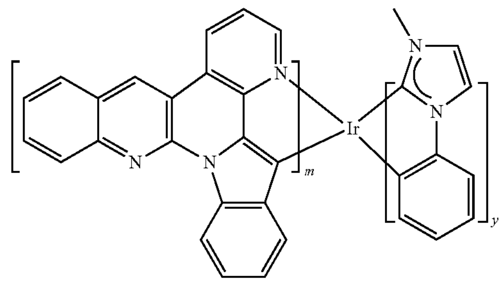
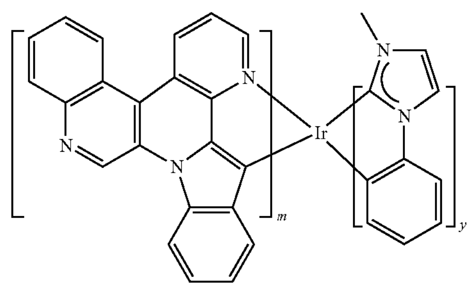
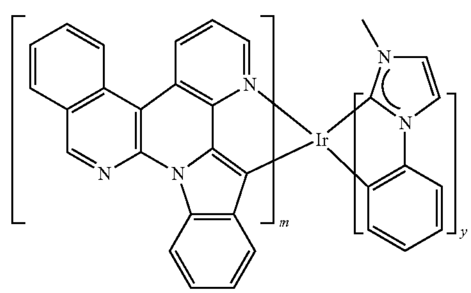
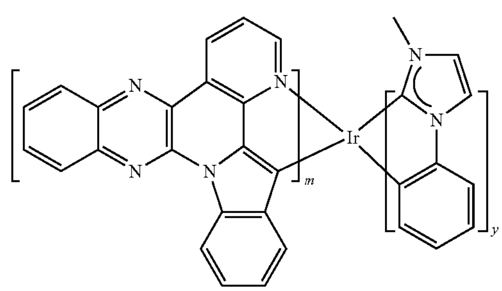
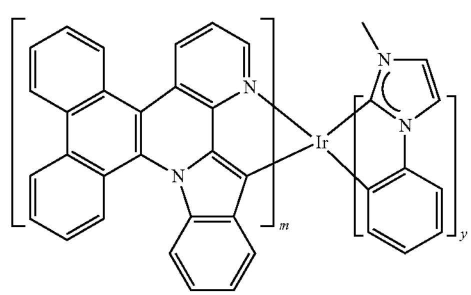

-continued
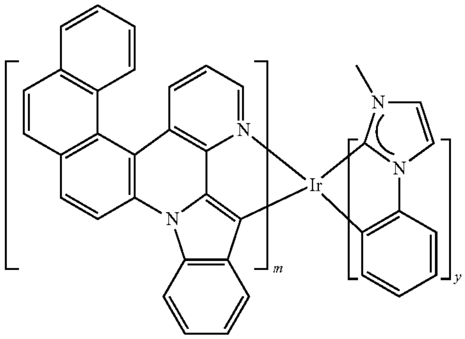
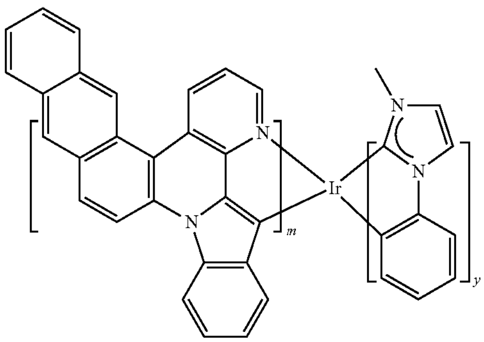
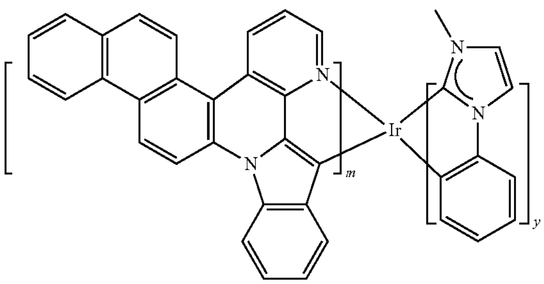
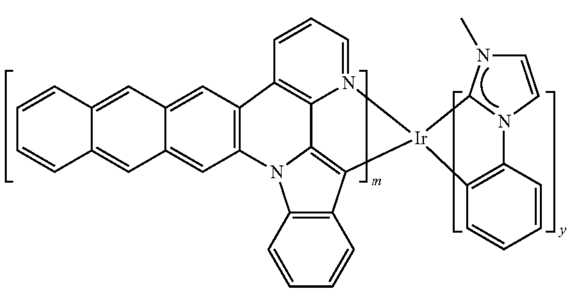
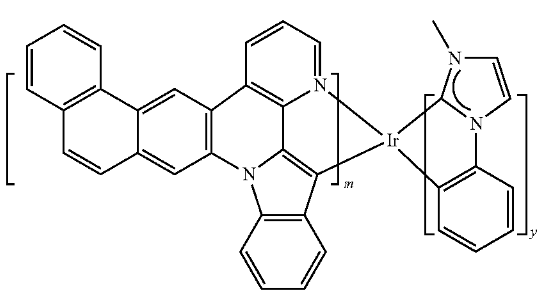
-continued
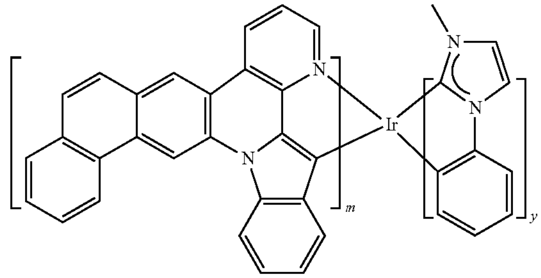
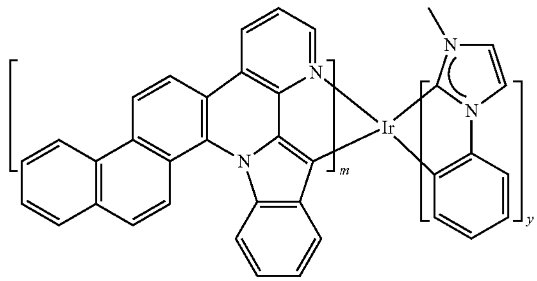
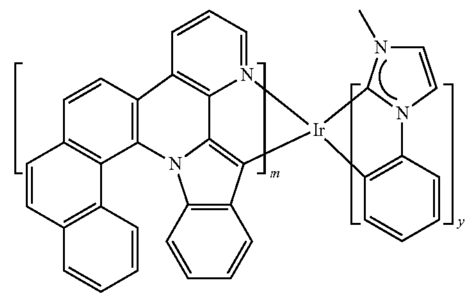
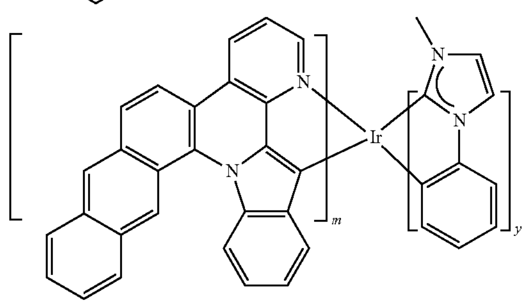
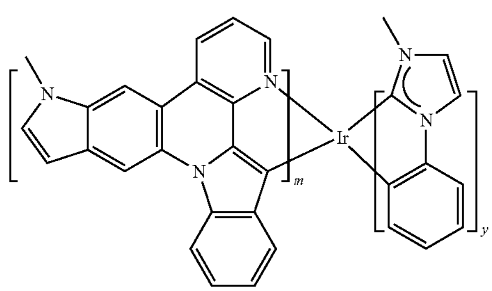
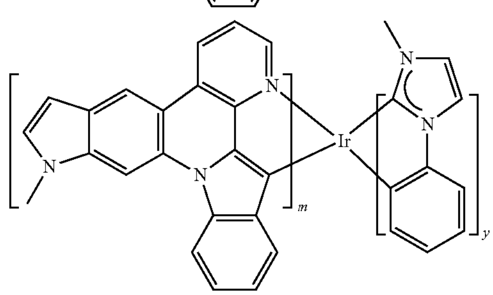

-continued
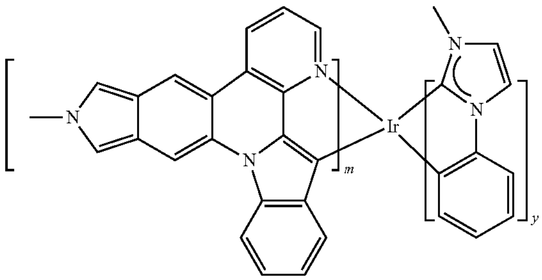
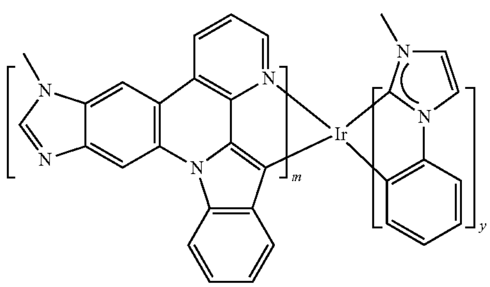
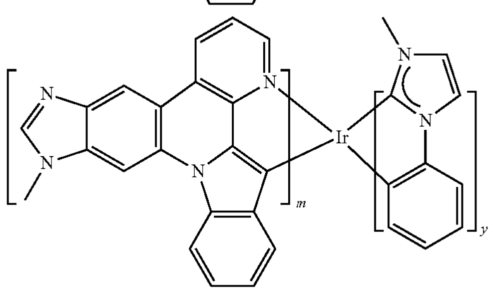
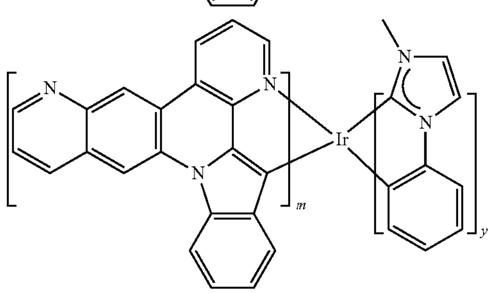
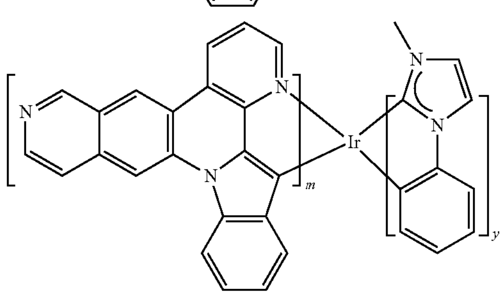
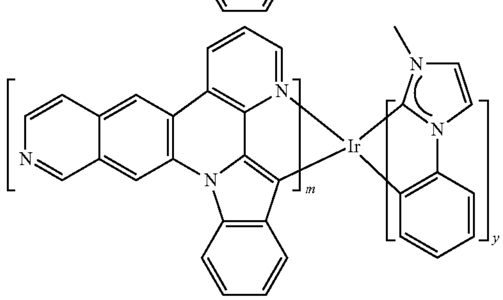
-continued
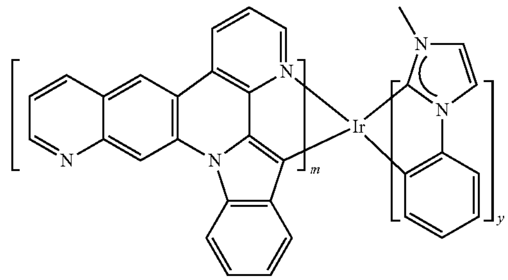
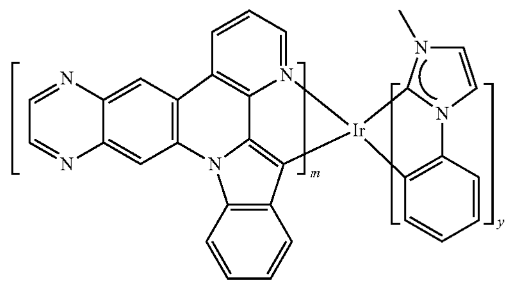
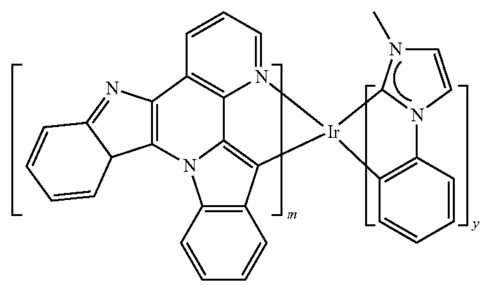
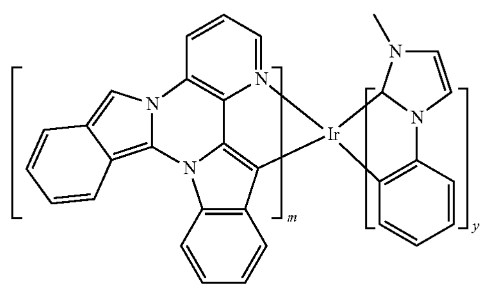
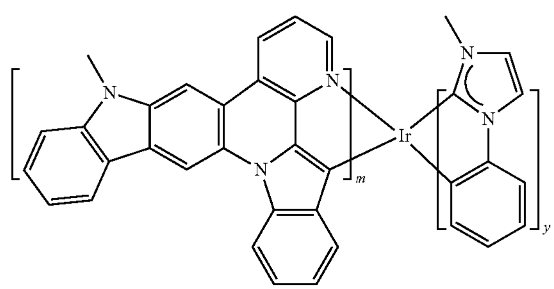
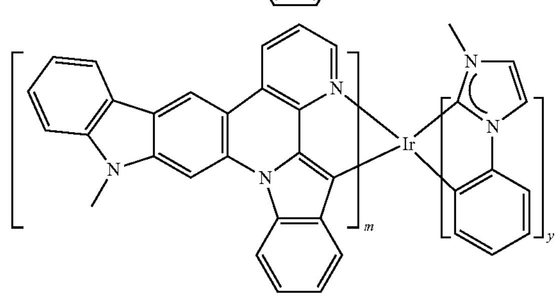

-continued
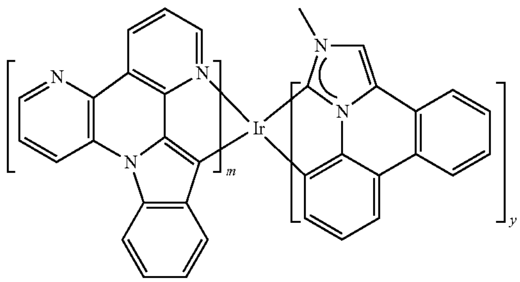
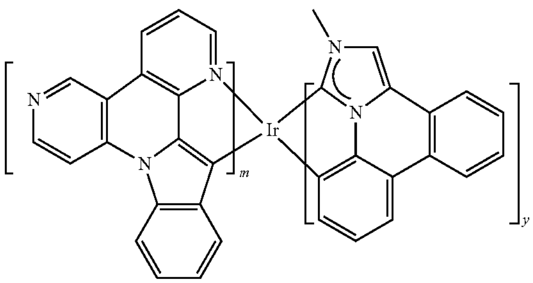
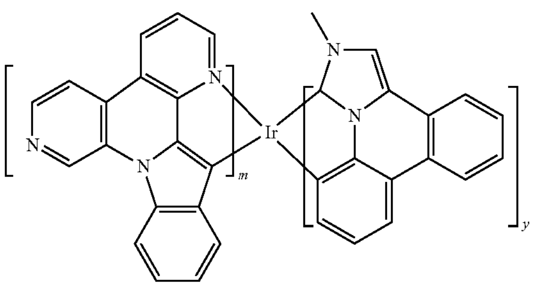
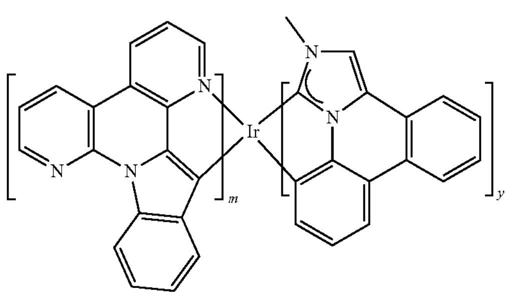
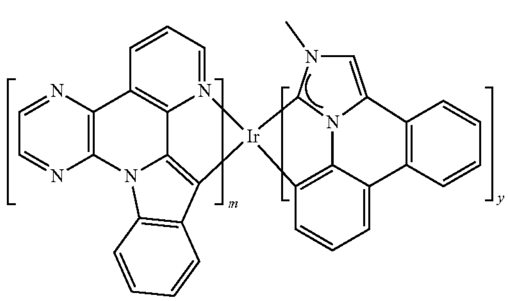
-continued
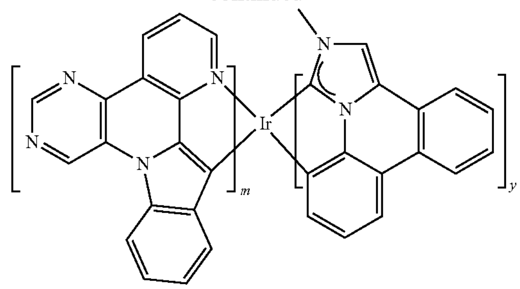
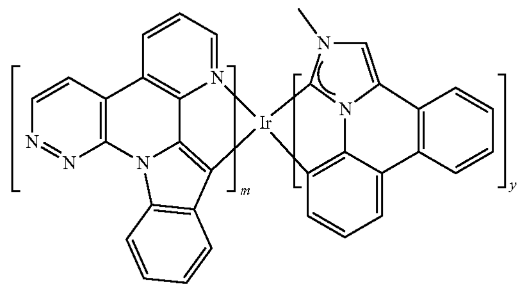
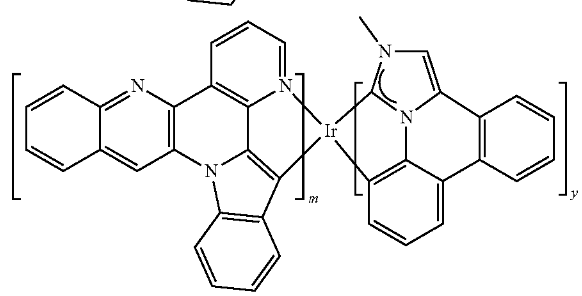
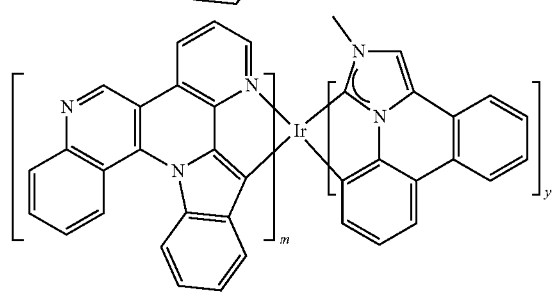
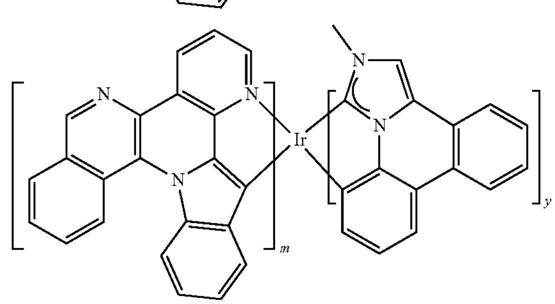
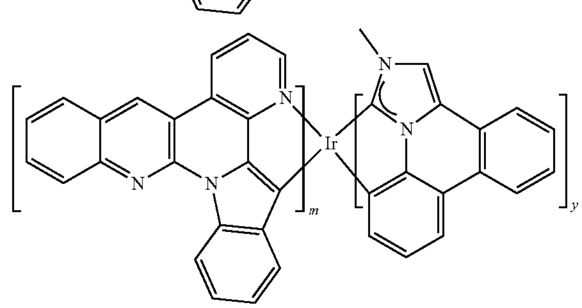

-continued
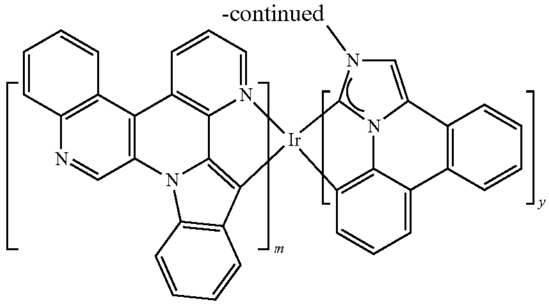
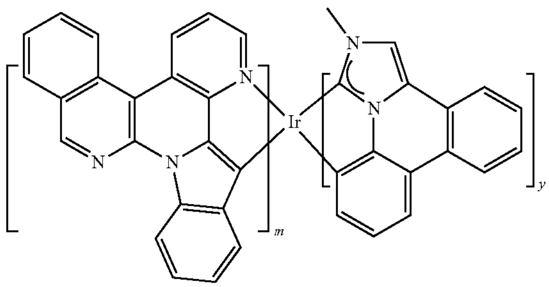
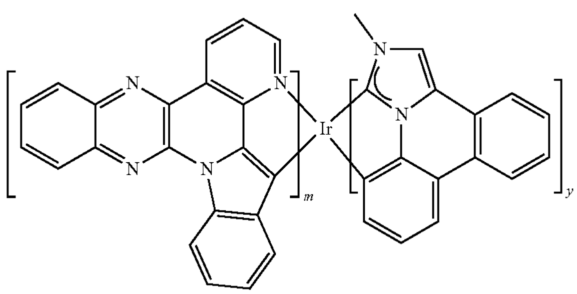
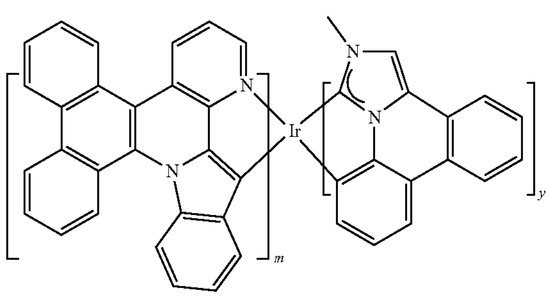
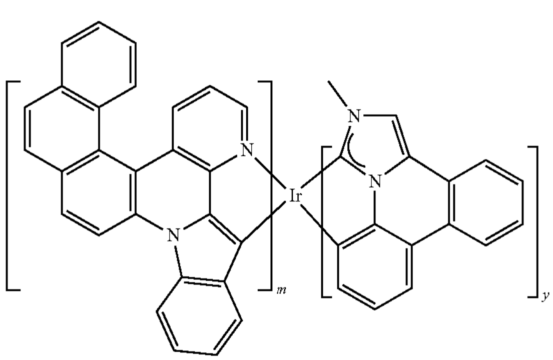
-continued
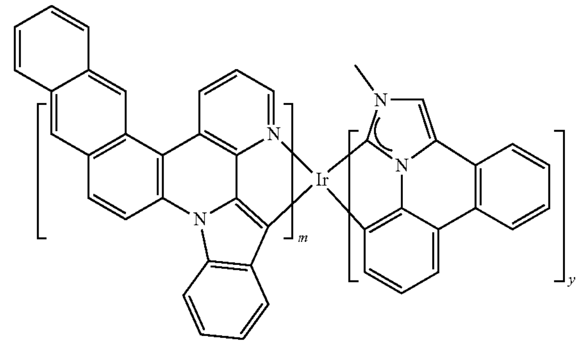
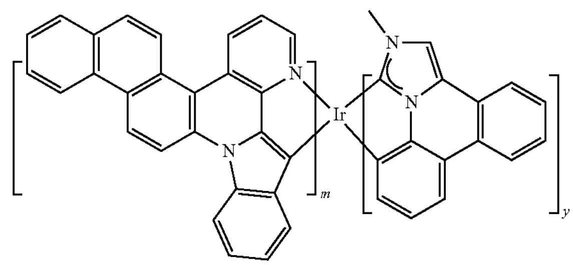
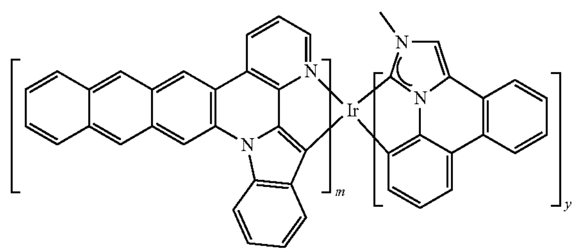
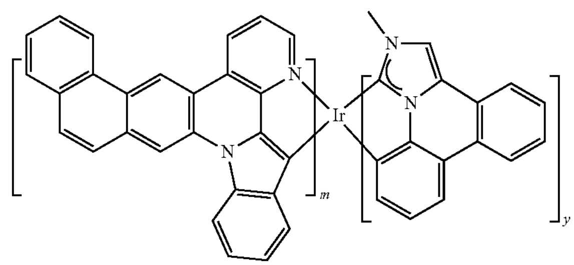
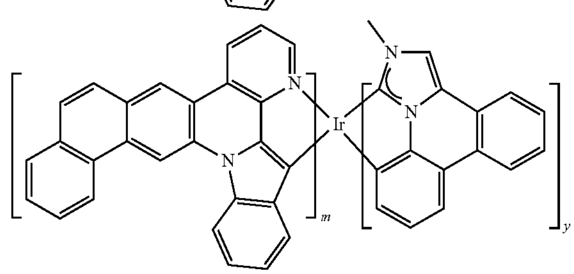
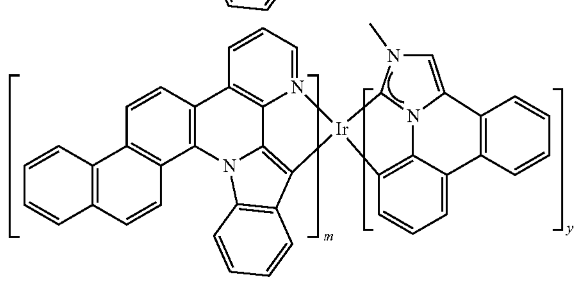

-continued
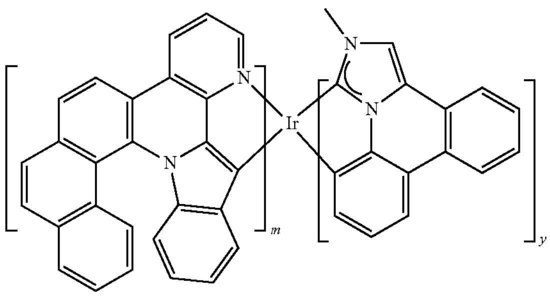
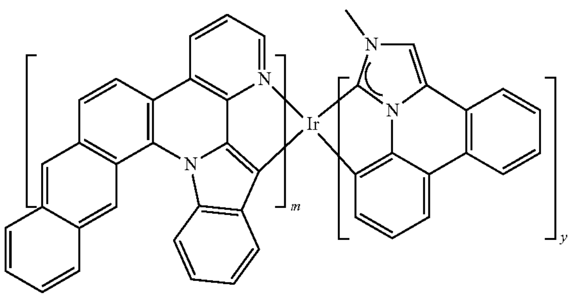
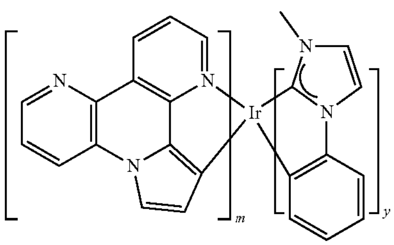
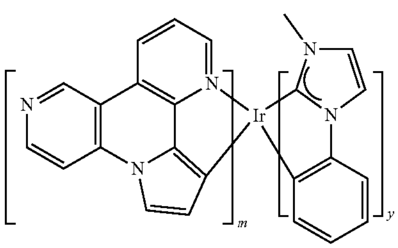
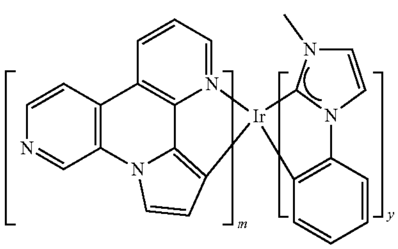
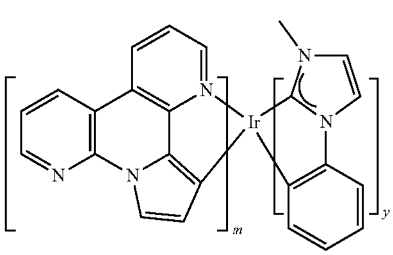
-continued
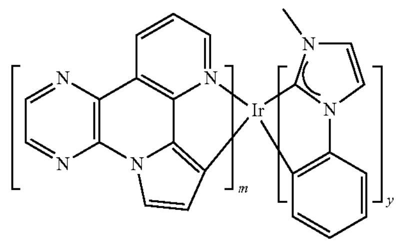
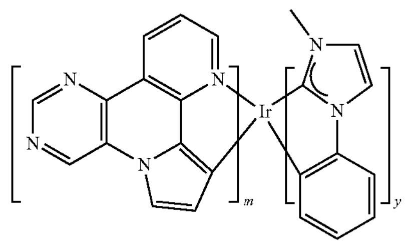
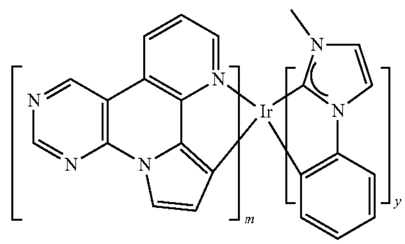
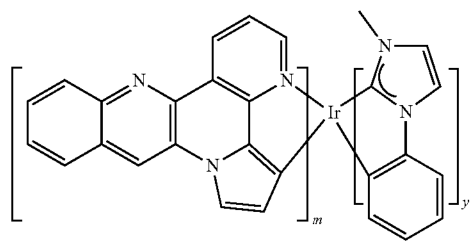
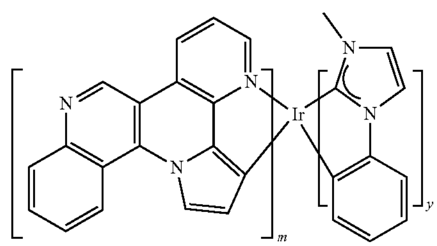
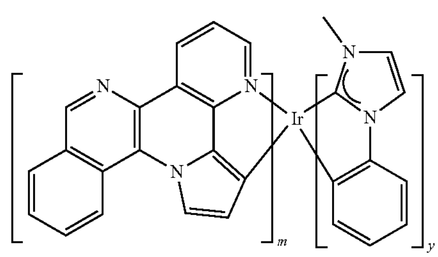
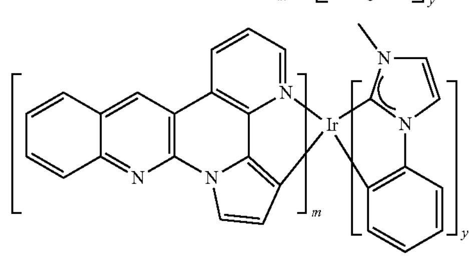

-continued
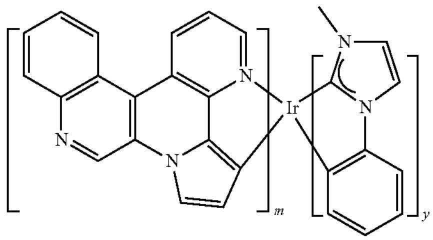
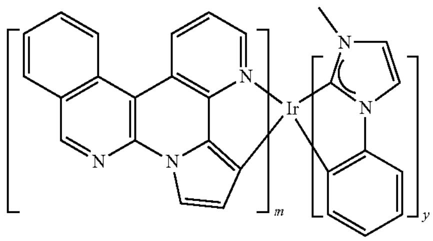
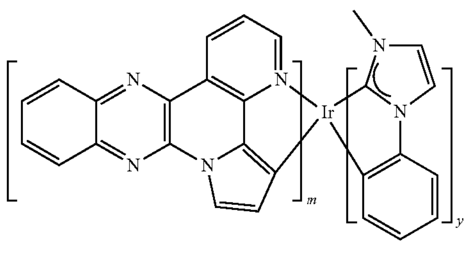
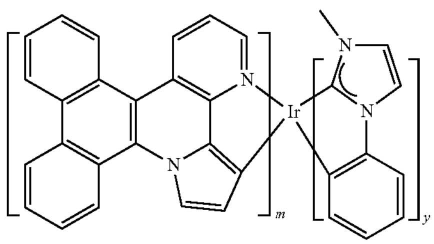
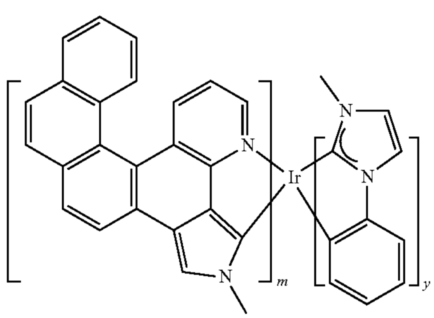
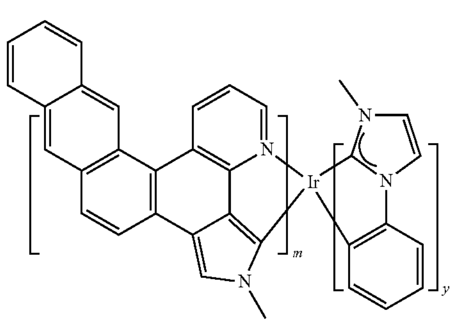
-continued
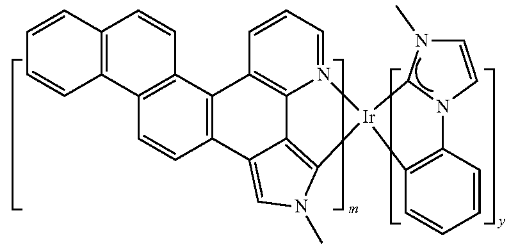
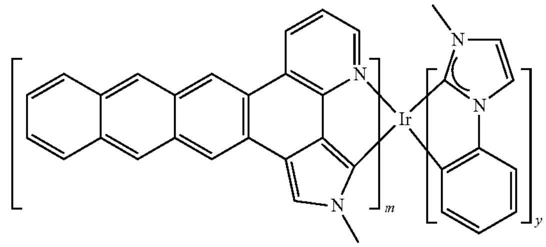
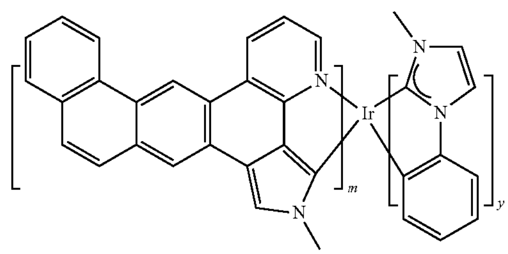
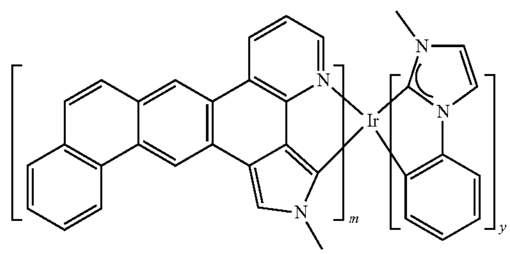
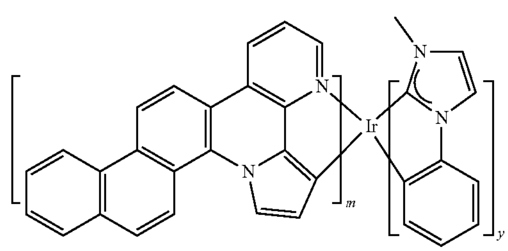
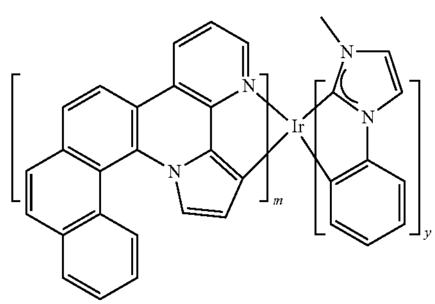

-continued
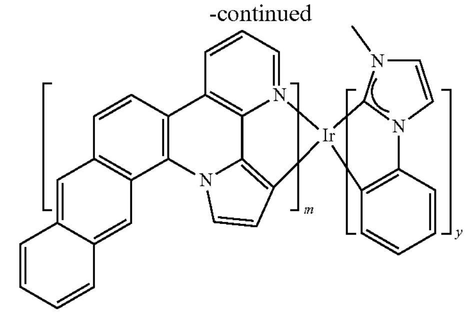
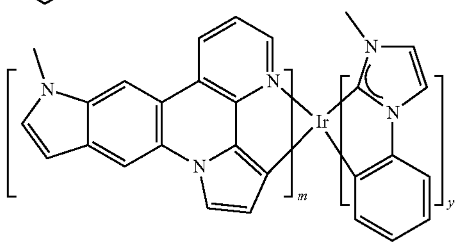
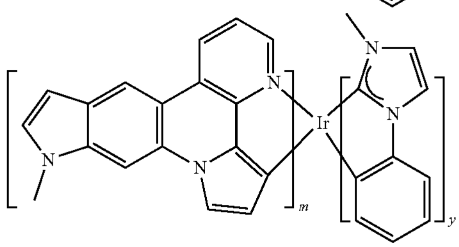
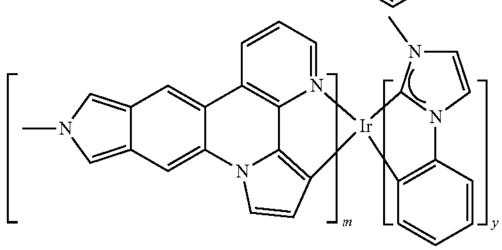
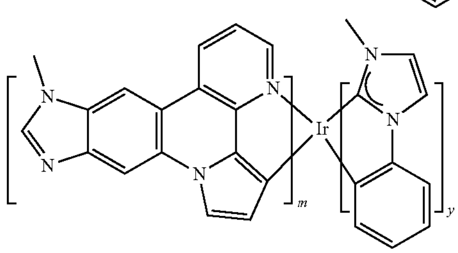
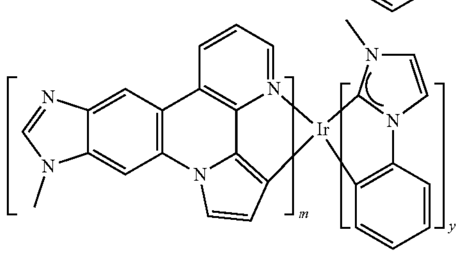
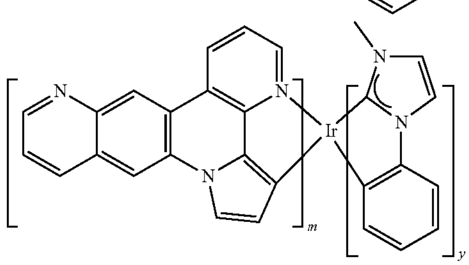
-continued
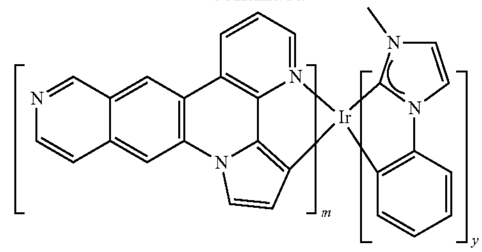
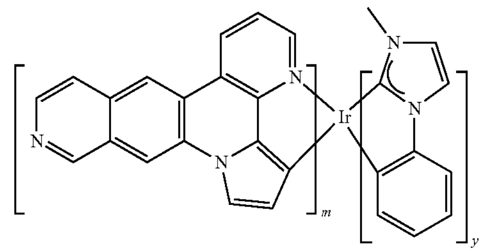
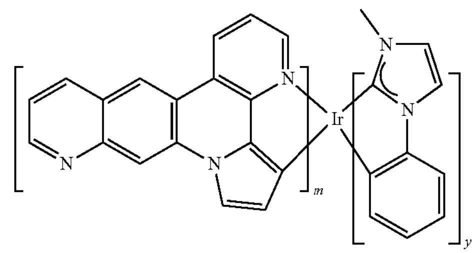
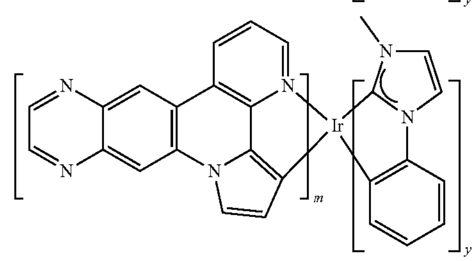
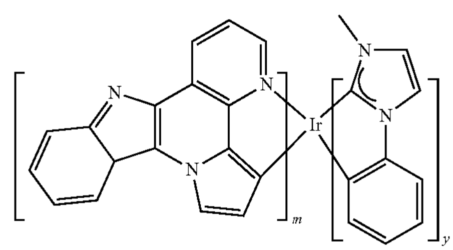
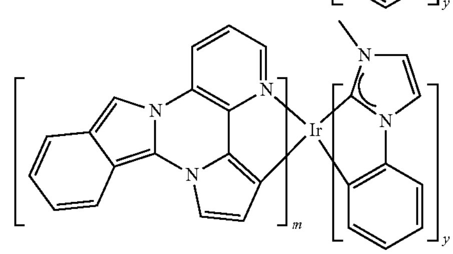
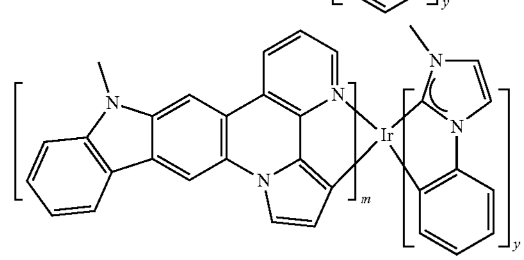

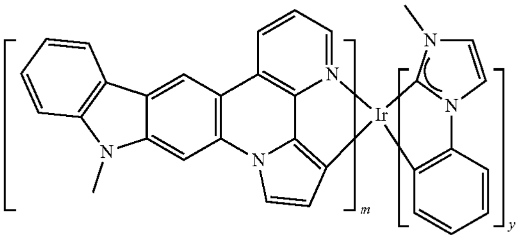
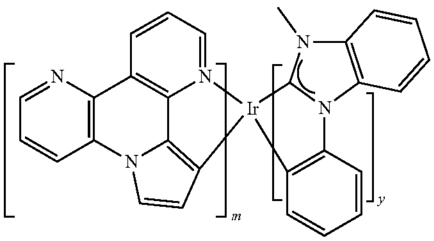
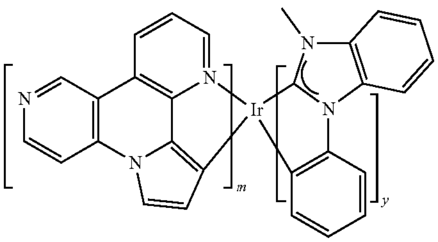
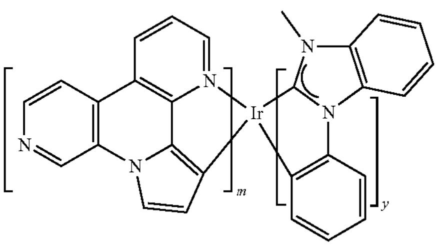
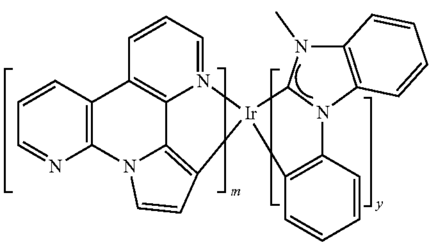
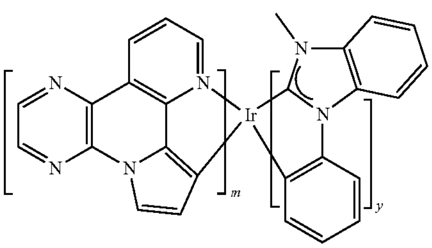
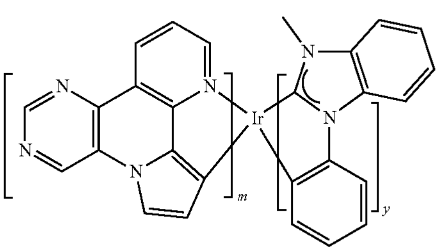
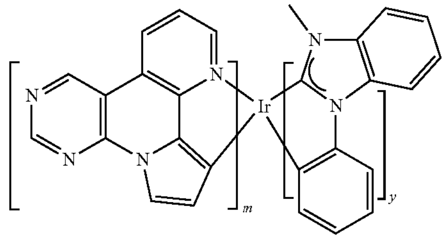
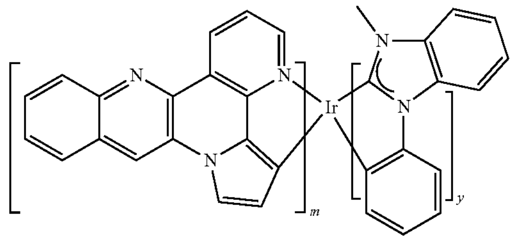
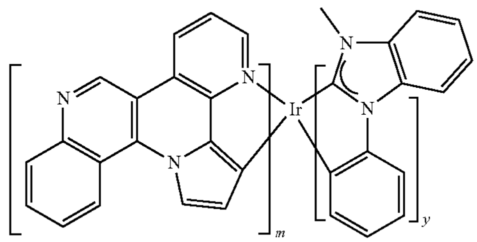
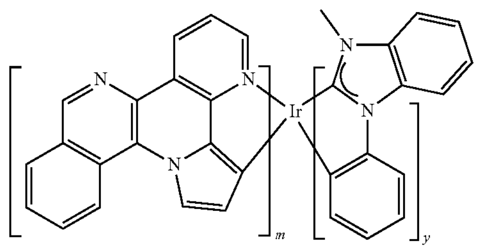
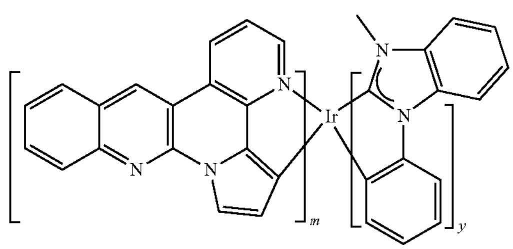
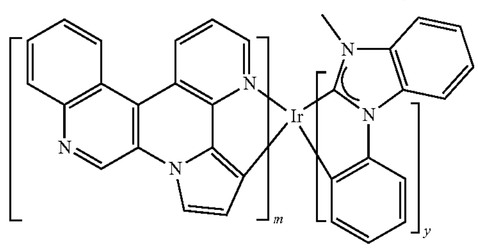
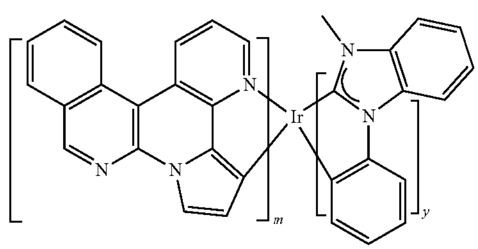

-continued
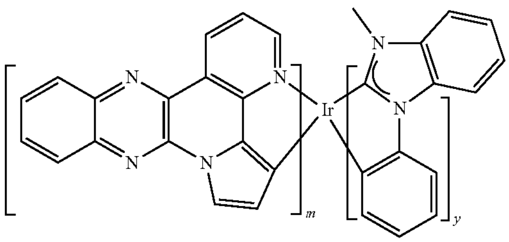
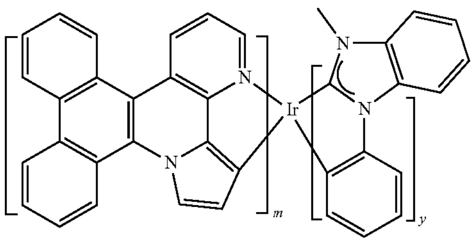
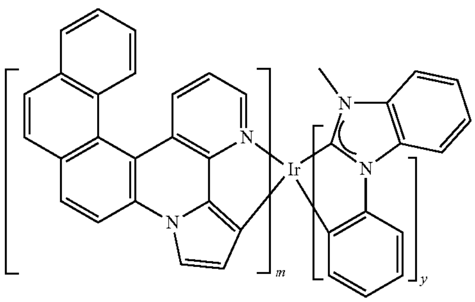
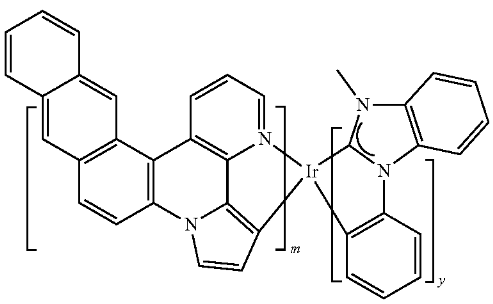
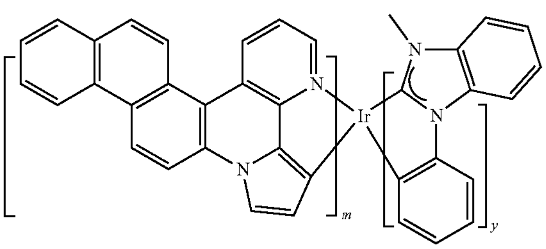
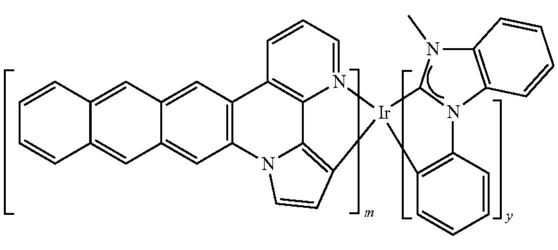
-continued
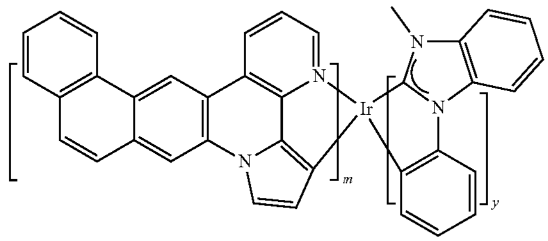
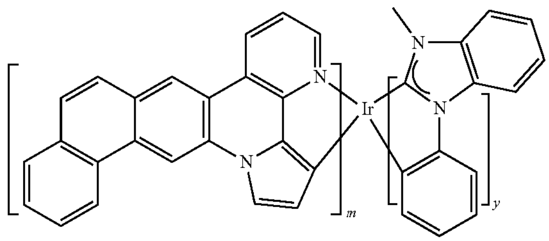
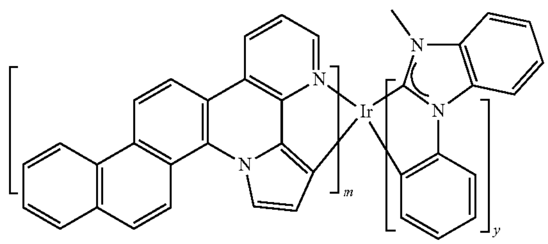
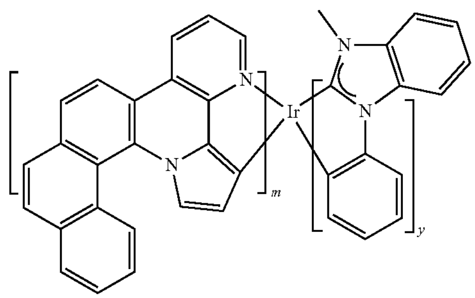
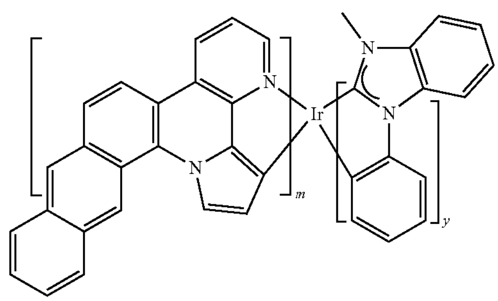
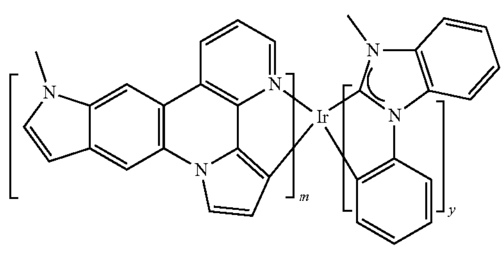

-continued
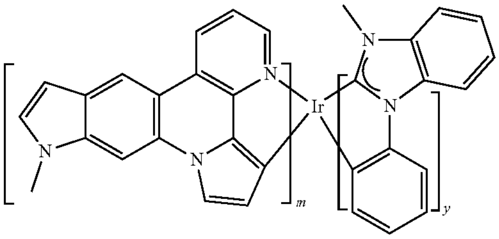
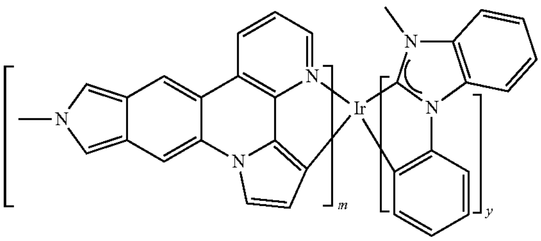
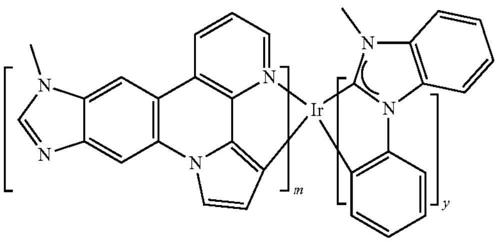
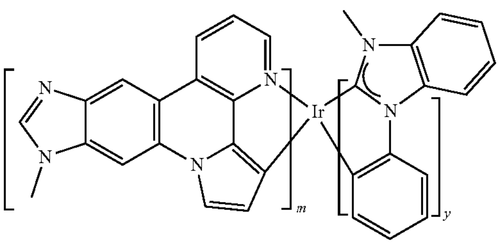
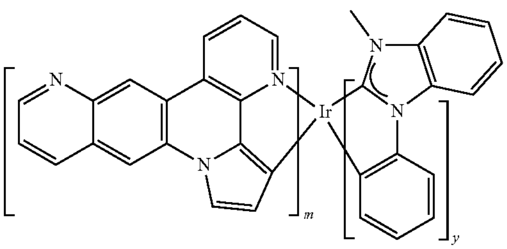
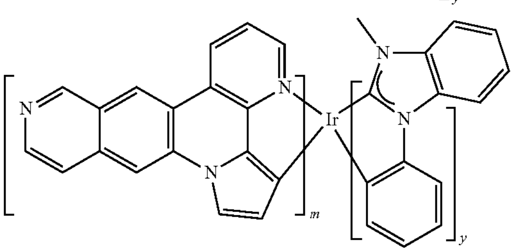
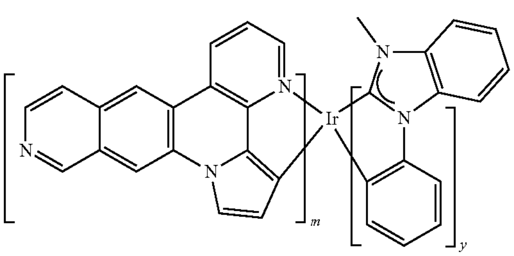
-continued
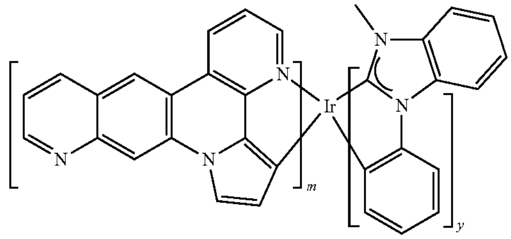
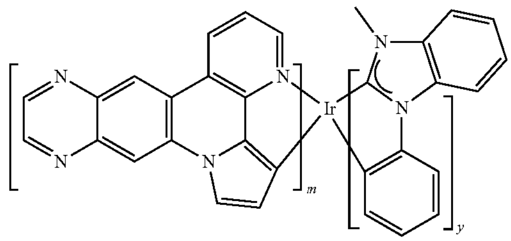
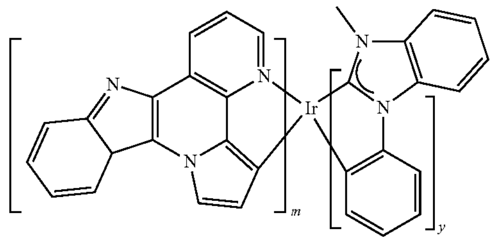
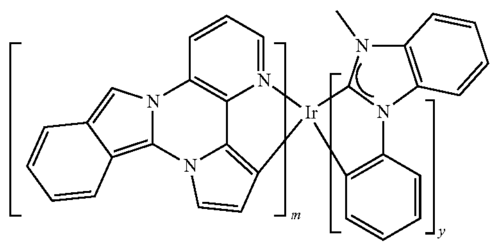
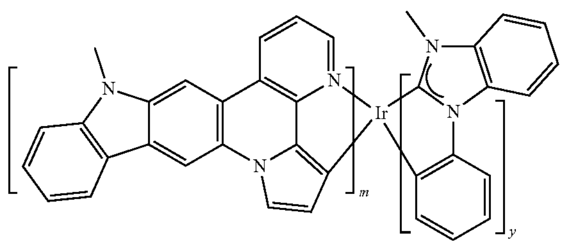
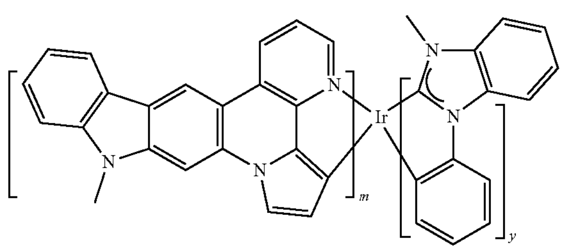
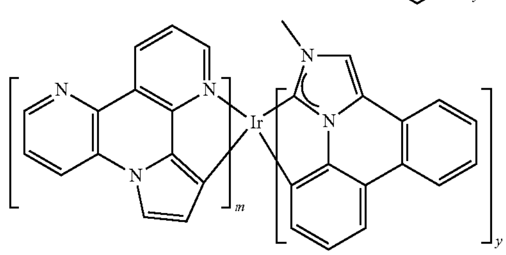

-continued
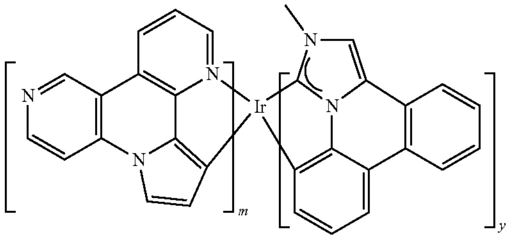
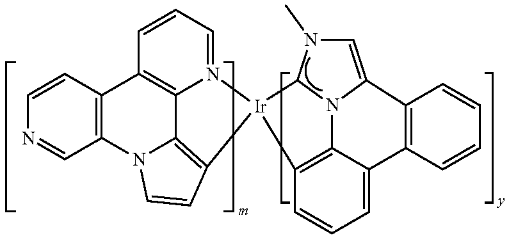
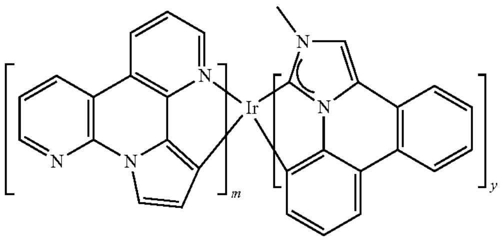
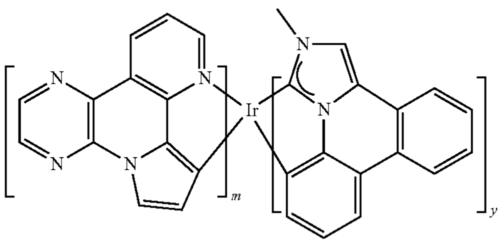
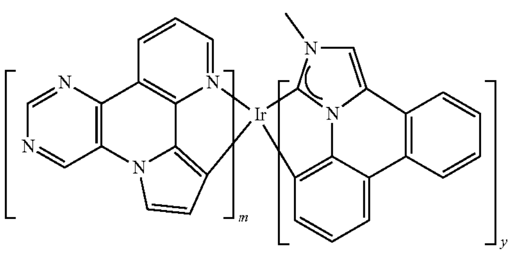
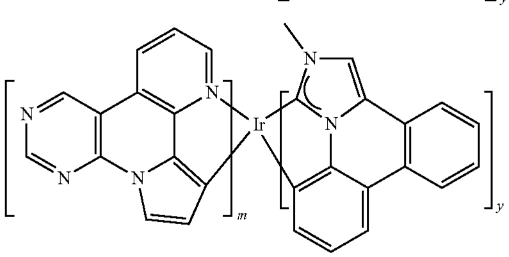
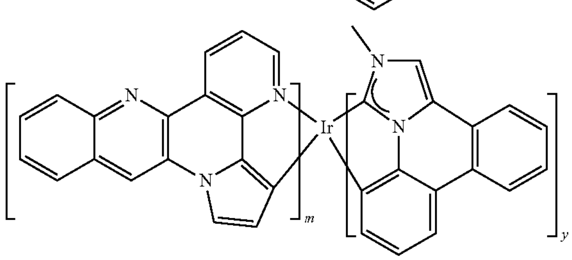
-continued
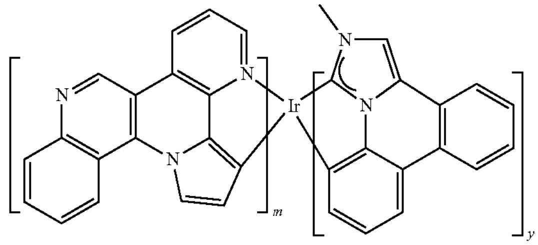
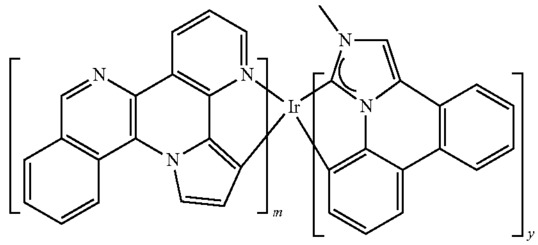
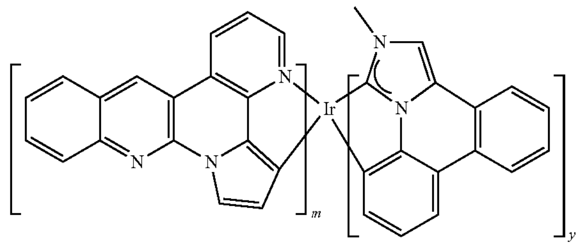
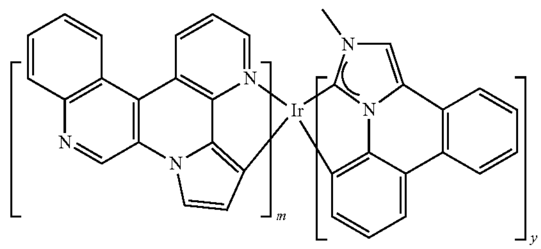
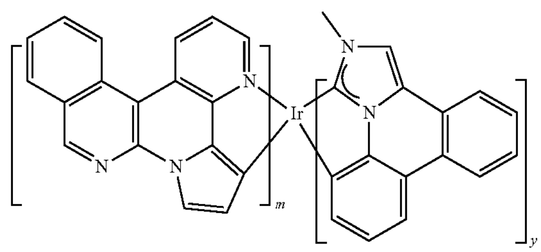
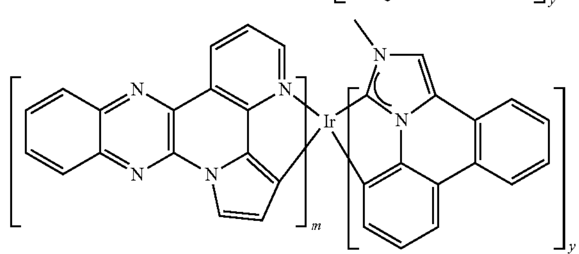
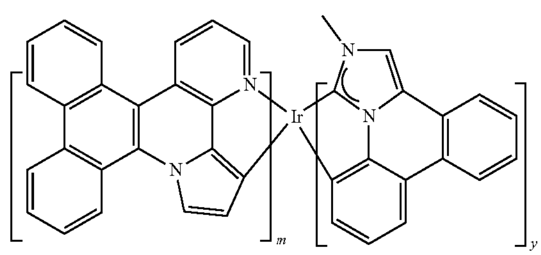

-continued
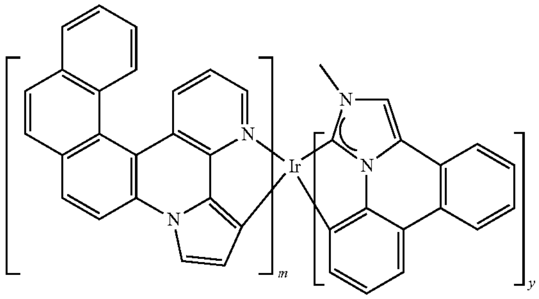
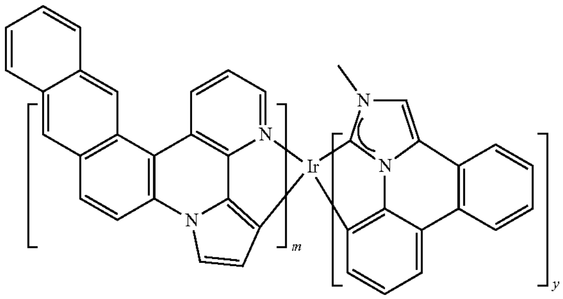
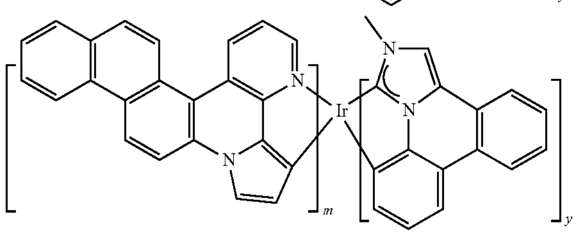
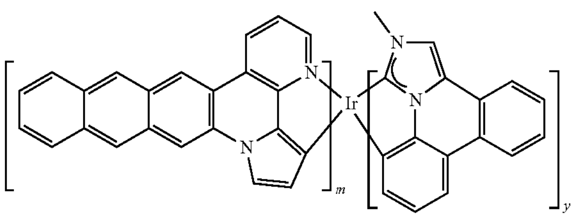
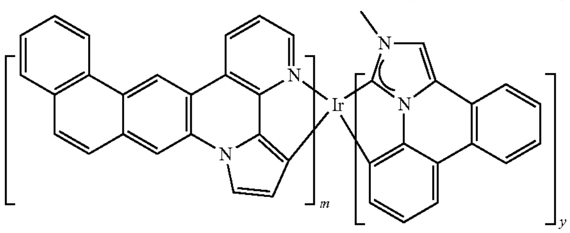
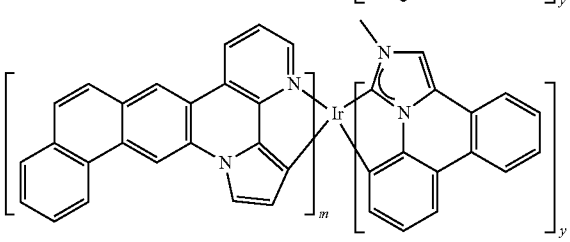
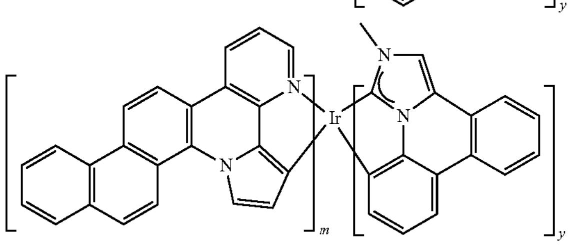
-continued
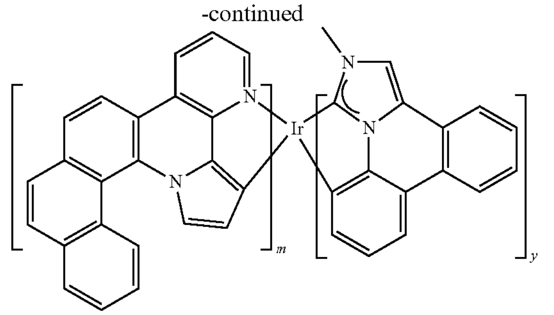
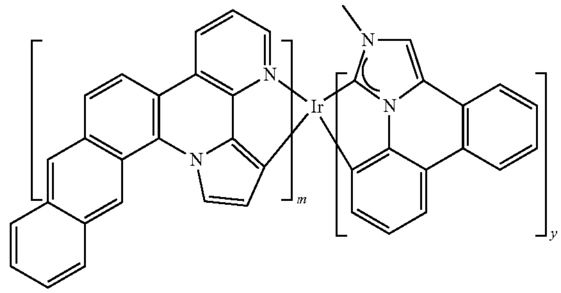
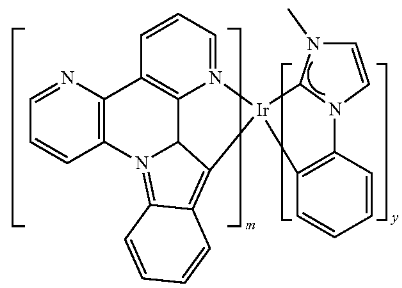
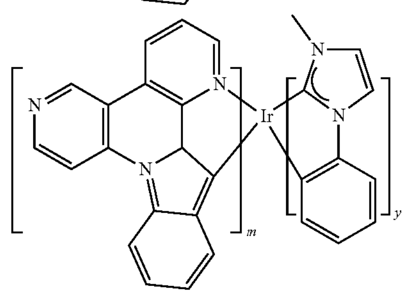
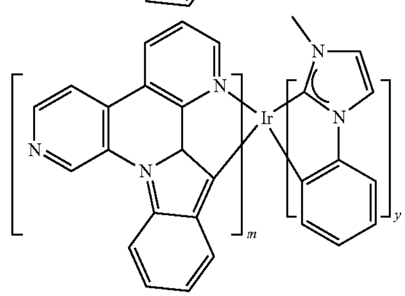
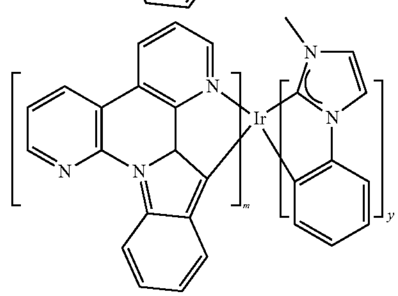

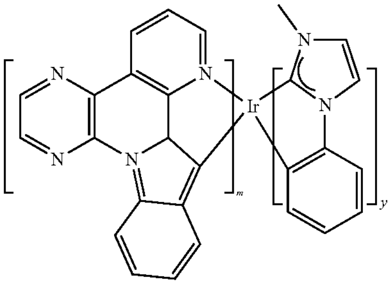
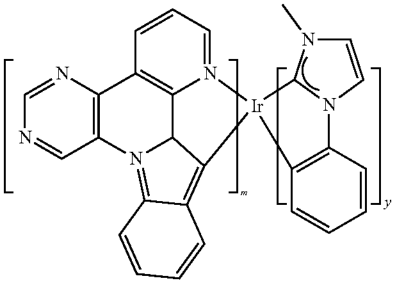
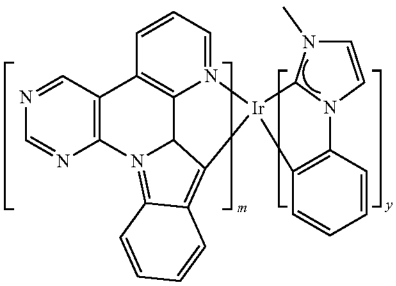
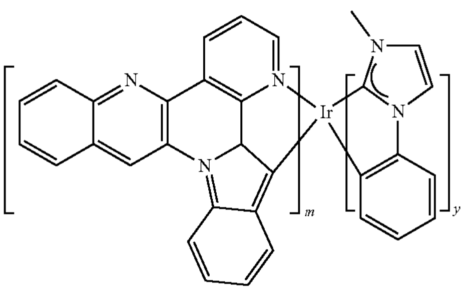
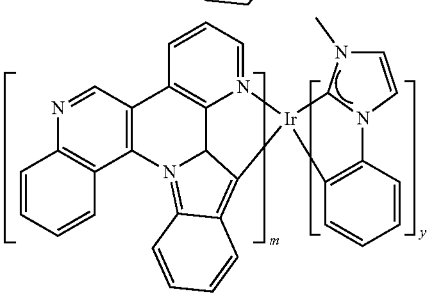
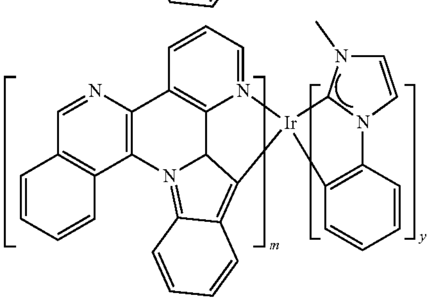
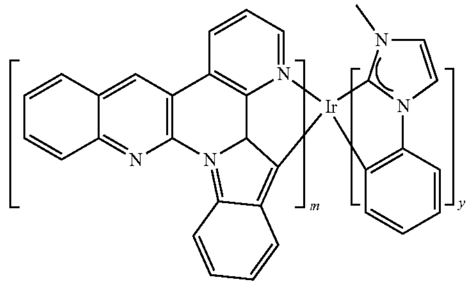
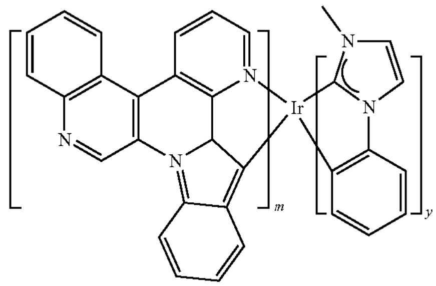
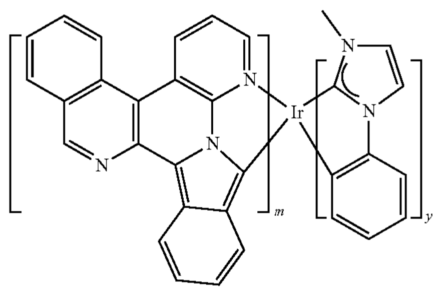
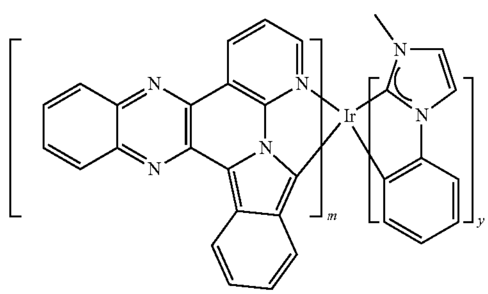
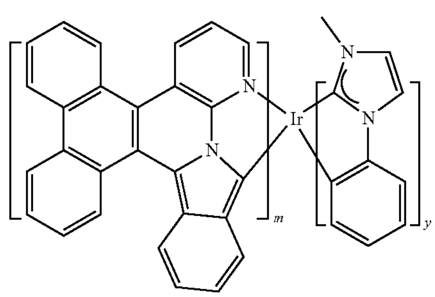

-continued
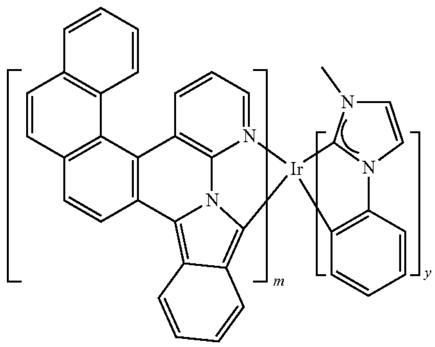
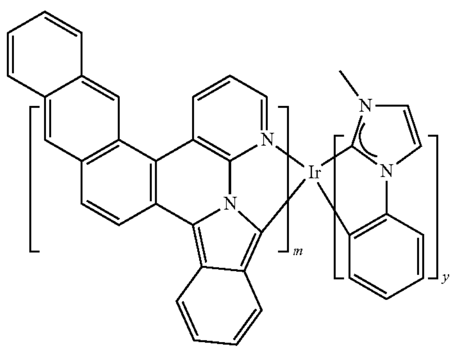
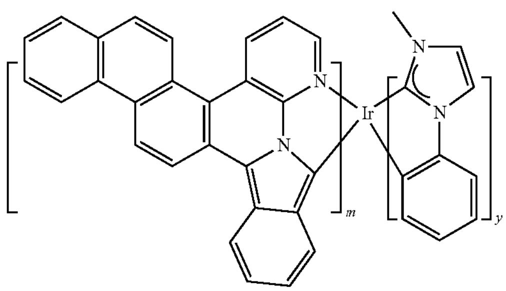
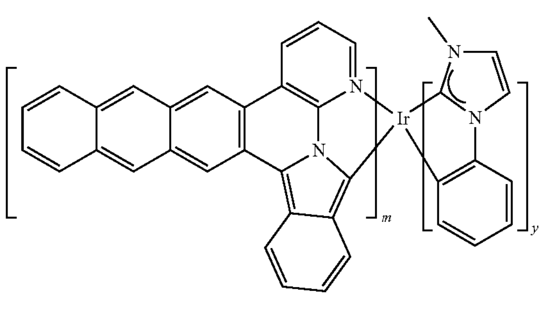
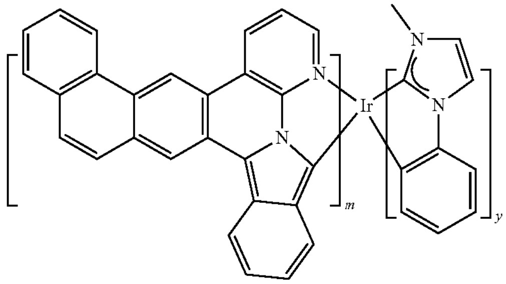
-continued
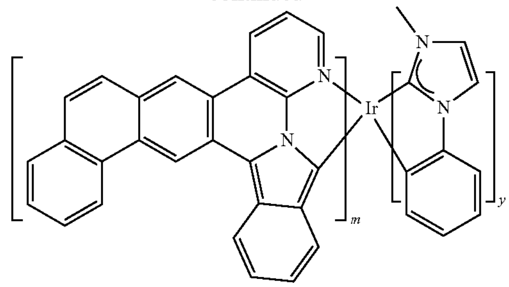
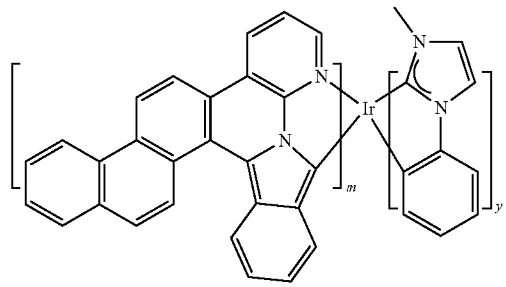
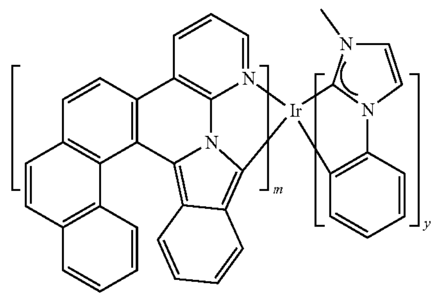
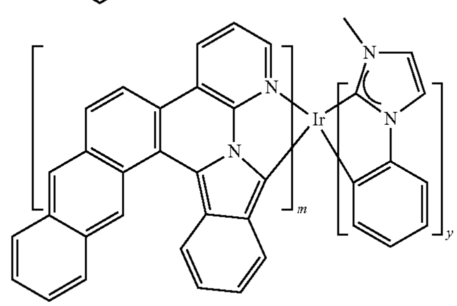
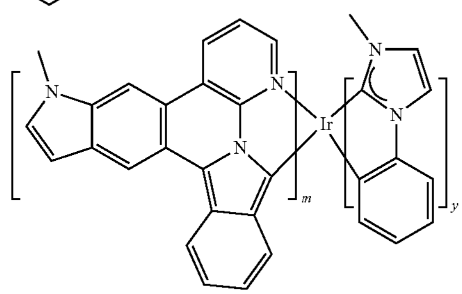
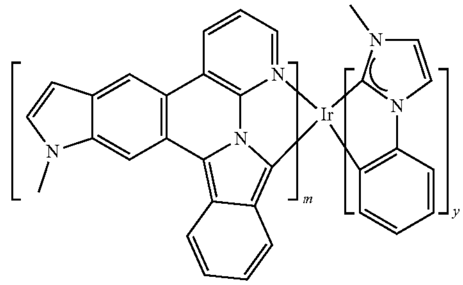

-continued
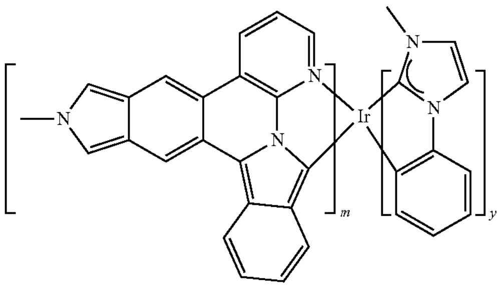
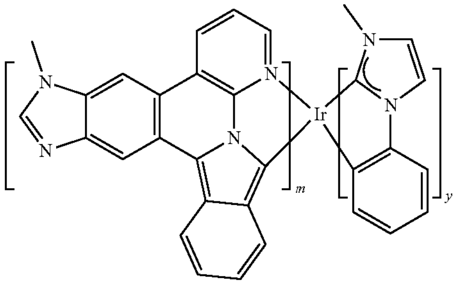
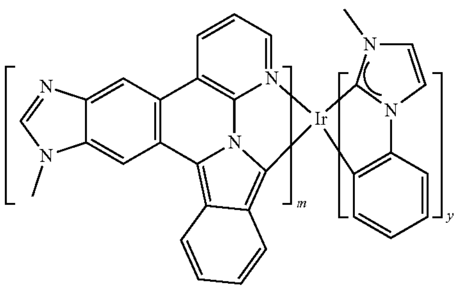
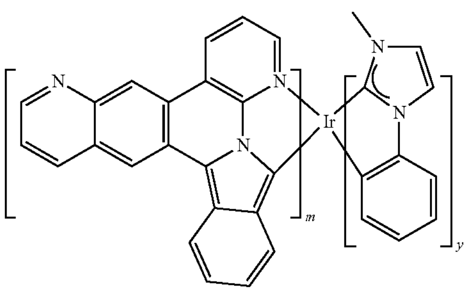
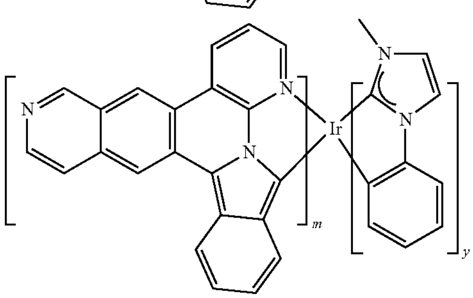
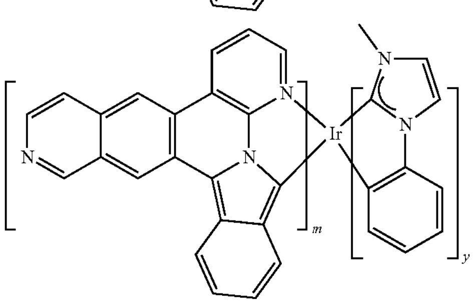
-continued
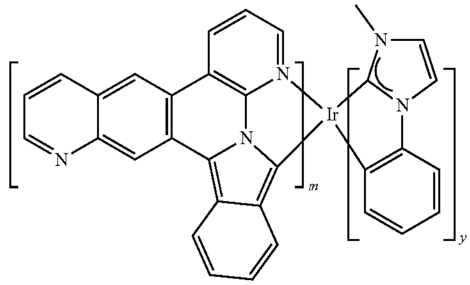
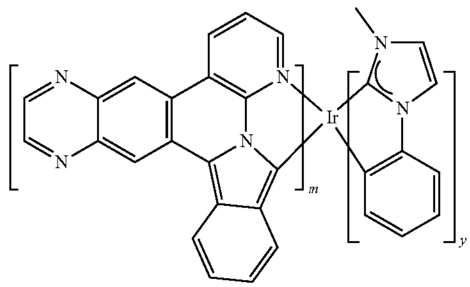
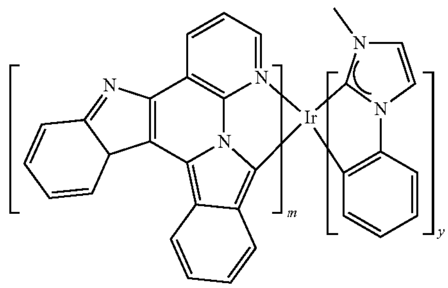
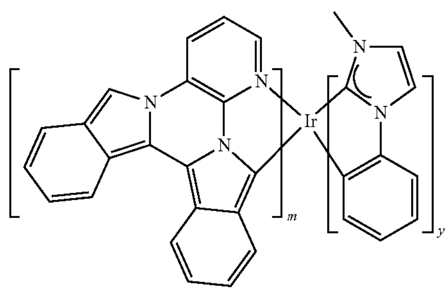
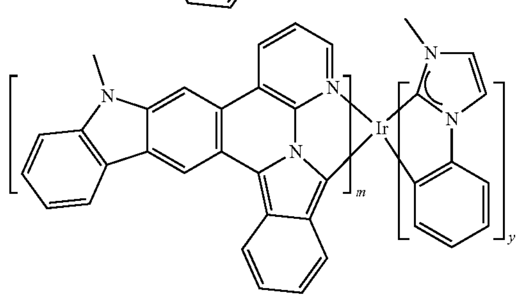
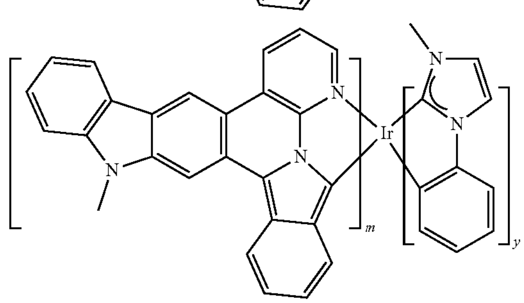

-continued
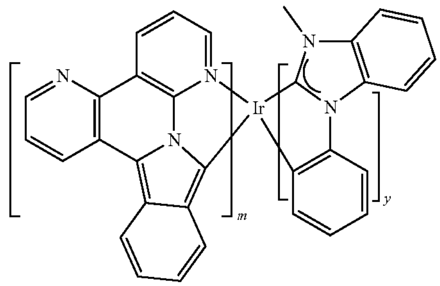
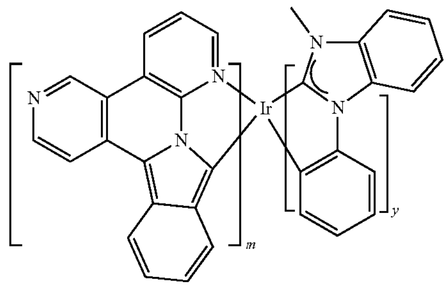
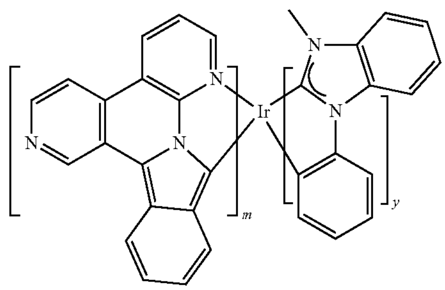
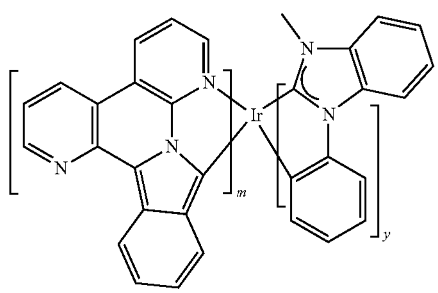
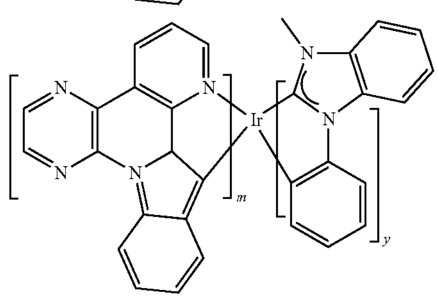
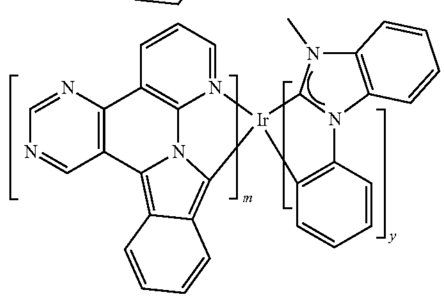
-continued
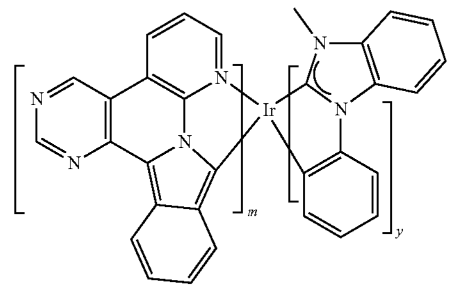
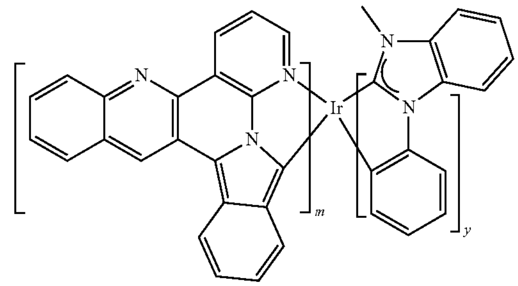
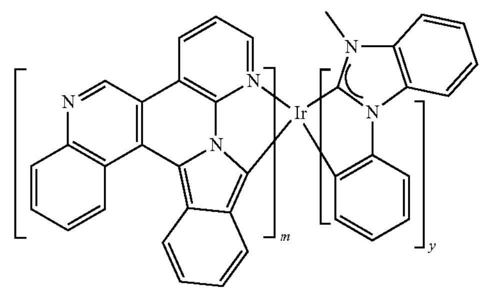
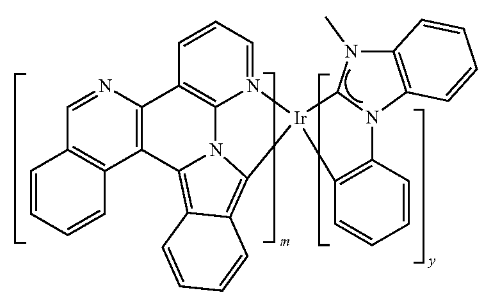
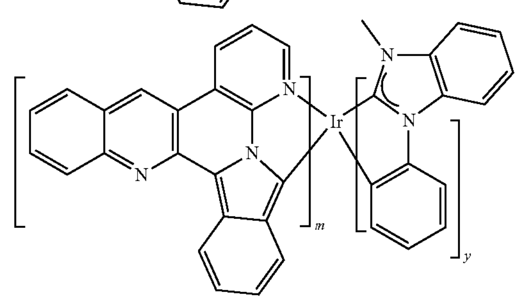
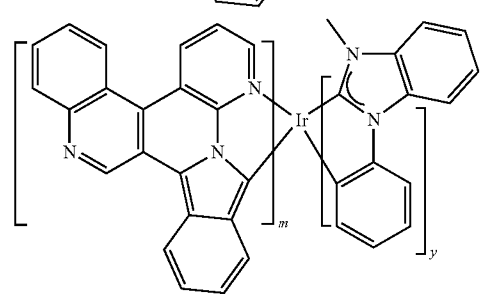

-continued
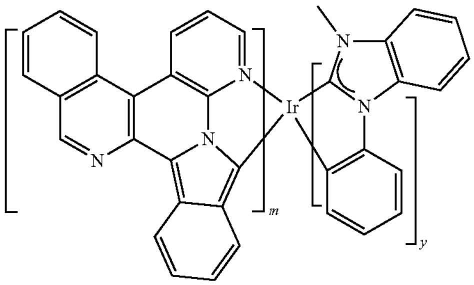
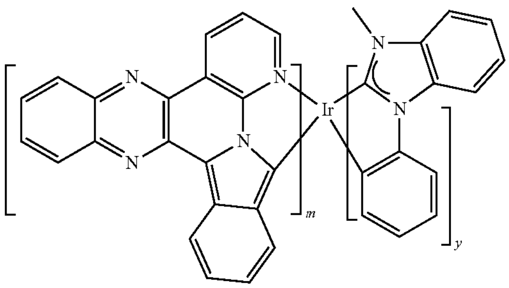
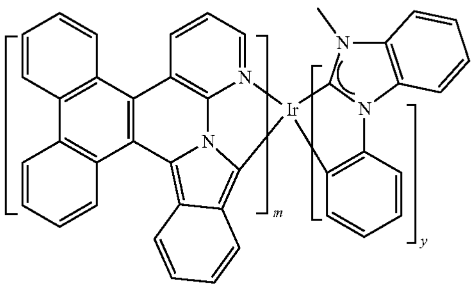
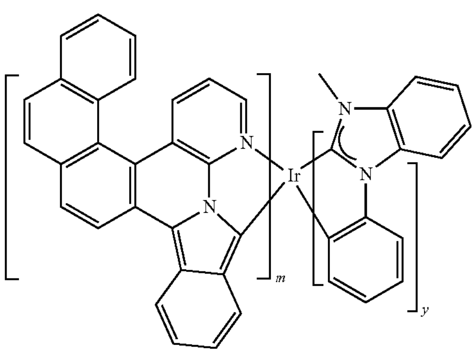
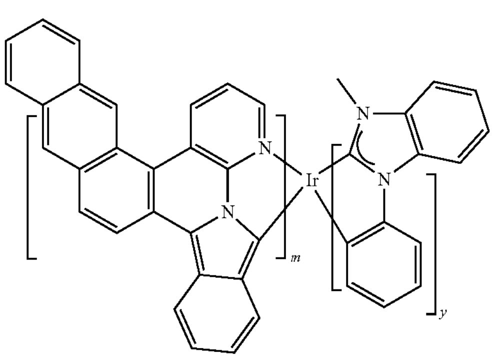
-continued
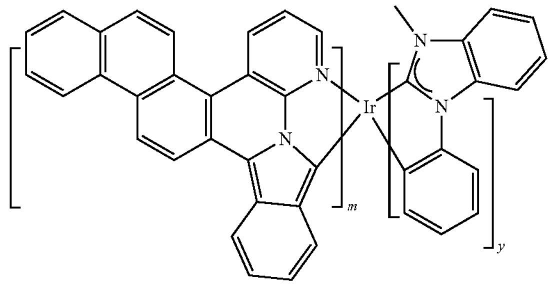
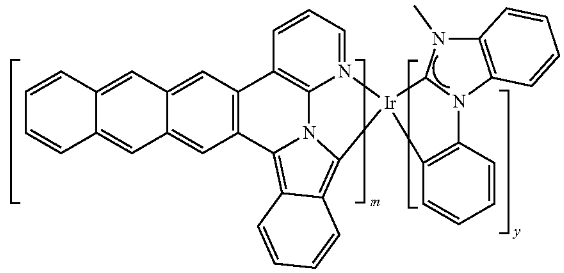
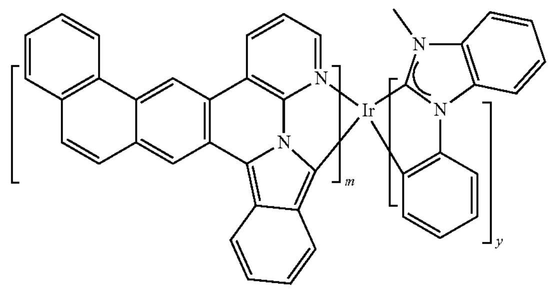
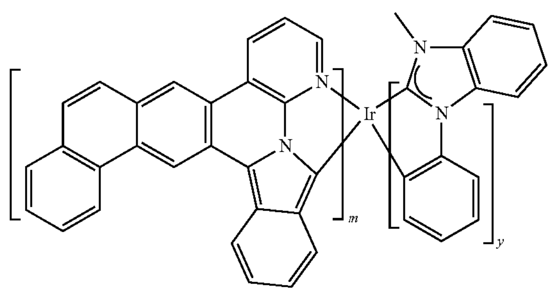
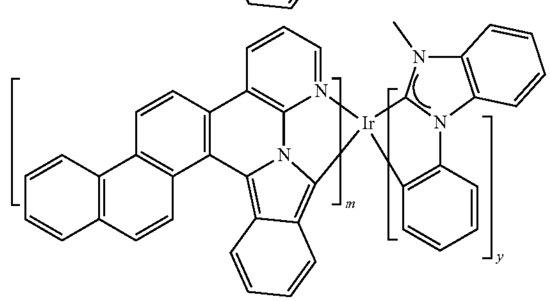
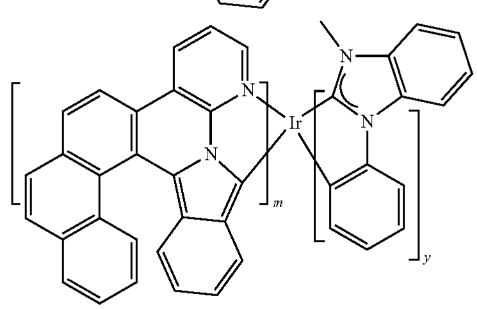

-continued
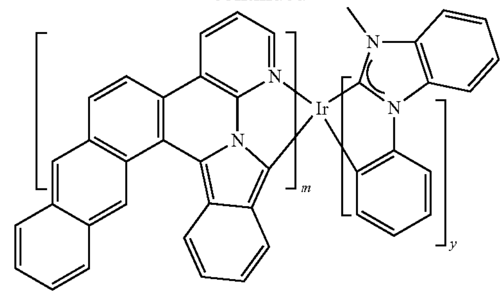
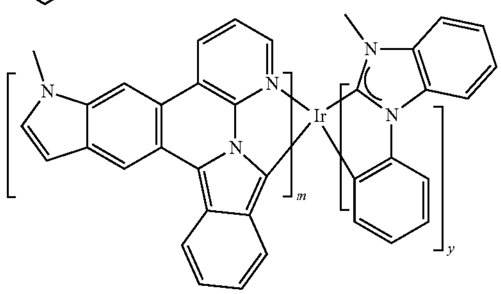
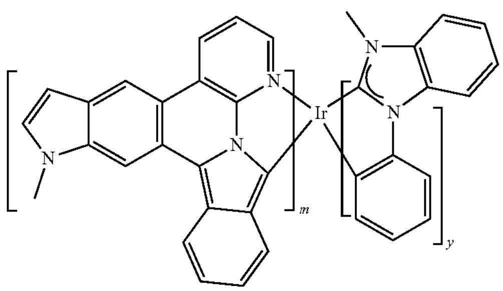
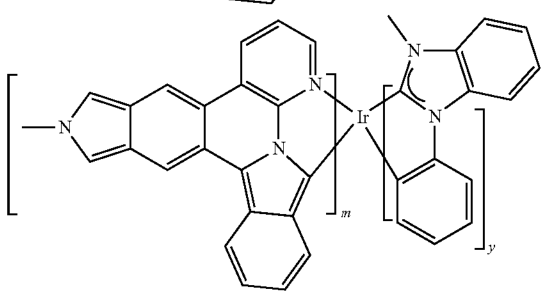
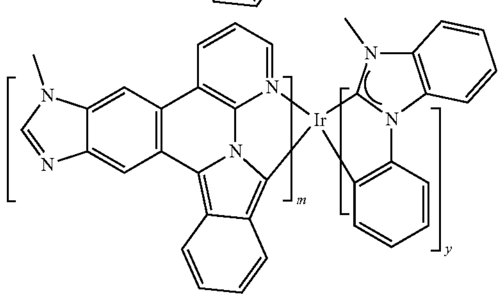
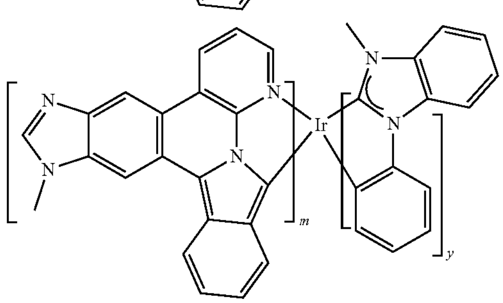
-continued
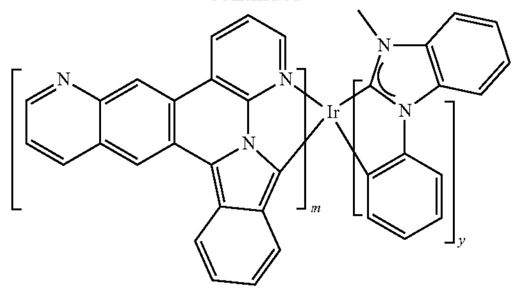
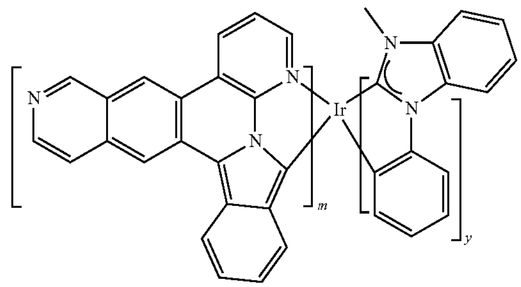
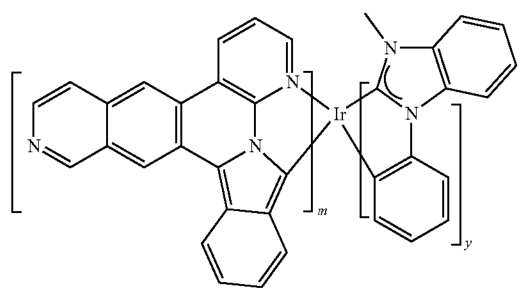
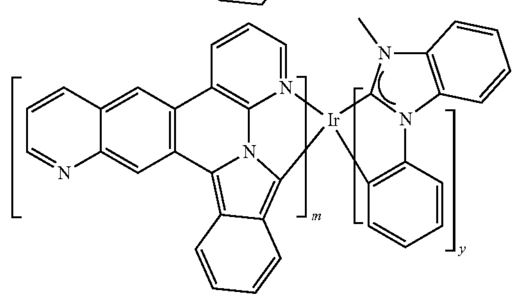
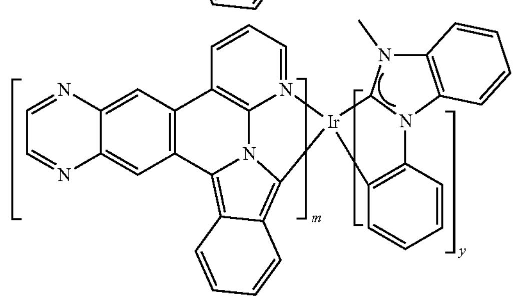
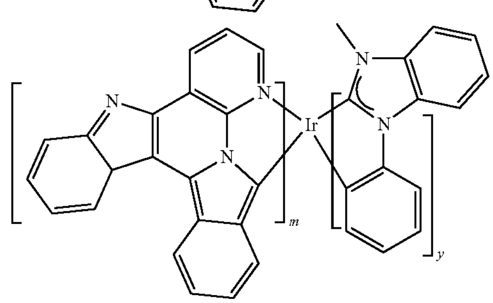

-continued
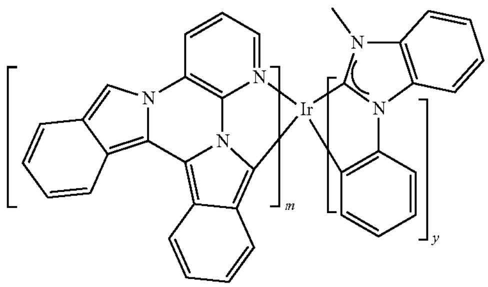
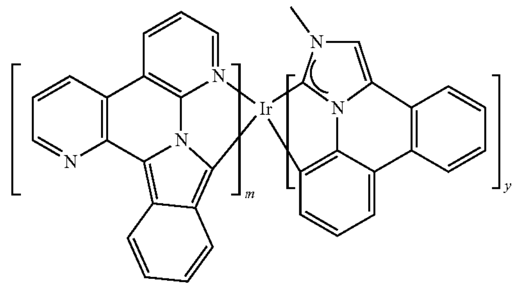
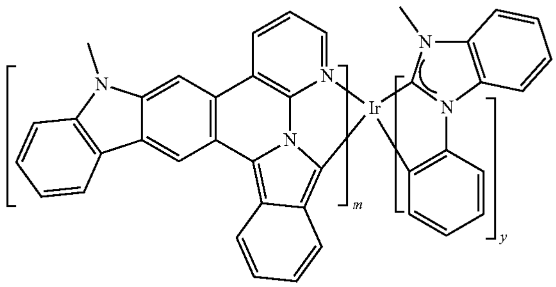
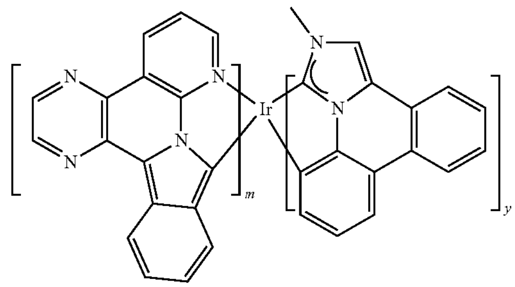
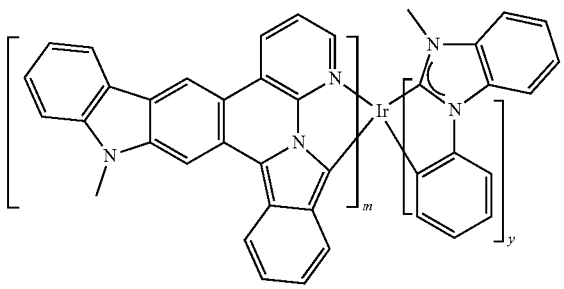
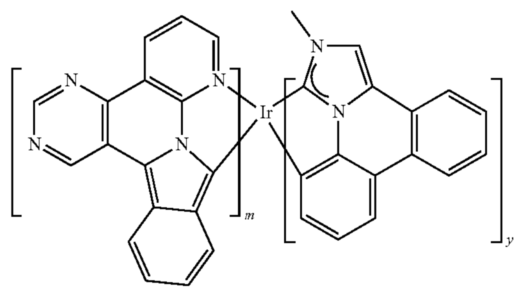
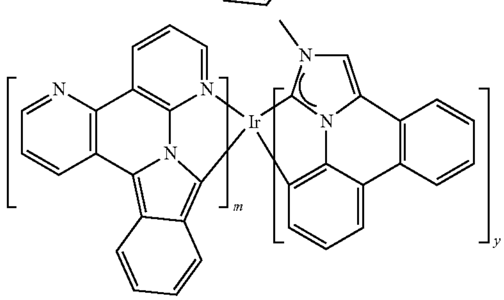
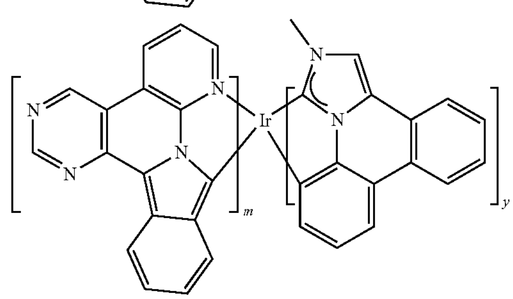
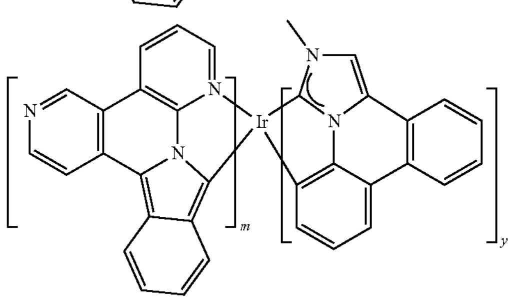
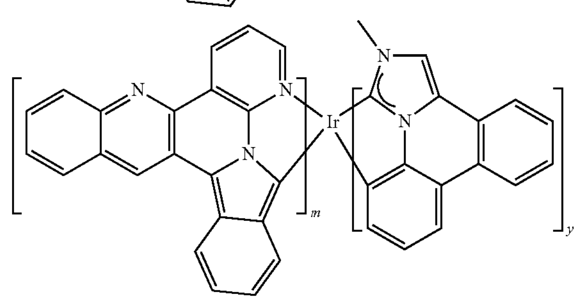
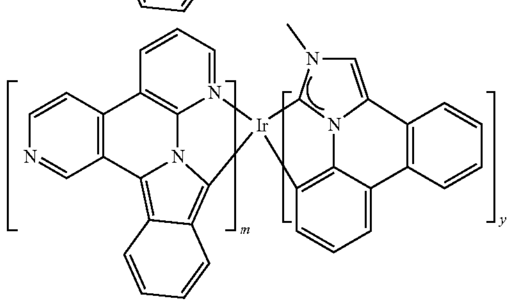
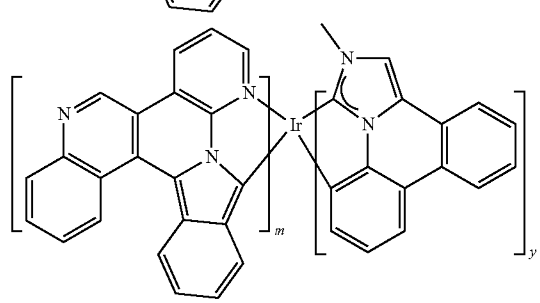
-continued -continued
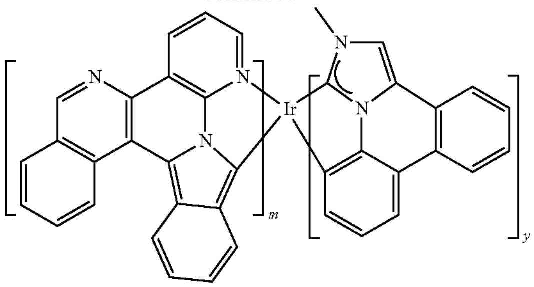
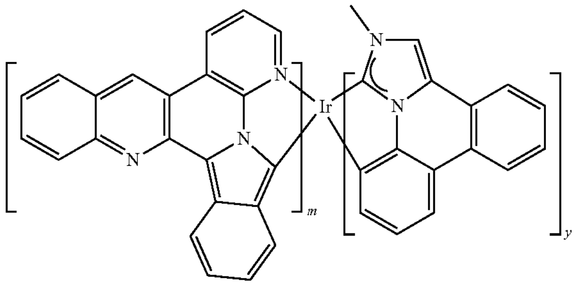
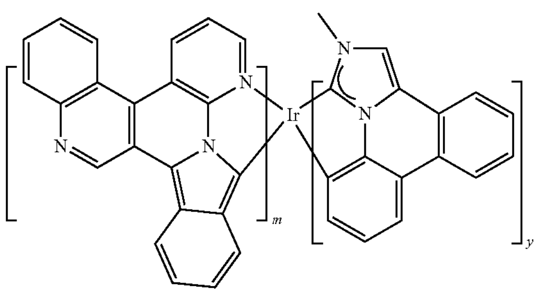
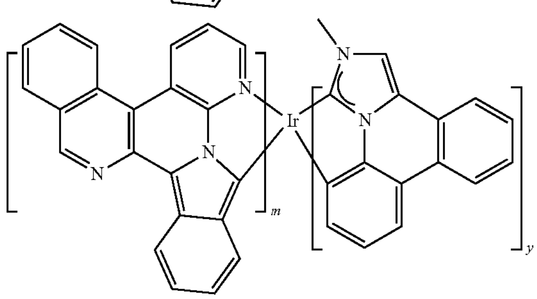
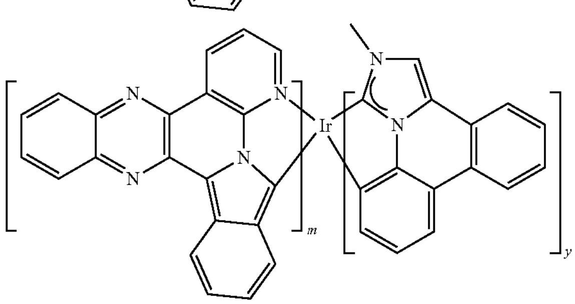
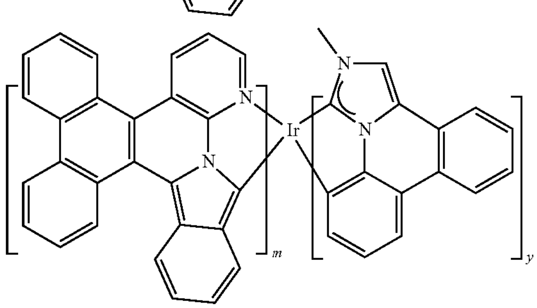
-continued
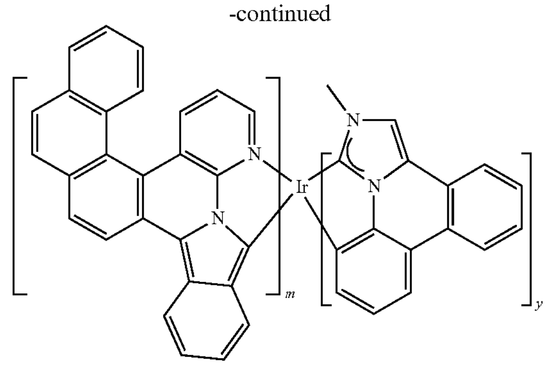
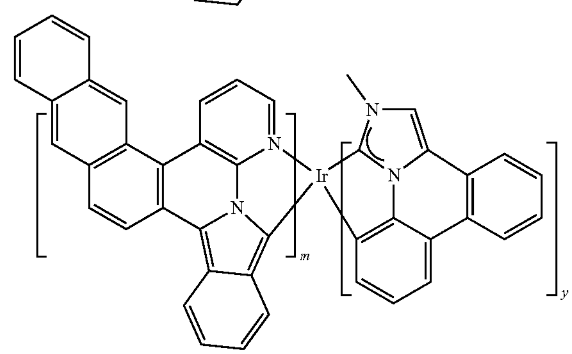
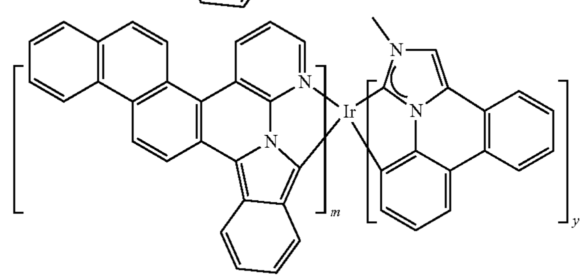
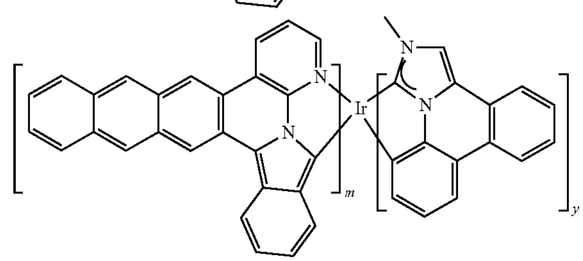
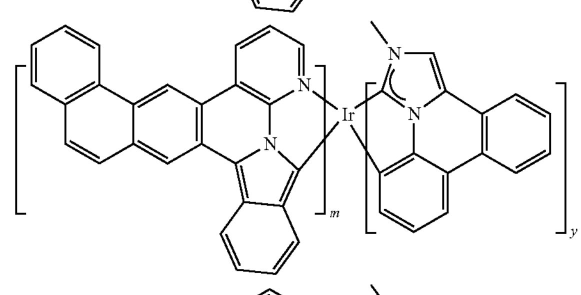
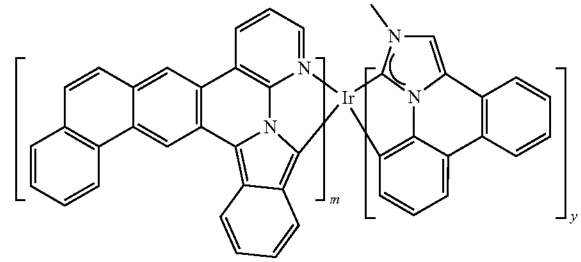

-continued
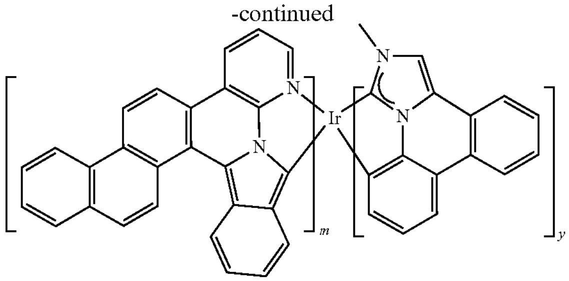
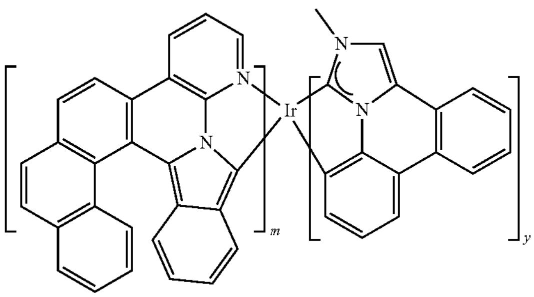
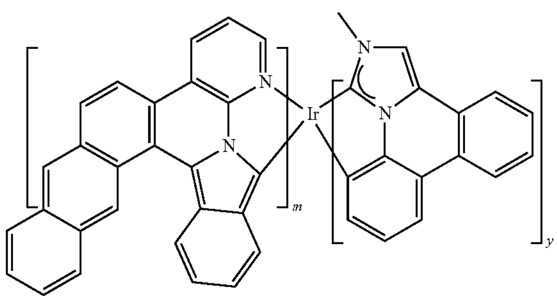
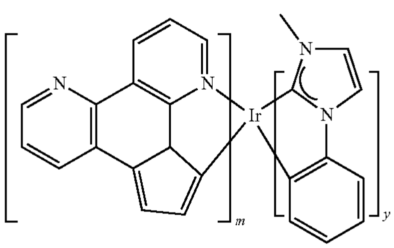
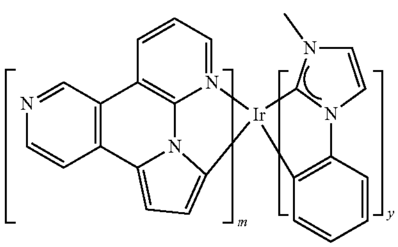
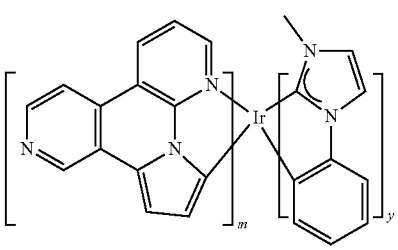
-continued
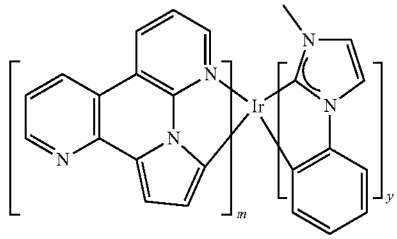
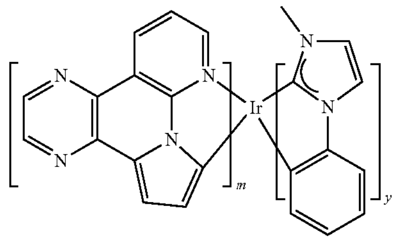
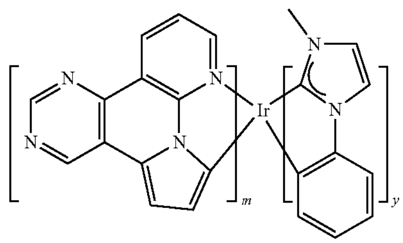
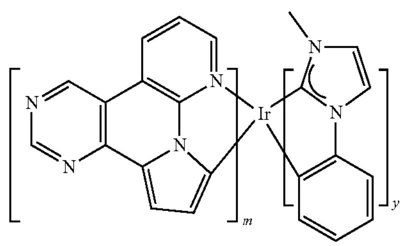
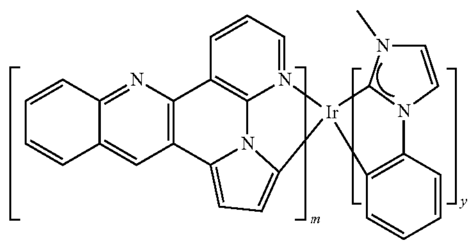
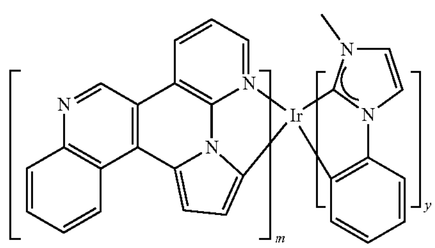
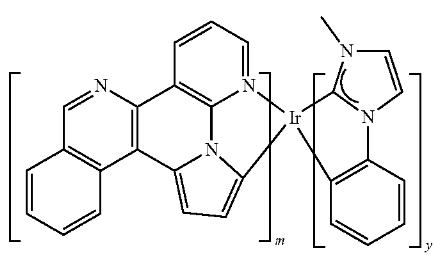

-continued
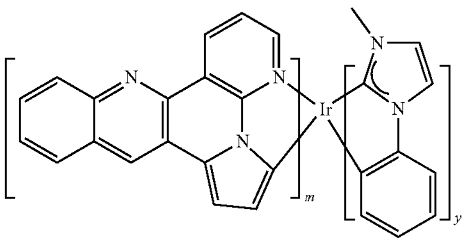
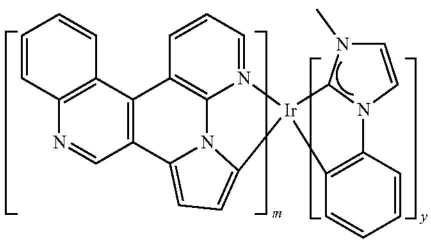
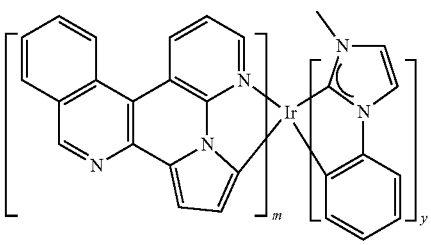
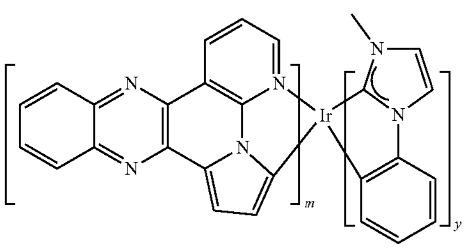
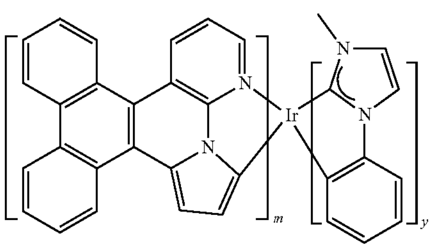
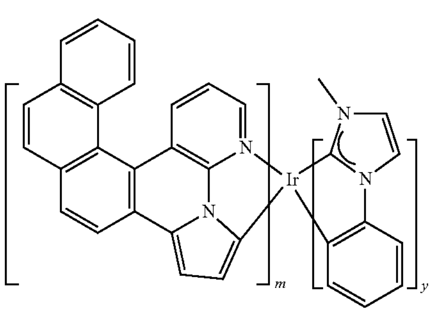
-continued
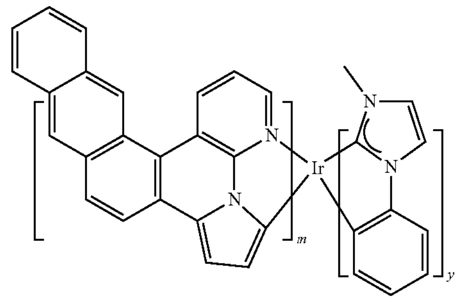
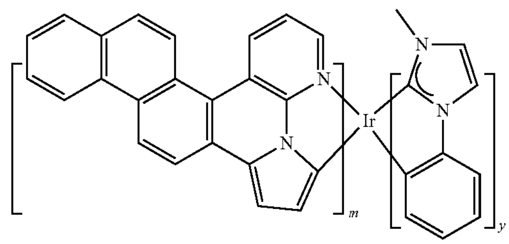
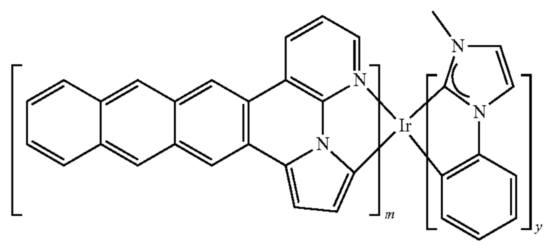
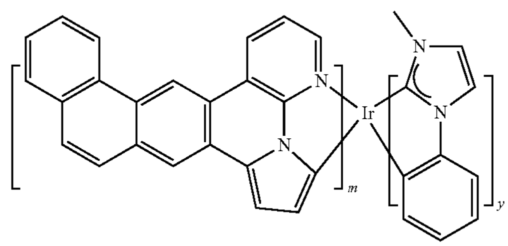
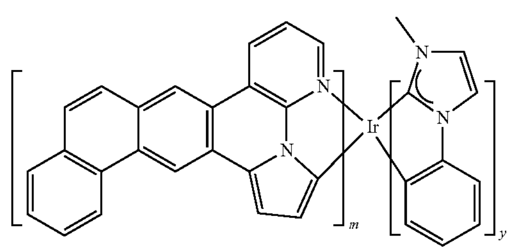
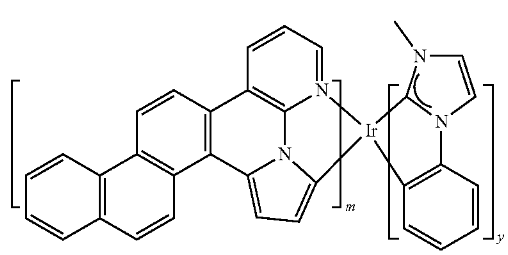

-continued
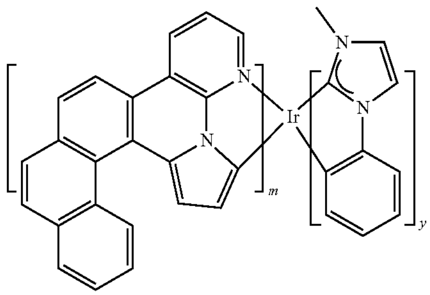
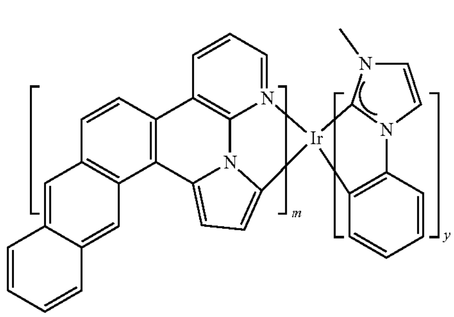
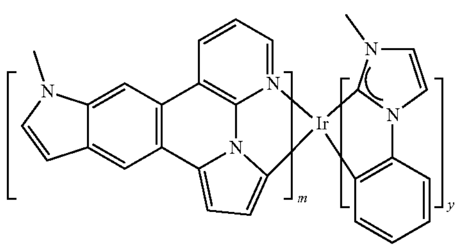
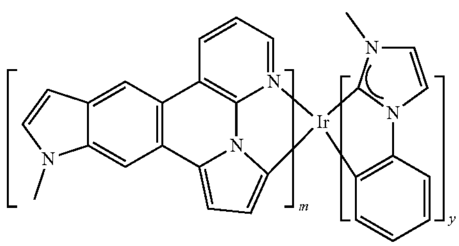
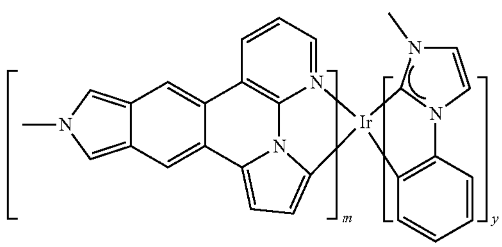
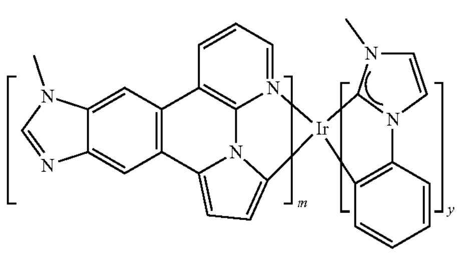
-continued
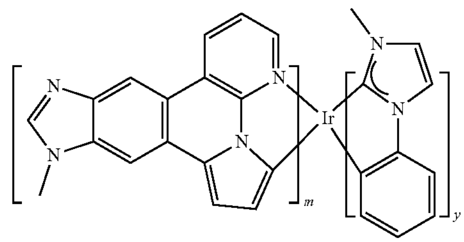
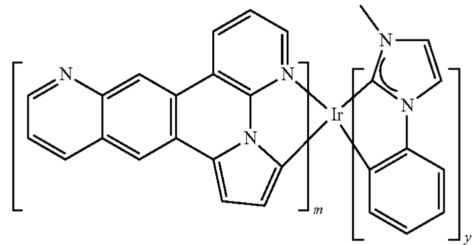
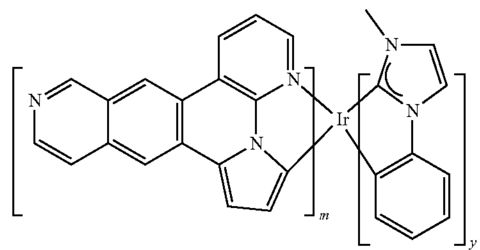
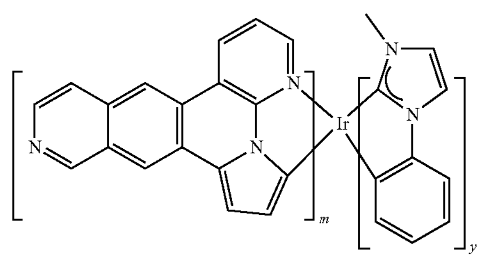
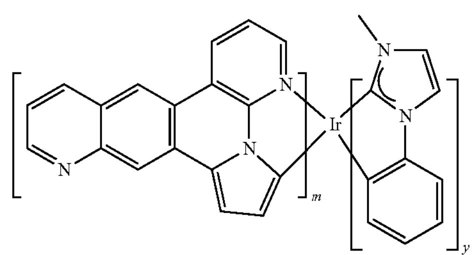
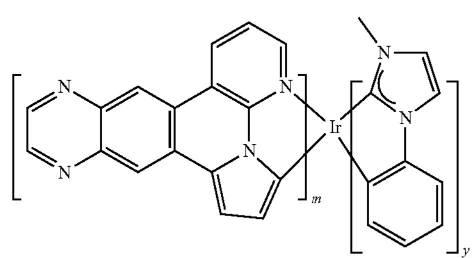

-continued
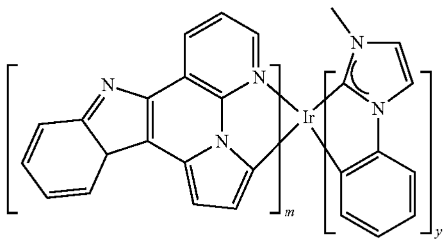
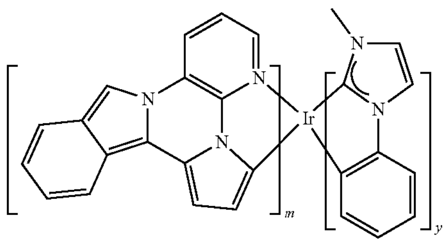
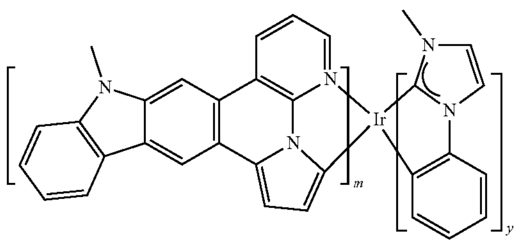
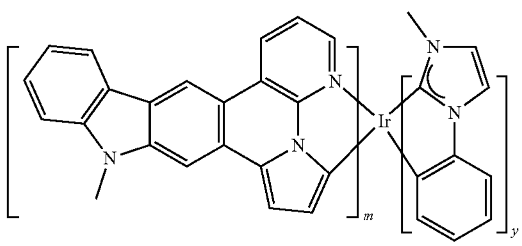
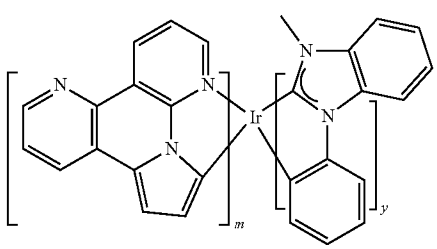
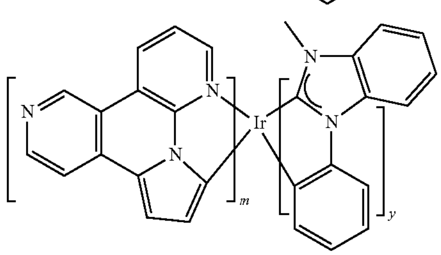
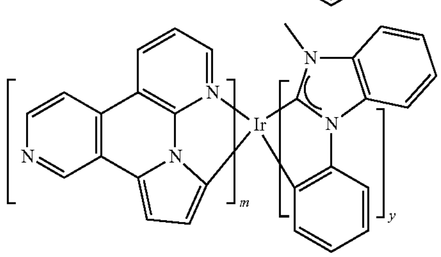
-continued
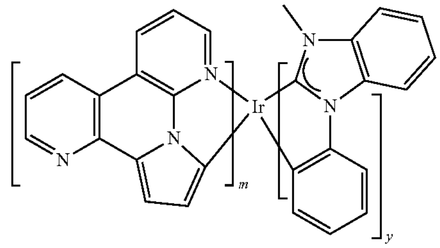
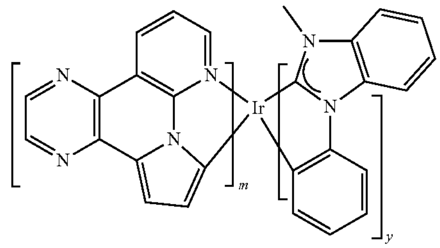
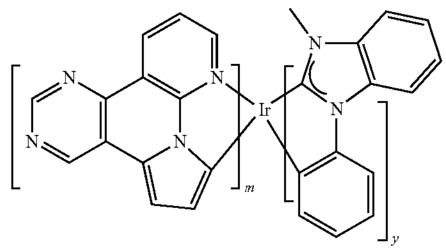
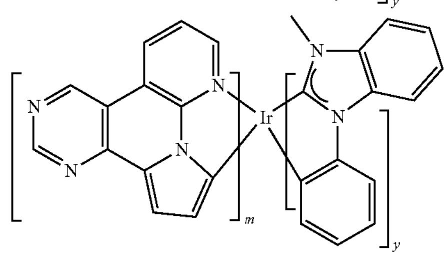
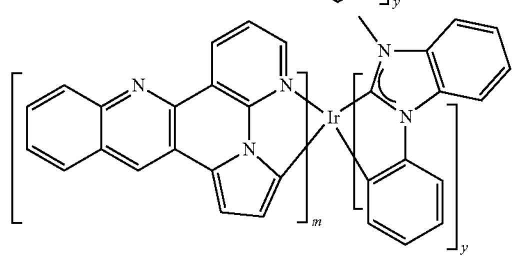
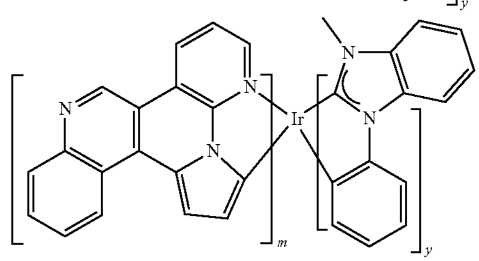
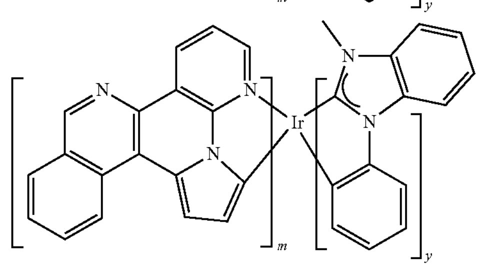

-continued
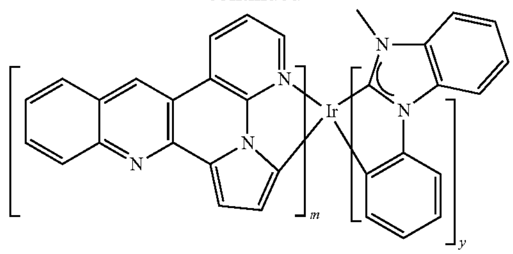
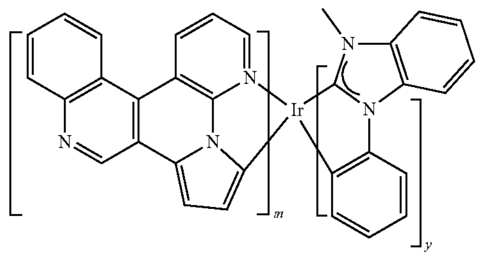
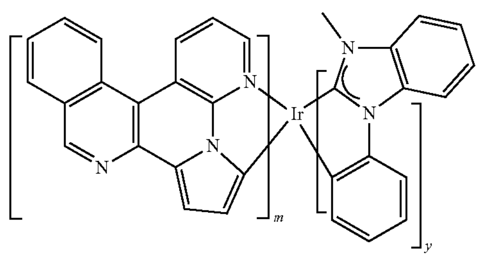
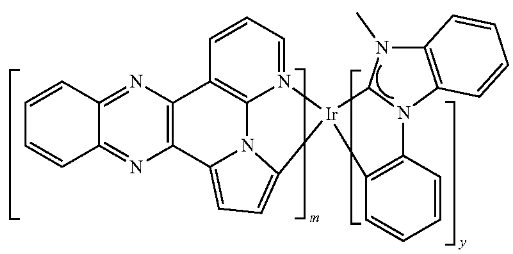
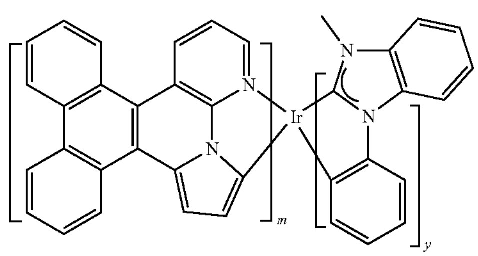
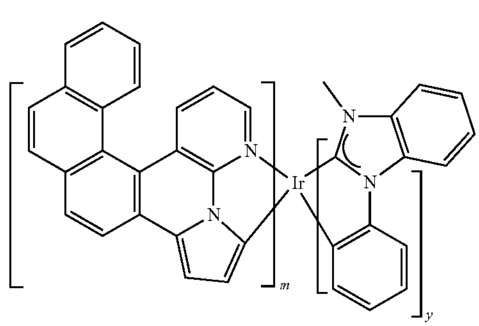
-continued
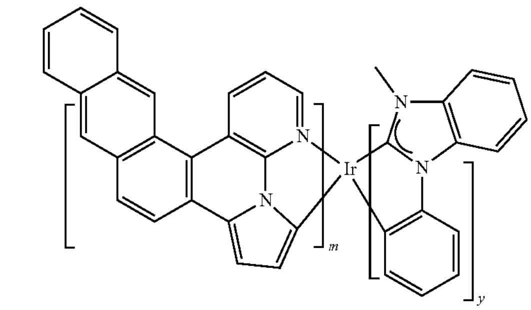
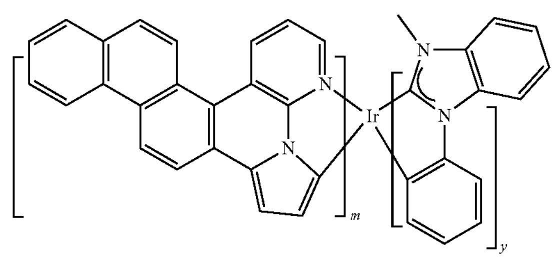
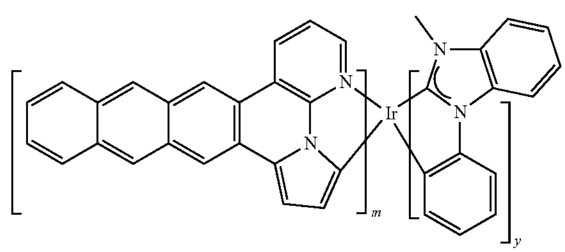
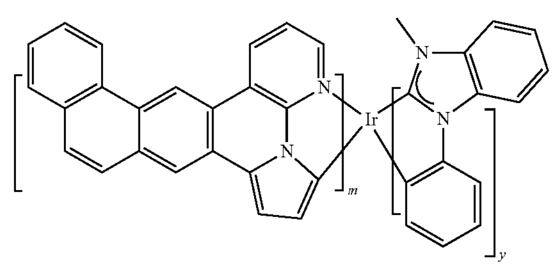
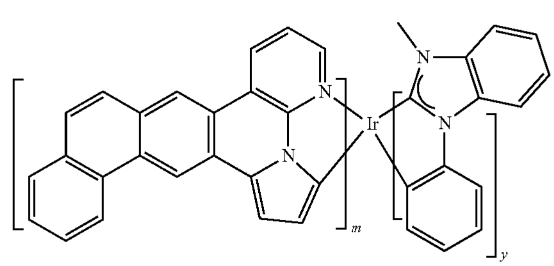
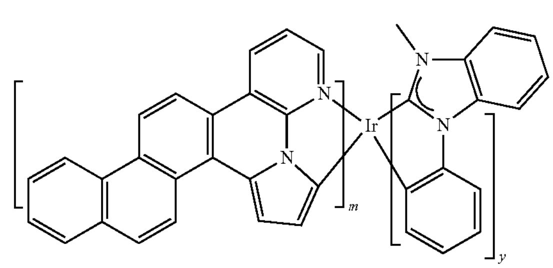

-continued
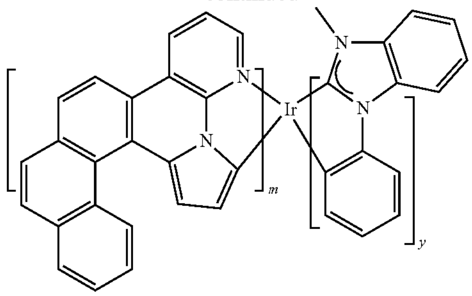
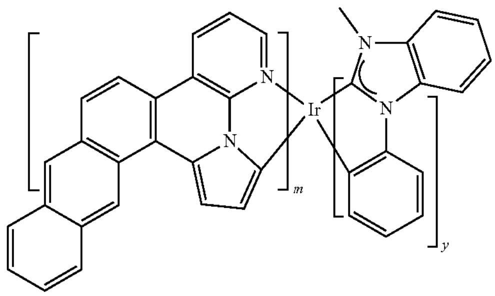
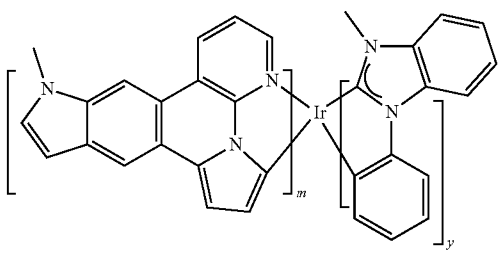
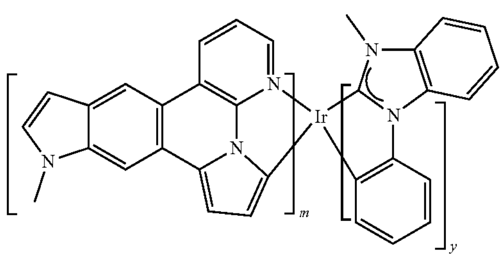
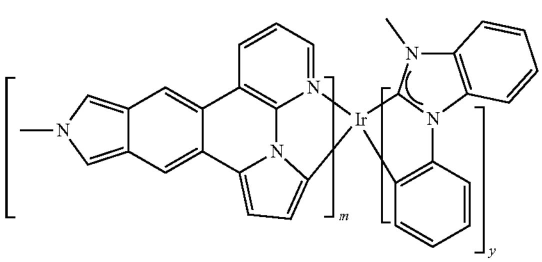
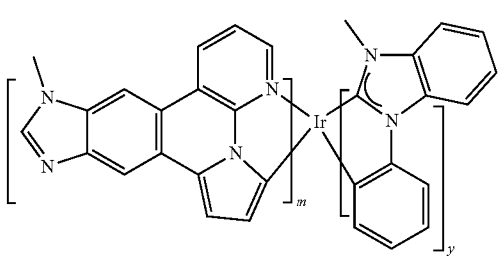
-continued
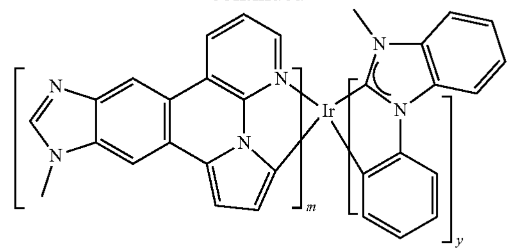
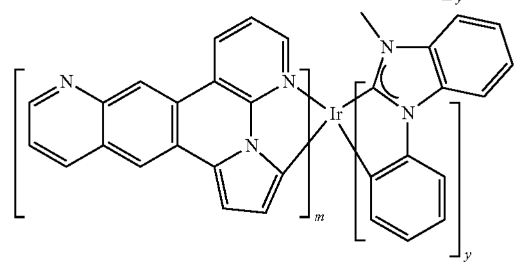
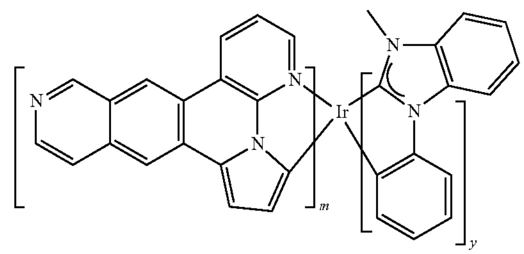
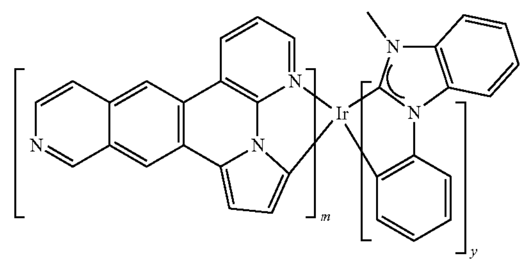
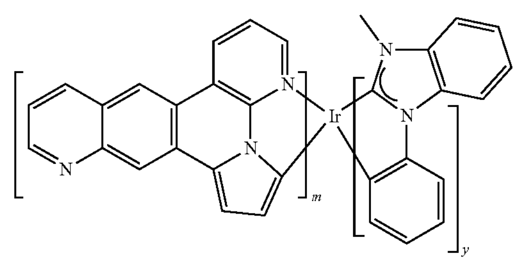
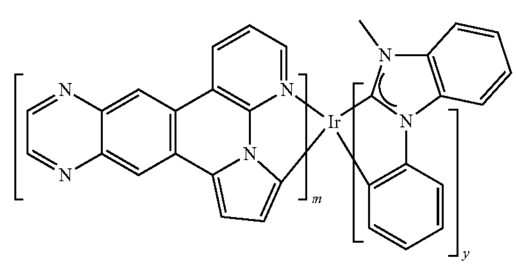

-continued
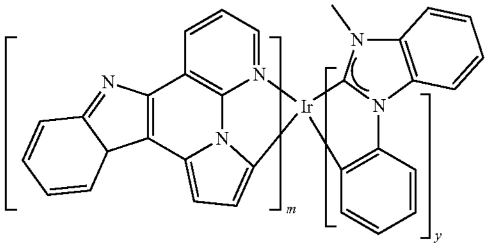
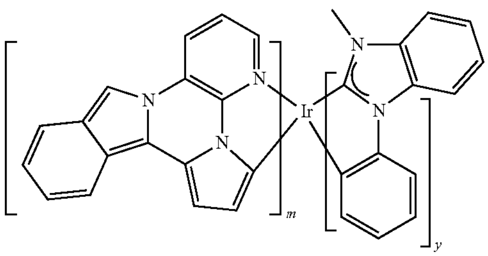
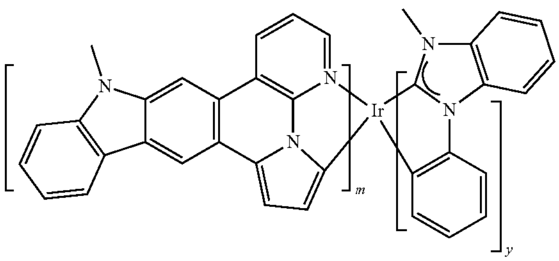
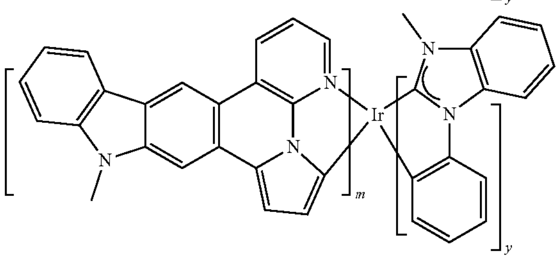
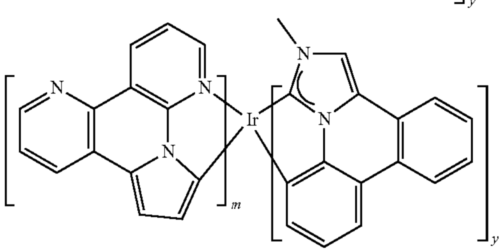
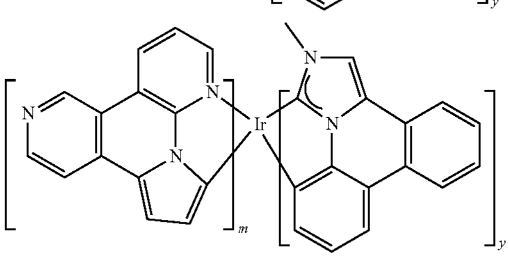
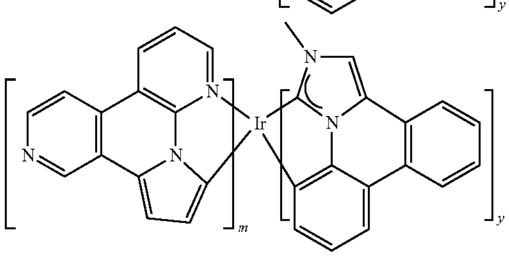
-continued
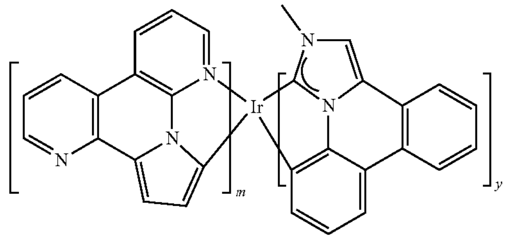
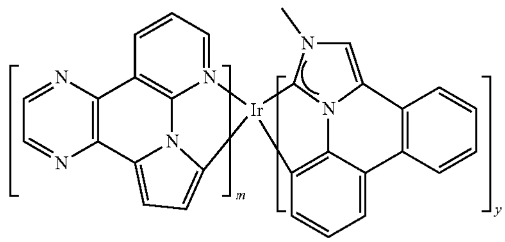
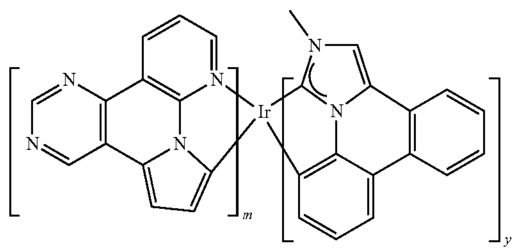
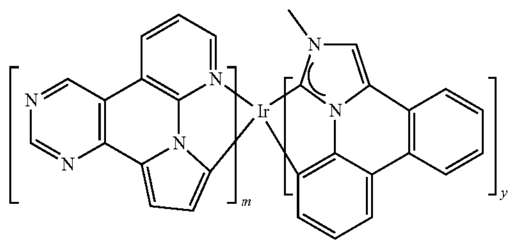
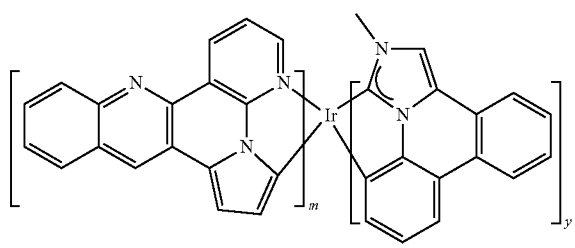
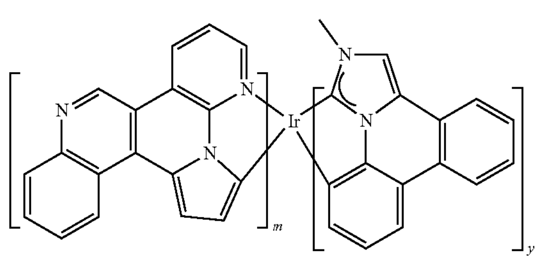
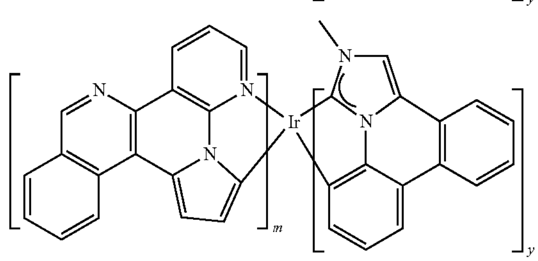

-continued
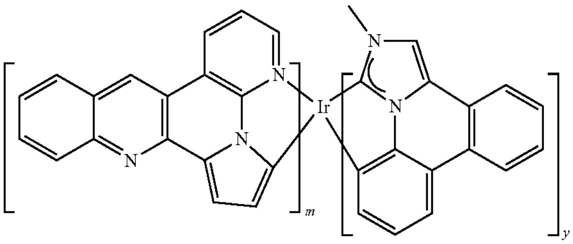
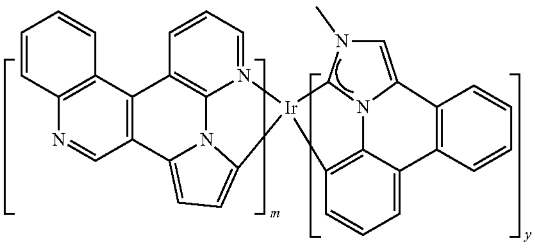
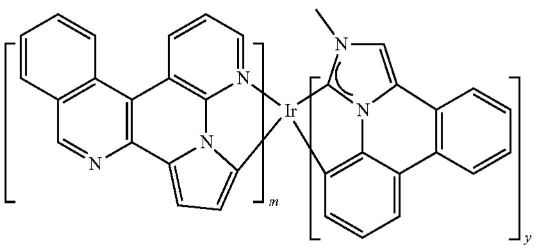
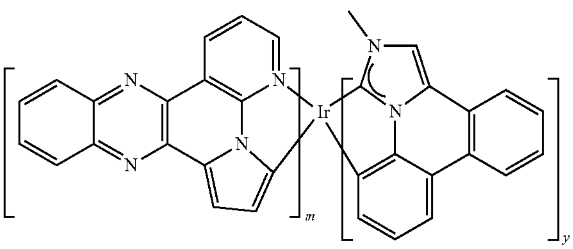
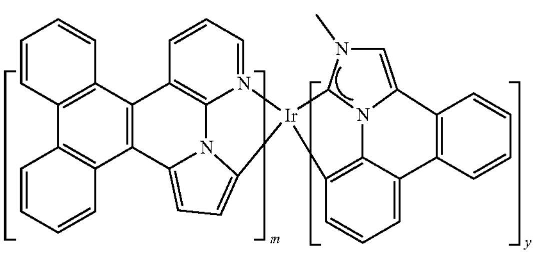
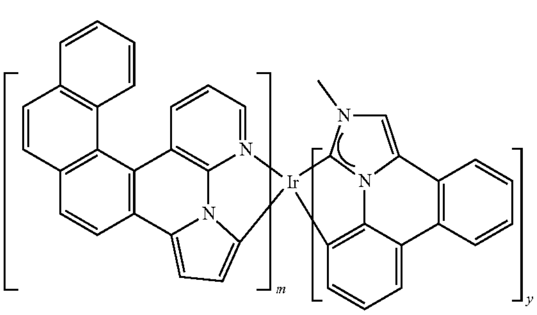
-continued
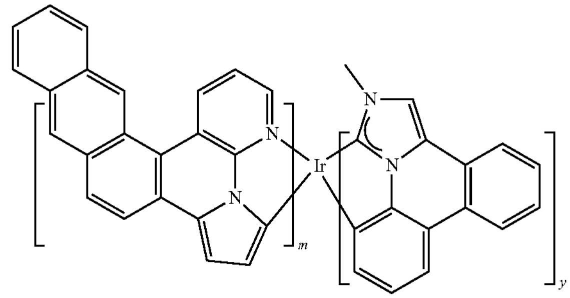
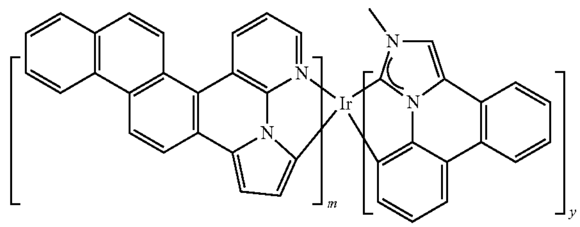
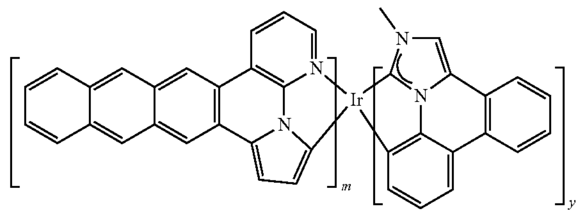
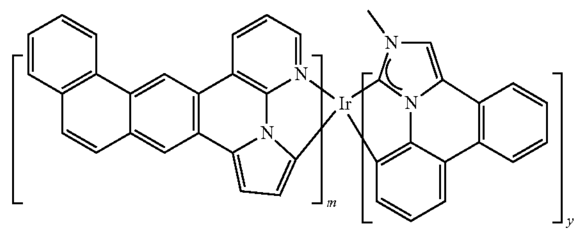
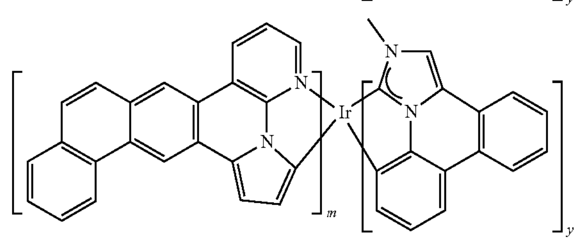
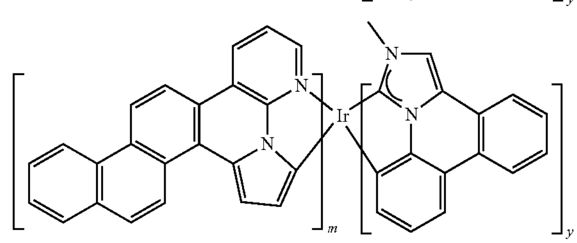
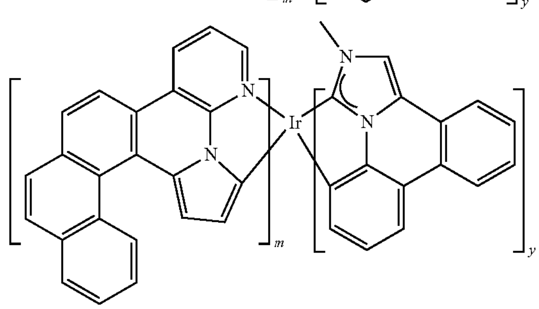

-continued
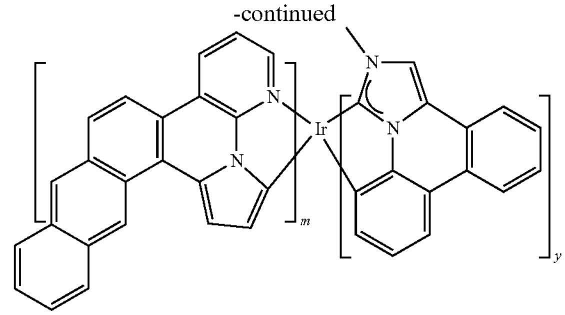
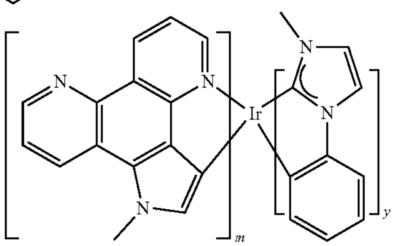
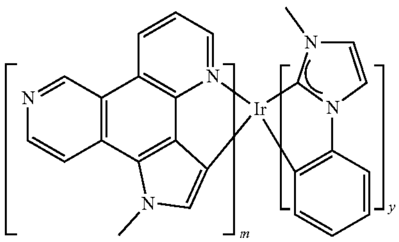
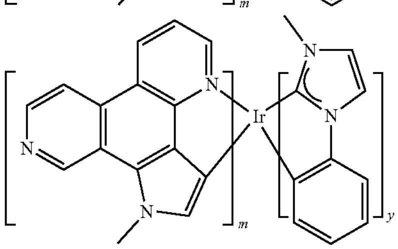
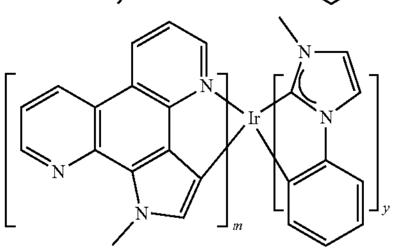
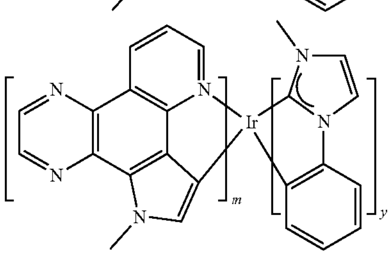
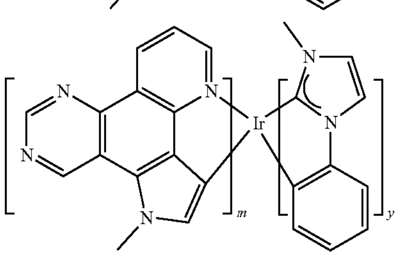
-continued
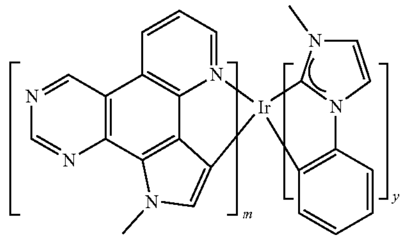
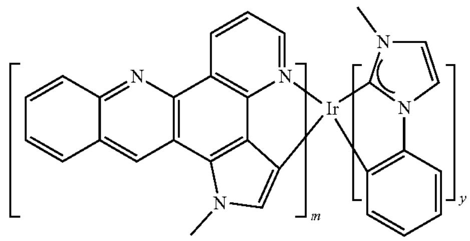
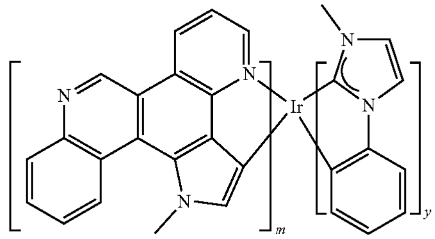
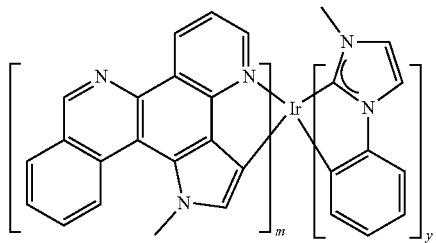
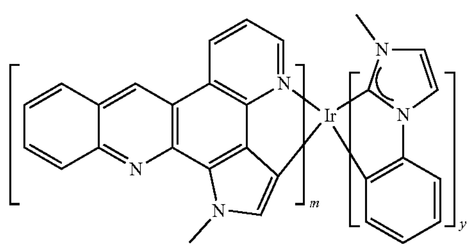
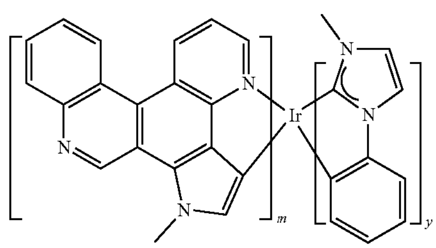
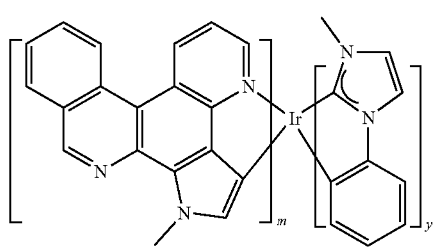

-continued
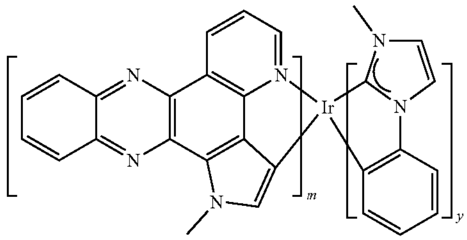
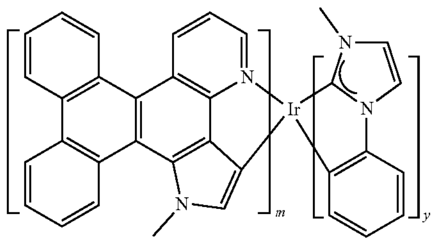
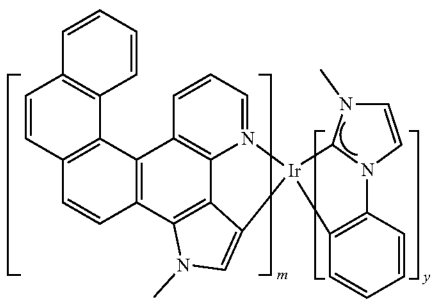
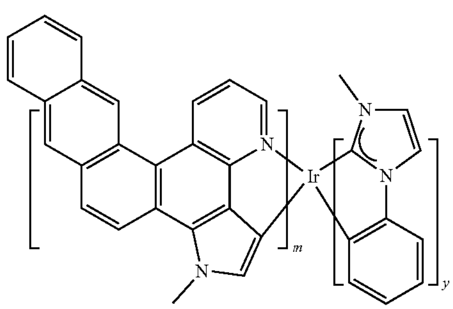
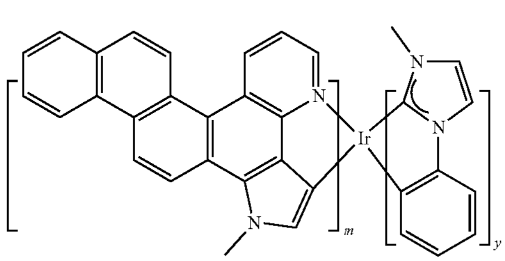
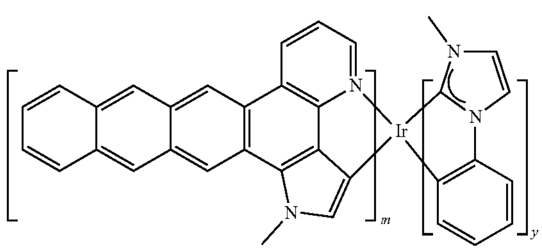
-continued
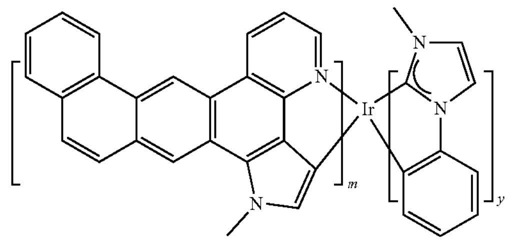
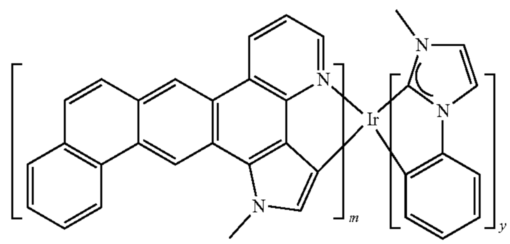
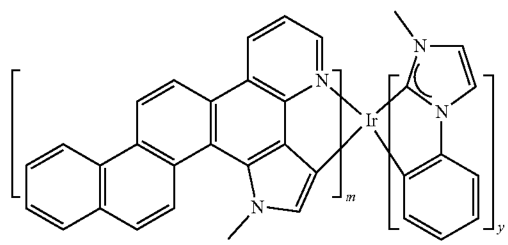
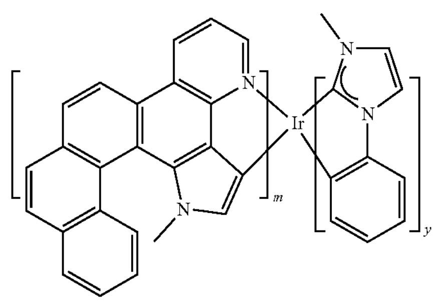
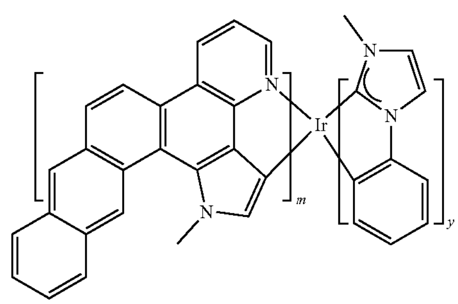
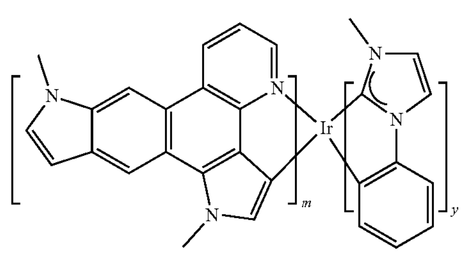

-continued
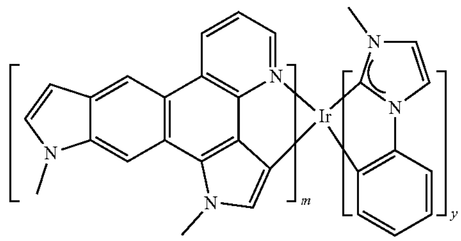
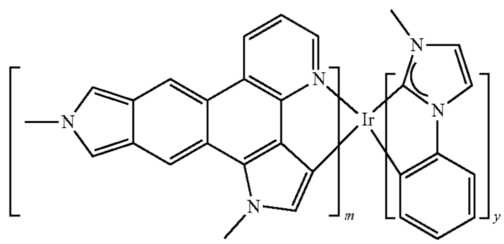
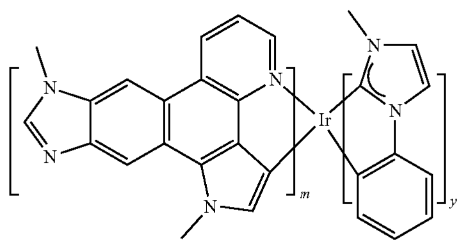
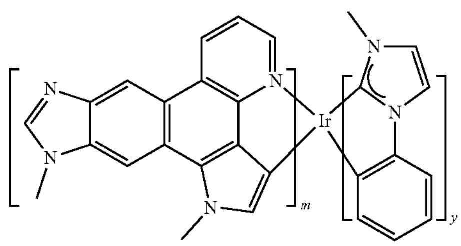
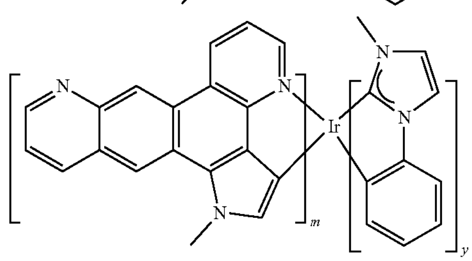
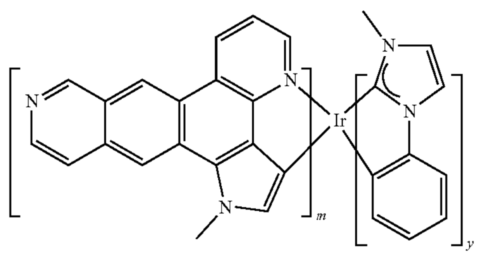
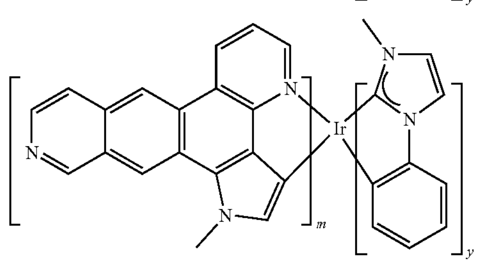
-continued
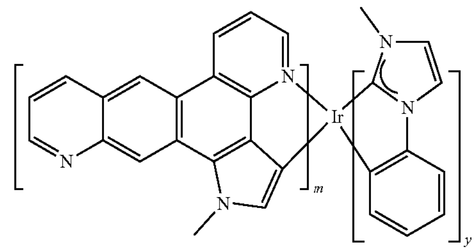
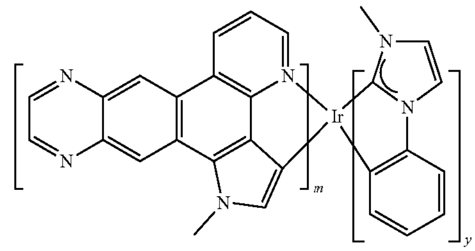
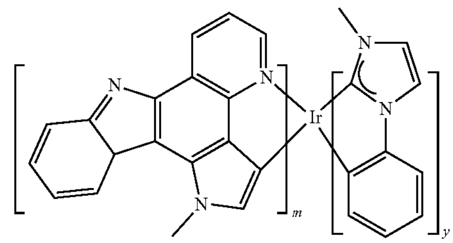
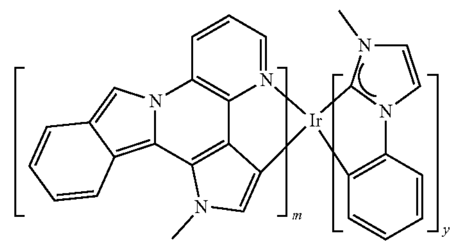
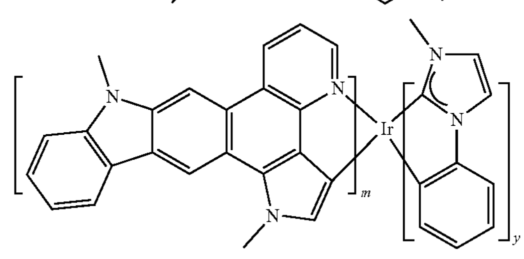
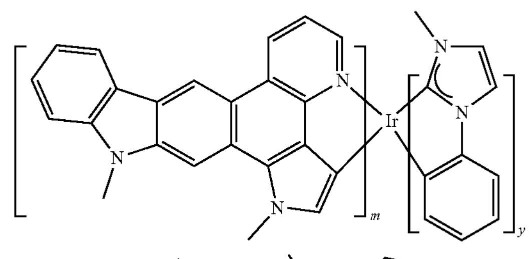
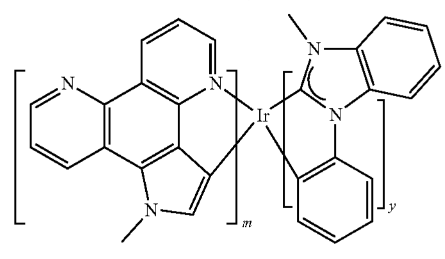

-continued
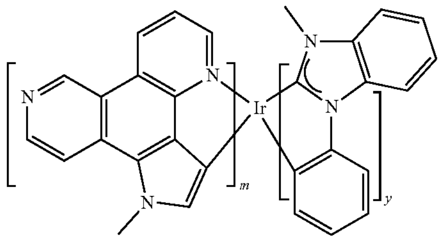
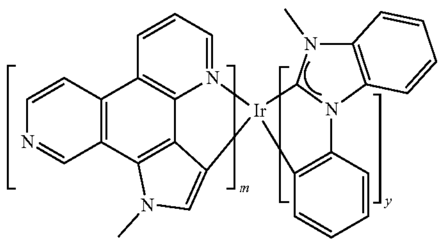
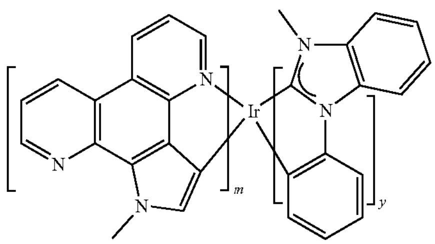
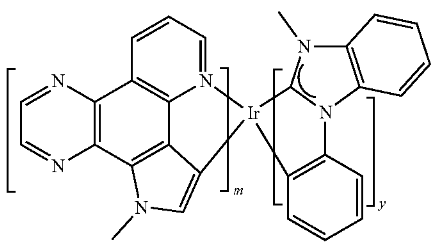
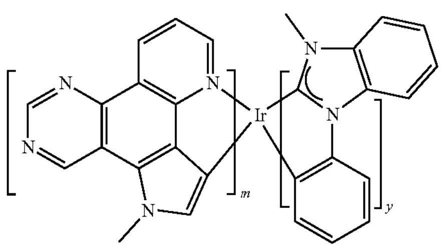
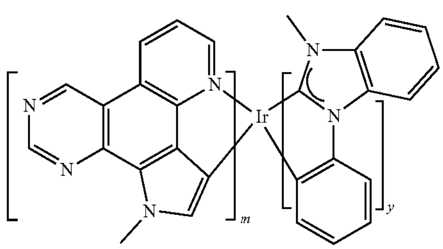
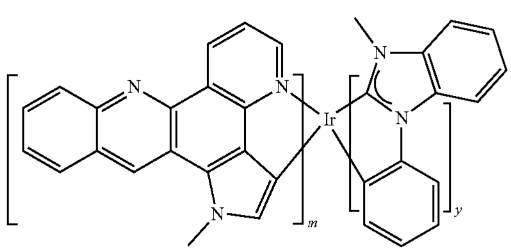
-continued
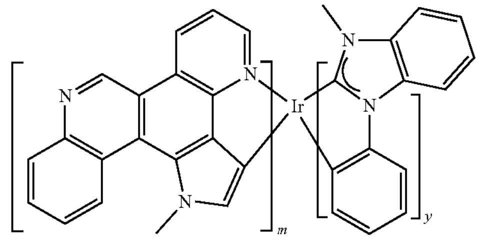
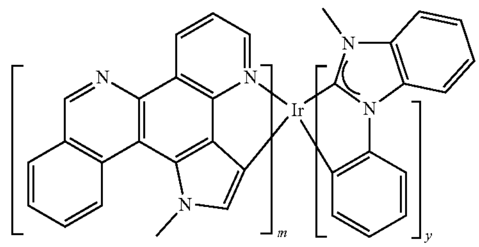
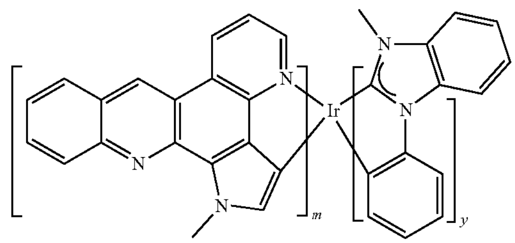
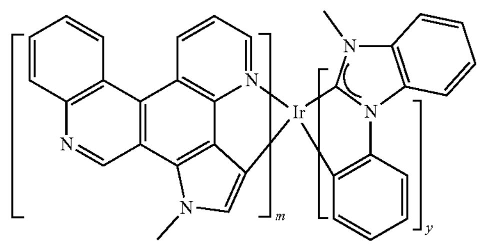
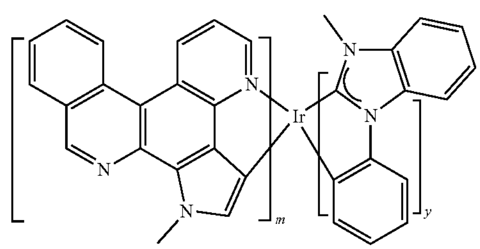
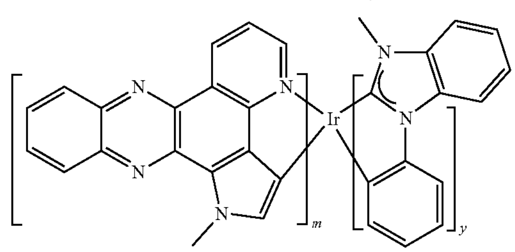
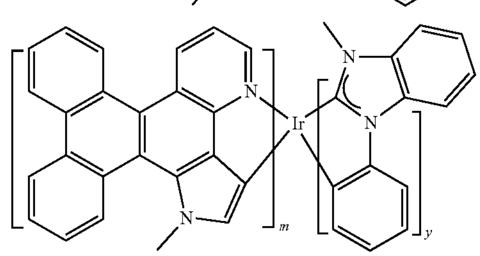

-continued
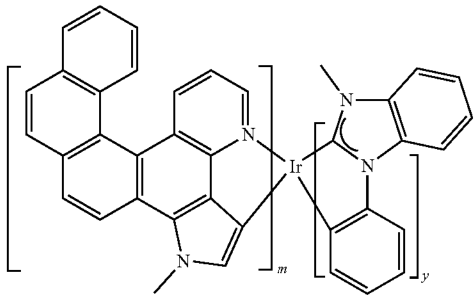
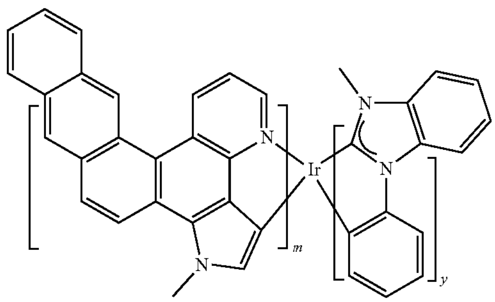
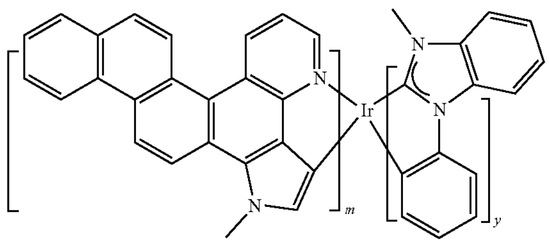
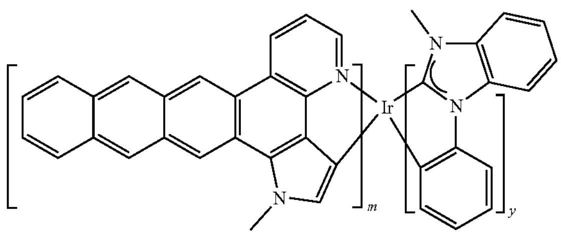
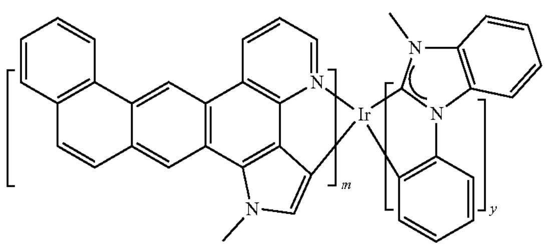
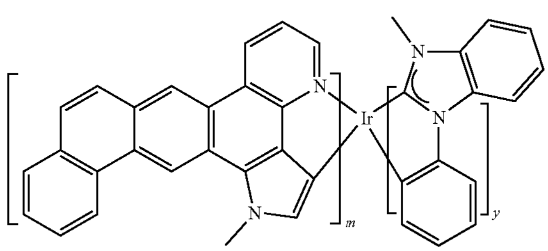
-continued
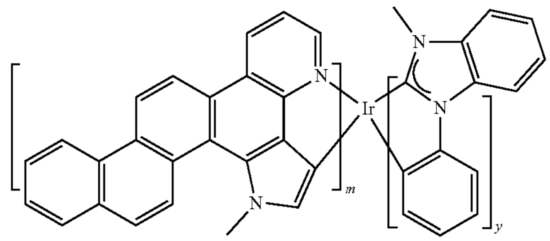
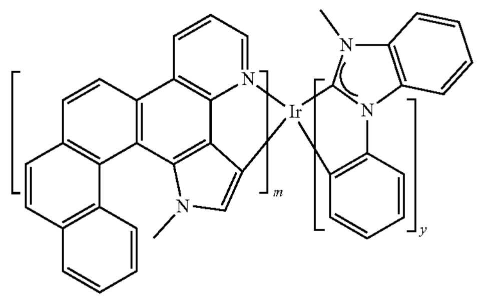
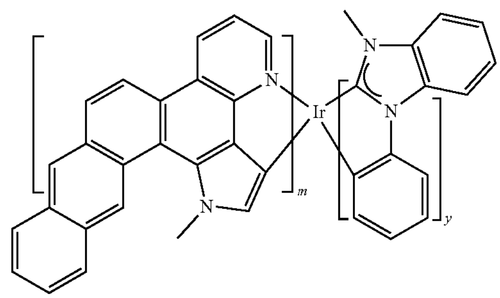
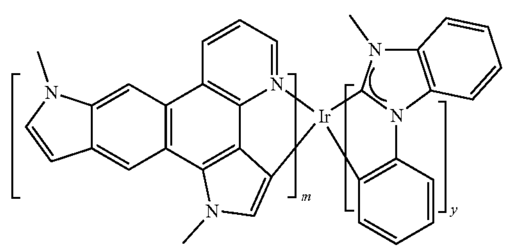
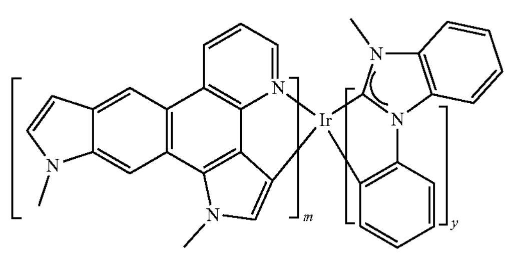
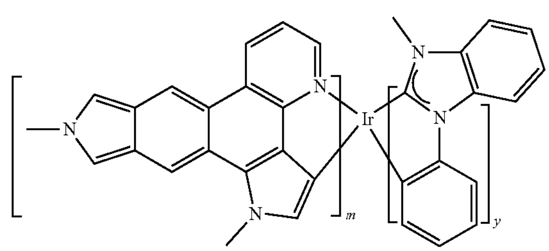

-continued
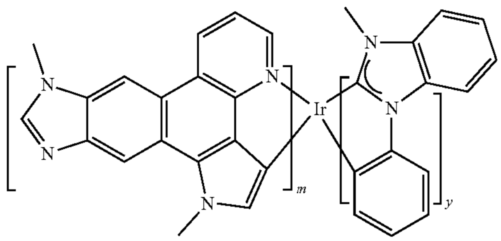
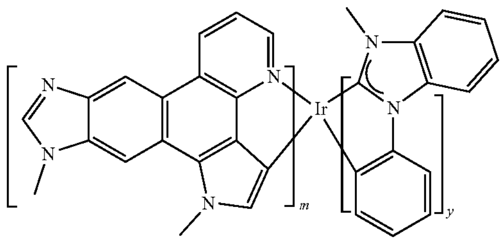
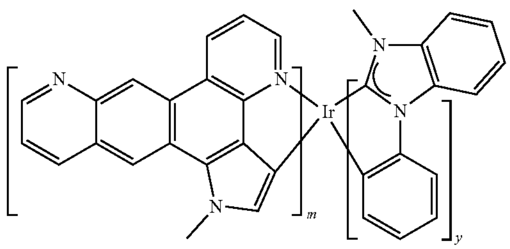
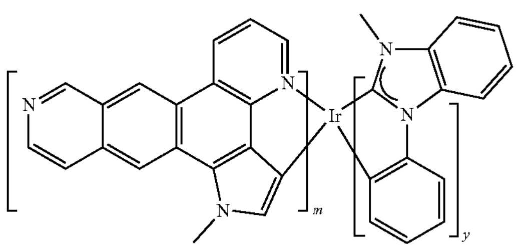
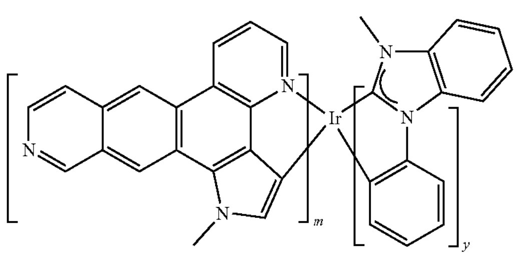
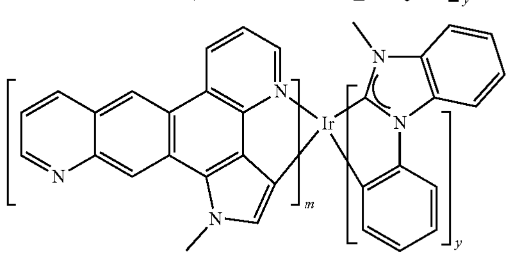
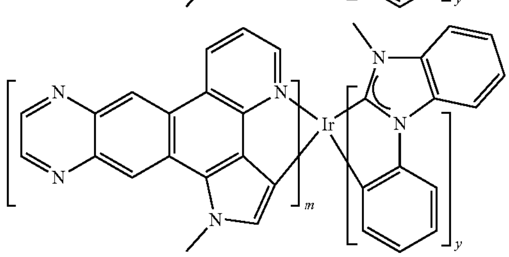
-continued
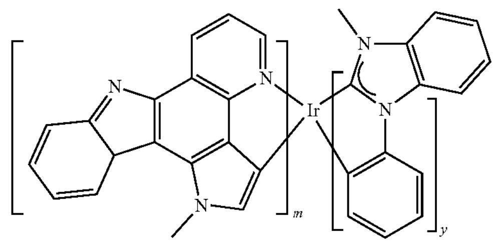
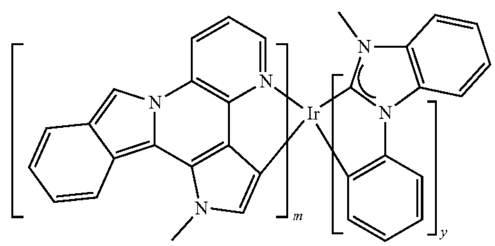
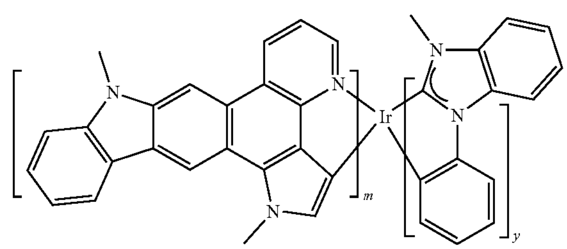
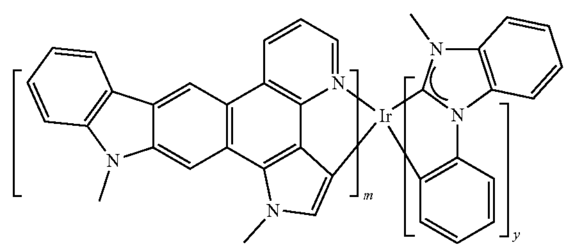
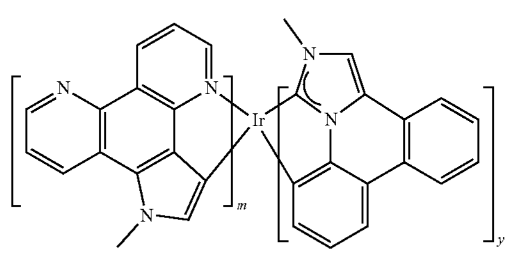
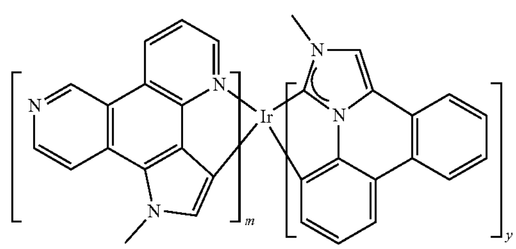
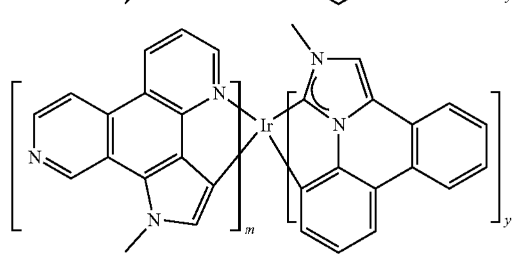

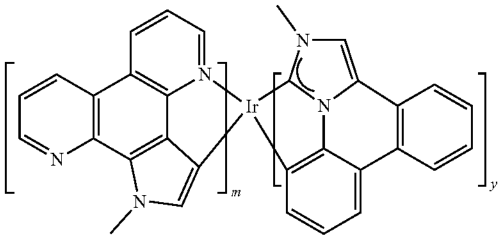
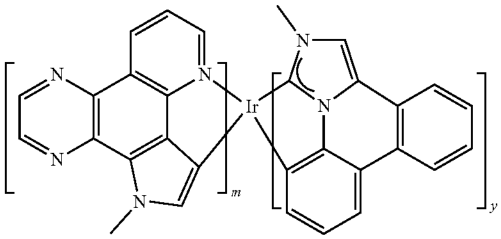
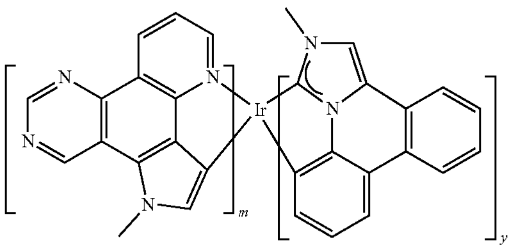
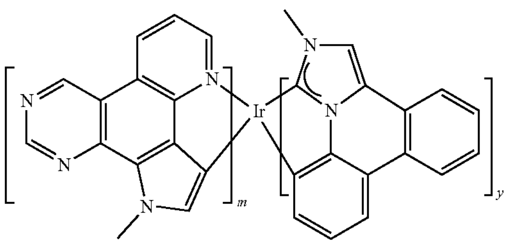
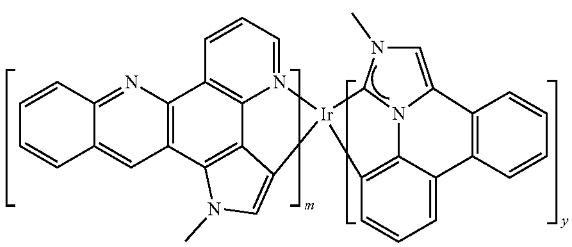
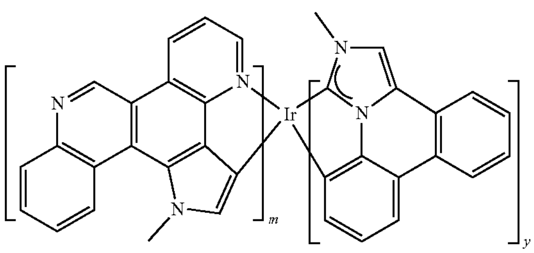
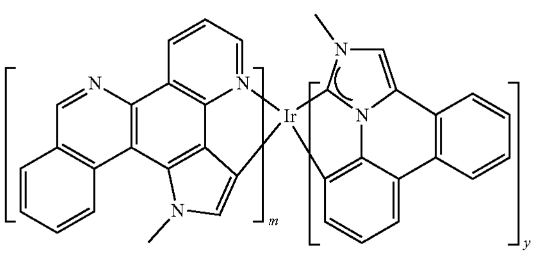
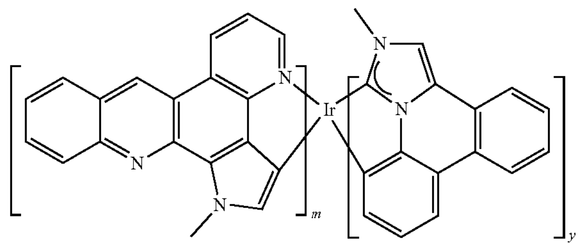
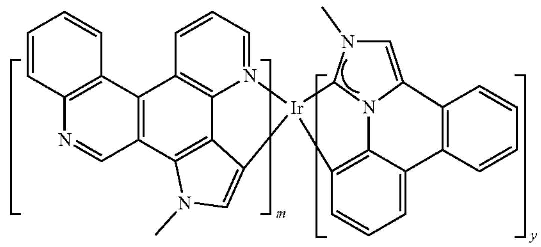
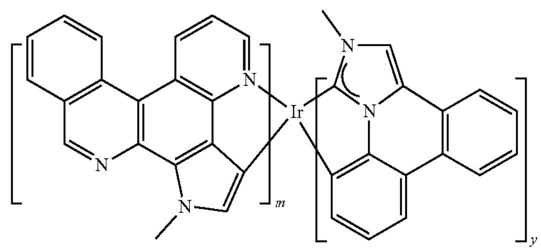
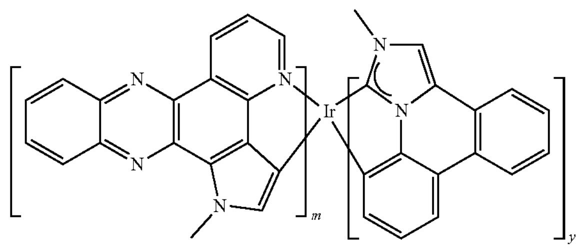
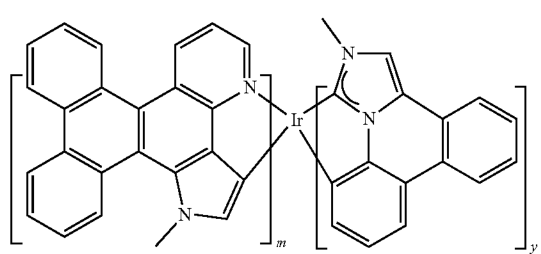
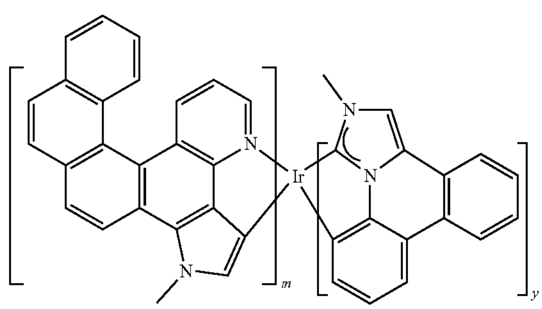

-continued
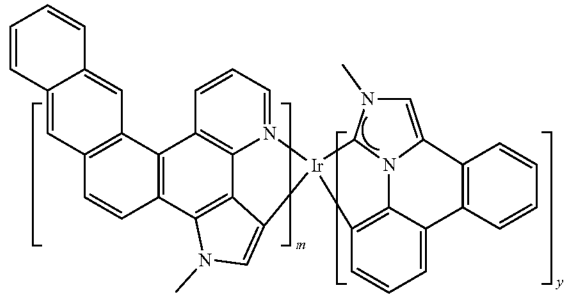
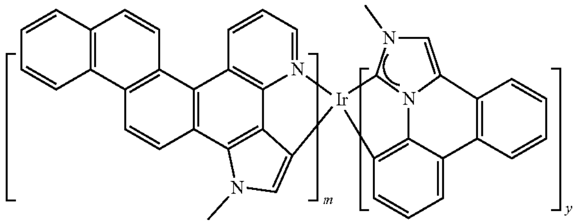
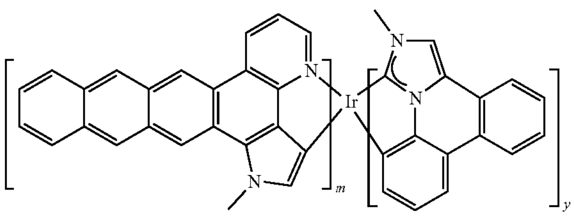
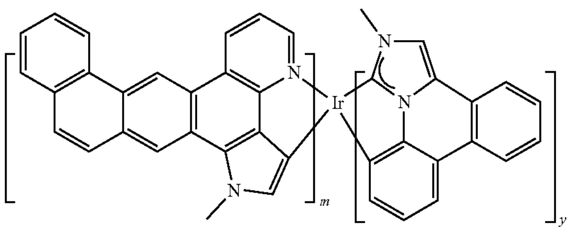
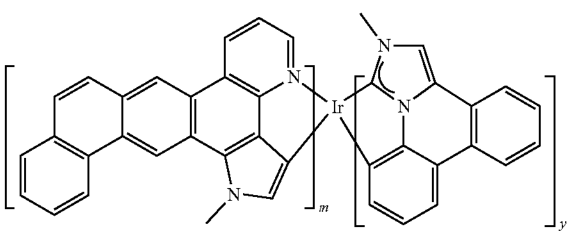
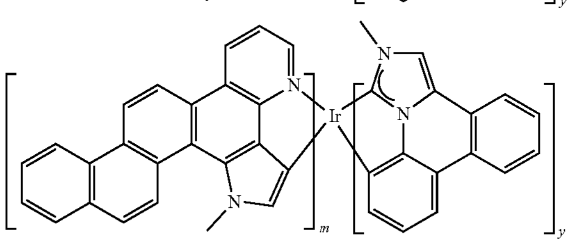
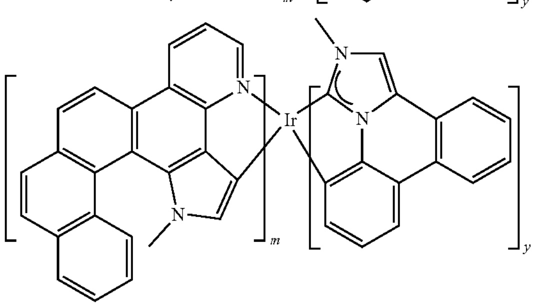
-continued
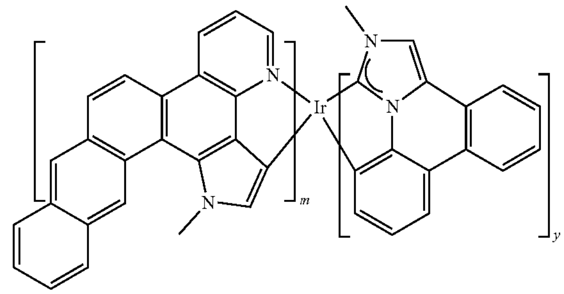
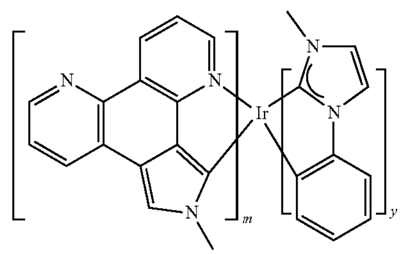
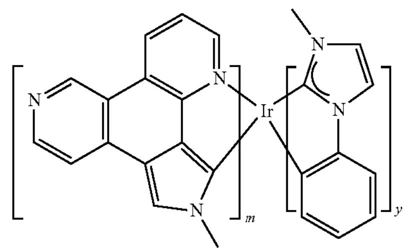
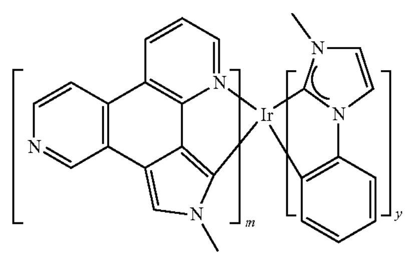
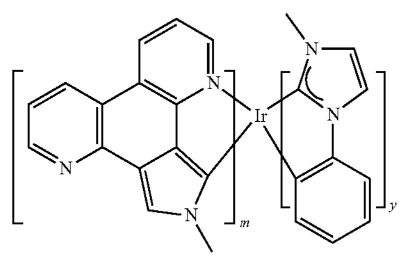
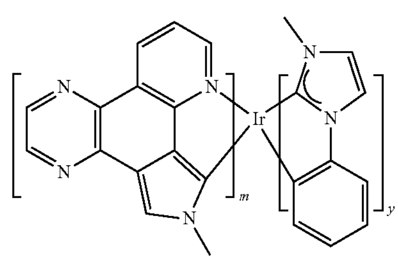

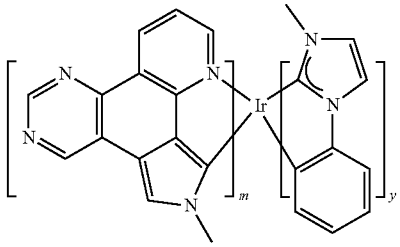
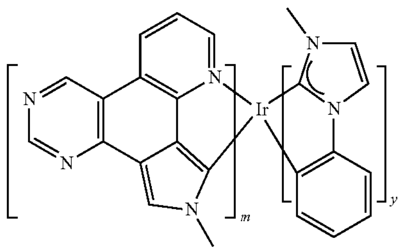
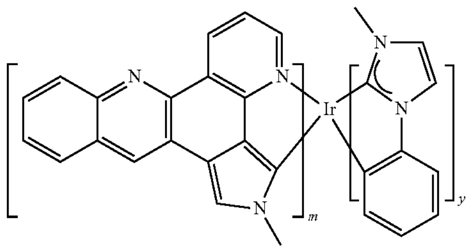
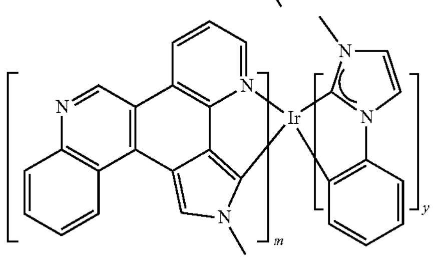
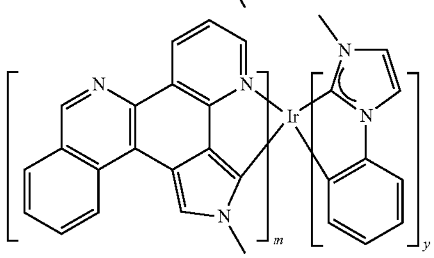
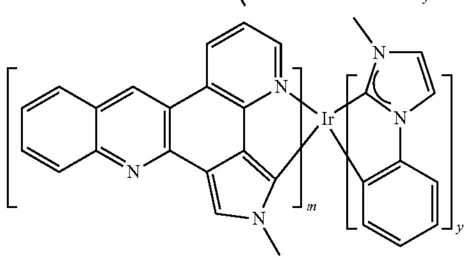
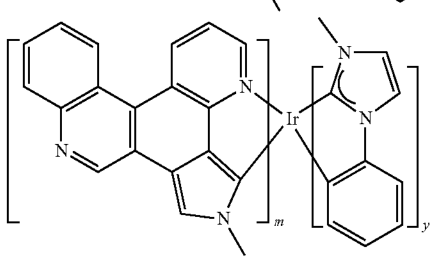
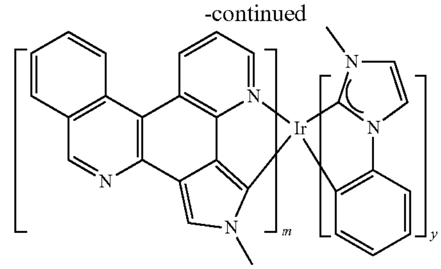
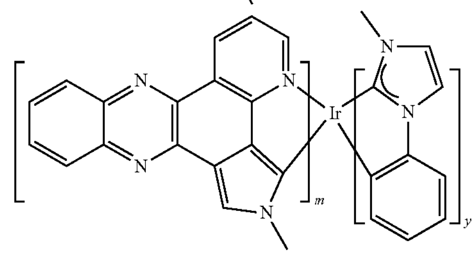
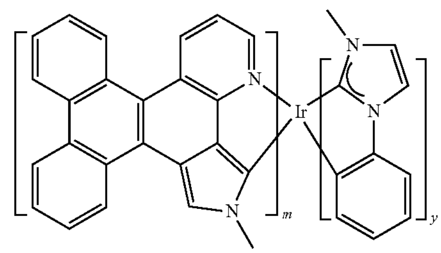
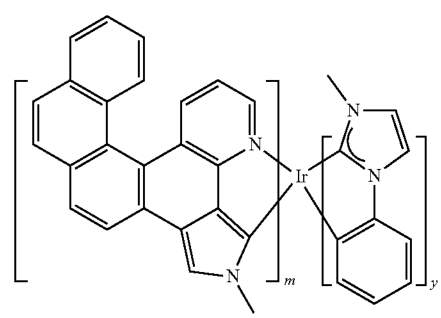
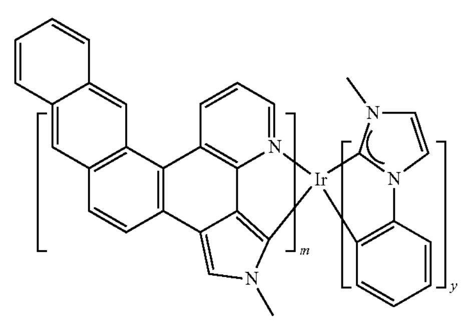
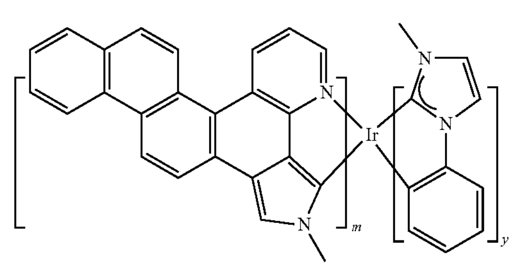

-continued
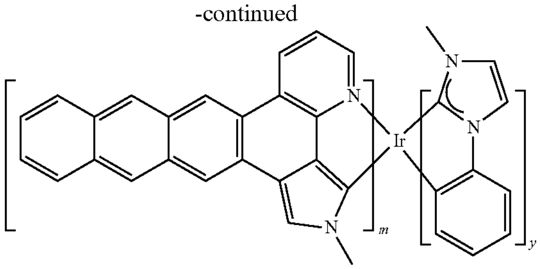
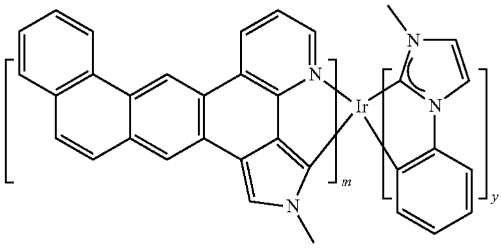
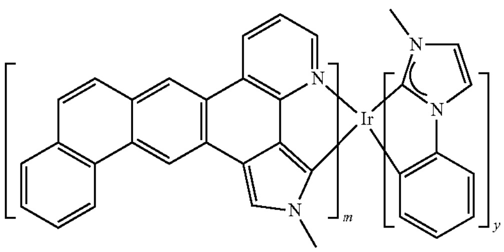
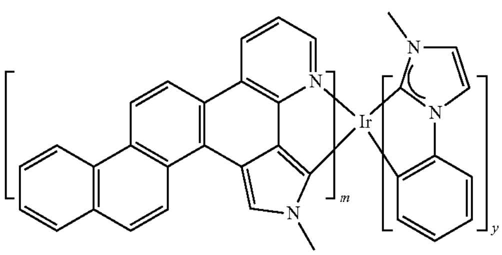
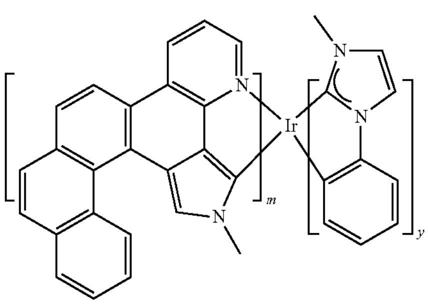
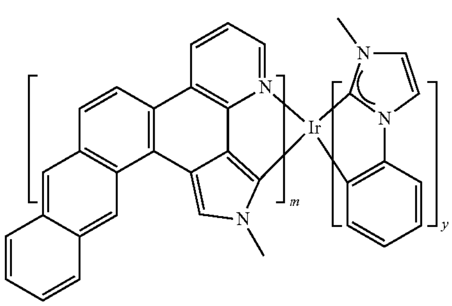
-continued
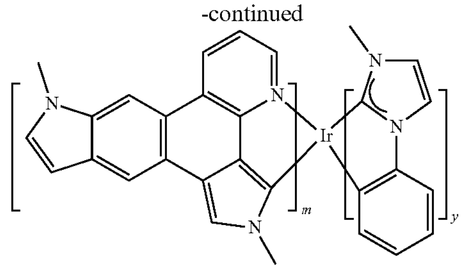
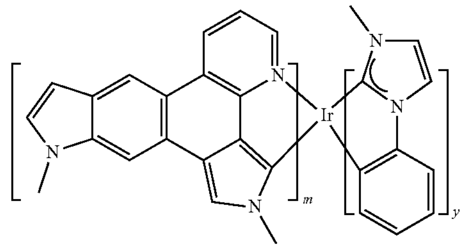
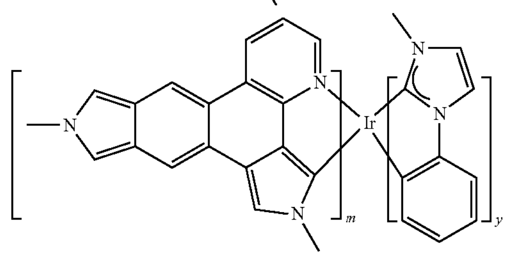
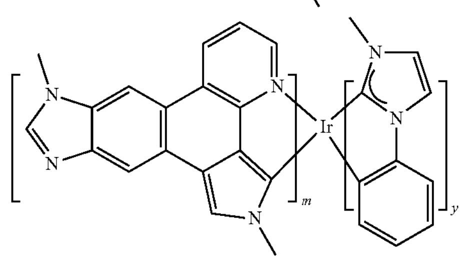
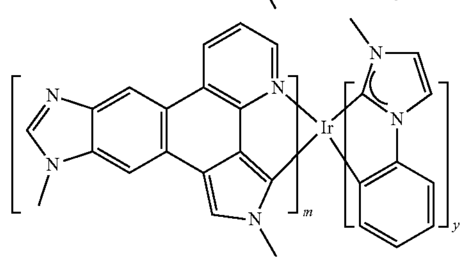
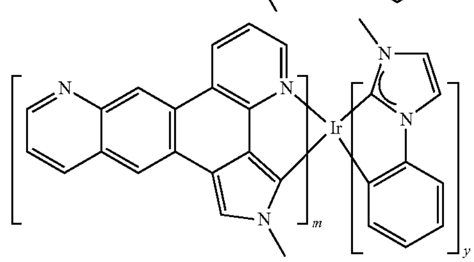
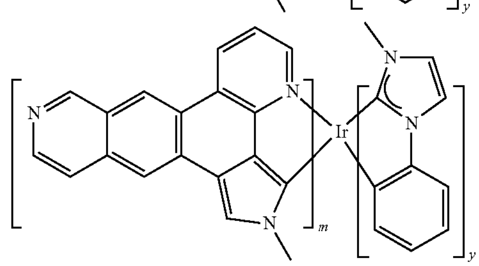

-continued
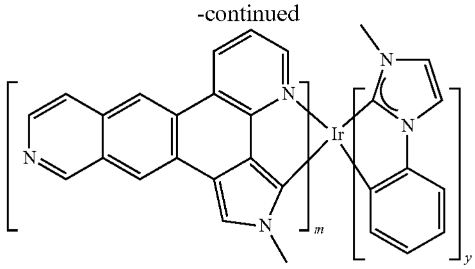
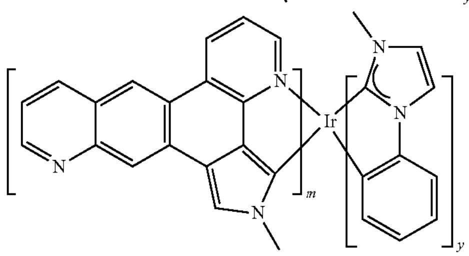
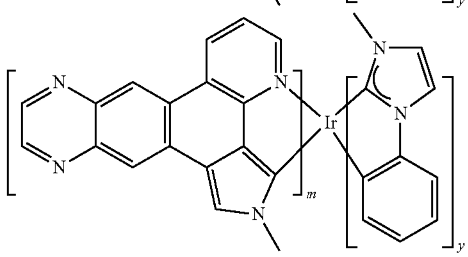
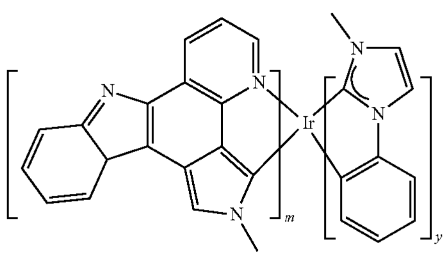
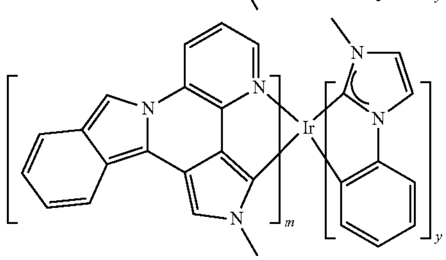
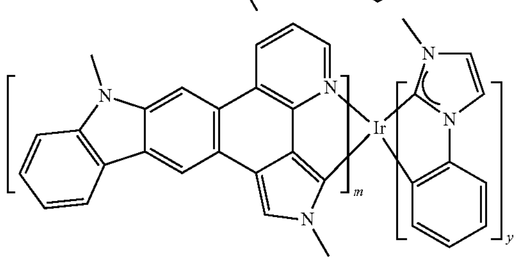
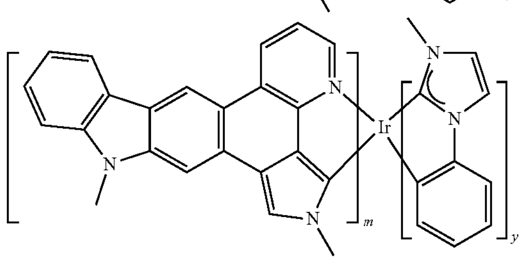
-continued
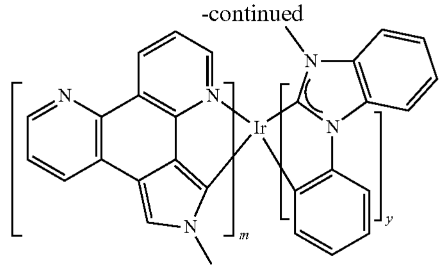
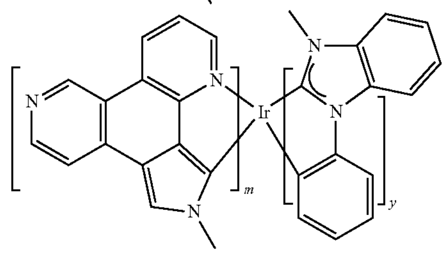
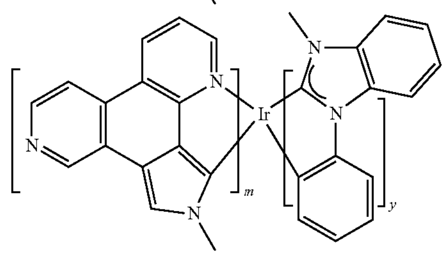
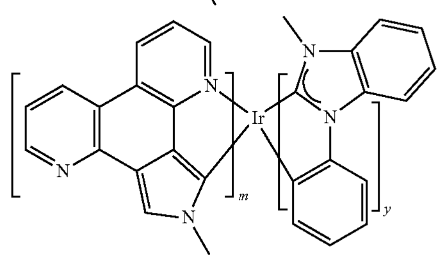
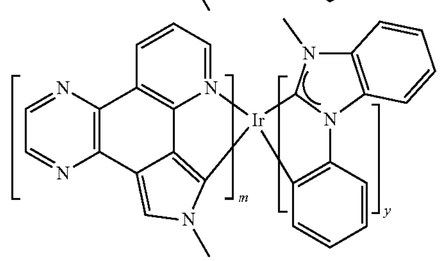
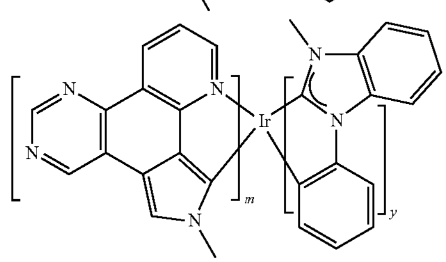
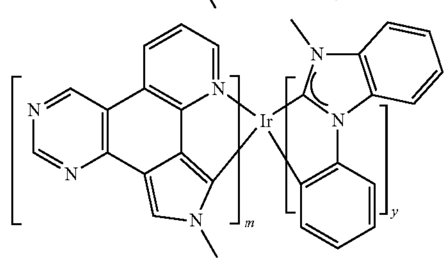

-continued
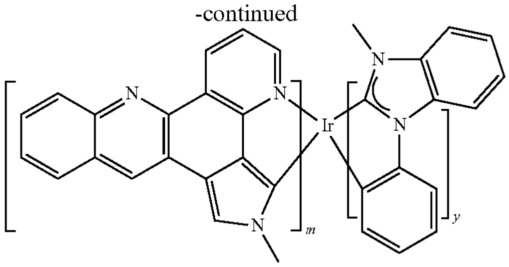
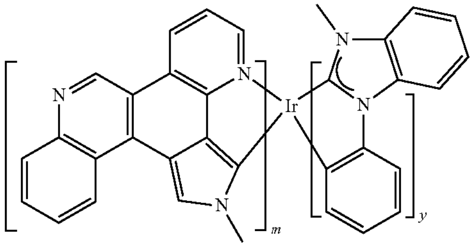
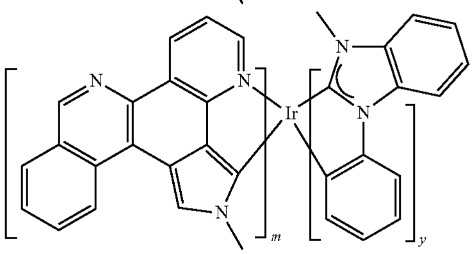
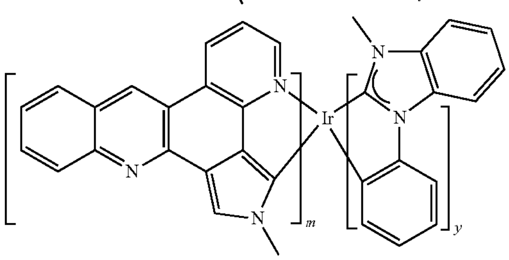
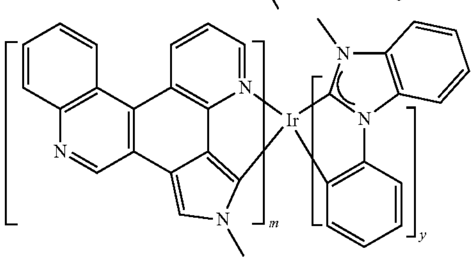
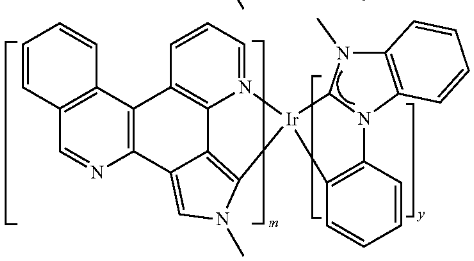
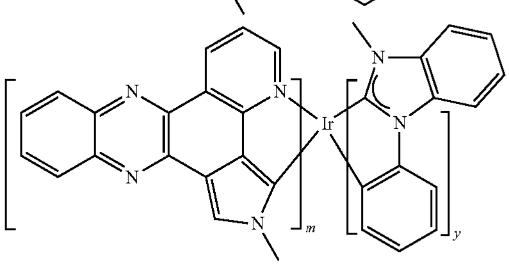
-continued
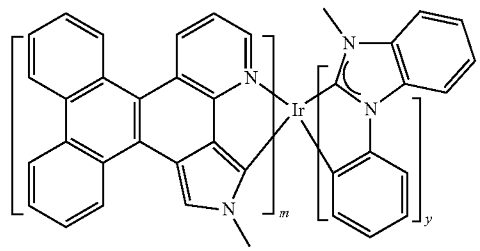
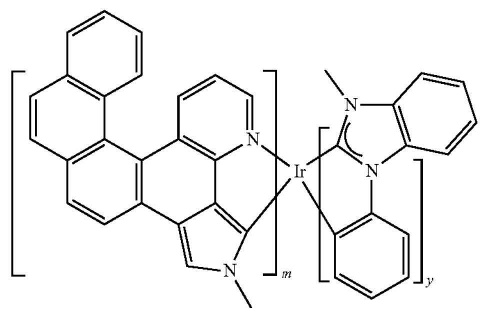
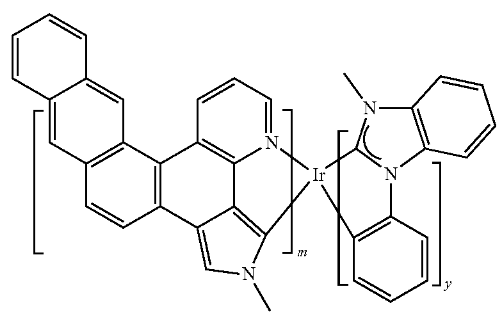
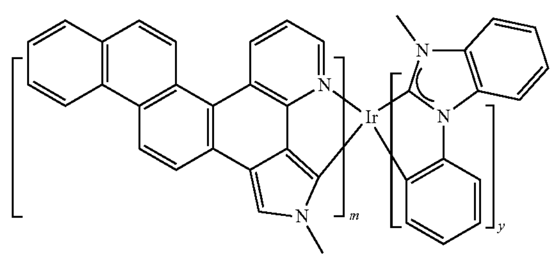
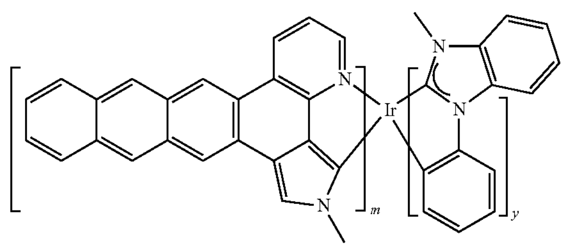
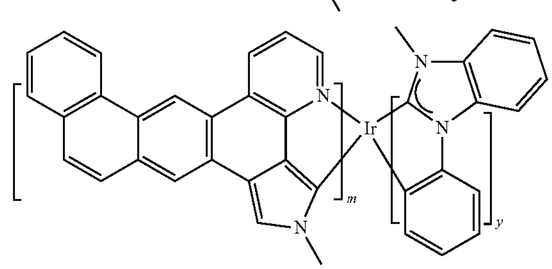

-continued
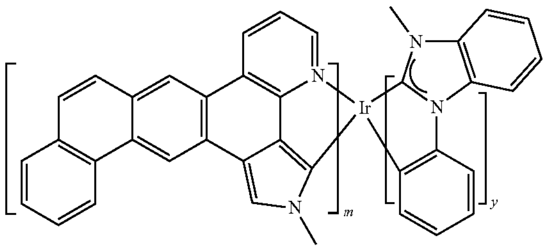
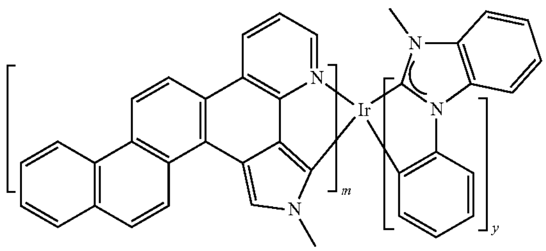
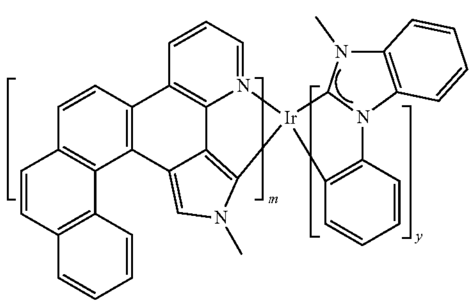
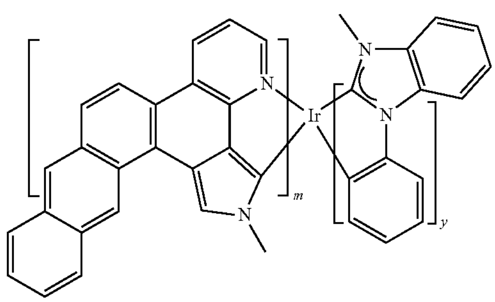
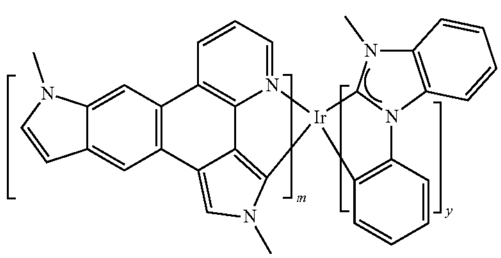
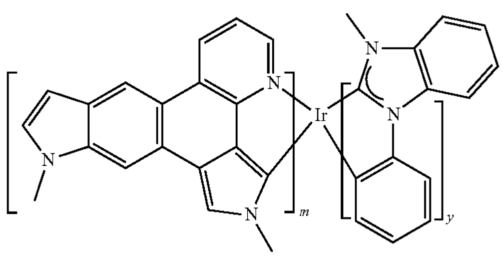
-continued
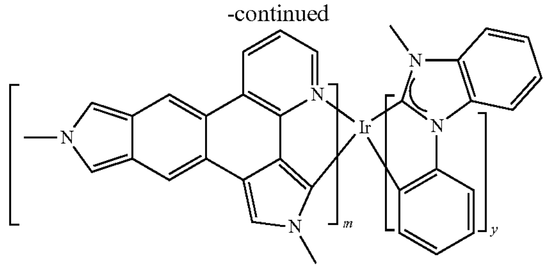
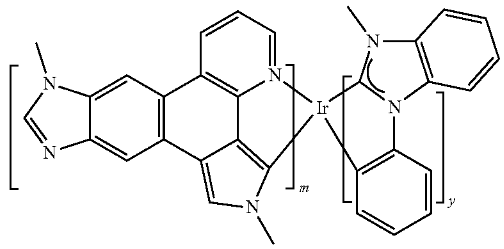
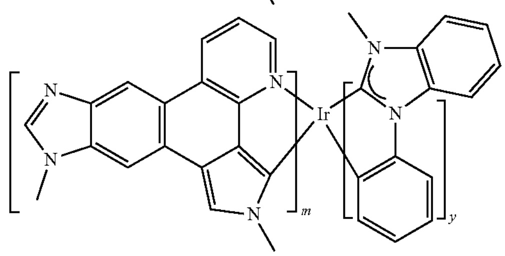
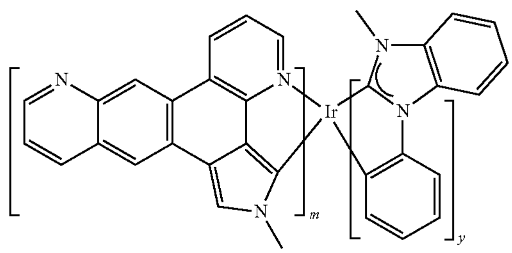
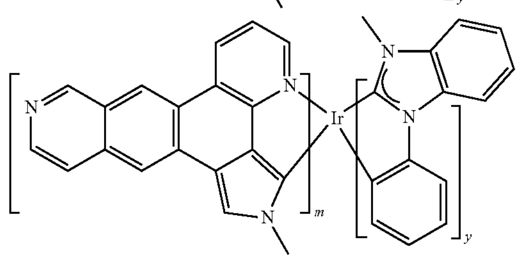
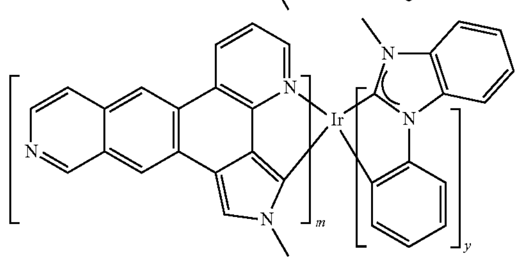
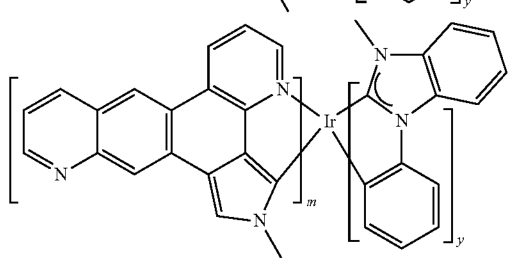

-continued
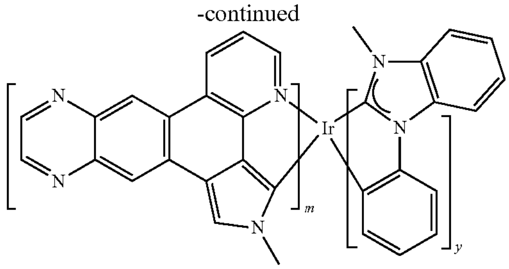
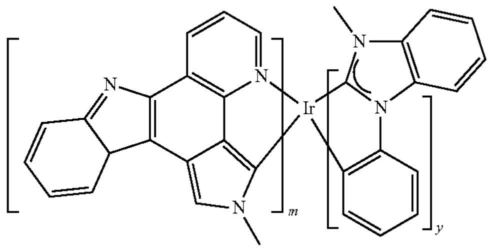
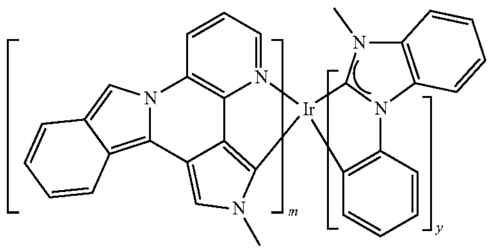
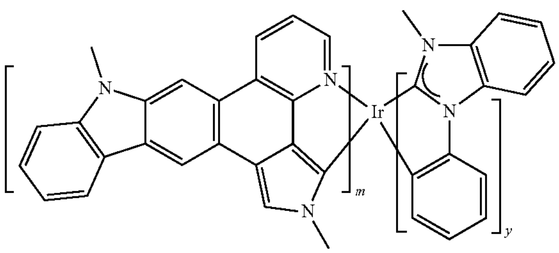
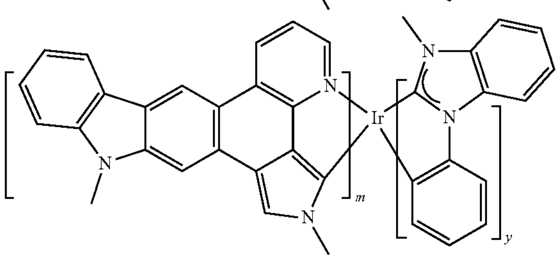
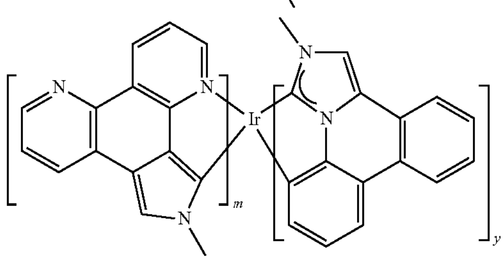
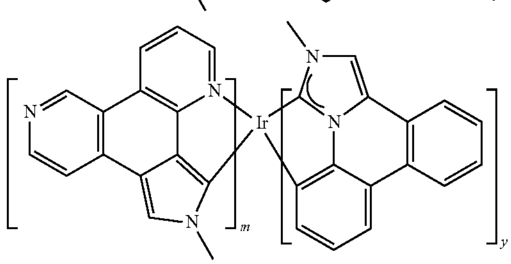
-continued
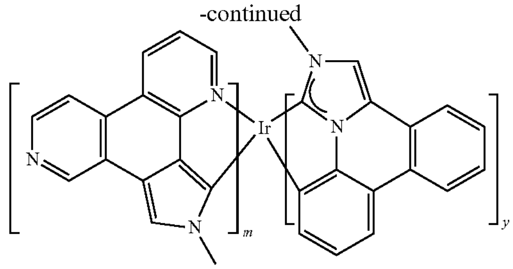
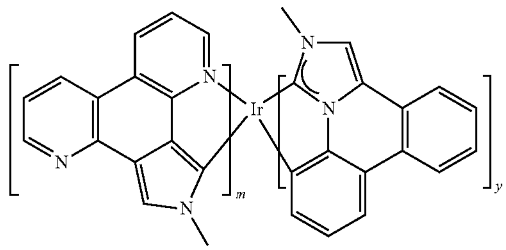
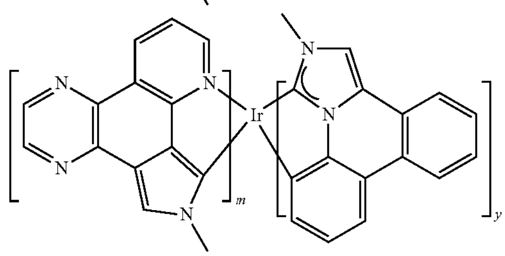
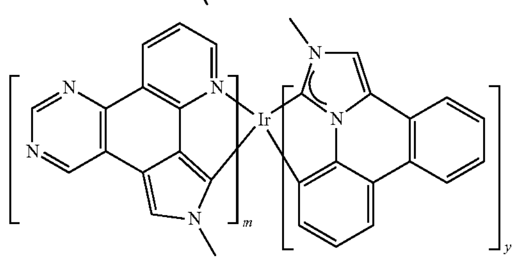
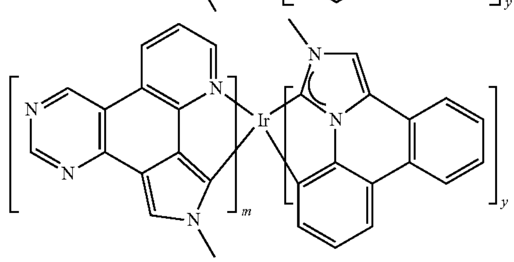
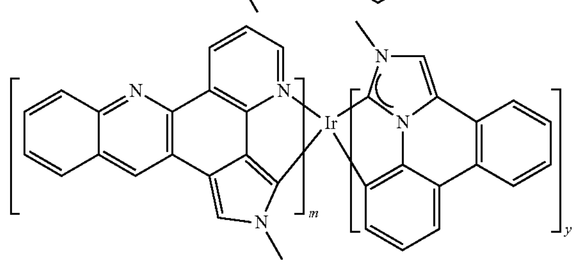
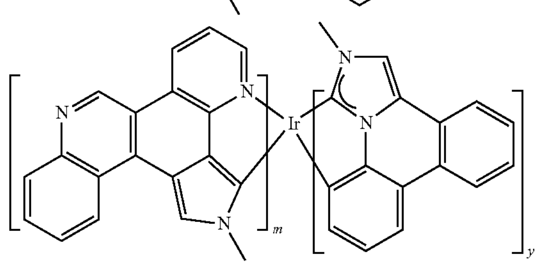

-continued
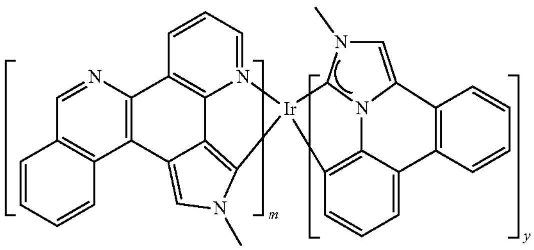
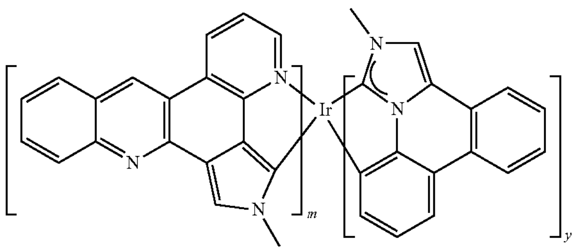
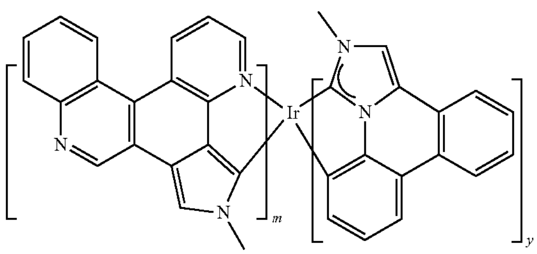
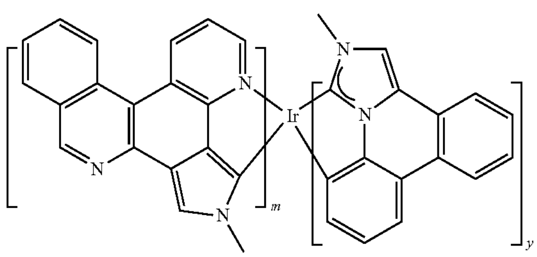
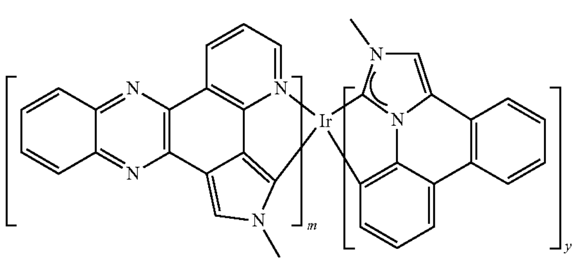
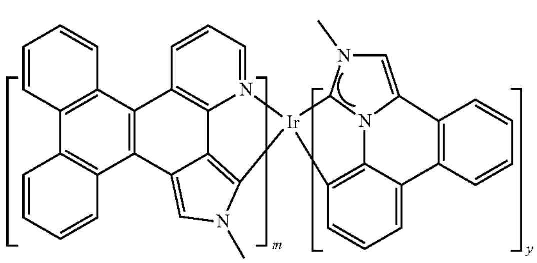
-continued
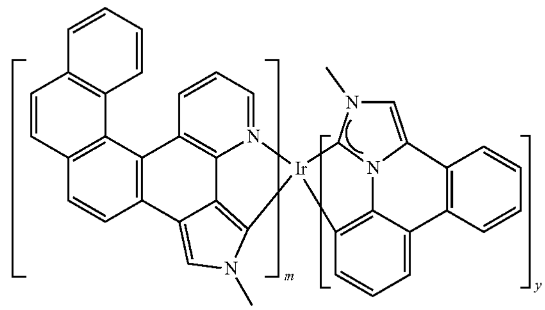
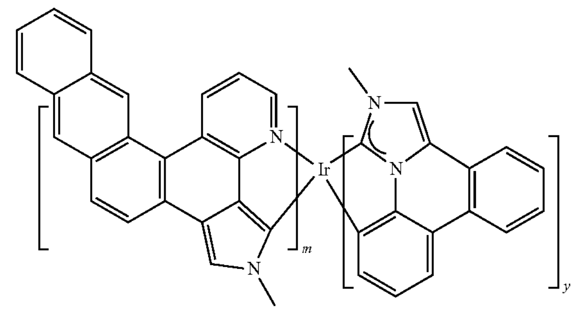
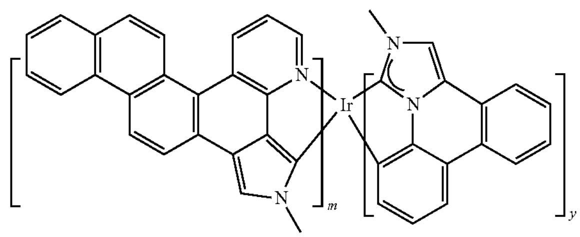
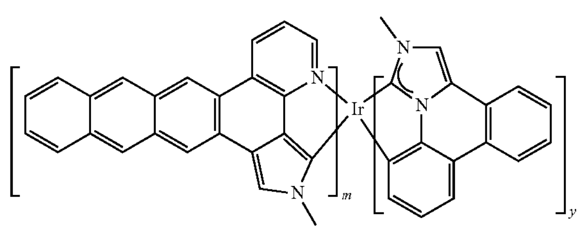
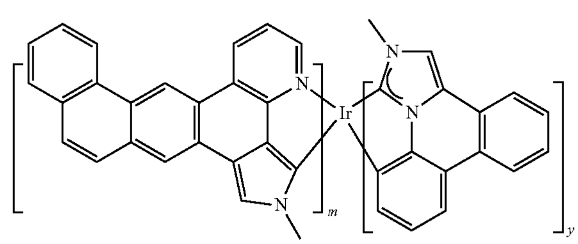
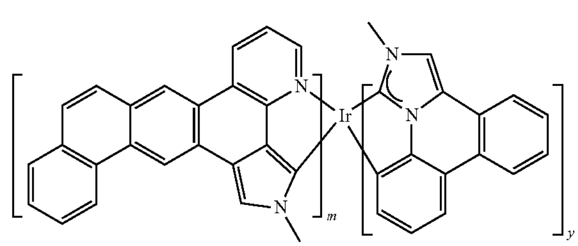

-continued
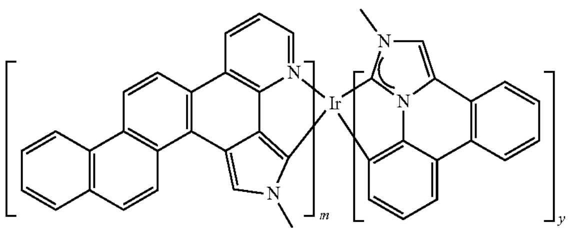
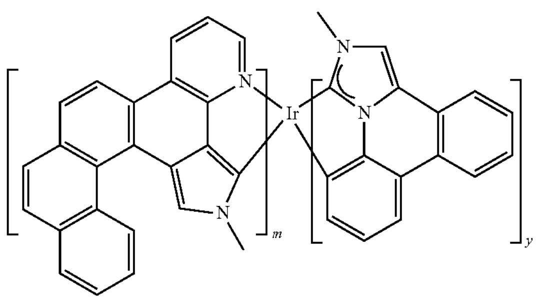
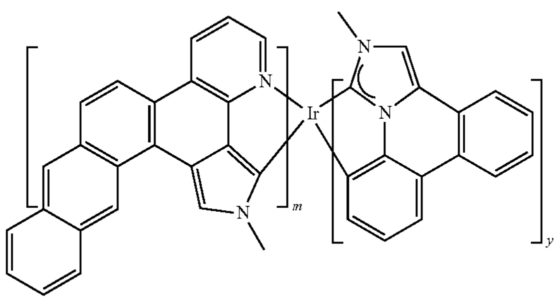
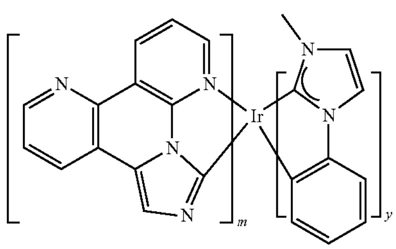
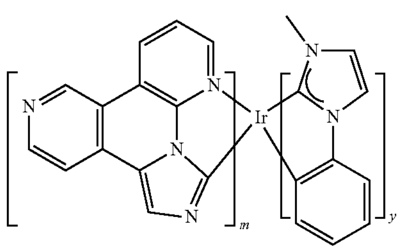
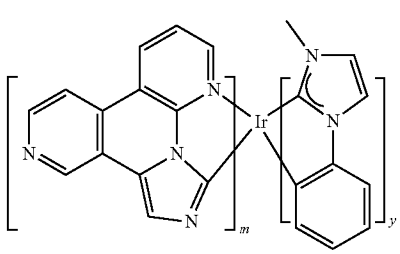
-continued
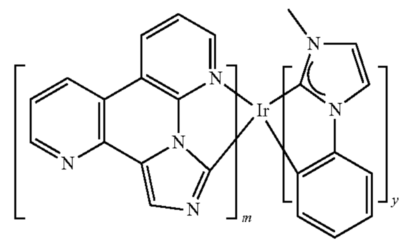
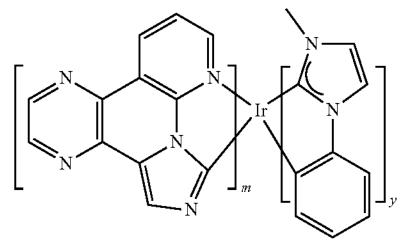
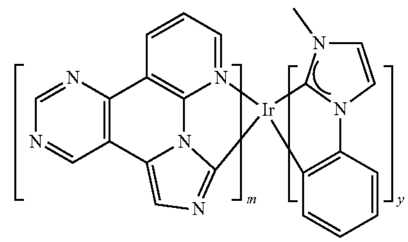
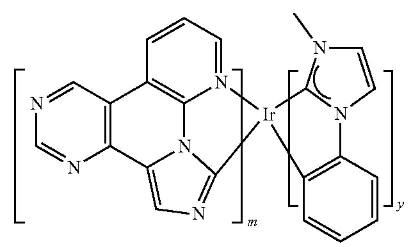
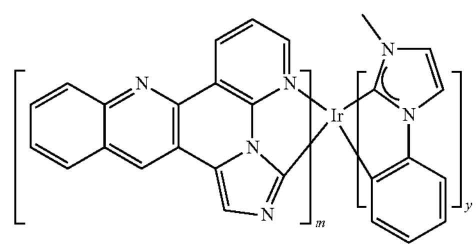
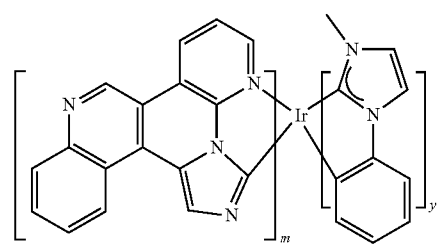
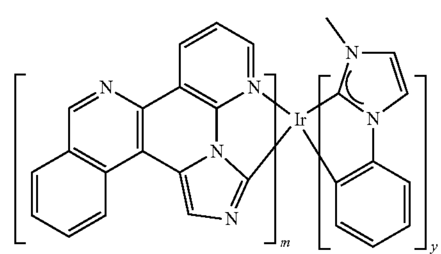

-continued
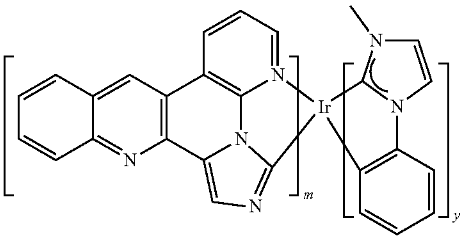
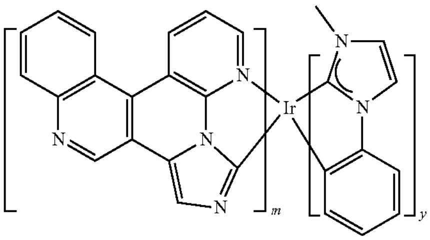
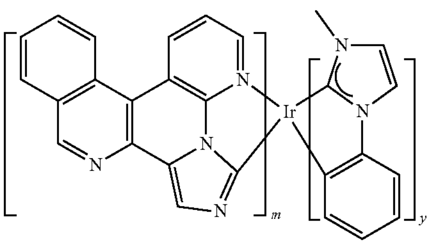
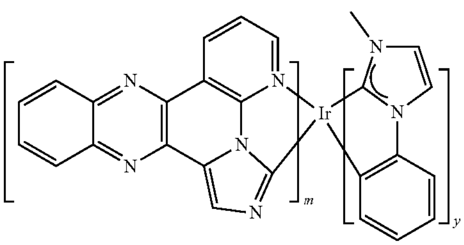
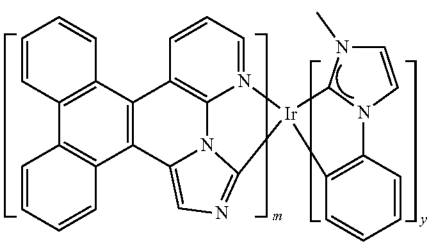
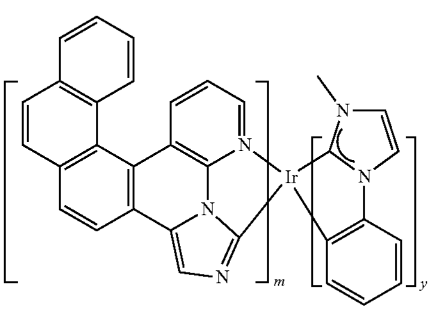
-continued
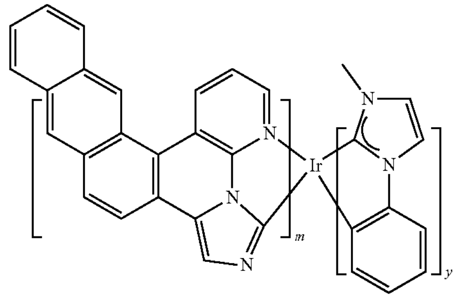
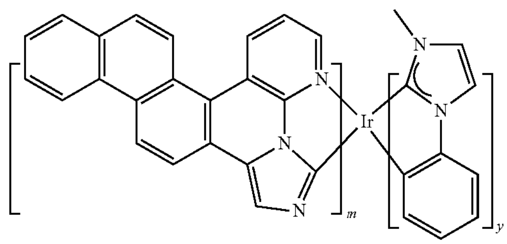
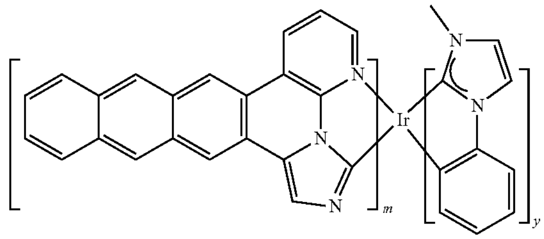
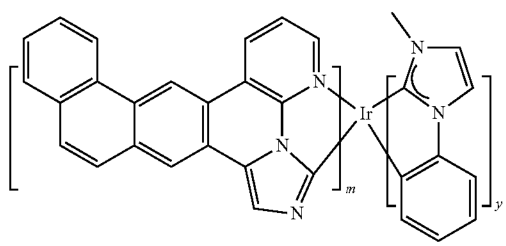
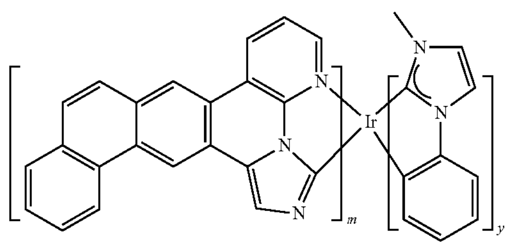
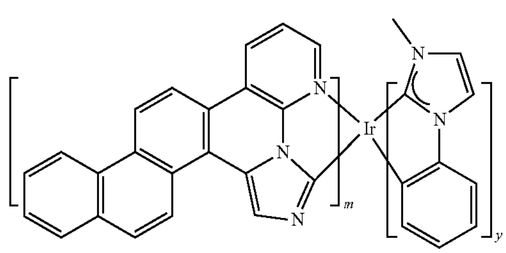

-continued
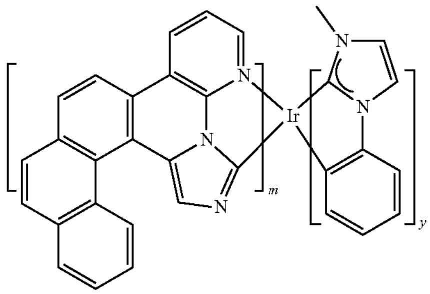
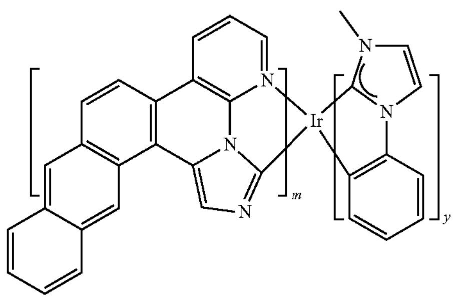
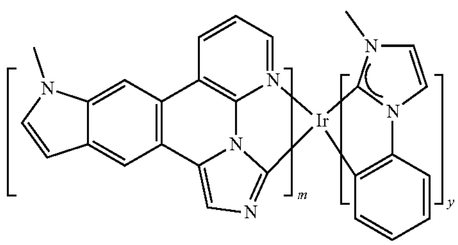
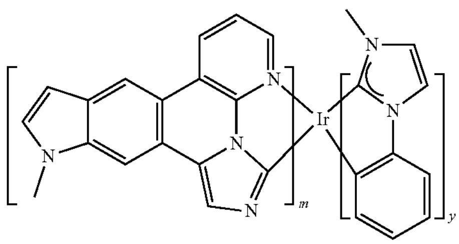
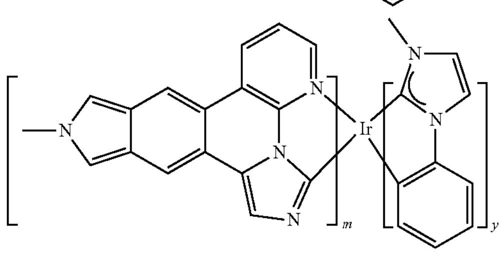
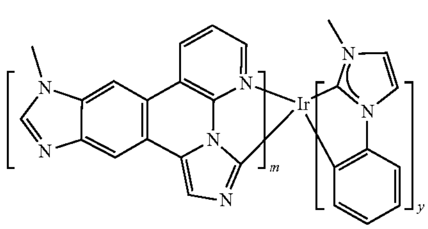
-continued
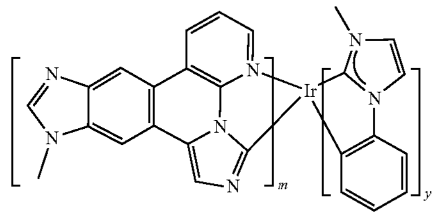
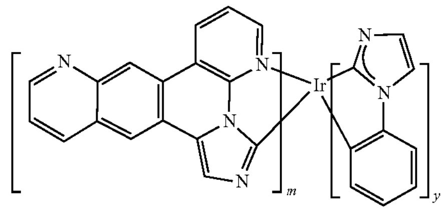
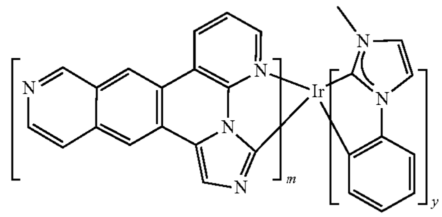
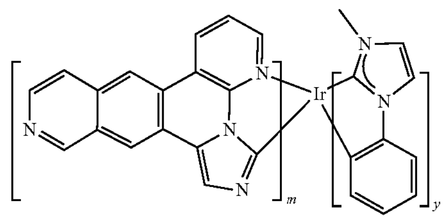
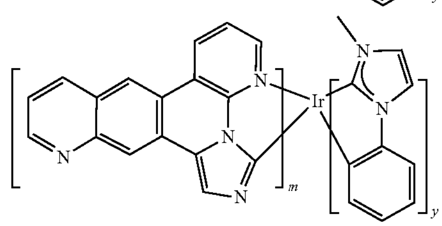
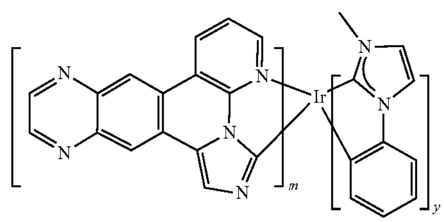
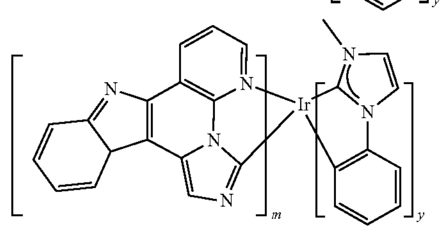
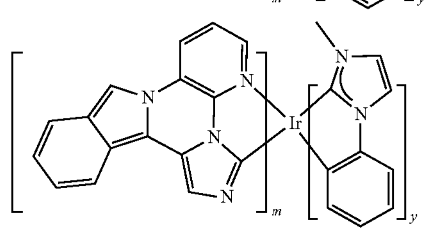

-continued
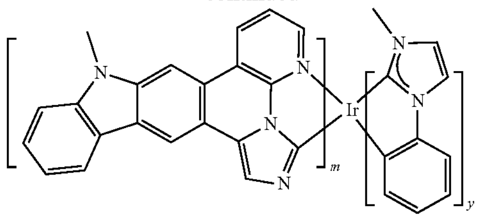
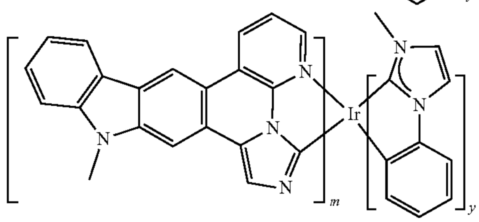
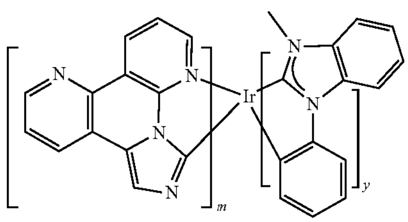
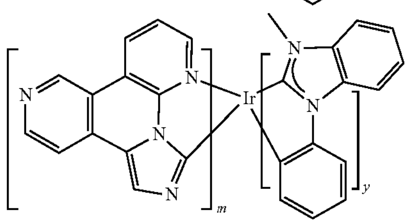
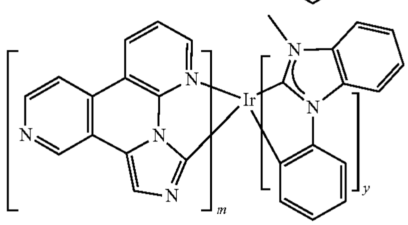
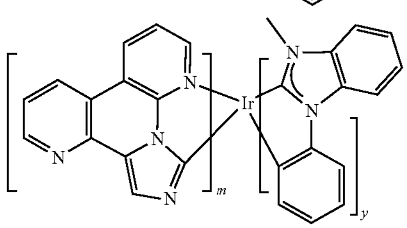
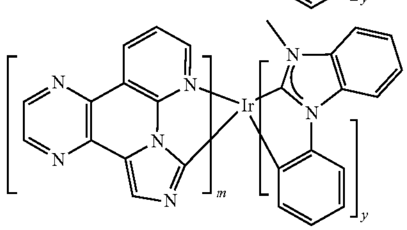
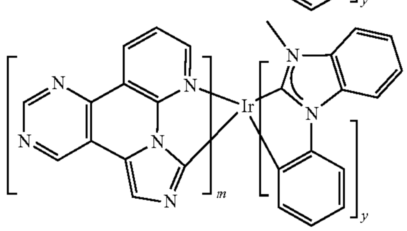
-continued
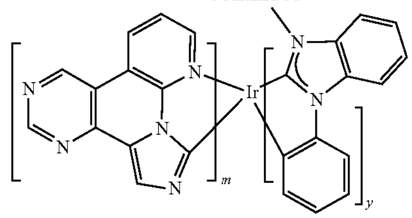
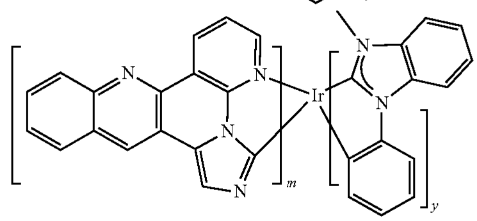
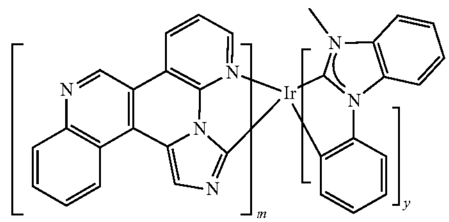
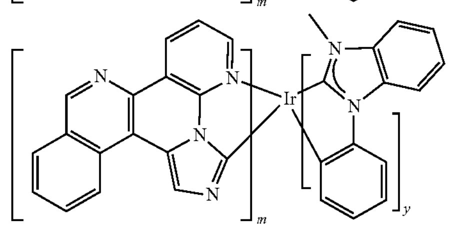
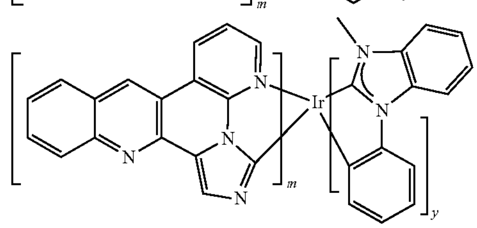
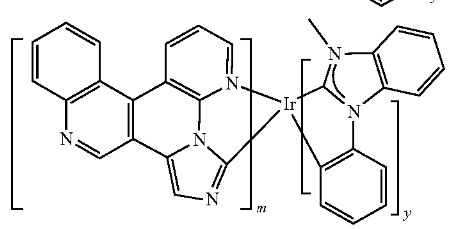
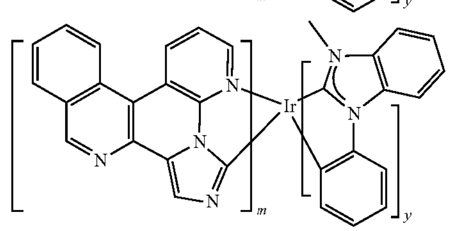
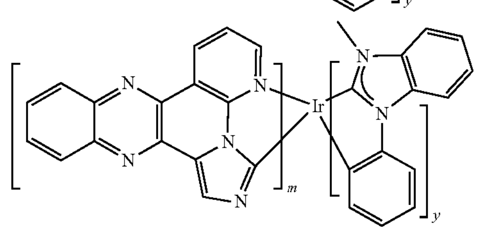

-continued
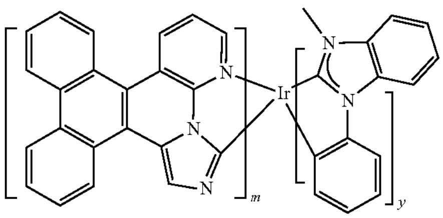
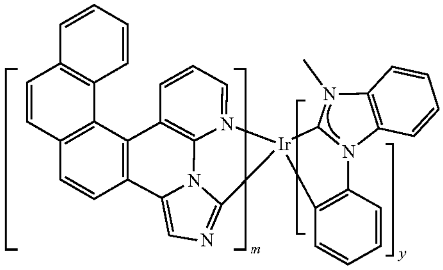
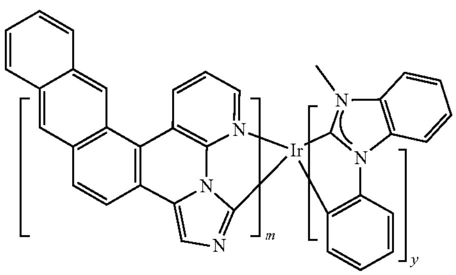
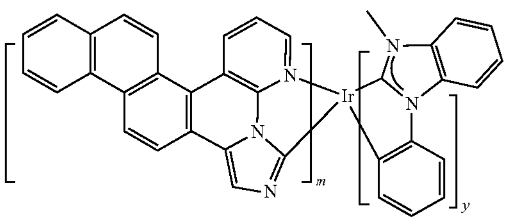
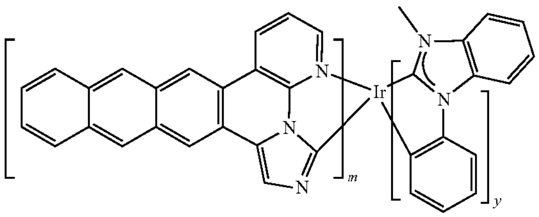
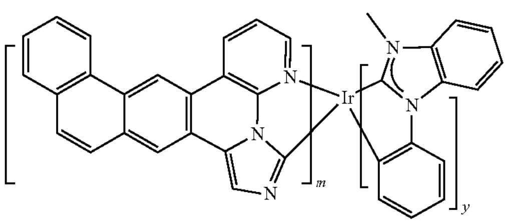
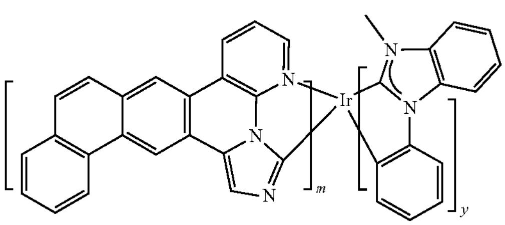
-continued
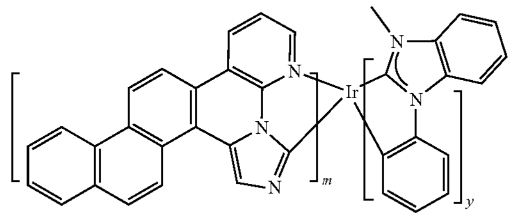
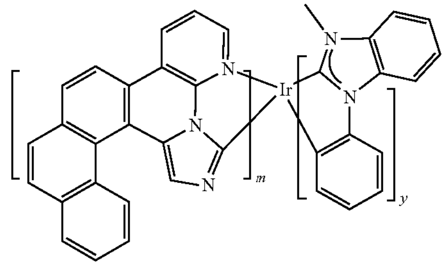
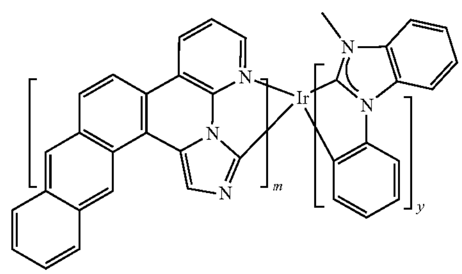
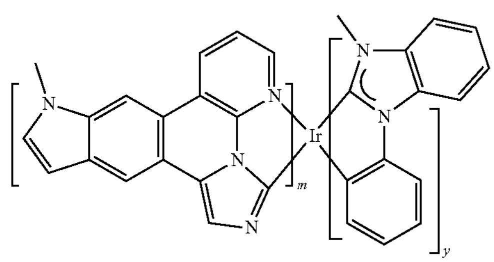
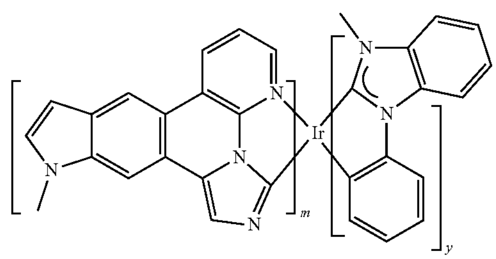
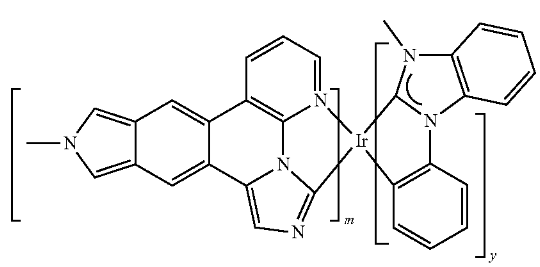

-continued
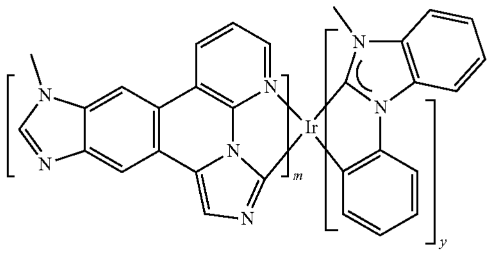
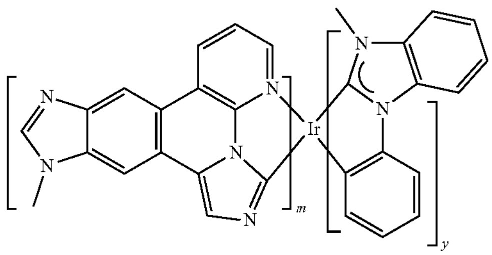
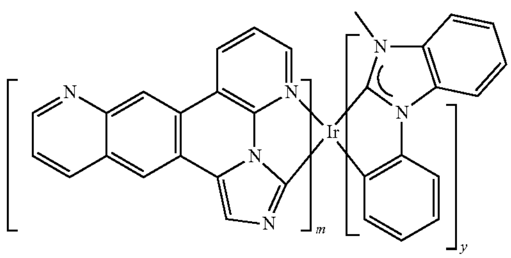
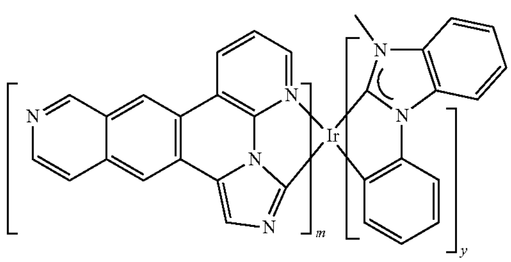
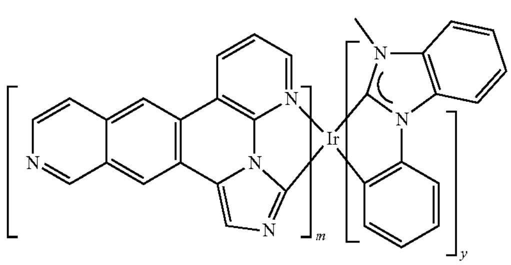
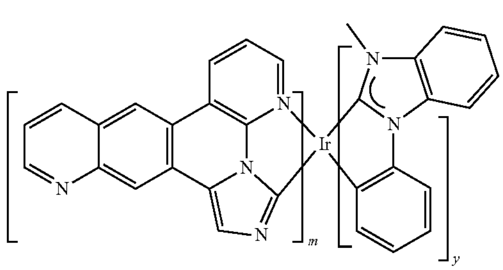
-continued
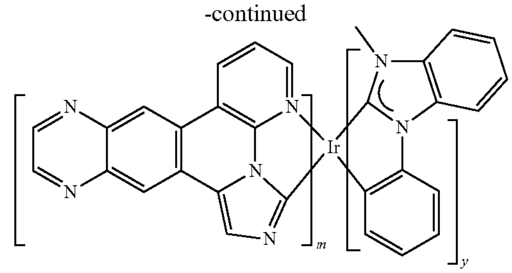
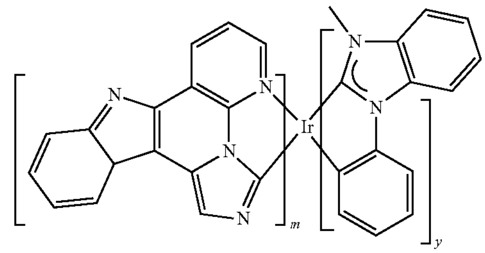
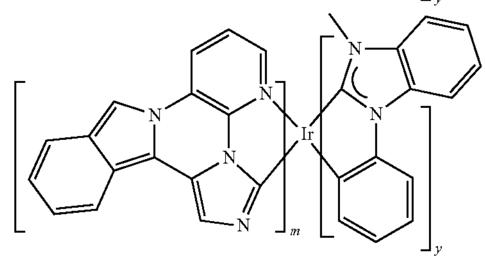
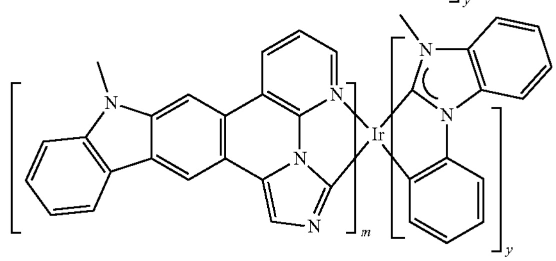
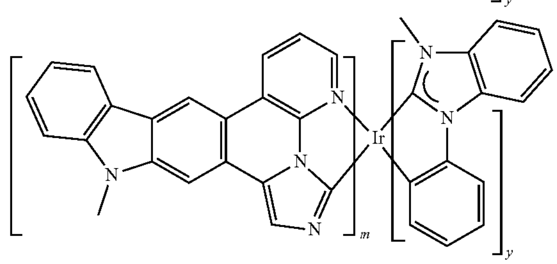
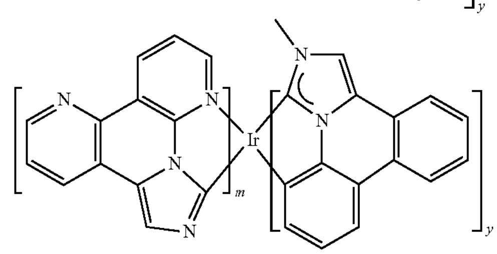
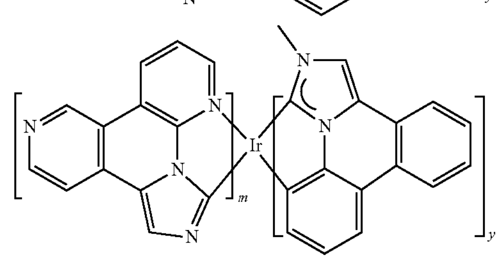

-continued
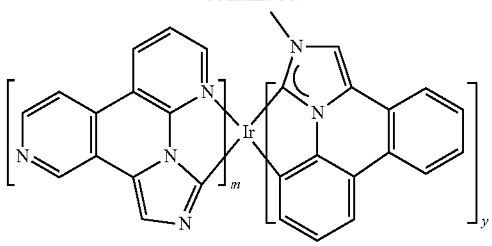
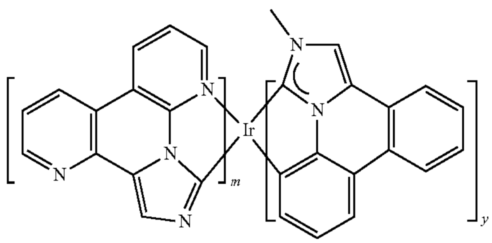
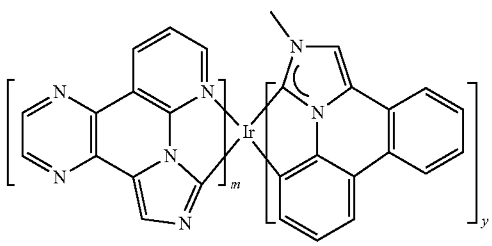
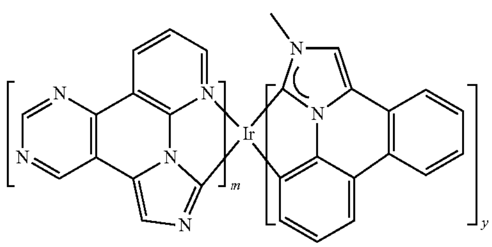
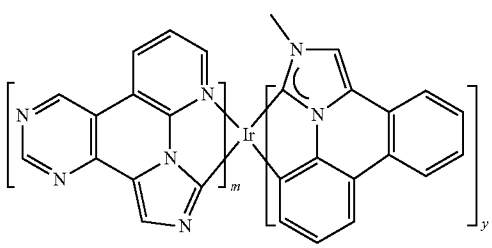
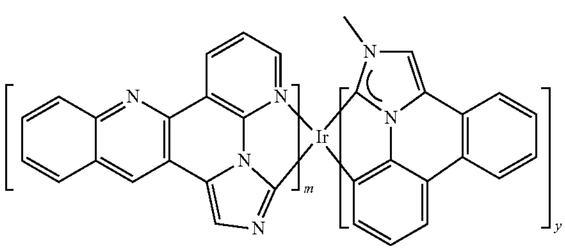
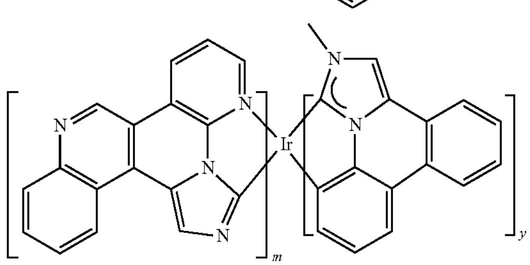
-continued
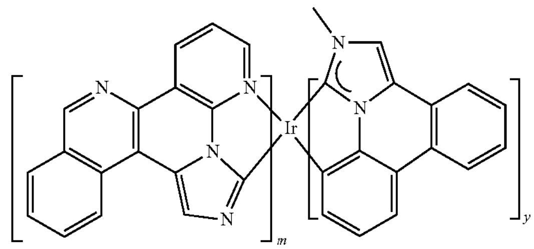
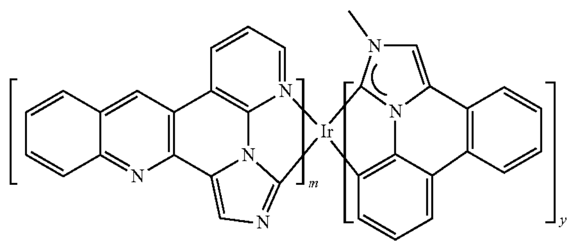
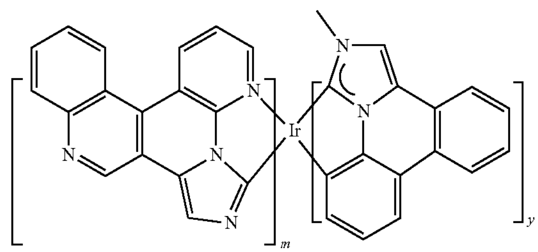
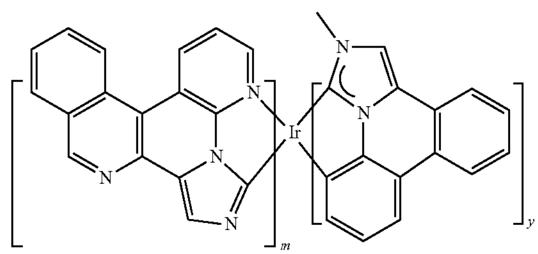
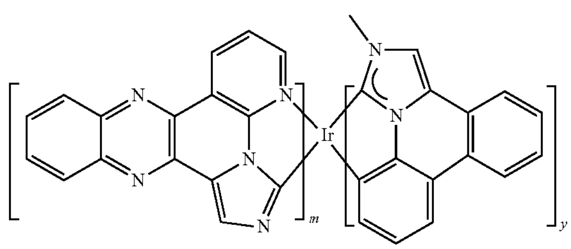
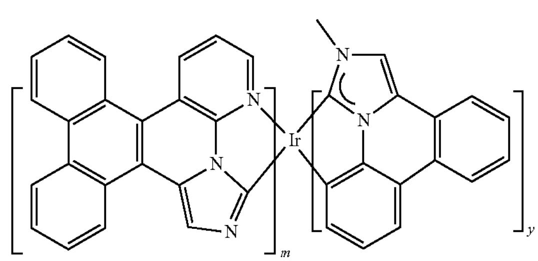

-continued
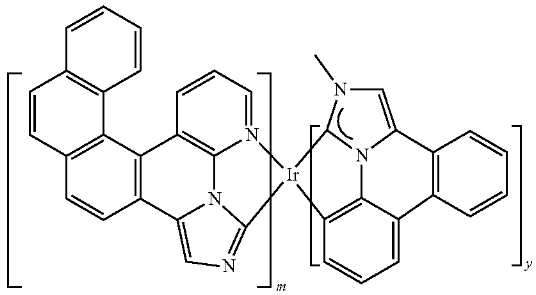
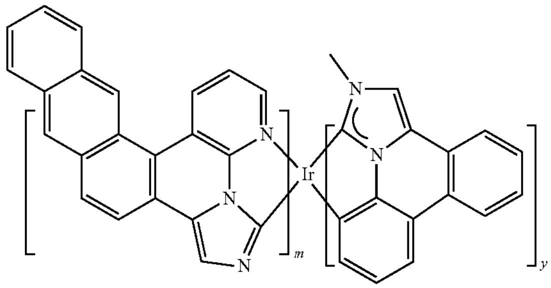
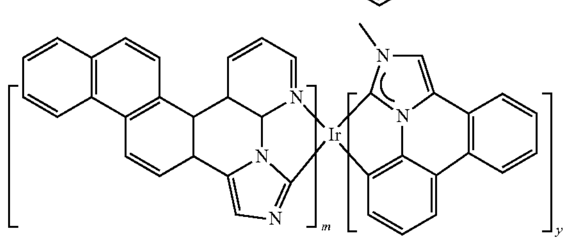
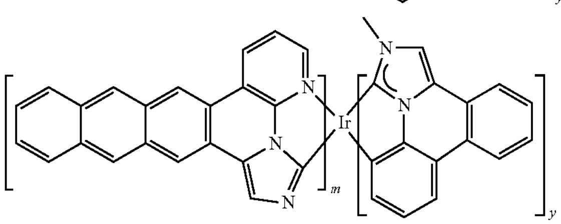
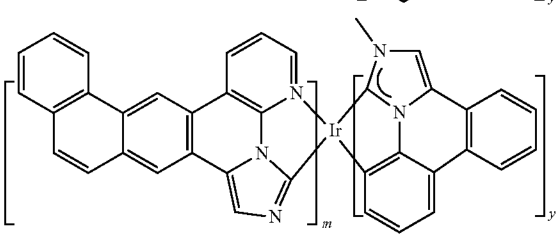
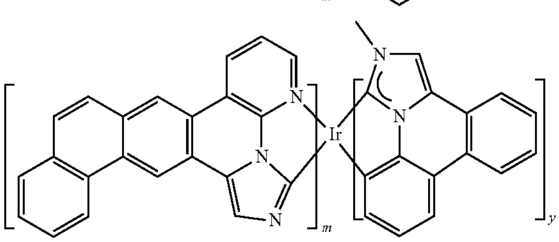
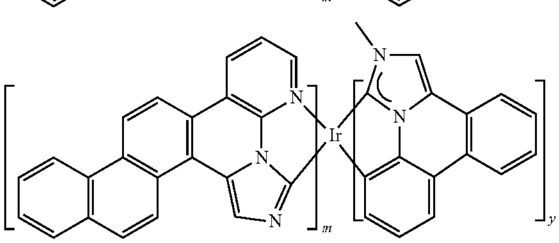
-continued
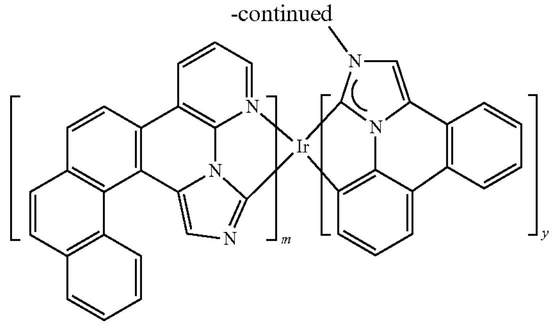
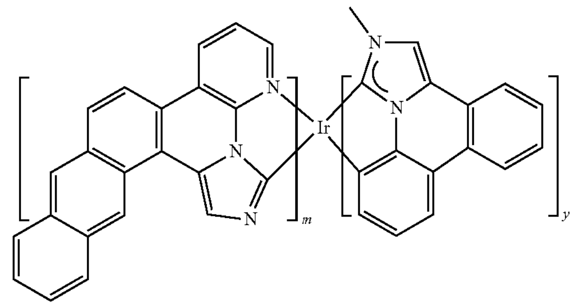
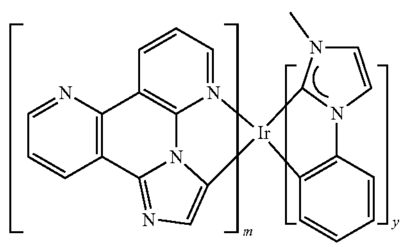
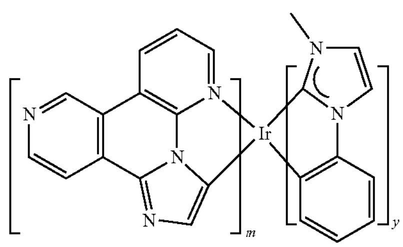
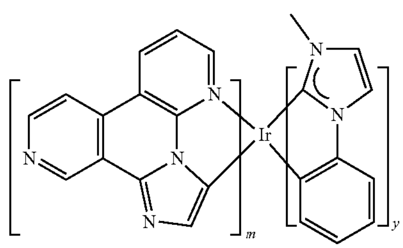
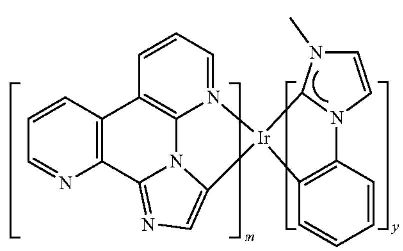

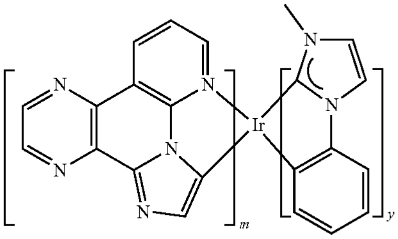
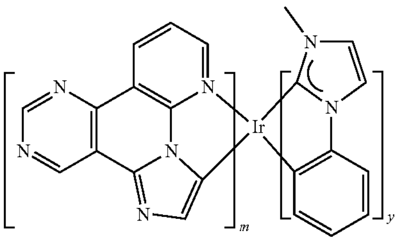
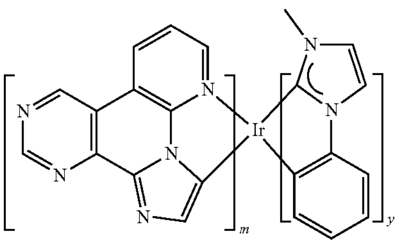
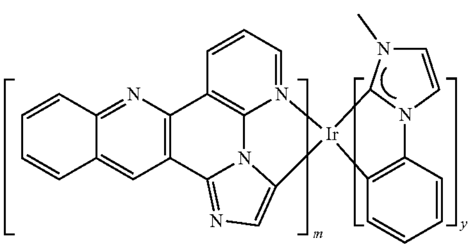
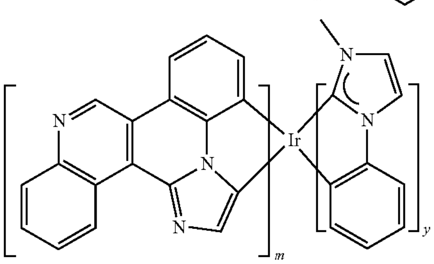
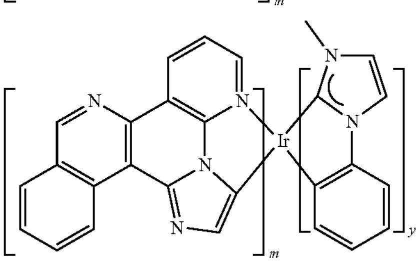
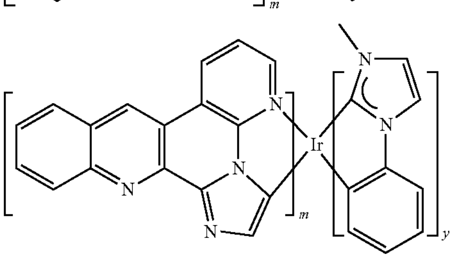
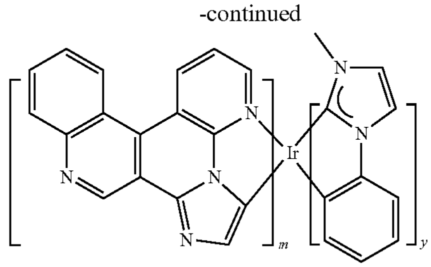
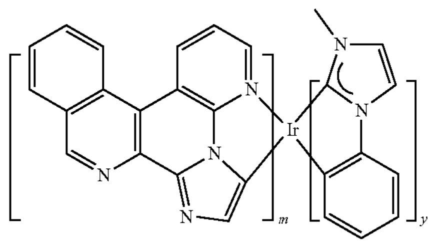
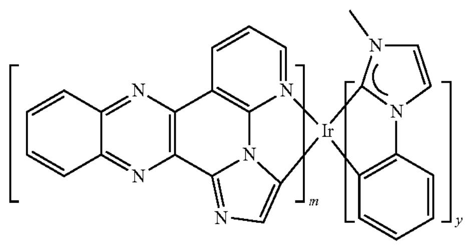
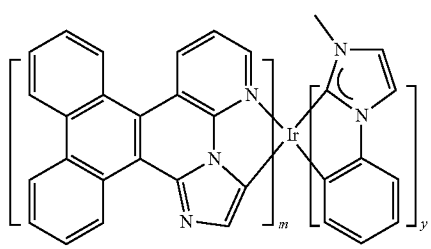
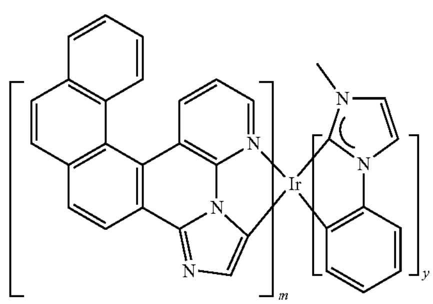
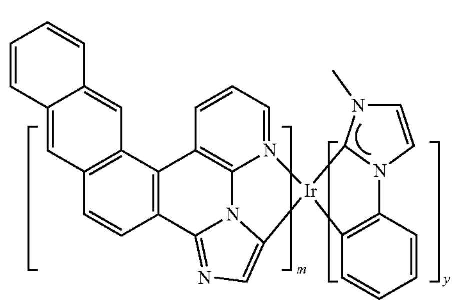

-continued
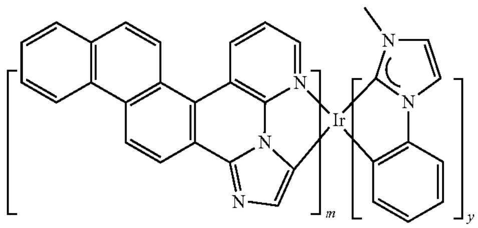
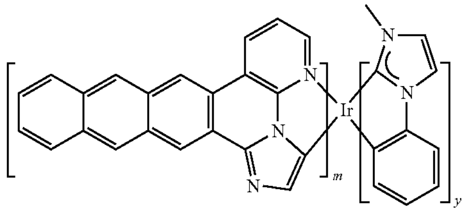
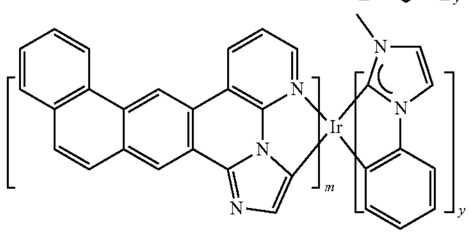
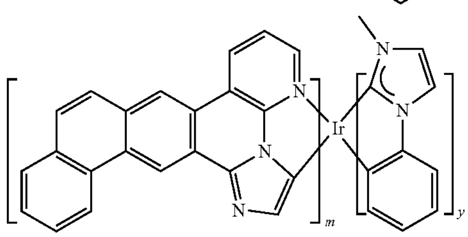
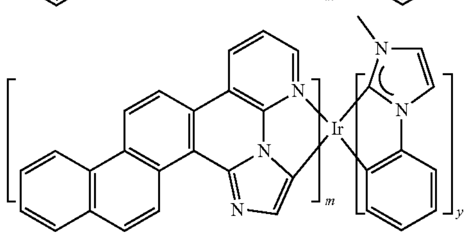
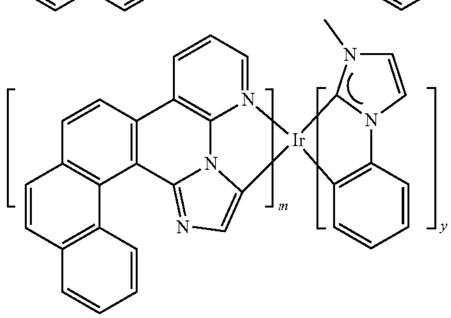
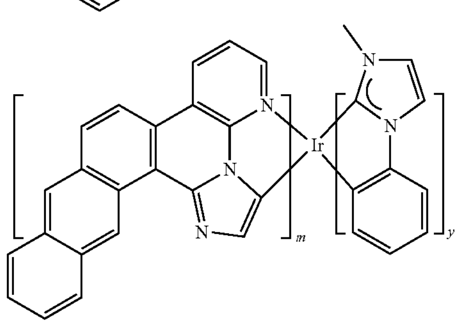
-continued
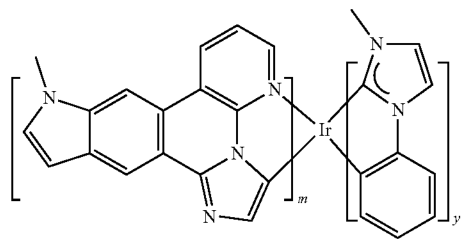
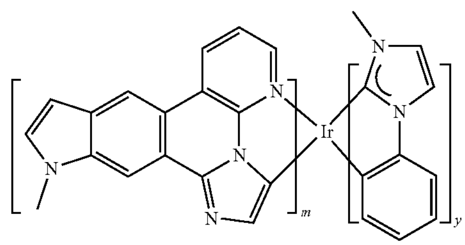
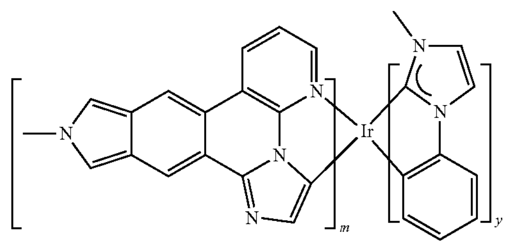
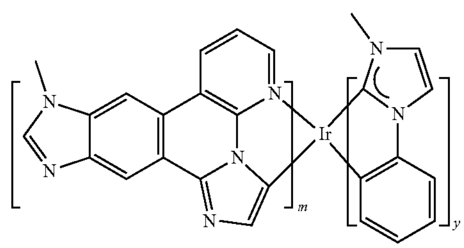
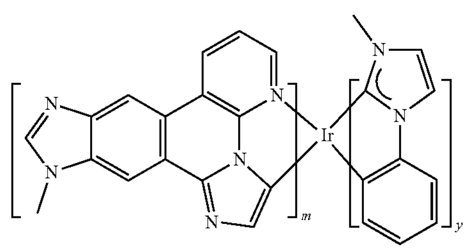
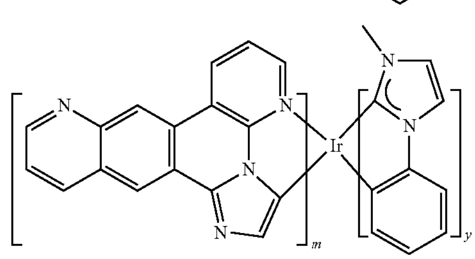
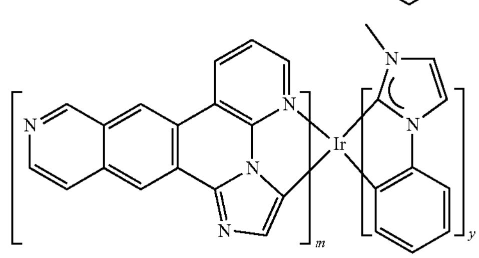

-continued
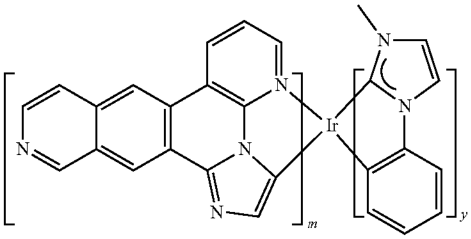
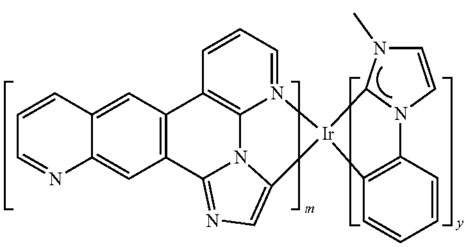
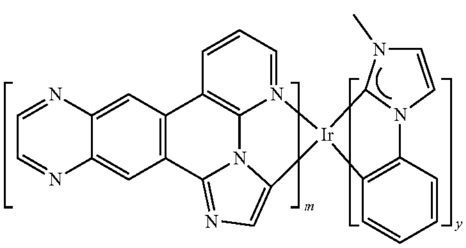
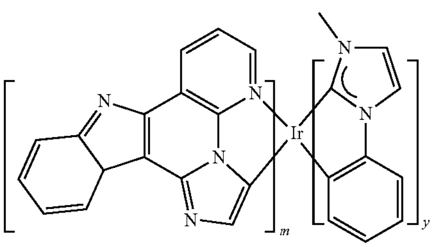
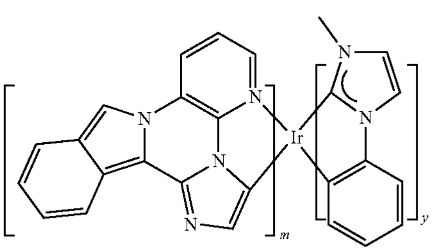
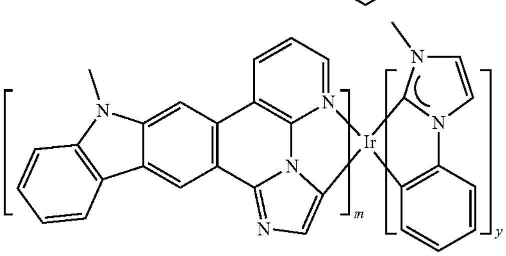
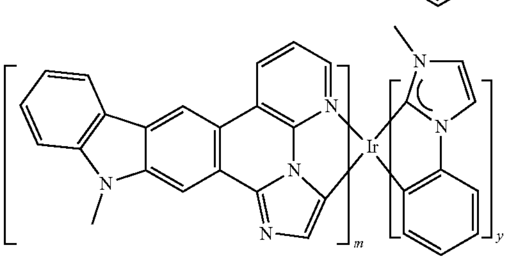
-continued
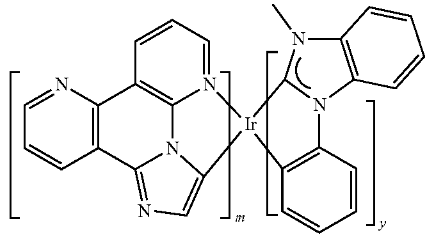
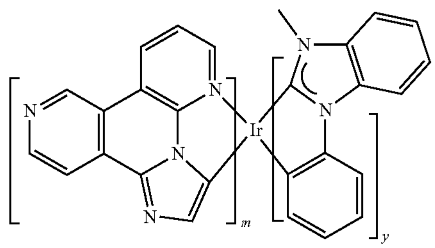
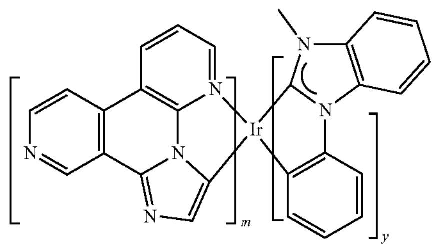
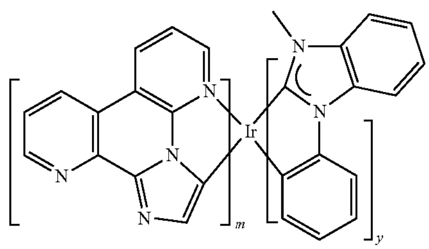
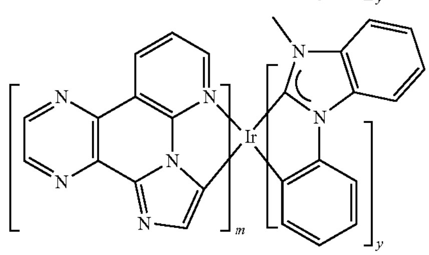
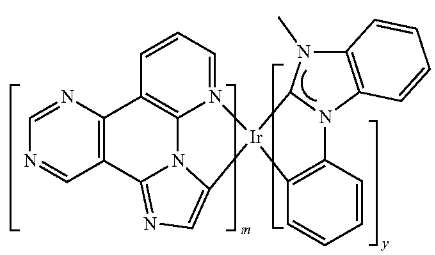
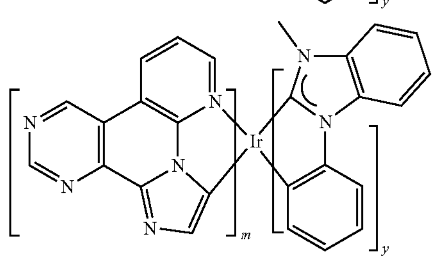

-continued
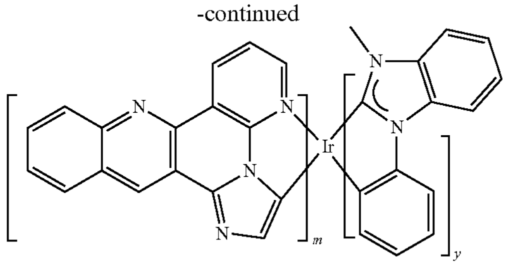
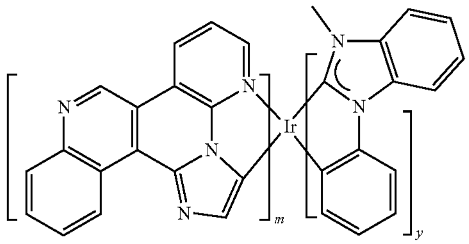
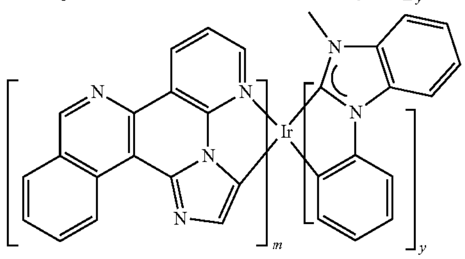
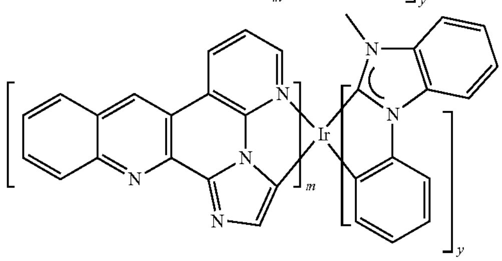
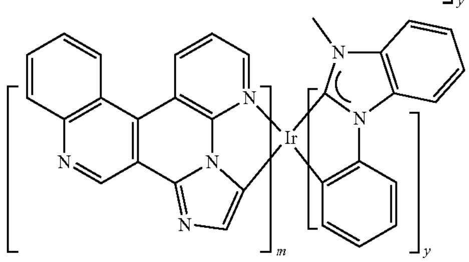
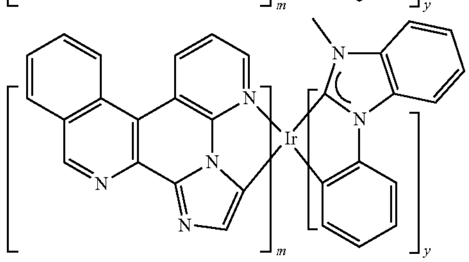
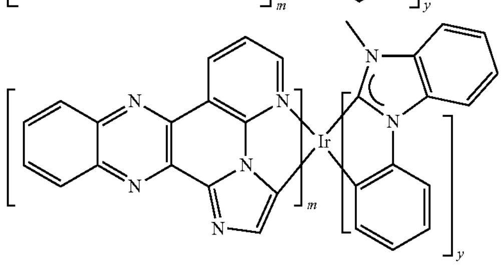
-continued
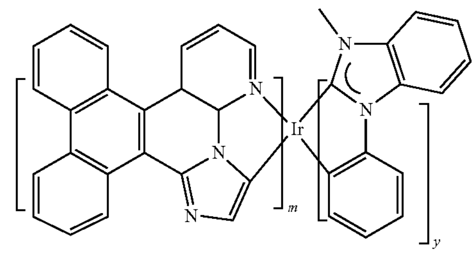
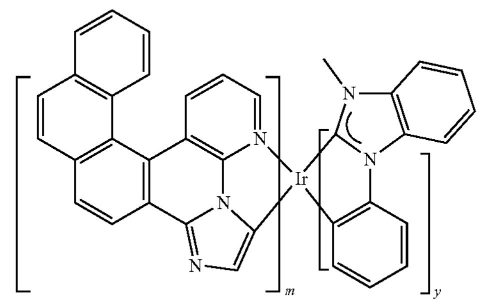
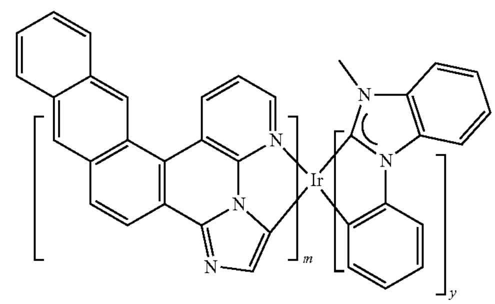
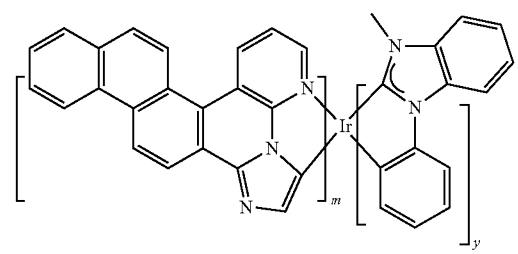
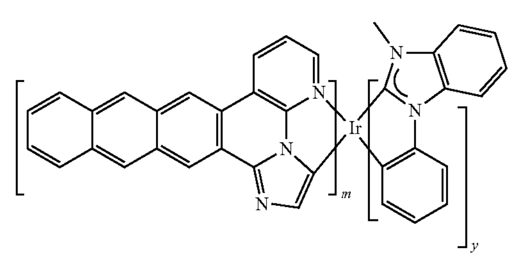
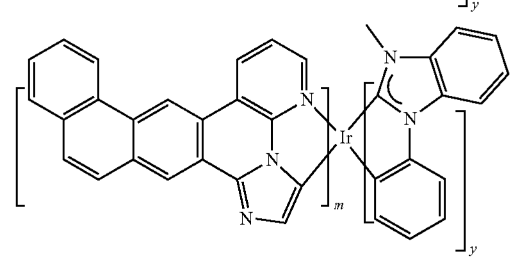

-continued
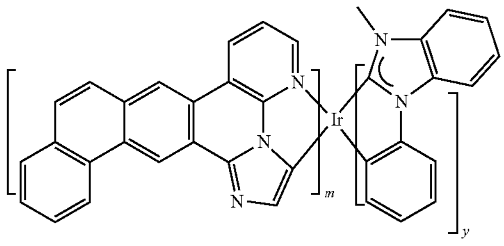
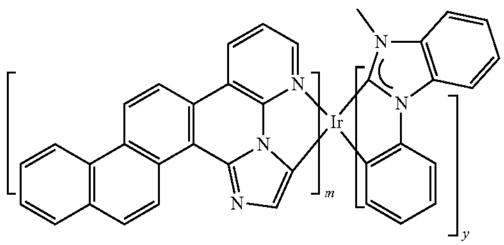
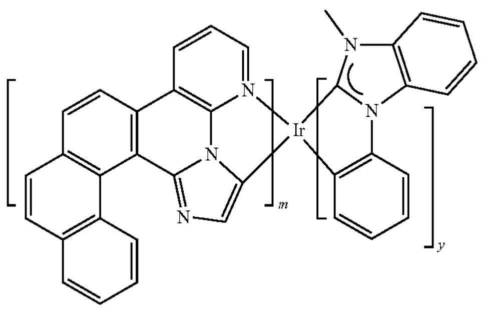
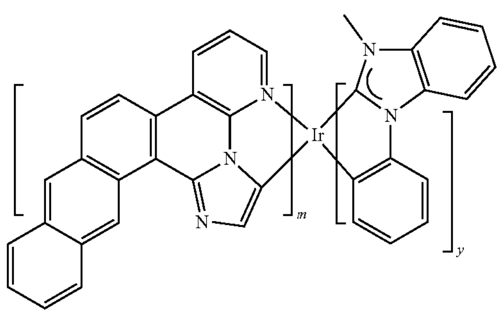
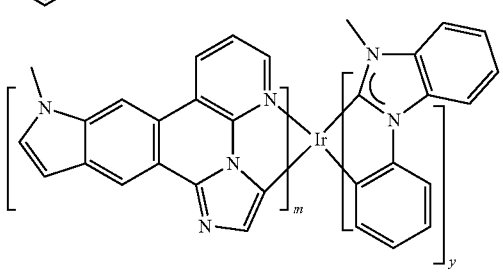
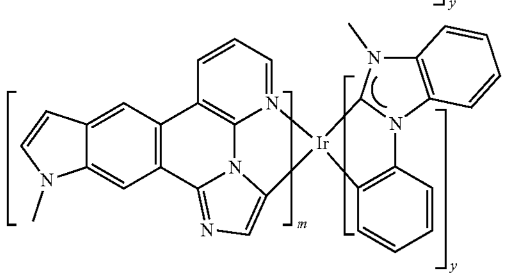
-continued
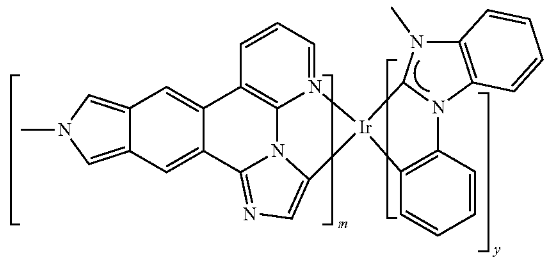
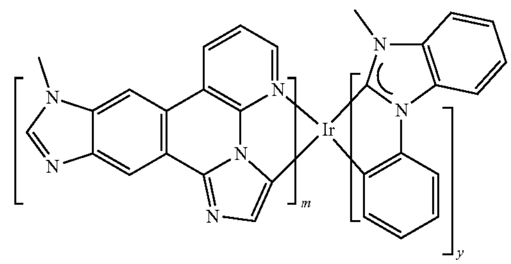
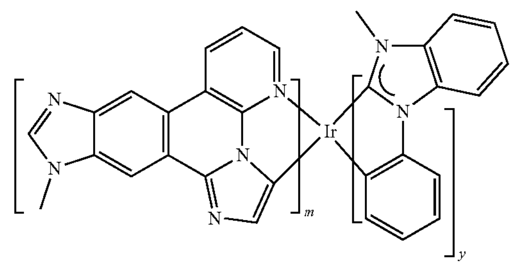
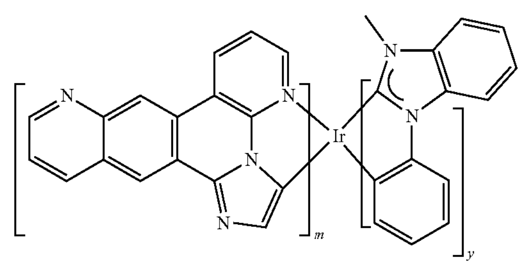
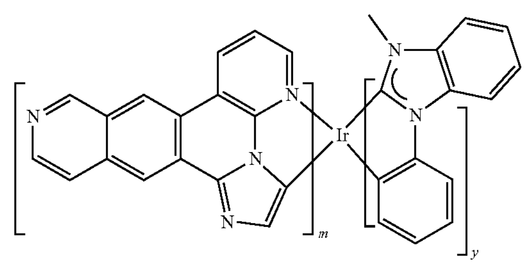
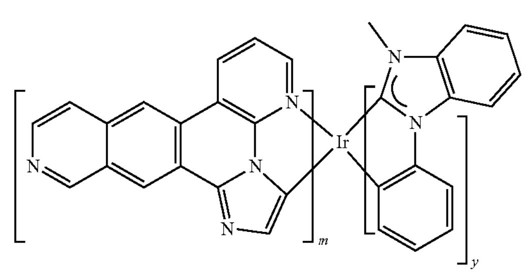

-continued
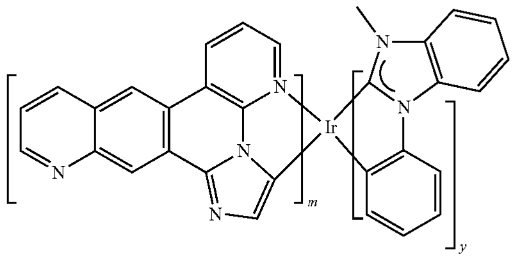
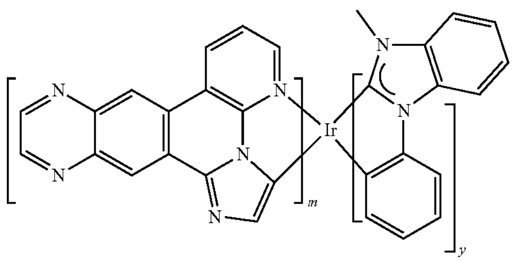
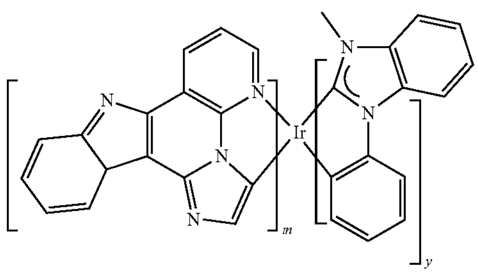
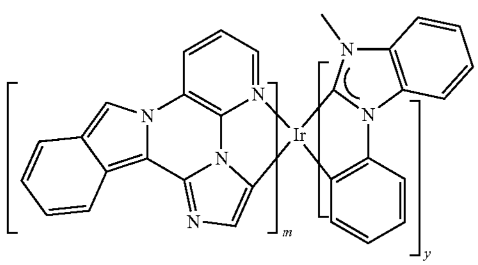
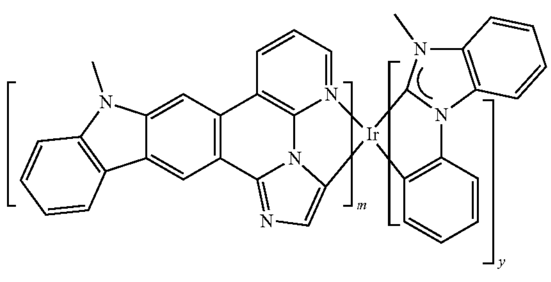
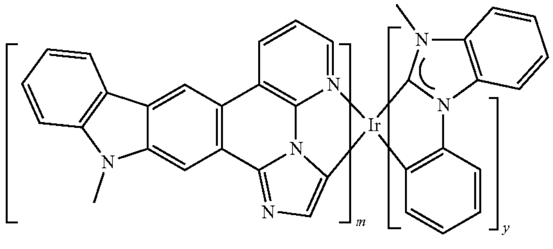
-continued
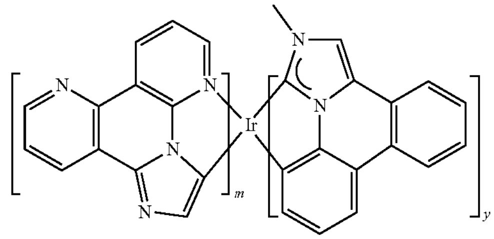
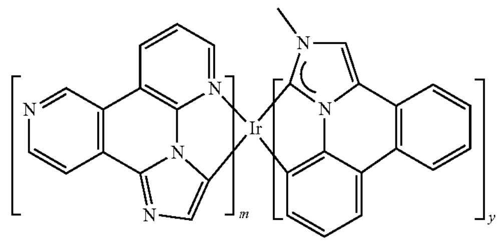
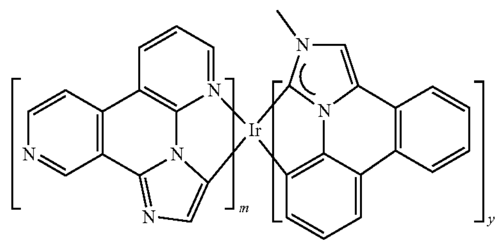
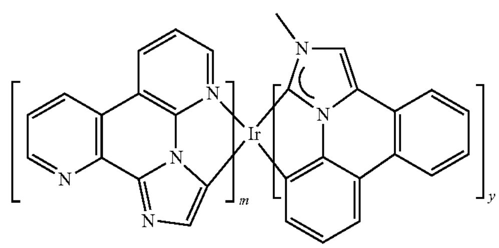
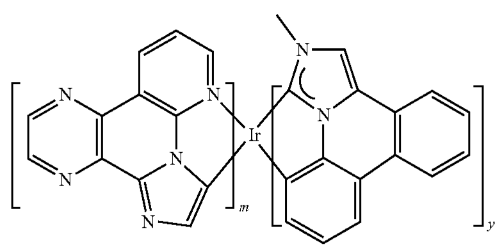
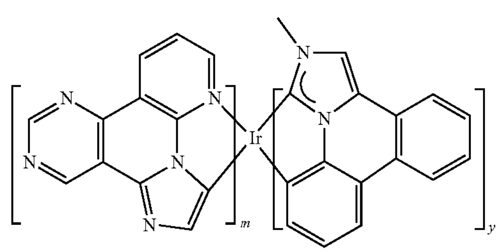
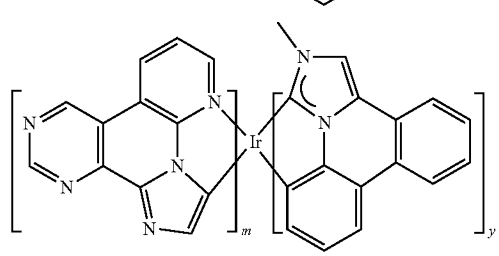

-continued
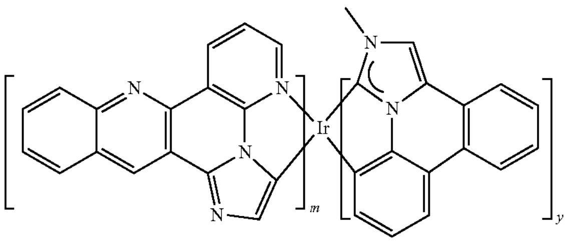
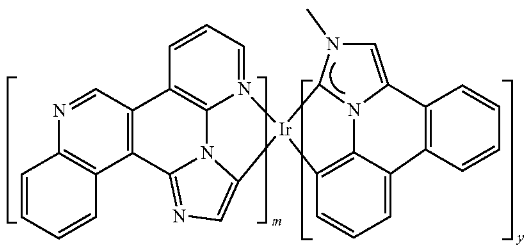
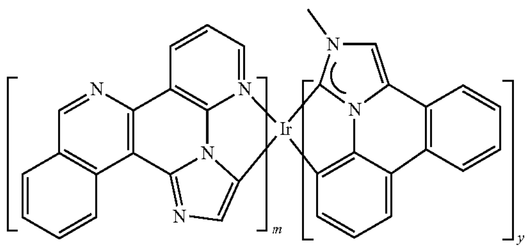
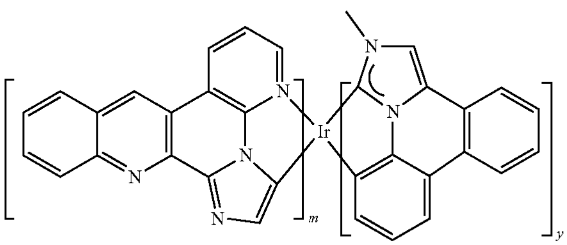
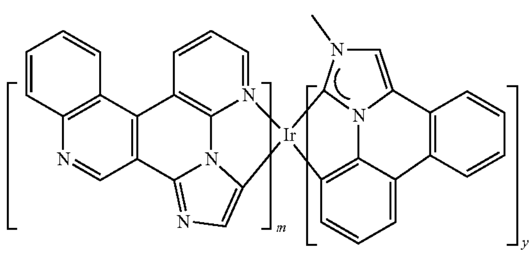
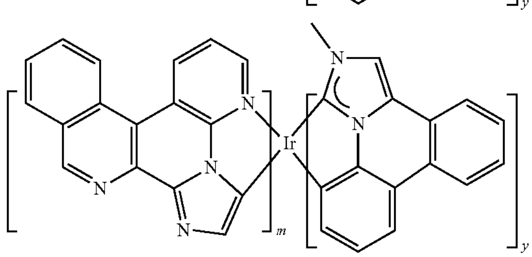
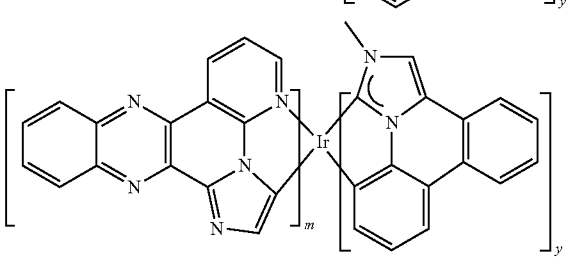
-continued
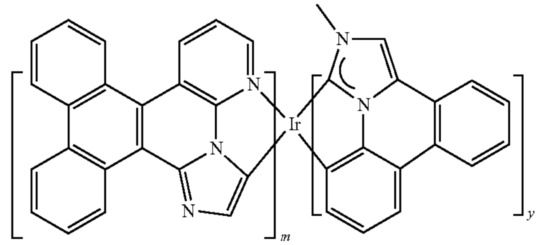
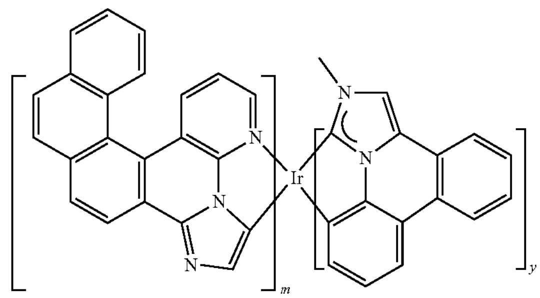
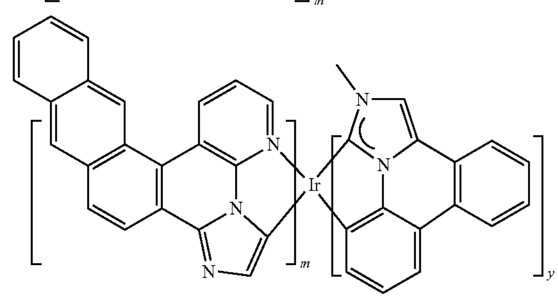
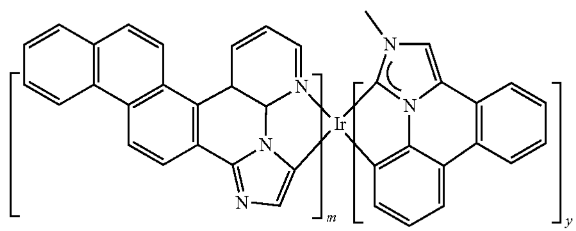
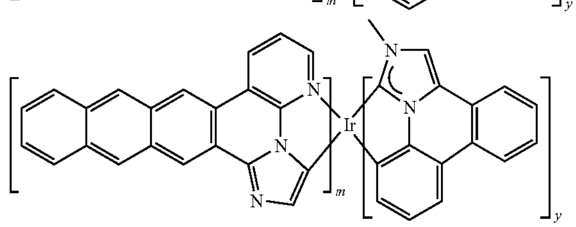
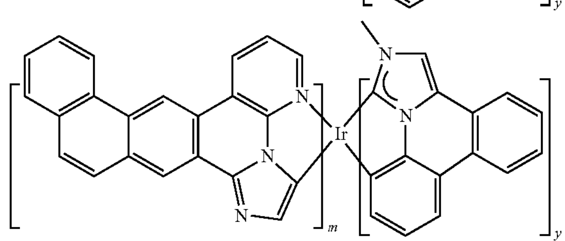
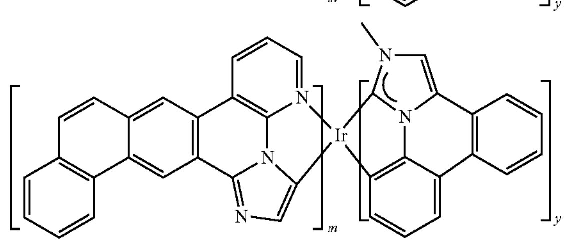

-continued
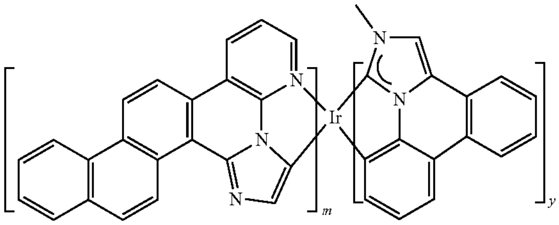
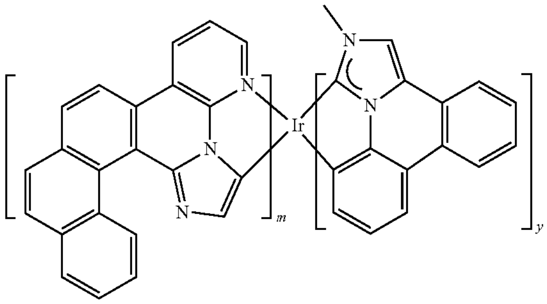
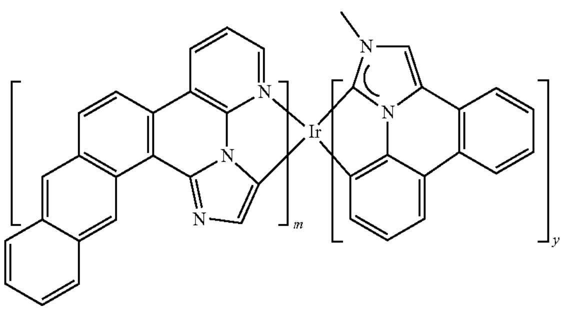
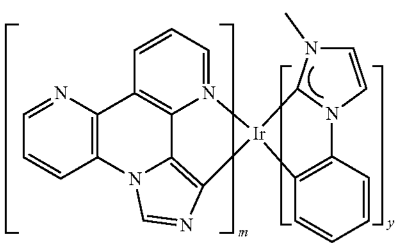
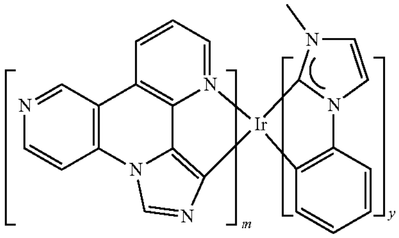
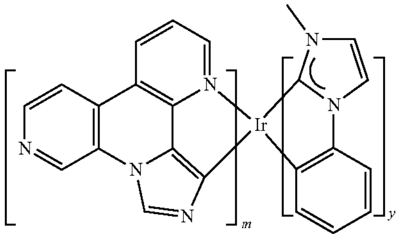
-continued
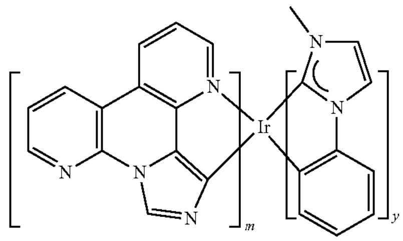
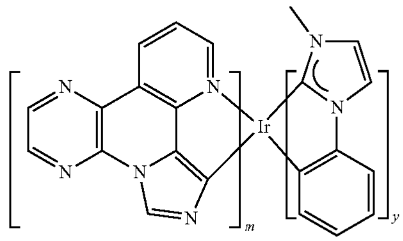
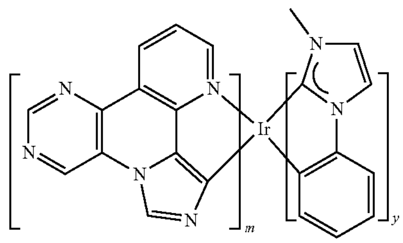
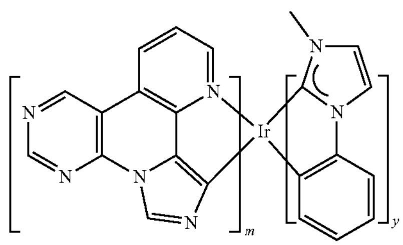
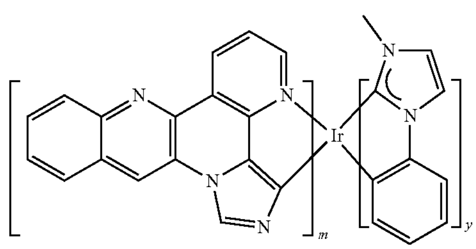
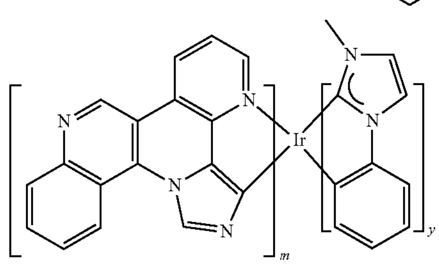
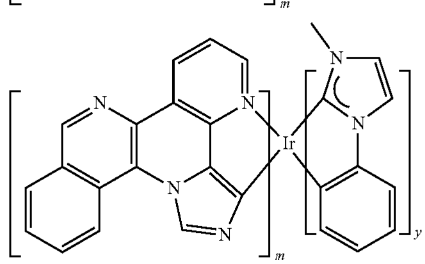

-continued
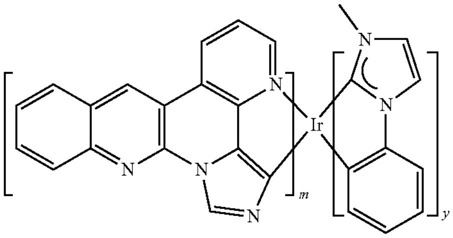
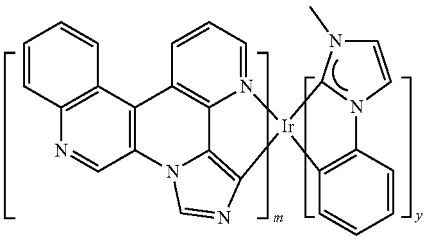
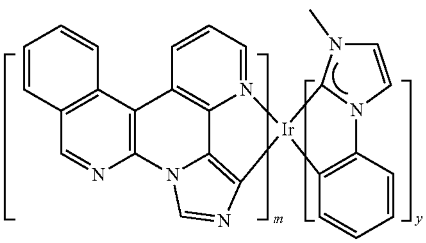
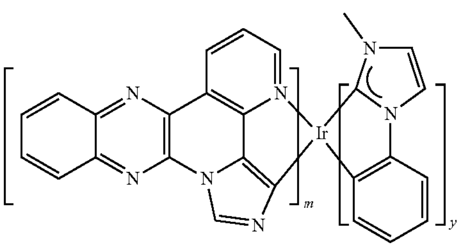
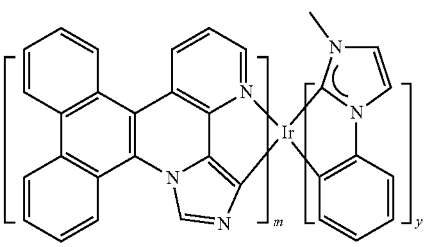
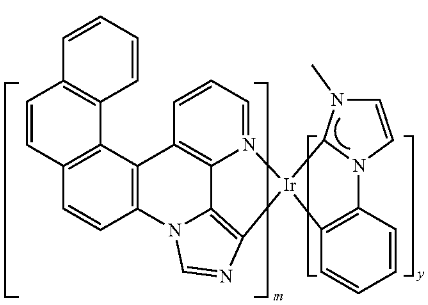
-continued
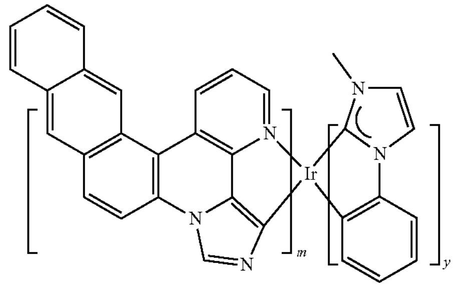
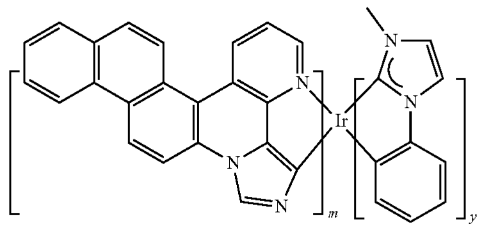
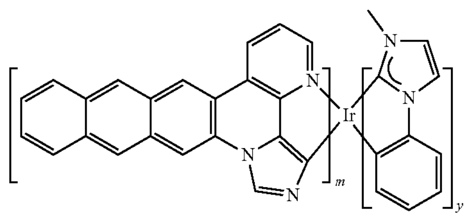
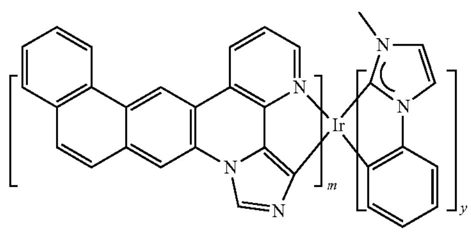
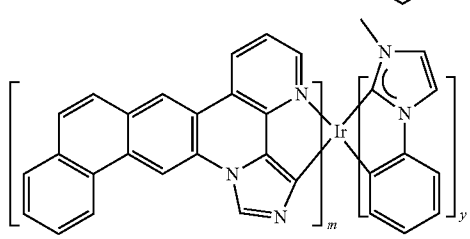
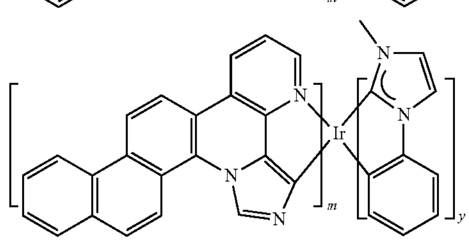
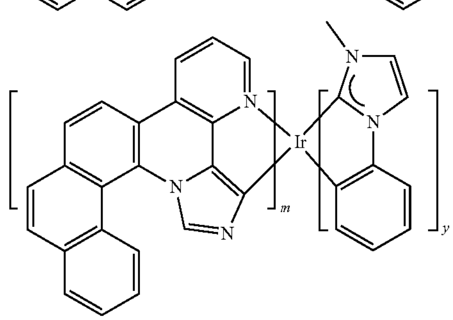

-continued
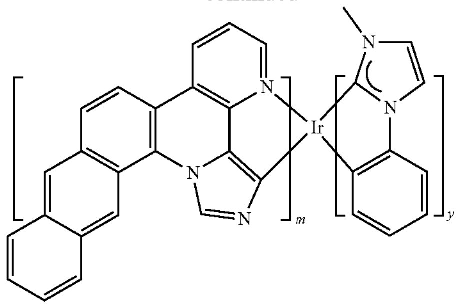
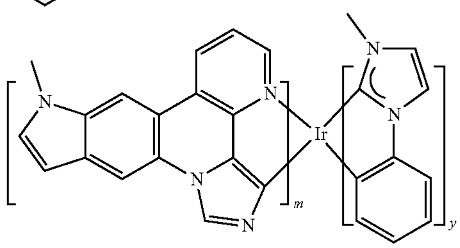
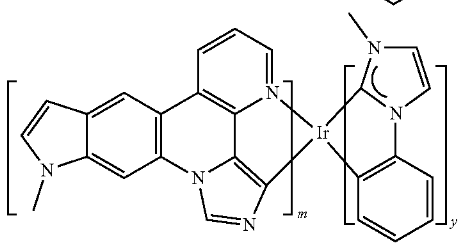
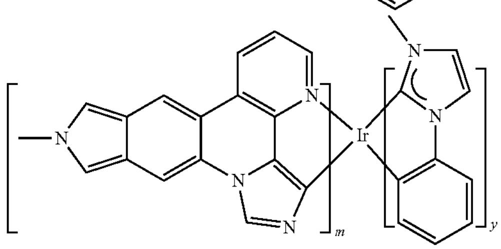
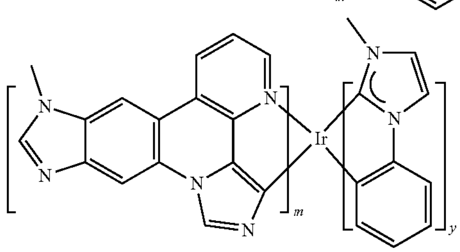
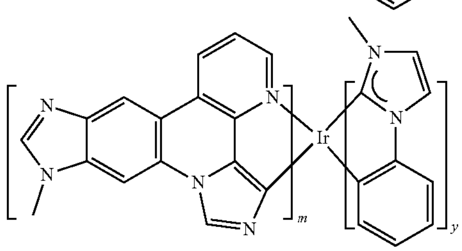
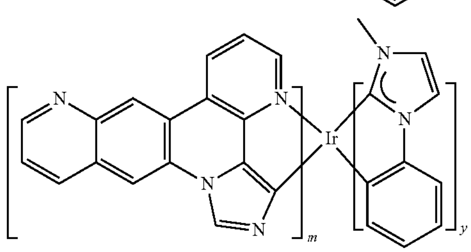
-continued
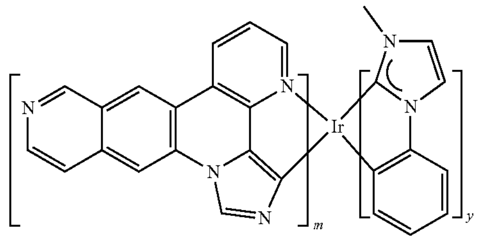
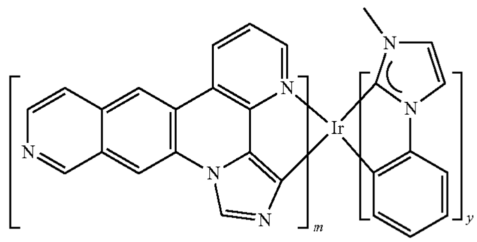
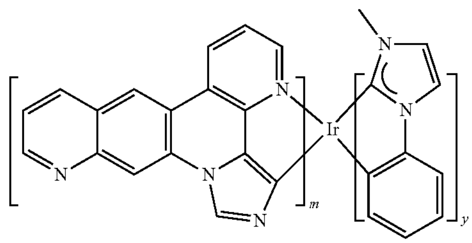
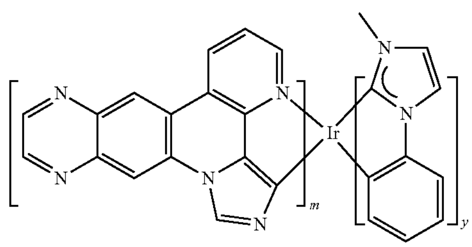
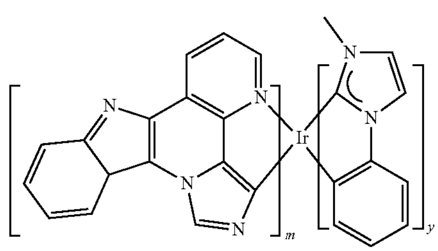
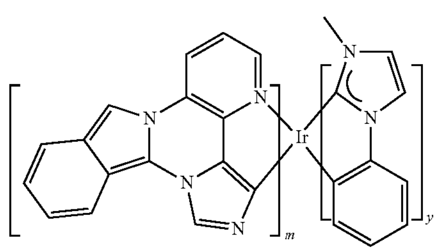
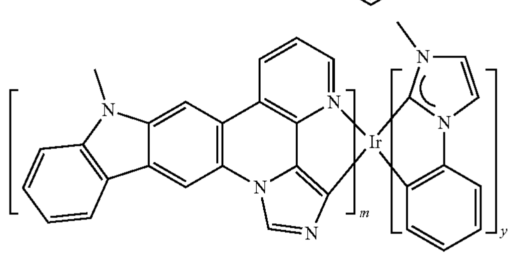

-continued
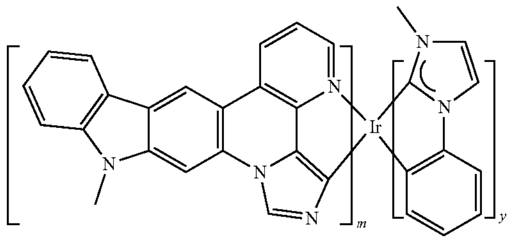
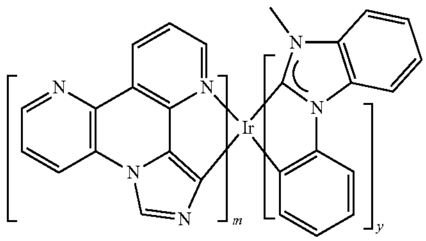
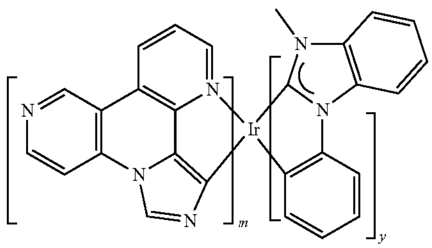
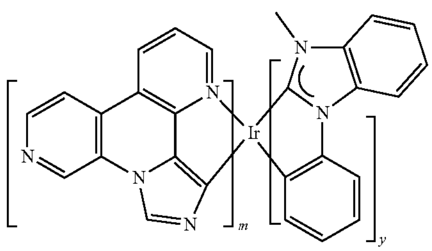
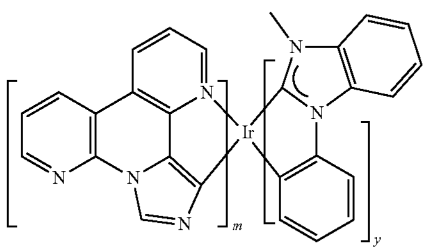
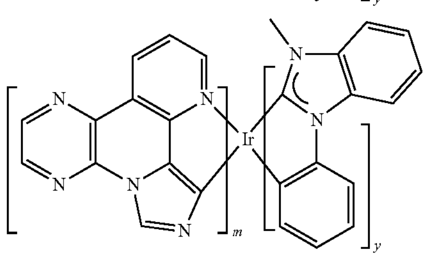
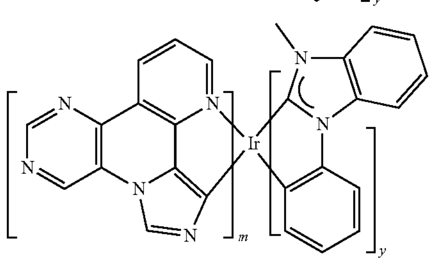
-continued
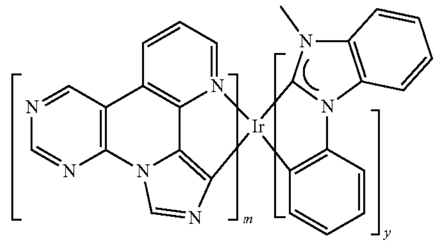
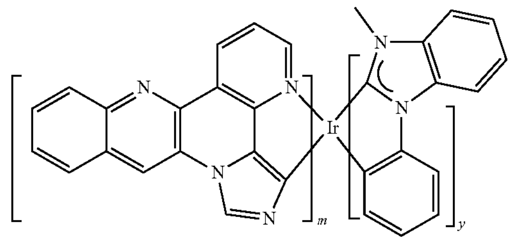
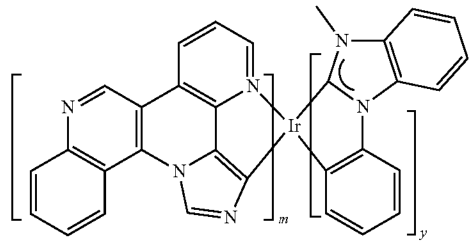
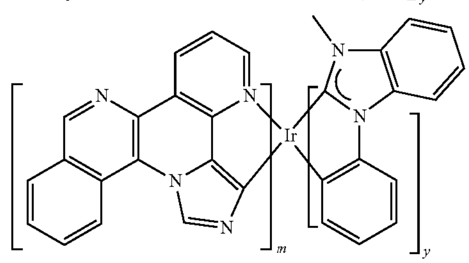
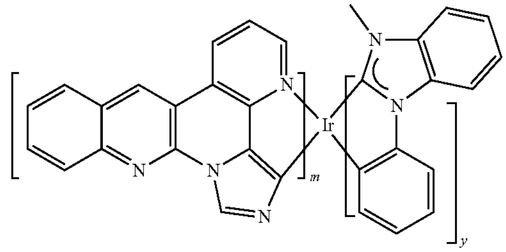
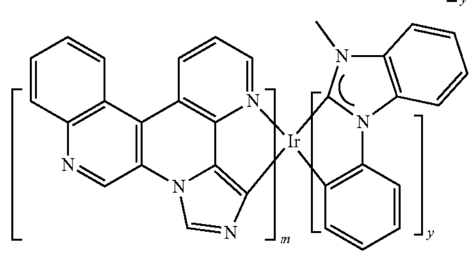
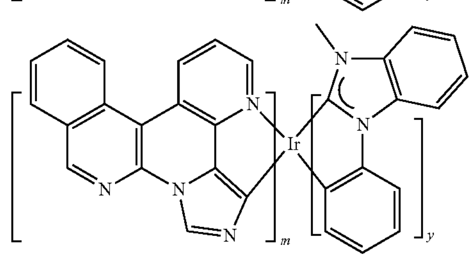

-continued
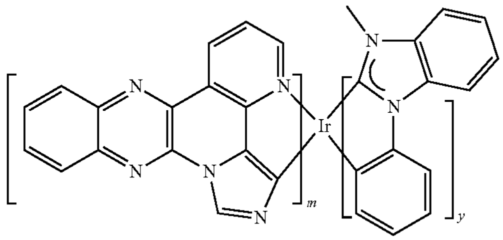
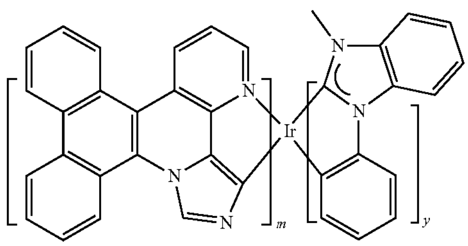
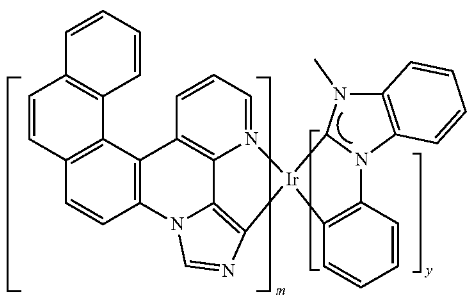
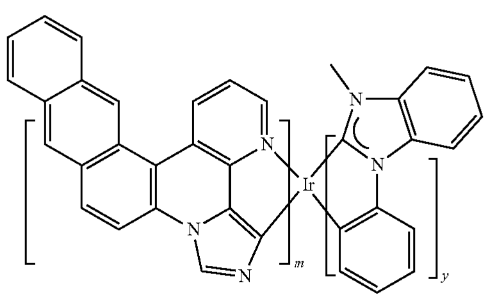
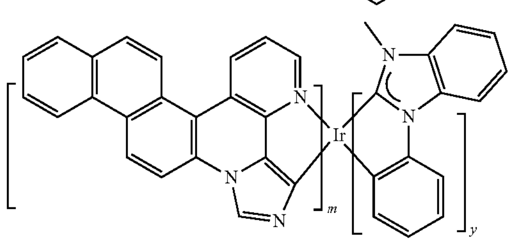
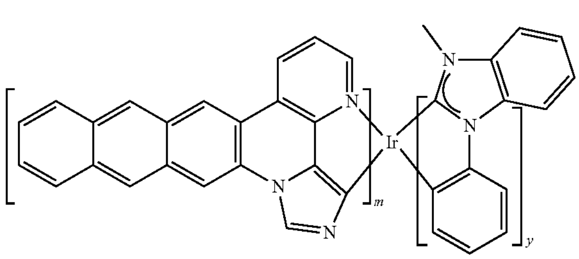
-continued
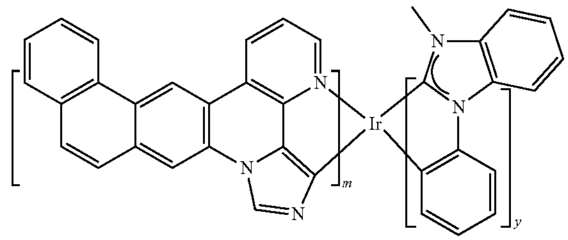
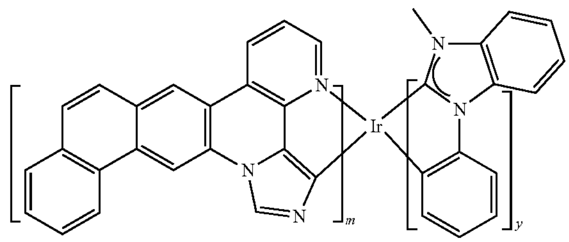
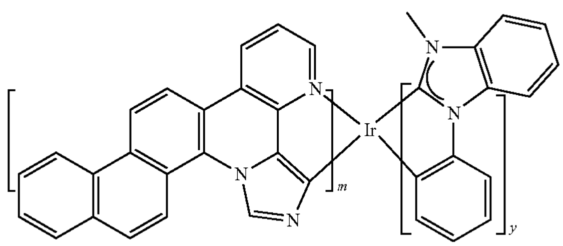
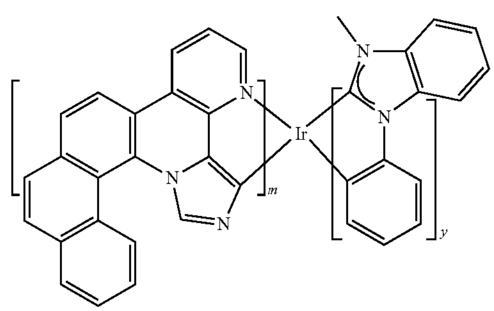
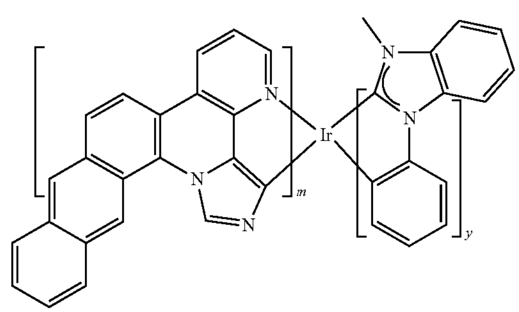
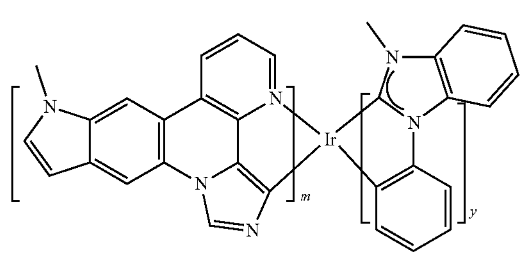

-continued
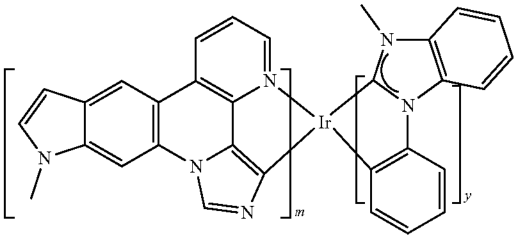
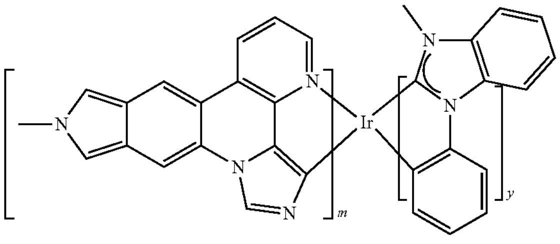
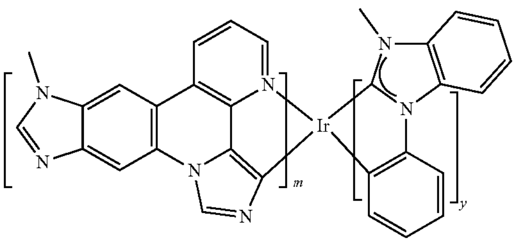
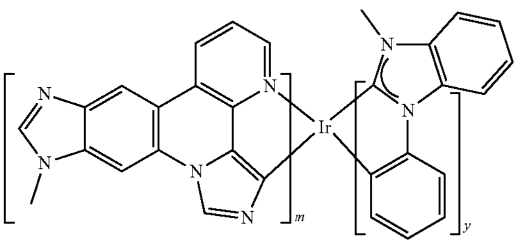
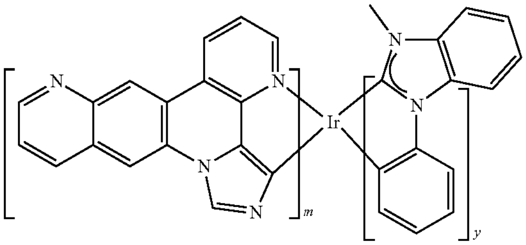
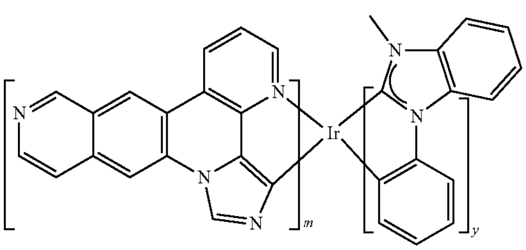
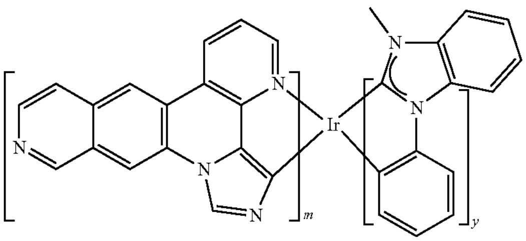
-continued
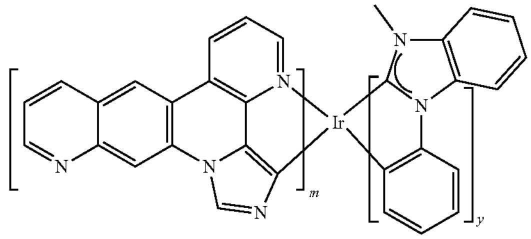
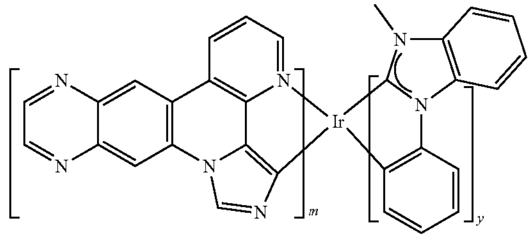
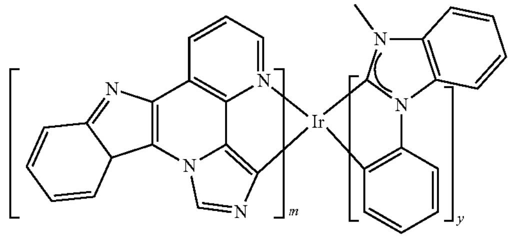
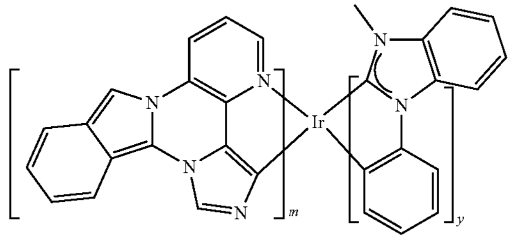
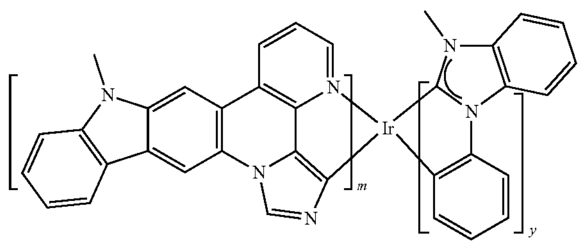
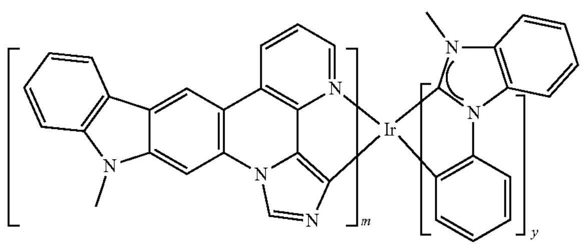
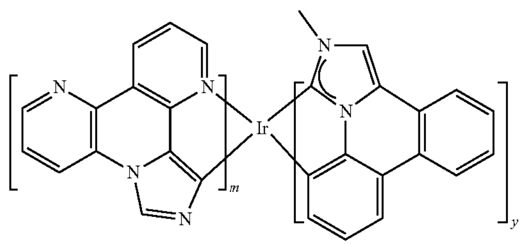

-continued
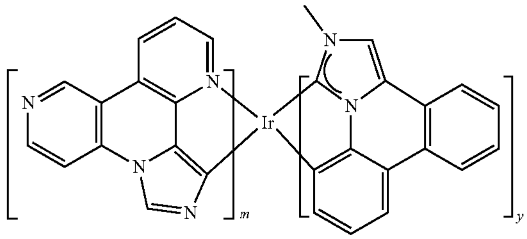
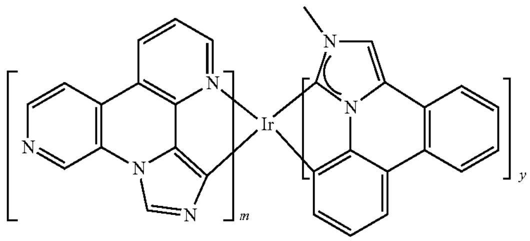
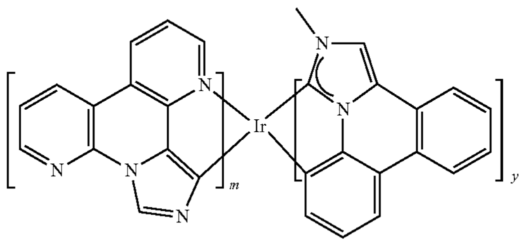
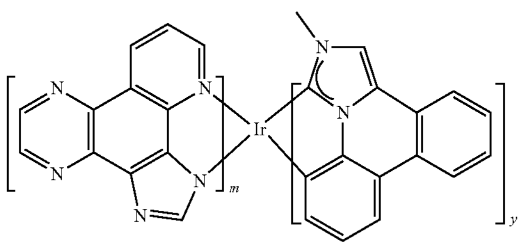
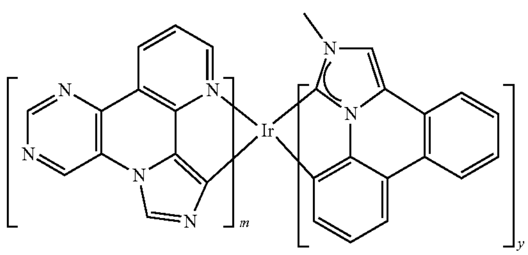
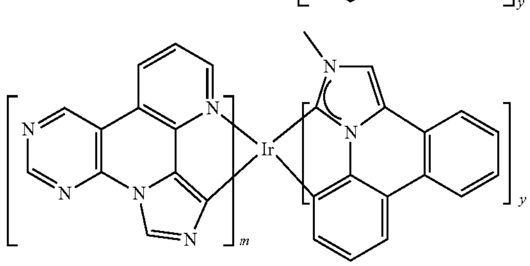
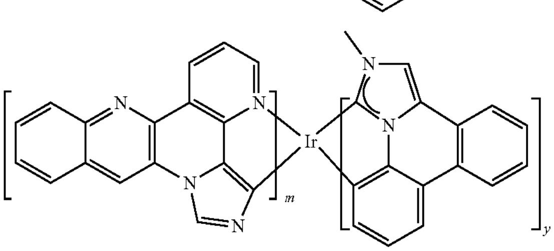
-continued
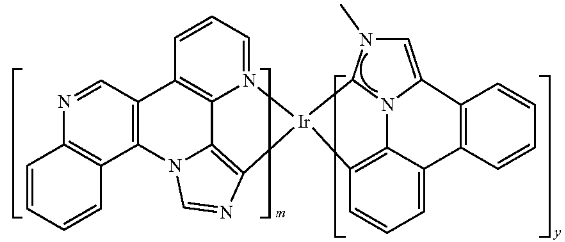
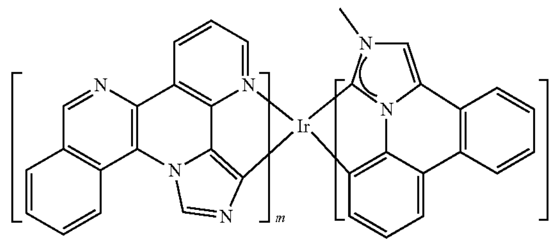
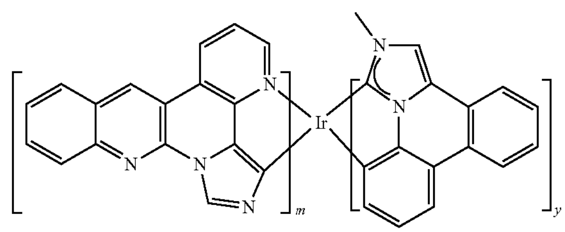
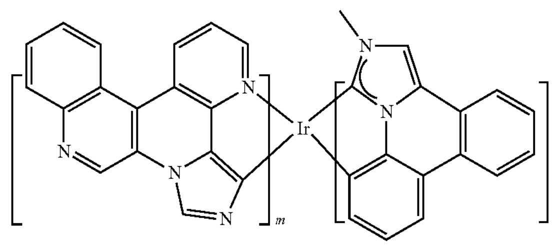
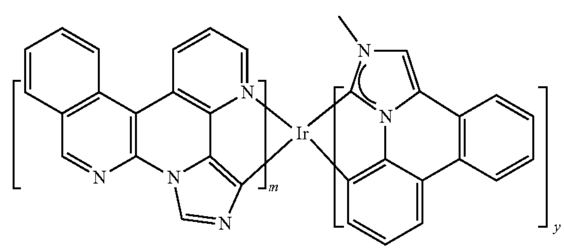
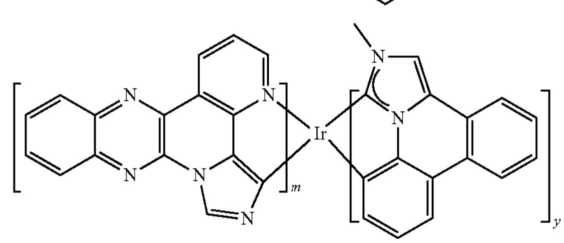
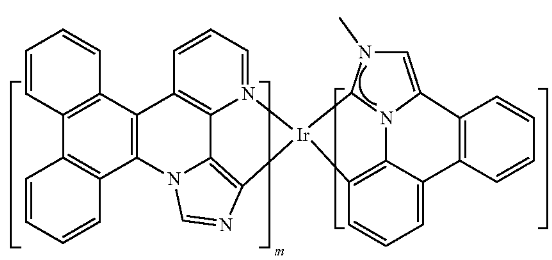

-continued
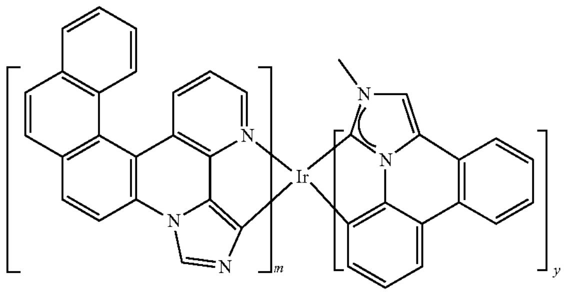
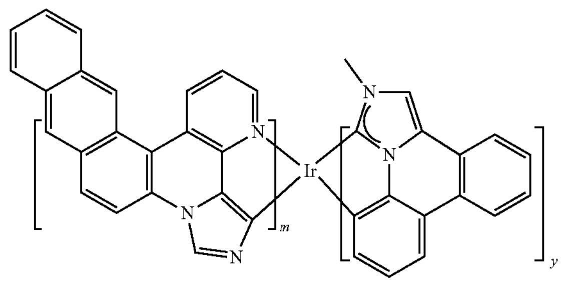
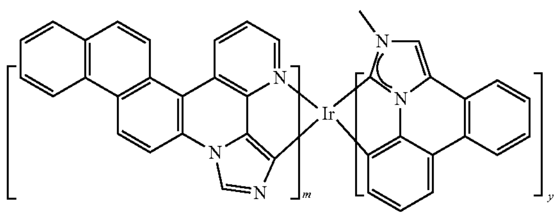
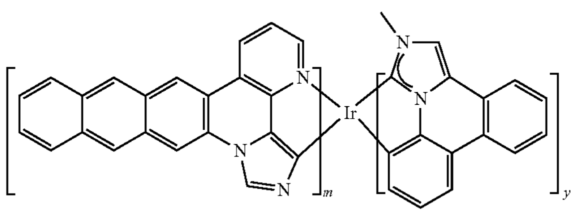
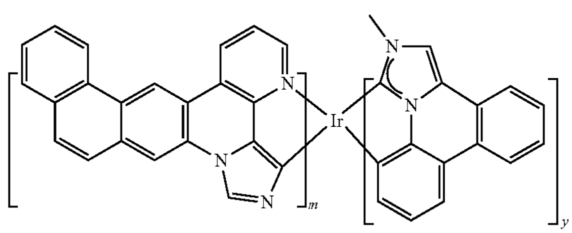
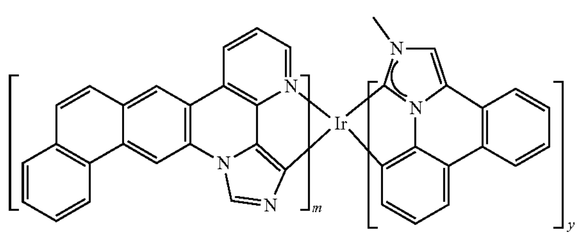
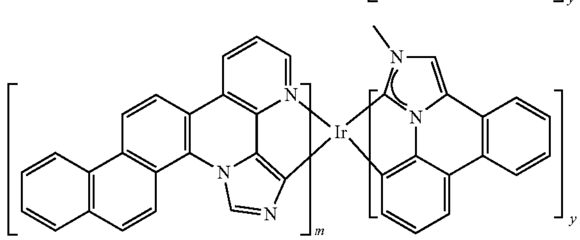
-continued
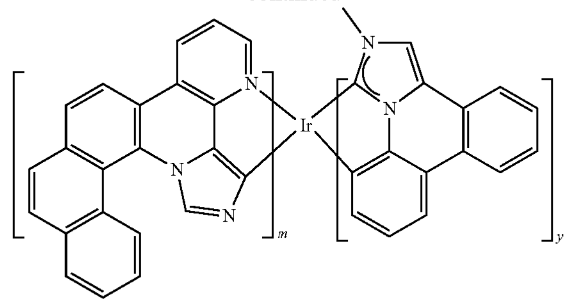
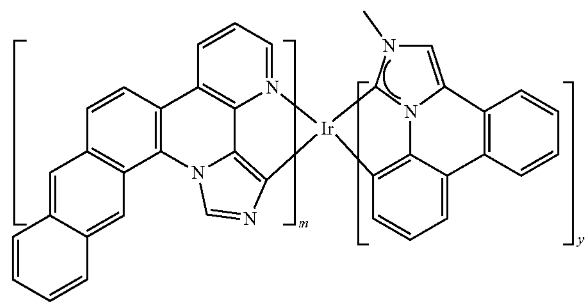
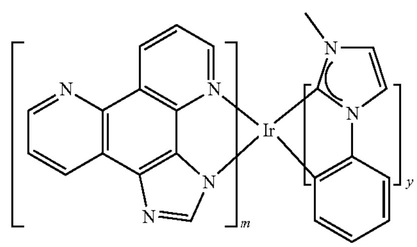
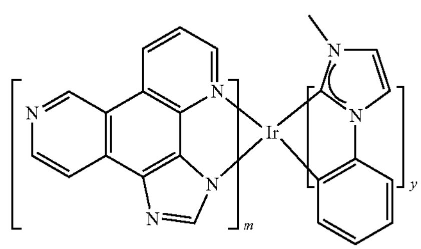
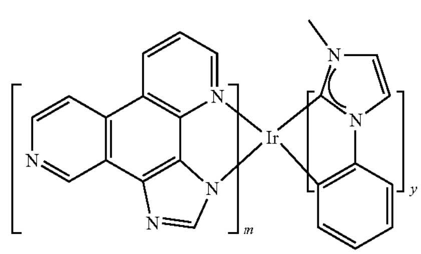
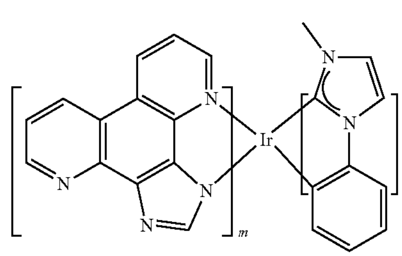

-continued
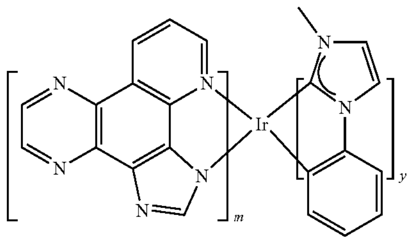
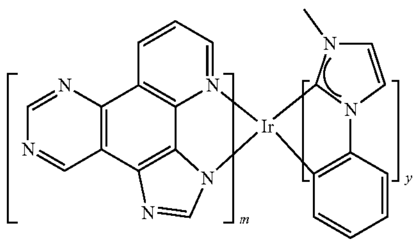
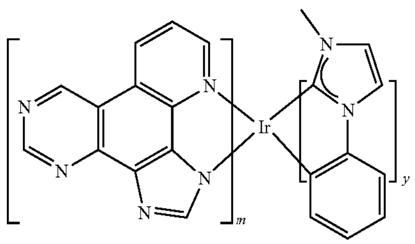
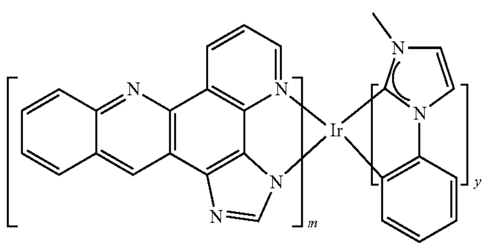
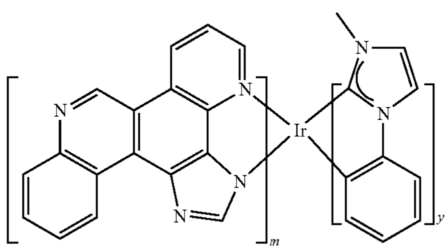
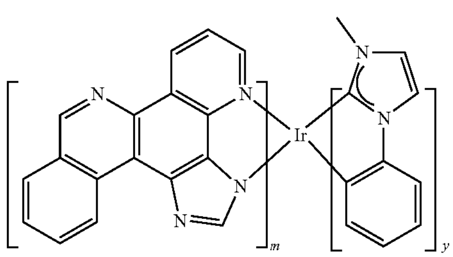
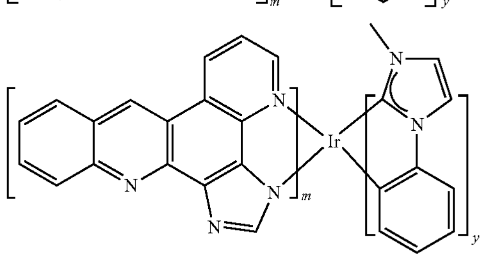
-continued
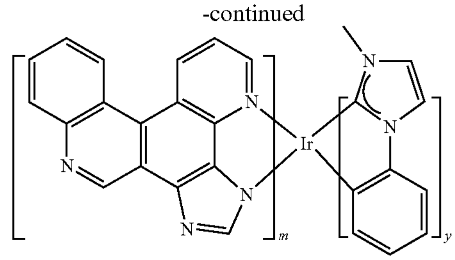
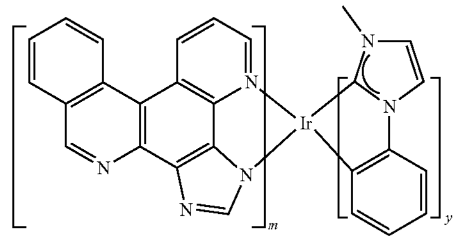
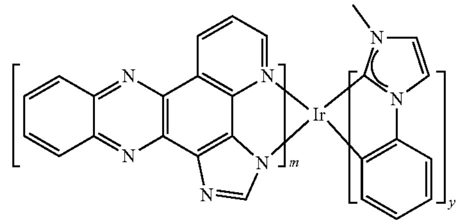
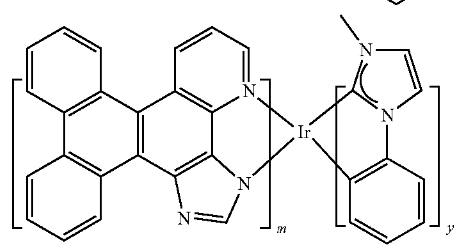
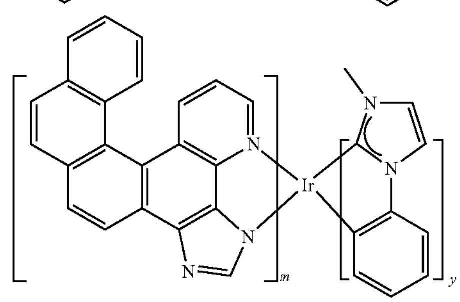
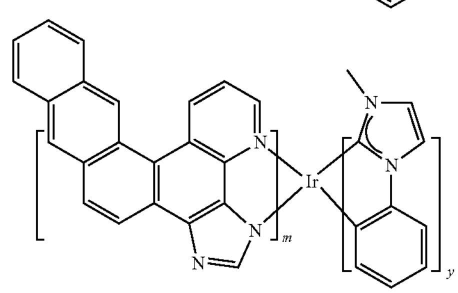
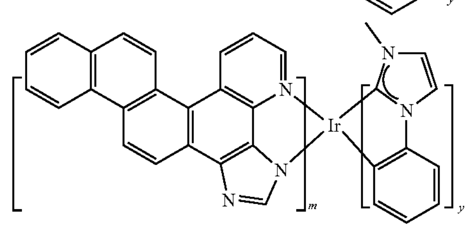

-continued
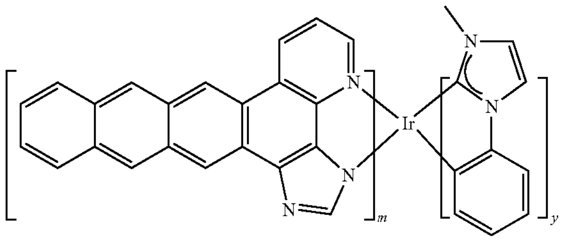
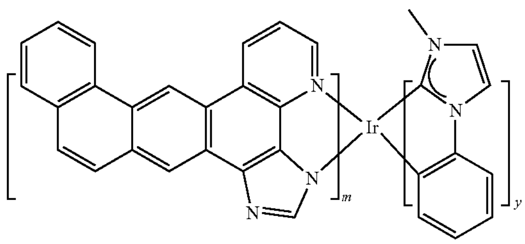
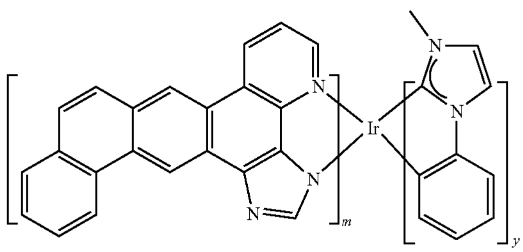
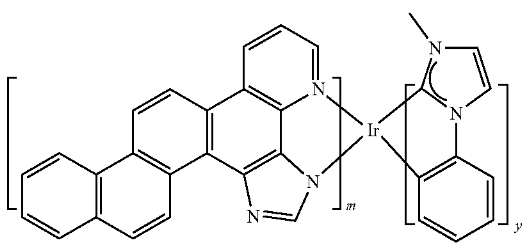
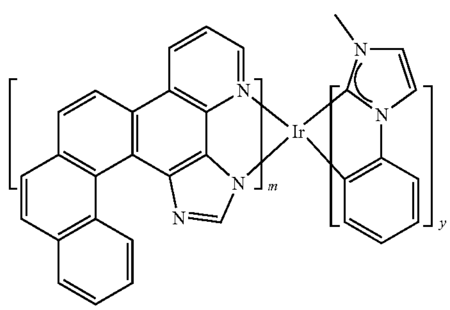
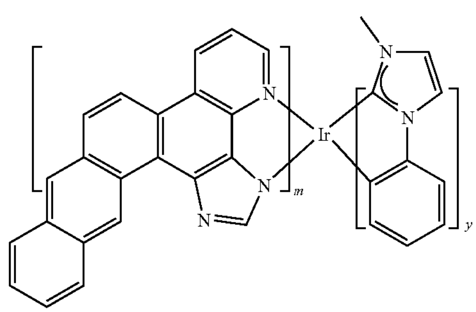
-continued
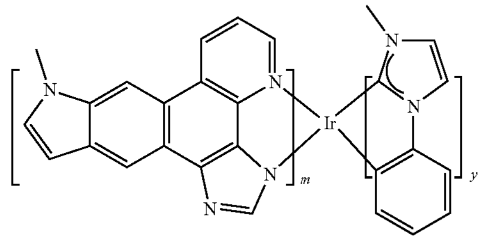
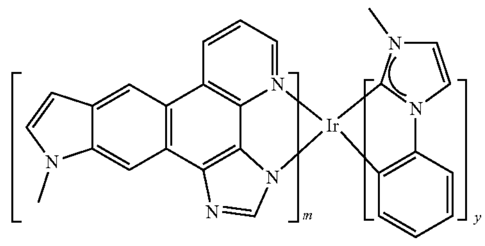
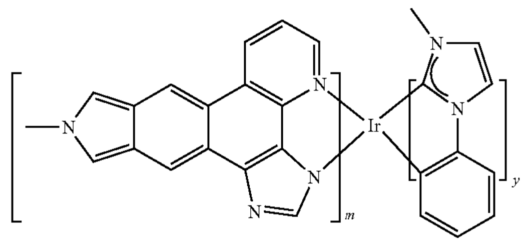
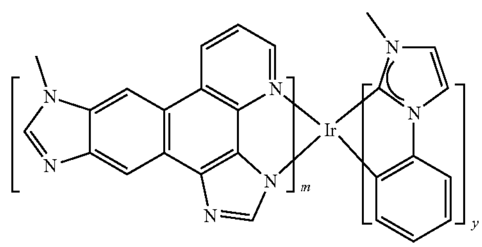
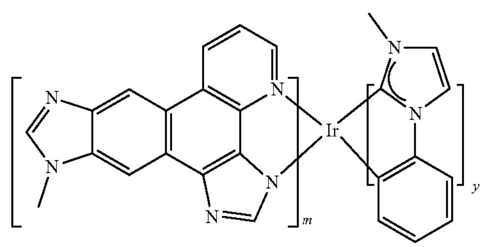
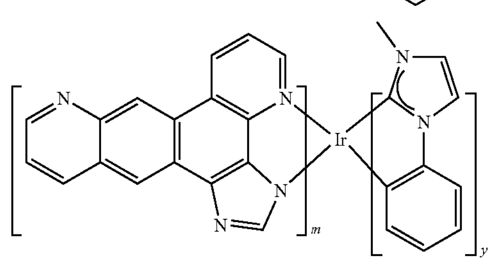
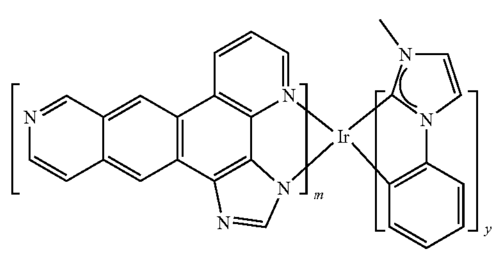

-continued
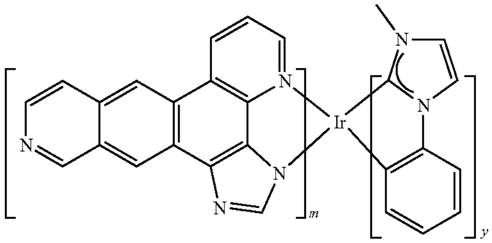
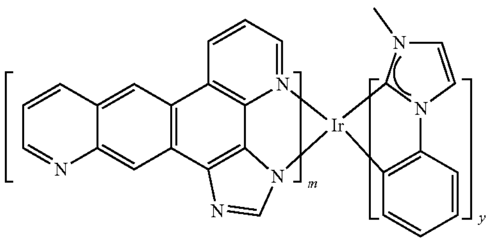
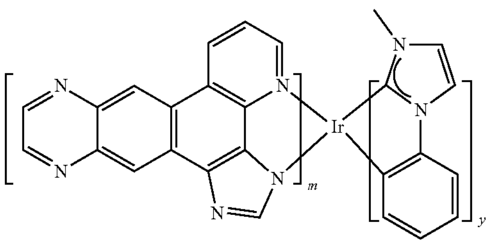
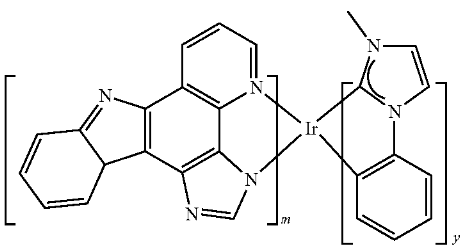
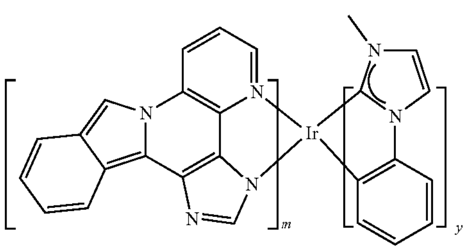
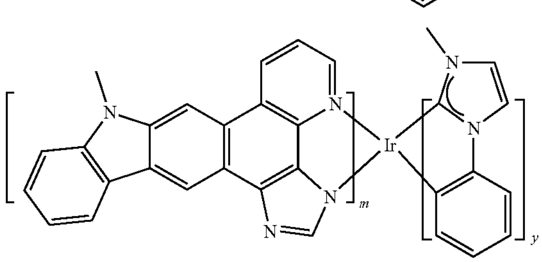
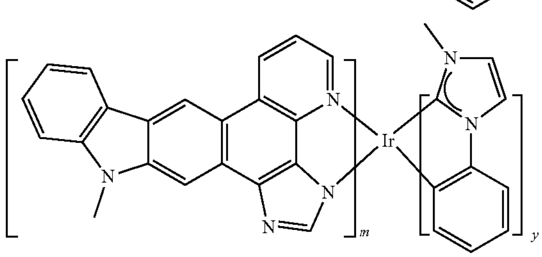
-continued
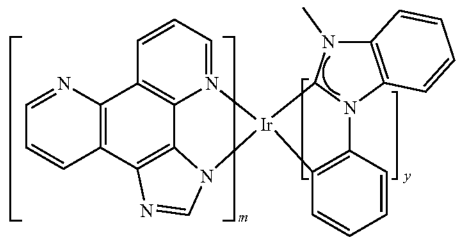
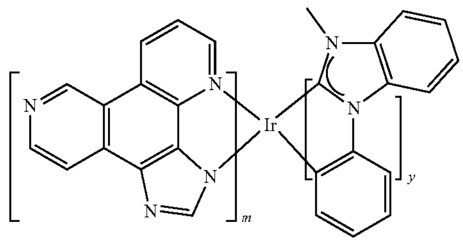
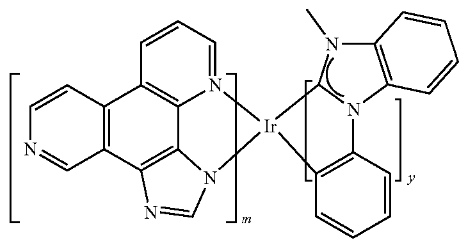
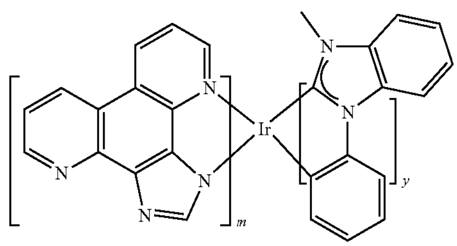
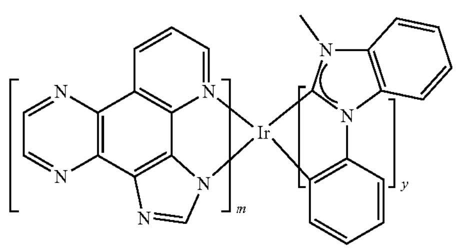
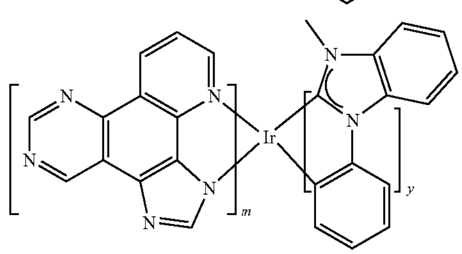
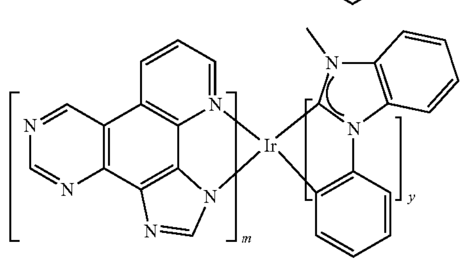

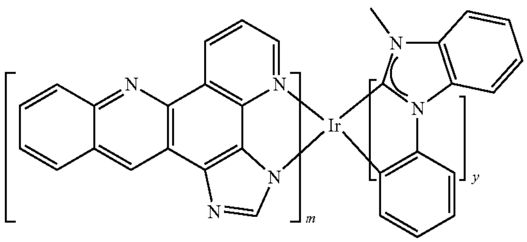
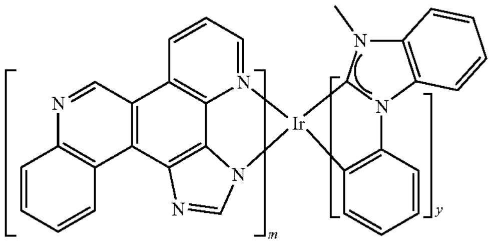
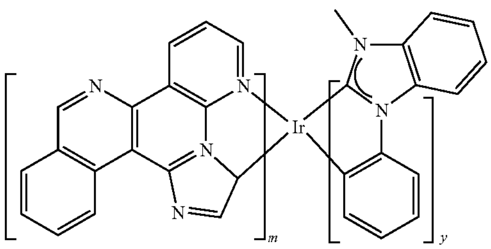
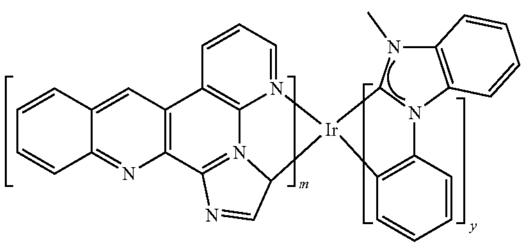
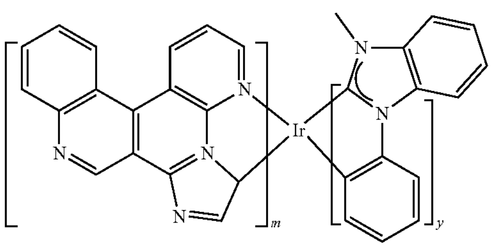
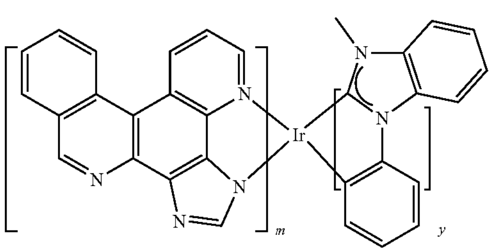
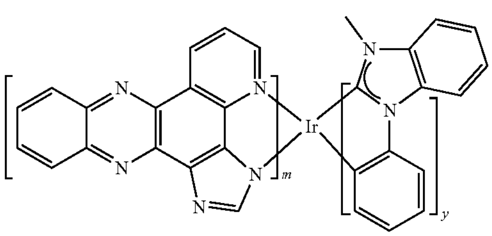
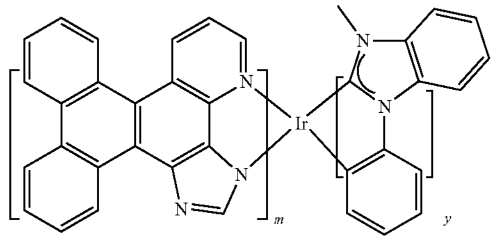
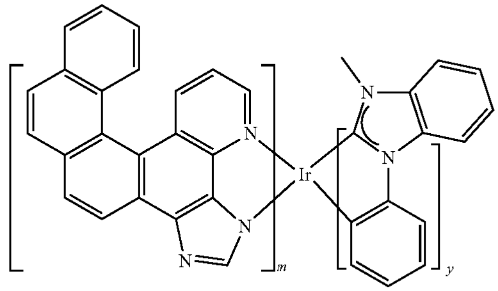
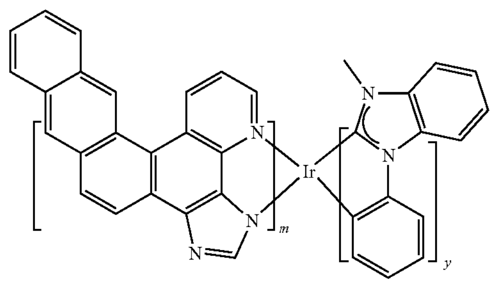
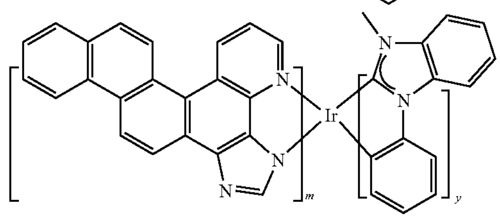
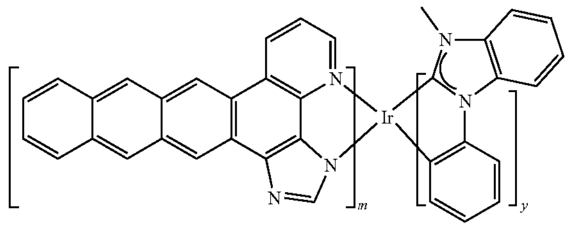
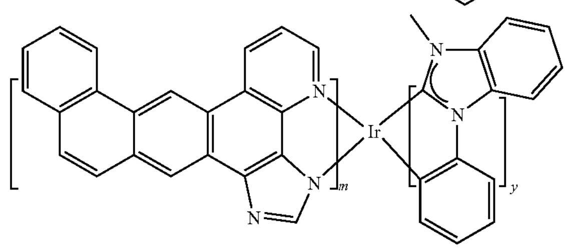
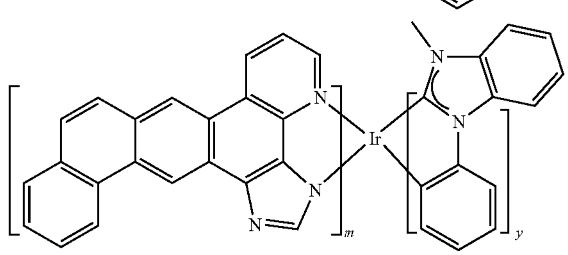

-continued
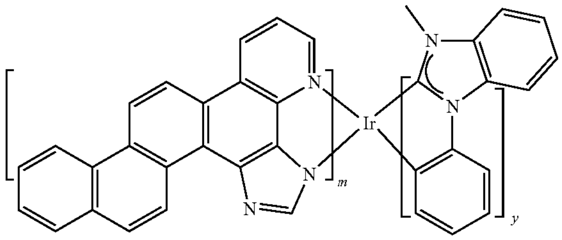
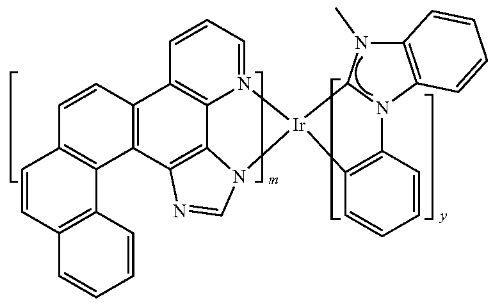
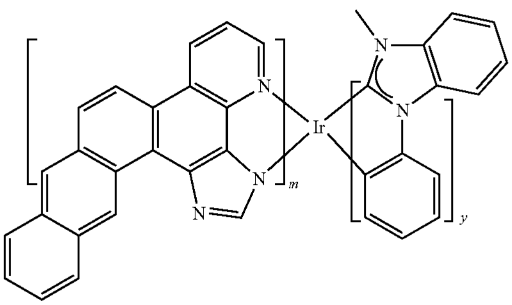
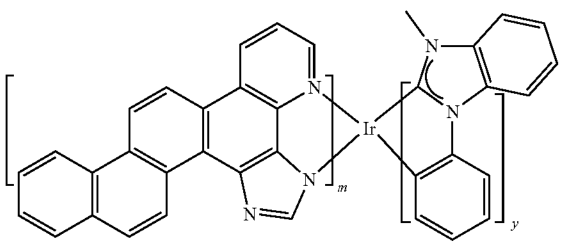
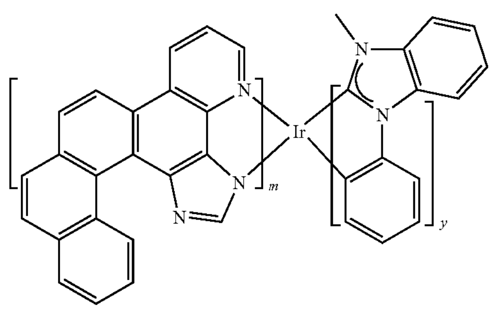
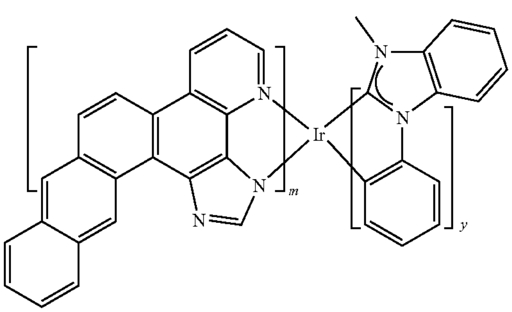
-continued
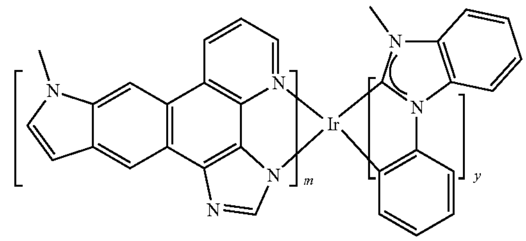
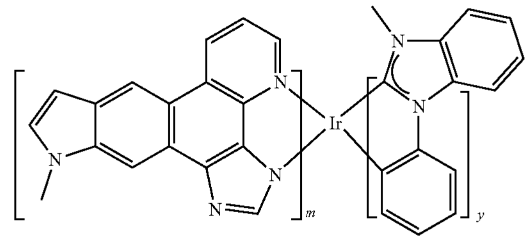
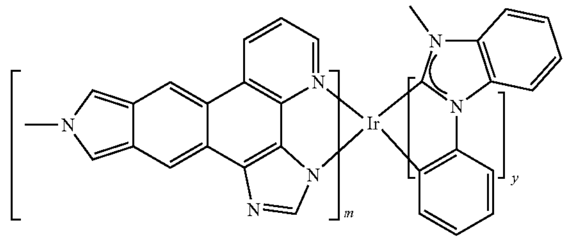
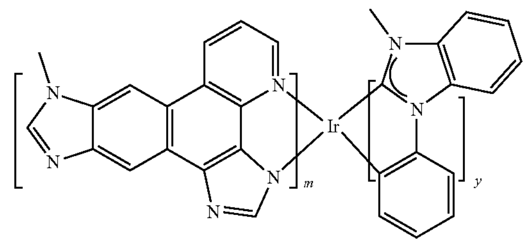
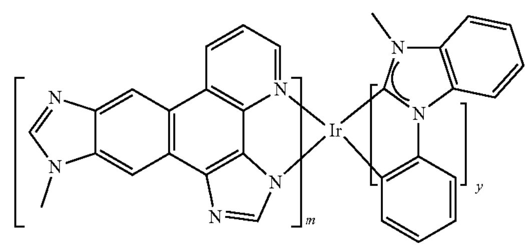
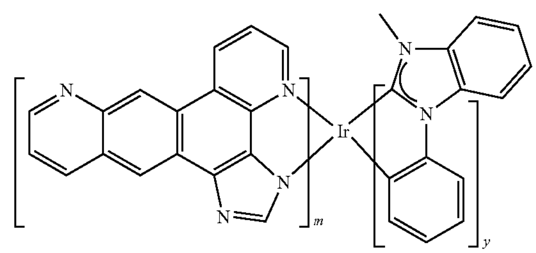
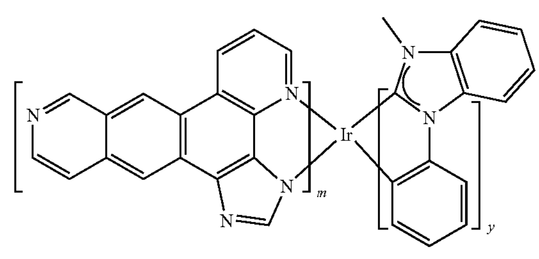

-continued
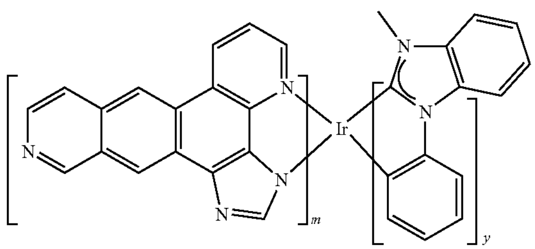
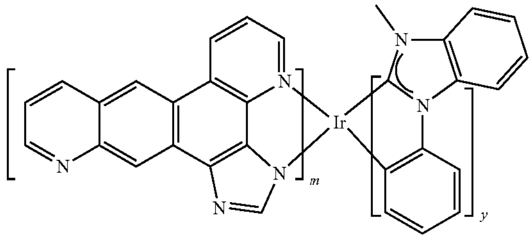
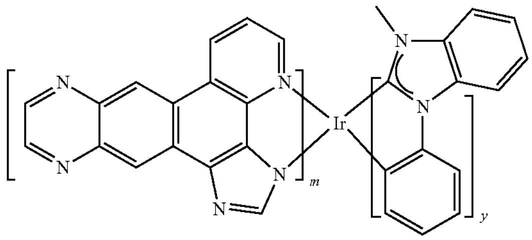
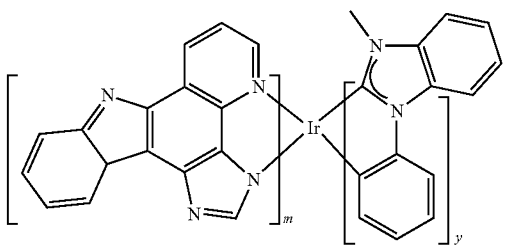
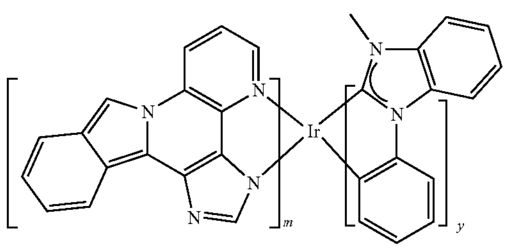
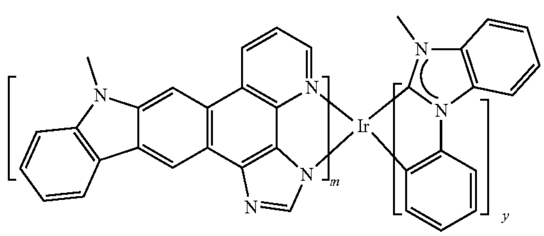
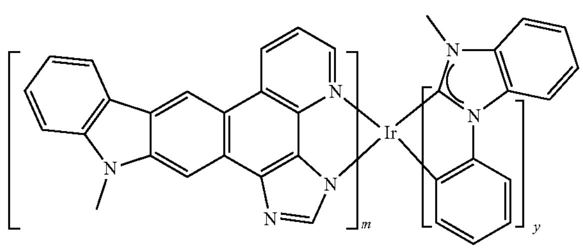
-continued
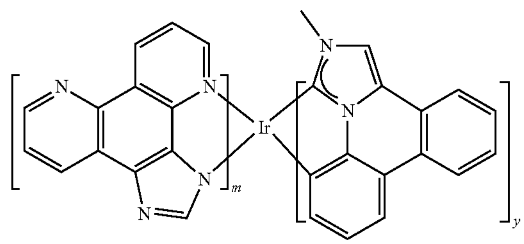
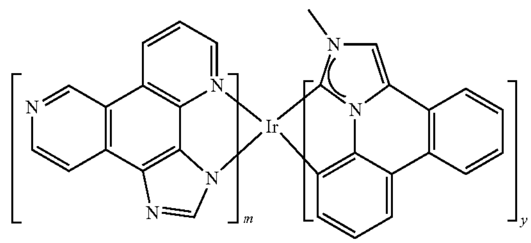
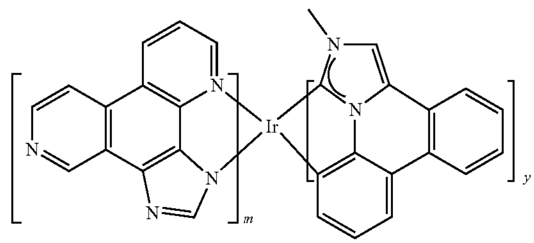
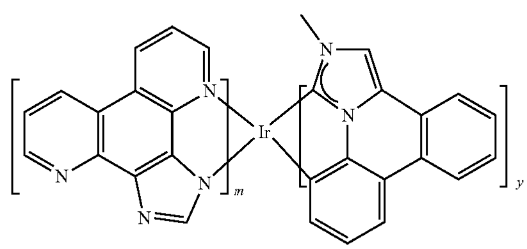
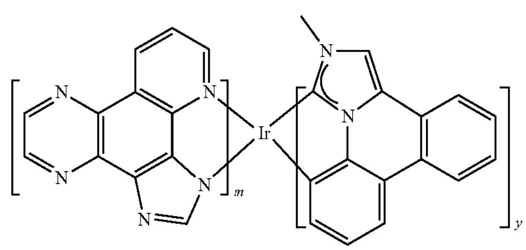
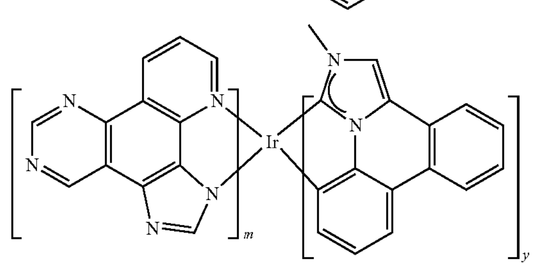
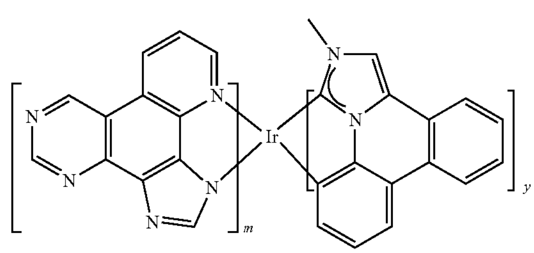

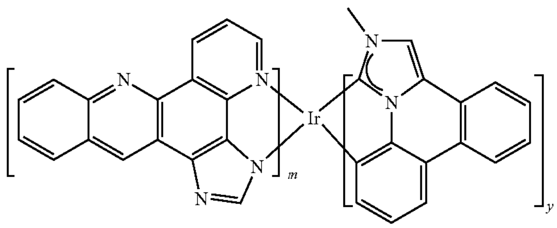
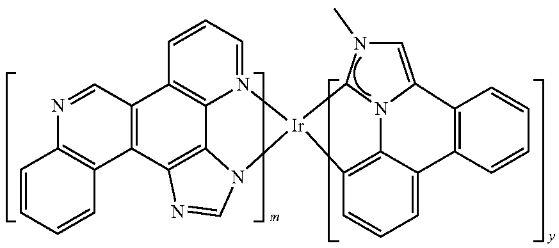
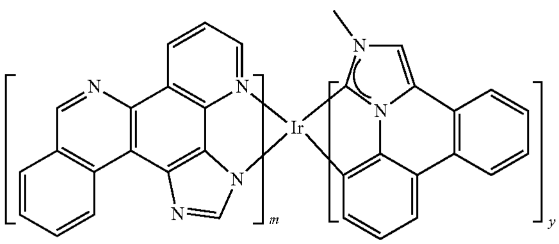
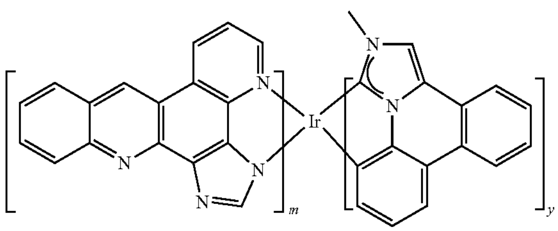
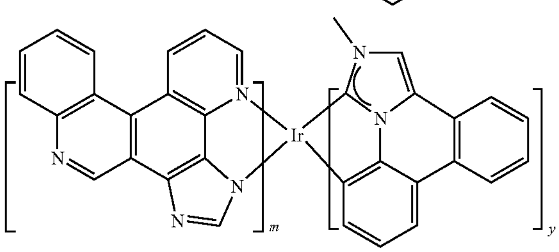
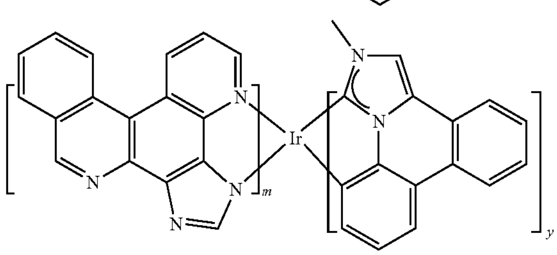
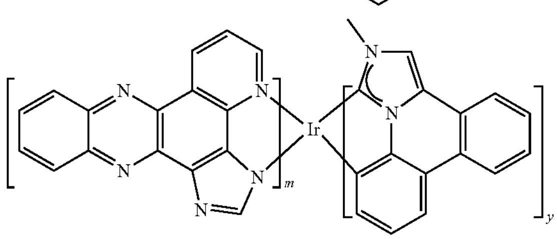
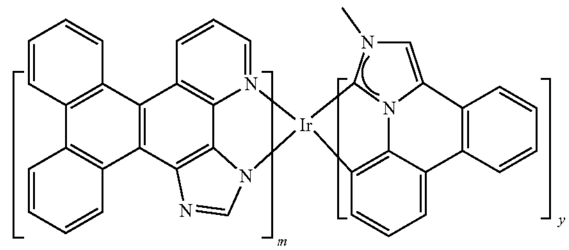
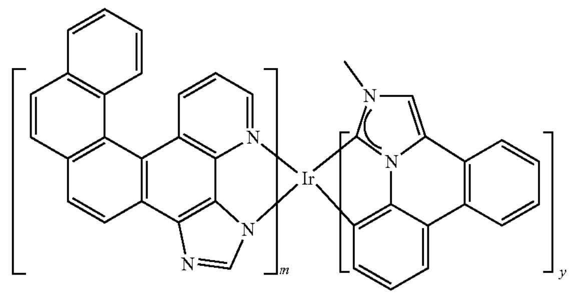
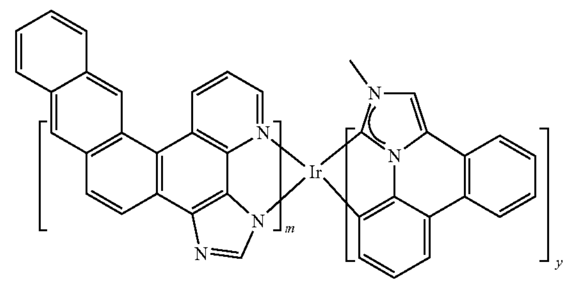
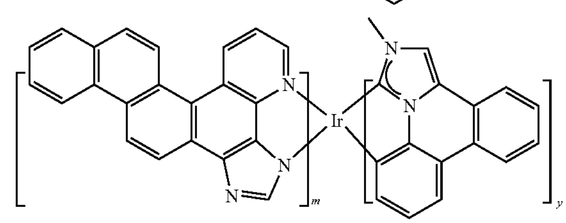
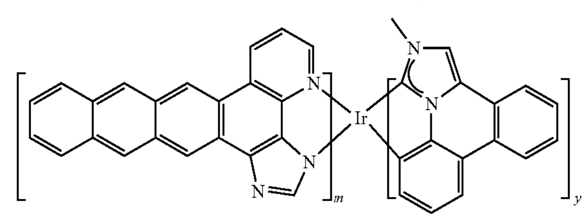
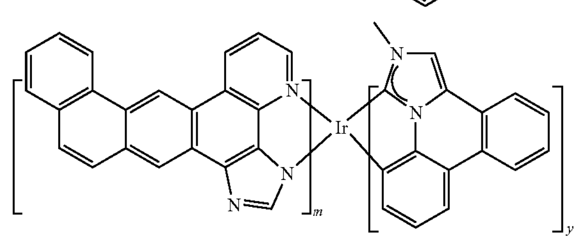
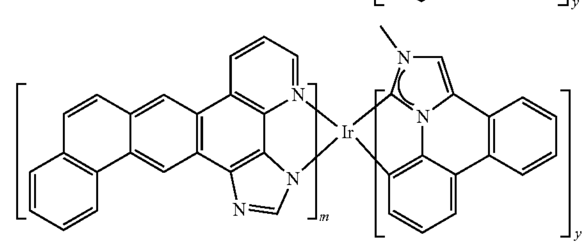

-continued
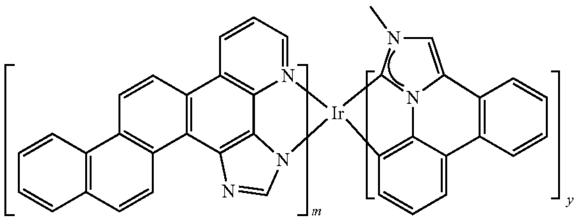
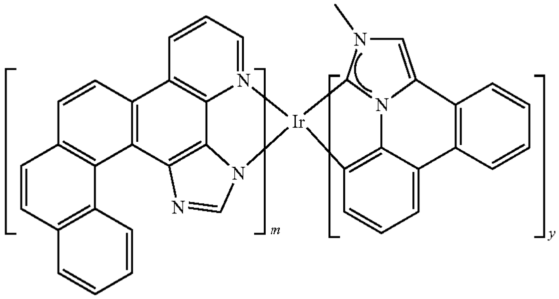
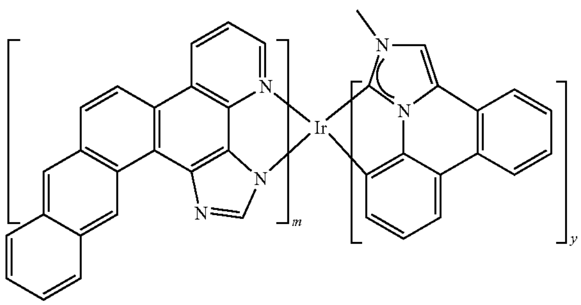
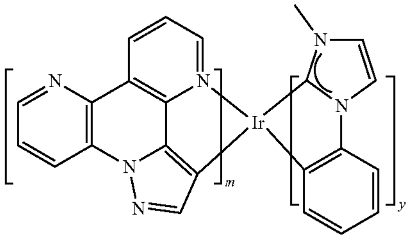
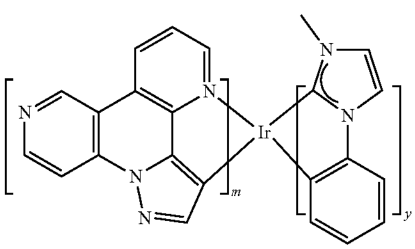
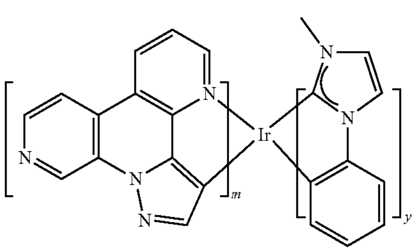
-continued
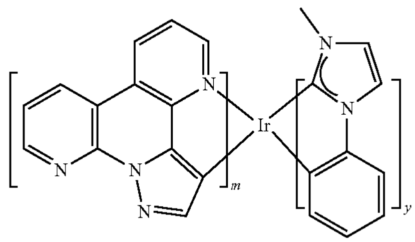
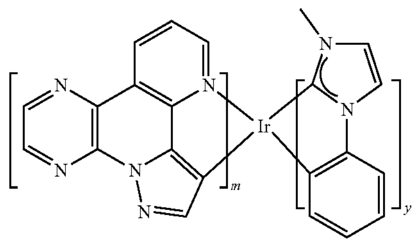
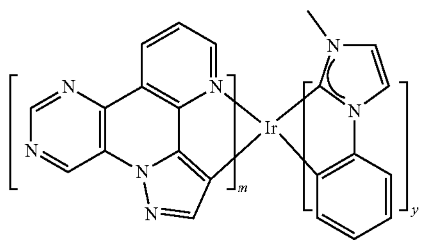
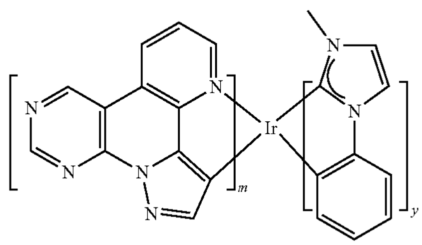
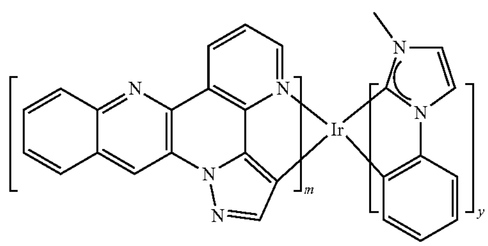
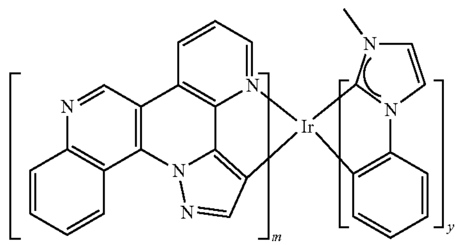
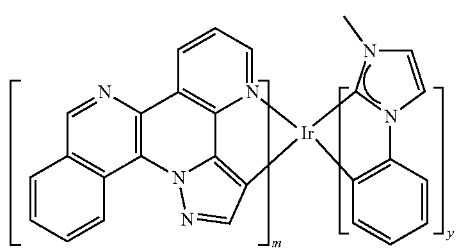

-continued
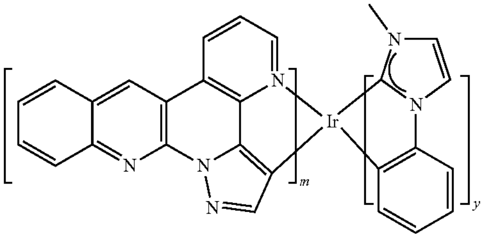
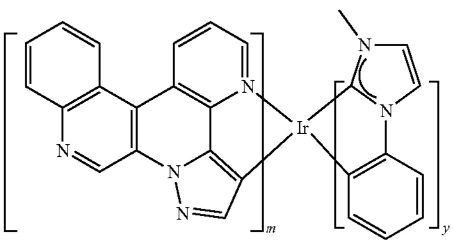
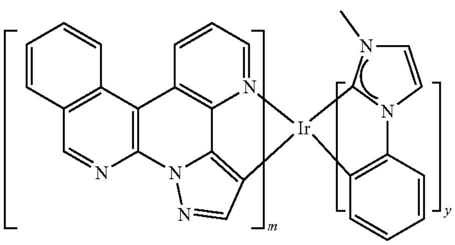
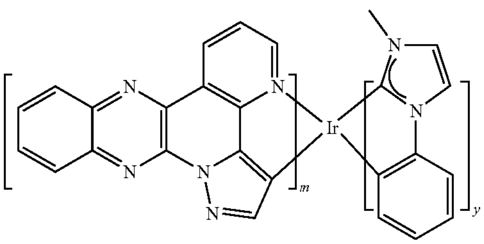
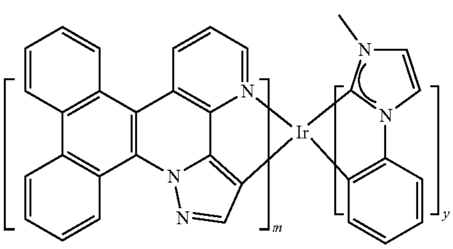
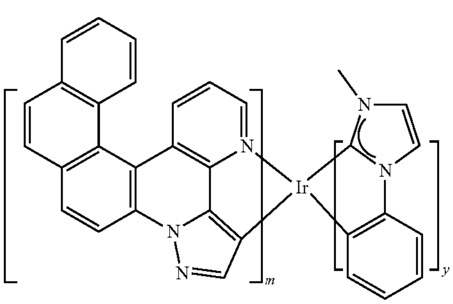
-continued
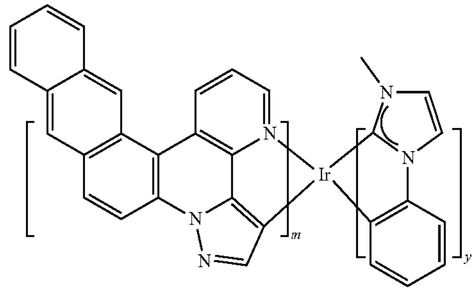
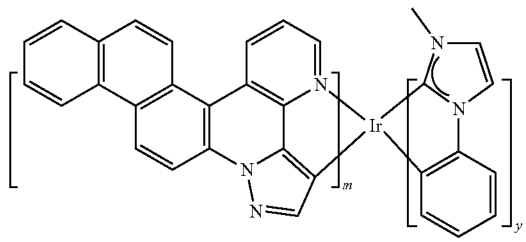
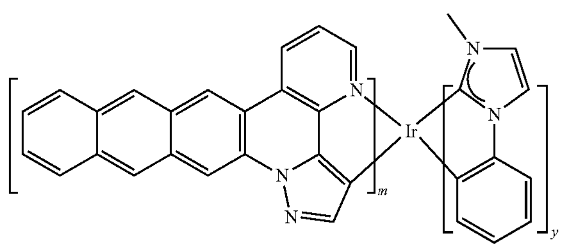
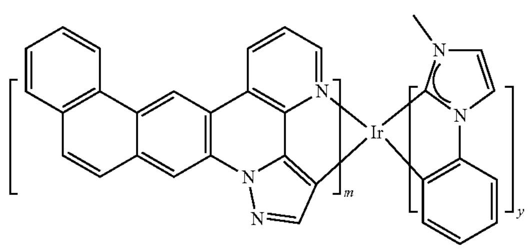
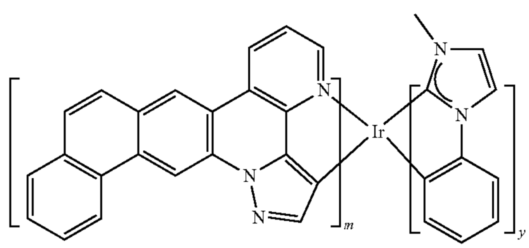
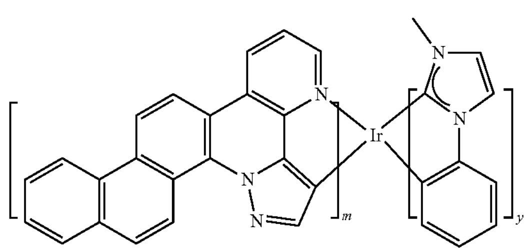

-continued
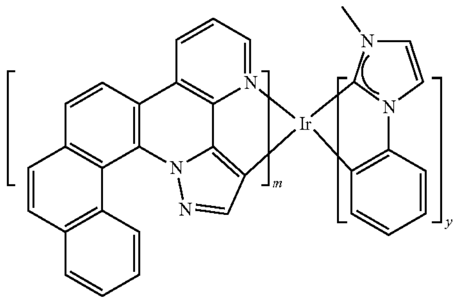
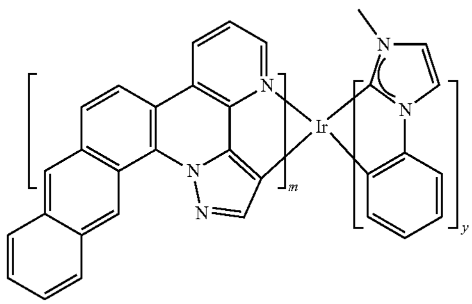
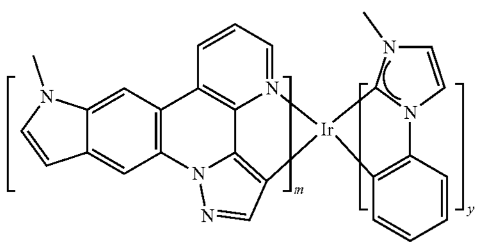
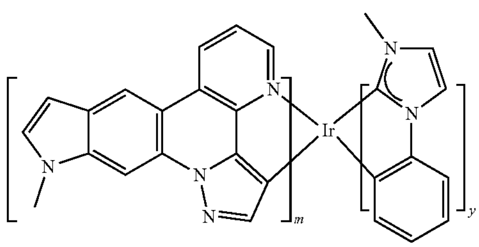
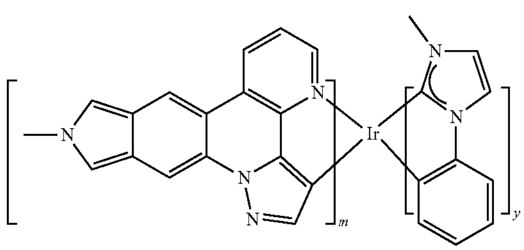
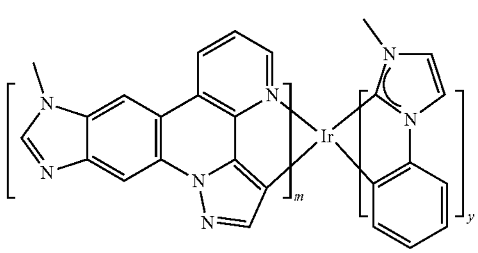
-continued
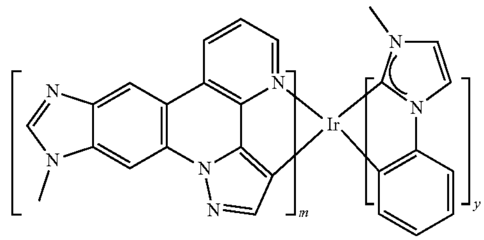
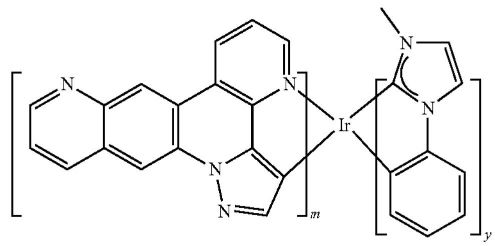
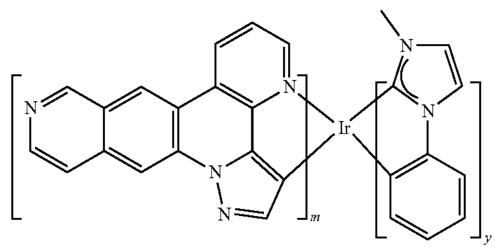
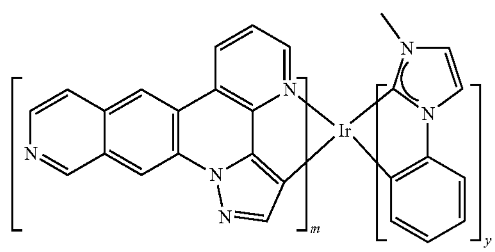
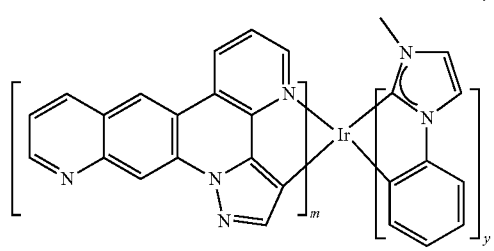
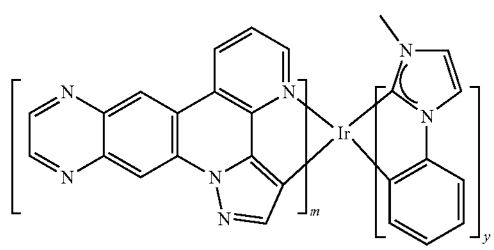
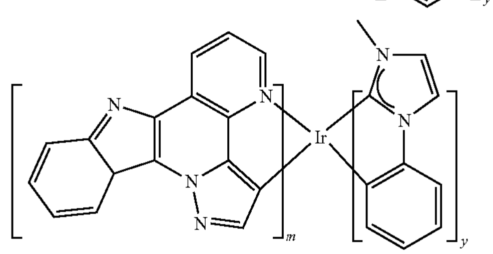

-continued
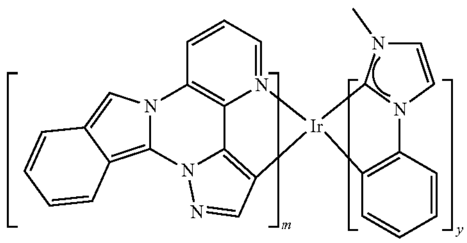
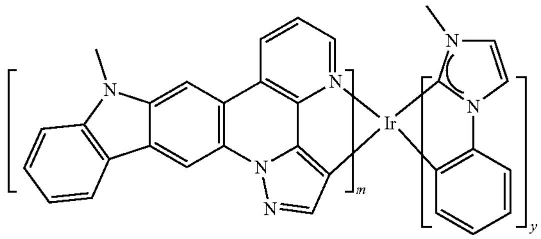
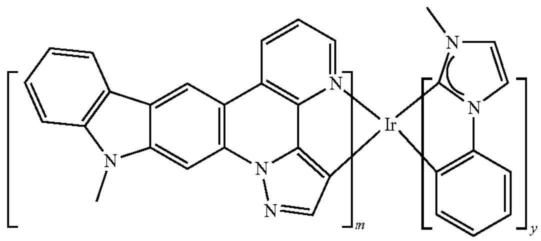
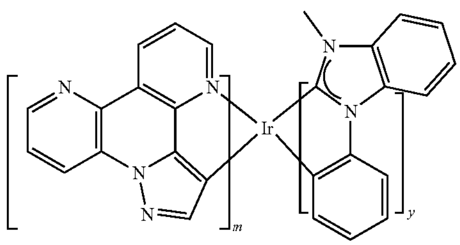
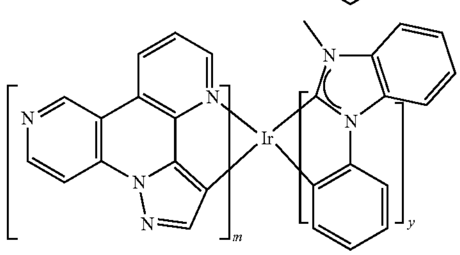
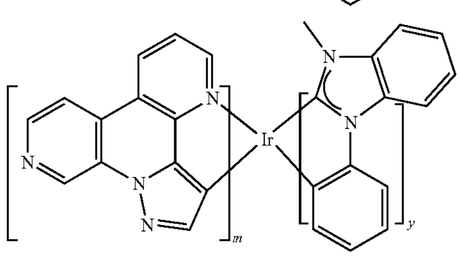
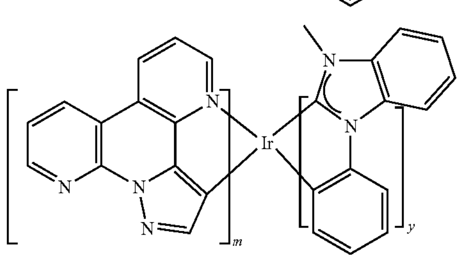
-continued
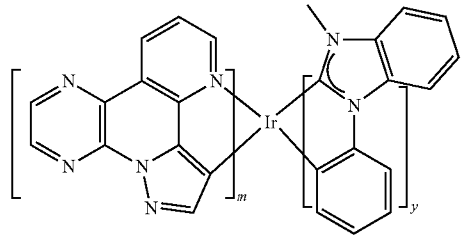
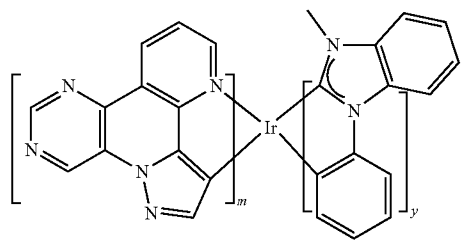
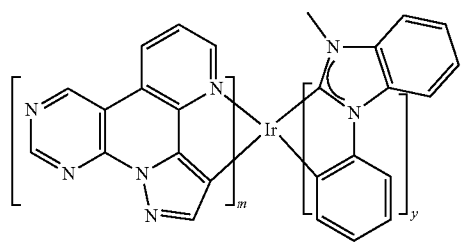
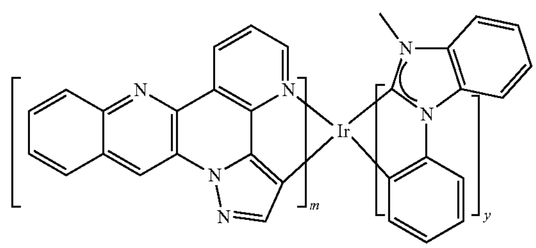
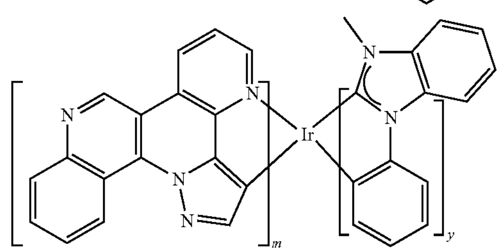
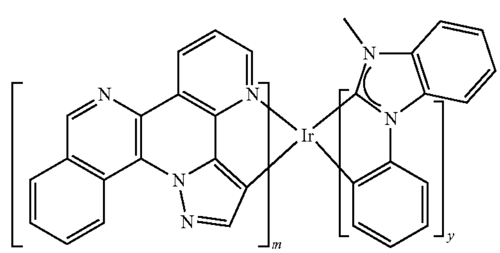
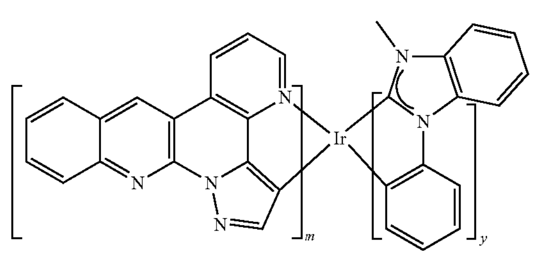

-continued
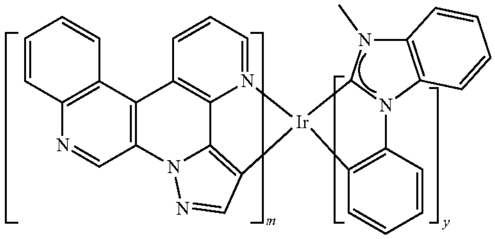
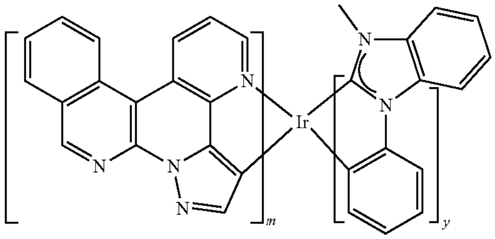
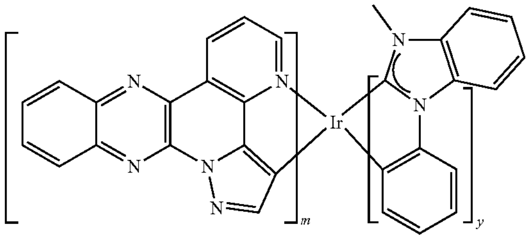
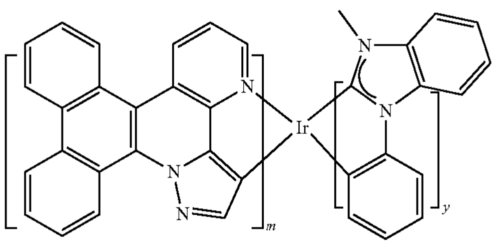
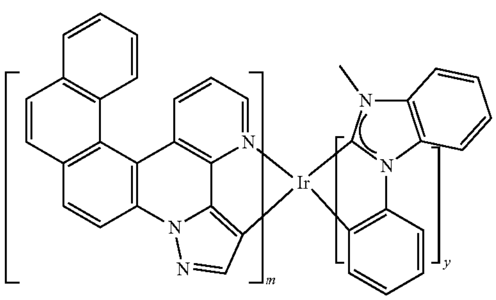
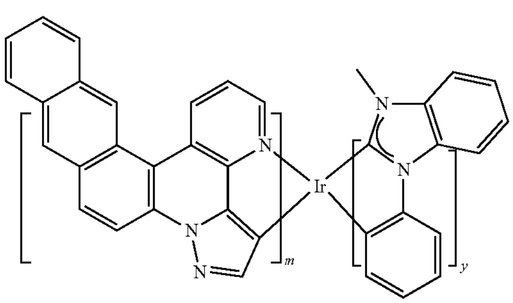
-continued
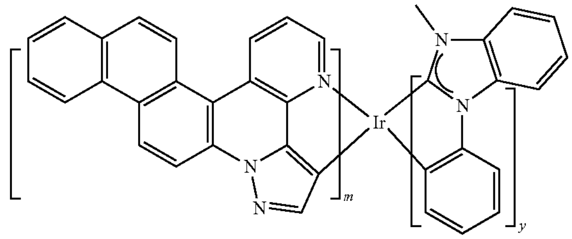
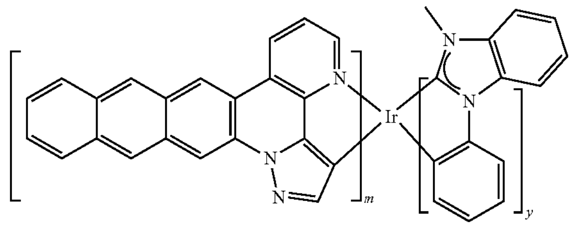
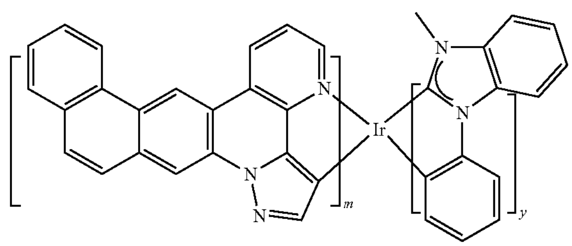
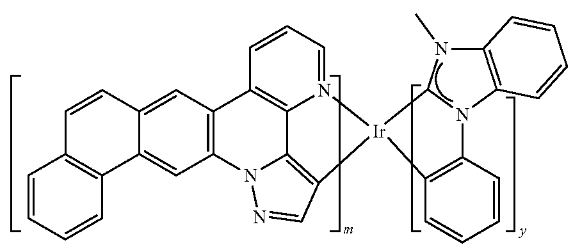
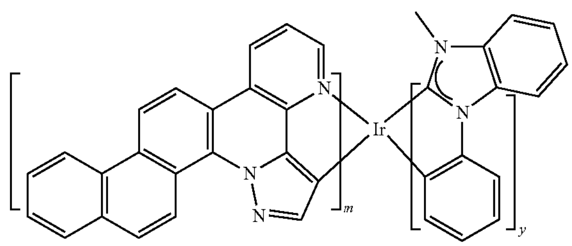
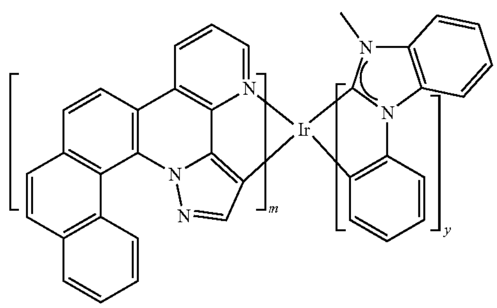

-continued
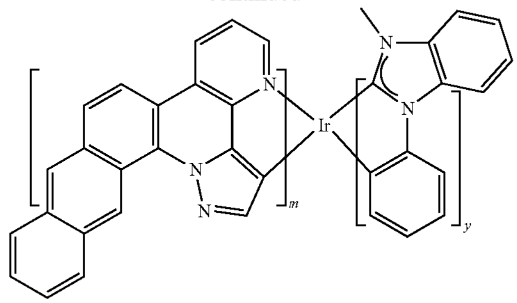
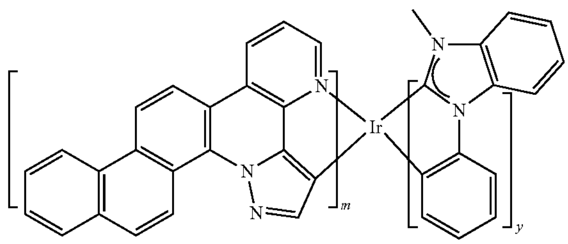
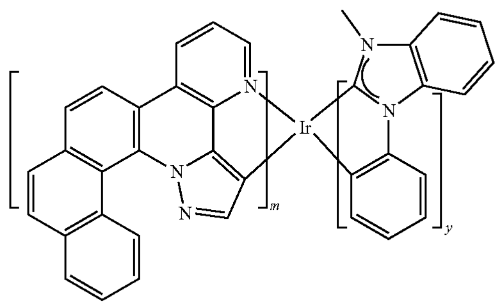
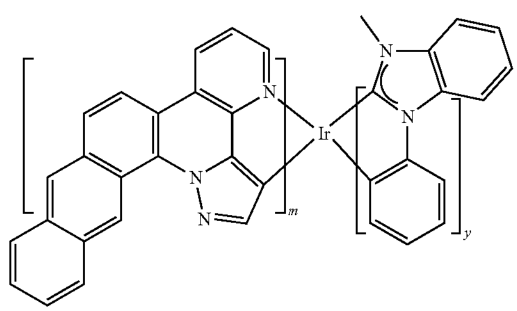
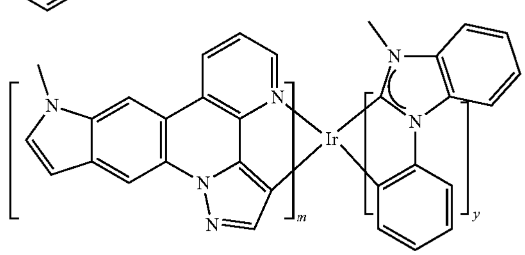
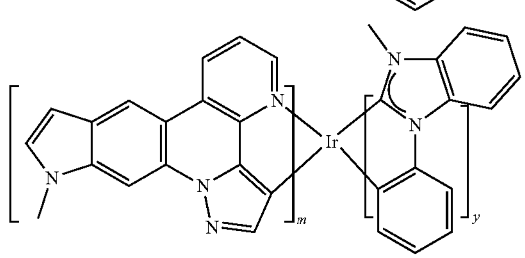
-continued
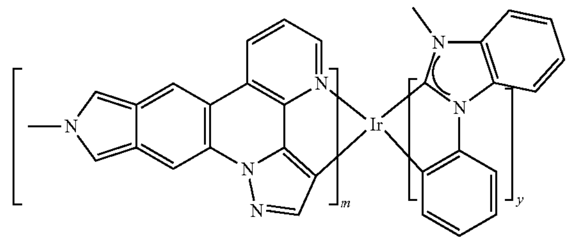
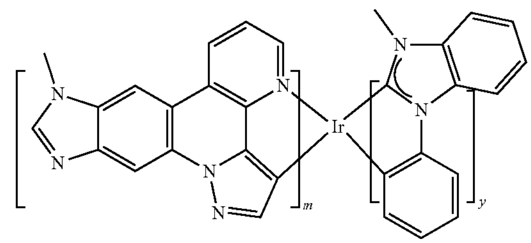
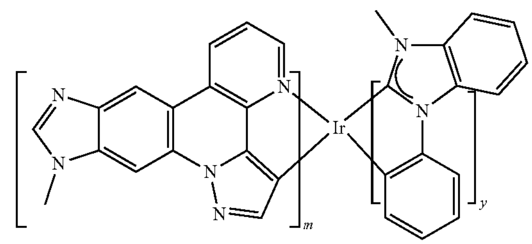
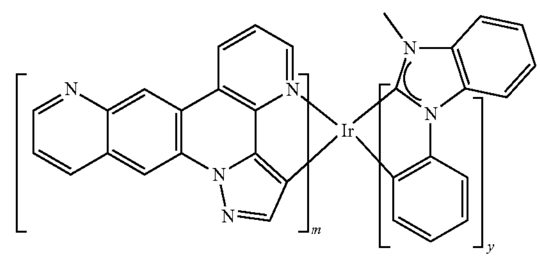
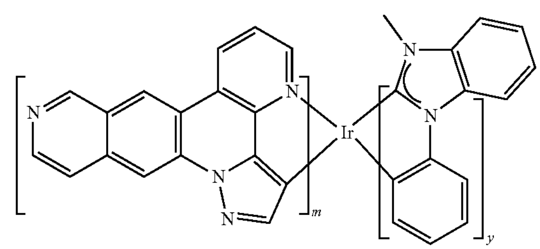
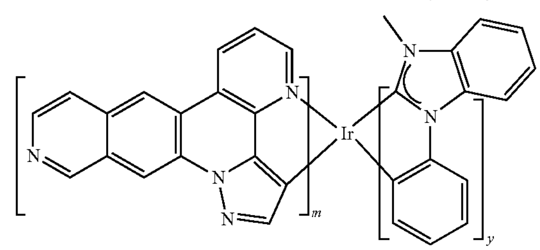
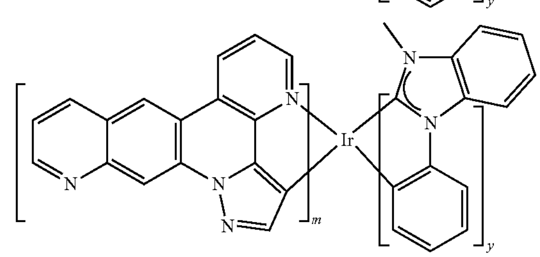

-continued
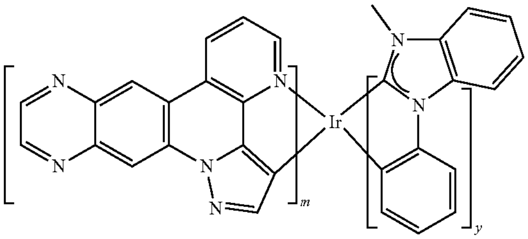
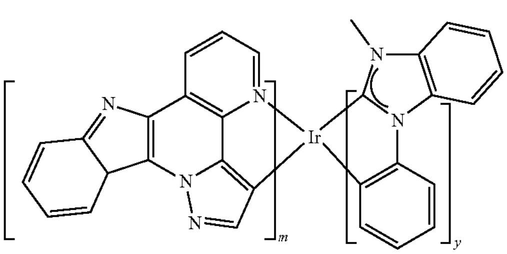
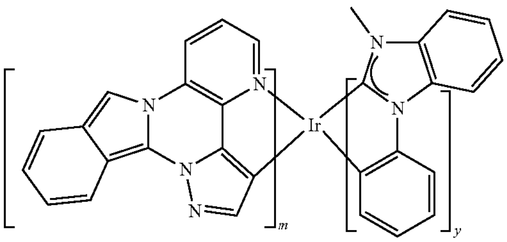
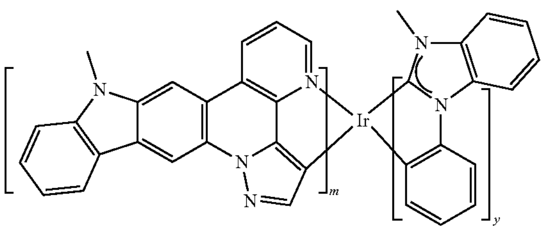
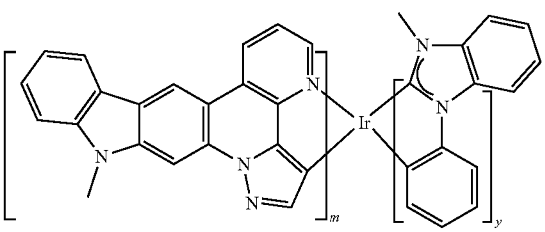
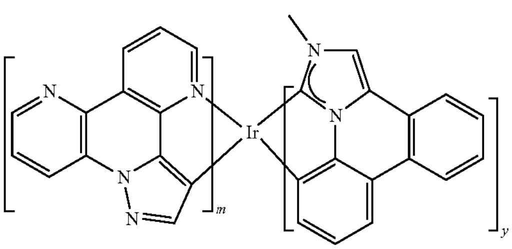
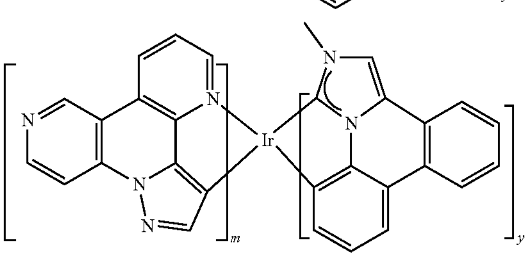
-continued
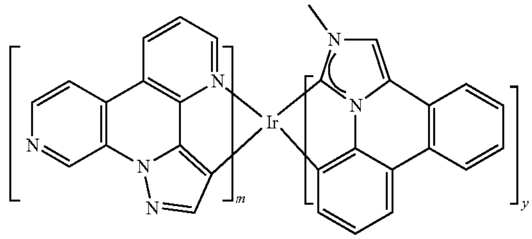
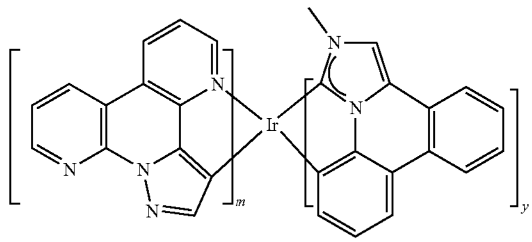
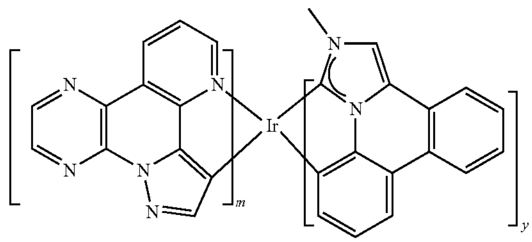
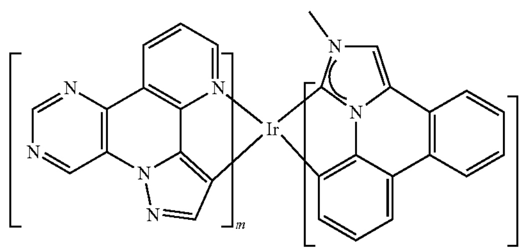
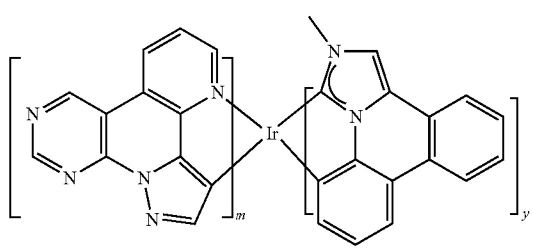
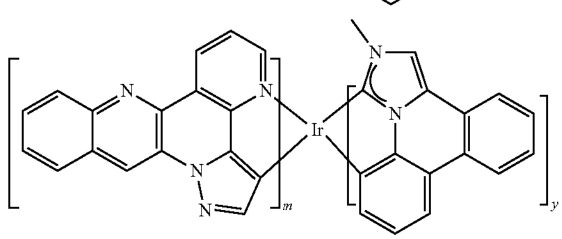
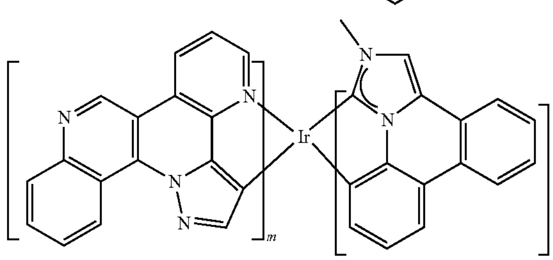

-continued
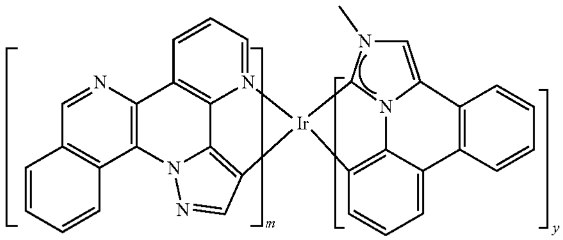
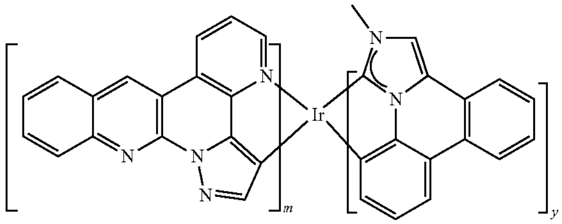
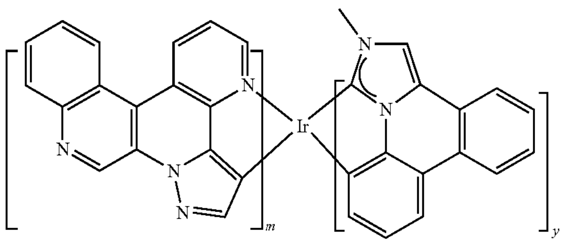
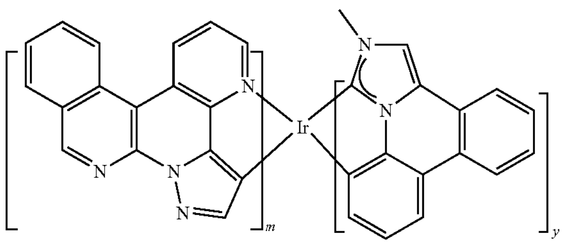
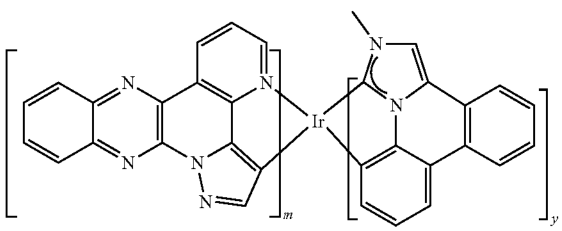
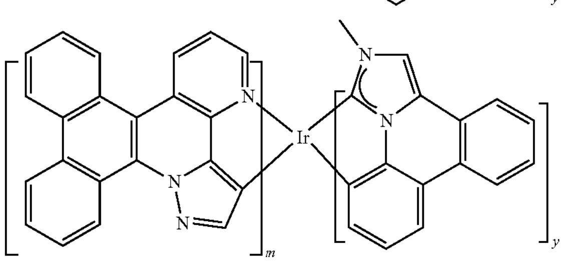
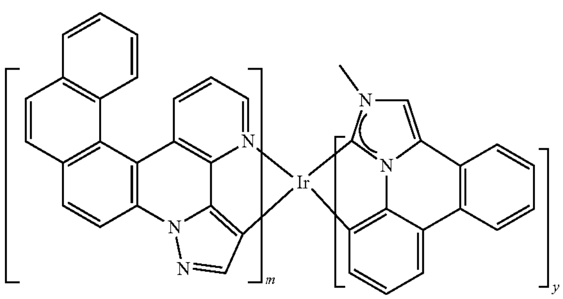
-continued
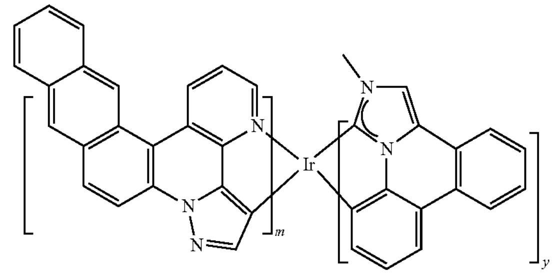
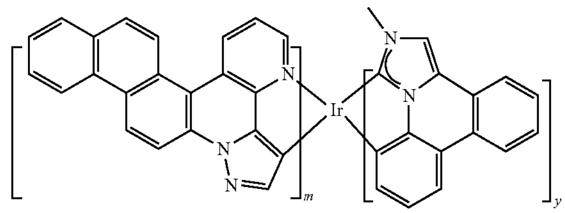
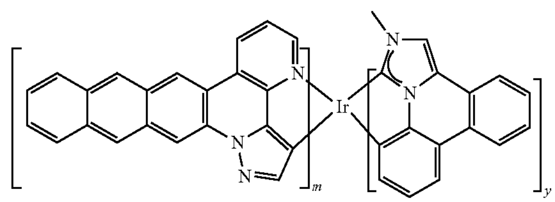
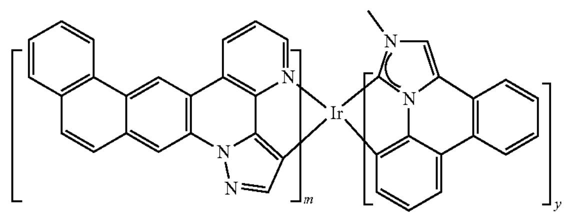
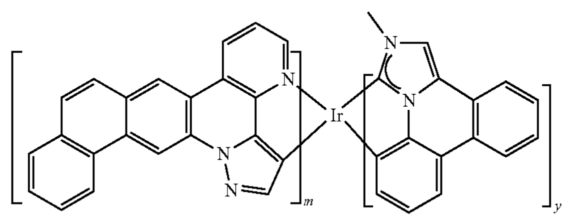
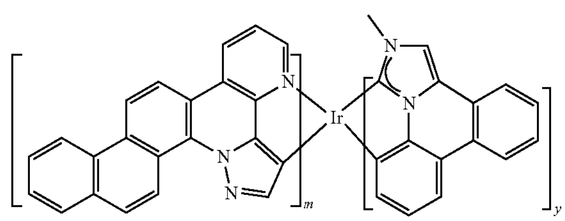
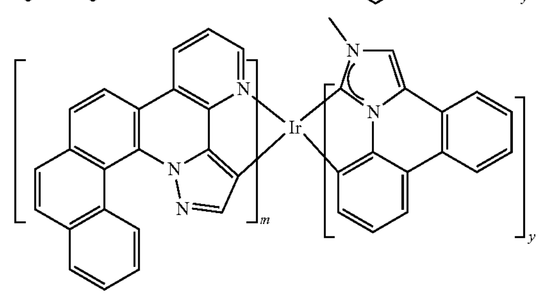

-continued

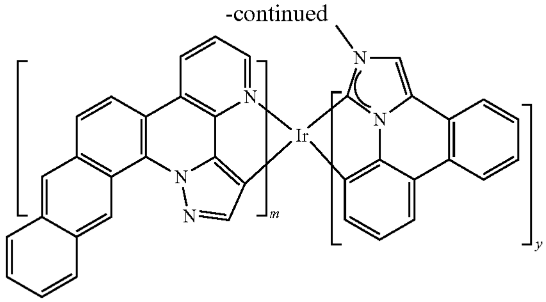

As referred to herein, a linking atom or group connects two atoms such as, for example, an N atom and a C atom. A linking atom or group is in one aspect disclosed as $L^1$, $L^2$, $L^3$, etc. herein. The linking atom can optionally, if valency permits, have other chemical moieties attached. For example, in one aspect, an oxygen would not have any other chemical groups attached as the valency is satisfied once it is bonded to two groups (e.g., N and/or C groups). In another aspect, when carbon is the linking atom, two additional chemical moieties can be attached to the carbon. Suitable chemical moieties include amine, amide, thiol, aryl, heteroaryl, cycloalkyl, and heterocyclyl moieties. The term "cyclic structure" or the like terms used herein refer to any cyclic chemical structure which includes, but is not limited to, aryl, heteroaryl, cycloalkyl, cycloalkenyl, heterocyclyl, carbene, and N-heterocyclic carbene.

As used herein, the term "substituted" is contemplated to include all permissible substituents of organic compounds. In a broad aspect, the permissible substituents include acyclic and cyclic, branched and unbranched, carbocyclic and heterocyclic, and aromatic and nonaromatic substituents of organic compounds. Illustrative substituents include, for example, those described below. The permissible substituents can be one or more and the same or different for appropriate organic compounds. For purposes of this disclosure, the heteroatoms, such as nitrogen, can have hydrogen substituents and/or any permissible substituents of organic compounds described herein which satisfy the valences of the heteroatoms. This disclosure is not intended to be limited in any manner by the permissible substituents of organic compounds. Also, the terms "substitution" or "substituted with" include the implicit proviso that such substitution is in accordance with permitted valence of the substituted atom and the substituent, and that the substitution results in a stable compound, e.g., a compound that does not spontaneously undergo transformation such as by rearrangement, cyclization, elimination, etc. It is also contemplated that, in certain aspects, unless expressly indicated to the contrary, individual substituents can be further optionally substituted (i.e., further substituted or unsubstituted).

In defining various terms, "$A^1$", "$A^2$", "$A^3$", "$A^4$" and "$A^5$" are used herein as generic symbols to represent various specific substituents. These symbols can be any substituent, not limited to those disclosed herein, and when they are defined to be certain substituents in one instance, they can, in another instance, be defined as some other substituents.

The term "alkyl" as used herein is a branched or unbranched saturated hydrocarbon group of 1 to 24 carbon atoms, such as methyl, ethyl, n-propyl, isopropyl, n-butyl, isobutyl, s-butyl, t-butyl, n-pentyl, isopentyl, s-pentyl, neopentyl, hexyl, heptyl, octyl, nonyl, decyl, dode cyl, tetradecyl, hexadecyl, eicosyl, tetracosyl, and the like. The alkyl group can be cyclic or acyclic. The alkyl group can be branched or unbranched. The alkyl group can also be substituted or unsubstituted. For example, the alkyl group can be substituted with one or more groups including, but not limited to, alkyl, cycloalkyl, alkoxy, amino, ether, halide, hydroxy, nitro, silyl, sulfo-oxo, or thiol, as described herein. A "lower alkyl" group is an alkyl group containing from one to six (e.g., from one to four) carbon atoms.

Throughout the specification "alkyl" is generally used to refer to both unsubstituted alkyl groups and substituted alkyl groups; however, substituted alkyl groups are also specifically referred to herein by identifying the specific substituent(s) on the alkyl group. For example, the term "halogenated alkyl" or "haloalkyl" specifically refers to an alkyl group that is substituted with one or more halide, e.g., fluorine, chlorine, bromine, or iodine. The term "alkoxyalkyl" specifically refers to an alkyl group that is substituted with one or more alkoxy groups, as described below. The term "alkylamino" specifically refers to an alkyl group that is substituted with one or more amino groups, as described below, and the like. When "alkyl" is used in one instance and a specific term such as "alkylalcohol" is used in another, it is not meant to imply that the term "alkyl" does not also refer to specific terms such as "alkylalcohol" and the like.

This practice is also used for other groups described herein. That is, while a term such as "cycloalkyl" refers to both unsubstituted and substituted cycloalkyl moieties, the substituted moieties can, in addition, be specifically identified herein; for example, a particular substituted cycloalkyl can be referred to as, e.g., an "alkylcycloalkyl." Similarly, a substituted alkoxy can be specifically referred to as, e.g., a "halogenated alkoxy," a particular substituted alkenyl can be, e.g., an "alkenylalcohol," and the like. Again, the practice of using a general term, such as "cycloalkyl," and a specific term, such as "alkylcycloalkyl," is not meant to imply that the general term does not also include the specific term.

The term "cycloalkyl" as used herein is a non-aromatic carbon-based ring composed of at least three carbon atoms. Examples of cycloalkyl groups include, but are not limited to, cyclopropyl, cyclobutyl, cyclopentyl, cyclohexyl, norbornyl, and the like. The term "heterocycloalkyl" is a type of cycloalkyl group as defined above, and is included within the meaning of the term "cycloalkyl," where at least one of the carbon atoms of the ring is replaced with a heteroatom such as, but not limited to, nitrogen, oxygen, sulfur, or phosphorus. The cycloalkyl group and heterocycloalkyl group can be substituted or unsubstituted. The cycloalkyl group and heterocycloalkyl group can be substituted with one or more groups including, but not limited to, alkyl, cycloalkyl, alkoxy, amino, ether, halide, hydroxy, nitro, silyl, sulfo-oxo, or thiol as described herein.

The terms "alkoxy" and "alkoxyl" as used herein to refer to an alkyl or cycloalkyl group bonded through an ether linkage; that is, an "alkoxy" group can be defined as —$OA^1$ where $A^1$ is alkyl or cycloalkyl as defined above. "Alkoxy" also includes polymers of alkoxy groups as just described; that is, an alkoxy can be a polyether such as —$OA^1$-$OA^2$ or —$OA^1$-$(OA^2)_a$-$OA^3$, where "a" is an integer of from 1 to 200 and $A^1$, $A^2$, and $A^3$ are alkyl and/or cycloalkyl groups.

The term "alkenyl" as used herein is a hydrocarbon group of from 2 to 24 carbon atoms with a structural formula containing at least one carbon-carbon double bond. Asymmetric structures such as $(A^1A^2)C{=}C(A^3A^4)$ are intended to include both the E and Z isomers. This can be presumed in structural formulae herein wherein an asymmetric alkene is present, or it can be explicitly indicated by the bond symbol C═C. The alkenyl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol, as described herein.

The term "cycloalkenyl" as used herein is a non-aromatic carbon-based ring composed of at least three carbon atoms and containing at least one carbon-carbon double bound, i.e., C═C. Examples of cycloalkenyl groups include, but are not limited to, cyclopropenyl, cyclobutenyl, cyclopentenyl, cyclopentadienyl, cyclohexenyl, cyclohexadienyl, norbornenyl, and the like. The term "heterocycloalkenyl" is a type of cycloalkenyl group as defined above, and is included within the meaning of the term "cycloalkenyl," where at least one of the carbon atoms of the ring is replaced with a heteroatom such as, but not limited to, nitrogen, oxygen, sulfur, or phosphorus. The cycloalkenyl group and heterocycloalkenyl group can be substituted or unsubstituted. The cycloalkenyl group and heterocycloalkenyl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol as described herein.

The term "alkynyl" as used herein is a hydrocarbon group of 2 to 24 carbon atoms with a structural formula containing at least one carbon-carbon triple bond. The alkynyl group can be unsubstituted or substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol, as described herein.

The term "cycloalkynyl" as used herein is a non-aromatic carbon-based ring composed of at least seven carbon atoms and containing at least one carbon-carbon triple bound. Examples of cycloalkynyl groups include, but are not limited to, cycloheptynyl, cyclooctynyl, cyclononynyl, and the like. The term "heterocycloalkynyl" is a type of cycloalkenyl group as defined above, and is included within the meaning of the term "cycloalkynyl," where at least one of the carbon atoms of the ring is replaced with a heteroatom such as, but not limited to, nitrogen, oxygen, sulfur, or phosphorus. The cycloalkynyl group and heterocycloalkynyl group can be substituted or unsubstituted. The cycloalkynyl group and heterocycloalkynyl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol as described herein.

The term "aryl" as used herein is a group that contains any carbon-based aromatic group including, but not limited to, benzene, naphthalene, phenyl, biphenyl, phenoxybenzene, and the like. The term "aryl" also includes "heteroaryl," which is defined as a group that contains an aromatic group that has at least one heteroatom incorporated within the ring of the aromatic group. Examples of heteroatoms include, but are not limited to, nitrogen, oxygen, sulfur, and phosphorus. Likewise, the term "non-heteroaryl," which is also included in the term "aryl," defines a group that contains an aromatic group that does not contain a heteroatom. The aryl group can be substituted or unsubstituted. The aryl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol as described herein. The term "biaryl" is a specific type of aryl group and is included in the definition of "aryl." Biaryl refers to two aryl groups that are bound together via a fused ring structure, as in naphthalene, or are attached via one or more carbon-carbon bonds, as in biphenyl.

The term "aldehyde" as used herein is represented by the formula —C(O)H. Throughout this specification "C(O)" is a short hand notation for a carbonyl group, i.e., C═O.

The terms "amine" or "amino" as used herein are represented by the formula —$NA^1A^2$, where $A^1$ and $A^2$ can be, independently, hydrogen or alkyl, cycloalkyl, alkenyl, cycloalkenyl, alkynyl, cycloalkynyl, aryl, or heteroaryl group as described herein.

The term "alkylamino" as used herein is represented by the formula —NH(-alkyl) where alkyl is a described herein. Representative examples include, but are not limited to, methylamino group, ethylamino group, propylamino group, isopropylamino group, butylamino group, isobutylamino group, (sec-butyl)amino group, (tert-butyl)amino group, pentylamino group, isopentylamino group, (tert-pentyl) amino group, hexylamino group, and the like.

The term "dialkylamino" as used herein is represented by the formula —$N(\text{-alkyl})_2$ where alkyl is a described herein. Representative examples include, but are not limited to, dimethylamino group, diethylamino group, dipropylamino group, diisopropylamino group, dibutylamino group, diisobutylamino group, di(sec-butyl)amino group, di(tert-butyl)amino group, dipentylamino group, diisopentylamino group, di(tert-pentyl)amino group, dihexylamino group, N-ethyl-N-methylamino group, N-methyl-N-propylamino group, N-ethyl-N-propylamino group and the like.

The term "carboxylic acid" as used herein is represented by the formula —C(O)OH.

The term "ester" as used herein is represented by the formula —$OC(O)A^1$ or —$C(O)OA^1$, where $A^1$ can be alkyl, cycloalkyl, alkenyl, cycloalkenyl, alkynyl, cycloalkynyl, aryl, or heteroaryl group as described herein. The term "polyester" as used herein is represented by the formula $-(A^1O(O)C-A^2-C(O)O)_a$— or $-(A^1O(O)C-A^2-OC(O))_a$—, where $A^1$ and $A^2$ can be, independently, an alkyl, cycloalkyl, alkenyl, cycloalkenyl, alkynyl, cycloalkynyl, aryl, or heteroaryl group described herein and "a" is an interger from 1 to 500. "Polyester" is as the term used to describe a group that is produced by the reaction between a compound having at least two carboxylic acid groups with a compound having at least two hydroxyl groups.

The term "ether" as used herein is represented by the formula $A^1OA^2$, where $A^1$ and $A^2$ can be, independently, an alkyl, cycloalkyl, alkenyl, cycloalkenyl, alkynyl, cycloalkynyl, aryl, or heteroaryl group described herein. The term "polyether" as used herein is represented by the formula $-(A^1O-A^2O)_a$—, where $A^1$ and $A^2$ can be, independently, an alkyl, cycloalkyl, alkenyl, cycloalkenyl, alkynyl, cycloalkynyl, aryl, or heteroaryl group described herein and "a" is an integer of from 1 to 500. Examples of polyether groups include polyethylene oxide, polypropylene oxide, and polybutylene oxide.

The term "halide" or "halo" as used herein refers to the halogens fluorine, chlorine, bromine, and iodine.

The term "heterocyclyl," as used herein refers to single and multi-cyclic non-aromatic ring systems and "heteroaryl as used herein refers to single and multi-cyclic aromatic ring systems: in which at least one of the ring members is other than carbon. The terms includes azetidine, dioxane, furan, imidazole, isothiazole, isoxazole, morpholine, oxazole, oxazole, including, 1,2,3-oxadiazole, 1,2,5-oxadiazole and 1,3,4-oxadiazole, piperazine, piperidine, pyrazine, pyrazole, pyridazine, pyridine, pyrimidine, pyrrole, pyrrolidine, tetrahydrofuran, tetrahydropyran, tetrazine, including 1,2,4,5-tetrazine, tetrazole, including 1,2,3,4-tetrazole and 1,2,4,5-tetrazole, thiadiazole, including, 1,2,3-thiadiazole, 1,2,5-thiadiazole, and 1,3,4-thiadiazole, thiazole, thiophene, triazine, including 1,3,5-triazine and 1,2,4-triazine, triazole, including, 1,2,3-triazole, 1,3,4-triazole, and the like.

The term "hydroxyl" as used herein is represented by the formula —OH.

The term "ketone" as used herein is represented by the formula $A^1C(O)A^2$, where $A^1$ and $A^2$ can be, independently, an alkyl, cycloalkyl, alkenyl, cycloalkenyl, alkynyl, cycloalkynyl, aryl, or heteroaryl group as described herein.

The term "azide" as used herein is represented by the formula $—N_3$.

The term "nitro" as used herein is represented by the formula $—NO_2$.

The term "cyanide" as used herein is represented by the formula —CN.

The term "silyl" as used herein is represented by the formula $—SiA^1A^2A^3$, where $A^1$, $A^2$, and $A^3$ can be, independently, hydrogen or an alkyl, cycloalkyl, alkoxy, alkenyl, cycloalkenyl, alkynyl, cycloalkynyl, aryl, or heteroaryl group as described herein.

The term "sulfo-oxo" as used herein is represented by the formulas $—S(O)A^1$, $—S(O)_2A^1$, $—OS(O)_2A^1$, or $—OS(O)_2OA^1$, where $A^1$ can be hydrogen or an alkyl, cycloalkyl, alkenyl, cycloalkenyl, alkynyl, cycloalkynyl, aryl, or heteroaryl group as described herein. Throughout this specification "S(O)" is a short hand notation for S═O. The term "sulfonyl" is used herein to refer to the sulfo-oxo group represented by the formula $—S(O)_2A^1$, where $A^1$ can be hydrogen or an alkyl, cycloalkyl, alkenyl, cycloalkenyl, alkynyl, cycloalkynyl, aryl, or heteroaryl group as described herein. The term "sulfone" as used herein is represented by the formula $A^1S(O)_2A^2$, where $A^1$ and $A^2$ can be, independently, an alkyl, cycloalkyl, alkenyl, cycloalkenyl, alkynyl, cycloalkynyl, aryl, or heteroaryl group as described herein. The term "sulfoxide" as used herein is represented by the formula $A^1S(O)A^2$, where $A^1$ and $A^2$ can be, independently, an alkyl, cycloalkyl, alkenyl, cycloalkenyl, alkynyl, cycloalkynyl, aryl, or heteroaryl group as described herein.

The term "thiol" as used herein is represented by the formula —SH.

"R," "$R^1$," "$R^2$," "$R^3$," "$R^n$," where n is an integer, as used herein can, independently, possess one or more of the groups listed above. For example, if $R^1$ is a straight chain alkyl group, one of the hydrogen atoms of the alkyl group can optionally be substituted with a hydroxyl group, an alkoxy group, an alkyl group, a halide, and the like. Depending upon the groups that are selected, a first group can be incorporated within second group or, alternatively, the first group can be pendant (i.e., attached) to the second group. For example, with the phrase "an alkyl group comprising an amino group," the amino group can be incorporated within the backbone of the alkyl group. Alternatively, the amino group can be attached to the backbone of the alkyl group. The nature of the group(s) that is (are) selected will determine if the first group is embedded or attached to the second group.

Compounds described herein may contain "optionally substituted" moieties. In general, the term "substituted," whether preceded by the term "optionally" or not, means that one or more hydrogens of the designated moiety are replaced with a suitable substituent. Unless otherwise indicated, an "optionally substituted" group may have a suitable substituent at each substitutable position of the group, and when more than one position in any given structure may be substituted with more than one substituent selected from a specified group, the substituent may be either the same or different at every position. Combinations of substituents envisioned by this disclosure are preferably those that result in the formation of stable or chemically feasible compounds. In is also contemplated that, in certain aspects, unless expressly indicated to the contrary, individual substituents can be further optionally substituted (i.e., further substituted or unsubstituted).

In some aspects, a structure of a compound can be represented by a formula:

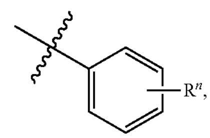

which is understood to be equivalent to a formula:

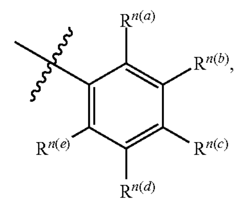

wherein n is typically an integer. That is, $R^n$ is understood to represent five independent substituents, $R^{n(a)}$, $R^{n(b)}$, $R^{n(c)}$, $R^{n(d)}$, $R^{n(e)}$. By "independent substituents," it is meant that each R substituent can be independently defined. For example, if in one instance $R^{n(a)}$ is halogen, then $R^{n(b)}$ is not necessarily halogen in that instance. In a case where there is a single $R^n$ (e.g., only $R^{n(a)}$), $R^n$ is referred to as a "single substituent." In a case where there are two or more $R^n$ (e.g., at least $R^{n(a)}$ and $R^{n(b)}$) $R^n$ is referred to as a "multiple substituents."

Several references to R, $R^1$, $R^2$, $R^3$, $R^4$, $R^5$, $R^6$, etc. are made in chemical structures and moieties disclosed and described herein. Any description of R, $R^1$, $R^2$, $R^3$, $R^4$, $R^5$, $R^6$, etc. in the specification is applicable to any structure or moiety reciting R, $R^1$, $R^2$, $R^3$, $R^4$, $R^5$, $R^6$, etc. respectively.

The compounds disclosed herein are suited for use in a wide variety of devices, including, for example, organic light emitting diodes (OLEDs) for full color displays and lighting applications.

Also disclosed herein are compositions including one or more compounds disclosed herein. The present disclosure provides light emitting device that include one or more compositions described herein. The present disclosure also provides a photovoltaic device comprising one or more complexes or compositions described herein. Further, the present disclosure also provides a luminescent display device comprising one or more compounds described herein.

Compounds described herein can be used in a light emitting device such as an OLED. FIG. 1 depicts a cross-sectional view of an OLED 100. OLED 100 includes substrate 102, anode 104, hole-transporting material(s) (HTL) 106, light processing material 108, electron-transporting material(s) (ETL) 110, and a metal cathode layer 112. Anode 104 is typically a transparent material, such as indium tin oxide. Light processing material 108 may be an emissive material (EML) including an emitter and a host.

In various aspects, any of the one or more layers depicted in FIG. 1 may include indium tin oxide (ITO), poly(3,4-ethylenedioxythiophene) (PEDOT), polystyrene sulfonate (PSS), N,N'-di-1-naphthyl-N,N-diphenyl-1,1'-biphenyl-4,4'diamine (NPD), 1,1-bis((di-4-tolylamino)phenyl)cyclohexane (TAPC), 2,6-Bis(N-carbazolyl)pyridine (mCpy), 2,8-bis(diphenylphosphoryl)dibenzothiophene (PO15), LiF, Al, or a combination thereof.

Light processing material 108 may include one or more compounds of the present disclosure optionally together with a host material. The host material can be any suitable host material known in the art. The emission color of an OLED is determined by the emission energy (optical energy gap) of the light processing material 108, which can be tuned by tuning the electronic structure of the emitting compounds, the host material, or both. Both the hole-transporting material in the HTL layer 106 and the electron-transporting material(s) in the ETL layer 110 may include any suitable hole-transporter known in the art.

EXAMPLES

The following examples are put forth so as to provide those of ordinary skill in the art with a complete disclosure and description of how the compounds, compositions, articles, devices and/or methods claimed herein are made and evaluated, and are intended to be purely exemplary and are not intended to be limiting in scope. Some of these synthetic examples have been performed. Others are based on an understanding of related synthetic procedures and are predictive in nature. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric.

Various methods for the preparation method of the compounds described herein are recited in the examples. These methods are provided to illustrate various methods of preparation, but are not intended to limit any of the methods recited herein. Accordingly, one of skill in the art in possession of this disclosure could readily modify a recited method or utilize a different method to prepare one or more of the compounds described herein. The following aspects are only exemplary and are not intended to be limiting in scope. Temperatures, catalysts, concentrations, reactant compositions, and other process conditions can vary, and one of skill in the art, in possession of this disclosure, could readily select appropriate reactants and conditions for a desired complex.

EXAMPLES OF GENERAL FORMULAS I-XIII

Example 1

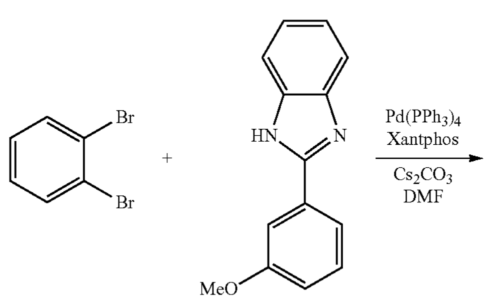

-continued

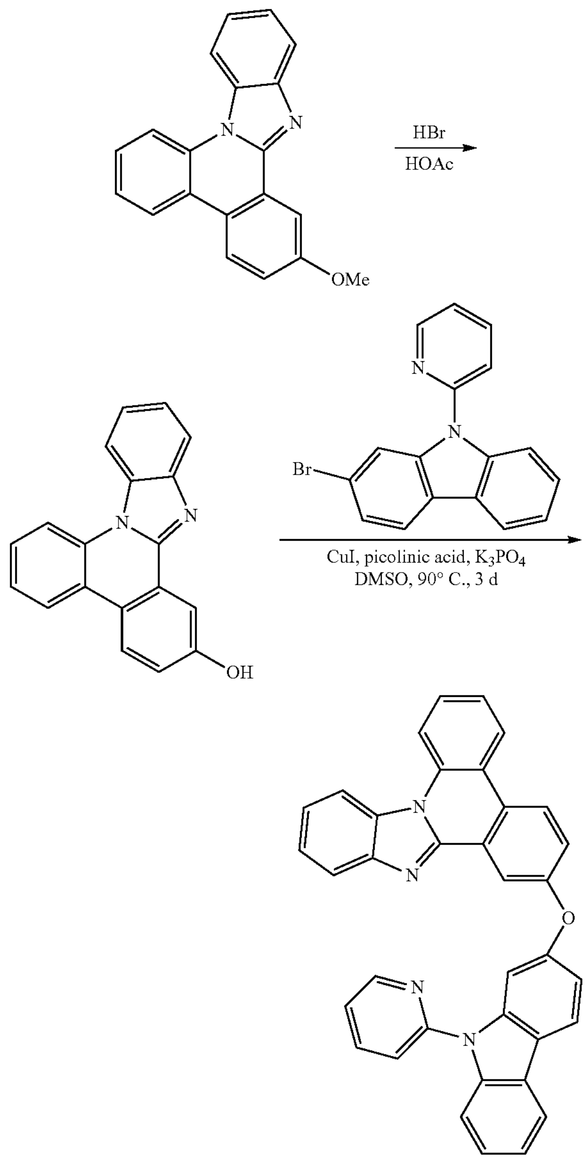

L1

Benzo[4,5]imidazo[1,2-f]phenanthridin-7-ol (284.3 mg, 1 mmol, 1.0 eq), 2-bromo-9-(pyridin-2-yl)-9H-carbazole (388 mg, 1.2 mmol, 1.2 eq), CuI (38 mg, 0.2 mmol, 0.2 eq), picolinic acid (49 mg, 0.4 mmol, 0.4 eq) and $K_3PO_4$ (425 mg, 2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L1 in 30%~70% yield.

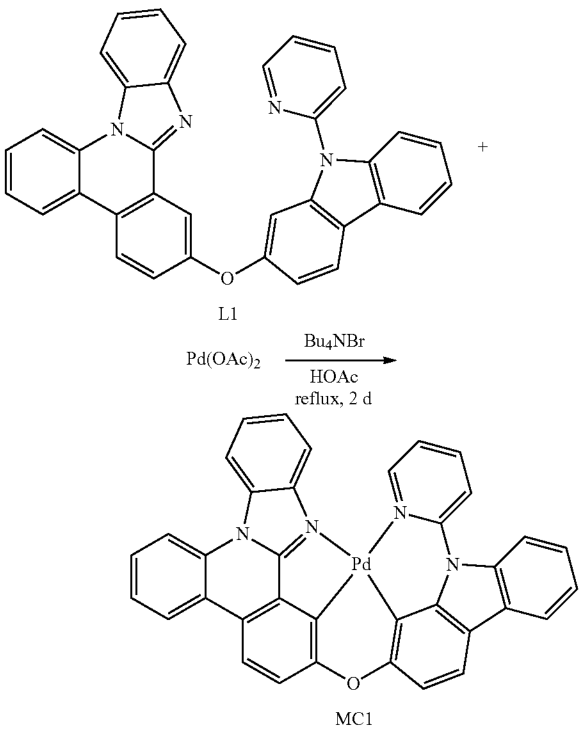

L1 (0.20 mmol, 1.0 eq), $Pd(OAc)_2$ (54 mg, 0.24 mmol, 1.2 eq) and n-$Bu_4NBr$ (6.5 mg, 0.02 mmol, 0.1 eq) were added to a dry pressure tube, which was taken into a glove box and acetic acid (10 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain to obtain the desired product MC1 in 10%~50% yield.

Example 2

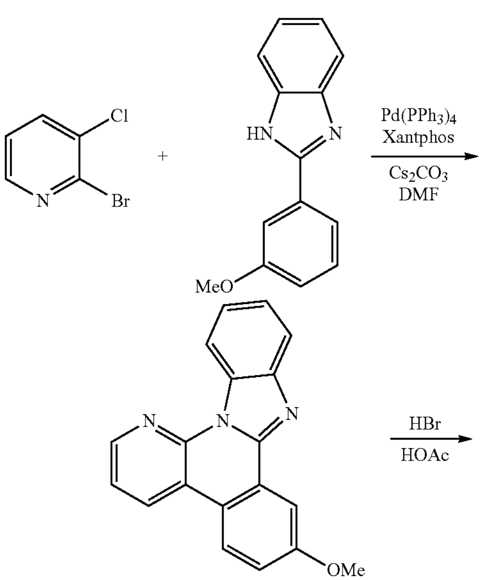

-continued

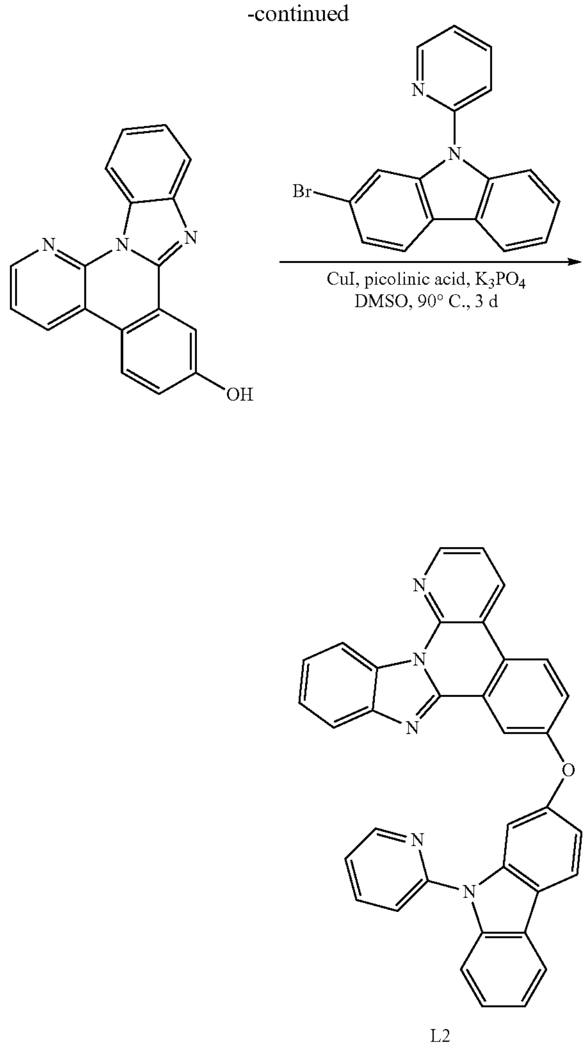

Benzo[c]benzo[4,5]imidazo[1,2-a][1,8]naphthyridin-7-ol (285 mg, 1 mmol, 1.0 eq), 2-bromo-9-(pyridin-2-yl)-9H-carbazole (388 mg, 1.2 mmol, 1.2 eq), CuI (38 mg, 0.2 mmol, 0.2 eq), picolinic acid (49 mg, 0.4 mmol, 0.4 eq) and $K_3PO_4$ (425 mg, 2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L2 in 30%~70% yield.

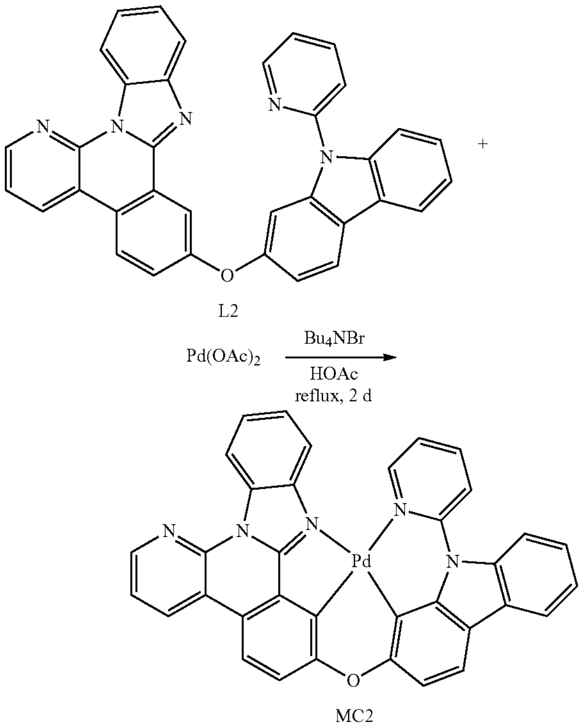

L2

MC2

L2 (0.20 mmol, 1.0 eq), $Pd(OAc)_2$ (54 mg, 0.24 mmol, 1.2 eq) and n-$Bu_4NBr$ (6.5 mg, 0.02 mmol, 0.1 eq) were added to a dry pressure tube, which was taken into a glove box and acetic acid (10 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain to obtain the desired product MC2 in 10%~50% yield.

Example 3

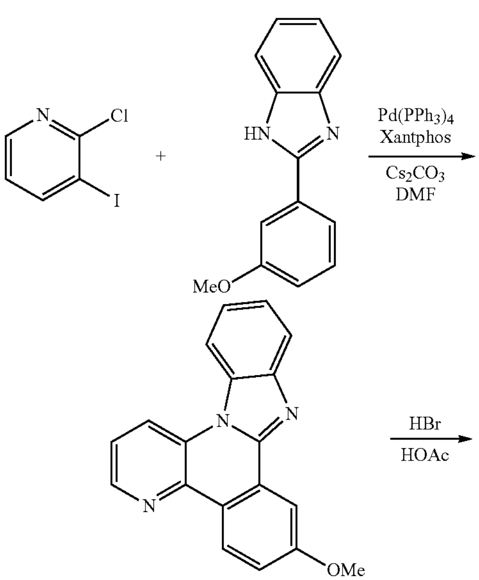

-continued

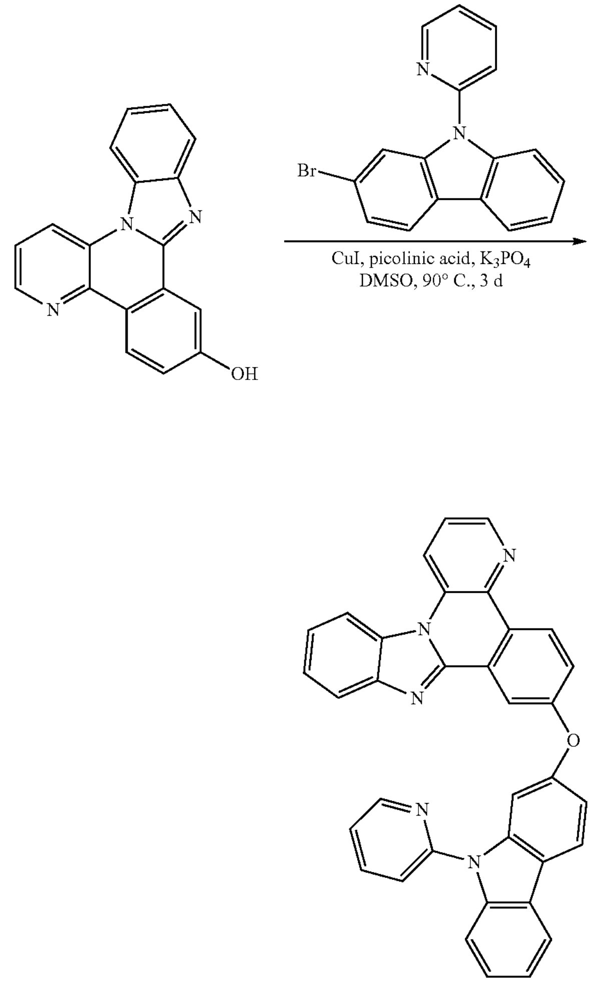

L3

Benzo[c]benzo[4,5]imidazo[1,2-a][1,5]naphthyridin-7-ol (100 mg, 0.35 mmol, 1.0 eq), 2-bromo-9-(pyridin-2-yl)-9H-carbazole (136 mg, 0.42 mmol, 1.2 eq), CuI (13 mg, 0.07 mmol, 0.2 eq), picolinic acid (9 mg, 0.07 mmol, 0.2 eq) and $K_3PO_4$ (149 mg, 0.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (5 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L3 as an orange yellow solid 105 mg in 57% yield.

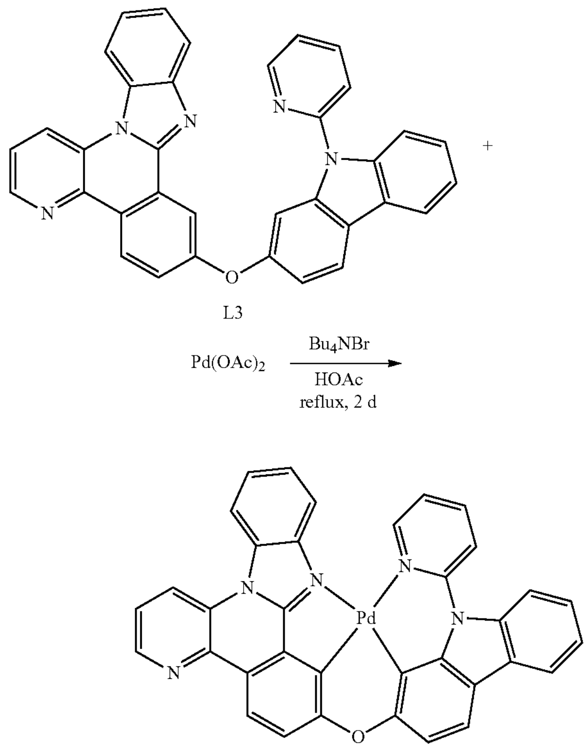

MC3

Figure 2:
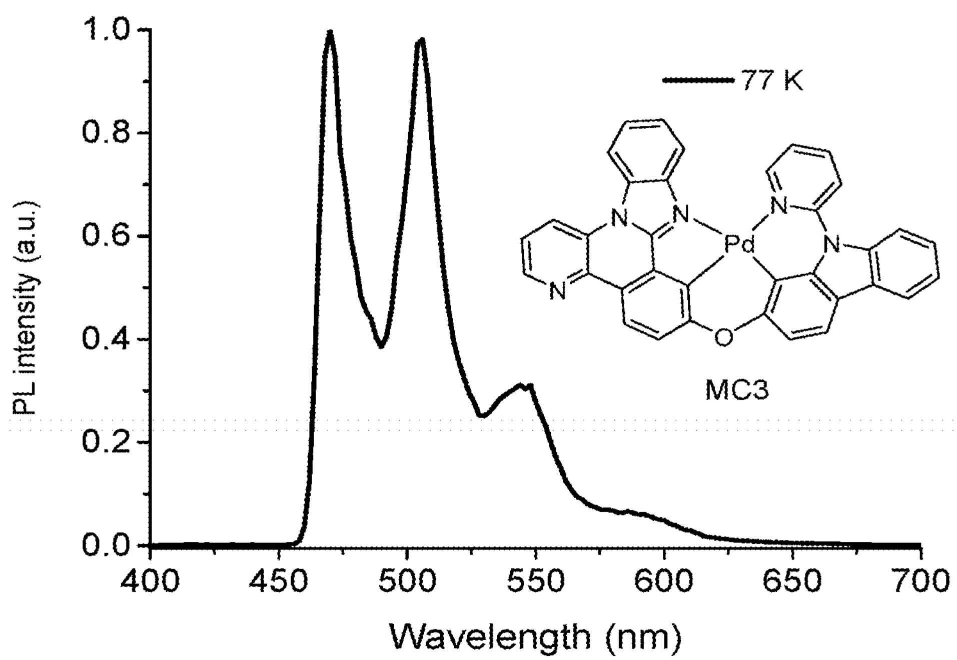
FIG. 2 is an emission spectrum of the metal-assisted delayed fluorescent emitter of Example 3 in tehtrahydro-2-methylfuran at 77K.

L3 (95 mg, 0.18 mmol, 1.0 eq), $Pd(OAc)_2$ (43 mg, 0.19 mmol, 1.1 eq) and n-$Bu_4NBr$ (6 mg, 0.018 mmol, 0.1 eq) were added to a dry pressure tube, which was taken into a glove box and acetic acid (11 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product MC3 as a white solid 100 mg in 86% yield. FIG. 2 shows an emission spectrum of MC3 in tetrahydro-2-methylfuran at 77K.

Example 4

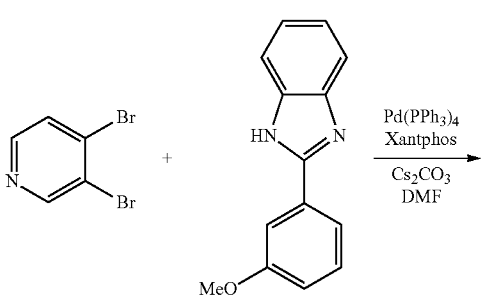

-continued

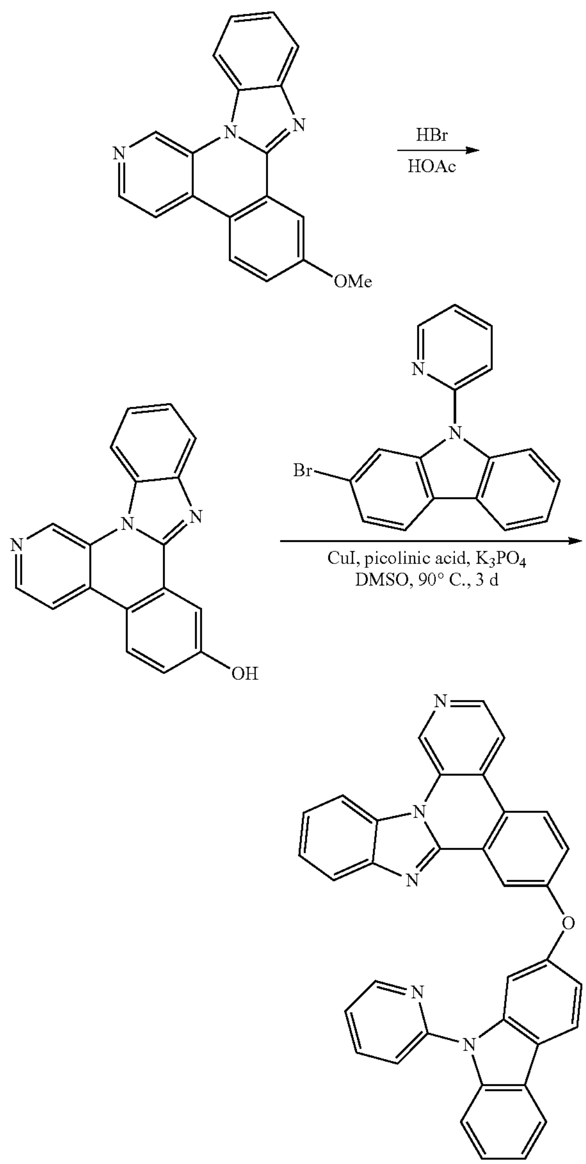

L4

Benzo[c]benzo[4,5]imidazo[1,2-a][1,7]naphthyridin-7-ol (100 mg, 0.35 mmol, 1.0 eq), 2-bromo-9-(pyridin-2-yl)-9H-carbazole (136 mg, 0.42 mmol, 1.2 eq), CuI (13 mg, 0.07 mmol, 0.2 eq), picolinic acid (9 mg, 0.07 mmol, 0.2 eq) and $K_3PO_4$ (149 mg, 0.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (5 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L4 in 40%~70% yield.

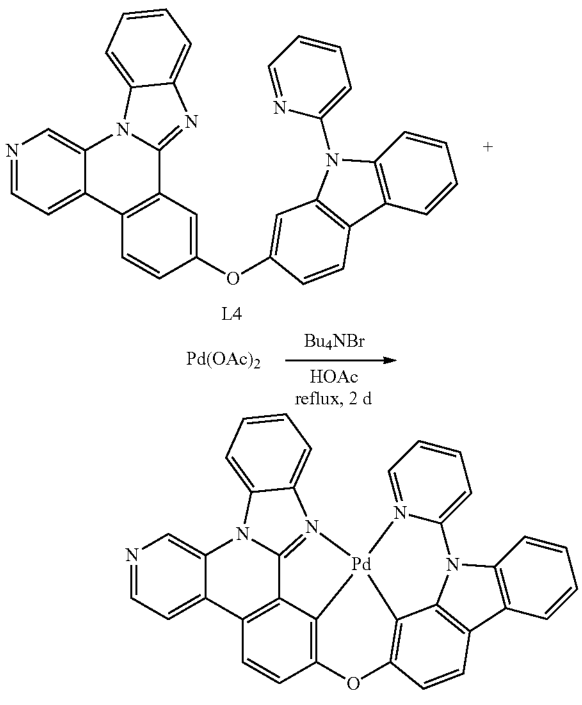

L4

MC4

L4 (95 mg, 0.18 mmol, 1.0 eq), $Pd(OAc)_2$ (43 mg, 0.19 mmol, 1.1 eq) and n-$Bu_4NBr$ (6 mg, 0.018 mmol, 0.1 eq) were added to a dry pressure tube, which was taken into a glove box and acetic acid (11 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product MC4 in 10%~50% yield.

Example 5

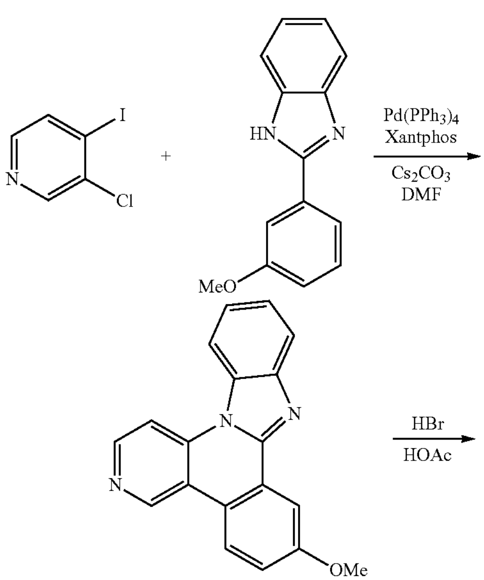

-continued

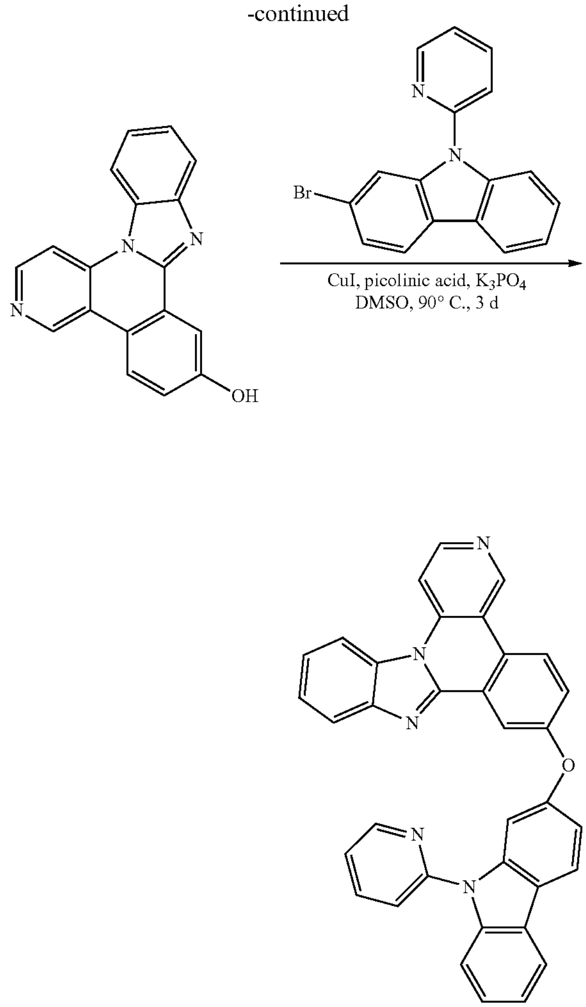

L5

Benzo[c]benzo[4,5]imidazo[1,2-a][1,6]naphthyridin-7-ol (100 mg, 0.35 mmol, 1.0 eq), 2-bromo-9-(pyridin-2-yl)-9H-carbazole (136 mg, 0.42 mmol, 1.2 eq), CuI (13 mg, 0.07 mmol, 0.2 eq), picolinic acid (9 mg, 0.07 mmol, 0.2 eq) and $K_3PO_4$ (149 mg, 0.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (5 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L5 in 40%~70% yield.

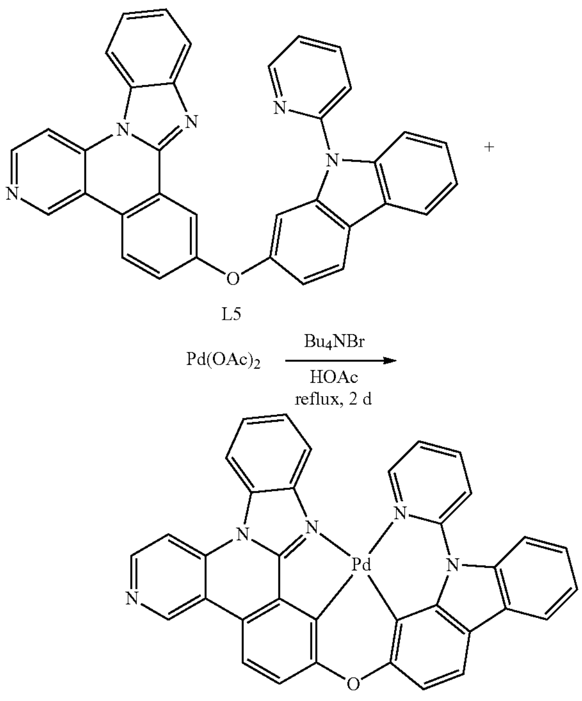

MC5

L5 (9.5 mg, 0.18 mmol, 1.0 eq), $Pd(OAc)_2$ (43 mg, 0.19 mmol, 1.1 eq) and n-$Bu_4NBr$ (6 mg, 0.018 mmol, 0.1 eq) were added to a dry pressure tube, which was taken into a glove box and acetic acid (11 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product MC5 in 10%~50% yield.

Example 6

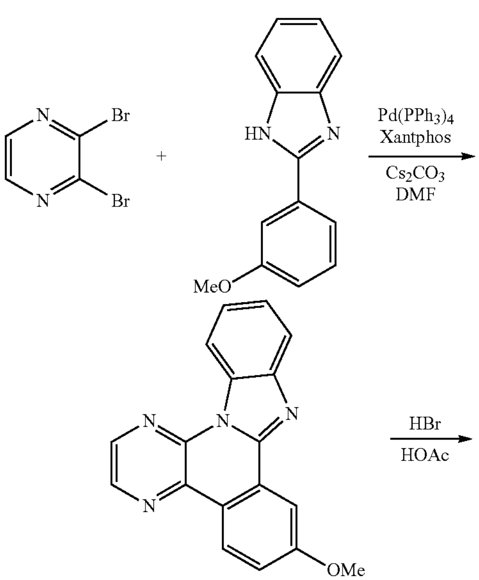

-continued

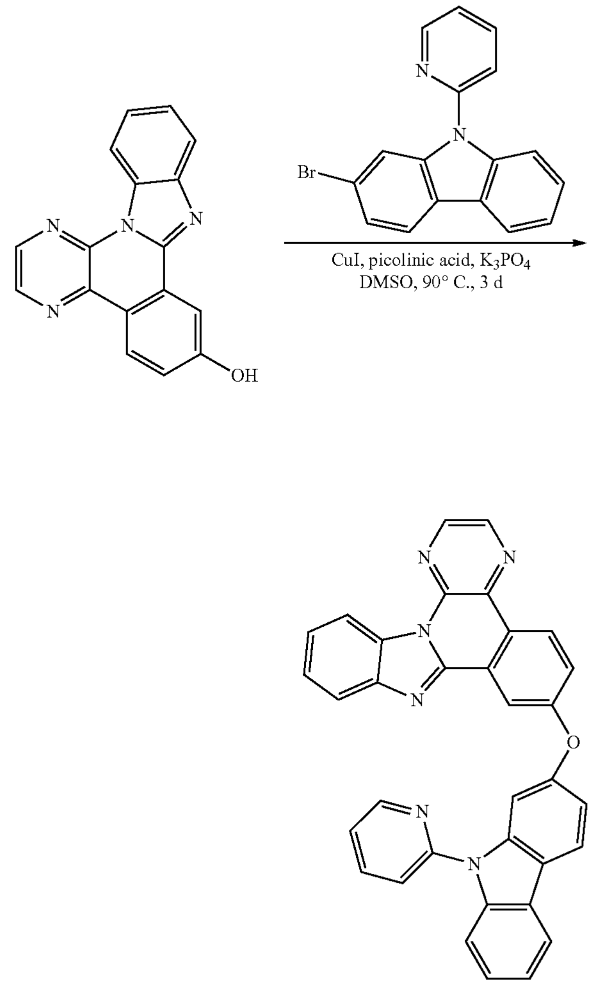

L6

Benzo[4,5]imidazo[2,1-a]pyrazino[2,3-c]isoquinolin-7-ol (286 mg, 1 mmol, 1.0 eq), 2-bromo-9-(pyridin-2-yl)-9H-carbazole (388 mg, 1.2 mmol, 1.2 eq), CuI (38 mg, 0.2 mmol, 0.2 eq), picolinic acid (49 mg, 0.4 mmol, 0.4 eq) and $K_3PO_4$ (425 mg, 2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L6 in 30%~70% yield.

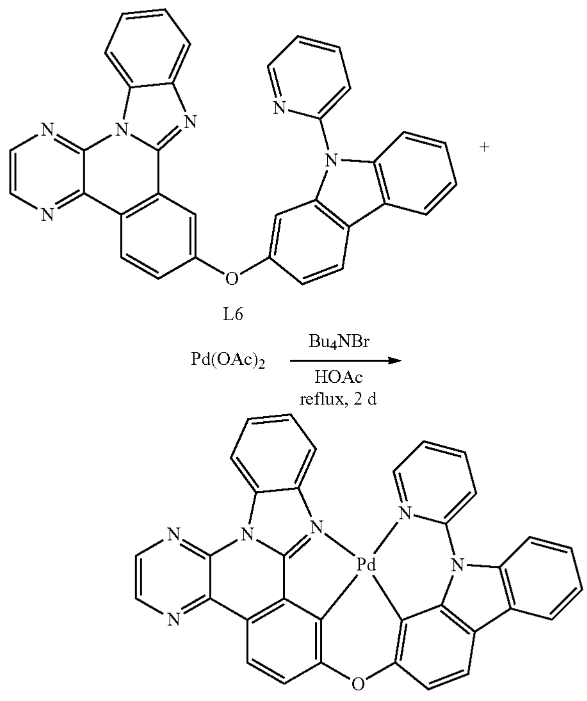

L6

MC6

L6 (0.20 mmol, 1.0 eq), Pd(OAc)$_2$ (54 mg, 0.24 mmol, 1.2 eq) and n-Bu$_4$NBr (6.5 mg, 0.02 mmol, 0.1 eq) were added to a dry pressure tube, which was taken into a glove box and acetic acid (10 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain to obtain the desired product MC6 in 10%~50% yield.

Example 7

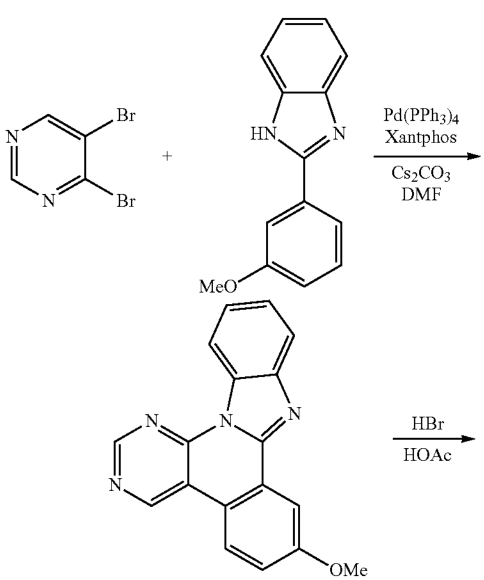

-continued

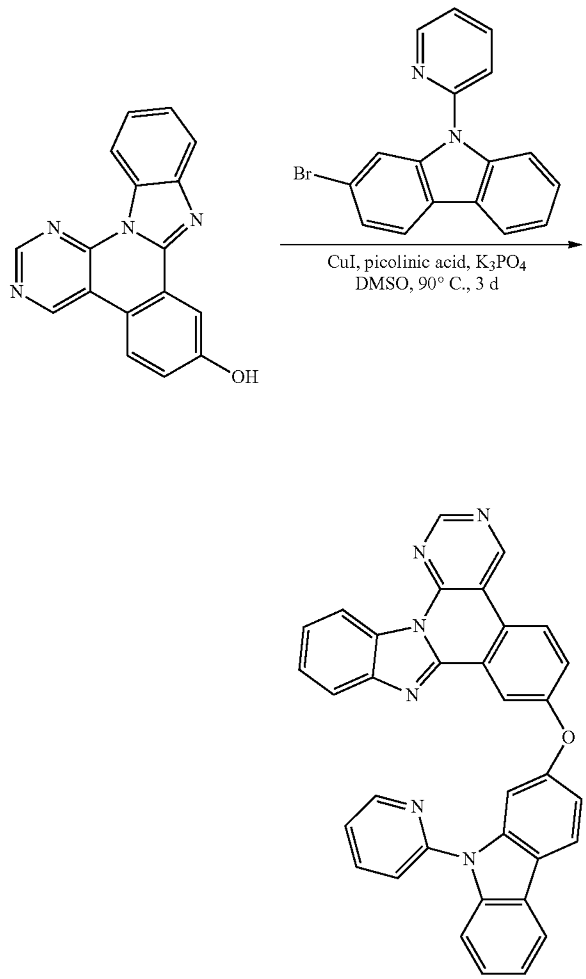

L7

Benzo[4,5]imidazo[2,1-a]pyrimido[4,5-c]isoquinolin-7-ol (286 mg, 1 mmol, 1.0 eq), 2-bromo-9-(pyridin-2-yl)-9H-carbazole (388 mg, 1.2 mmol, 1.2 eq), CuI (38 mg, 0.2 mmol, 0.2 eq), picolinic acid (49 mg, 0.4 mmol, 0.4 eq) and $K_3PO_4$ (425 mg, 2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L7 in 30%~70% yield.

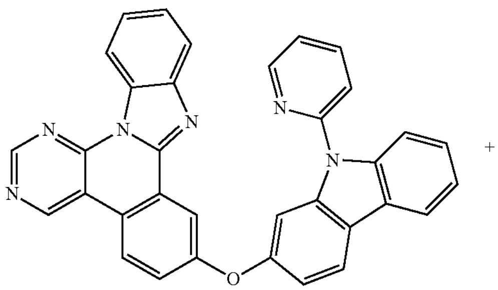

L7

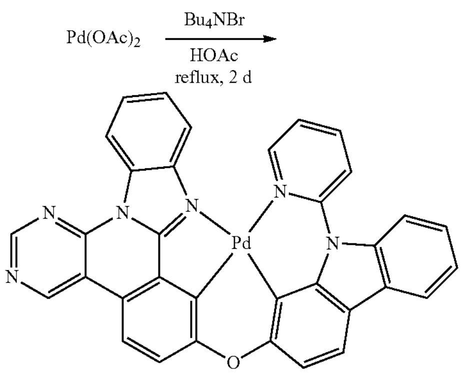

MC7

L7 (0.20 mmol, 1.0 eq), Pd(OAc)$_2$ (54 mg, 0.24 mmol, 1.2 eq) and n-Bu$_4$NBr (6.5 mg, 0.02 mmol, 0.1 eq) were added to a dry pressure tube, which was taken into a glove box and acetic acid (10 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain to obtain the desired product MC7 in 10%~50% yield.

Example 8

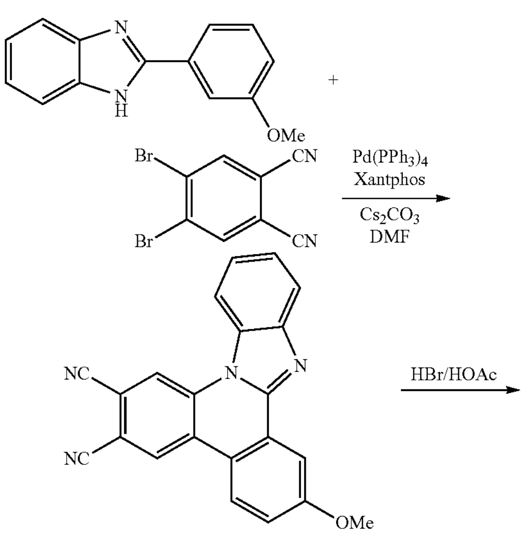

-continued

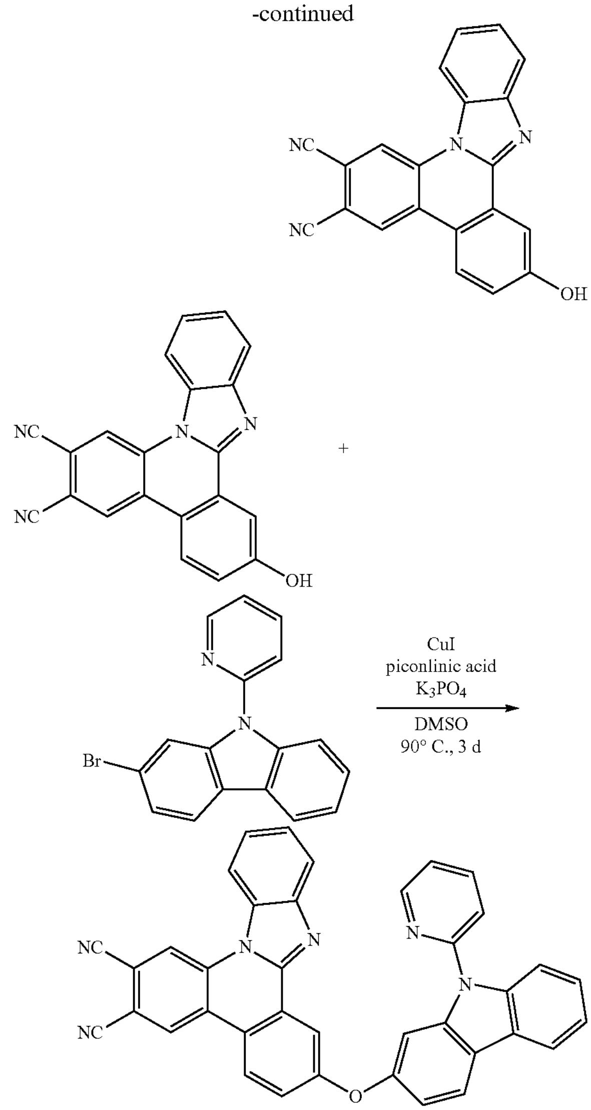

L8

7-hydroxybenzo[4,5]imidazo[1,2-f]phenanthridine-2,3-dicarbonitrile (334 mg, 1 mmol, 1.0 eq), 2-bromo-9-(pyridin-2-yl)-9H-carbazole (388 mg, 1.2 mmol, 1.2 eq), CuI (38 mg, 0.2 mmol, 0.2 eq), picolinic acid (49 mg, 0.4 mmol, 0.4 eq) and K$_3$PO$_4$ (425 mg, 2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L8 in 30%~70% yield.

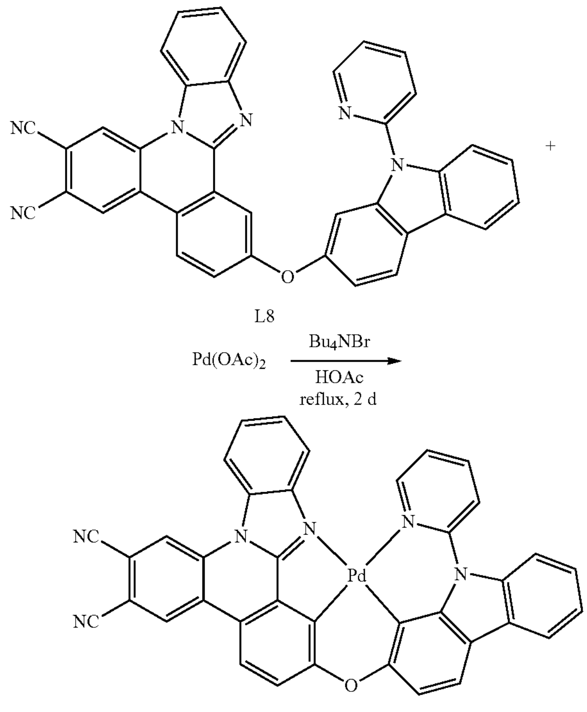

L8

MC8

L8 (0.20 mmol, 1.0 eq), $Pd(OAc)_2$ (54 mg, 0.24 mmol, 1.2 eq) and n-$Bu_4NBr$ (6.5 mg, 0.02 mmol, 0.1 eq) were added to a dry pressure tube, which was taken into a glove box and acetic acid (10 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain to obtain the desired product MC8 in 10%~50% yield.

Example 9

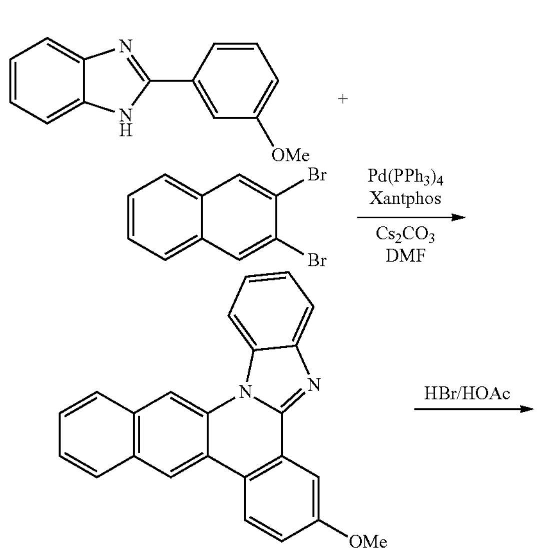

-continued

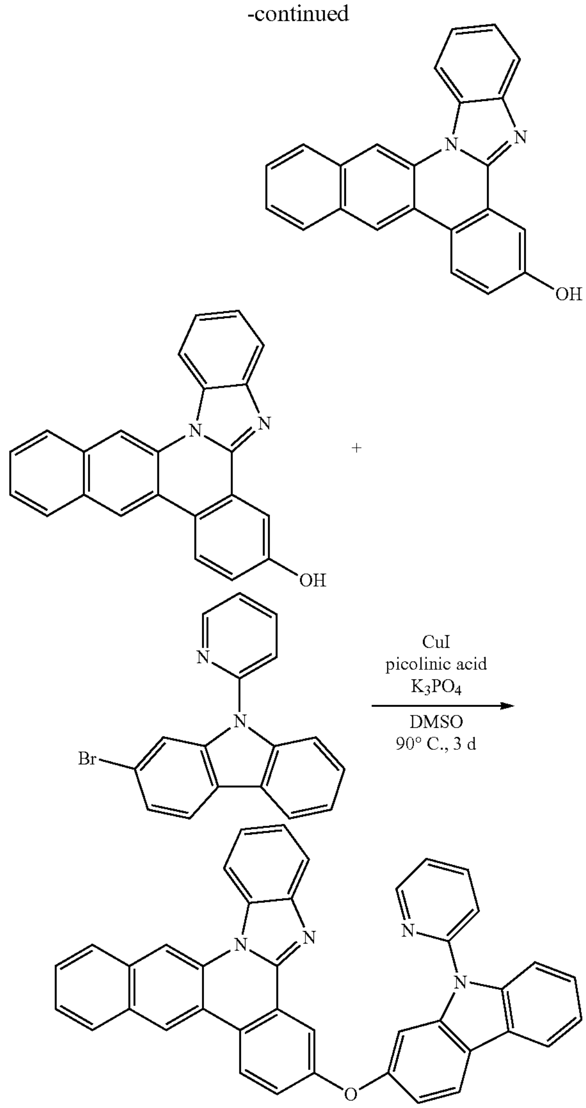

L9

Benzo[b]benzo[4,5]imidazo[1,2-f]phenanthridin-7-ol (217 mg, 0.65 mmol, 1.0 eq), 2-bromo-9-(pyridin-2-yl)-9H-carbazole (252 mg, 0.78 mmol, 1.2 eq), CuI (25 mg, 0.13 mmol, 0.2 eq), picolinic acid (16 mg, 0.13 mmol, 0.2 eq) and $K_3PO_4$ (275 mg, 1.3 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (5 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L9 as a white solid 100 mg in 27% yield.

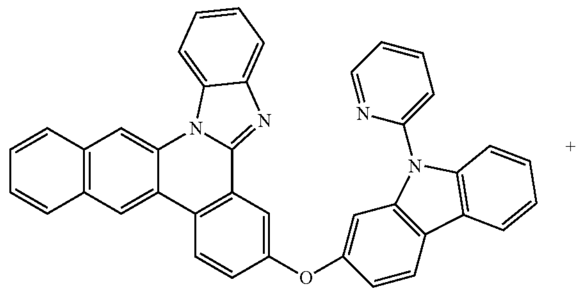

L9

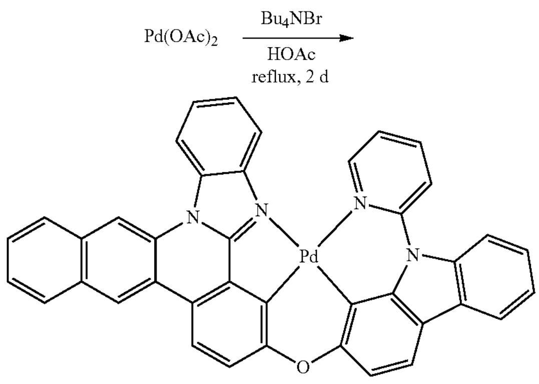

MC9

7-((9-(pyridin-2-yl)-9H-carbazol-2-yl)oxy)benzo[b]benzo[4,5]imidazo[1,2-f]phenanthridine (80 mg, 0.14 mmol, 1.0 eq), $Pd(OAc)_2$ (37 mg, 0.17 mmol, 1.2 eq) and n-$Bu_4NBr$ (5 mg, 0.014 mmol, 0.1 eq) were added to a dry pressure tube, which was taken into a glove box and acetic acid (9 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica, gel using dichloromethane as eluent to obtain the desired product MC9 as a white solid 60 mg in 63% yield.

Example 10

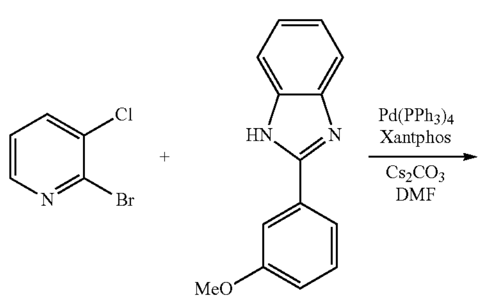

-continued

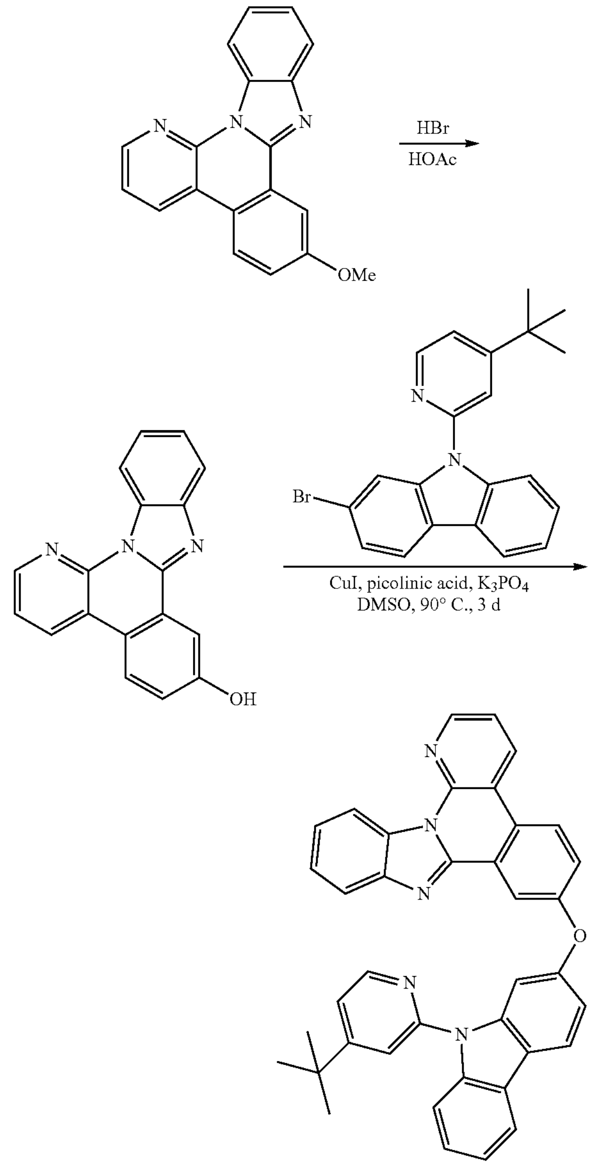

L10

Benzo[c]benzo[4,5]imidazo[1,2-a][1,8]naphthyridin-7-ol (145 mg, 0.51 mmol, 1.0 eq), 2-bromo-9-(4-(tert-butyl)pyridin-2-yl)-9H-carbazole (231 mg, 0.61 mmol, 1.2 eq), CuI (20 mg, 0.10 mmol, 0.2 eq), picolinic acid (13 mg, 0.10 mmol, 0.2 eq) and $K_3PO_4$ (217 mg, 1.02 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (5 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L10 as an orange yellow solid 185 mg in 63% yield.

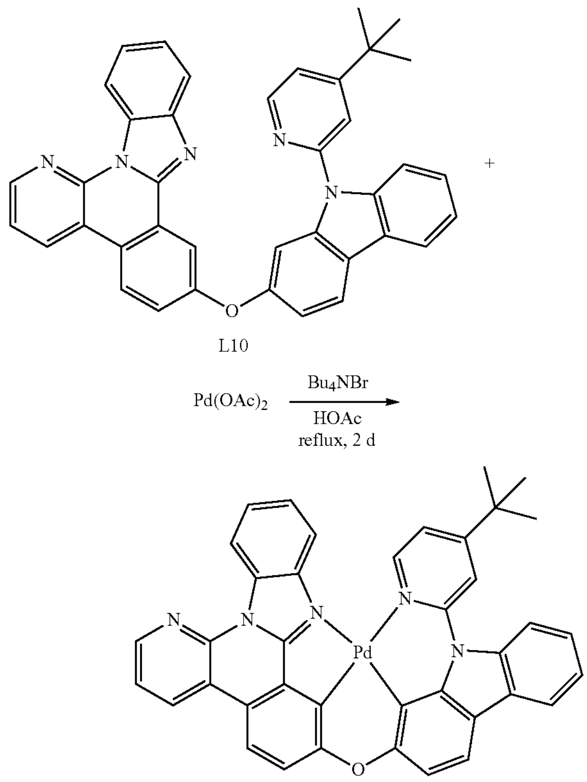

L10
MC10

L10 (175 mg, 0.3 mmol, 1.0 eq), $Pd(OAc)_2$ (74 mg, 0.33 mmol, 1.1 eq) and n-$Bu_4NBr$ (10 mg, 0.03 mmol, 0.1 eq) were added to a dry pressure tube, which was taken into a glove box and acetic acid (19 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product MC10 in 10%~50% yield.

Example 11

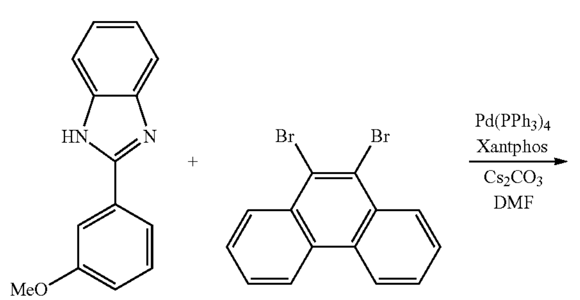

-continued

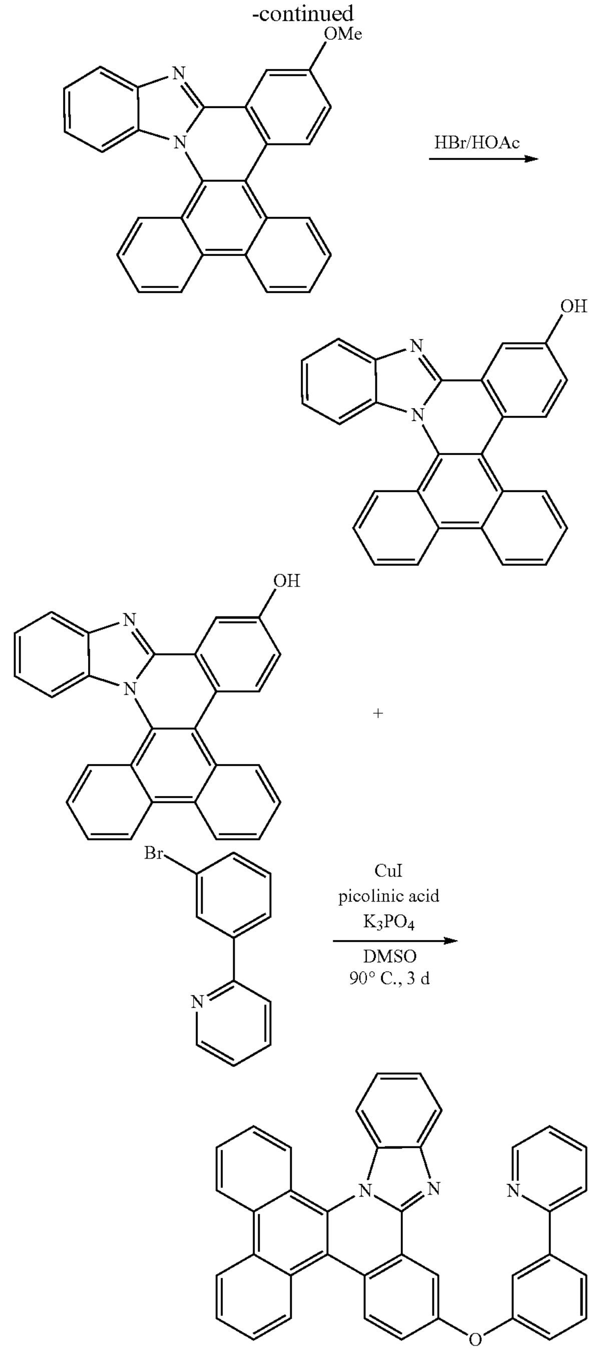

L11

Dibenzo[a,c]benzo[4,5]imidazo[1,2-f]phenanthridin-7-ol (384.4 mg, 1 mmol, 1.0 eq), 2-(3-bromophenyl)pyridine (281 mg, 1.2 mmol, 1.2 eq), CuI (38 mg, 0.2 mmol, 0.2 eq), picolinic acid (49 mg, 0.4 mmol, 0.4 eq) and $K_3PO_4$ (425 mg, 2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate (2:1) as eluent to obtain the desired product ligand L11 as a white solid 350 mg in 65% yield.

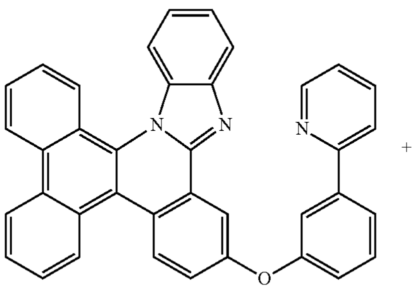

L11

$Pd(OAc)_2$ —$Bu_4NBr$, HOAc, reflux, 2 d→

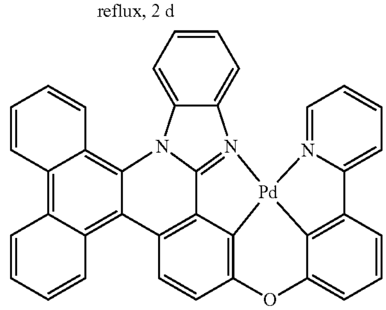

MC11

L11 (107.6 mg, 0.20 mmol, 1.0 eq), $Pd(OAc)_2$ (54 mg, 0.24 mmol, 1.2 eq) and n-$Bu_4NBr$ (6.5 mg, 0.02 mmol, 0.1 eq) were added to a dry pressure tube was then taken into a glove box and acetic acid (10 mL) was added. The mixture was bubbled with nitrogen for 30 minutes and then the tube was sealed. Then the mixture was heated to reflux in an oil bath and stirred for 2 days, cooled to ambient temperature and removed the solvent. Then the solid was purified through column chromatography on silica gel using dichloromethane as eluent to obtain to obtain the desired product MC11 as a white solid 58 mg in 45% yield.

Example 12

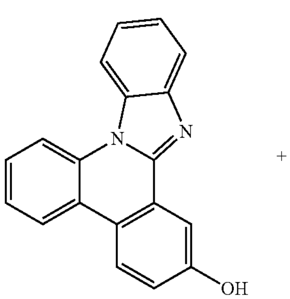

-continued

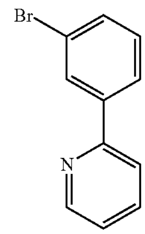

CuI, picolinic acid, $K_3PO_4$ / DMSO, 90° C., 3 d →

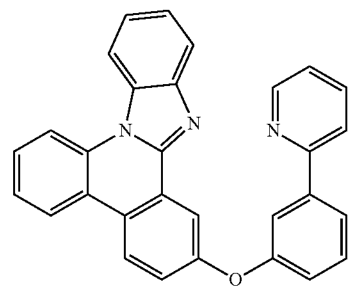

L12

Benzo[4,5]imidazo[1,2-f]phenanthridin-7-ol (284.3 mg, 1 mmol, 1.0 eq), 2-(3-bromophenyl)pyridine (281 mg, 1.2 mmol, 1.2 eq), CuI (38 mg, 0.2 mmol, 0.2 eq), picolinic acid (49 mg, 0.4 mmol, 0.4 eq) and $K_3PO_4$ (425 mg, 2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate (2:1) as eluent to obtain the desired product ligand L12 as a white solid 306 mg in 70% yield.

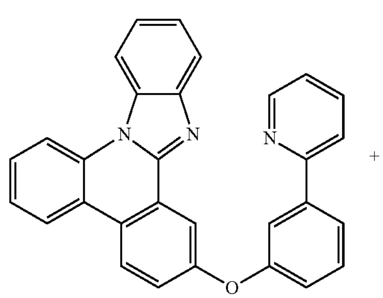

L12

$Pd(OAc)_2$ —$Bu_4NBr$, HOAc, reflux, 2 d→

-continued

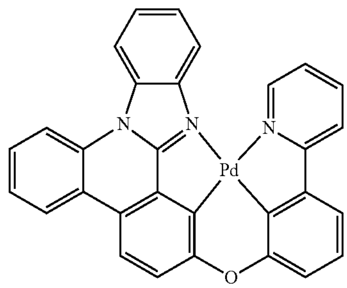

MC12

-continued

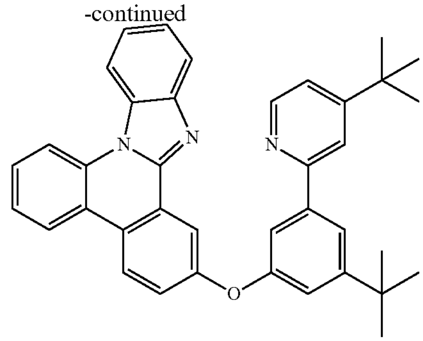

L13

Figure 3:
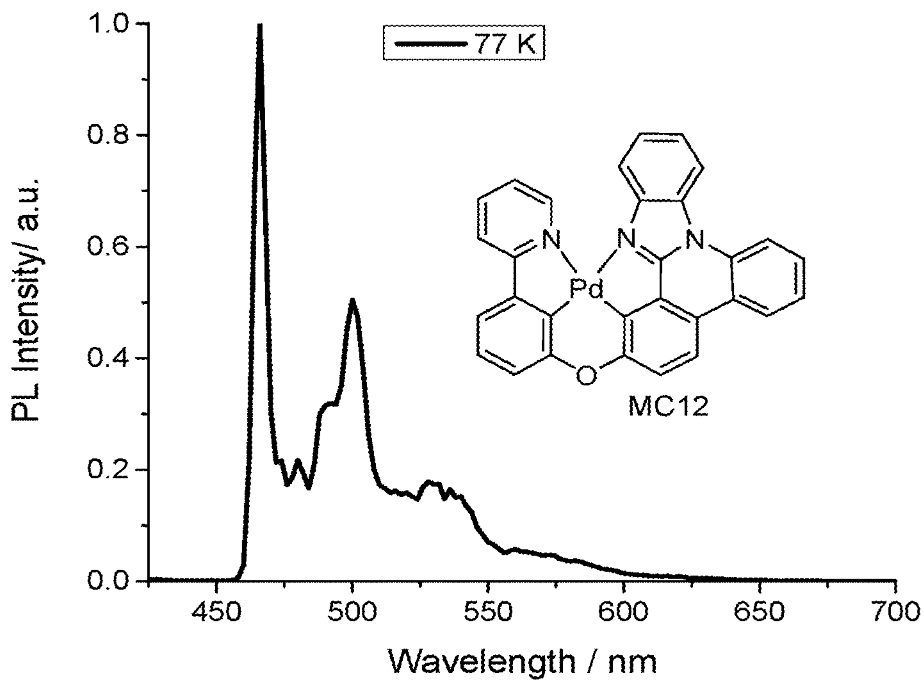
FIG. 3 is an emission spectrum of the metal-assisted delayed fluorescent emitter of Example 12 in tehtrahydro-2-methylfuran at 77K.

LC12 (87.4 mg, 0.20 mmol, 1.0 eq), $Pd(OAc)_2$ (54 mg, 0.24 mmol, 1.2 eq) and n-$Bu_4NBr$ (6.5 mg, 0.02 mmol, 0.1 eq) were added to a dry pressure tube, which was taken into a glove box and acetic acid (10 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain to obtain the desired product MC12 as a white solid 43 mg in 40% yield. FIG. 3 shows an emission spectrum of MC12 in tetrahydro-2-methylfuran at 77K.

Example 13

Benzo[4,5]imidazo[1,2-f]phenanthridin-7-ol (355 mg, 1.03 mmol, 1.0 eq), 2-(3-bromo-5-(tert-butyl)phenyl)-4-(tert-butyl)pyridine (350 mg, 1.23 mmol, 1.2 eq), CuI (40 mg, 0.21 mmol, 0.2 eq), picolinic acid (25 mg, 0.21 mmol, 0.2 eq) and $K_3PO_4$ (437 mg, 2.06 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L13 as an orange yellow solid 310 mg in 55% yield.

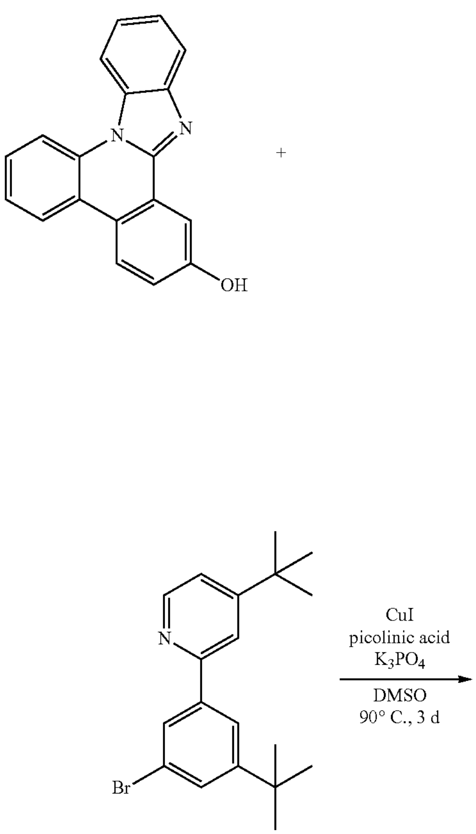

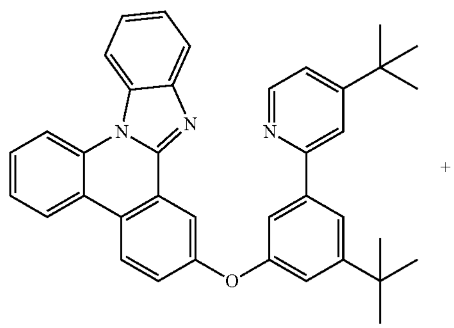

L13

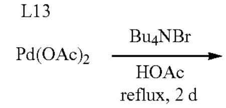

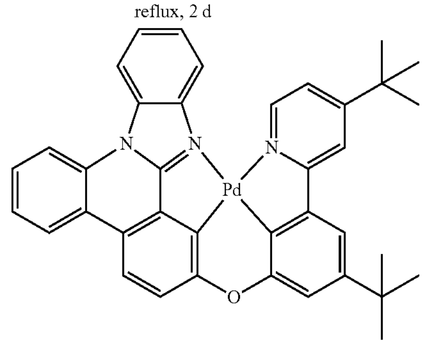

MC13

L13 (66 mg, 0.12 mmol, 1.0 eq), $Pd(OAc)_2$ (32 mg, 0.14 mmol, 1.2 eq) and n-$Bu_4NBr$ (4 mg, 0.012 mmol, 0.1 eq) were added to a dry pressure tube, which was taken into a glove box and acetic acid (8 mL) added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product MC13 in 10%~50% yield.

Example 14

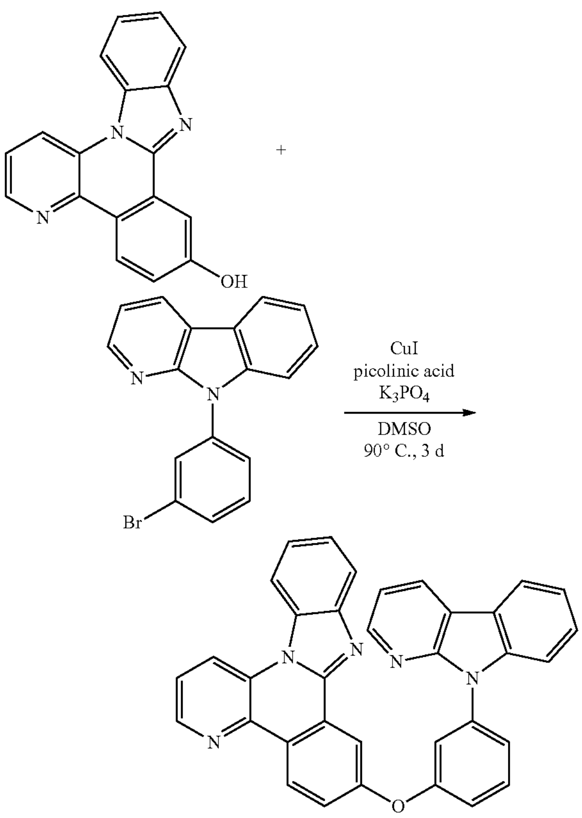

L14

Benzo[c]benzo[4,5]imidazo[1,2-a][1,5]naphthyridin-7-ol (100 mg, 0.35 mmol, 1.0 eq), 9-(3-bromophenyl)-9H-pyrido[2,3-b]indole (136 mg, 0.42 mmol, 1.2 eq), CuI (13 mg, 0.07 mmol, 0.2 eq), picolinic acid (9 mg, 0.07 mmol, 0.2 eq) and $K_3PO_4$ (149 mg, 0.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (5 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L14 in 30%~70% yield.

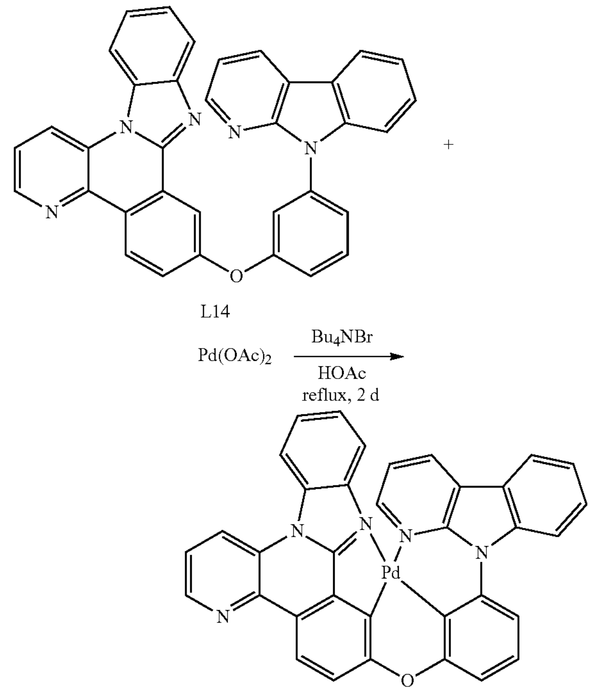

MC14

L14 (95 mg, 0.18 mmol, 1.0 eq), $Pd(OAc)_2$ (43 mg, 0.19 mmol, 1.1 eq) and n-$Bu_4NBr$ (6 mg, 0.018 mmol, 0.1 eq) were added to a dry pressure tube, which was taken into a glove box and acetic acid (11 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product MC14 in 10%-50% yield.

Example 15

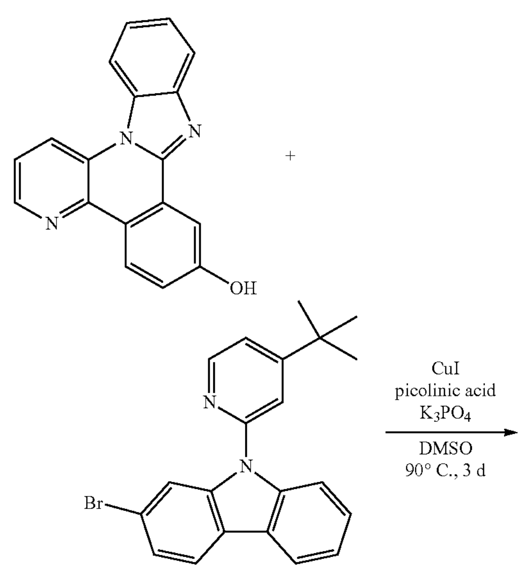

-continued

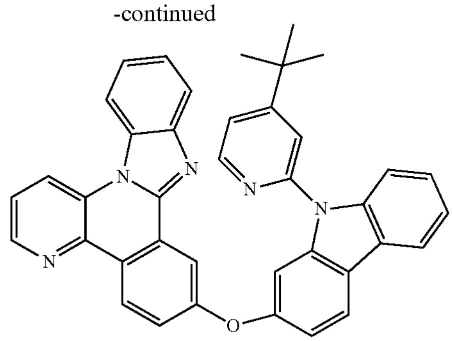

L15

Benzo[c]benzo[4,5]imidazo[1,2-a][1,5]naphthyridin-7-ol (100 mg, 0.35 mmol, 1.0 eq), 2-bromo-9-(4-(tert-butyl)pyridin-2-yl)-9H-carbazole (159 mg, 0.42 mmol, 1.2 eq), CuI (13 mg, 0.07 mmol, 0.2 eq), picolinic acid (9 mg, 0.07 mmol, 0.2 eq) and $K_3PO_4$ (149 mg, 0.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (5 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L15 in 30%~70% yield.

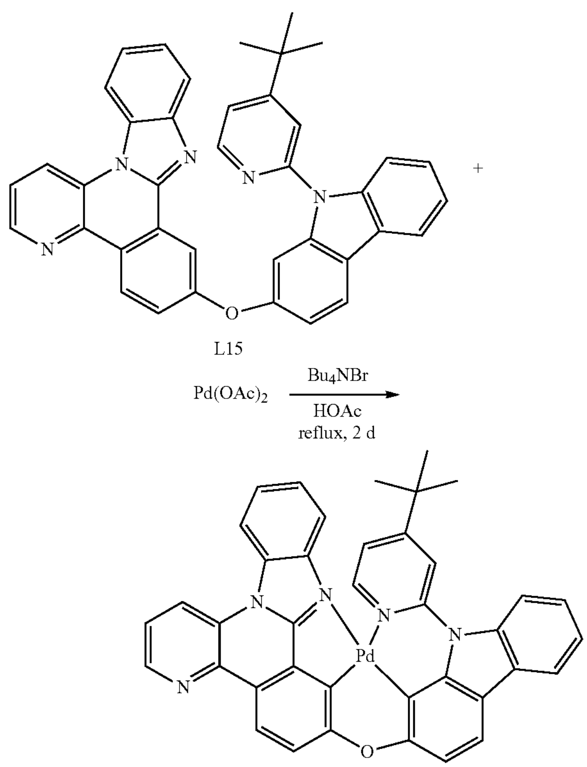

MC15

L15 (0.18 mmol, 1.0 eq), $Pd(OAc)_2$ (43 mg, 0.19 mmol, 1.1 eq) and $n\text{-}Bu_4NBr$ (6 mg, 0.018 mmol, 0.1 eq) were added to a dry pressure tube, which was taken into a glove box and acetic acid (11 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product MC15 in 10%-50% yield.

Example 16

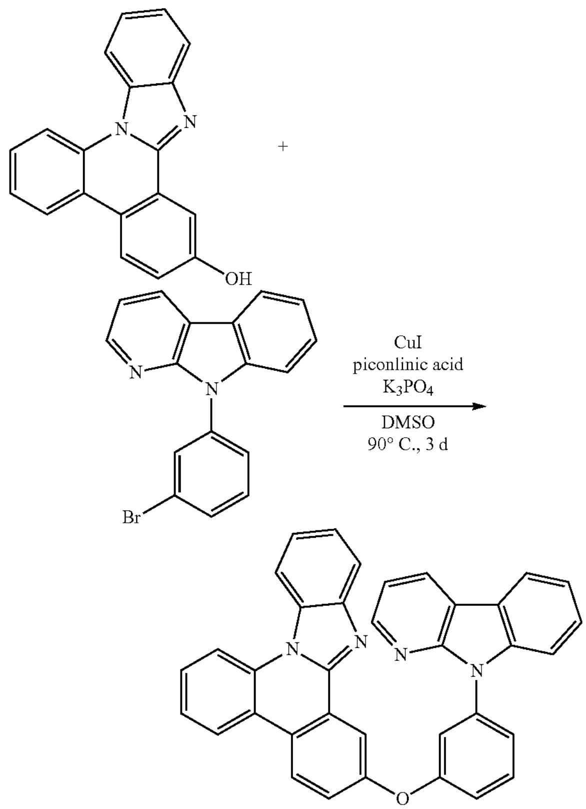

L16

Benzo[4,5]imidazo[1,2-f]phenanthridin-7-ol (284.3 mg, 1 mmol, 1.0 eq), 2-bromo-9-(pyridin-2-yl)-9H-carbazole (388 mg, 1.2 mmol, 1.2 eq), CuI (38 mg, 0.2 mmol, 0.2 eq), picolinic acid (49 mg, 0.4 mmol, 0.4 eq) and $K_3PO_4$ (425 mg, 2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate (2:1) as and eluent to obtain the desired product ligand L16 as a white solid 316 mg in 60% yield.

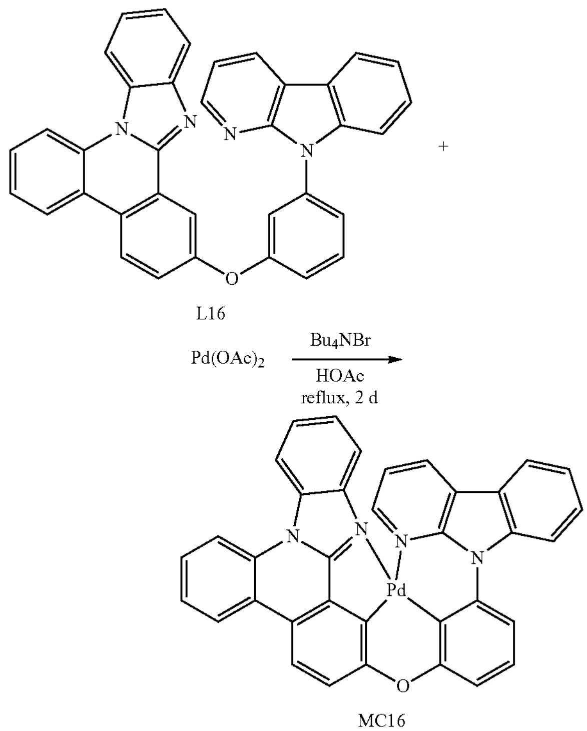

L16 (105.4 mg, 0.20 mmol, 1.0 eq), $Pd(OAc)_2$ (54 mg, 0.24 mmol, 1.2 eq) and n-$Bu_4NBr$ (6.5 mg, 0.02 mmol, 0.1 eq) were added to a dry pressure tube was then taken into a glove box and acetic acid (10 mL) was added. The mixture was bubbled with nitrogen for 30 minutes and then the tube was sealed. Then the mixture was heated to reflux in an oil bath and stirred for 2 days, cooled to ambient temperature and removed the solvent. Then the solid was purified through column chromatography on silica gel using dichloromethane as eluent to obtain to obtain the desired product MC16 as a white solid 52 mg in 40% yield.

Example 17

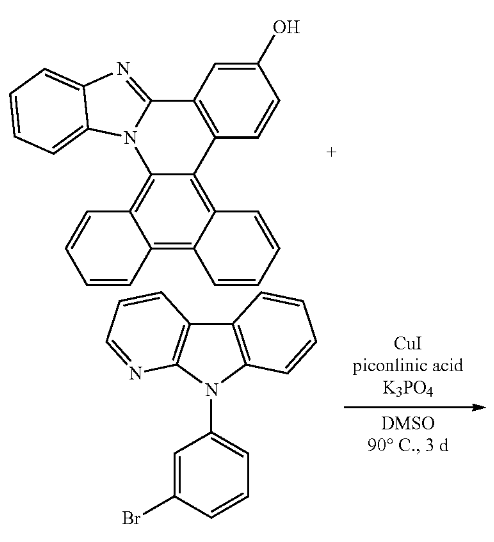

-continued

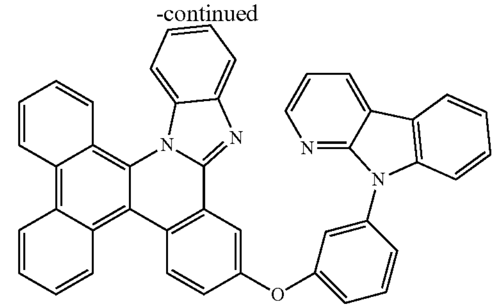

L17

Dibenzo[a,c]benzo[4,5]imidazo[1,2-f]phenanthridin-7-ol (384.3 mg, 1 mmol, 1.0 eq), 9-(3-bromophenyl)-9H-pyrido[2,3-b]indole (388 mg, 1.2 mmol, 1.2 eq), CuI (38 mg, 0.2 mmol, 0.2 eq), picolinic acid (49 mg, 0.4 mmol, 0.4 eq) and $K_3PO_4$ (425 mg, 2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate (2:1) as eluent to obtain the desired product ligand L17 as a white solid 352 mg in 56% yield.

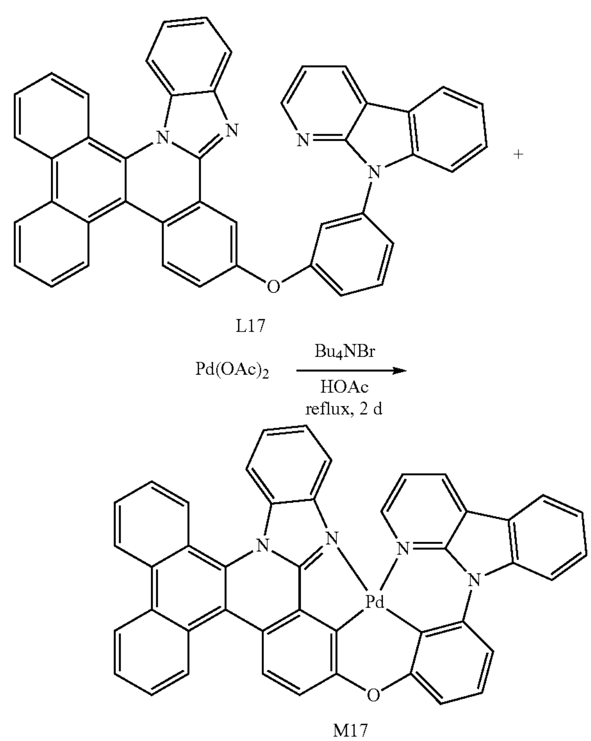

L17 (125.4 mg, 0.20 mmol, 1.0 eq), $Pd(OAc)_2$ (54 mg, 0.24 mmol, 1.2 eq) and n-$Bu_4NBr$ (6.5 mg, 0.02 mmol, 0.1 eq) were added to a dry pressure tube was then taken into a glove box and acetic acid (10 mL) was added. The mixture was bubbled with nitrogen for 30 minutes and then the tube was sealed. Then the mixture was heated to reflux in an oil bath and stirred for 2 days, cooled to ambient temperature and removed the solvent. Then the solid was purified through column chromatography on silica gel using dichloromethane as eluent to obtain to obtain the desired product MC17 as a white solid 66 mg in 45% yield.

Example 18

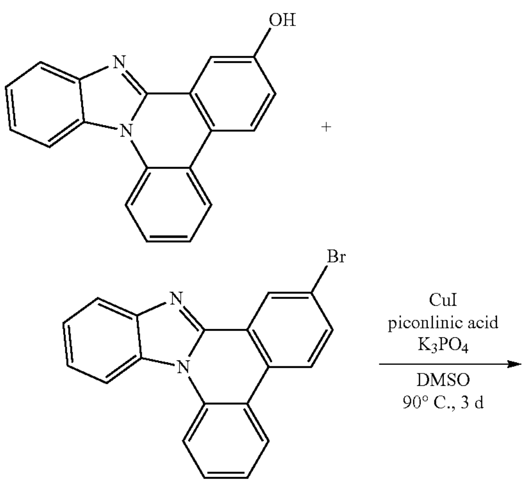

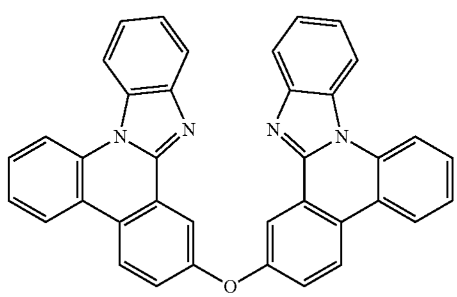

L18

Benzo[4,5]imidazo[1,2-f]phenanthridin-7-ol (1 mmol, 1.0 eq), 7-bromobenzo[4,5]imidazo[1,2-f]phenanthridine (1.2 mmol, 1.2 eq), CuI (38 mg, 0.2 mmol, 0.2 eq), picolinic acid (49 mg, 0.4 mmol, 0.4 eq) and $K_3PO_4$ (425 mg, 2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate (2:1) as eluent to obtain the desired product ligand L18 as a white solid in 40%~70% yield.

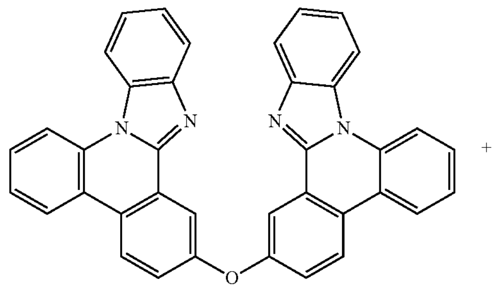

L18

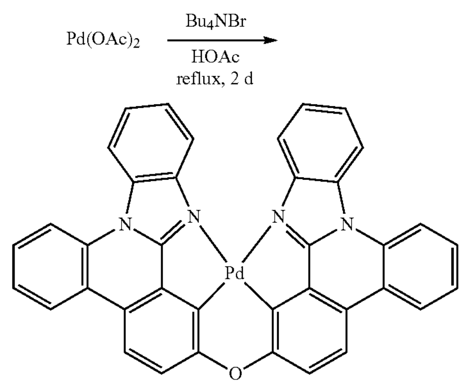

MC18

L18 (0.20 mmol, 1.0 eq), $Pd(OAc)_2$ (0.24 mmol, 1.2 eq) and n-$Bu_4NBr$ (6.5 mg, 0.02 mmol, 0.1 eq) were added to a dry pressure tube was then taken into a glove box and acetic acid (10 mL) was added. The mixture was bubbled with nitrogen for 30 minutes and then the tube was sealed. Then the mixture was heated to reflux in an oil bath and stirred for 2 days, cooled to ambient temperature and removed the solvent. Then the solid was purified through column chromatography on silica gel using dichloromethane as eluent to obtain to obtain the desired product MC18 as a white solid in 10%~50% yield.

Example 19

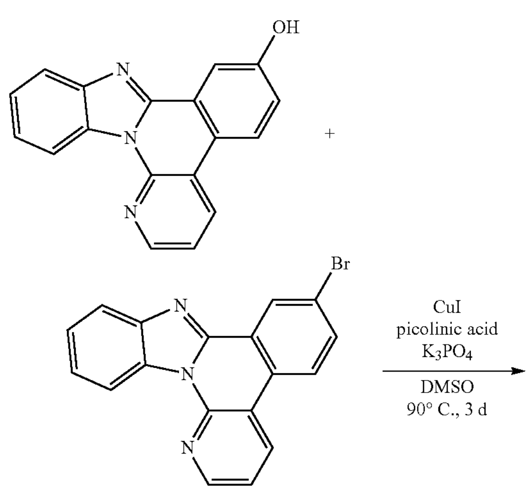

-continued

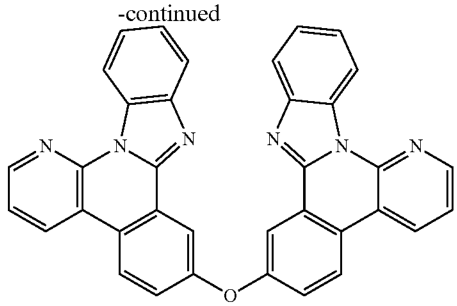

L19

Benzo[c]benzo[4,5]imidazo[1,2-a][1,8]naphthyridin-7-ol (1 mmol, 1.0 eq), 7-bromobenzo[c]benzo[4,5]imidazo[1,2-a][1,8]naphthyridine (1.2 mmol, 1.2 eq), CuI (38 mg, 0.2 mmol, 0.2 eq), picolinic acid (49 mg, 0.4 mmol, 0.4 eq) and $K_3PO_4$ (425 mg, 2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate (2:1) as eluent to obtain the desired product ligand L19 as a white solid in 40%~70% yield.

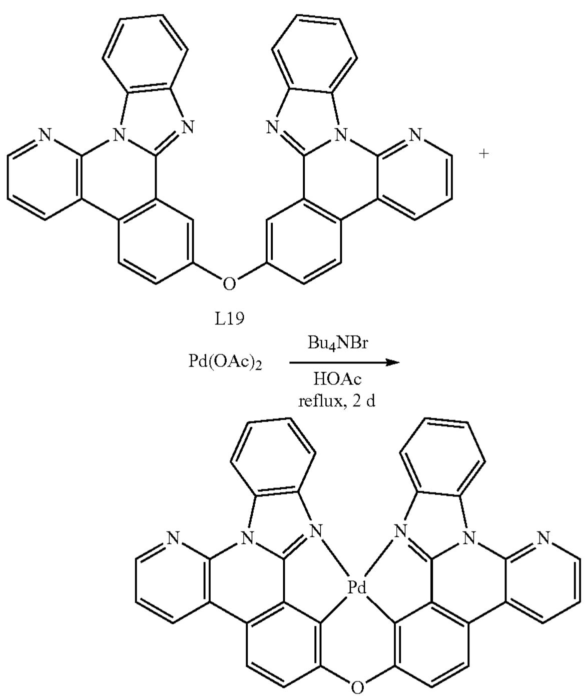

MC19

L19 (0.20 mmol, 1.0 eq), $Pd(OAc)_2$ (0.24 mmol, 1.2 eq) and $n\text{-}Bu_4NBr$ (6.5 mg, 0.02 mmol, 0.1 eq) were added to a dry pressure tube was then taken into a glove box and acetic acid (10 mL) was added. The mixture was bubbled with nitrogen for 30 minutes and then the tube was sealed. Then the mixture was heated to reflux in an oil bath and stirred for 2 days, cooled to ambient temperature and removed the solvent. Then the solid was purified through column chromatography on silica gel using dichloromethane as eluent to obtain to obtain the desired product MC19 as a white solid in 10%~50% yield.

Example 20

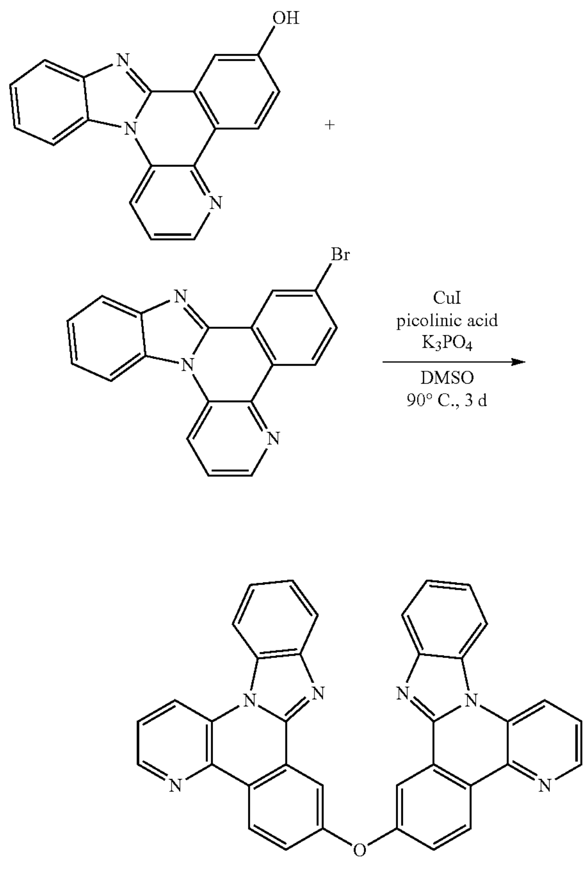

L20

Benzo[c]benzo[4,5]imidazo[1,2-a][1,5]naphthyridin-7-ol (1 mmol, 1.0 eq), 7-bromobenzo[c]benzo[4,5]imidazo[1,2-a][1,5]naphthyridine (1.2 mmol, 1.2 eq), CuI (38 mg, 0.2 mmol, 0.2 eq), picolinic acid (49 mg, 0.4 mmol, 0.4 eq) and $K_3PO_4$ (425 mg, 2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate (2:1) as eluent to obtain the desired product ligand L20 as a white solid in 40%~70% yield.

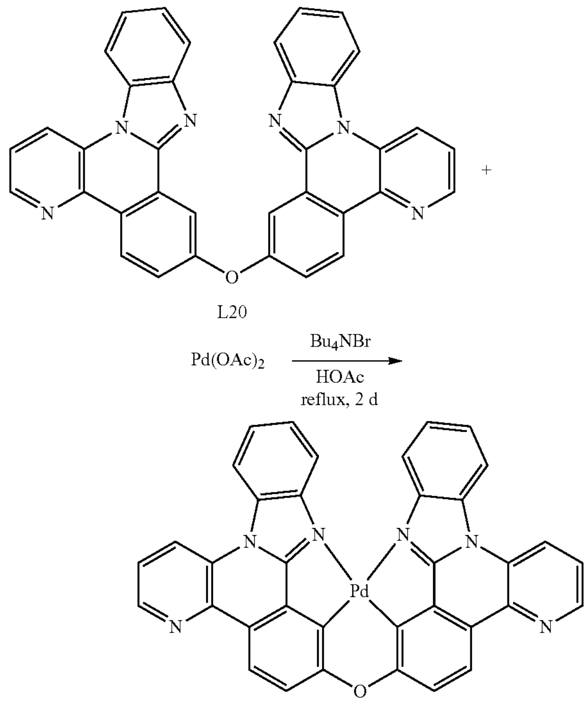

MC20

L20 (0.20 mmol, 1.0 eq), $Pd(OAc)_2$ (0.24 mmol, 1.2 eq) and n-$Bu_4NBr$ (6.5 mg, 0.02 mmol, 0.1 eq) were added to a dry pressure tube was then taken into a glove box and acetic acid (10 mL) was added. The mixture was bubbled with nitrogen for 30 minutes and then the tube was sealed. Then the mixture was heated to reflux in an oil bath and stirred for 2 days, cooled to ambient temperature and removed the solvent. Then the solid was purified through column chromatography on silica gel using dichloromethane as eluent to obtain to obtain the desired product MC20 as a white solid in 10%~50% yield.

Example 21

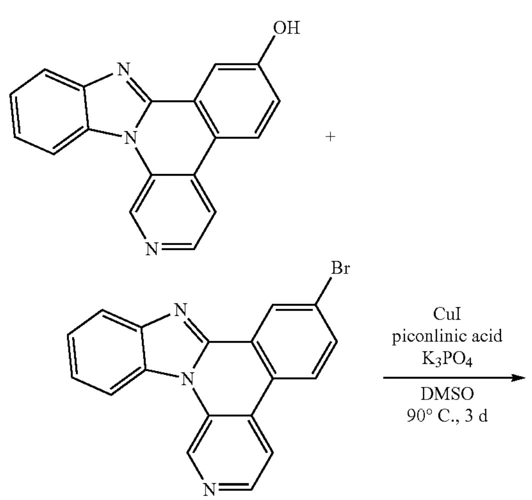

-continued

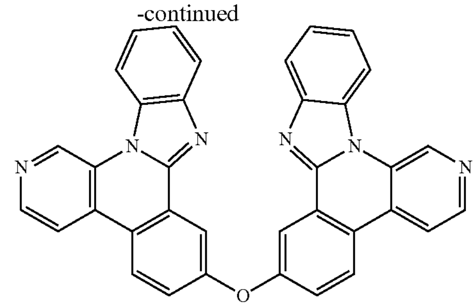

L21

Benzo[c]benzo[4,5]imidazo[1,2-a][1,7]naphthyridin-7-ol (1 mmol, 1.0 eq), 7-bromobenzo[c]benzo[4,5]imidazo[1,2-a][1,7]naphthyridine (1.2 mmol, 1.2 eq), CuI (38 mg, 0.2 mmol, 0.2 eq), picolinic acid (49 mg, 0.4 mmol, 0.4 eq) and $K_3PO_4$ (425 mg, 2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate (2:1) as eluent to obtain the desired product ligand L21 as a white solid in 40%~70% yield.

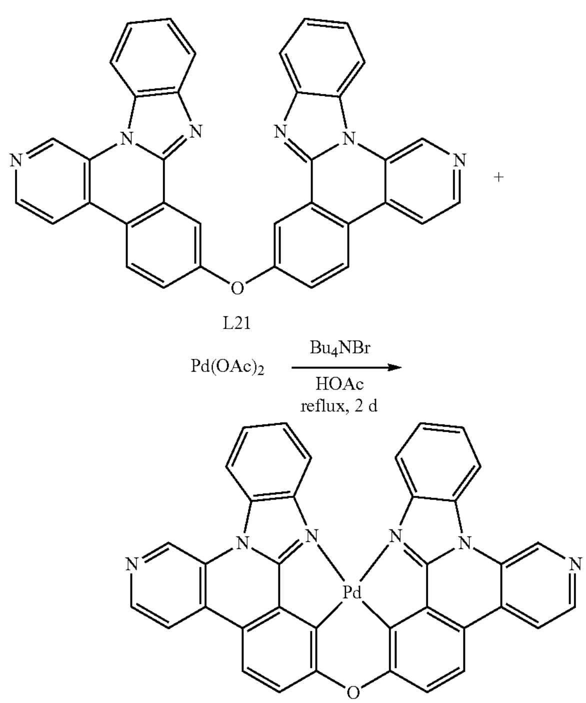

MC21

L21 (0.20 mmol, 1.0 eq), $Pd(OAc)_2$ (0.24 mmol, 1.2 eq) and n-$Bu_4NBr$ (6.5 mg, 0.02 mmol, 0.1 eq) were added to a dry pressure tube was then taken into a glove box and acetic acid (10 mL) was added. The mixture was bubbled with nitrogen for 30 minutes and then the tube was sealed. Then the mixture was heated to reflux in an oil bath and stirred for 2 days, cooled to ambient temperature and removed the solvent. Then the solid was purified through column chromatography on silica gel using dichloromethane as eluent to obtain to obtain the desired product MC21 as a white solid in 10%~50% yield.

Example 22

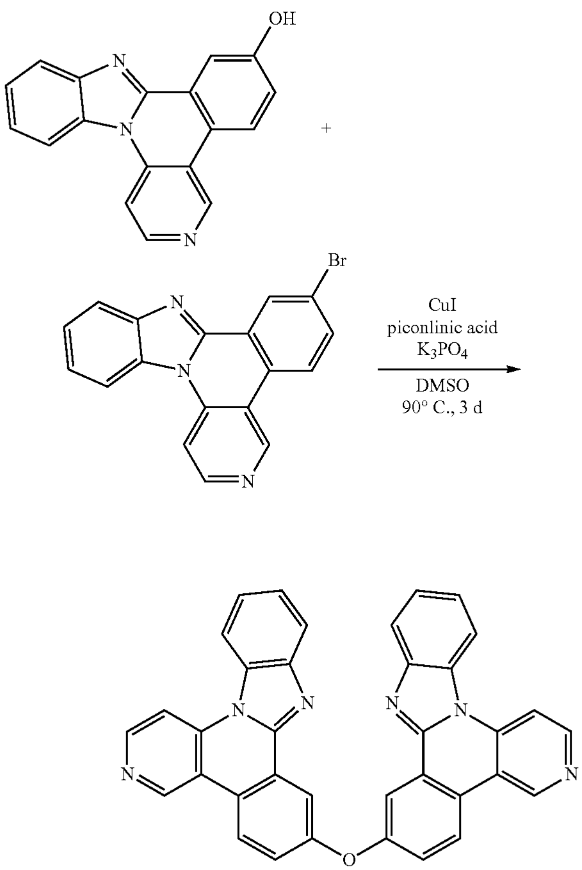

L22

Benzo[c]benzo[4,5]imidazo[1,2-a][1,6]naphthyridin-7-ol (1 mmol, 1.0 eq), 7-bromobenzo[c]benzo[4,5]imidazo[1,2-a][1,6]naphthyridine (1.2 mmol, 1.2 eq), CuI (38 mg, 0.2 mmol, 0.2 eq), picolinic acid (49 mg, 0.4 mmol, 0.4 eq) and $K_3PO_4$ (425 mg, 2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate (2:1) as eluent to obtain the desired product ligand L22 as a white solid in 40%~70% yield.

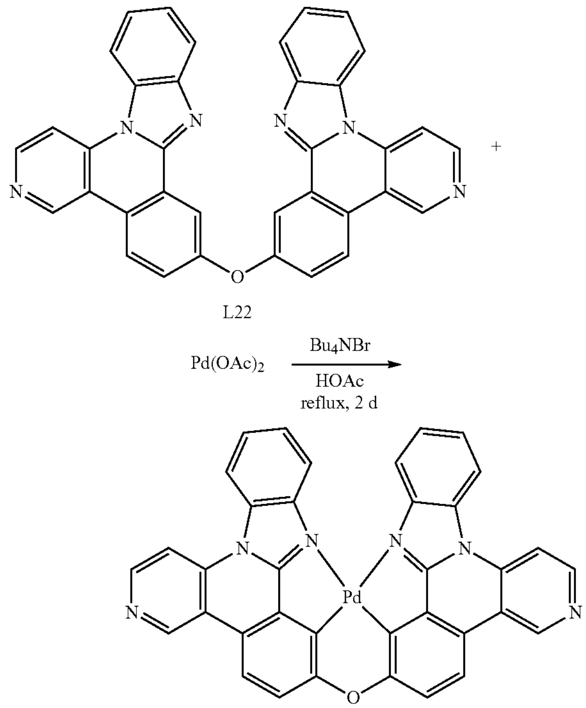

MC22

L22 (0.20 mmol, 1.0 eq), $Pd(OAc)_2$ (0.24 mmol, 1.2 eq) and n-$Bu_4NBr$ (6.5 mg, 0.02 mmol, 0.1 eq) were added to a dry pressure tube was then taken into a glove box and acetic acid (10 mL) was added. The mixture was bubbled with nitrogen for 30 minutes and then the tube was sealed. Then the mixture was heated to reflux in an oil bath and stirred for 2 days, cooled to ambient temperature and removed the solvent. Then the solid was purified through column chromatography on silica gel using dichloromethane as eluent to obtain to obtain the desired product MC22 as a white solid in 10%~50% yield.

Example 23

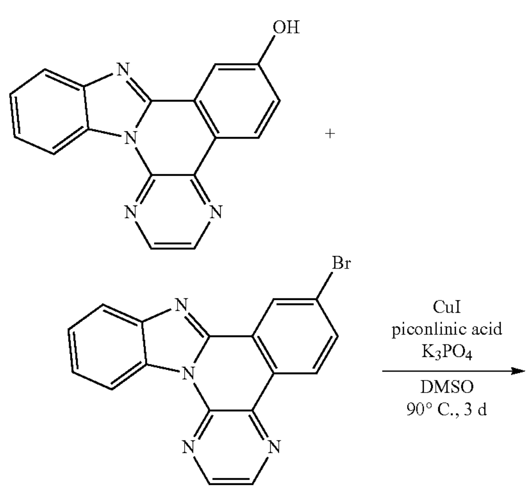

-continued

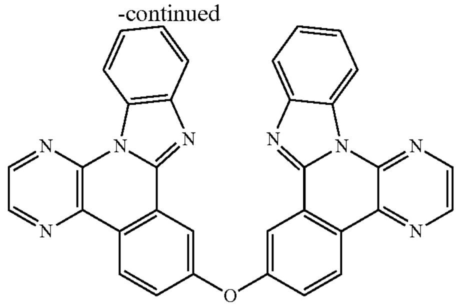

L23

Benzo[4,5]imidazo[2,1-a]pyrazino[2,3-c]isoquinolin-7-ol (1 mmol, 1.0 eq), 7-bromobenzo[4,5]imidazo[2,1-a]pyrazino[2,3-c]isoquinoline (1.2 mmol, 1.2 eq), CuI (38 mg, 0.2 mmol, 0.2 eq), picolinic acid (49 mg, 0.4 mmol, 0.4 eq) and $K_3PO_4$ (425 mg, 2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate (2:1) as eluent to obtain the desired product ligand L23 as a white solid in 40%~70% yield.

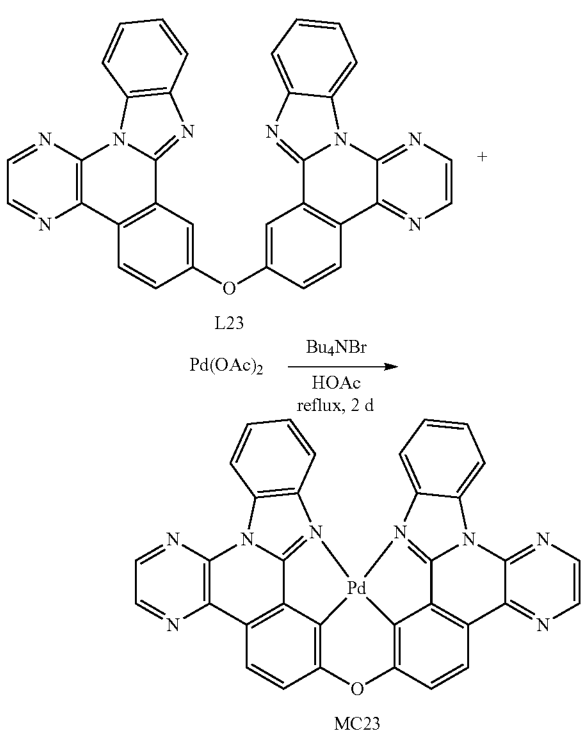

L23 (0.20 mmol, 1.0 eq), $Pd(OAc)_2$ (0.24 mmol, 1.2 eq) and n-$Bu_4NBr$ (6.5 mg, 0.02 mmol, 0.1 eq) were added to a dry pressure tube was then taken into a glove box and acetic acid (10 mL) was added. The mixture was bubbled with nitrogen for 30 minutes and then the tube was sealed. Then the mixture was heated to reflux in an oil bath and stirred for 2 days, cooled to ambient temperature and removed the solvent. Then the solid was purified through column chromatography on silica gel using dichloromethane as eluent to obtain to obtain the desired product MC23 as a white solid in 10%~50% yield.

Example 24

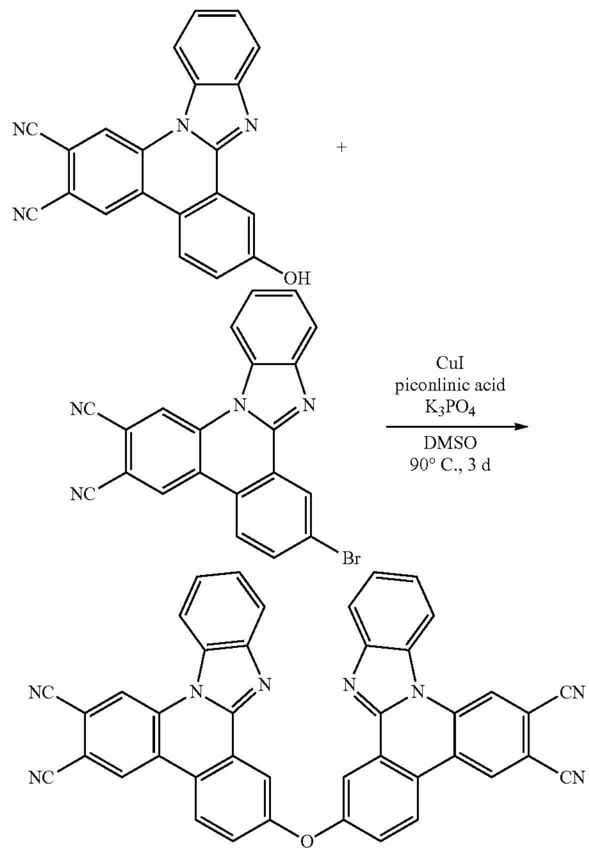

7-hydroxybenzo[4,5]imidazo[1,2-f]phenanthridine-2,3-dicarbonitrile (1 mmol, 1.0 eq), 7-bromobenzo[4,5]imidazo[1,2-f]phenanthridine-2,3-dicarbonitrile (1.2 mmol, 1.2 eq), CuI (38 mg, 0.2 mmol, 0.2 eq), picolinic acid (49 mg, 0.4 mmol, 0.4 eq) and $K_3PO_4$ (425 mg, 2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate (2:1) as eluent to obtain the desired product ligand L24 as a white solid in 40%~70% yield.

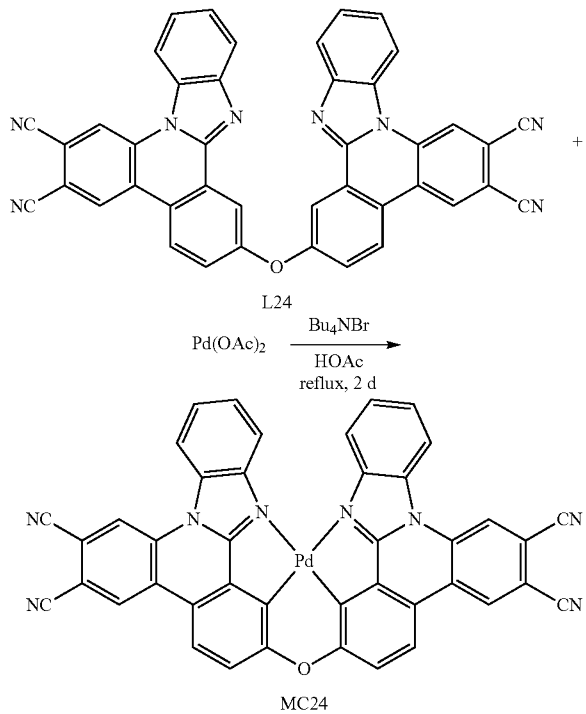

L24

MC24

L24 (0.20 mmol, 1.0 eq), $Pd(OAc)_2$ (0.24 mmol, 1.2 eq) and n-$Bu_4NBr$ (6.5 mg, 0.02 mmol, 0.1 eq) were added to a dry pressure tube was then taken into a glove box and acetic acid (10 mL) was added. The mixture was bubbled with nitrogen for 30 minutes and then the tube was sealed. Then the mixture was heated to reflux in an oil bath and stirred for 2 days, cooled to ambient temperature and removed the solvent. Then the solid was purified through column chromatography on silica gel using dichloromethane as eluent to obtain to obtain the desired product MC24 as a white solid in 10%~50% yield.

Example 25

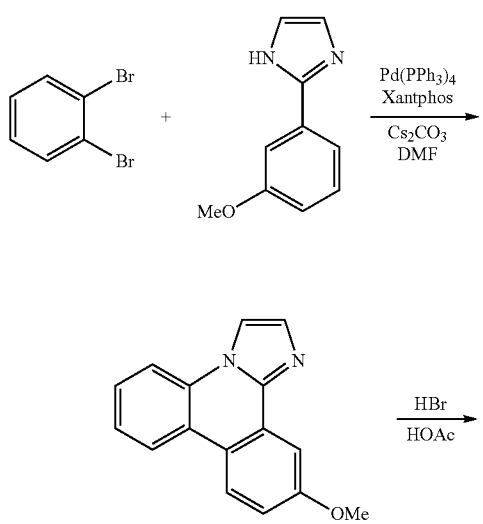

-continued

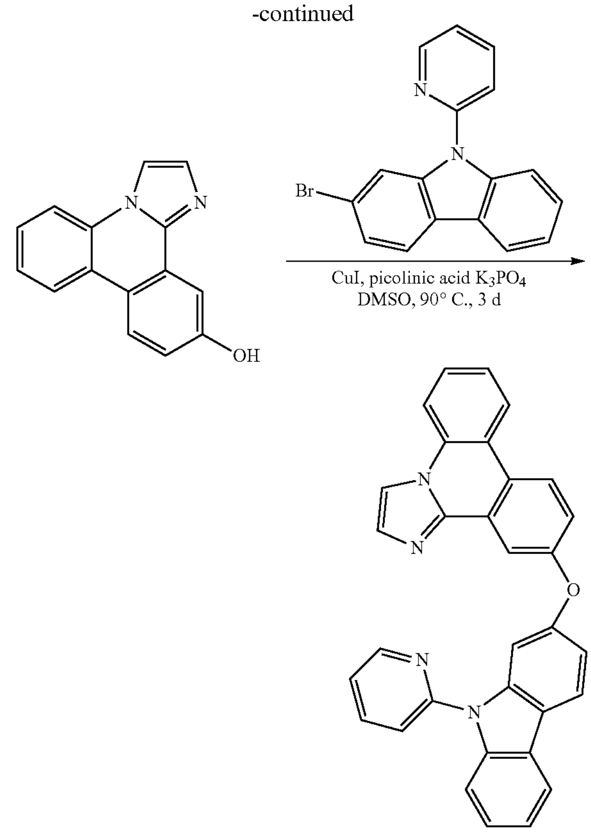

L25

Imidazo[1,2-f]phenanthridin-11-ol (200 mg, 0.85 mmol, 1.0 eq), 2-bromo-9-(pyridin-2-yl)-9H-carbazole (359 mg, 1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L25 as a light orange solid 350 mg in 86% yield.

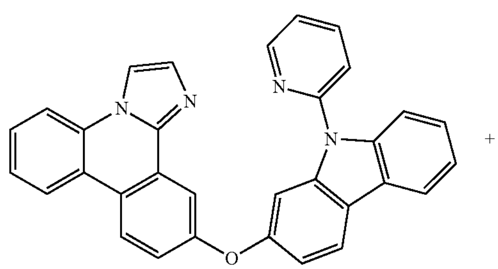

L25

-continued

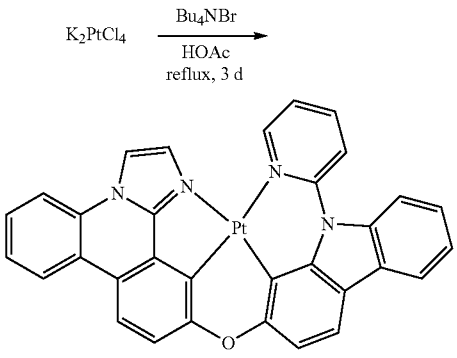

MC25

L25 (50 mg, 0.11 mmol, 1.0 eq), $K_2PtCl_4$ (48 mg, 0.12 mmol, 1.1 eq) and n-$Bu_4NBr$ (3 mg, 0.011 mmol, 0.1 eq) were added to a dry pressure tube, which was taken into a glove box and acetic acid (7 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC25 as a white solid 15 mg in 21% yield.

Example 26

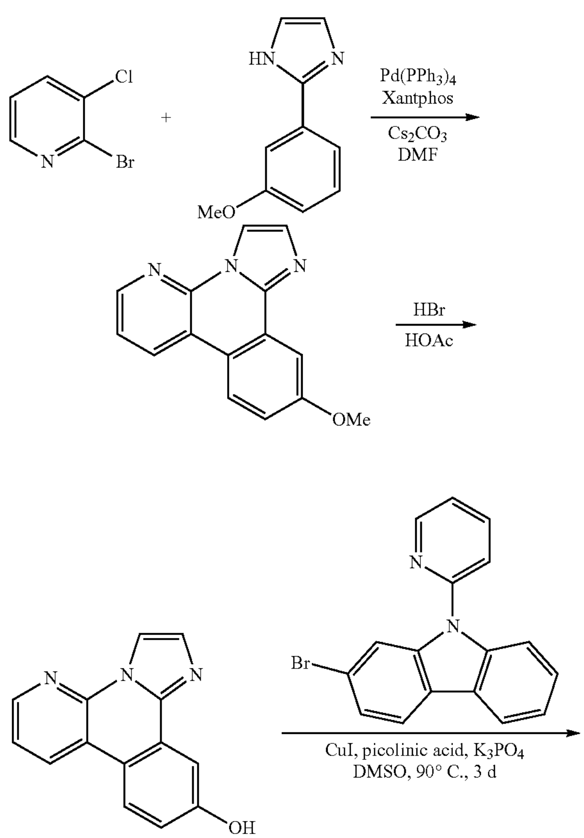

-continued

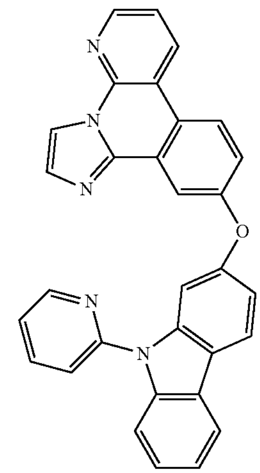

L26

11-bromobenzo[c]imidazo[1,2-a][1,8]naphthyridine (250 mg, 0.84 mmol, 1.0 eq), 9-(pyridin-2-yl)-9H-carbazol-2-ol (262 mg, 1.01 mmol, 1.2 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L26 as a light orange solid 200 mg in 50% yield.

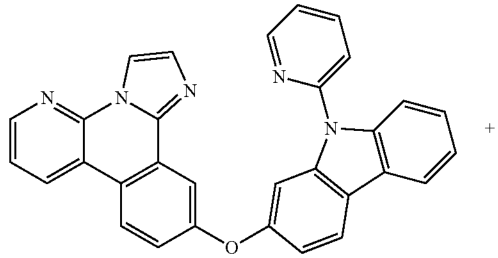

L26

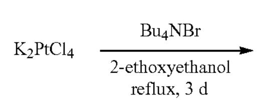

-continued

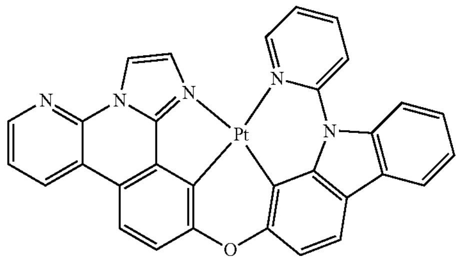

MC26

L26 (140 mg, 0.29 mmol, 1.0 eq), $K_2PtCl_4$ (134 mg, 0.32 mmol, 1.1 eq) and n-$Bu_4NBr$ (9 mg, 0.030 mmol, 0.1 eq) were added to a dry pressure tube, which was taken into a glove box and acetic acid (20 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC26 as a white solid 65 mg in 33% yield.

Example 27

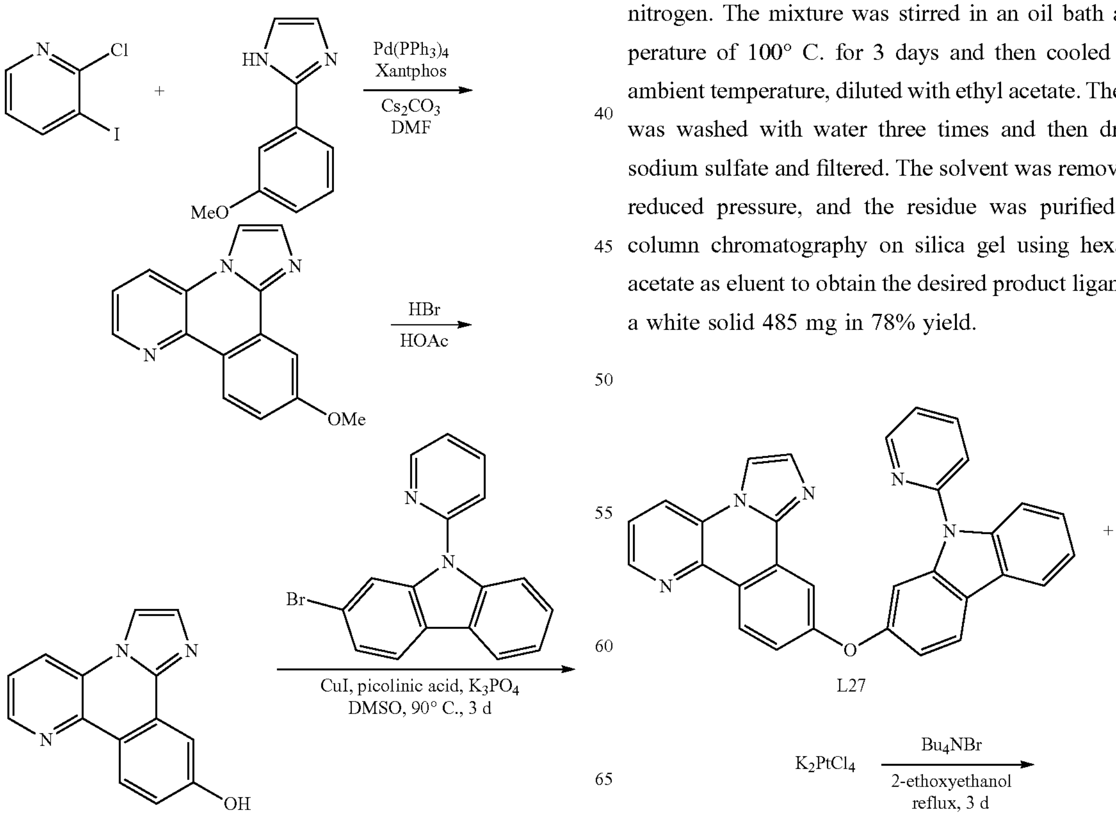

-continued

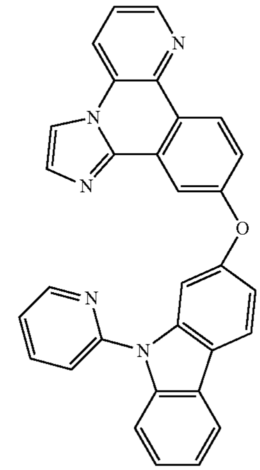

L27

Benzo[c]imidazo[1,2-a][1,5]naphthyridin-11-ol (305 mg, 1.30 mmol, 1.0 eq), 2-bromo-9-(pyridin-2-yl)-9H-carbazole (494 mg, 1.56 mmol, 1.2 eq), CuI (50 mg, 0.26 mmol, 0.2 eq), picolinic acid (32 mg, 0.26 mmol, 0.2 eq) and $K_3PO_4$ (552 mg, 2.6 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L27 as a white solid 485 mg in 78% yield.

-continued

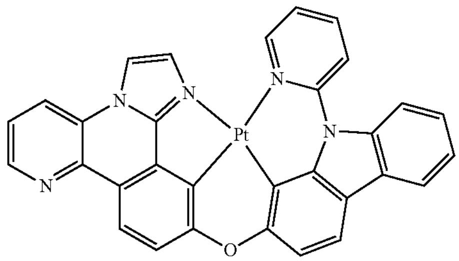

MC27

Figure 4:
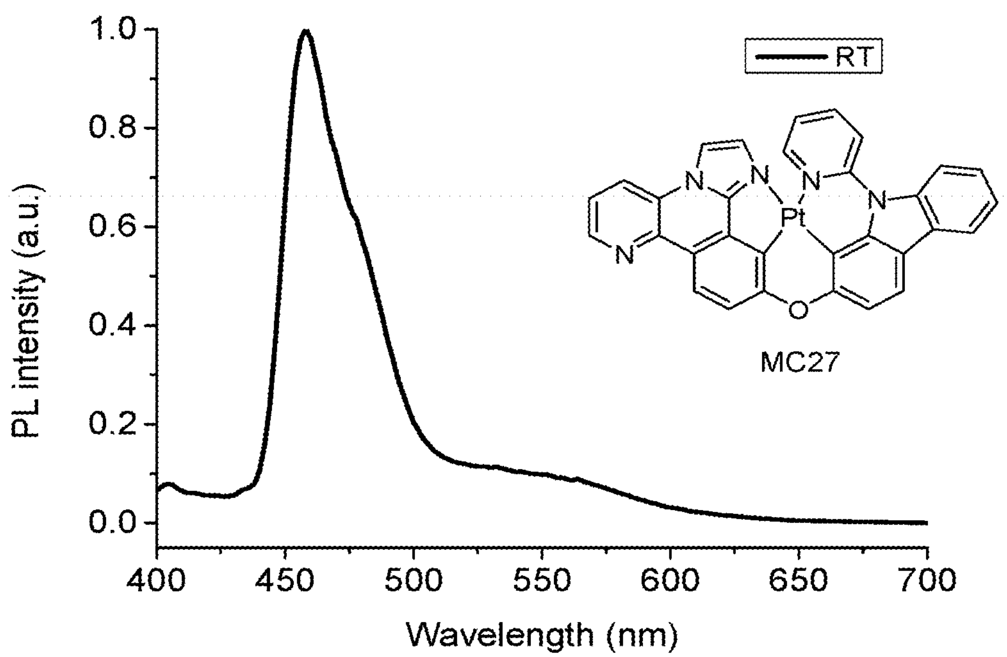
FIG. 4 is an emission spectrum of the metal-assisted delayed fluorescent emitter of Example 27 in methylene chloride at room temperature.

L27 (485 mg, 1.02 mmol, 1.0 eq), $K_2PtCl_4$ (443 mg, 1.07 mmol, 1.05 eq) and n-$Bu_4NBr$ (33 mg, 0.102 mmol, 0.1 eq) were added to a dry pressure tube, which was taken into a glove box and acetic acid (60 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC27 as a white solid 268 mg in 40% yield. FIG. 4 shows an emission spectrum of MC27 in methylene chloride at room temperature.

Example 28

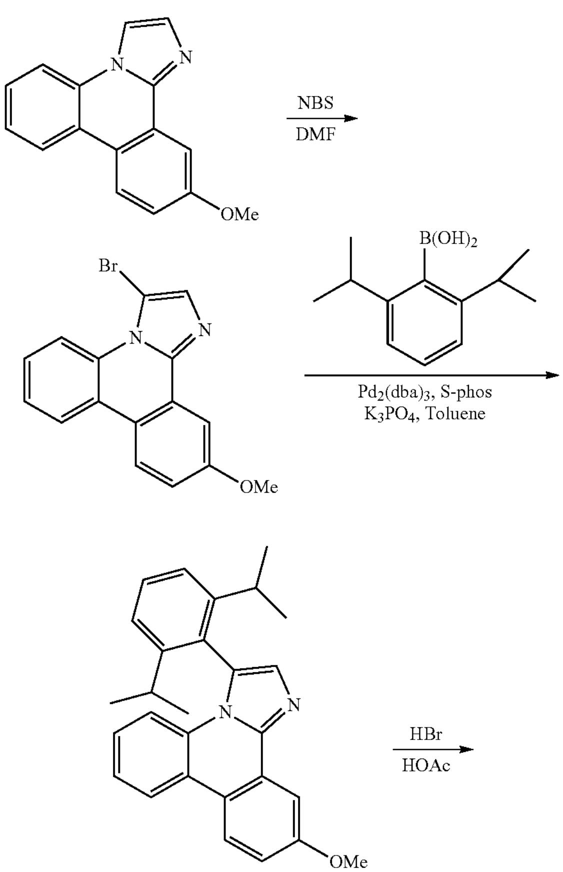

-continued

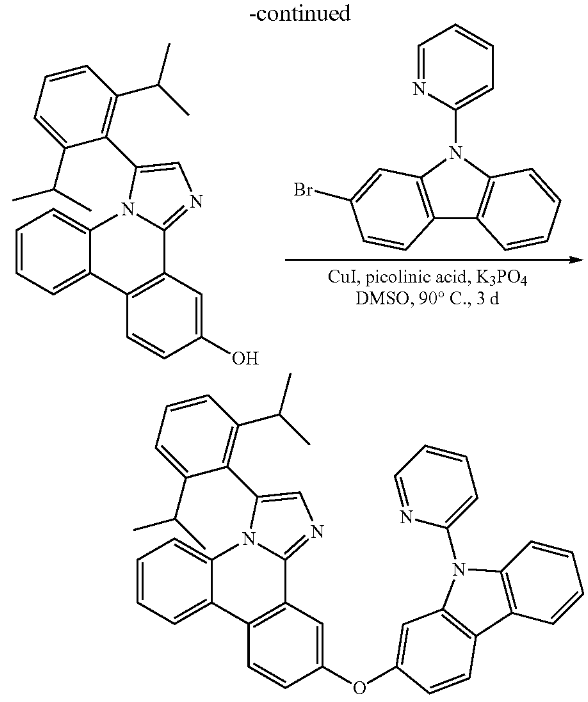

L28

3-(2,6-diisopropylphenyl)imidazo[1,2-f]phenanthridin-11-ol (0.85 mmol, 1.0 eq), 2-bromo-9-(pyridin-2-yl)-9H-carbazole (359 mg, 1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L28 in 50%~80% yield.

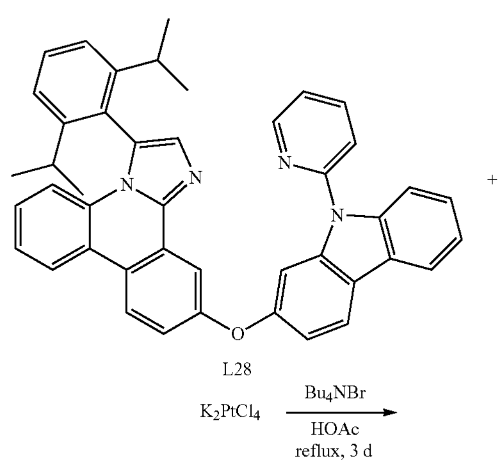

-continued

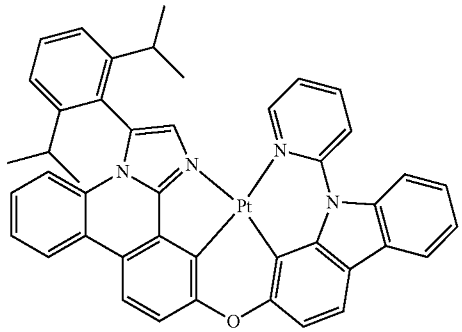

MC28

L28 (1.02 mmol, 1.0 eq), $K_2PtCl_4$ (443 mg, 1.07 mmol, 1.05 eq) and n-$Bu_4NBr$ (33 mg, 0.102 mmol, 0.1 eq) were added to a dry pressure tube, which was taken into a glove box and acetic acid (60 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC28 in 10%-50% yield.

Example 29

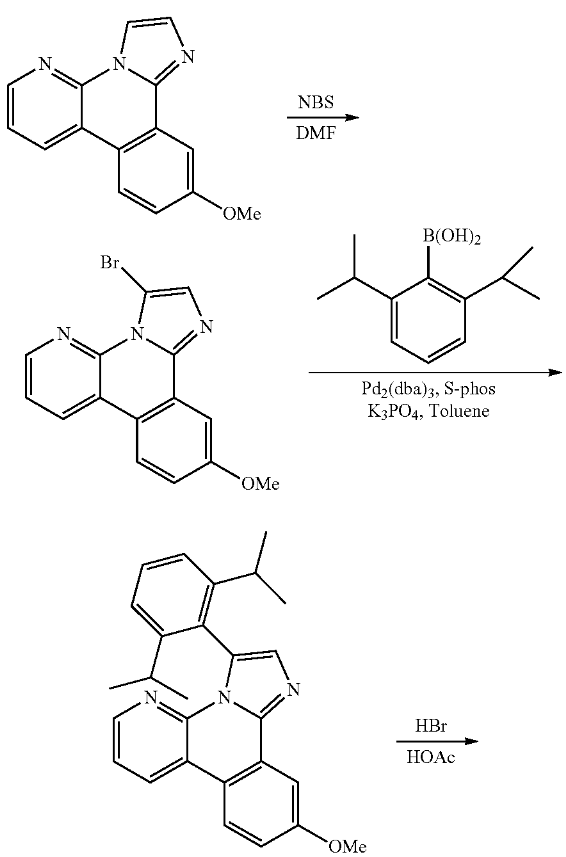

-continued

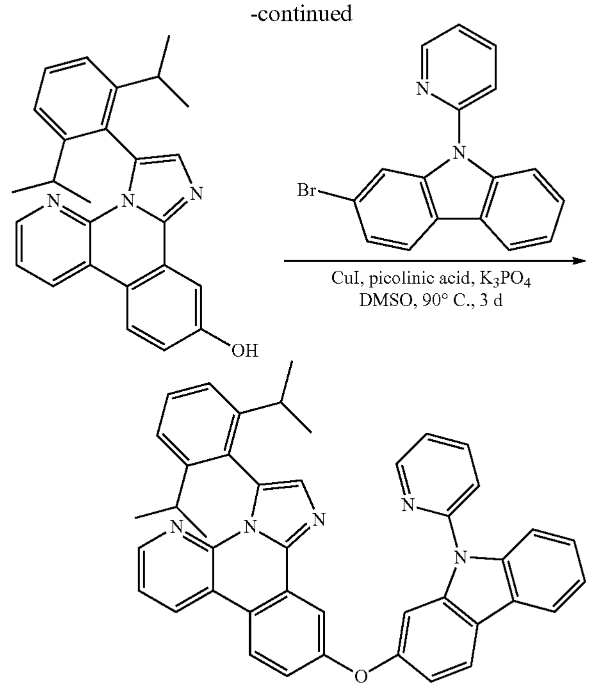

L29

3-(2,6-diisopropylphenyl)benzo[c]imidazo[1,2-a][1,8]naphthyridin-11-ol (0.85 mmol, 1.0 eq), 2-bromo-9-(pyridin-2-yl)-9H-carbazole (359 mg, 1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L29 in 50%~80% yield.

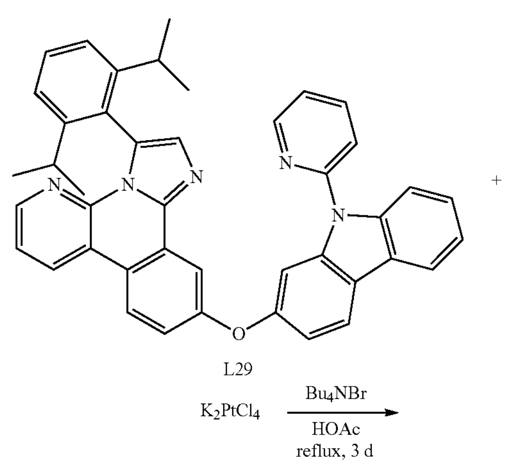

-continued

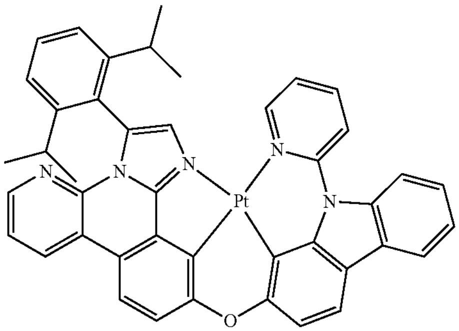

MC29

L29 (1.02 mmol, 1.0 eq), $K_2PtCl_4$ (443 mg, 1.07 mmol, 1.05 eq) and n-$Bu_4NBr$ (33 mg, 0.102 mmol, 0.1 eq) were added to a dry pressure tube, which was taken into a glove box and acetic acid (60 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC29 in 10%-50% yield.

Example 30

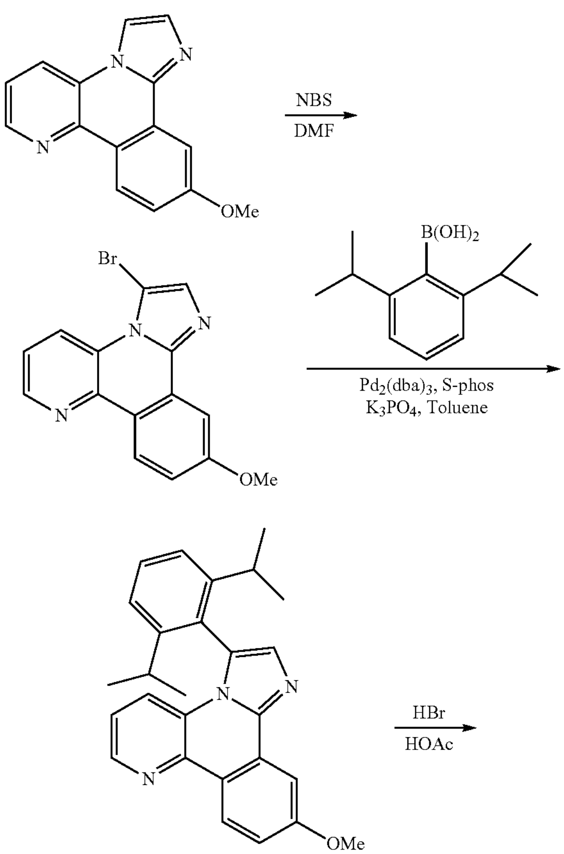

-continued

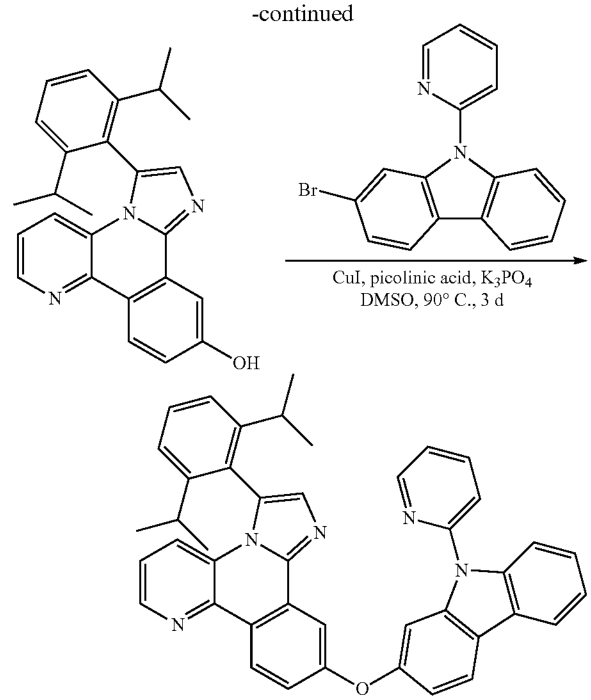

L30

3-(2,6-diisopropylphenyl)benzo[c]imidazo[1,2-a][1,5]naphthyridin-11-ol (0.85 mmol, 1.0 eq), 2-bromo-9-(pyridin-2-yl)-9H-carbazole (359 mg, 1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L30 in 50%~80% yield.

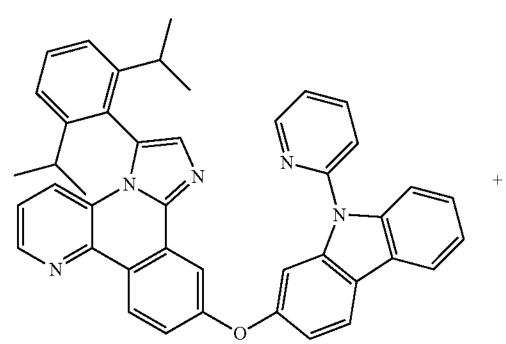

L30

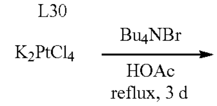

-continued

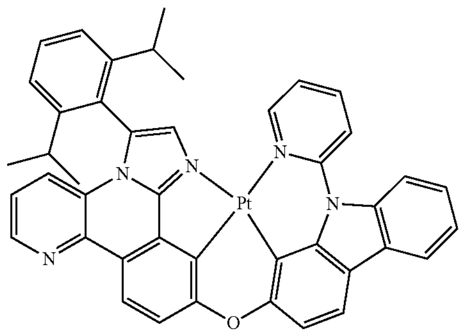

MC30

L30 (1.02 mmol, 1.0 eq), $K_2PtCl_4$ (443 mg, 1.07 mmol, 1.05 eq) and n-$Bu_4NBr$ (33 mg, 0.102 mmol, 0.1 eq) were added to a dry pressure tube, which was taken into a glove box and acetic acid (60 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC30 in 10%-50% yield.

Example 31

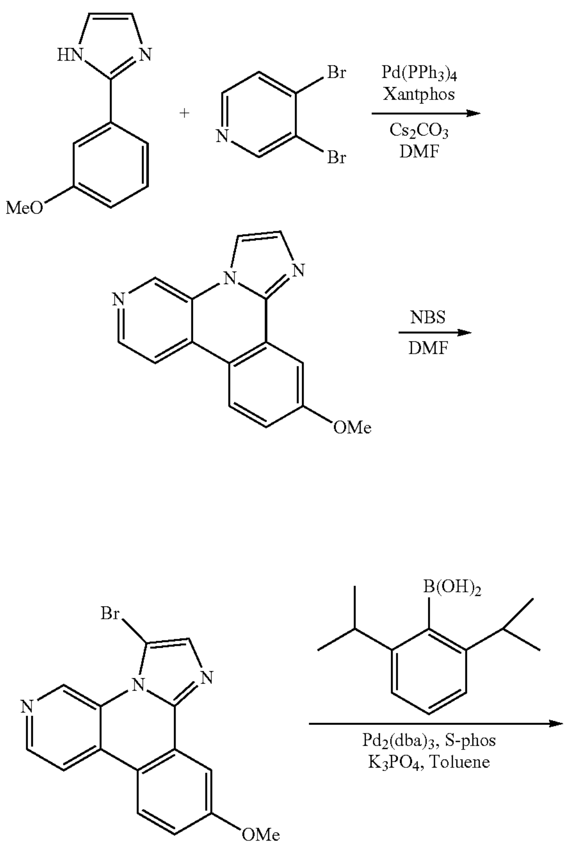

-continued

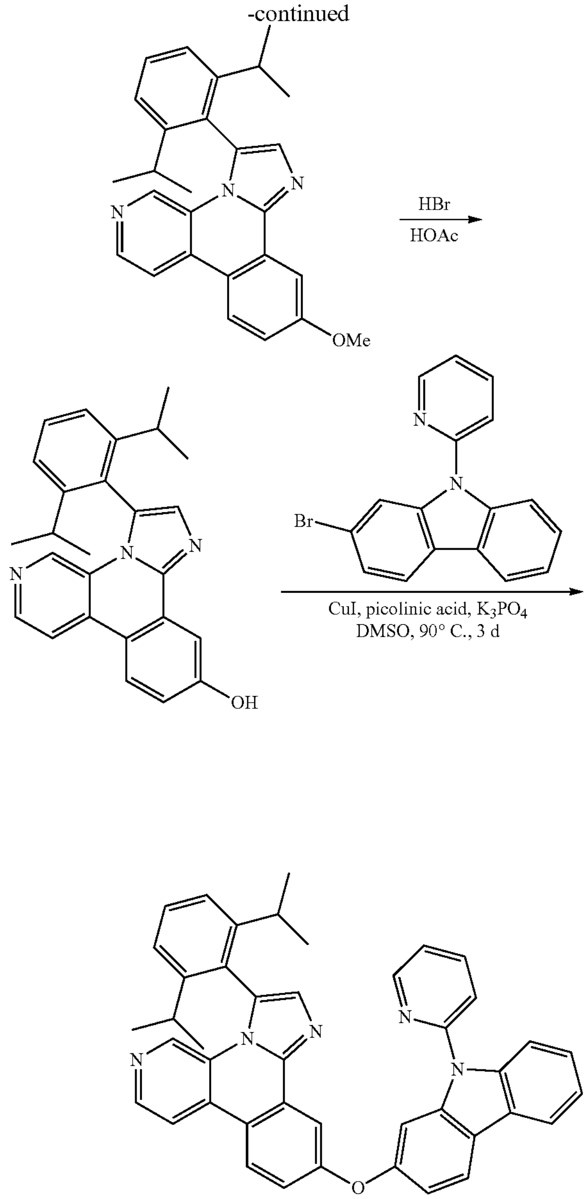

L31

3-(2,6-diisopropylphenyl)benzo[c]imidazo[1,2-a][1,7]naphthyridin-11-ol (0.85 mmol, 1.0 eq), 2-bromo-9-(pyridin-2-yl)-9H-carbazole (359 mg, 1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L31 in 50%~80% yield.

-continued

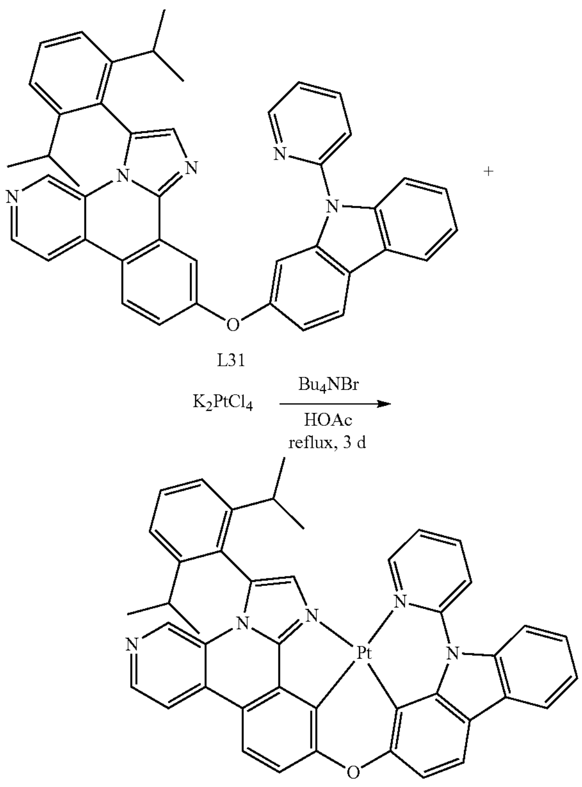

MC31

L31 (1.02 mmol, 1.0 eq), $K_2PtCl_4$ (443 mg, 1.07 mmol, 1.05 eq) and n-$Bu_4NBr$ (33 mg, 0.102 mmol, 0.1 eq) were added to a dry pressure tube, which was taken into a glove box and acetic acid (60 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC31 in 10%-50% yield.

Example 32

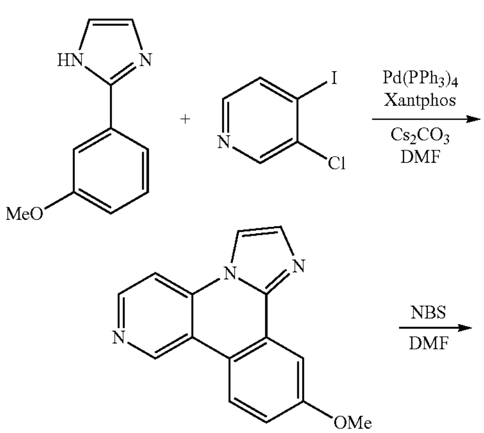

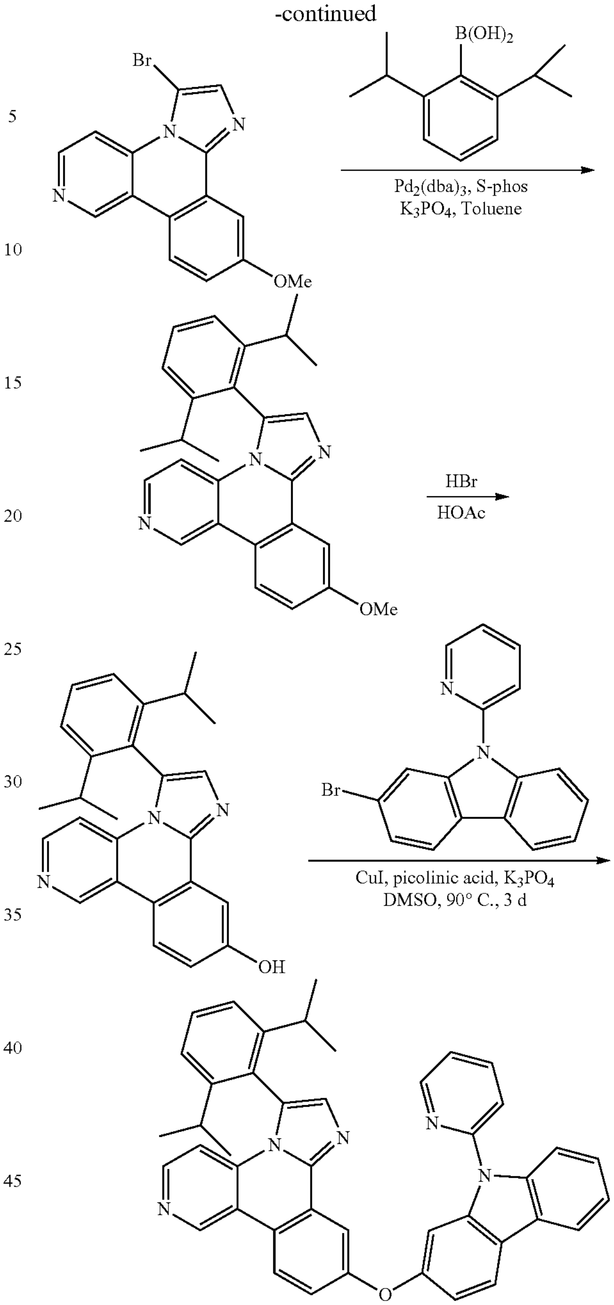

L32

3-(2,6-diisopropylphenyl)benzo[c]imidazo[1,2-a][1,6]naphthyridin-11-ol (0.85 mmol, 1.0 eq), 2-bromo-9-(pyridin-2-yl)-9H-carbazole (359 mg, 1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L32 in 50%~80% yield.

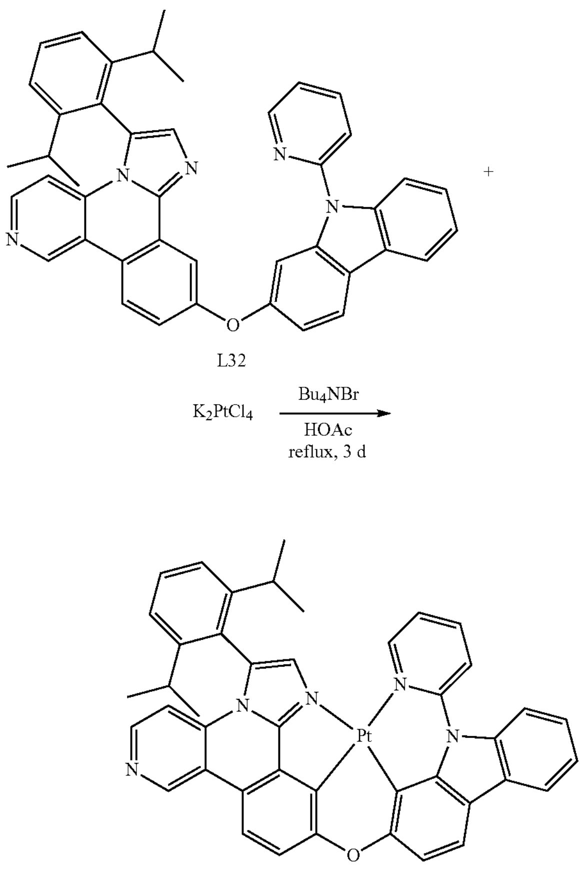

L32

MC32

L32 (1.02 mmol, 1.0 eq), $K_2PtCl_4$ (443 mg, 1.07 mmol, 1.05 eq) and n-$Bu_4NBr$ (33 mg, 0.102 mmol, 0.1 eq) were added to a dry pressure tube, which was taken into a glove box and acetic acid (60 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC32 in 10%-50% yield.

Example 33

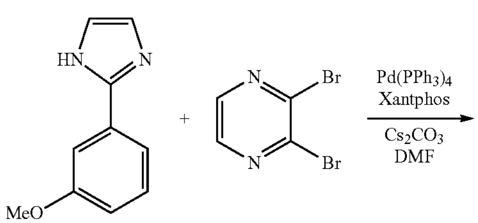

-continued

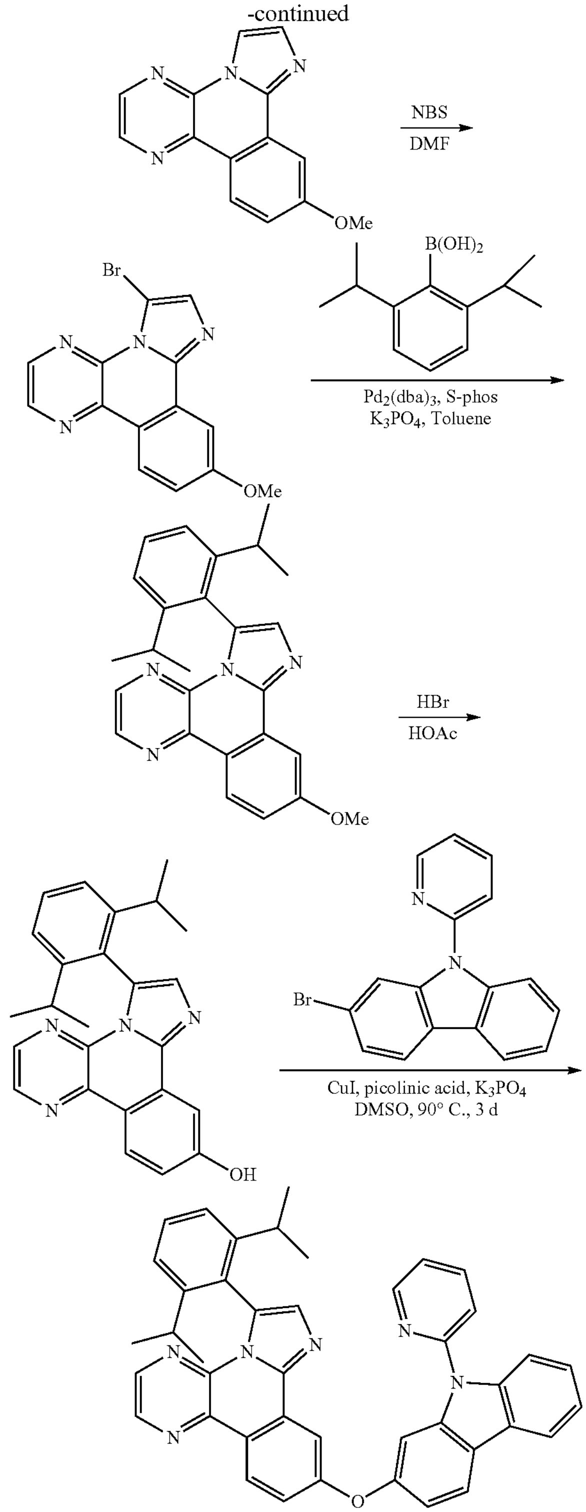

L33

3-(2,6-diisopropylphenyl)imidazo[2,1-a]pyrazino[2,3-c]isoquinolin-11-ol (0.85 mmol, 1.0 eq), 2-bromo-9-(pyridin-2-yl)-9H-carbazole (359 mg, 1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L33 in 50%~80% yield.

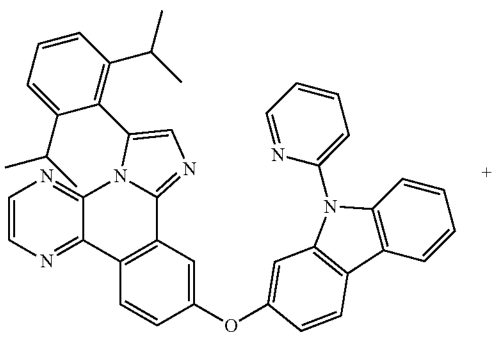

L33

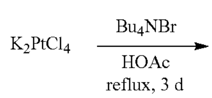

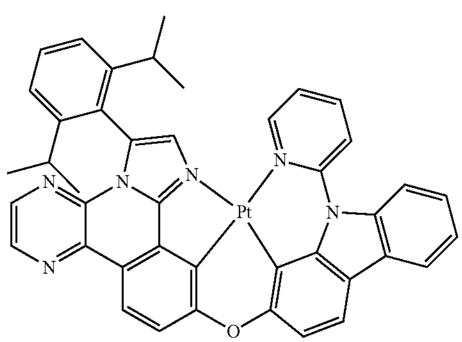

MC33

L33 (1.02 mmol, 1.0 eq), $K_2PtCl_4$ (443 mg, 1.07 mmol, 1.05 eq) and n-$Bu_4NBr$ (33 mg, 0.102 mmol, 0.1 eq) were added to a dry pressure tube, which was taken into a glove box and acetic acid (60 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC33 in 10%-50% yield.

Example 34

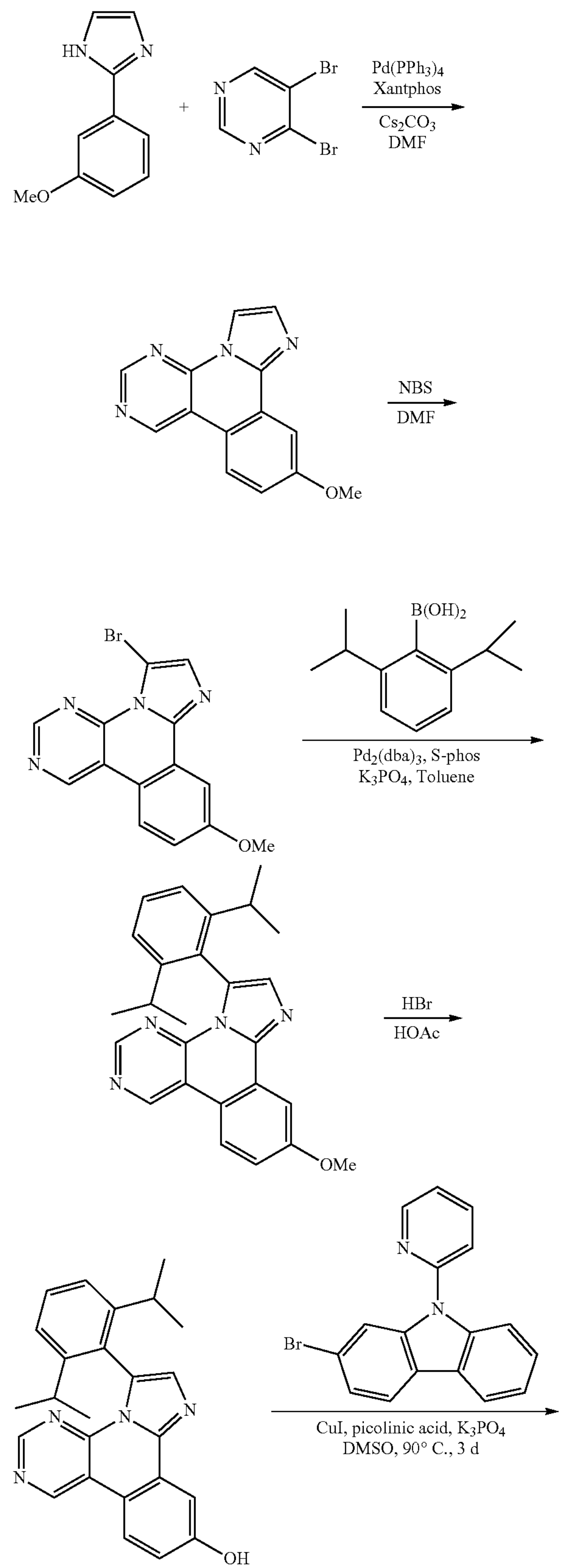

-continued

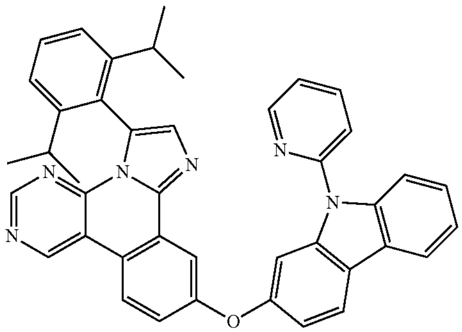

L34

-continued

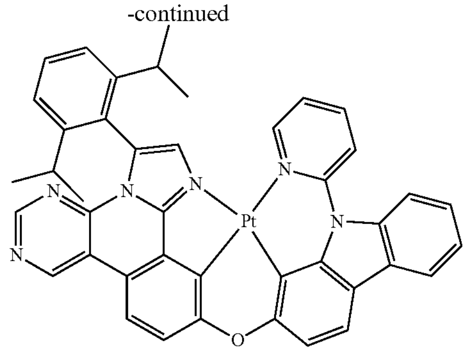

MC34

11-(2,6-diisopropylphenyl)imidazo[2,1-a]pyrimido[4,5-c]isoquinolin-7-ol (0.85 mmol, 1.0 eq), 2-bromo-9-(pyridin-2-yl)-9H-carbazole (359 mg, 1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L34 in 50%~80% yield.

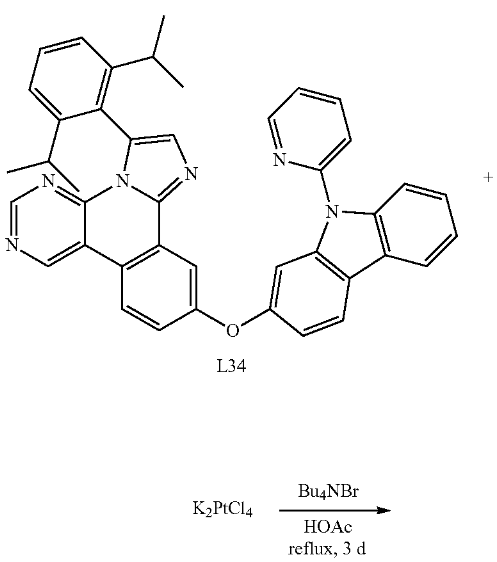

L34

L34 (1.02 mmol, 1.0 eq), $K_2PtCl_4$ (443 mg, 1.07 mmol, 1.05 eq) and n-$Bu_4NBr$ (33 mg, 0.102 mmol, 0.1 eq) were added to a dry pressure tube, which was taken into a glove box and acetic acid (60 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC34 in 10%-50% yield.

Example 35

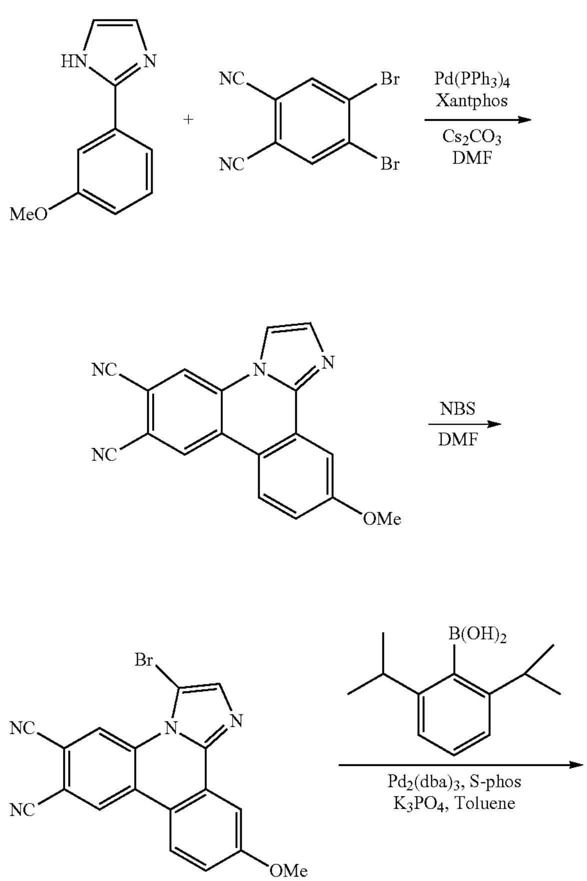

-continued

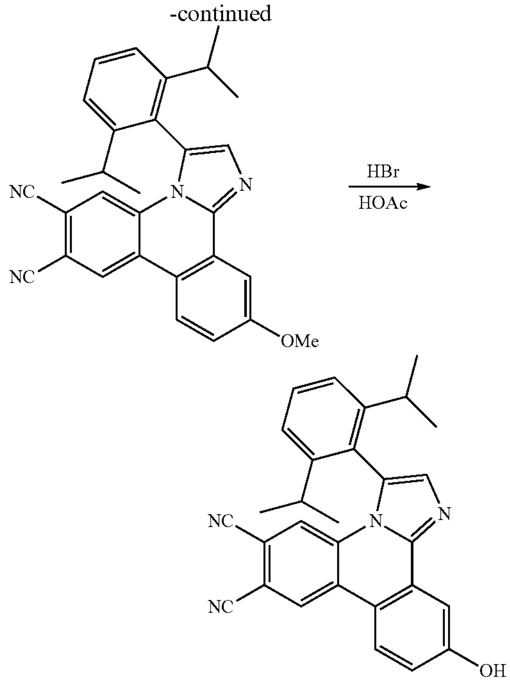

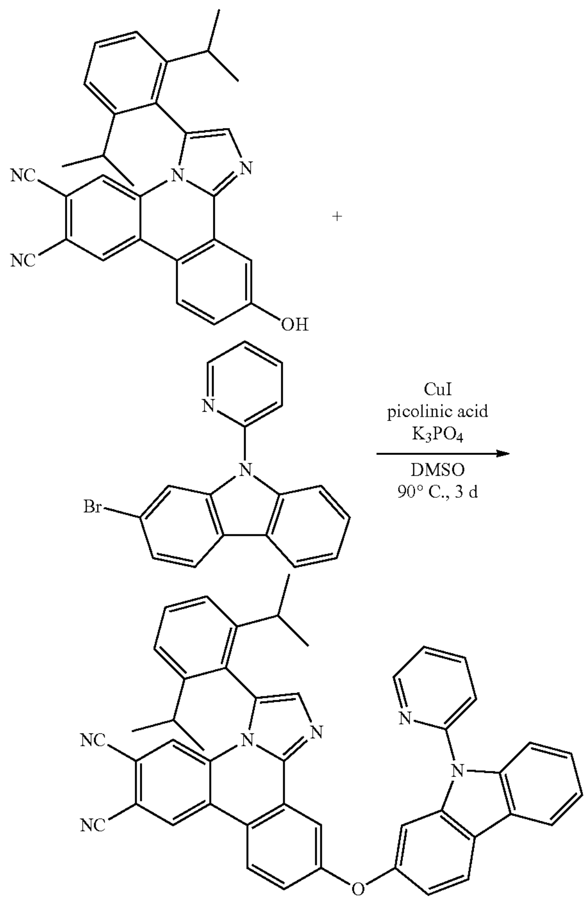

L35

3-(2,6-diisopropylphenyl)-11-hydroxyimidazo[1,2-f]phenanthridine-6,7-dicarbonitrile (0.85 mmol, 1.0 eq), 2-bromo-9-(pyridin-2-yl)-9H-carbazole (359 mg, 1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L35 in 50%~80% yield.

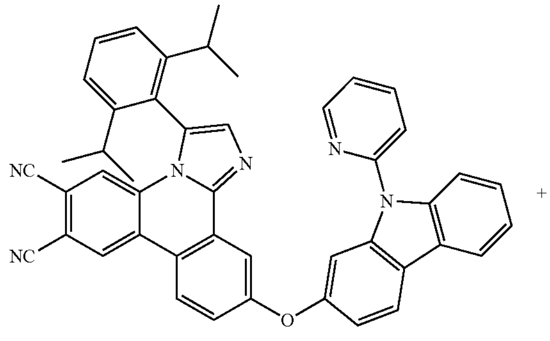

L35

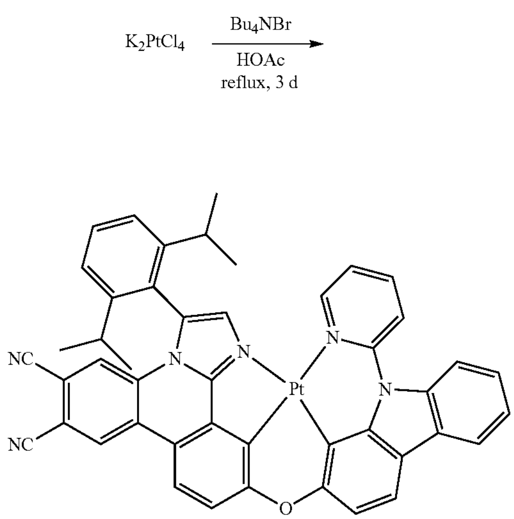

MC35

L35 (1.02 mmol, 1.0 eq), $K_2PtCl_4$ (443 mg, 1.07 mmol, 1.05 eq) and n-$Bu_4NBr$ (33 mg, 0.102 mmol, 0.1 eq) were added to a dry pressure tube, which was taken into a glove box and acetic acid (60 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC35 in 10%-50% yield.

Example 36

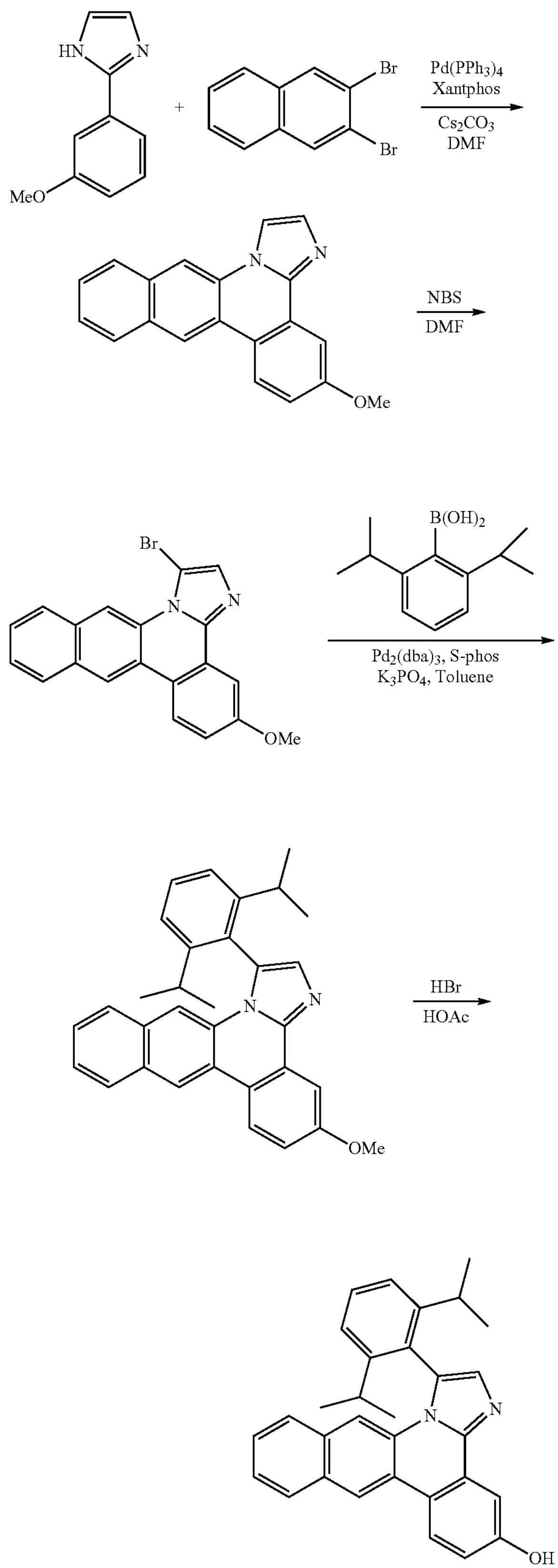

-continued

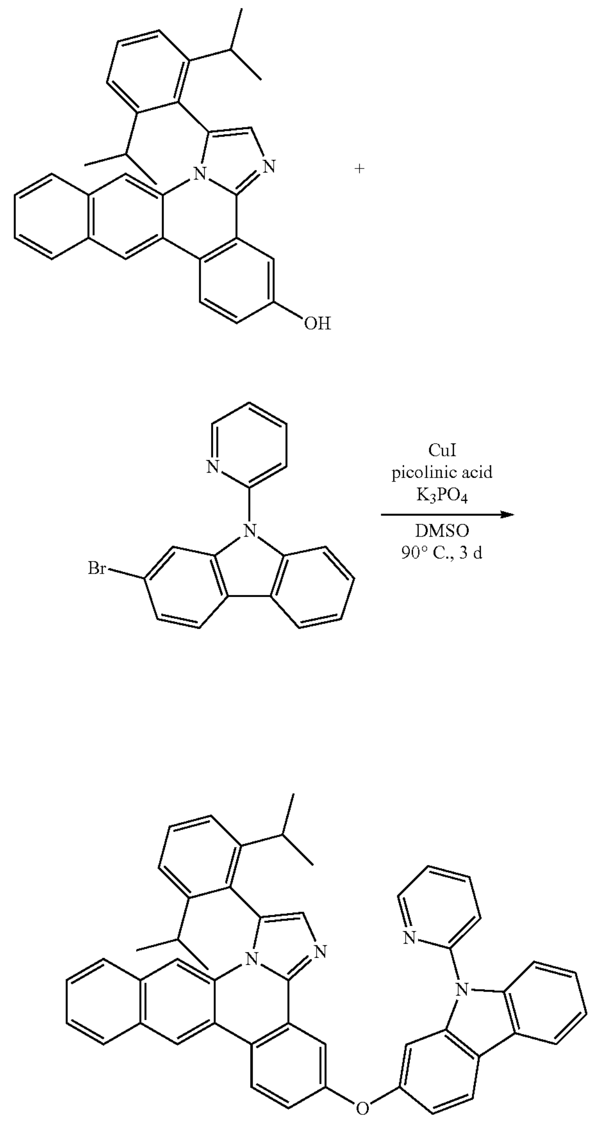

L36

1-(2,6-diisopropylphenyl)benzo[b]imidazo[1,2-f]phenanthridin-5-ol (0.85 mmol, 1.0 eq), 2-bromo-9-(pyridin-2-yl)-9H-carbazole (359 mg, 1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L36 in 50%~80% yield.

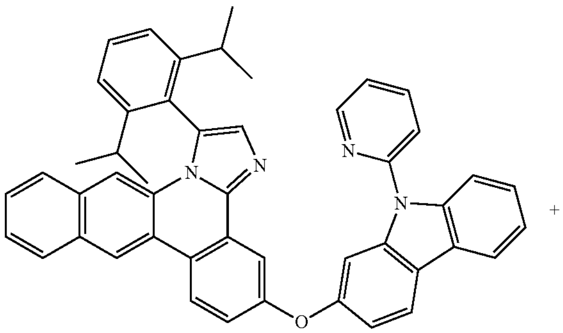

L36

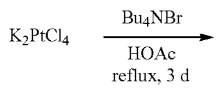

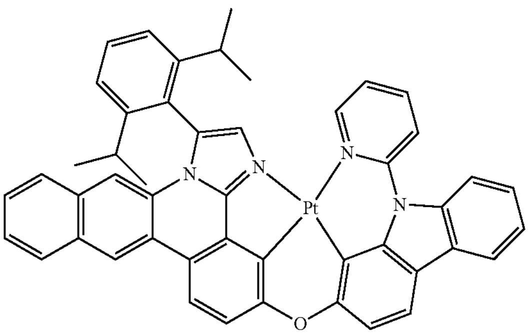

MC36

L36 (1.02 mmol, 1.0 eq), $K_2PtCl_4$ (443 mg, 1.07 mmol, 1.05 eq) and n-$Bu_4NBr$ (33 mg, 0.102 mmol, 0.1 eq) were added to a dry pressure tube, which was taken into a glove box and acetic acid (60 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC36 in 10%-50% yield.

Example 37

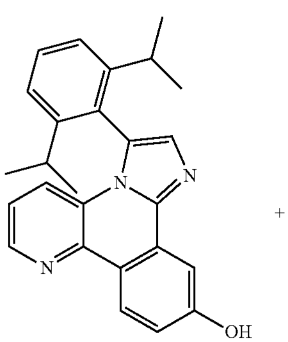

-continued

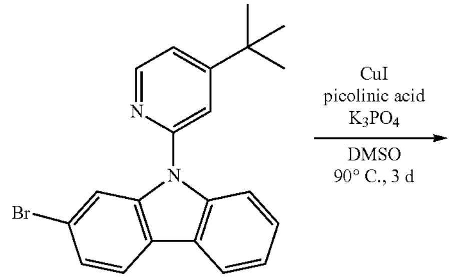

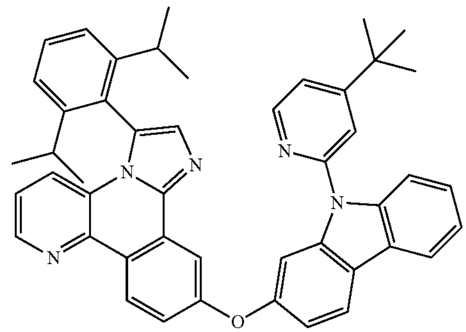

L37

3-(2,6-diisopropylphenyl)benzo[c]imidazo[1,2-a][1,5]naphthyridin-11-ol (0.85 mmol, 1.0 eq), 2-bromo-9-(4-(tert-butyl)pyridin-2-yl)-9H-carbazole (417 mg, 1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L37 in 50%~80% yield.

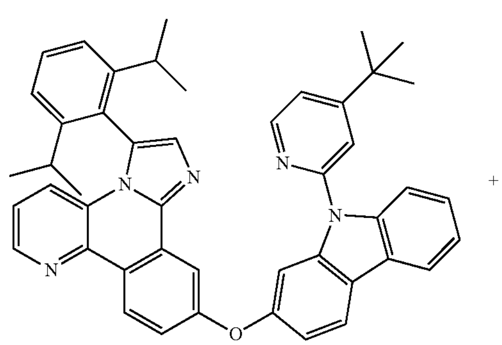

L37

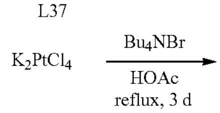

-continued

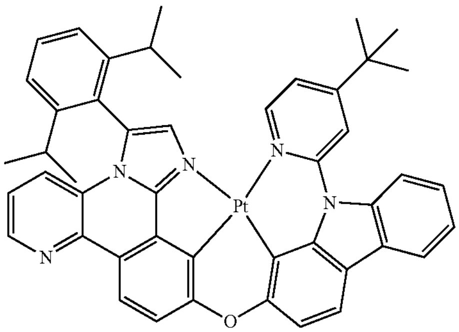

MC37

-continued

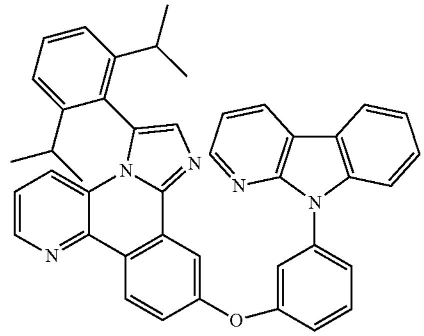

L38

L37 (1.02 mmol, 1.0 eq), $K_2PtCl_4$ (443 mg, 1.07 mmol, 1.05 eq) and n-$Bu_4NBr$ (33 mg, 0.102 mmol, 0.1 eq) were added to a dry pressure tube, which was taken into a glove box and acetic acid (60 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC37 in 10%-50% yield.

Example 38

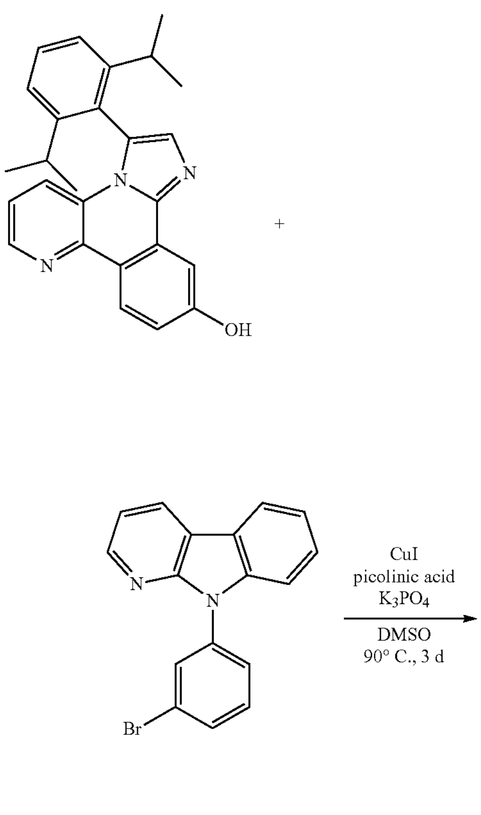

3-(2,6-diisopropylphenyl)benzo[c]imidazo[1,2-a][1,5]naphthyridin-11-ol (0.85 mmol, 1.0 eq), 9-(3-bromophenyl)-9H-pyrido[2,3-b]indole (359 mg, 1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L38 in 50%~80% yield.

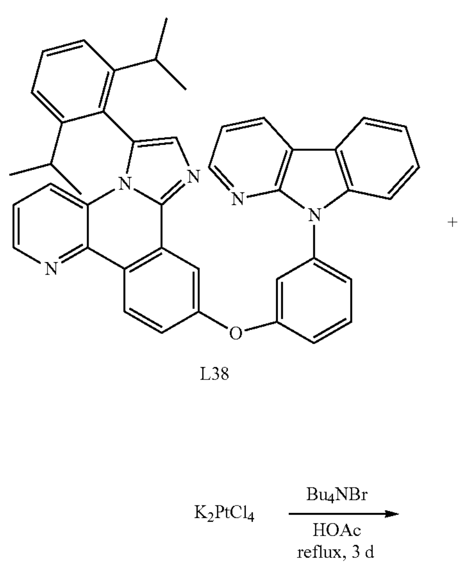

-continued

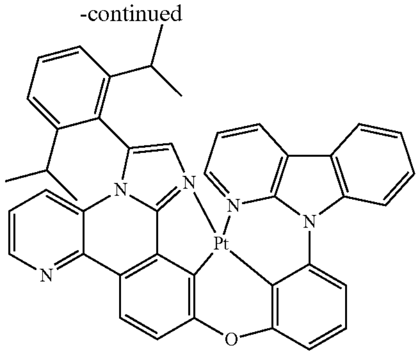

MC38

L38 (1.02 mmol, 1.0 eq), $K_2PtCl_4$ (443 mg, 1.07 mmol, 1.05 eq) and n-$Bu_4NBr$ (33 mg, 0.102 mmol, 0.1 eq) were added to a dry pressure tube, which was taken into a glove box and acetic acid (60 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC38 in 10%-50% yield.

Example 39

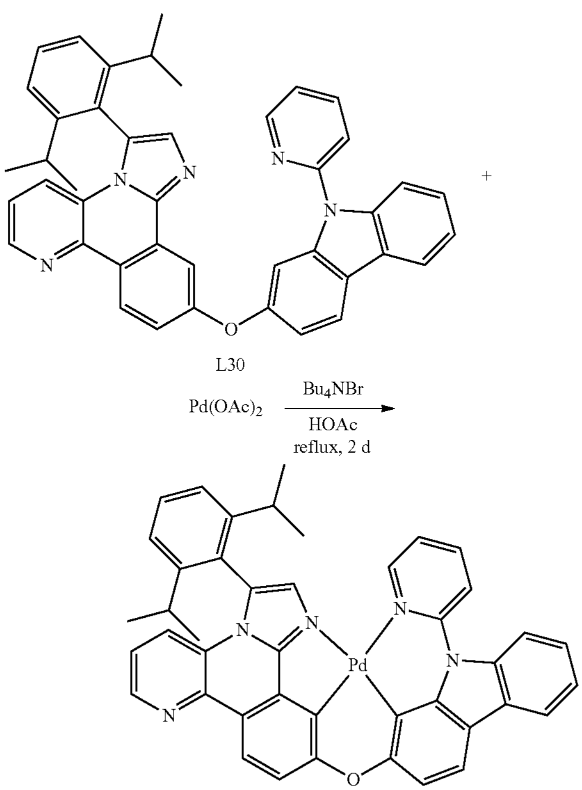

L30 (1.02 mmol, 1.0 eq), $Pd(OAc)_2$ (239 mg, 1.07 mmol, 1.05 eq) and n-$Bu_4NBr$ (33 mg, 0.102 mmol, 0.1 eq) were added to a dry pressure tube, which was taken into a glove box and acetic acid (60 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product MC39 in 10%-50% yield.

Example 40

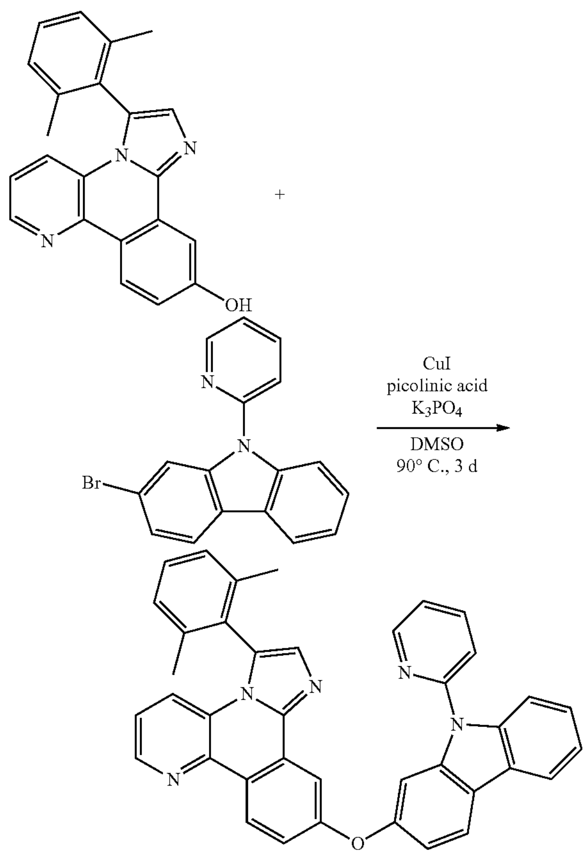

L40

3-(2,6-dimethylphenyl)benzo[c]imidazo[1,2-a][1,5]naphthyridin-11-ol (0.85 mmol, 1.0 eq), 2-bromo-9-(pyridin-2-yl)-9H-carbazole (359 mg, 1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L40 in 50%~80% yield.

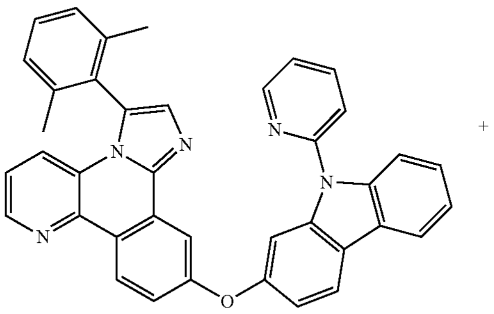

L40

$K_2PtCl_4$ $\xrightarrow[\text{HOAc, reflux, 3 d}]{Bu_4NBr}$

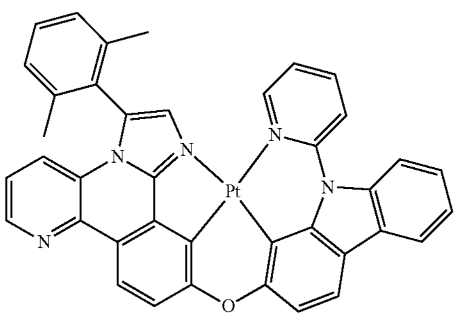

MC40

L40 (1.02 mmol, 1.0 eq), $K_2PtCl_4$ (443 mg, 1.07 mmol, 1.05 eq) and n-$Bu_4NBr$ (33 mg, 0.102 mmol, 0.1 eq) were added to a dry pressure tube, which was taken into a glove box and acetic acid (60 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC40 in 10%-50% yield.

Example 41

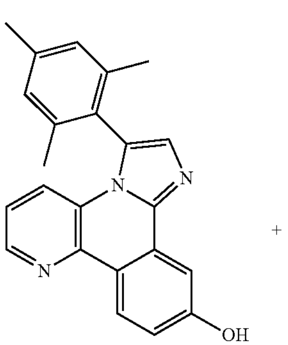

-continued

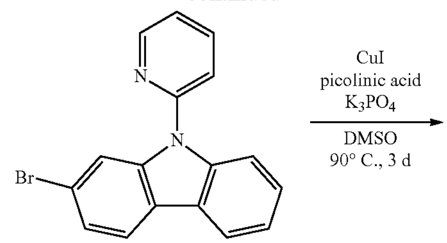

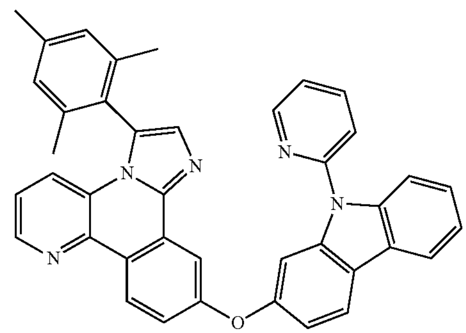

L41

3-mesitylbenzo[c]imidazo[1,2-a][1,5]naphthyridin-11-ol (300 mg, 0.85 mmol, 1.0 eq), 2-bromo-9-(pyridin-2-yl)-9H-carbazole (359 mg, 1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L41 in 75% yield.

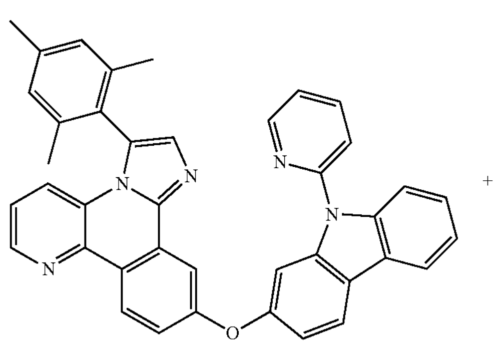

L41

$K_2PtCl_4$ $\xrightarrow[\text{HOAc, reflux, 3 d}]{Bu_4NBr}$

-continued

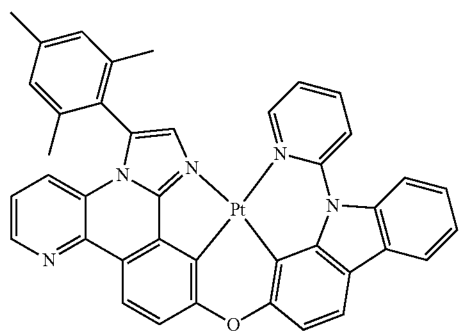

MC41

L41 (238 mg, 0.4 mmol, 1.0 eq), $K_2PtCl_4$ (174 mg, 0.42 mmol, 1.05 eq) and n-$Bu_4NBr$ (13 mg, 0.04 mmol, 0.1 eq) were added to a dry pressure tube, which was taken into a glove box and acetic acid (60 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC41 in 72% yield.

Example 42

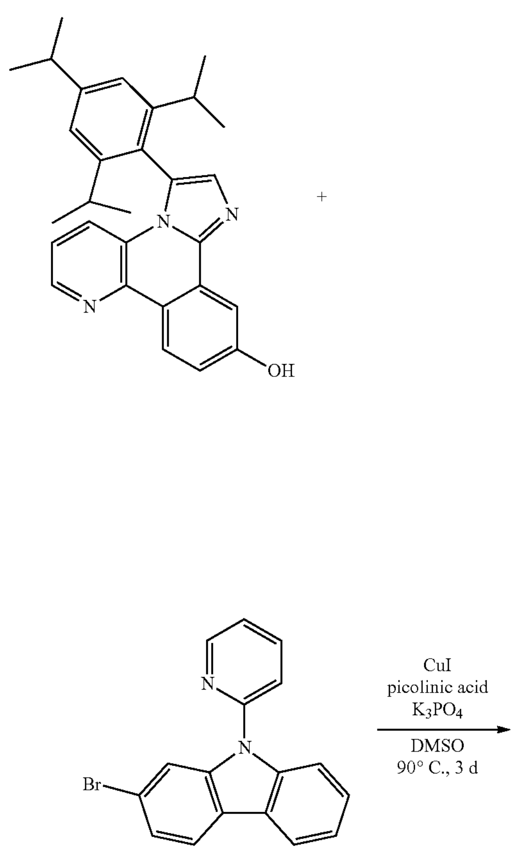

-continued

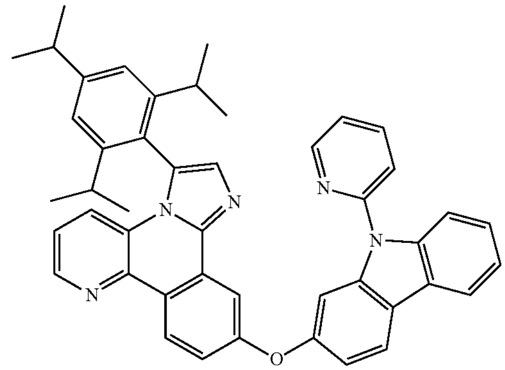

L42

3-(2,4,6-triisopropylphenyl)benzo[c]imidazo[1,2-a][1,5]naphthyridin-11-ol (0.85 mmol, 1.0 eq), 2-bromo-9-(pyridin-2-yl)-9H-carbazole (359 mg, 1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L42 in 50%~80% yield.

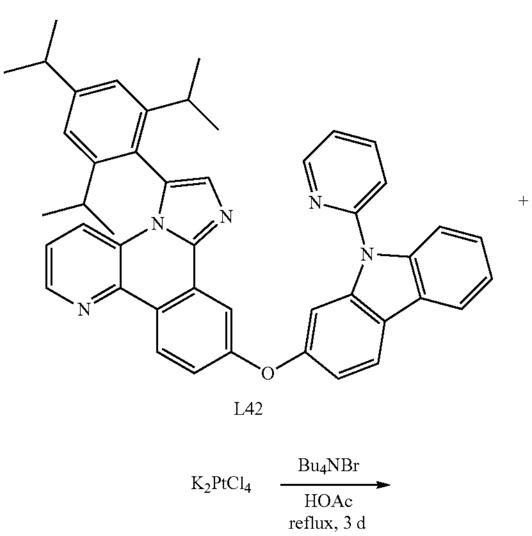

L42

-continued

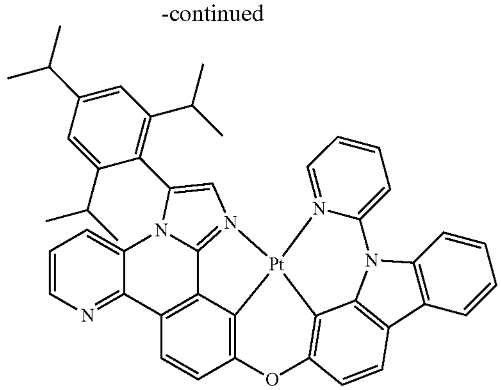

MC42

L42 (1.02 mmol, 1.0 eq), $K_2PtCl_4$ (443 mg, 1.07 mmol, 1.05 eq) and n-$Bu_4NBr$ (33 mg, 0.102 mmol, 0.1 eq) were added to a dry pressure tube, which was taken into a glove box and acetic acid (60 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC42 in 10%-50% yield.

Example 43

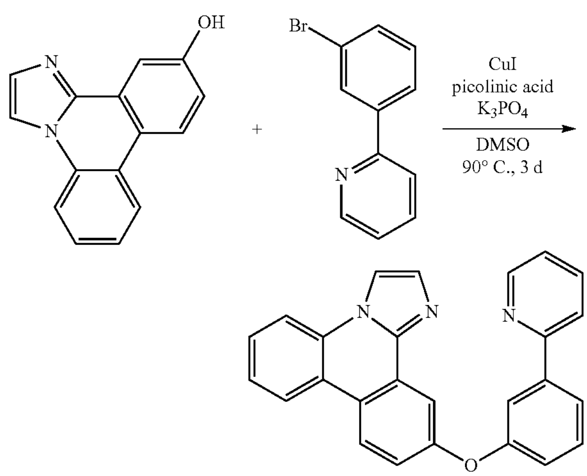

L43

Imidazo[1,2-f]phenanthridin-11-ol (1 mmol, 1.0 eq), 2-(3-bromophenyl)pyridine (281 mg, 1.2 mmol, 1.2 eq), CuI (38 mg, 0.2 mmol, 0.2 eq), picolinic acid (49 mg, 0.4 mmol, 0.4 eq) and $K_3PO_4$ (425 mg, 2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture us stirred in oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate (2:1) as eluent to obtain the desired product ligand L43 as a white solid in 72% yield.

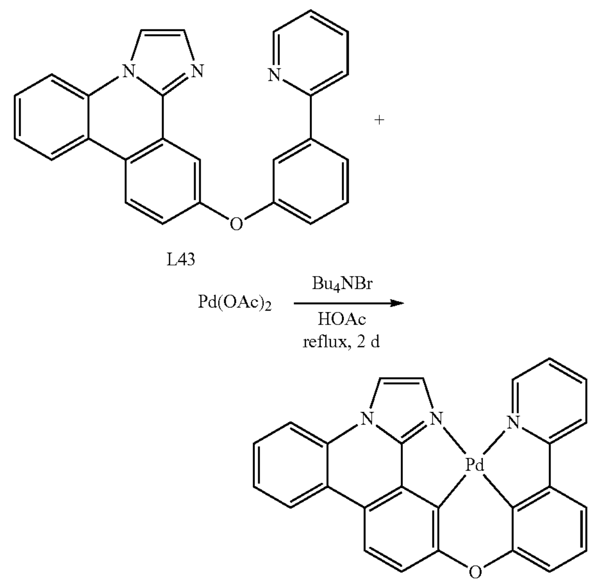

MC43

L43 (0.20 mmol, 1.0 eq), $Pd(OAc)_2$ (54 mg, 0.24 mmol, 1.2 eq) and n-$Bu_4NBr$ (6.5 mg, 0.02 mmol, 0.1 eq) were added to a dry pressure tube was then taken into a glove box and acetic acid (10 mL) was added. The mixture was bubbled with nitrogen for 30 minutes and then the tube was sealed. Then the mixture was heated to reflux in an oil bath and stirred for 2 days, cooled to ambient temperature and removed the solvent. Then the solid was purified through column chromatography on silica gel using dichloromethane as eluent to obtain to obtain the desired product MC43 as a white solid in 53% yield.

Example 44

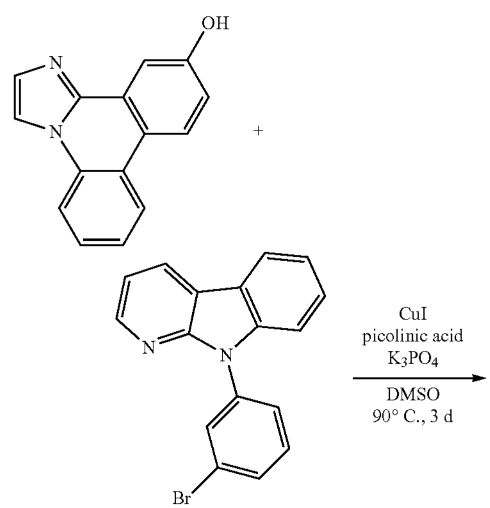

-continued

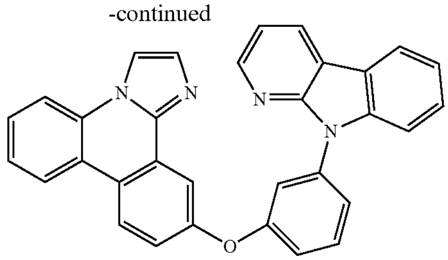

L44

Imidazo[1,2-f]phenanthridin-11-ol (1 mmol, 1.0 eq). 9-(3-bromophenyl)-9H-pyrido[2,3-b]indole (388 mg, 1.2 mmol, 1.2 eq), CuI (38 mg, 0.2 mmol, 0.2 eq), picolinic acid (49 mg, 0.4 mmol, 0.4 eq) and $K_3PO_4$ (425 mg, 2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate (2:1) as eluent to obtain the desired product ligand L44 as a white solid in 66% yield.

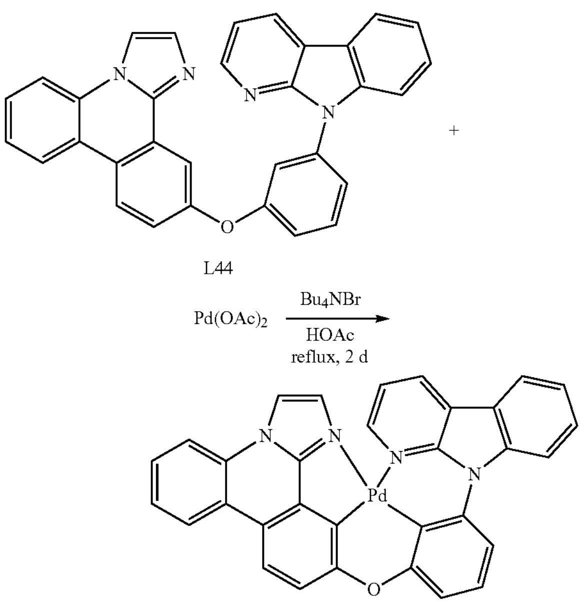

MC44

L44 (0.20 mmol, 1.0 eq), $Pd(OAc)_2$ (54 mg, 0.24 mmol, 1.2 eq) and n-$Bu_4NBr$ (6.5 mg, 0.02 mmol, 0.1 eq) were added to a dry pressure tube was then taken into a glove box and acetic acid (10 mL) was added. The mixture was bubbled with nitrogen for 30 minutes and then the tube was sealed. Then the mixture was heated to reflux in an oil bath and stirred for 2 days, cooled to ambient temperature and removed the solvent. Then the solid was purified through column chromatography on silica gel using dichloromethane as eluent to obtain to obtain the desired product MC44 as a white solid in 45% yield.

Example 45

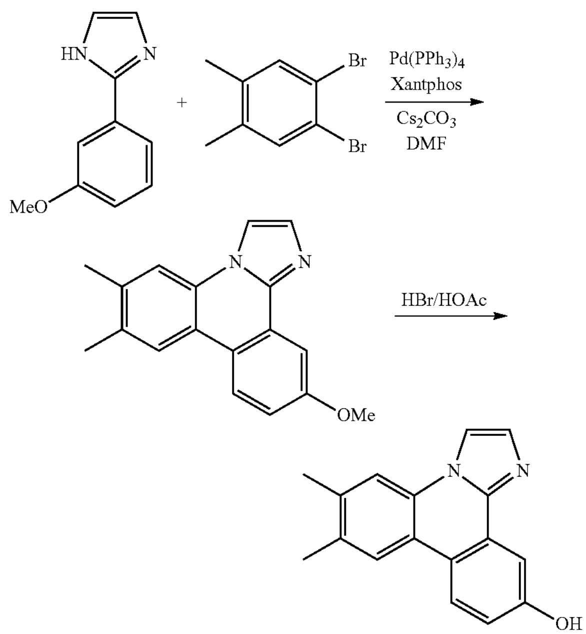

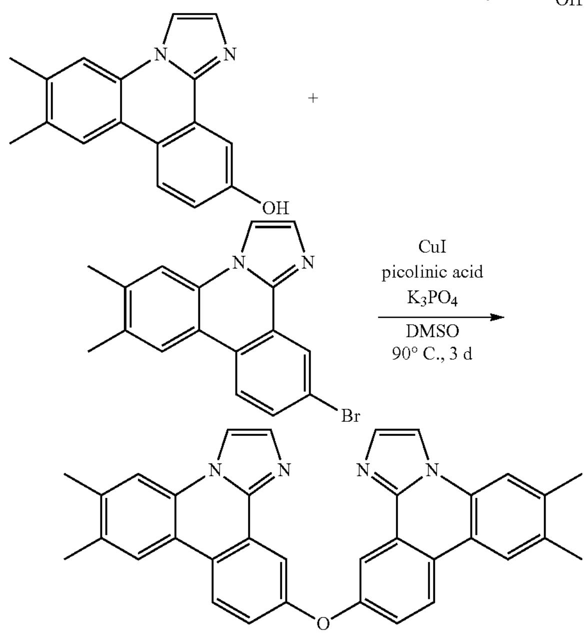

L45

6,7-dimethylimidazo[1,2-f]phenanthridin-11-ol (0.85 mmol, 1.0 eq), 11-bromo-6,7-dimethylimidazo[1,2-f]phenanthridine (1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L45 in 30%~70% yield.

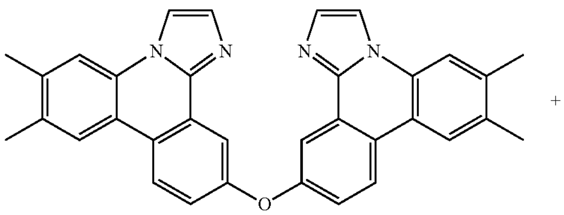

L45

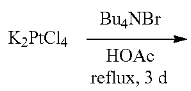

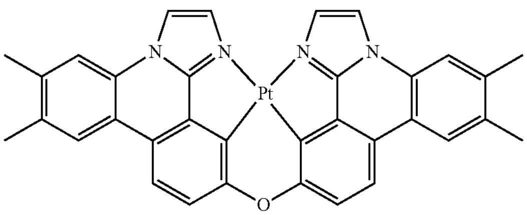

MC45

L45 (0.11 mmol, 1.0 eq), $K_2PtCl_4$ (48 mg, 0.12 mmol, 1.1 eq) and n-$Bu_4NBr$ (3 mg, 0.011 mmol, 0.1 eq) were added to a dry pressure tube, which was taken into a glove box and acetic acid (7 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC45 in 10%~50% yield.

Example 46

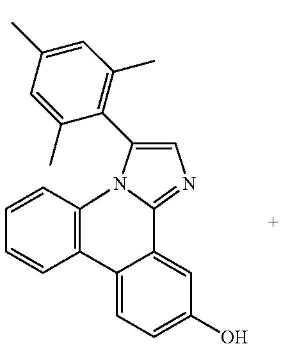

-continued

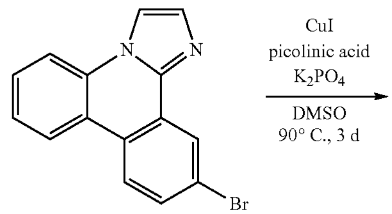

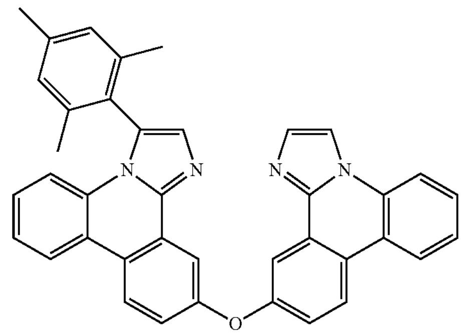

L46

3-mesitylimidazo[1,2-f]phenanthridin-11-ol (270 mg, 0.76 mmol, 1.0 eq), 11-bromoimidazo[1,2-f]phenanthridine (250 mg, 1.10 mmol, 1.3 eq), CuI (29 mg, 0.15 mmol, 0.2 eq), picolinic acid (19 mg, 0.15 mmol, 0.2 eq) and $K_3PO_4$ (323 mg, 1.5 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L46 as a white solid of 300 mg in 70% yield.

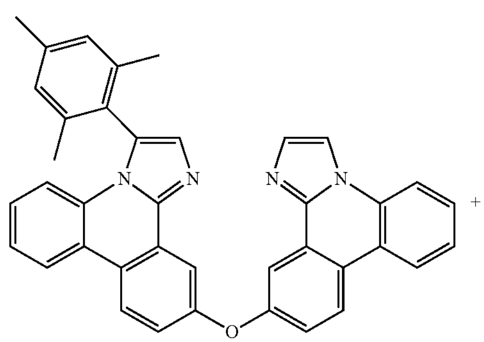

L46

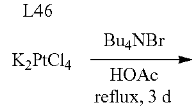

-continued

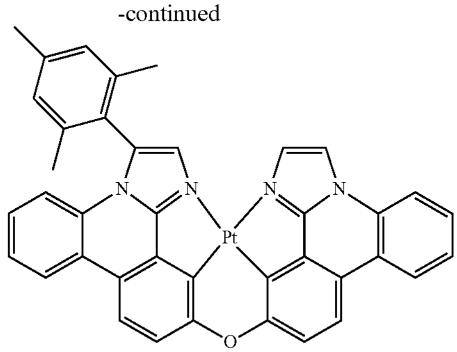

MC46

L46 (220 mg, 0.39 mmol, 1.0 eq), $K_2PtCl_4$ (190 mg, 0.46 mmol, 1.2 eq) and n-$Bu_4NBr$ (13 mg, 0.039 mmol, 0.1 eq) were added to a dry pressure tube, which was taken into a glove box and acetic acid (25 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC46 of 100 mg in 33% yield.

Figure 5A:
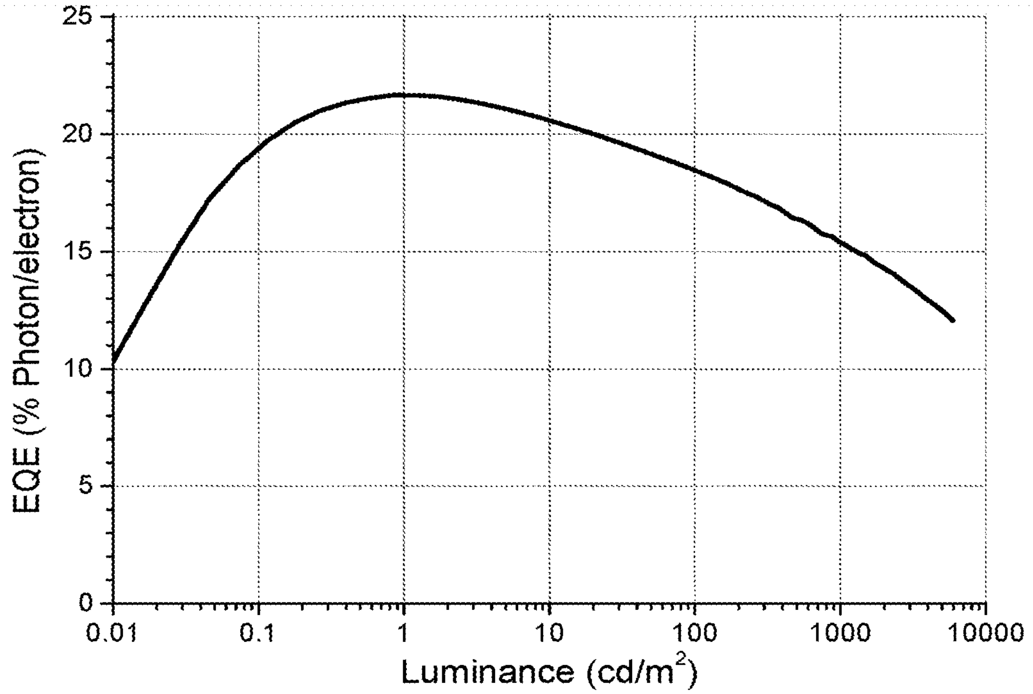
FIGS. 5A-5C show external quantum efficiency (EQE) versus luminance, EQE versus current density, and an electroluminescent spectrum, respectively, for a light-emitting device including the emitter of Example 46.
Figure 5B:
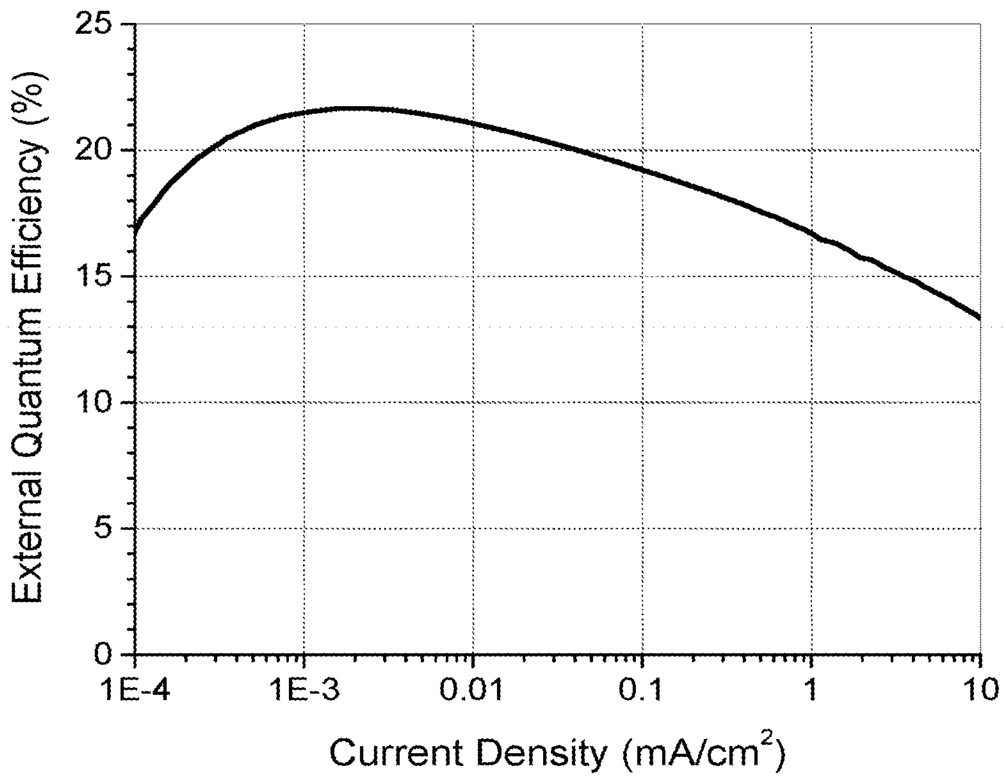
Figure 5C:
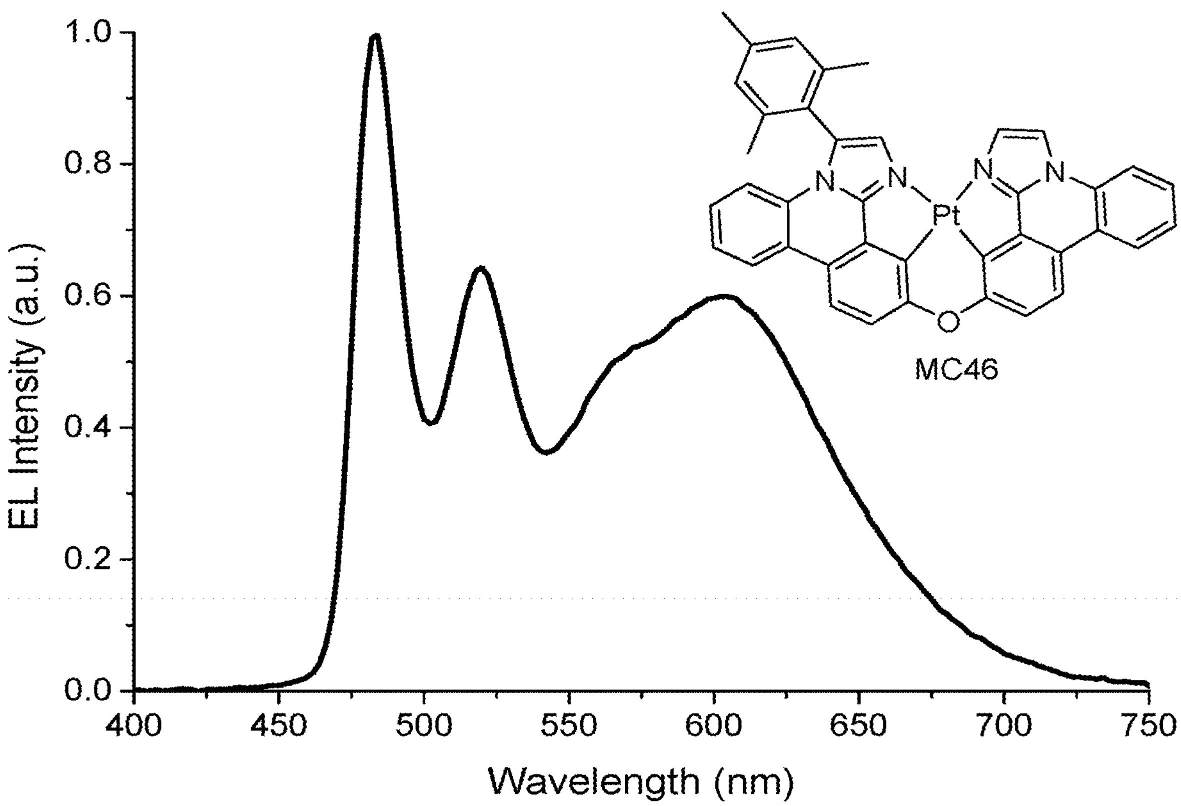
Figure 6A:
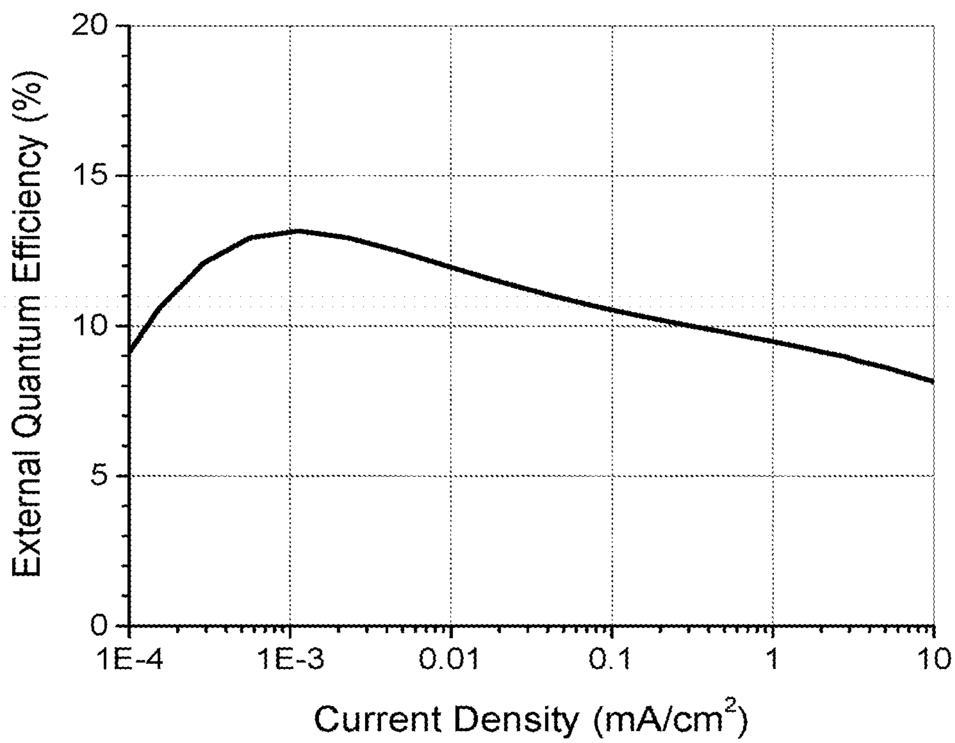
FIGS. 6A-6C show external quantum efficiency (EQE) versus luminance, EQE versus current density, and an electroluminescent spectrum, respectively, for a light-emitting device including the emitter of Example 46.
Figure 6B:
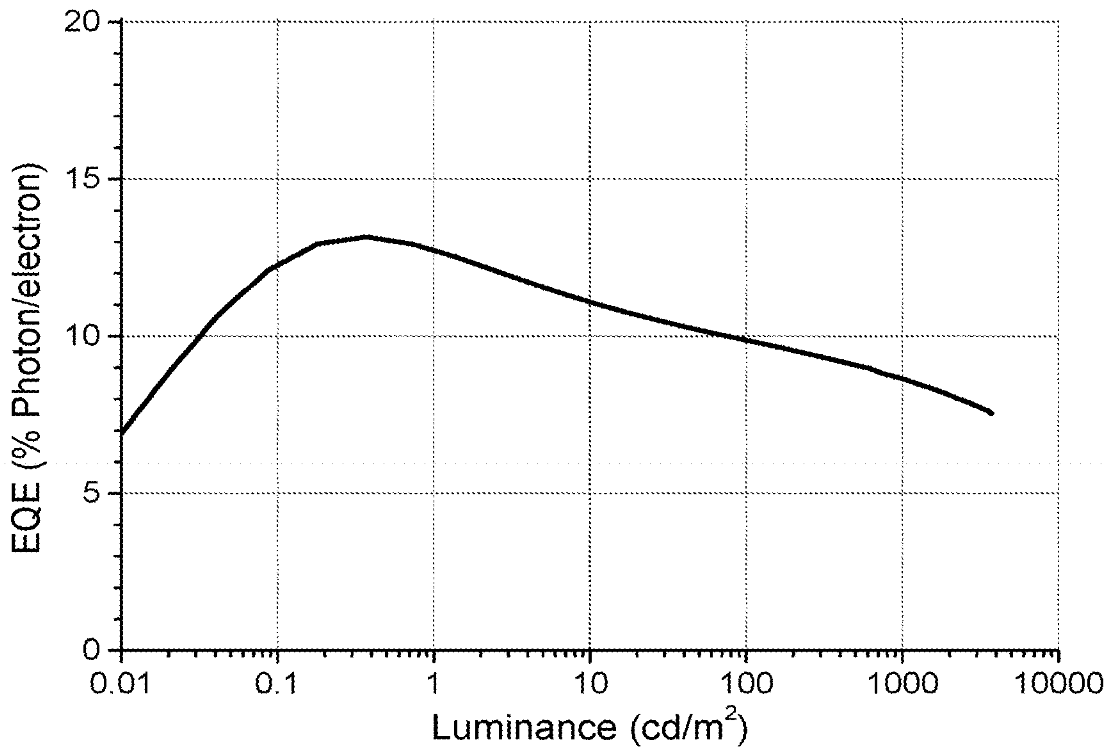
Figure 6C:
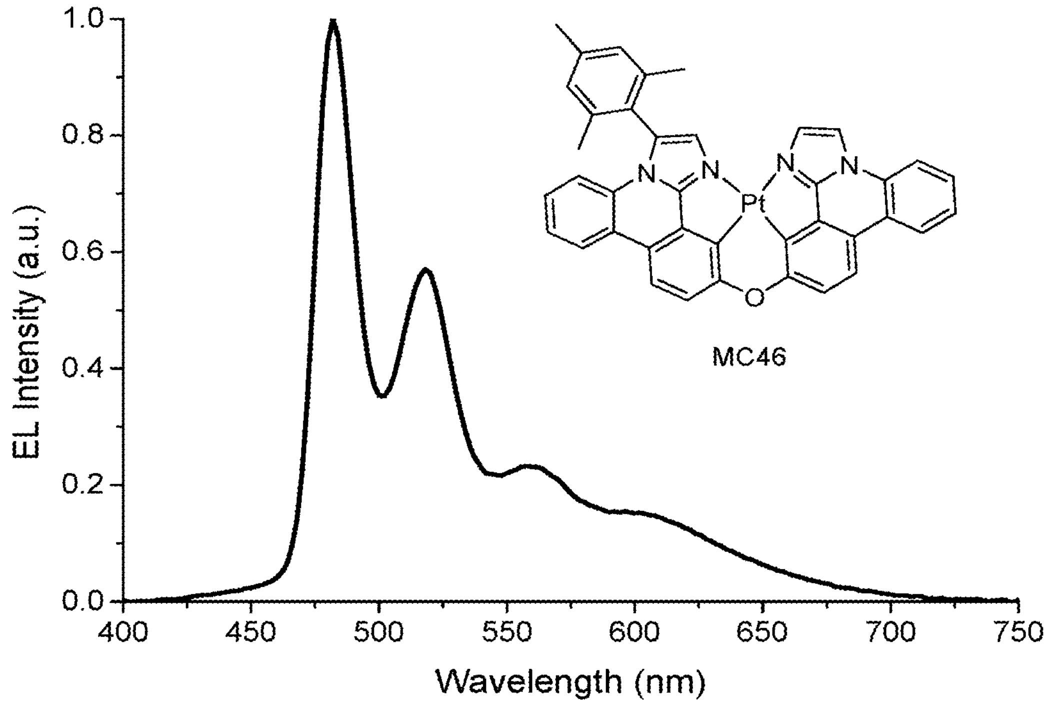

FIGS. 5A-5C show external quantum efficiency (EQE) versus luminance, EQE versus current density, and electroluminescent spectrum, respectively, for Device type 1 with MC46. Device type 1: ITO (100 nm)/HATCN (10 nm)/NPD (40 nm)/BCN34 (10 nm)/20% Pt2O2-P2M:mCBP (10 nm)/10% Pt2O2-P2M:mCBP (20 nm)/Balq (10 nm)/BPyTP (40 nm)/Liq (2 nm)/Al (100 nm). FIGS. 6A-6C show external quantum efficiency (EQE) versus luminance, EQE versus current density, and electroluminescent spectrum, respectively, for Device type 1 with MC46. Device type 2: ITO (100 nm)/HATCN (10 nm)/NPD (40 nm)/BCN34 (10 nm)/10% % Pt2O2-P2M:mCBP (20 nm)/Balq (10 nm)/BPyTP (40 nm)/Liq (2 nm)/AL (100 nm). In Device types 1 and 2: ITO: Indium tin oxide; HATCN: 1,4,5,8,9,11-hexaazatriphenylenehexacarbonitrile; HatCN: NPD: N,N'-diphenyl-N,N'-bis(1-naphthyl)-1,1'-biphenyl-4,4"-diamine; BCN34: 5,12-diphenyl-5,12-dihydroindolo[3,2-a]carbazole; Pt2O2-P2M: MC46; mCBP: 3,3-Di(9H-carbazol-9-yl)biphenyl; Balq: bis(2-methyl-8-quinolinolato)(biphenyl-4-olato)aluminum; BPyTP: (2,7-di(2,2'-bipyridin-5-yl)triphenylene); Liq: 8-Quinolinolato lithium; Al: aluminum.

Example 47

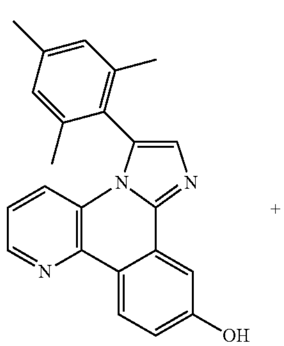

-continued

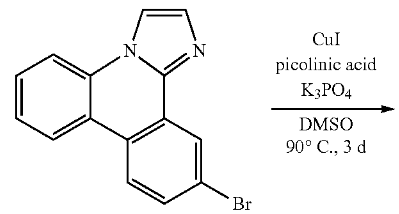

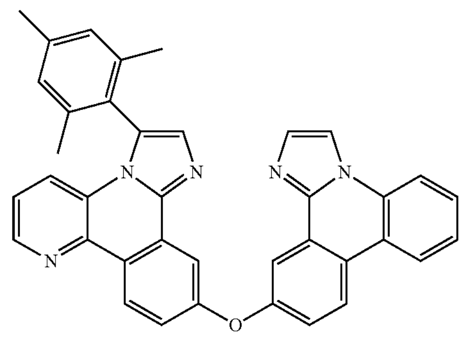

L47

3-mesitylbenzo[c]imidazo[1,2-a][1,5]naphthyridin-11-ol (0.85 mmol, 1.0 eq), 11-bromoimidazo[1,2-f]phenanthridine (1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three time. Then solvent DMSO (10 mL) was added under the protection of nitrogen. The mixture was stirred in an oil bath at a temperature of 90° C. for 3 days and then cooled down to ambient temperature, diluted with ethyl acetate. The mixture as washed with water three times and then dried over sodium sulfate and filtered. The solvent was removed under reduced pressure, and the residue was purified through column chromatography on silica gel using hexane/ethyl acetate as eluent to obtain the desired product ligand L47 in 30%~70% yield.

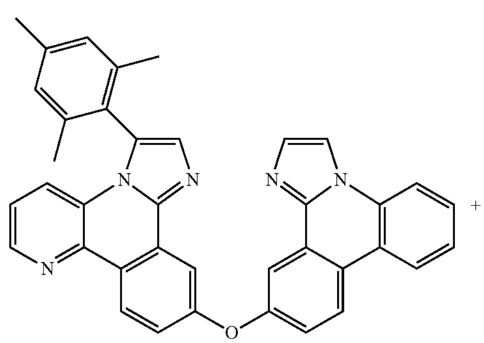

L47

-continued

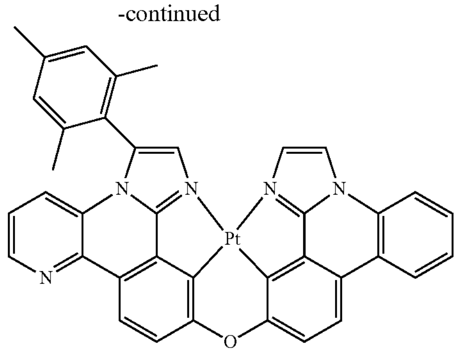

MC47

L47 (0.11 mmol, 1.0 eq), $K_2PtCl_4$ (48 mg, 0.12 mmol, 1.1 eq) and n-$Bu_4NBr$ (3 mg, 0.011 mmol, 0.1 eq) were added to a dry pressure tube, which was taken into a glove box and acetic acid (7 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC47 in 10%~50% yield.

Example 48

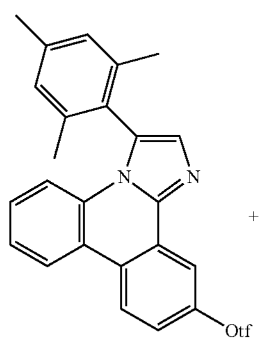

Otf-48

+

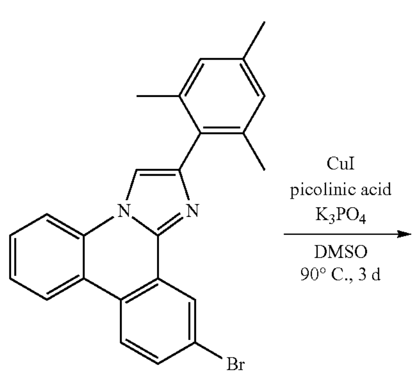

-continued

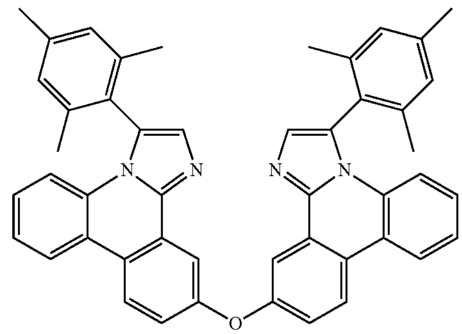

L48

Otf-48 (0.85 mmol, 1.0 eq), 11-bromo-2-mesitylimidazo [1,2-f]phenanthridine (1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L48 in 30%~70% yield.

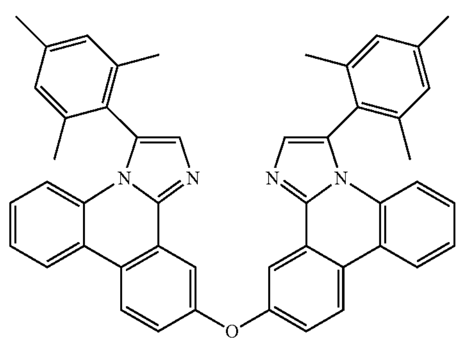

L48

+

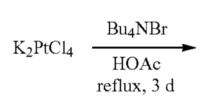

-continued

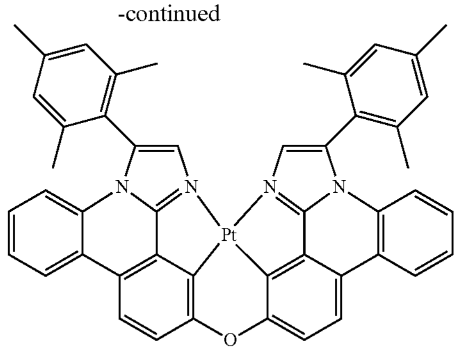

MC48

L48 (0.11 mmol, 1.0 eq), $K_2PtCl_4$ (48 mg, 0.12 mmol, 1.1 eq) and n-$Bu_4NBr$ (3 mg, 0.011 mmol, 0.1 eq) were added to a dry pressure tube, which was taken into a glove box and acetic acid (7 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC48 in 10%~50% yield.

Example 49

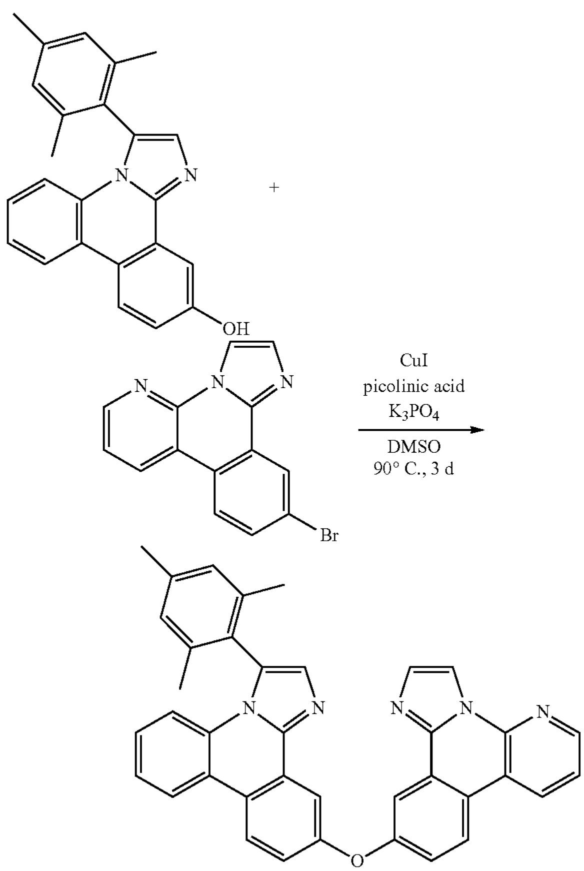

L49

3-mesitylimidazo[1,2-f]phenanthridin-11-ol (0.85 mmol, 1.0 eq), 11-bromobenzo[c]imidazo[1,2-a][1,8]naphthyridine (1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L49 in 30%~70% yield.

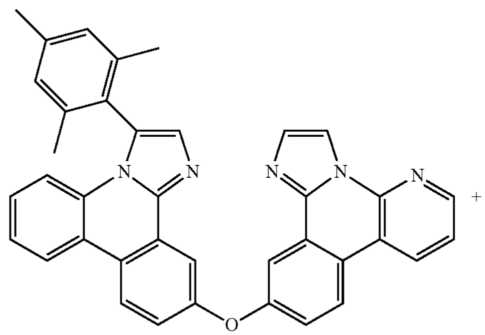

L49

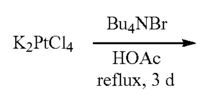

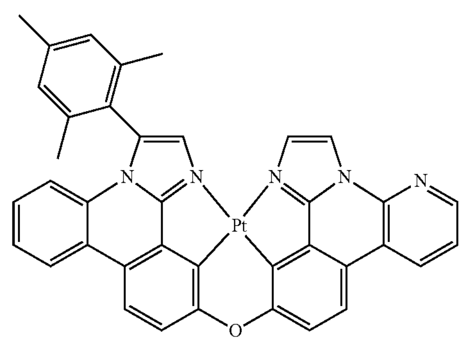

MC49

L49 (0.11 mmol, 1.0 eq), $K_2PtCl_4$ (48 mg, 0.12 mmol, 1.1 eq) and n-$Bu_4NBr$ (3 mg, 0.011 mmol, 0.1 eq) were added to a dry pressure tube, which was taken into a glove box and acetic acid (7 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC49 in 10%~50% yield.

Example 50

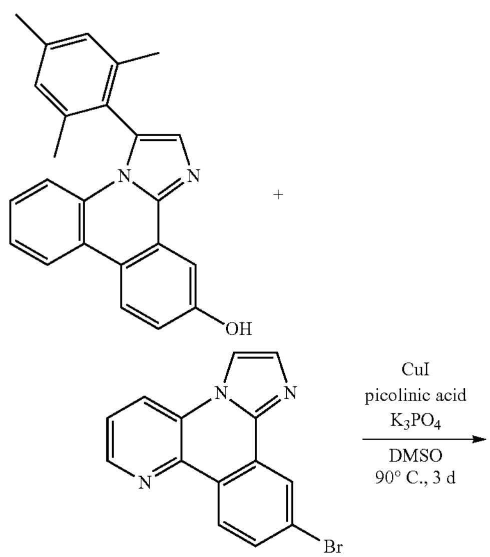

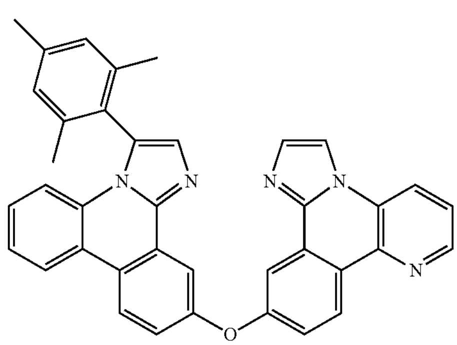

L50

3-mesitylimidazo[1,2-f]phenanthridin-11-ol (0.85 mmol, 1.0 eq), 11-bromobenzo[c]imidazo[1,2-a][1,5]naphthyridine (1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L50 in 30%~70% yield.

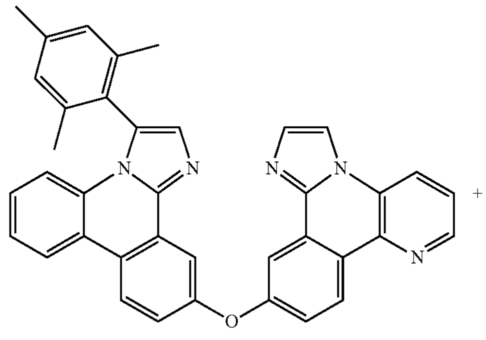

L50

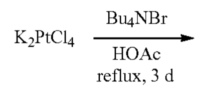

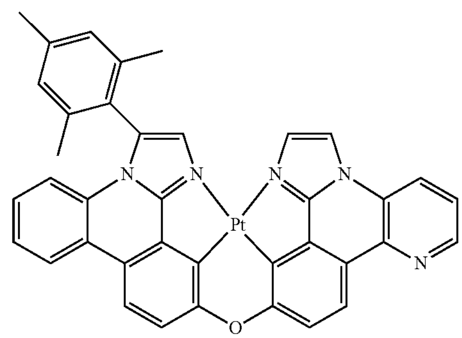

MC50

L50 (0.11 mmol, 1.0 eq), $K_2PtCl_4$ (48 mg, 0.12 mmol, 1.1 eq) and n-$Bu_4NBr$ (3 mg, 0.011 mmol, 0.1 eq) were added to a dry pressure tube, which was taken into a glove box and acetic acid (7 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC50 in 10%~50% yield.

Example 51

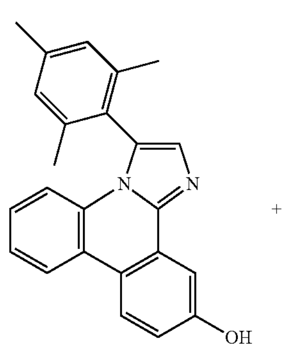

-continued

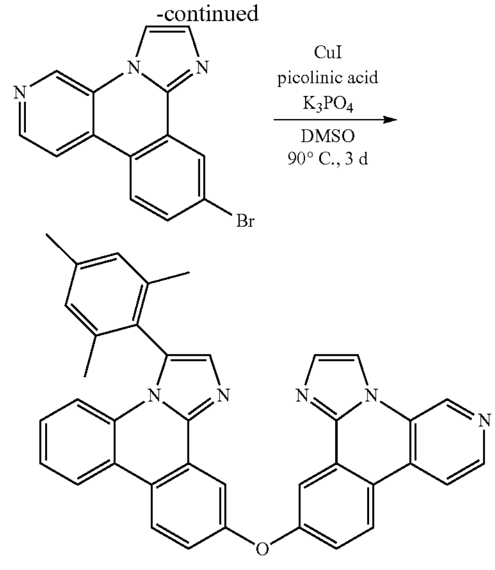

L51

3-mesitylimidazo[1,2-f]phenanthridin-11-ol (0.85 mmol, 1.0 eq), 11-bromobenzo[c]imidazo[1,2-a][1,7]naphthyridine (1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L51 in 30%~70% yield.

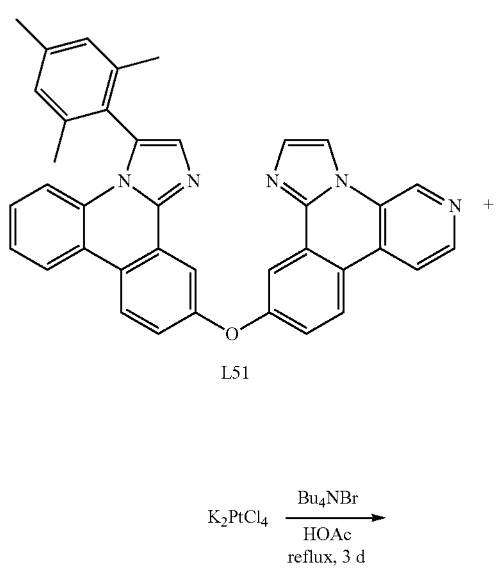

-continued

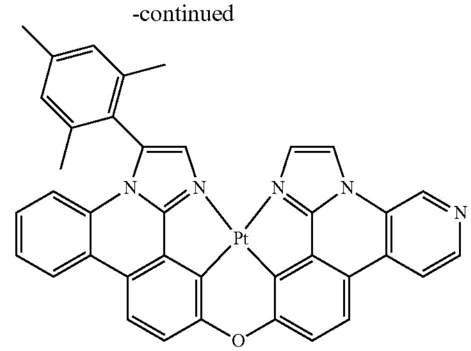

MC51

L51 (0.11 mmol, 1.0 eq), $K_2PtCl_4$ (48 mg, 0.12 mmol, 1.1 eq) and n-$Bu_4NBr$ (3 mg, 0.011 mmol, 0.1 eq) were added to a dry pressure tube, which was taken into a glove box and acetic acid (7 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC51 in 10%~50% yield.

Example 52

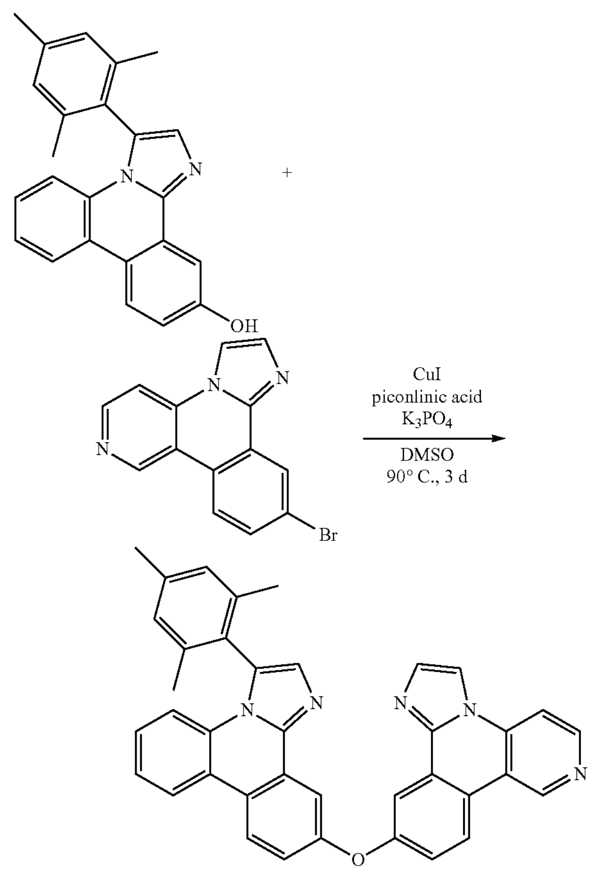

L52

3-mesitylimidazo[1,2-f]phenanthridin-11-ol (0.85 mmol, 1.0 eq), 11-bromobenzo[c]imidazo[1,2-a][1,6]naphthyridine (1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L52 in 30%~70% yield.

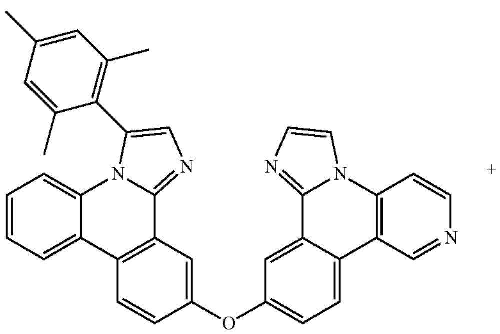

L52

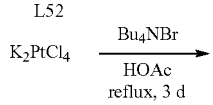

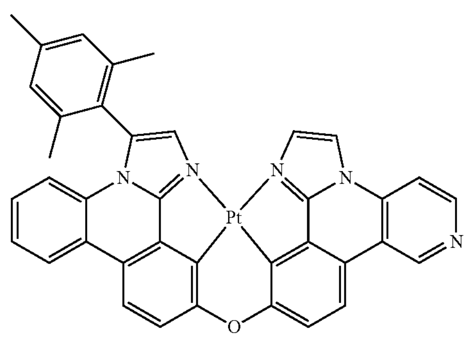

MC52

L52 (0.11 mmol, 1.0 eq), $K_2PtCl_4$ (48 mg, 0.12 mmol, 1.1 eq) and n-$Bu_4NBr$ (3 mg, 0.011 mmol, 0.1 eq) were added to a dry pressure tube, which was taken into a glove box and acetic acid (7 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC52 in 10%~50% yield.

Example 53

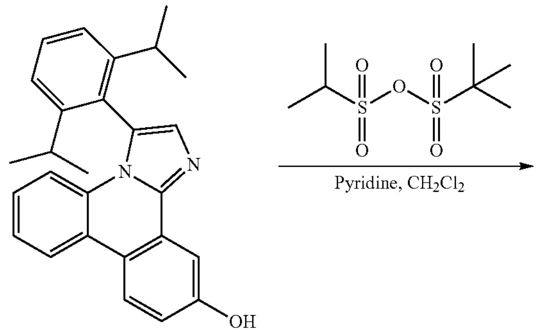

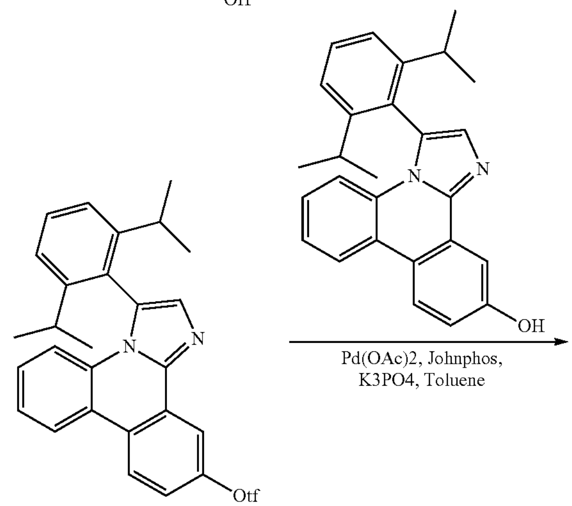

Otf-53

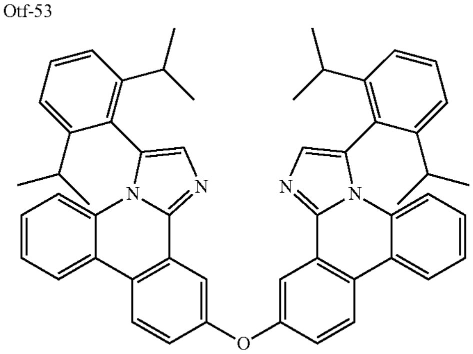

L53

Otf-53 (0.85 mmol, 1.0 eq), 3-(2,6-diisopropylphenyl) imidazo[1,2-f]phenanthridin-11-ol (1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L53 in 30%~70% yield.

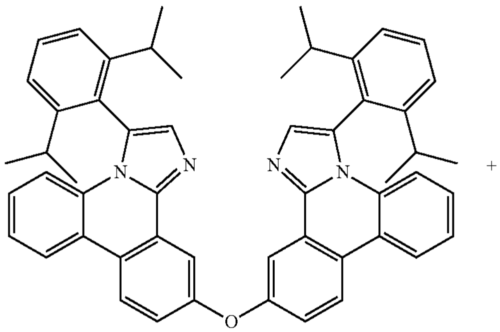

L53

$K_2PtCl_4$ $\xrightarrow{Bu_4NBr}$ HOAc, reflux, 3 d

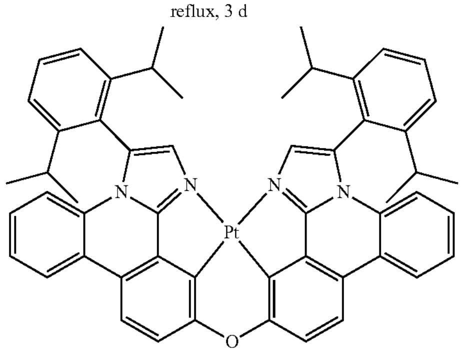

MC53

L53 (0.11 mmol, 1.0 eq), $K_2PtCl_4$ (48 mg, 0.12 mmol, 1.1 eq) and n-$Bu_4NBr$ (3 mg, 0.011 mmol, 0.1 eq) were added to a dry pressure tube, which was taken into a glove box and acetic acid (7 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC53 in 10%~50% yield.

Example 54

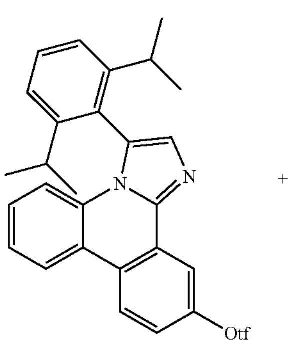

Otf-53

-continued

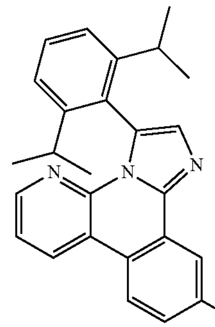

Pd(OAc)2, Johnphos / K3PO4, Toluene

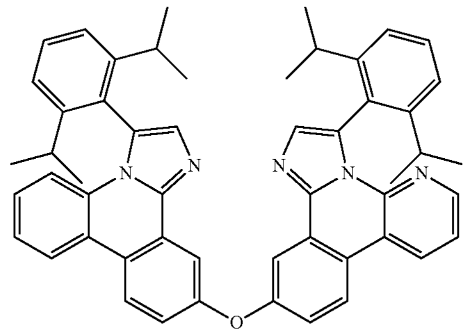

L54

Otf-53 (0.85 mmol, 1.0 eq), 3-(2,6-diisopropylphenyl) benzo[c]imidazo[1,2-a][1,8]naphthyridin-11-ol (1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L54 in 30%~70% yield.

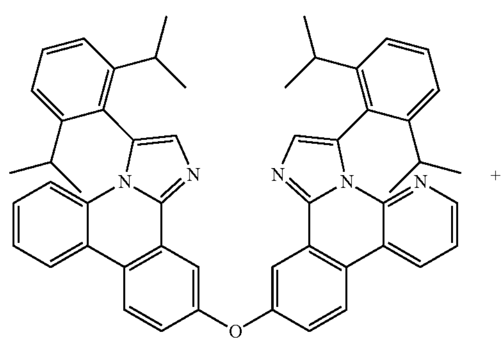

L54

$K_2PtCl_4$ $\xrightarrow{Bu_4NBr}$ HOAc, reflux, 3 d

-continued

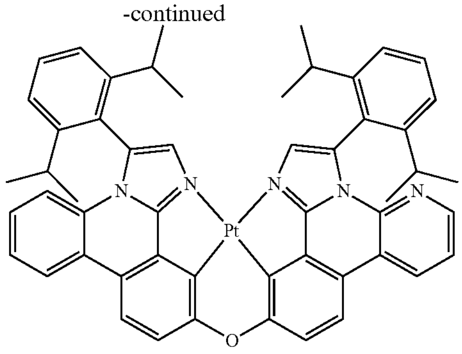

MC54

L54 (0.11 mmol, 1.0 eq), $K_2PtCl_4$ (48 mg, 0.12 mmol, 1.1 eq) and n-$Bu_4NBr$ (3 mg, 0.011 mmol, 0.1 eq) were added to a dry pressure tube, which was taken into a glove box and acetic acid (7 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC54 in 10%~50% yield.

Example 55

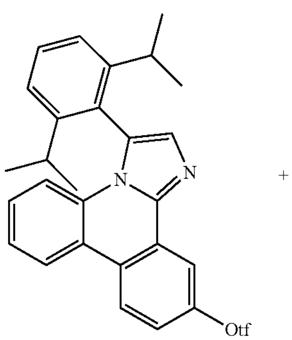

Otf-53

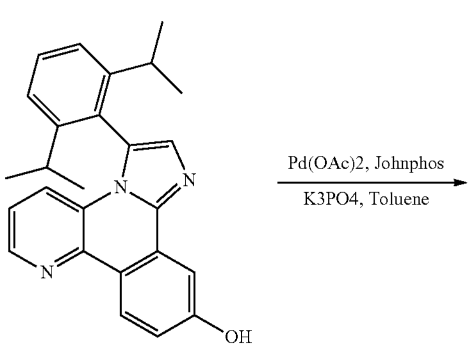

-continued

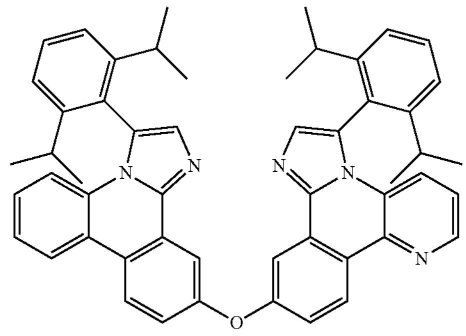

L55

Otf-53 (0.85 mmol, 1.0 eq), 3-(2,6-diisopropylphenyl) benzo[c]imidazo[1,2-a][1,5]naphthyridin-11-ol (1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L55 in 30%~70% yield.

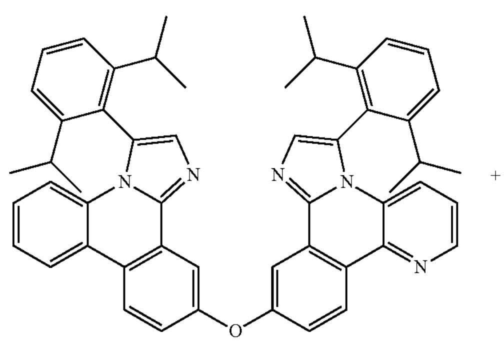

L55

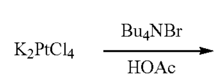

-continued

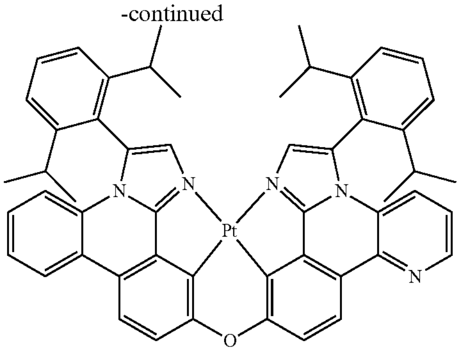

MC55

L55 (0.11 mmol, 1.0 eq), $K_2PtCl_4$ (48 mg, 0.12 mmol, 1.1 eq) and n-$Bu_4NBr$ (3 mg, 0.011 mmol, 0.1 eq) were added to a dry pressure tube, which was taken into a glove box and acetic acid (7 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC55 in 10%~50% yield.

Example 56

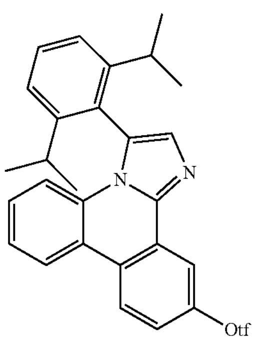

Otf-53

+

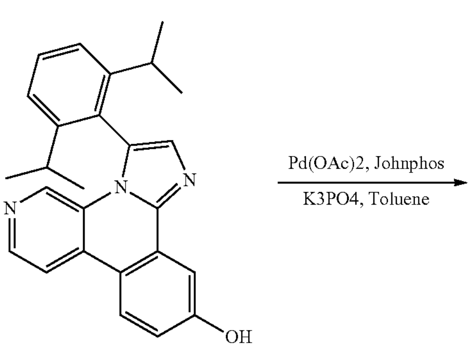

Pd(OAc)2, Johnphos

K3PO4, Toluene

-continued

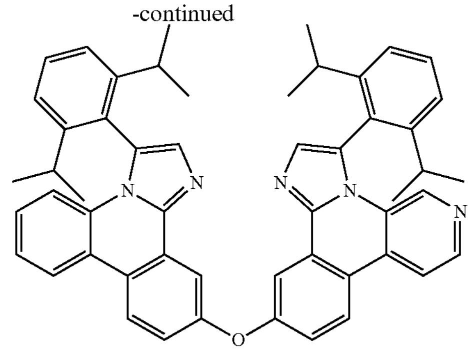

L56

Otf-53 (0.85 mmol, 1.0 eq), 3-(2,6-diisopropylphenyl) benzo[c]imidazo[1,2-a][1,7]naphthyridin-11-ol (1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L56 in 30%~70% yield.

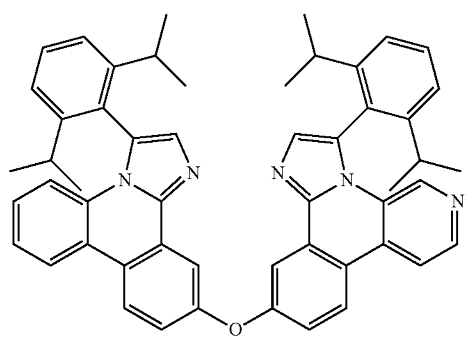

L56

+

$K_2PtCl_4$ $\xrightarrow[\text{HOAc, reflux, 3 d}]{Bu_4NBr}$

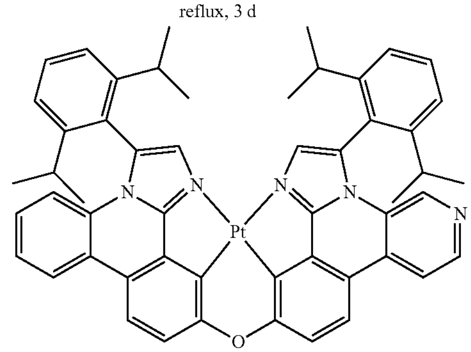

MC56

L56 (0.11 mmol, 1.0 eq), $K_2PtCl_4$ (48 mg, 0.12 mmol, 1.1 eq) and n-$Bu_4NBr$ (3 mg, 0.011 mmol, 0.1 eq) were added to a dry pressure tube, which was taken into a glove box and acetic acid (7 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC56 in 10%~50% yield.

Example 57

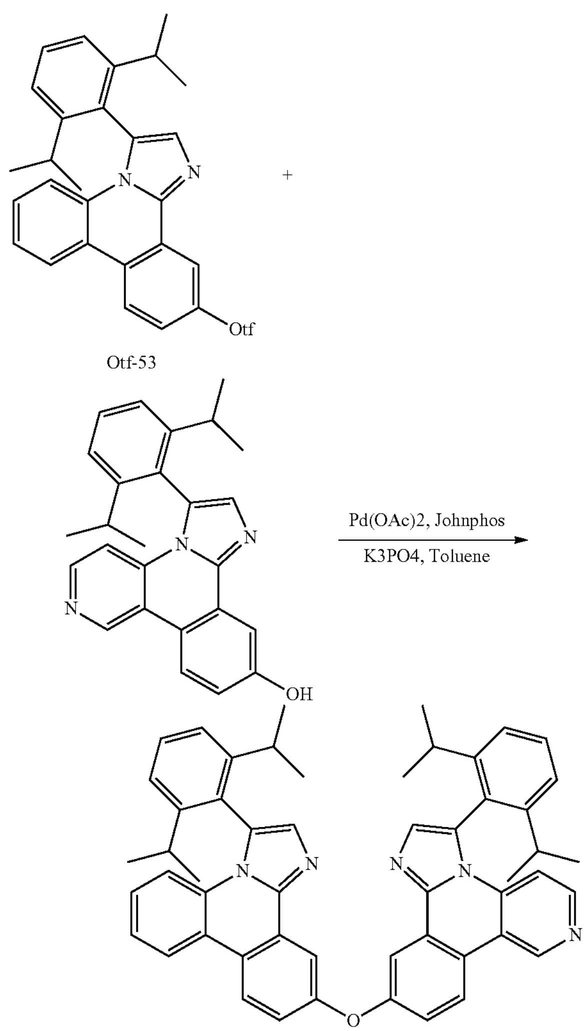

L57

Otf-53 (0.85 mmol, 1.0 eq), 3-(2,6-diisopropylphenyl)benzo[c]imidazo[1,2-a][1,6]naphthyridin-11-ol (1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L57 in 30%~70% yield.

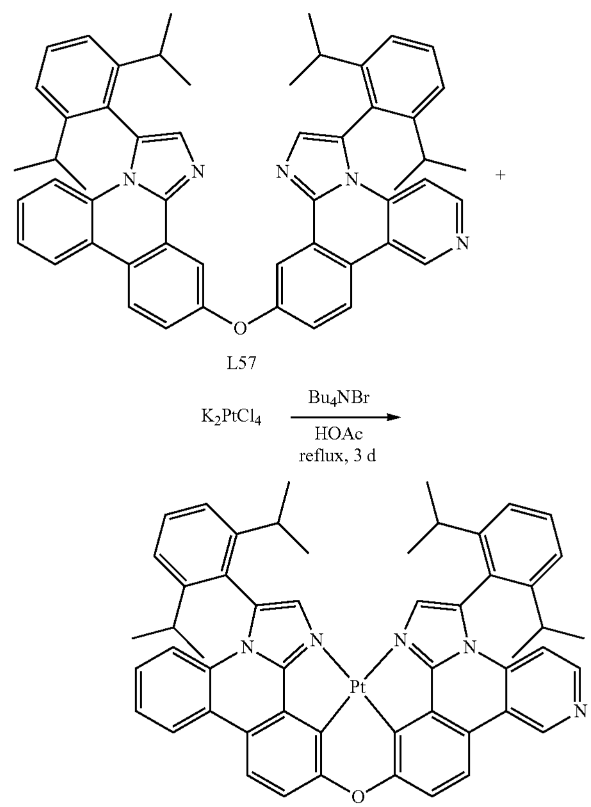

MC57

L57 (0.11 mmol, 1.0 eq), $K_2PtCl_4$ (48 mg, 0.12 mmol, 1.1 eq) and n-$Bu_4NBr$ (3 mg, 0.011 mmol, 0.1 eq) were added to a dry pressure tube, which was taken into a glove box and acetic acid (7 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC57 in 10%~50% yield.

Example 58

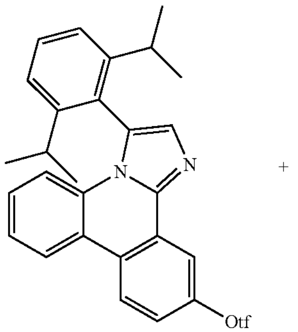

Otf-53

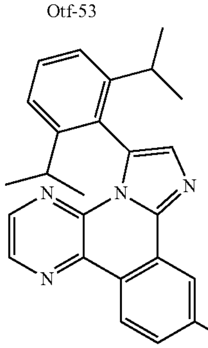

Pd(OAc)2, Johnphos

K3PO4, Toluene

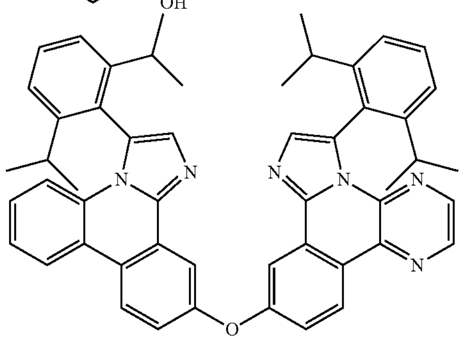

L58

Otf-53 (0.85 mmol, 1.0 eq), 3-(2,6-diisopropylphenyl) imidazo[2,1-a]pyrazino[2,3-c]isoquinolin-11-ol (1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L58 in 30%~70% yield.

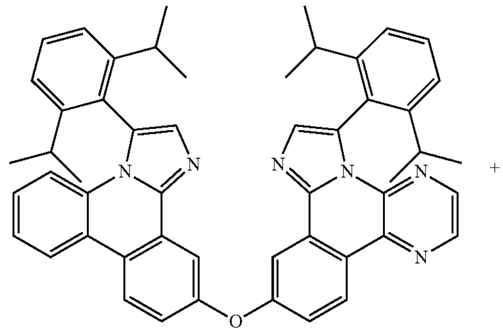

L58

$K_2PtCl_4$ $\xrightarrow[\text{HOAc, reflux, 3 d}]{Bu_4NBr}$

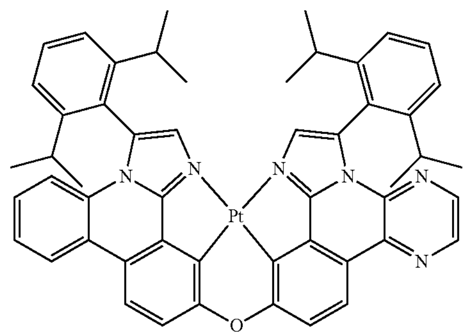

MC58

L58 (0.11 mmol, 1.0 eq), $K_2PtCl_4$ (48 mg, 0.12 mmol, 1.1 eq) and n-$Bu_4NBr$ (3 mg, 0.011 mmol, 0.1 eq) were added to a dry pressure tube, which was taken into a glove box and acetic acid (7 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC58 in 10%~50% yield.

Example 59

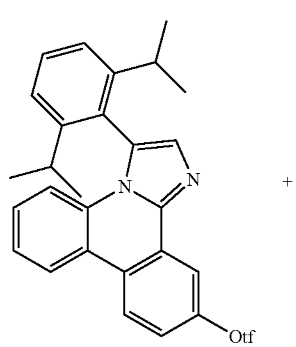

Otf-53

-continued

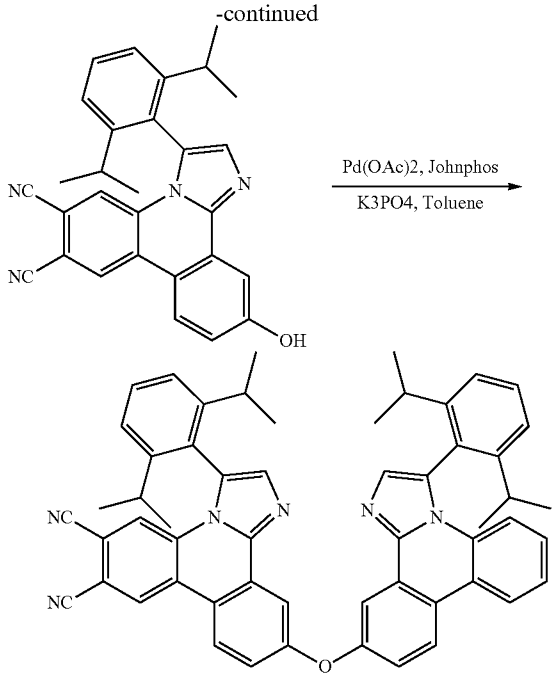

L59

Otf-53 (0.85 mmol, 1.0 eq), 3-(2,6-diisopropylphenyl)-11-hydroxyimidazo[1,2-f]phenanthridine-6,7-dicarbonitrile (1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L59 in 30%~70% yield.

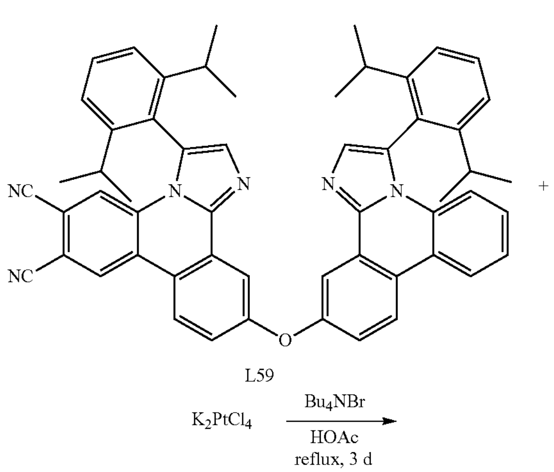

-continued

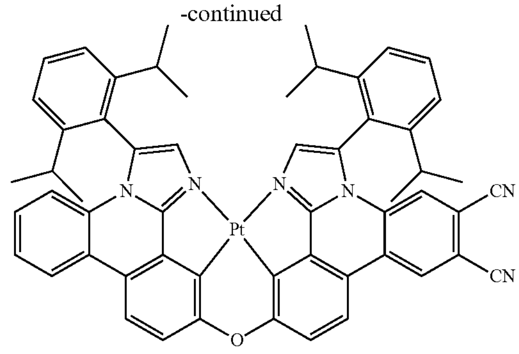

MC59

L59 (0.11 mmol, 1.0 eq), $K_2PtCl_4$ (48 mg, 0.12 mmol, 1.1 eq) and n-$Bu_4NBr$ (3 mg, 0.011 mmol, 0.1 eq) were added to a dry pressure tube, which was taken into a glove box and acetic acid (7 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC59 in 10%~50% yield.

Example 60

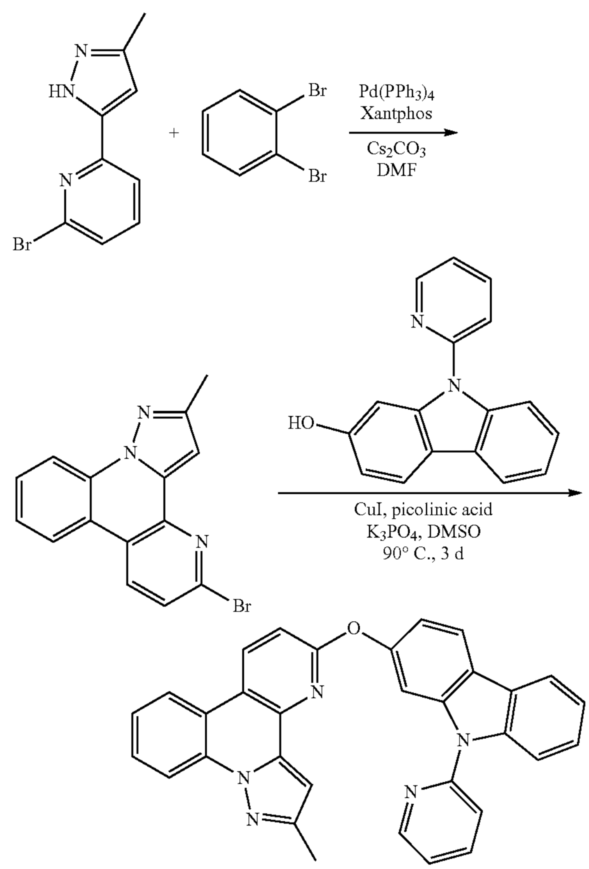

L60

5-bromo-2-methylbenzo[f]pyrazolo[1,5-h][1,7]naphthyridine (0.85 mmol, 1.0 eq), 9-(pyridin-2-yl)-9H-carbazol-2-ol (359 mg, 1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture as washed with water three times and then dried over sodium sulfate and filtered. The solvent was removed under reduced pressure, and the residue was purified through column chromatography on silica gel using hexane/ethyl acetate as eluent to obtain the desired product ligand L60 in 20%-70% yield.

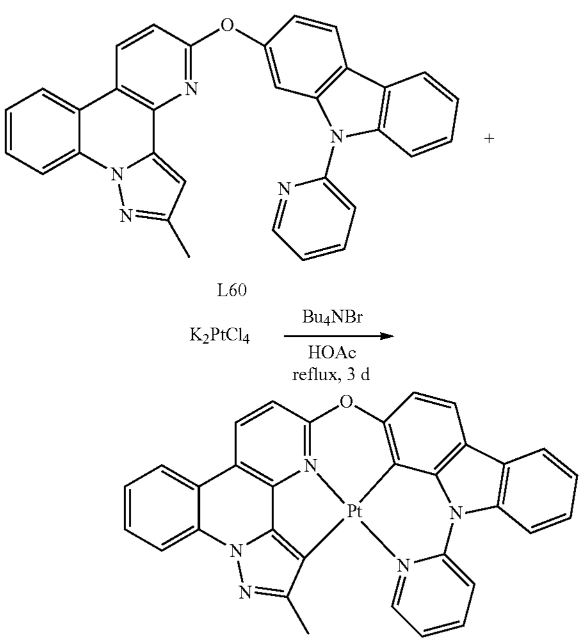

L60 (0.11 mmol, 1.0 eq), $K_2PtCl_4$ (48 mg, 0.12 mmol, 1.1 eq) and n-$Bu_4NBr$ (3 mg, 0.011 mmol, 0.1 eq) were added to a dry pressure tube, which was taken into a glove box and acetic acid (7 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC60 in 10%~50% yield.

Example 61

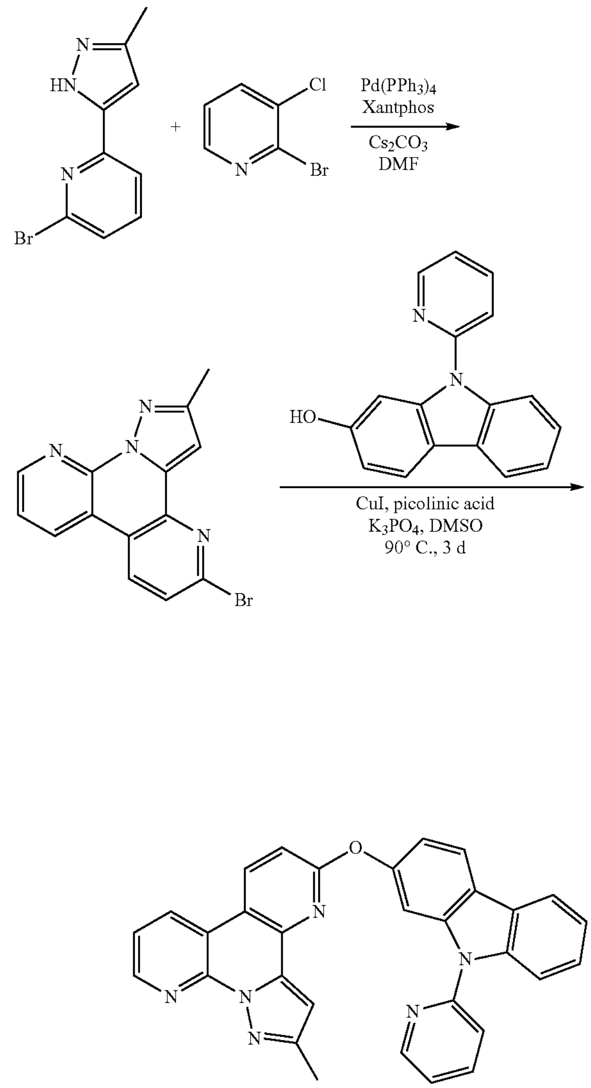

5-bromo-2-methylpyrazolo[1,5-h]pyrido[3,2-f][1,7]naphthyridine (0.85 mmol, 1.0 eq), 9-(pyridin-2-yl)-9H-carbazol-2-ol (359 mg, 1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L61 in 20%-70% yield.

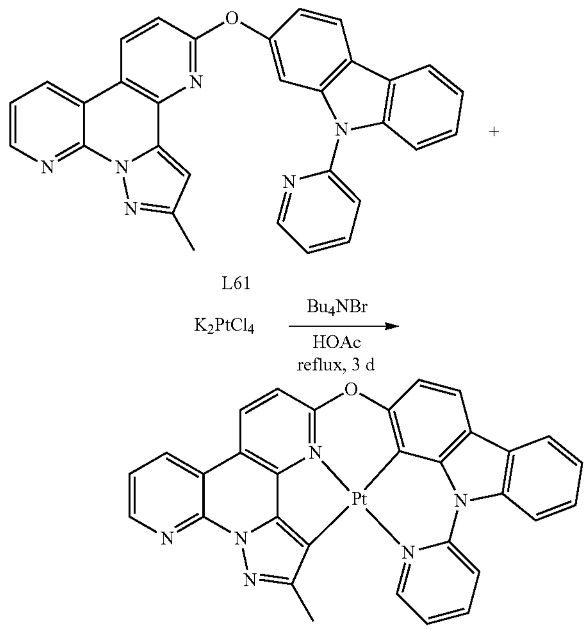

L61

MC61

L61 (0.11 mmol, 1.0 eq), $K_2PtCl_4$ (48 mg, 0.12 mmol, 1.1 eq) and n-$Bu_4NBr$ (3 mg, 0.011 mmol, 0.1 eq) were added to a dry pressure tube, which was taken into a glove box and acetic acid (7 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC61 in 10%~50% yield.

Example 62

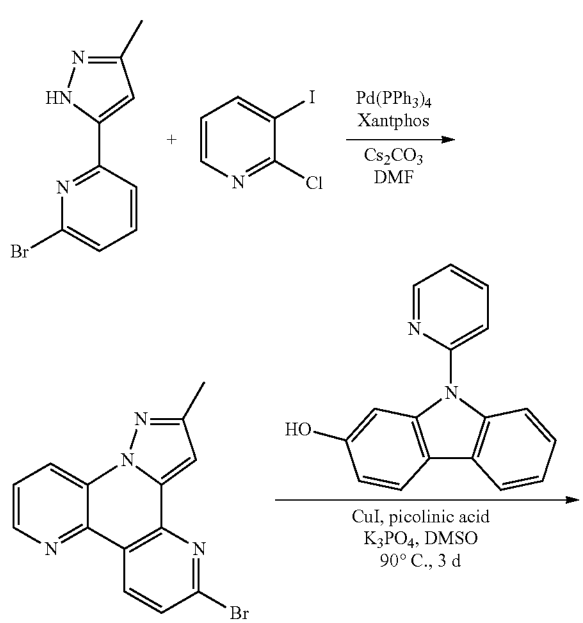

-continued

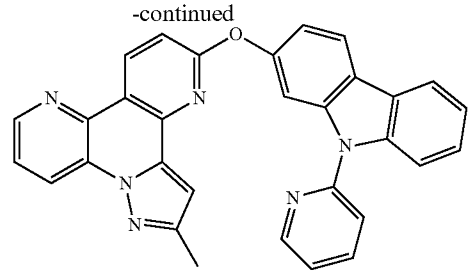

L62

5-bromo-2-methylpyrazolo[1,5-a]pyrido[2,3-c][1,5]naphthyridine (0.85 mmol, 1.0 eq), 9-(pyridin-2-yl)-9H-carbazol-2-ol (359 mg, 1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L62 in 20%-70% yield.

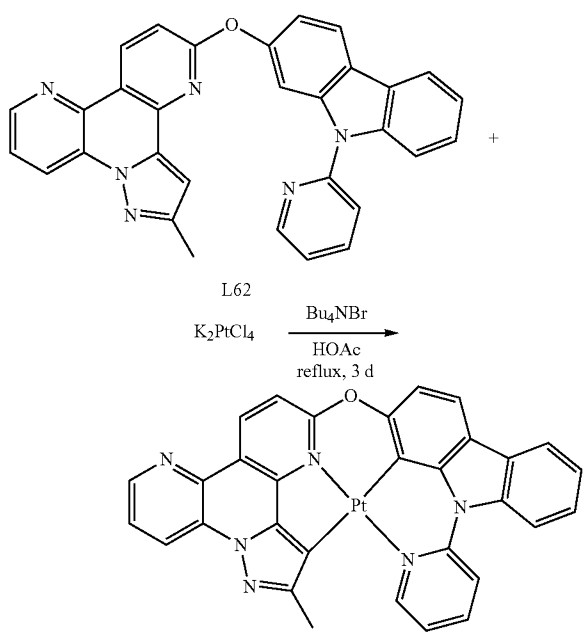

L62

MC62

L62 (0.11 mmol, 1.0 eq), $K_2PtCl_4$ (48 mg, 0.12 mmol, 1.1 eq) and n-$Bu_4NBr$ (3 mg, 0.011 mmol, 0.1 eq) were added to a dry pressure tube, which was taken into a glove box and acetic acid (7 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC62 in 10%~50% yield.

Example 63

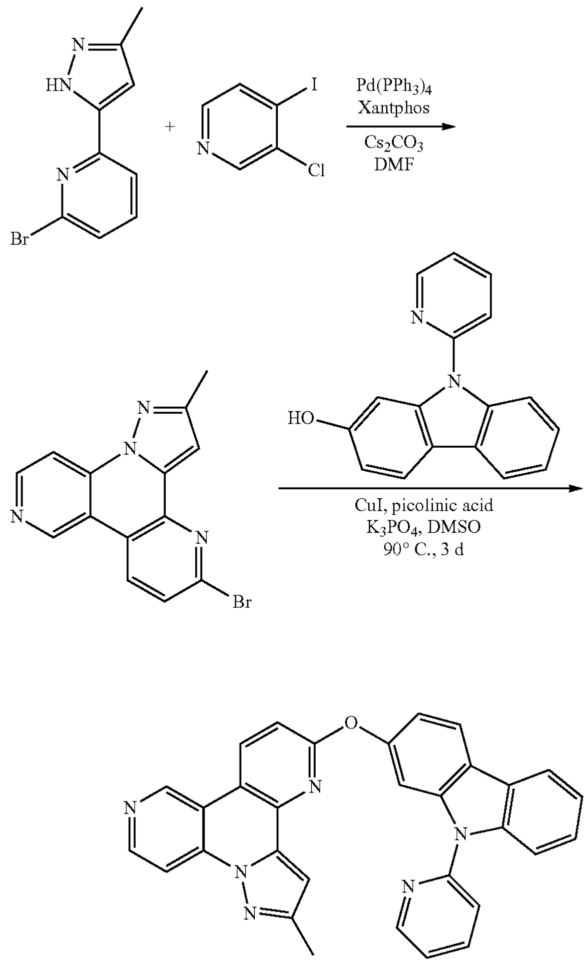

L63

5-bromo-2-methylpyrazolo[1,5-a]pyrido[2,3-c][1,6] naphthyridine (0.85 mmol, 1.0 eq), 9-(pyridin-2-yl)-9H-carbazol-2-ol (359 mg, 1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L63 in 20%-70% yield.

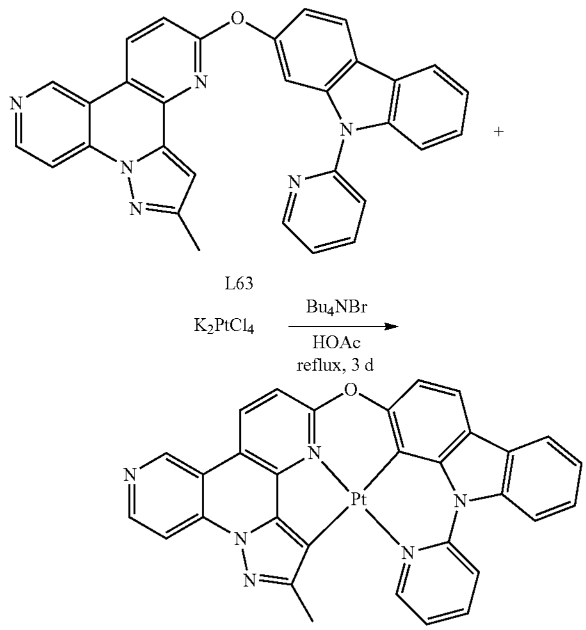

MC63

L63 (0.11 mmol, 1.0 eq), $K_2PtCl_4$ (48 mg, 0.12 mmol, 1.1 eq) and n-$Bu_4NBr$ (3 mg, 0.011 mmol, 0.1 eq) were added to a dry pressure tube, which was taken into a glove box and acetic acid (7 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC63 in 10%~50% yield.

Example 64

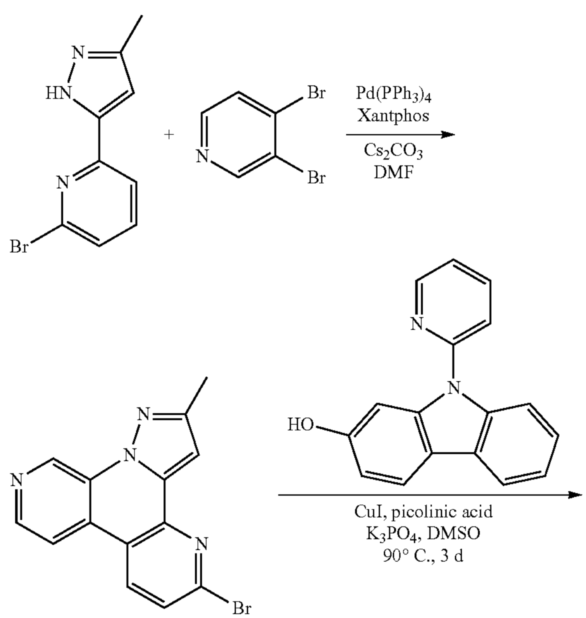

-continued

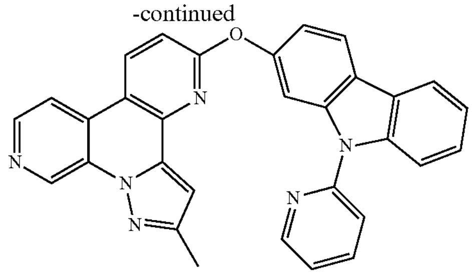

L64

5-bromo-2-methylpyrazolo[1,5-a]pyrido[2,3-c][1,7]naphthyridine (0.85 mmol, 1.0 eq), 9-(pyridin-2-yl)-9H-carbazol-2-ol (359 mg, 1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L64 in 20%-70% yield.

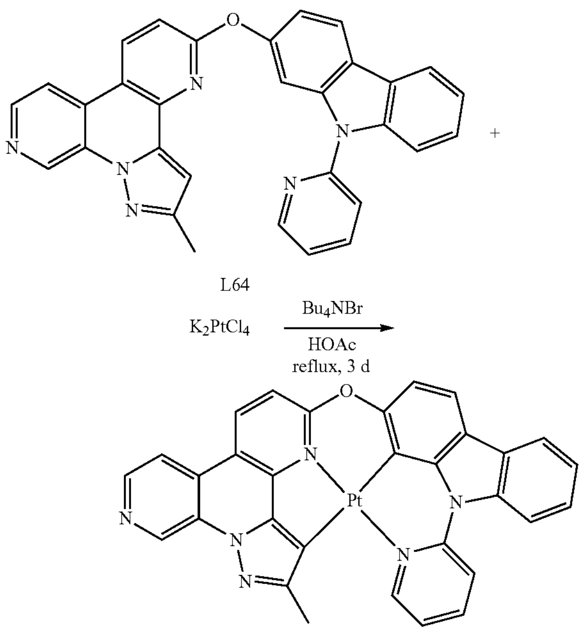

MC64

L64 (0.11 mmol, 1.0 eq), $K_2PtCl_4$ (48 mg, 0.12 mmol, 1.1 eq) and n-$Bu_4NBr$ (3 mg, 0.011 mmol, 0.1 eq) were added to a dry pressure tube, which was taken into a glove box and acetic acid (7 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC64 in 10%~50% yield.

Example 65

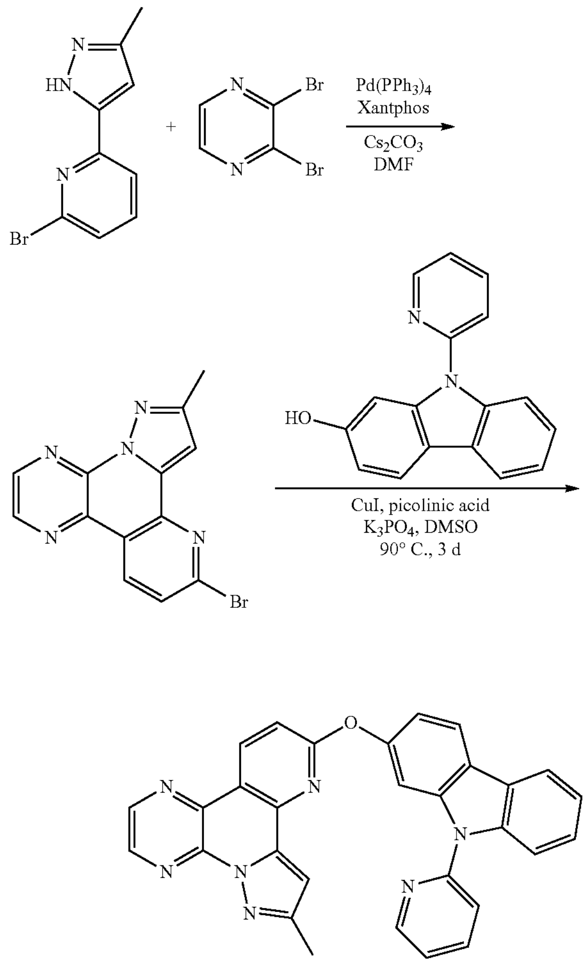

L65

10-bromo-7-methylpyrazino[2,3-f]pyrazolo[1,5-h][1,7]naphthyridine (0.85 mmol, 1.0 eq), 9-(pyridin-2-yl)-9H-carbazol-2-ol (359 mg, 1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L65 in 20%-70% yield.

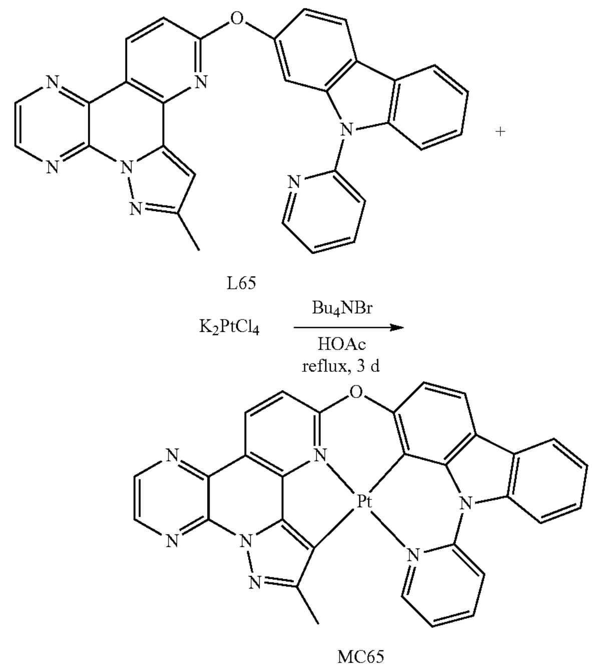

L65 (0.11 mmol, 1.0 eq), $K_2PtCl_4$ (48 mg, 0.12 mmol, 1.1 eq) and n-$Bu_4NBr$ (3 mg, 0.011 mmol, 0.1 eq) were added to a dry pressure tube, which was taken into a glove box and acetic acid (7 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC65 in 10%~50% yield.

Example 66

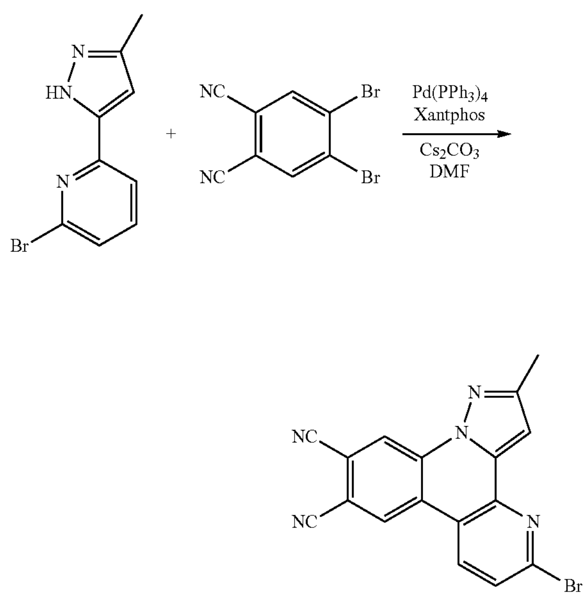

-continued

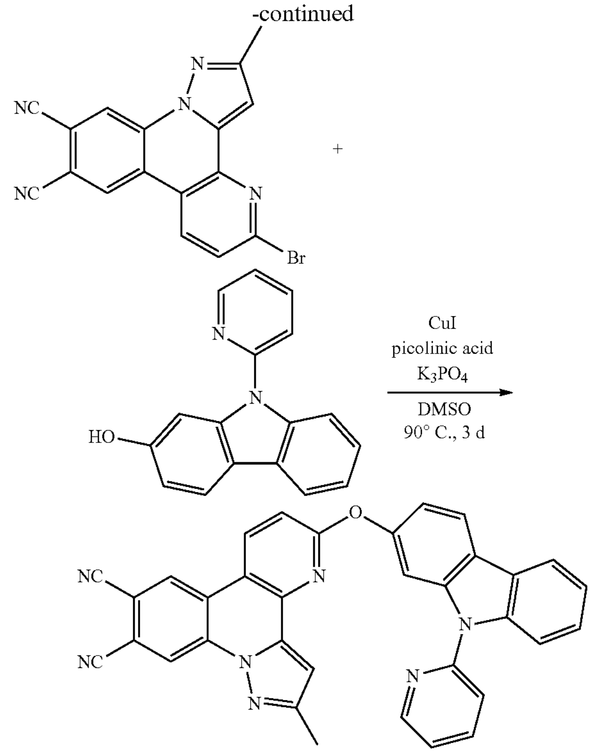

L66

5-bromo-2-methylbenzo[f]pyrazolo[1,5-h][1,7]naphthyridine-9,10-dicarbonitrile (0.85 mmol, 1.0 eq), 9-(pyridin-2-yl)-9H-carbazol-2-ol (359 mg, 1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L66 in 20%-70% yield.

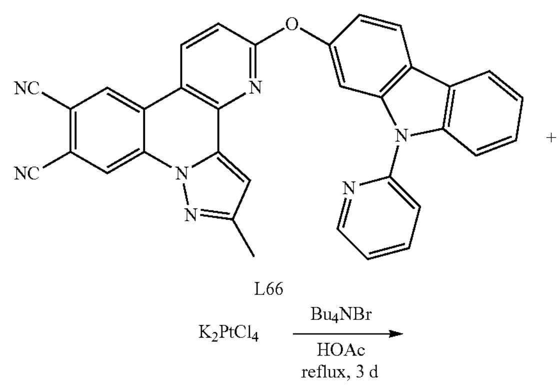

-continued

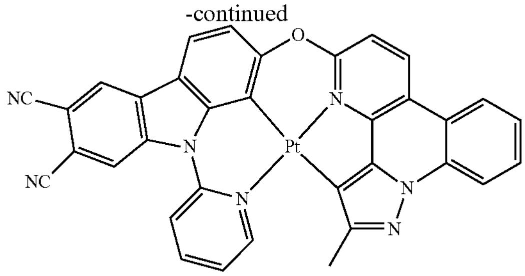

MC66

-continued

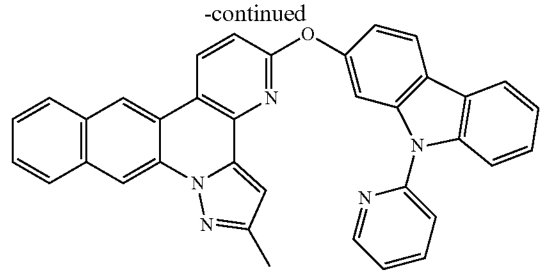

L67

L66 (0.11 mmol, 1.0 eq), $K_2PtCl_4$ (48 mg, 0.12 mmol, 1.1 eq) and n-$Bu_4NBr$ (3 mg, 0.011 mmol, 0.1 eq) were added to a dry pressure tube, which was taken into a glove box and acetic acid (7 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC66 in 10%~50% yield.

Example 67

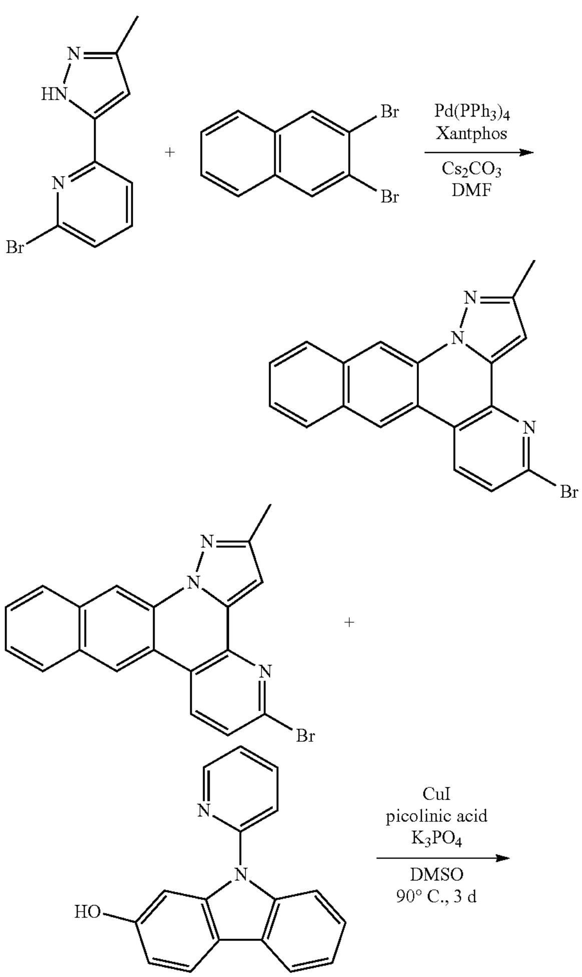

5-bromo-2-methylnaphtho[2,3-f]pyrazolo[1,5-h][1,7]naphthyridine (0.85 mmol, 1.0 eq), 9-(pyridin-2-yl)-9H-carbazol-2-ol (359 mg, 1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L67 in 20%-70% yield.

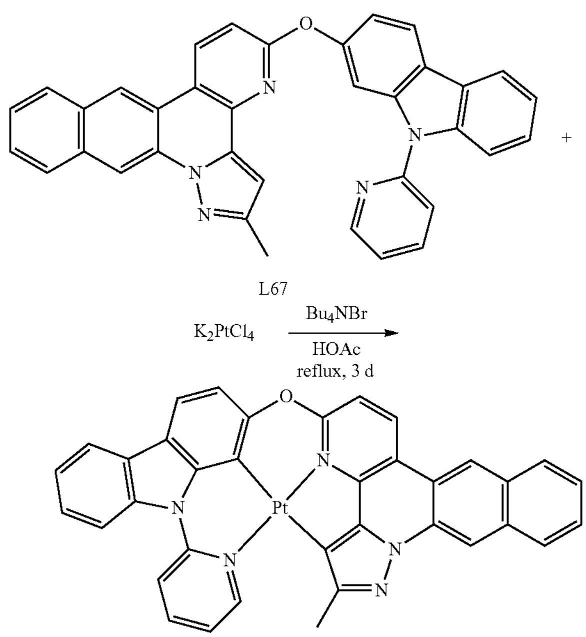

MC67

L67 (0.11 mmol, 1.0 eq), $K_2PtCl_4$ (48 mg, 0.12 mmol, 1.1 eq) and n-$Bu_4NBr$ (3 mg, 0.011 mmol, 0.1 eq) were added to a dry pressure tube, which was taken into a glove box and acetic acid (7 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC67 in 10%~50% yield.

Example 68

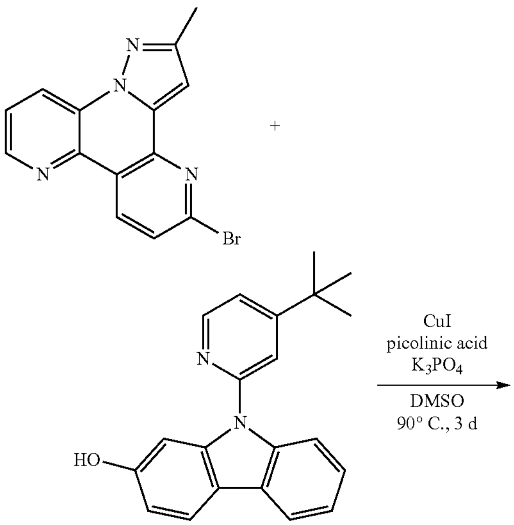

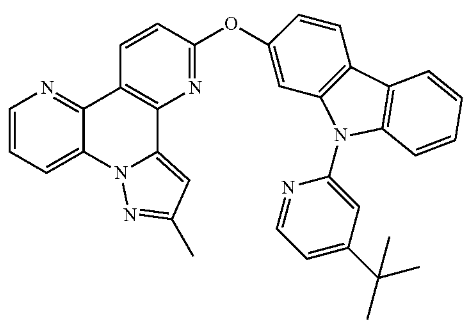

L68

5-bromo-2-methylpyrazolo[1,5-a]pyrido[2,3-c][1,5]naphthyridine (0.35 mmol, 1.0 eq), 2-bromo-9-(4-(tert-butyl)pyridin-2-yl)-9H-carbazole (159 mg, 0.42 mmol, 1.2 eq), CuI (13 mg, 0.07 mmol, 0.2 eq), picolinic acid (9 mg, 0.07 mmol, 0.2 eq) and $K_3PO_4$ (149 mg, 0.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (5 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L68 in 30%~70% yield.

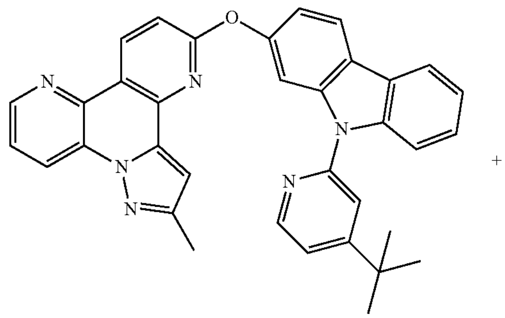

L68

$K_2PtCl_4$ $\xrightarrow[\text{HOAc, reflux, 3 d}]{Bu_4NBr}$

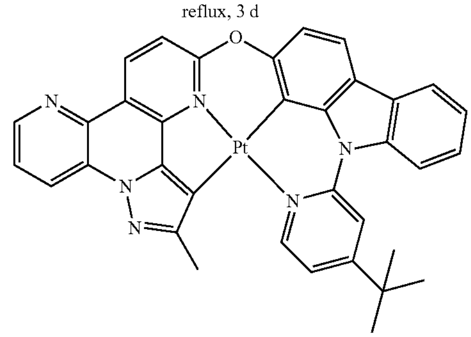

MC68

L68 (0.11 mmol, 1.0 eq), $K_2PtCl_4$ (48 mg, 0.12 mmol, 1.1 eq) and n-$Bu_4NBr$ (3 mg, 0.011 mmol, 0.1 eq) were added to a dry pressure tube, which was taken into a glove box and acetic acid (7 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC68 in 10%~50% yield.

Example 69

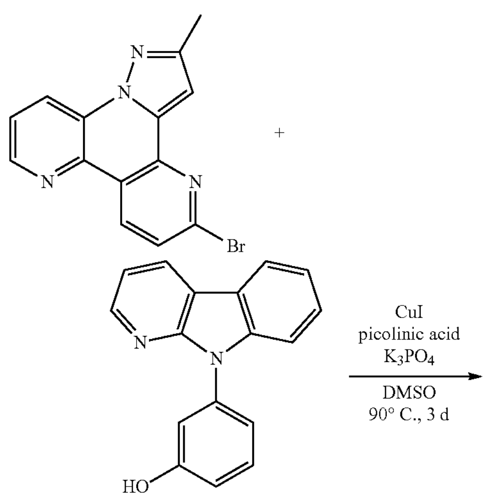

-continued

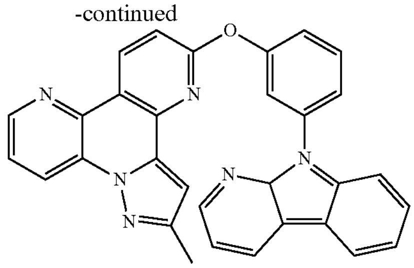

L69

5-bromo-2-methylpyrazolo[1,5-a]pyrido[2,3-c][1,5]naphthyridine (0.85 mmol, 1.0 eq), 3-(9H-pyrido[2,3-b]indol-9-yl)phenol (359 mg, 1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L69 in 20%-70% yield.

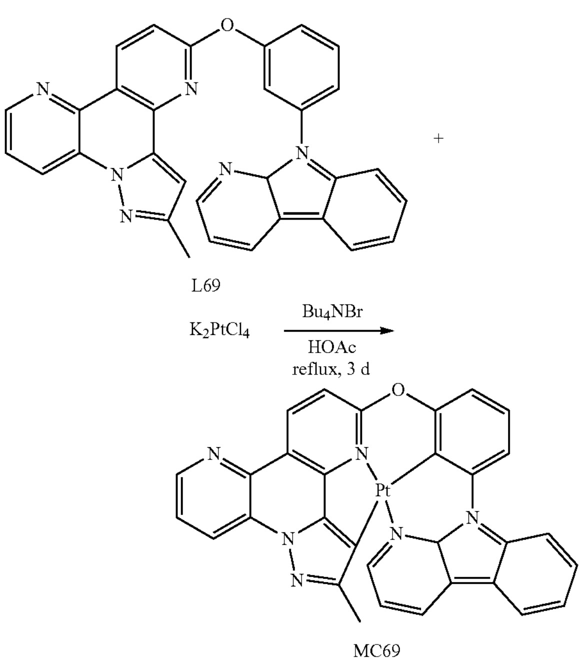

MC69

L69 (0.11 mmol, 1.0 eq), $K_2PtCl_4$ (48 mg, 0.12 mmol, 1.1 eq) and n-$Bu_4NBr$ (3 mg, 0.011 mmol, 0.1 eq) were added to a dry pressure tube, which was taken into a glove box and acetic acid (7 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC69 in 10%~50% yield.

Example 70

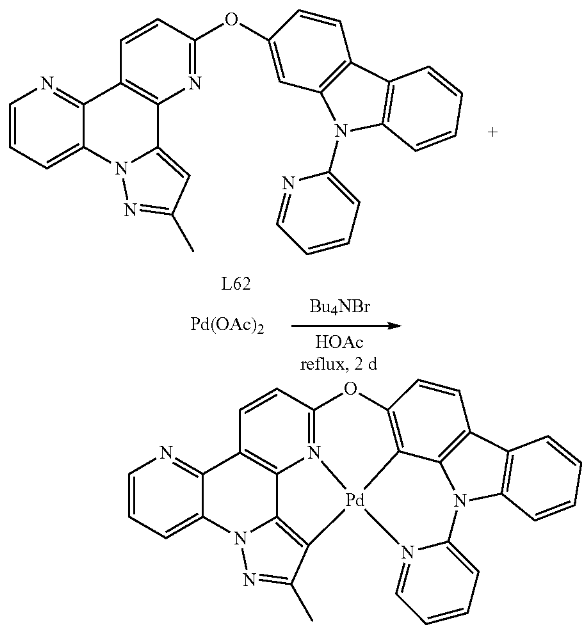

L70

L62 (0.11 mmol, 1.0 eq), $Pd(OAc)_2$ (27 mg, 0.12 mmol, 1.1 eq) and n-$Bu_4NBr$ (3 mg, 0.011 mmol, 0.1 eq) were added to a dry pressure tube, which was taken into a glove box and acetic acid (7 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product MC70 in 10%~50% yield.

Example 71

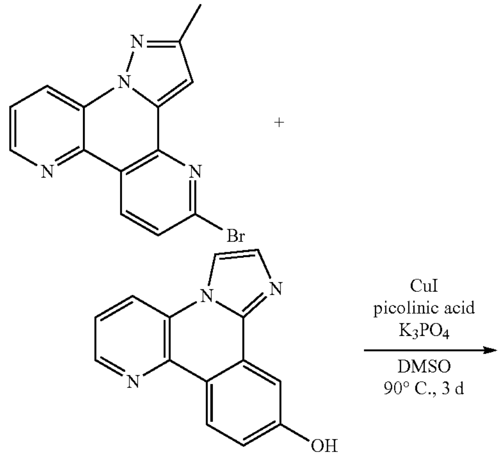

-continued

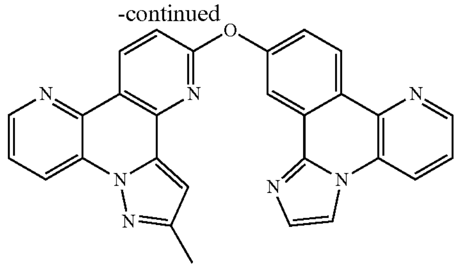

L71

5-bromo-2-methylpyrazolo[1,5-a]pyrido[2,3-c][1,5]naphthyridine (0.85 mmol, 1.0 eq), benzo[c]imidazo[1,2-a][1,5]naphthyridin-11-ol (1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L71 in 20%-70% yield.

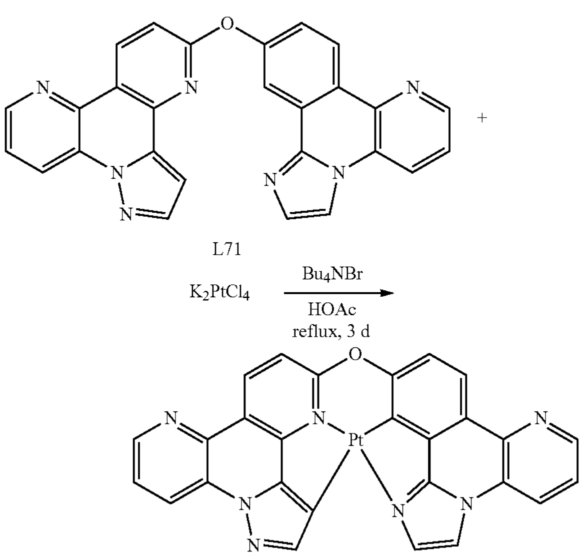

MC71

L71 (0.11 mmol, 1.0 eq), $K_2PtCl_4$ (48 mg, 0.12 mmol, 1.1 eq) and n-$Bu_4NBr$ (3 mg, 0.011 mmol, 0.1 eq) were added to a dry pressure tube, which was taken into a glove box and acetic acid (7 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC71 in 10%~50% yield.

Example 72

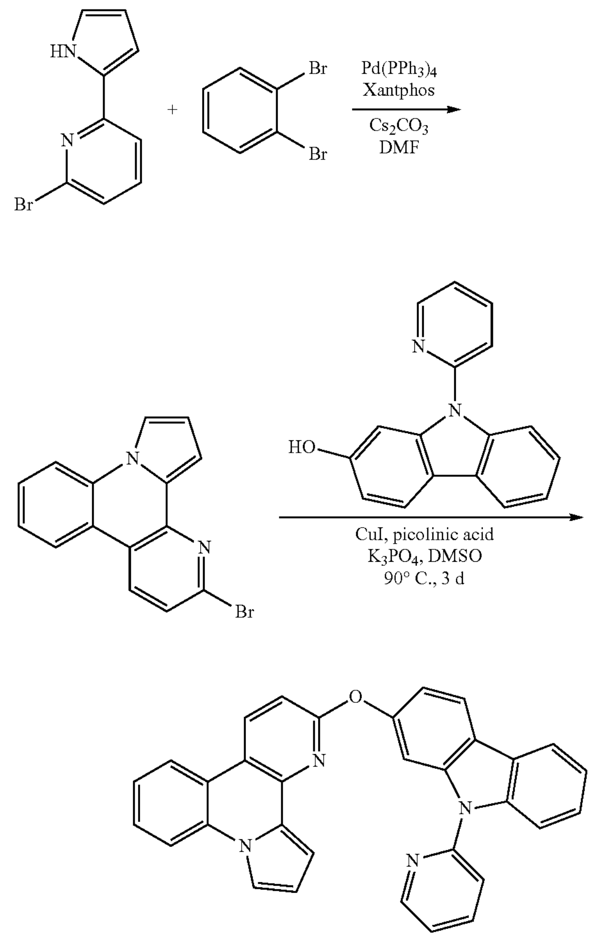

L72

2-bromobenzo[f]pyrrolo[1,2-h][1,7]naphthyridine (0.85 mmol, 1.0 eq), 9-(pyridin-2-yl)-9H-carbazol-2-ol (359 mg, 1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L72 in 20%-70% yield.

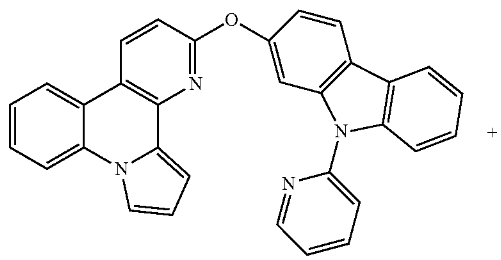

L72

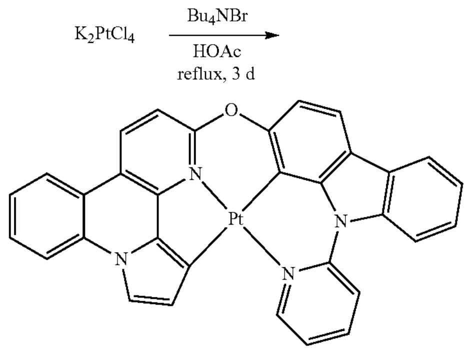

MC72

L72 (0.11 mmol, 1.0 eq), $K_2PtCl_4$ (48 mg, 0.12 mmol, 1.1 eq) and n-$Bu_4NBr$ (3 mg, 0.011 mmol, 0.1 eq) were added to a dry pressure tube, which was taken into a glove box and acetic acid (7 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC72 in 10%~50% yield.

Example 73

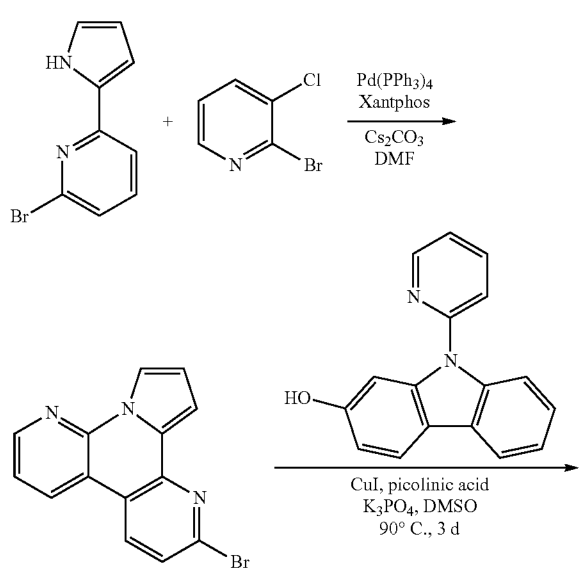

-continued

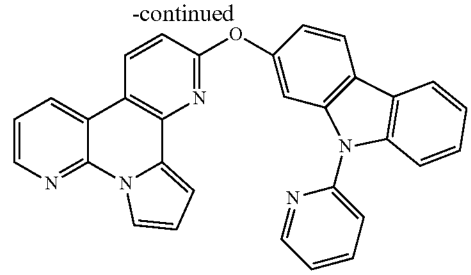

L73

2-bromopyrido[3,2-f]pyrrolo[1,2-h][1,7]naphthyridine (0.85 mmol, 1.0 eq), 9-(pyridin-2-yl)-9H-carbazol-2-ol (359 mg, 1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L73 in 20%-70% yield.

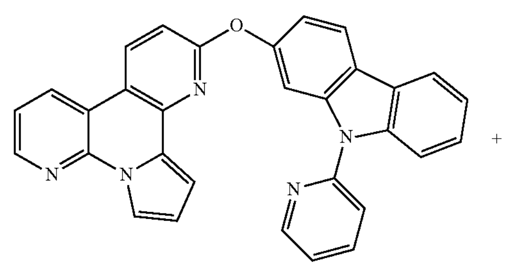

L73

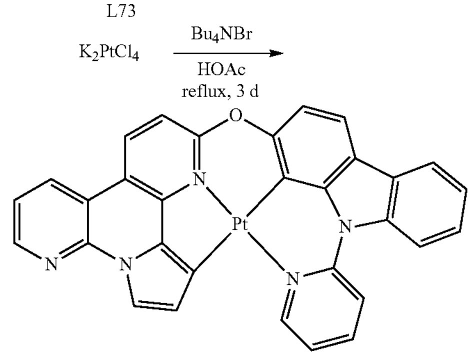

MC73

L73 (0.11 mmol, 1.0 eq), $K_2PtCl_4$ (48 mg, 0.12 mmol, 1.1 eq) and n-$Bu_4NBr$ (3 mg, 0.011 mmol, 0.1 eq) were added to a dry pressure tube, which was taken into a glove box and acetic acid (7 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC73 in 10%~50% yield.

Example 74

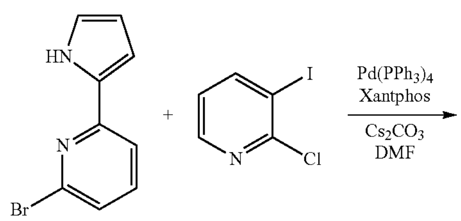

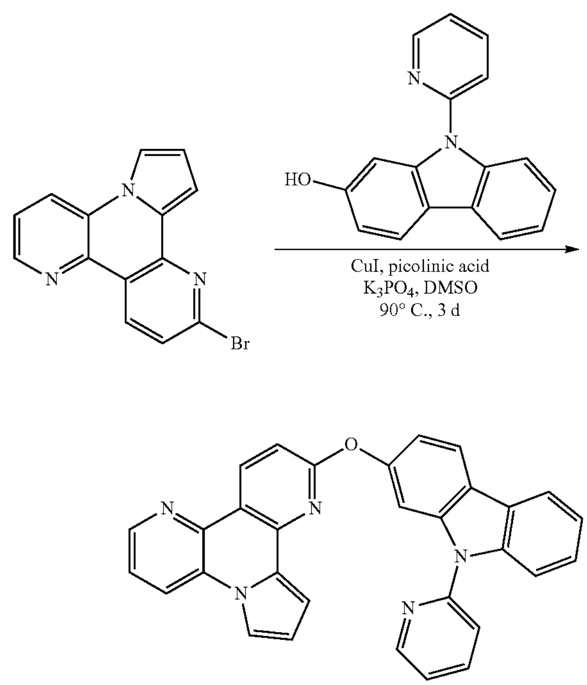

L74

2-bromopyrido[2,3-c]pyrrolo[1,2-a][1,5]naphthyridine (0.85 mmol, 1.0 eq), 9-(pyridin-2-yl)-9H-carbazol-2-ol (359 mg, 1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L74 in 20%-70% yield.

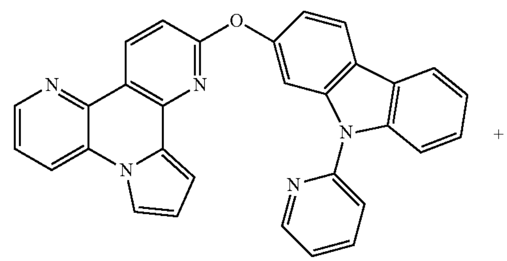

L74

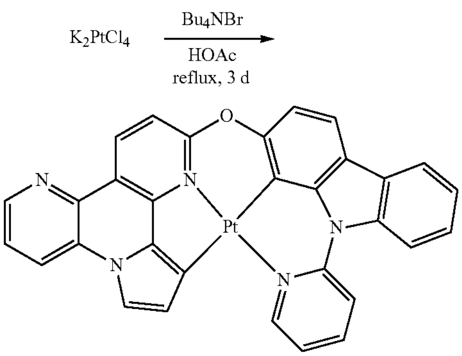

MC74

L74 (0.11 mmol, 1.0 eq), $K_2PtCl_4$ (48 mg, 0.12 mmol, 1.1 eq) and n-$Bu_4NBr$ (3 mg, 0.011 mmol, 0.1 eq) were added to a dry pressure tube, which was taken into a glove box and acetic acid (7 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC74 in 10%~50% yield.

Example 75

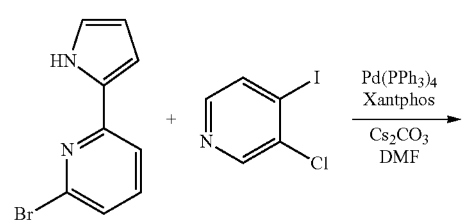

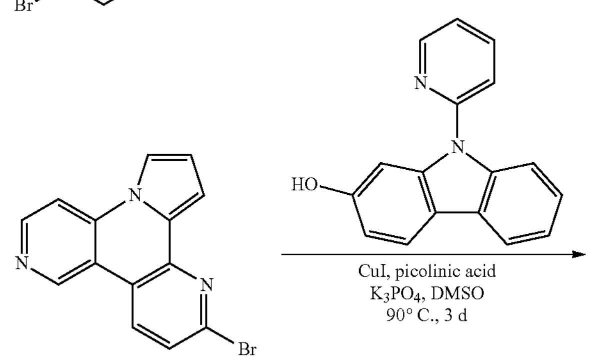

-continued

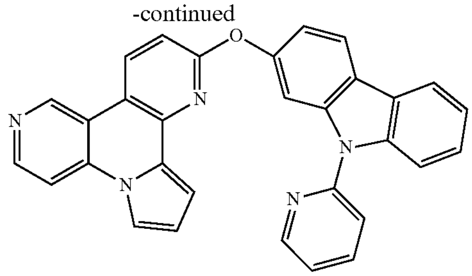

L75

2-bromopyrido[2,3-c]pyrrolo[1,2-a][1,6]naphthyridine (0.85 mmol, 1.0 eq), 9-(pyridin-2-yl)-9H-carbazol-2-ol (359 mg, 1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L75 in 20%-70% yield.

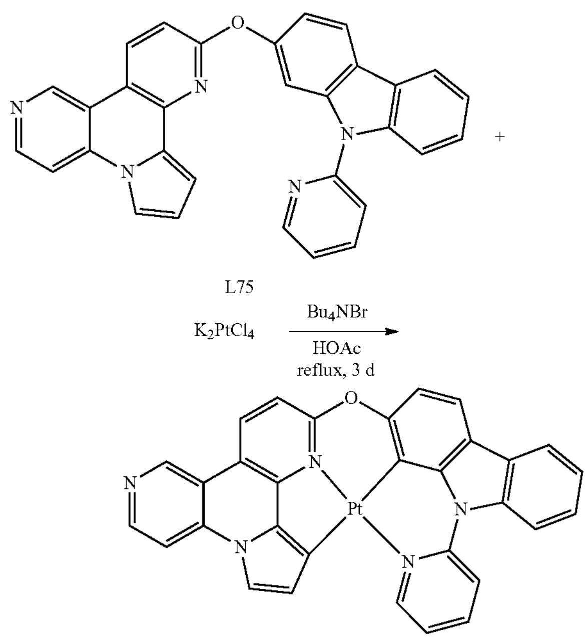

MC75

L75 (0.11 mmol, 1.0 eq), $K_2PtCl_4$ (48 mg, 0.12 mmol, 1.1 eq) and n-$Bu_4NBr$ (3 mg, 0.011 mmol, 0.1 eq) were added to a dry pressure tube, which was taken into a glove box and acetic acid (7 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC75 in 10%~50% yield.

Example 76

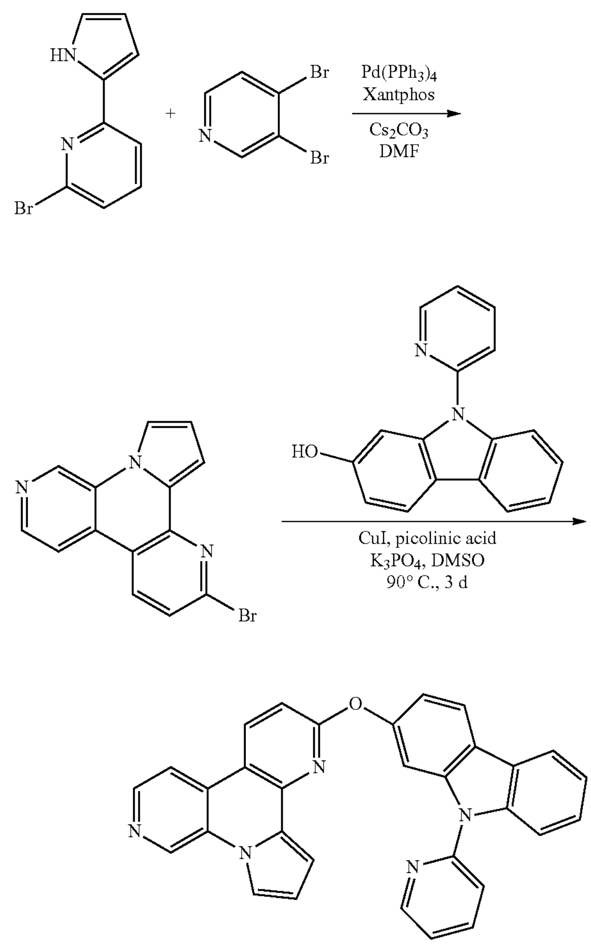

L76

2-bromopyrido[2,3-c]pyrrolo[1,2-a][1,7]naphthyridine (0.85 mmol, 1.0 eq), 9-(pyridin-2-yl)-9H-carbazol-2-ol (359 mg, 1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L76 in 20%-70% yield.

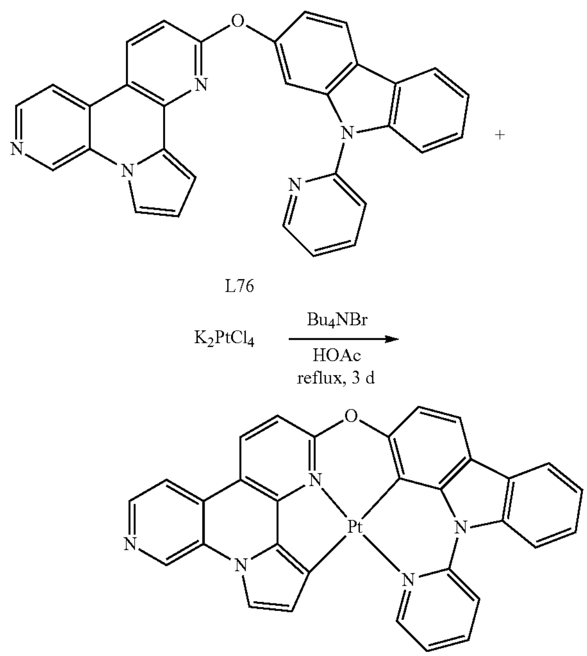

L76

MC76

L76 (0.11 mmol, 1.0 eq), $K_2PtCl_4$ (48 mg, 0.12 mmol, 1.1 eq) and n-$Bu_4NBr$ (3 mg, 0.011 mmol, 0.1 eq) were added to a dry pressure tube, which was taken into a glove box and acetic acid (7 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC76 in 10%~50% yield.

Example 77

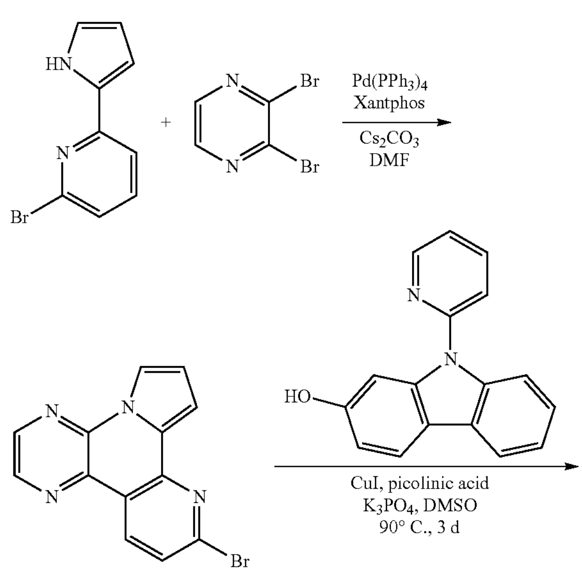

-continued

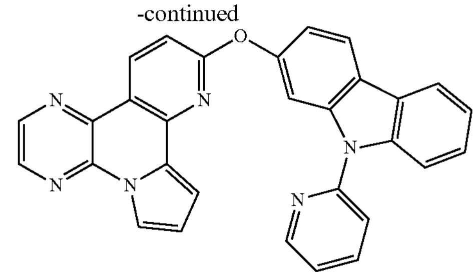

L77

10-bromopyrazino[2,3-f]pyrrolo[1,2-h][1,7]naphthyridine (0.85 mmol, 1.0 eq), 9-(pyridin-2-yl)-9H-carbazol-2-ol (359 mg, 1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L77 in 20%-70% yield.

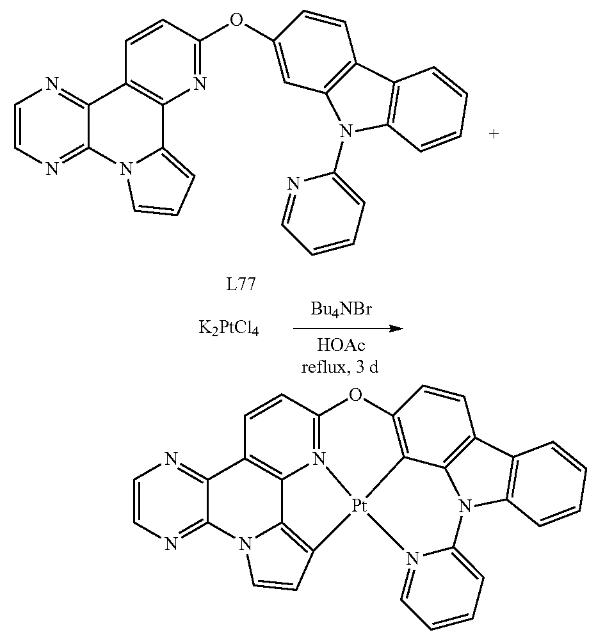

L77

MC77

L77 (0.11 mmol, 1.0 eq), $K_2PtCl_4$ (48 mg, 0.12 mmol, 1.1 eq) and n-$Bu_4NBr$ (3 mg, 0.011 mmol, 0.1 eq) were added to a dry pressure tube, which was taken into a glove box and acetic acid (7 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC77 in 10%~50% yield.

Example 78

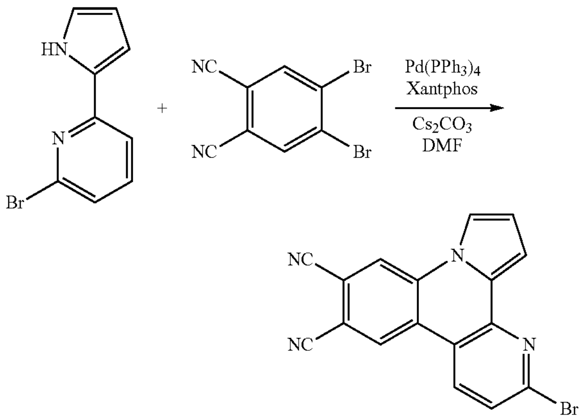

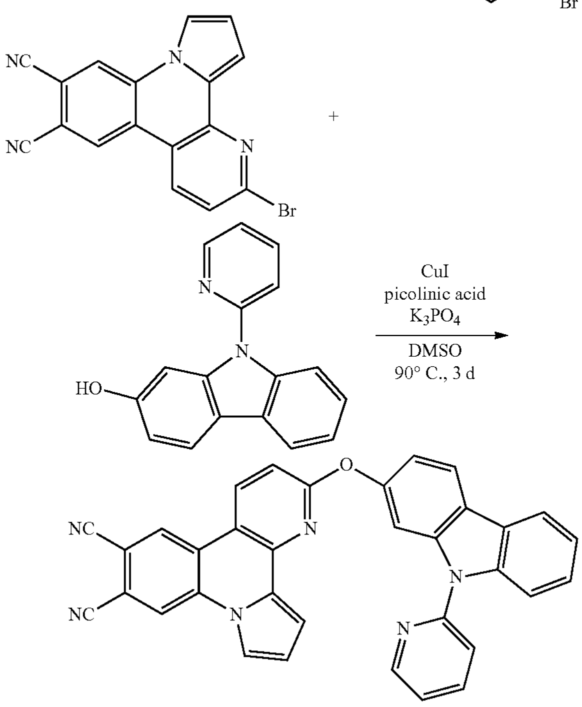

L78

2-bromobenzo[f]pyrrolo[1,2-h][1,7]naphthyridine-6,7-dicarbonitrile (0.85 mmol, 1.0 eq), 9-(pyridin-2-yl)-9H-carbazol-2-ol (359 mg, 1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L78 in 20%-70% yield.

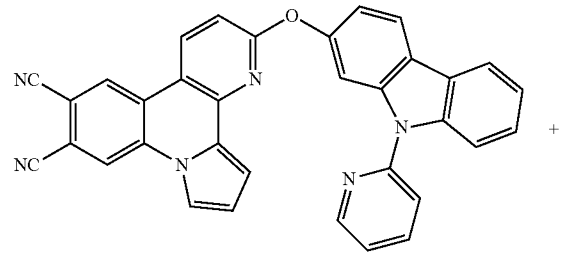

L78

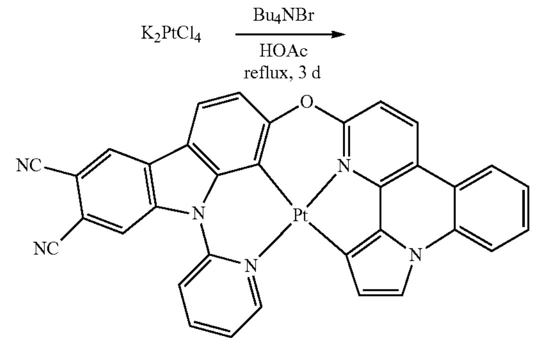

MC78

L78 (0.11 mmol, 1.0 eq), $K_2PtCl_4$ (48 mg, 0.12 mmol, 1.1 eq) and n-$Bu_4NBr$ (3 mg, 0.011 mmol, 0.1 eq) were added to a dry pressure tube, which was taken into a glove box and acetic acid (7 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC78 in 10%~50% yield.

Example 79

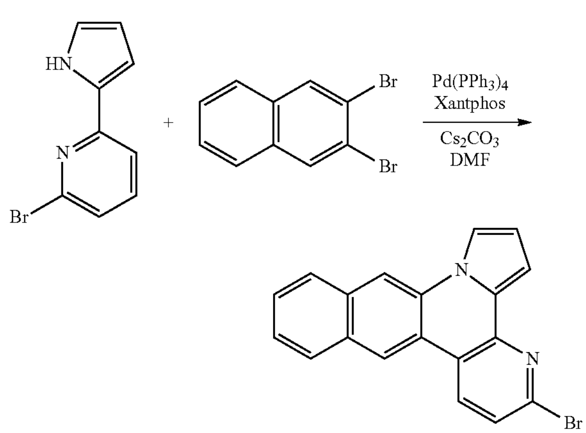

-continued

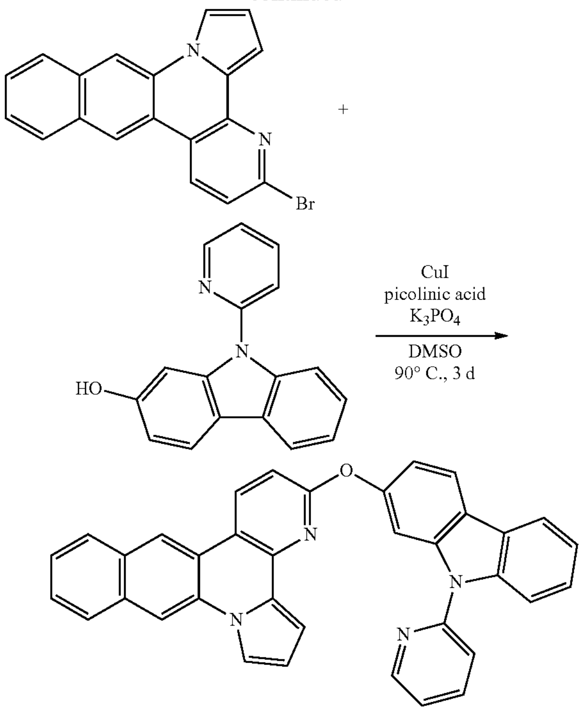

L79

3-bromonaphtho[2,3-f]pyrrolo[1,2-h][1,7]naphthyridine (0.85 mmol, 1.0 eq), 9-(pyridin-2-yl)-9H-carbazol-2-ol (359 mg, 1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L79 in 20%-70% yield.

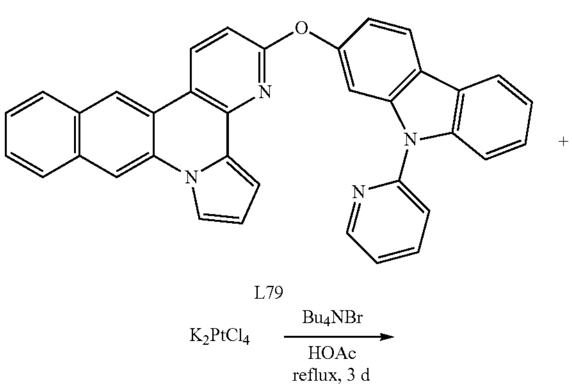

-continued

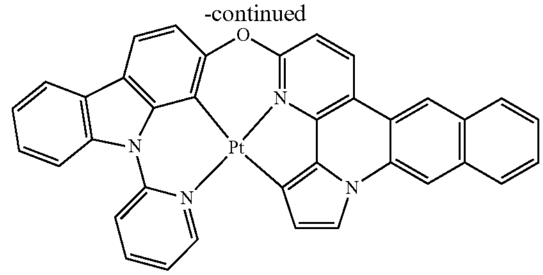

MC79

L79 (0.11 mmol, 1.0 eq), $K_2PtCl_4$ (48 mg, 0.12 mmol, 1.1 eq) and n-$Bu_4NBr$ (3 mg, 0.011 mmol, 0.1 eq) were added to a dry pressure tube, which was taken into a glove box and acetic acid (7 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC79 in 10%~50% yield.

Example 80

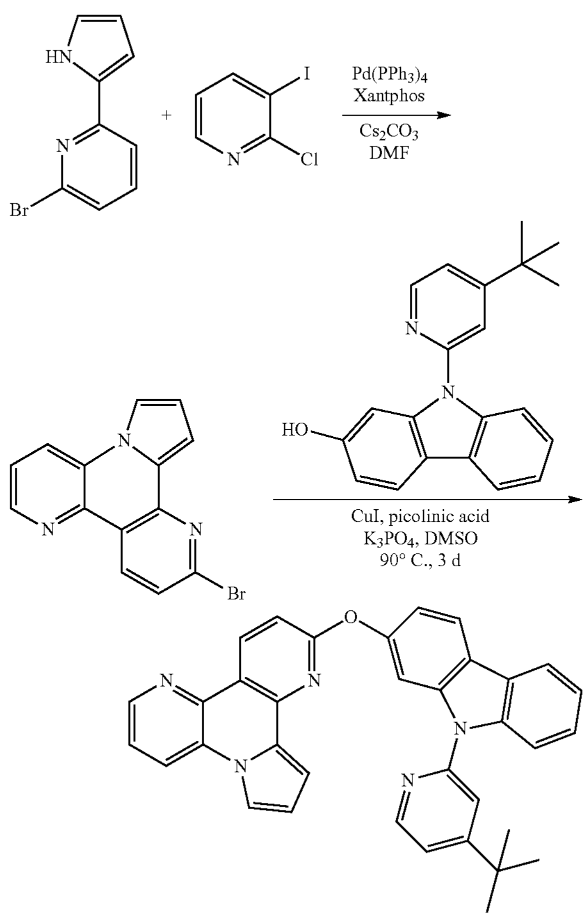

L80

2-bromopyrido[2,3-c]pyrrolo[1,2-a][1,5]naphthyridine (0.85 mmol, 1.0 eq), 9-(4-(tert-butyl)pyridin-2-yl)-9H-carbazol-2-ol (359 mg, 1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L80 in 20%-70% yield.

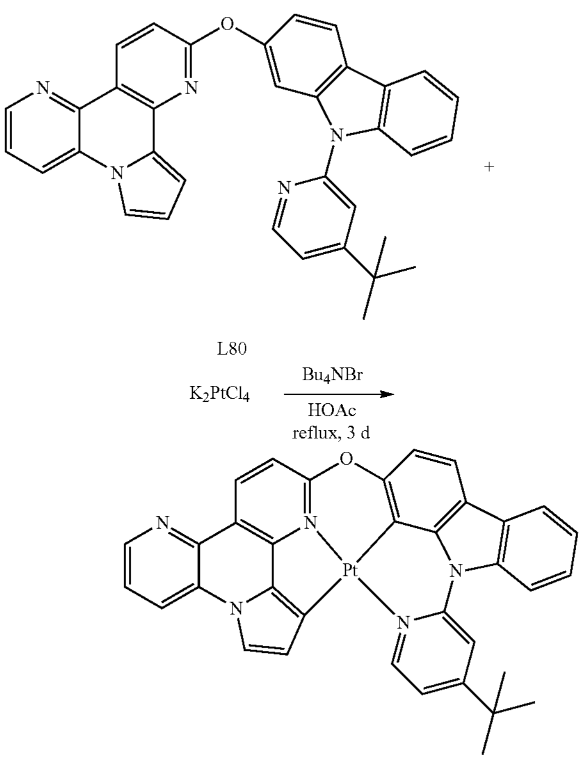

L80 (0.11 mmol, 1.0 eq), $K_2PtCl_4$ (48 mg, 0.12 mmol, 1.1 eq) and n-$Bu_4NBr$ (3 mg, 0.011 mmol, 0.1 eq) were added to a dry pressure tube, which was taken into a glove box and acetic acid (7 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC80 in 10%~50% yield.

Example 81

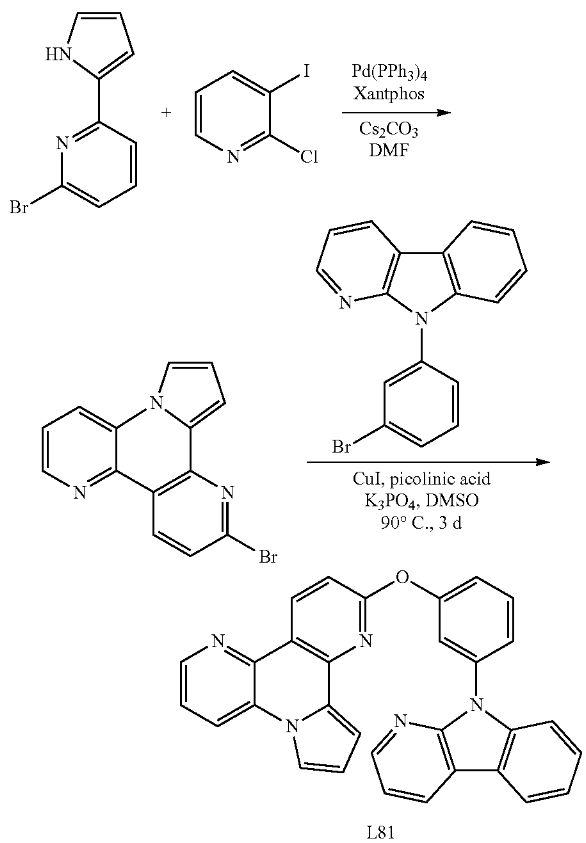

2-bromopyrido[2,3-c]pyrrolo[1,2-a][1,5]naphthyridine (0.85 mmol, 1.0 eq), 9-(3-bromophenyl)-9H-pyrido[2,3-b]indole (359 mg, 1.10 mmol, 1.3 eq), CuI (32 mg, 0.17 mmol, 0.2 eq), picolinic acid (21 mg, 0.17 mmol, 0.2 eq) and $K_3PO_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L81 in 20%-70% yield.

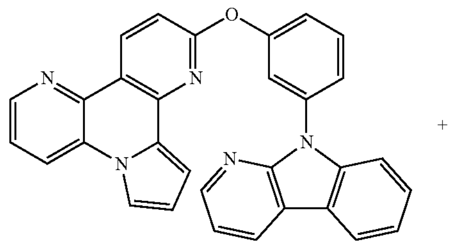

L81

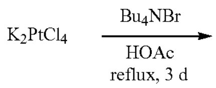

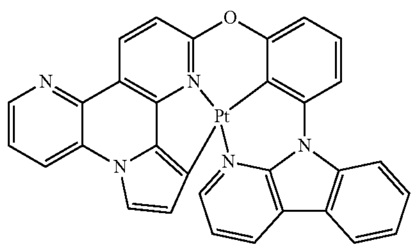

MC81

L81 (0.11 mmol, 1.0 eq), $K_2PtCl_4$ (48 mg, 0.12 mmol, 1.1 eq) and n-$Bu_4NBr$ (3 mg, 0.011 mmol, 0.1 eq) were added to a dry pressure tube, which was taken into a glove box and acetic acid (7 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC81 in 10%~50% yield.

Example 82

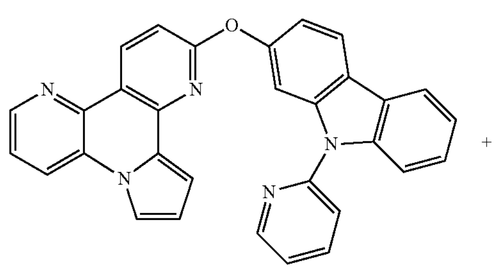

L74

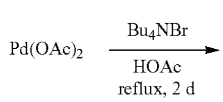

-continued

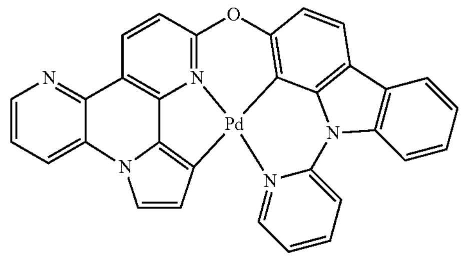

MC82

L74 (0.11 mmol, 1.0 eq), $Pd(OAc)_2$ (0.12 mmol, 1.1 eq) and n-$Bu_4NBr$ (3 mg, 0.011 mmol, 0.1 eq) were added to a dry pressure tube, which was taken into a glove box and acetic acid (7 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product MC82 in 10%~50% yield.

Example 83

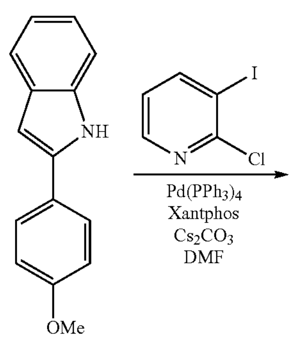

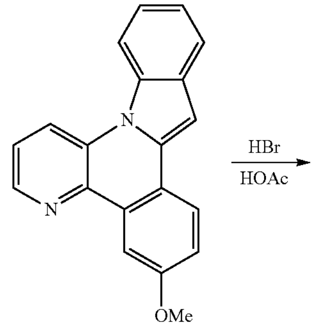

-continued

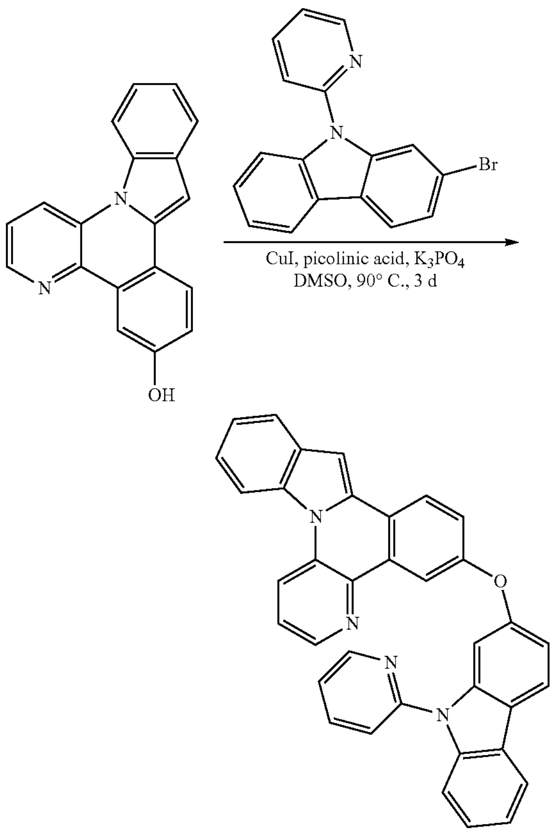

L83

Benzo[c]indolo[1,2-a][1,5]naphthyridin-6-ol (1 mmol, 1.0 eq), 2-bromo-9-(pyridin-2-yl)-9H-carbazole (388 mg, 1.2 mmol, 1.2 eq), CuI (38 mg, 0.2 mmol, 0.2 eq), picolinic acid (49 mg, 0.4 mmol, 0.4 eq) and $K_3PO_4$ (425 mg, 2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate (2:1) as eluent to obtain the desired product ligand L83 as a white solid in 65% yield.

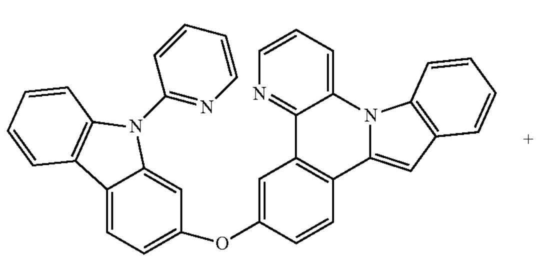

L83

-continued

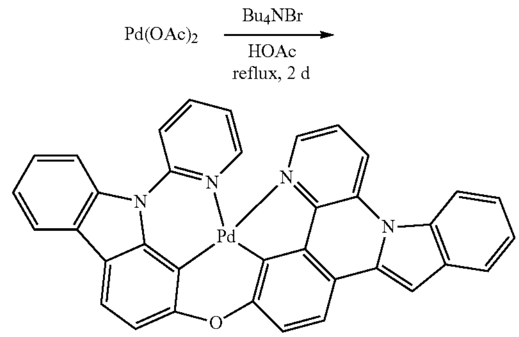

MC83

L83 (0.20 mmol, 1.0 eq), $Pd(OAc)_2$ (54 mg, 0.24 mmol, 1.2 eq) and n-$Bu_4NBr$ (6.5 mg, 0.02 mmol, 0.1 eq) were added to a dry pressure tube was then taken into a glove box and acetic acid (10 mL) was added. The mixture was bubbled with nitrogen for 30 minutes and then the tube was sealed. Then the mixture was heated to reflux in an oil bath and stirred for 2 days, cooled to ambient temperature and removed the solvent. Then the solid was purified through column chromatography on silica gel using dichloromethane as eluent to obtain to obtain the desired product MC83 as a white solid in 35% yield.

Example 84

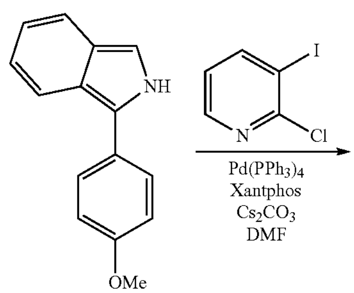

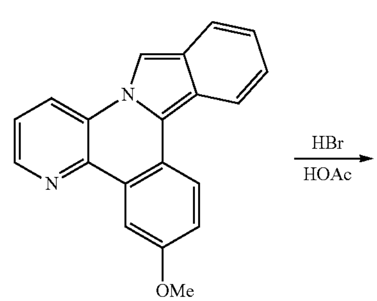

-continued

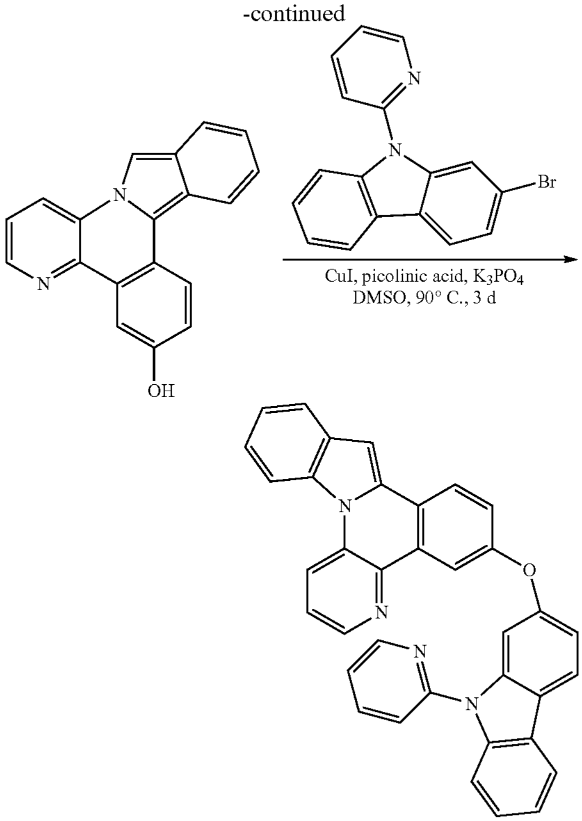

L84

Benzo[c]isoindolo[2,1-a][1,5]naphthyridin-6-ol (1 mmol, 1.0 eq), 2-bromo-9-(pyridin-2-yl)-9H-carbazole (388 mg, 1.2 mmol, 1.2 eq), CuI (38 mg, 0.2 mmol, 0.2 eq), picolinic acid (49 mg, 0.4 mmol, 0.4 eq) and $K_3PO_4$ (425 mg, 2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate (2:1) as eluent to obtain the desired product ligand L84 as a white solid in 65% yield.

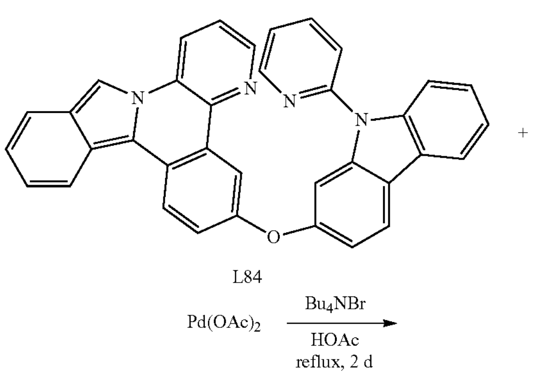

-continued

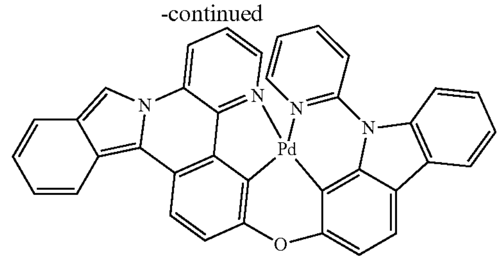

MC84

L84 (0.20 mmol, 1.0 eq), $Pd(OAc)_2$ (54 mg, 0.24 mmol, 1.2 eq) and n-$Bu_4NBr$ (6.5 mg, 0.02 mmol, 0.1 eq) were added to a dry pressure tube was then taken into a glove box and acetic acid (10 mL) was added. The mixture was bubbled with nitrogen for 30 minutes and then the tube was sealed. Then the mixture was heated to reflux in an oil bath and stirred for 2 days, cooled to ambient temperature and removed the solvent. Then the solid was purified through column chromatography on silica gel using dichloromethane as eluent to obtain to obtain the desired product MC84 as a white solid in 35% yield.

Example 85

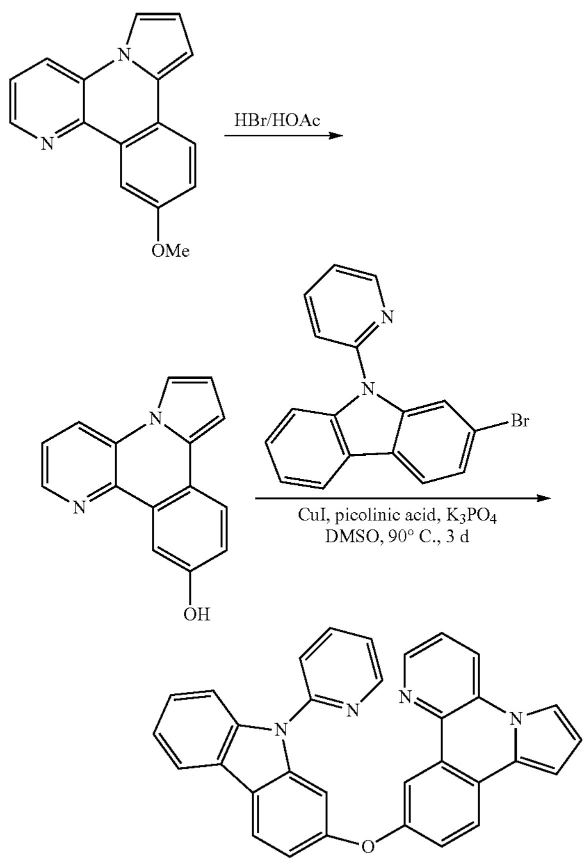

L85

Benzo[c]pyrrolo[1,2-a][1,5]naphthyridin-11-ol (1 mmol, 1.0 eq), 2-bromo-9-(pyridin-2-yl)-9H-carbazole (388 mg, 1.2 mmol, 1.2 eq), CuI (38 mg, 0.2 mmol, 0.2 eq), picolinic acid (49 mg, 0.4 mmol, 0.4 eq) and $K_3PO_4$ (425 mg, 2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate (2:1) as eluent to obtain the desired product ligand L85 as a white solid in 65% yield.

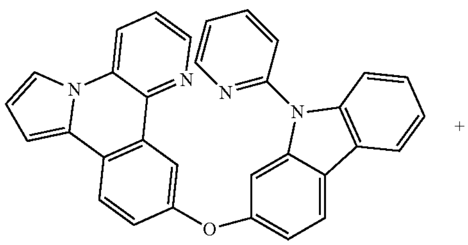

L85

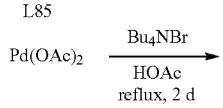

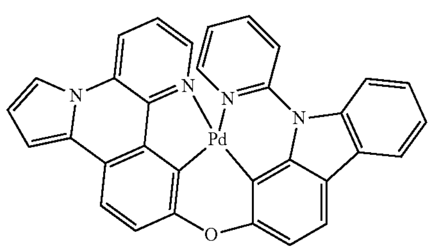

MC85

L85 (0.20 mmol, 1.0 eq), $Pd(OAc)_2$ (54 mg, 0.24 mmol, 1.2 eq) and n-$Bu_4NBr$ (6.5 mg, 0.02 mmol, 0.1 eq) were added to a dry pressure tube was then taken into a glove box and acetic acid (10 mL) was added. The mixture was bubbled with nitrogen for 30 minutes and then the tube was sealed. Then the mixture was heated to reflux in an oil bath and stirred for 2 days, cooled to ambient temperature and removed the solvent. Then the solid was purified through column chromatography on silica gel using dichloromethane as eluent to obtain to obtain the desired product MC85 as a white solid in 35% yield.

Example 86

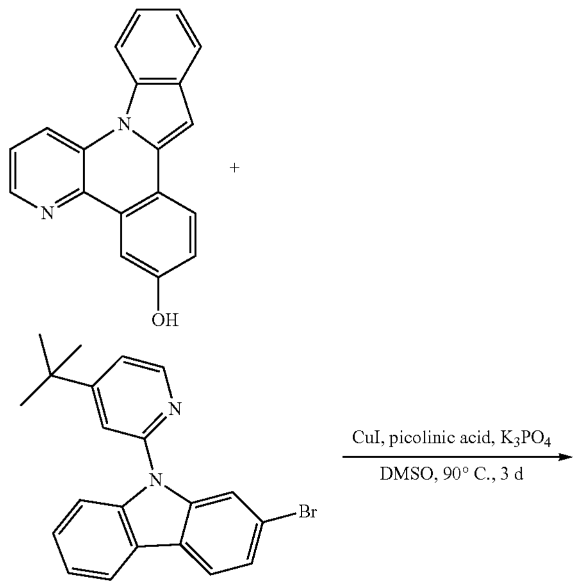

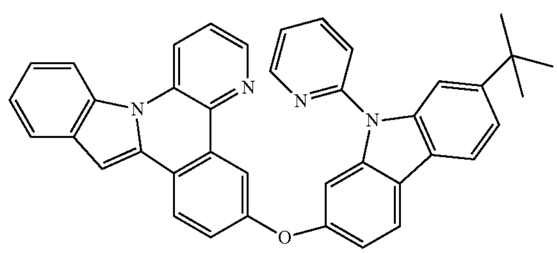

L86

Benzo[c]indolo[1,2-a][1,5]naphthyridin-6-ol (1 mmol, 1.0 eq), 2-bromo-9-(4-(tert-butyl)pyridin-2-yl)-9H-carbazole (1.2 mmol, 1.2 eq), CuI (38 mg, 0.2 mmol, 0.2 eq), picolinic acid (49 mg, 0.4 mmol, 0.4 eq) and $K_3PO_4$ (425 mg, 2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate (2:1) as eluent to obtain the desired product ligand L86 as a white solid in 65% yield.

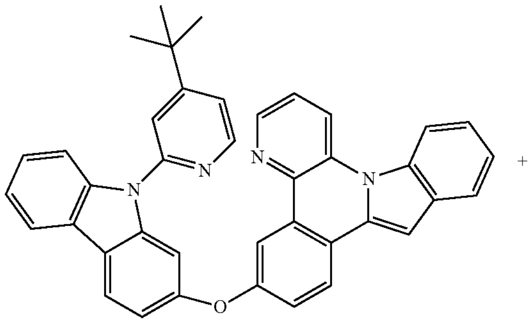

L86

$Pd(OAc)_2$ — $Bu_4NBr$, HOAc, reflux, 2 d →

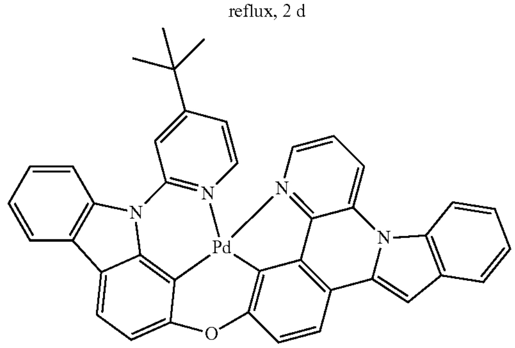

MC86

L86 (0.20 mmol, 1.0 eq), $Pd(OAc)_2$ (54 mg, 0.24 mmol, 1.2 eq) and n-$Bu_4NBr$ (6.5 mg, 0.02 mmol, 0.1 eq) were added to a dry pressure tube was then taken into a glove box and acetic acid (10 mL) was added. The mixture was bubbled with nitrogen for 30 minutes and then the tube was sealed. Then the mixture was heated to reflux in an oil bath and stirred for 2 days, cooled to ambient temperature and removed the solvent. Then the solid was purified through column chromatography on silica gel using dichloromethane as eluent to obtain to obtain the desired product MC86 as a white solid in 35% yield.

Example 87

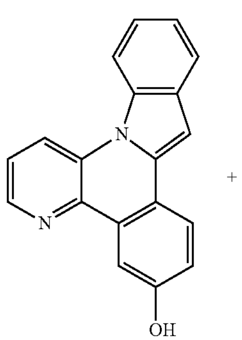

-continued

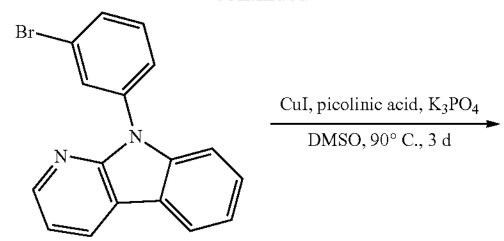

CuI, picolinic acid, $K_3PO_4$ / DMSO, 90° C., 3 d

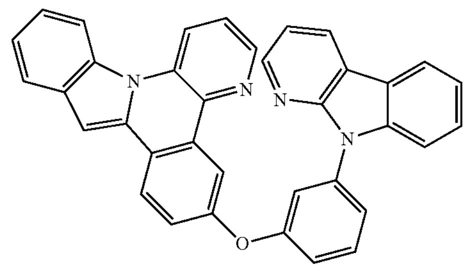

L87

Benzo[c]indolo[1,2-a][1,5]naphthyridin-6-ol (1 mmol, 1.0 eq), 9-(3-bromophenyl)-9H-pyrido[2,3-b]indole (388 mg, 1.2 mmol, 1.2 eq), CuI (38 mg, 0.2 mmol, 0.2 eq), picolinic acid (49 mg, 0.4 mmol, 0.4 eq) and $K_3PO_4$ (425 mg, 2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate (2:1) as eluent to obtain the desired product ligand L87 as a white solid in 65% yield.

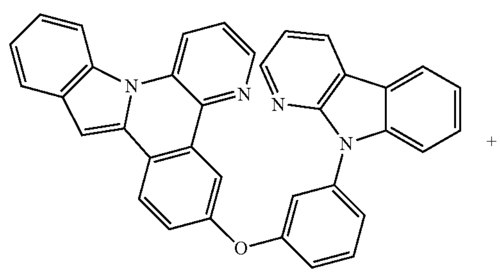

L87

$Pd(OAc)_2$ — $Bu_4NBr$, HOAc, reflux, 2 d →

-continued

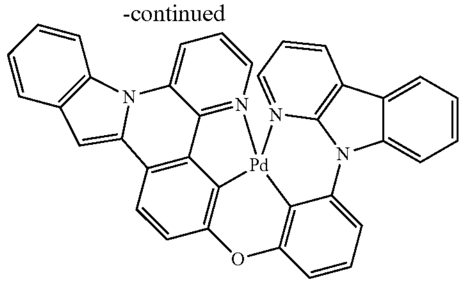

MC87

L87 (0.20 mmol, 1.0 eq), $Pd(OAc)_2$ (54 mg, 0.24 mmol, 1.2 eq) and $n\text{-}Bu_4NBr$ (6.5 mg, 0.02 mmol, 0.1 eq) were added to a dry pressure tube was then taken into a glove box and acetic acid (10 mL) was added. The mixture was bubbled with nitrogen for 30 minutes and then the tube was sealed. Then the mixture was heated to reflux in an oil bath and stirred for 2 days, cooled to ambient temperature and removed the solvent. Then the solid was purified through column chromatography on silica gel using dichloromethane as eluent to obtain to obtain the desired product MC87 as a white solid in 35% yield.

Example 88

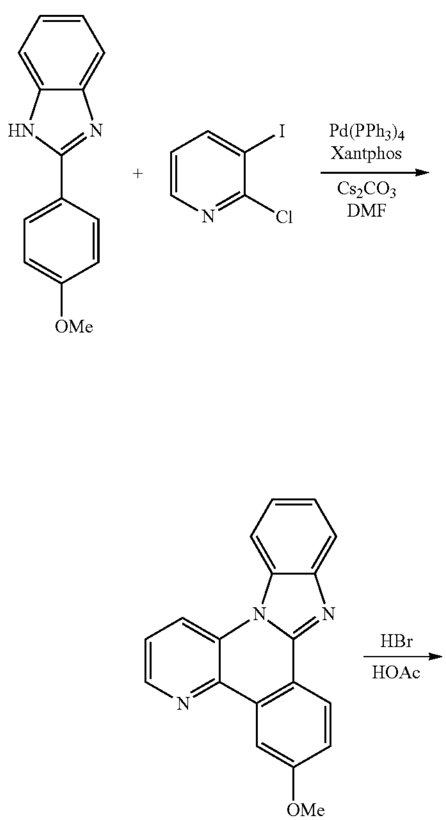

-continued

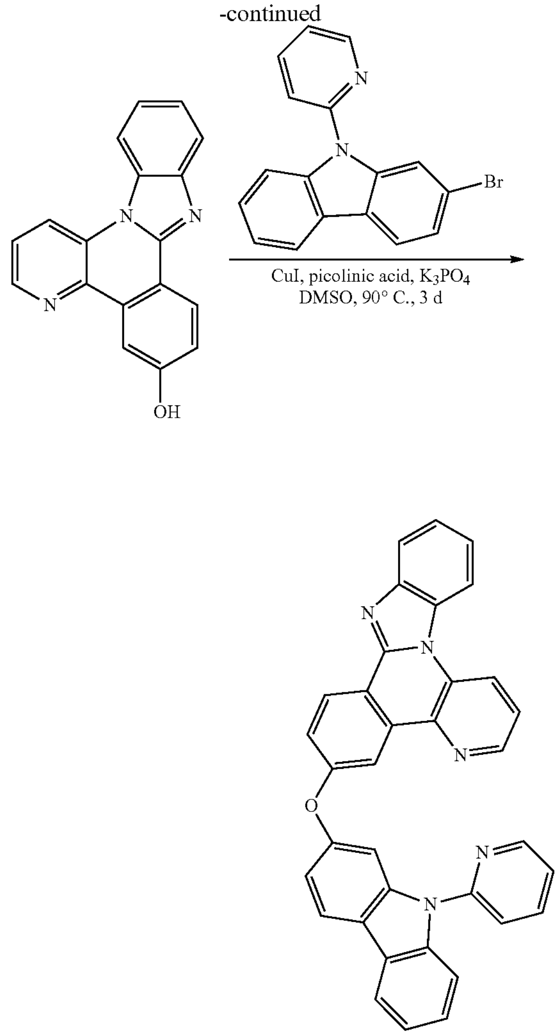

L88

Benzo[c]benzo[4,5]imidazo[1,2-a][1,5]naphthyridin-6-ol (114 mg, 0.4 mmol, 1.0 eq), 2-bromo-9-(pyridin-2-yl)-9H-carbazole (156 mg, 0.48 mmol, 1.2 eq), CuI (15 mg, 0.08 mmol, 0.2 eq), picolinic acid (10 mg, 0.08 mmol, 0.2 eq) and $K_3PO_4$ (170 mg, 0.8 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (5 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L88 as an orange yellow solid 92 mg in 44% yield.

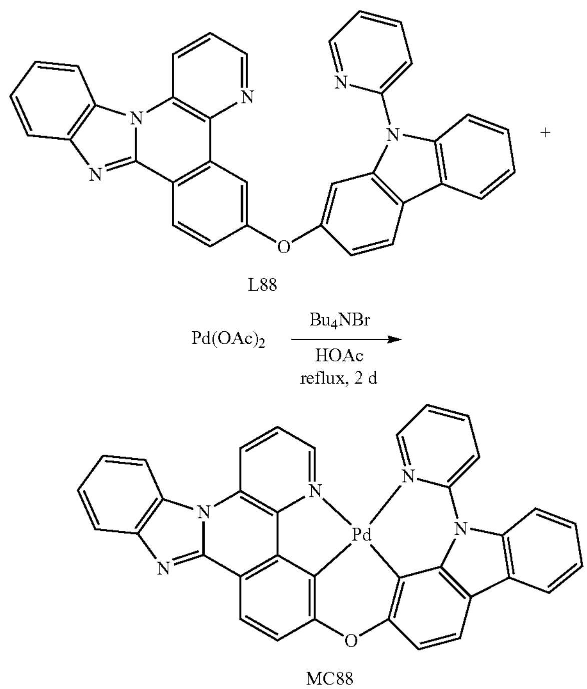

L88 (52 mg, 0.09 mmol, 1.0 eq), $Pd(OAc)_2$ (23 mg, 0.10 mmol, 1.1 eq) and n-$Bu_4NBr$ (3 mg, 0.01 mmol, 0.1 eq) were added to a dry pressure tube, which was taken into a glove box and acetic acid (10 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product MC88 in 10%~50% yield.

Example 89

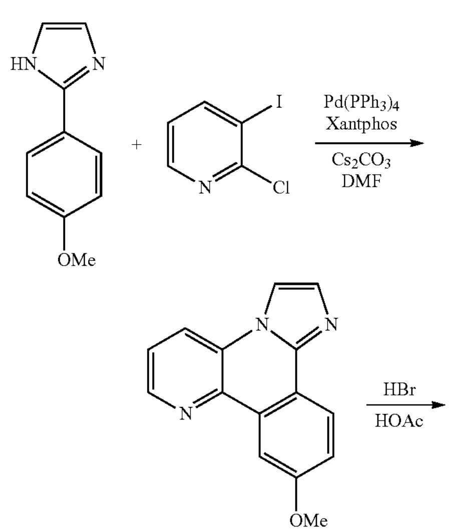

-continued

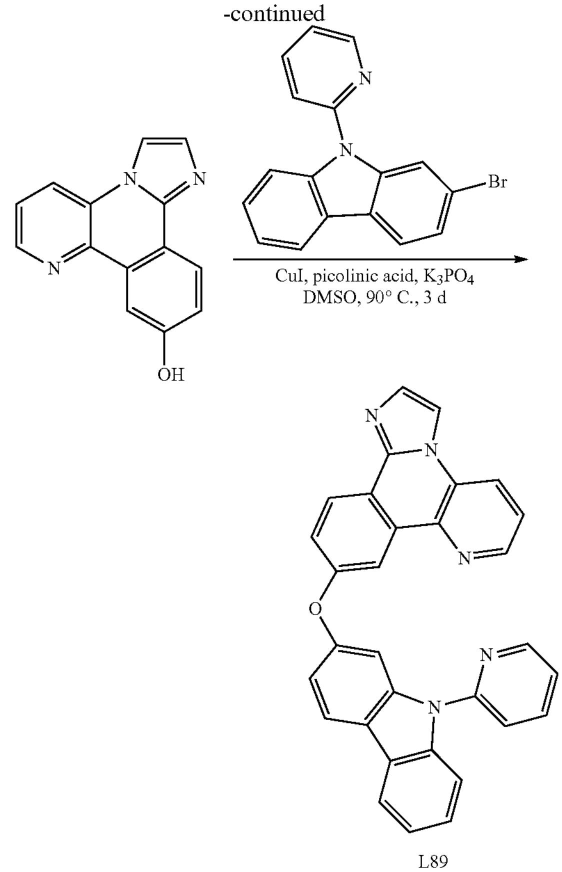

Benzo[c]imidazo[1,2-a][1,5]naphthyridin-10-ol (0.4 mmol, 1.0 eq), 2-bromo-9-(pyridin-2-yl)-9H-carbazole (156 mg, 0.48 mmol, 1.2 eq), CuI (15 mg, 0.08 mmol, 0.2 eq), picolinic acid (10 mg, 0.08 mmol, 0.2 eq) and $K_3PO_4$ (170 mg, 0.8 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (5 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L89 in 30%~70% yield.

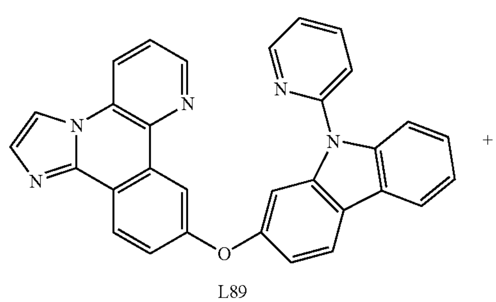

-continued

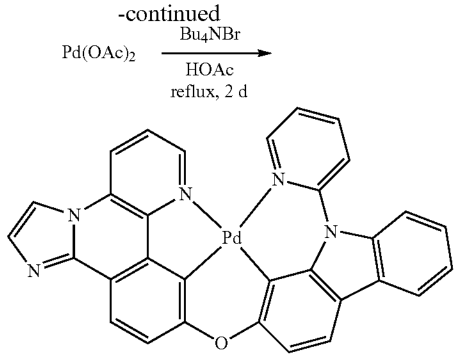

MC89

L89 (0.09 mmol, 1.0 eq), $Pd(OAc)_2$ (23 mg, 0.10 mmol, 1.1 eq) and n-$Bu_4NBr$ (3 mg, 0.01 mmol, 0.1 eq) were added to a dry pressure tube, which was taken into a glove box and acetic acid (10 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product MC89 in 10%~50% yield.

Example 90

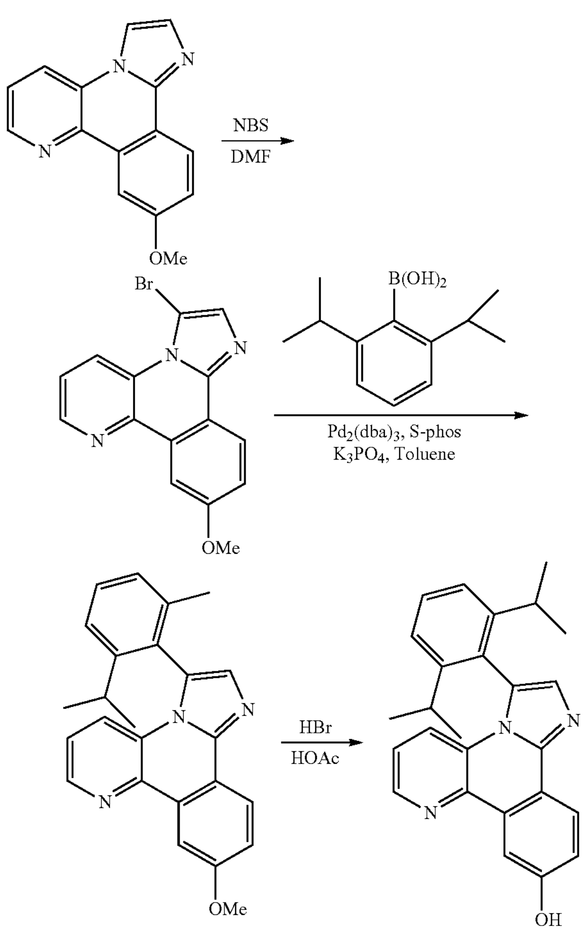

-continued

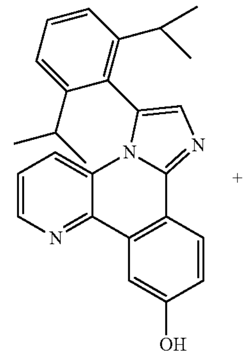

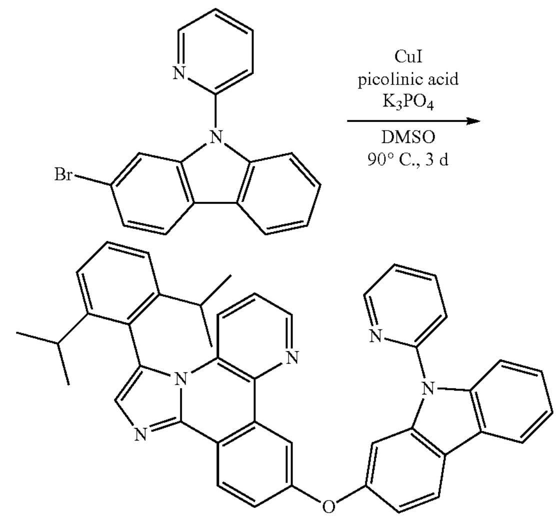

L90

3-(2,6-diisopropylphenyl)benzo[c]imidazo[1,2-a][1,5]naphthyridin-10-ol (0.4 mmol, 1.0 eq), 2-bromo-9-(pyridin-2-yl)-9H-carbazole (156 mg, 0.48 mmol, 1.2 eq), CuI (15 mg, 0.08 mmol, 0.2 eq), picolinic acid (10 mg, 0.08 mmol, 0.2 eq) and $K_3PO_4$ (170 mg, 0.8 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (5 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L90 in 30%~70% yield.

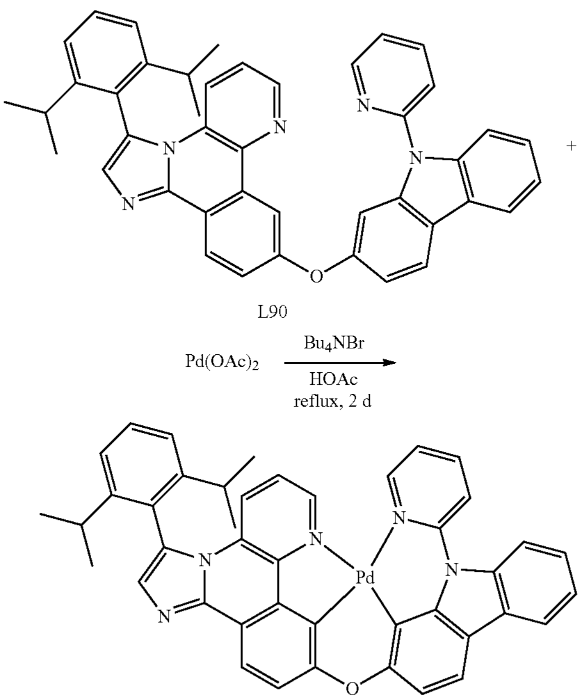

L90

MC90

L90 (0.09 mmol, 1.0 eq), Pd(OAc)$_2$ (23 mg, 0.10 mmol, 1.1 eq) and n-Bu$_4$NBr (3 mg, 0.01 mmol, 0.1 eq) were added to a dry pressure tube, which was taken into a glove box and acetic acid (10 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product MC90 in 10%~50% yield.

Example 91

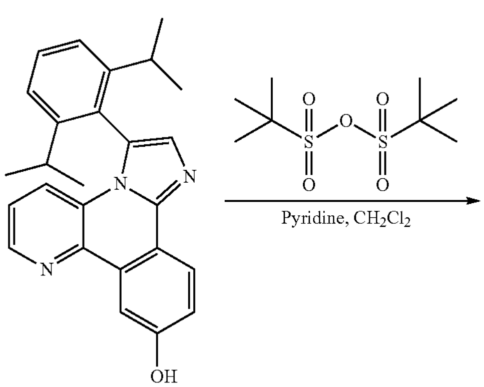

-continued

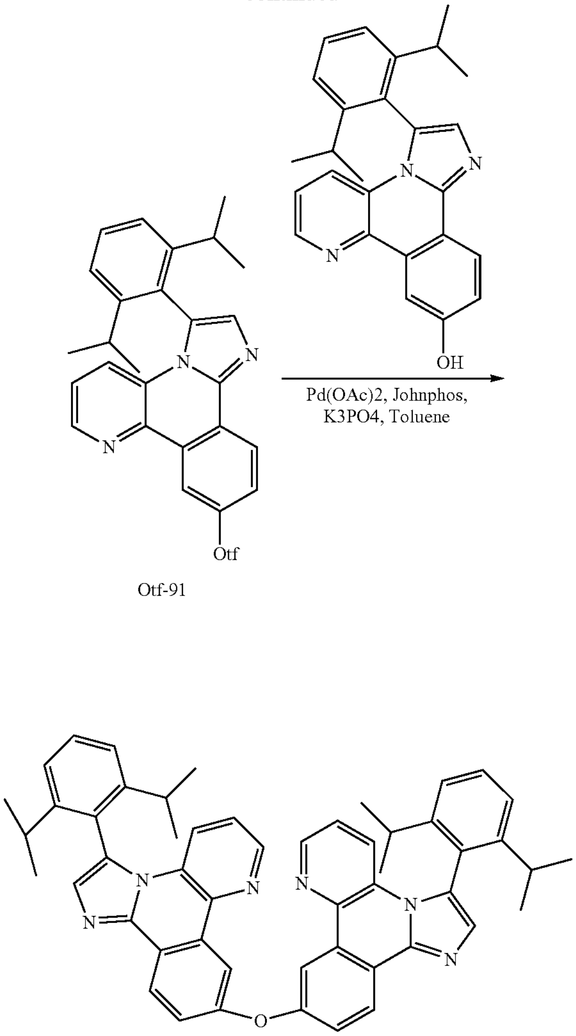

Otf-91

L91

Otf-91 (0.85 mmol, 1.0 eq), 3-(2,6-diisopropylphenyl) benzo[c]imidazo[1,2-a][1,5]naphthyridin-10-ol (1.10 mmol, 1.3 eq), CuI (32 mg, 0.17 mmol, 0.2 eq), picolinic acid (21 mg, 0.17 mmol, 0.2 eq) and K$_3$PO$_4$ (356 mg, 1.7 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L91 in 30%~70% yield.

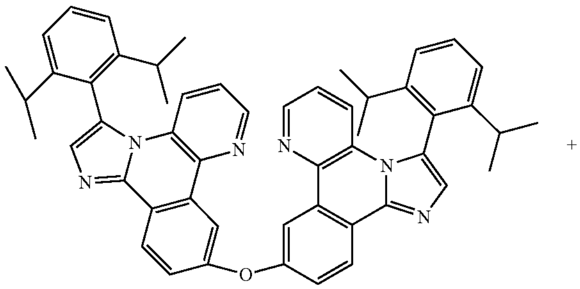

L91

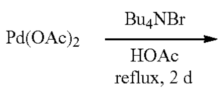

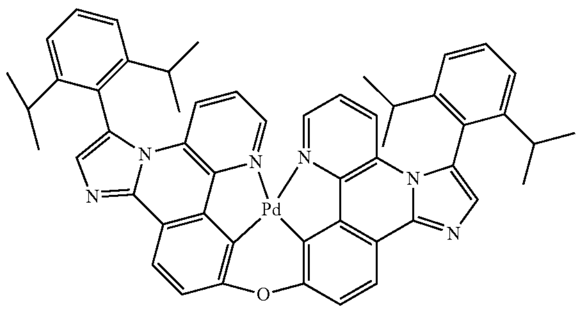

MC91

L91 (0.11 mmol, 1.0 eq), $K_2PtCl_4$ (48 mg, 0.12 mmol, 1.1 eq) and n-$Bu_4NBr$ (3 mg, 0.011 mmol, 0.1 eq) were added to a dry pressure tube, which was taken into a glove box and acetic acid (7 mL) was added. The mixture was bubbled with nitrogen for 30 minutes and then the tube was sealed. Then the mixture was heated to reflux in an oil bath and stirred for 3 days, cooled to ambient temperature and the solvent removed. Then the solid was purified through column chromatography on silica gel using dichloromethane as eluent to obtain the desired product MC91 in 10%~50% yield.

Examples of General Formulas XIV-XVII

Example 92

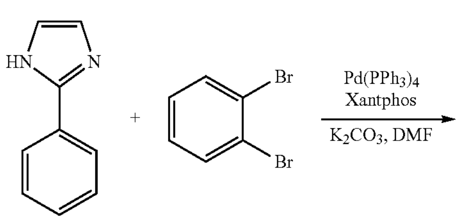

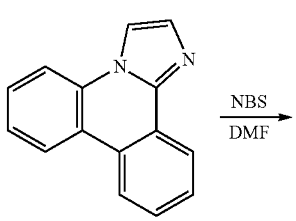

-continued

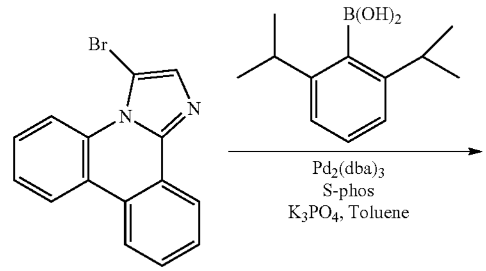

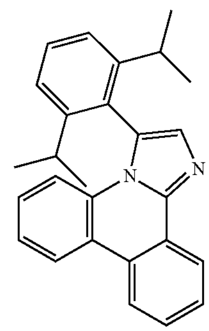

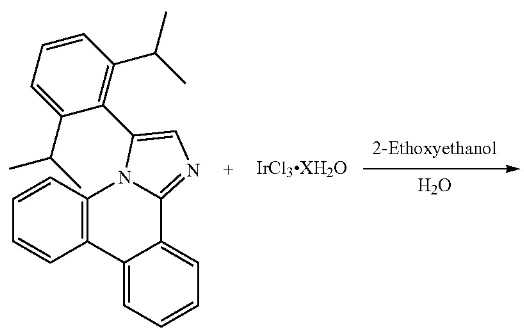

IrL1

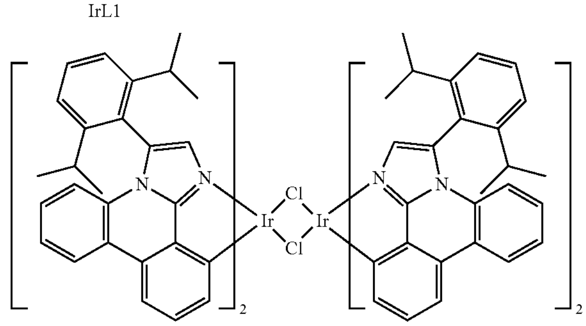

D1

IrL1 (2.2 mmol, 2.2 eq) and $IrCl_3 \cdot XH_2O$ (1.0 mmol, 1.0 eq) were added to a dry Schlenck tube equipped with a magnetic stir bar. The tube was evacuated and backfilled with nitrogen. The evacuation and backfill procedure was repeated for a total of three times. Then 2-ethoxyethanol (30 mL) and $H_2O$ (10 mL) were added under the protection of nitrogen. The mixture was stirred in an oil bath at a temperature of 110° C. overnight and then cooled down to ambient temperature. The precipitate was filtered and washed with methanol several times to obtain the desired product chlorodimer D1 in 40%~80% yield.

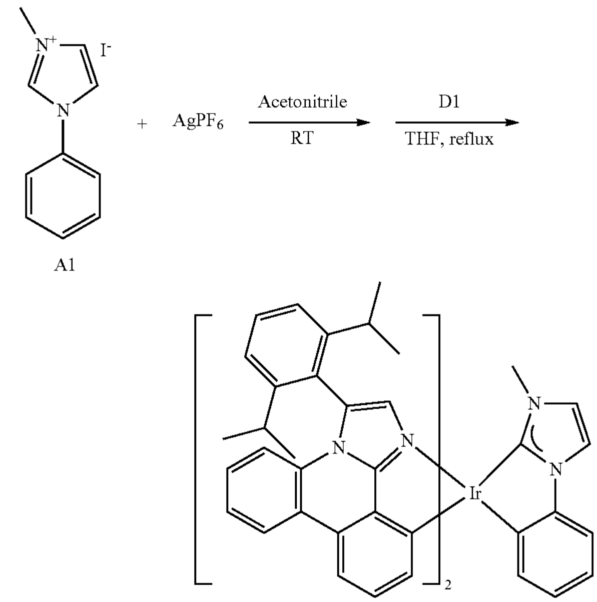

A1

IrC1

A mixture of ancillary ligand A1 (1.5 mmol, 1.5 eq) and $AgPF_6$ (0.75 mmol, 0.75 eq) was stirred in a solution of 100 mL of acetonitrile at room temperature for 24 h. The solvent was evaporated to dryness under reduced pressure. Then chlorodimer D1 (1.0 mmol, 1.0 eq) and 150 mL of THF were added. The reaction mixture was heated to reflux for 24 h. Then the mixture was cooled to room temperature, and the precipitate was filtered off. The filtrate was evaporated to dryness under reduced pressure, and then purified by column chromatography to obtain the emitter IrC1 in 20%~60% yield.

Example 93

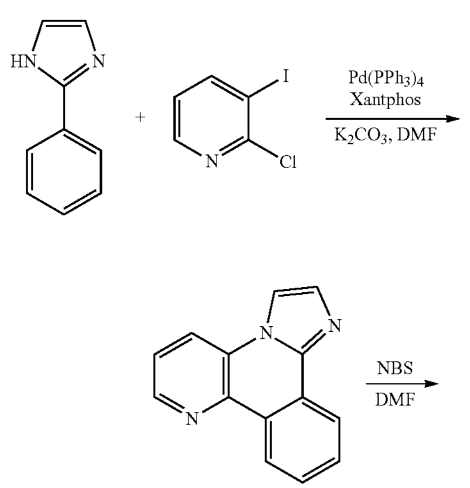

-continued

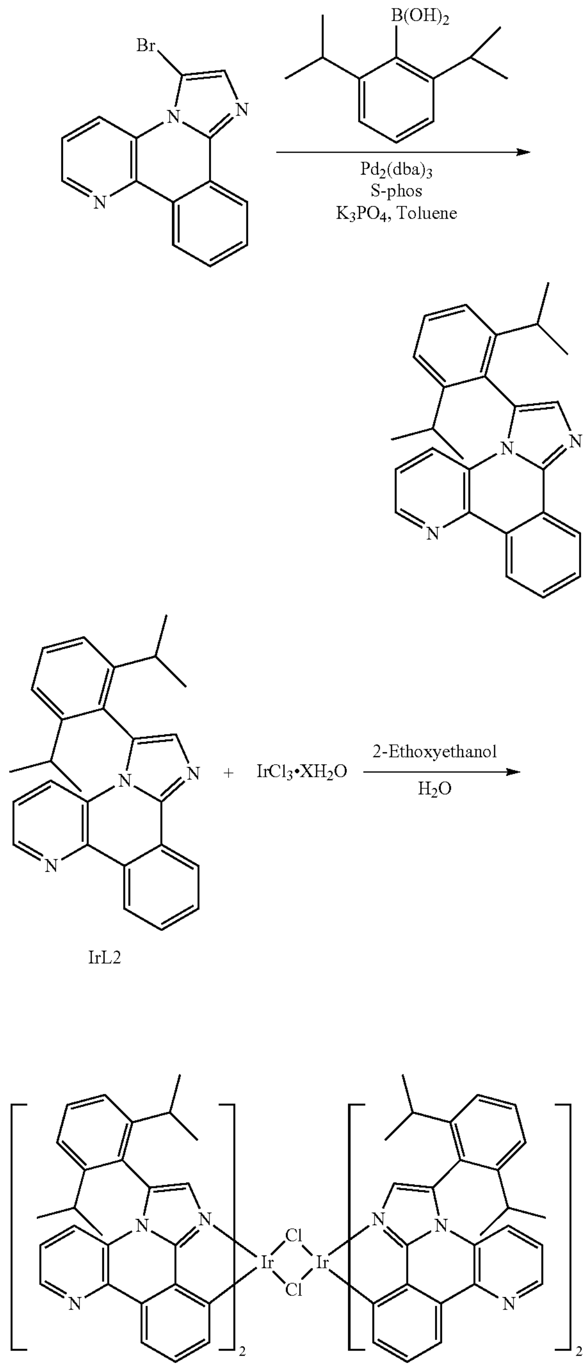

IrL2

D2

IrL2 (2.2 mmol, 2.2 eq) and $IrCl_3{\cdot}XH_2O$ (1.0 mmol, 1.0 eq) were added to a dry Shlenck tube equipped with a magnetic stir bar. The tube was evacuated and backfilled with nitrogen. The evacuation and backfill procedure was repeated for a total of three times. Then 2-ethoxyethanol (30 mL) and $H_2O$ (10 mL) were added under the protection of nitrogen. The mixture was stirred in an oil bath at a temperature of 110° C. overnight and then cooled down to ambient temperature. The precipitate was filtered and washed with methanol several times to obtain the desired product chlorodimer D2 in 40%~80% yield.

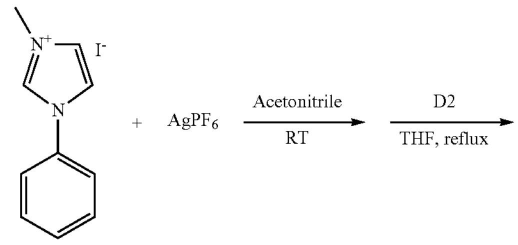

A1

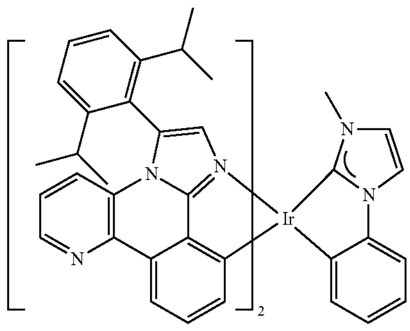

IrC2

A mixture of ancillary ligand A1 (1.5 mmol, 1.5 eq) and $AgPF_6$ (0.75 mmol, 0.75 eq) was stirred in a solution of 100 mL of acetonitrile at room temperature for 24 h. The solvent was evaporated to dryness under reduced pressure. Then chlorodimer D2 (1.0 mmol, 1.0 eq) and 150 mL of THF were added. The reaction mixture was heated to reflux for 24 h. Then the mixture was cooled to room temperature, and the precipitate was filtered off. The filtrate was evaporated to dryness under reduced pressure, and then purified by column chromatography to obtain the emitter IrC2 in 20%~60% yield.

Example 94

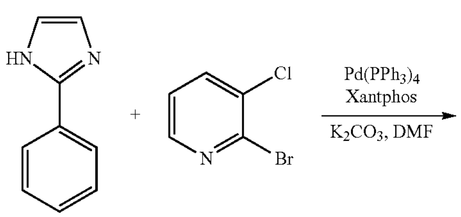

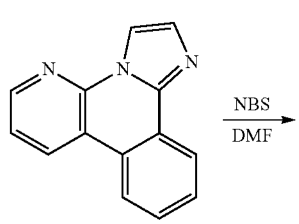

-continued

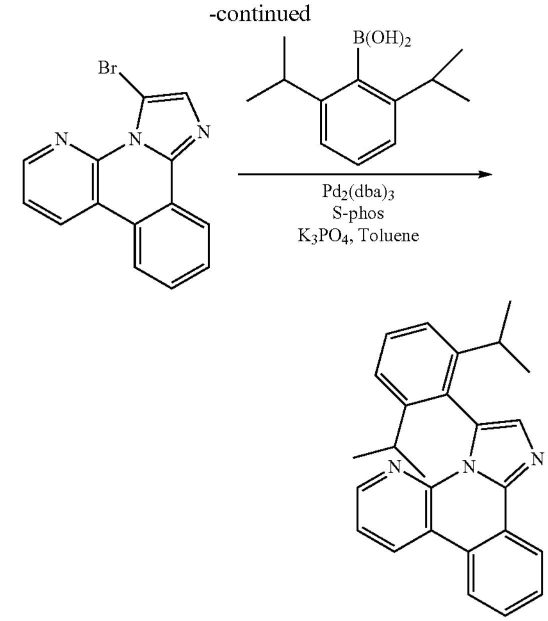

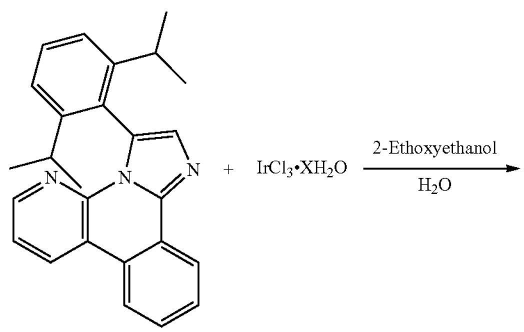

IrL3

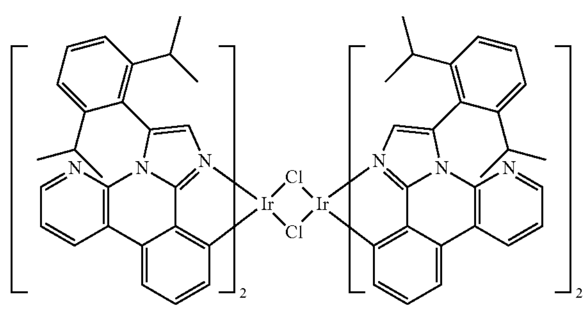

D3

IrL3 (2.2 mmol, 2.2 eq) and $IrCl_3 \cdot XH_2O$ (1.0 mmol, 1.0 eq) were added to a dry Schlenck tube equipped with a magnetic stir bar. The tube was evacuated and backfilled with nitrogen. The evacuation and backfill procedure was repeated for a total of three times. Then 2-ethoxyethanol (30 mL) and $H_2O$ (10 mL) were added under the protection of nitrogen. The mixture was stirred in an oil bath at a temperature of 110° C. overnight and then cooled down to ambient temperature. The precipitate was filtered and washed with methanol several times to obtain the desired product chlorodimer D3 in 40%~80% yield.

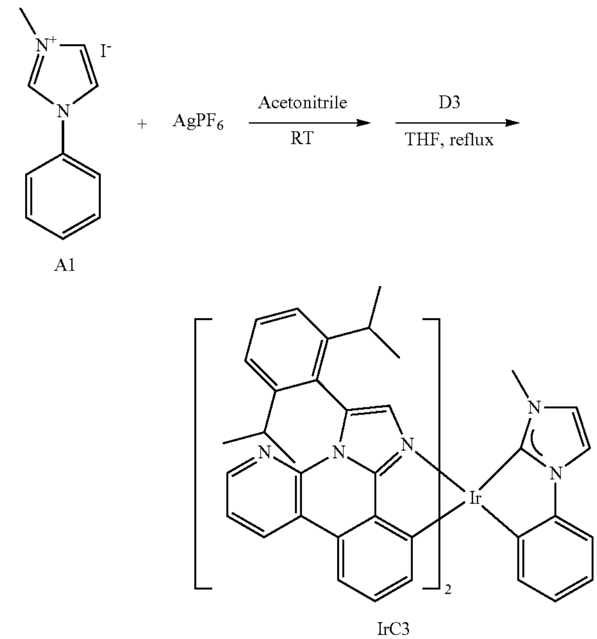

A mixture of ancillary ligand A1 (1.5 mmol, 1.5 eq) and $AgPF_6$ (0.75 mmol, 0.75 eq) was stirred in a solution of 100 mL of acetonitrile at room temperature for 24 h. The solvent was evaporated to dryness under reduced pressure. Then chlorodimer D3 (1.0 mmol, 1.0 eq) and 150 mL of THF were added. The reaction mixture was heated to reflux for 24 h. Then the mixture was cooled to room temperature, and the precipitate was filtered off. The filtrate was evaporated to dryness under reduced pressure, and then purified by column chromatography to obtain the emitter IrC3 in 20%~60% yield.

Example 95

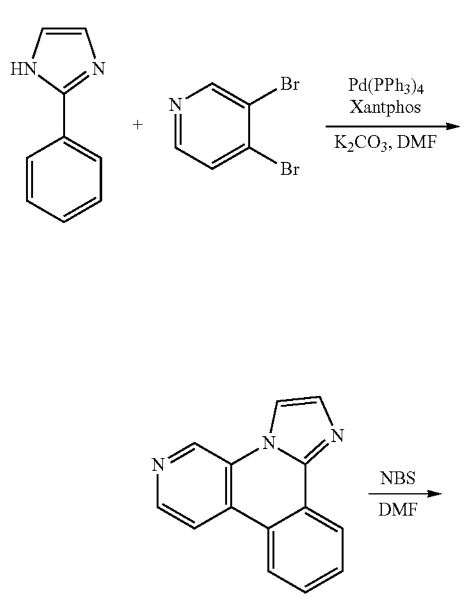

-continued

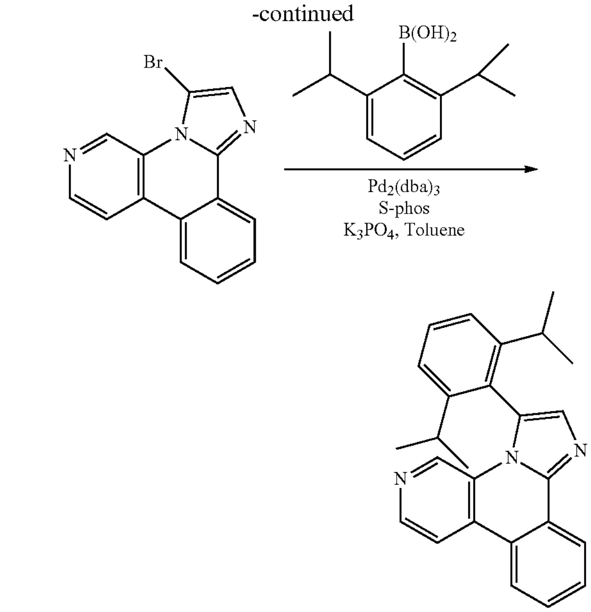

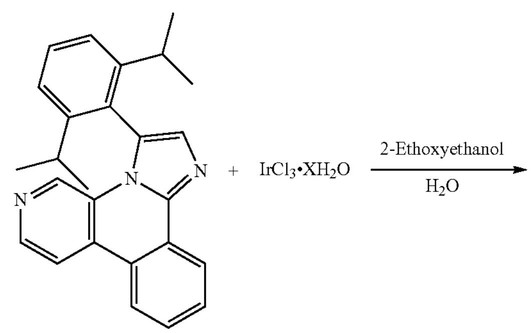

IrL4

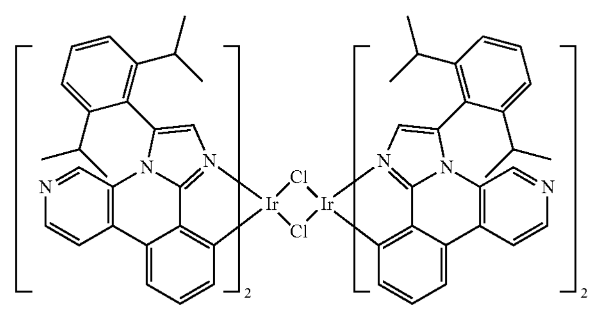

D4

IrL4 (2.2 mmol, 2.2 eq) and $IrCl_3 \cdot XH_2O$ (1.0 mmol, 1.0 eq) were added to a dry Shlenck tube equipped with a magnetic stir bar. The tube was evacuated and backfilled with nitrogen. The evacuation and backfill procedure was repeated for a total of three times. Then 2-ethoxyethanol (30 mL) and $H_2O$ (10 mL) were added under the protection of nitrogen. The mixture was stirred in an oil bath at a temperature of 110° C. overnight and then cooled down to ambient temperature. The precipitate was filtered and washed with methanol several times to obtain the desired product chlorodimer D4 in 40%~80% yield.

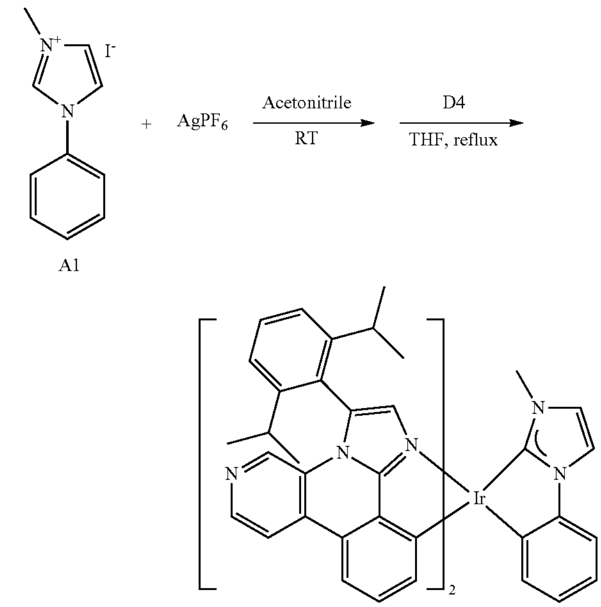

A1

IrC4

A mixture of ancillary ligand A1 (1.5 mmol, 1.5 eq) and $AgPF_6$ (0.75 mmol, 0.75 eq) was stirred in a solution of 100 mL of acetonitrile at room temperature for 24 h. The solvent was evaporated to dryness under reduced pressure. Then chlorodimer D4 (1.0 mmol, 1.0 eq) and 150 mL of THF were added. The reaction mixture was heated to reflux for 24 h. Then the mixture was cooled to room temperature, and the precipitate was filtered off. The filtrate was evaporated to dryness under reduced pressure, and then purified by column chromatography to obtain the emitter IrC4 in 20%~60% yield.

Example 96

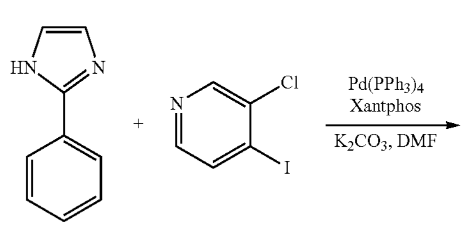

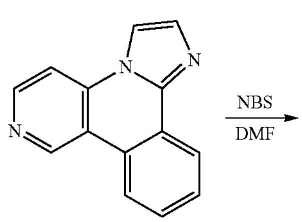

-continued

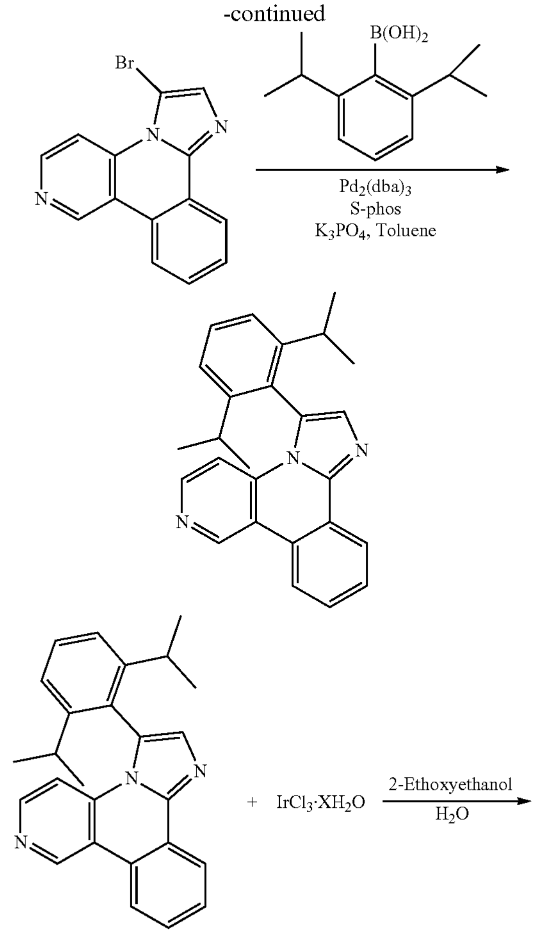

IrL5

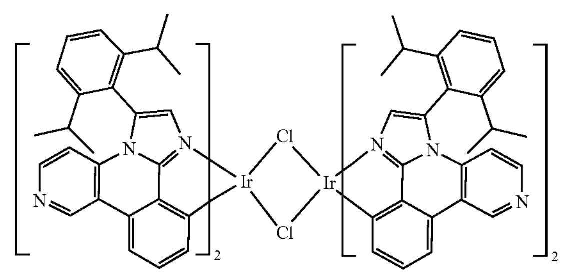

D5

IrL5 (2.2 mmol, 2.2 eq) and $IrCl_3 \cdot XH_2O$ (1.0 mmol, 1.0 eq) were added to a dry Shlenck tube equipped with a magnetic stir bar. The tube was evacuated and backfilled with nitrogen. The evacuation and backfill procedure was repeated for a total of three times. Then 2-ethoxyethanol (30 mL) and $H_2O$ (10 mL) were added under the protection of nitrogen. The mixture was stirred in an oil bath at a temperature of 110° C. overnight and then cooled down to ambient temperature. The precipitate was filtered and washed with methanol several times to obtain the desired product chlorodimer D5 in 40%~80% yield.

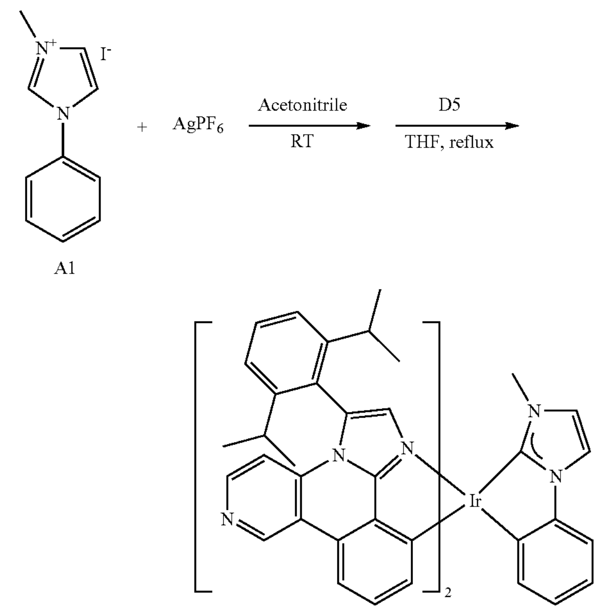

A1

IrC5

A mixture of ancillary ligand A1 (1.5 mmol, 1.5 eq) and $AgPF_6$ (0.75 mmol, 0.75 eq) was stirred in a solution of 100 mL of acetonitrile at room temperature for 24 h. The solvent was evaporated to dryness under reduced pressure. Then chlorodimer D5 (1.0 mmol, 1.0 eq) and 150 mL of THF were added. The reaction mixture was heated to reflux for 24 h. Then the mixture was cooled to room temperature, and the precipitate was filtered off. The filtrate was evaporated to dryness under reduced pressure, and then purified by column chromatography to obtain the emitter IrC5 in 20%~60% yield.

Example 97

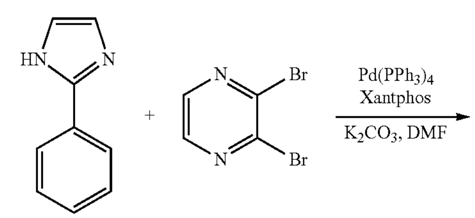

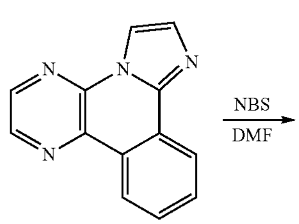

-continued

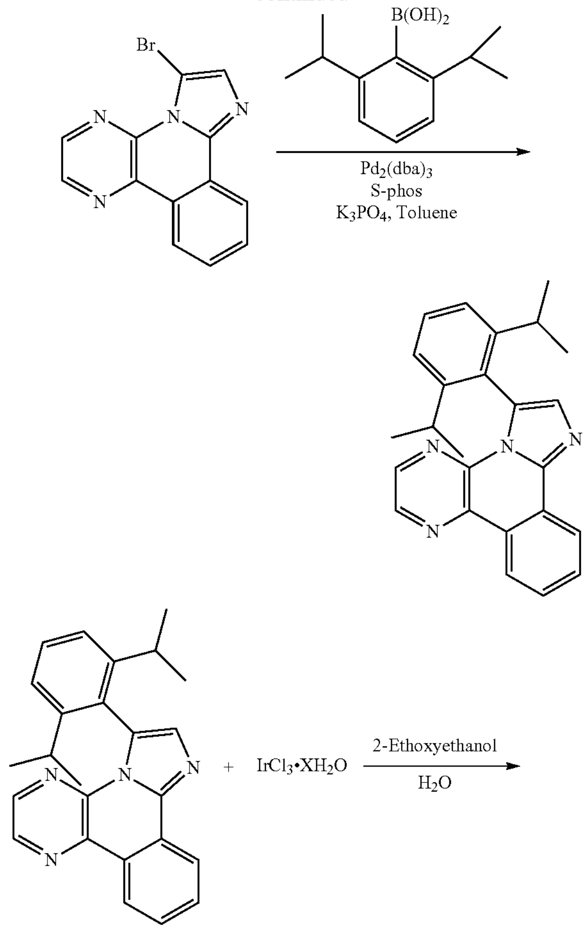

IrL6

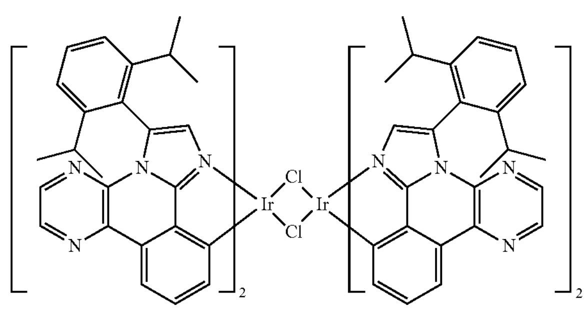

D6

IrL6 (2.2 mmol, 2.2 eq) and $IrCl_3{\cdot}XH_2O$ (1.0 mmol, 1.0 eq) were added to a dry Shlenck tube equipped with a magnetic stir bar. The tube was evacuated and backfilled with nitrogen. The evacuation and backfill procedure was repeated for a total of three times. Then 2-ethoxyethanol (30 mL) and $H_2O$ (10 mL) were added under the protection of nitrogen. The mixture was stirred in an oil bath at a temperature of 110° C. overnight and then cooled down to ambient temperature. The precipitate was filtered and washed with methanol several times to obtain the desired product chlorodimer D6 in 40%~80% yield.

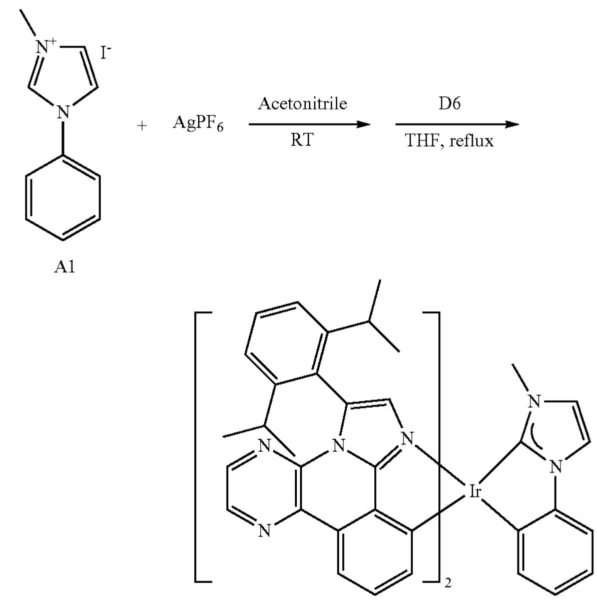

IrC6

A mixture of ancillary ligand A1 (1.5 mmol, 1.5 eq) and $AgPF_6$ (0.75 mmol, 0.75 eq) was stirred in a solution of 100 mL of acetonitrile at room temperature for 24 h. The solvent was evaporated to dryness under reduced pressure. Then chlorodimer D6 (1.0 mmol, 1.0 eq) and 150 mL of THF were added. The reaction mixture was heated to reflux for 24 h. Then the mixture was cooled to room temperature, and the precipitate was filtered off. The filtrate was evaporated to dryness under reduced pressure, and then purified by column chromatography to obtain the emitter IrC6 in 20%~60% yield.

Example 98

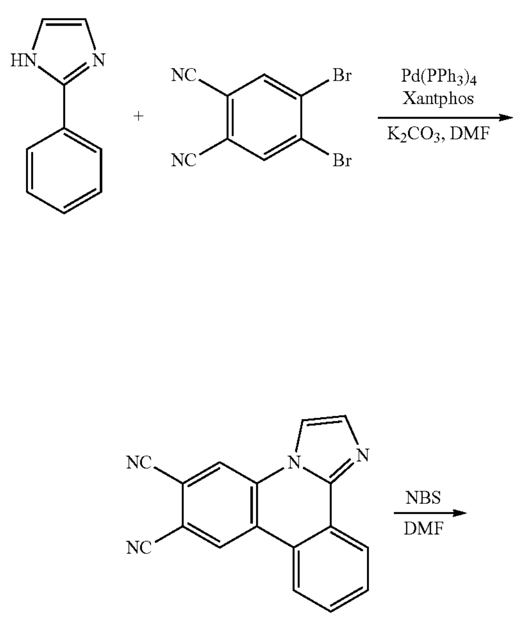

-continued

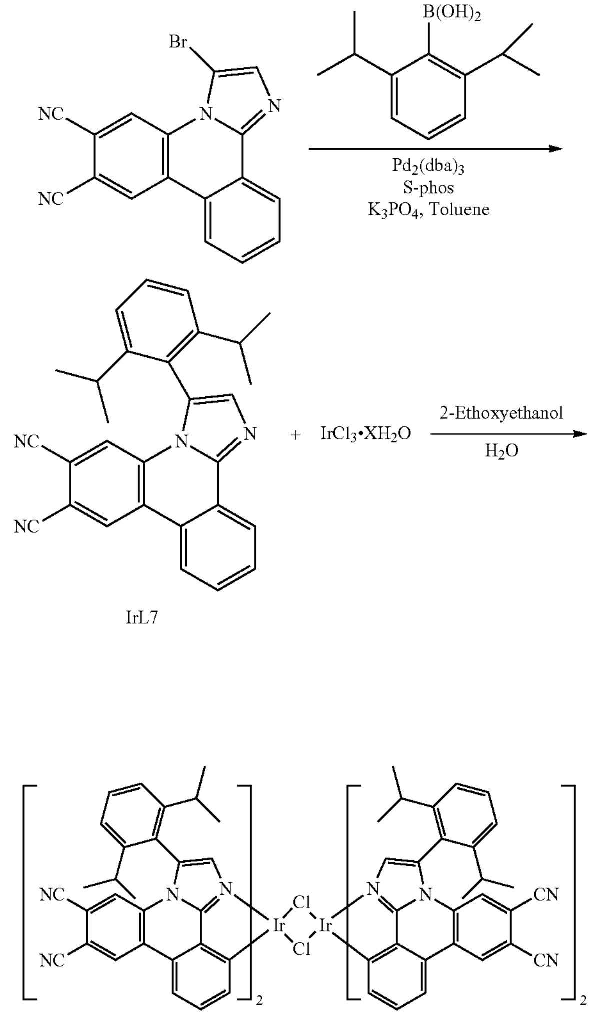

D7

IrL7 (2.2 mmol, 2.2 eq) and $IrCl_3 \cdot XH_2O$ (1.0 mmol, 1.0 eq) were added to a dry Shlenck tube equipped with a magnetic stir bar. The tube was evacuated and backfilled with nitrogen. The evacuation and backfill procedure was repeated for a total of three times. Then 2-ethoxyethanol (30 mL) and $H_2O$ (10 mL) were added under the protection of nitrogen. The mixture was stirred in an oil bath at a temperature of 110° C. overnight and then cooled down to ambient temperature. The precipitate was filtered and washed with methanol several times to obtain the desired product chlorodimer D7 in 40%~80% yield.

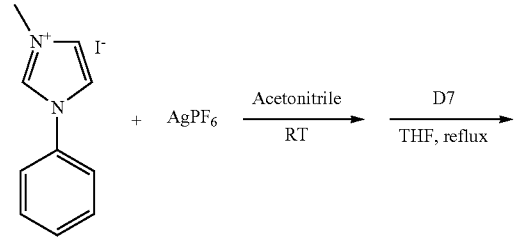

A1

-continued

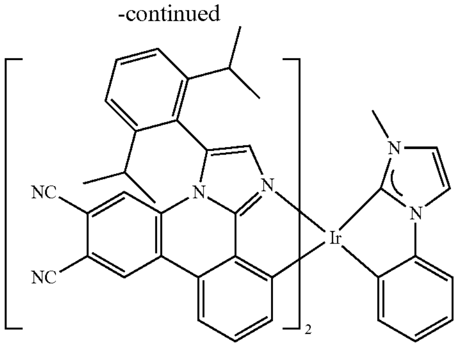

IrC7

A mixture of ancillary ligand A1 (1.5 mmol, 1.5 eq) and $AgPF_6$ (0.75 mmol, 0.75 eq) was stirred in a solution of 100 mL of acetonitrile at room temperature for 24 h. The solvent was evaporated to dryness under reduced pressure. Then chlorodimer D7 (1.0 mmol, 1.0 eq) and 150 mL of THF were added. The reaction mixture was heated to reflux for 24 h. Then the mixture was cooled to room temperature, and the precipitate was filtered off. The filtrate was evaporated to dryness under reduced pressure, and then purified by column chromatography to obtain the emitter IrC7 in 20%~60% yield.

Example 99

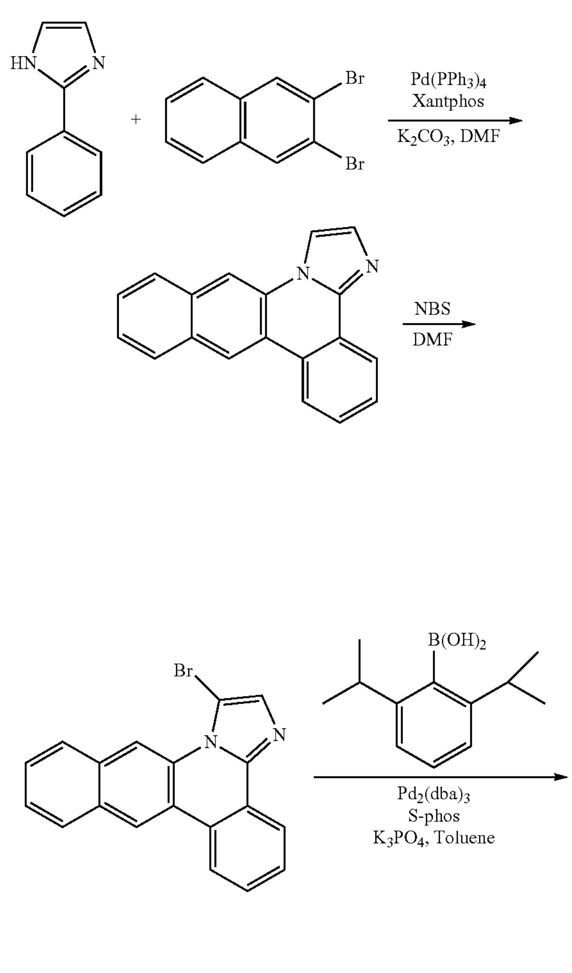

-continued

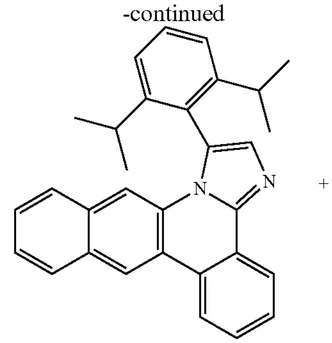

IrL8

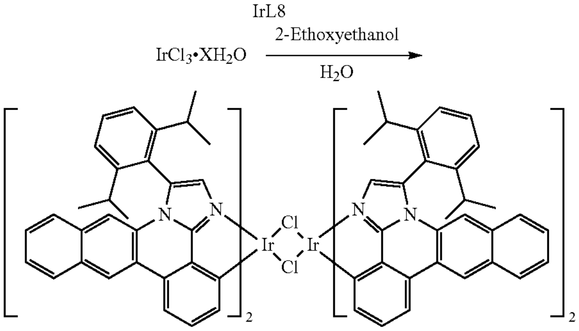

D8

IrL8 (2.2 mmol, 2.2 eq) and $IrCl_3 \cdot XH_2O$ (1.0 mmol, 1.0 eq) were added to a dry Shlenck tube equipped with a magnetic stir bar. The tube was evacuated and backfilled with nitrogen. The evacuation and backfill procedure was repeated for a total of three times. Then 2-ethoxyethanol (30 mL) and $H_2O$ (10 mL) were added under the protection of nitrogen. The mixture was stirred in an oil bath at a temperature of 110° C. overnight and then cooled down to ambient temperature. The precipitate was filtered and washed with methanol several times to obtain the desired product chlorodimer D8 in 40%~80% yield.

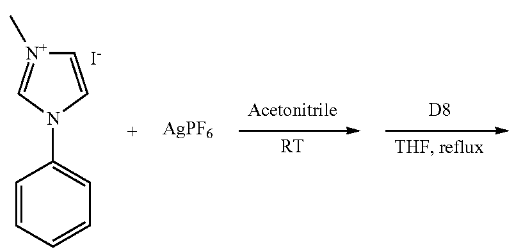

A1

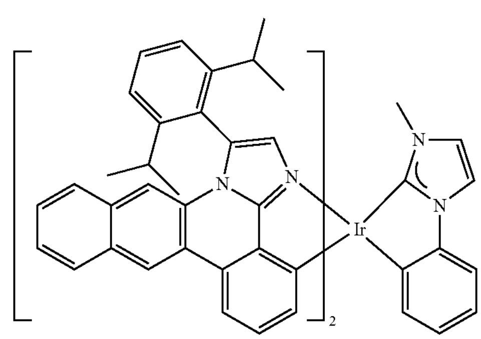

IrC8

A mixture of ancillary ligand A1 (1.5 mmol, 1.5 eq) and $AgPF_6$ (0.75 mmol, 0.75 eq) was stirred in a solution of 100 mL of acetonitrile at room temperature for 24 h. The solvent was evaporated to dryness under reduced pressure. Then chlorodimer D8 (1.0 mmol, 1.0 eq) and 150 mL of THF were added. The reaction mixture was heated to reflux for 24 h. Then the mixture was cooled to room temperature, and the precipitate was filtered off. The filtrate was evaporated to dryness under reduced pressure, and then purified by column chromatography to obtain the emitter IrC8 in 20%~60% yield.

Example 100

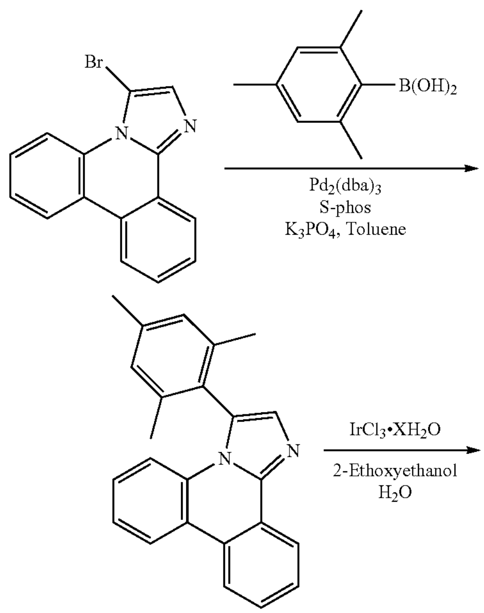

IrL9

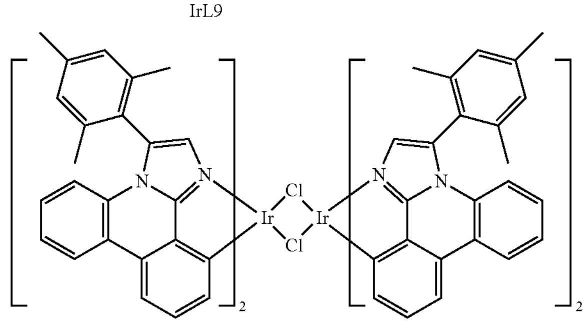

D9

IrL9 (2.2 mmol, 2.2 eq) and $IrCl_3 \cdot XH_2O$ (1.0 mmol, 1.0 eq) were added to a dry Shlenck tube equipped with a magnetic stir bar. The tube was evacuated and backfilled with nitrogen. The evacuation and backfill procedure was repeated for a total of three times. Then 2-ethoxyethanol (30 mL) and $H_2O$ (10 mL) were added under the protection of nitrogen. The mixture was stirred in an oil bath at a temperature of 110° C. overnight and then cooled down to ambient temperature. The precipitate was filtered and washed with methanol several times to obtain the desired product chlorodimer D9 in 40%~80% yield.

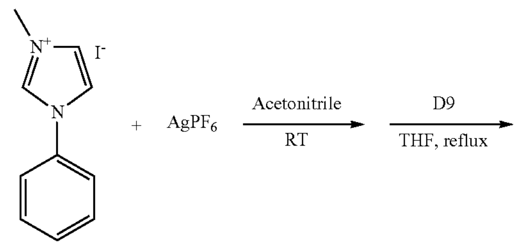

A1

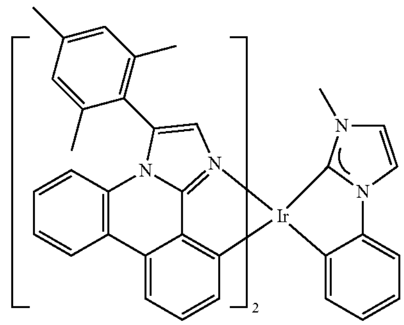

IrC9

A mixture of ancillary ligand A1 (1.5 mmol, 1.5 eq) and $AgPF_6$ (0.75 mmol, 0.75 eq) was stirred in a solution of 100 mL of acetonitrile at room temperature for 24 h. The solvent was evaporated to dryness under reduced pressure. Then chlorodimer D9 (1.0 mmol, 1.0 eq) and 150 mL of THF were added. The reaction mixture was heated to reflux for 24 h. Then the mixture was cooled to room temperature, and the precipitate was filtered off. The filtrate was evaporated to dryness under reduced pressure, and then purified by column chromatography to obtain the emitter IrC9 in 20%~60% yield.

Example 101

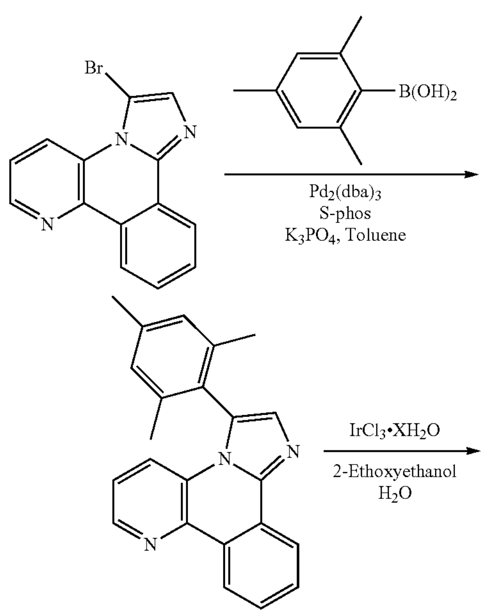

IrL10

-continued

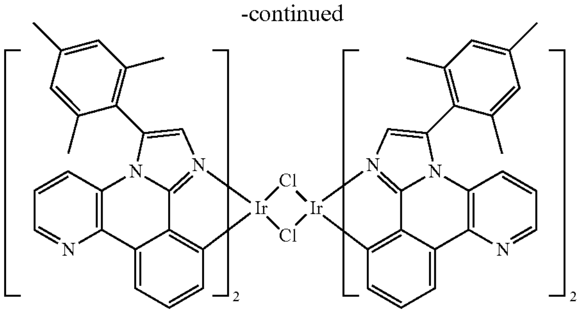

D10

IrL10 (2.2 mmol, 2.2 eq) and $IrCl_3 \cdot XH_2O$ (1.0 mmol, 1.0 eq) were added to a dry Shlenck tube equipped with a magnetic stir bar. The tube was evacuated and backfilled with nitrogen. The evacuation and backfill procedure was repeated for a total of three times. Then 2-ethoxyethanol (30 mL) and $H_2O$ (10 mL) were added under the protection of nitrogen. The mixture was stirred in an oil bath at a temperature of 110° C. overnight and then cooled down to ambient temperature. The precipitate was filtered and washed with methanol several times to obtain the desired product chlorodimer D10 in 40%~80% yield.

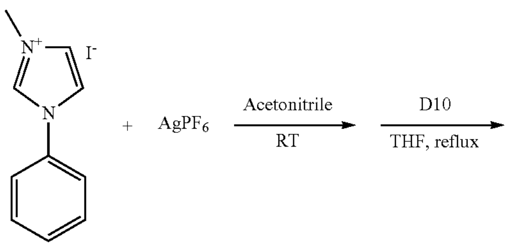

A1

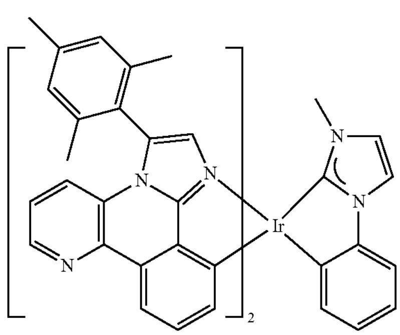

IrC10

A mixture of ancillary ligand A1 (1.5 mmol, 1.5 eq) and $AgPF_6$ (0.75 mmol, 0.75 eq) was stirred in a solution of 100 mL of acetonitrile at room temperature for 24 h. The solvent was evaporated to dryness under reduced pressure. Then chlorodimer D10 (1.0 mmol, 1.0 eq) and 150 mL of THF were added. The reaction mixture was heated to reflux for 24 h. Then the mixture was cooled to room temperature, and the precipitate was filtered off. The filtrate was evaporated to dryness under reduced pressure, and then purified by column chromatography to obtain the emitter IrC10 in 20%~60% yield.

Example 102

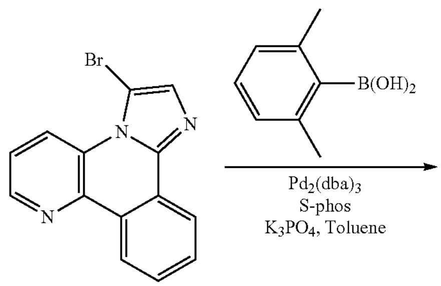

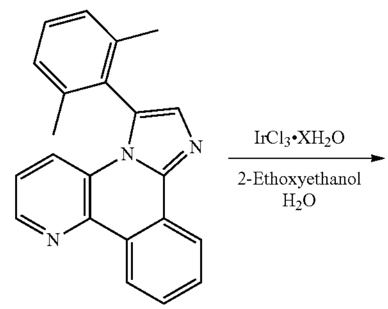

IrL11

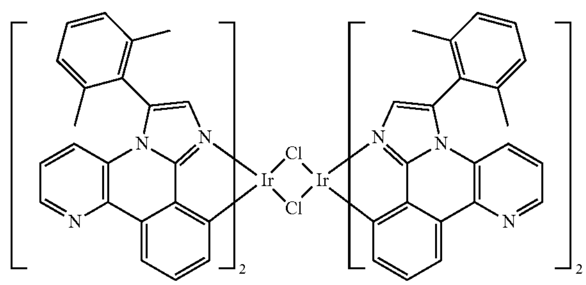

D11

IrL11 (2.2 mmol, 2.2 eq) and $IrCl_3 \cdot XH_2O$ (1.0 mmol, 1.0 eq) were added to a dry Shlenck tube equipped with a magnetic stir bar. The tube was evacuated and backfilled with nitrogen. The evacuation and backfill procedure was repeated for a total of three times. Then 2-ethoxyethanol (30 mL) and $H_2O$ (10 mL) were added under the protection of nitrogen. The mixture was stirred in an oil bath at a temperature of 110° C. overnight and then cooled down to ambient temperature. The precipitate was filtered and washed with methanol several times to obtain the desired product chlorodimer D11 in 40%~80% yield.

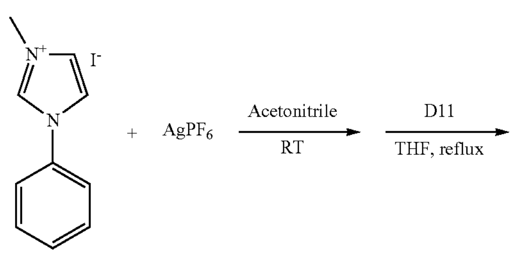

A1

-continued

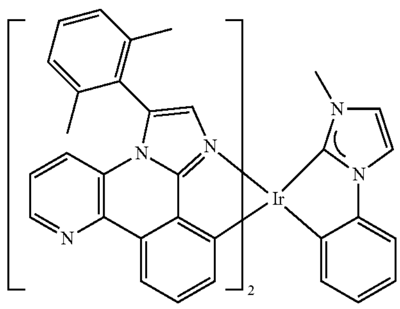

IrC11

A mixture of ancillary ligand A1 (1.5 mmol, 1.5 eq) and $AgPF_6$ (0.75 mmol, 0.75 eq) was stirred in a solution of 100 mL of acetonitrile at room temperature for 24 h. The solvent was evaporated to dryness under reduced pressure. Then chlorodimer D11 (1.0 mmol, 1.0 eq) and 150 mL of THF were added. The reaction mixture was heated to reflux for 24 h. Then the mixture was cooled to room temperature, and the precipitate was filtered off. The filtrate was evaporated to dryness under reduced pressure, and then purified by column chromatography to obtain the emitter IrC11 in 20%~60% yield.

Example 103

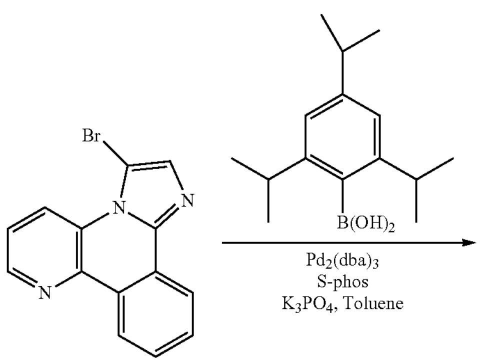

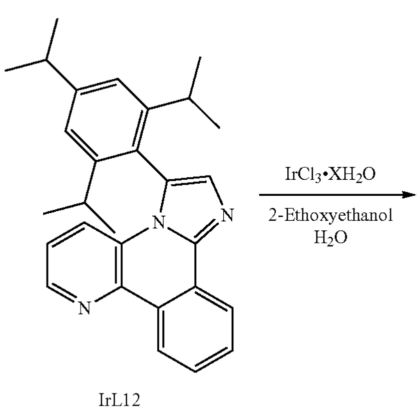

IrL12

-continued

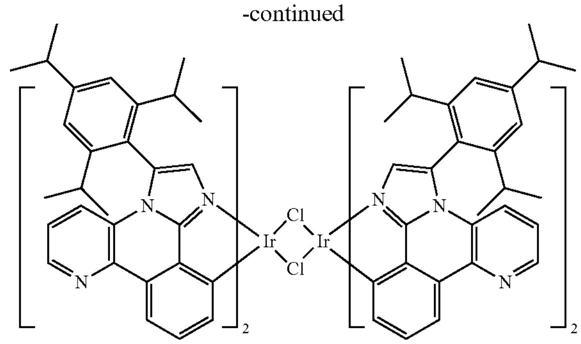

D12

IrL12 (2.2 mmol, 2.2 eq) and $IrCl_3 \cdot XH_2O$ (1.0 mmol, 1.0 eq) were added to a dry Shlenck tube equipped with a magnetic stir bar. The tube was evacuated and backfilled with nitrogen. The evacuation and backfill procedure was repeated for a total of three times. Then 2-ethoxyethanol (30 mL) and $H_2O$ (10 mL) were added under the protection of nitrogen. The mixture was stirred in an oil bath at a temperature of 110° C. overnight and then cooled down to ambient temperature. The precipitate was filtered and washed with methanol several times to obtain the desired product chlorodimer D12 in 40%~80% yield.

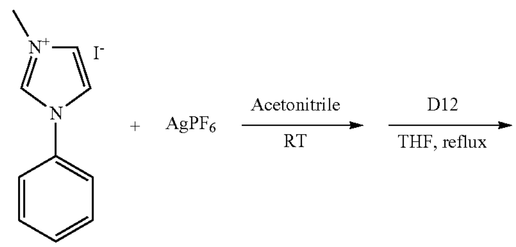

A1

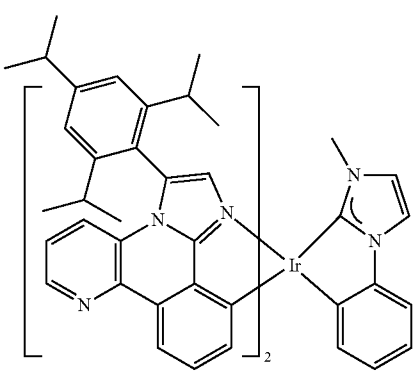

IrC12

A mixture of ancillary ligand A1 (1.5 mmol, 1.5 eq) and $AgPF_6$ (0.75 mmol, 0.75 eq) was stirred in a solution of 100 mL of acetonitrile at room temperature for 24 h. The solvent was evaporated to dryness under reduced pressure. Then chlorodimer D12 (1.0 mmol, 1.0 eq) and 150 mL of THF were added. The reaction mixture was heated to reflux for 24 h. Then the mixture was cooled to room temperature, and the precipitate was filtered off. The filtrate was evaporated to dryness under reduced pressure, and then purified by column chromatography to obtain the emitter IrC12 in 20%~60% yield.

Example 104

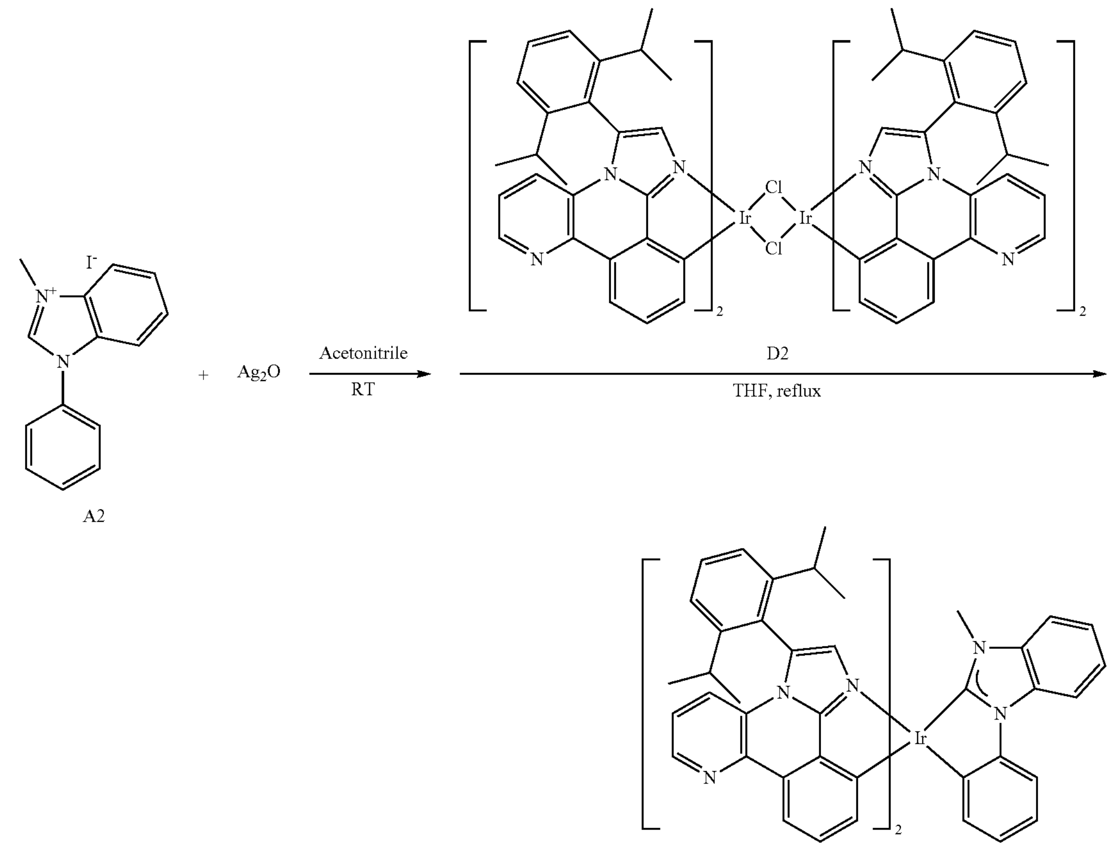

IrC13

A mixture of ancillary ligand A2 (1.5 mmol, 1.5 eq) and $AgPF_6$ (0.75 mmol, 0.75 eq) was stirred in a solution of 100 mL of acetonitrile at room temperature for 24 h. The solvent was evaporated to dryness under reduced pressure. Then chlorodimer D2 (1.0 mmol, 1.0 eq) and 150 mL of THF were added. The reaction mixture was heated to reflux for 24 h. Then the mixture was cooled to room temperature, and the precipitate was filtered off. The filtrate was evaporated to dryness under reduced pressure, and then purified by column chromatography to obtain the emitter IrC13 in 20%~60% yield.

Example 105

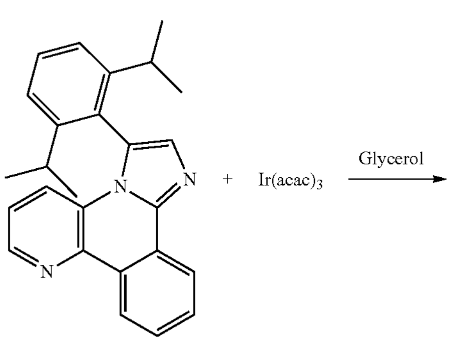

IrL2

-continued

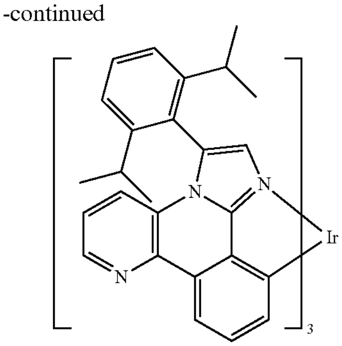

IrC14

IrL2 (2.5 mmol, 5.0 eq) and $Ir(acac)_3$ (0.5 mmol, 1.0 eq) were added to a dry Shlenck tube equipped with a magnetic stir bar. The tube was evacuated and backfilled with nitrogen. The evacuation and backfill procedure was repeated for a total of three times. Then 45 mL of glycerol was added under the protection of nitrogen. The mixture was stirred in an oil bath at a temperature of 240° C. for 3 days. After the mixture was cooled down to ambient temperature, 150 mL of 1M HCl solution was added, and the product was thrice extracted with $CH_2Cl_2$. Then the organic extracts were combined, and dried with $MgSO_4$. The mixture was evaporated to dryness under reduced pressure, and then purified by column chromatography to obtain the emitter IrC14 in 5%~50% yield.

Example 106

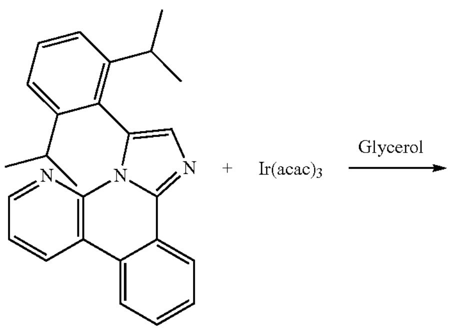

IrL3

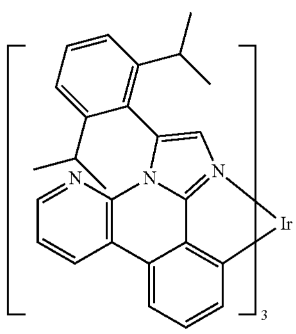

IrC15

IrL3 (2.5 mmol, 5.0 eq) and $Ir(acac)_3$ (0.5 mmol, 1.0 eq) were added to a dry Shlenck tube equipped with a magnetic stir bar. The tube was evacuated and backfilled with nitrogen. The evacuation and backfill procedure was repeated for a total of three times. Then 45 mL of glycerol was added under the protection of nitrogen. The mixture was stirred in an oil bath at a temperature of 240° C. for 3 days. After the mixture was cooled down to ambient temperature, 150 mL of 1M HCl solution was added, and the product was thrice extracted with $CH_2Cl_2$. Then the organic extracts were combined, and dried with $MgSO_4$. The mixture was evaporated to dryness under reduced pressure, and then purified by column chromatography to obtain the emitter IrC15 in 5%~50% yield.

Example 107

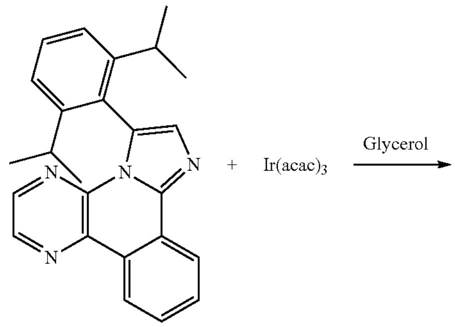

IrL6

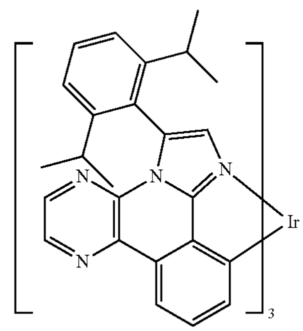

IrC16

IrL6 (2.5 mmol, 5.0 eq) and $Ir(acac)_3$ (0.5 mmol, 1.0 eq) were added to a dry Shlenck tube equipped with a magnetic stir bar. The tube was evacuated and backfilled with nitrogen. The evacuation and backfill procedure was repeated for a total of three times. Then 45 mL of glycerol was added under the protection of nitrogen. The mixture was stirred in an oil bath at a temperature of 240° C. for 3 days. After the mixture was cooled down to ambient temperature, 150 mL of 1M HCl solution was added, and the product was thrice extracted with $CH_2Cl_2$. Then the organic extracts were combined, and dried with $MgSO_4$. The mixture was evaporated to dryness under reduced pressure, and then purified by column chromatography to obtain the emitter IrC16 in 5%~50% yield.

Example 108

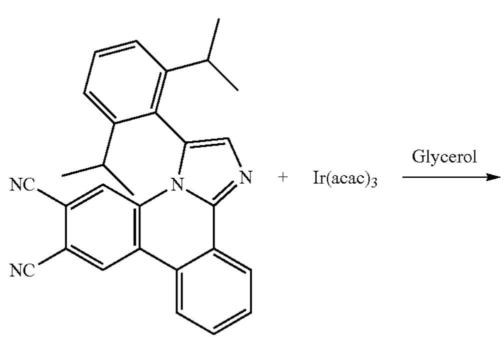

IrL7

-continued

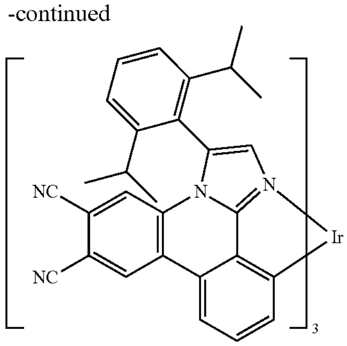

IrC17

IrL7 (2.5 mmol, 5.0 eq) and $Ir(acac)_3$ (0.5 mmol, 1.0 eq) were added to a dry Shlenck tube equipped with a magnetic stir bar. The tube was evacuated and backfilled with nitrogen. The evacuation and backfill procedure was repeated for a total of three times. Then 45 mL of glycerol was added under the protection of nitrogen. The mixture was stirred in an oil bath at a temperature of 240° C. for 3 days. After the mixture was cooled down to ambient temperature, 150 mL of 1M HCl solution was added, and the product was thrice extracted with $CH_2Cl_2$. Then the organic extracts were combined, and dried with $MgSO_4$. The mixture was evaporated to dryness under reduced pressure, and then purified by column chromatography to obtain the emitter IrC17 in 5%~50% yield.

Example 109

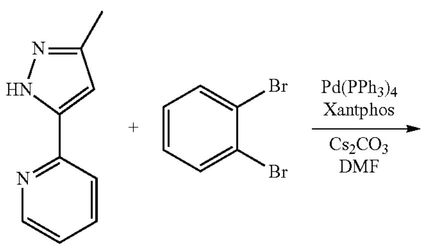

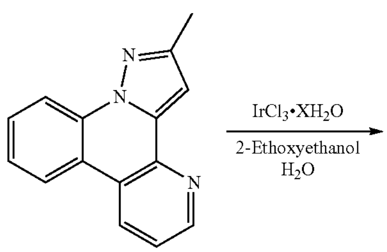

IrL18

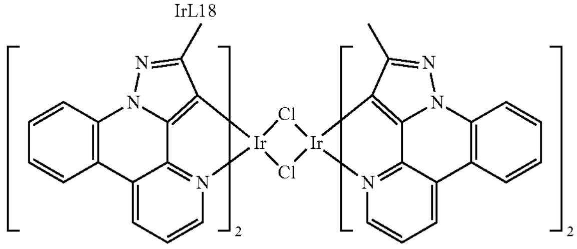

D18

IrL18 (2.2 mmol, 2.2 eq) and $IrCl_3{\cdot}XH_2O$ (1.0 mmol, 1.0 eq) were added to a dry Shlenck tube equipped with a magnetic stir bar. The tube was evacuated and backfilled with nitrogen. The evacuation and backfill procedure was repeated for a total of three times. Then 2-ethoxyethanol (30 mL) and $H_2O$ (10 mL) were added under the protection of nitrogen. The mixture was stirred in an oil bath at a temperature of 110° C. overnight and then cooled down to ambient temperature. The precipitate was filtered and washed with methanol several times to obtain the desired product chlorodimer D18 in 40%~80% yield.

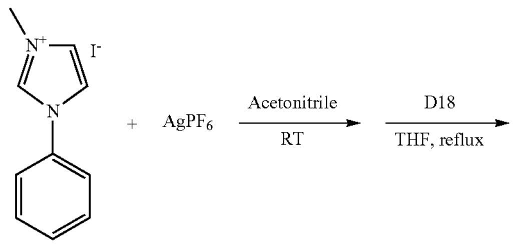

A1

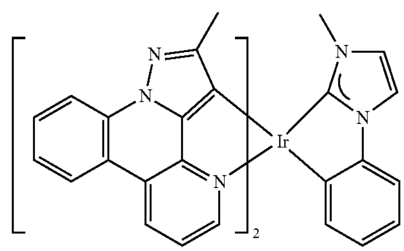

IrC18

A mixture of ancillary ligand A1 (1.5 mmol, 1.5 eq) and $AgPF_6$ (0.75 mmol, 0.75 eq) was stirred in a solution of 100 mL of acetonitrile at room temperature for 24 h. The solvent was evaporated to dryness under reduced pressure. Then chlorodimer D18 (1.0 mmol, 1.0 eq) and 150 mL of THF were added. The reaction mixture was heated to reflux for 24 h. Then the mixture was cooled to room temperature, and the precipitate was filtered off. The filtrate was evaporated to dryness under reduced pressure, and then purified by column chromatography to obtain the emitter IrC18 in 20%~60% yield.

Example 110

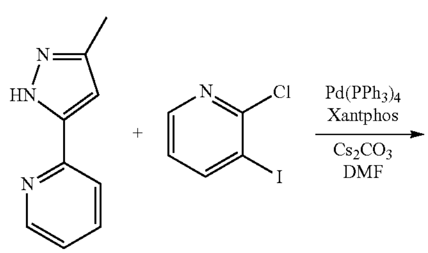

-continued

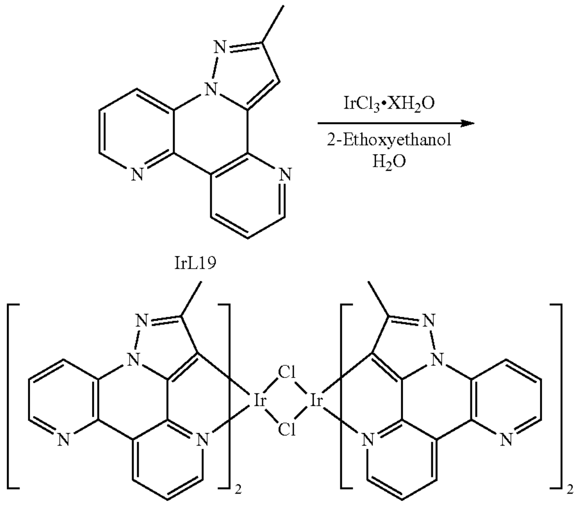

IrL19

D19

IrL19 (2.2 mmol, 2.2 eq) and $IrCl_3 \cdot XH_2O$ (1.0 mmol, 1.0 eq) were added to a dry Shlenck tube equipped with a magnetic stir bar. The tube was evacuated and backfilled with nitrogen. The evacuation and backfill procedure was repeated for a total of three times. Then 2-ethoxyethanol (30 mL) and $H_2O$ (10 mL) were added under the protection of nitrogen. The mixture was stirred in an oil bath at a temperature of 110° C. overnight and then cooled down to ambient temperature. The precipitate was filtered and washed with methanol several times to obtain the desired product chlorodimer D19 in 40%~80% yield.

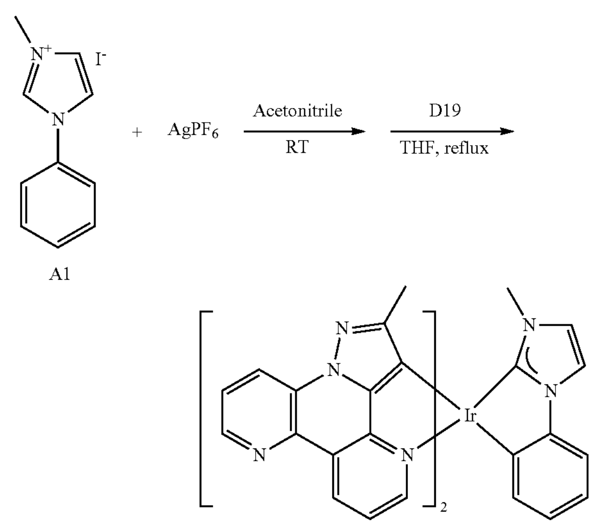

A1

IrC19

A mixture of ancillary ligand A1 (1.5 mmol, 1.5 eq) and $AgPF_6$ (0.75 mmol, 0.75 eq) was stirred in a solution of 100 mL of acetonitrile at room temperature for 24 h. The solvent was evaporated to dryness under reduced pressure. Then chlorodimer D19 (1.0 mmol, 1.0 eq) and 150 mL of THF were added. The reaction mixture was heated to reflux for 24 h. Then the mixture was cooled to room temperature, and the precipitate was filtered off. The filtrate was evaporated to dryness under reduced pressure, and then purified by column chromatography to obtain the emitter IrC19 in 20%~60% yield.

Example 111

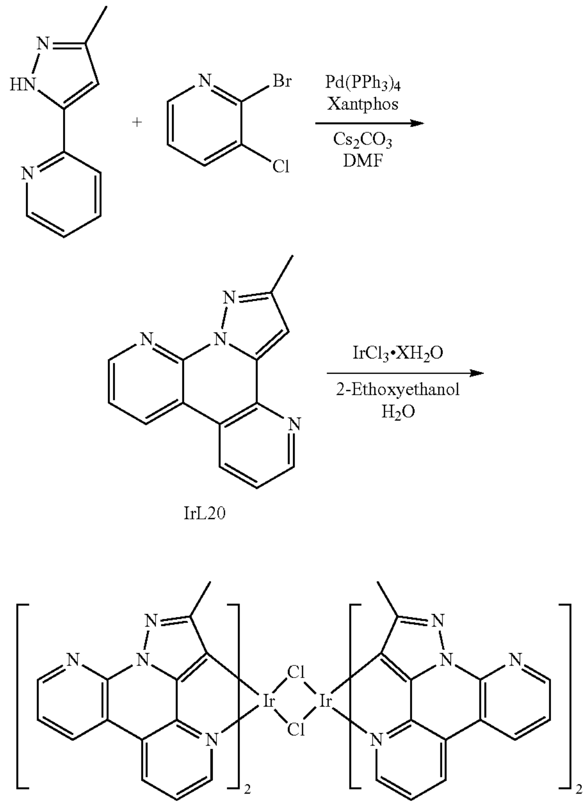

IrL20

D20

IrL20 (2.2 mmol, 2.2 eq) and $IrCl_3 \cdot XH_2O$ (1.0 mmol, 1.0 eq) were added to a dry Shlenck tube equipped with a magnetic stir bar. The tube was evacuated and backfilled with nitrogen. The evacuation and backfill procedure was repeated for a total of three times. Then 2-ethoxyethanol (30 mL) and $H_2O$ (10 mL) were added under the protection of nitrogen. The mixture was stirred in an oil bath at a temperature of 110° C. overnight and then cooled down to ambient temperature. The precipitate was filtered and washed with methanol several times to obtain the desired product chlorodimer D20 in 40%~80% yield.

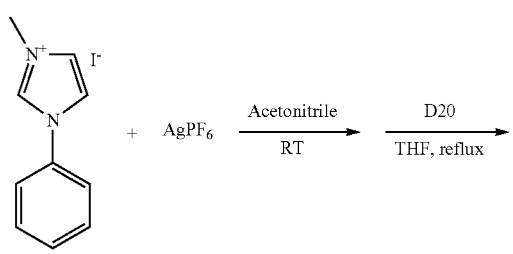

A1

-continued

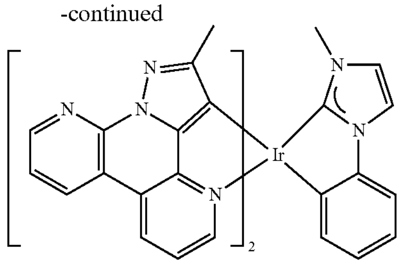

IrC20

A mixture of ancillary ligand A1 (1.5 mmol, 1.5 eq) and $AgPF_6$ (0.75 mmol, 0.75 eq) was stirred in a solution of 100 mL of acetonitrile at room temperature for 24 h. The solvent was evaporated to dryness under reduced pressure. Then chlorodimer D20 (1.0 mmol, 1.0 eq) and 150 mL of THF were added. The reaction mixture was heated to reflux for 24 h. Then the mixture was cooled to room temperature, and the precipitate was filtered off. The filtrate was evaporated to dryness under reduced pressure, and then purified by column chromatography to obtain the emitter IrC20 in 20%~60% yield.

Example 112

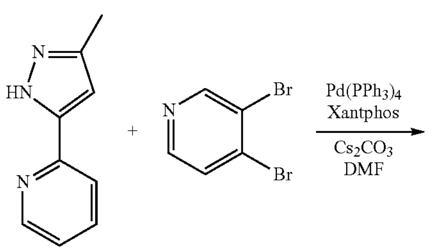

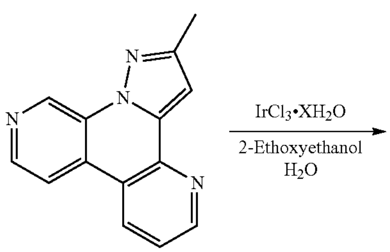

IrL21

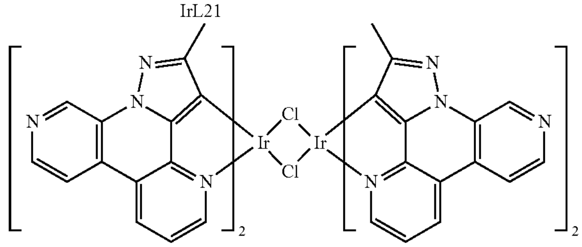

D21

IrL21 (2.2 mmol, 2.2 eq) and $IrCl_3 \cdot XH_2O$ (1.0 mmol, 1.0 eq) were added to a dry Shlenck tube equipped with a magnetic stir bar. The tube was evacuated and backfilled with nitrogen. The evacuation and backfill procedure was repeated for a total of three times. Then 2-ethoxyethanol (30 mL) and $H_2O$ (10 mL) were added under the protection of nitrogen. The mixture was stirred in an oil bath at a temperature of 110° C. overnight and then cooled down to ambient temperature. The precipitate was filtered and washed with methanol several times to obtain the desired product chlorodimer D21 in 40%~80% yield.

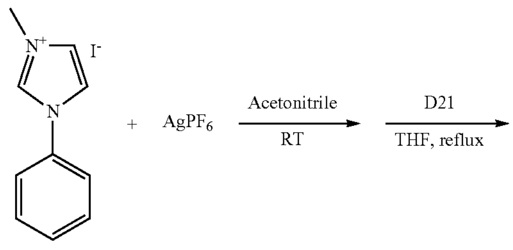

A1

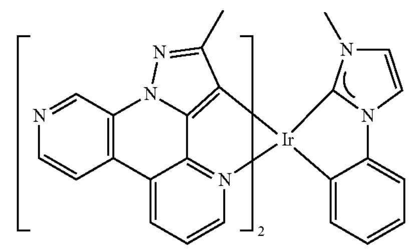

IrC21

A mixture of ancillary ligand A1 (1.5 mmol, 1.5 eq) and $AgPF_6$ (0.75 mmol, 0.75 eq) was stirred in a solution of 100 mL of acetonitrile at room temperature for 24 h. The solvent was evaporated to dryness under reduced pressure. Then chlorodimer D21 (1.0 mmol, 1.0 eq) and 150 mL of THF were added. The reaction mixture was heated to reflux for 24 h. Then the mixture was cooled to room temperature, and the precipitate was filtered off. The filtrate was evaporated to dryness under reduced pressure, and then purified by column chromatography to obtain the emitter IrC21 in 20%~60% yield.

Example 113

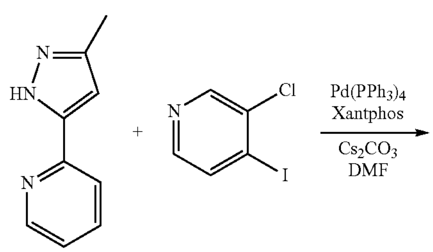

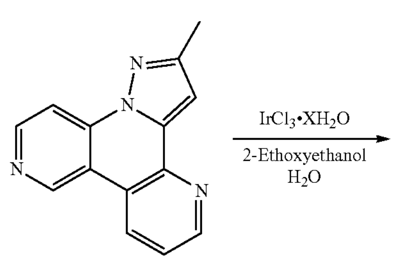

IrL22

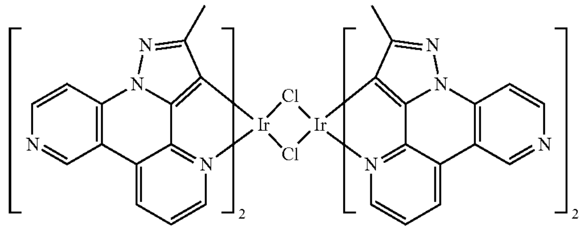

D22

IrL22 (2.2 mmol, 2.2 eq) and $IrCl_3 \cdot XH_2O$ (1.0 mmol, 1.0 eq) were added to a dry Shlenck tube equipped with a magnetic stir bar. The tube was evacuated and backfilled with nitrogen. The evacuation and backfill procedure was repeated for a total of three times. Then 2-ethoxyethanol (30 mL) and $H_2O$ (10 mL) were added under the protection of nitrogen. The mixture was stirred in an oil bath at a temperature of 110° C. overnight and then cooled down to ambient temperature. The precipitate was filtered and washed with methanol several times to obtain the desired product chlorodimer D22 in 40%~80% yield.

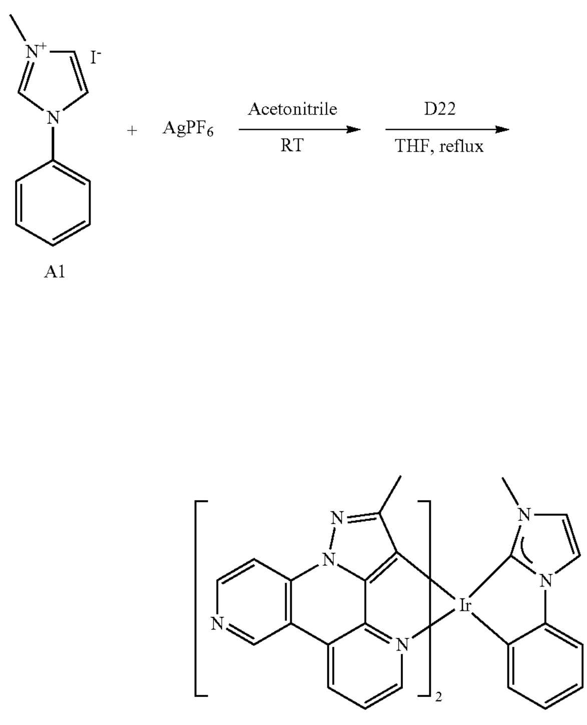

A mixture of ancillary ligand A1 (1.5 mmol, 1.5 eq) and $AgPF_6$ (0.75 mmol, 0.75 eq) was stirred in a solution of 100 mL of acetonitrile at room temperature for 24 h. The solvent was evaporated to dryness under reduced pressure. Then chlorodimer D22 (1.0 mmol, 1.0 eq) and 150 mL of THF were added. The reaction mixture was heated to reflux for 24 h. Then the mixture was cooled to room temperature, and the precipitate was filtered off. The filtrate was evaporated to dryness under reduced pressure, and then purified by column chromatography to obtain the emitter IrC22 in 20%~60% yield.

Example 114

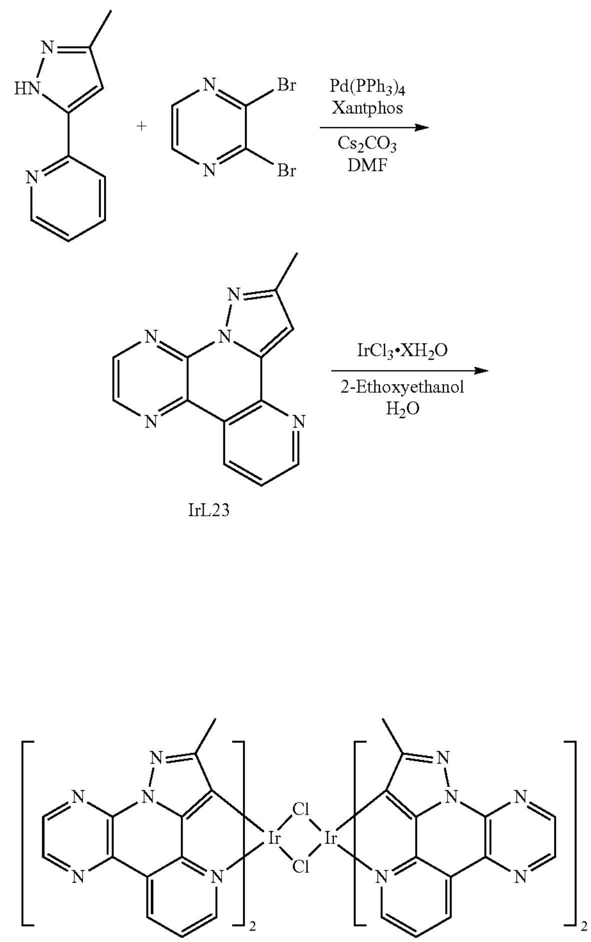

D23

IrL23 (2.2 mmol, 2.2 eq) and $IrCl_3 \cdot XH_2O$ (1.0 mmol, 1.0 eq) were added to a dry Shlenck tube equipped with a magnetic stir bar. The tube was evacuated and backfilled with nitrogen. The evacuation and backfill procedure was repeated for a total of three times. Then 2-ethoxyethanol (30 mL) and $H_2O$ (10 mL) were added under the protection of nitrogen. The mixture was stirred in an oil bath at a temperature of 110° C. overnight and then cooled down to ambient temperature. The precipitate was filtered and washed with methanol several times to obtain the desired product chlorodimer D23 in 40%~80% yield.

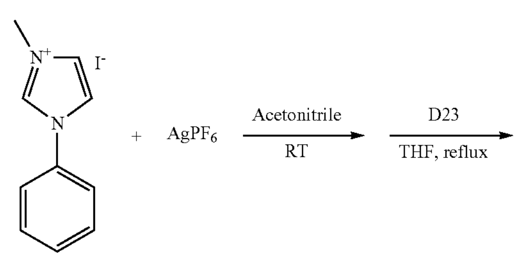

-continued

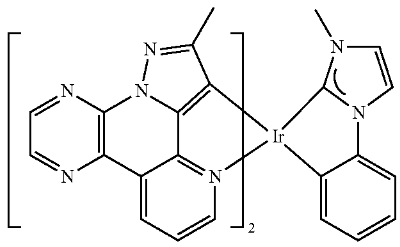

IrC23

A mixture of ancillary ligand A1 (1.5 mmol, 1.5 eq) and $AgPF_6$ (0.75 mmol, 0.75 eq) was stirred in a solution of 100 mL of acetonitrile at room temperature for 24 h. The solvent was evaporated to dryness under reduced pressure. Then chlorodimer D23 (1.0 mmol, 1.0 eq) and 150 mL of THF were added. The reaction mixture was heated to reflux for 24 h. Then the mixture was cooled to room temperature, and the precipitate was filtered off. The filtrate was evaporated to dryness under reduced pressure, and then purified by column chromatography to obtain the emitter IrC23 in 20%~60% yield.

Example 115

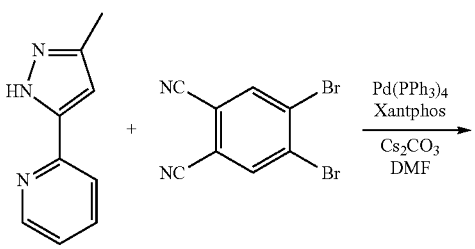

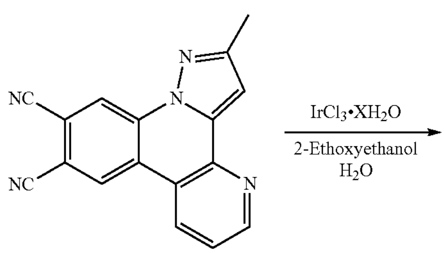

IrL24

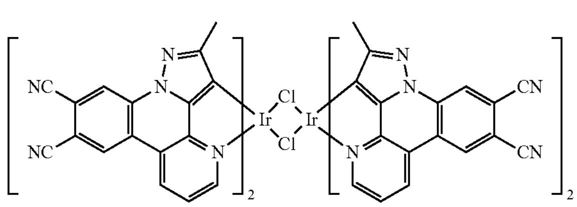

D24

IrL24 (2.2 mmol, 2.2 eq) and $IrCl_3{\cdot}XH_2O$ (1.0 mmol, 1.0 eq) were added to a dry Shlenck tube equipped with a magnetic stir bar. The tube was evacuated and backfilled with nitrogen. The evacuation and backfill procedure was repeated for a total of three times. Then 2-ethoxyethanol (30 mL) and $H_2O$ (10 mL) were added under the protection of nitrogen. The mixture was stirred in an oil bath at a temperature of 110° C. overnight and then cooled down to ambient temperature. The precipitate was filtered and washed with methanol several times to obtain the desired product chlorodimer D24 in 40%~80% yield.

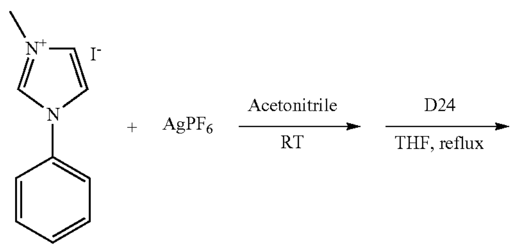

A1

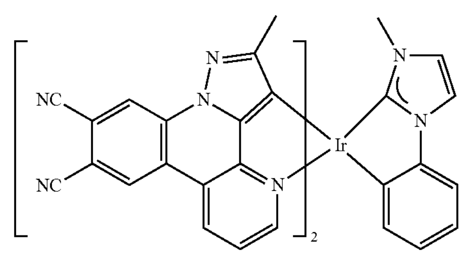

IrC24

A mixture of ancillary ligand A1 (1.5 mmol, 1.5 eq) and $AgPF_6$ (0.75 mmol, 0.75 eq) was stirred in a solution of 100 mL of acetonitrile at room temperature for 24 h. The solvent was evaporated to dryness under reduced pressure. Then chlorodimer D24 (1.0 mmol, 1.0 eq) and 150 mL of THF were added. The reaction mixture was heated to reflux for 24 h. Then the mixture was cooled to room temperature, and the precipitate was filtered off. The filtrate was evaporated to dryness under reduced pressure, and then purified by column chromatography to obtain the emitter IrC24 in 20%~60% yield.

Example 116

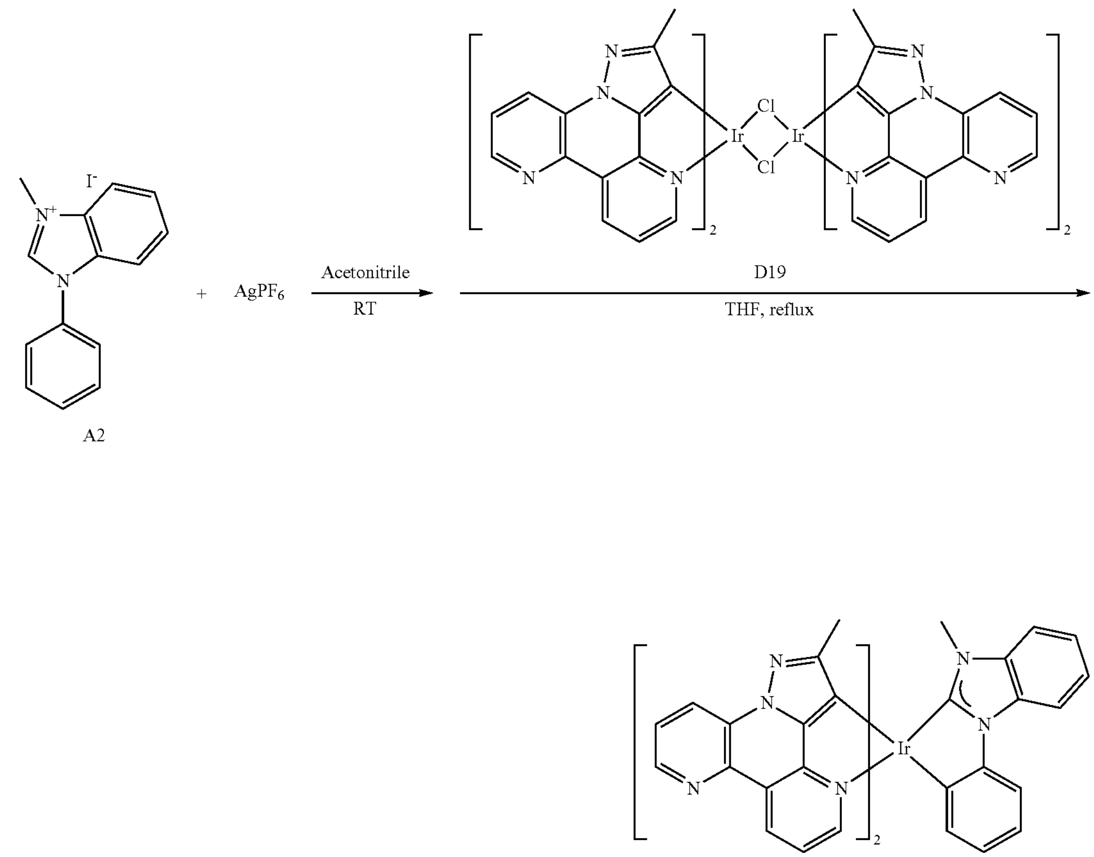

IrC25

A mixture of ancillary ligand A2 (1.5 mmol, 1.5 eq) and $AgPF_6$ (0.75 mmol, 0.75 eq) was stirred in a solution of 100 mL of acetonitrile at room temperature for 24 h. The solvent was evaporated to dryness under reduced pressure. Then chlorodimer D19 (1.0 mmol, 1.0 eq) and 150 mL of THF were added. The reaction mixture was heated to reflux for 24 h. Then the mixture was cooled to room temperature, and the precipitate was filtered off. The filtrate was evaporated to dryness under reduced pressure, and then purified by column chromatography to obtain the emitter IrC25 in 20%~60% yield.

Example 117

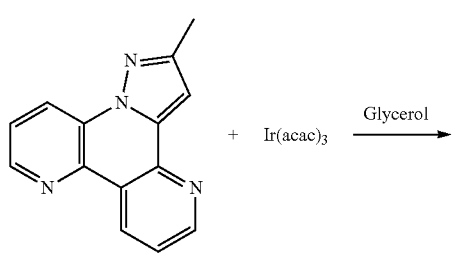

IrL19

-continued

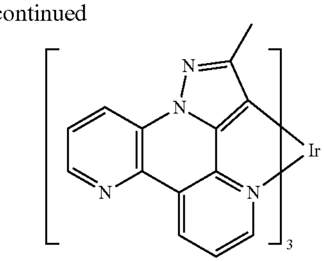

IrC26

IrL19 (2.5 mmol, 5.0 eq) and $Ir(acac)_3$ (0.5 mmol. 1.0 eq) were added to a dry Shlenck tube equipped with a magnetic stir bar. The tube was evacuated and backfilled with nitrogen. The evacuation and backfill procedure was repeated for a total of three times. Then 45 mL of glycerol was added under the protection of nitrogen. The mixture was stirred in an oil bath at a temperature of 240° C. for 3 days. After the mixture was cooled down to ambient temperature, 150 mL of 1M HCl solution was added, and the product was thrice extracted with $CH_2Cl_2$. Then the organic extracts were combined, and dried with $MgSO_4$. The mixture was evaporated to dryness under reduced pressure, and then purified by column chromatography to obtain the emitter IrC26 in 5%~50% yield.

Example 118

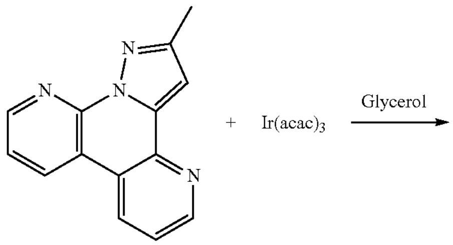

IrL20

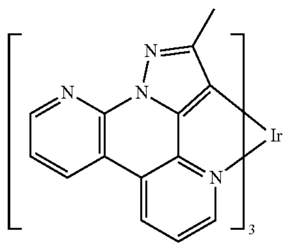

IrC27

IrL20 (2.5 mmol, 5.0 eq) and $Ir(acac)_3$ (0.5 mmol, 1.0 eq) were added to a dry Shlenck tube equipped with a magnetic stir bar. The tube was evacuated and backfilled with nitrogen. The evacuation and backfill procedure was repeated for a total of three times. Then 45 mL of glycerol was added under the protection of nitrogen. The mixture was stirred in an oil bath at a temperature of 240° C. for 3 days. After the mixture was cooled down to ambient temperature, 150 mL of 1M HCl solution was added, and the product was thrice extracted with $CH_2Cl_2$. Then the organic extracts were combined, and dried with $MgSO_4$. The mixture was evaporated to dryness under reduced pressure, and then purified by column chromatography to obtain the emitter IrC27 in 5%~50% yield.

Example 119

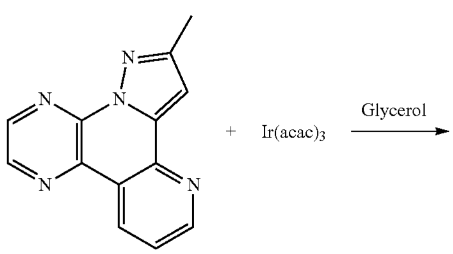

IrL23

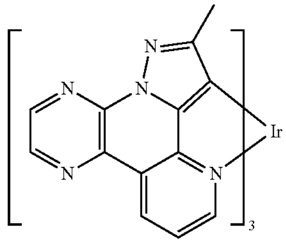

IrC28

IrL23 (2.5 mmol, 5.0 eq) and $Ir(acac)_3$ (0.5 mmol, 1.0 eq) were added to a dry Shlenck tube equipped with a magnetic stir bar. The tube was evacuated and backfilled with nitrogen. The evacuation and backfill procedure was repeated for a total of three times. Then 45 mL of glycerol was added under the protection of nitrogen. The mixture was stirred in an oil bath at a temperature of 240° C. for 3 days. After the mixture was cooled down to ambient temperature, 150 mL of 1M HCl solution was added, and the product was thrice extracted with $CH_2Cl_2$. Then the organic extracts were combined, and dried with $MgSO_4$. The mixture was evaporated to dryness under reduced pressure, and then purified by column chromatography to obtain the emitter IrC28 in 5%~50% yield.

Example 120

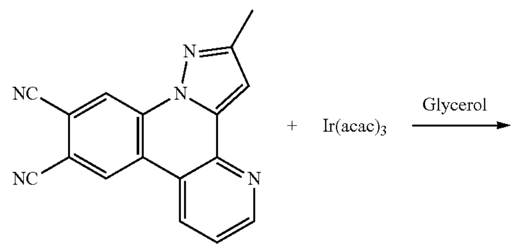

IrL24

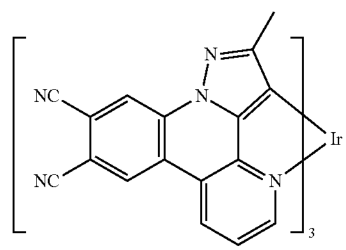

IrC29

IrL24 (2.5 mmol, 5.0 eq) and $Ir(acac)_3$ (0.5 mmol, 1.0 eq) were added to a dry Shlenck tube equipped with a magnetic stir bar. The tube was evacuated and backfilled with nitrogen. The evacuation and backfill procedure was repeated for a total of three times. Then 45 mL of glycerol was added under the protection of nitrogen. The mixture was stirred in an oil bath at a temperature of 240° C. for 3 days. After the mixture was cooled down to ambient temperature, 150 mL of 1M HCl solution was added, and the product was thrice extracted with $CH_2Cl_2$. Then the organic extracts were combined, and dried with $MgSO_4$. The mixture was evaporated to dryness under reduced pressure, and then purified by column chromatography to obtain the emitter IrC29 in 5%~50% yield.

Example 121

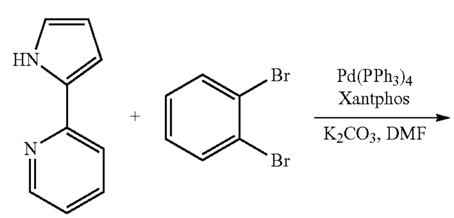

-continued

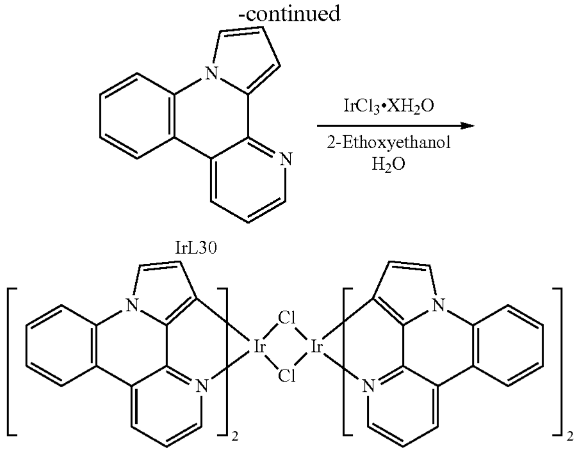

IrL30

D30

IrL30 (2.2 mmol, 2.2 eq) and $IrCl_3 \cdot XH_2O$ (1.0 mmol, 1.0 eq) were added to a dry Shlenck tube equipped with a magnetic stir bar. The tube was evacuated and backfilled with nitrogen. The evacuation and backfill procedure was repeated for a total of three times. Then 2-ethoxyethanol (30 mL) and $H_2O$ (10 mL) were added under the protection of nitrogen. The mixture was stirred in an oil bath at a temperature of 110° C. overnight and then cooled down to ambient temperature. The precipitate was filtered and washed with methanol several times to obtain the desired product chlorodimer D30 in 40%~80% yield.

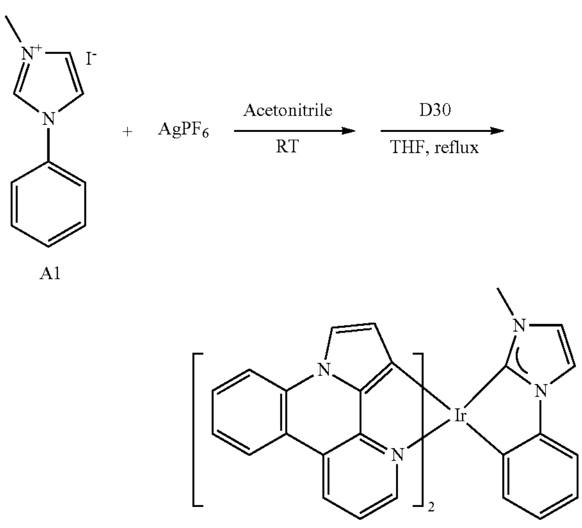

A1

IrC30

A mixture of ancillary ligand A1 (1.5 mmol, 1.5 eq) and $AgPF_6$ (0.75 mmol, 0.75 eq) was stirred in a solution of 100 mL of acetonitrile at room temperature for 24 h. The solvent was evaporated to dryness under reduced pressure. Then chlorodimer D30 (1.0 mmol, 1.0 eq) and 150 mL of THF were added. The reaction mixture was heated to reflux for 24 h. Then the mixture was cooled to room temperature, and the precipitate was filtered off. The filtrate was evaporated to dryness under reduced pressure, and then purified by column chromatography to obtain the emitter IrC30 in 20%~60% yield.

Example 122

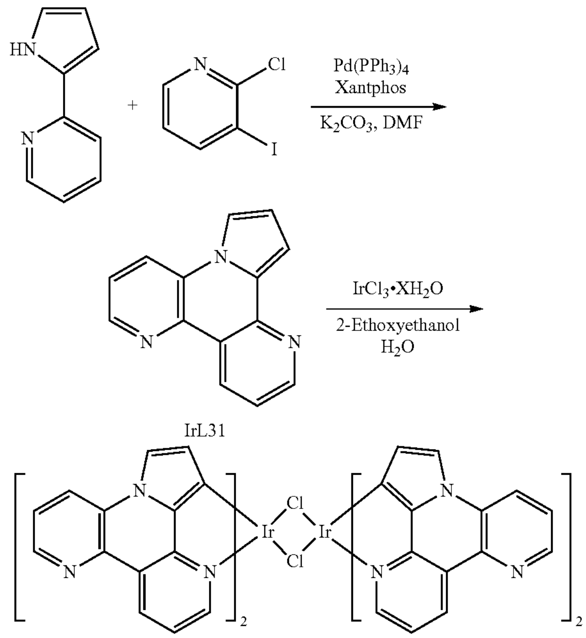

IrL31

D31

IrL31 (2.2 mmol, 2.2 eq) and $IrCl_3 \cdot XH_2O$ (1.0 mmol, 1.0 eq) were added to a dry Shlenck tube equipped with a magnetic stir bar. The tube was evacuated and backfilled with nitrogen. The evacuation and backfill procedure was repeated for a total of three times. Then 2-ethoxyethanol (30 mL) and $H_2O$ (10 mL) were added under the protection of nitrogen. The mixture was stirred in an oil bath at a temperature of 110° C. overnight and then cooled down to ambient temperature. The precipitate was filtered and washed with methanol several times to obtain the desired product chlorodimer D31 in 40%~80% yield.

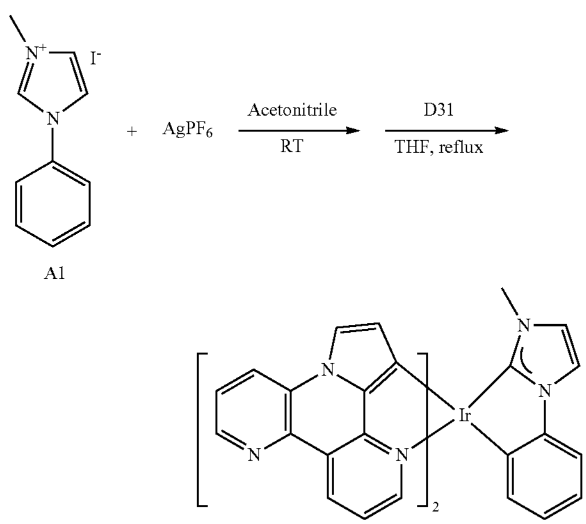

A1

IrC31

A mixture of ancillary ligand A1 (1.5 mmol, 1.5 eq) and $AgPF_6$ (0.75 mmol, 0.75 eq) was stirred in a solution of 100 mL of acetonitrile at room temperature for 24 h. The solvent was evaporated to dryness under reduced pressure. Then chlorodimer D31 (1.0 mmol, 1.0 eq) and 150 mL of THF were added. The reaction mixture was heated to reflux for 24 h. Then the mixture was cooled to room temperature, and the precipitate was filtered off. The filtrate was evaporated to dryness under reduced pressure, and then purified by column chromatography to obtain the emitter IrC31 in 20%~60% yield.

Example 123

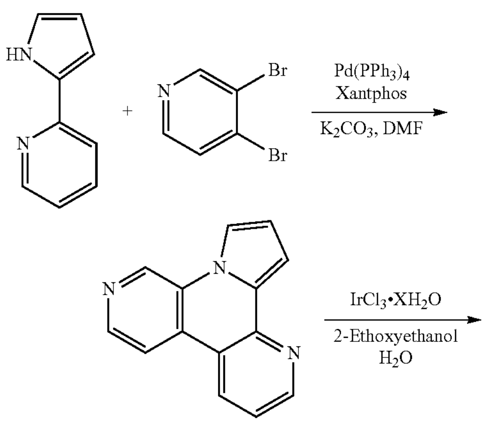

IrL32

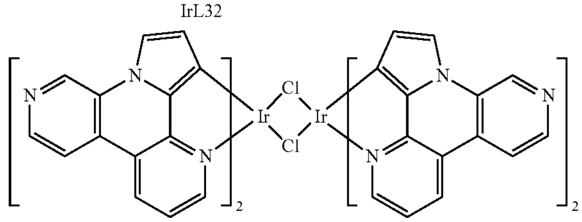

D32

IrL32 (2.2 mmol, 2.2 eq) and $IrCl_3 \cdot XH_2O$ (1.0 mmol, 1.0 eq) were added to a dry Shlenck tube equipped with a magnetic stir bar. The tube was evacuated and backfilled with nitrogen. The evacuation and backfill procedure was repeated for a total of three times. Then 2-ethoxyethanol (30 mL) and $H_2O$ (10 mL) were added under the protection of nitrogen. The mixture was stirred in an oil bath at a temperature of 110° C. overnight and then cooled down to ambient temperature. The precipitate was filtered and washed with methanol several times to obtain the desired product chlorodimer D32 in 40%~80% yield.

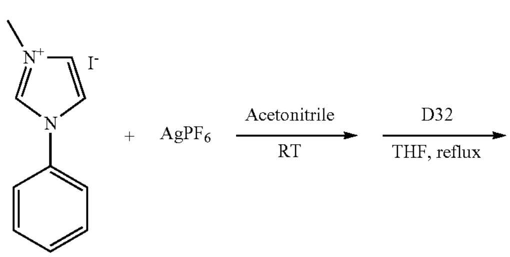

A1

-continued

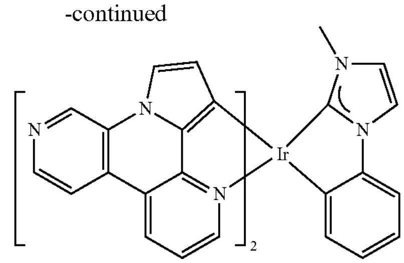

IrC32

A mixture of ancillary ligand A1 (1.5 mmol, 1.5 eq) and $AgPF_6$ (0.75 mmol, 0.75 eq) was stirred in a solution of 100 mL of acetonitrile at room temperature for 24 h. The solvent was evaporated to dryness under reduced pressure. Then chlorodimer D32 (1.0 mmol, 1.0 eq) and 150 mL of THF were added. The reaction mixture was heated to reflux for 24 h. Then the mixture was cooled to room temperature, and the precipitate was filtered off. The filtrate was evaporated to dryness under reduced pressure, and then purified by column chromatography to obtain the emitter IrC32 in 20%~60% yield.

Example 124

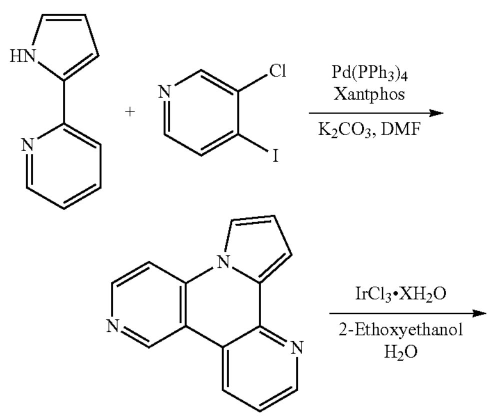

IrL33

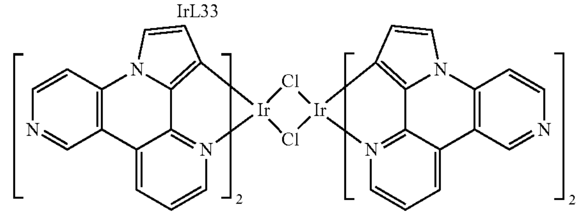

D33

IrL33 (2.2 mmol, 2.2 eq) and $IrCl_3 \cdot XH_2O$ (1.0 mmol, 1.0 eq) were added to a dry Shlenck tube equipped with a magnetic stir bar. The tube was evacuated and backfilled with nitrogen. The evacuation and backfill procedure was repeated for a total of three times. Then 2-ethoxyethanol (30 mL) and $H_2O$ (10 mL) were added under the protection of nitrogen. The mixture was stirred in an oil bath at a temperature of 110° C. overnight and then cooled down to ambient temperature. The precipitate was filtered and washed with methanol several times to obtain the desired product chlorodimer D33 in 40%~80% yield.

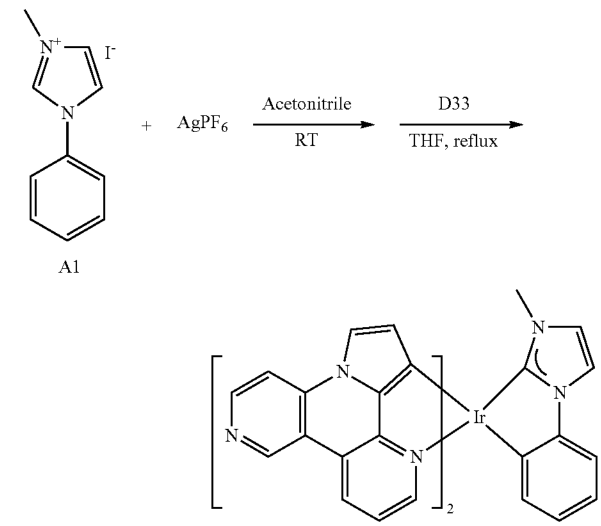

A1

IrC33

A mixture of ancillary ligand A1 (1.5 mmol, 1.5 eq) and $AgPF_6$ (0.75 mmol, 0.75 eq) was stirred in a solution of 100 mL of acetonitrile at room temperature for 24 h. The solvent was evaporated to dryness under reduced pressure. Then chlorodimer D33 (1.0 mmol, 1.0 eq) and 150 mL of THF were added. The reaction mixture was heated to reflux for 24 h. Then the mixture was cooled to room temperature, and the precipitate was filtered off. The filtrate was evaporated to dryness under reduced pressure, and then purified by column chromatography to obtain the emitter IrC33 in 20%~60% yield.

Example 125

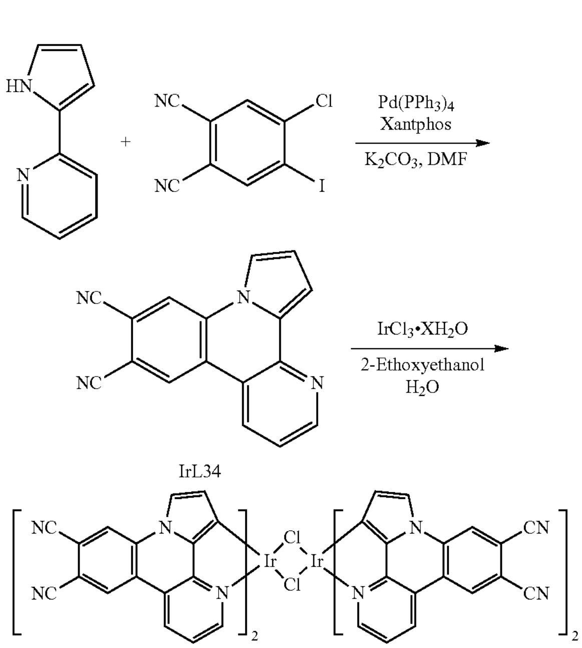

IrL34

D34

IrL34 (2.2 mmol, 2.2 eq) and $IrCl_3 \cdot XH_2O$ (1.0 mmol, 1.0 eq) were added to a dry Shlenck tube equipped with a magnetic stir bar. The tube was evacuated and backfilled with nitrogen. The evacuation and backfill procedure was repeated for a total of three times. Then 2-ethoxyethanol (30 mL) and $H_2O$ (10 mL) were added under the protection of nitrogen. The mixture was stirred in an oil bath at a temperature of 110° C. overnight and then cooled down to ambient temperature. The precipitate was filtered and washed with methanol several times to obtain the desired product chlorodimer D34 in 40%~80% yield.

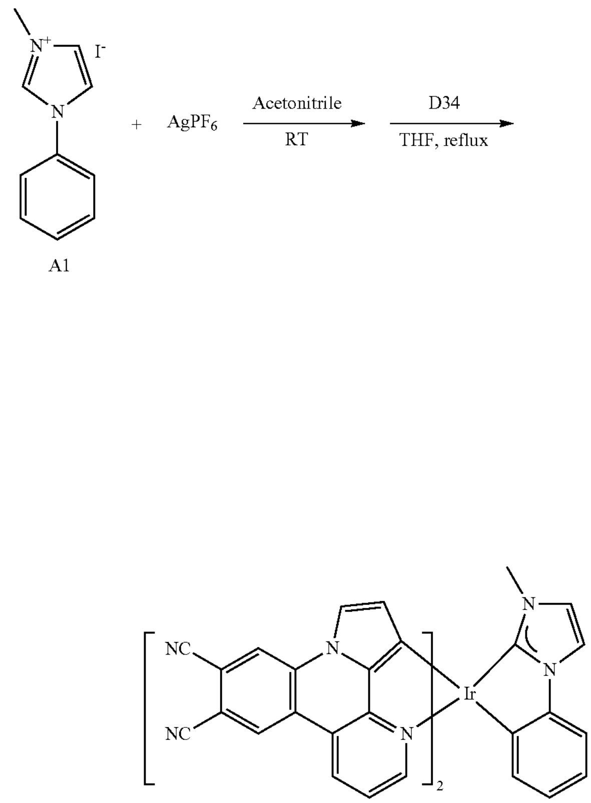

A1

IrC34

A mixture of ancillary ligand A1 (1.5 mmol, 1.5 eq) and $AgPF_6$ (0.75 mmol, 0.75 eq) was stirred in a solution of 100 mL of acetonitrile at room temperature for 24 h. The solvent was evaporated to dryness under reduced pressure. Then chlorodimer D34 (1.0 mmol, 1.0 eq) and 150 mL of THF were added. The reaction mixture was heated to reflux for 24 h. Then the mixture was cooled to room temperature, and the precipitate was filtered off. The filtrate was evaporated to dryness under reduced pressure, and then purified by column chromatography to obtain the emitter IrC34 in 20%~60% yield.

Example 126

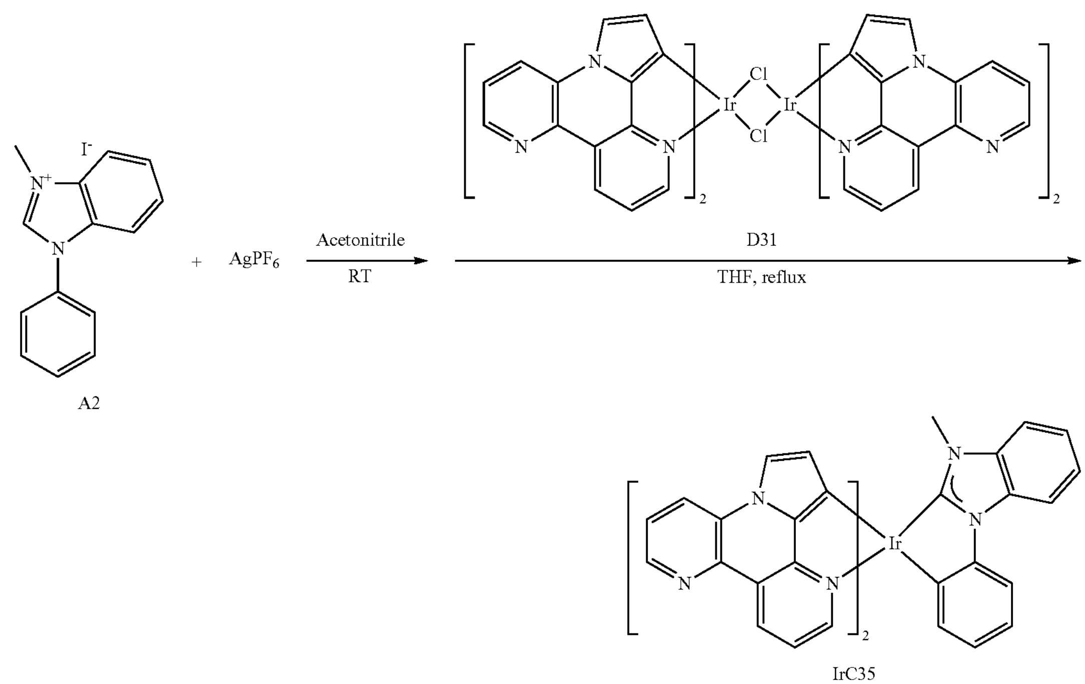

A mixture of ancillary ligand A2 (1.5 mmol, 1.5 eq) and $AgPF_6$ (0.75 mmol, 0.75 eq) was stirred in a solution of 100 mL of acetonitrile at room temperature for 24 h. The solvent was evaporated to dryness under reduced pressure. Then chlorodimer D31 (1.0 mmol, 1.0 eq) and 150 mL of THF were added. The reaction mixture was heated to reflux for 24 h. Then the mixture was cooled to room temperature, and the precipitate was filtered off. The filtrate was evaporated to dryness under reduced pressure, and then purified by column chromatography to obtain the emitter IrC35 in 20%~60% yield.

Example 127

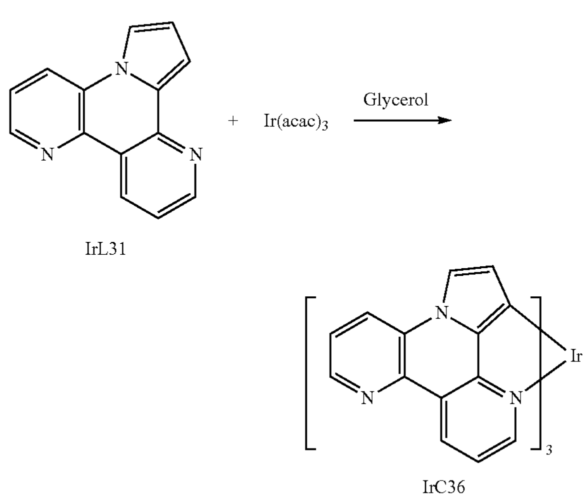

IrL31 (2.5 mmol, 5.0 eq) and $Ir(acac)_3$ (0.5 mmol, 1.0 eq) were added to a dry Shlenck tube equipped with a magnetic stir bar. The tube was evacuated and backfilled with nitrogen. The evacuation and backfill procedure was repeated for a total of three times. Then 45 mL of glycerol was added under the protection of nitrogen. The mixture was stirred in an oil bath at a temperature of 240° C. for 3 days. After the mixture was cooled down to ambient temperature, 150 mL of 1M HCl solution was added, and the product was thrice extracted with $CH_2Cl_2$. Then the organic extracts were combined, and dried with $MgSO_4$. The mixture was evaporated to dryness under reduced pressure, and then purified by column chromatography to obtain the emitter IrC36 in 5%~50% yield.

Example 128

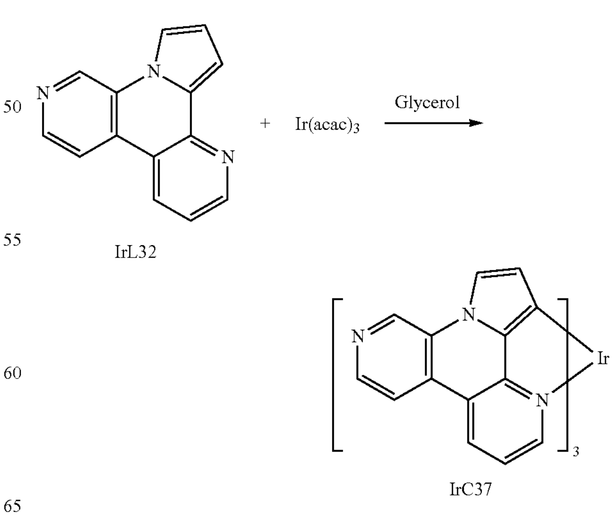

IrL32 (2.5 mmol, 5.0 eq) and $Ir(acac)_3$ (0.5 mmol, 1.0 eq) were added to a dry Shlenck tube equipped with a magnetic stir bar. The tube was evacuated and backfilled with nitrogen. The evacuation and backfill procedure was repeated for a total of three times. Then 45 mL of glycerol was added under the protection of nitrogen. The mixture was stirred in an oil bath at a temperature of 240° C. for 3 days. After the mixture was cooled down to ambient temperature, 150 mL of 1M HCl solution was added, and the product was thrice extracted with $CH_2Cl_2$. Then the organic extracts were combined, and dried with $MgSO_4$. The mixture was evaporated to dryness under reduced pressure, and then purified by column chromatography to obtain the emitter IrC37 in 5%~50% yield.

Example 129

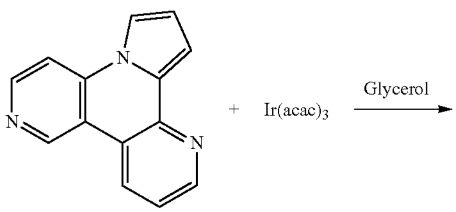

IrL33

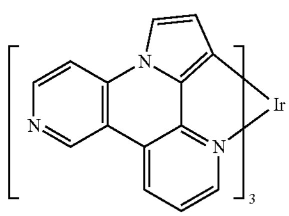

IrC38

IrL33 (2.5 mmol, 5.0 eq) and $Ir(acac)_3$ (0.5 mmol, 1.0 eq) were added to a dry Shlenck tube equipped with a magnetic stir bar. The tube was evacuated and backfilled with nitrogen. The evacuation and backfill procedure was repeated for a total of three times. Then 45 mL of glycerol was added under the protection of nitrogen. The mixture was stirred in an oil bath at a temperature of 240° C. for 3 days. After the mixture was cooled down to ambient temperature, 150 mL of 1M HCl solution was added, and the product was thrice extracted with $CH_2Cl_2$. Then the organic extracts were combined, and dried with $MgSO_4$. The mixture was evaporated to dryness under reduced pressure, and then purified by column chromatography to obtain the emitter IrC38 in 5%~50% yield.

Example 130

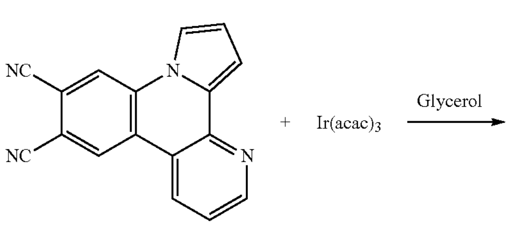

IrL34

-continued

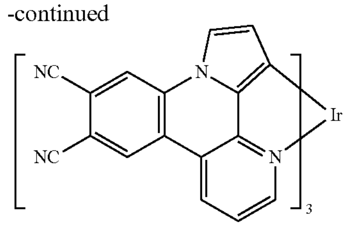

IrC39

IrL34 (2.5 mmol, 5.0 eq) and $Ir(acac)_3$ (0.5 mmol, 1.0 eq) were added to a dry Shlenck tube equipped with a magnetic stir bar. The tube was evacuated and backfilled with nitrogen. The evacuation and backfill procedure was repeated for a total of three times. Then 45 mL of glycerol was added under the protection of nitrogen. The mixture was stirred in an oil bath at a temperature of 240° C. for 3 days. After the mixture was cooled down to ambient temperature, 150 mL of 1M HCl solution was added, and the product was thrice extracted with $CH_2Cl_2$. Then the organic extracts were combined, and dried with $MgSO_4$. The mixture was evaporated to dryness under reduced pressure, and then purified by column chromatography to obtain the emitter IrC39 in 5%~50% yield.

Example 131

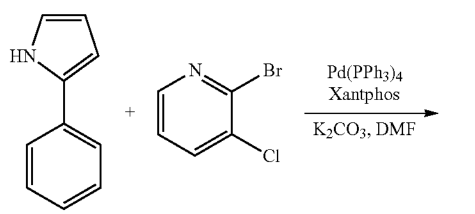

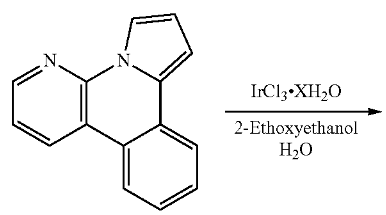

IrL40

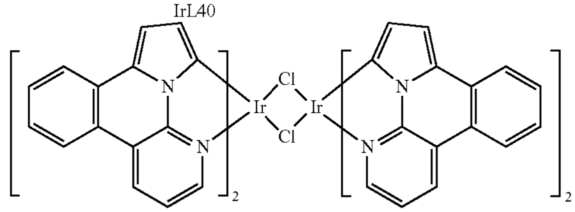

D40

IrL40 (2.2 mmol, 2.2 eq) and $IrCl_3 \cdot XH_2O$ (1.0 mmol, 1.0 eq) were added to a dry Shlenck tube equipped with a magnetic stir bar. The tube was evacuated and backfilled with nitrogen. The evacuation and backfill procedure was repeated for a total of three times. Then 2-ethoxyethanol (30 mL) and $H_2O$ (10 mL) were added under the protection of nitrogen. The mixture was stirred in an oil bath at a temperature of 110° C. overnight and then cooled down to ambient temperature. The precipitate was filtered and washed with methanol several times to obtain the desired product chlorodimer D40 in 40%~80% yield.

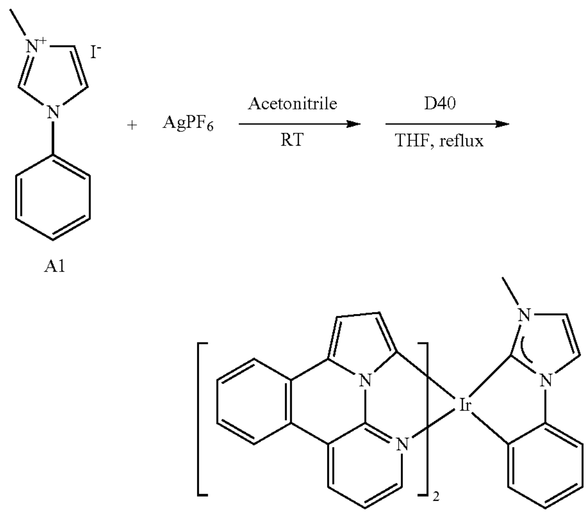

IrC40

A mixture of ancillary ligand A1 (1.5 mmol, 1.5 eq) and $AgPF_6$ (0.75 mmol, 0.75 eq) was stirred in a solution of 100 mL of acetonitrile at room temperature for 24 h. The solvent was evaporated to dryness under reduced pressure. Then chlorodimer D40 (1.0 mmol, 1.0 eq) and 150 mL of THF were added. The reaction mixture was heated to reflux for 24 h. Then the mixture was cooled to room temperature, and the precipitate was filtered off. The filtrate was evaporated to dryness under reduced pressure, and then purified by column chromatography to obtain the emitter IrC40 in 20%~60% yield.

Example 132

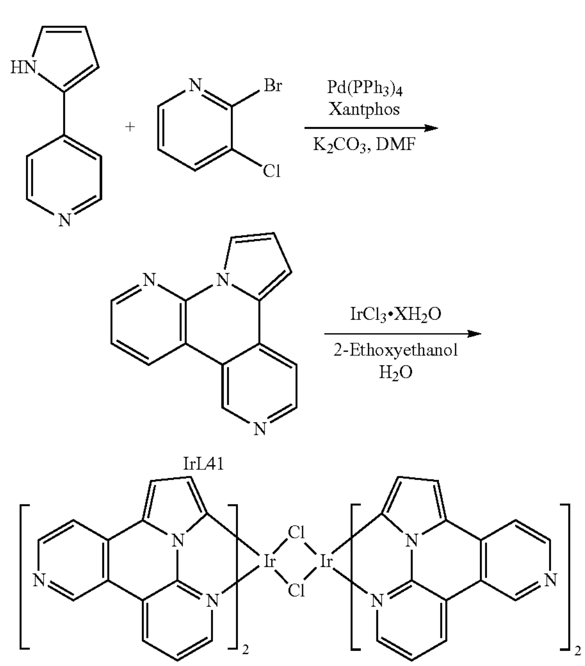

D41

IrL41 (2.2 mmol, 2.2 eq) and $IrCl_3 \cdot XH_2O$ (1.0 mmol, 1.0 eq) were added to a dry Shlenck tube equipped with a magnetic stir bar. The tube was evacuated and backfilled with nitrogen. The evacuation and backfill procedure was repeated for a total of three times. Then 2-ethoxyethanol (30 mL) and $H_2O$ (10 mL) were added under the protection of nitrogen. The mixture was stirred in an oil bath at a temperature of 110° C. overnight and then cooled down to ambient temperature. The precipitate was filtered and washed with methanol several times to obtain the desired product chlorodimer D41 in 40%~80% yield.

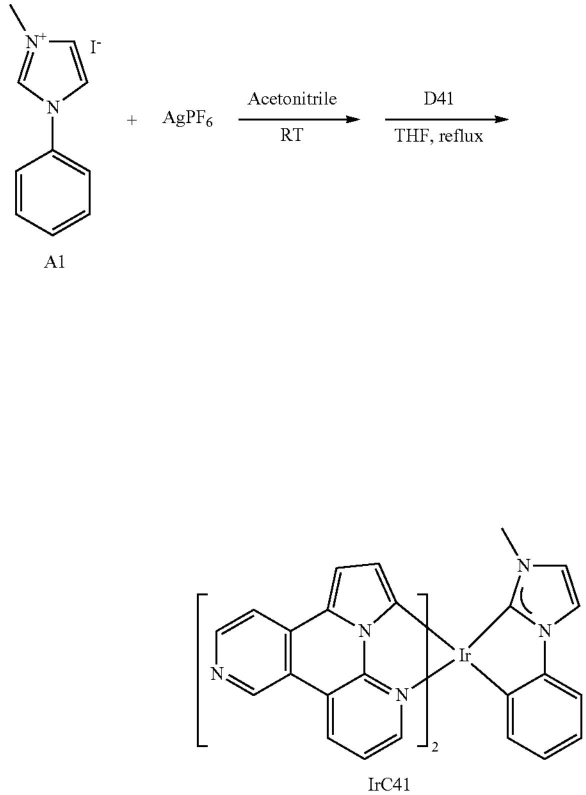

IrC41

A mixture of ancillary ligand A1 (1.5 mmol, 1.5 eq) and $AgPF_6$ (0.75 mmol, 0.75 eq) was stirred in a solution of 100 mL of acetonitrile at room temperature for 24 h. The solvent was evaporated to dryness under reduced pressure. Then chlorodimer D41 (1.0 mmol, 1.0 eq) and 150 mL of THF were added. The reaction mixture was heated to reflux for 24 h. Then the mixture was cooled to room temperature, and the precipitate was filtered off. The filtrate was evaporated to dryness under reduced pressure, and then purified by column chromatography to obtain the emitter IrC41 in 20%~60% yield.

Example 133

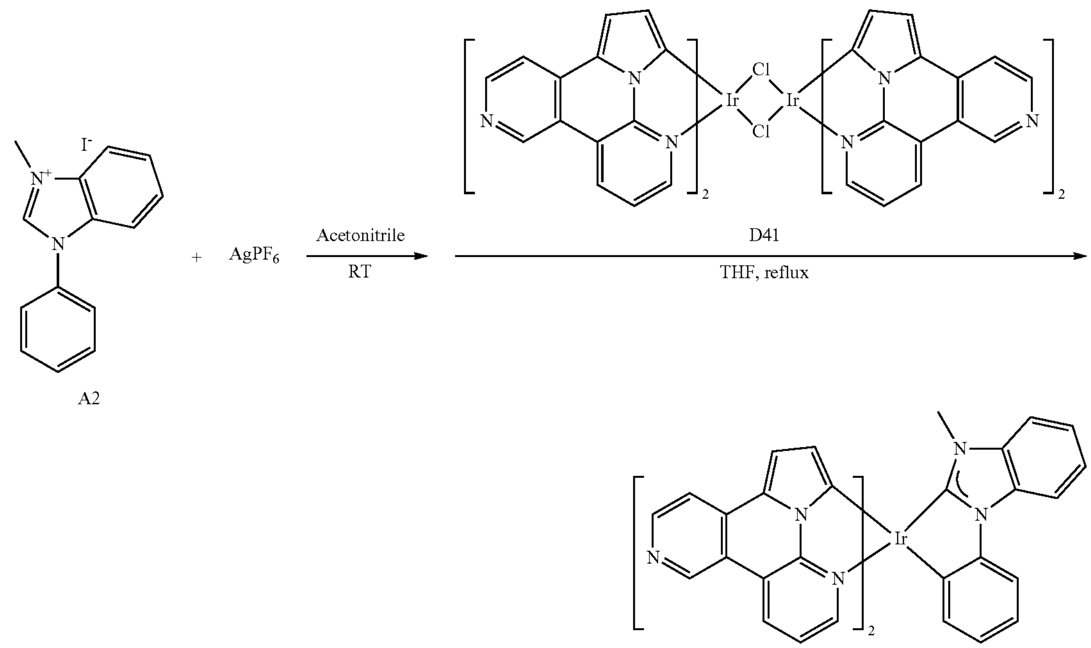

A2 IrC42

A mixture of ancillary ligand A2 (1.5 mmol, 1.5 eq) and $AgPF_6$ (0.75 mmol, 0.75 eq) was stirred in a solution of 100 mL of acetonitrile at room temperature for 24 h. The solvent was evaporated to dryness under reduced pressure. Then chlorodimer D41 (1.0 mmol, 1.0 eq) and 150 mL of THF were added. The reaction mixture was heated to reflux for 24 h. Then the mixture was cooled to room temperature, and the precipitate was filtered off. The filtrate was evaporated to dryness under reduced pressure, and then purified by column chromatography to obtain the emitter IrC42 in 20%~60% yield.

Example 134

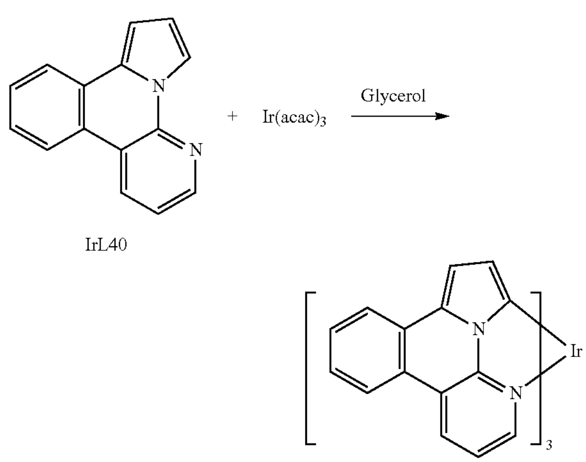

IrL40 IrC43

IrL40 (2.5 mmol, 5.0 eq) and $Ir(acac)_3$ (0.5 mmol, 1.0 eq) were added to a dry Shlenck tube equipped with a magnetic stir bar. The tube was evacuated and backfilled with nitrogen. The evacuation and backfill procedure was repeated for a total of three times. Then 45 mL of glycerol was added under the protection of nitrogen. The mixture was stirred in an oil bath at a temperature of 240° C. for 3 days. After the mixture was cooled down to ambient temperature, 150 mL of 1M HCl solution was added, and the product was thrice extracted with $CH_2Cl_2$. Then the organic extracts were combined, and dried with $MgSO_4$. The mixture was evaporated to dryness under reduced pressure, and then purified by column chromatography to obtain the emitter IrC43 in 5%~50% yield.

Example 135

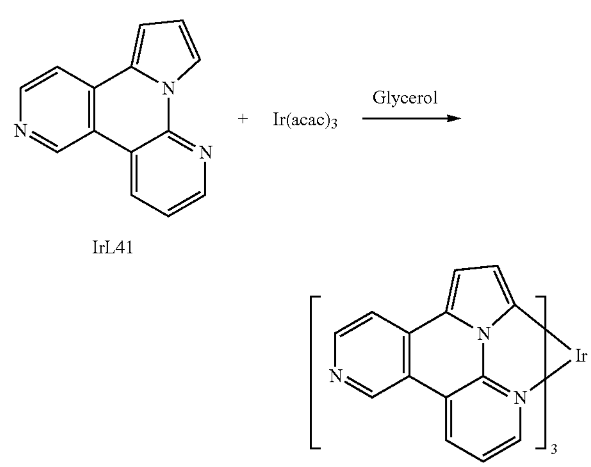

IrL41 IrC44

IrL41 (2.5 mmol, 5.0 eq) and $Ir(acac)_3$ (0.5 mmol, 1.0 eq) were added to a dry Shlenck tube equipped with a magnetic stir bar. The tube was evacuated and backfilled with nitrogen. The evacuation and backfill procedure was repeated for a total of three times. Then 45 mL of glycerol was added under the protection of nitrogen. The mixture was stirred in an oil bath at a temperature of 240° C. for 3 days. After the mixture was cooled down to ambient temperature, 150 mL of 1M HCl solution was added, and the product was thrice extracted with $CH_2Cl_2$. Then the organic extracts were combined, and dried with $MgSO_4$. The mixture was evaporated to dryness under reduced pressure, and then purified by column chromatography to obtain the emitter IrC44 in 5%~50% yield.

Example 136

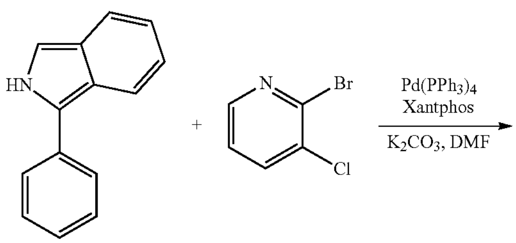

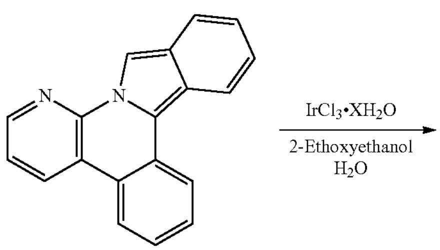

IrL45

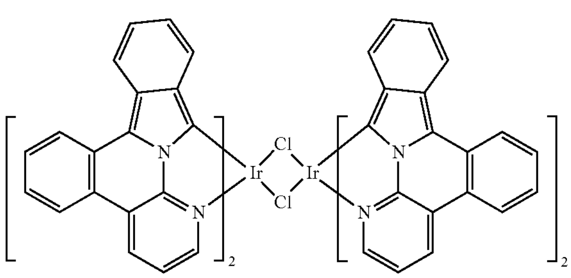

D45

IrL45 (2.2 mmol, 2.2 eq) and $IrCl_3 \cdot XH_2O$ (1.0 mmol, 1.0 eq) were added to a dry Shlenck tube equipped with a magnetic stir bar. The tube was evacuated and backfilled with nitrogen. The evacuation and backfill procedure was repeated for a total of three times. Then 2-ethoxyethanol (30 mL) and $H_2O$ (10 mL) were added under the protection of nitrogen. The mixture was stirred in an oil bath at a temperature of 110° C. overnight and then cooled down to ambient temperature. The precipitate was filtered and washed with methanol several times to obtain the desired product chlorodimer D45 in 40%~80% yield.

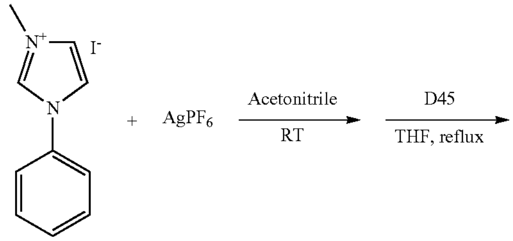

A1

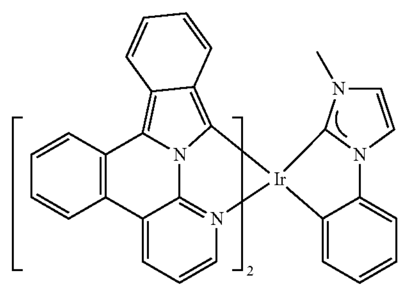

IrC45

A mixture of ancillary ligand A1 (1.5 mmol, 1.5 eq) and $AgPF_6$ (0.75 mmol, 0.75 eq) was stirred in a solution of 100 mL of acetonitrile at room temperature for 24 h. The solvent was evaporated to dryness under reduced pressure. Then chlorodimer D45 (1.0 mmol, 1.0 eq) and 150 mL of THF were added. The reaction mixture was heated to reflux for 24 h. Then the mixture was cooled to room temperature, and the precipitate was filtered off. The filtrate was evaporated to dryness under reduced pressure, and then purified by column chromatography to obtain the emitter IrC45 in 20%~60% yield.

Example 137

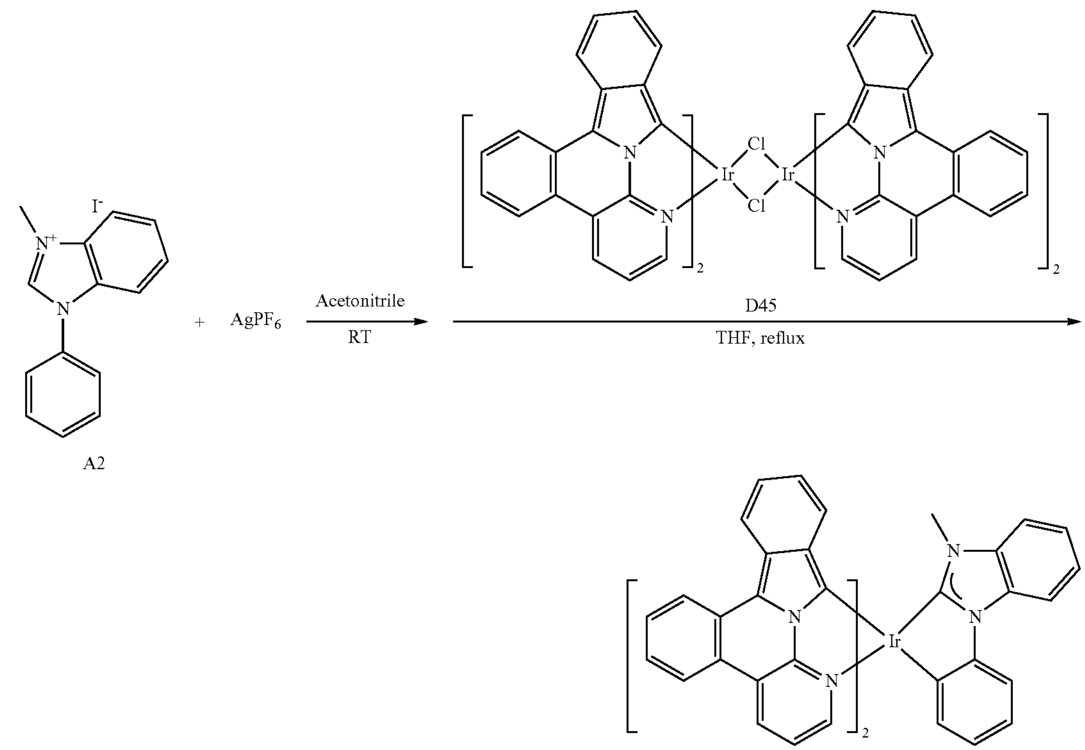

IrC46

A mixture of ancillary ligand A2 (1.5 mmol, 1.5 eq) and $AgPF_6$ (0.75 mmol, 0.75 eq) was stirred in a solution of 100 mL of acetonitrile at room temperature for 24 h. The solvent was evaporated to dryness under reduced pressure. Then chlorodimer D45 (1.0 mmol, 1.0 eq) and 150 mL of THF were added. The reaction mixture was heated to reflux for 24 h. Then the mixture was cooled to room temperature, and the precipitate was filtered off. The filtrate was evaporated to dryness under reduced pressure, and then purified by column chromatography to obtain the emitter IrC46 in 20%~60% yield.

Example 138

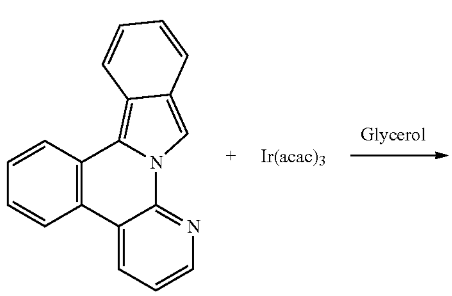

IrL45

-continued

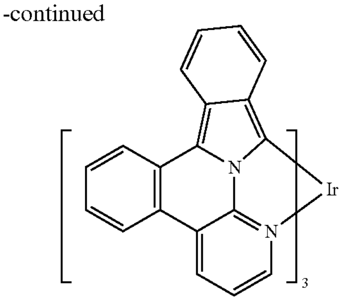

IrC47

IrL45 (2.5 mmol, 5.0 eq) and $Ir(acac)_3$ (0.5 mmol, 1.0 eq) were added to a dry Shlenck tube equipped with a magnetic stir bar. The tube was evacuated and backfilled with nitrogen. The evacuation and backfill procedure was repeated for a total of three times. Then 45 mL of glycerol was added under the protection of nitrogen. The mixture was stirred in an oil bath at a temperature of 240° C. for 3 days. After the mixture was cooled down to ambient temperature, 150 mL of 1M HCl solution was added, and the product was thrice extracted with $CH_2Cl_2$. Then the organic extracts were combined, and dried with $MgSO_4$. The mixture was evaporated to dryness under reduced pressure, and then purified by column chromatography to obtain the emitter IrC47 in 5%~50% yield.

Example 139

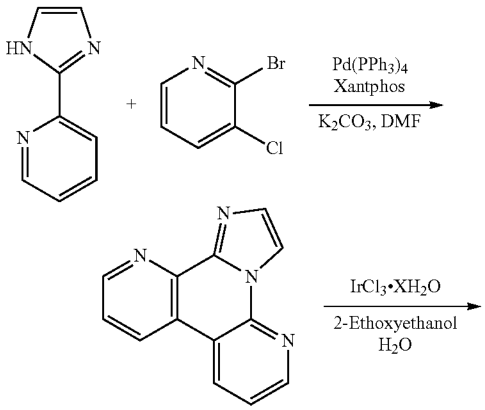

IrL48

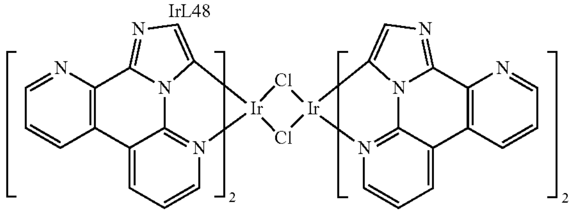

D48

IrL48 (2.2 mmol, 2.2 eq) and $IrCl_3{\cdot}XH_2O$ (1.0 mmol, 1.0 eq) were added to a dry Shlenck tube equipped with a magnetic stir bar. The tube was evacuated and backfilled with nitrogen. The evacuation and backfill procedure was repeated for a total of three times. Then 2-ethoxyethanol (30 mL) and $H_2O$ (10 mL) were added under the protection of nitrogen. The mixture was stirred in an oil bath at a temperature of 110° C. overnight and then cooled down to ambient temperature. The precipitate was filtered and washed with methanol several times to obtain the desired product chlorodimer D48 in 40%~80% yield.

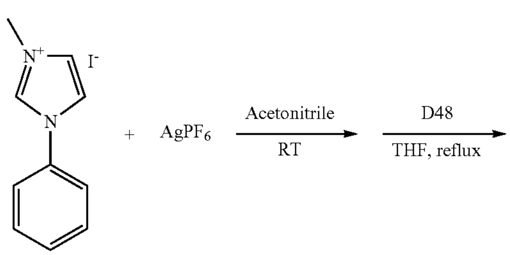

A1

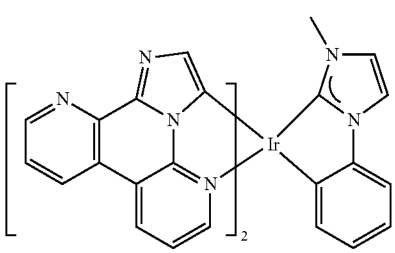

IrC48

A mixture of ancillary ligand A1 (1.5 mmol, 1.5 eq) and $AgPF_6$ (0.75 mmol, 0.75 eq) was stirred in a solution of 100 mL of acetonitrile at room temperature for 24 h. The solvent was evaporated to dryness under reduced pressure. Then chlorodimer D48 (1.0 mmol, 1.0 eq) and 150 mL of THF were added. The reaction mixture was heated to reflux for 24 h. Then the mixture was cooled to room temperature, and the precipitate was filtered off. The filtrate was evaporated to dryness under reduced pressure, and then purified by column chromatography to obtain the emitter IrC48 in 20%~60% yield.

Example 140

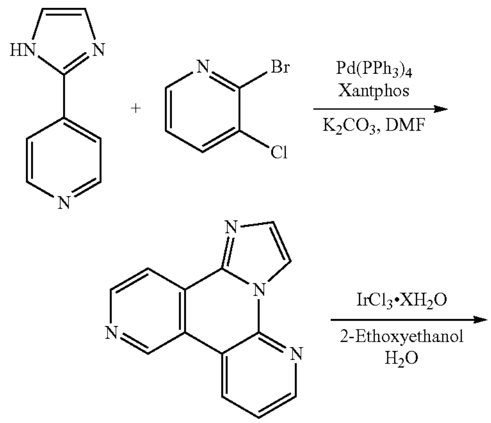

IrL49

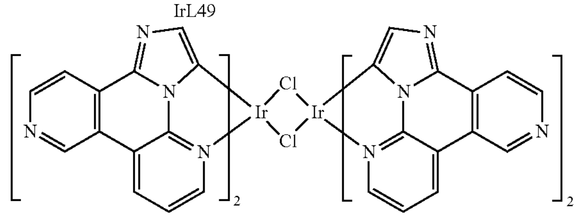

D49

IrL49 (2.2 mmol, 2.2 eq) and $IrCl_3{\cdot}XH_2O$ (1.0 mmol, 1.0 eq) were added to a dry Shlenck tube equipped with a magnetic stir bar. The tube was evacuated and backfilled with nitrogen. The evacuation and backfill procedure was repeated for a total of three times. Then 2-ethoxyethanol (30 mL) and $H_2O$ (10 mL) were added under the protection of nitrogen. The mixture was stirred in an oil bath at a temperature of 110° C. overnight and then cooled down to ambient temperature. The precipitate was filtered and washed with methanol several times to obtain the desired product chlorodimer D49 in 40%~80% yield.

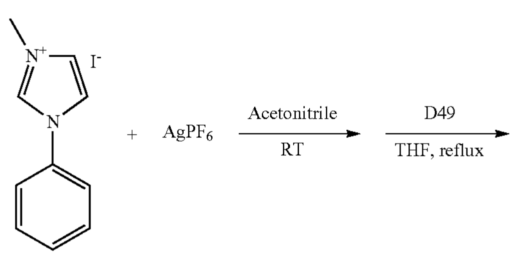

A1

-continued

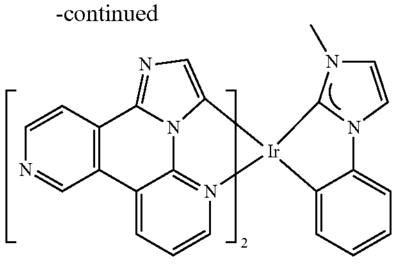

IrC49

A mixture of ancillary ligand A1 (1.5 mmol, 1.5 eq) and $AgPF_6$ (0.75 mmol, 0.75 eq) was stirred in a solution of 100 mL of acetonitrile at room temperature for 24 h. The solvent was evaporated to dryness under reduced pressure. Then chlorodimer D49 (1.0 mmol, 1.0 eq) and 150 mL of THF were added. The reaction mixture was heated to reflux for 24 h. Then the mixture was cooled to room temperature, and the precipitate was filtered off. The filtrate was evaporated to dryness under reduced pressure, and then purified by column chromatography to obtain the emitter IrC49 in 20%~60% yield.

Example 141

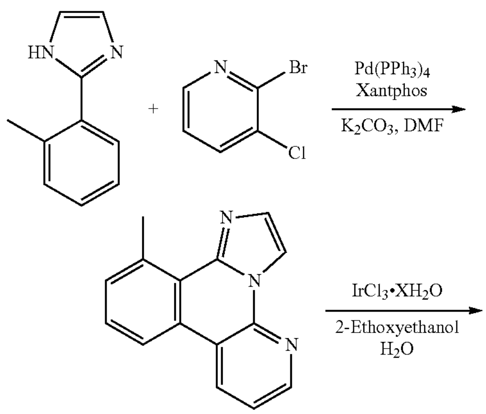

IrL50

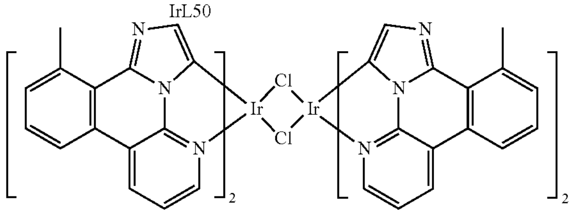

D50

IrL50 (2.2 mmol, 2.2 eq) and $IrCl_3 \cdot XH_2O$ (1.0 mmol, 1.0 eq) were added to a dry Shlenck tube equipped with a magnetic stir bar. The tube was evacuated and backfilled with nitrogen. The evacuation and backfill procedure was repeated for a total of three times. Then 2-ethoxyethanol (30 mL) and $H_2O$ (10 mL) were added under the protection of nitrogen. The mixture was stirred in an oil bath at a temperature of 110° C. overnight and then cooled down to ambient temperature. The precipitate was filtered and washed with methanol several times to obtain the desired product chlorodimer D50 in 40%~80% yield.

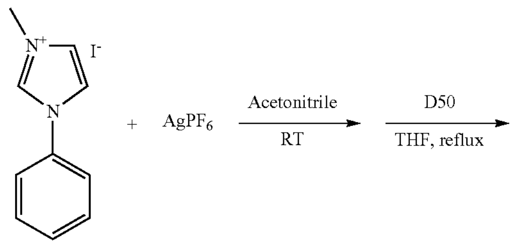

A1

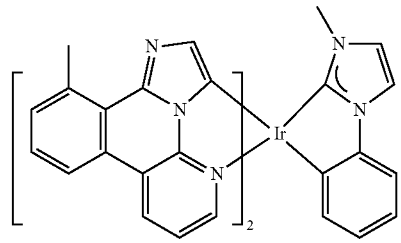

IrC50

A mixture of ancillary ligand A1 (1.5 mmol, 1.5 eq) and $AgPF_6$ (0.75 mmol, 0.75 eq) was stirred in a solution of 100 mL of acetonitrile at room temperature for 24 h. The solvent was evaporated to dryness under reduced pressure. Then chlorodimer D50 (1.0 mmol, 1.0 eq) and 150 mL of THF were added. The reaction mixture was heated to reflux for 24 h. Then the mixture was cooled to room temperature, and the precipitate was filtered off. The filtrate was evaporated to dryness under reduced pressure, and then purified by column chromatography to obtain the emitter IrC50 in 20%~60% yield.

Example 142

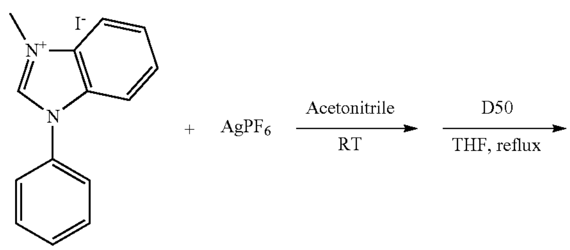

A2

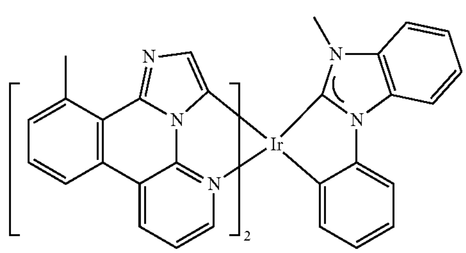

IrC51

A mixture of ancillary ligand A2 (1.5 mmol, 1.5 eq) and $AgPF_6$ (0.75 mmol, 0.75 eq) was stirred in a solution of 100 mL of acetonitrile at room temperature for 24 h. The solvent was evaporated to dryness under reduced pressure. Then chlorodimer D50 (1.0 mmol, 1.0 eq) and 150 mL of THF were added. The reaction mixture was heated to reflux for 24 h. Then the mixture was cooled to room temperature, and the precipitate was filtered off. The filtrate was evaporated to dryness under reduced pressure, and then purified by column chromatography to obtain the emitter IrC51 in 20%~60% yield.

Example 143

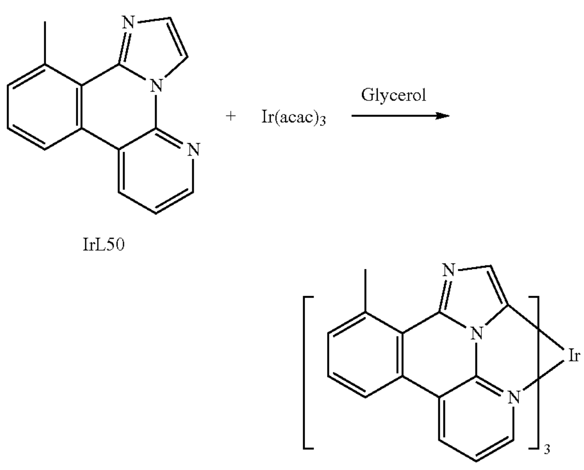

IrL50

IrC52

IrL50 (2.5 mmol, 5.0 eq) and $Ir(acac)_3$ (0.5 mmol, 1.0 eq) were added to a dry Shlenck tube equipped with a magnetic stir bar. The tube was evacuated and backfilled with nitrogen. The evacuation and backfill procedure was repeated for a total of three times. Then 45 mL of glycerol was added under the protection of nitrogen. The mixture was stirred in an oil bath at a temperature of 240° C. for 3 days. After the mixture was cooled down to ambient temperature, 150 mL of 1M HCl solution was added, and the product was thrice extracted with $CH_2Cl_2$. Then the organic extracts were combined, and dried with $MgSO_4$. The mixture was evaporated to dryness under reduced pressure, and then purified by column chromatography to obtain the emitter IrC52 in 5%~50% yield.

Only a few implementations are described and illustrated. Variations, enhancements and improvements of the described implementations and other implementations can be made based on what is described and illustrated in this document.

What is claimed is:

1. A complex represented by General Formula VIII or General Formula XII:

General Formula VIII

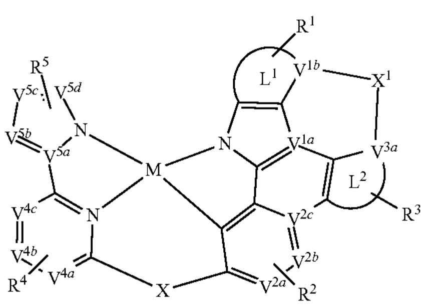

-continued

General Formula XII

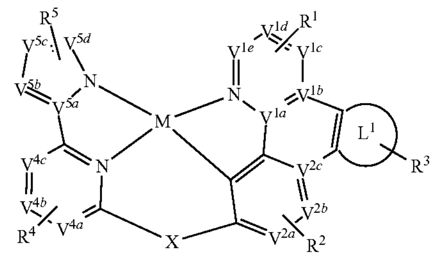

wherein:

M is Pt (II) or Pd (II),

N is nitrogen, each of $V^{1a}$-$V^{1e}$, $V^{2a}$-$V^{2c}$, $V^{3a}$, $V^{4a}$-$V^{4c}$, and $V^{5a}$-$V^{5d}$, if present, is independently N or C, $X^1$ is absent, X represents $CR^7R^8$, $SiR^7R^8$, $NR^7$, O, or S, each of $L^1$ and $L^2$ is independently present or absent, and each $L^1$ and $L^2$ present independently represents a substituted or unsubstituted aryl or heteroaryl, each of $R^1$, $R^2$, $R^3$, $R^4$, $R^5$, $R^7$, and $R^8$ is independently absent or present as a single substituent or multiple substituents, valency permitting, and each $R^1$, $R^2$, $R^3$, $R^4$, $R^5$, $R^7$, and $R^8$ present independently represents deuterium, halogen, hydroxyl, thiol, nitro, cyanide, isocyanide, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof.

2. A light emitting diode comprising the complex of claim 1.

3. A light emitting device comprising the light emitting diode of claim 2.

4. The complex of claim 1 represented by General Formula VIII-(i) or General Formula VIII-(ii):

General Formula VIII-(i)

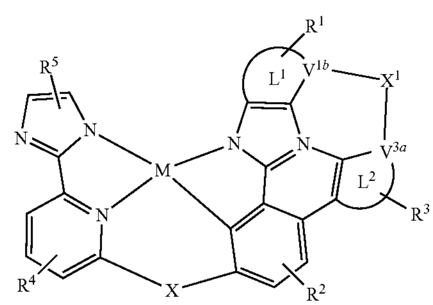

-continued

General Formula VIII-(ii)

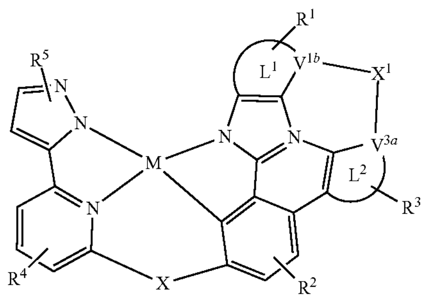

wherein:

M is Pt (II) or Pd (II),

N is nitrogen, each of $V^{1b}$ and $V^{3a}$, if present, is independently N or C, X is O, $CR^7R^8$, or $SiR^7R^8$, wherein, optionally, $R^7$ and $R^8$ may link together to form a fluorene ring, $X^1$ is absent, each of $L^1$ and $L^2$ is independently present or absent, and each $L^1$ and $L^2$ present independently represents a substituted or unsubstituted aryl, heteroaryl, or N-heterocyclic carbene, each $R^1$, $R^2$, $R^3$, $R^4$, $R^5$, $R^6$, $R^7$ and $R^8$ is independently absent or present as a single substituent or multiple substituents, valency permitting, and each $R^1$, $R^2$, $R^3$, $R^4$, $R^5$, $R^6$, $R^7$ and $R^8$ present independently represents deuterium, halogen, hydroxyl, thiol, nitro, cyanide, isocyanide, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof.

5. A light emitting diode comprising the complex of claim 4.

6. A light emitting device comprising the light emitting diode of claim 5.

7. The complex of claim 1 represented by General Formula XII-(i) or General Formula XII-(ii):

General Formula XII-(i)

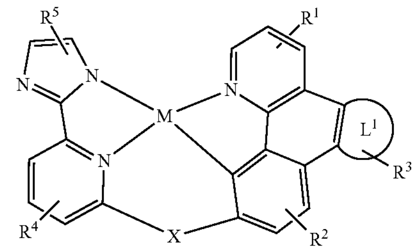

General Formula XII-(ii)

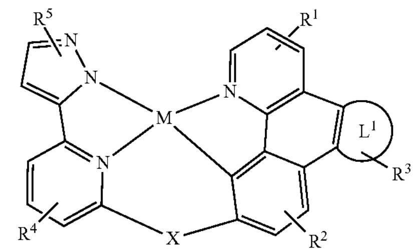

wherein:

M is Pt (II) or Pd (II),

N is nitrogen,

X is O, $CR^7R^8$, or $SiR^7R^8$, wherein, optionally, $R^7$ and $R^8$ may link together to form a fluorene ring, $L^1$ is present or absent, and each $L^1$ present represents a substituted or unsubstituted aryl or heteroaryl, each of $R^1$, $R^2$, $R^3$, $R^4$, $R^5$, $R^7$ and $R^8$ is independently absent or present as a single substituent or multiple substituents, valency permitting, and each $R^1$, $R^2$, $R^3$, $R^4$, $R^5$, $R^7$ and $R^8$ present independently represents deuterium, halogen, hydroxyl, thiol, nitro, cyanide, isocyanide, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof.

8. A light emitting diode comprising the complex of claim 7.

9. A light emitting device comprising the light emitting diode of claim 8.

* * * * *